US012247039B2

(12) United States Patent
Min et al.

(10) Patent No.: US 12,247,039 B2
(45) Date of Patent: Mar. 11, 2025

(54) ORGANOMETALLIC COMPOUND, ORGANIC LIGHT-EMITTING DEVICE INCLUDING ORGANOMETALLIC COMPOUND AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Minsik Min, Suwon-si (KR); Hyejin Bae, Suwon-si (KR); Soonok Jeon, Suwon-si (KR); Inkoo Kim, Suwon-si (KR); Jong Soo Kim, Hanam-si (KR); Sungho Nam, Daegu (KR); Hyeonho Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 759 days.

(21) Appl. No.: 17/104,051

(22) Filed: Nov. 25, 2020

(65) Prior Publication Data

US 2021/0171548 A1 Jun. 10, 2021

(30) Foreign Application Priority Data

Nov. 27, 2019 (KR) ........................ 10-2019-0154355
Nov. 25, 2020 (KR) ........................ 10-2020-0159546

(51) Int. Cl.
*H01L 51/00* (2006.01)
*C07F 1/10* (2006.01)
(Continued)

(52) U.S. Cl.
CPC ............ *C07F 1/10* (2013.01); *C07F 15/0066* (2013.01); *H10K 85/346* (2023.02);
(Continued)

(58) Field of Classification Search
CPC ............... H10K 85/346; H10K 85/371; C09K 2211/185
See application file for complete search history.

(56) References Cited

U.S. PATENT DOCUMENTS 7,279,704 B2 * 10/2007 Walters .................. H05B 33/14
257/40
7,553,560 B2 6/2009 Lamansky et al.
(Continued)

FOREIGN PATENT DOCUMENTS

CN 1784376 A 6/2006
CN 103102372 A 5/2013
(Continued)

OTHER PUBLICATIONS

Ruben Seifert, et al., Chemical degradation mechanisms of highly efficient blue phosphorescent emitters used for organic light emitting diodes, Organic Electronics 14 (2013) 115-123.
(Continued)

*Primary Examiner* — Alexander C Kollias
(74) *Attorney, Agent, or Firm* — CANTOR COLBURN LLP

(57) ABSTRACT

Provided are an organometallic compound represented by Formula 1, an organic light-emitting device including the organometallic compound and an electronic apparatus including the organic light-emitting device:
(Continued)

Formula 1

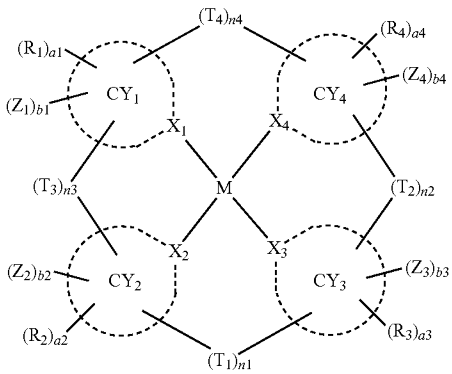

Formula 1 may be understood by referring to the descriptions of Formula 1 provided herein.

12 Claims, 1 Drawing Sheet

(51) Int. Cl.

| | |
|---|---|
| ***C07F 15/00*** | (2006.01) |
| ***H10K 85/30*** | (2023.01) |
| ***H10K 85/60*** | (2023.01) |
| *H10K 50/15* | (2023.01) |
| *H10K 50/16* | (2023.01) |

(52) U.S. Cl.
CPC ......... *H10K 85/371* (2023.02); *H10K 85/631* (2023.02); *H10K 50/15* (2023.02); *H10K 50/16* (2023.02)

(56) References Cited

U.S. PATENT DOCUMENTS 9,493,698 B2 11/2016 Beers et al.
10,199,583 B1 2/2019 Hang et al.
2007/0009758 A1* 1/2007 Funahashi ............ H10K 85/626 564/426
2013/0048963 A1* 2/2013 Beers ................... H10K 85/346 257/E51.026
2014/0124763 A1 5/2014 Funahashi
2015/0069334 A1 3/2015 Xia et al.
2015/0105556 A1* 4/2015 Li .......................... C09K 11/06 546/4
2015/0295197 A1* 10/2015 Adamovich ......... C07D 213/02 257/40
2016/0028028 A1 1/2016 Li et al.
2018/0305385 A1 10/2018 Chen et al.
2019/0119312 A1 4/2019 Chen et al.
2019/0233453 A1 8/2019 Li
2019/0372030 A1 12/2019 Takizawa et al.
2020/0266366 A1 8/2020 Bold et al.
2020/0395558 A1* 12/2020 Bae ........................ C09K 11/06
2020/0395560 A1 12/2020 Bae et al.
2022/0069242 A1 3/2022 Li et al.
2022/0081457 A1* 3/2022 Bae ...................... H10K 85/346
2022/0106345 A1* 4/2022 Bae ...................... H10K 85/346
2023/0389410 A1 11/2023 Lin et al.

FOREIGN PATENT DOCUMENTS

| | | | |
|---|---|---|---|
| CN | 104693243 | A | 6/2015 |
| CN | 108840886 | A | 11/2018 |
| CN | 109309168 | A | 2/2019 |
| CN | 109748938 | A | 5/2019 |
| CN | 110372756 | A | 10/2019 |
| CN | 112079870 | A | 12/2020 |
| EP | 3750898 | A1 | 12/2020 |
| JP | 2011054695 | A | 3/2011 |
| JP | 2013053149 | A | 3/2013 |
| JP | 2015081257 | A | 4/2015 |
| WO | 2002015645 | A1 | 2/2002 |
| WO | 2004083162 | A1 | 9/2004 |
| WO | 2005019373 | A2 | 3/2005 |
| WO | 2005113704 | A3 | 8/2006 |
| WO | 2014138912 | A1 | 9/2014 |

OTHER PUBLICATIONS

Extended European Search Report issued in EP Patent Application No. 20209767.1 on Apr. 30, 2021.
Faraz Hussain, et al., Journal of Organometallic Chemistry, 880, 2019, 300-311, (XP055795914).
Xiang Wang, et al., 2014 Adv. Funct. Mater, (XP001594258), 7257-7271.
English Abstract of CN 109748938.
English Abstract of CN 110372756.
English Abstract of Office Action dated Dec. 25, 2023, issued in corresponding CN Patent Application No. 202011368197.6, 11 pp.
Office Action dated Dec. 25, 2023, issued in corresponding CN Patent Application No. 202011368197.6, 7 pp.
English Translation of Office Action dated Aug. 27, 2024, issued in corresponding JP Patent Application No. 2020-197629, 3 pp.
Office Action dated Aug. 27, 2024, issued in corresponding JP Patent Application No. 2020-197629, 2 pp.

* cited by examiner

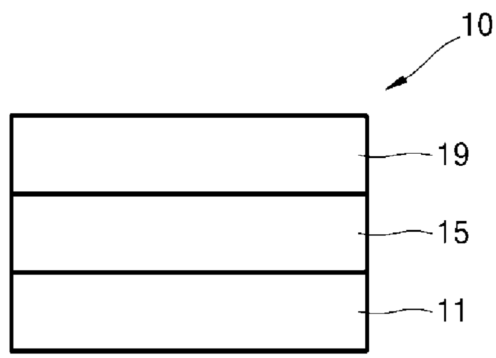
10
19
15
11

ORGANOMETALLIC COMPOUND, ORGANIC LIGHT-EMITTING DEVICE INCLUDING ORGANOMETALLIC COMPOUND AND ELECTRONIC APPARATUS INCLUDING THE ORGANIC LIGHT-EMITTING DEVICE

CROSS-REFERENCE TO RELATED APPLICATION

This application claims priority to and the benefit of Korean Patent Applications Nos. 10-2019-0154355, filed on Nov. 27, 2019, and 10-2020-0159546, filed on Nov. 25, 2020, in the Korean Intellectual Property Office, the content of which is incorporated herein in its entirety by reference.

BACKGROUND

1. Field

The present disclosure relates to an organometallic compound, an organic light-emitting device including the organometallic compound and an electronic apparatus including the organic light emitting device.

2. Description of Related Art

Organic light-emitting devices (OLEDs) are self-emission devices which produce full-color images. In addition, OLEDs have wide viewing angles and exhibit excellent driving voltage and response speed characteristics.

Typical OLEDs include an anode, a cathode, and an organic layer that is between the anode and the cathode and includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state to thereby generate light.

SUMMARY

Provided are an organometallic compound, an organic light-emitting device including the organometallic compound and an electronic apparatus including the organic light emitting device.

Additional aspects will be set forth in part in the description which follows and, in part, will be apparent from the description, or may be learned by practice of the presented embodiments of the disclosure.

According an aspect of an embodiment, an organometallic compound is represented by Formula 1:

Formula 1

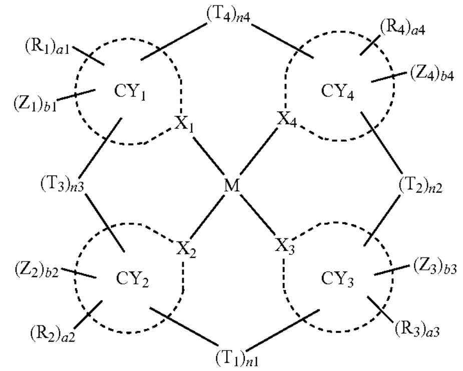

wherein, M in Formula 1 is a transition metal, $X_1$ to $X_4$ in Formula 1 are each independently C or N, in Formula 1, two of a bond between $X_1$ and M, a bond between $X_2$ and M, a bond between $X_3$ and M, and a bond between $X_4$ and M are each a coordinate bond, and the rest may each be a covalent bond, $Z_1$ to $Z_4$ in Formula 1 are each independently a group represented by Formula 2:

Formula 2

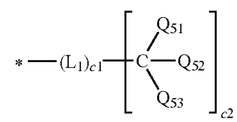

b1 to b4 in Formula 1 are each independently an integer from 0 to 20, and the sum of b1 to b4 is 1 or greater, ring $CY_1$ to ring $CY_4$ in Formula 1 are each independently a $C_5$-$C_{30}$ carbocyclic group or a $C_1$-$C_{30}$ heterocyclic group, $T_1$ in Formula 1 is a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S—*', *—Se—*', *—O—*', *—C(═O)—*', *—S(═O)—*40 , *—S(═O)$_2$—*', *—C($R_{5a}$)═*', *═C($R_{5a}$)—*', *—C($R_{5a}$)═C($R_{5b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_2$ in Formula 1 is a single bond, a double bond, *—N($R_{6a}$)—*', *—B($R_{6a}$)—*', *—P($R_{6a}$)—*', *—C($R_{6a}$)($R_{6b}$)—*', *—Si($R_{6a}$)($R_{6b}$)—*', *—Ge($R_{6a}$)($R_{6b}$)—*', *—S—*', *—Se—*', *—O—*', *—C(═O)—*', *—S(═O)—*', *—S(═O)$_2$—*', *—C($R_{6a}$)═*', *═C($R_{6a}$)—*', *—C($R_{6a}$)═C($R_{6b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_3$ in Formula 1 is a single bond, a double bond, *—N($R_{7a}$)—', *—B($R_{7a}$)—*', *—P($R_{7a}$)—*', *—C($R_{7a}$)($R_{7b}$)—*', *—Si($R_{7a}$)($R_{7b}$)—*', *—Ge($R_{7a}$)($R_{7b}$)—*', *—S—*', *—Se—*', *—O—*', *—C(═O)—*', *—S(═O)—', *—S(═O)$_2$—*', *—C($R_{7a}$)═*', *═C($R_{7a}$)—*', *—C($R_{7a}$)═C($R_{7b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_4$ in Formula 1 is a single bond, a double bond, *—N($R_{8a}$)—*', *—B($R_{8a}$)—*', *—P($R_{8a}$)—*', *—C($R_{8a}$)

$(R_{8b})$—*', *—$Si(R_{8a})(R_{8b})$—*', *—$Ge(R_{8a})(R_{8b})$—*', *—S—*', *—Se—*', *—O—*', *—C(═O)—*', *—S(═O)—*', *—$S(═O)_2$—*', *—$C(R_{8a})$═*', *═$C(R_{8a})$—*', *—$C(R_{8a})$═$C(R_{8b})$—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, n1 to n4 in Formula 1 are each independently an integer from 0 to 5, and at least three of n1 to n4 are each independently an integer from 1 to 5, in Formula 1, when n1 is 0, $T_1$ is not present, when n2 is 0, $T_2$ is not present, when n3 is 0, $T_3$ is not present, and when n4 is 0, $T_4$ is not present, in Formula 1, when n1 is 2 or greater, at least two $T_1$(s) are identical to or different from each other, when n2 is 2 or greater, at least two $T_2$(s) are identical to or different from each other, when n3 is 2 or greater, at least two $T_3$(s) are identical to or different from each other, and when n4 is 2 or greater, at least two $T_4$(s) are identical to or different from each other, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ in Formulae 1 and 2 are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted unsaturated $C_1$-$C_{10}$ heterocyclic group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(═O)(Q_8)(Q_9)$, or —$P(Q_8)(Q_9)$, and none of $Q_{51}$ to $Q_{53}$ in Formula 2 may be hydrogen, at least one of $Q_{51}$ to $Q_{53}$ in Formula 2 is independently a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, a1 to a4 in Formula 1 are each independently an integer from 0 to 20, $L_1$ in Formula 2 is a single bond, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, c1 in Formula 2 is an integer from 1 to 10, c2 in Formula 2 is an integer from 1 to 20, at least two $R_1$(s) in the number of a1 in Formula 1 is optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two $R_2$(s) in the number of a2 in Formula 1 is optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two $R_3$(s) in the number of a3 in Formula 1 is optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two $R_4$(s) in the number of a4 in Formula 1 is optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, at least two $R_1$ to $R_4$, $R_{5a}$, $R_{5b}$, $R_{6a}$, $R_{6b}$, $R_{7a}$, $R_{7b}$, $R_{8a}$, and $R_{8b}$ is optionally bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is understood by referring to the description of $R_1$ provided herein,

* and *' each indicate a binding site to an adjacent atom, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted heterocycloalkyl group, the substituted $C_3$-$C_{10}$ cycloalkenyl group, the substituted $C_2$-$C_{10}$ heterocycloalkenyl group, the substituted unsaturated $C_1$-$C_{10}$ heterocyclic group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(═O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$S(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or any combination thereof, wherein $Q_1$ to $Q_9$, $Q_{11}$ to $Q_{19}$, $Q_{21}$ to $Q_{29}$, and $Q_{31}$ to $Q_{39}$ is independently hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; an unsaturated $C_1$-$C_{10}$ heterocyclic group, a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

According to an aspect of another embodiment, an organic light-emitting device may include: a first electrode; a second electrode; and an organic layer disposed between the first electrode and the second electrode and including an emission layer, wherein the organic layer may include at least one organometallic compound represented by Formula 1.

The organometallic compound may be included in the emission layer of the organic layer, and the organometallic compound included in the emission layer may serve as a dopant.

According to an aspect of another embodiment, there is provided an electronic apparatus including the organic light-emitting device.

BRIEF DESCRIPTION OF THE DRAWINGS

The above and other aspects, features, and advantages of certain embodiments of the disclosure will be more apparent from the following description taken in conjunction with the accompanying drawings, in which:

The FIGURE is a schematic cross-sectional view of an organic light-emitting device according to an exemplary embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

According to an aspect, an organometallic compound may be represented by Formula 1:

Formula 1

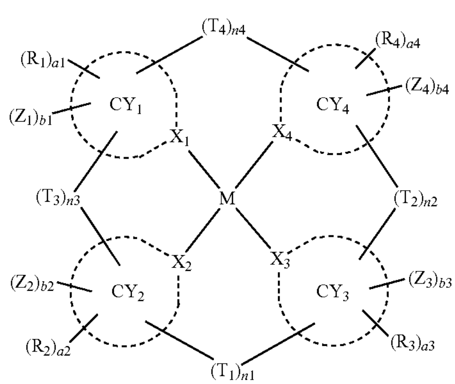

wherein, in Formula 1, M may be a transition metal.

In some embodiments, M may a first-row transition metal, a second-row transition metal, or a third-row transition metal in the periodic table of elements.

In some embodiments, M may be iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

In some embodiments, M in Formula 1 may be Pt, Pd, or Au.

In Formula 1, $X_1$ to $X_4$ may each independently be C or N.

In some embodiments, $X_2$ and $X_3$ may each be C, and $X_4$ may be N.

In some embodiments, $X_1$ to $X_3$ may each be C, and $X_4$ may be N.

In Formula 1, two a bond between $X_1$ and M, a bond between $X_2$ and M, a bond between $X_3$ and M, and a bond between $X_4$ and M may each be a coordinate bond, and the rest may each be a covalent bond.

In some embodiments, a bond between $X_1$ and M in Formula 1 may be a coordinate bond. For example, in Formula 1, a bond between $X_1$ and M may be a coordinate bond and $X_1$ may be C. Alternatively, in Formula 1, a bond between $X_1$ and M may be a coordinate bond and $X_1$ may be N.

In one or more embodiments, in Formula 1, a bond between $X_1$ and M and a bond between $X_4$ and M may each be a coordinate bond, and a bond between $X_2$ and M and a bond between $X_3$ and M may each be a covalent bond.

In one or more embodiments, in Formula 1, $X_2$ and $X_3$ may each be C, $X_4$ may be N, a bond between $X_2$ and M and a bond between $X_3$ and M may each be a covalent bond, and a bond between $X_1$ and M and a bond between $X_4$ and M may each be a coordinate bond.

$Z_1$ to $Z_4$ in Formula 1 may each independently be a group represented by Formula 2:

Formula 2

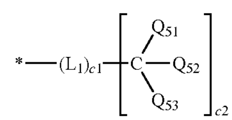

Formula 2 may be understood by referring to the description thereof provided herein.

In Formula 1, b1 to b4 may respectively indicate the number of $Z_1$(s) to $Z_4$(s), and b1 to b4 may each independently be an integer from 0 to 20 (e.g., 0, 1, 2, or 3), wherein the sum of b1 to b4 may be 1 or greater (e.g., 1, 2, 3, 4, 5, or 6). That is, the organometallic compound represented by Formula 1 may include at least one (e.g., one, two, three, four, five, or six) group represented by Formula 2. When b1 is 2 or greater, at least two $Z_1$ groups may be identical to or different from each other, when b2 is 2 or greater, at least two $Z_2$ groups may be identical to or different from each other, when b3 is 2 is or greater, at least two $Z_3$ groups may be identical to or different from each other, and when b4 is 2 is or greater, at least two $Z_4$ groups may be identical to or different from each other.

In some embodiments, in Formula 1, b1 may be 0, 1, 2 or 3 and b2 to b4 may be 0 or 1.

In some embodiments, in Formula 1, the sum of b1, b2, b3 and b4 may be 1, 2 or 3.

In some embodiments, in Formula 1, i) b1 may be 1, 2 or 3, and b2, b3, and b4 may each be 0, ii) b2 may be 1, and b1, b3, and b4 may each be 0, iii) b3 may be 1, and b1, b2, and b4 may each be 0, iv) b4 may be 1, and b1, b2, and b3 may be 0, v) b1 may be 1 or 2, b2 may be 1, and b3 and b4 may each be 0, vi) b1 may be 1 or 2, b3 may be 1, and b2 and b4 may each be 0, vii) b1 may be 1 or 2, b4 may be 1, and b2 and b3 may each be 0, viii) b1 may be 0, b2 may be 1, and b3 may be 1, and b4 may be 0, ix) b1 may be 0, b2 may be 1, and b3 may be 0, and b4 may be 1, or x) b1 may be 0, b2 may be 0, and b3 may be 1, and b4 may be 1.

In Formula 1, ring $CY_1$ to ring $CY_4$ may each independently be a $C_5$-$C_{30}$ carbocyclic group or a $C_1$-$C_{30}$ heterocyclic group.

In some embodiments, ring $CY_1$ to ring $CY_4$ in Formula 1 may each independently be i) a first ring, ii) a second ring, iii) a condensed ring in which at least two first rings are condensed, iv) a condensed ring in which at least two second rings are condensed, or v) a condensed ring in which at least one first ring is condensed with at least one second ring, the first ring may be a cyclopentane group, a cyclopentadiene group, a furan group, a thiophene group, a pyrrole group, a silole group, a borole group, a phosphole group, a germole group, a selenophene group, an oxazole group, an isoxazole group, a 1,2,3-oxadiazole group, a 1,2,4-oxadiazole group, a 1,2,5-oxadiazole group, a 1,3,4-oxadiazole group, an oxatriazole group, an isooxatriazole group, a thiazole group, an isothiazole group, a 1,2,3-thiadiazole group, a 1,2,4-thiadiazole group, a 1,2,5-thiadiazole group, a 1,3,4-thiadiazole group, a thiatriazole group, an isothiatriazole group, a pyrazole group, an imidazole group, a 1,2,3-triazole group, a 1,2,4-triazole group, a tetrazole group, an azasilole group, a 1,2,3-diazasilole group, a 1,2,4-diazasilole group, a 1,2,5-diazasilole group, a 1,3,4-diazasilole group, or a triazasilole group, and the second ring may be an adamantane group, a norbornane group, a norbornene group, a cyclohexane group, a cyclohexene group, a cyclohexadiene group, a benzene group, a pyridine group, a pyrimidine group, a pyrazine group, a pyridazine group, a 1,3,5-triazine group, a 1,2,3-triazine group, a 1,2,4-triazine group, a 1,2-oxazine group, a 1,3-oxazine group, a 1,4-oxazine group, a 1,2-thiazine group, a 1,3-thiazine group, a 1,4-thiazine group, a dihydropyrazine group, a dihydropyridine group, or a dihydroazasilole group.

In some embodiments, ring $CY_1$ in Formula 1 may be i) a first ring, ii) a condensed ring in which at least two first rings are condensed, or iii) a condensed ring in which at least one first ring is condensed with at least one second ring, and C or N in the first ring included in ring $CY_1$ may be $X_1$ in Formula 1. That is, the first ring (e.g., a 5-membered ring) included in ring $CY_1$ may be bound to M in Formula 1. The first ring and the second ring may respectively be understood by referring to the descriptions of the first ring and the second ring provided herein.

In one or more embodiments, in Formula 1, ring $CY_1$ to ring $CY_4$ may each independently be a cyclopentane group, a cyclopentene group, a cyclohexane group, a cyclohexene group, a cyclohexadiene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, a borole group, a phosphole group, a germole group, a selenophene group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a 1,3,5-triazine group, a 1,2,3-triazine group, a 1,2,4-triazine group, a quinoline group, an isoquinoline group, a quinoxaline group, a quinazoline group, a phenanthroline group, a pyrrole group, a pyrazole group, an imidazole group, a 1,2,3-triazole group, a 1,2,4-triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

In one or more embodiments, in Formula 1, ring $CY_1$ may be a pyrazole group, an imidazole group, a 1,2,3-triazole group, a 1,2,4-triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a pyridine group, a pyrimidine group, a pyrazine group, a pyridazine group, a 1,3,5-triazine group, a 1,2,3-triazine group, a 1,2,4-triazine group, a quinoline group, an isoquinoline group, a quinoxaline group, a quinazoline group, a 5,6,7,8-tetrahydroisoquinoline group, or a 5,6,7,8-tetrahydroquinoline group.

In one or more embodiments, in Formula 1, ring $CY_2$ and $CY_3$ may each independently be a benzene group, a naphthalene group, a carbazole group, a fluorene group, a dibenzosilole group, a dibenzothiophene group, a dibenzofuran group, an azacarbazole group, an azafluorene group, an azadibenzosilole group, an azadibenzothiophene group, an azadibenzofuran group, a pyridine group, a pyrimidine group, a pyrazine group, a pyridazine group, a 1,3,5-triazine group, a 1,2,3-triazine group, a 1,2,4-triazine group, a quinoline group, an isoquinoline group, a quinoxaline group, a quinazoline group, a 5,6,7,8-tetrahydroisoquinoline group, or a 5,6,7,8-tetrahydroquinoline group.

In one or more embodiments, in Formula 1, ring $CY_4$ may be a benzene group, a naphthalene group, a carbazole group, a fluorene group, a dibenzosilole group, a dibenzothiophene group, a dibenzofuran group, an azacarbazole group, an azafluorene group, an azadibenzosilole group, an azadibenzothiophene group, an azadibenzofuran group, a pyridine group, a pyrimidine group, a pyrazine group, a pyridazine group, a 1,3,5-triazine group, a 1,2,3-triazine group, a 1,2,4-triazine group, a quinoline group, an isoquinoline group, a quinoxaline group, a quinazoline group, a 5,6,7,8-tetrahydroisoquinoline group, a 5,6,7,8-tetrahydroquinoline group, benzimidazole group, a benzoxazole group, or a benzothiazole group.

In Formula 1, $T_1$ may be a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S—*', *—Se—*', *—O—*', *—C(═O)—*', *—S(═O)—*', *—S(═O)$_2$—*', *—C($R_{5a}$)═*', *═C($R_{5a}$)—*', *—C($R_{5a}$)═C($R_{5b}$)—*', *—C(═S)—*', *—C≡C*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_2$ may be a single bond, a double bond, *—N($R_{6a}$)—*', *—B($R_{6a}$)—*', *—P($R_{6a}$)—*', *—C($R_{6a}$)($R_{6b}$)—*', *—Si($R_{6a}$)($R_{6b}$)—*', *—Ge($R_{6a}$)($R_{6b}$)—*', *—S—*', *—Se—*', *—O—*', *—C(═O)—*', *—S(═O)—*', *—S(═O)$_2$—*', *—C($R_{6a}$)═*', *═C($R_{6a}$)—*', *—C($R_{6a}$)═C($R_{6b}$)—*', *—O(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_3$ may be a single bond, a double bond, *—N($R_{7a}$)—*', *—B($R_{7a}$)—*', *—P($R_{7a}$)—*', *—C($R_{7a}$)($R_{7b}$)—*', *—Si($R_{7a}$)($R_{7b}$)—*', *—Ge($R_{7a}$)($R_{7b}$)—*', *—S—*', *—Se—', *—O—', *—C(═O)—*', *—S(═O)—*', *—S(═O)$_2$—*', *—C($R_{7a}$)═*', *═C($R_{7a}$)—*', *—C($R_{7a}$)═C($R_{7b}$)—*', *—O(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, and $T_4$ may be a single bond, a double bond, *—N($R_{8a}$)—*', *—B($R_{8a}$)—*', *—P($R_{8a}$)—*', *—C($R_{8a}$)($R_{8b}$)—*', *—Si($R_{8a}$)($R_{8b}$)—*', *—Ge($R_{8a}$)($R_{8b}$)—*', *—S—*', *—Se—*', *—O—*', *—C(═O)—*', *—S(═O)—*', *—S(═O)$_2$—*', *—C($R_{8a}$)═*', *═C($R_{8a}$)—*', *—C($R_{8a}$)═C($R_{8b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$. $R_{5a}$, $R_{5b}$, $R_{6a}$, $R_{6b}$, $R_{7a}$, $R_{7b}$, $R_{8a}$, and $R_{8b}$ may respectively be understood by referring to the descriptions of $R_{5a}$, $R_{5b}$, $R_{6a}$, $R_{6b}$, $R_{7a}$, $R_{7b}$, $R_{8a}$, and $R_{8b}$ provided herein.

In one or more embodiments, in Formula 1, $T_1$ may be *—N($R_{5a}$)—*', *—B($R_{5a}$)—*', *—C($R_{5a}$)($R_{5b}$)—*', *—Si($R_{5a}$)($R_{5b}$)—*', *—S—*', or *—O—*'.

In one or more embodiments, in Formula 1, $T_2$ may be a single bond, *—N($R_{6a}$)—*', *—B($R_{6a}$)—*', *—C($R_{6a}$)($R_{6b}$)—*', *—Si($R_{6a}$)($R_{6b}$)—*', *—S—*', or *—O—*'.

In one or more embodiments, in Formula 1, $T_3$ may be a single bond.

In one or more embodiments, in Formula 1, $T_4$ may be *—N($R_{8a}$)—*', *—B($R_{8a}$)—*', *—C($R_{8a}$)($R_{8b}$)—*', *—Si($R_{8a}$)($R_{8b}$)—*', *—O—*', a $C_6$-$C_{30}$ carbocyclic group unsubstituted or substituted with at least one $R_{10a}$, or a $C_1$-$C_{30}$ heterocyclic group unsubstituted or substituted with at least one $R_{10a}$.

n1 to n4 in Formula 1 may each independently be an integer from 0 to 5, and at least three of n1 to n4 may each independently be an integer from 1 to 5. That is, the organometallic compound represented by Formula 1 may be a tetradentate ligand.

In one or more embodiments, in Formula 1, i) n1 may be 0 and n2, n3 and n4 may each independently be an integer from 1 to 5, ii) n2 may be 0 and n1, n3 and n4 may each independently be an integer from 1 to 5, iii) n3 may be 0 and n1, n2 and n4 may each independently be an integer from 1 to 5, iv) n4 may be 0 and n1, n2 and n3 may each independently be an integer from 1 to 5, or v) n1, n2, n3 and n4 may each independently be an integer from 1 to 5.

In Formula 1, when n1 is 0, $T_1$ may not be present, when n2 is 0, $T_2$ may not be present, when n3 is 0, $T_3$ may not be present, and when n4 is 0, $T_4$ may not be present.

In Formula 1, when n1 is 2 or greater, at least two $T_1$(s) may be identical to or different from each other, when n2 is 2 or greater, at least two $T_2$(s) may be identical to or different from each other, when n3 is 2 or greater, at least two $T_3$(s) may be identical to or different from each other, and when n4 is 2 or greater, at least two $T_4$(s) may be identical to or different from each other.

In some embodiments, in Formula 1, 1) n4 may be 0, and n1, n2, and n3 may be 1, 2) n4 may be 1, 2, 3, or 4, and n1, n2, and n3 may each be 1, 3) n3 may be 0, n1 and n2 may each be 1, and n4 may be 1, 2, 3, or 4, 4) n2 may be 0, n1 and n3 may each be 1, and n4 may be 1, 2, 3, or 4, or 5) n1 may be 0, n2 and n3 may each be 1, and n4 may be 1, 2, 3, or 4.

In some embodiments, in Formula 1, n1 and n3 may each not be 0.

In some embodiments, in Formula 1, n1 may not be 0 (for example, n1 may be 1), and $T_1$ may be *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S—*', or *—O—*'.

In one or more embodiments, in Formula 1, n2 may not be 0 (for example, n2 may be 1), and $T_2$ may be a single bond.

In one or more embodiments, in Formula 1, n2 may not be 0 (for example, n2 may be 1), and $T_2$ may be *—N($R_{6a}$)—*', *—B($R_{6a}$)—*', *—P($R_{6a}$)—*', *—C($R_{6a}$)($R_{6b}$)—*', *—Si($R_{6a}$)($R_{6b}$)—*', *—Ge($R_{6a}$)($R_{6b}$)—*', *—S—*', or *—O—*'.

In one or more embodiments, in Formula 1, n3 may not be 0 (for example, n3 may be 1), and $T_3$ may be a single bond.

In one or more embodiments, in Formula 1, n4 may be 0.

In one or more embodiments, in Formula 1, n4 may not be 0, and $T_4$ may be *—N($R_{8a}$)—*', *—B($R_{8a}$)—*', *—P($R_{8a}$)—*', *—C($R_{8a}$)($R_{8b}$)—*', *—Si($R_{8a}$)($R_{8b}$)—*', *—Ge($R_{8a}$)($R_{8b}$)—*', *—S—*', *—Se—*', *—O—*', *—C(═O)—*', *—S(═O)—*', *—S(═O)$_2$—*', *—C($R_{8a}$)═*', *═C($R_{8a}$)—*', *—C($R_{8a}$)═C($R_{8b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In one or more embodiments, in Formula 1, n4 may be 1, 2, 3, or 4, and $T_4$ may be *—C($R_{8a}$)($R_{8b}$)—*', *—S—*', *—O—*', or a $C_5$-$C_{30}$ carbocyclic group unsubstituted or substituted with at least one $R_{10a}$.

In Formulae 1 and 2, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted unsaturated $C_1$-$C_{10}$ heterocyclic group, a substituted or unsubstituted $C_6$-$C_{60}$ aryl group, a substituted or unsubstituted $C_7$-$C_{60}$ alkyl aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), wherein none of $Q_{51}$ to $Q_{53}$ in Formula 2 may be hydrogen and at least one of $Q_{51}$ to $Q_{53}$ (e.g., one or two of $Q_{51}$ to $Q_{53}$) in Formula 2 may each independently be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In some embodiments, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_2$-$C_{20}$ alkenyl group, a $C_1$-$C_{20}$ alkoxy group, or a $C_1$-$C_{20}$ alkylthio group;

a $C_1$-$C_{20}$ alkyl group, a $C_2$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a cyclooctenyl group, a cyclopentadienyl group, a cyclohexadienyl group, a cycloheptadienyl group, a cyclooctadienyl group, a cycloheptatrienyl group, a cyclooctatrienyl group, a bicyclo[1.1.1]pentyl group, a bicyclo[2.1.1]hexyl group, a bicyclo[2.2.2]octyl group, a bicyclo[2.2.2]octenyl group, a bicyclo[2.2.2]octadienyl group, a bicyclo[2.2.2]octatrienyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)cyclopentadienyl group, a ($C_1$-$C_{20}$ alkyl)cyclohexadienyl group, a ($C_1$-$C_{20}$ alkyl)cycloheptadienyl group, a ($C_1$-$C_{20}$ alkyl)cyclooctadienyl group, a ($C_1$-$C_{20}$ alkyl)cycloheptatrienyl group, a ($C_1$-$C_{20}$ alkyl)cyclooctatrienyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a ($C_1$-$C_{20}$ alkyl)bicyclo[2.2.2]octadienyl group, a ($C_1$-$C_{20}$ alkyl)bicyclo[2.2.2]octatrienyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a cyclooctenyl group, a cyclopentadienyl group, a cyclohexadienyl group, a cycloheptadienyl group, a cyclooctadienyl group, a cycloheptatrienyl group, a cyclooctatrienyl group, a bicyclo[1.1.1]pentyl group, a bicyclo[2.1.1]hexyl group, a bicyclo[2.2.2]octyl group, a bicyclo[2.2.2]octenyl group, a bicyclo[2.2.2]octadienyl group, a bicyclo[2.2.2]octatrienyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a cyclooctenyl group, a cyclopentadienyl group, a cyclohexadienyl group, a cycloheptadienyl group, a cyclooctadienyl group, a cycloheptatrienyl group, a cyclooctatrienyl group, a bicyclo[1.1.1]pentyl group, a bicyclo[2.1.1]hexyl group, a bicyclo[2.2.2]octyl group, a bicyclo[2.2.2]octenyl group, a bicyclo[2.2.2]octadienyl group, a bicyclo[2.2.2]octatrienyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)cyclopentadienyl group, a ($C_1$-$C_{20}$ alkyl)cyclohexadienyl group, a ($C_1$-$C_{20}$ alkyl)cycloheptadienyl group, a ($C_1$-$C_{20}$ alkyl)cyclooctadienyl group, a ($C_1$-$C_{20}$ alkyl)cycloheptatrienyl group, a ($C_1$-$C_{20}$ alkyl)cyclooctatrienyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), wherein $Q_1$ to $Q_9$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$, or an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

In some embodiments, $Q_{51}$ to $Q_{53}$ may each independently be a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one of $Q_{51}$ to $Q_{53}$ (e.g., one or two of $Q_{51}$ to $Q_{53}$) may be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, $Q_{51}$ to $Q_{53}$ may each independently be a $C_1$-$C_{20}$ alkyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a phenyl group, a ($C_1$-$C_{20}$ alkyl)phenyl group, a biphenyl group, a terphenyl group, a naphthyl group, a pyridinyl group, a pyrimidinyl group, or any combination thereof, wherein at least one of $Q_{51}$ to $Q_{53}$ (e.g., one or two of $Q_{51}$ to $Q_{53}$) may be a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a phenyl group, a ($C_1$-$C_{20}$ alkyl)phenyl group, a biphenyl group, a terphenyl group, a naphthyl group, a pyridinyl group, a pyrimidinyl group, or any combination thereof.

In one or more embodiments, in Formulae 1 and 2, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ may each independently be hydrogen, deuterium, —F, —$CH_3$, —$CD_3$, —$CD_2H$, —$CDH_2$, —$CF_3$, —$CF_2H$, —$CFH_2$, $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with a deuterium, a group represented by one of Formulae 9-1 to 9-39 in which at least one hydrogen is substituted with —F, a group represented by one of Formulae 9-201 to 9-237, a group represented by one of Formulae 9-201 to 9-237 in which at least one hydrogen is substituted with a deuterium, a group represented by one of Formulae 9-201 to 9-237 in which at least one hydrogen is substituted with —F, a group represented by one of Formulae 10-1 to 10-129, a group represented by one of Formulae 10-1 to 10-129 in which at least one hydrogen is substituted with a deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with a deuterium, a group represented by one of Formulae 10-201 to 10-350 in which at least one hydrogen is substituted with —F, —Si($Q_3$)($Q_4$)($Q_5$), or —Ge($Q_3$)($Q_4$)($Q_5$) (wherein $Q_3$ to $Q_5$ may respectively be understood by referring to the descriptions of $Q_3$ to $Q_5$ provided herein), wherein none of $Q_{51}$ to $Q_{53}$ in Formula 2 may be hydrogen and at least one of $Q_{51}$ to $Q_{53}$ may each independently a group represented by one of Formulae 10-12 to 10-129, a group represented by one of Formulae 10-12 to 10-129 in which at least one hydrogen is substituted with a deuterium, a group represented by one of Formulae 10-12 to 10-129 in which at least one hydrogen is substituted with —F, a group represented by one of Formulae 10-201 to 10-350, a group represented by one of Formulae 10-201 to 10-350 in which at least one hydrogen is substituted with a deuterium, or a group represented by one of Formulae 10-201 to 10-350 in which at least one hydrogen is substituted with —F:

9-1
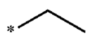

9-2
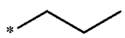

9-3
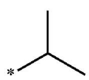

9-4
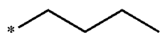

9-5
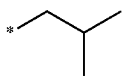

9-6
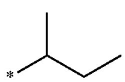

9-7
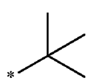

9-8
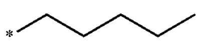

9-9
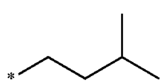

9-10
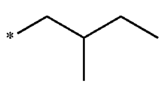

9-11
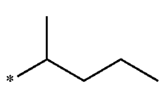

9-12
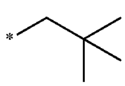

9-13
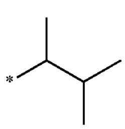

9-14
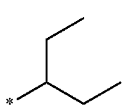

-continued 9-15
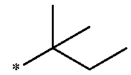

9-16
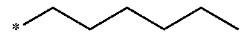

9-17
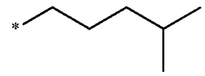

9-18
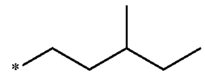

9-19
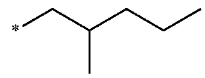

9-20
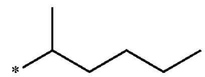

9-21
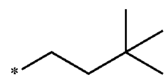

9-22
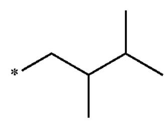

9-23
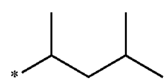

9-24
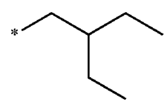

9-25
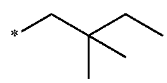

9-26
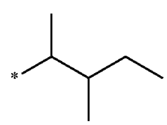

9-27
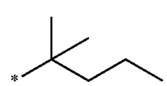

9-28
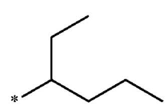

9-29
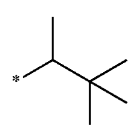

9-30
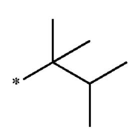

-continued
9-31
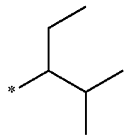
9-32
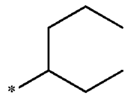
9-33
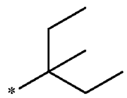
9-34
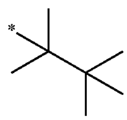
9-35
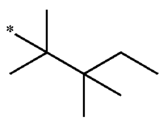
9-36
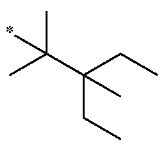
9-37
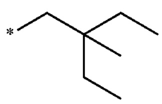
9-38
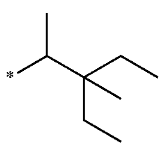
9-39
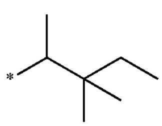
9-201
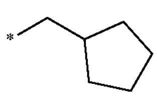
9-202
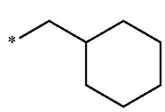
9-203
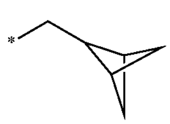
-continued
9-204
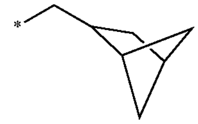
9-205
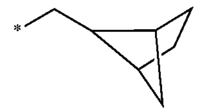
9-206
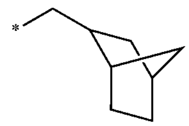
9-207
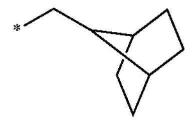
9-208
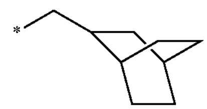
9-209
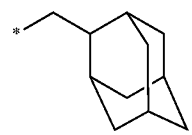
9-210
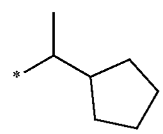
9-211
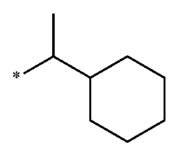
9-212
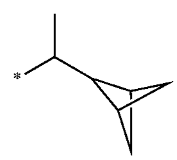
9-213
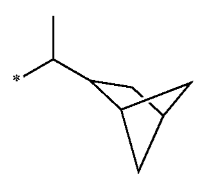
9-214
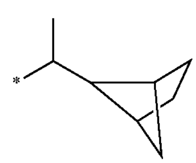

-continued
9-215
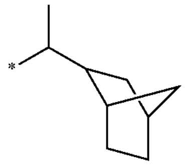
9-216
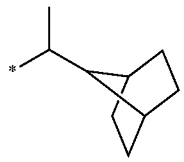
9-217
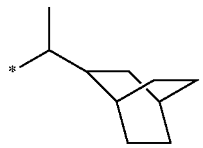
9-218
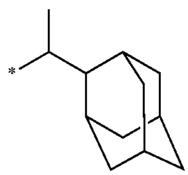
9-219
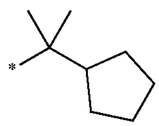
9-220
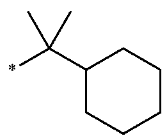
9-221
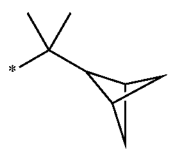
9-222
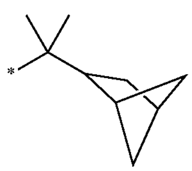
9-223
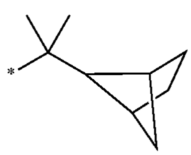
9-224
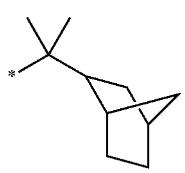
-continued
9-225
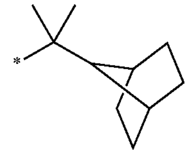
9-226
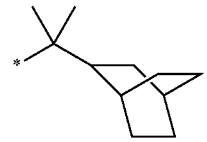
9-227
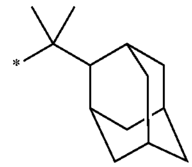
9-228
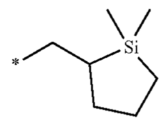
9-229
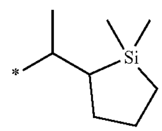
9-230
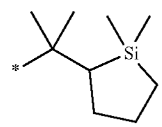
9-231
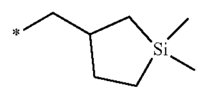
9-232
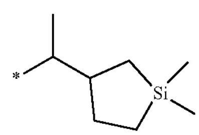
9-233
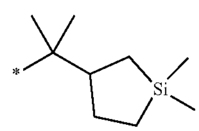
9-234
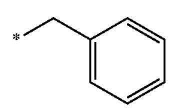
9-235
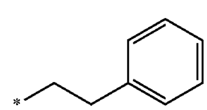
9-236
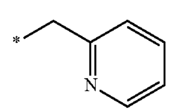

-continued
9-237
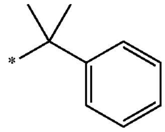
10-1
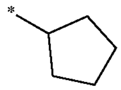
10-2
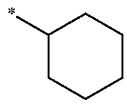
10-3
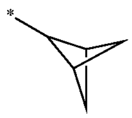
10-4
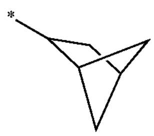
10-5
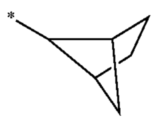
10-6
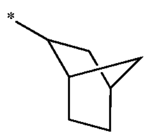
10-7
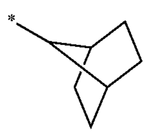
10-8
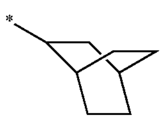
10-9
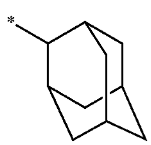
10-10
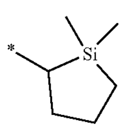
10-11
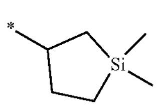
-continued
10-12
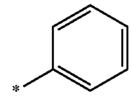
10-13
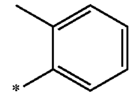
10-14
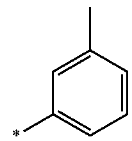
10-15
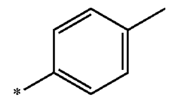
10-16
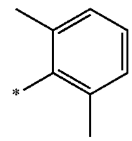
10-17
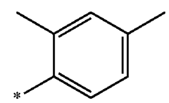
10-18
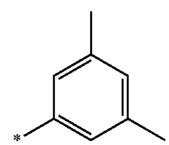
10-19
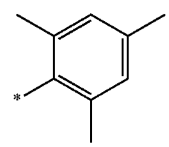
10-20
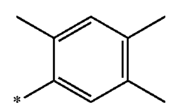
10-21
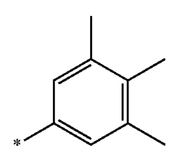
10-22
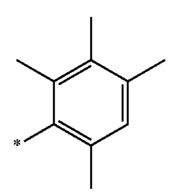

-continued
10-23
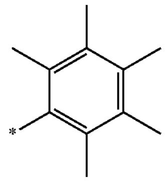
10-24
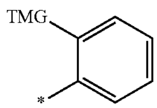
10-25
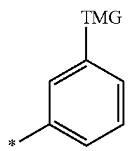
10-26
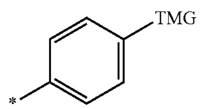
10-27
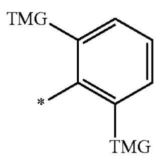
10-28
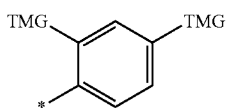
10-29
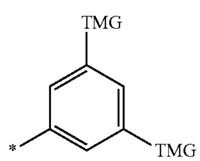
10-30
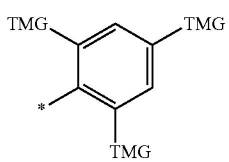
10-31
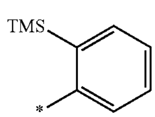
10-32
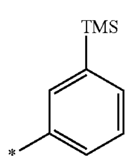
10-33
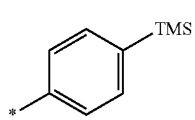
-continued
10-34
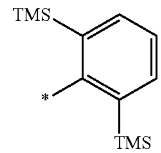
10-35
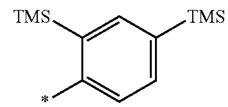
10-36
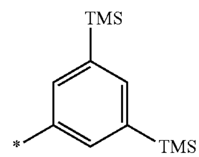
10-37
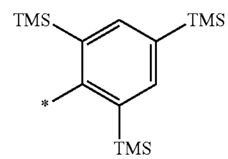
10-38
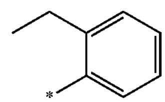
10-39
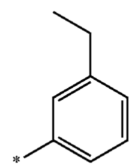
10-40
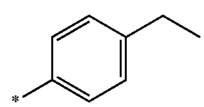
10-41
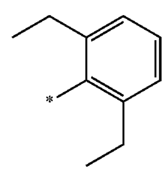
10-42
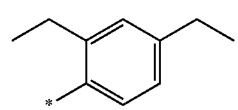
10-43
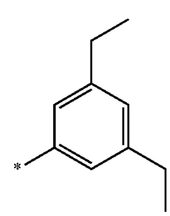

-continued
10-44
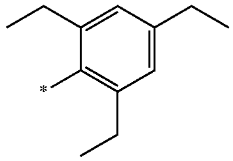
10-45
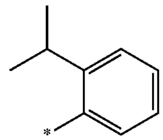
10-46
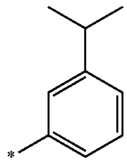
10-47
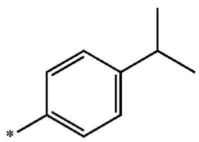
10-48
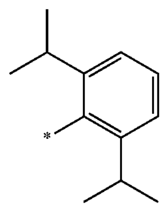
10-49
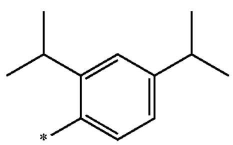
10-50
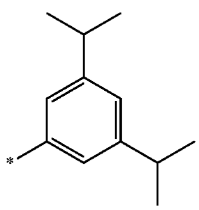
10-51
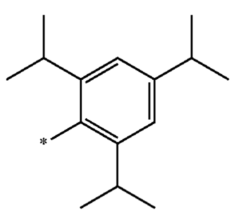
10-52
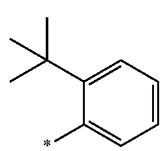
-continued
10-53
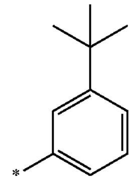
10-54
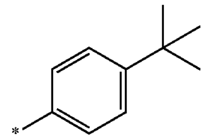
10-55
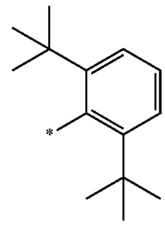
10-56
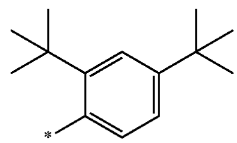
10-57
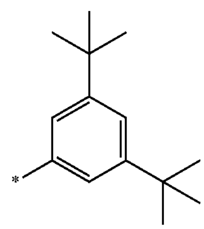
10-58
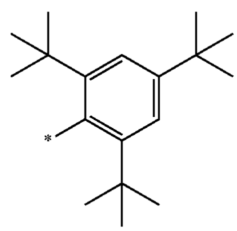
10-59
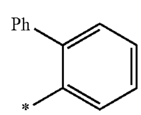
10-60
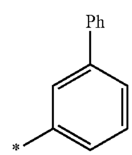
10-61
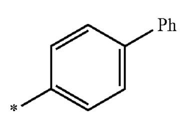

-continued
10-62
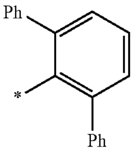
10-63
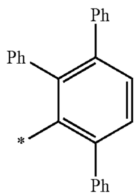
10-64
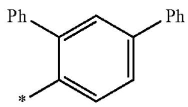
10-65
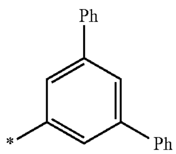
10-66
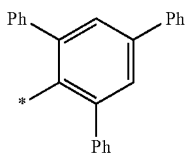
10-67
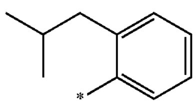
10-68
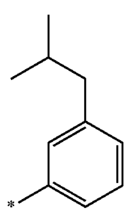
10-69
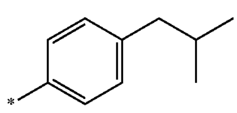
10-70
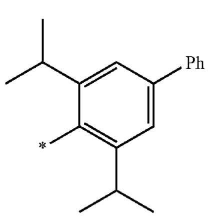
-continued
10-71
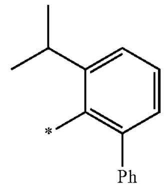
10-72
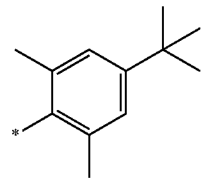
10-73
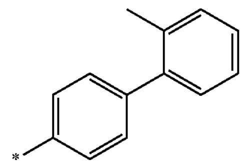
10-74
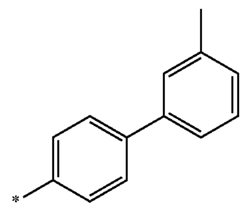
10-75
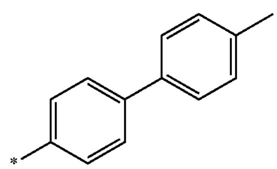
10-76
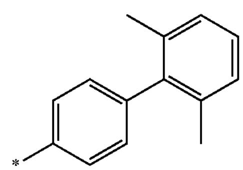
10-77
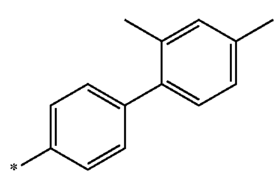
10-78
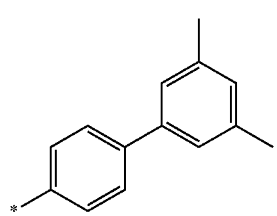

-continued
10-79
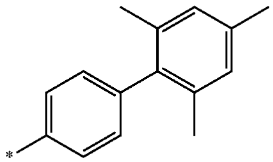
10-80
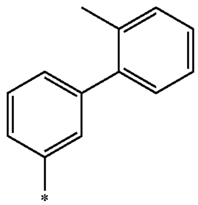
10-81
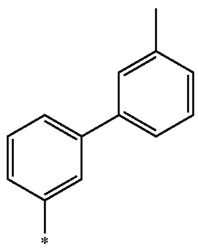
10-82
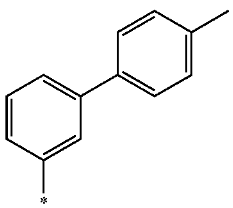
10-83
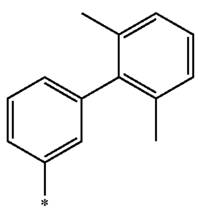
10-84
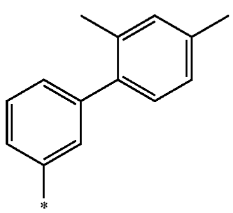
10-85
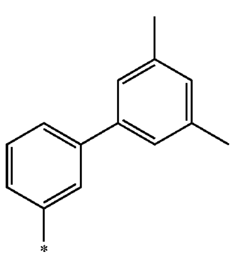
-continued
10-86
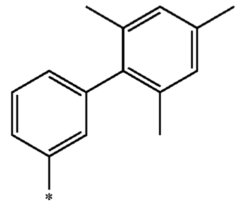
10-87
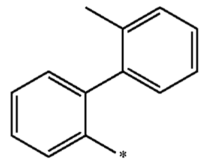
10-88
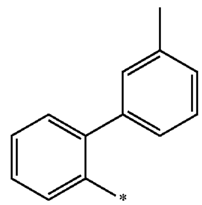
10-89
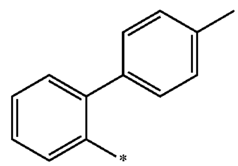
10-90
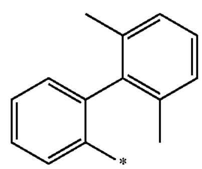
10-91
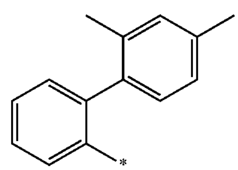
10-92
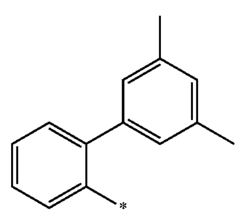
10-93
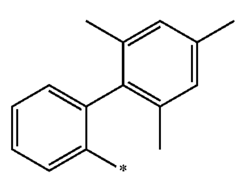

-continued
10-94
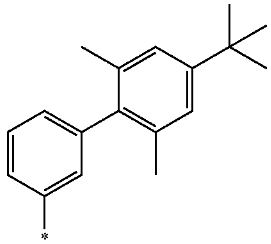
10-95
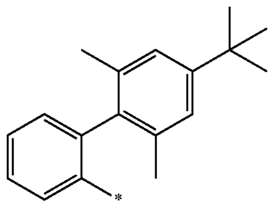
10-96
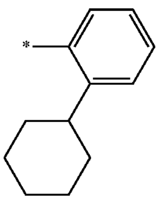
10-97
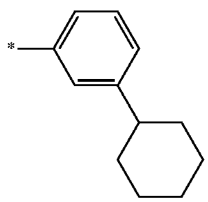
10-98
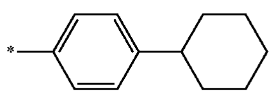
10-99
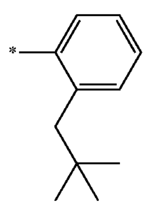
10-100
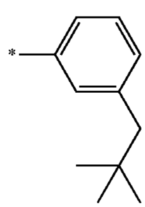
10-101
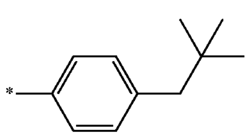
-continued
10-102
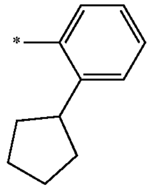
10-103
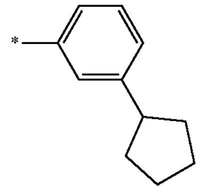
10-104
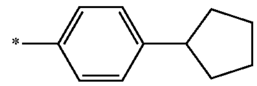
10-105
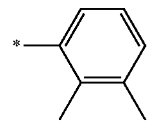
10-106
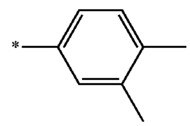
10-107
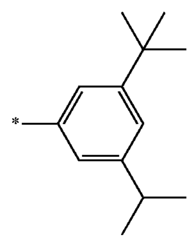
10-108
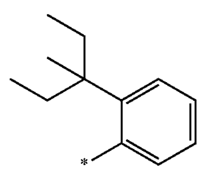
10-109
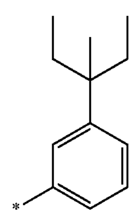
10-110
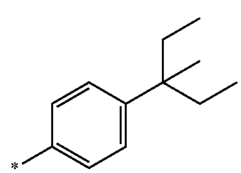

-continued
10-111
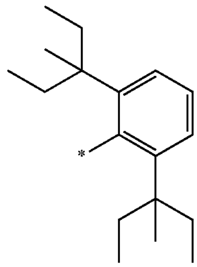
10-112
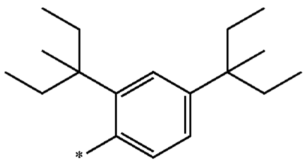
10-113
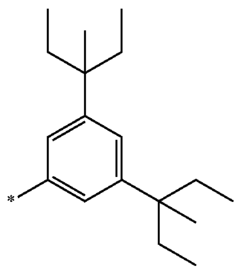
10-114
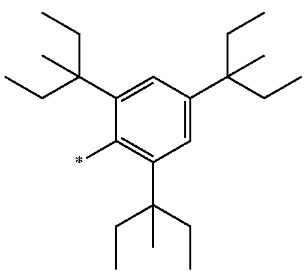
10-115
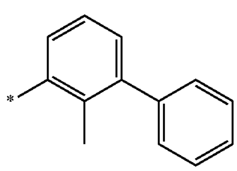
10-116
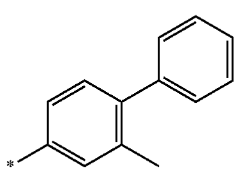
10-117
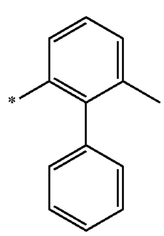
-continued
10-118
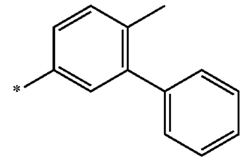
10-119
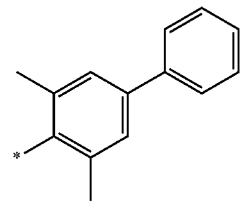
10-120
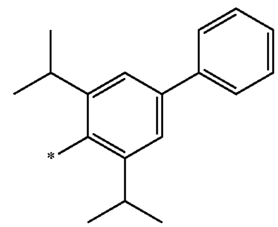
10-121
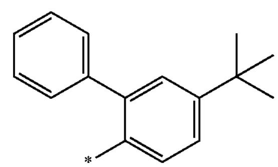
10-122
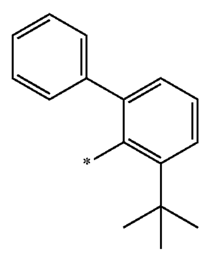
10-123
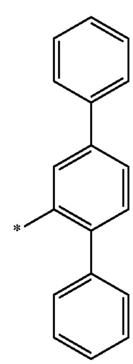

-continued
10-124
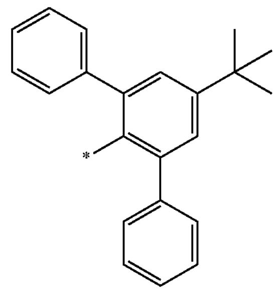
10-125
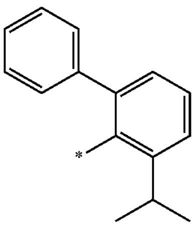
10-126
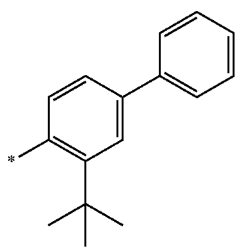
10-127
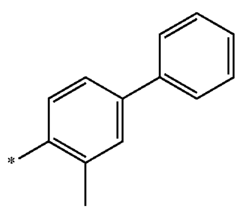
10-128
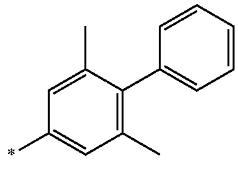
10-129
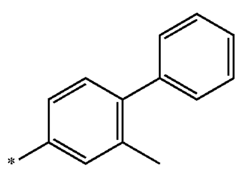
10-201
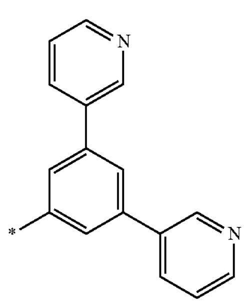
-continued
10-202
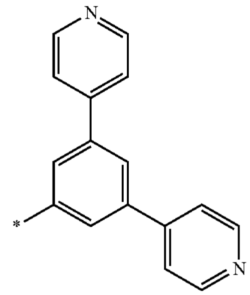
10-203
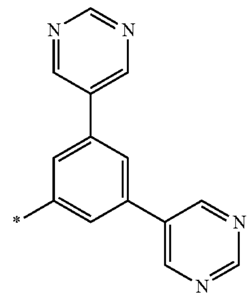
10-204
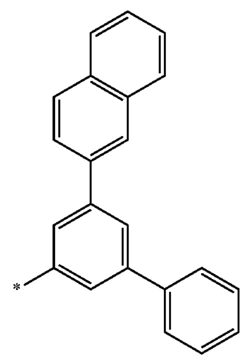
10-205
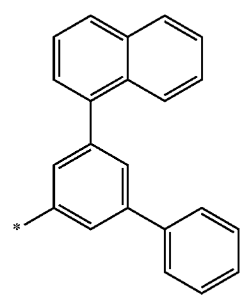
10-206
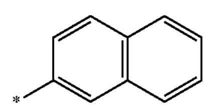
10-207
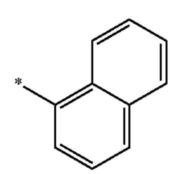
10-208
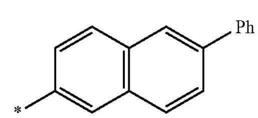

-continued
10-209
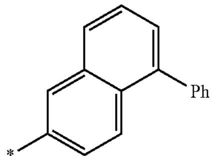
10-210
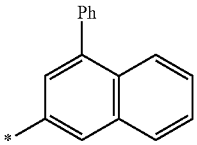
10-211
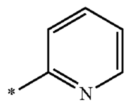
10-212
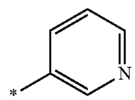
10-213
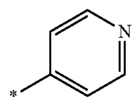
10-214
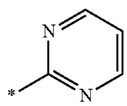
10-215
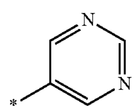
10-216
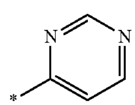
10-217
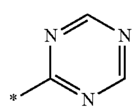
10-218
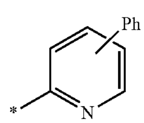
10-219
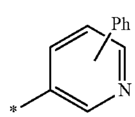
10-220
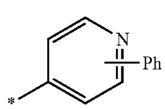
10-221
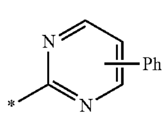
-continued
10-222
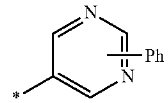
10-223
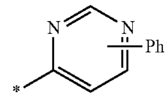
10-224
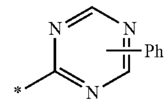
10-225
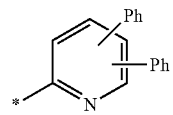
10-226
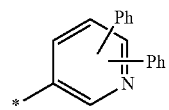
10-227
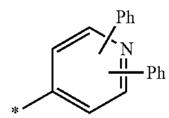
10-228
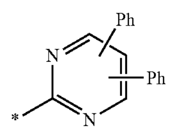
10-229
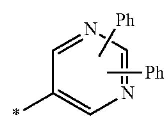
10-230
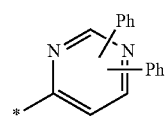
10-231
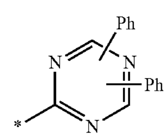
10-232
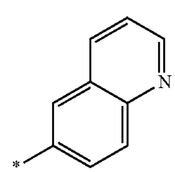
10-233
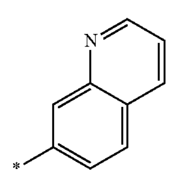

-continued
10-234
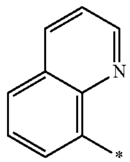
10-235
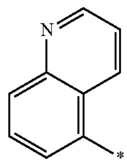
10-236
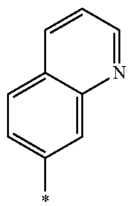
10-237
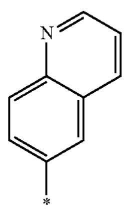
10-238
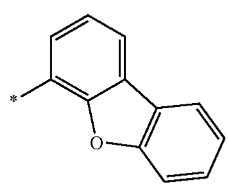
10-239
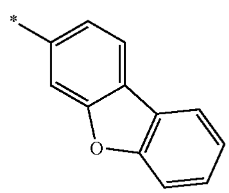
10-240
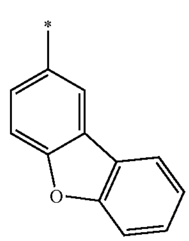
10-241
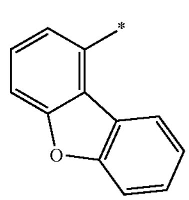
-continued
10-242
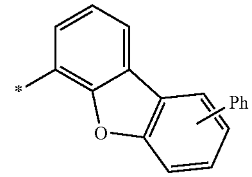
10-243
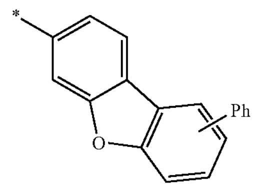
10-244
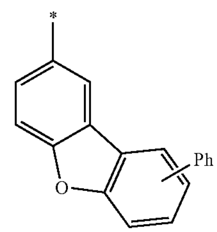
10-245
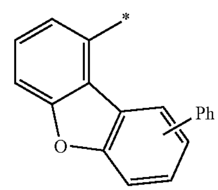
10-246
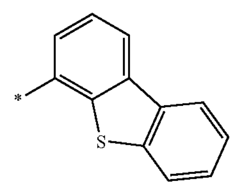
10-247
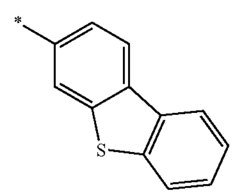
10-248
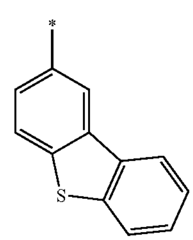
10-249
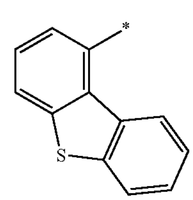

-continued
10-250
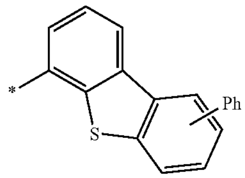
10-251
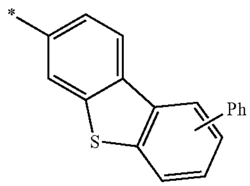
10-252
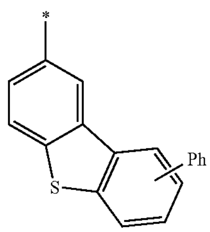
10-253
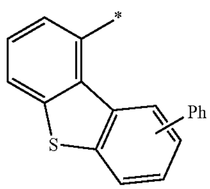
10-254
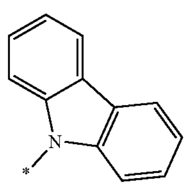
10-255
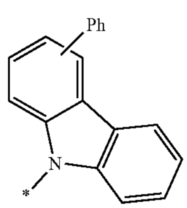
10-256
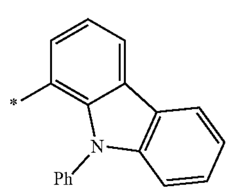
10-257
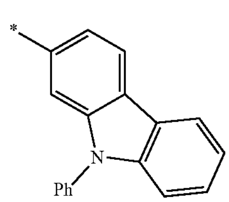
-continued
10-258
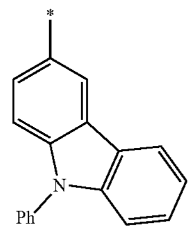
10-259
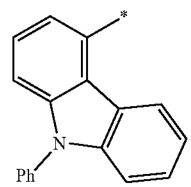
10-260
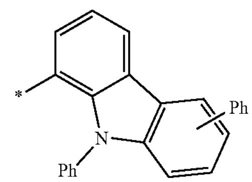
10-261
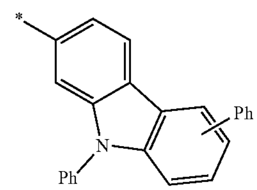
10-262
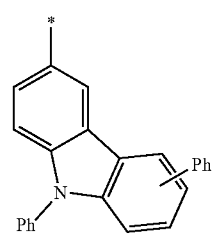
10-263
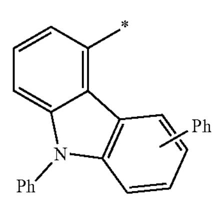
10-264
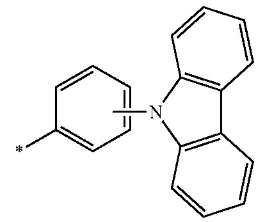

-continued
10-265
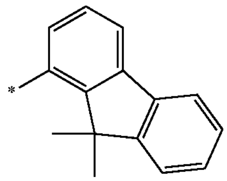
10-266
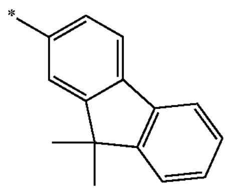
10-267
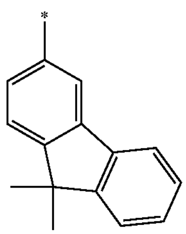
10-268
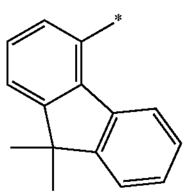
10-269
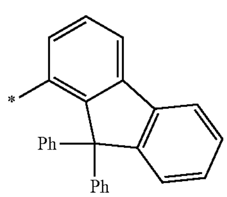
10-270
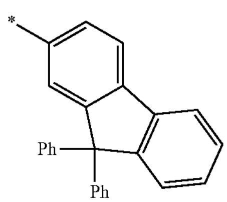
10-271
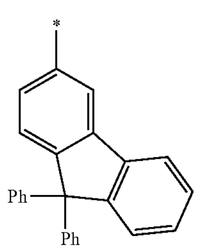
-continued
10-272
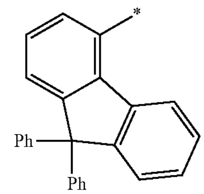
10-273
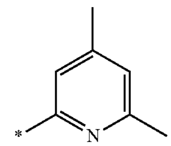
10-274
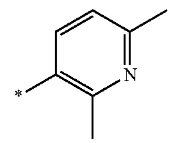
10-275
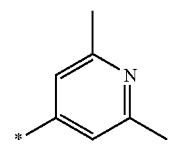
10-276
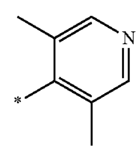
10-277
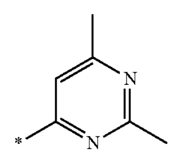
10-278
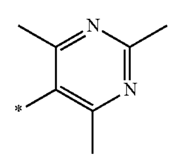
10-279
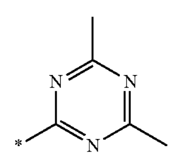
10-280
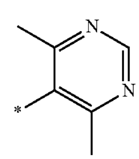
10-281
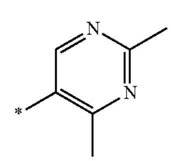

-continued
10-282
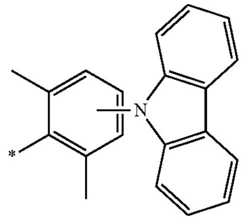
10-283
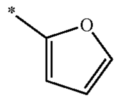
10-284
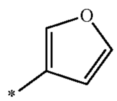
10-285
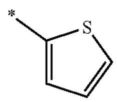
10-286
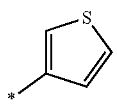
10-287
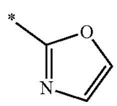
10-288
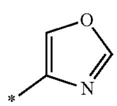
10-289
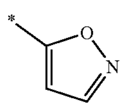
10-290
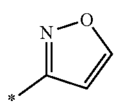
10-291
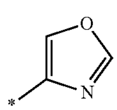
10-292
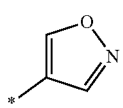
10-293
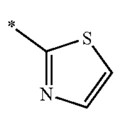
10-294
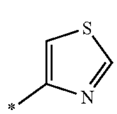
-continued
10-295
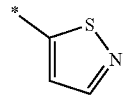
10-296
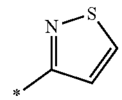
10-297
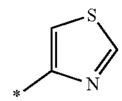
10-298
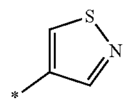
10-299
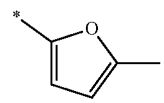
10-300
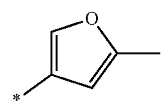
10-301
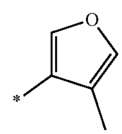
10-302
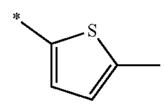
10-303
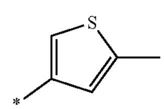
10-304
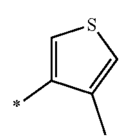
10-305
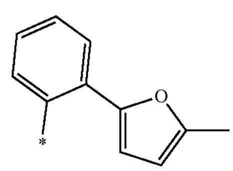
10-306
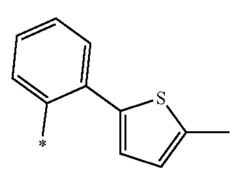

-continued
10-307
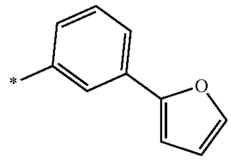
10-308
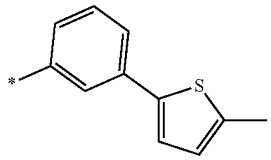
10-309
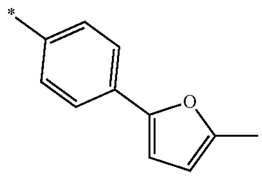
10-310
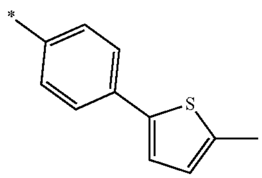
10-311
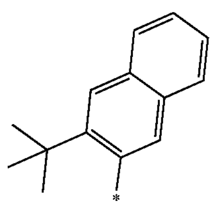
10-312
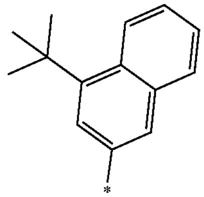
10-313
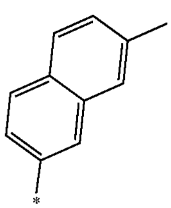
10-314
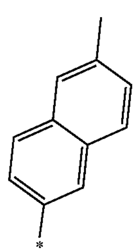
-continued
10-315
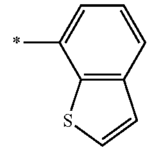
10-316
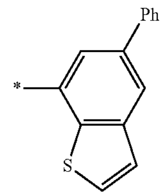
10-317
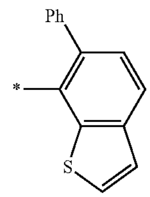
10-318
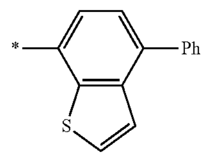
10-319
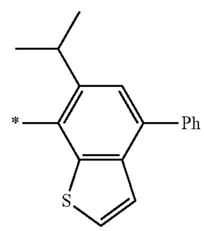
10-320
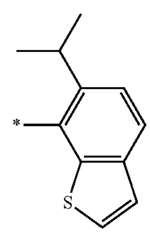
10-321
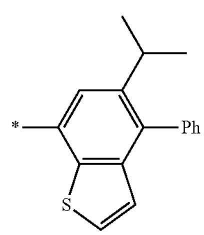
10-322
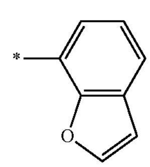

-continued
10-323
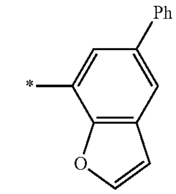
10-324
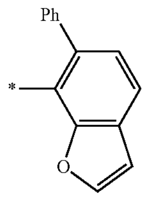
10-325
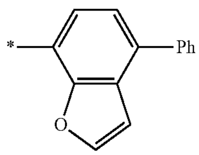
10-326
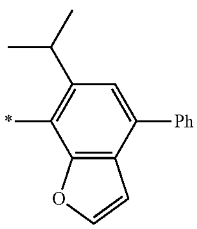
10-327
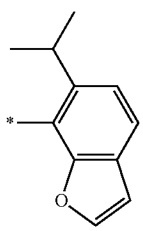
10-328
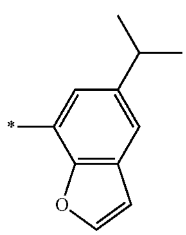
10-329
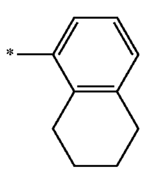
10-330
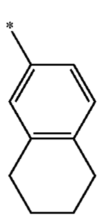
-continued
10-331
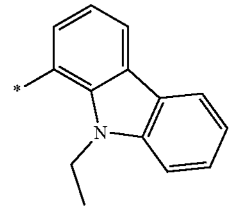
10-332
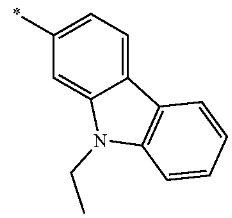
10-333
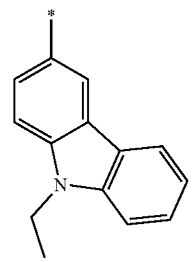
10-334
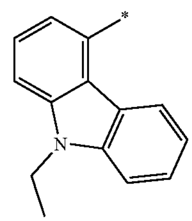
10-335
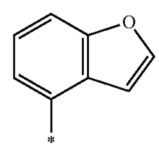
10-336
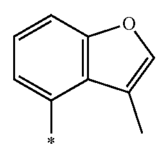
10-337
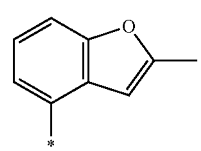
10-338
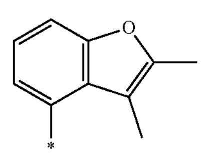

-continued 10-339

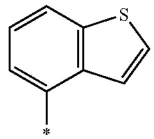

10-340

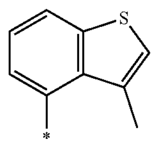

10-341

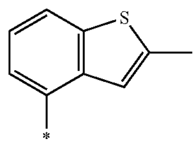

10-342

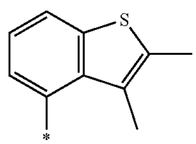

10-343

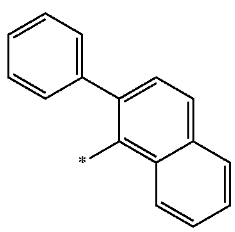

10-344

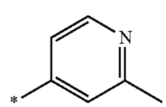

10-345

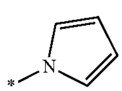

10-346

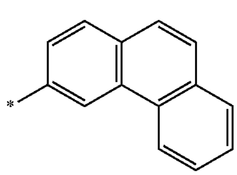

10-347

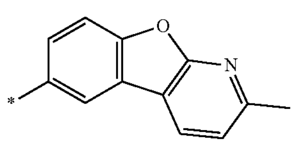

10-348

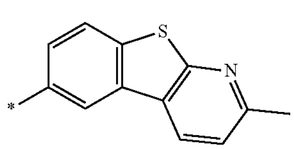

-continued 10-349

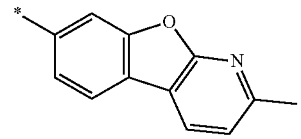

10-350

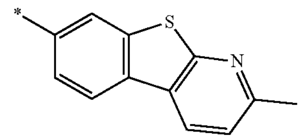

In one or more embodiments, in Formula 2, $Q_{51}$ to $Q_{53}$ may each independently be —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with a deuterium, a group represented by one of Formulae 9-1 to 9-39 in which at least one hydrogen is substituted with —F, a group represented by one of Formulae 10-12 to 10-129, a group represented by one of Formulae 10-1 to 10-129 in which at least one hydrogen is substituted with a deuterium, or a group represented by one of Formulae 10-1 to 10-129 in which at least one hydrogen is substituted with —F.

In one or more embodiments, at least one of $Q_{51}$ to $Q_{53}$ (e.g., one of $Q_{51}$ to $Q_{53}$) may be a group represented by one of Formulae 10-12 to 10-129, a group represented by one of Formulae 10-1 to 10-129 in which at least one hydrogen is substituted with a deuterium, or a group represented by one of Formulae 10-1 to 10-129 in which at least one hydrogen is substituted with —F.

In Formulae 9-1 to 9-39, 9-201 to 9-237, 10-1 to 10-129, and 10-201 to 10-350, * may indicate a binding site to an adjacent atom, "Ph" represents a phenyl group, "TMS" represents a trimethylsilyl group, and "TMG" represents a trimethylgermyl group.

The "group represented by one of Formulae 9-1 to 9-39 in which at least one hydrogen is substituted with a deuterium" and the "group represented by one of Formulae 9-201 to 9-237 in which at least one hydrogen is substituted with a deuterium" may each be, for example, a group represented by one of Formulae 9-501 to 9-514 and 9-601 to 9-636:

9-501

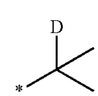

9-502

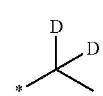

9-503

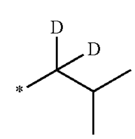

9-504

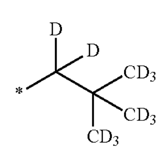

-continued
9-505
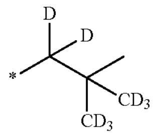
9-506
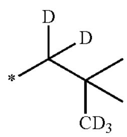
9-507
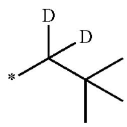
9-508
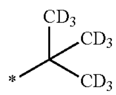
9-509
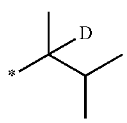
9-510
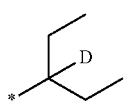
9-511
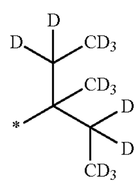
9-512
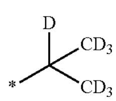
9-513
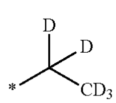
9-514
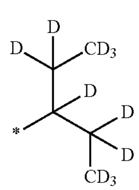
9-601
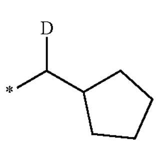
-continued
9-602
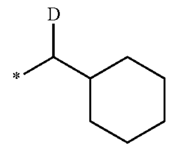
9-603
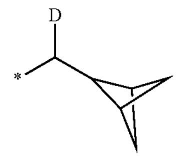
9-604
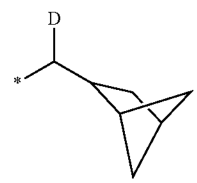
9-605
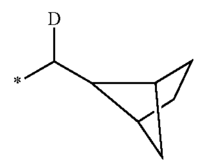
9-606
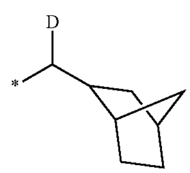
9-607
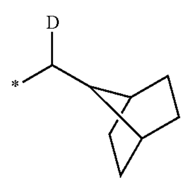
9-608
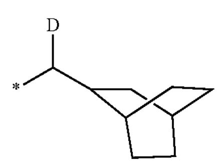
9-609
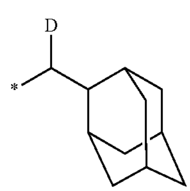
9-610
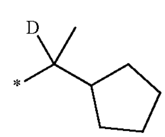

9-611
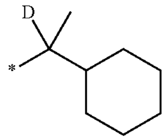
9-612
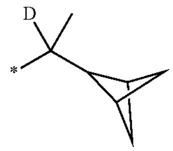
9-613
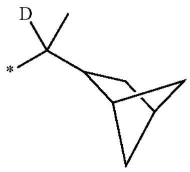
9-614
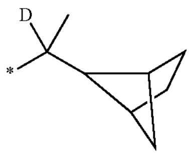
9-615
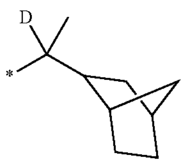
9-616
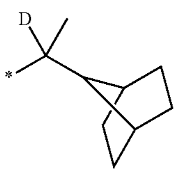
9-617
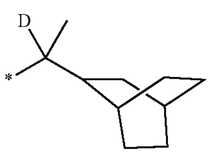
9-618
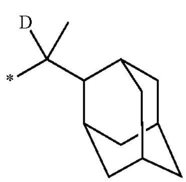
9-619
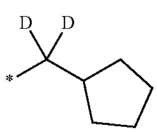
9-620
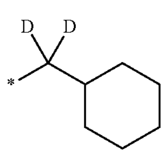
9-621
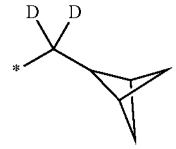
9-622
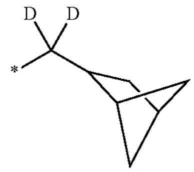
9-623
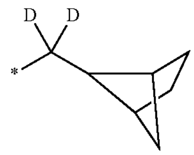
9-624
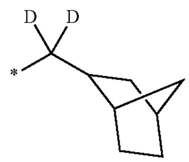
9-625
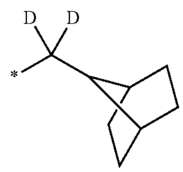
9-626
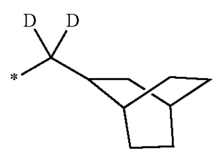
9-627
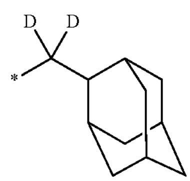
9-628
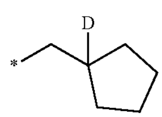
9-629
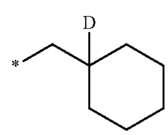
9-630
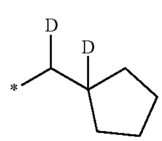

-continued 9-631

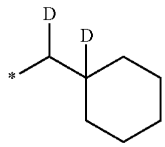

9-632

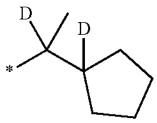

9-633

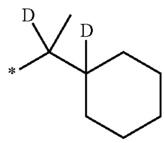

9-634

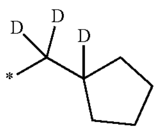

9-635

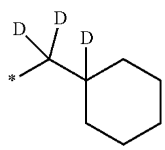

9-636

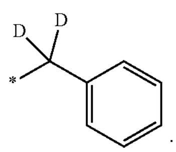

The “group represented by one of Formulae 9-1 to 9-39 in which at least one hydrogen is substituted with —F” and the “group represented by one of Formulae 9-201 to 9-236 in which at least one hydrogen is substituted with —F” may each be, for example, a group represented by one of Formulae 9-701 to 710:

9-701

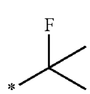

9-702

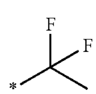

9-703

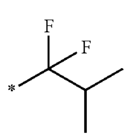

9-704

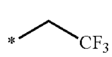

9-705

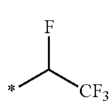

-continued 9-706

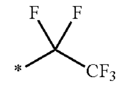

9-707

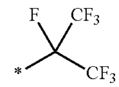

9-708

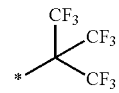

9-709

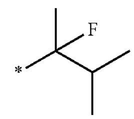

9-710

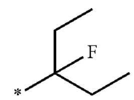

The “group represented by one of Formulae 10-1 to 10-129 in which at least one hydrogen is substituted with a deuterium atom” and the “group represented by one of Formulae 10-201 to 10-350 in which at least one hydrogen is substituted with a deuterium atom” may each be, for example, a group represented by one of Formulae 10-501 to 553:

10-501

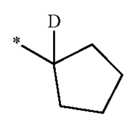

10-502

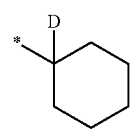

10-503

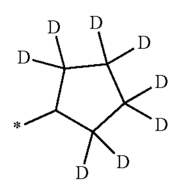

10-504

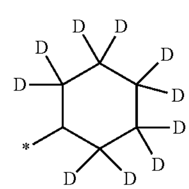

10-505

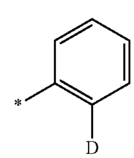

-continued
10-506
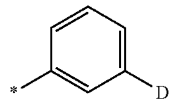
10-507
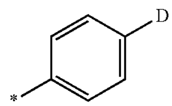
10-508
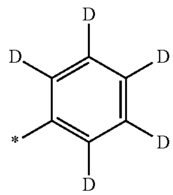
10-509
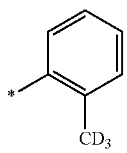
10-510
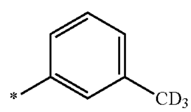
10-511
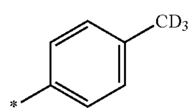
10-512
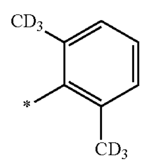
10-513
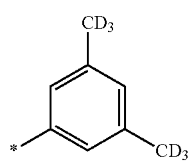
10-514
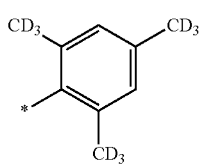
10-515
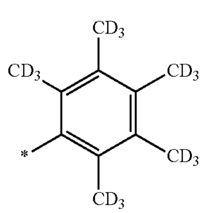
-continued
10-516
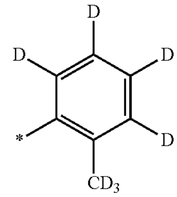
10-517
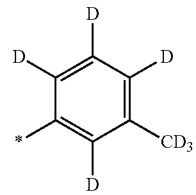
10-518
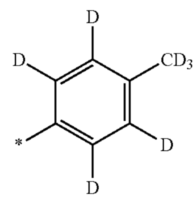
10-519
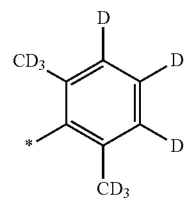
10-520
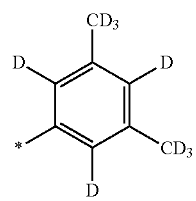
10-521
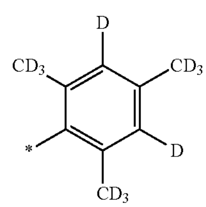
10-522
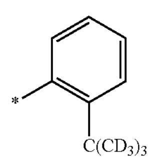
10-523
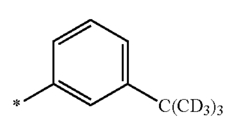
10-524
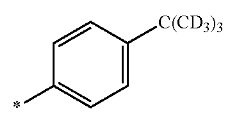

10-525
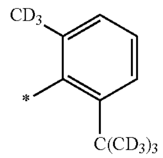
10-526
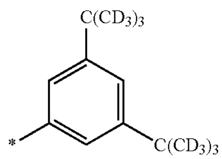
10-527
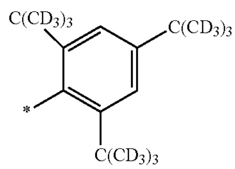
10-528
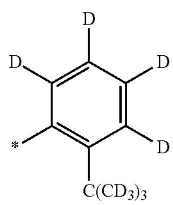
10-529
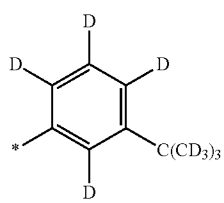
10-530
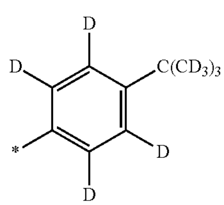
10-531
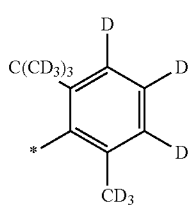
10-532
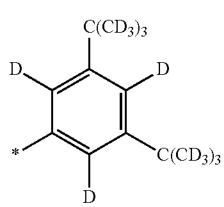
10-533
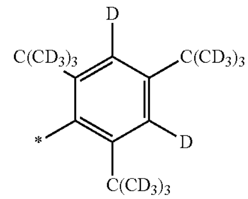
10-534
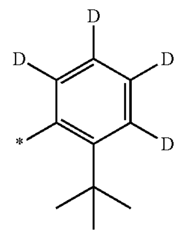
10-535
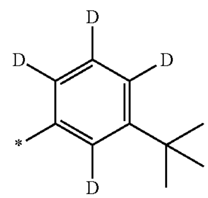
10-536
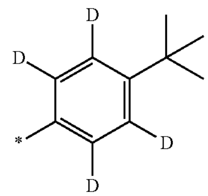
10-537
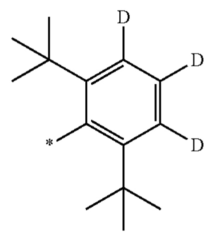
10-538
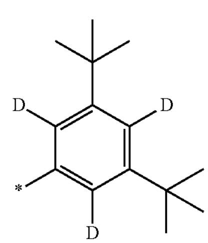
10-540
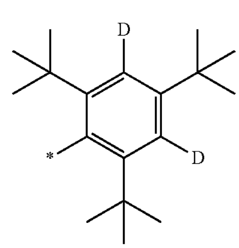

-continued
10-541
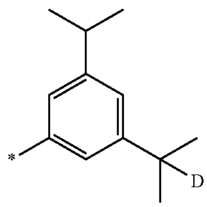
10-542
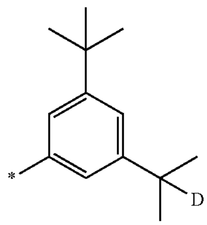
10-543
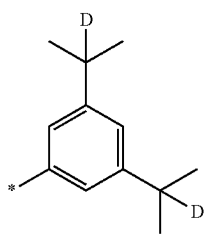
10-544
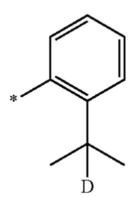
10-545
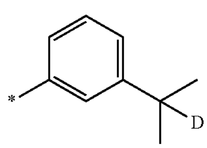
10-546
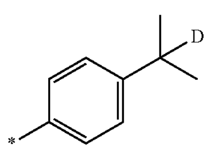
10-547
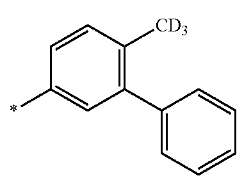
10-548
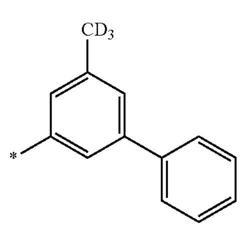
-continued
10-549
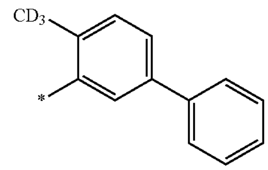
10-550
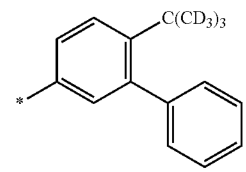
10-551
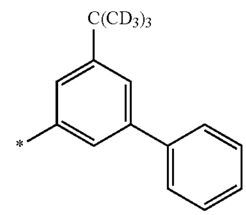
10-552
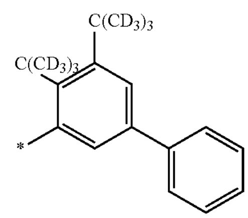
10-553
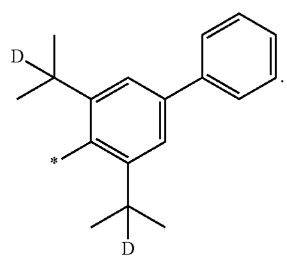
The "group represented by one of Formulae 10-1 to 10-129 in which at least one hydrogen is substituted with —F" and the "group represented by one of Formulae 10-201 to 10-350 in which at least one hydrogen is substituted with —F" may each be, for example, a group represented by one of Formulae 10-601 to 617:
10-601
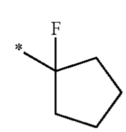
10-602
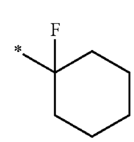

-continued 10-603

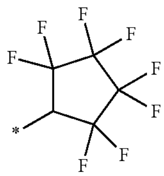

10-604

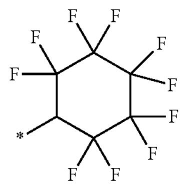

10-605

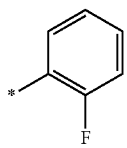

10-606

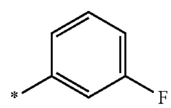

10-607

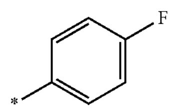

10-608

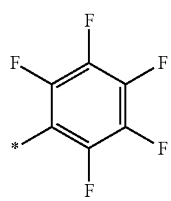

10-609

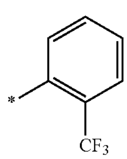

10-610

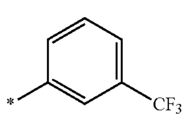

10-611

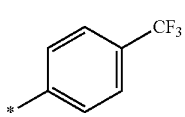

10-612

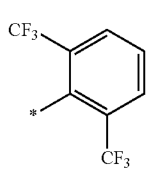

-continued 10-613

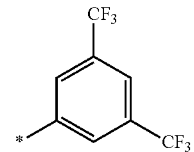

10-614

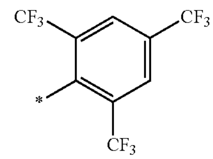

10-615

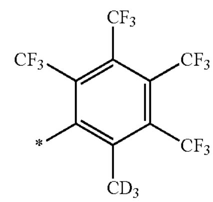

10-616

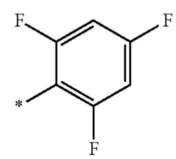

10-617

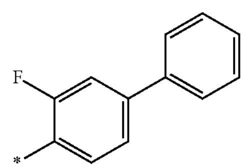

.

In Formula 1, a1 to a4 may respectively indicate the number of $R_1$(s) to $R_4$(s). a1 to a4 may each independently be an integer from 0 to 20 (e.g., 0, 1, 2, or 3). When a1 is 2 or greater, at least two $R_1$ groups may be identical to or different from each other, when a2 is 2 or greater, at least two $R_2$ groups may be identical to or different from each other, when a3 is 2 is or greater, at least two $R_3$ groups may be identical to or different from each other, and when a4 is 2 is or greater, at least two $R_4$ groups may be identical to or different from each other.

In some embodiments, in Formula 1, i) a1, a2, a3, and a4 may each be 0, ii) a1 may be 1, 2 or 3, and a2, a3, and a4 may each be 0, iii) a2 may be 1 or 2, and a1, a3, and a4 may each be 0, iv) a3 may be 1 or 2, and a1, a2, and a4 may each be 0, v) a4 may be 1 or 2, and a1, a2, and a3 may each be 0, or vi) a1 and a4 may each be 1, and a2 and a3 may each be 0.

$L_1$ in Formula 2 may be a single bond, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

In some embodiments, $L_1$ in Formula 1 may be:

a single bond; or a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a 1,3,5-triazine group, a 1,2,3-triazine group, a 1,2,4-triazine group, a quinoline group, an isoquinoline group, a quinoxaline group, a quinazoline group, a phenanthroline group, a pyrrole group, a pyrazole group, an imidazole group, a 1,2,3-triazole group, a 1,2,4-triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each unsubstituted or substituted with at least one $R_{10a}$.

In some embodiments, $L_1$ may be:

a single bond; or a benzene group unsubstituted or substituted with at least one $R_{10a}$.

In Formula 2, c1 may indicate the number of $L_1$(s). c1 may be an integer from 1 to 10 (e.g., 1, 2, or 3). When c1 is 2 or greater, at least two $L_1$(s) may be identical to different from each other.

In Formula 2, c2 may indicate the number of groups represented by *—C($Q_{51}$)($Q_{52}$)($Q_{53}$) (wherein * indicates a binding site to adjacent $L_1$). c2 may be an integer from 1 to 20 (e.g., 1, 2, or 3). When c2 is 2 or greater, at least two groups represented by *—C($Q_{51}$)($Q_{52}$)($Q_{53}$) may be identical to or different from each other.

In Formula 1, 1) at least two of $R_1$(s) in the number of a1 may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, 2) at least two of $R_2$(s) in the number of a2 may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, 3) at least two of $R_3$(s) in the number of a3 may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, 4) at least two of $R_4$(s) in the number of a4 may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10ab}$ , 5) at least two of $R_1$ to $R_4$, $R_{5a}$, $R_{5b}$, $R_{6a}$, $R_{6b}$, $R_{7a}$, $R_{7b}$, $R_{8a}$, and $R_{8b}$ may optionally be bound to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

$R_{10a}$ as used herein may be understood by referring to the description of $R_1$ provided herein.

In some embodiments, in Formula 1, n3 may not be 0, and ring $CY_1$ may be represented by one of Formulae CY1(1) to CY1(56) and CY1(101) to CY1(108):

CY1(1)

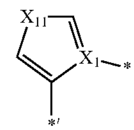

CY1(2)

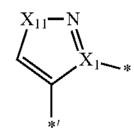

CY1(3)

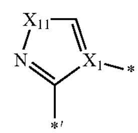

CY1(4)

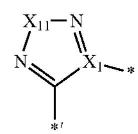

CY1(5)

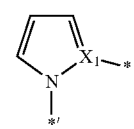

CY1(6)

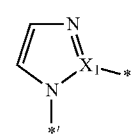

CY(7)

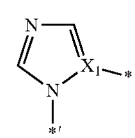

CY1(8)

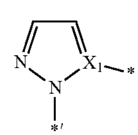

CY1(9)

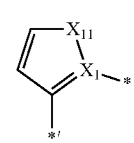

CY1(10)

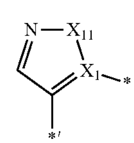

-continued
CY1(11)
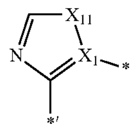
CY1(12)
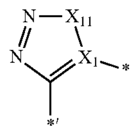
CY1(13)
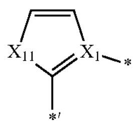
CY1(14)
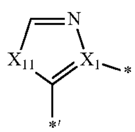
CY(15)
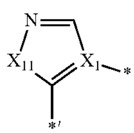
CY1(16)
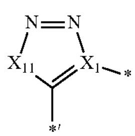
CY1(17)
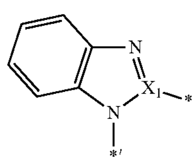
CY1(18)
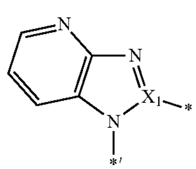
CY1(19)
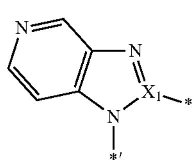
CY1(20)
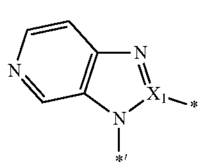
-continued
CY1(21)
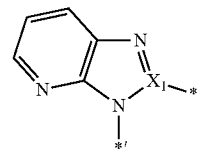
CY1(22)
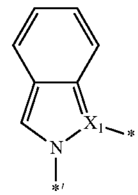
CY1(23)
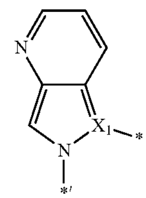
CY1(24)
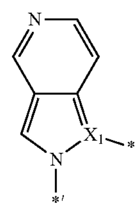
CY1(25)
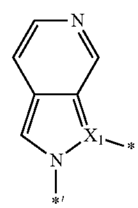
CY1(26)
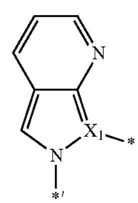
CY1(27)
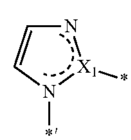
CY1(28)
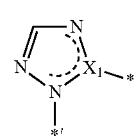
CY1(29)
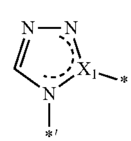

CY1(30)
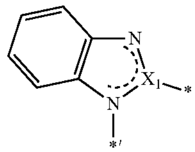
CY1(31)
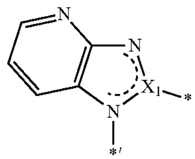
CY1(32)
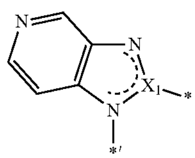
CY1(33)
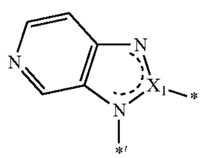
CY1(34)
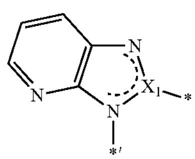
CY1(35)
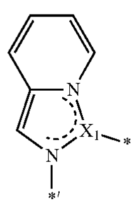
CY1(36)
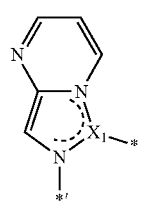
CY1(37)
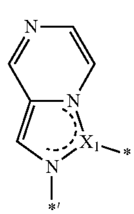
CY1(38)
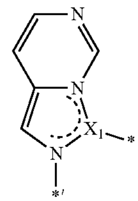
CY1(39)
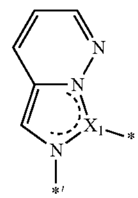
CY1(40)
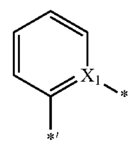
CY1(41)
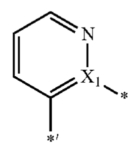
CY1(42)
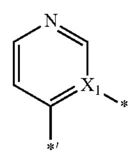
CY1(43)
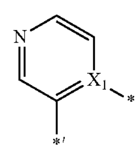
CY1(44)
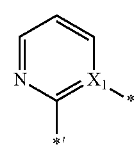
CY1(45)
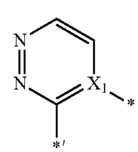
CY1(46)
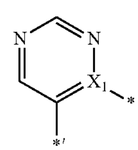
CY1(47)
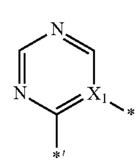

-continued
CY1(48)
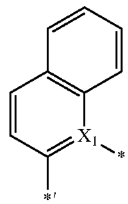
CY1(49)
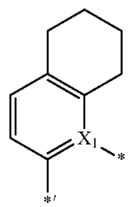
CY1(50)
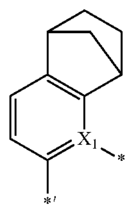
CY1(51)
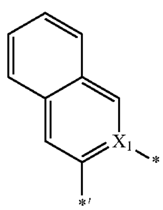
CY1(52)
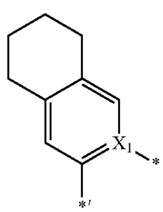
CY1(53)
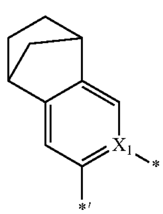
CY1(54)
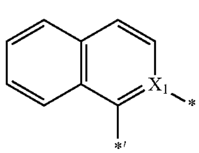
CY1(55)
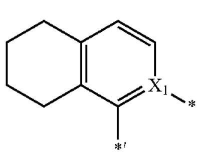
-continued
CY1(56)
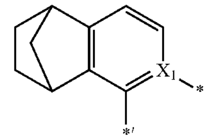
CY1(101)
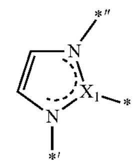
CY1(102)
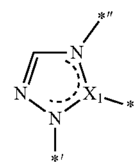
CY1(103)
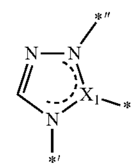
CY1(104)
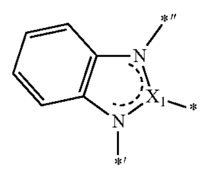
CY1(105)
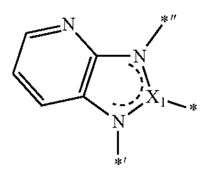
CY1(106)
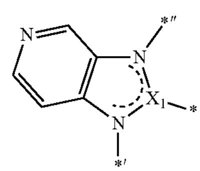
CY1(107)
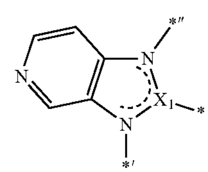
CY1(108)
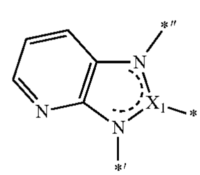
wherein, in Formulae CY1(1) to CY1(56) and CY1(101) to CY1(108),
$X_1$ may be C or N, provided that, $X_1$ in Formulae CY1(27) to CY1(39) and CY1(101) to CY1(108) may be C, $X_{11}$ may be O, S, $N(R_{18})$, $C(R_{18})(R_{19})$, or $Si(R_{18})(R_{19})$, and $R_{18}$ and $R_{19}$ may each be understood by referring to the descriptions of $R_1$ provided herein,

* indicates a binding site to M in Formula 1,

*' indicates a binding site to $T_3$ in Formula 1, and

*" indicates a binding site to $T_4$ in Formula 1.

In one or more embodiments, in Formula 1, n3 may not be 0, n4 may be 0, and the group represented by

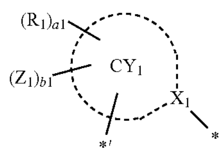

may be represented by one of Formulae CY1-1 to CY1-41 and CY1-Z1 to CY1-Z69:

CY1-1

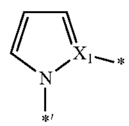

CY1-2

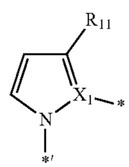

CY1-3

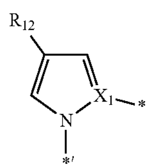

CY1-4

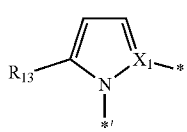

CY1-5

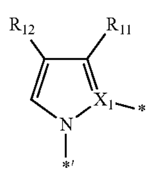

CY1-6

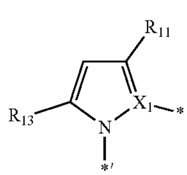

CY1-7

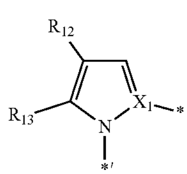

-continued

CY1-8

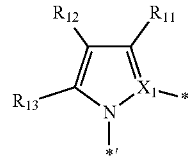

CY1-9

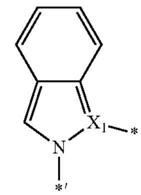

CY1-10

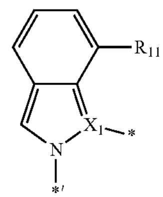

CY1-11

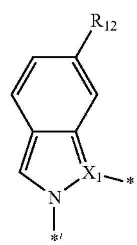

CY1-12

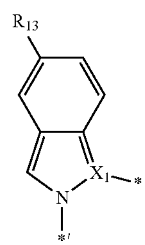

CY1-13

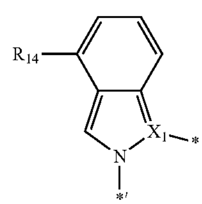

CY1-14

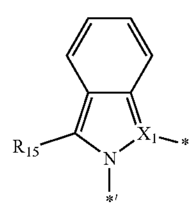

CY1-15

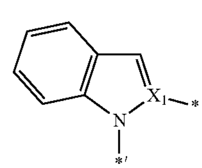

-continued
CY1-16
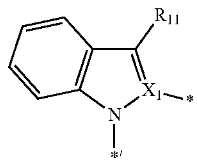
CY1-17
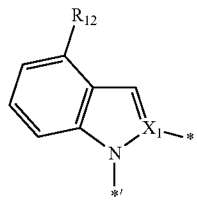
CY1-18
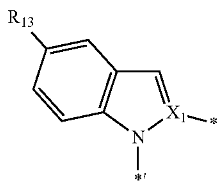
CY1-19
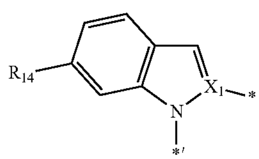
CY1-20
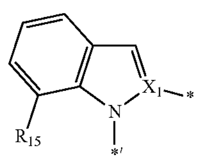
CY1-21
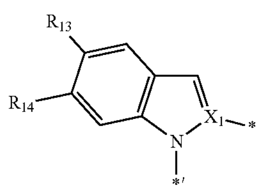
CY1-22
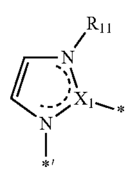
CY1-23
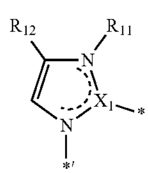
CY1-24
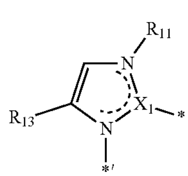
-continued
CY1-25
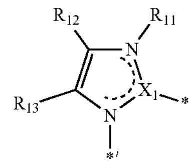
CY1-26
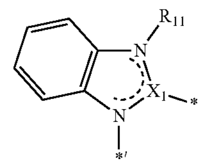
CY1-27
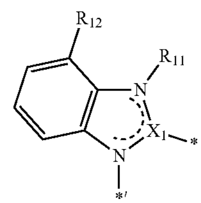
CY1-28
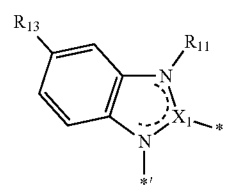
CY1-29
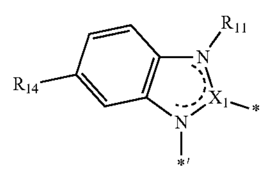
CY1-30
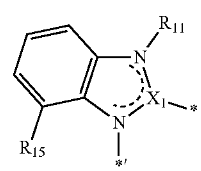
CY1-31
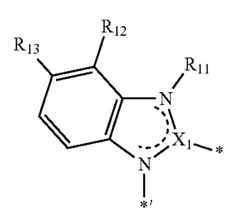
CY1-32
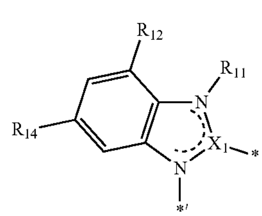

-continued
CY1-33
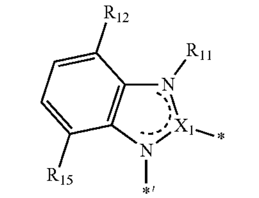
CY1-34
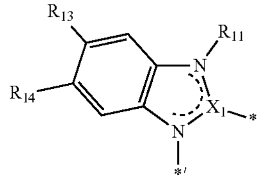
CY1-35
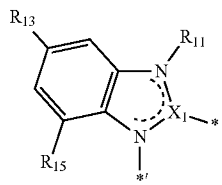
CY1-36
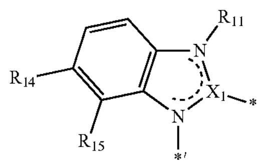
CY1-37
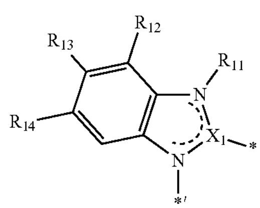
CY1-38
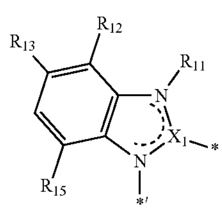
CY1-39
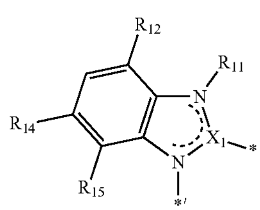
CY1-40
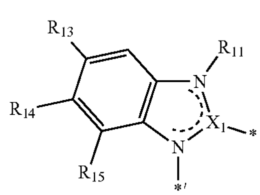
-continued
CY1-41
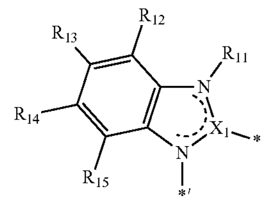
CY1-Z1
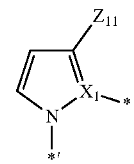
CY1-Z2
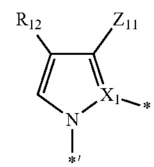
CY1-Z3
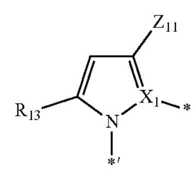
CY1-Z4
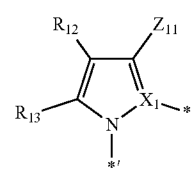
CY1-Z5
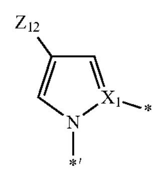
CY1-Z6
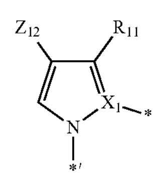
CY1-Z7
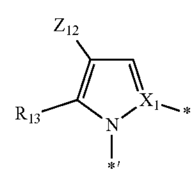
CY1-Z8
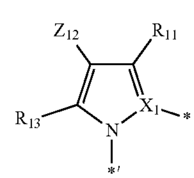

-continued
CY1-Z9
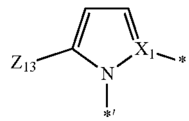
CY1-Z10
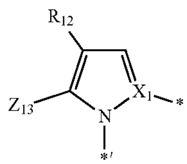
CY1-Z11
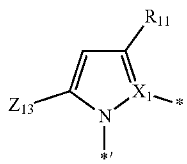
CY1-Z12
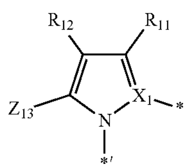
CY1-Z13
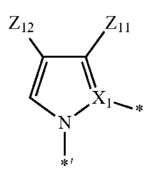
CY1-Z14
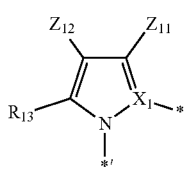
CY1-Z15
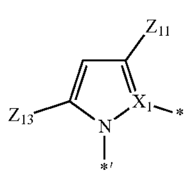
CY1-Z16
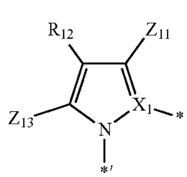
CY1-Z17
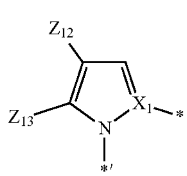
-continued
CY1-Z18
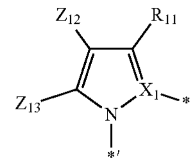
CY1-Z19
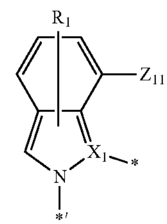
CY1-Z20
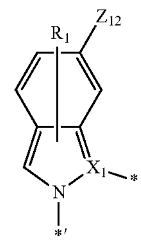
CY1-Z21
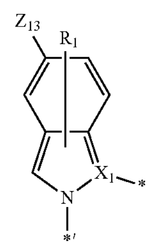
CY1-Z22
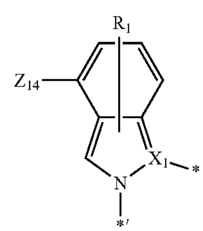
CY1-Z23
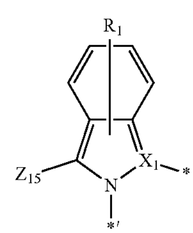
CY1-Z24
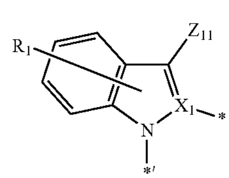

-continued
CY1-Z25
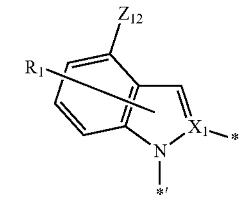
CY1-Z26
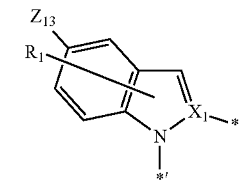
CY1-Z27
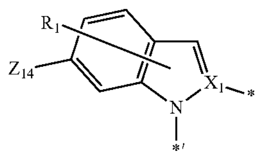
CY1-Z28
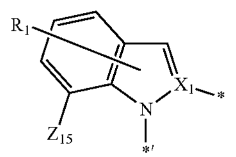
CY1-Z29
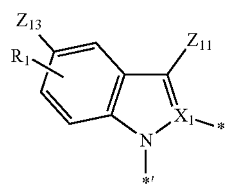
CY1-Z30
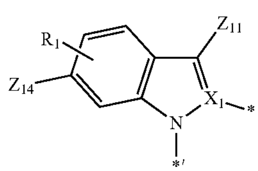
CY1-Z31
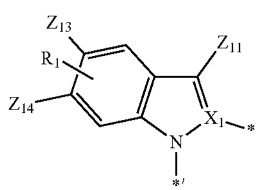
CY1-Z32
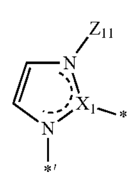
CY1-Z33
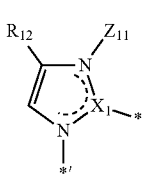
-continued
CY1-Z34
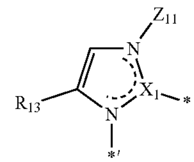
CY1-Z35
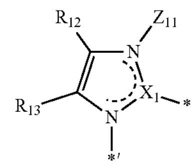
CY1-Z36
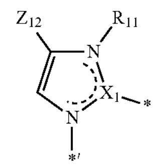
CY1-Z37
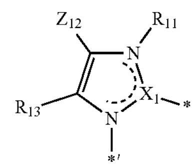
CY1-Z38
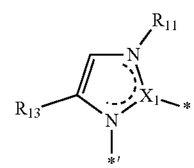
CY1-Z39
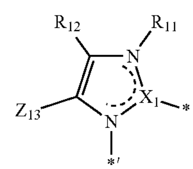
CY1-Z40
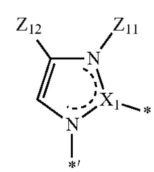
CY1-Z41
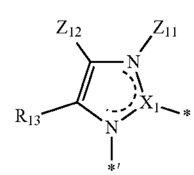
CY1-Z42
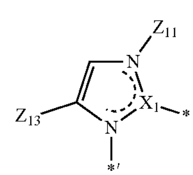

-continued
CY1-Z43
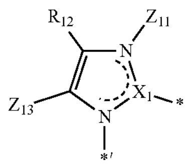
CY1-Z44
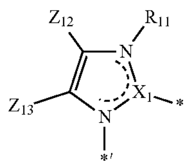
CY1-Z45
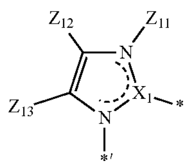
CY1-Z46
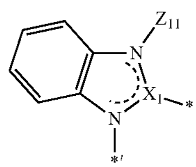
CY1-Z47
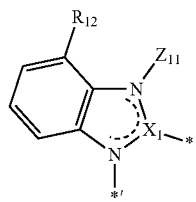
CY1-Z48
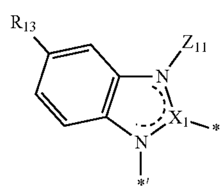
CY1-Z49
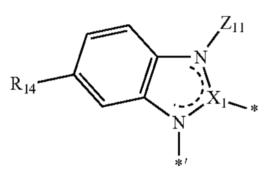
CY1-Z50
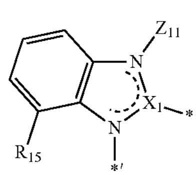
CY1-Z51
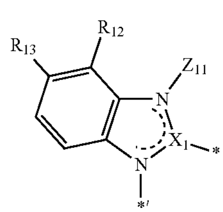
-continued
CY1-Z52
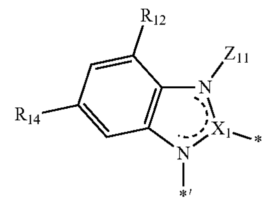
CY1-Z53
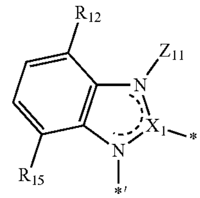
CY1-Z54
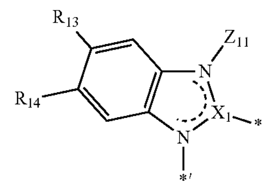
CY1-Z55
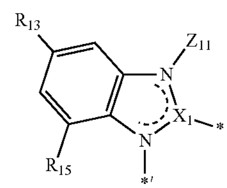
CY1-Z56
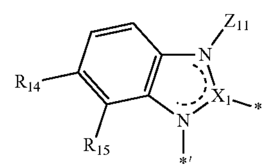
CY1-Z57
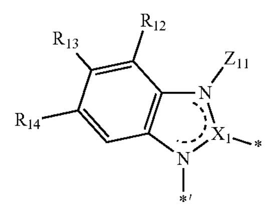
CY1-Z58
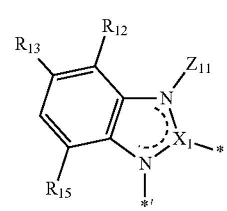
CY1-Z59
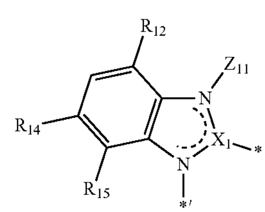

-continued

CY1-Z60

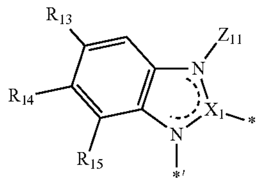

CY1-Z61

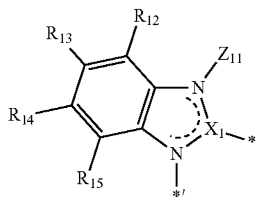

CY1-Z62

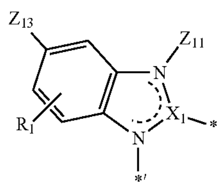

CY1-Z63

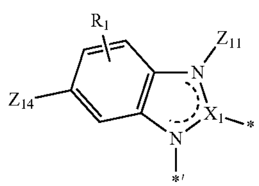

CY1-Z64

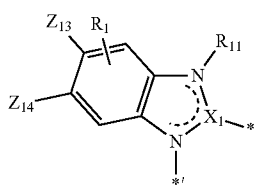

CY1-Z65

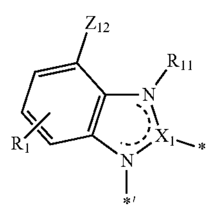

CY1-Z66

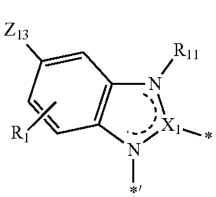

CY1-Z67

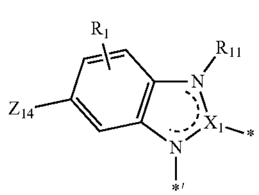

-continued

CY1-Z68

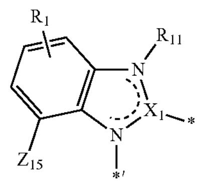

CY1-Z69

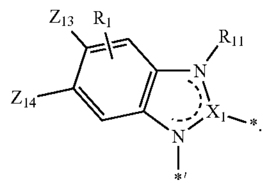

wherein, in Formulae CY1-1 to CY1-41 and CY1-Z1 to CY1-Z69, $X_1$ may be C or N, provided that, $X_1$ in Formulae CY1-22 to CY1-41 and CY1-Z32 to CY1-69Z may be C, $R_1$ and $R_{11}$ to $R_{15}$ may each be understood by referring to the description of $R_1$ provided herein, wherein $R_{11}$ to $R_{15}$ may each not be hydrogen, $Z_{11}$ to $Z_{15}$ may each be understood by referring to the description of $Z_1$ provided herein,

* indicates a binding site to M in Formula 1, and

*' indicates a binding site to $T_3$ in Formula 1.

In one or more embodiments, in Formula 1, n1 may not be 0, n3 may not be 0, and ring $CY_2$ may be represented by one of Formulae CY2(1) to CY2(15):

CY2(1)

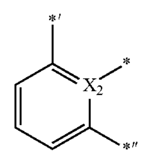

CY2(2)

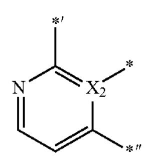

CY2(3)

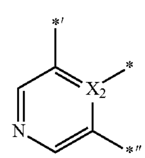

CY2(4)

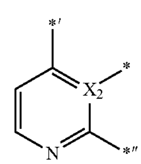

CY2(5)

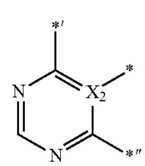

-continued

CY2(6)

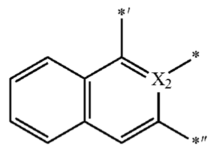

CY2(7)

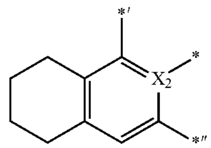

CY2(8)

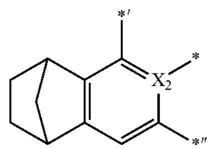

CY2(9)

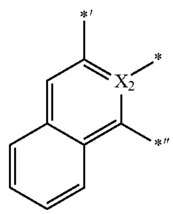

CY2(10)

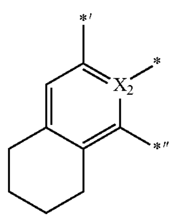

CY2(11)

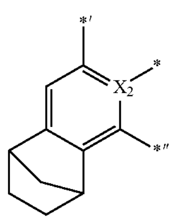

CY2(12)

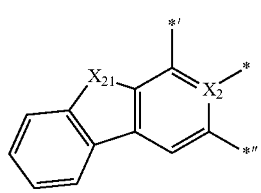

CY2(13)

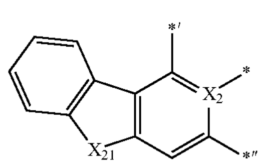

-continued

CY2(14)

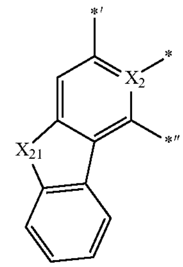

CY2(15)

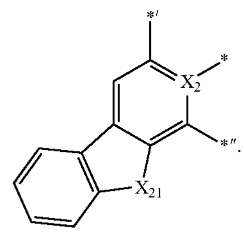

wherein, in Formulae CY2(1) to CY2(15), $X_2$ may be C or N, $X_{21}$ may be O, S, $N(R_{28})$, $C(R_{28})(R_{29})$, or $Si(R_{28})(R_{29})$, and $R_{28}$ and $R_{29}$ may each be understood by referring to the descriptions of $R_2$ provided herein,

*' indicates a binding site to $T_3$ in Formula 1,

* indicates a binding site to M in Formula 1, and

*" indicates a binding site to $T_1$ in Formula 1.

In one or more embodiments, in Formula 1, n1 may not be 0, n3 may not be 0, and the group represented by

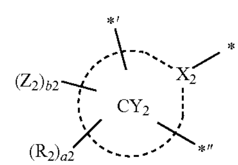

may be represented by one of Formulae CY2-1 to CY2-8 and CY2-Z1 to CY2-Z6:

CY2-1

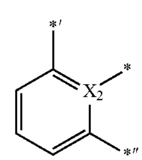

CY2-2

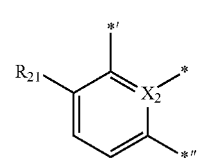

CY2-3

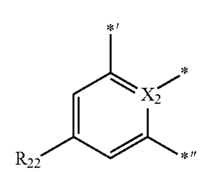

-continued

CY2-4

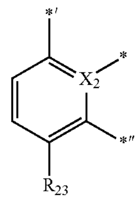

CY2-5

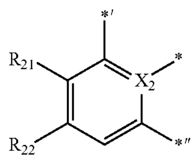

CY2-6

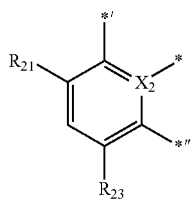

CY2-7

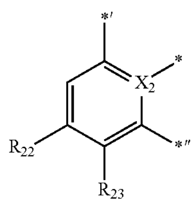

CY2-8

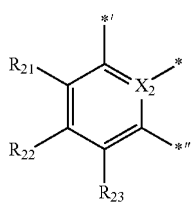

CY2-Z1

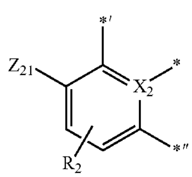

CY2-Z2

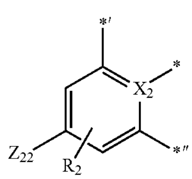

CY2-Z3

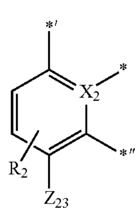

-continued

CY2-Z4

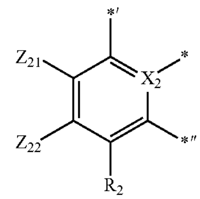

CY2-Z5

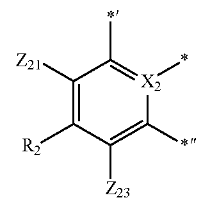

CY2-Z6

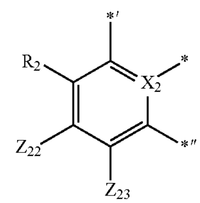

wherein, in Formulae CY2-1 to CY2-8 and CY2-Z1 to CY2-Z6, $X_1$ may be C or N, $R_2$ and $R_{21}$ to $R_{23}$ may each be understood by referring to the description of $R_2$ provided herein, wherein $R_{21}$ to $R_{23}$ may each not be hydrogen, $Z_{21}$ to $Z_{23}$ may each be understood by referring to the description of $Z_2$ provided herein,

*' indicates a binding site to $T_3$ in Formula 1,

* indicates a binding site to M in Formula 1, and

*" indicates a binding site to $T_1$ in Formula 1.

In one or more embodiments, in Formula 1, n1 may not be 0, n2 may not be 0, and ring $CY_3$ may be a group represented by Formula CY3-A or CY3-B:

CY3-A

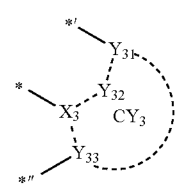

CY3-B

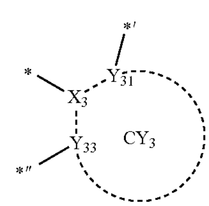

wherein, in Formulae CY3-A and CY3-B, $X_3$ and ring $CY_3$ may respectively be understood by referring to the descriptions of $X_3$ and ring $CY_3$ provided herein, $Y_{31}$ and $Y_{33}$ may each independently be C or N and $Y_{32}$ may be O, S, N, C, or Si, a bond between $X_3$ and $Y_{33}$, a bond between $X_3$ and $Y_{32}$ and a bond between $Y_{32}$ and $Y_{31}$ in Formula CY3-A may each be a chemical bond (for example, a single bond or a double bond), a bond between $X_3$ and $Y_{31}$ and a bond between $X_3$ and $Y_{33}$ in Formula CY3-B may each be a chemical bond (for example, a single bond or a double bond),

*" indicates a binding site to $T_1$ in Formula 1,

* indicates a binding site to M in Formula 1, and

*' indicates a binding site to $T_2$ in Formula 1.

In some embodiments, in Formula 1, n1 may not be 0, n2 may not be 0, and ring $CY_3$ may be a group represented by Formula CY3-A.

In one or more embodiments, in Formula 1, n2 may not be 0, n4 may be 0, and ring $CY_4$ may be a group represented by Formula CY4-A or CY4-B:

CY4-A

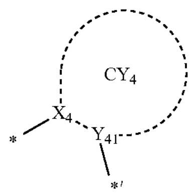

CY4-B

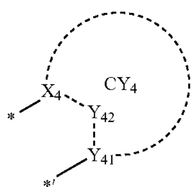

wherein, in Formulae CY4-A and CY4-B, $X_4$ and ring $CY_4$ may respectively be understood by referring to the descriptions of $X_4$ and ring $CY_4$ provided herein, $Y_{41}$ may be C or N and $Y_{42}$ may be O, S, N, C, or Si, a bond between $X_4$ and $Y_{41}$ in Formula CY4-A may be a chemical bond (for example, a single bond or a double bond), a bond between $X_4$ and $Y_{42}$ and a bond between $Y_{42}$ and $Y_{41}$ in Formula CY4-B may each be a chemical bond (for example, a single bond or a double bond),

* indicates a binding site to M in Formula 1, and

*' indicates a binding site to $T_2$ in Formula 1.

In some embodiments, in Formula 1, n2 may not be 0, n4 may be 0, and ring $CY_4$ may be a group represented by Formula CY4-A.

In some embodiments, in Formula 1, n2 may not be 0, $T_1$ may be a single bond, n4 may be 0, ring $CY_3$ may be a group represented by Formula CY3-A, and ring $CY_4$ may be a group represented by Formula CY4-A.

In some embodiments, in Formula 1, n2 may not be 0, $T_1$ may be a single bond, n4 may be 0, ring $CY_3$ may be a group represented by Formula CY3-B, and ring $CY_4$ may be a group represented by Formula CY4-B.

In some embodiments, in Formula 1, n2 may not be 0, $T_1$ may not be a single bond, n4 may be 0, ring $CY_3$ may be a group represented by Formula CY3-B, and ring $CY_4$ may be a group represented by Formula CY4-A.

In one or more embodiments, in Formula 1, n1 may not be 0, and ring $CY_3$ may be a group represented by one of Formulae CY3(1) to CY3(12) and CY3(101) to CY3(122):

CY3(1)

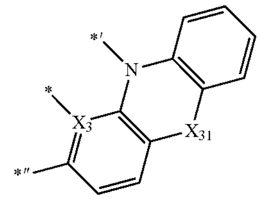

CY3(2)

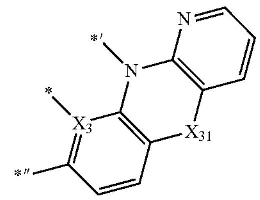

CY3(3)

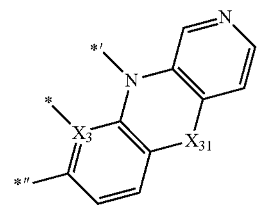

CY3(4)

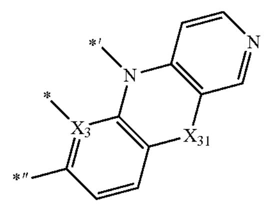

CY3(5)

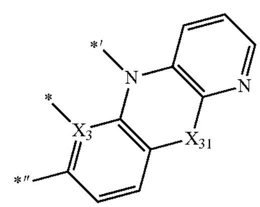

CY3(6)

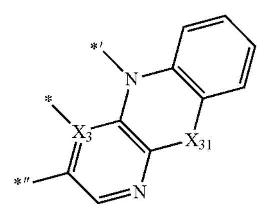

CY3(7)

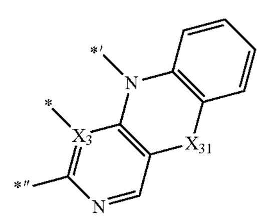

CY3(8)

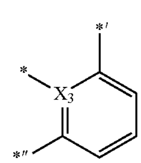

-continued
CY3(9)
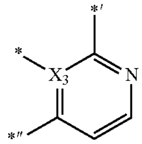
CY3(10)
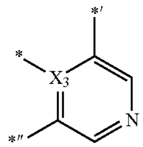
CY3(11)
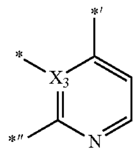
CY3(12)
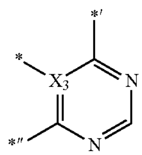
CY3(101)
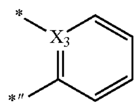
CY3(102)
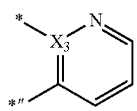
CY3(103)
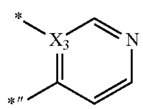
CY3(104)
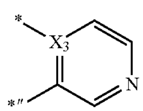
CY3(105)
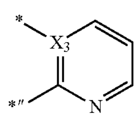
CY3(106)
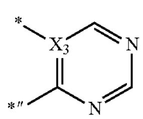
CY3(107)
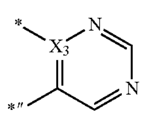
CY3(108)
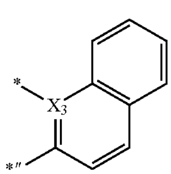
-continued
CY3(109)
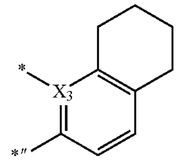
CY3(110)
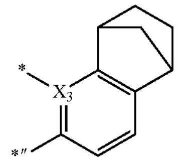
CY3(111)
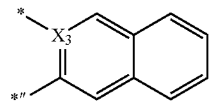
CY3(112)
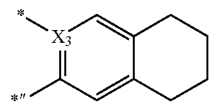
CY3(113)
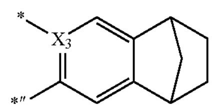
CY3(114)
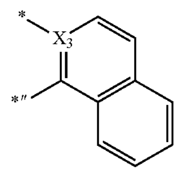
CY3(115)
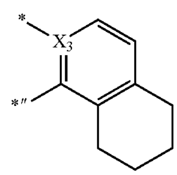
CY3(116)
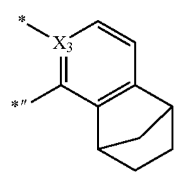
CY3(117)
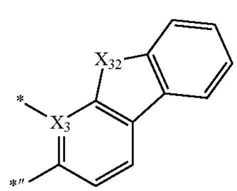
CY3(118)
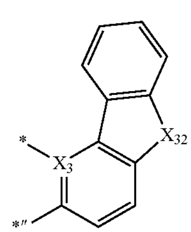

-continued

CY3(119)

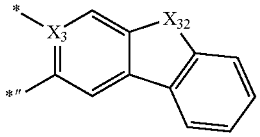

CY3(120)

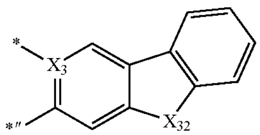

CY3(121)

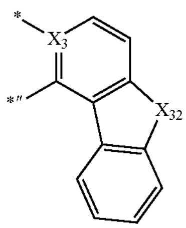

CY3(122)

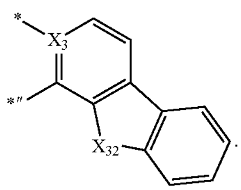

wherein, in Formulae CY3(1) to CY3(12) and CY3(101) to CY3(122), $X_3$ may be C or N, $X_{31}$ may be a single bond, O, S, $N(R_{38})$, $C(R_{38})(R_{39})$, or $Si(R_{38})(R_{39})$, $X_{32}$ may be O, S, $N(R_{38})$, $C(R_{38})(R_{39})$, or $Si(R_{38})(R_{39})$, $R_{38}$ and $R_{39}$ may each be understood by referring to the description of $R_3$ provided herein,

*" indicates a binding site to $T_1$ in Formula 1,

* indicates a binding site to M in Formula 1, and

*' indicates a binding site to $T_2$ in Formula 1.

In one or more embodiments, in Formula 1, n1 may not be 0, n2 may not be 0, and the group represented by

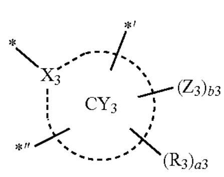

may be represented by one of Formulae CY3-1 to CY3-16 and CY3-Z1 to CY3-Z10:

CY3-1

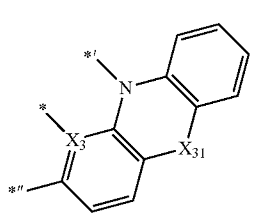

-continued

CY3-2

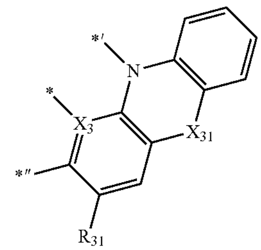

CY3-3

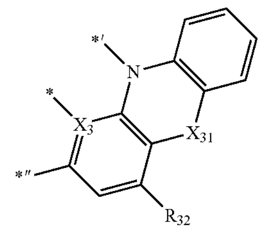

CY3-4

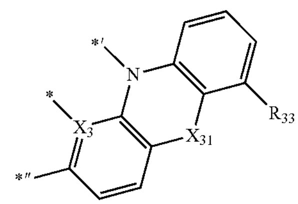

CY3-5

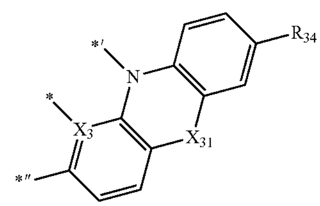

CY3-6

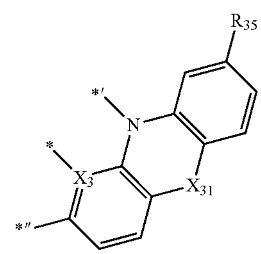

CY3-7

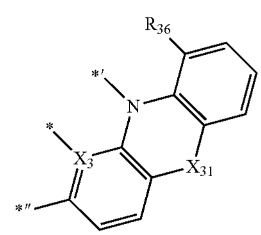

CY3-8

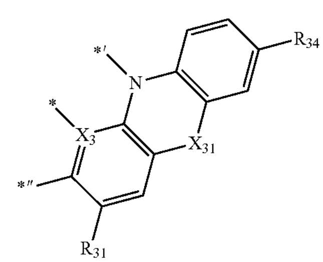

-continued
CY3-9
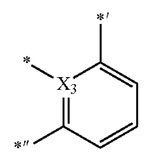
CY3-10
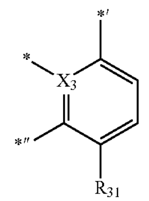
CY3-11
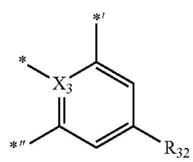
CY3-12
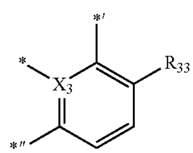
CY3-13
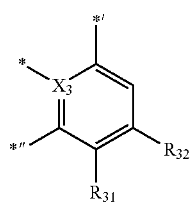
CY3-14
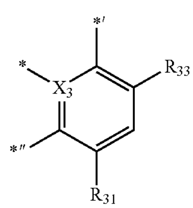
CY3-15
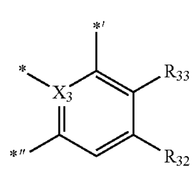
CY3-16
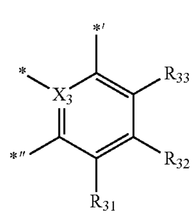
-continued
CY3-Z1
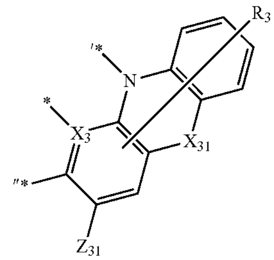
CY3-Z2
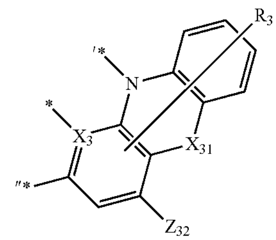
CY3-Z3
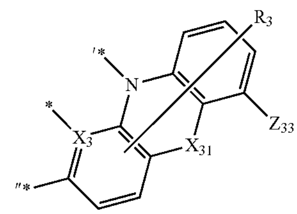
CY3-Z4
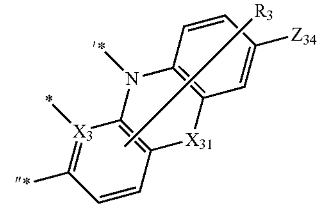
CY3-Z5
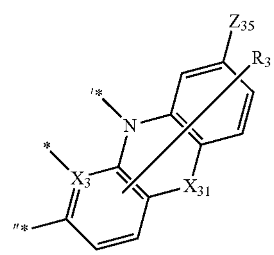
CY3-Z6
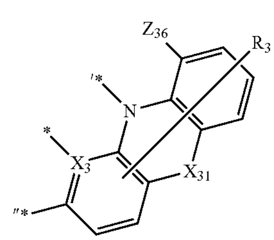

CY3-Z7

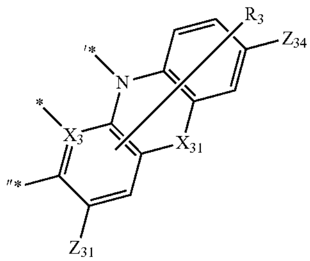

CY3-Z8

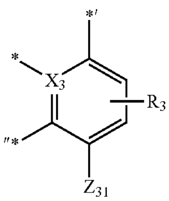

CY3-Z9

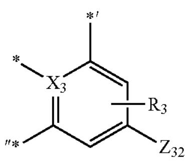

CY3-Z10

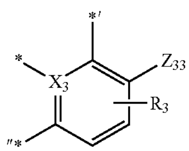

wherein, in Formulae CY3-1 to CY3-16 and CY3-Z1 to CY3-Z10, $X_3$ may be C or N, $R_3$ and $R_{31}$ to $R_{36}$ may each be understood by referring to the description of $R_3$ provided herein, wherein $R_{31}$ to $R_{36}$ may each not be hydrogen, $Z_{31}$ to $Z_{36}$ may each be understood by referring to the description of $Z_3$ provided herein,

*" indicates a binding site to $T_1$ in Formula 1,

* indicates a binding site to M in Formula 1, and

*' indicates a binding site to $T_2$ in Formula 1.

In one or more embodiments, in Formula 1, n2 may not be 0, and ring $CY_4$ may be a group represented by one of Formulae CY4(1) to CY4(42) and CY4(101) to CY4(111):

CY4(1)

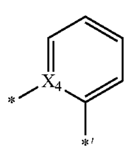

CY4(2)

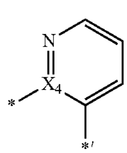

-continued

CY4(3)

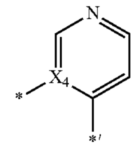

CY4(4)

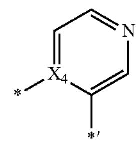

CY4(5)

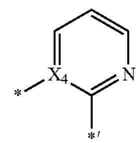

CY4(6)

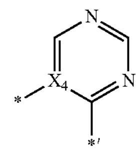

CY4(7)

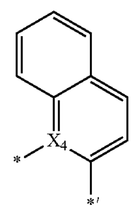

CY4(8)

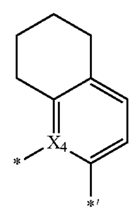

CY4(9)

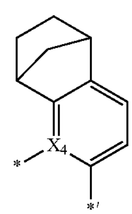

CY4(10)

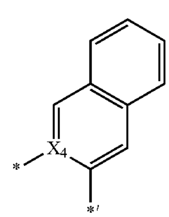

-continued
CY4(11)
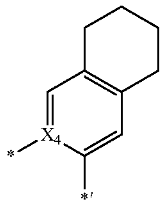
CY4(12)
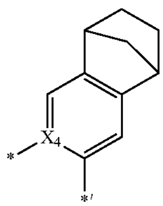
CY4(13)
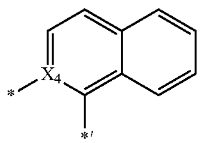
CY4(14)
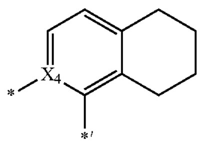
CY4(15)
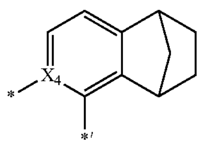
CY4(16)
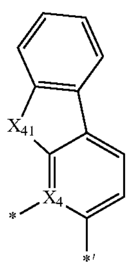
CY4(17)
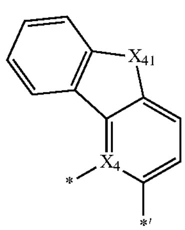
CY4(18)
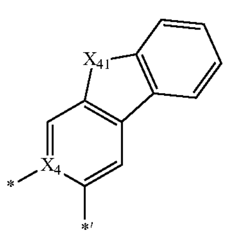
-continued
CY4(19)
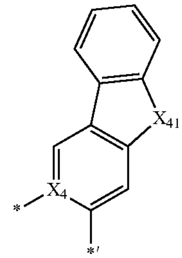
CY4(20)
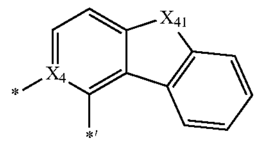
CY4(21)
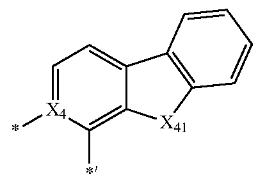
CY4(22)
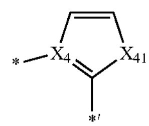
CY4(23)
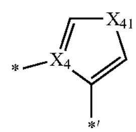
CY4(24)
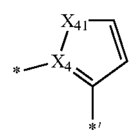
CY4(25)
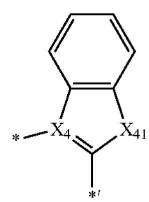
CY4(26)
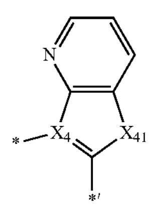
CY4(27)
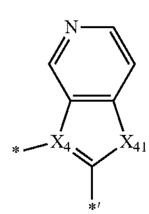

-continued
CY4(28)
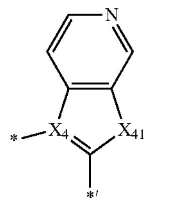
CY4(29)
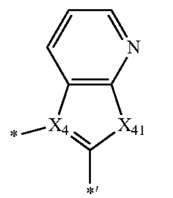
CY4(30)
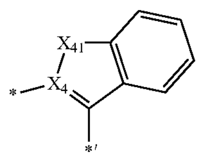
CY4(31)
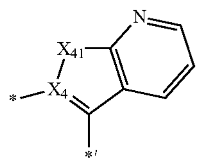
CY4(32)
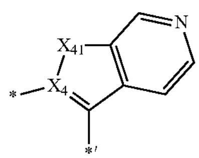
CY4(33)
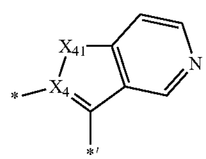
CY4(34)
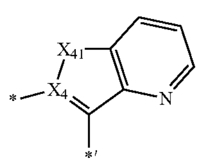
CY4(35)
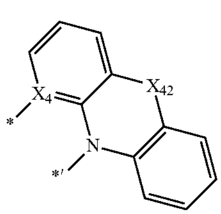
-continued
CY4(36)
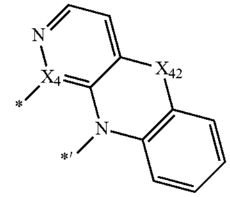
CY4(37)
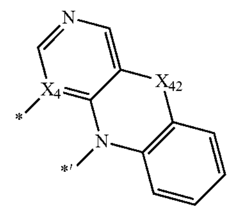
CY4(38)
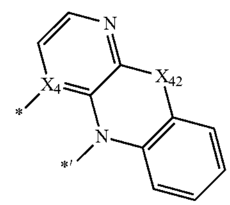
CY4(39)
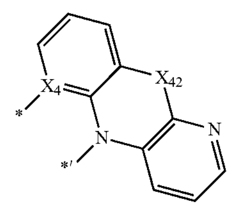
CY4(40)
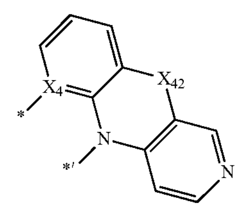
CY4(41)
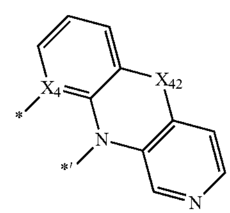
CY4(42)
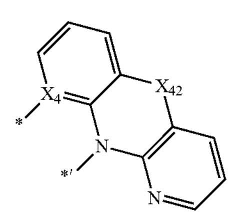
CY4(101)
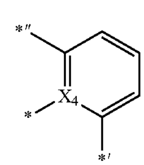

-continued

CY4(102)

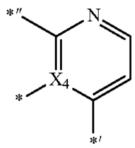

CY4(103)

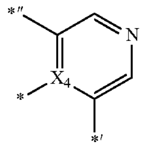

CY4104)

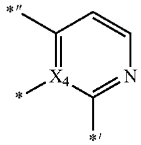

CY4(105)

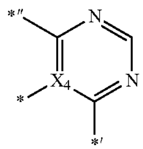

CY4(106)

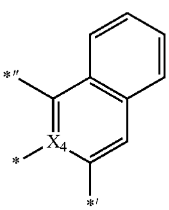

CY4(107)

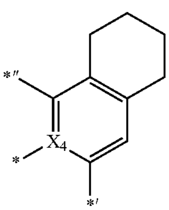

CY4(108)

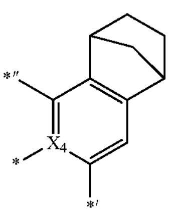

CY4(109)

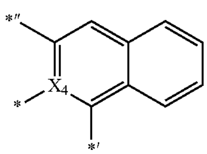

CY4(110)

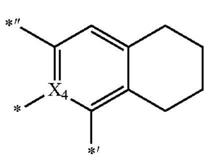

-continued

CY4(111)

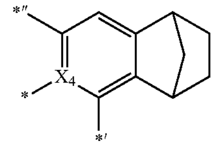

wherein, in Formulae CY4(1) to CY4(42) and CY4(101) to CY4(111), $X_4$ may be C or N, $X_{41}$ may be O, S, $N(R_{48})$, $C(R_{48})(R_{49})$, or $Si(R_{48})(R_{49})$, $X_{42}$ may be a single bond, O, S, $N(R_{48})$, $C(R_{48})(R_{49})$, or $Si(R_{48})(R_{49})$, and $R_{48}$ and $R_{49}$ may each be understood by referring to the descriptions of $R_4$ provided herein,

* indicates a binding site to M in Formula 1,

*' indicates a binding site to $T_2$ in Formula 1, and

*" indicates a binding site to $T_4$ in Formula 1.

In one or more embodiments, in Formula 1, n2 may not be 0, n4 may be 0, and the group represented by

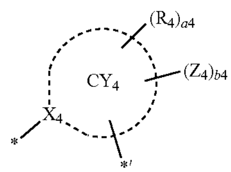

may be represented by one of Formulae CY4-1 to CY4-24 and CY4-Z1 to CY4-Z8:

CY4-1

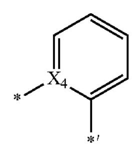

CY4-2

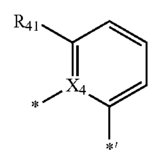

CY4-3

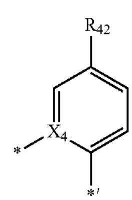

CY4-4

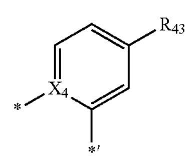

CY4-5

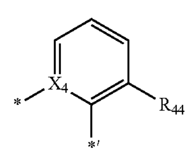

-continued
CY4-6
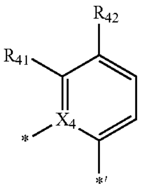
CY4-7
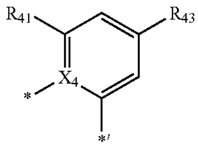
CY4-8
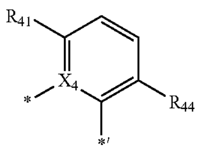
CY4-9
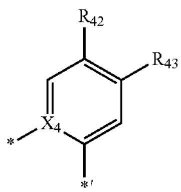
CY4-10
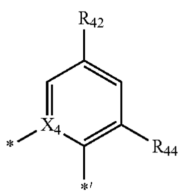
CY4-11
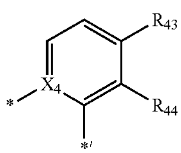
CY4-12
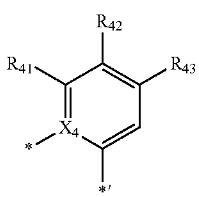
CY4-13
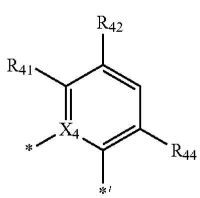
CY4-14
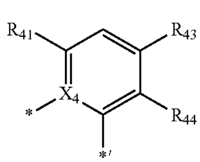
-continued
CY4-15
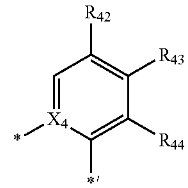
CY4-16
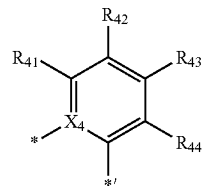
CY4-17
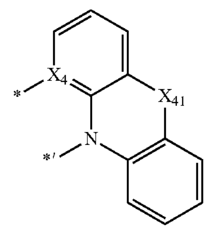
CY4-18
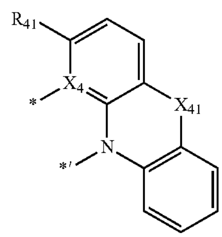
CY4-19
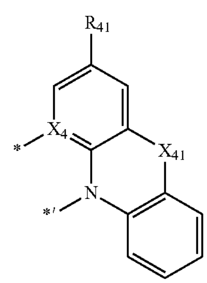
CY4-20
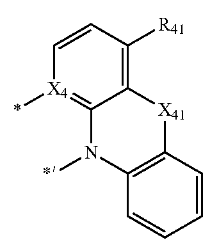
CY4-21
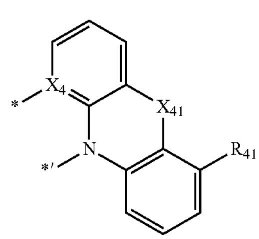

-continued

CY4-22

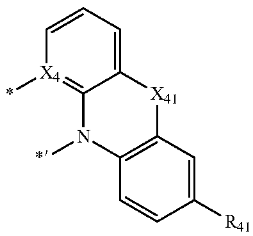

CY4-23

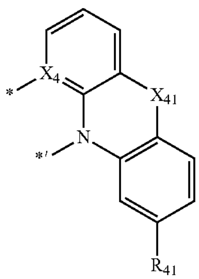

CY4-24

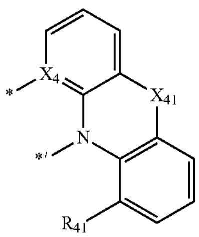

CY4-Z1

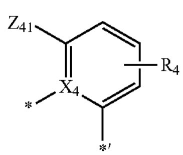

CY4-Z2

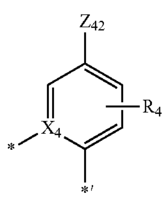

CY4-Z3

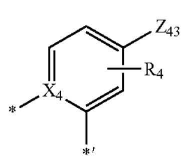

CY4-Z4

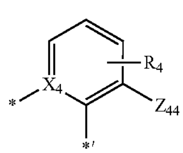

CY4-Z5

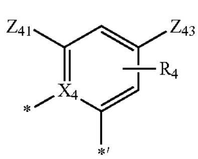

-continued

CY4-Z6

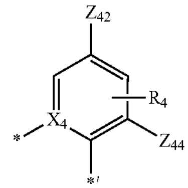

CY4-Z7

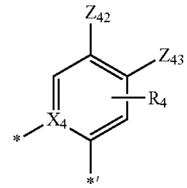

CY4-Z8

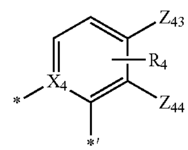

wherein, in Formulae CY4-1 to CY4-24 and CY4-Z1 to CY4-Z8, $X_4$ may be C or N, $X_{42}$ may be understood by referring to the description provided herein, $R_4$ and $R_{41}$ to $R_{44}$ may each be understood by referring to the description of $R_4$ provided herein, wherein $R_{41}$ to $R_{44}$ may each not be hydrogen, $Z_{41}$ to $Z_{44}$ may each be understood by referring to the description of $Z_4$ provided herein,

* indicates a binding site to M in Formula 1, and

*' indicates a binding site to $T_2$ in Formula 1.

In one or more embodiments, a group represented by $*—C(Q_{51})(Q_{52})(Q_{53})$ in Formula 2 may be represented by one of Formulae 2-1 to 2-20:

2-1

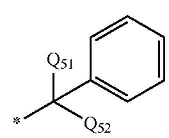

2-2

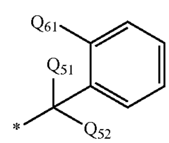

2-3

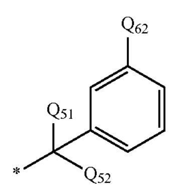

2-4

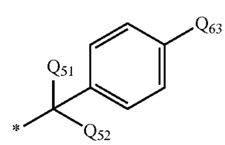

-continued 2-5

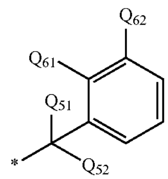

2-6

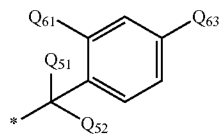

2-7

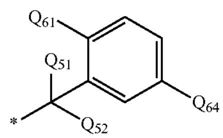

2-8

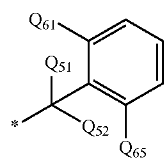

2-9

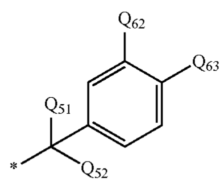

2-10

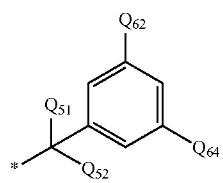

2-11

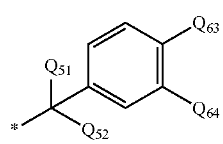

2-12

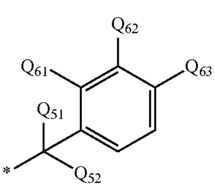

2-13

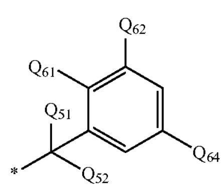

-continued 2-14

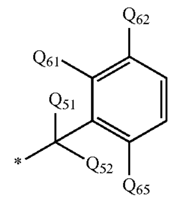

2-15

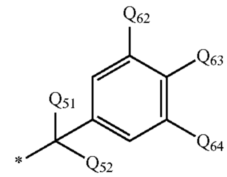

2-16

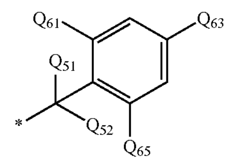

2-17

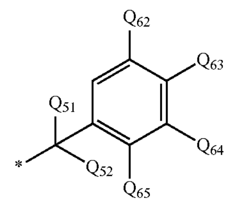

2-18

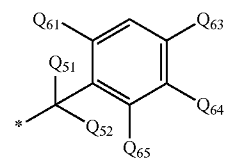

2-19

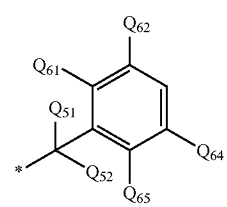

2-20

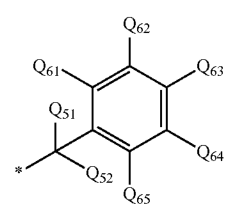

wherein, in Formulae 2-1 to 2-20, $Q_{51}$, $Q_{52}$ and $Q_{61}$ to $Q_{65}$ may each independently be a substituted or unsubstituted $C_1$-$C_{60}$ alkyl group or a substituted or unsubstituted phenyl group, wherein $Q_{51}$, $Q_{52}$, and $Q_{61}$ to $Q_{65}$ may be identical to or different from each other, and * indicates a binding site to $L_1$ in Formula 2.

In some embodiments, in Formulae 2-1 to 2-20, $Q_{51}$, $Q_{52}$, and $Q_{61}$ to $Q_{65}$ may each independently be a $C_1$-$C_{20}$ alkyl group or a phenyl group, each unsubstituted or substituted with deuterium, a $C_1$-$C_{20}$ alkyl group, a phenyl group, a biphenyl group, or any combination thereof.

In some embodiments, $L_1$ may be a single bond in the group represented by Formula 2, and the group represented by Formula 2 may be represented by one of Formulae 2-1 to 2-20.

In some embodiments, $Z_1$ to $Z_4$, $Z_{11}$ to $Z_{15}$, $Z_{21}$ to $Z_{23}$, $Z_{31}$ to $Z_{36}$, and $Z_{41}$ to $Z_{44}$ may each independently be represented by one of Formulae 2-1 to 2-20.

In one or more embodiments, $L_1$ in Formula 2 may be a benzene group, c1 in Formula 2 may be 1, and the group represented by Formula 2 may be represented by one of Formulae 2(1) to 2(19):

2(1)

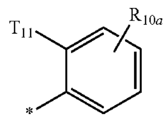

2(2)

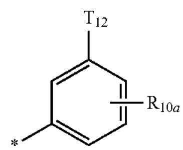

2(3)

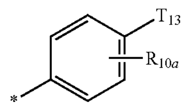

2(4)

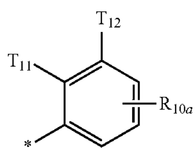

2(5)

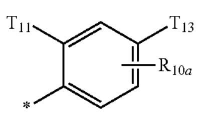

2(6)

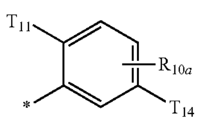

2(7)

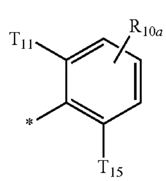

2(8)

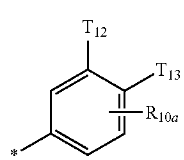

2(9)

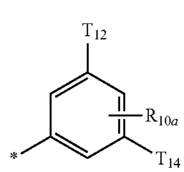

-continued

2(10)

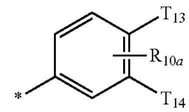

2(11)

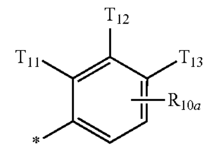

2(12)

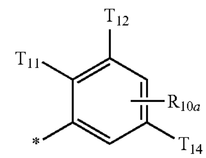

2(13)

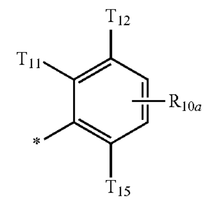

2(14)

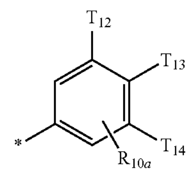

2(15)

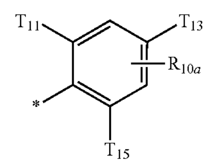

2(16)

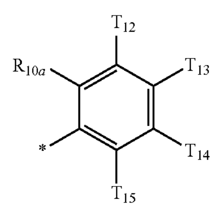

2(17)

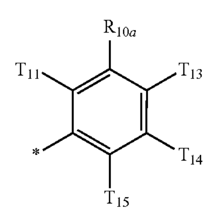

2(18)

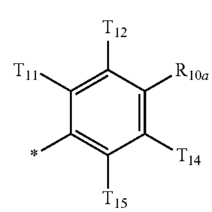

-continued

2(19)

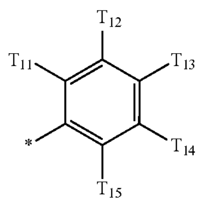

wherein, in Formulae 2(1) to 2(19), $T_{11}$ to $T_{15}$ may each be a group represented by *—$C(Q_{51})(Q_{52})(Q_{53})$ in Formula 2, $T_{11}$ to $T_{15}$ may be identical to or different from each other, $R_{10a}$ may be understood by referring to the description of $R_1$ in claim 1, and * indicates a binding site to at least one of ring $CY_1$ to ring $CY_4$ in Formula 1.

In some embodiments, $Z_1$ to $Z_4$, $Z_{11}$ to $Z_{15}$, $Z_{21}$ to $Z_{23}$, $Z_{31}$ to $Z_{36}$, and $Z_{41}$ to $Z_{44}$ may each independently be represented by one of Formulae 2(1) to 2(19).

In one or more embodiments, the organometallic compound represented by Formula 1 may satisfy at least one of Conditions 1 to 4:

Condition 1

In Formula 1, n3 may not be 0, n4 may be 0, and the group represented by

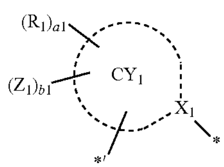

may be represented by one of Formulae CY1-Z1 to CY1-Z69.

Condition 2

In Formula 1, n1 may not be 0, n3 may not be 0, and the group represented by

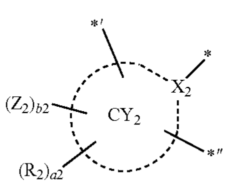

may be represented by one of Formulae CY2-Z1 to CY2-Z6.

Condition 3

In Formula 1, n1 may not be 0, n2 may not be 0, and the group represented by

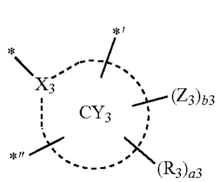

may be represented by one of Formulae CY3-Z1 to CY3-Z10.

Condition 4

In Formula 1, n2 may not be 0, n4 may be 0, and the group represented by

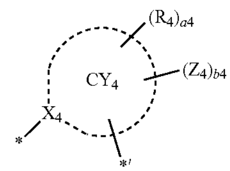

may be represented by one of Formulae CY4-Z1 to CY4-Z8.

In one or more embodiments, the organometallic compound represented by Formula 1 may emit blue light.

In one or more embodiments, the organometallic compound represented by Formula 1 may be one of the following compounds. Compound Pt-2, Pt-3, Pt-13, Pt-17, Pt-18, and Pt-21 are same as Compound 4, 2009, 2076, 2132, 2133, and 2187, respectively:

Pt-1

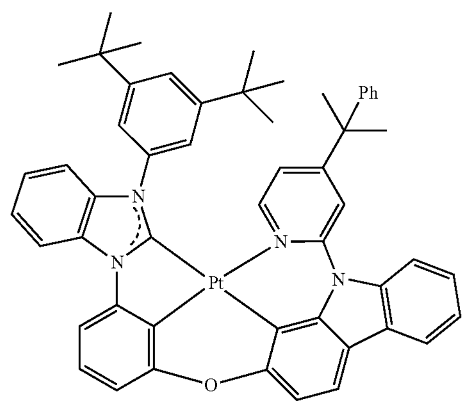

Pt-2

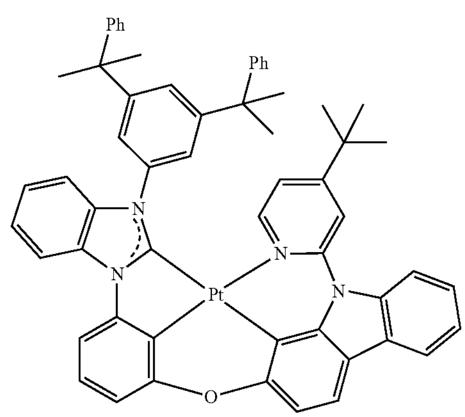

-continued
Pt-3
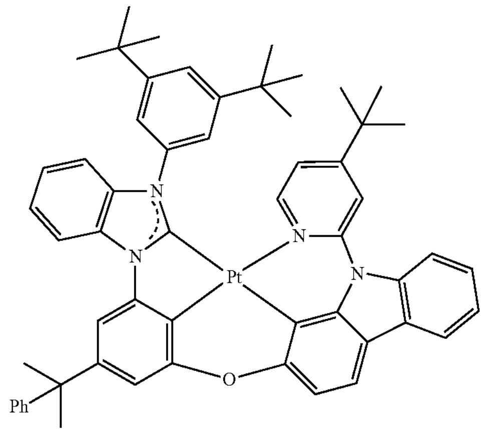
Pt-4
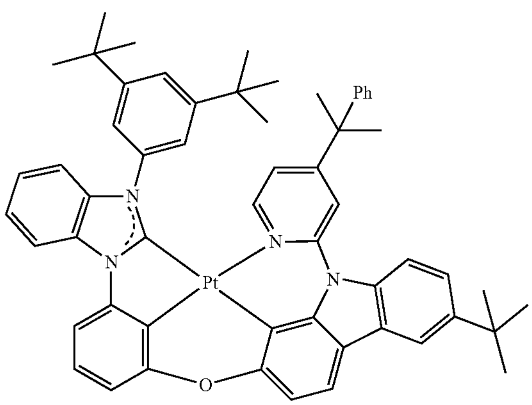
Pt-5
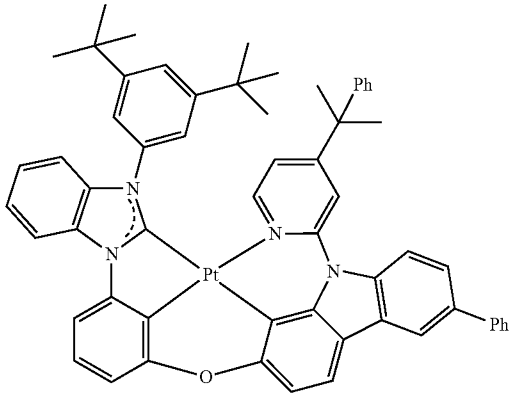
-continued
Pt-6
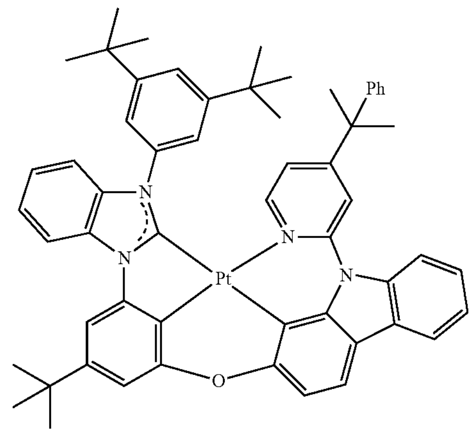
Pt-7
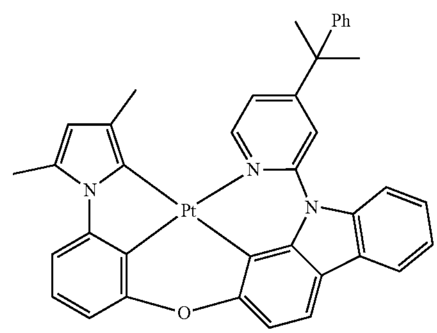
Pt-8
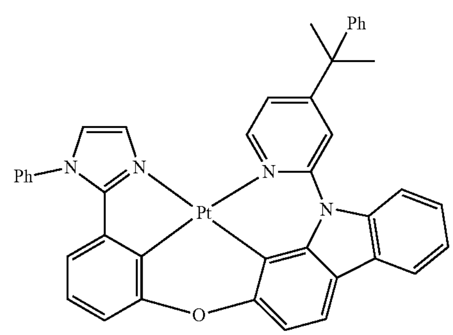
Pt-9
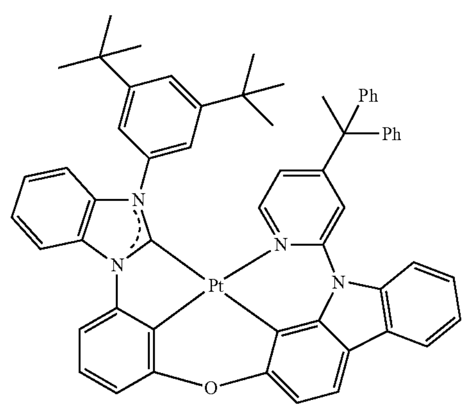

-continued
Pt-10
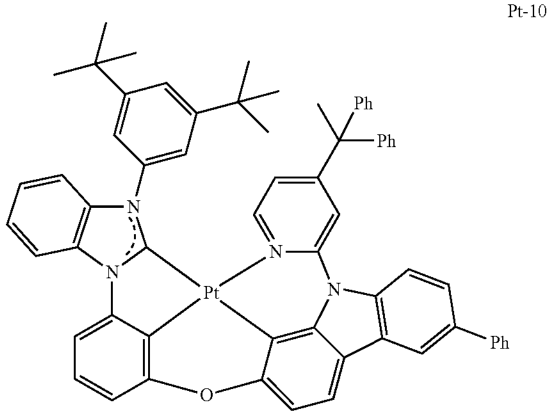
Pt-11
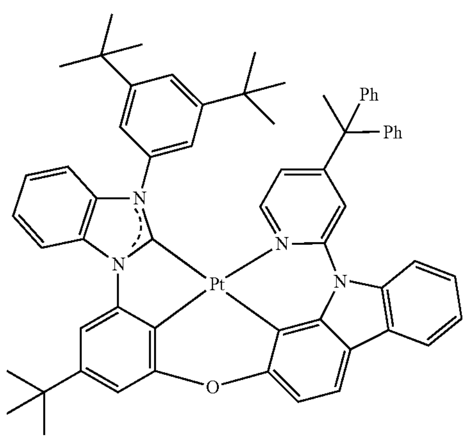
Pt-12
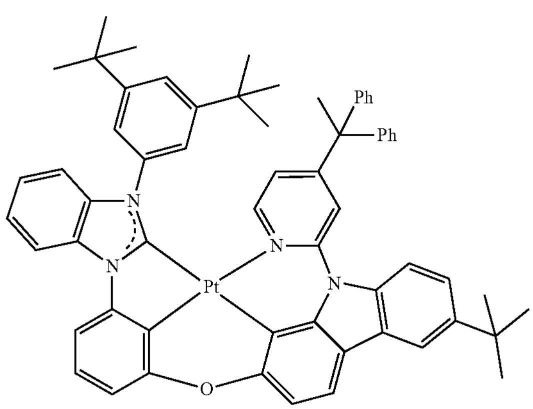
-continued
Pt-13
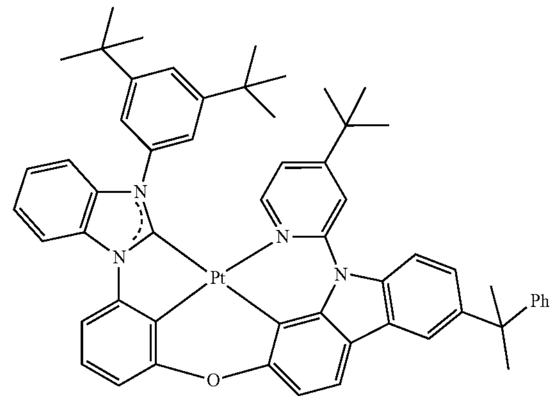
Pt-14
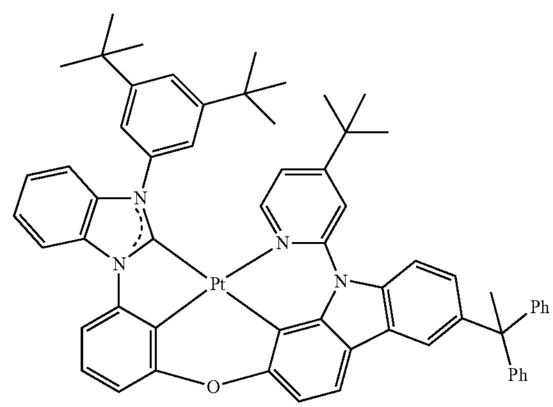
Pt-15
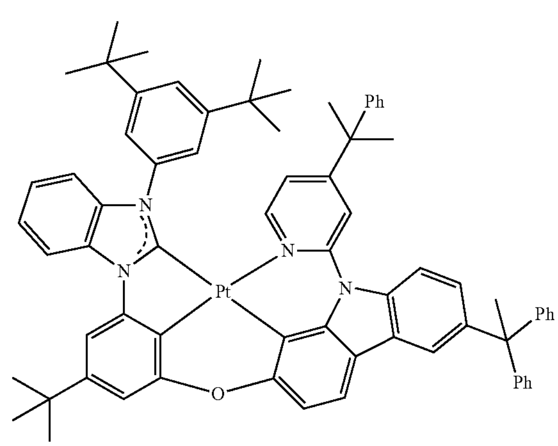

Pt-16
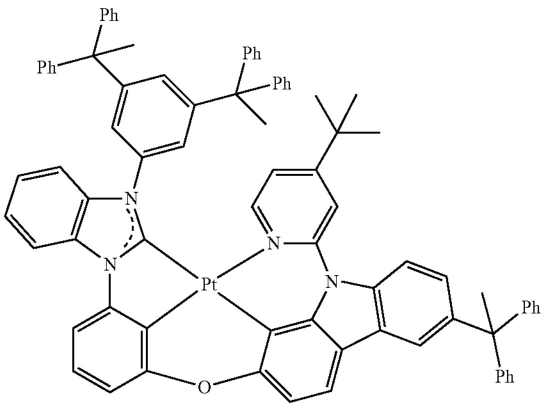
Pt-17
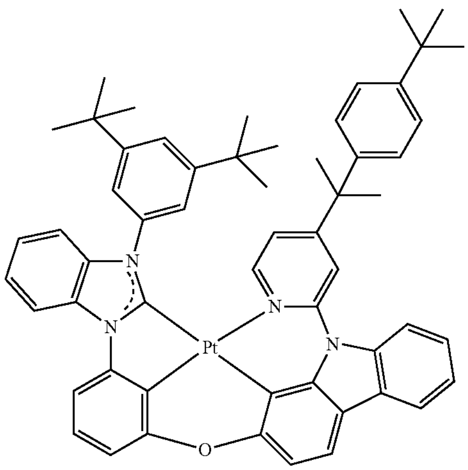
Pt-18
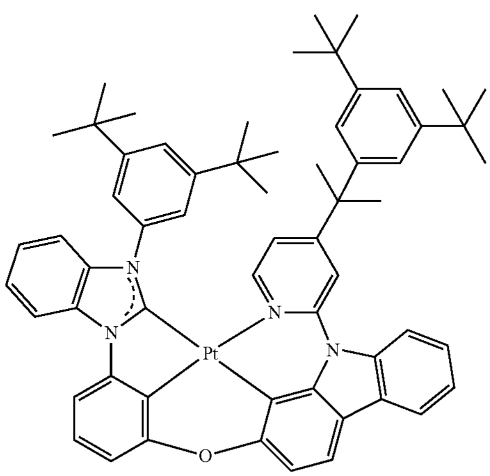
Pt-19
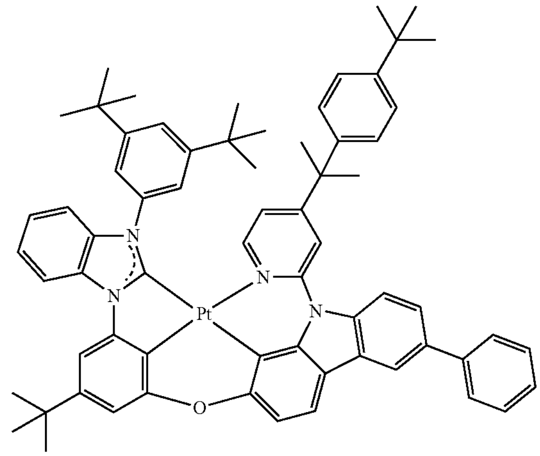
Pt-20
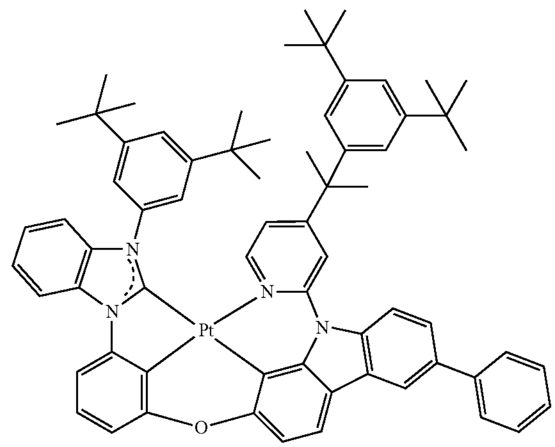
Pt-21
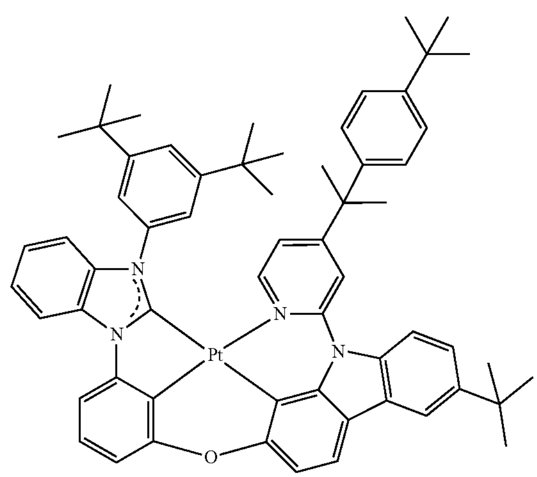

Pt-22
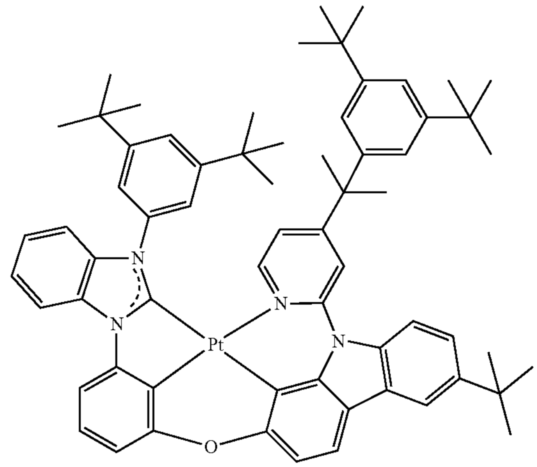
Pt-23
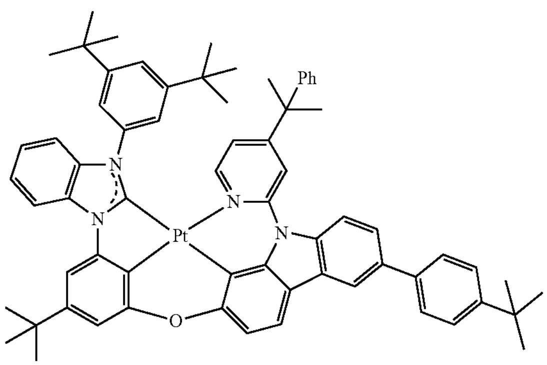
Pt-24
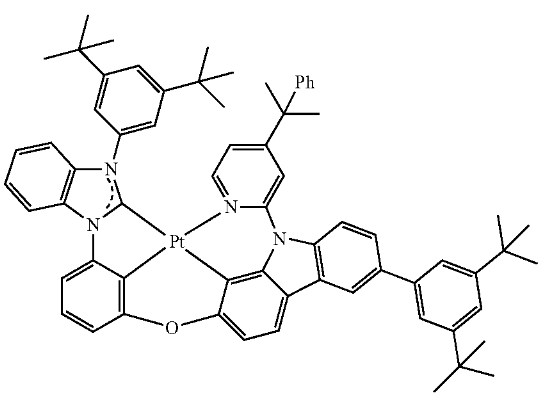
Pt-25
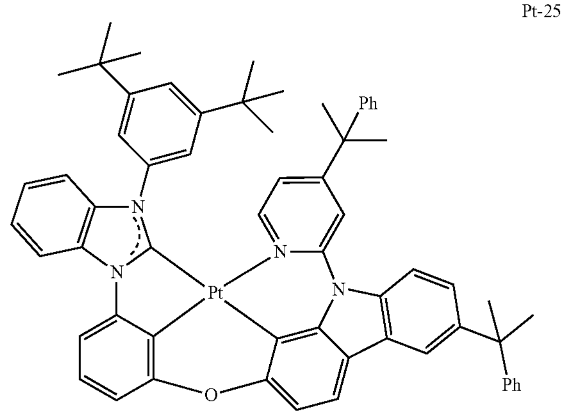
Pt-26
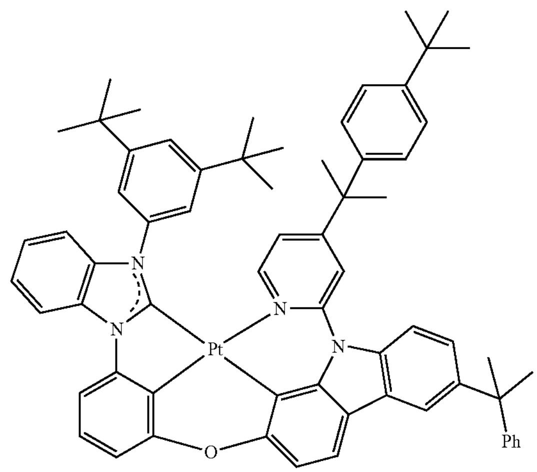
Pt-27
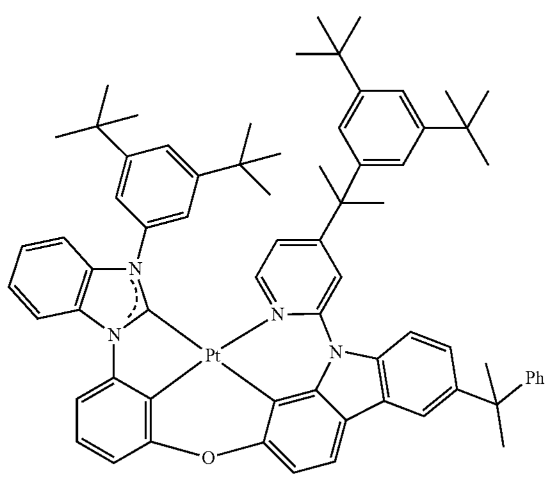

-continued
Pt-28
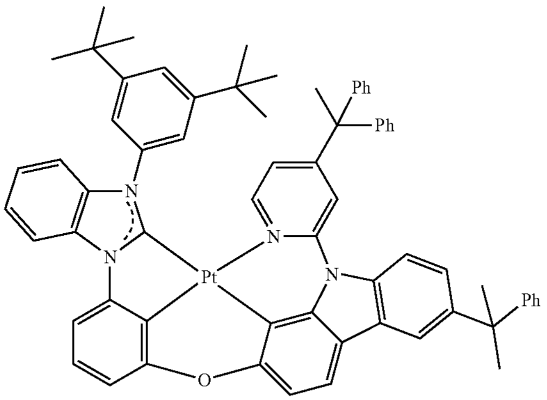
1
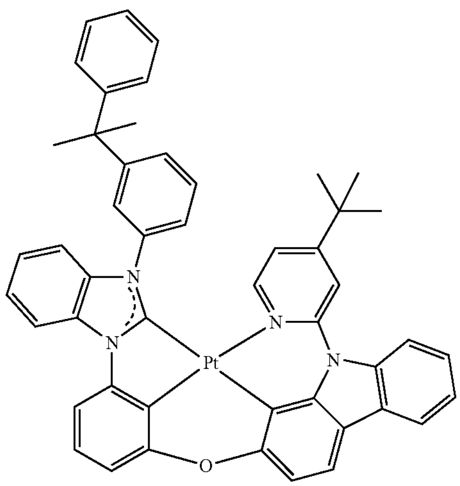
2
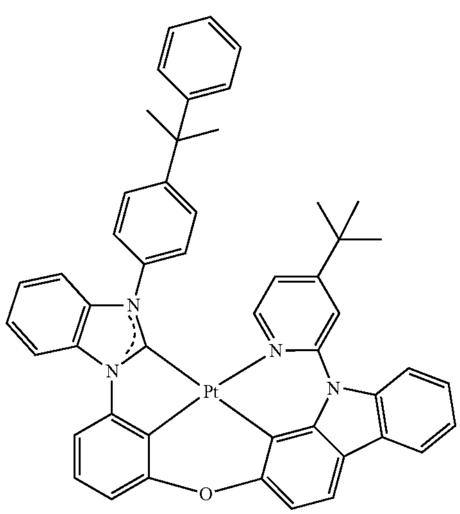
-continued
3
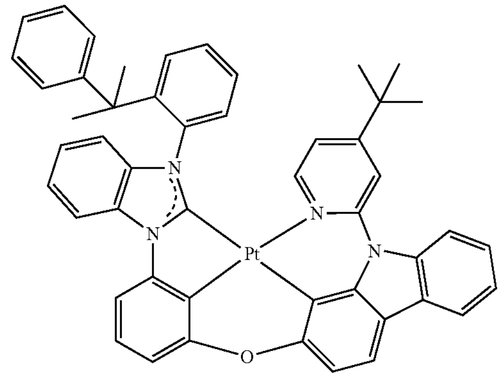
4
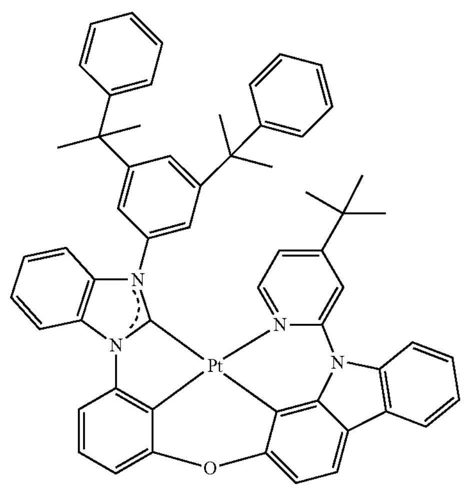
5
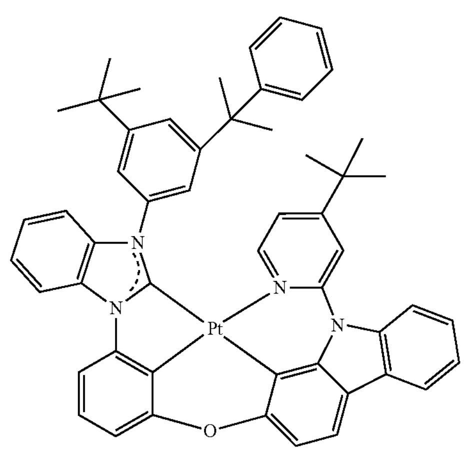

6
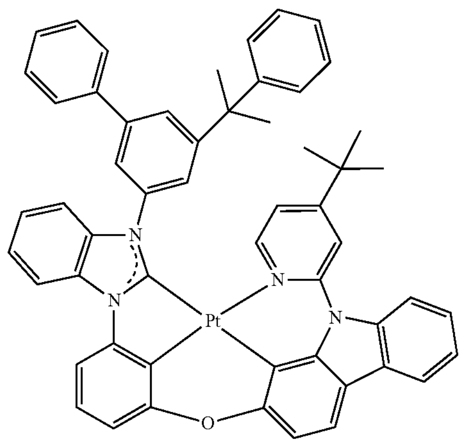
7
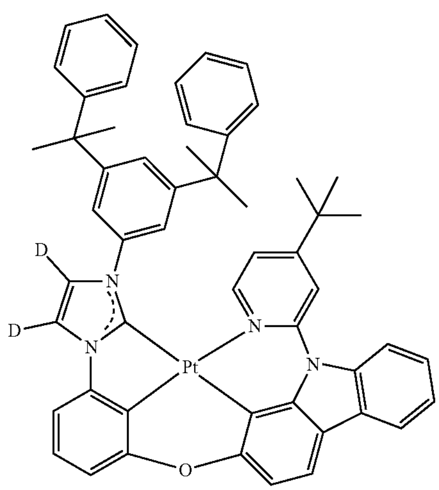
8
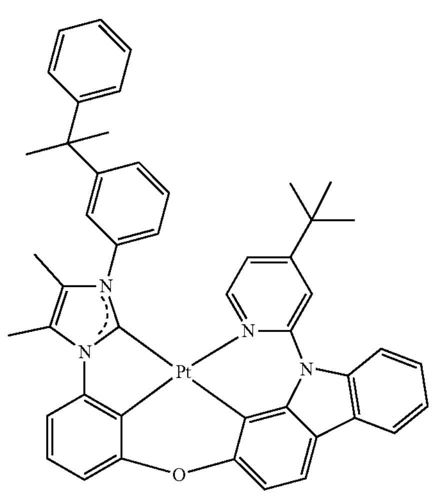
9
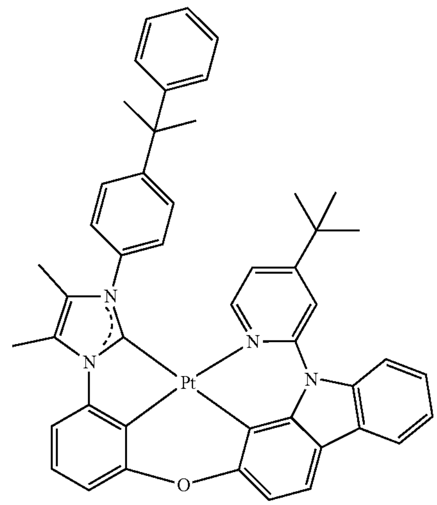
10
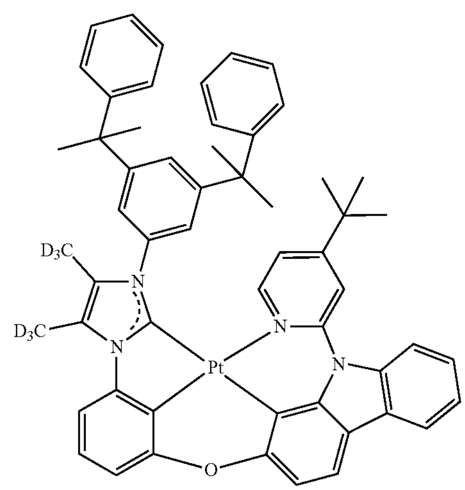
11
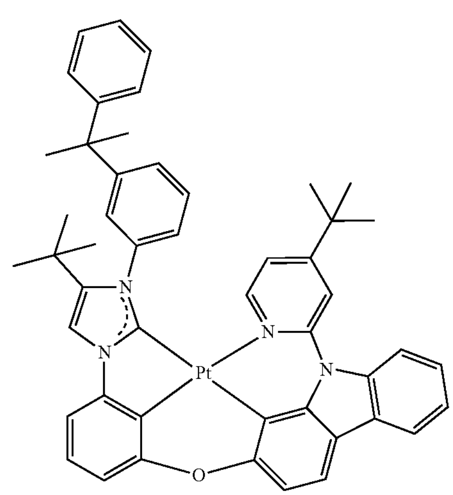

12
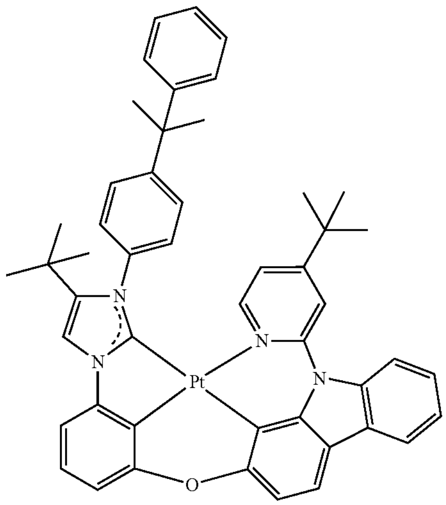
13
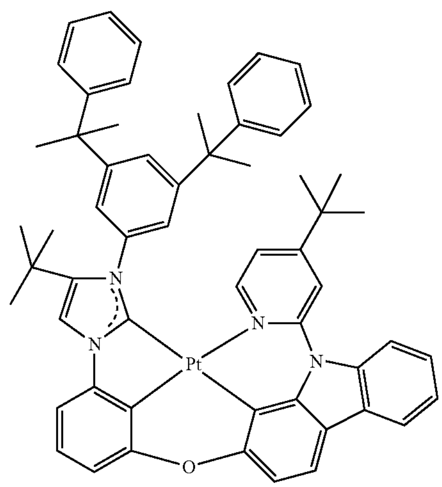
14
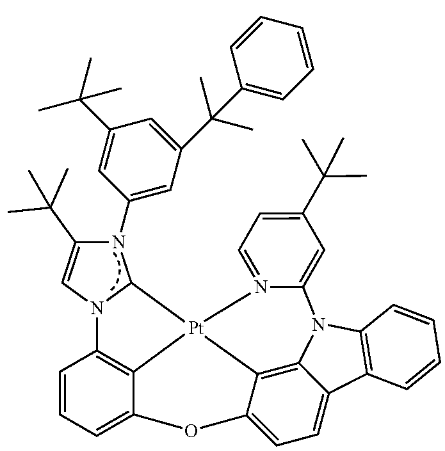
15
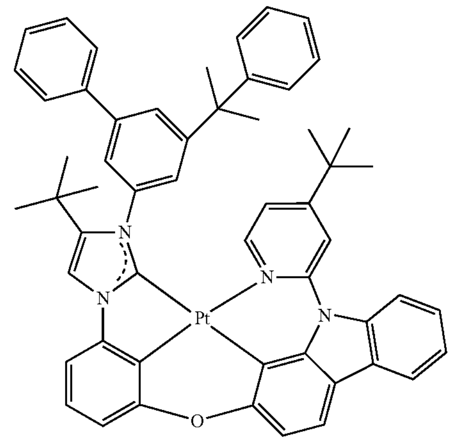
16
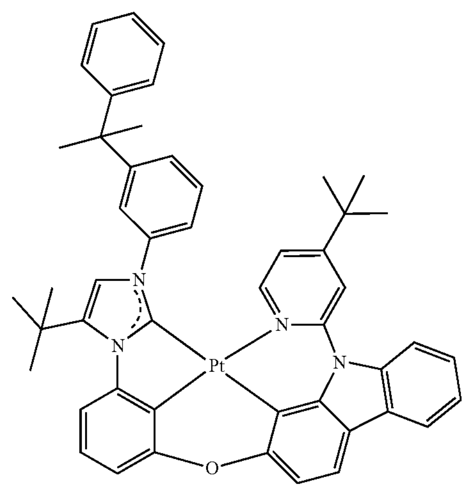
17
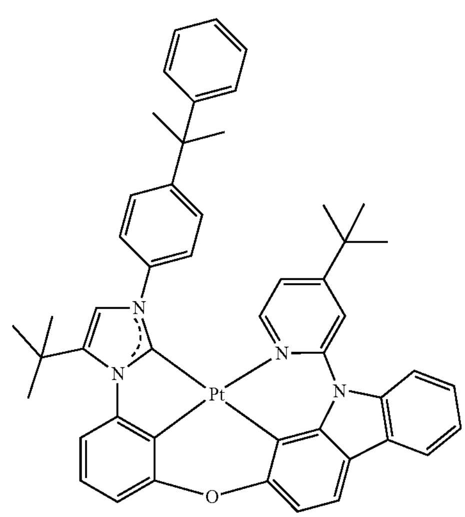

-continued
18
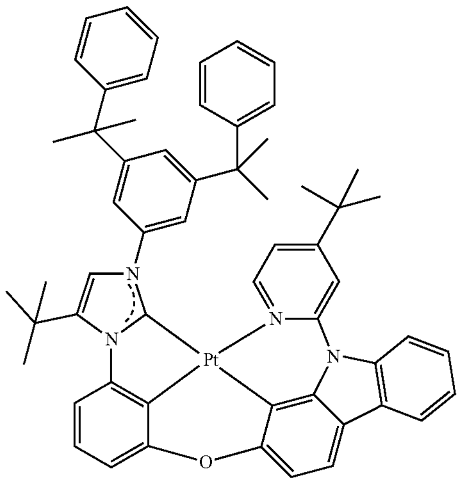
19
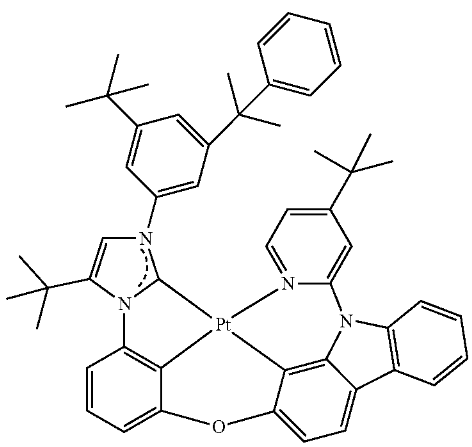
20
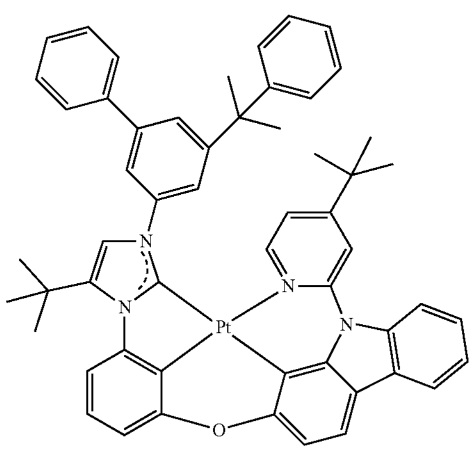
-continued
21
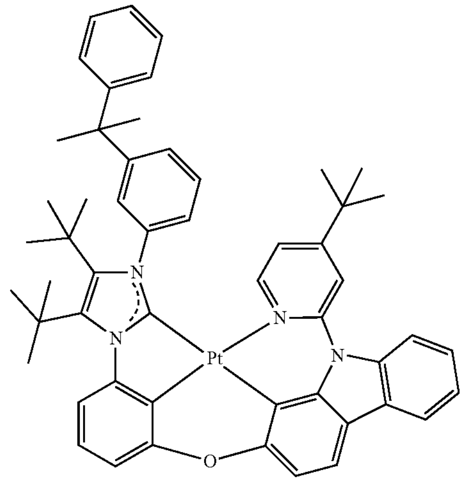
22
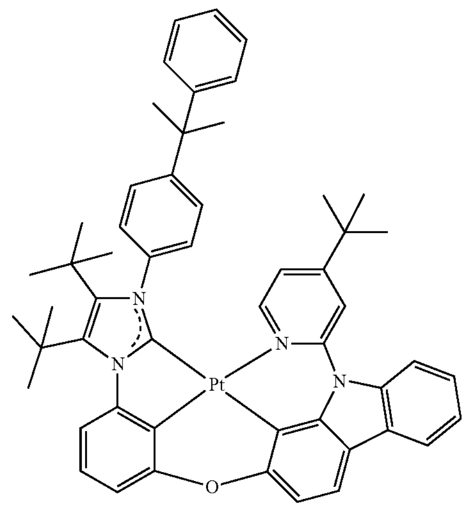
23
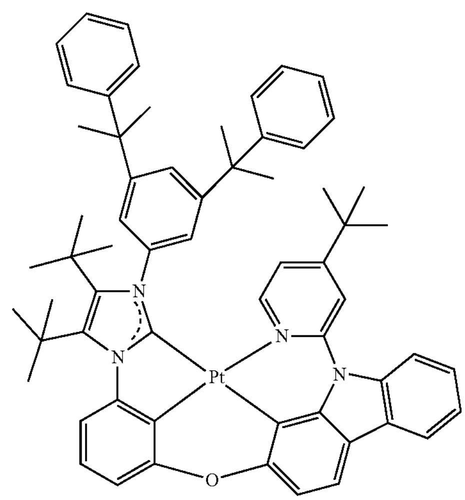

24
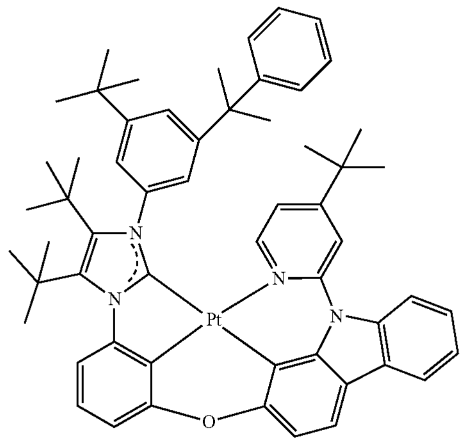
25
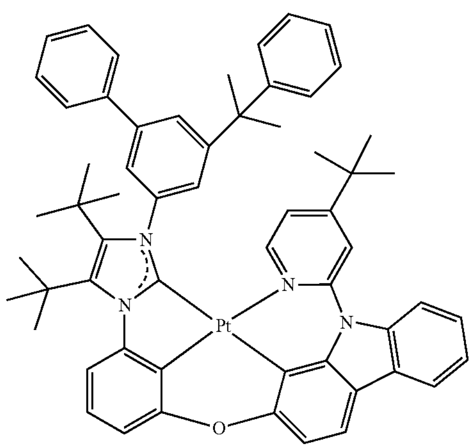
26
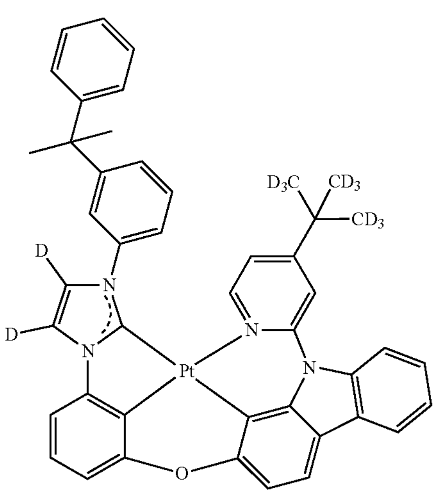
27
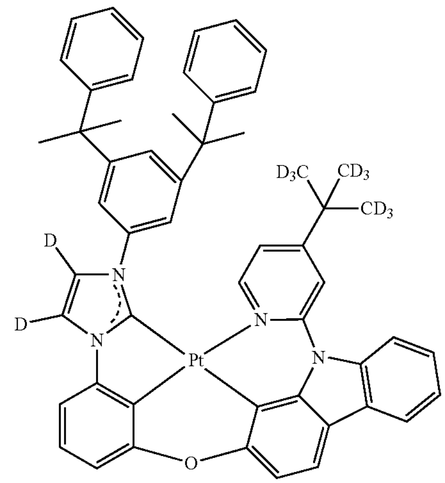
28
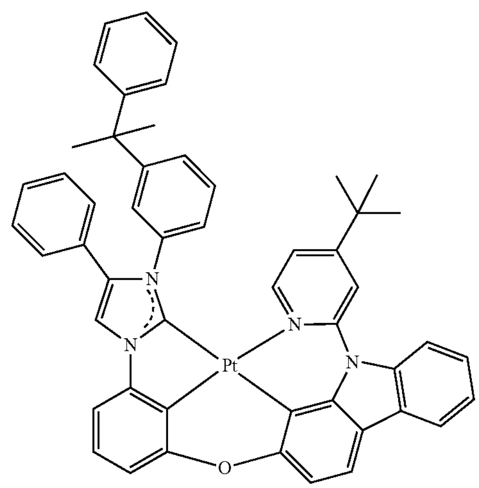
29
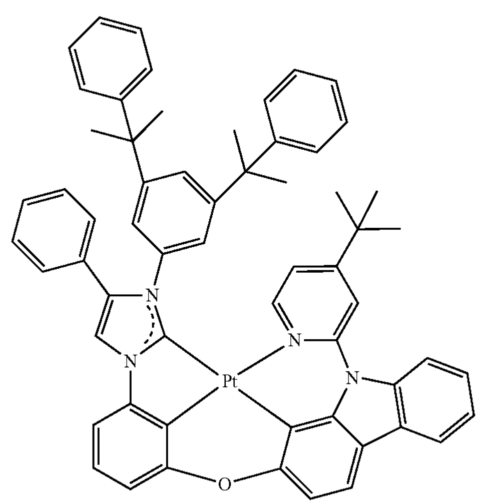

-continued
30
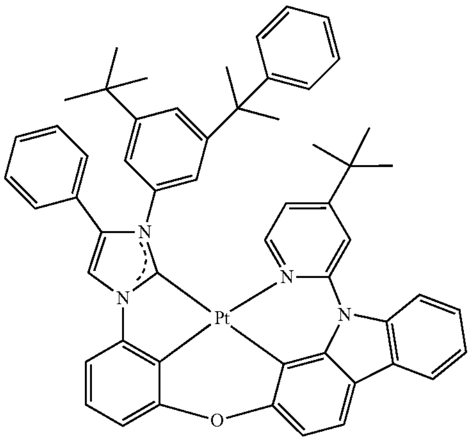
31
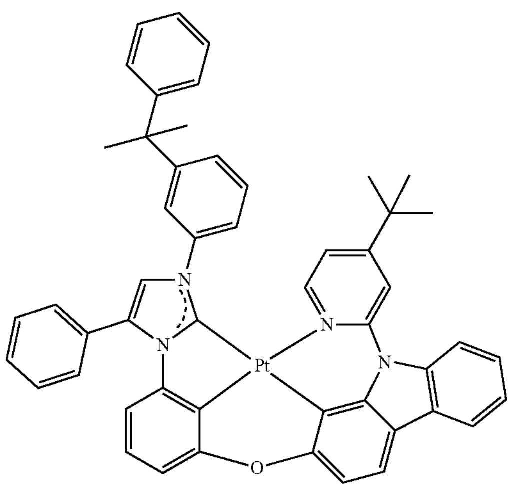
32
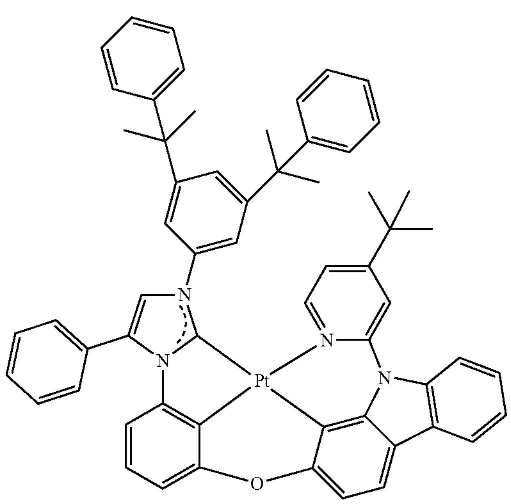
-continued
33
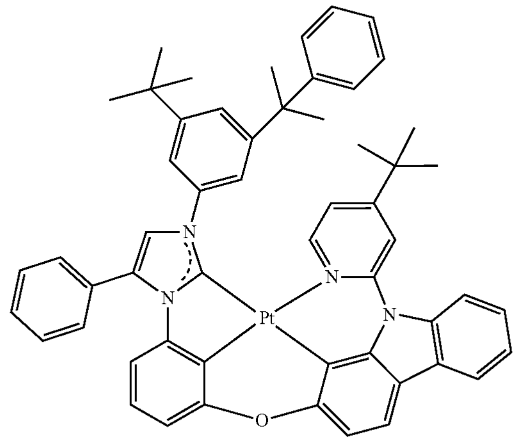
34
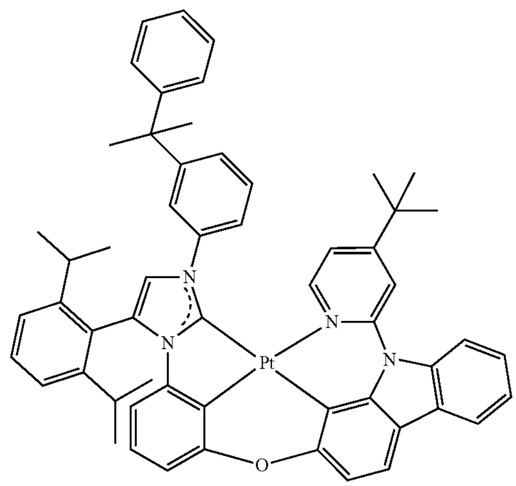
35
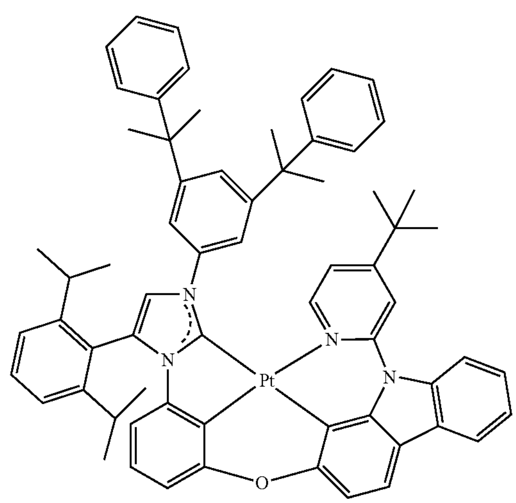

-continued
36
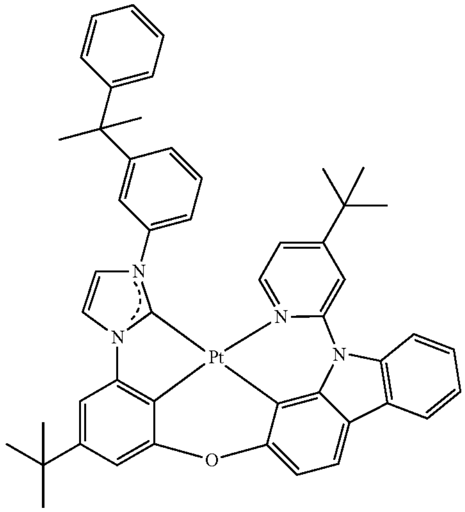
37
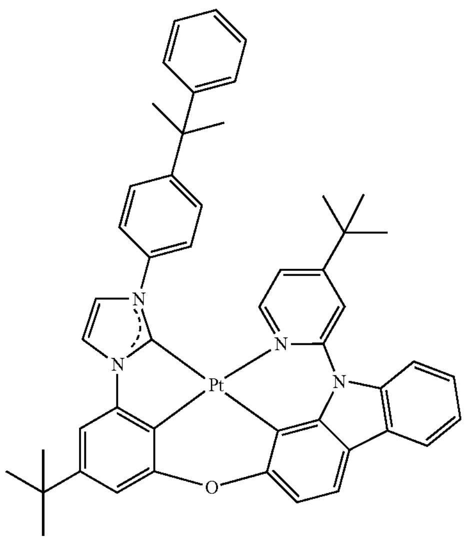
38
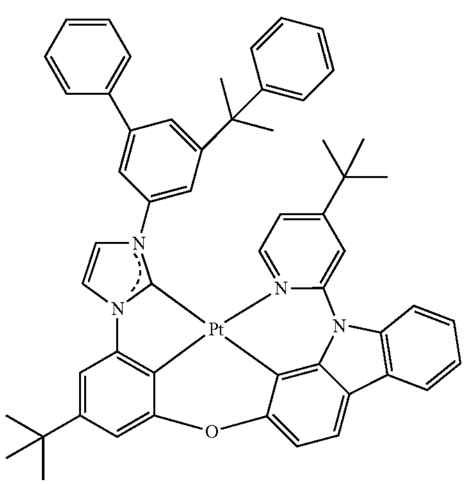
-continued
39
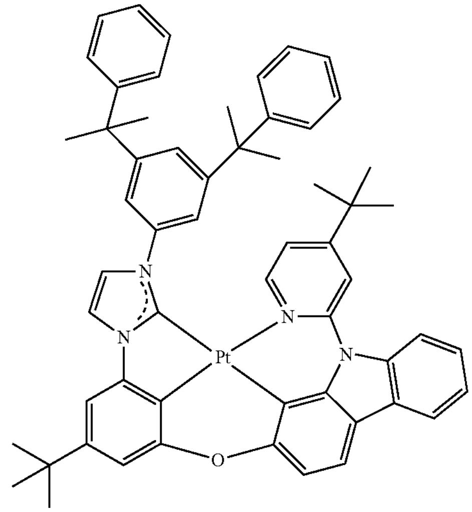
40
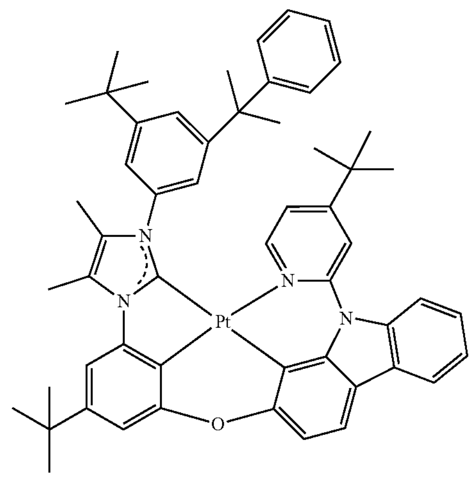
41
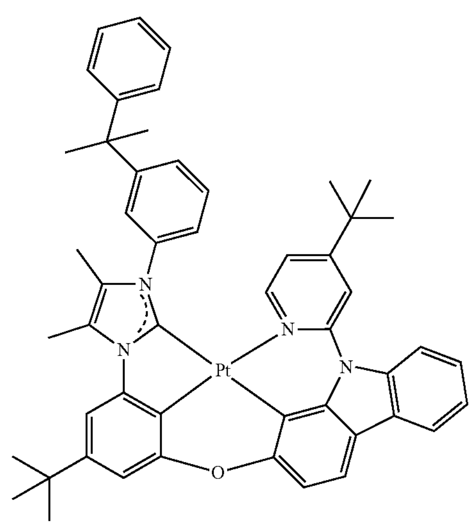

-continued
42
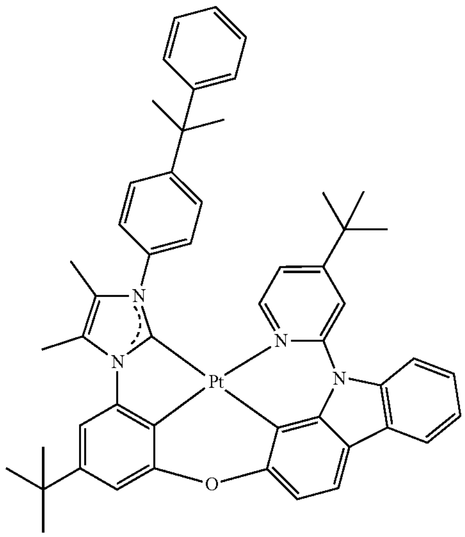
43
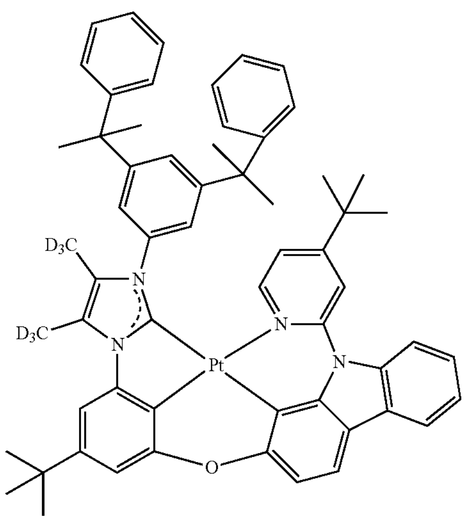
44
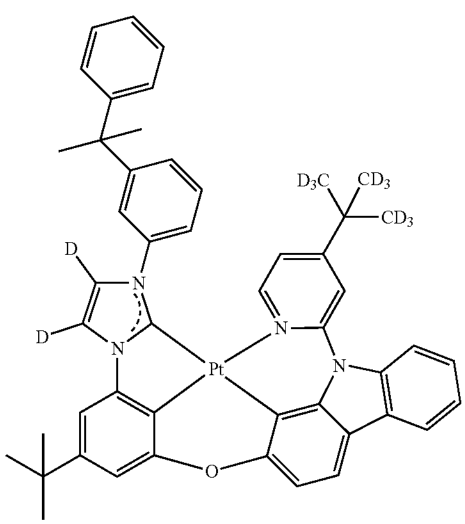
-continued
45
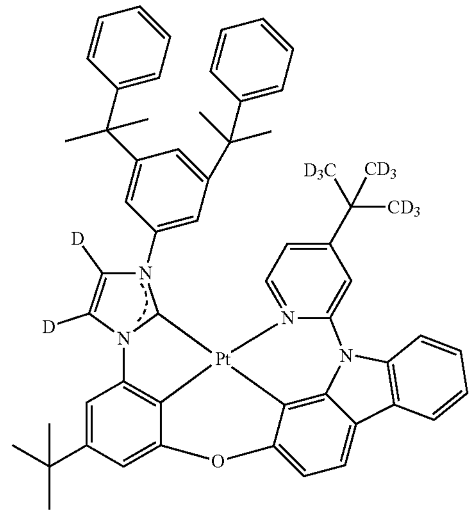
46
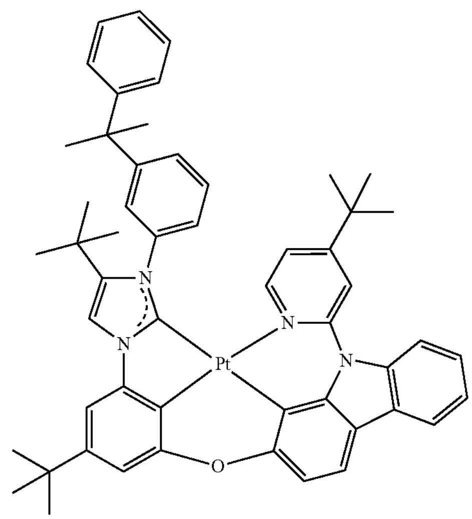
47
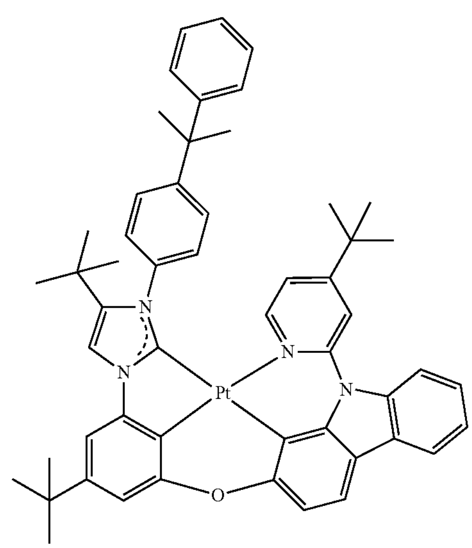

-continued
48
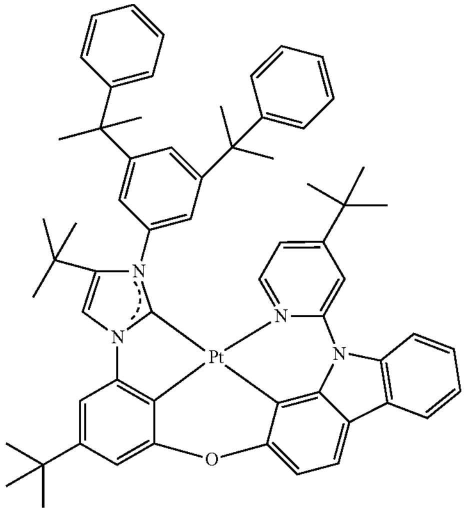
49
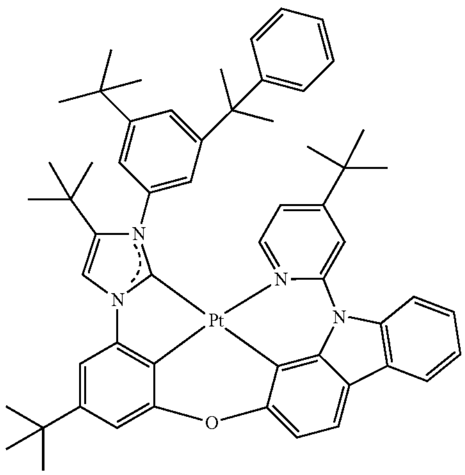
50
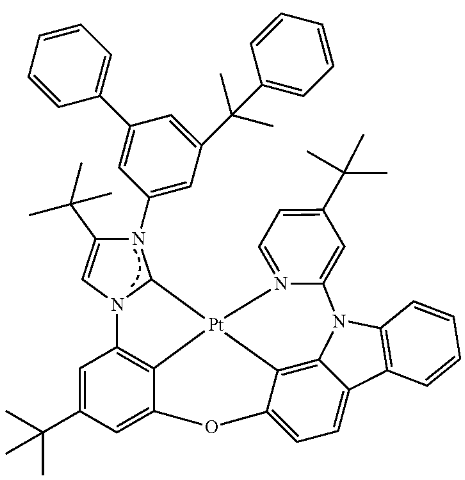
-continued
51
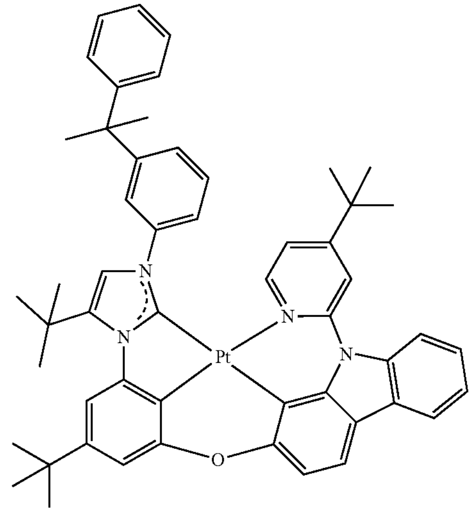
52
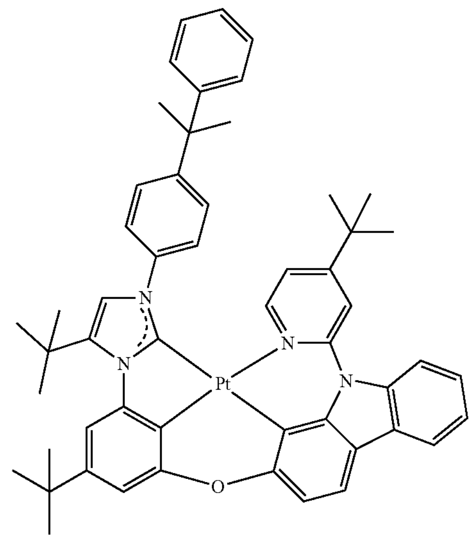
53
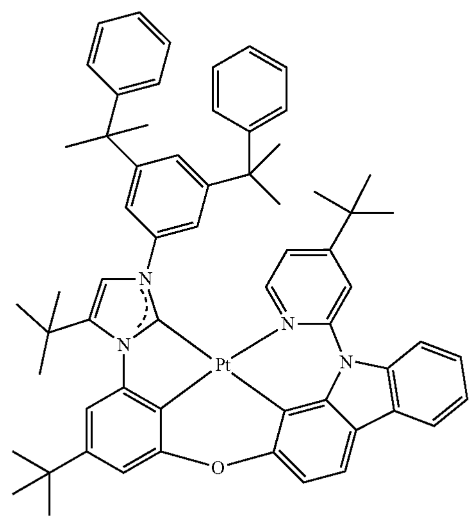

-continued
54
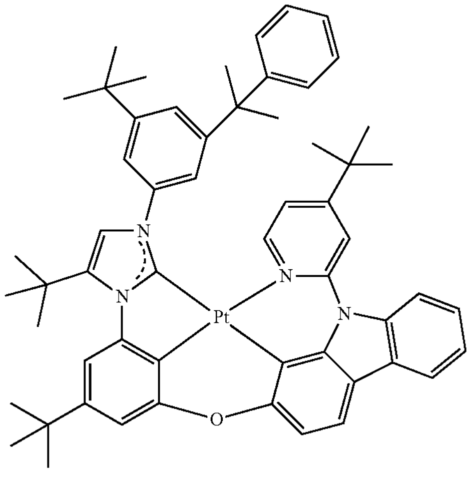
55
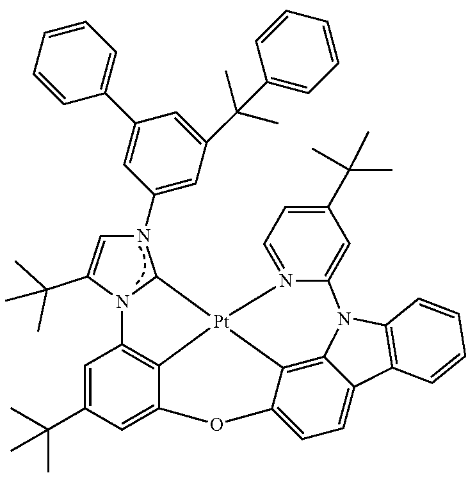
56
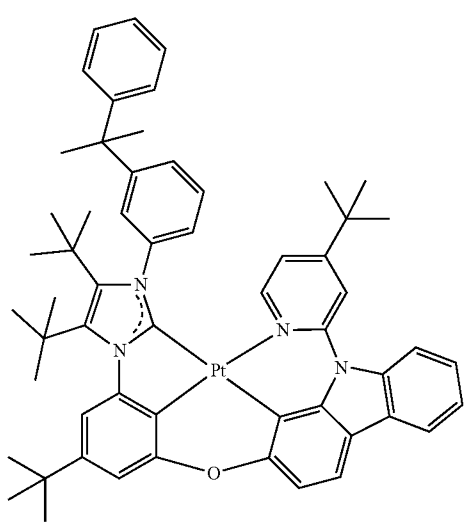
-continued
57
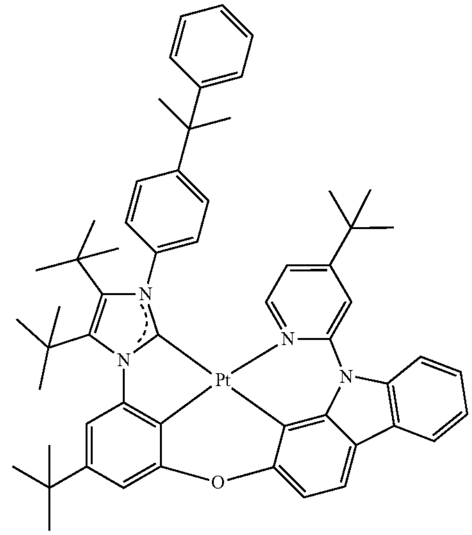
58
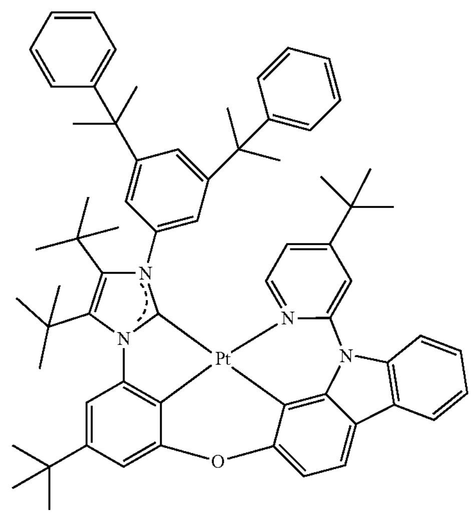
59
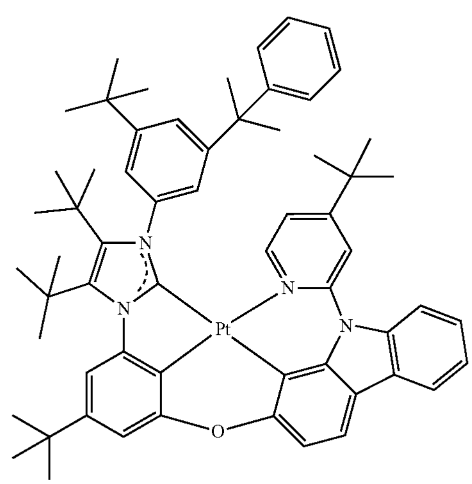

60
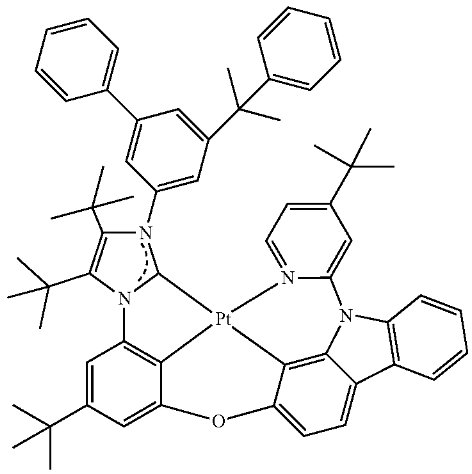
61
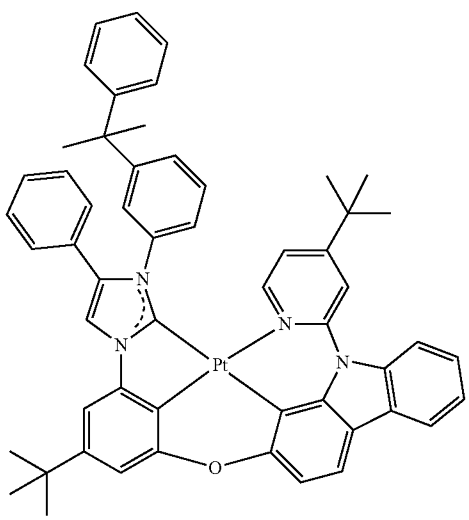
62
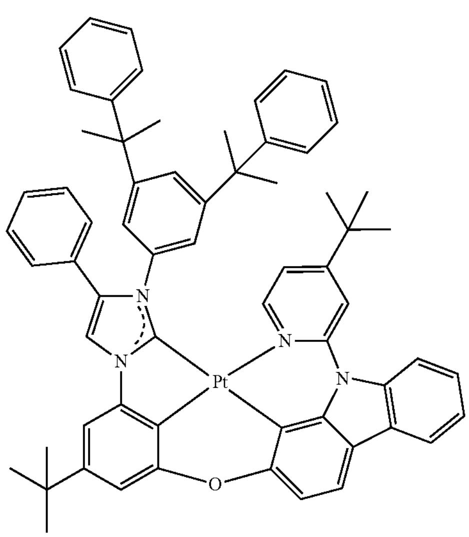
63
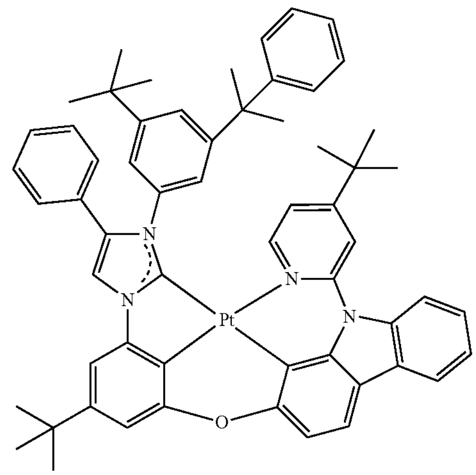
64
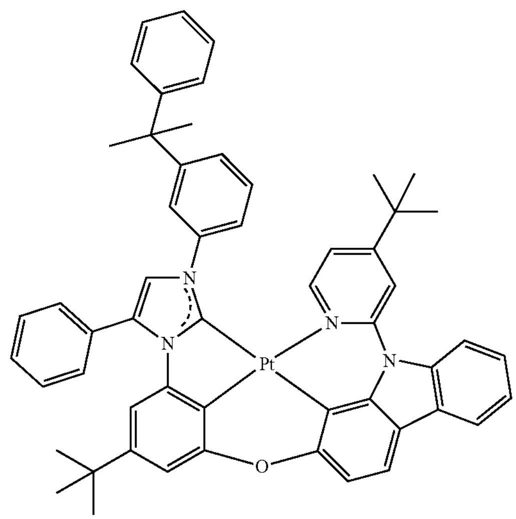
65
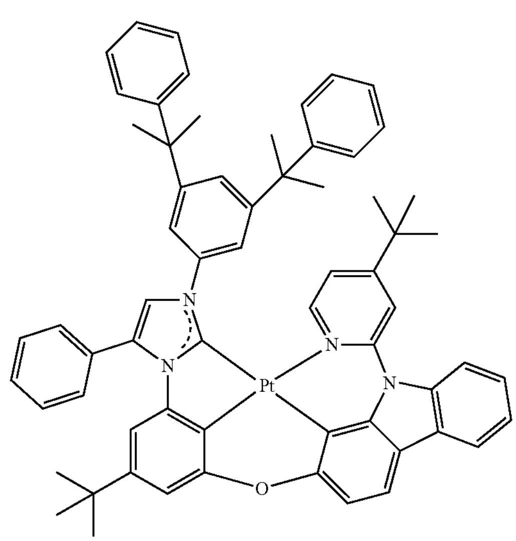

-continued
66
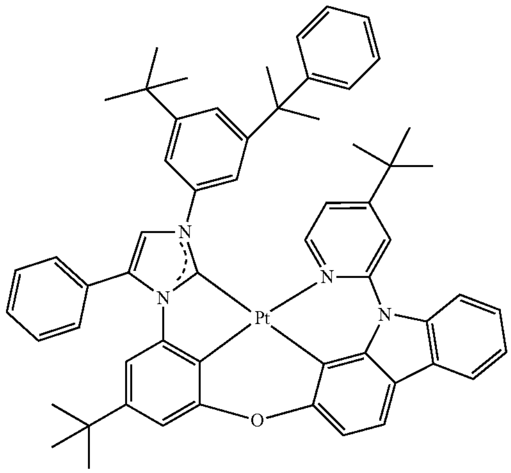
67
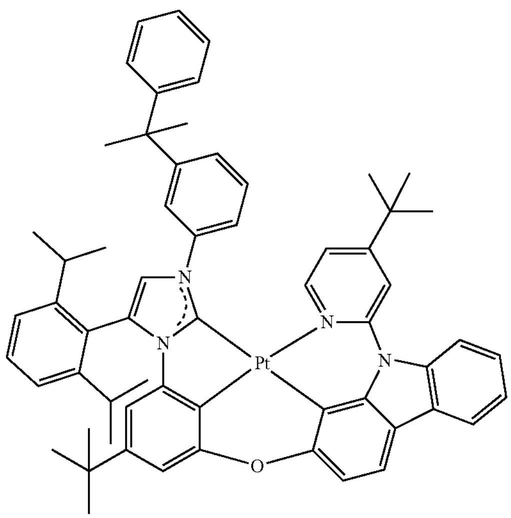
68
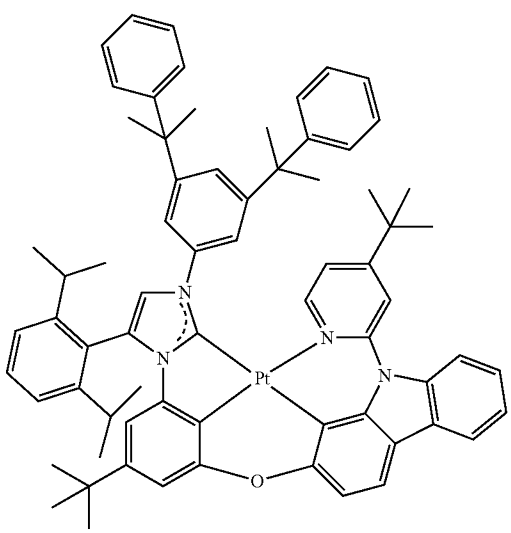
-continued
69
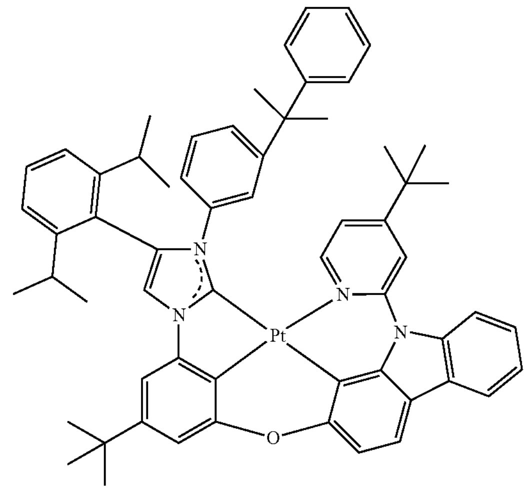
70
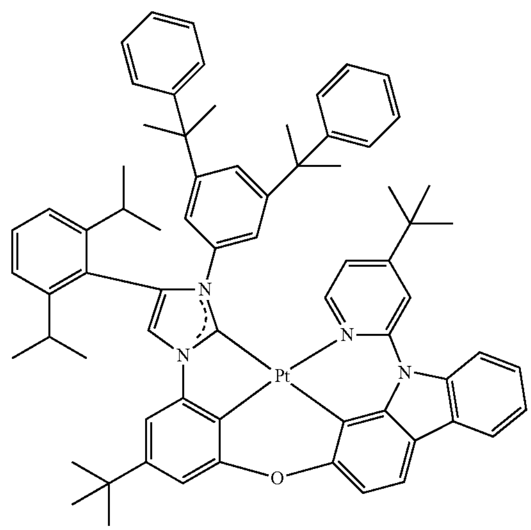
71
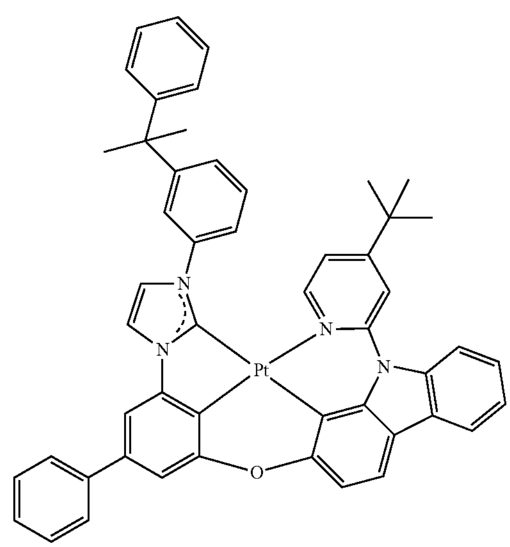

-continued
72
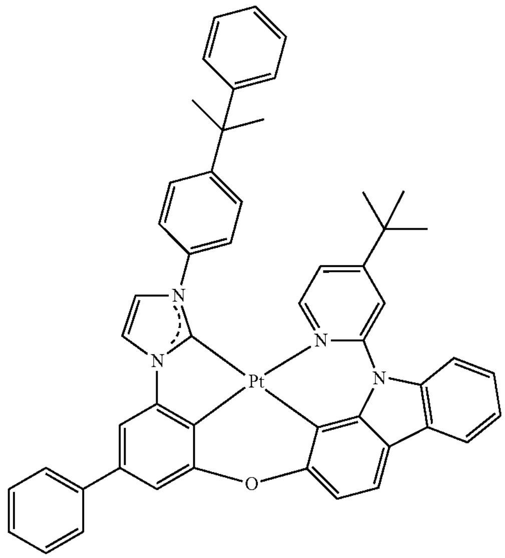
73
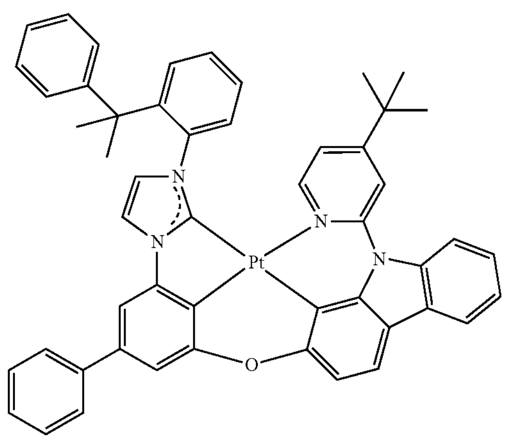
74
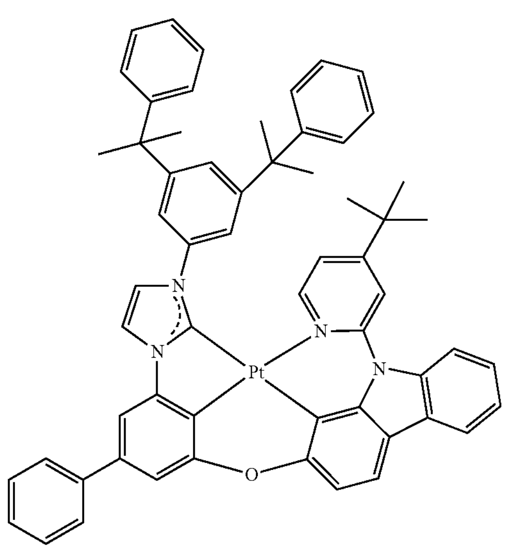
-continued
75
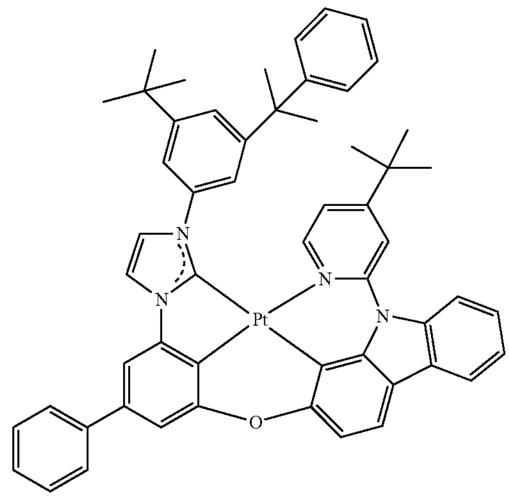
76
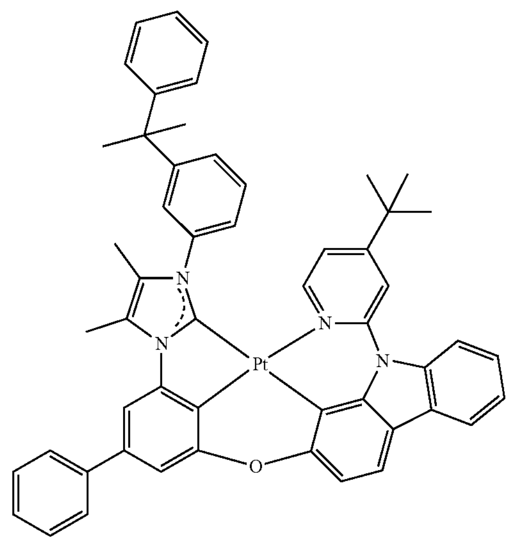
77
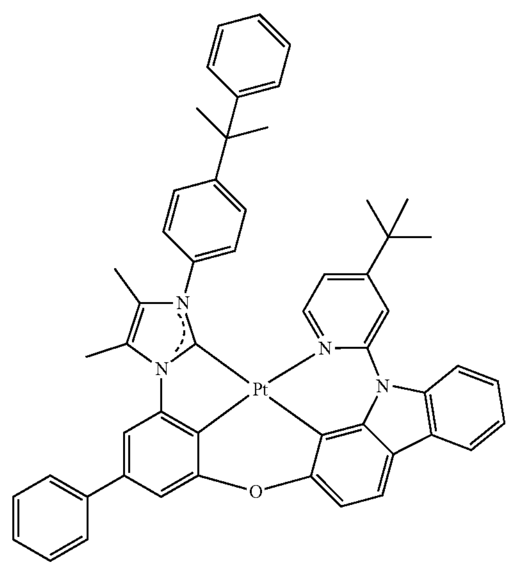

-continued
78
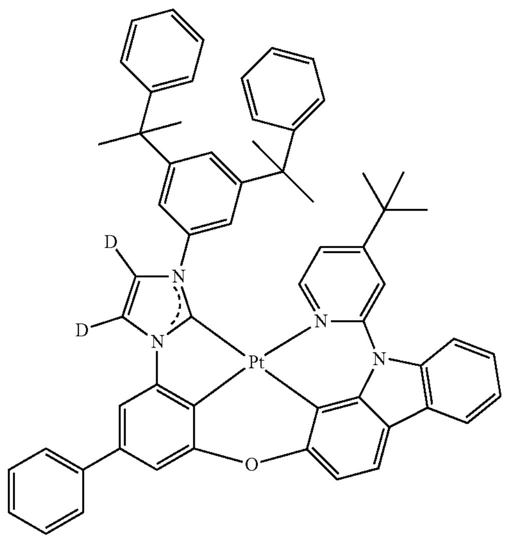
79
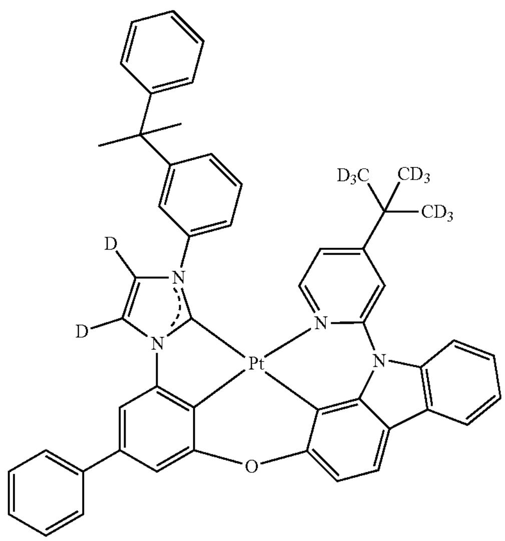
80
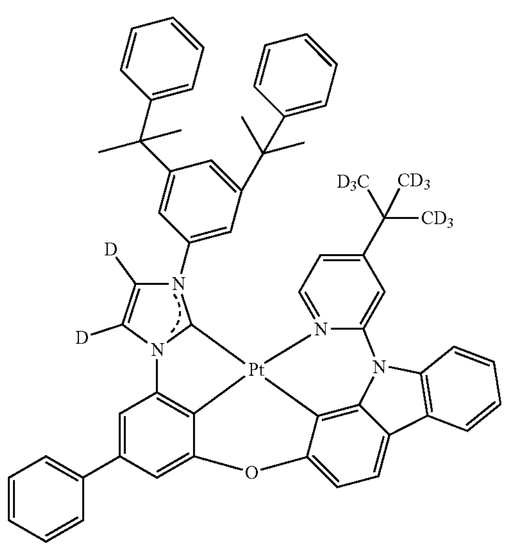
-continued
81
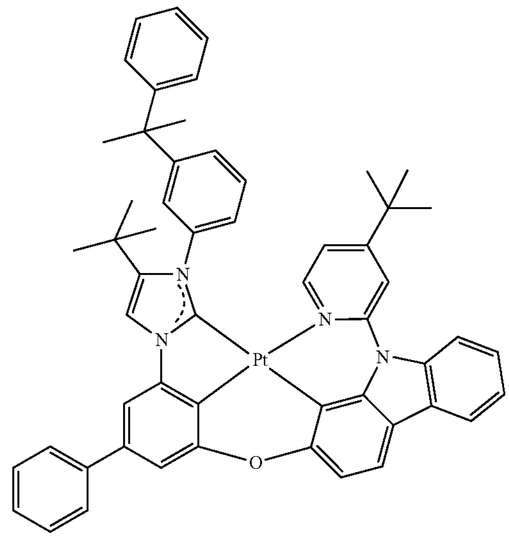
82
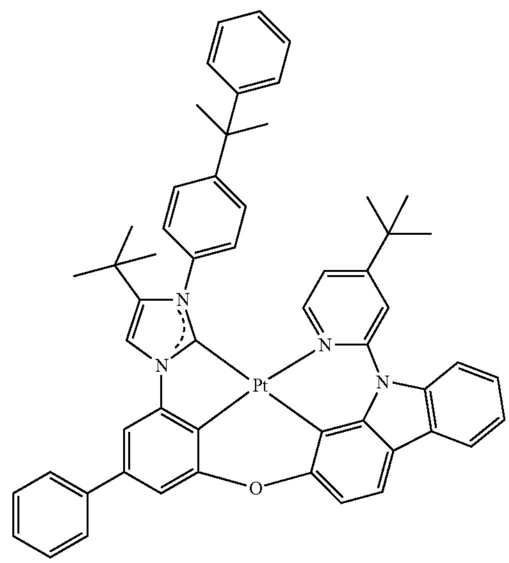
83
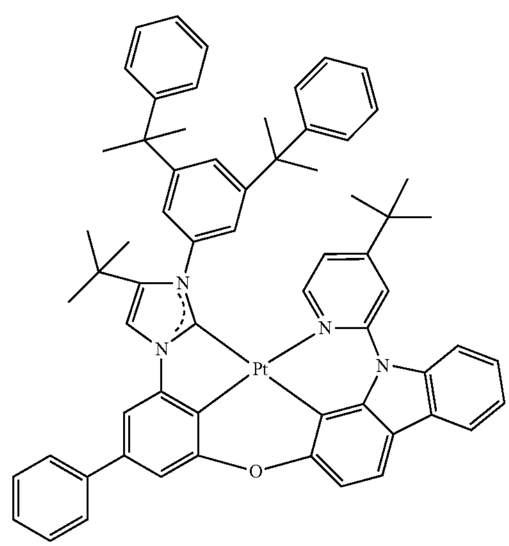

-continued
84
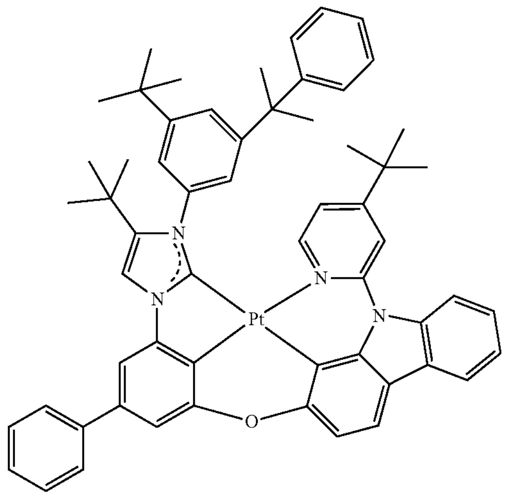
85
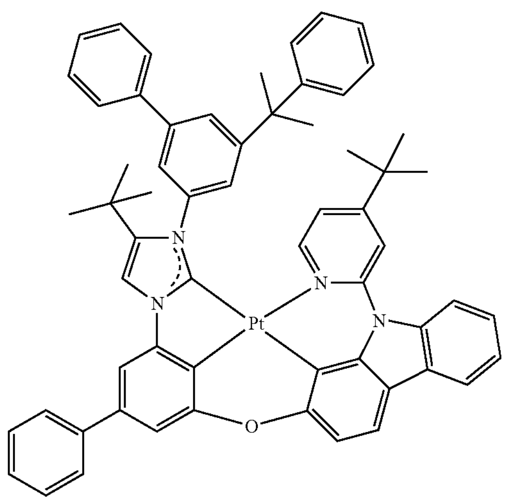
86
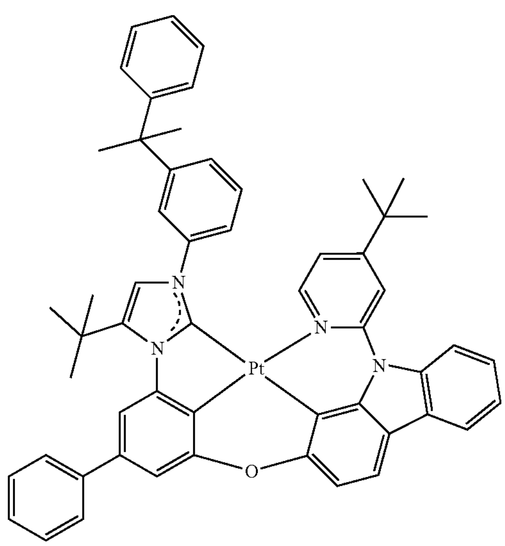
-continued
87
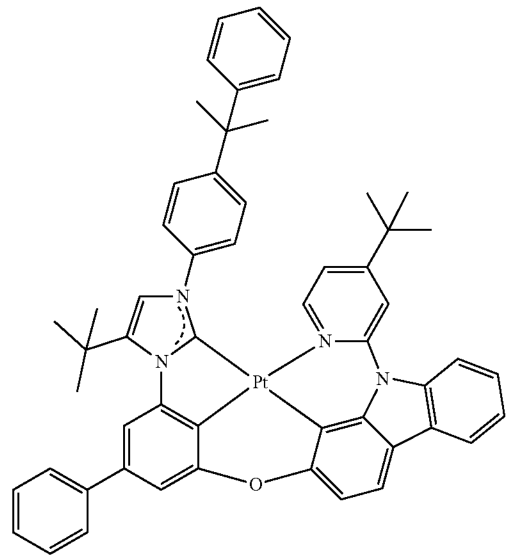
88
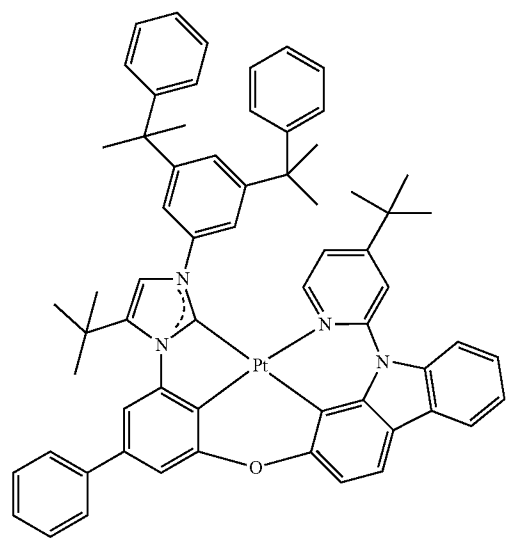
89
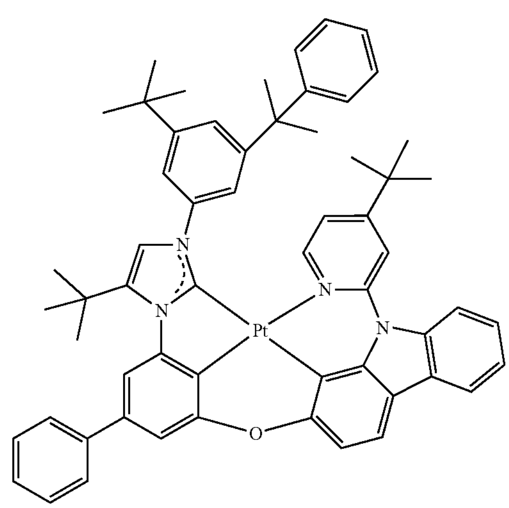

90
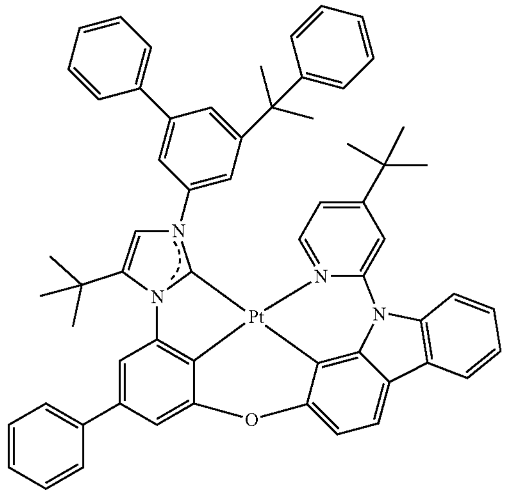
91
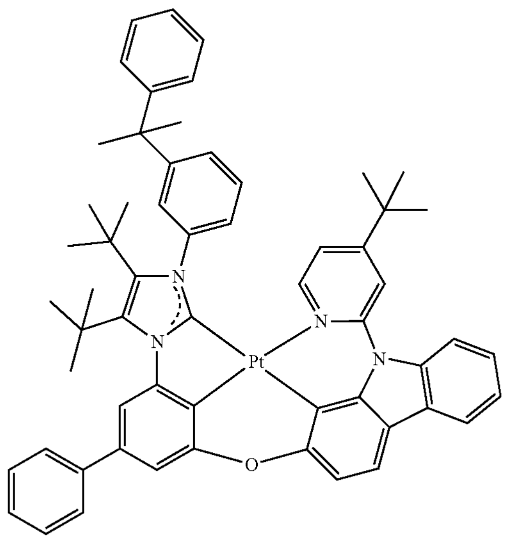
92
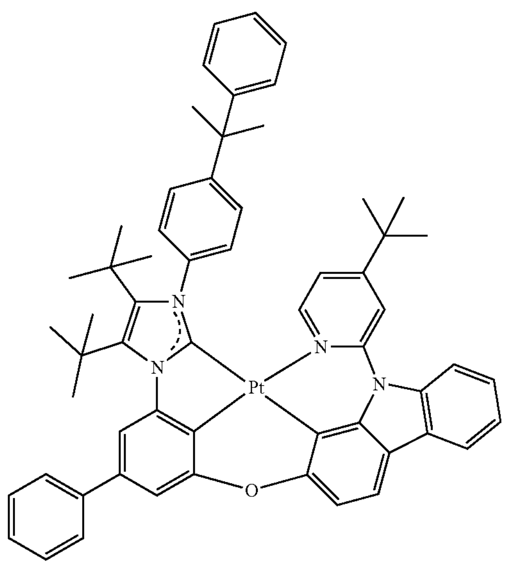
93
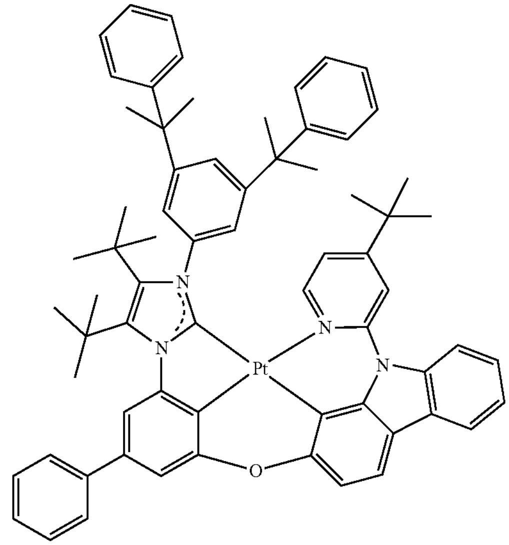
94
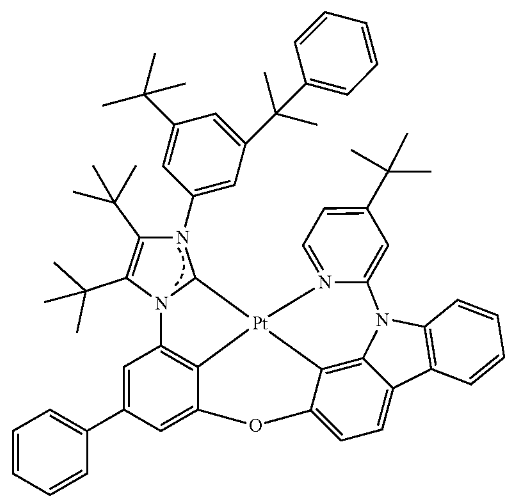
95
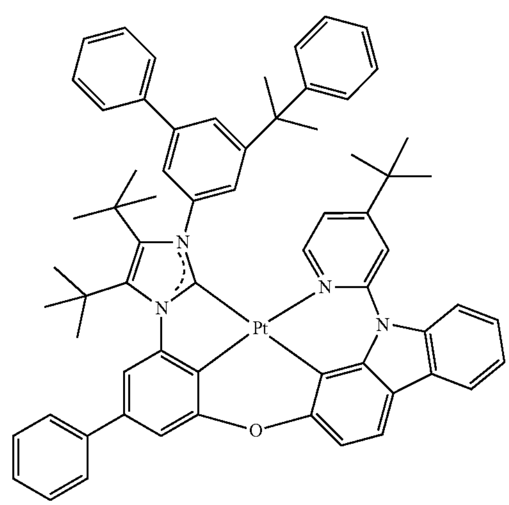

-continued
96
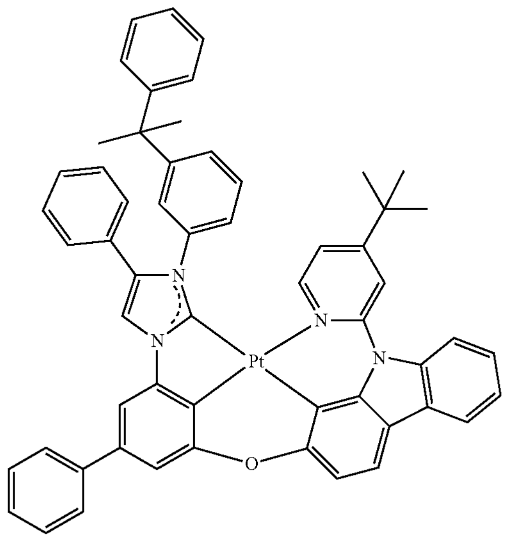
97
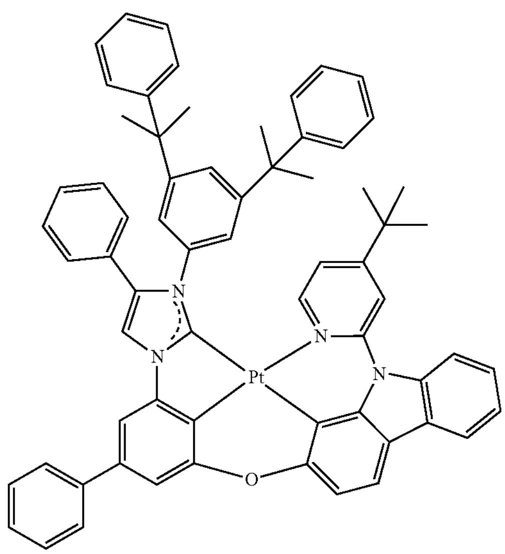
98
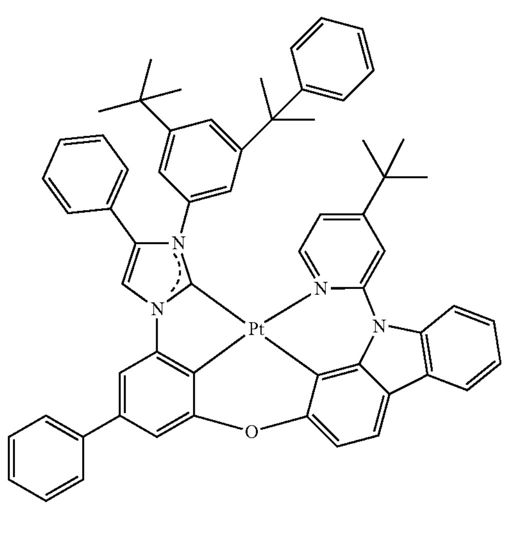
99
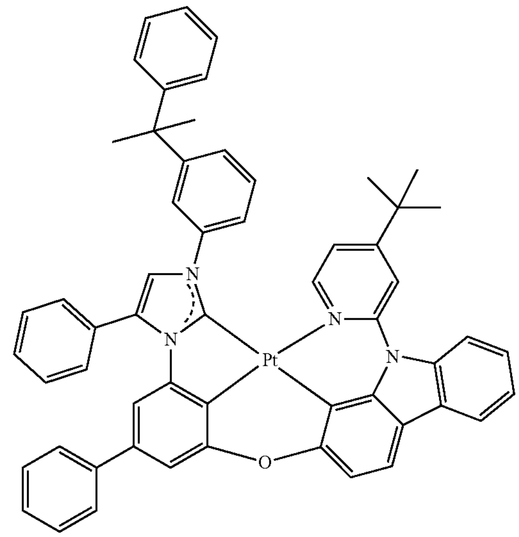
100
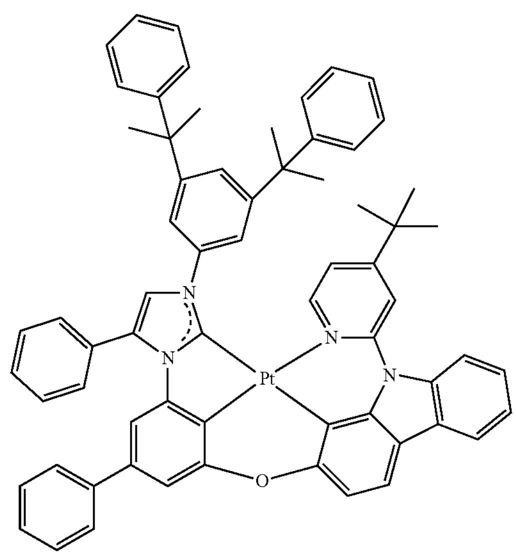
101
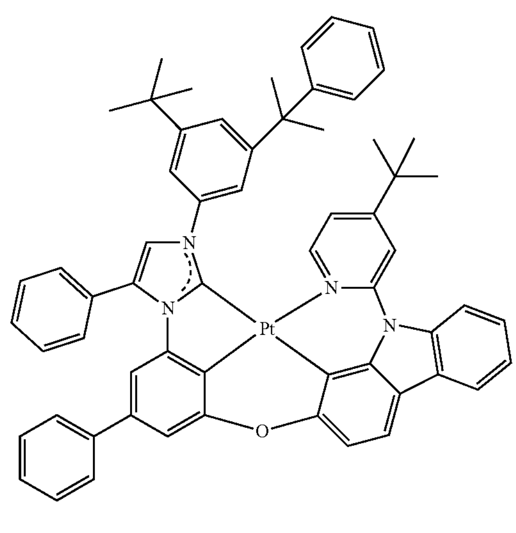

-continued
102
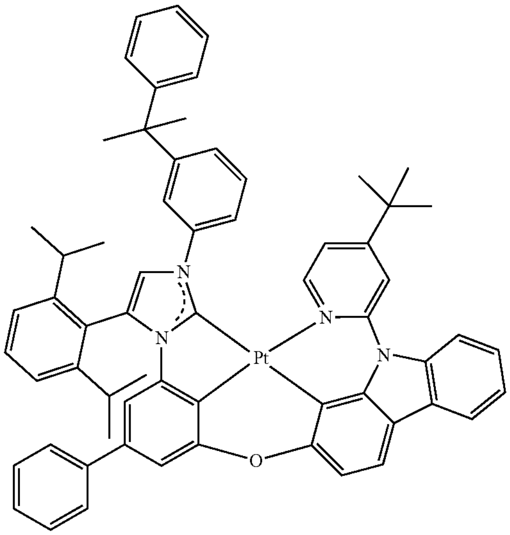
103
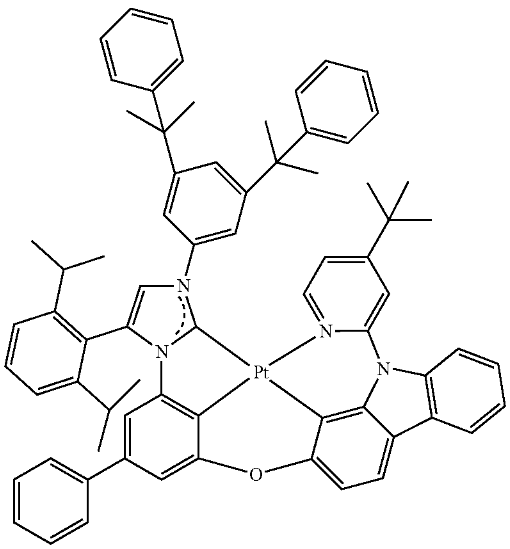
104
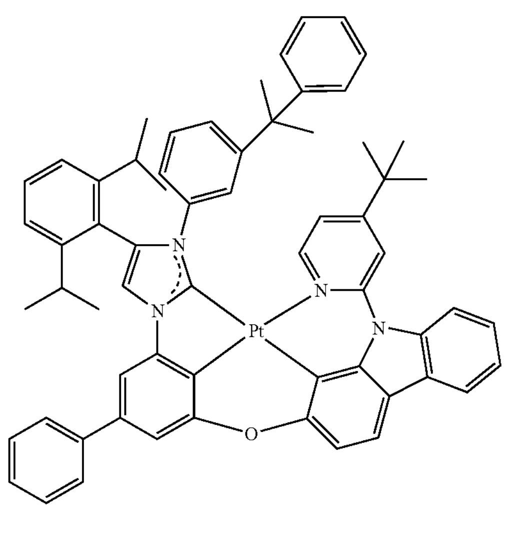
-continued
105
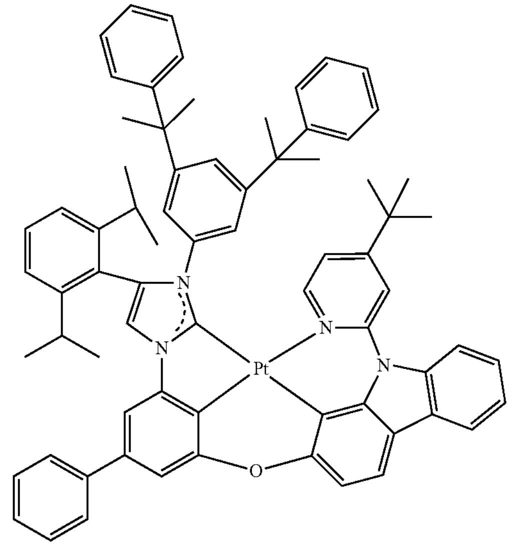
106
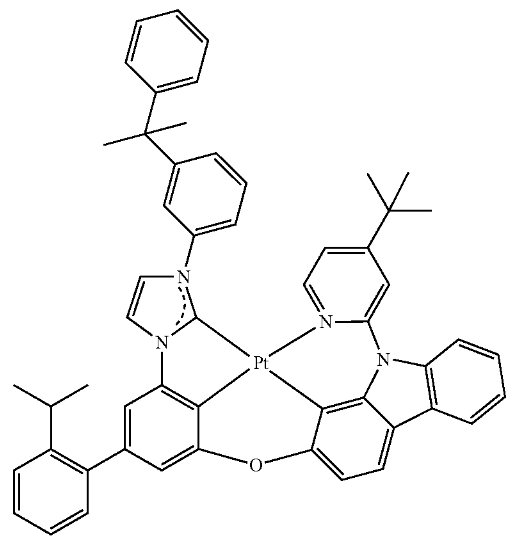
107
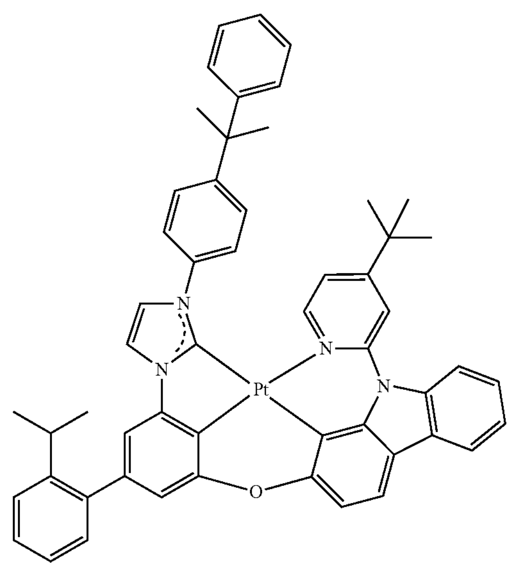

108
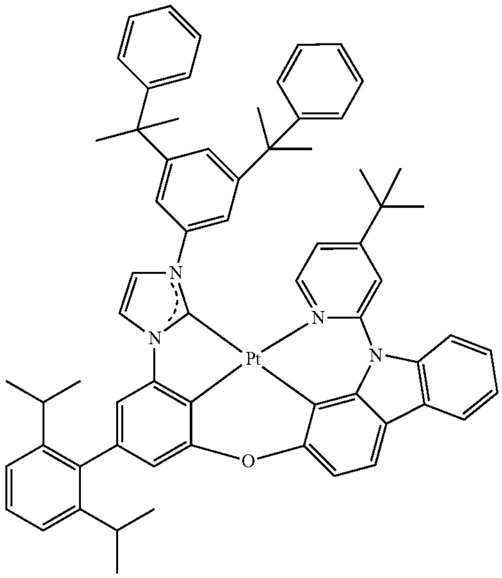
109
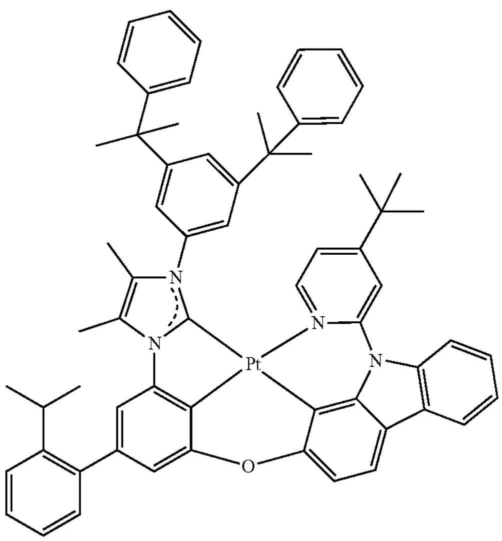
110
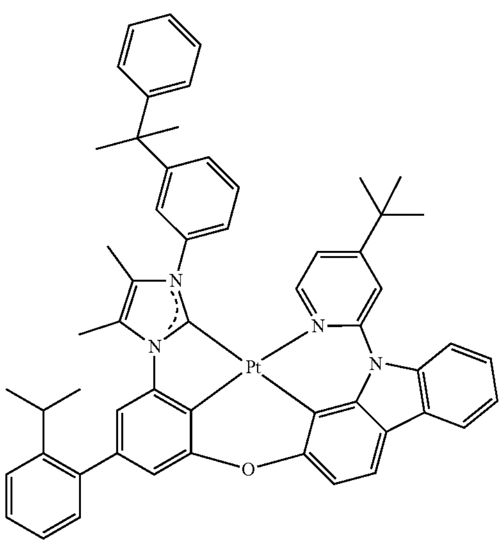
111
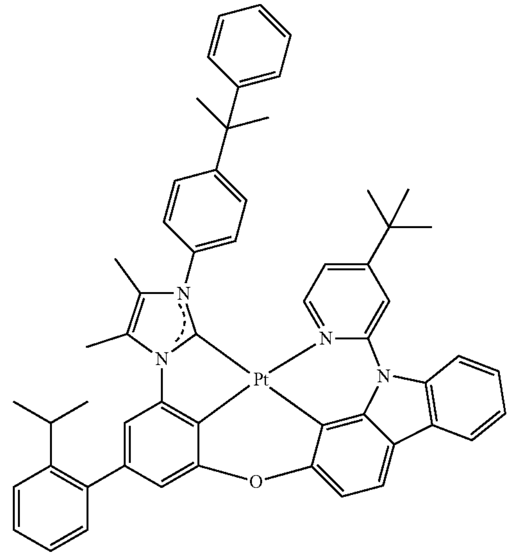
112
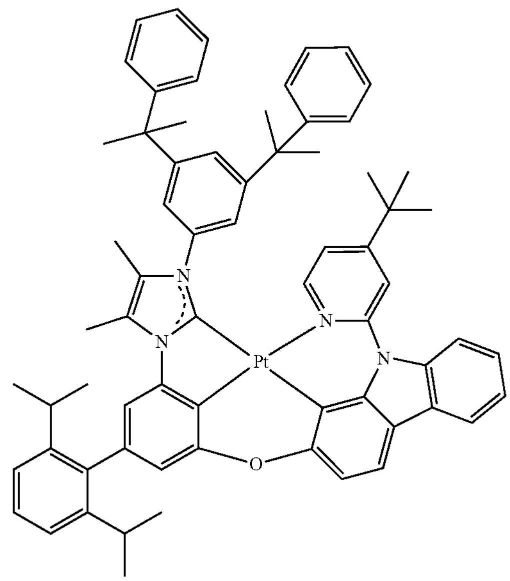
113
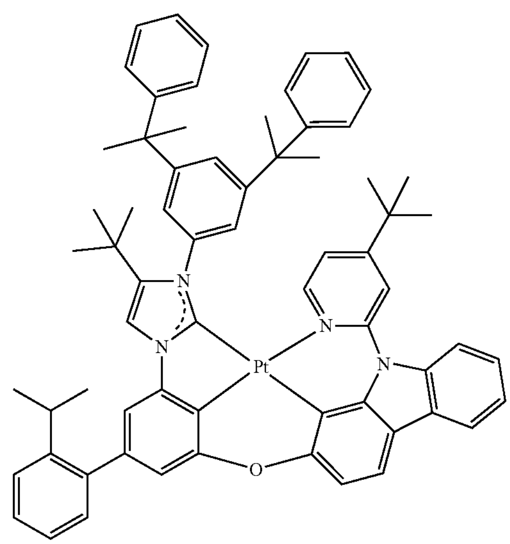

-continued
114
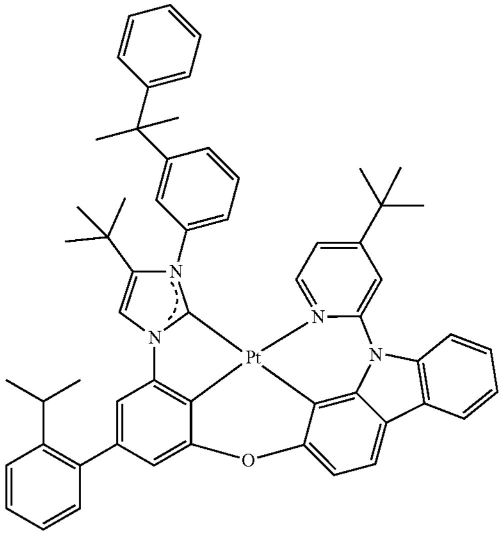
115
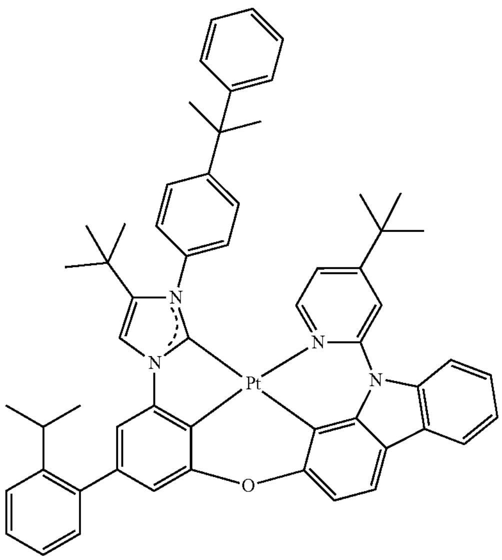
116
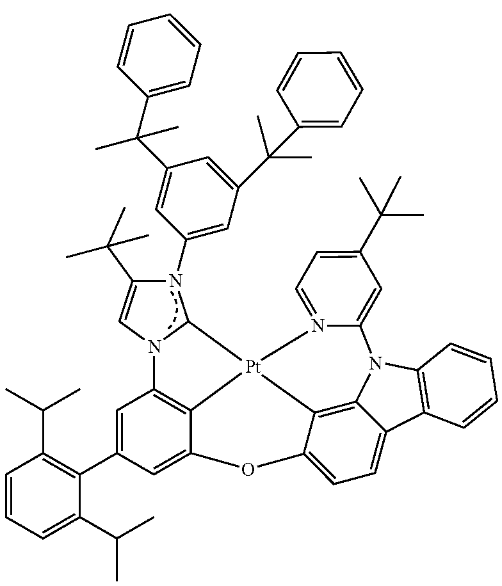
-continued
117
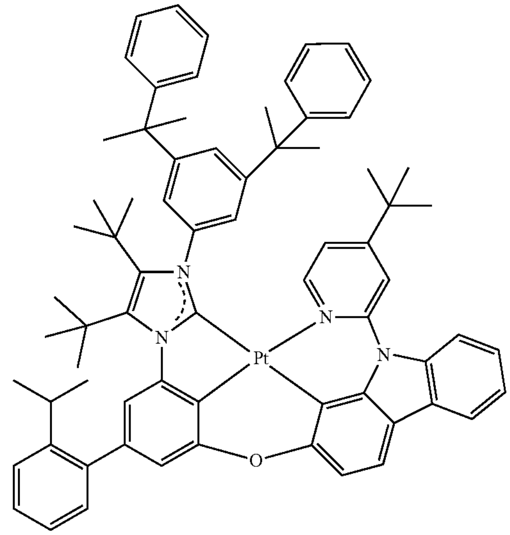
118
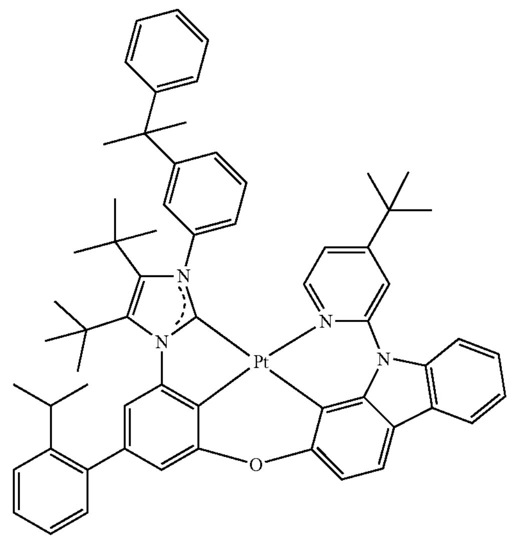
119
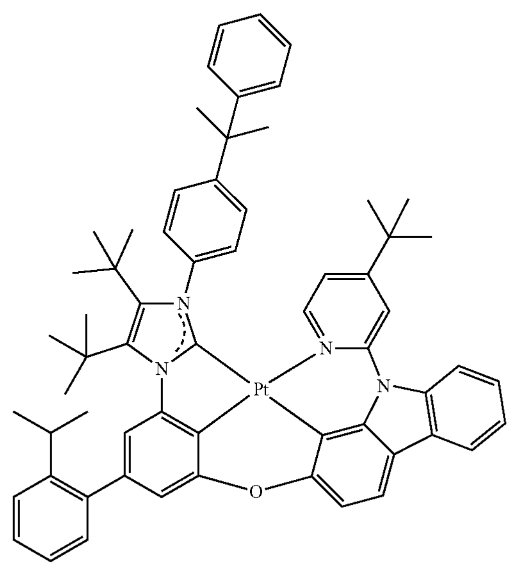

120
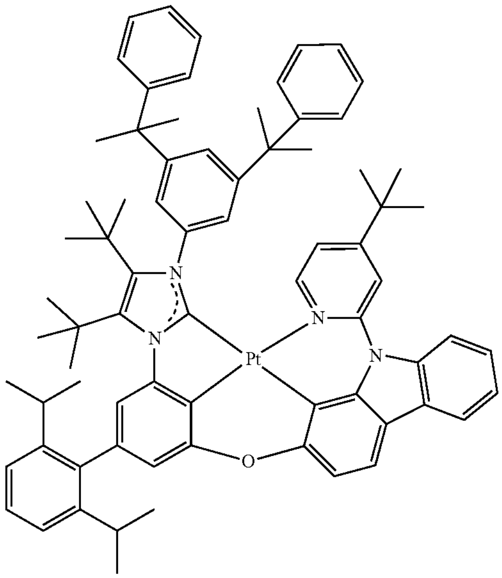
121
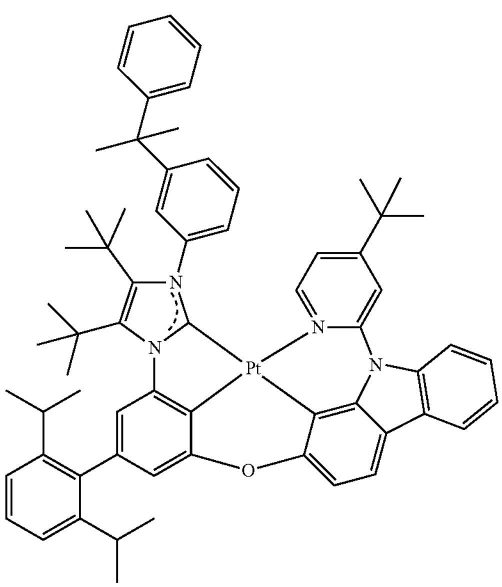
122
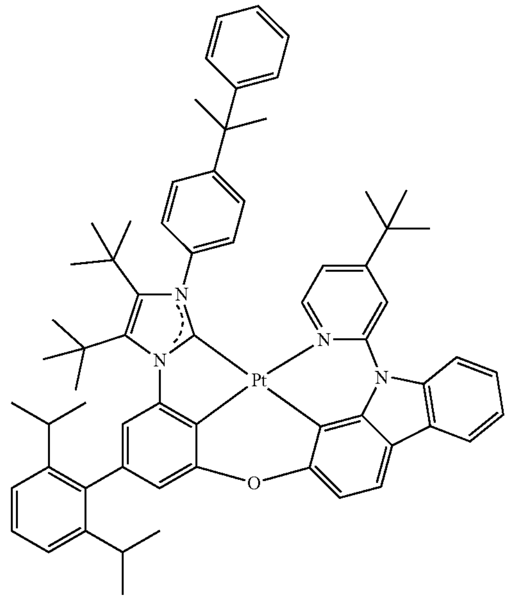
123
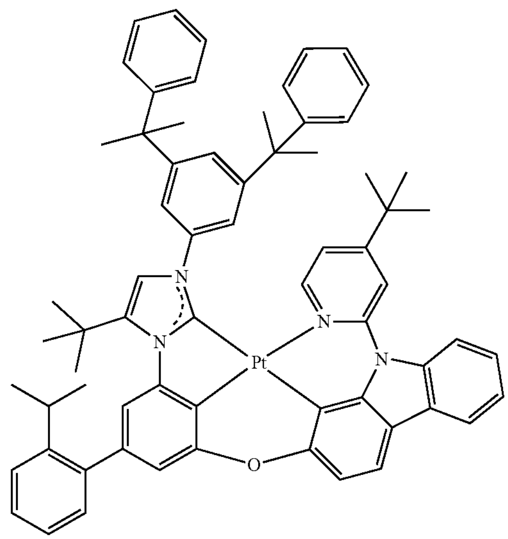
124
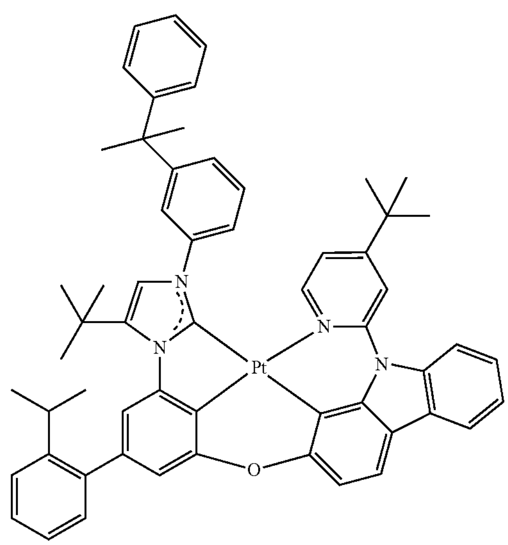

-continued
125
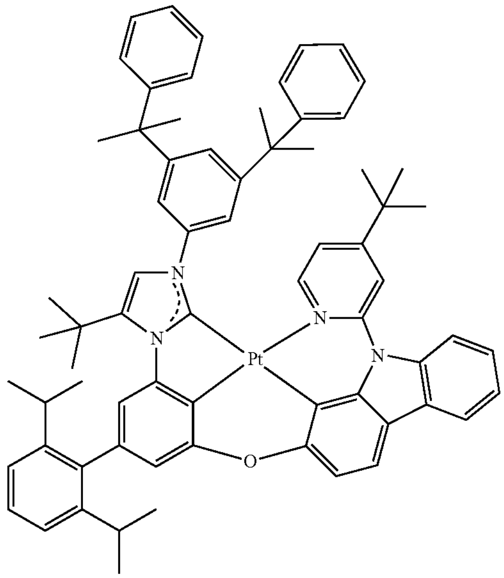
126
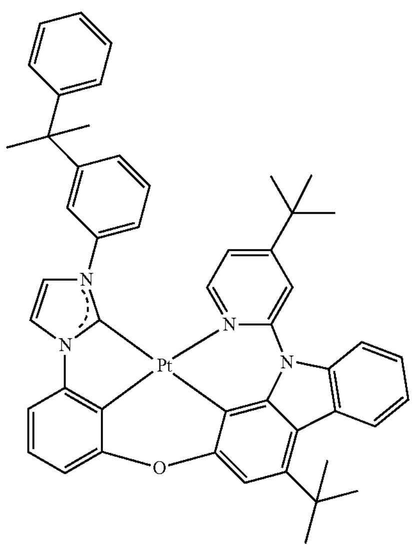
127
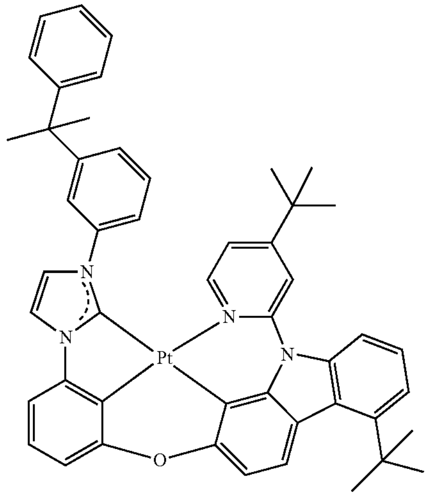
-continued
128
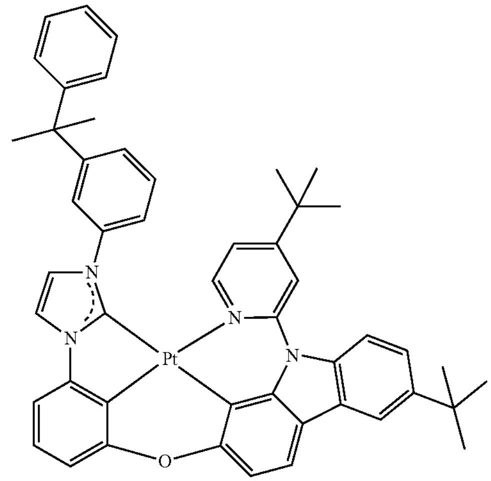
129
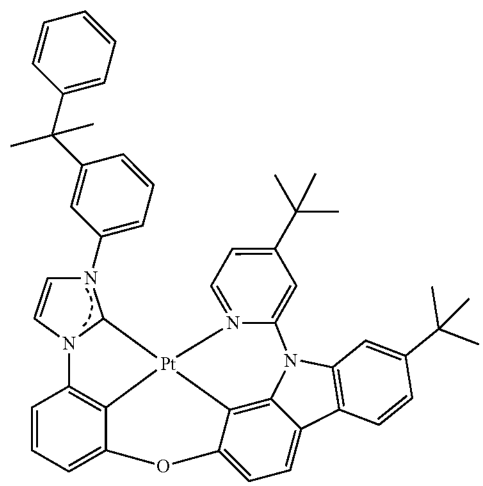
130
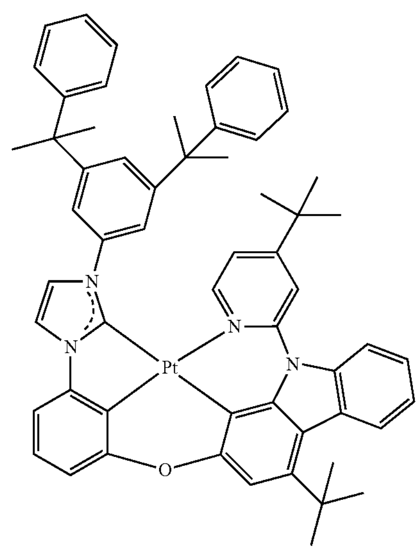

-continued
131
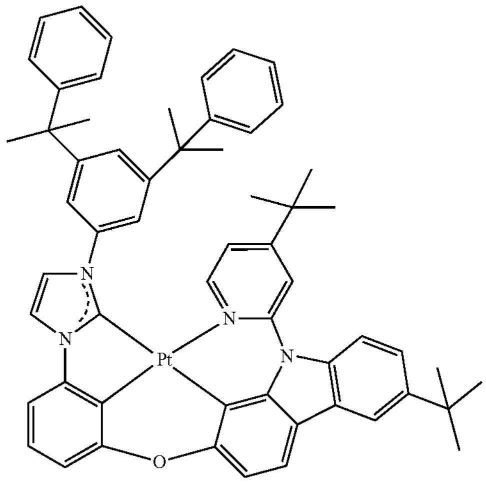
132
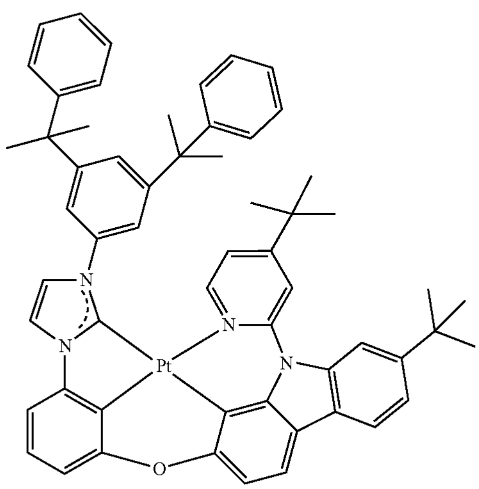
133
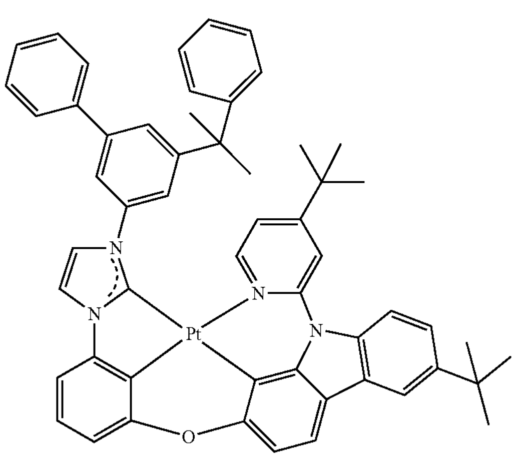
-continued
134
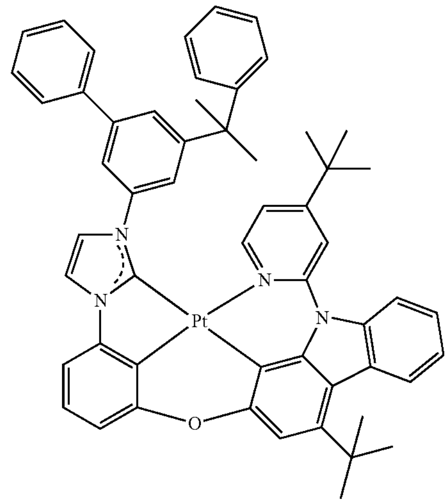
135
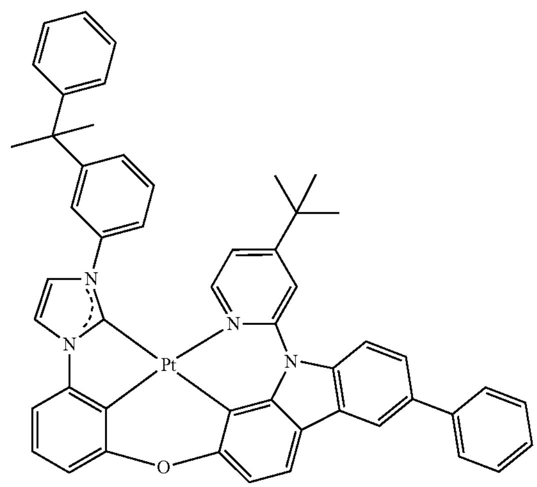
136
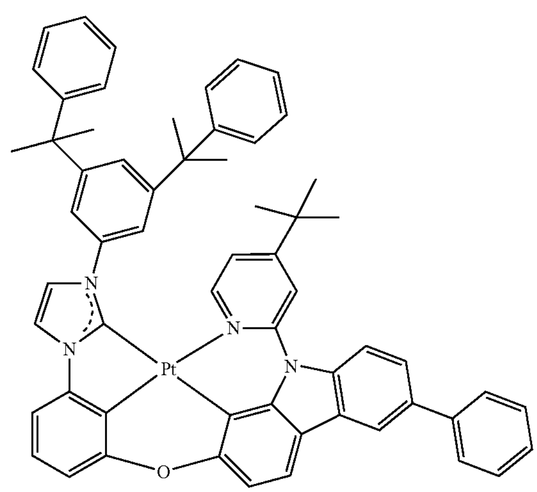

-continued
137
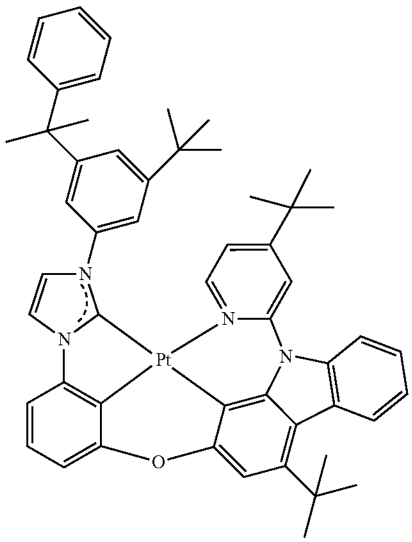
138
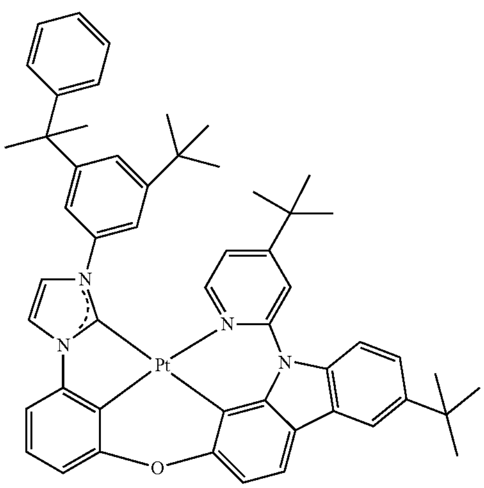
139
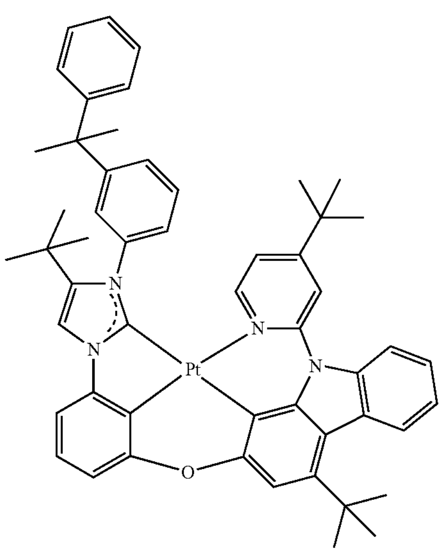
-continued
140
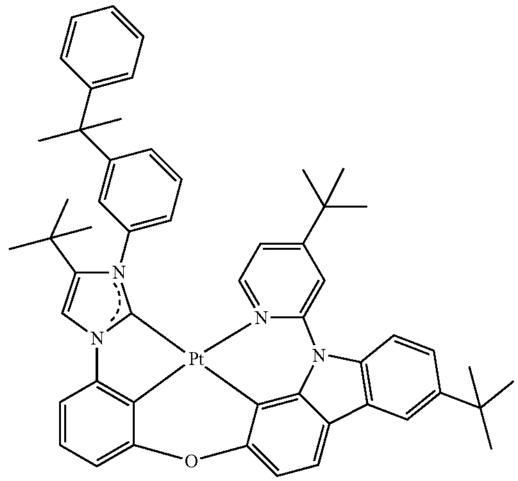
141
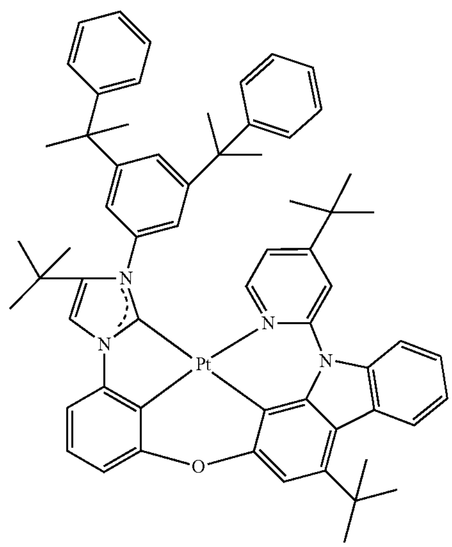
142
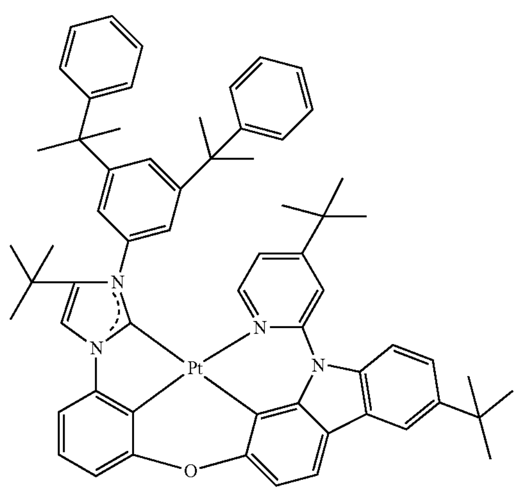

-continued
143
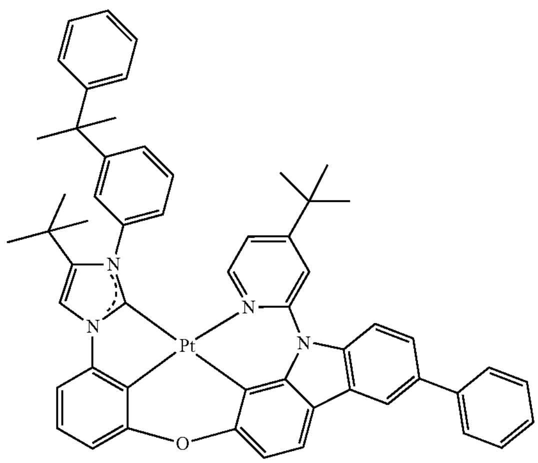
144
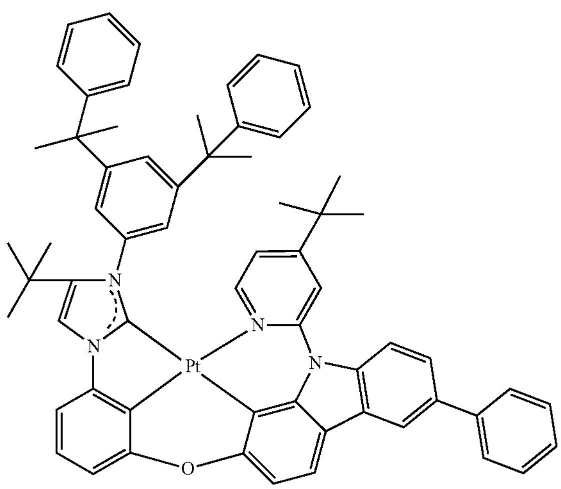
145
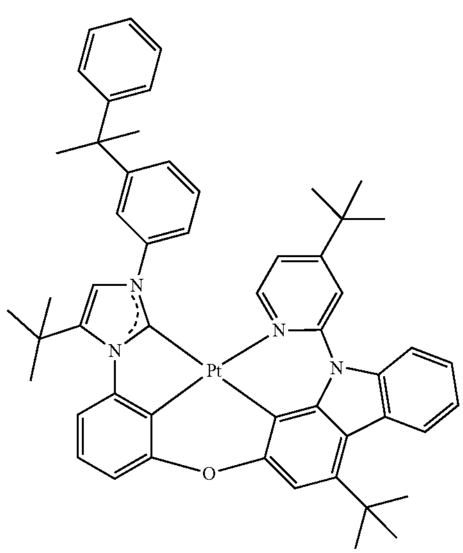
-continued
146
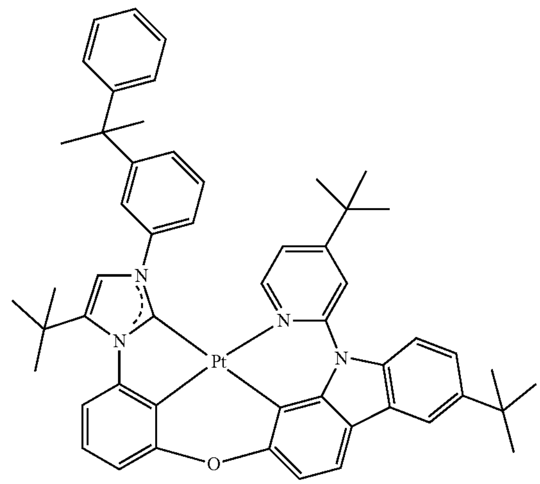
147
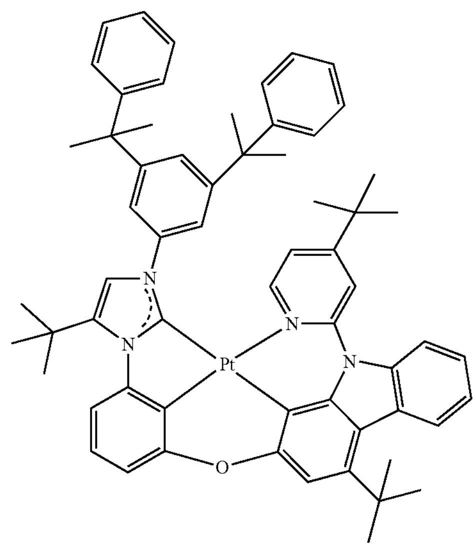
148
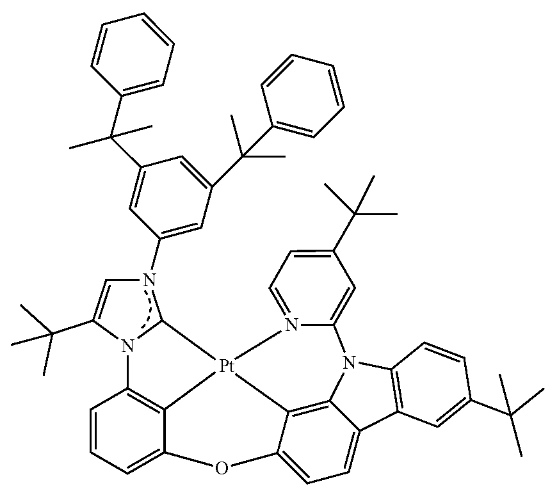

-continued
149
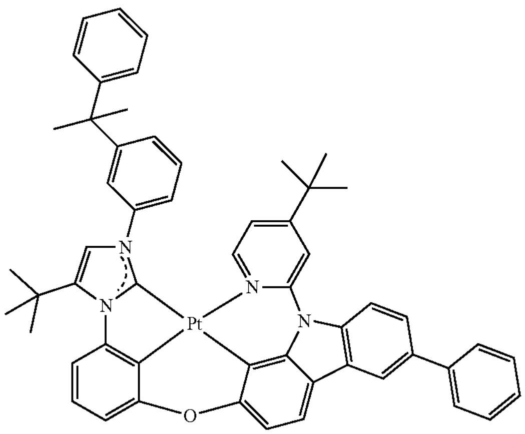
150
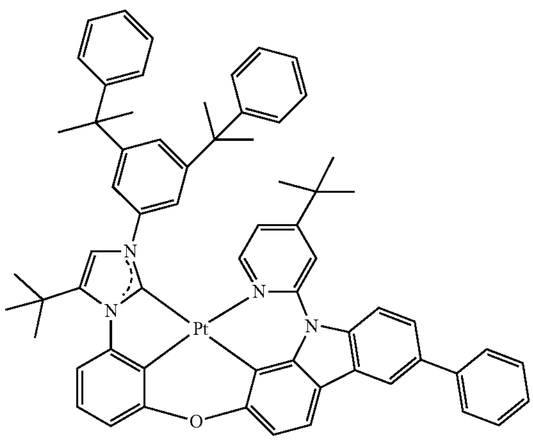
151
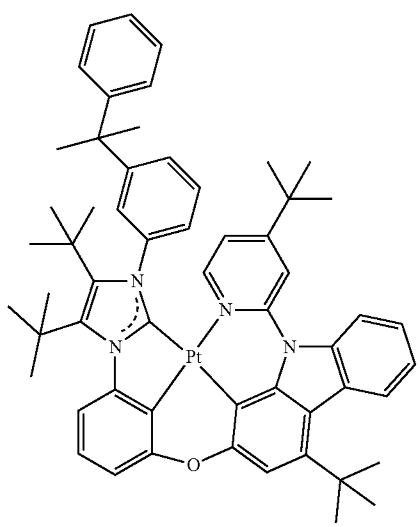
-continued
152
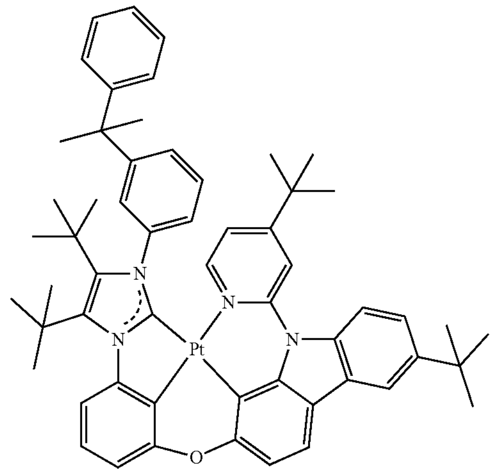
153
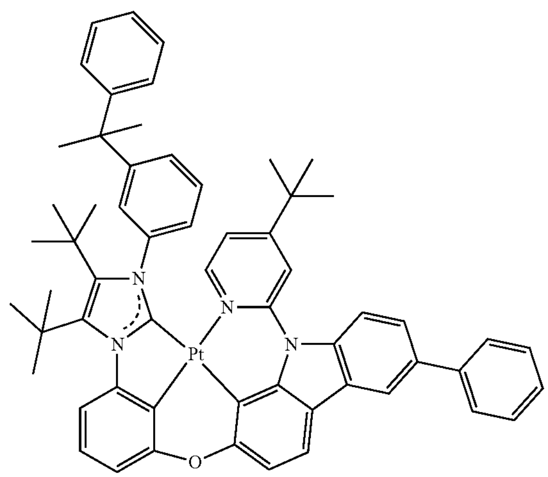
154
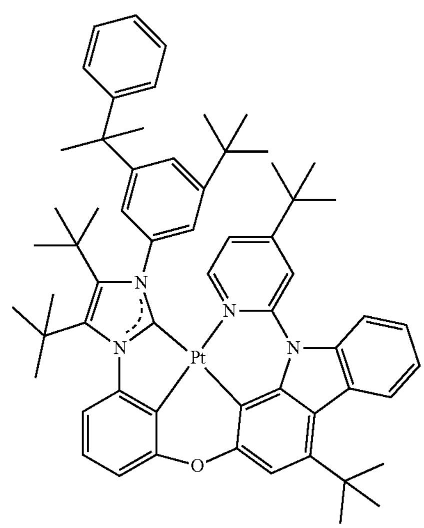

-continued
155
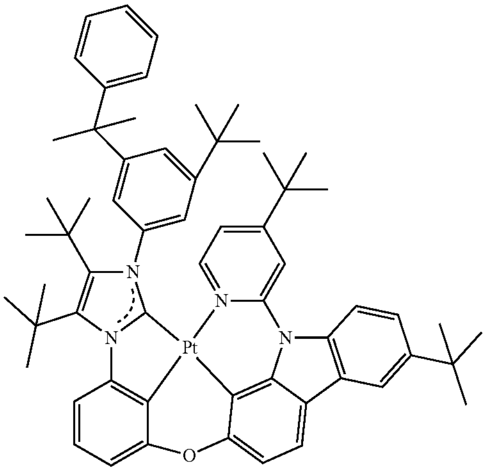
156
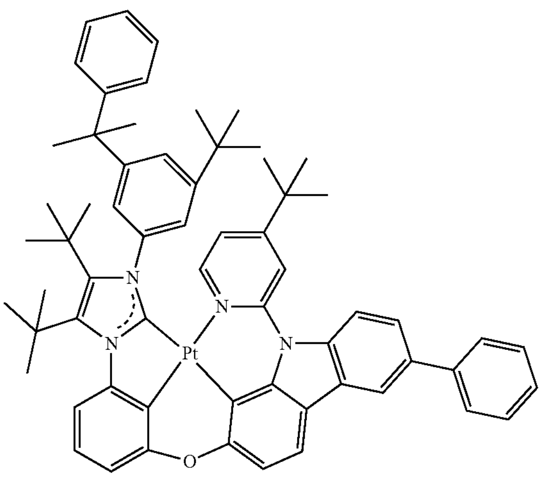
157
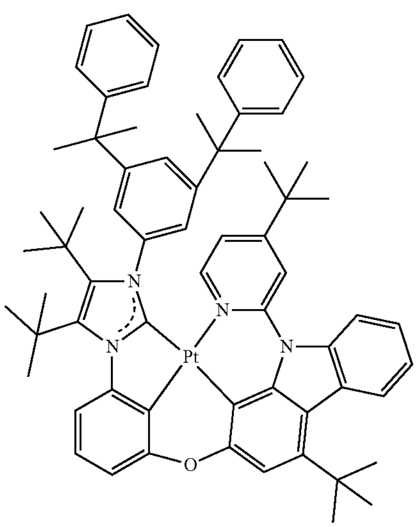
-continued
158
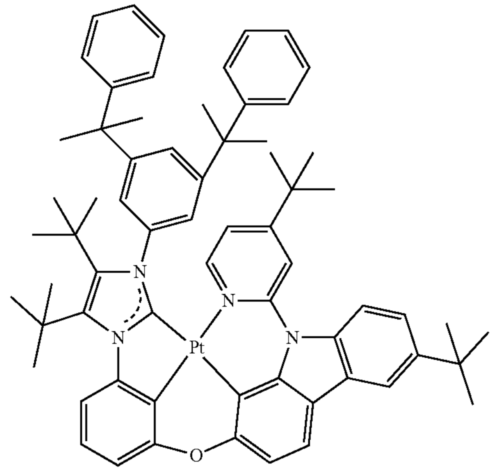
159
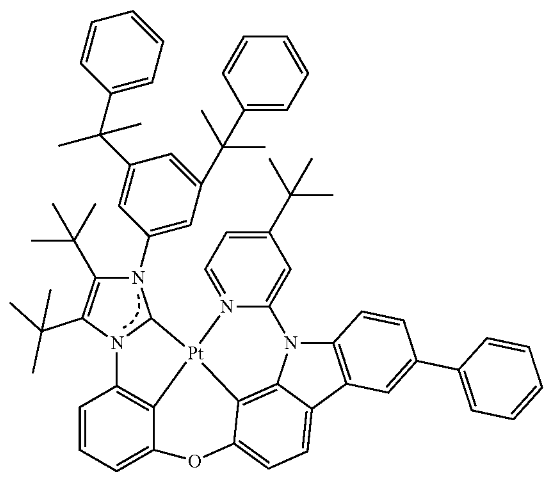
160
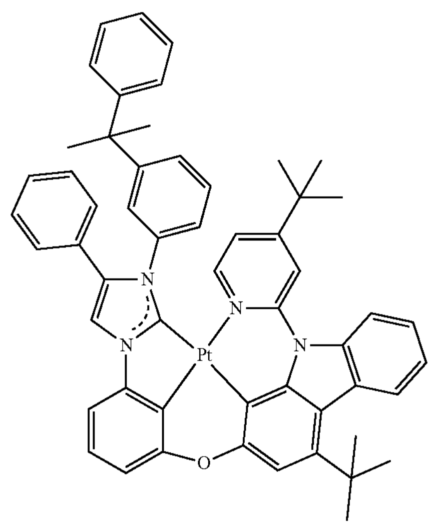

-continued
161
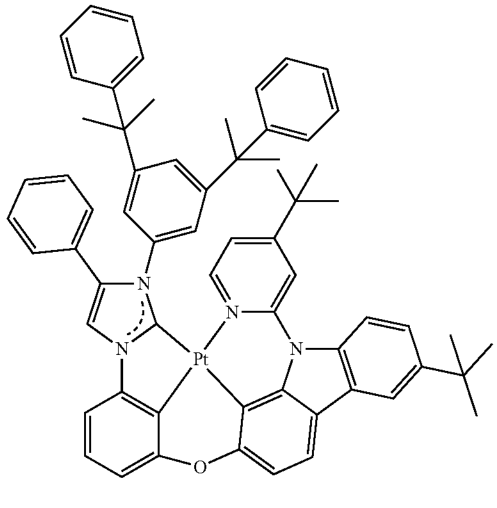
162
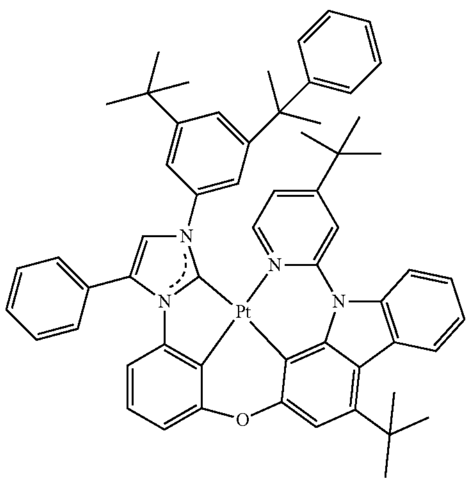
163
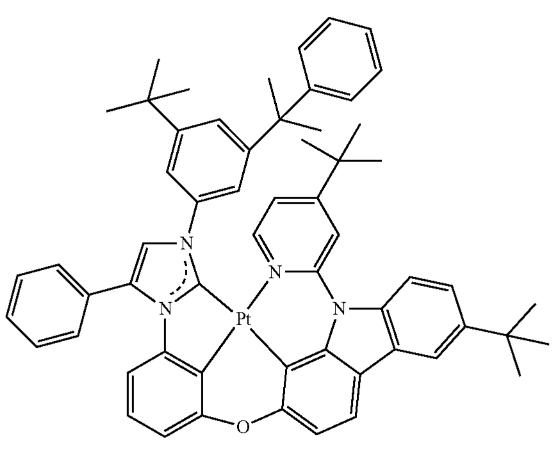
-continued
164
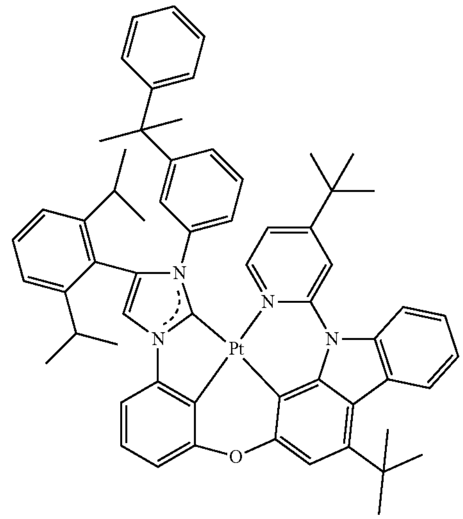
165
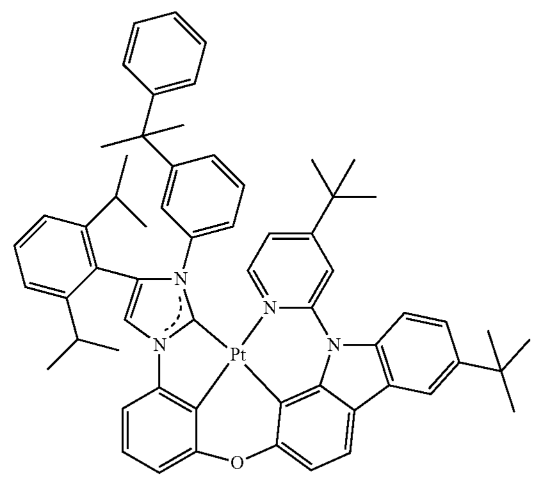
166
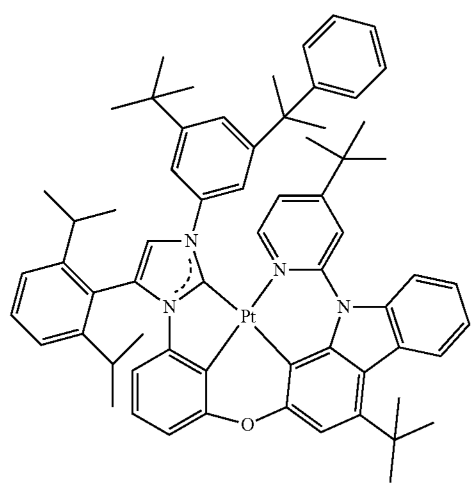

-continued
167
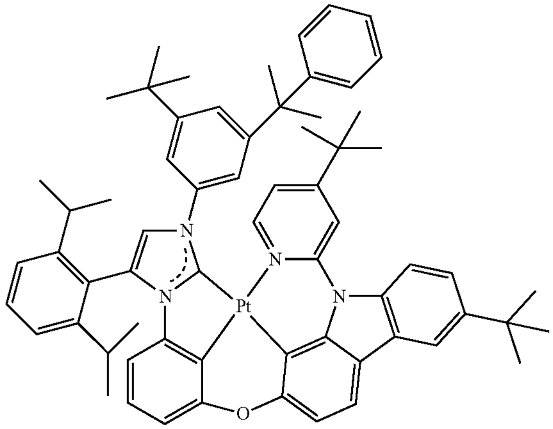
168
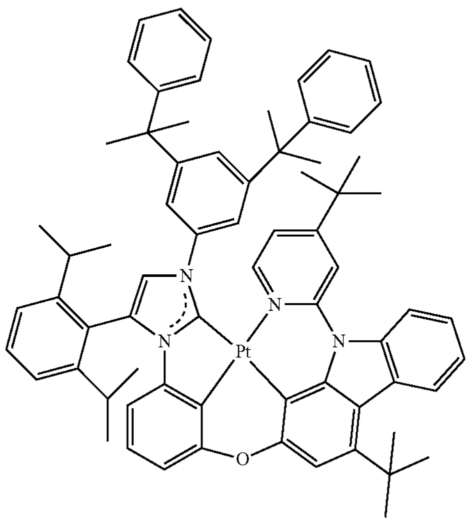
169
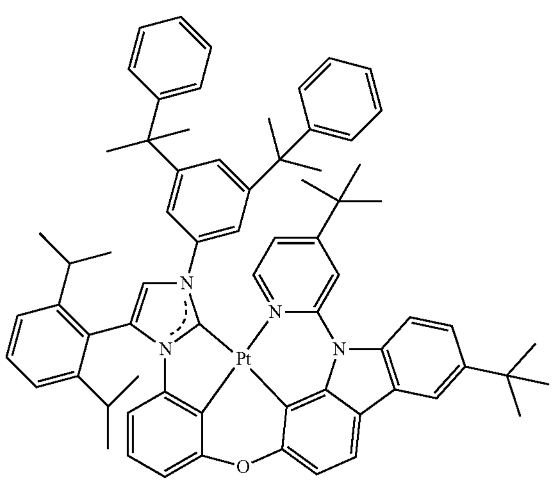
-continued
170
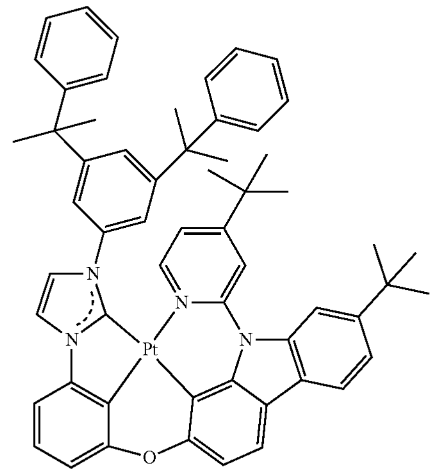
171
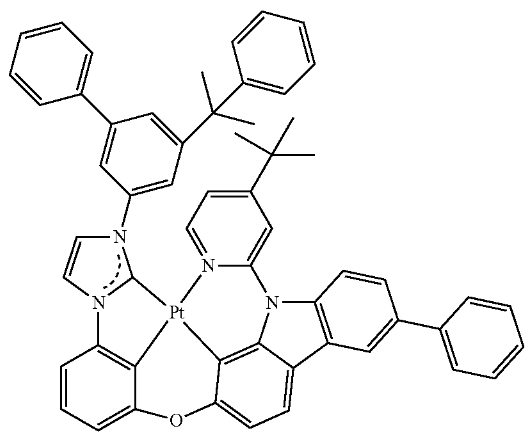
172
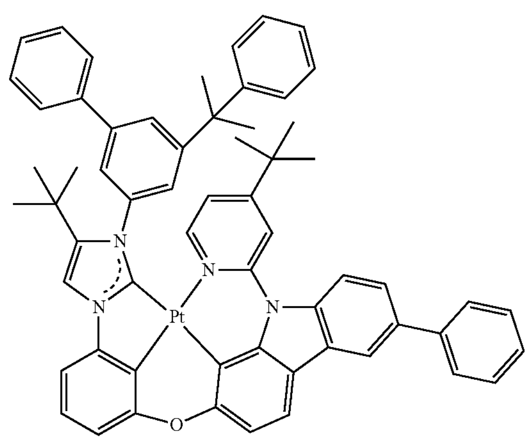

-continued
173
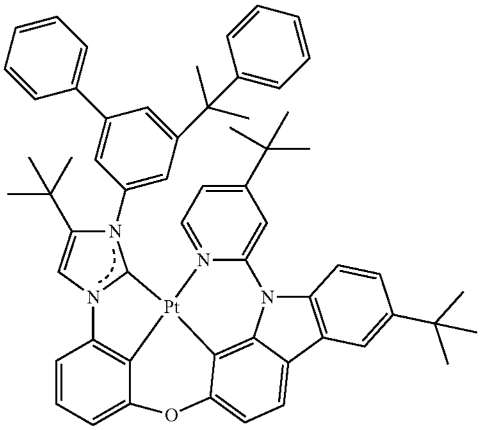
174
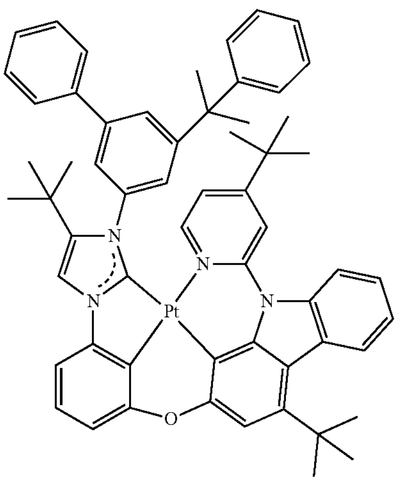
175
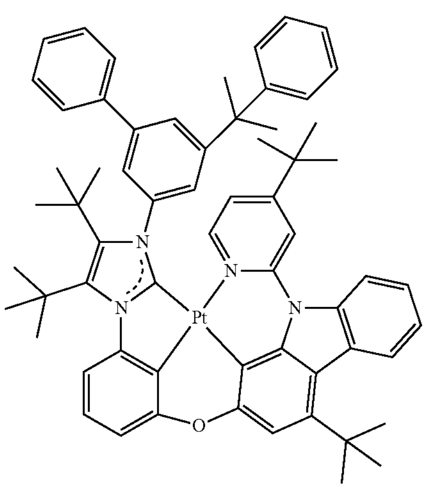
-continued
176
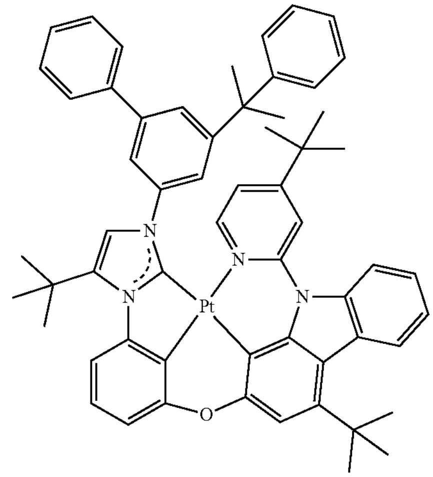
177
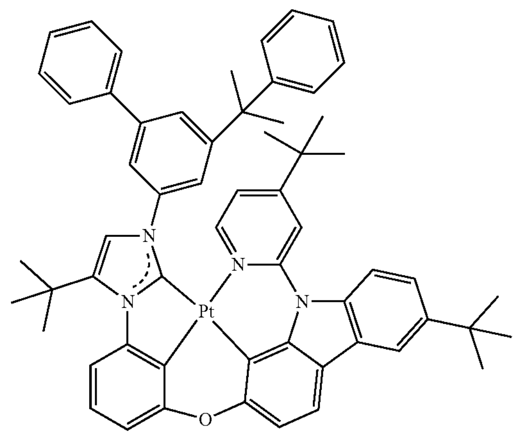
178
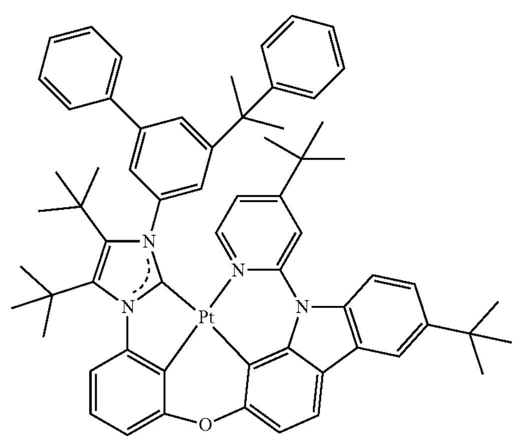

-continued
179
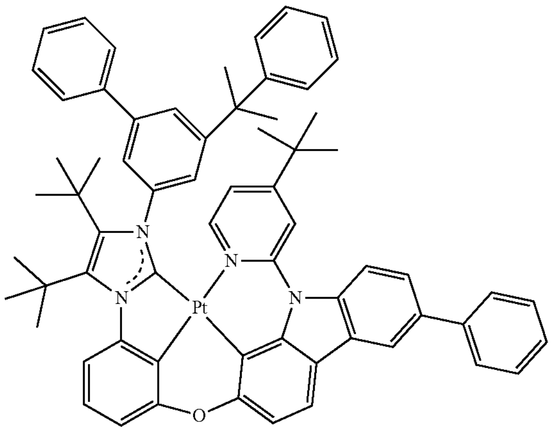
180
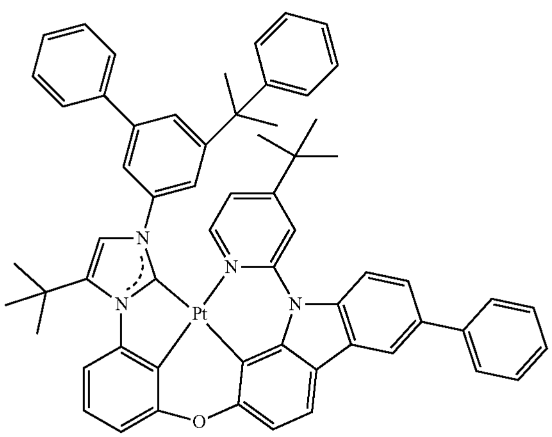
181
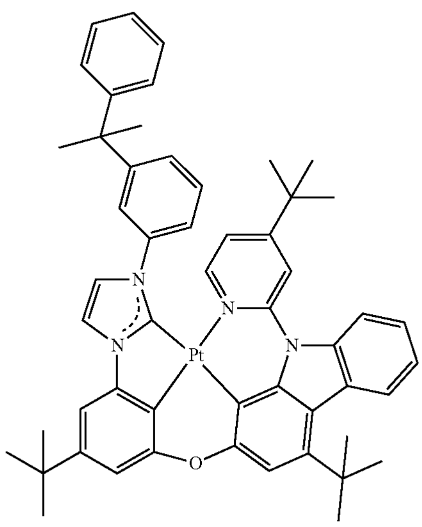
182
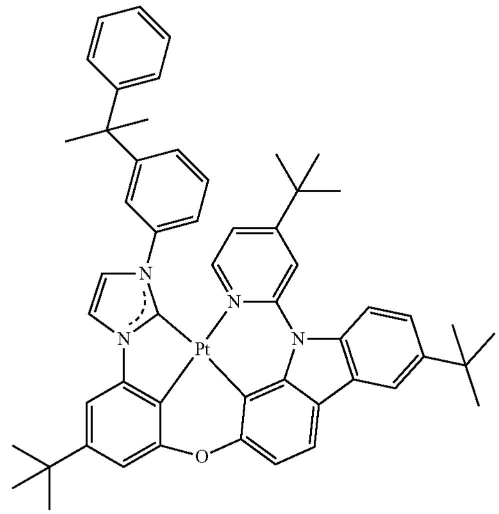
183
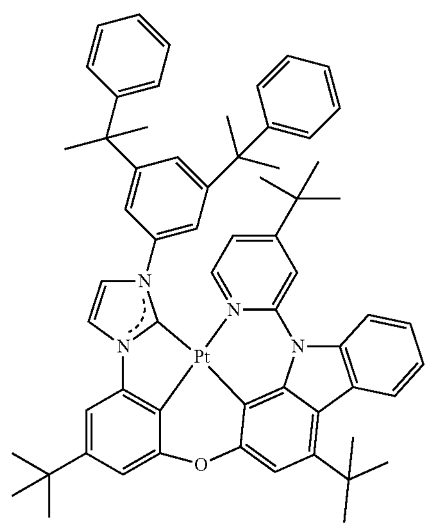
184
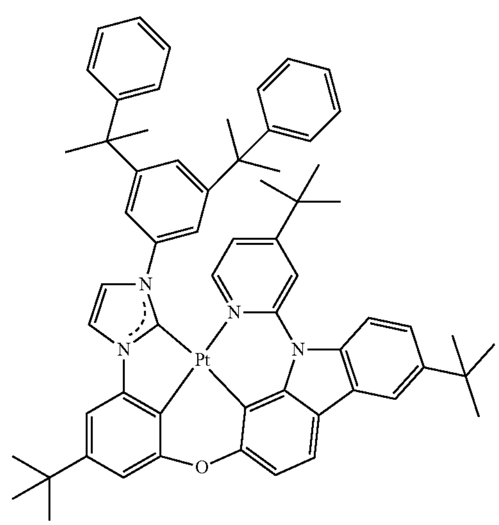

185
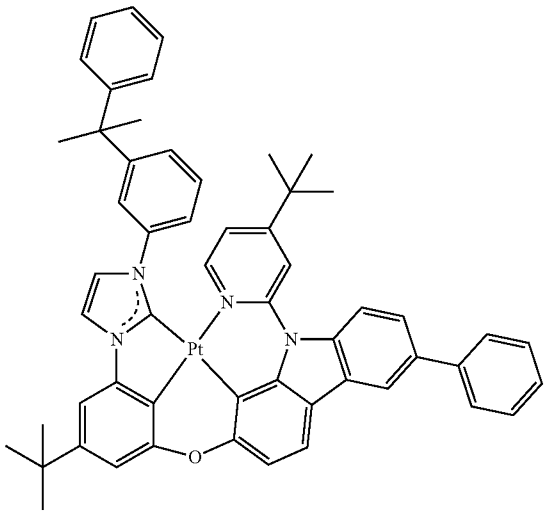
186
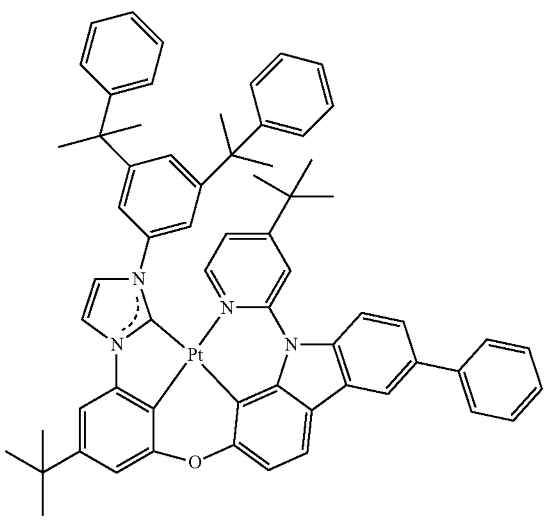
187
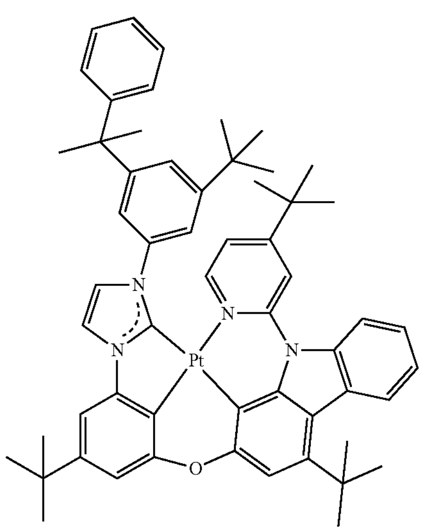
188
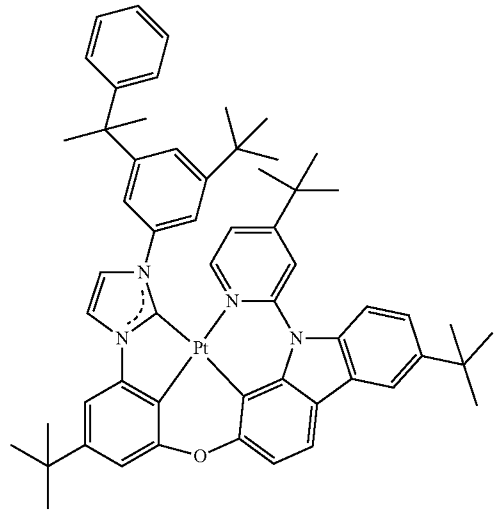
189
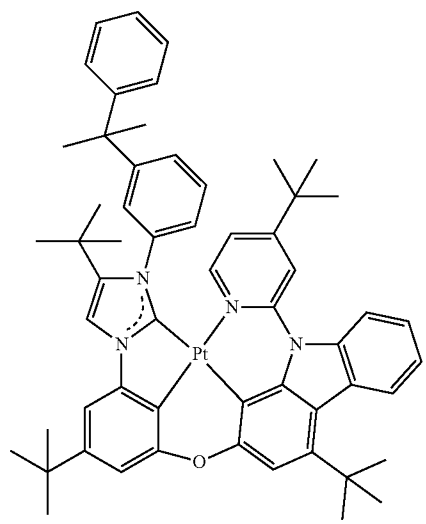
190
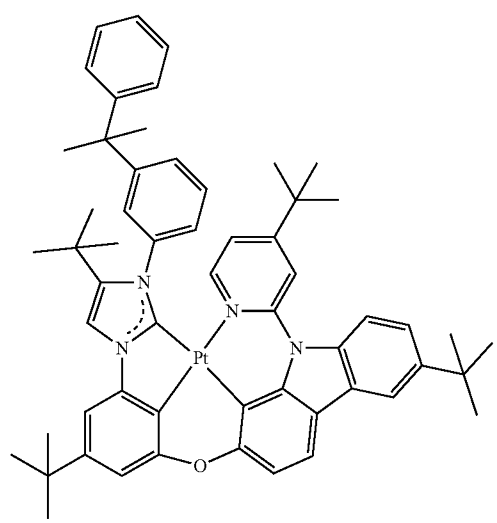

-continued
191
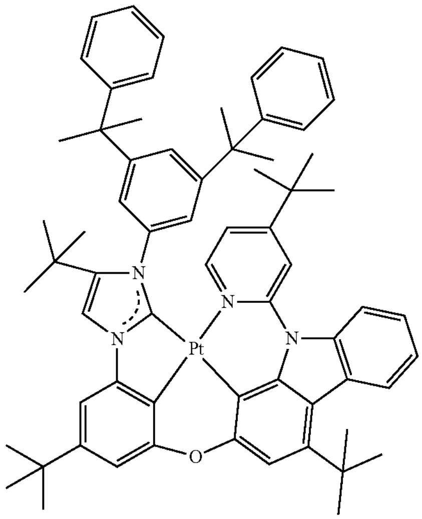
192
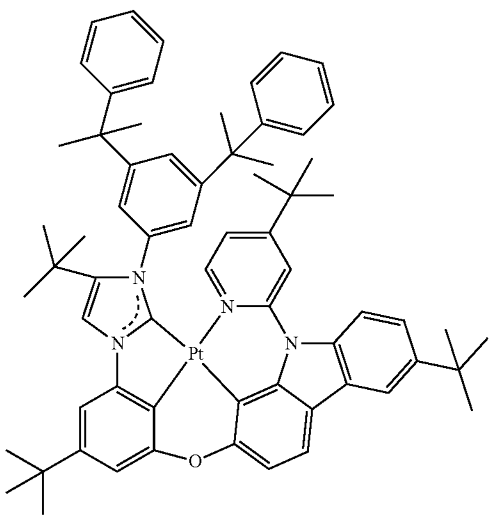
193
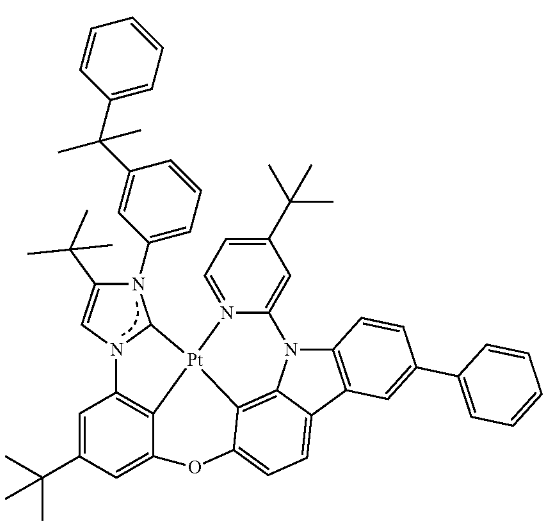
194
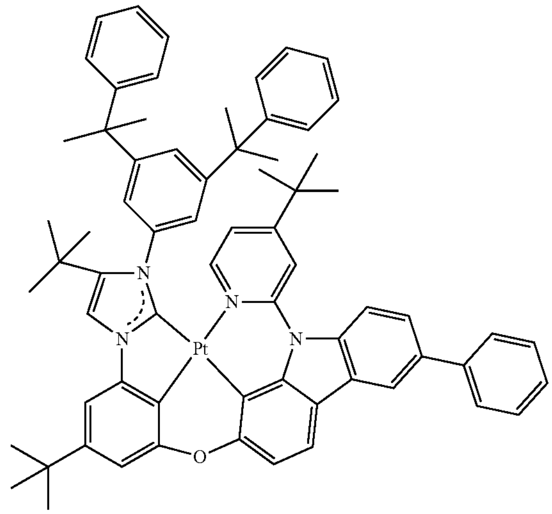
195
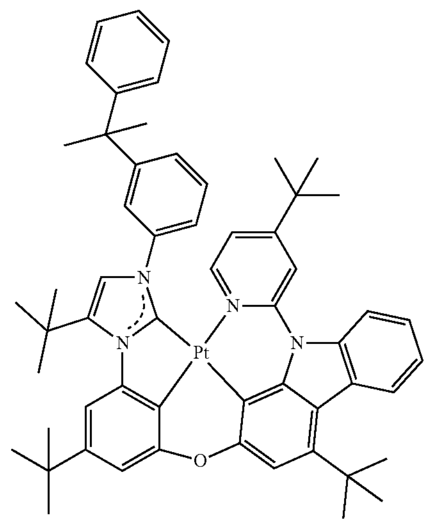
196
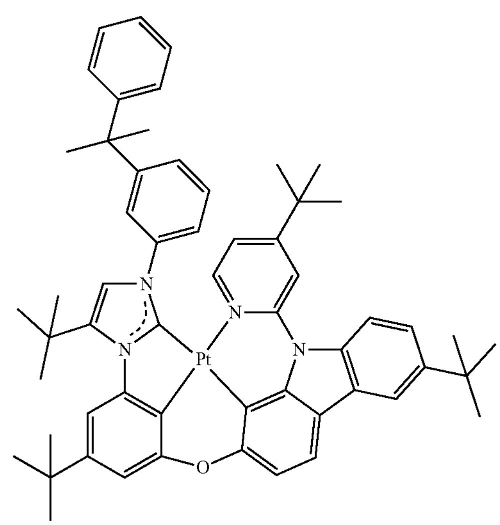

-continued
197
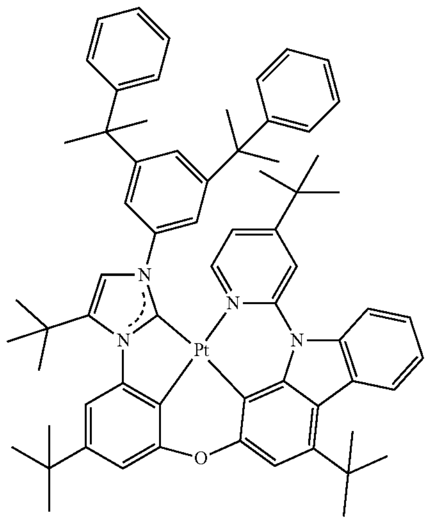
198
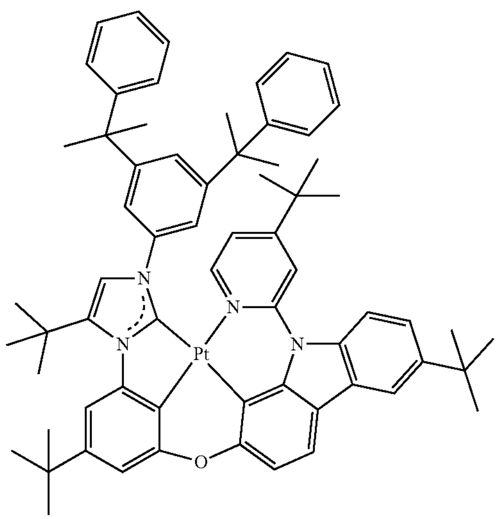
199
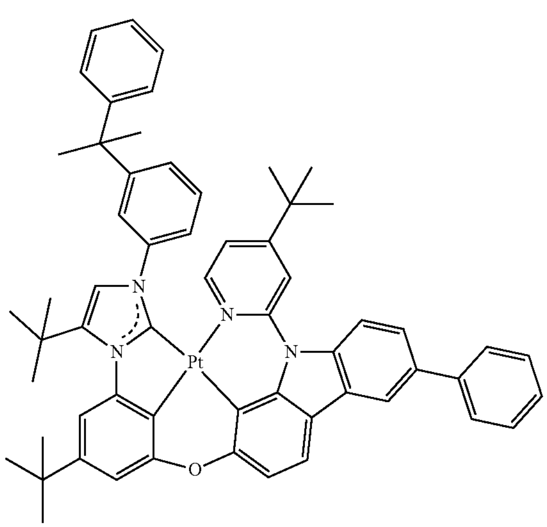
-continued
200
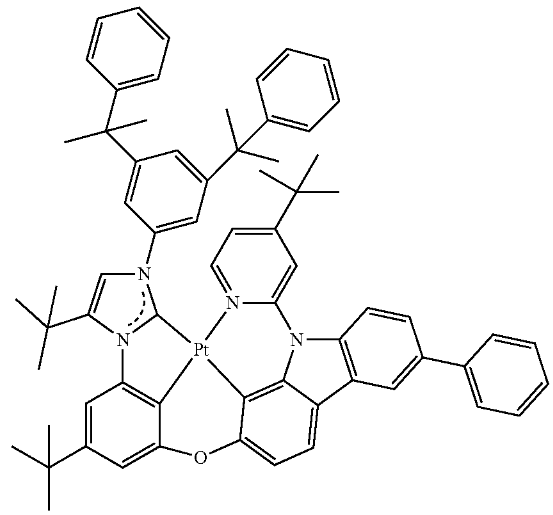
201
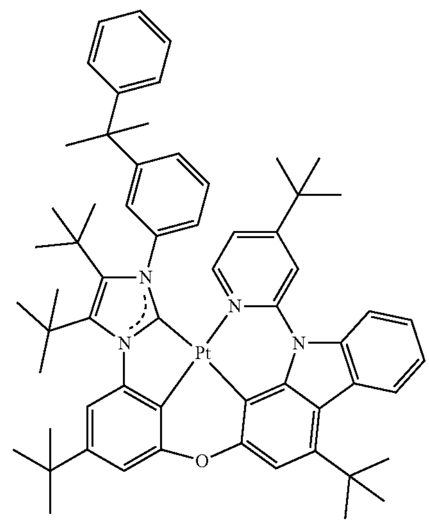
202
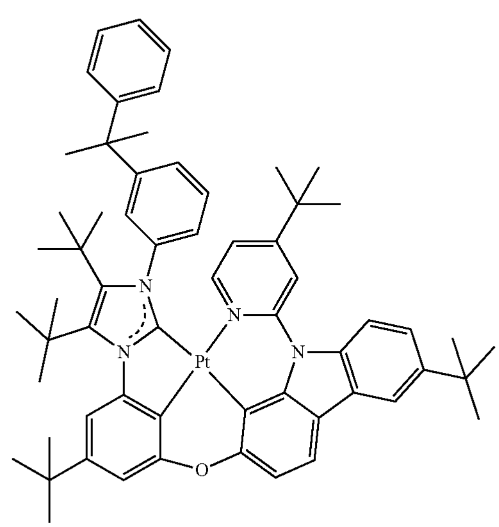

-continued
203
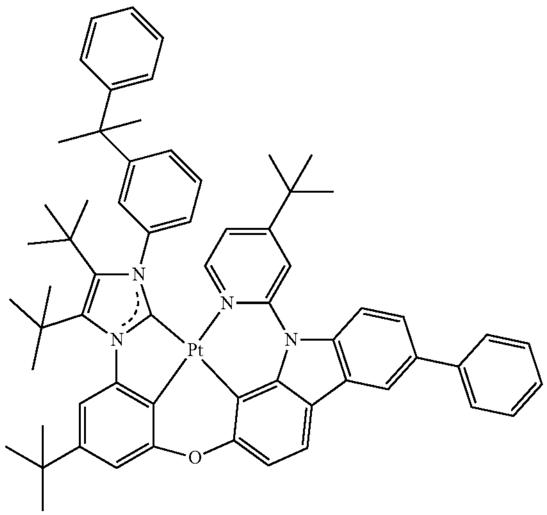
204
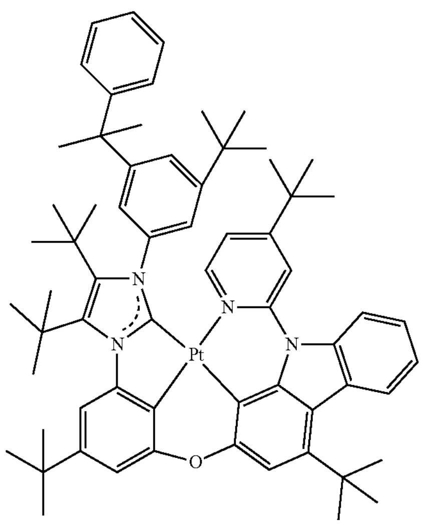
205
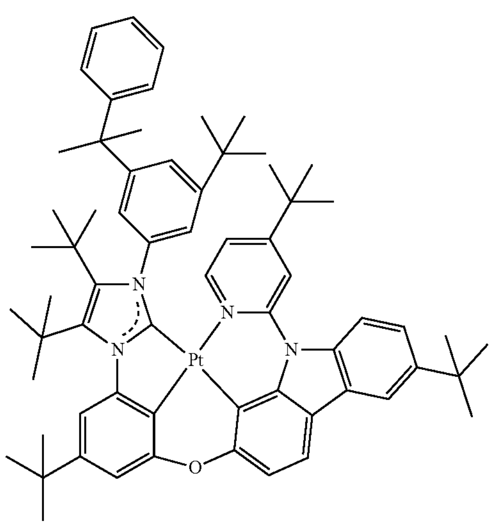
-continued
206
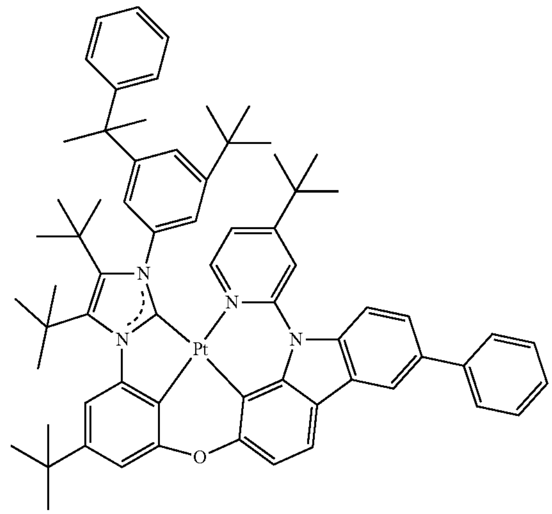
207
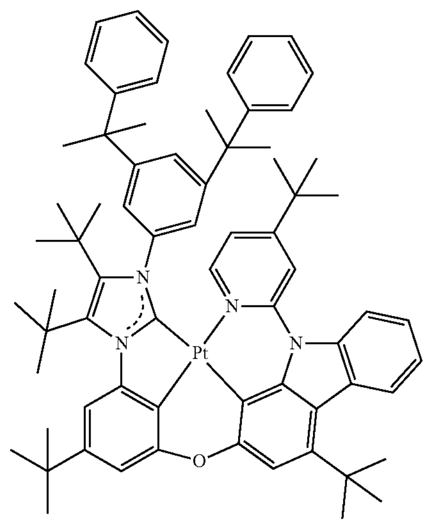
208
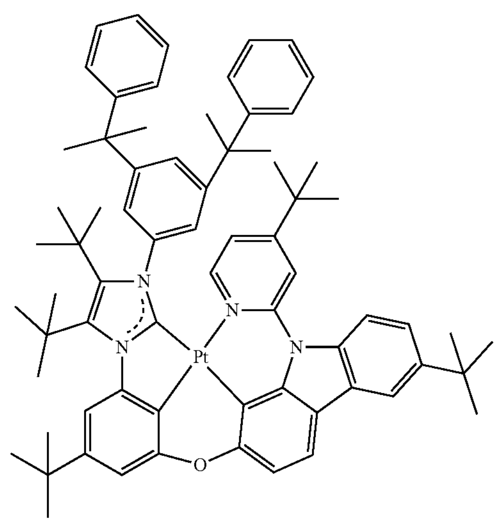

209
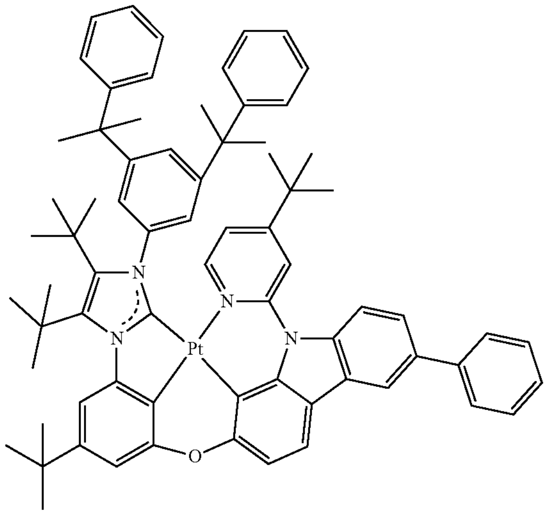
210
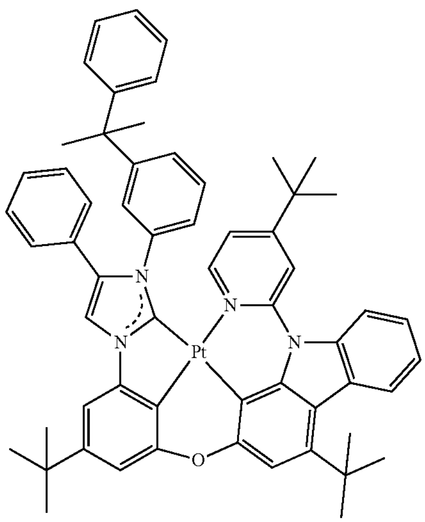
211
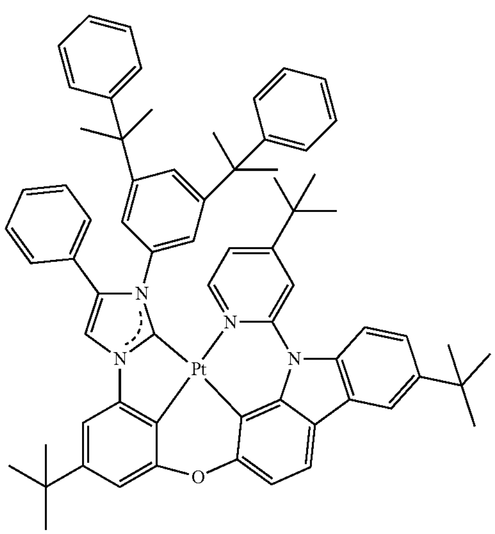
212
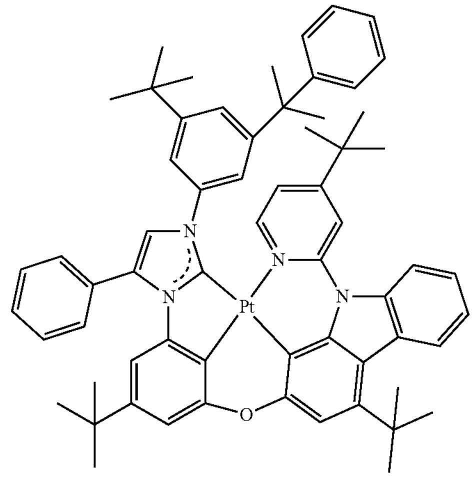
213
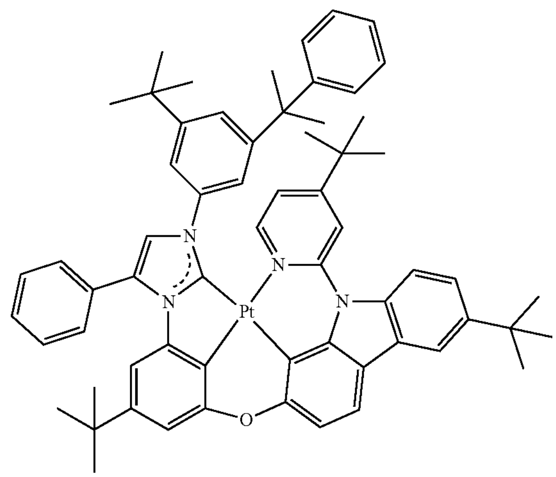
214
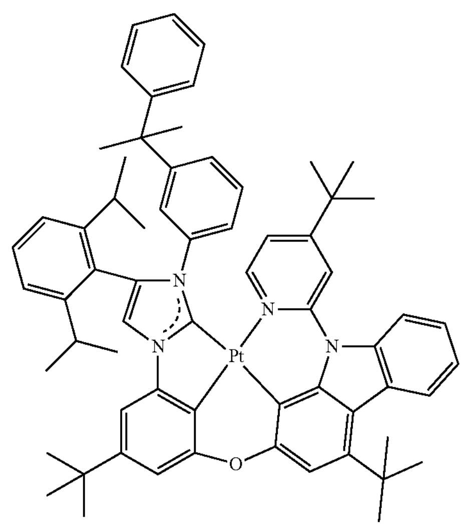

-continued
215
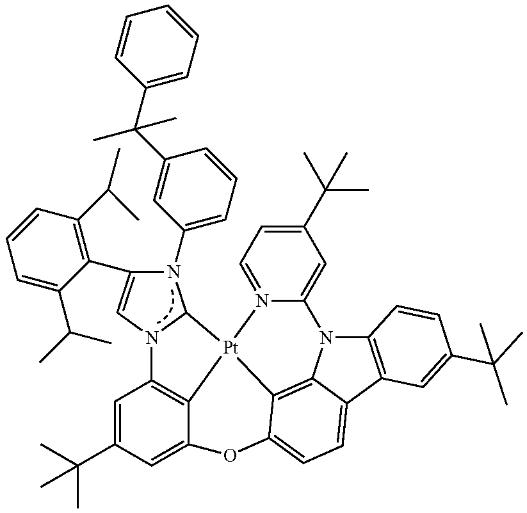
216
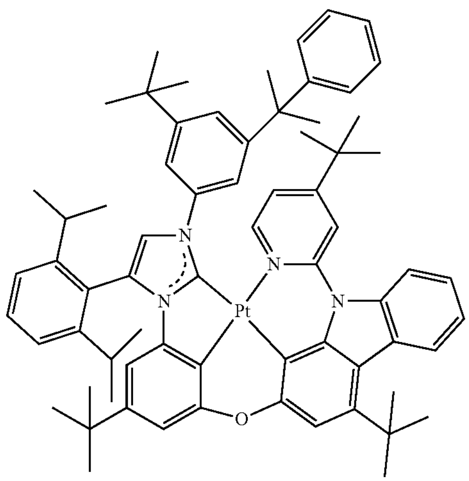
217
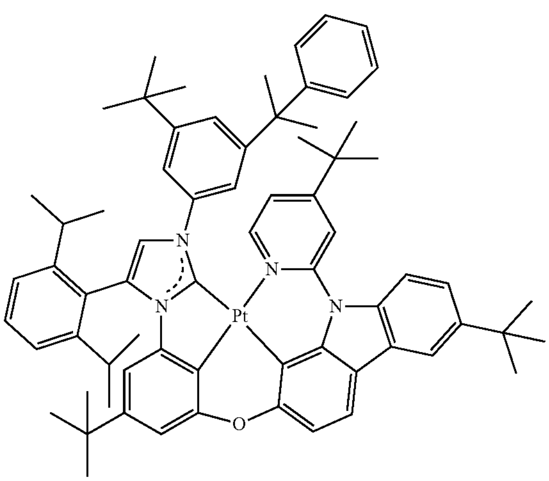
-continued
218
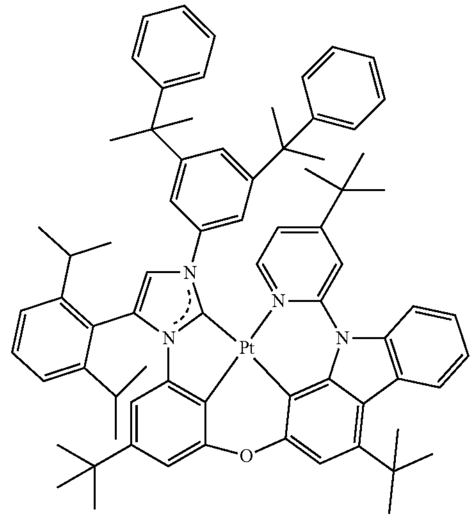
219
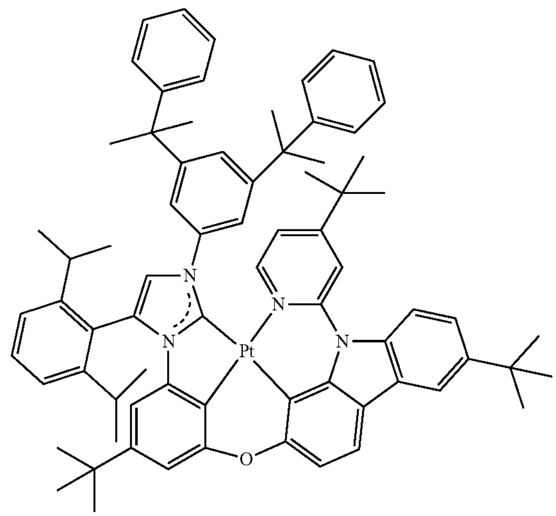
220
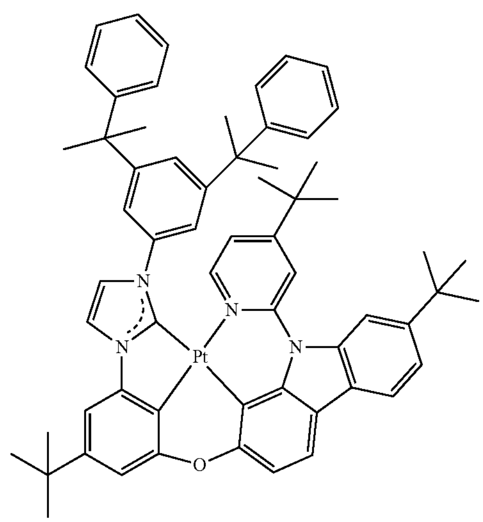

-continued
221
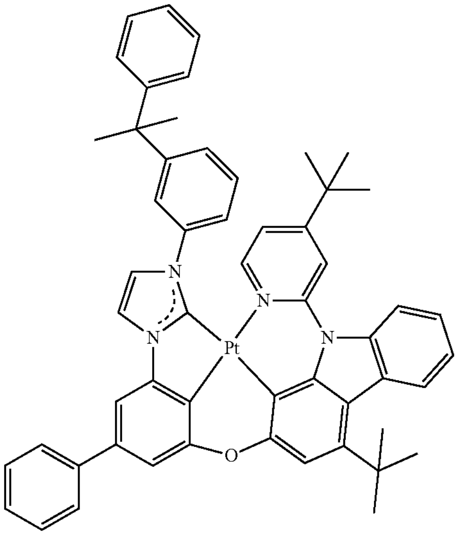
222
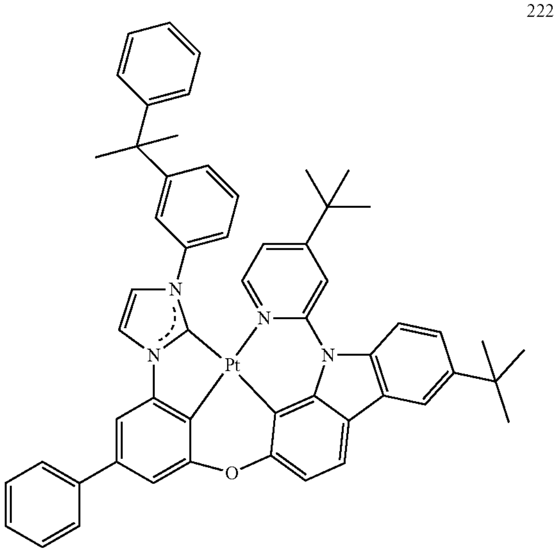
223
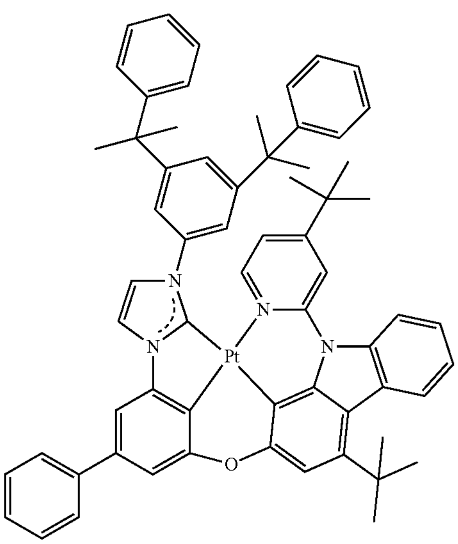
-continued
224
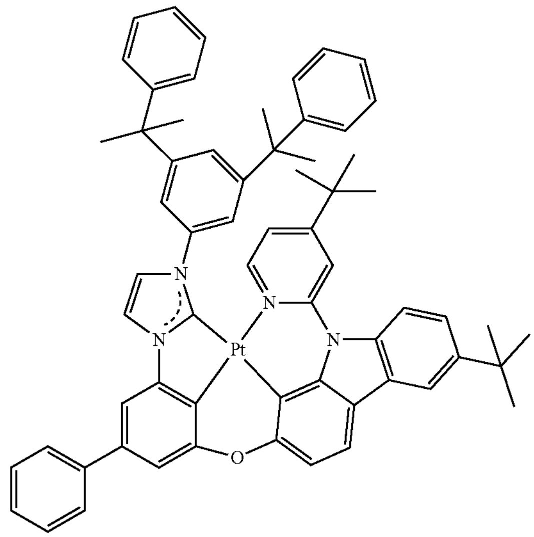
225
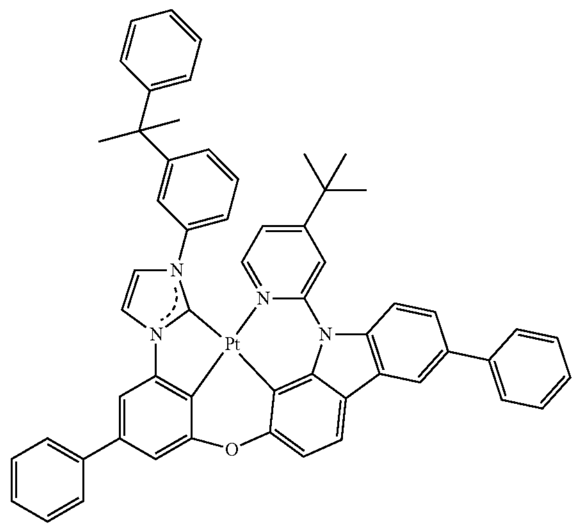
226
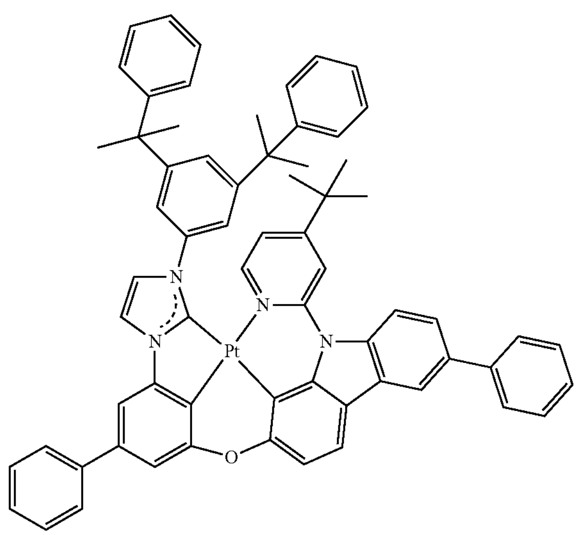

-continued
227
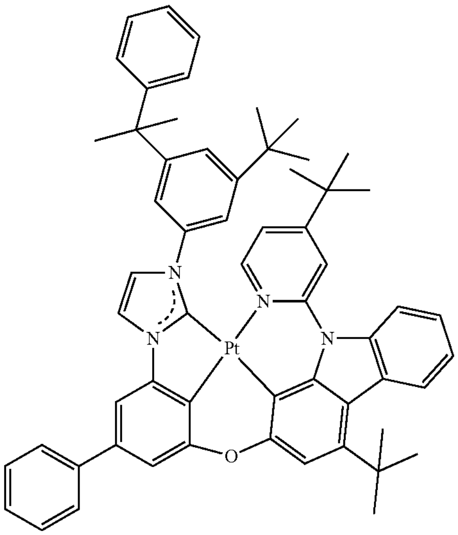
228
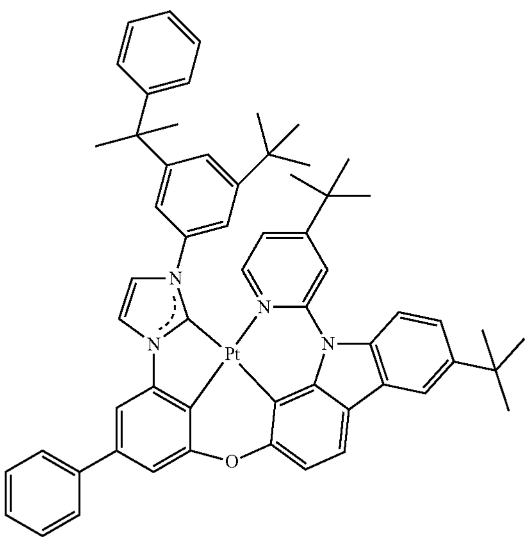
229
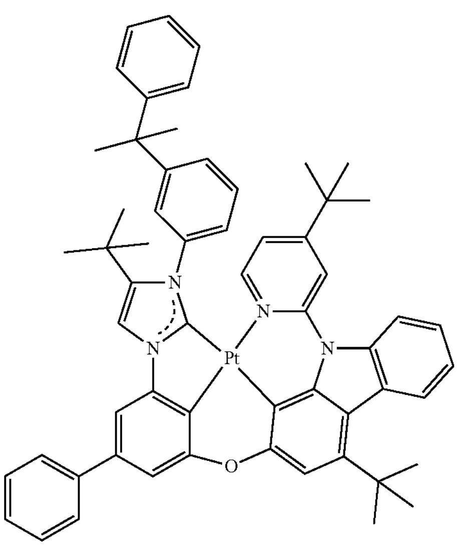
230
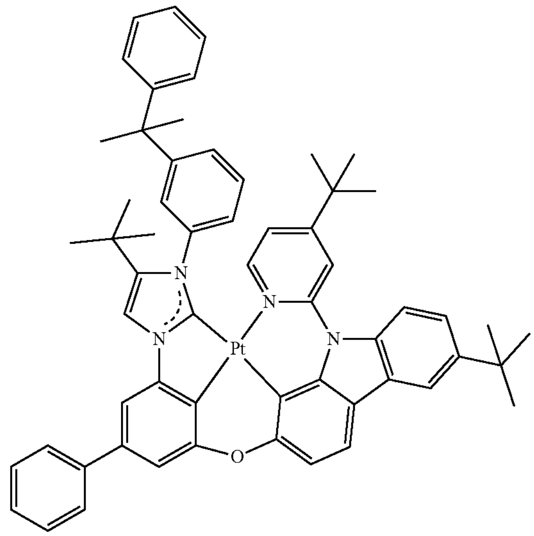
231
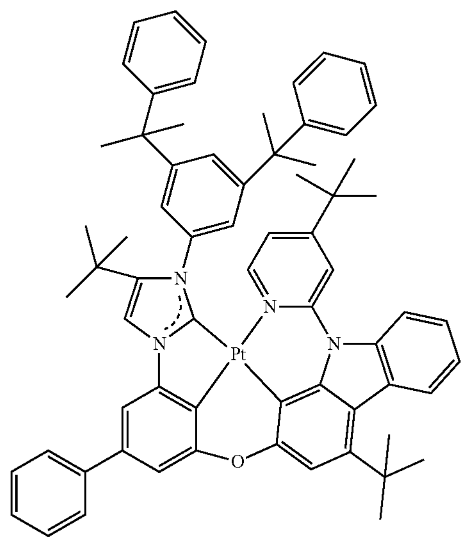
232
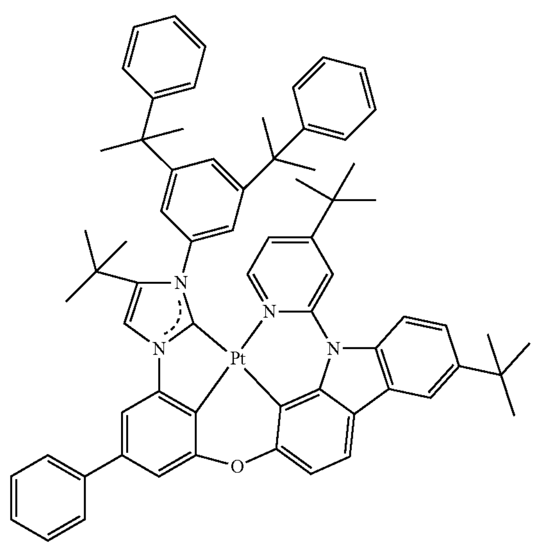

-continued
233
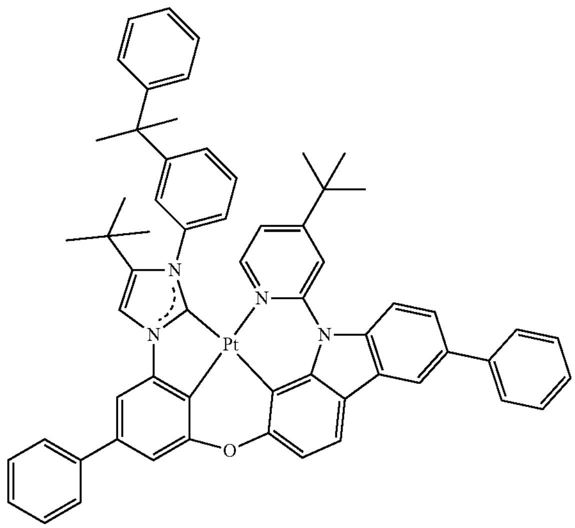
234
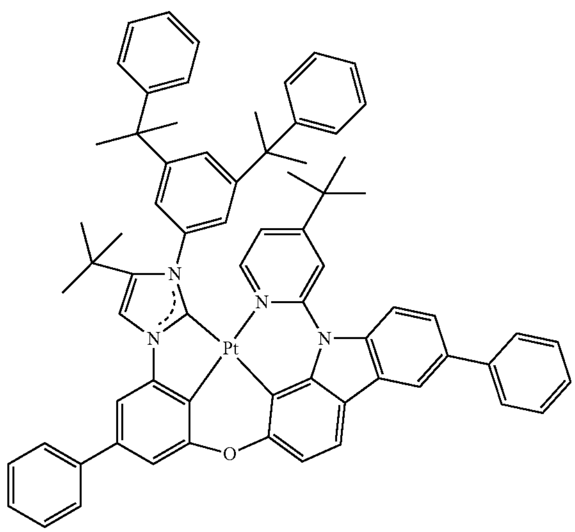
235
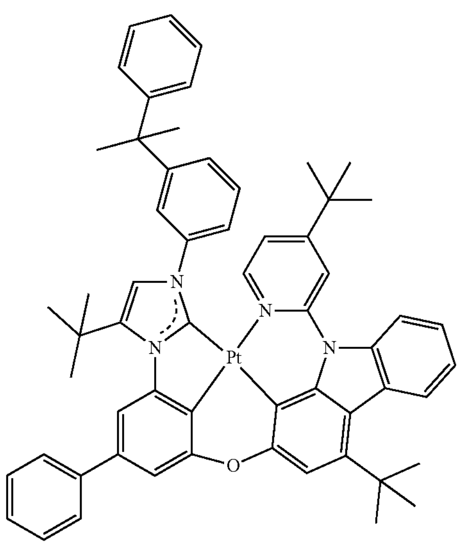
-continued
236
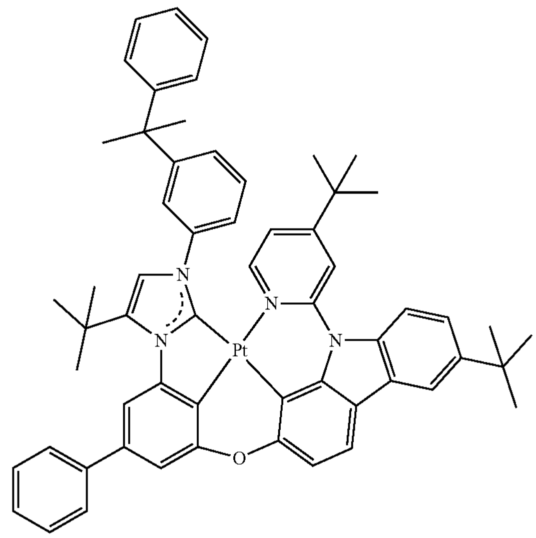
237
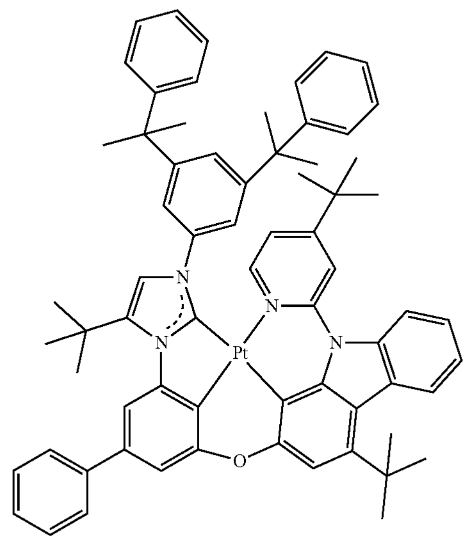
238
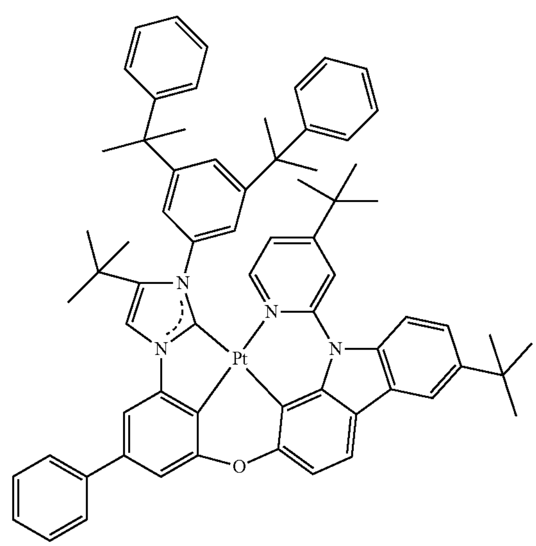

239
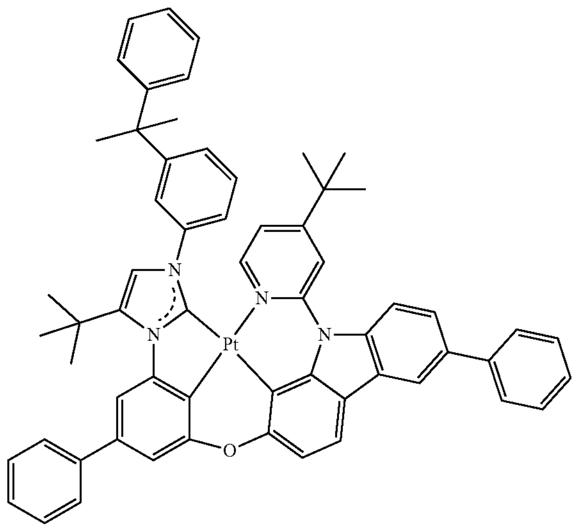
240
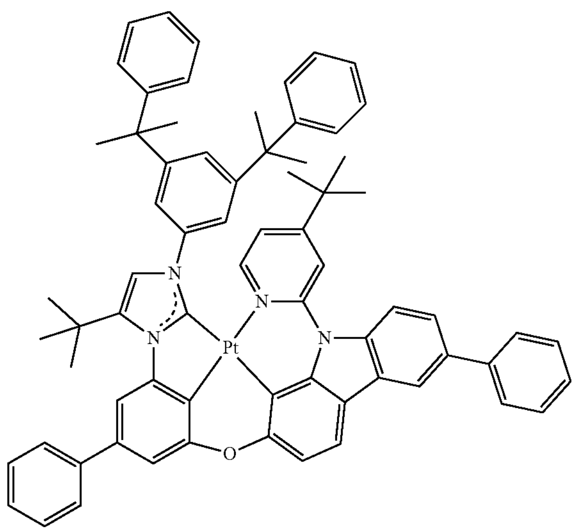
241
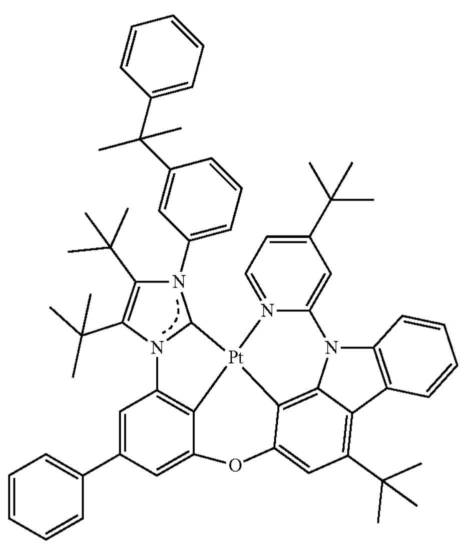
242
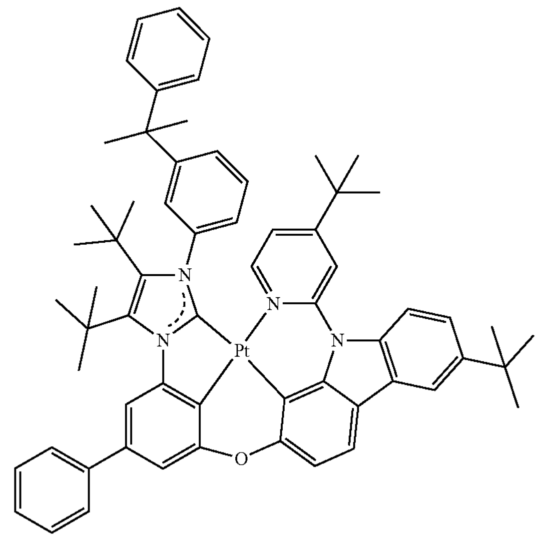
243
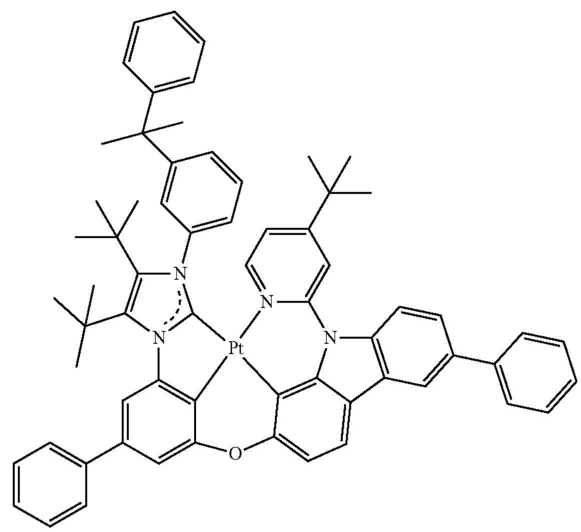
244
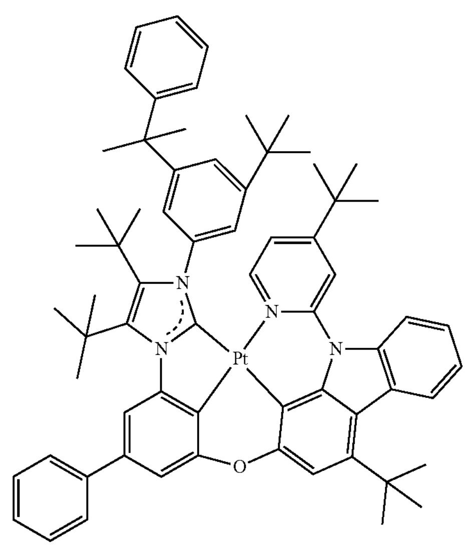

-continued
245
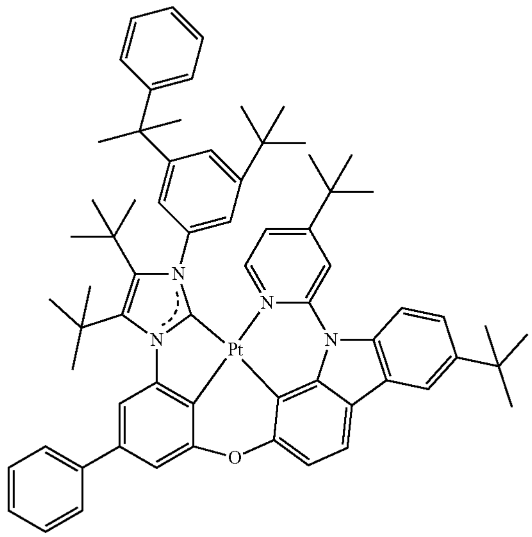
246
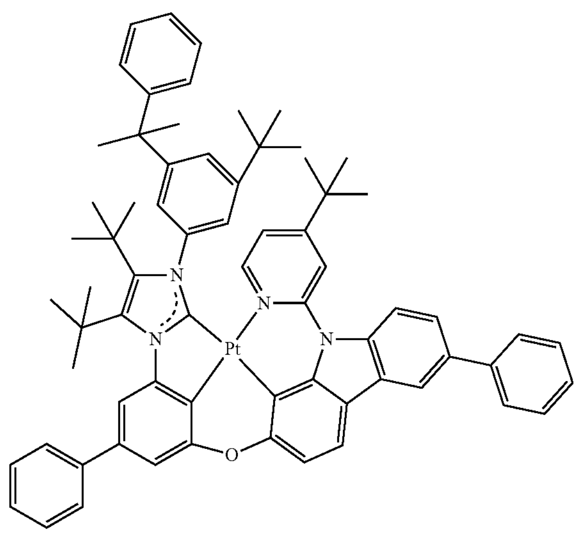
247
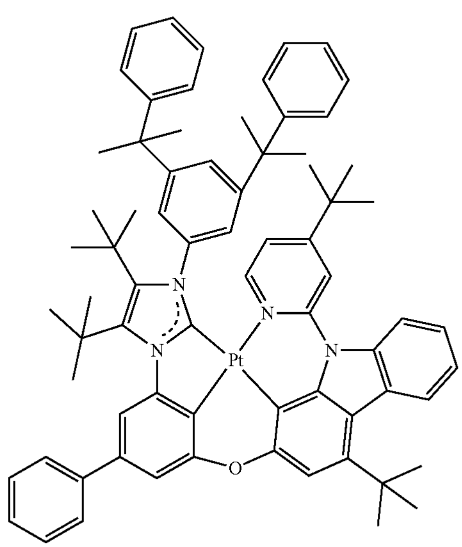
-continued
248
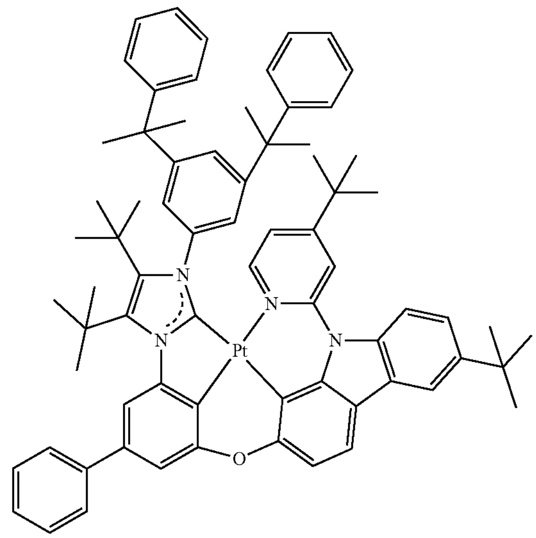
249
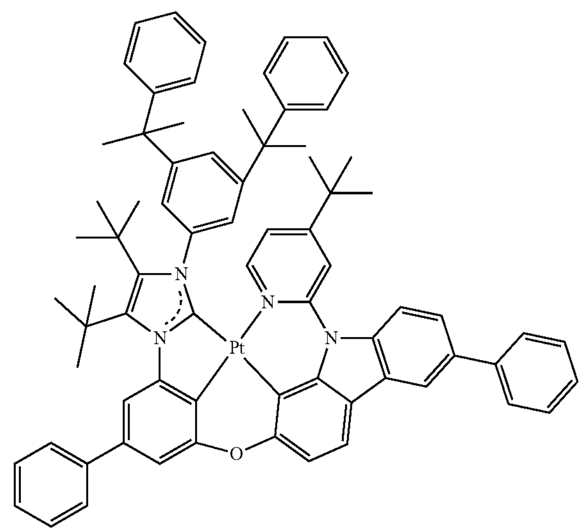
250
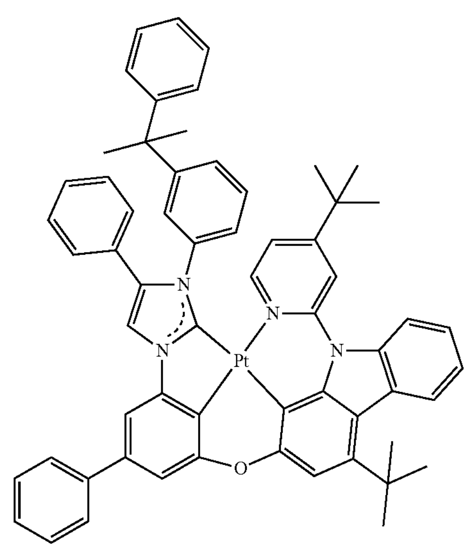

-continued
251
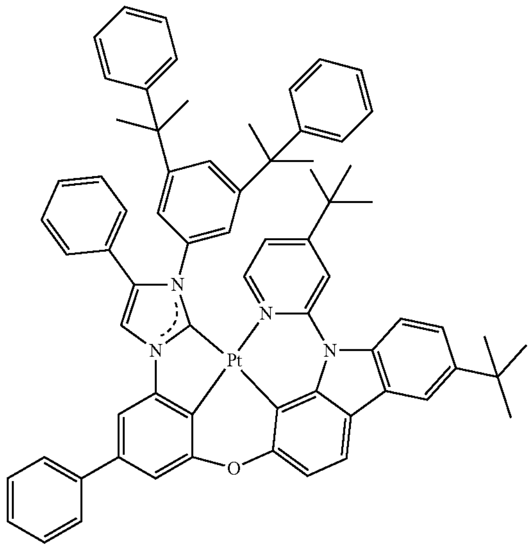
252
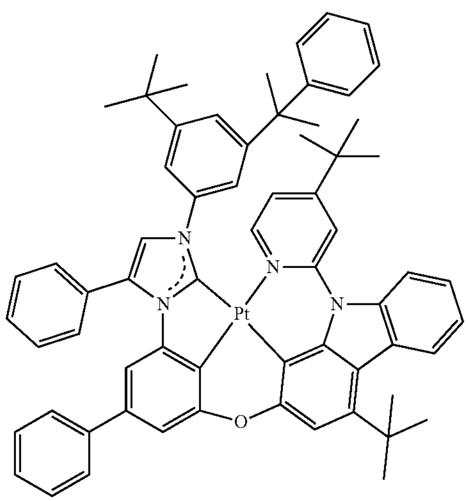
253
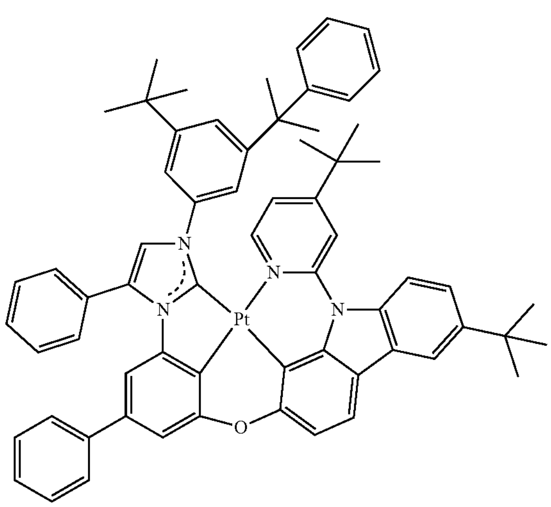
-continued
254
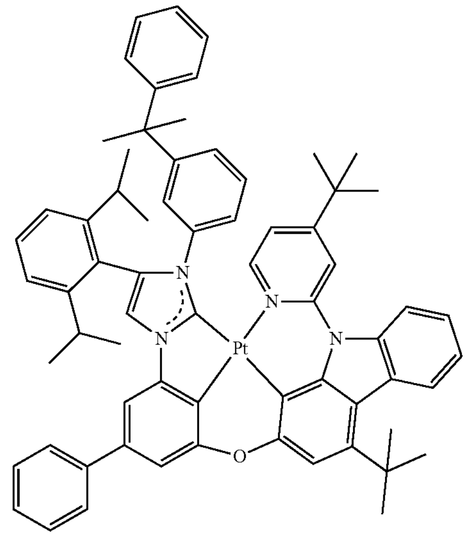
255
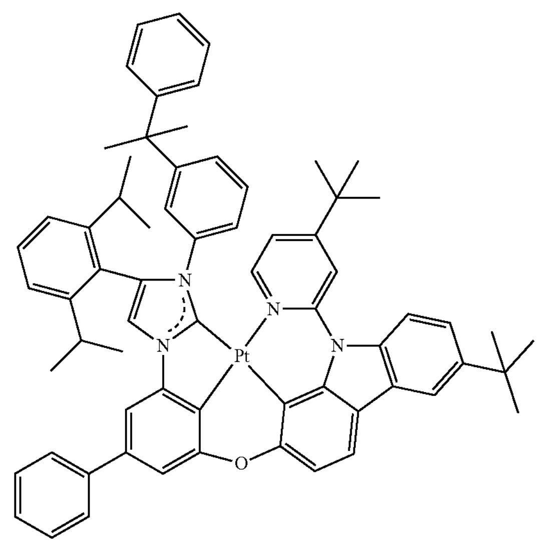
256
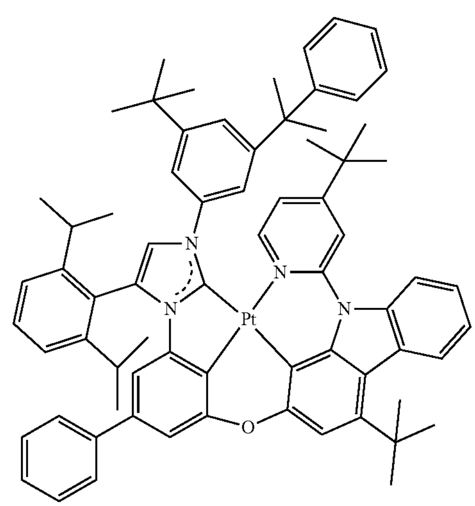

-continued
257
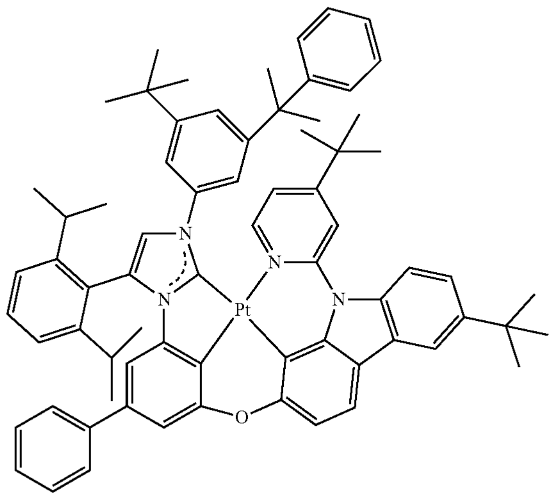
258
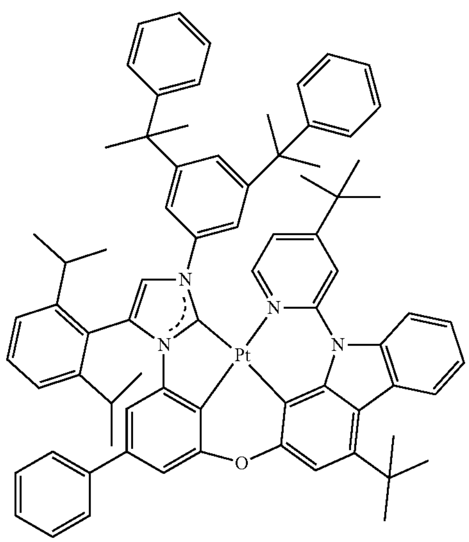
259
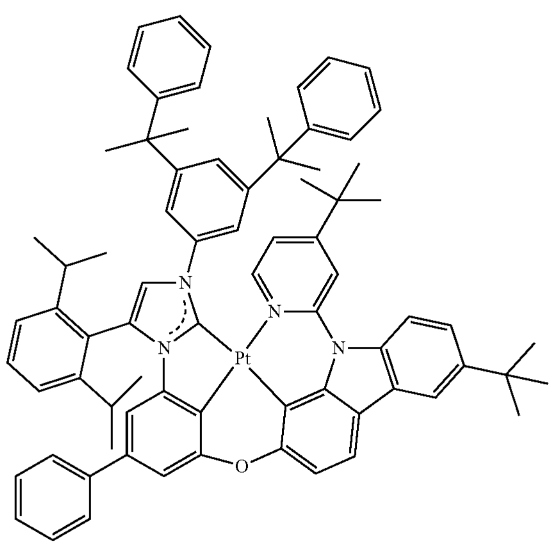
-continued
260
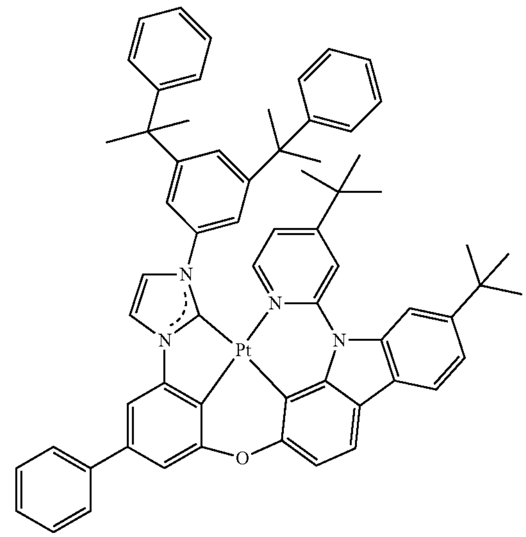
261
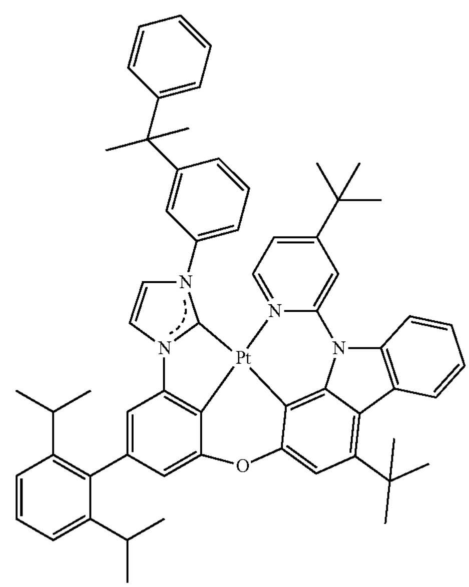

218
-continued
262
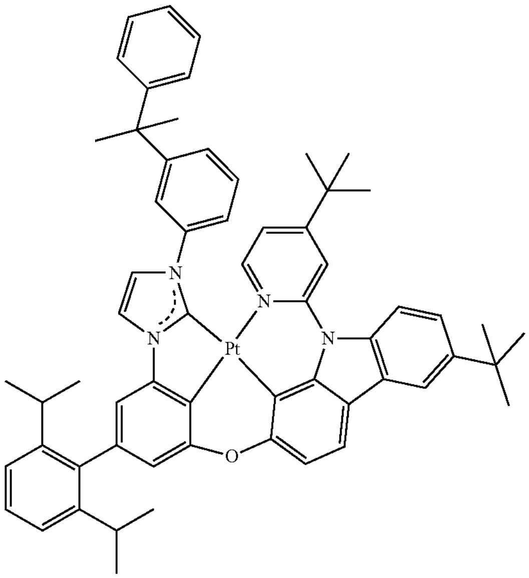
263
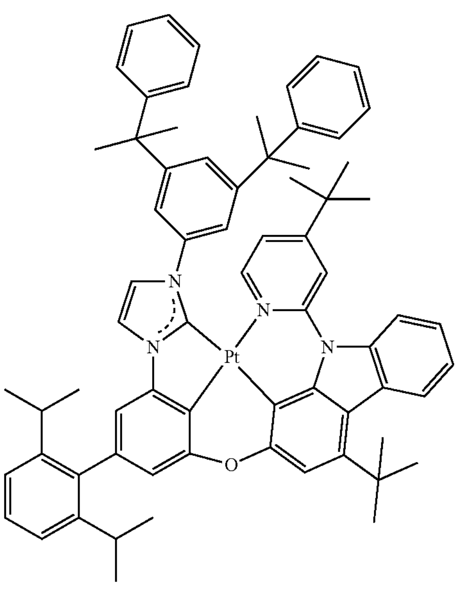
264
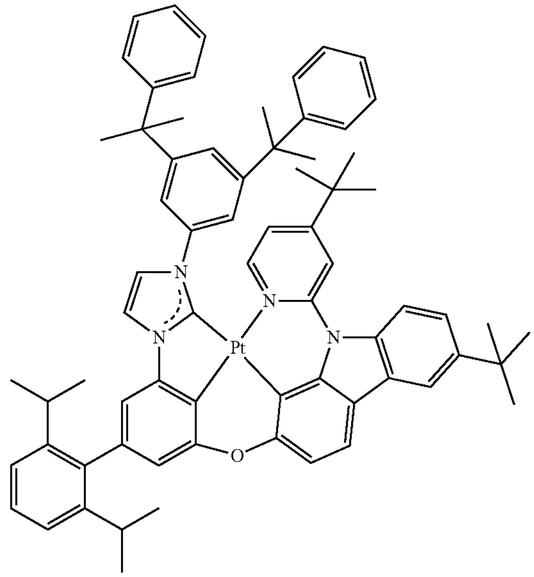
265
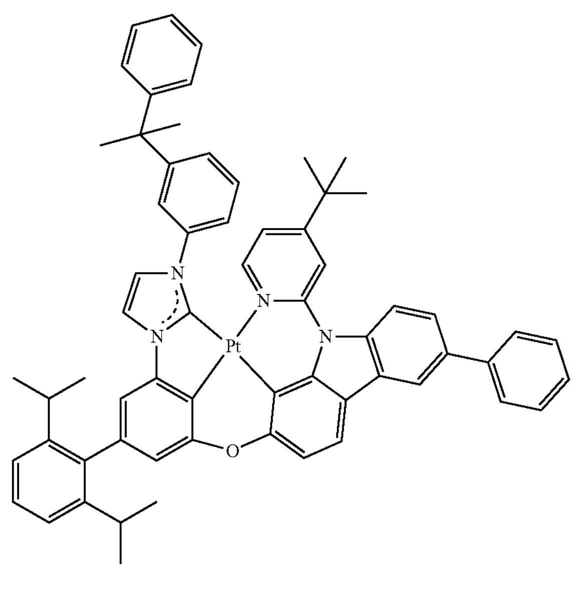

266
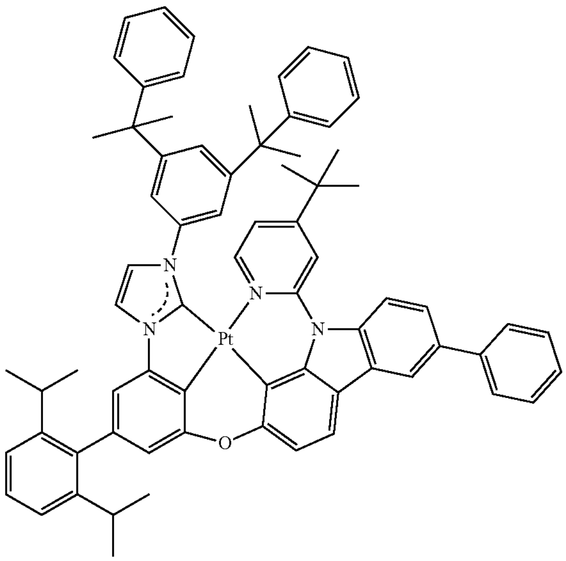
267
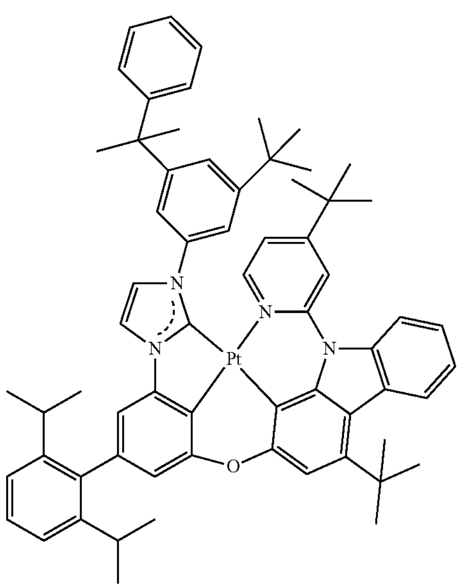
268
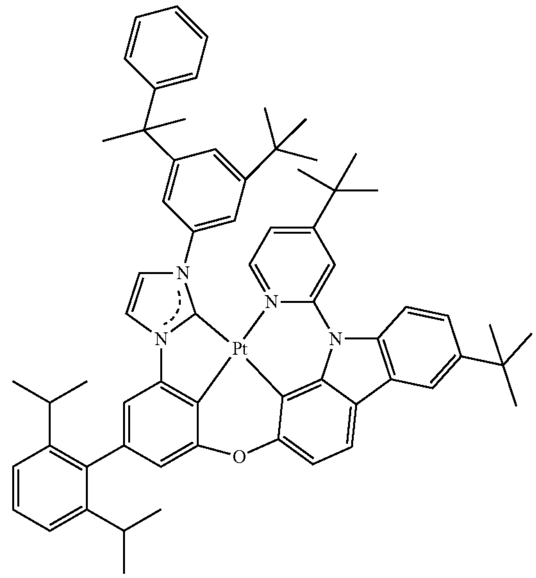
269
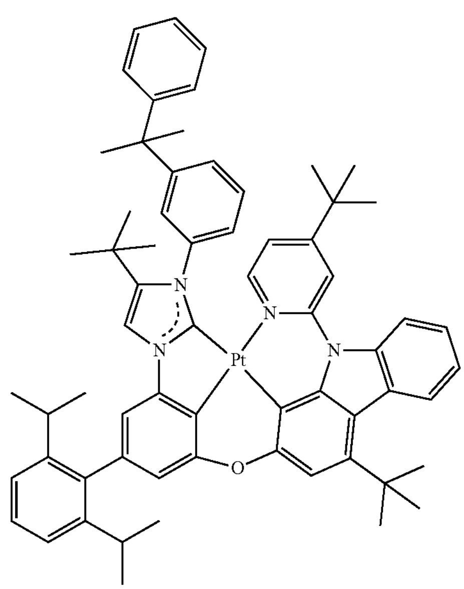

-continued
270
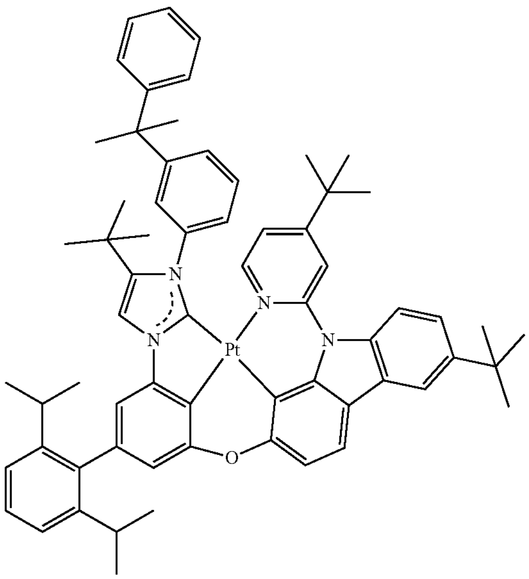
271
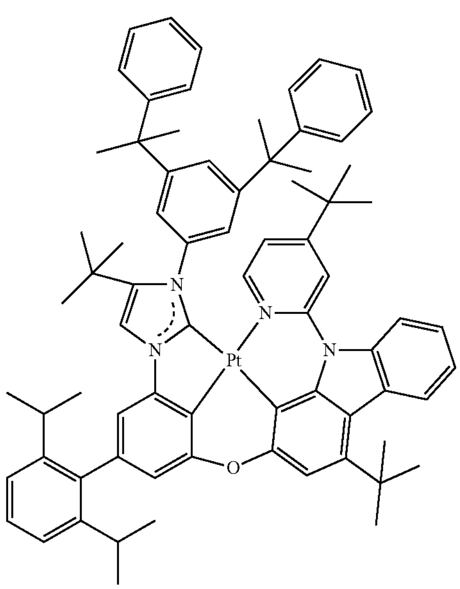
-continued
272
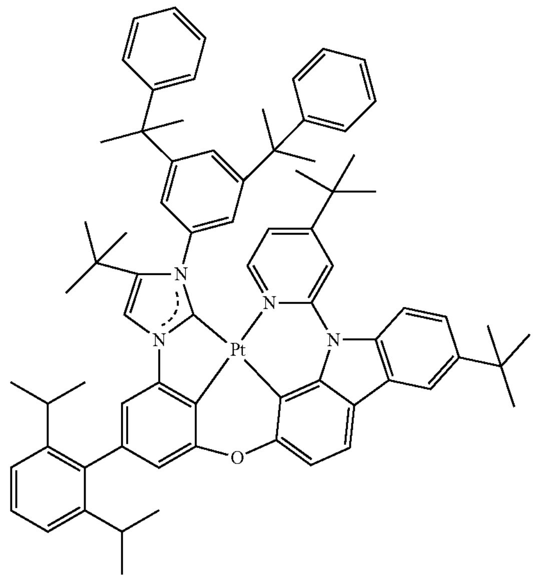
273
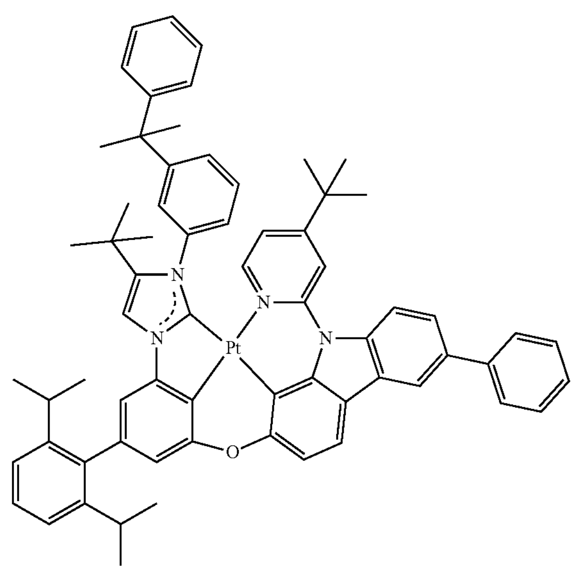

-continued
274
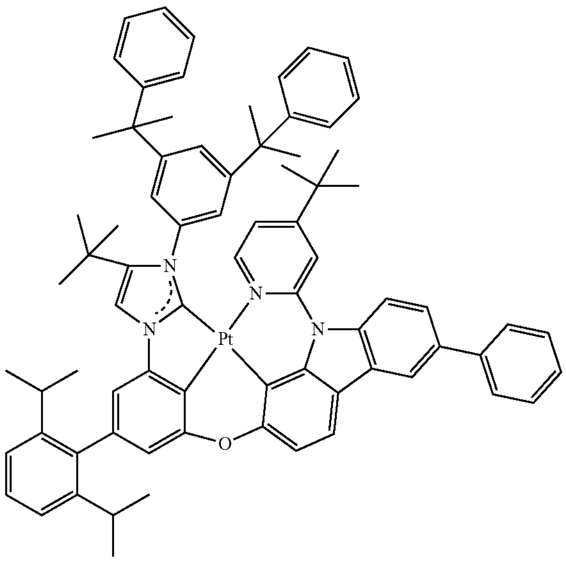
275
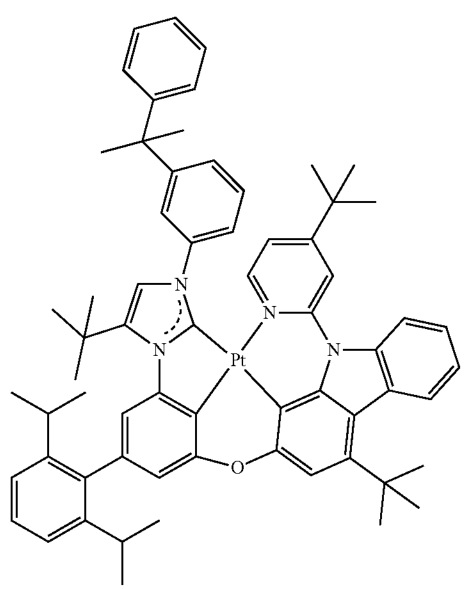
-continued
276
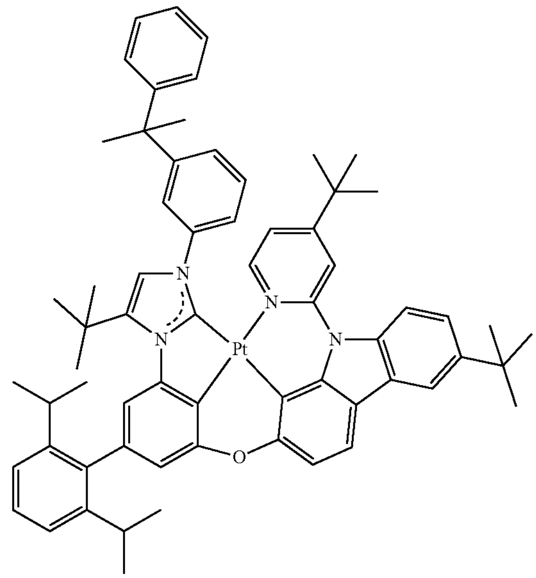
277
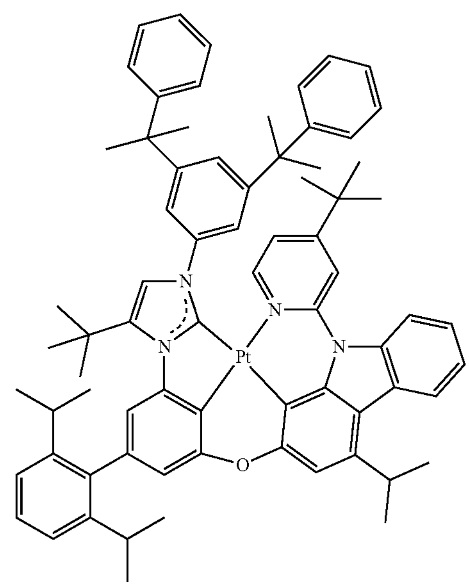

-continued
278
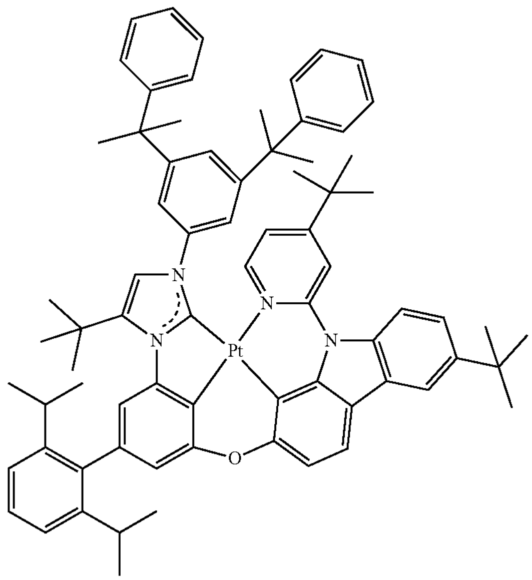
280
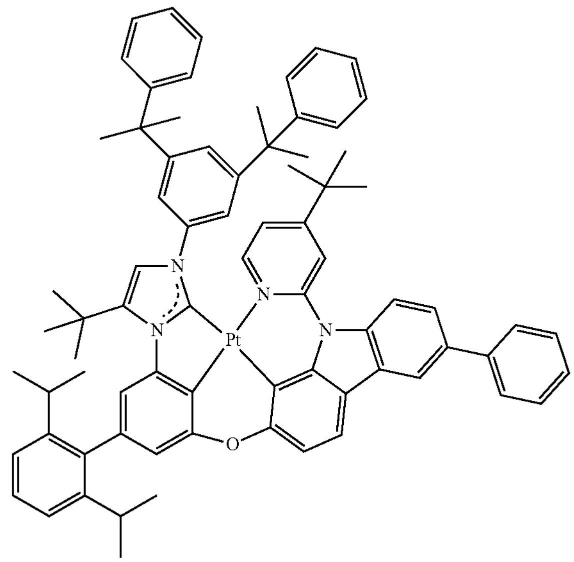
279
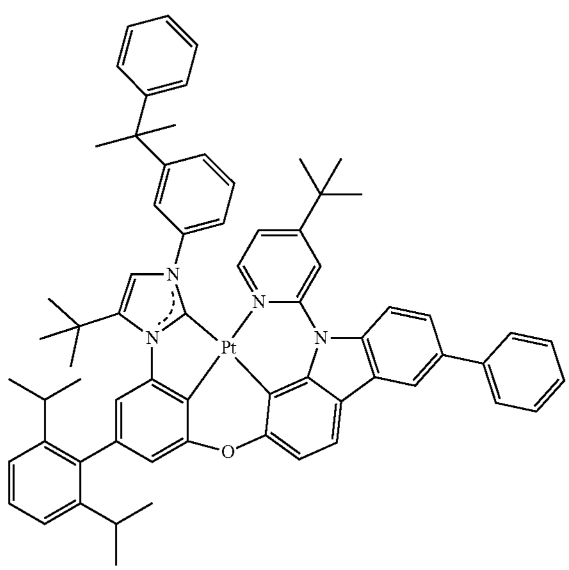
281
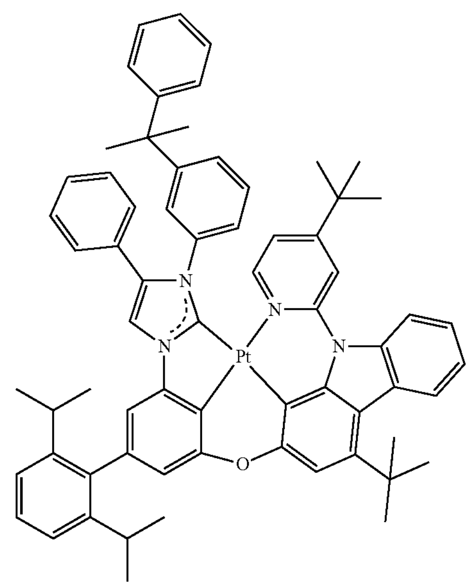
-continued -continued
282
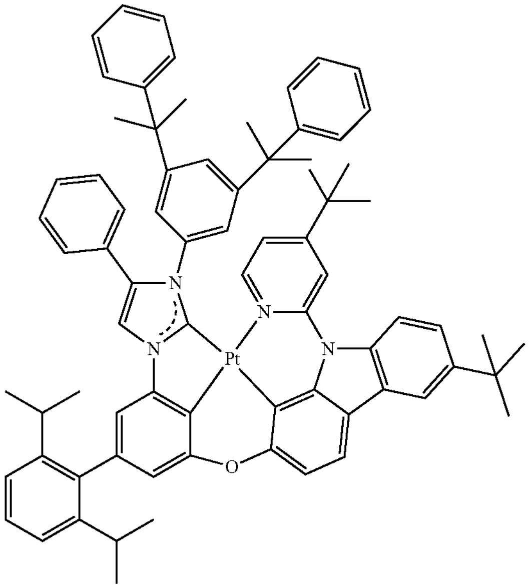
283
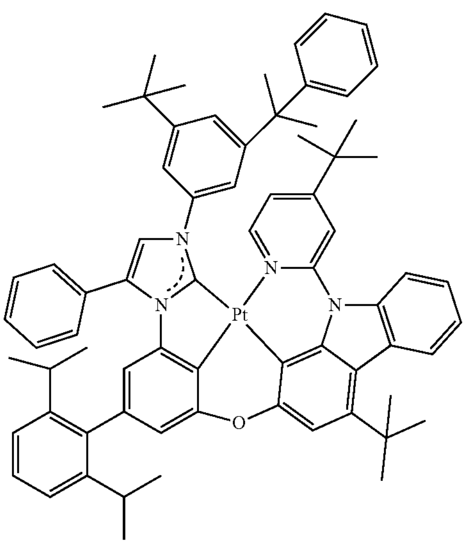
-continued
284
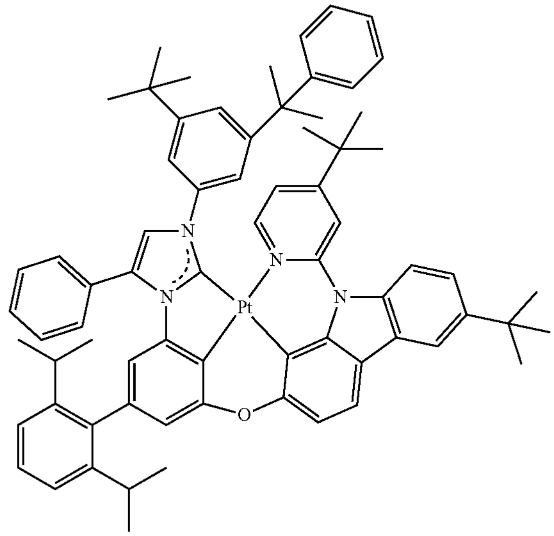
285
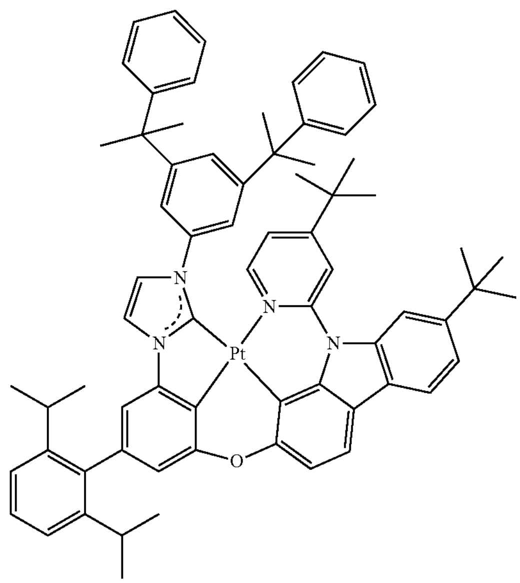
286
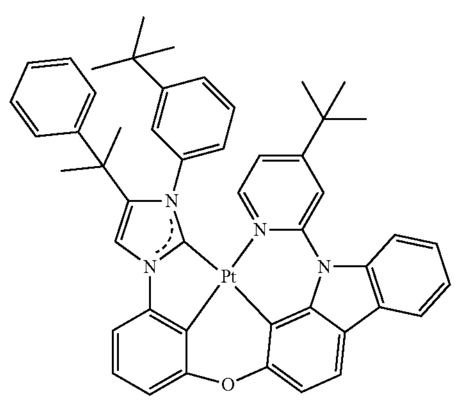

-continued
287
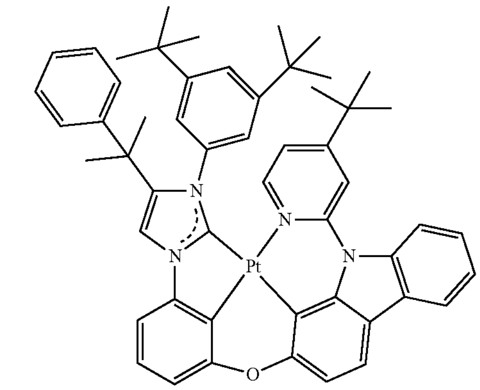
288
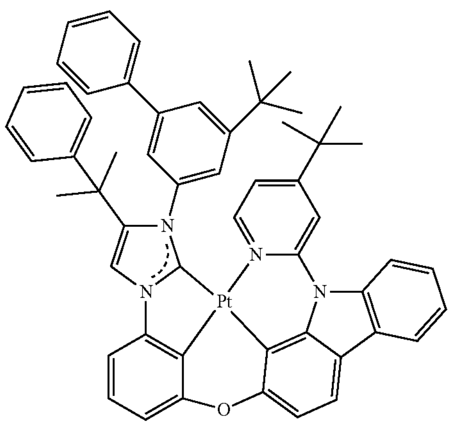
289
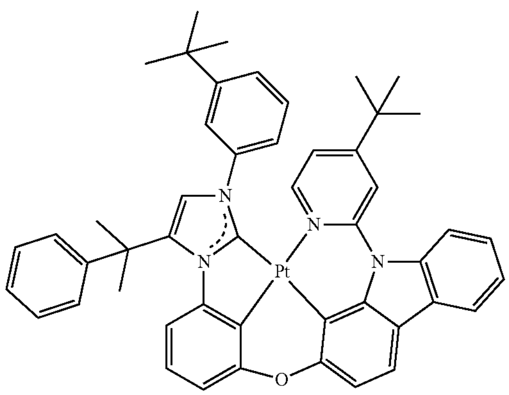
290
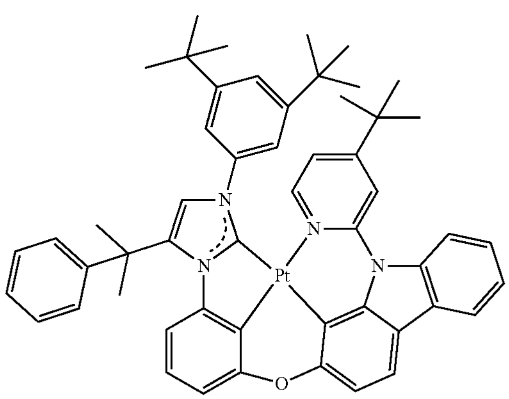
-continued
291
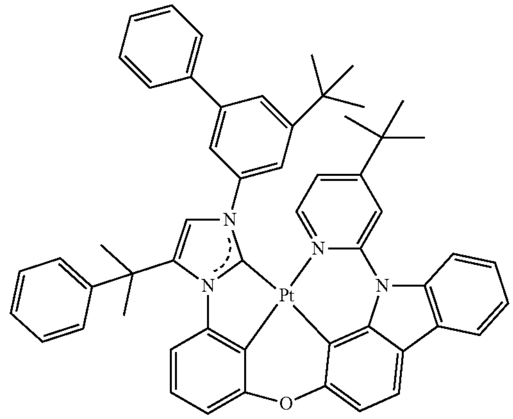
292
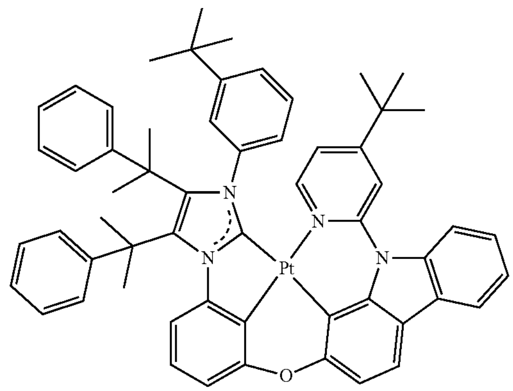
293
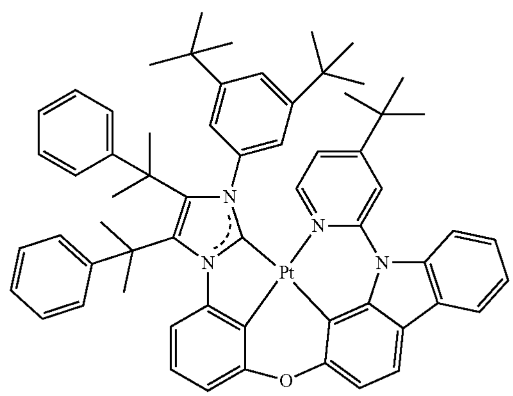
294
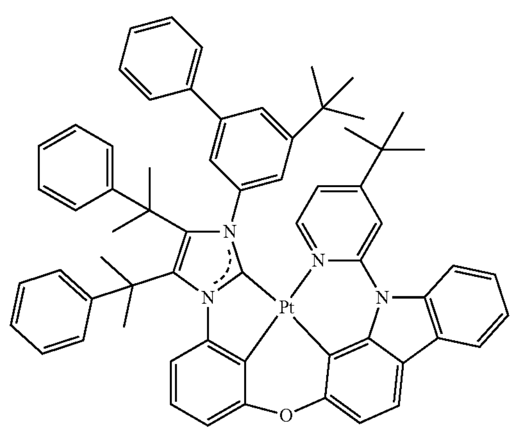

-continued
295
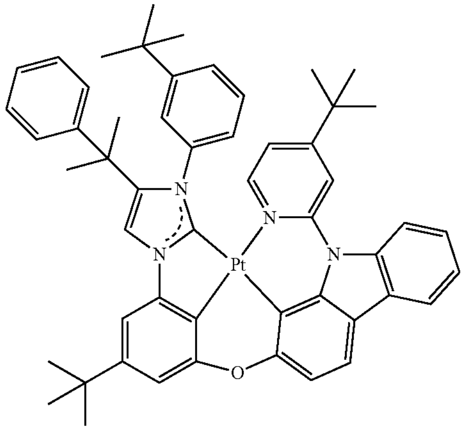
296
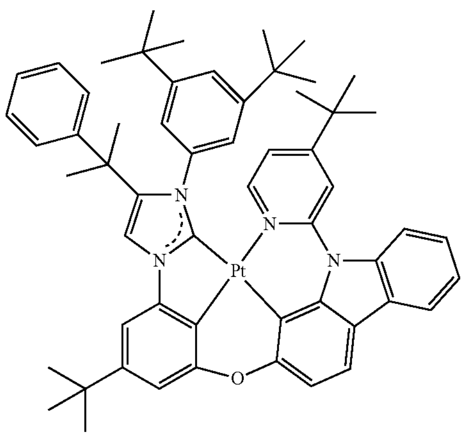
297
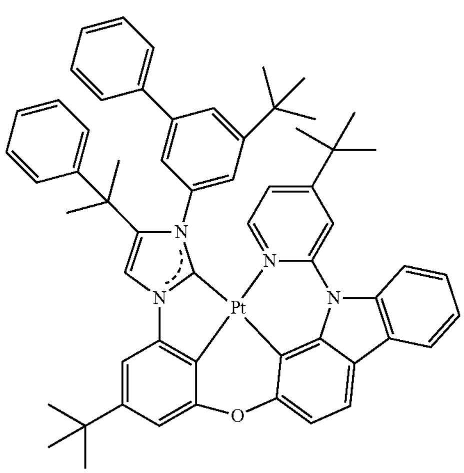
-continued
298
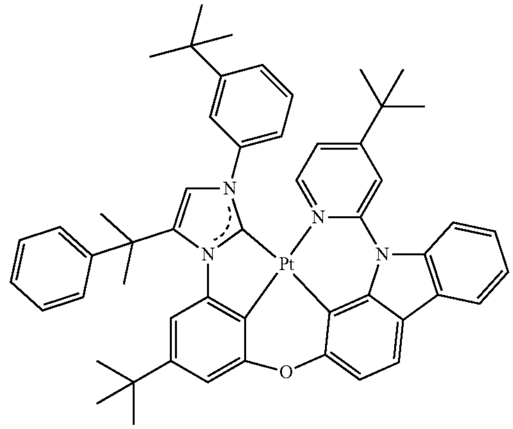
299
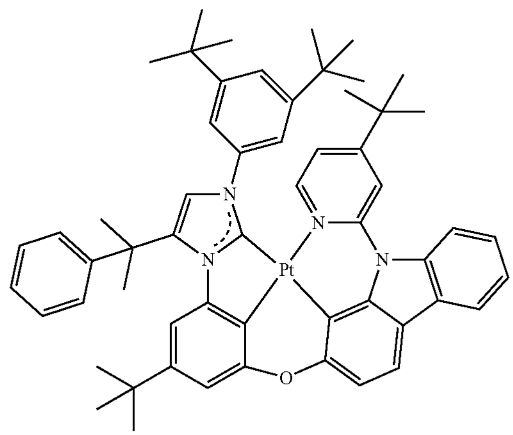
300
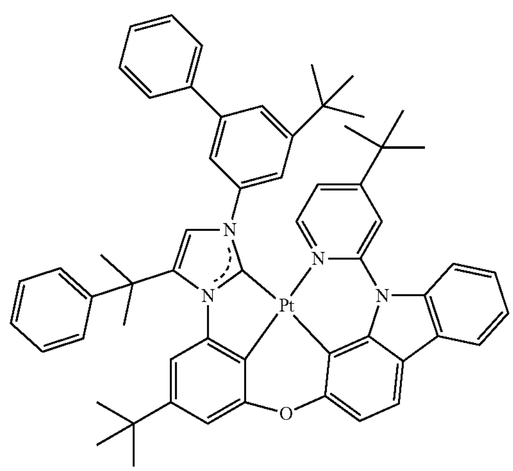

-continued
301
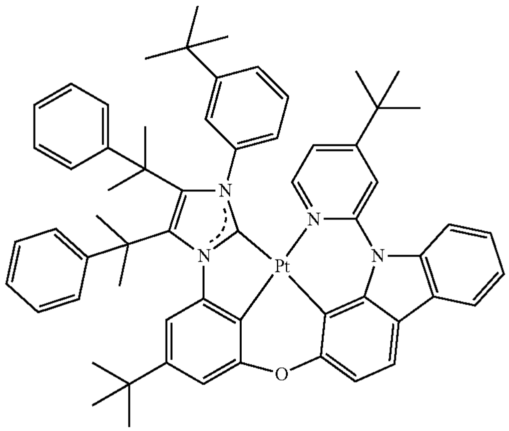
302
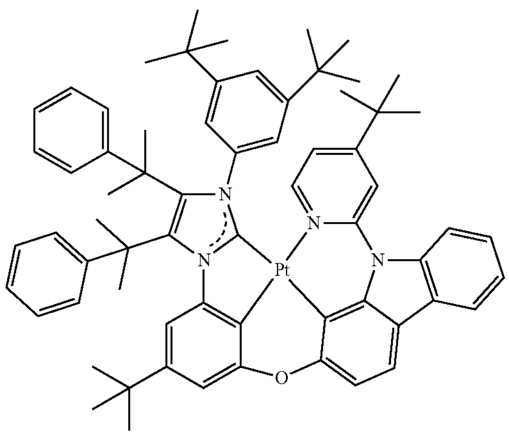
303
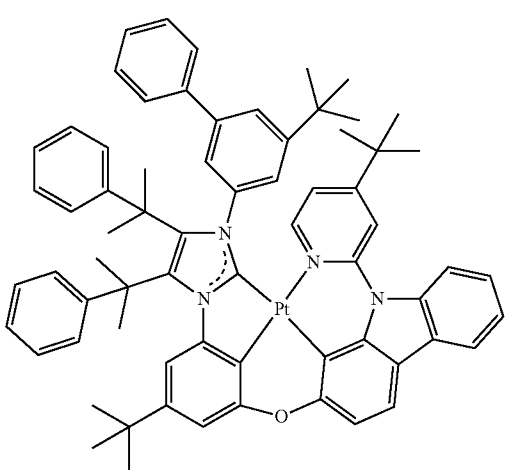
-continued
304
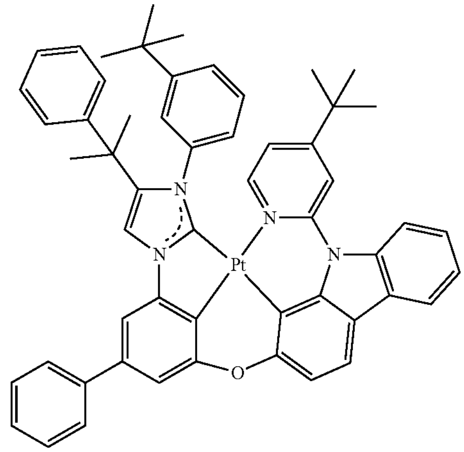
305
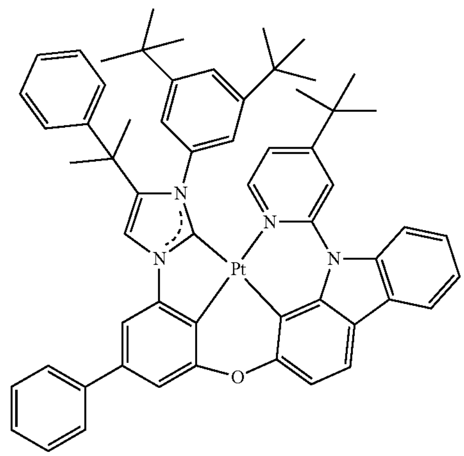
306
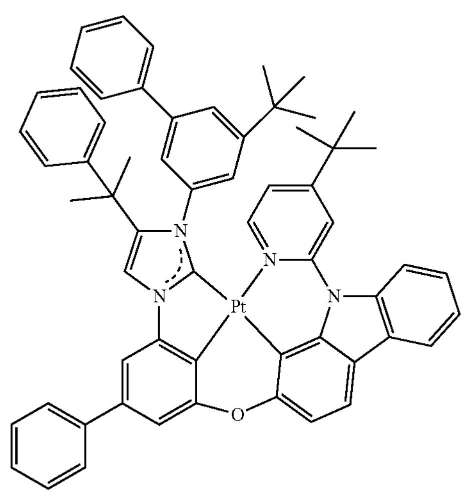

-continued
307
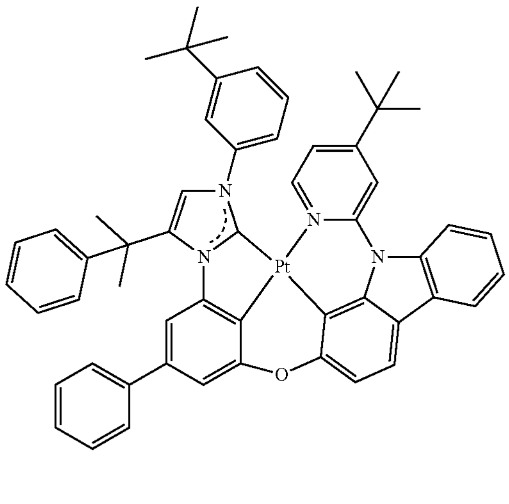
308
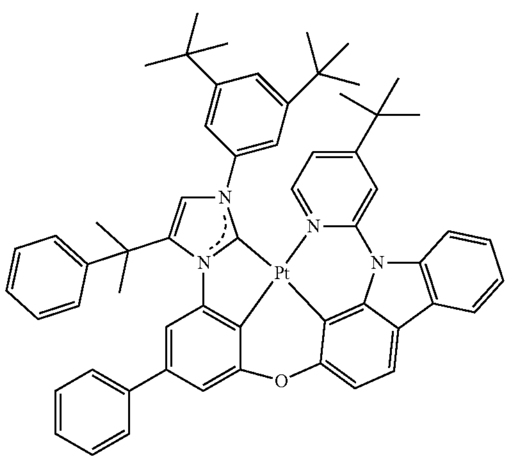
309
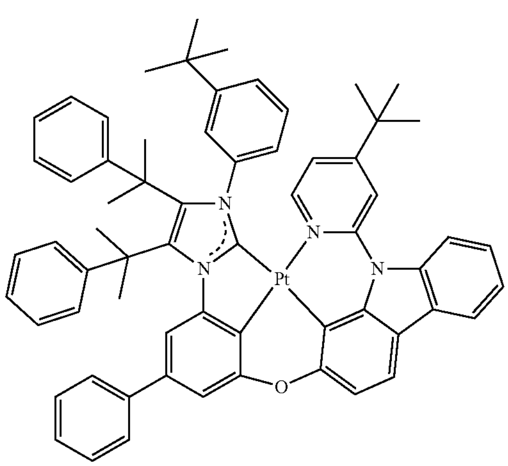
-continued
310
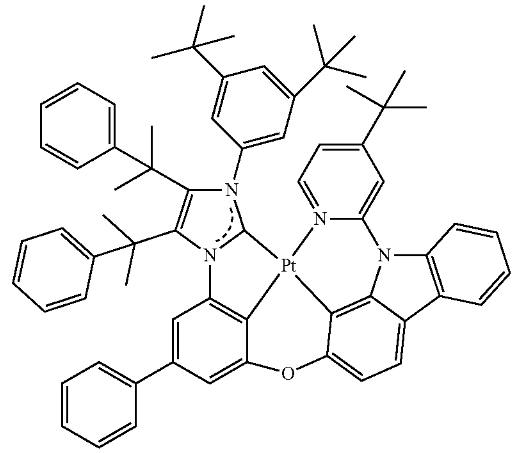
311
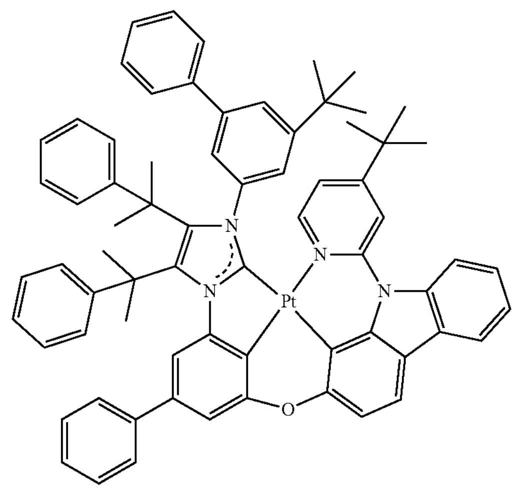
312
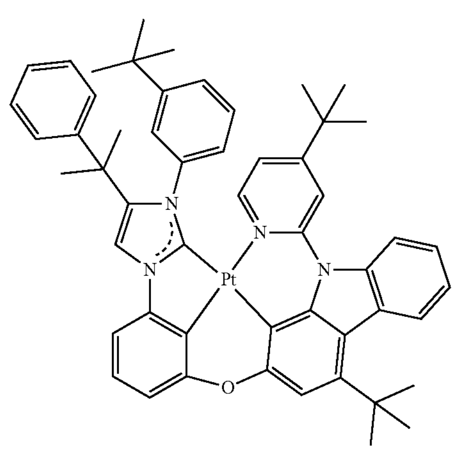

-continued
313
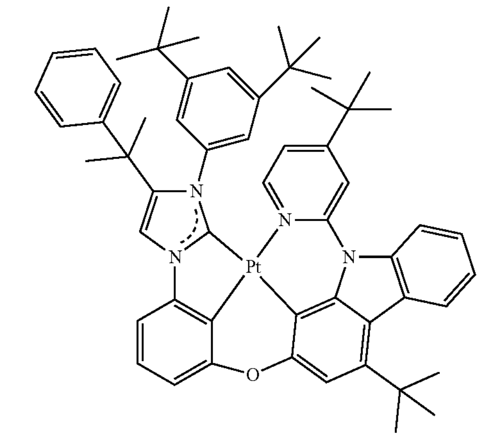
314
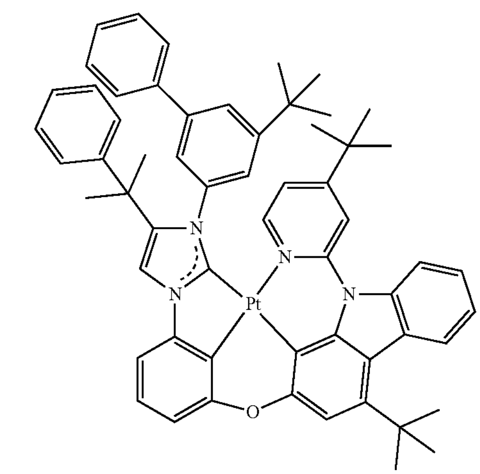
315
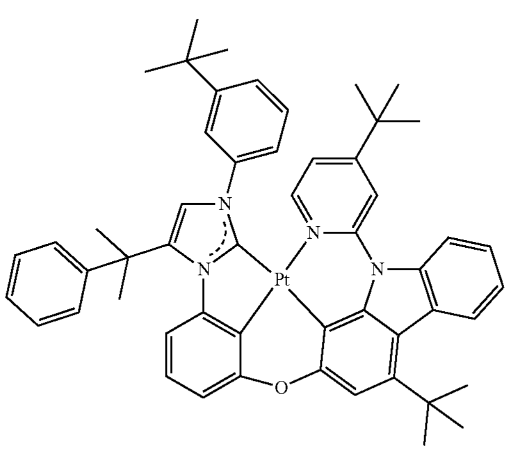
-continued
316
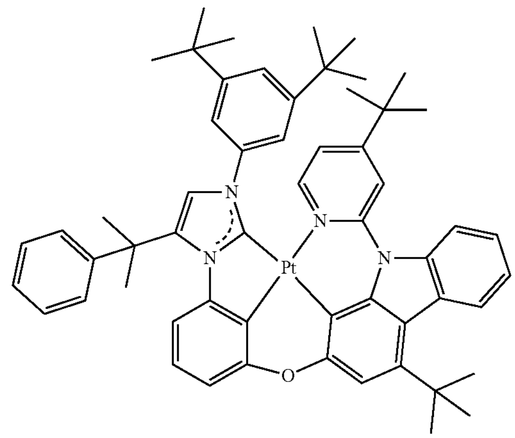
317
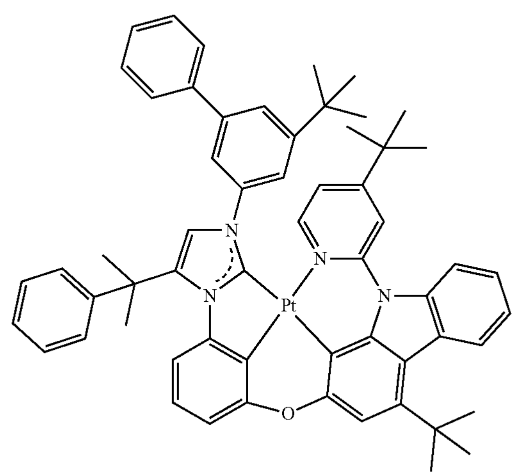
318
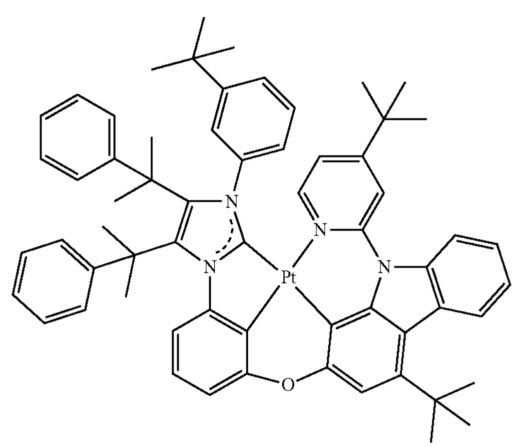

-continued
319
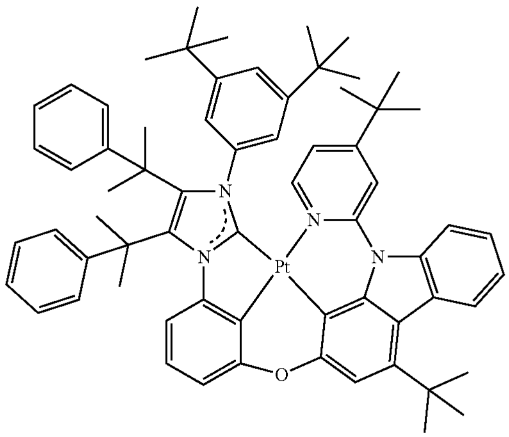
320
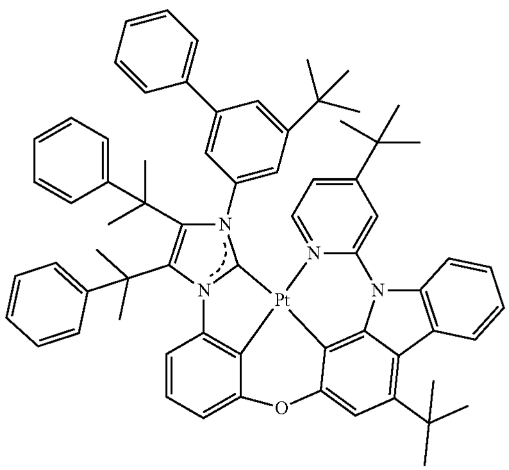
321
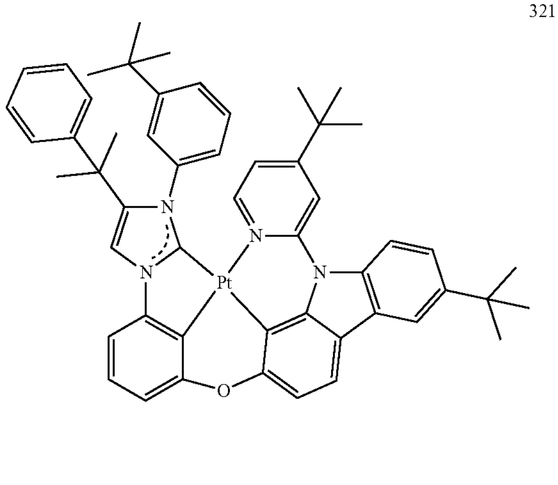
-continued
322
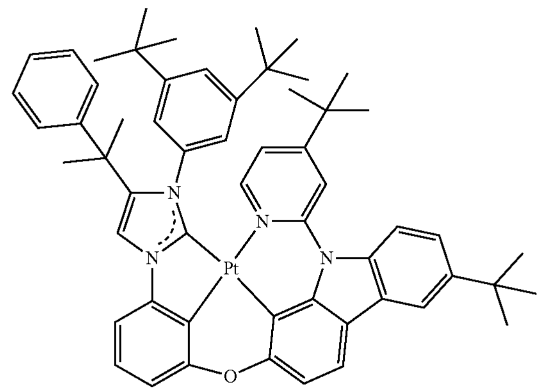
323
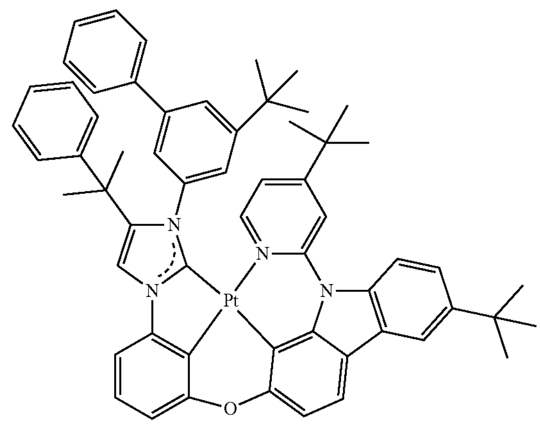
324
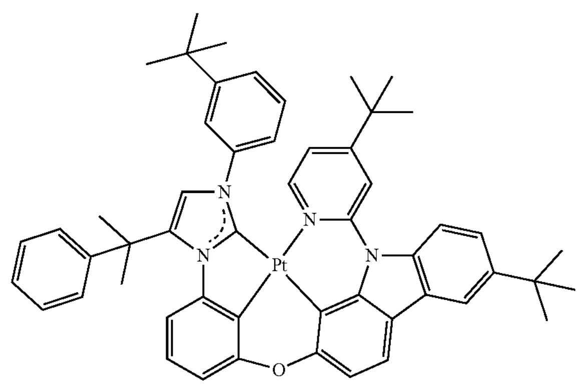
325
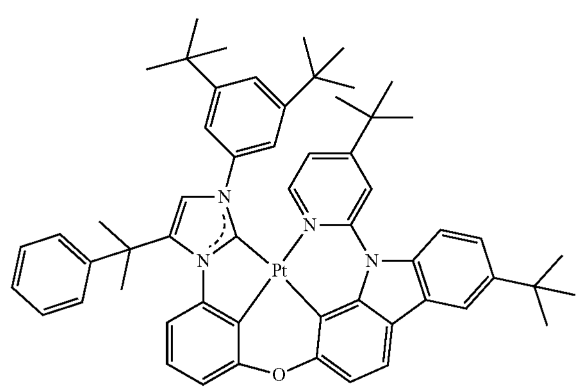

326
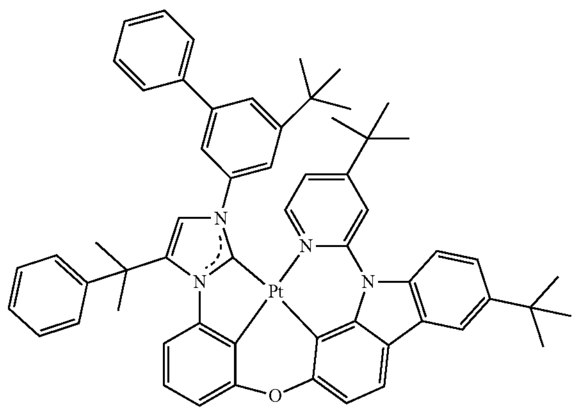
327
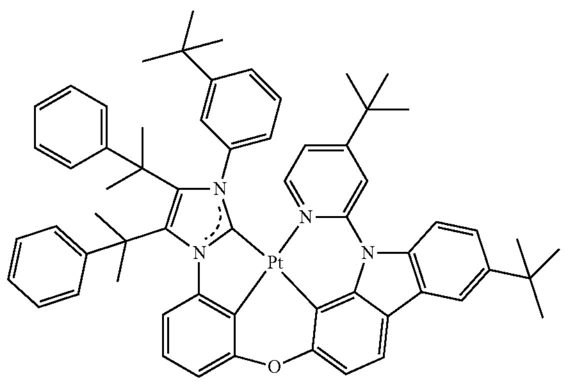
328
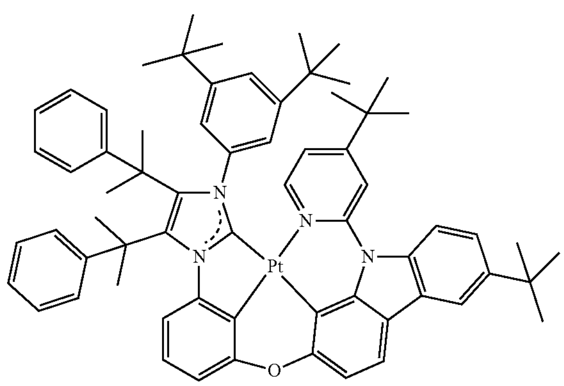
329
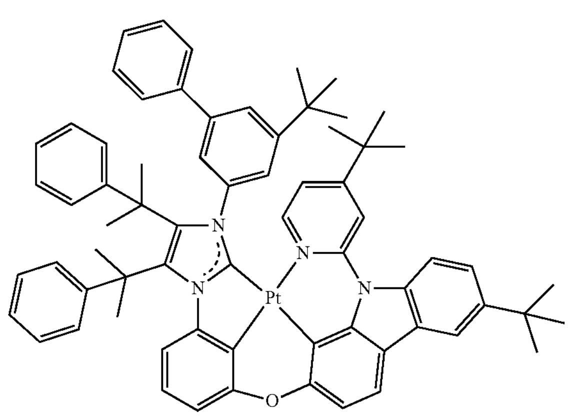
330
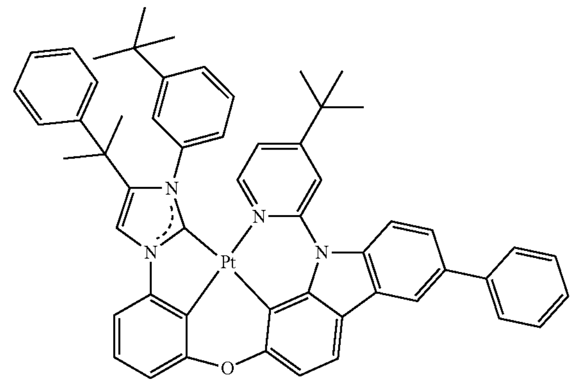
331
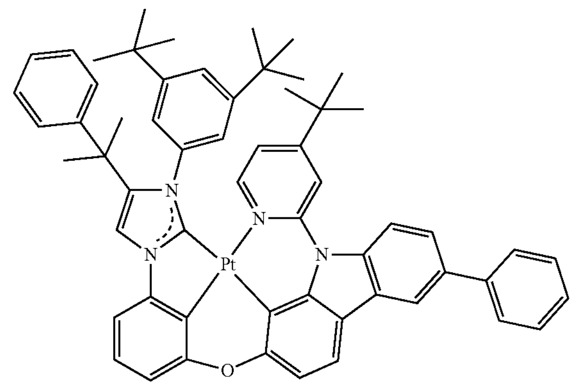
332
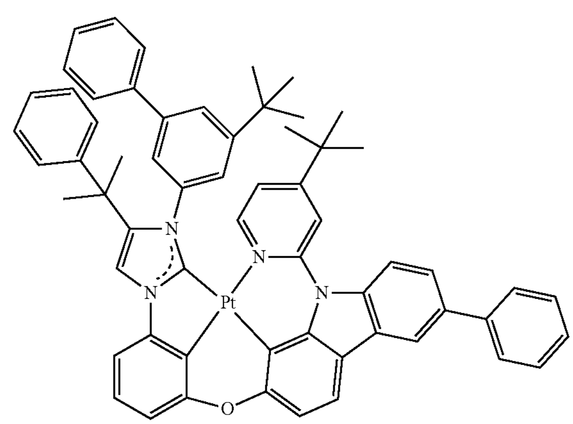
333
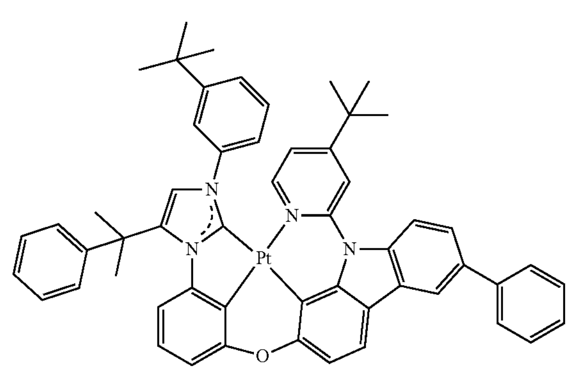

-continued
334
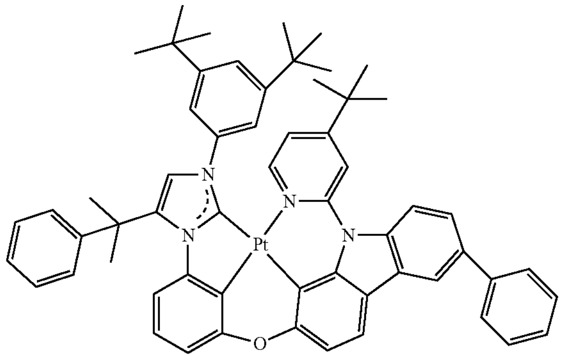
335
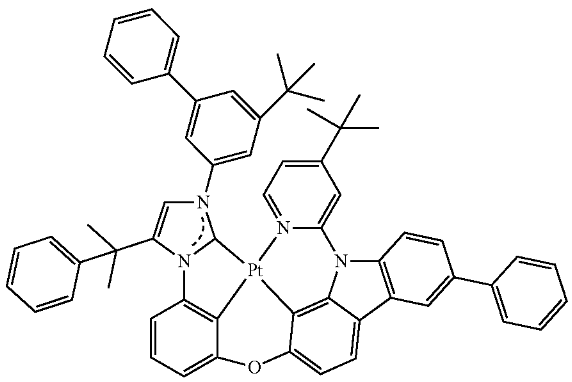
336
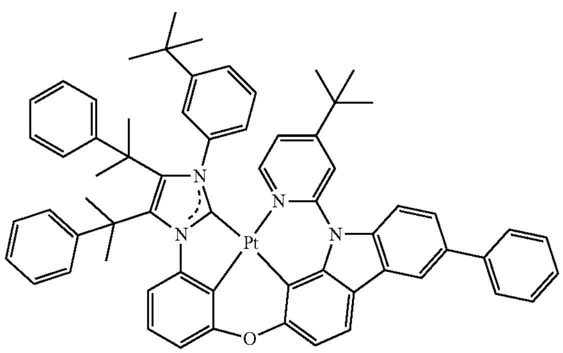
337
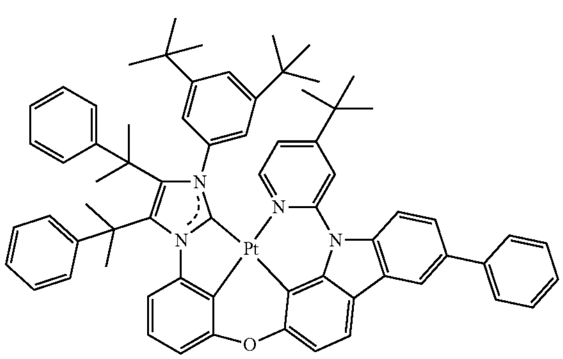
-continued
338
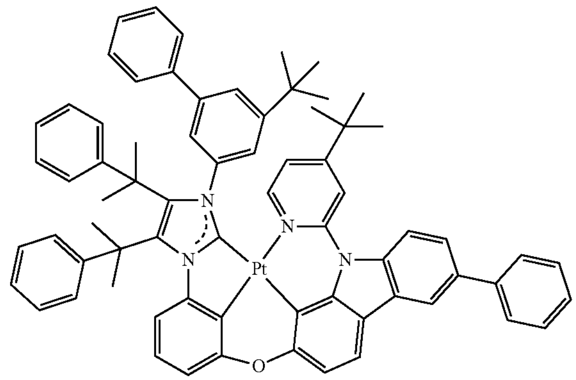
339
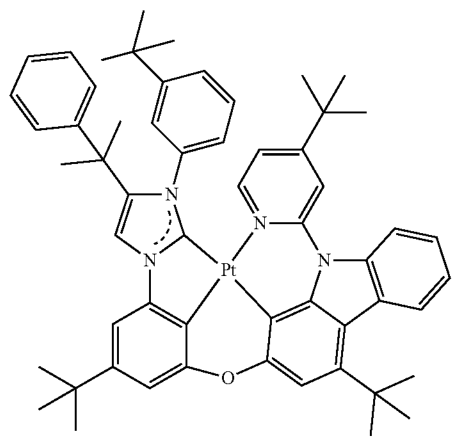
340
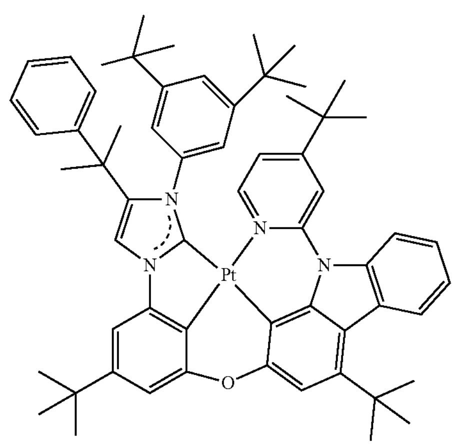

341
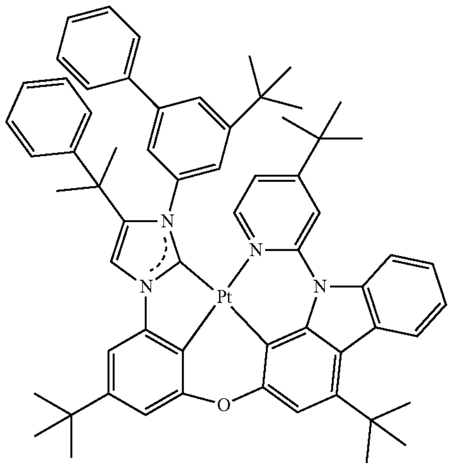
342
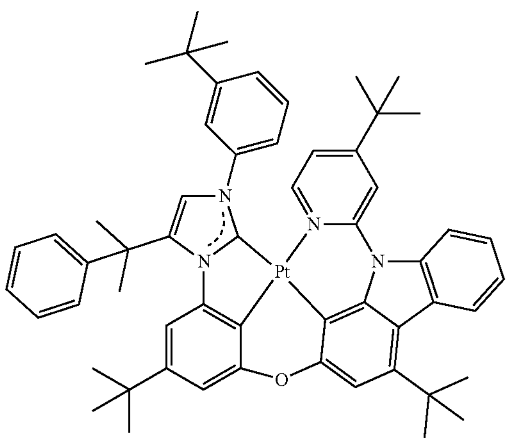
343
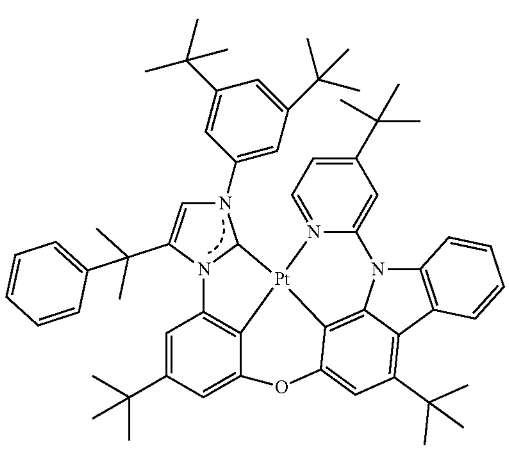
344
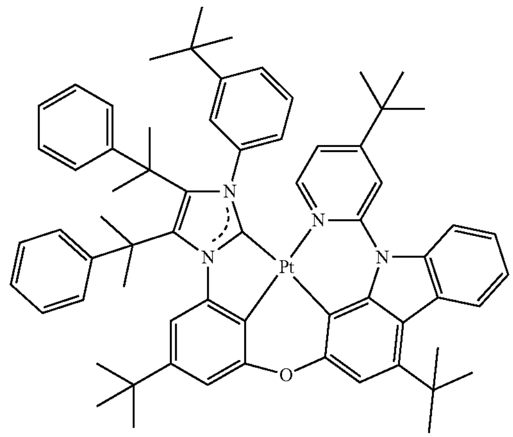
345
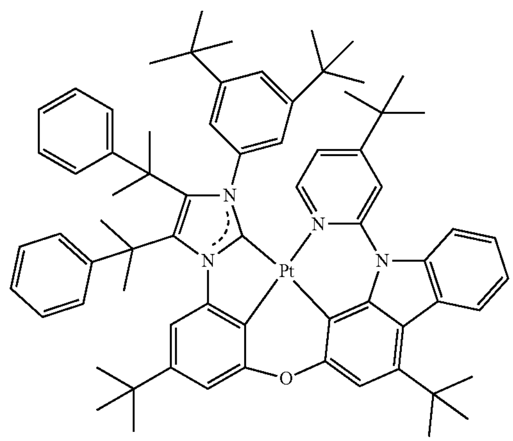
346
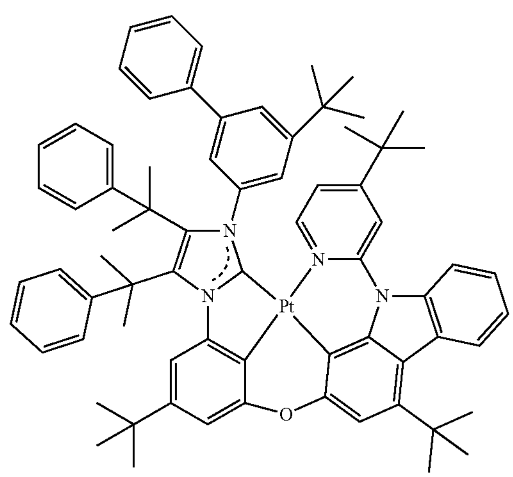

347
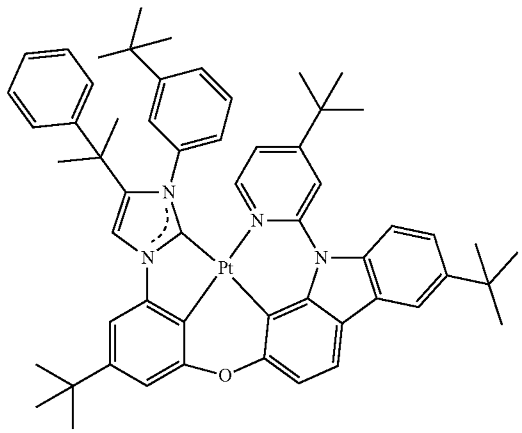
348
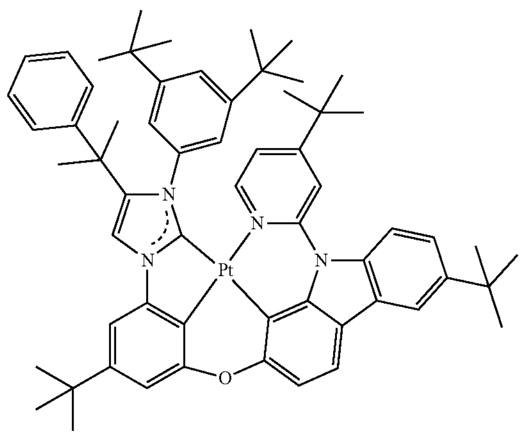
349
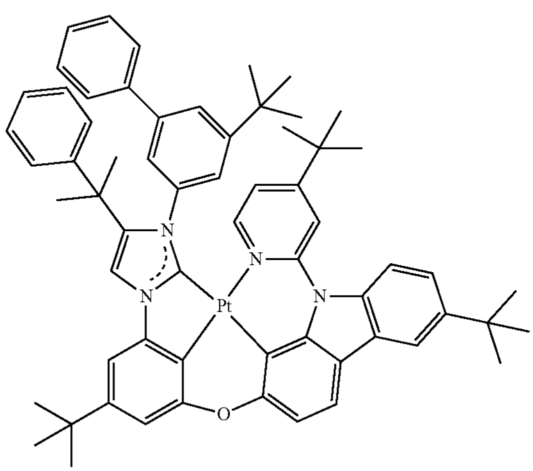
350
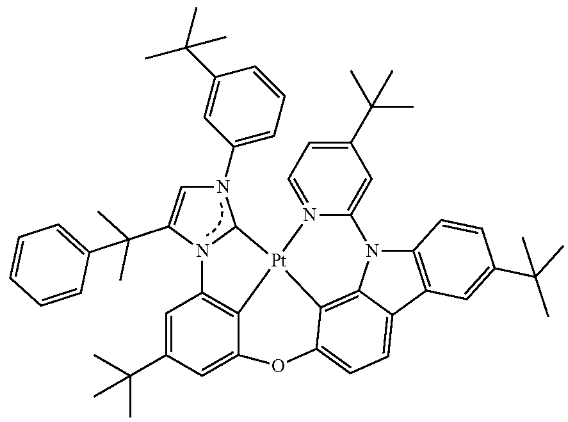
351
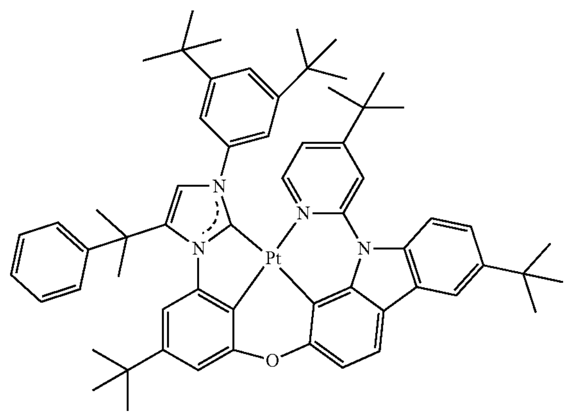
352
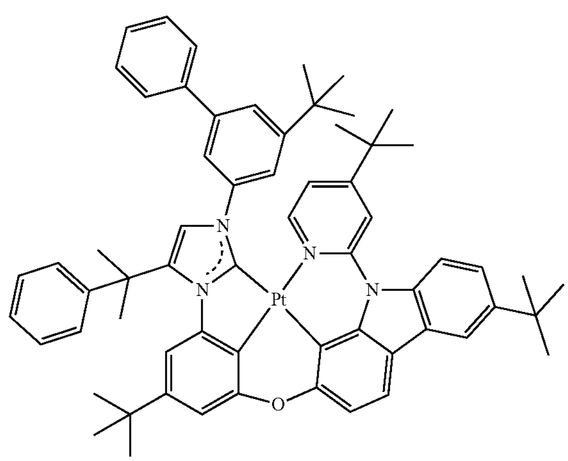

-continued
353
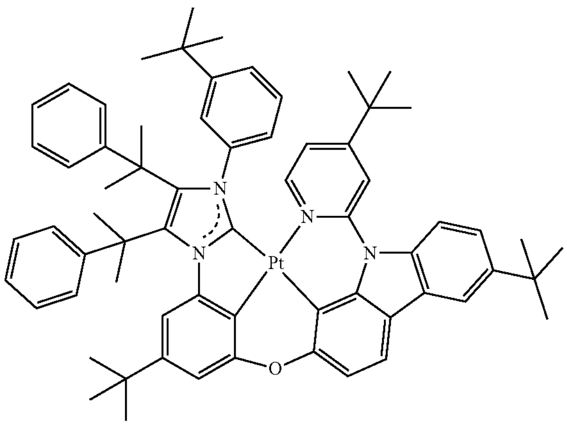
354
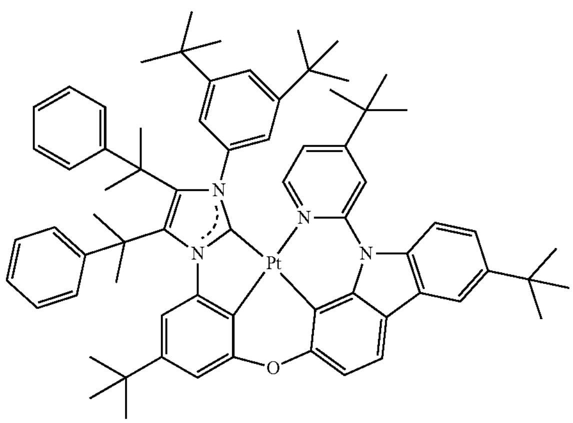
355
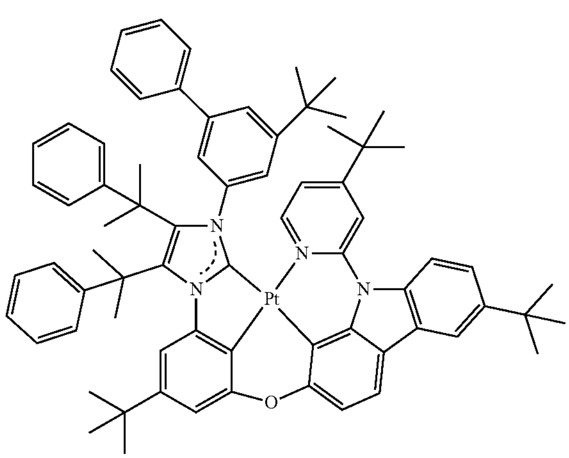
-continued
356
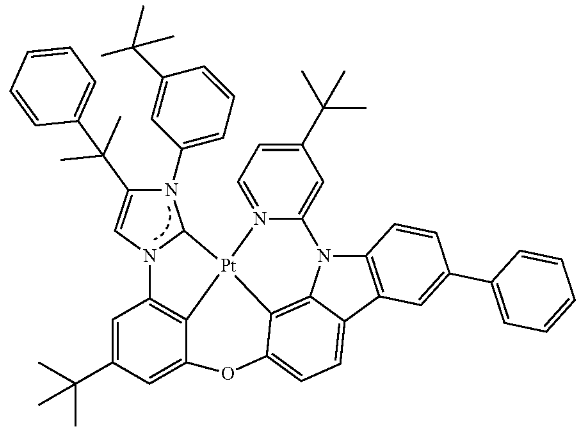
357
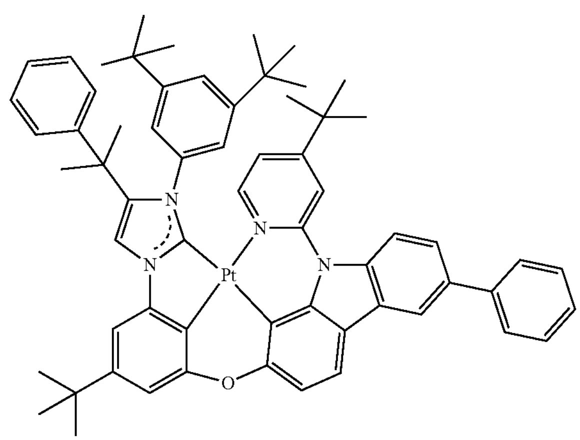
358
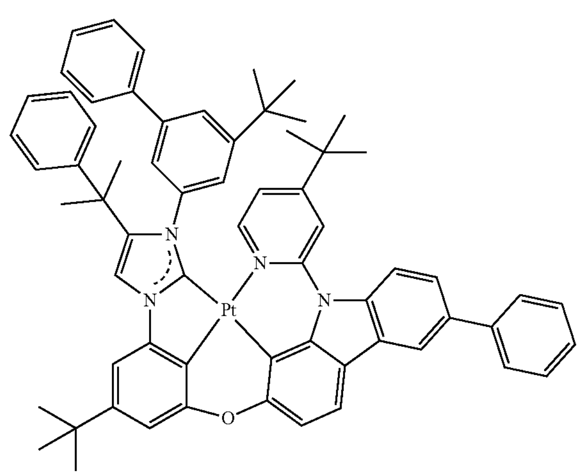

-continued
359
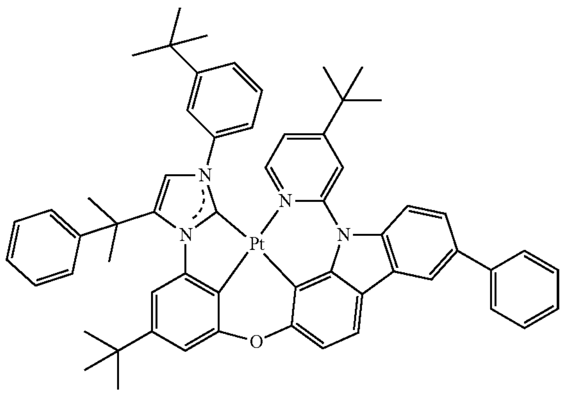
360
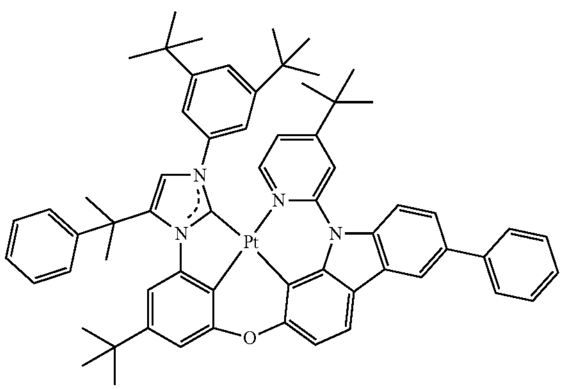
361
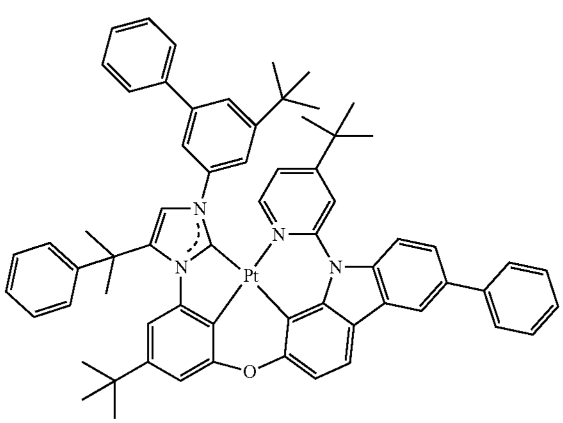
-continued
362
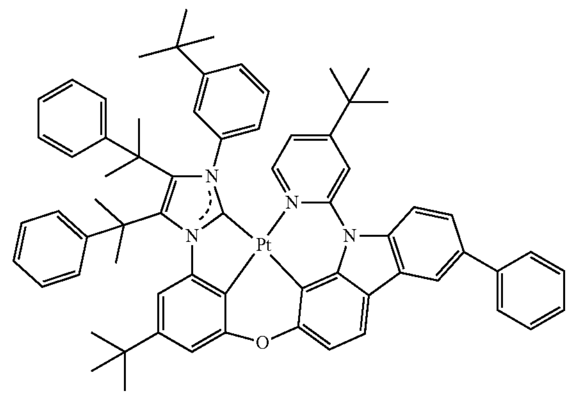
363
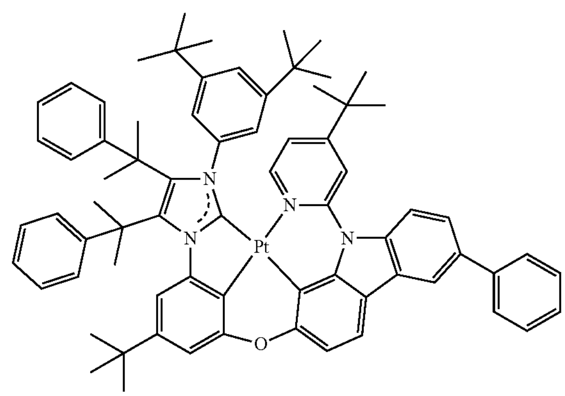
364
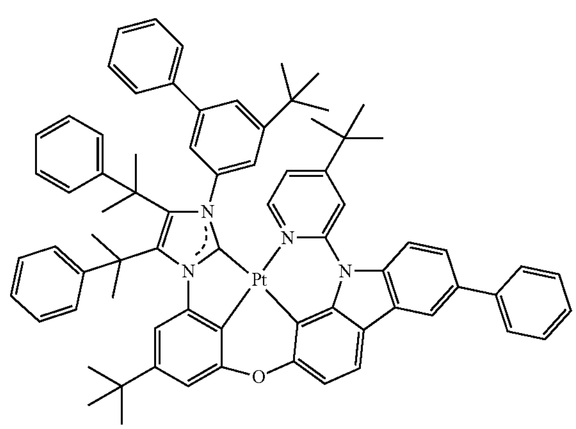

-continued
365
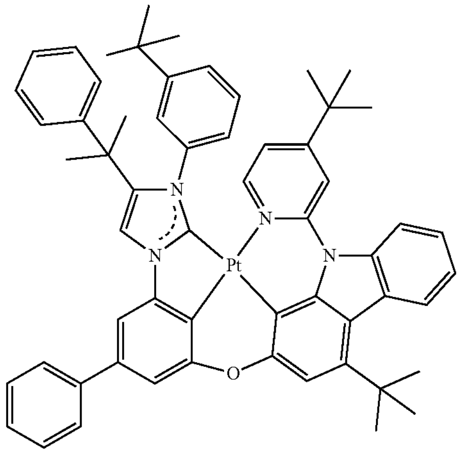
366
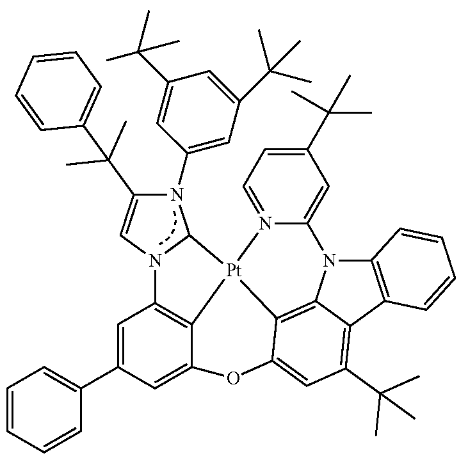
367
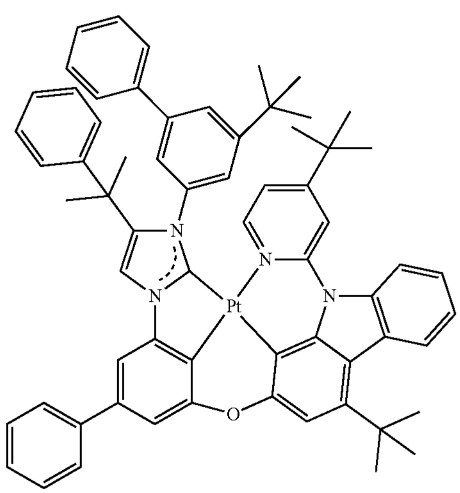
-continued
368
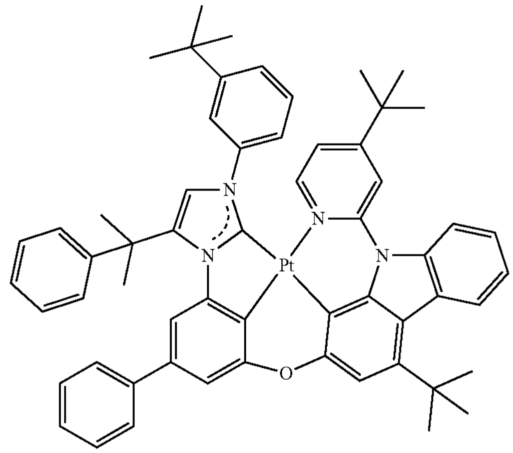
369
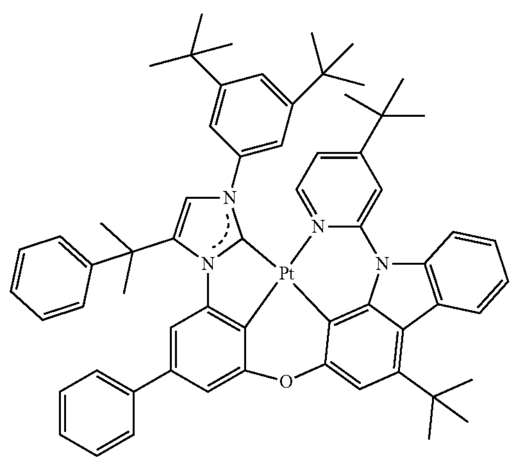
370
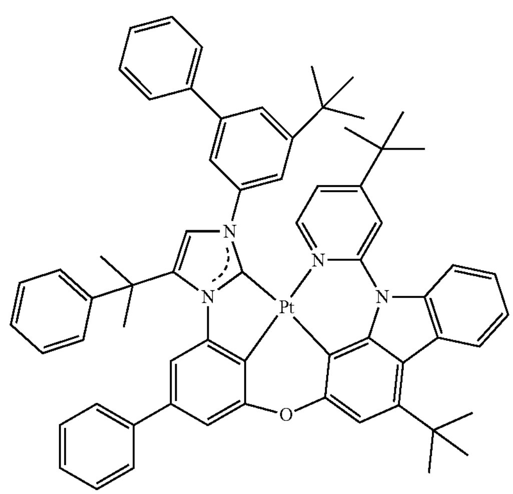

-continued
371
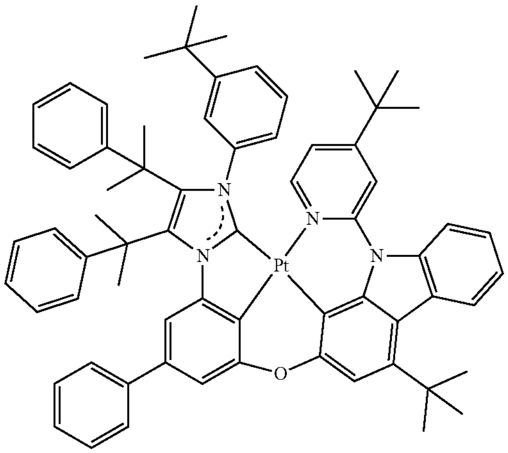
372
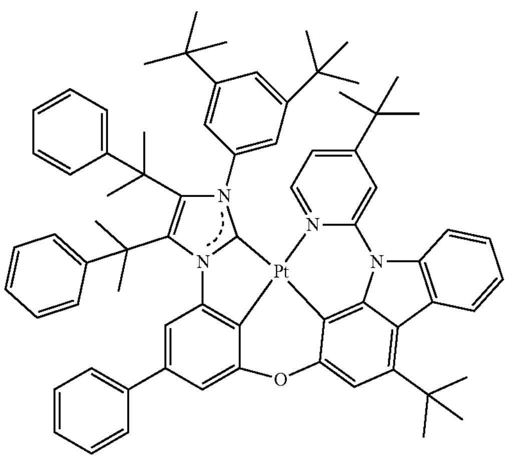
373
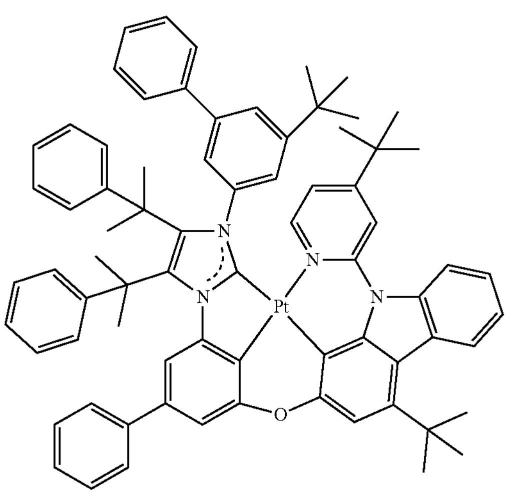
-continued
374
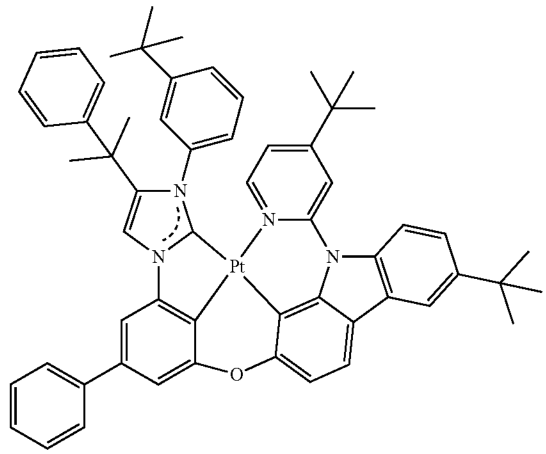
375
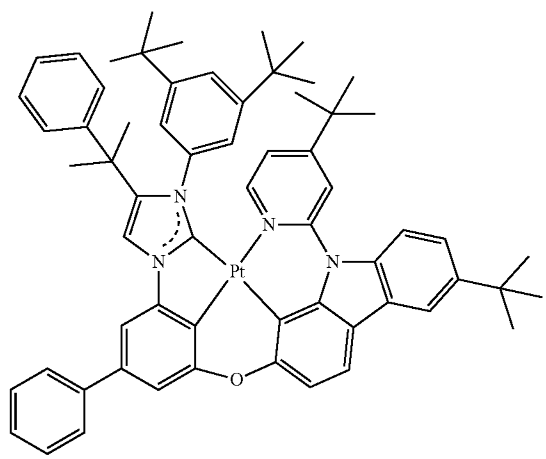
376
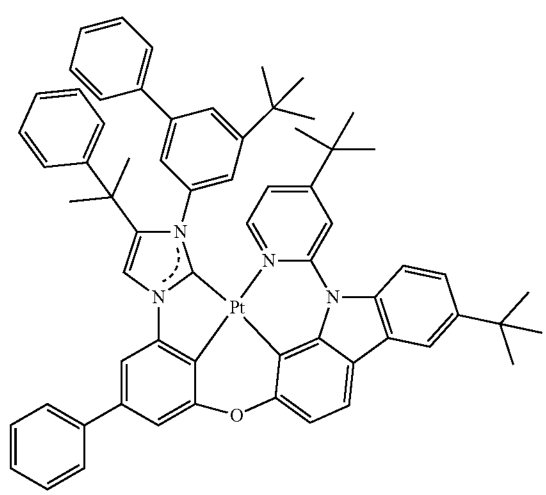

-continued
377
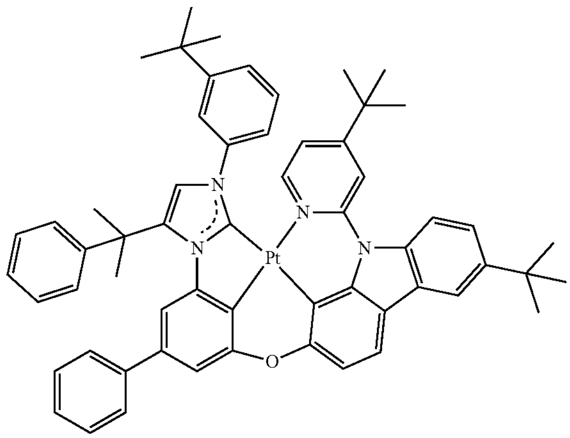
378
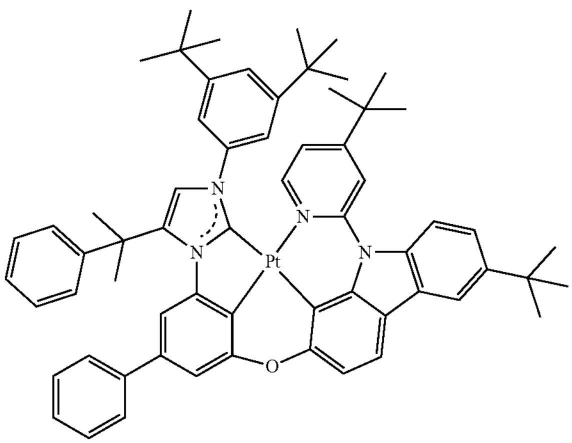
379
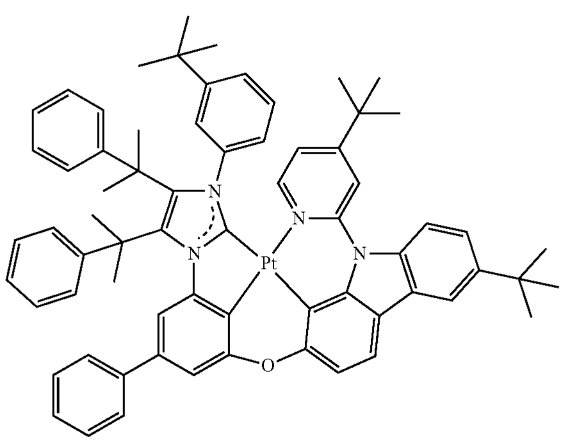
-continued
380
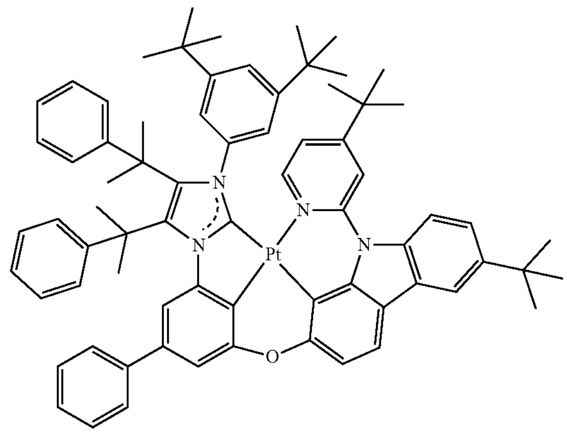
381
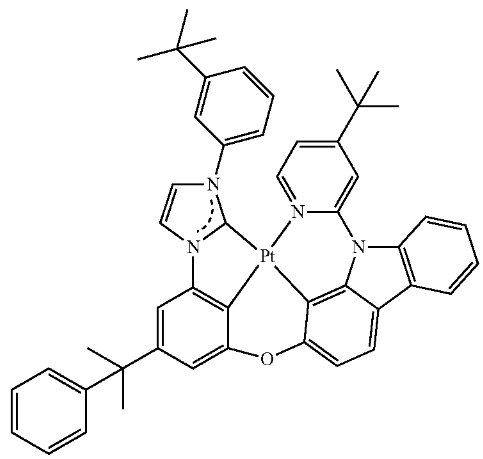
382
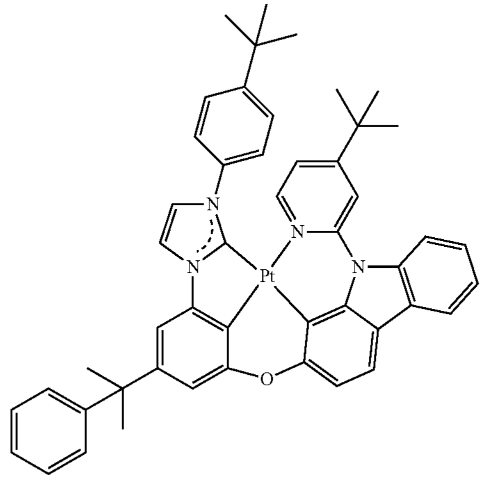

383
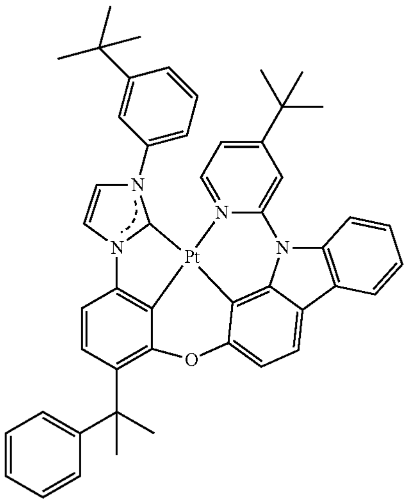
384
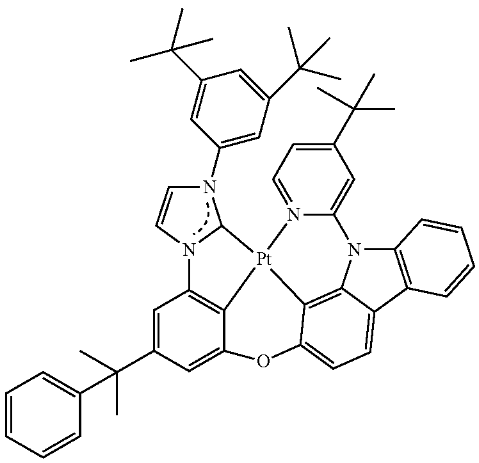
385
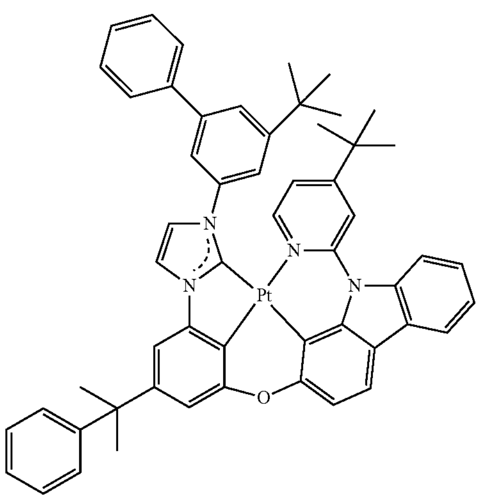
386
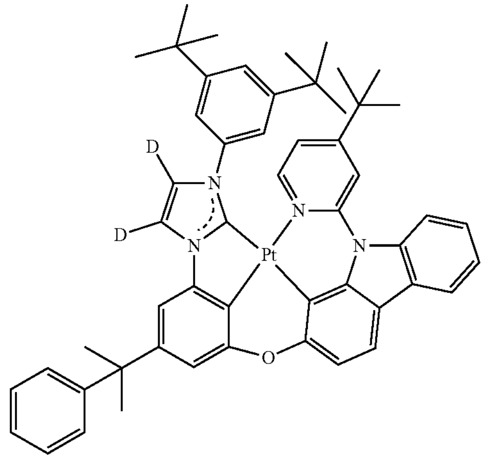
387
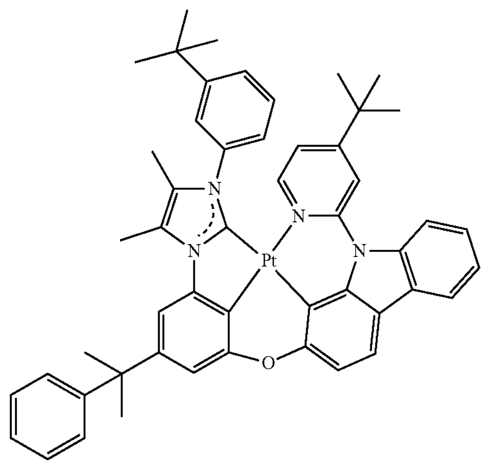
388
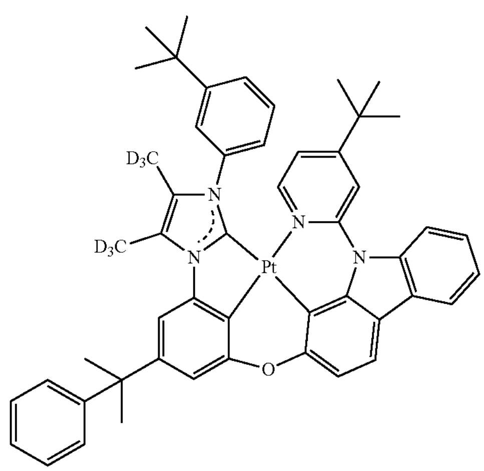

389
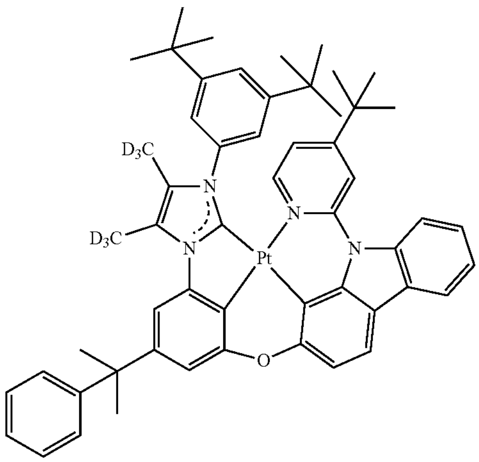
390
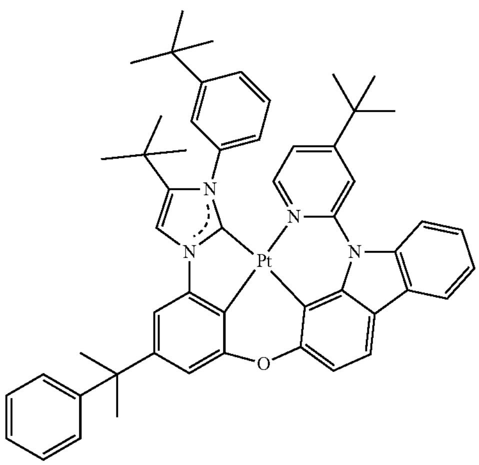
391
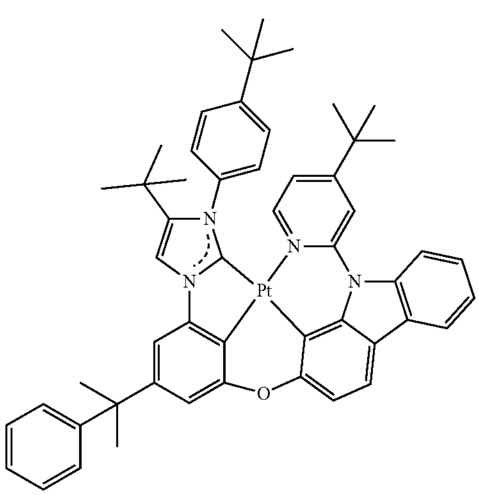
392
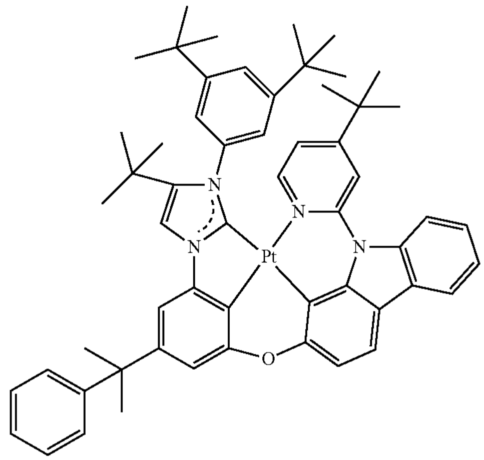
393
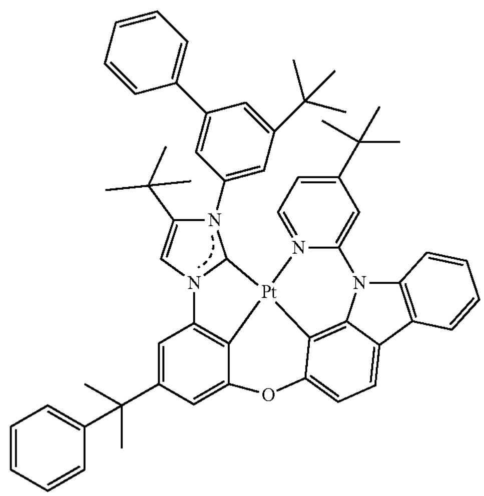
394
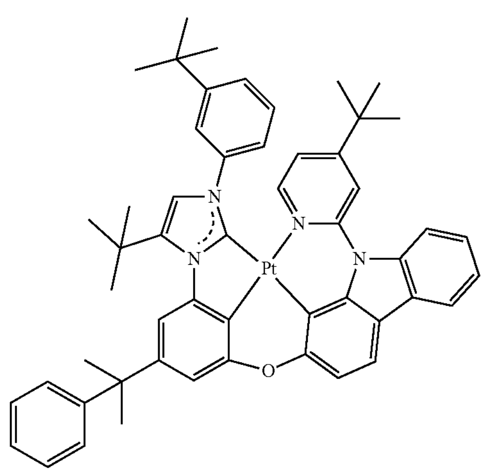

-continued
395
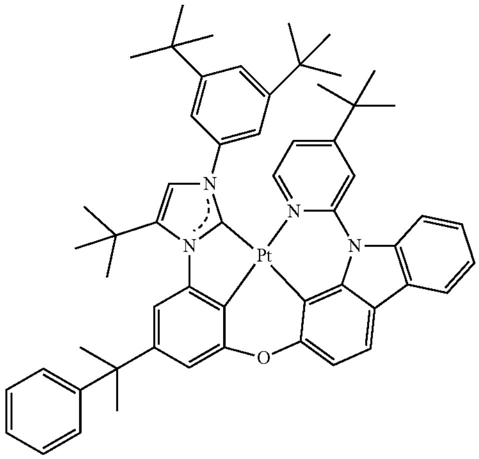
396
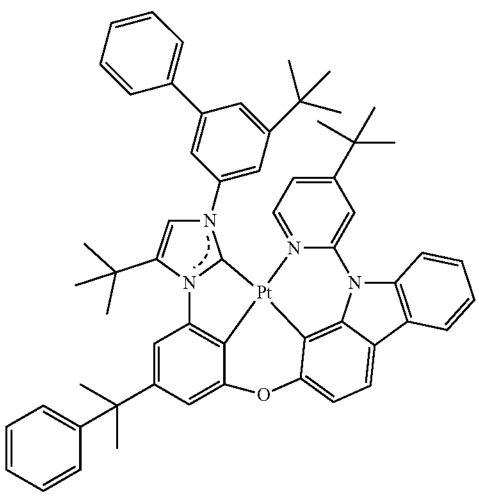
397
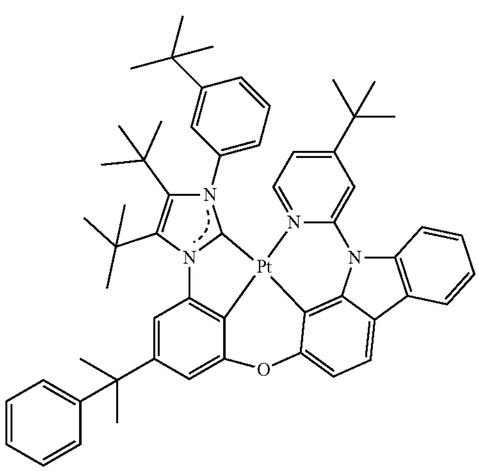
-continued
398
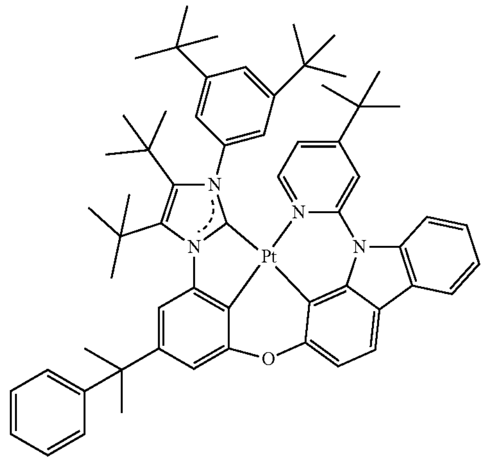
399
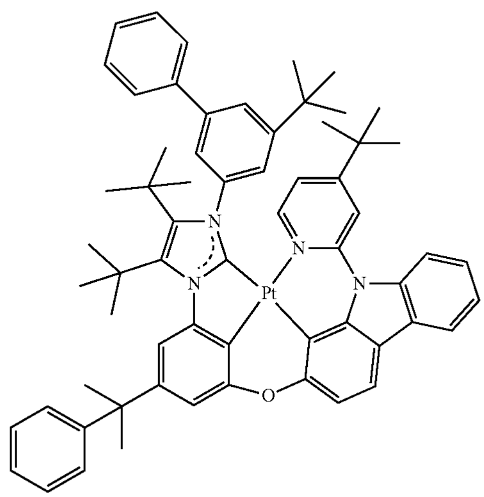
400
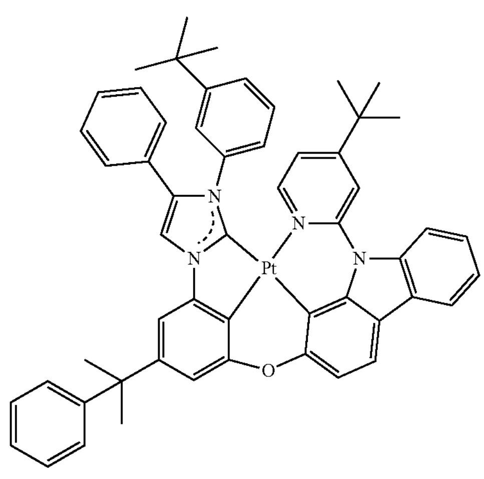

-continued
401
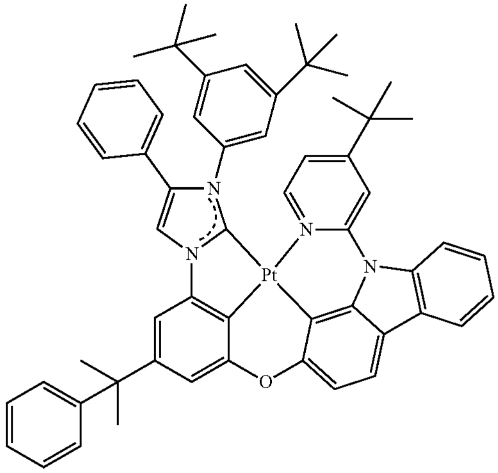
404
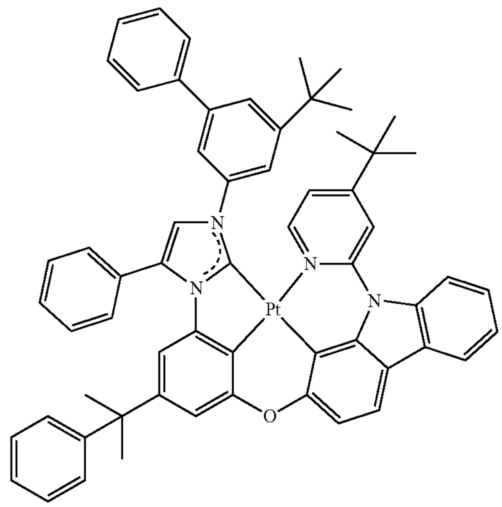
402
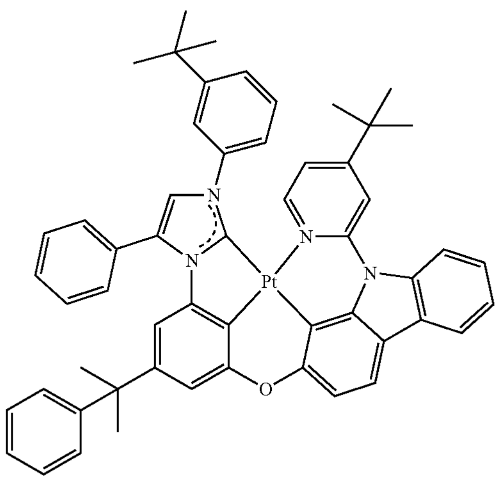
405
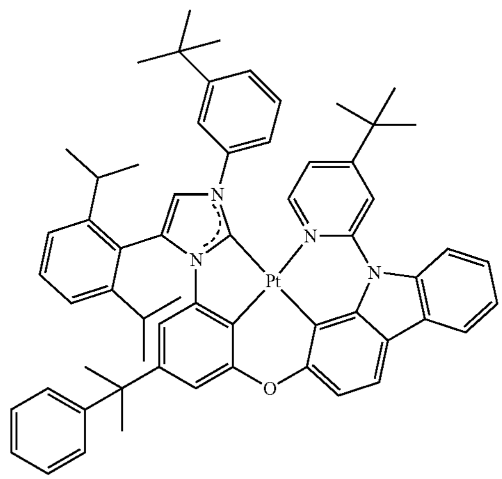
403
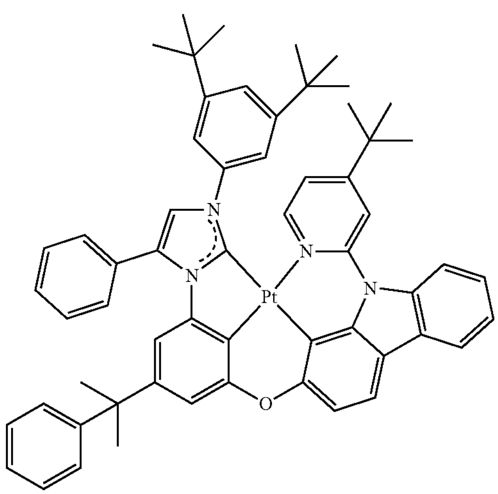
406
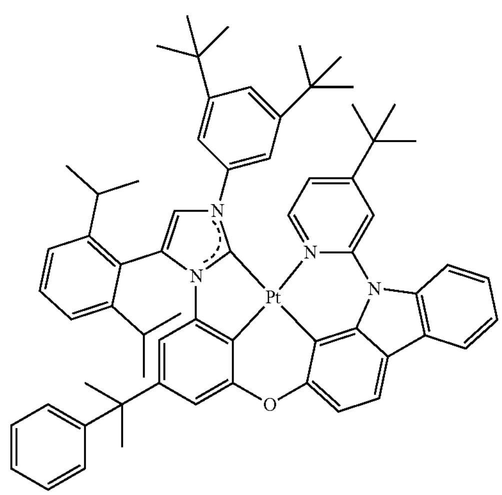

-continued
407
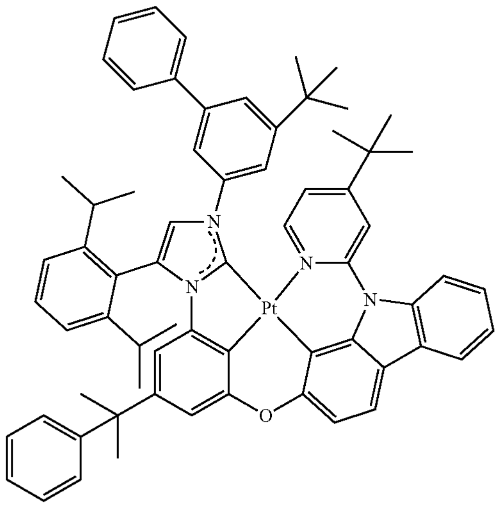
408
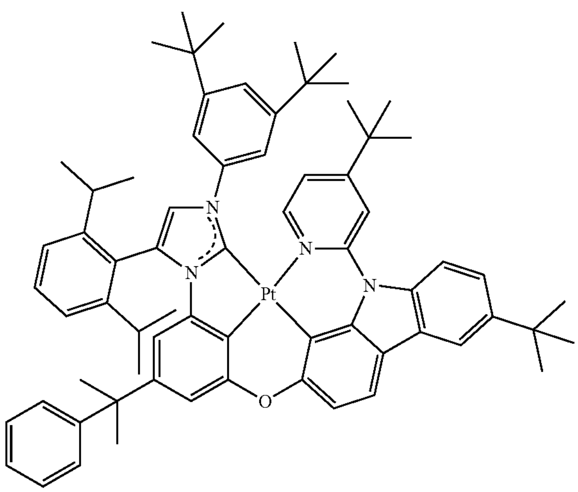
409
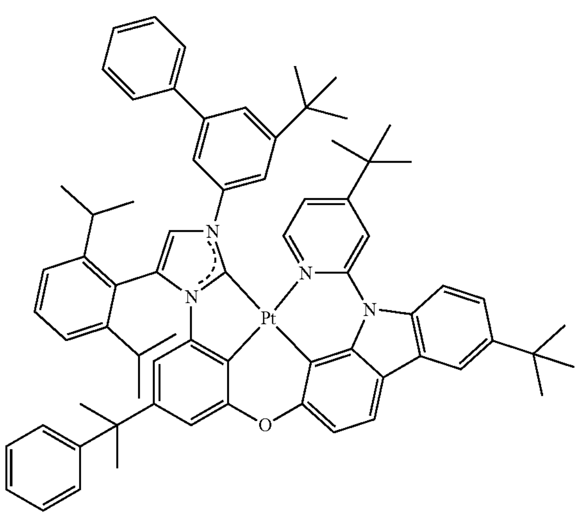
-continued
410
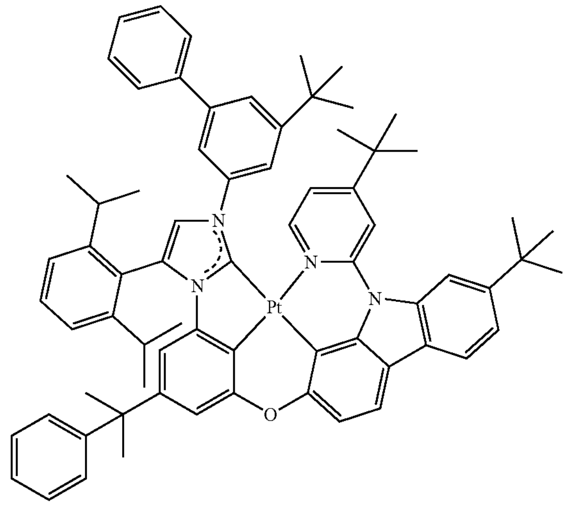
411
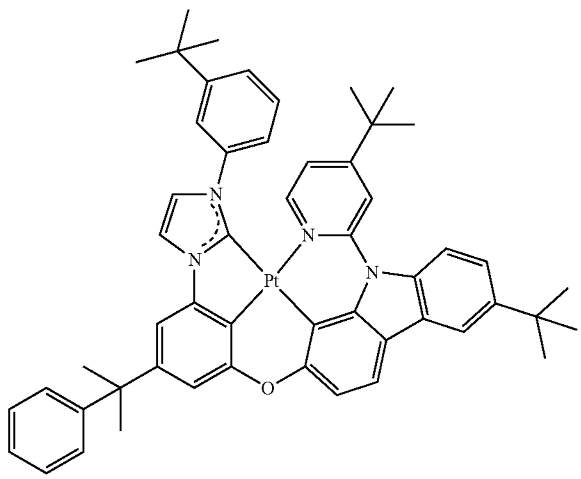
412
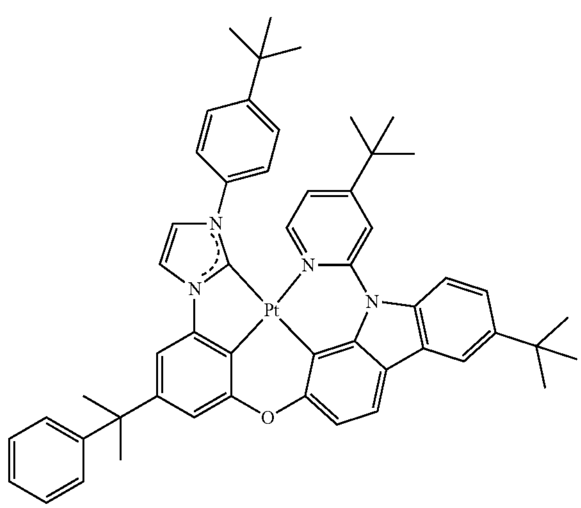

-continued
413
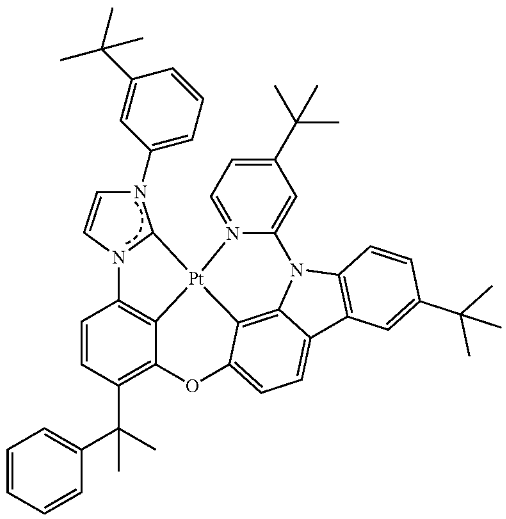
414
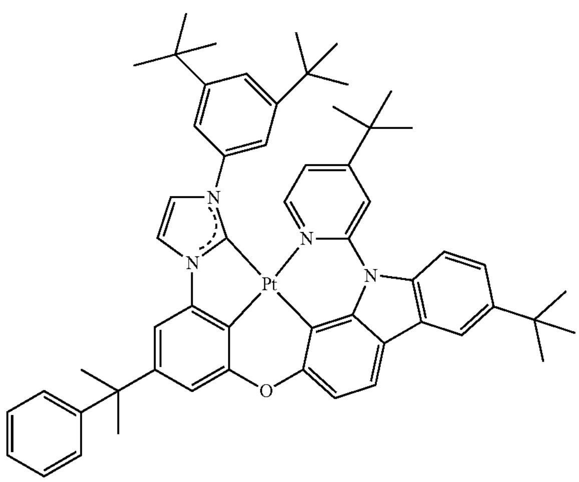
415
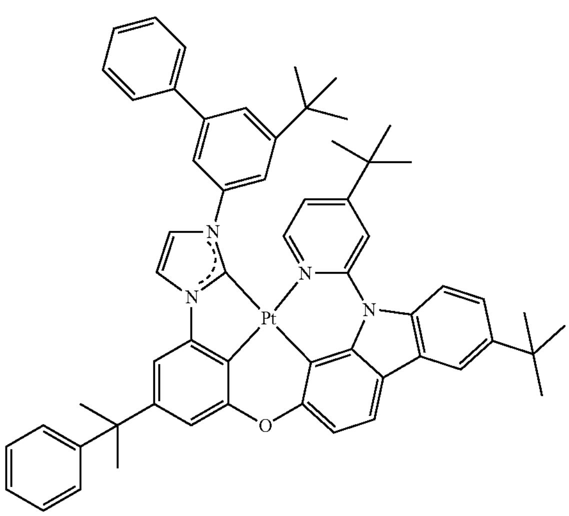
-continued
416
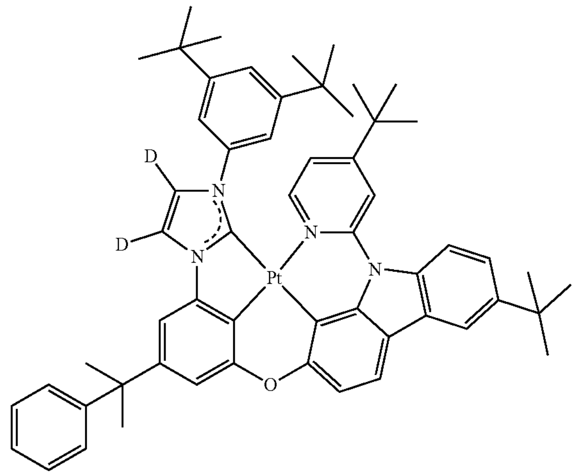
417
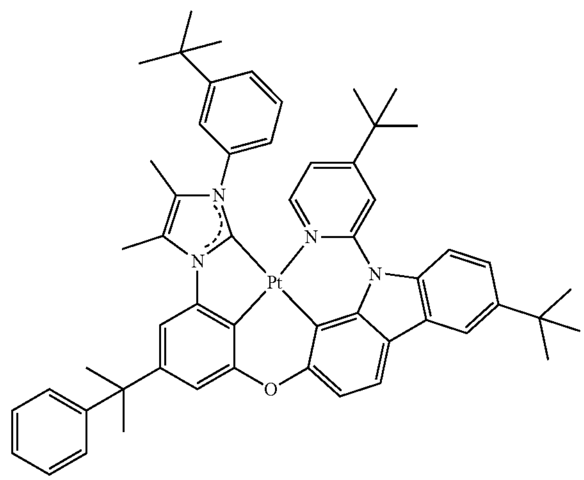
418
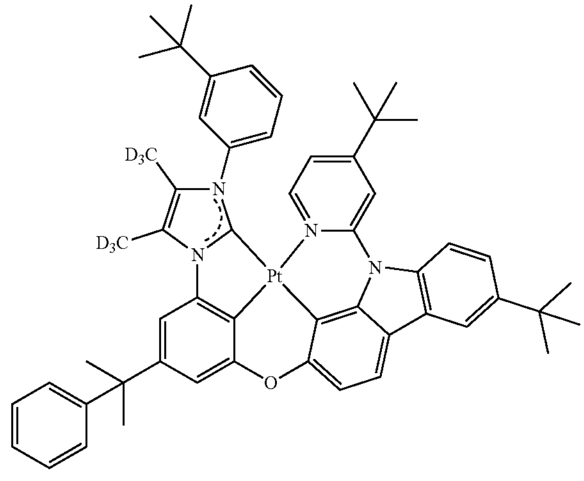

-continued
419
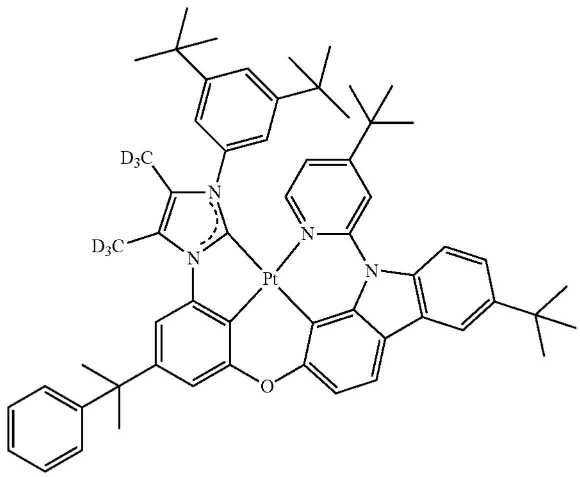
420
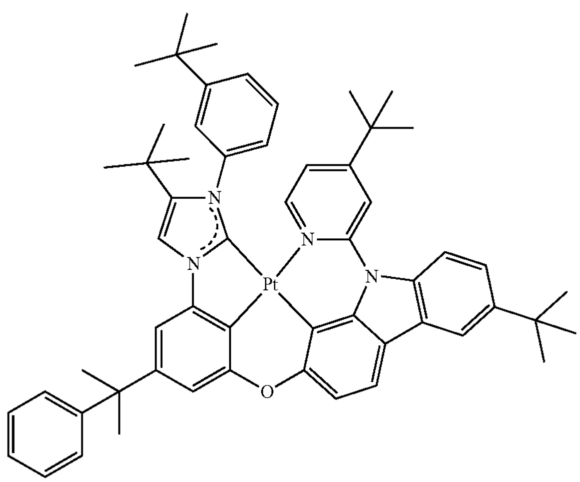
421
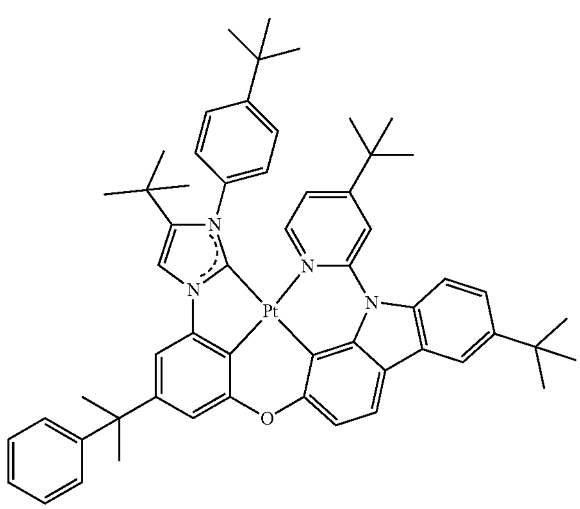
-continued
422
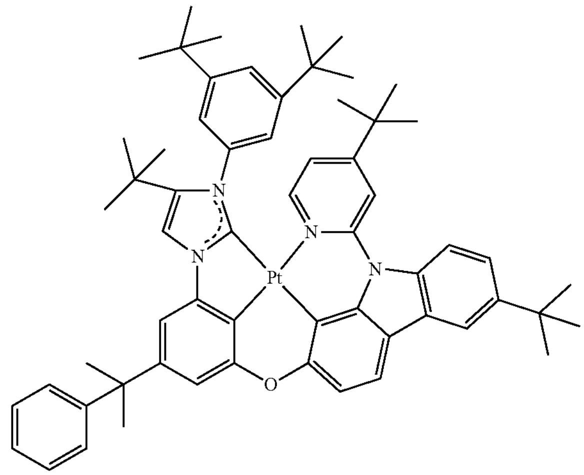
423
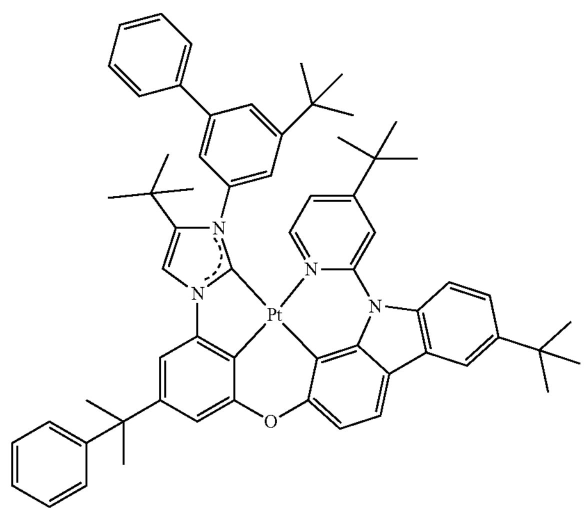
424
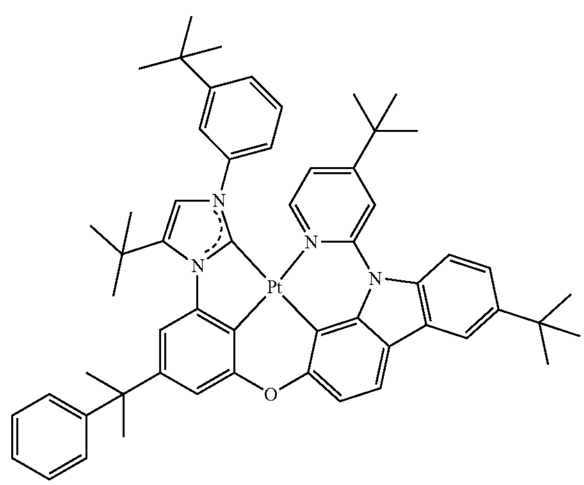

-continued
425
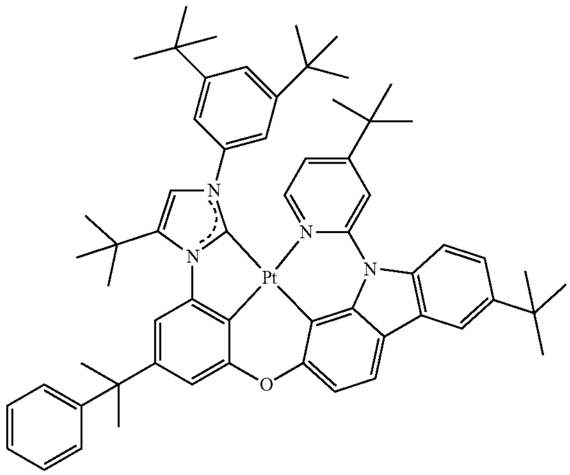
428
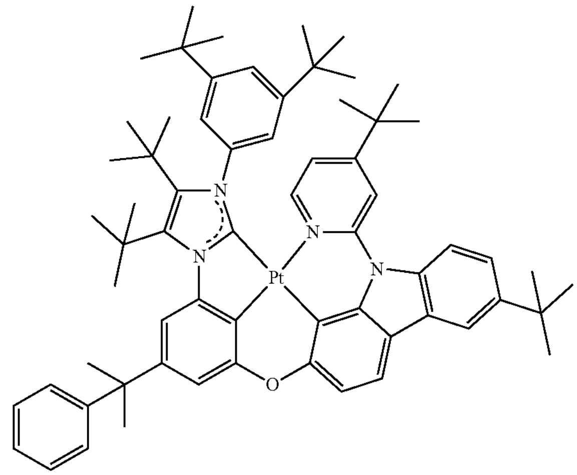
426
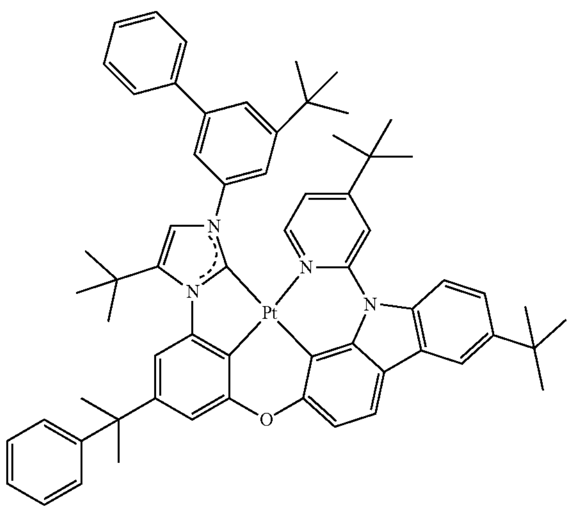
429
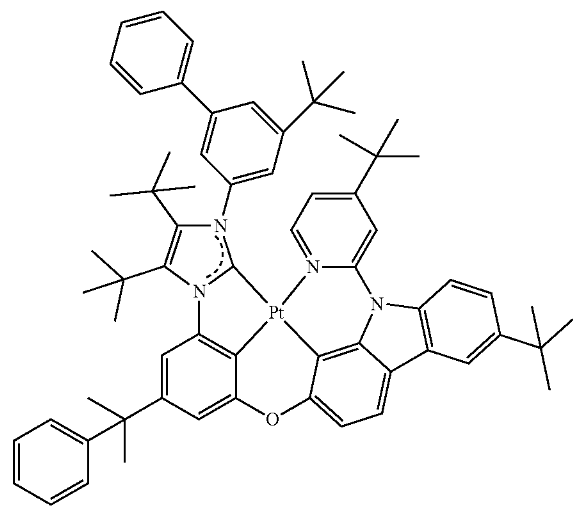
427
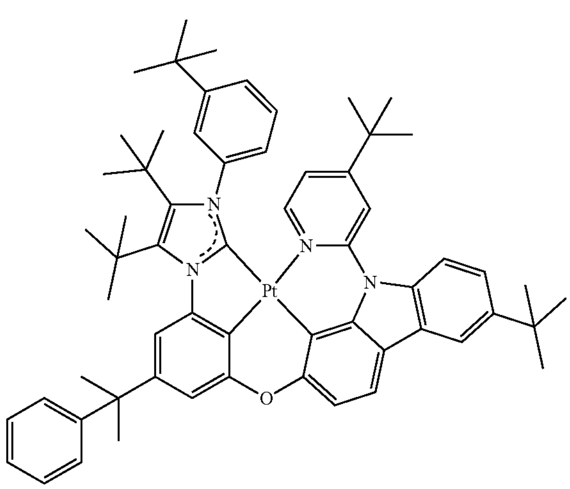
430
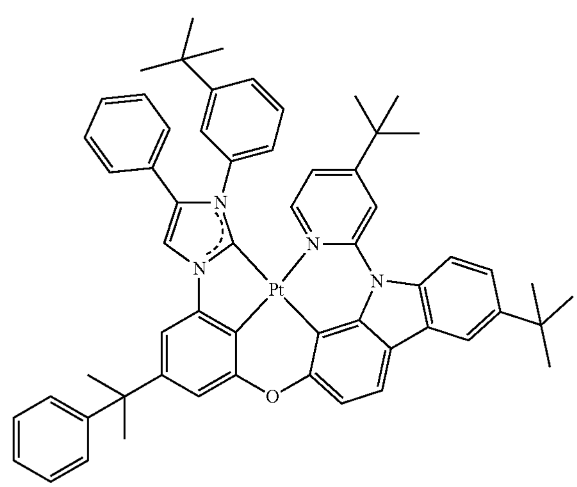

-continued
431
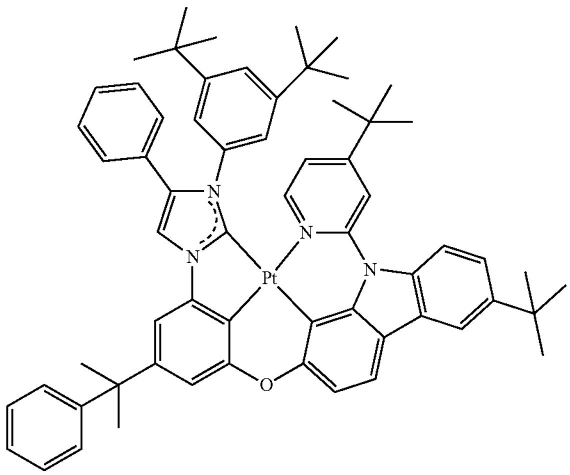
432
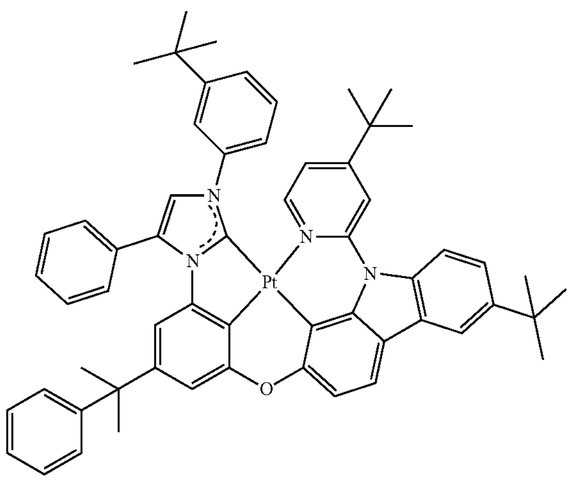
433
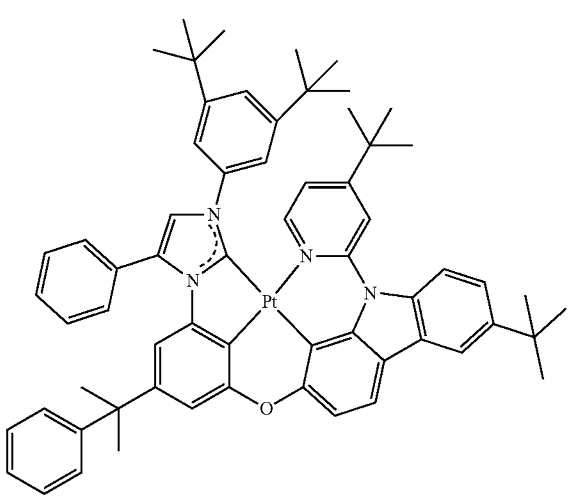
-continued
434
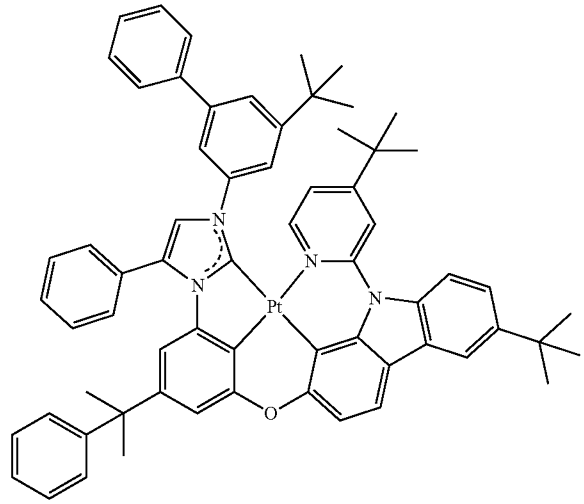
435
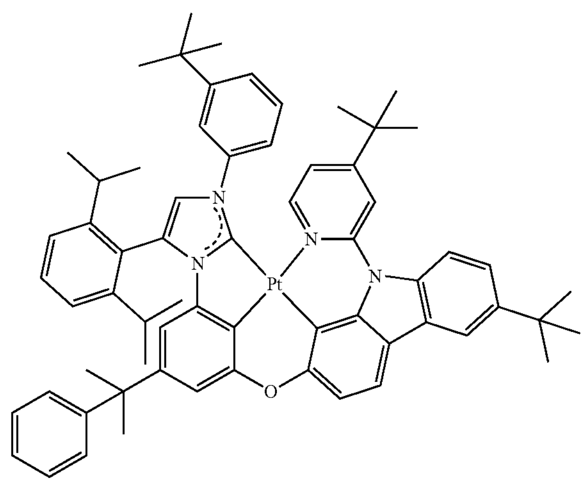
436
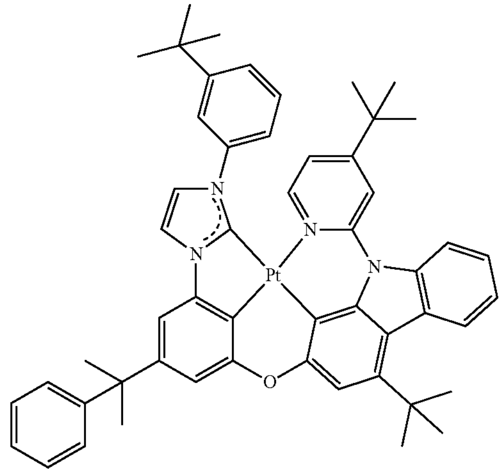

-continued
437
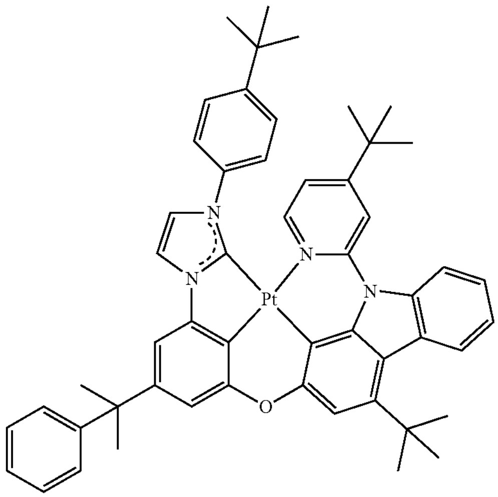
438
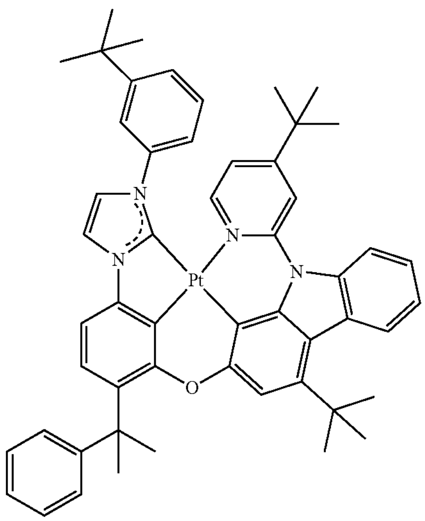
439
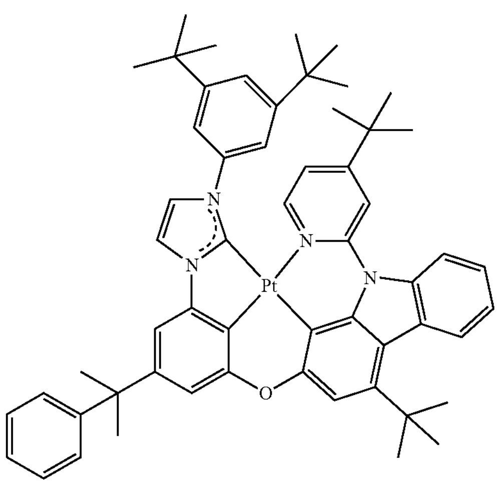
-continued
440
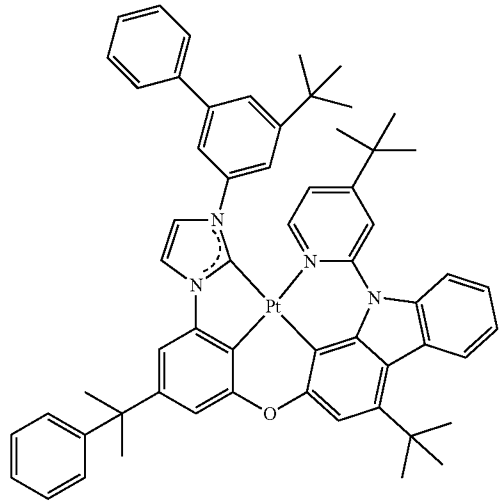
441
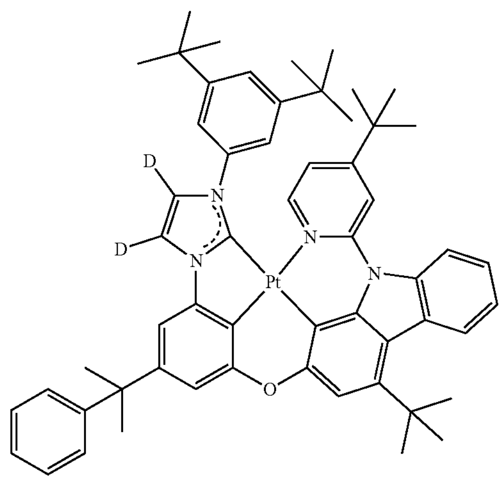
442
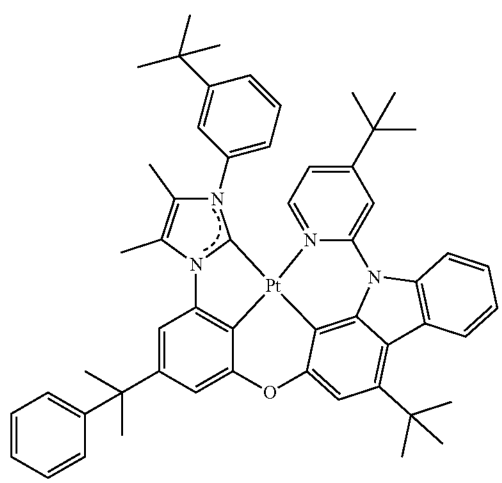

443
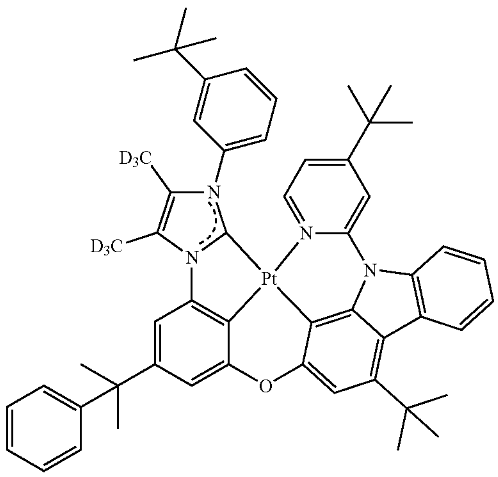
444
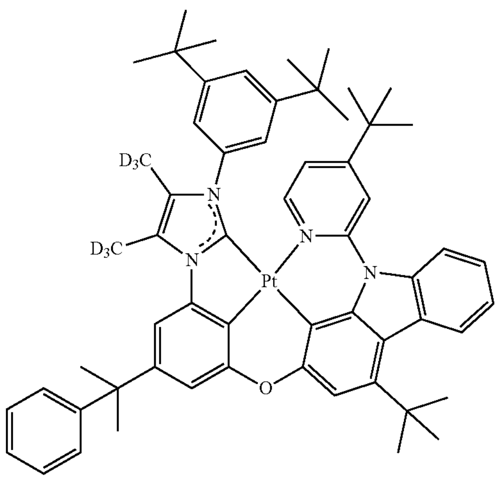
445
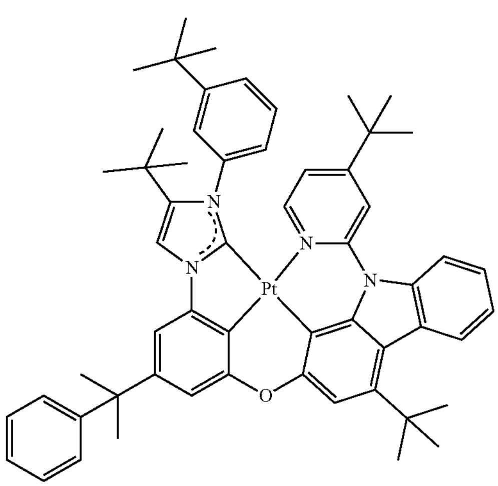
446
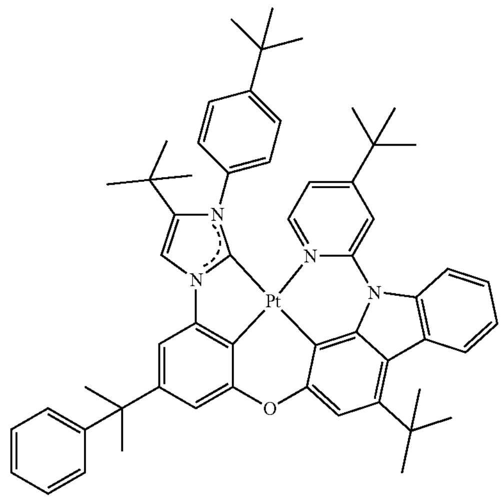
447
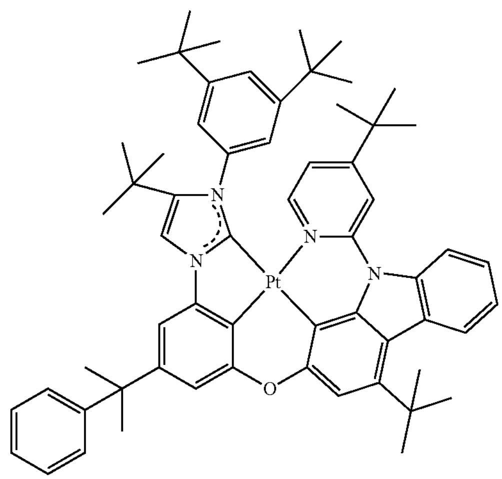
448
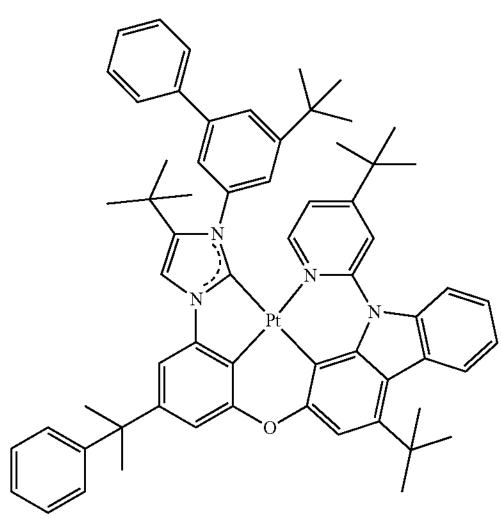

-continued
449
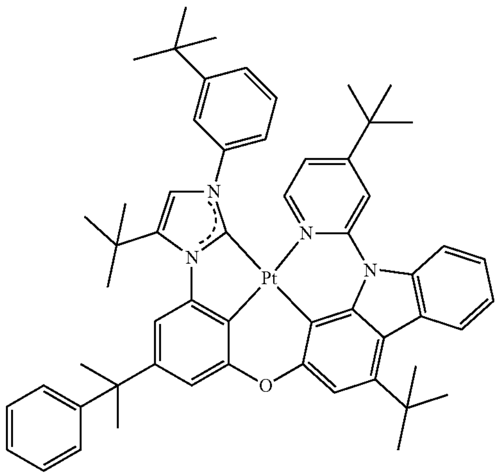
450
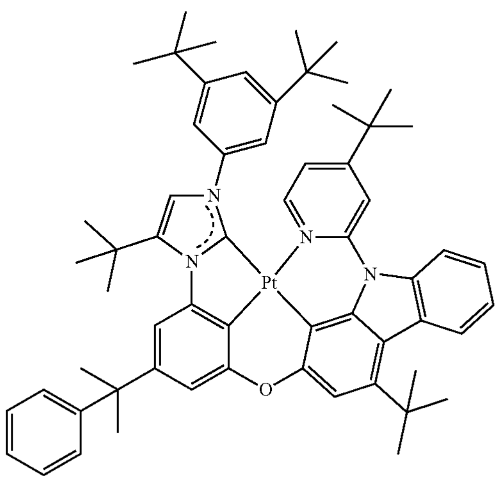
451
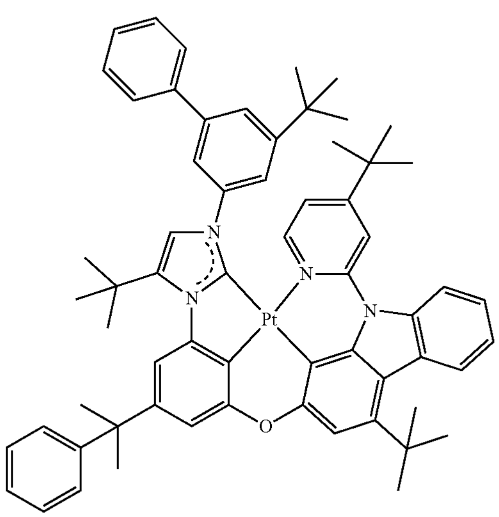
-continued
452
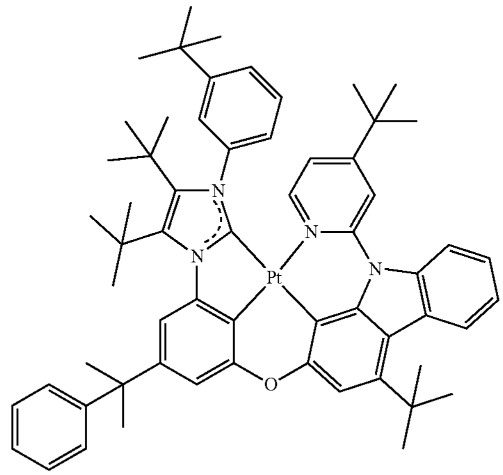
453
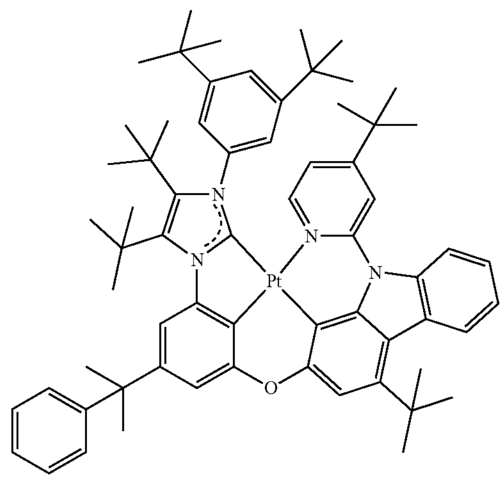
454
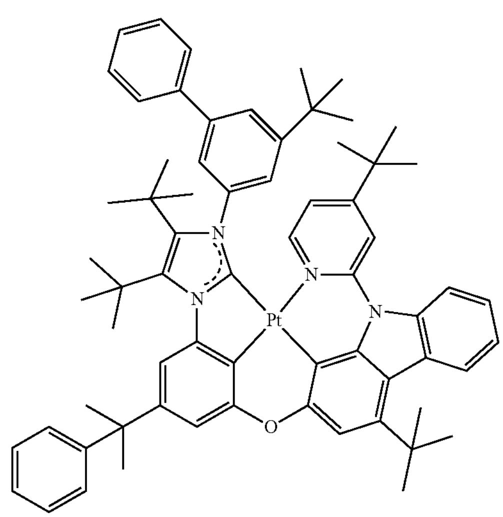

-continued
455
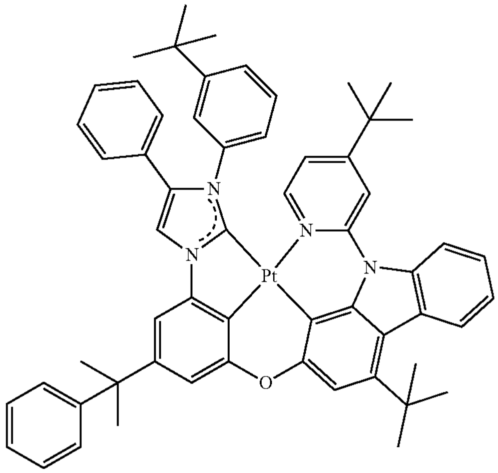
456
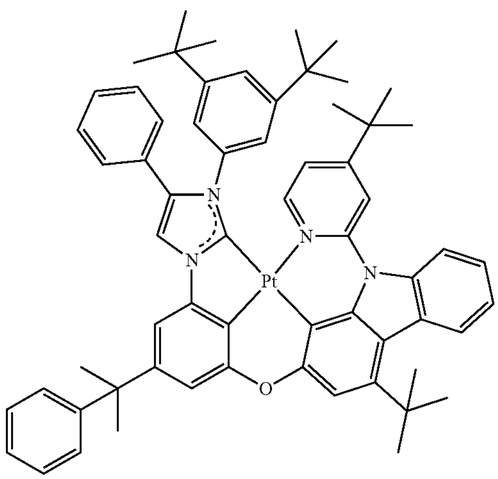
457
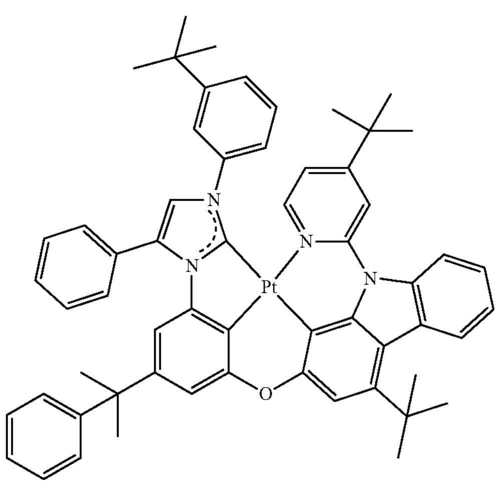
-continued
458
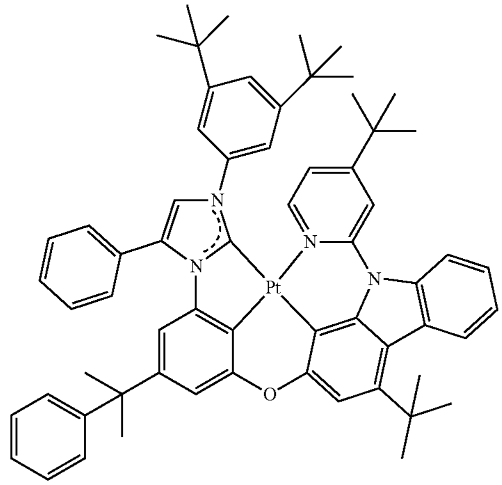
459
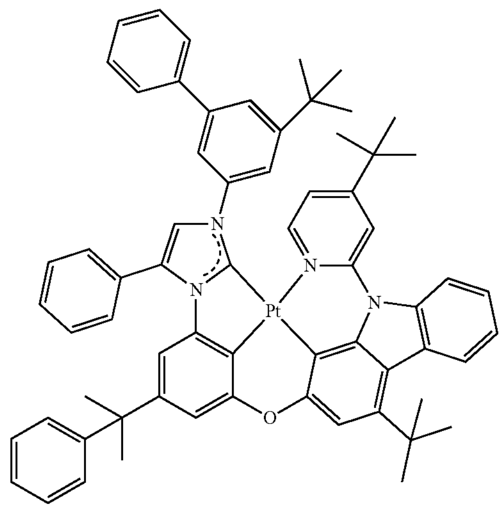
460
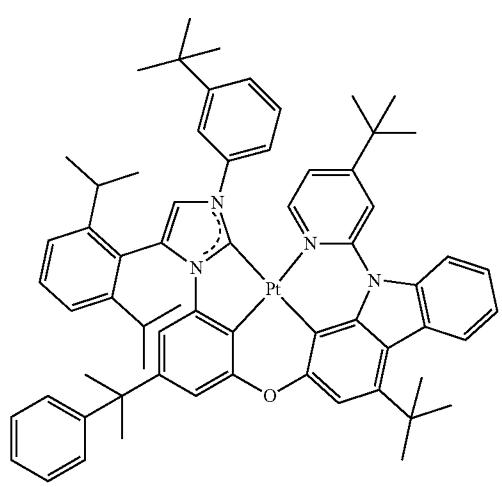

-continued
461
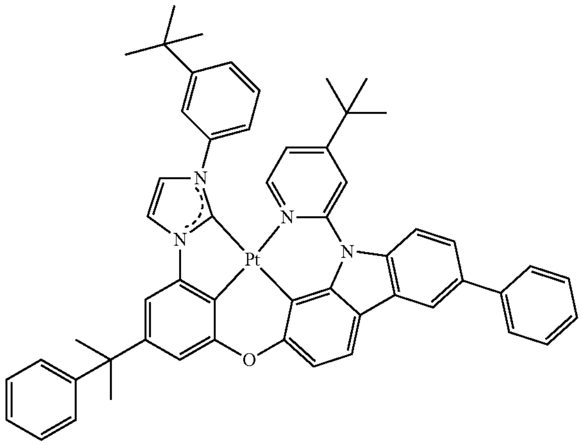
462
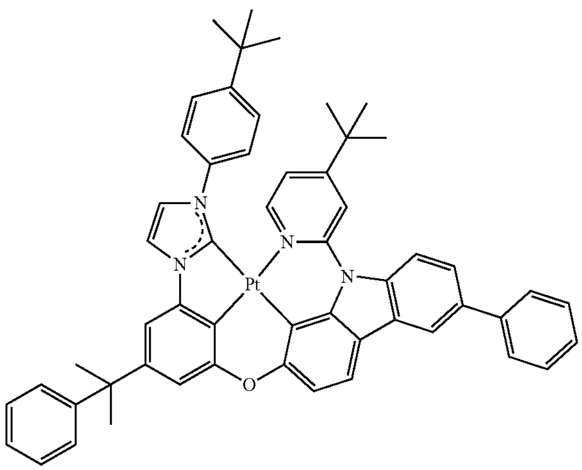
463
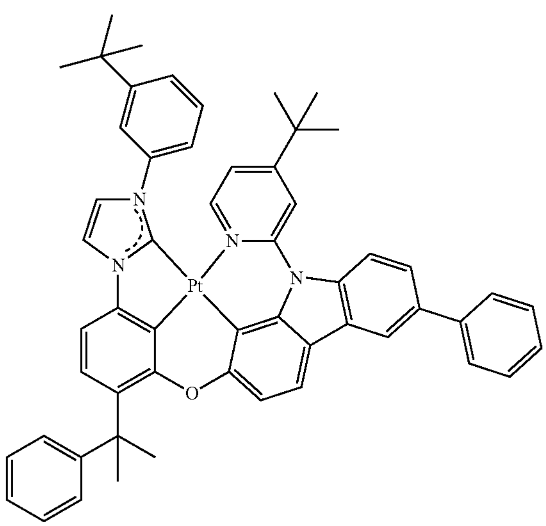
-continued
464
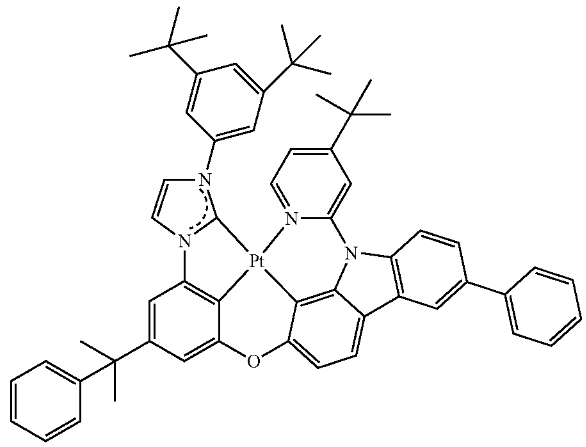
465
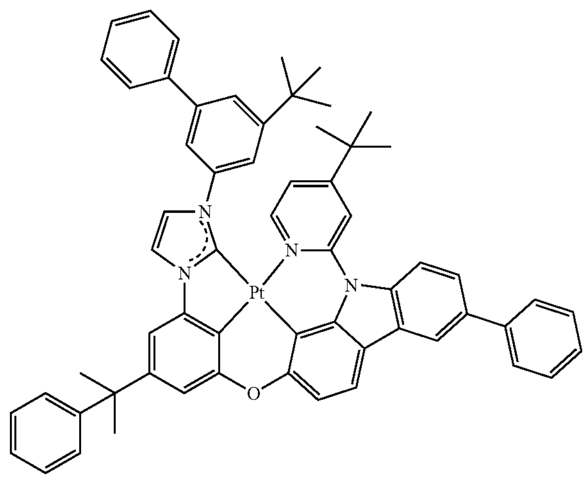
466
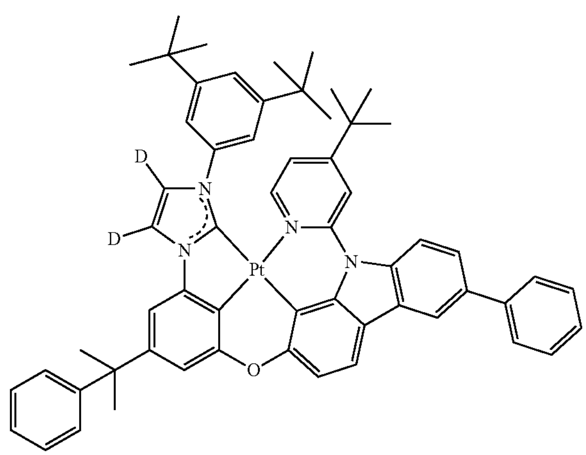

-continued
467
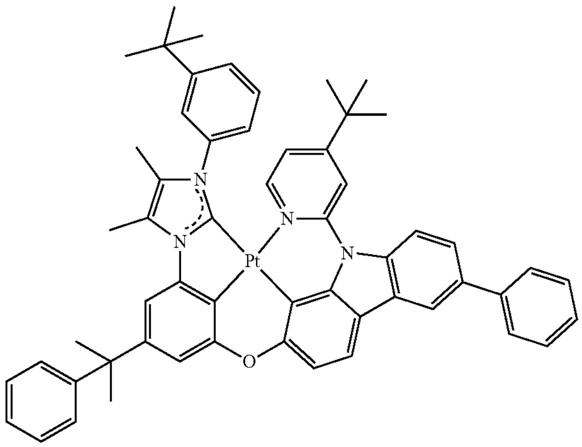
468
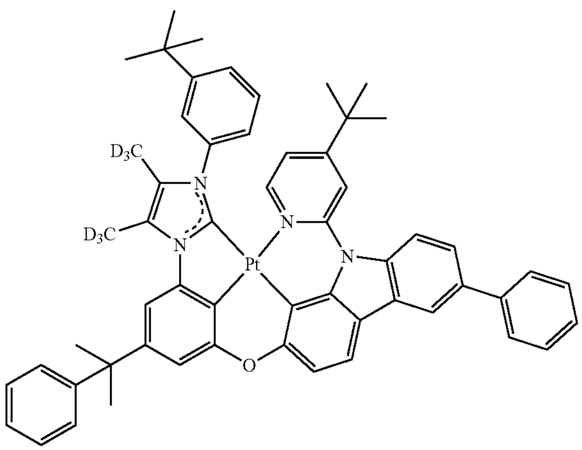
469
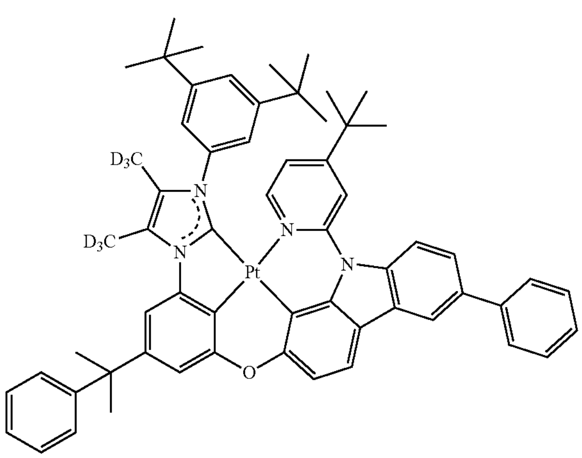
-continued
470
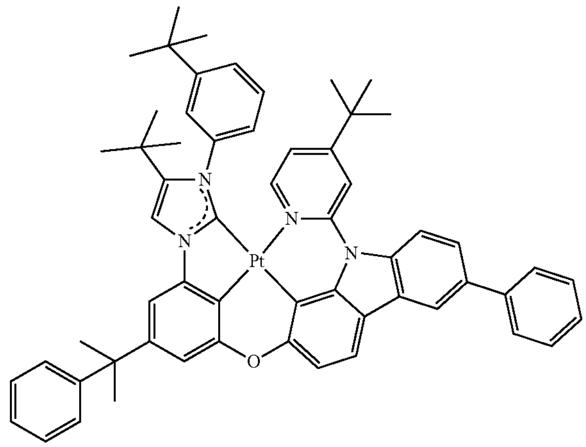
471
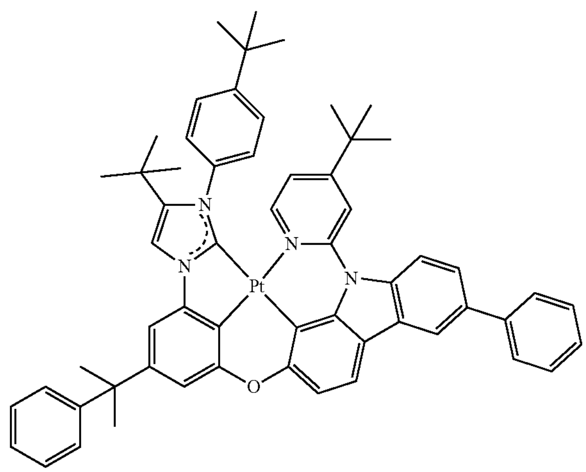
472
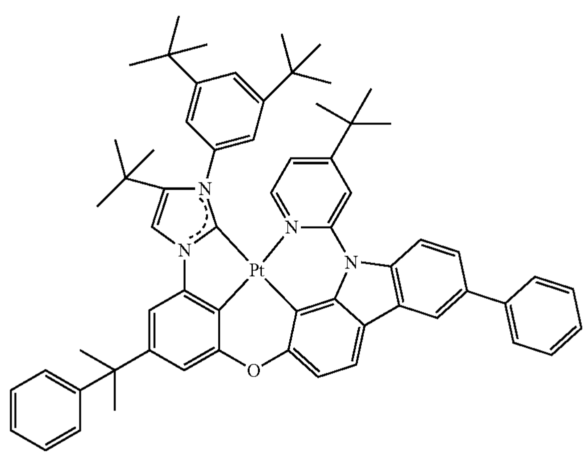

-continued
473
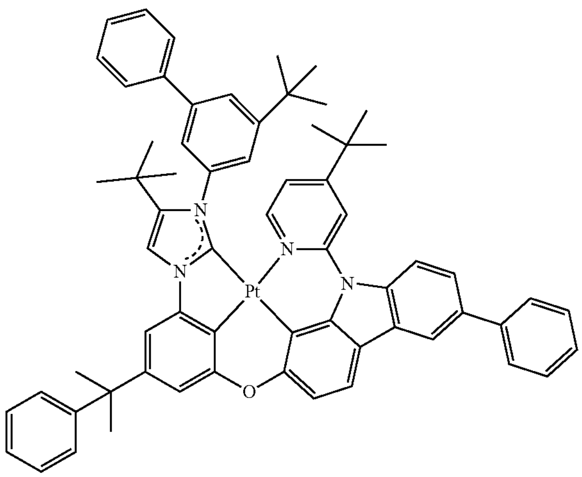
474
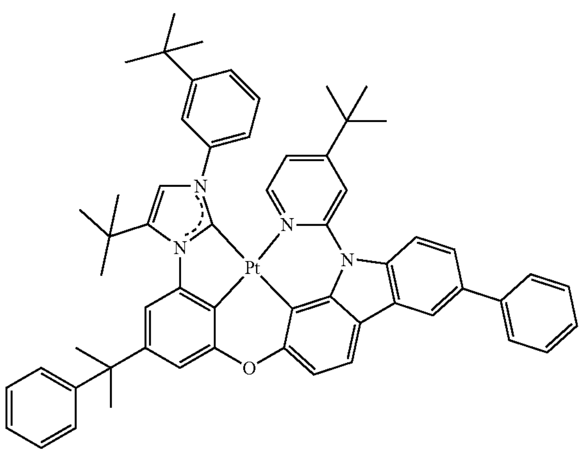
475
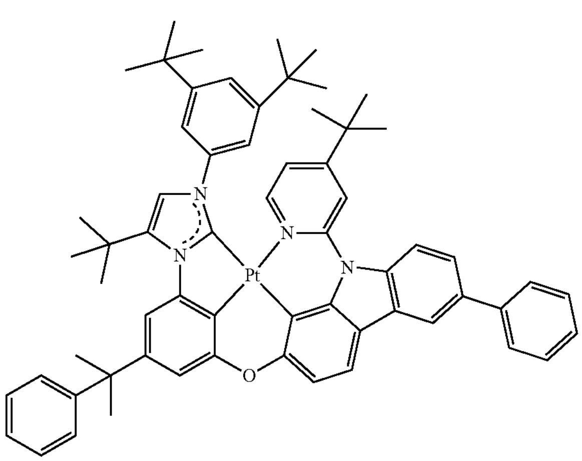
-continued
476
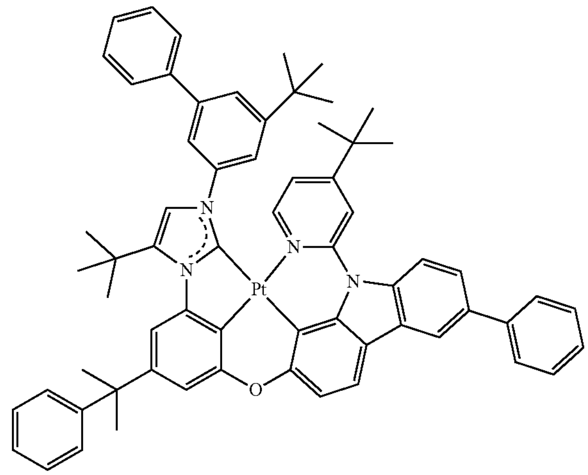
477
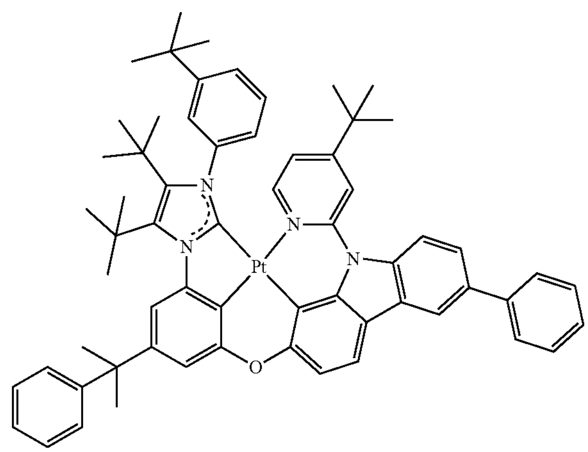
478
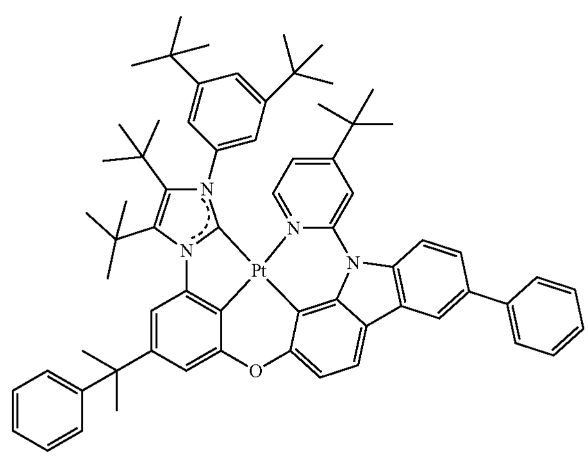

-continued
479
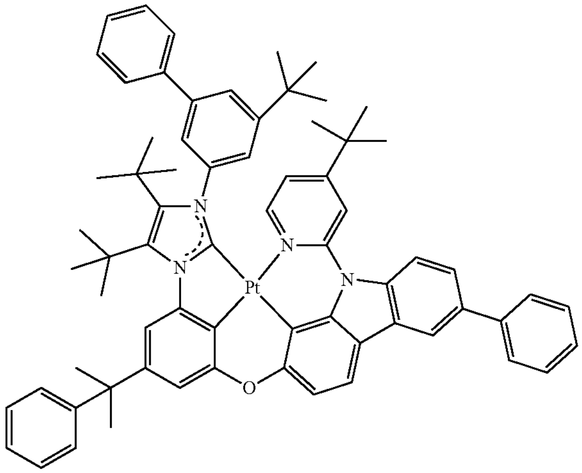
480
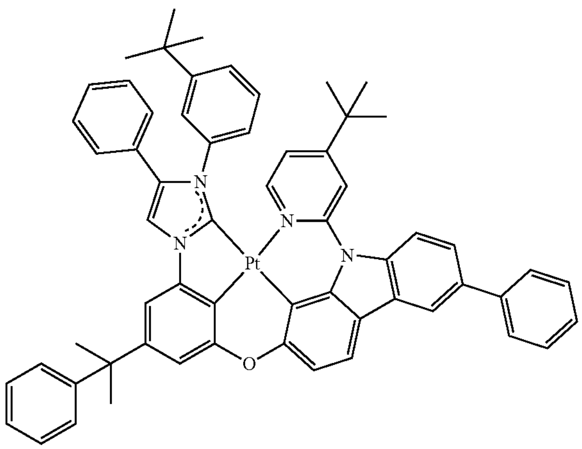
481
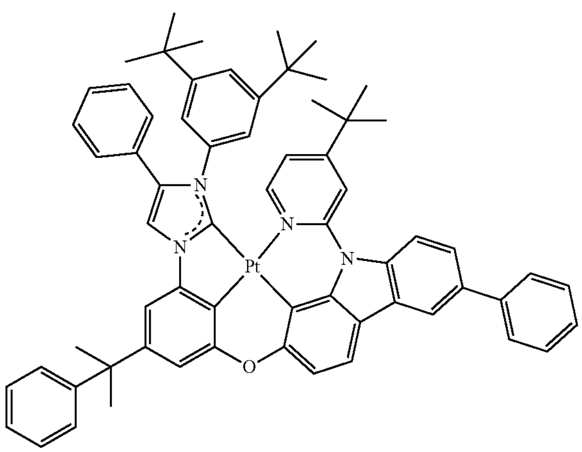
-continued
482
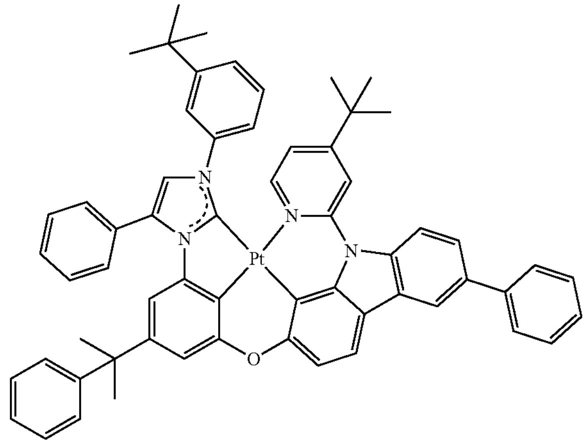
483
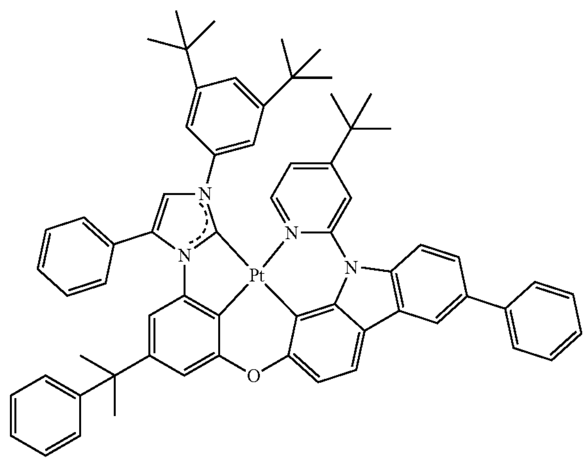
484
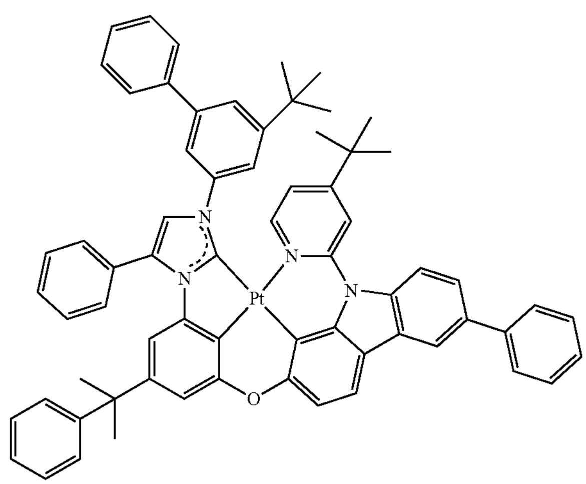

485
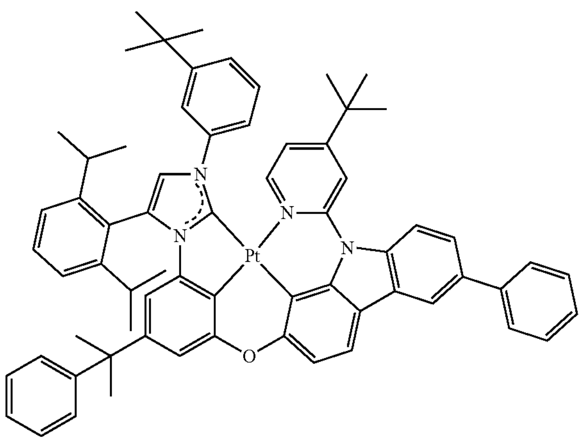
486
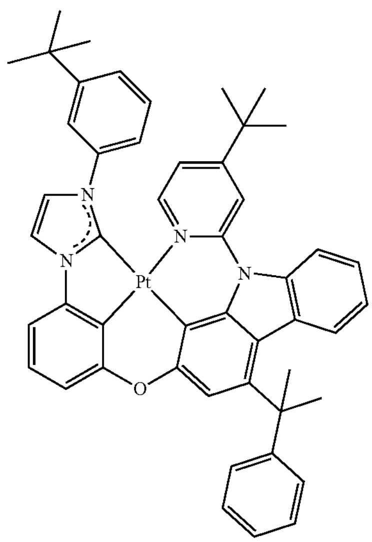
487
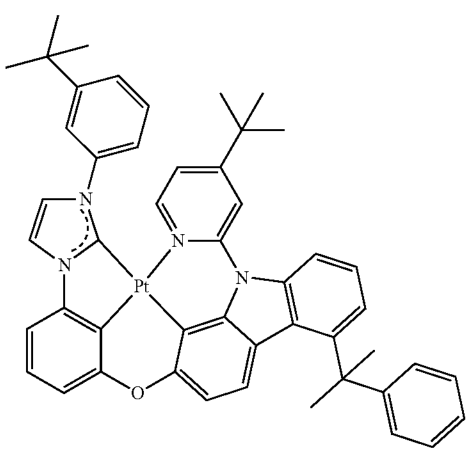
488
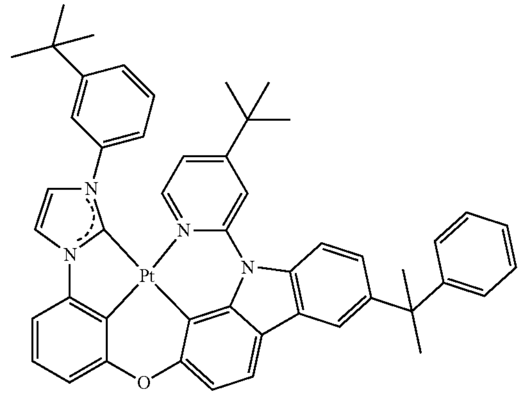
489
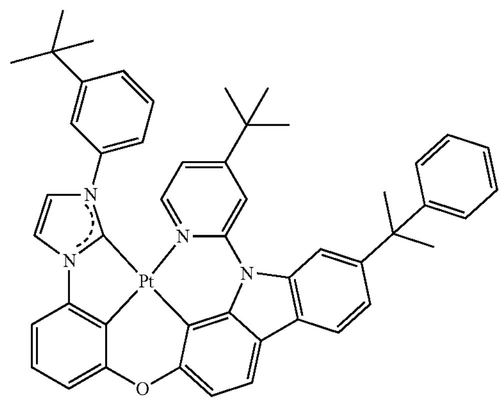
490
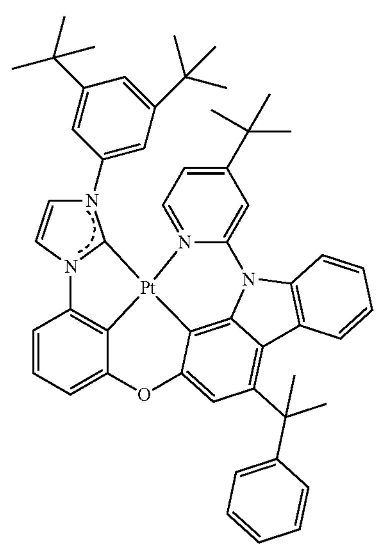

-continued
491
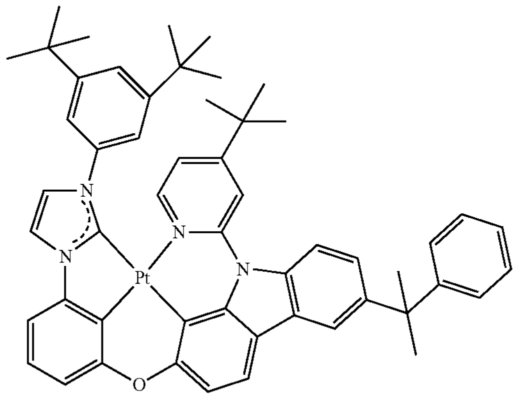
492
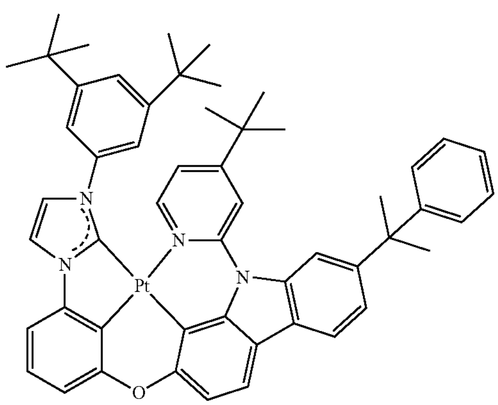
493
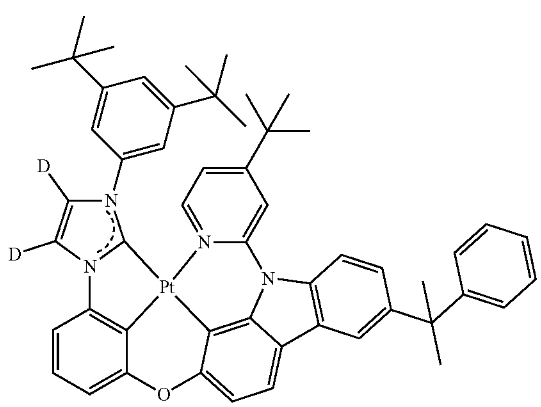
-continued
494
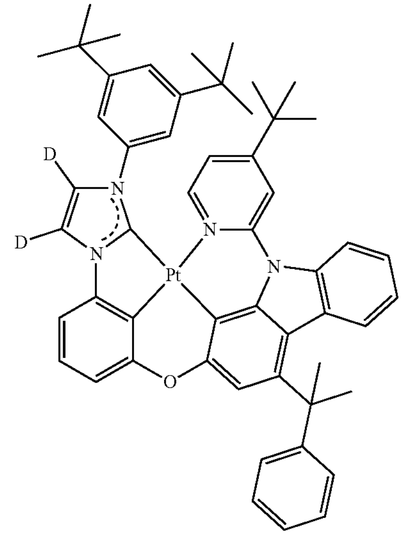
495
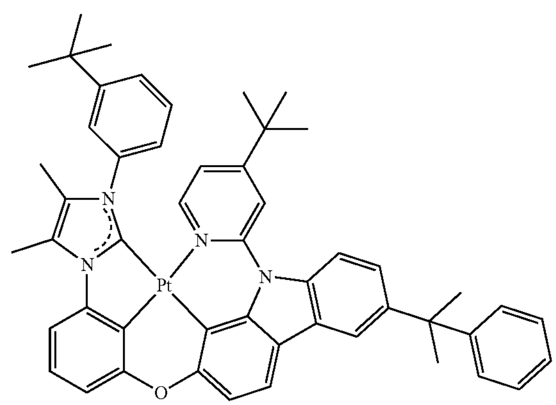
496
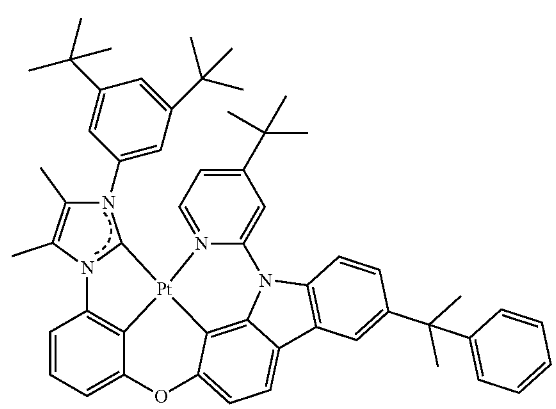

497
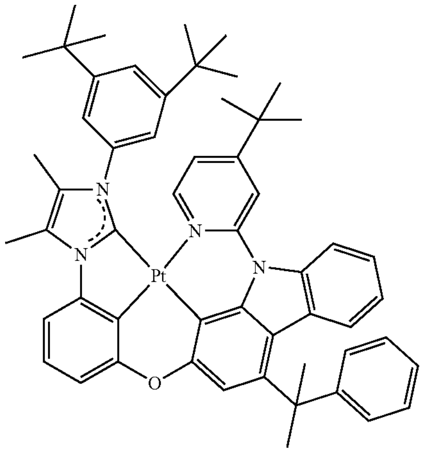
498
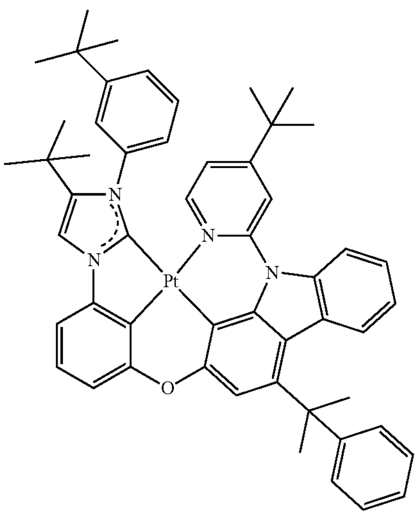
499
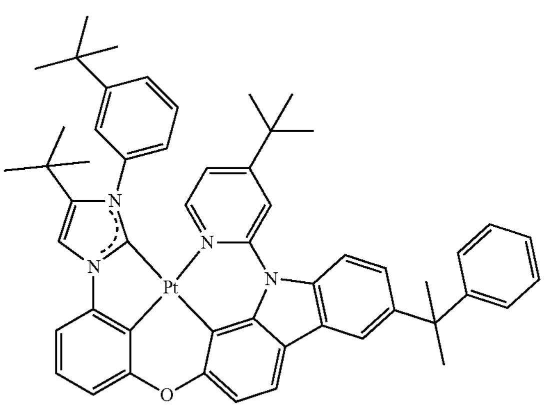
500
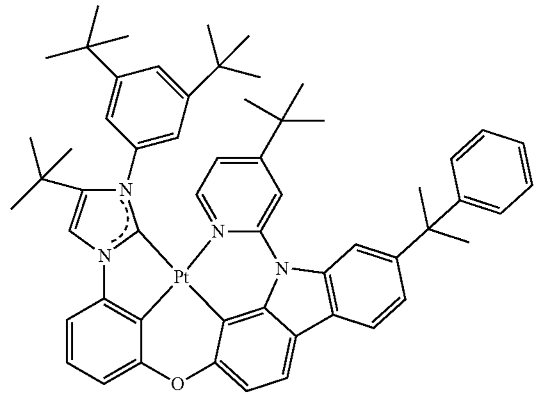
501
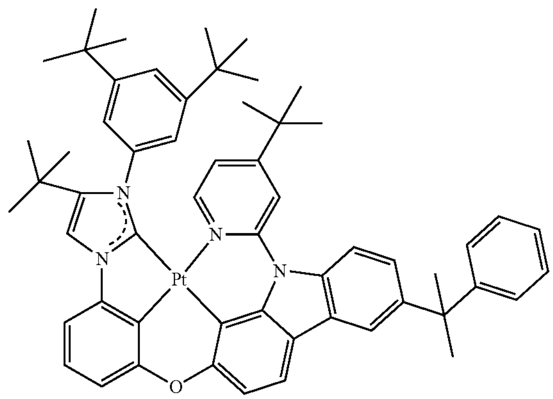
502
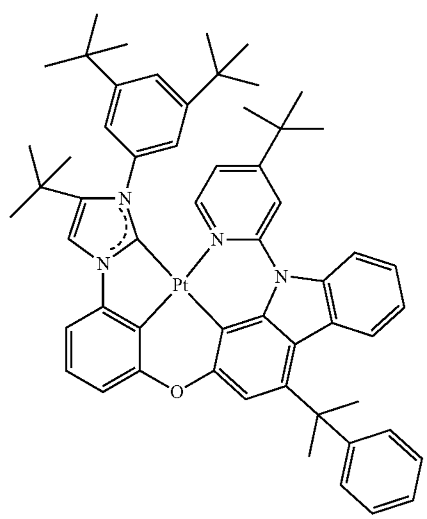

-continued
503
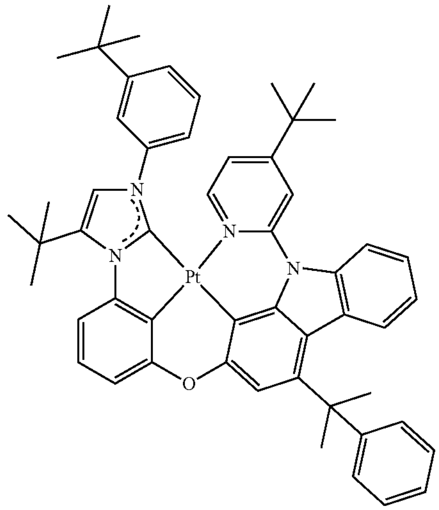
504
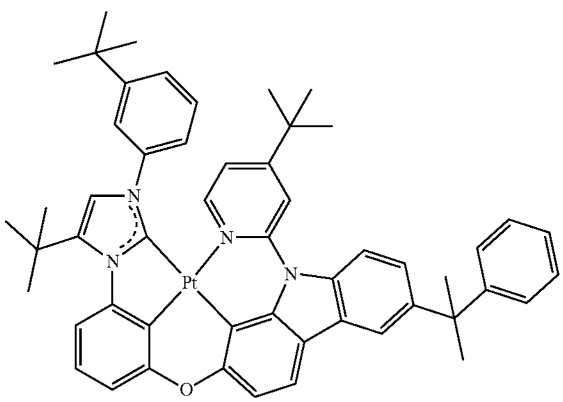
505
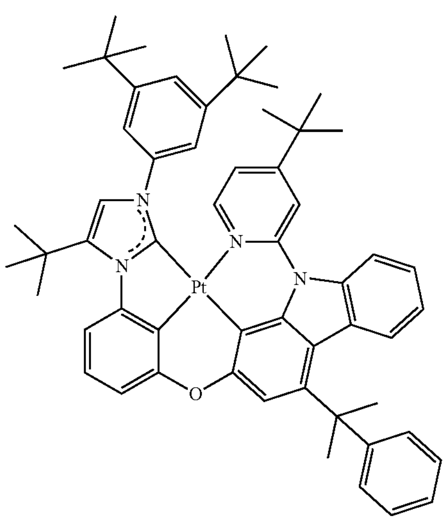
-continued
506
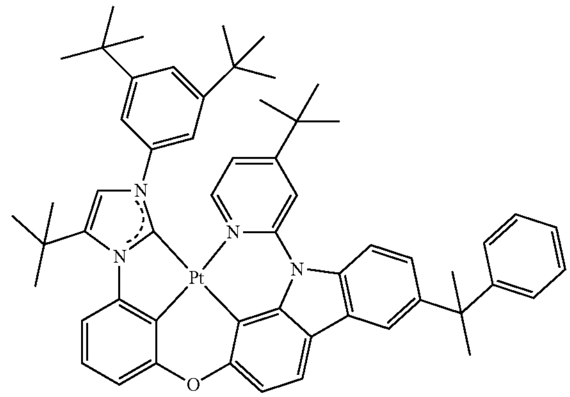
507
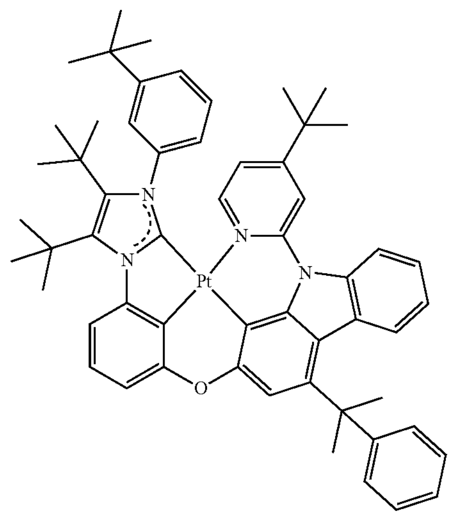
508
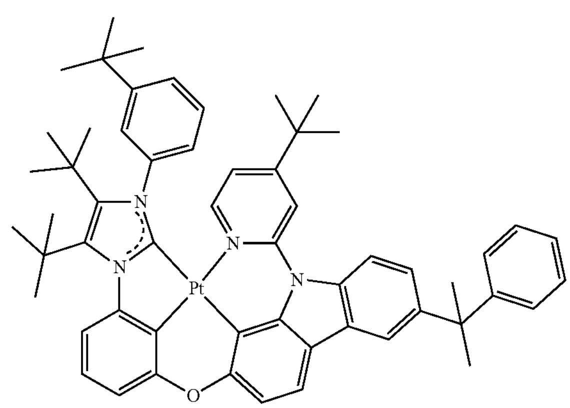

-continued
509
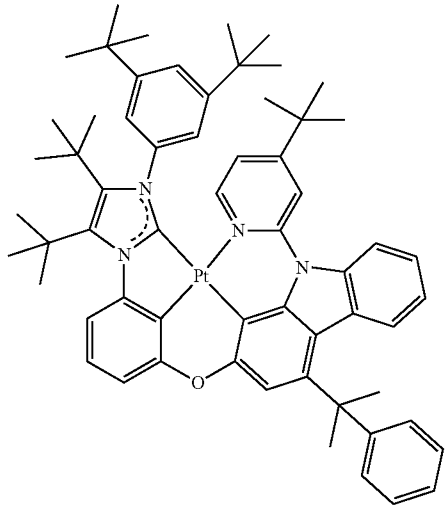
510
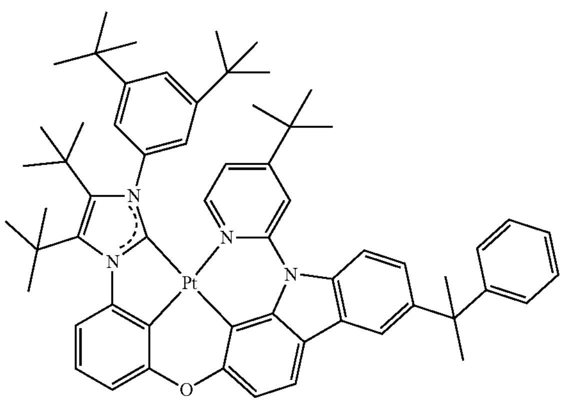
511
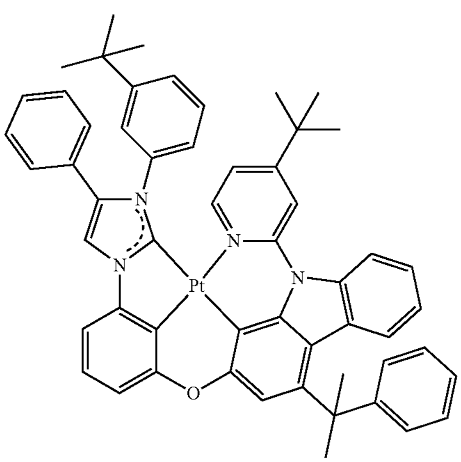
-continued
512
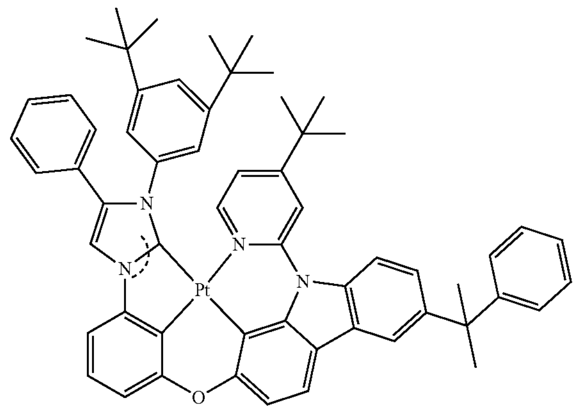
513
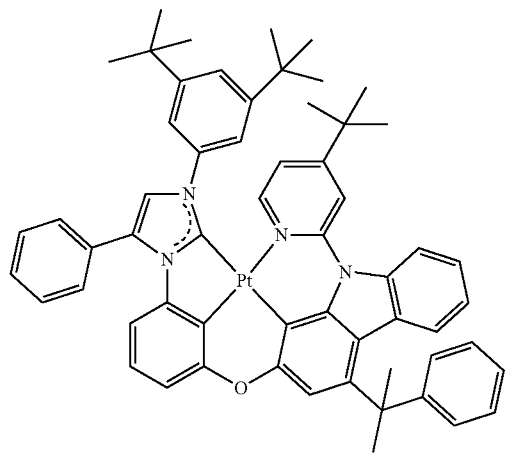
514
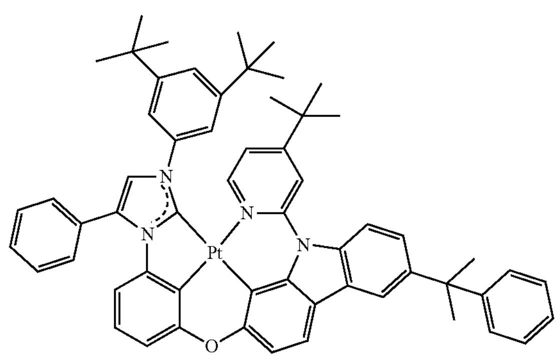

-continued
515
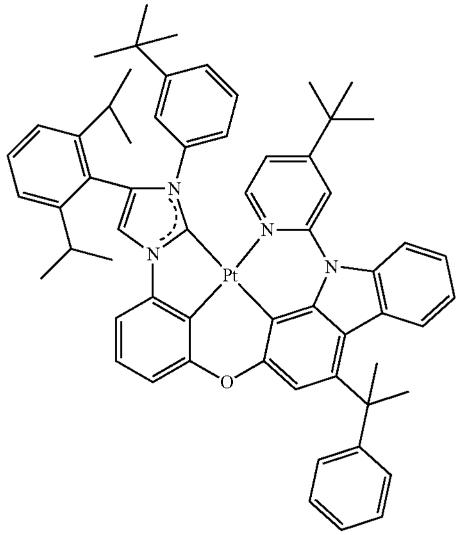
516
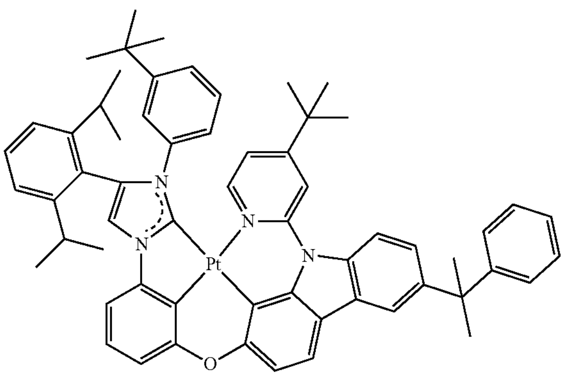
517
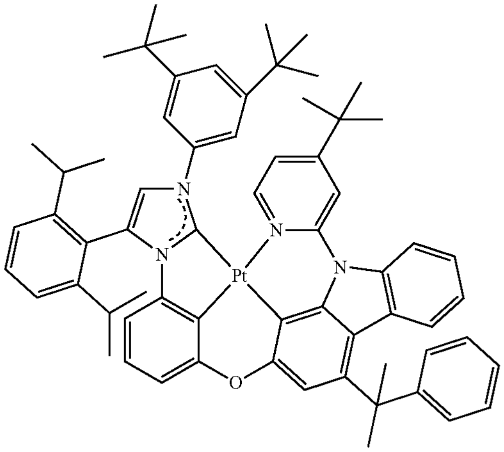
-continued
518
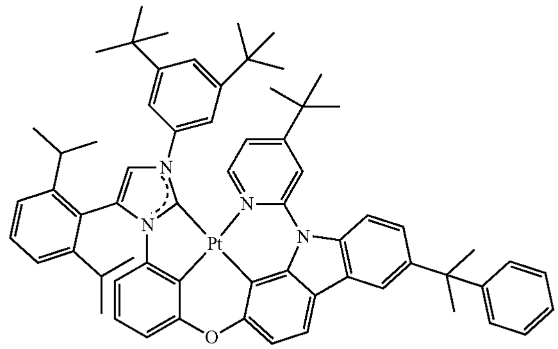
519
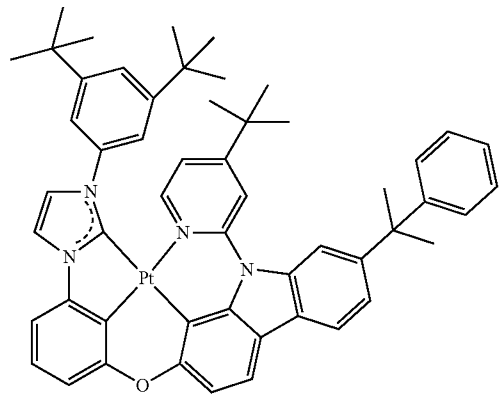
520
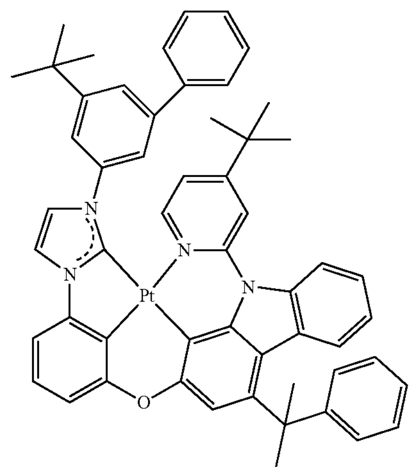
521
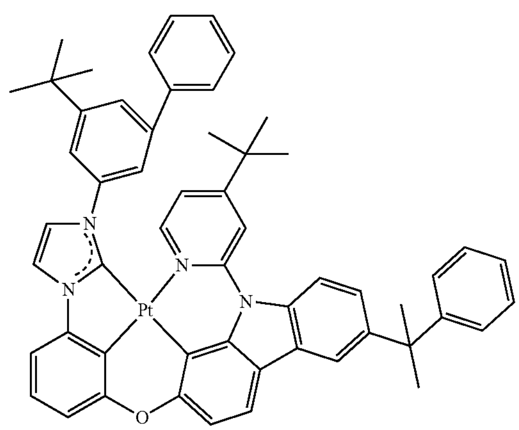

-continued
522
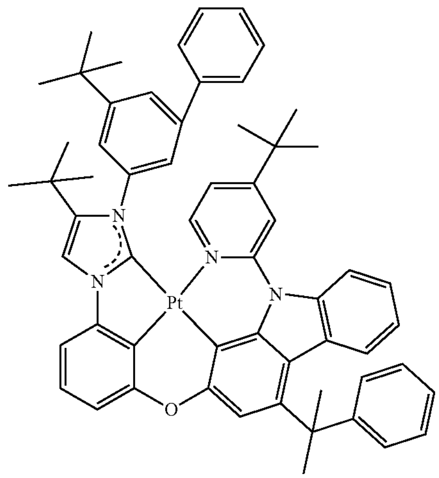
523
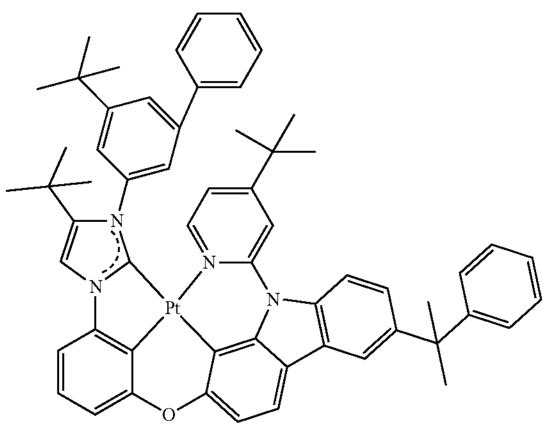
524
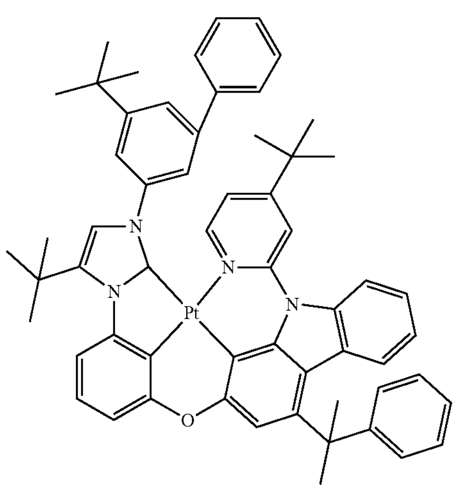
-continued
525
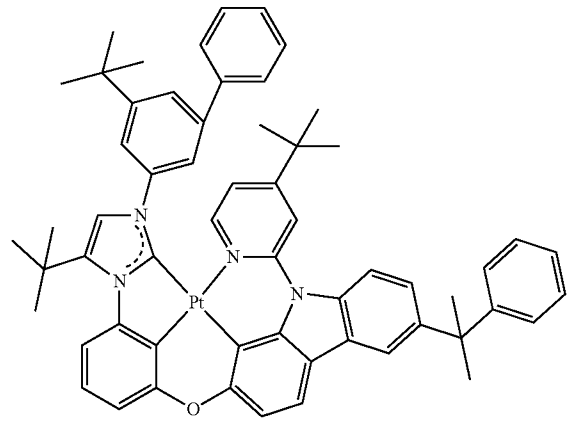
526
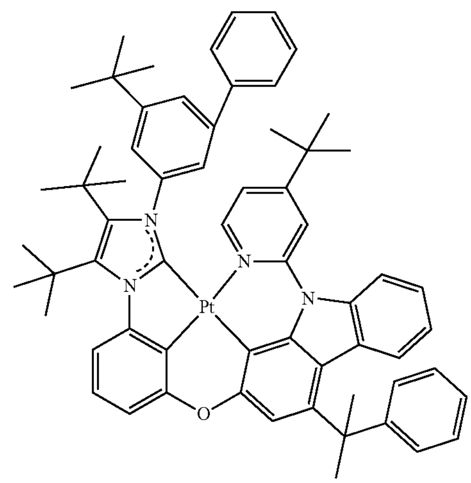
527
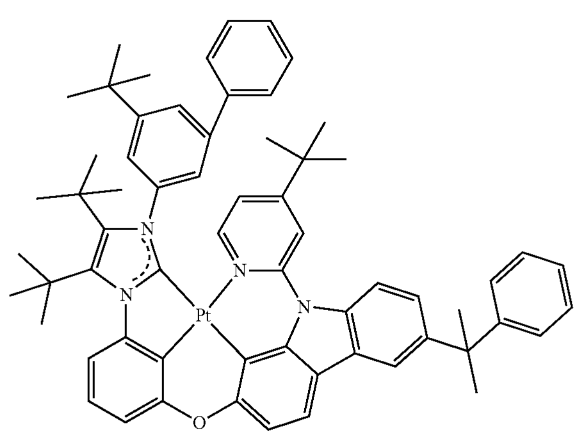

528
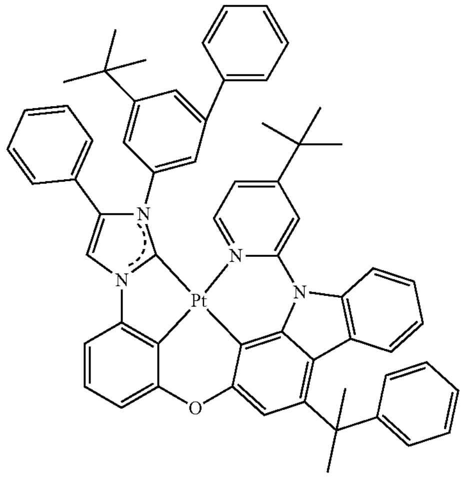
529
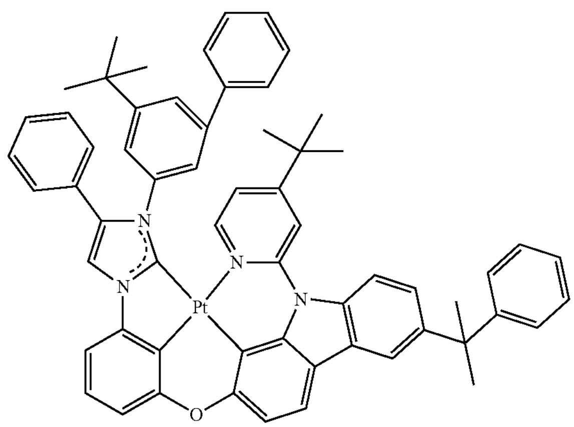
530
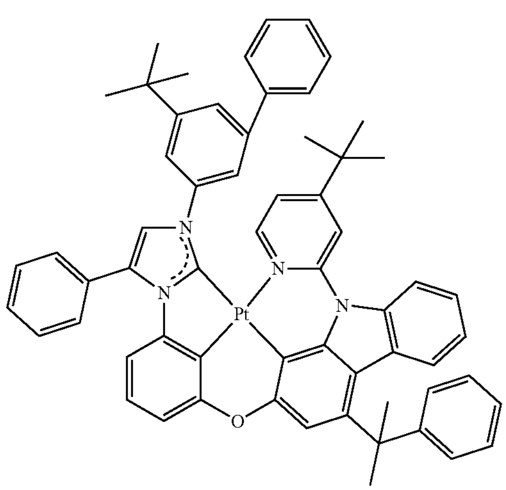
531
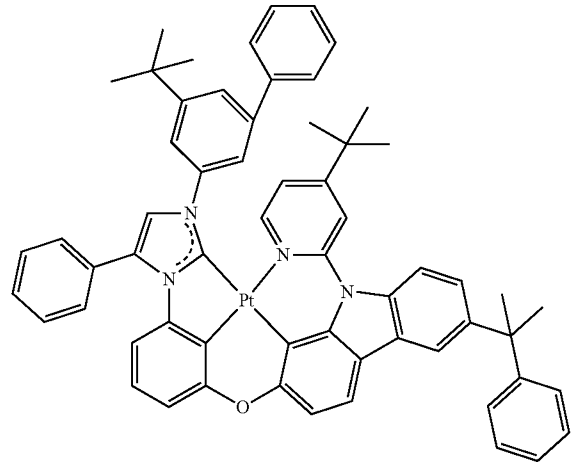
532
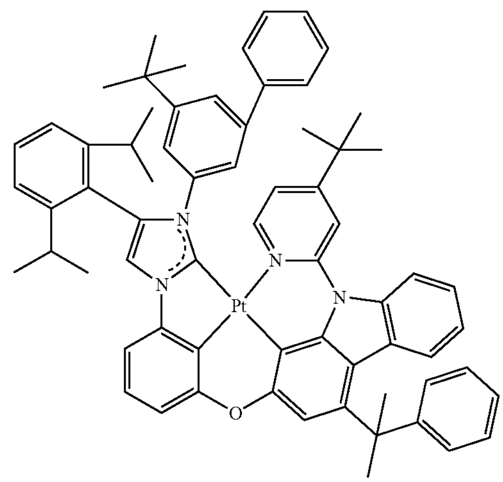
533
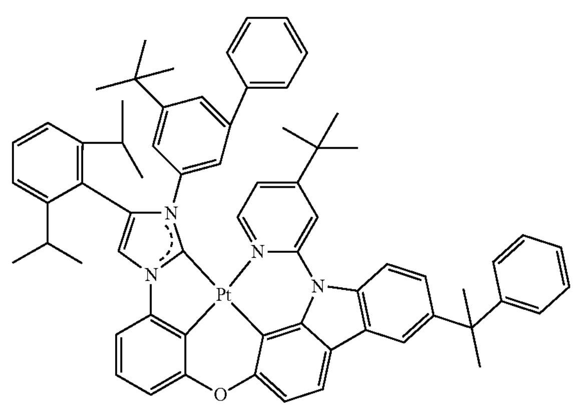

534
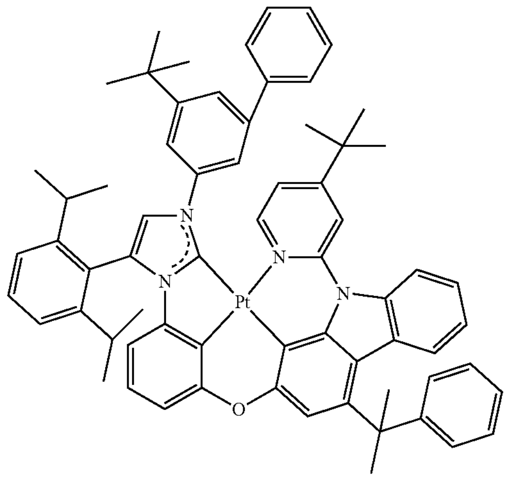
535
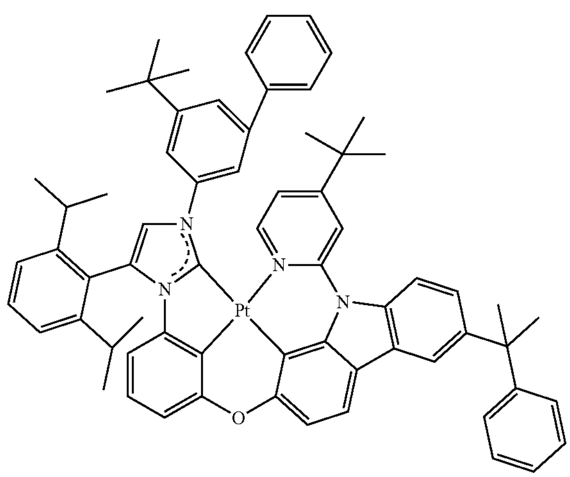
536
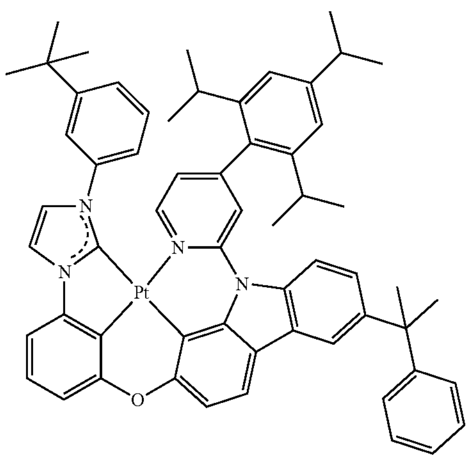
537
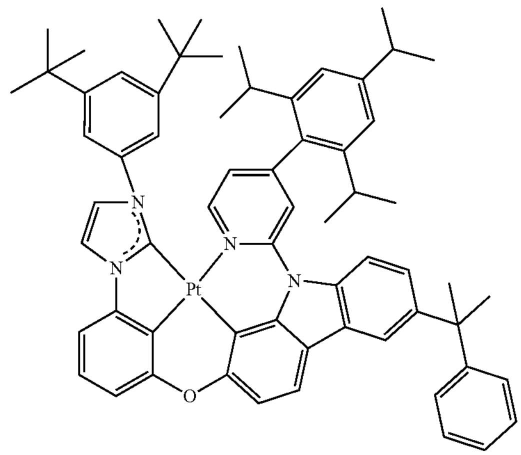
538
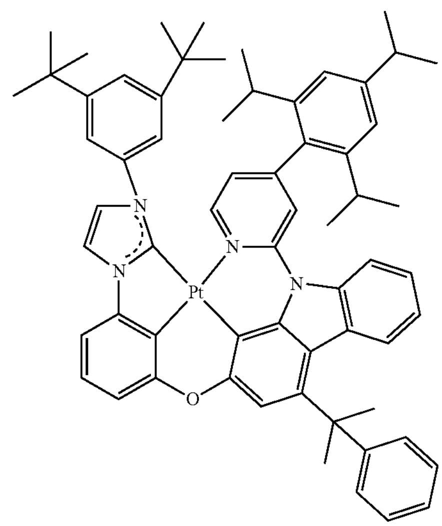
539
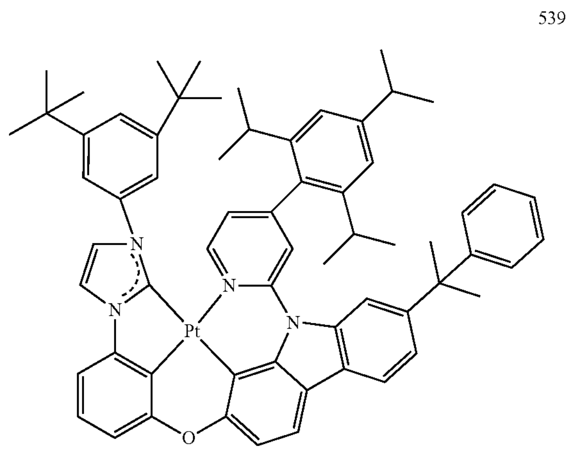

-continued
540
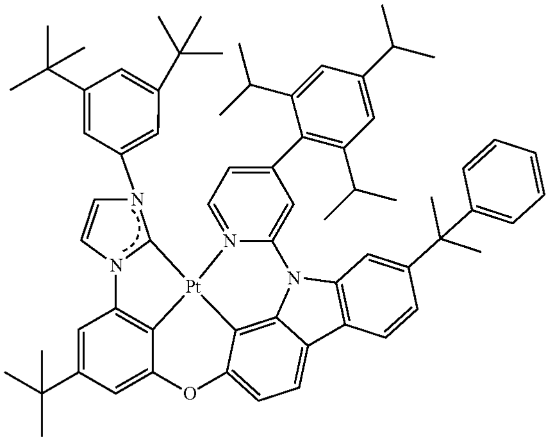
541
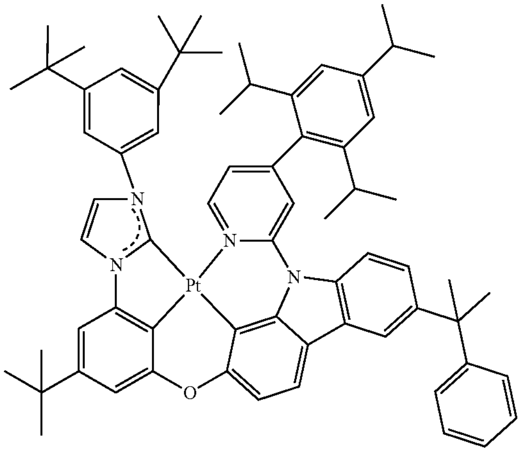
542
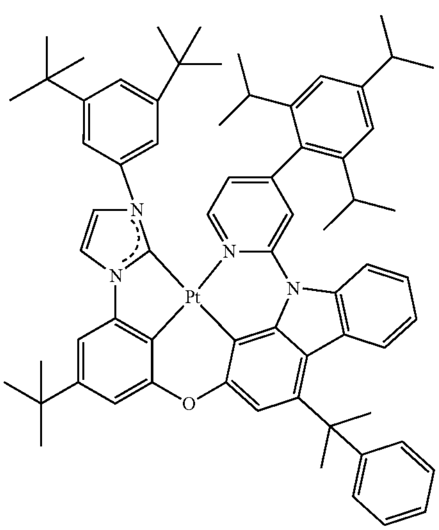
-continued
543
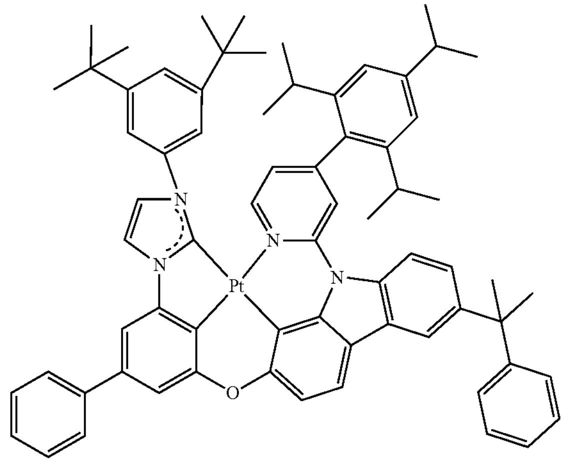
544
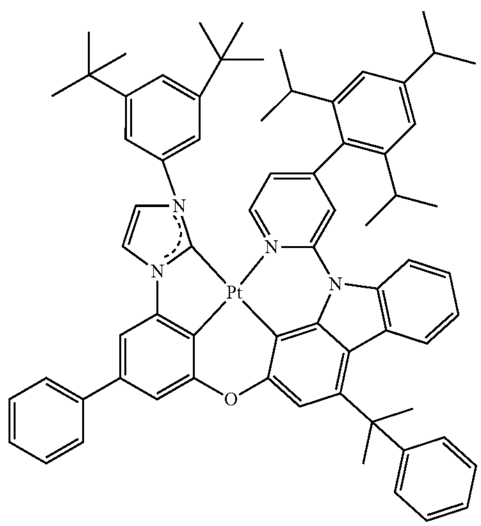
545
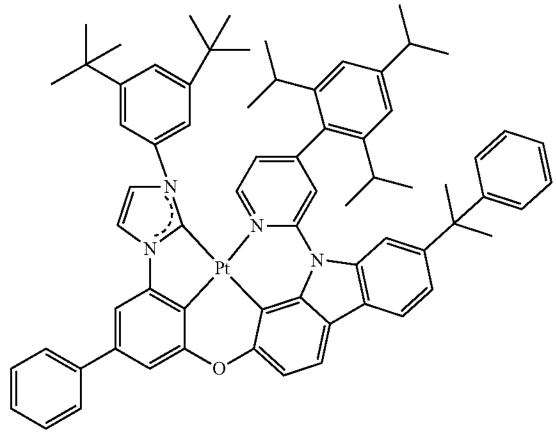

-continued
546
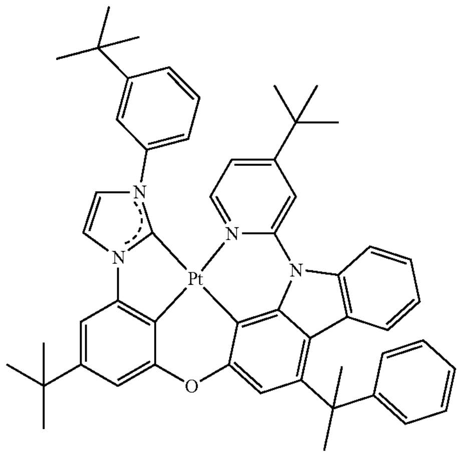
547
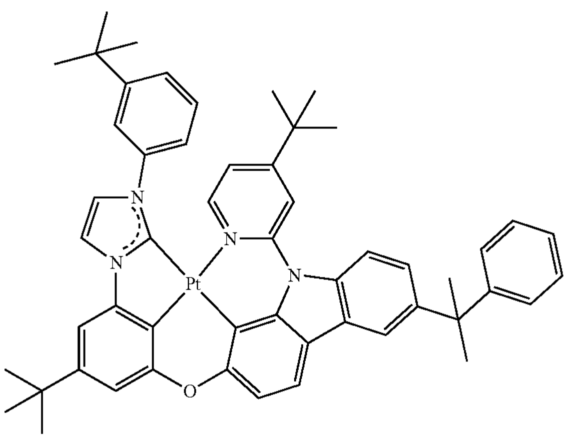
548
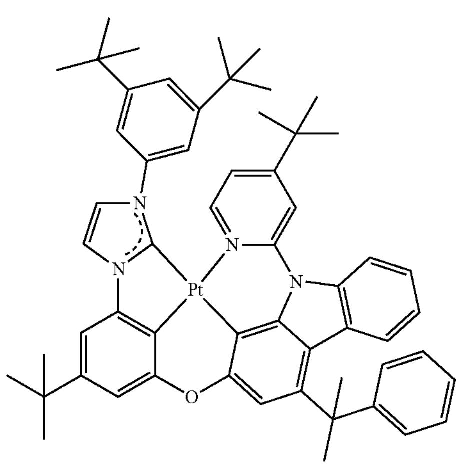
-continued
549
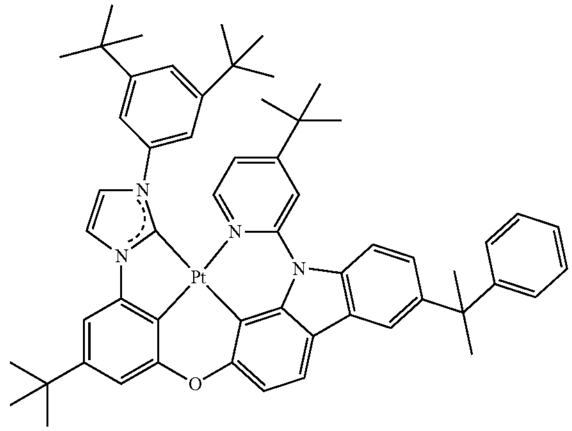
550
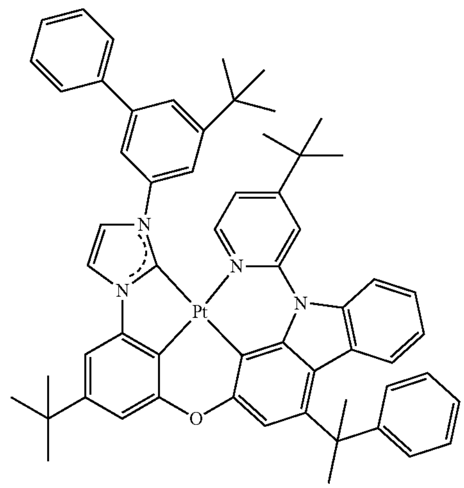
551
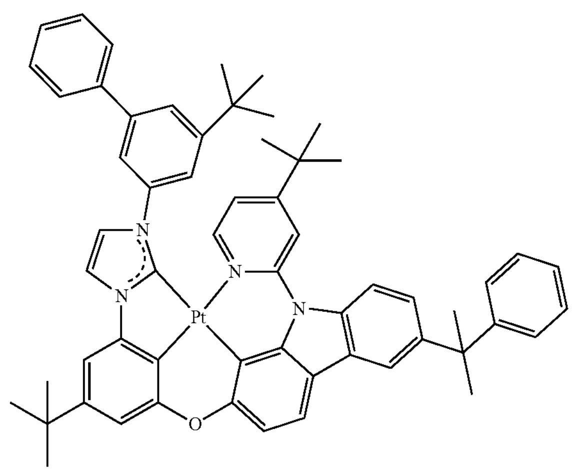

-continued
552
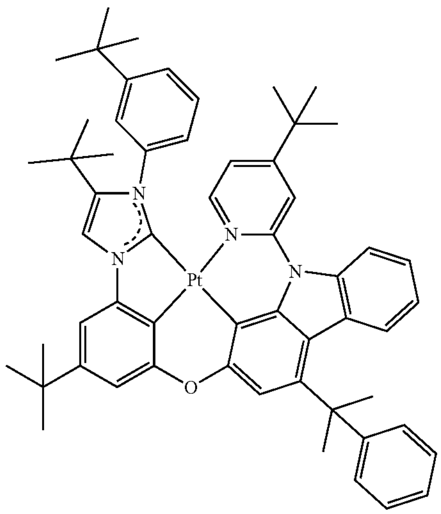
553
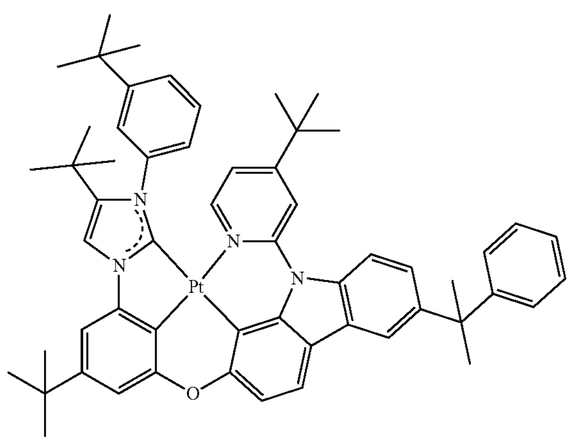
554
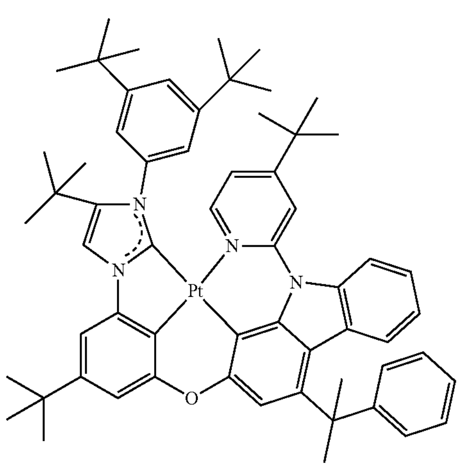
-continued
555
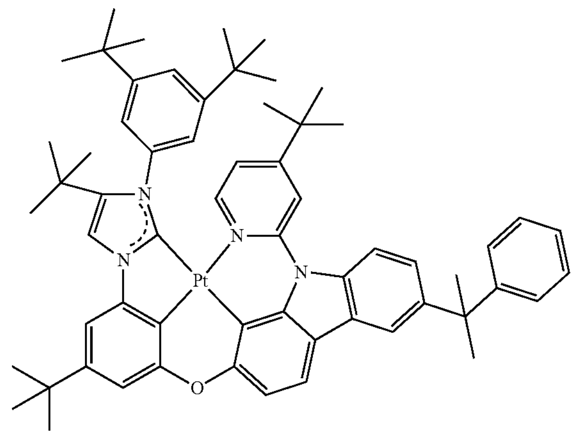
556
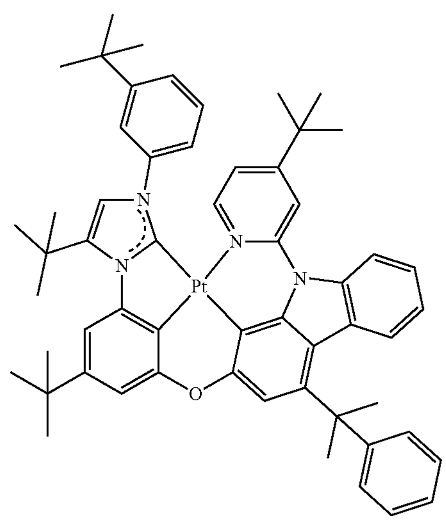
557
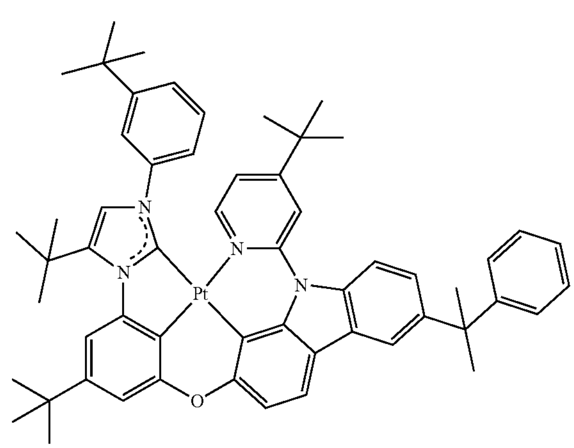

-continued
558
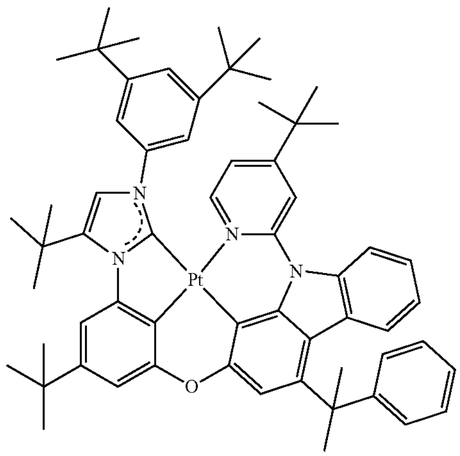
559
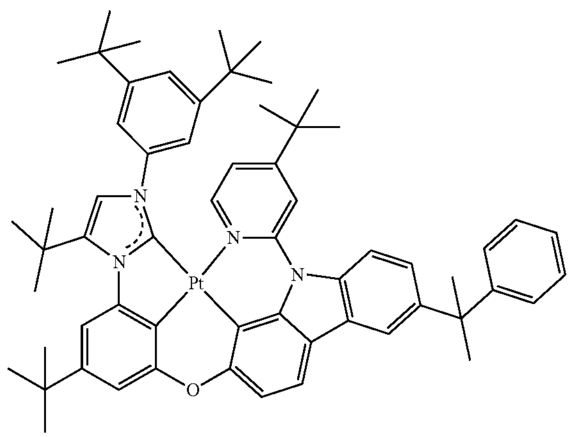
560
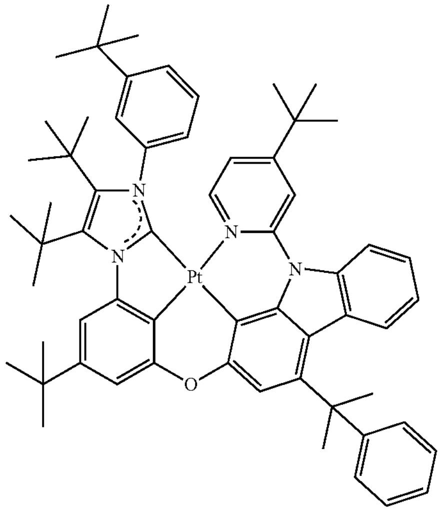
-continued
561
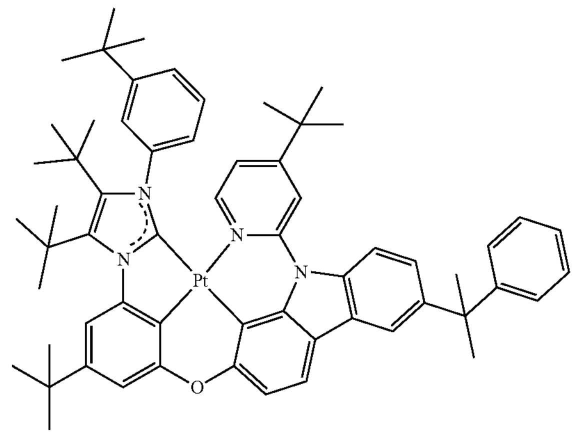
562
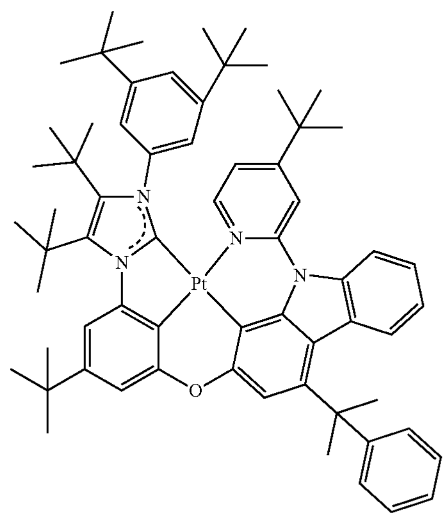
563
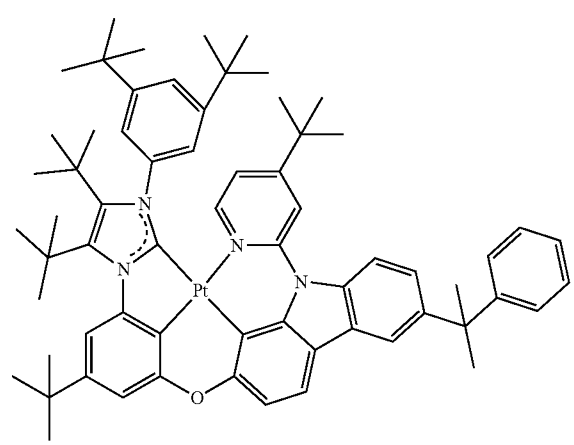

564
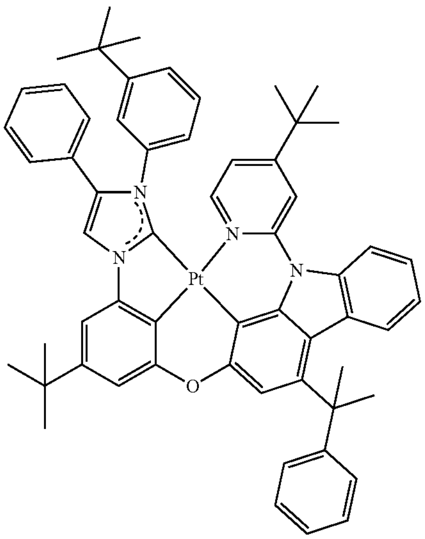
565
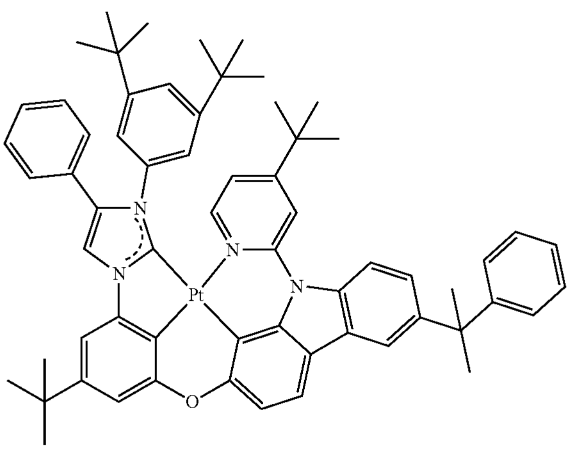
566
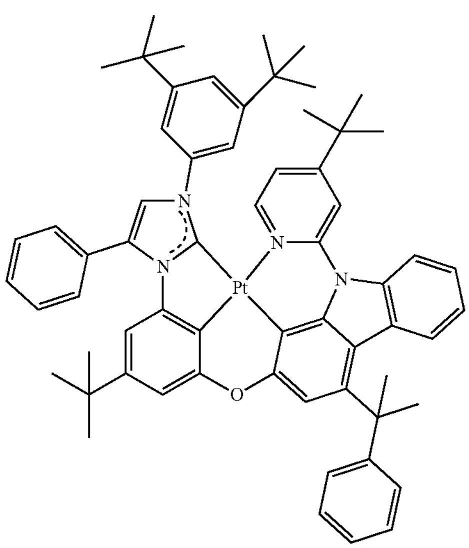
567
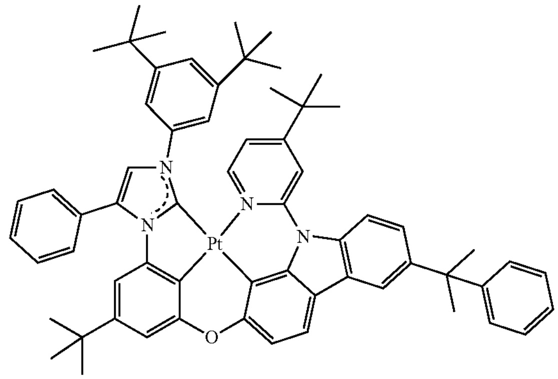
568
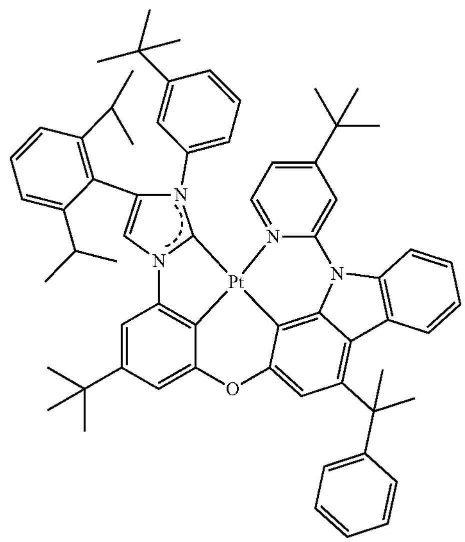
569
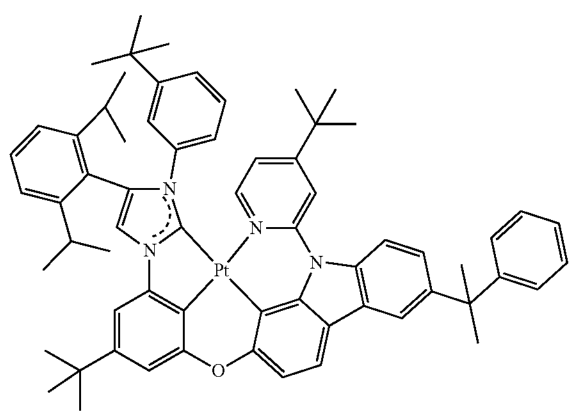

570
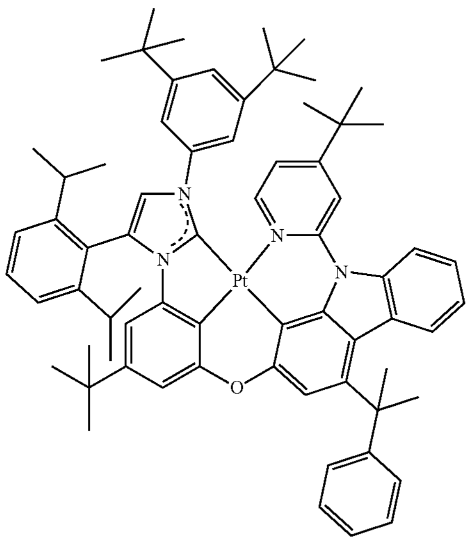
571
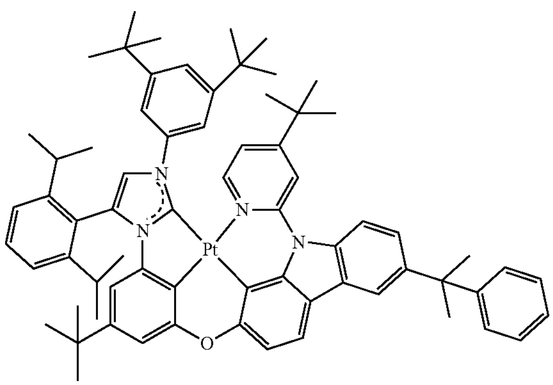
572
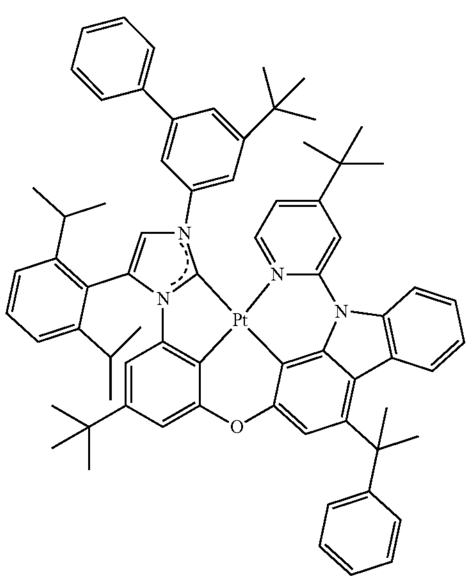
573
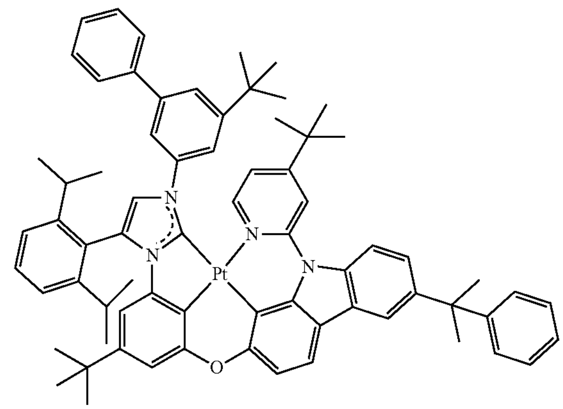
574
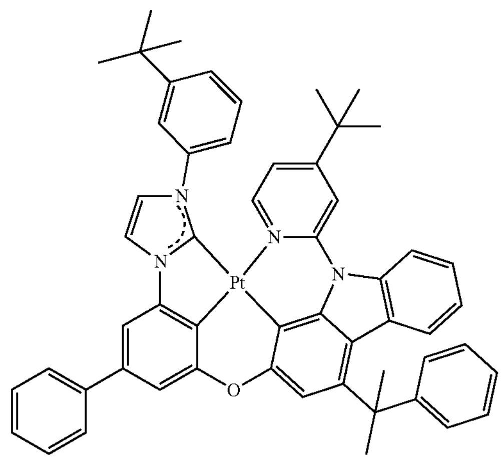
575
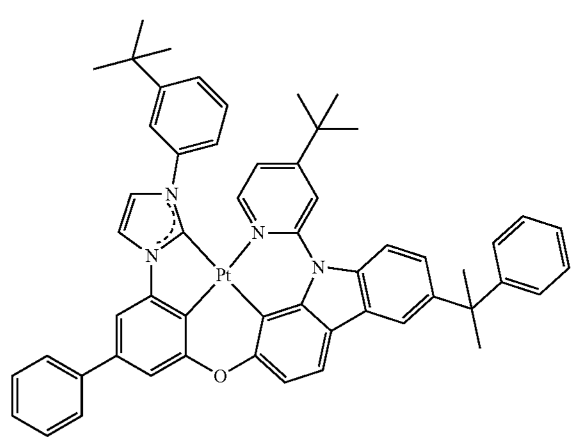

-continued
576
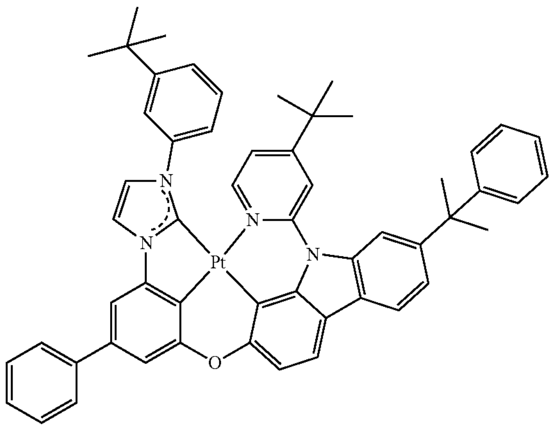
577
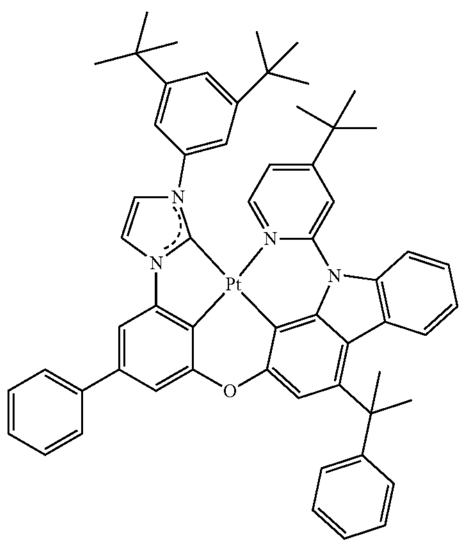
578
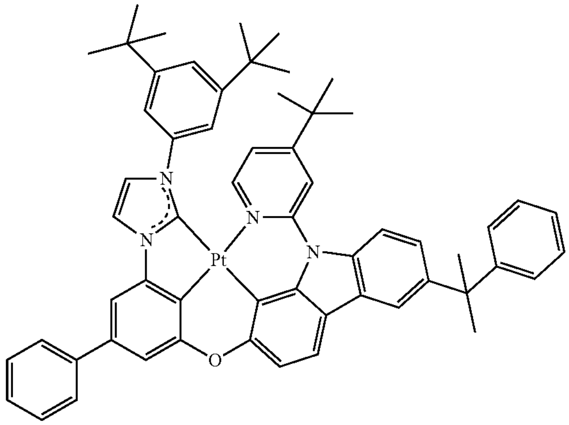
-continued
579
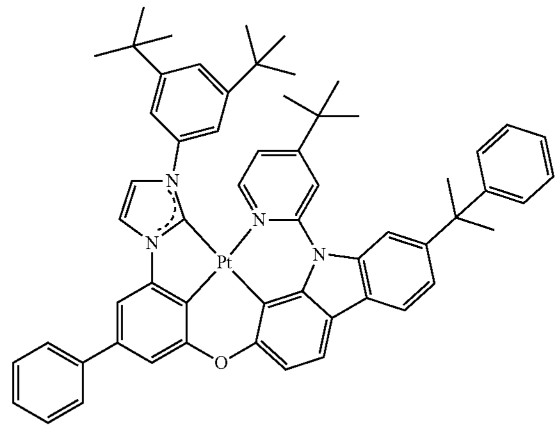
580
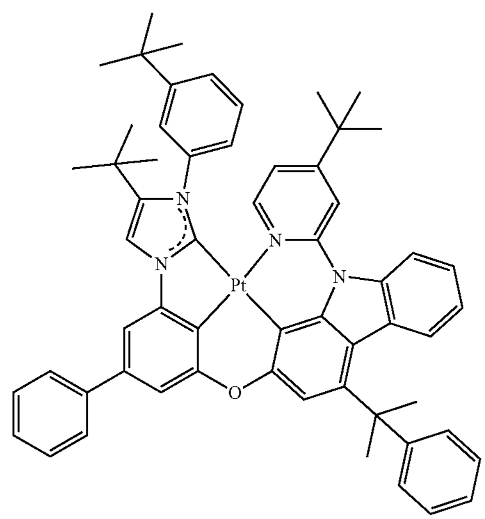
581
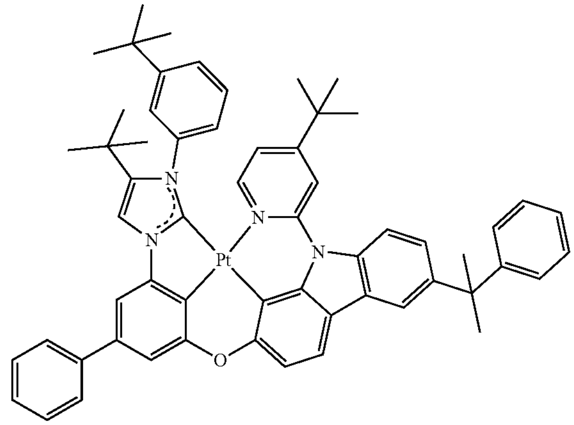

-continued
582
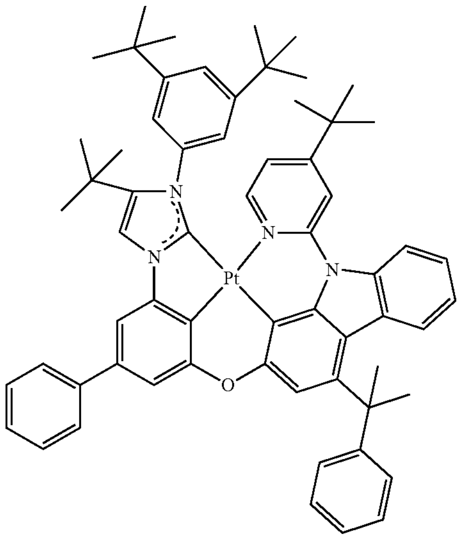
583
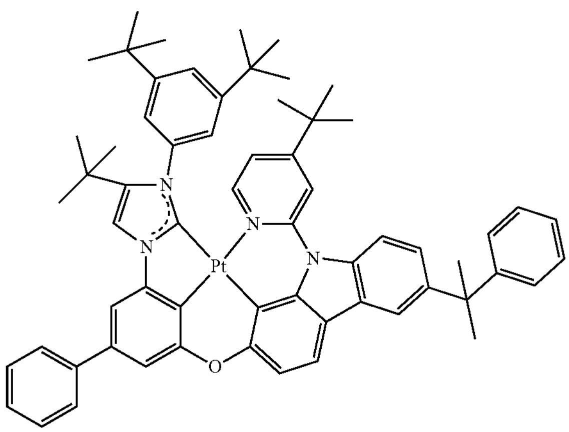
584
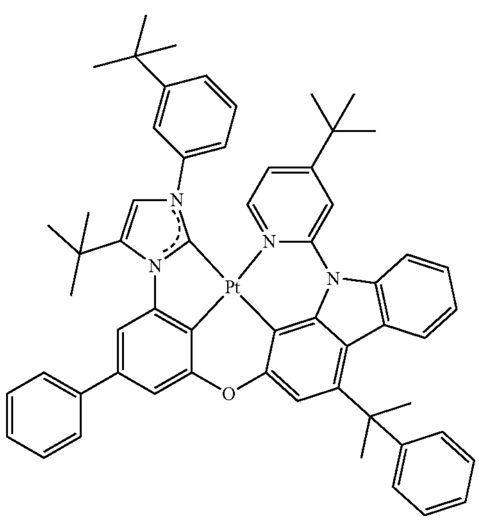
-continued
585
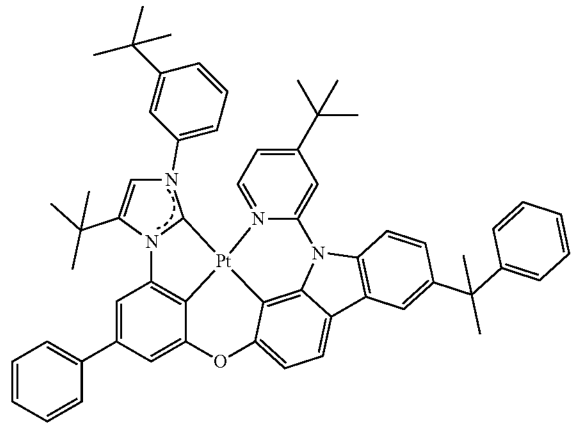
586
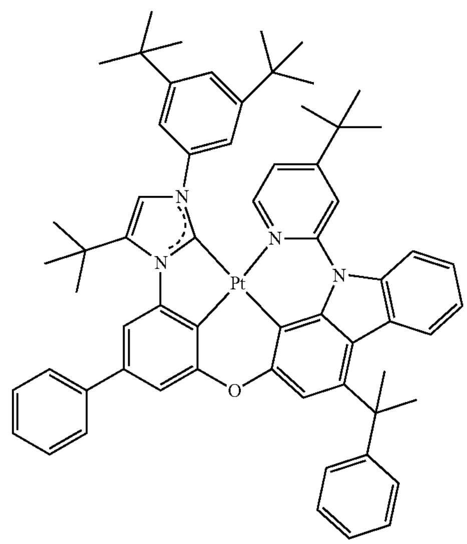
587
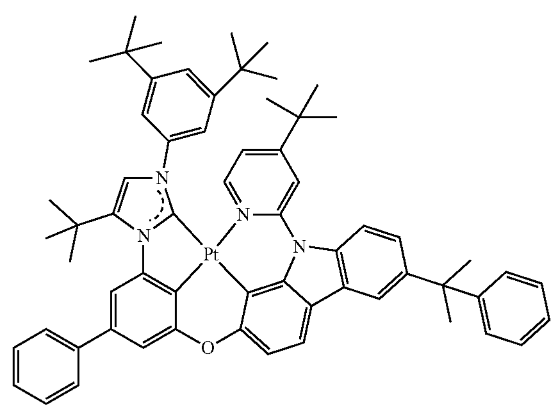

-continued
588
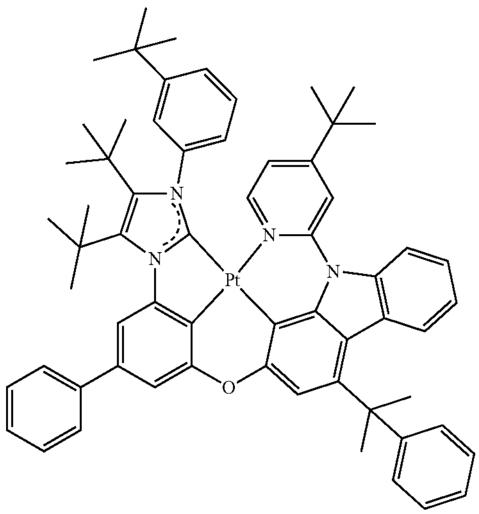
589
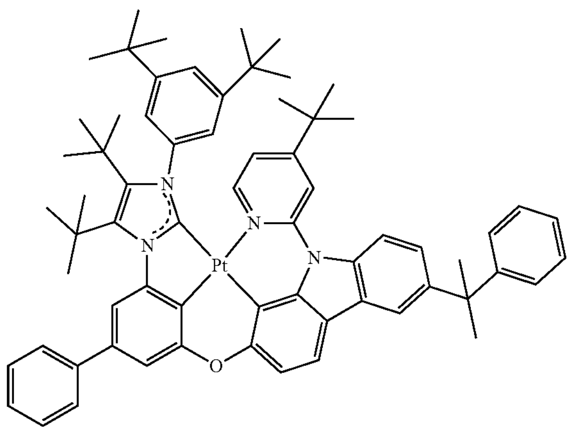
590
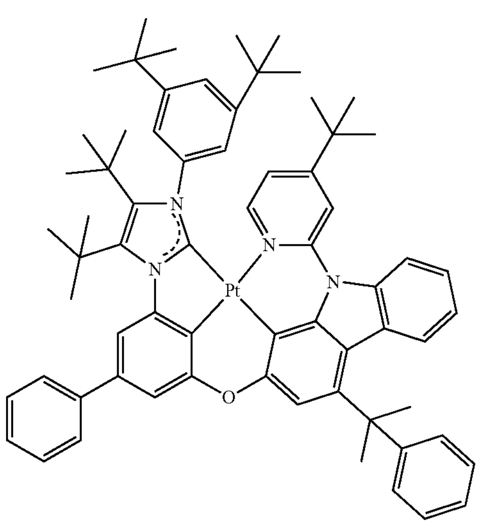
-continued
591
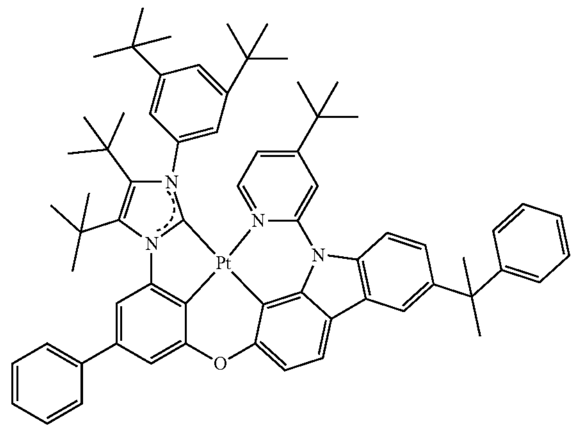
592
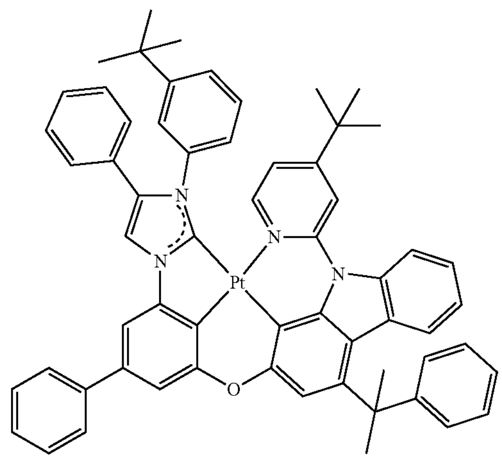
593
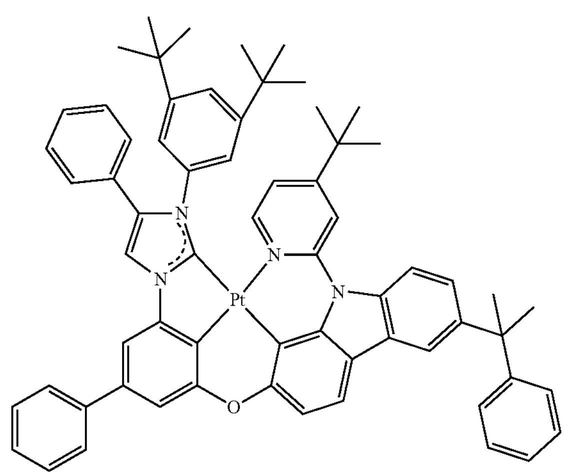

-continued
594
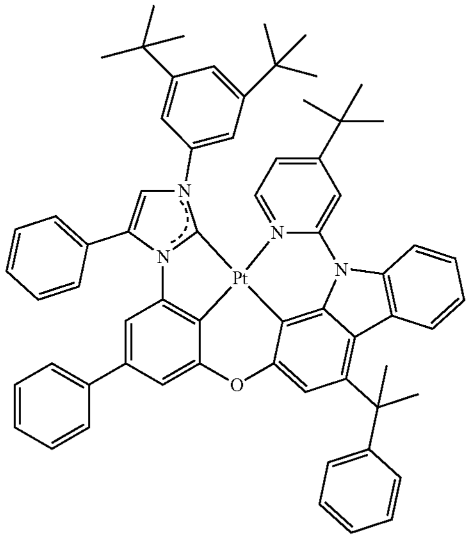
595
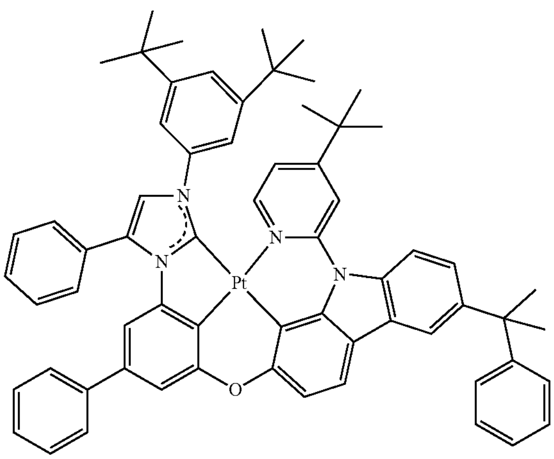
596
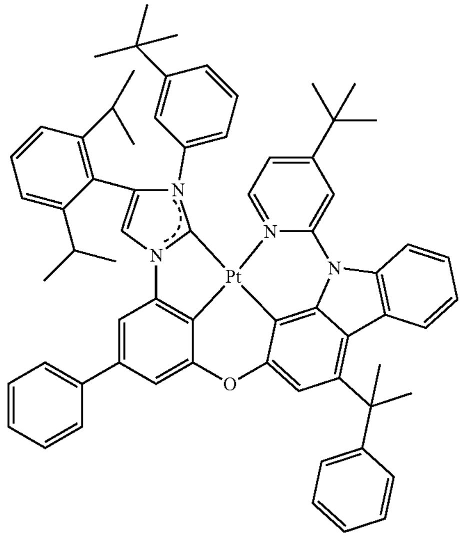
-continued
597
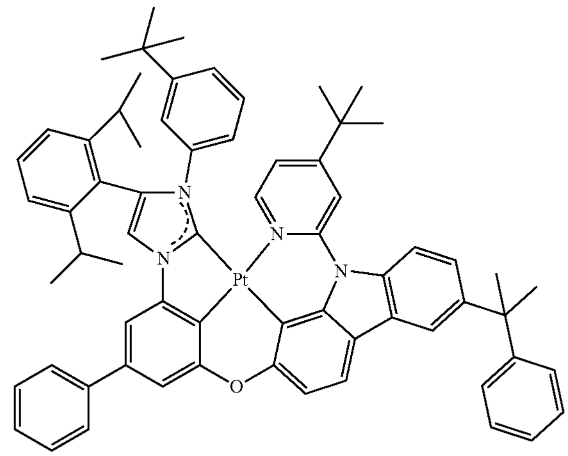
598
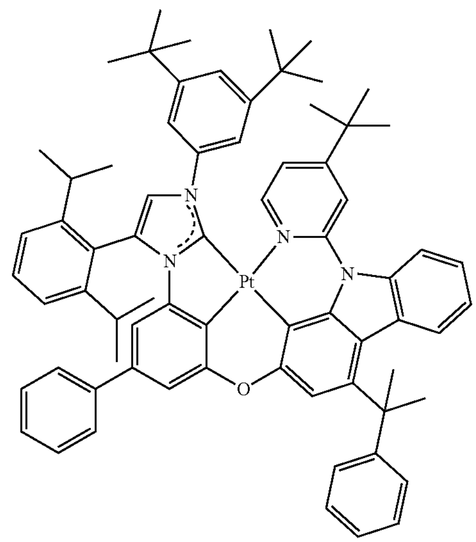
599
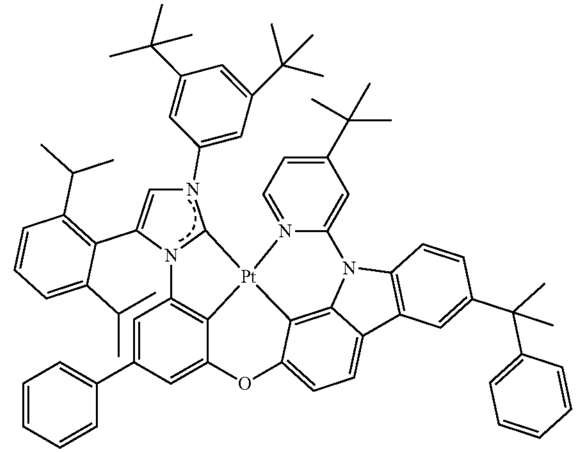

-continued
600
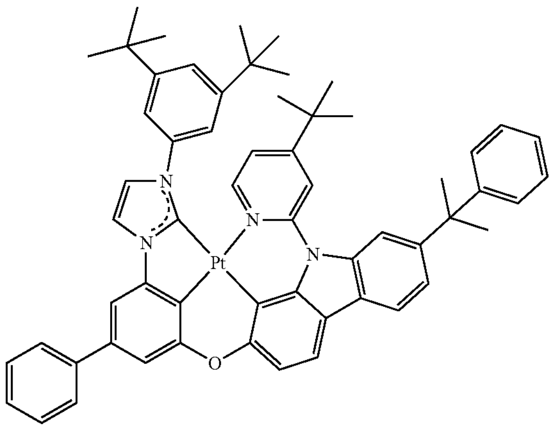
601
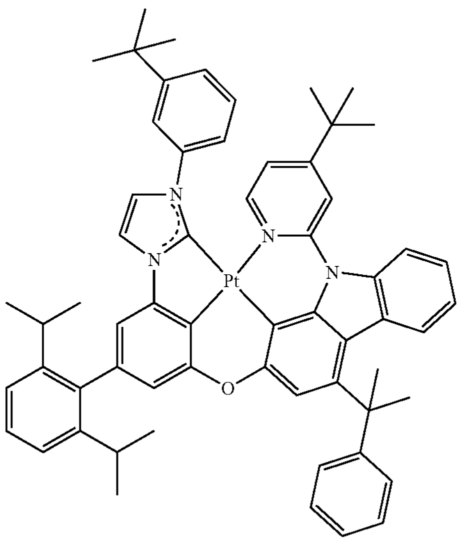
602
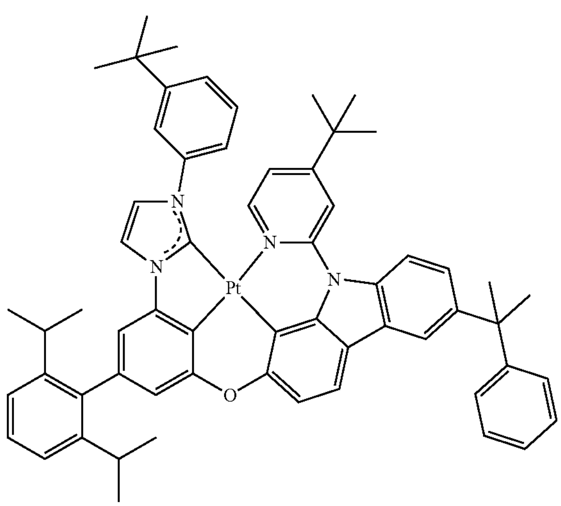
-continued
603
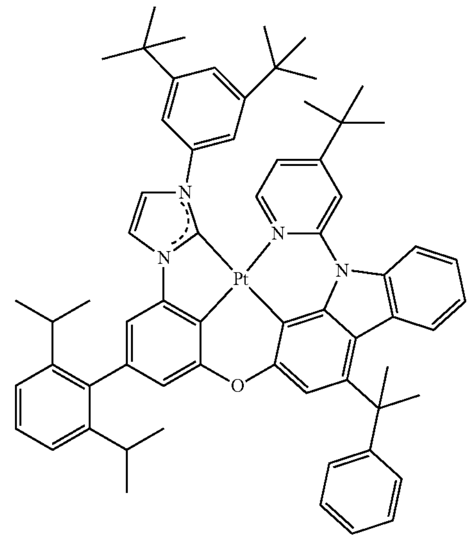
604
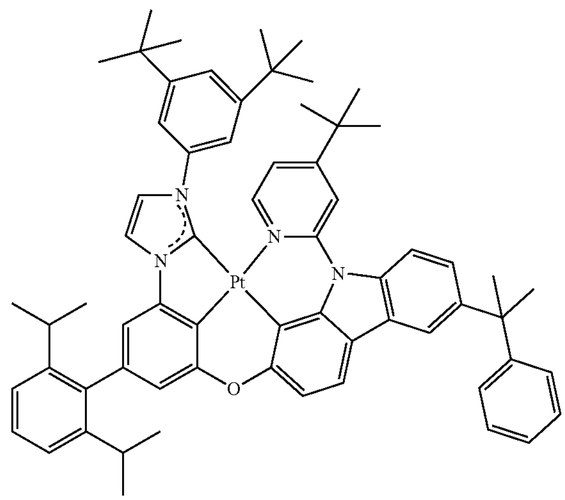
605
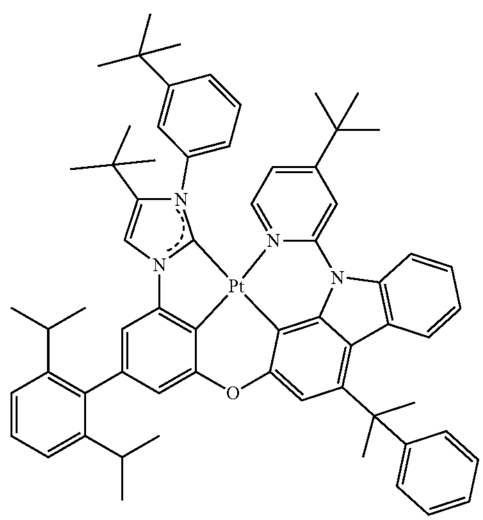

606
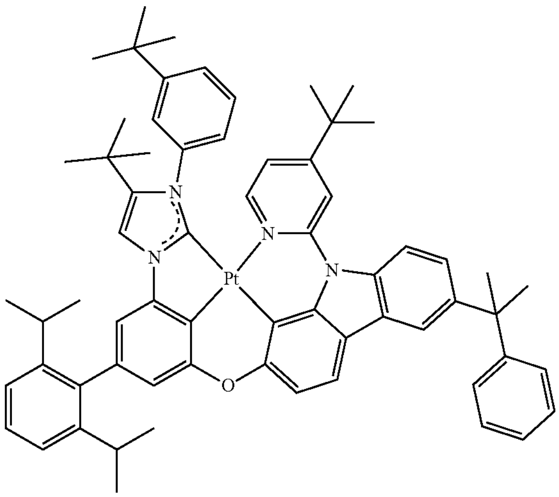
607
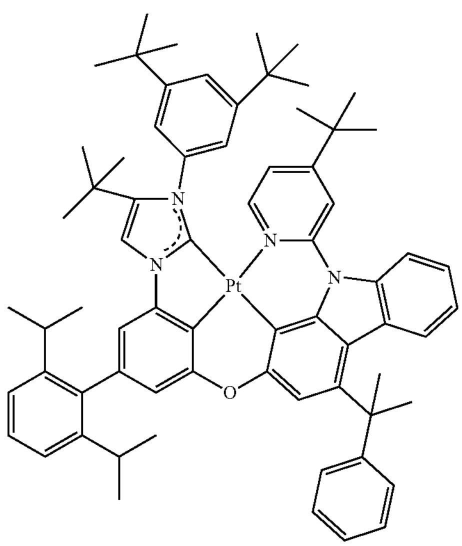
608
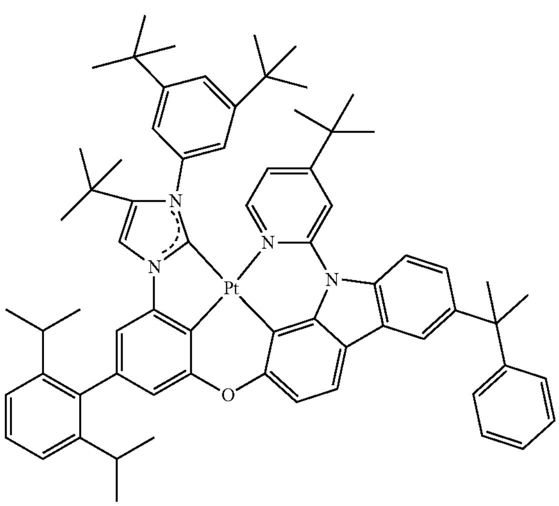
609
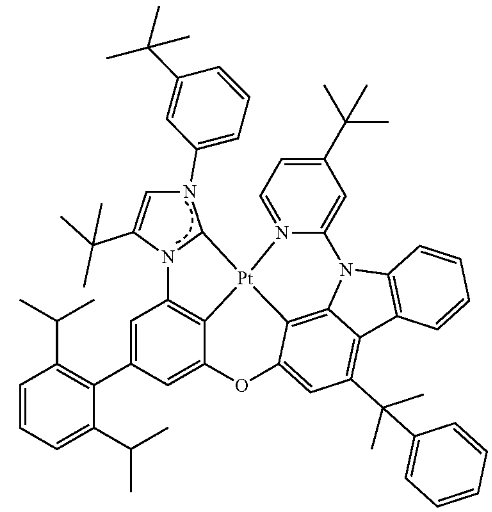
610
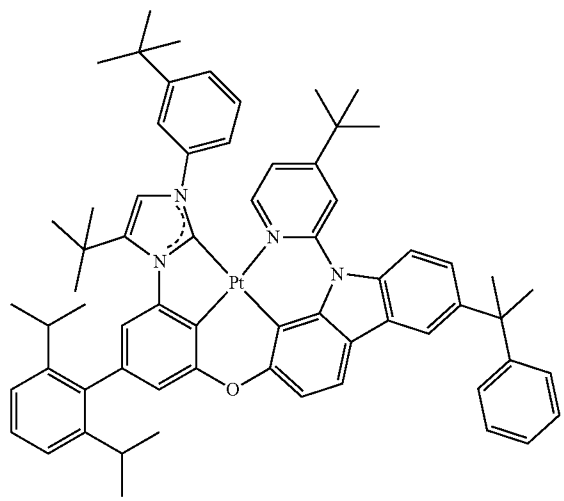
611
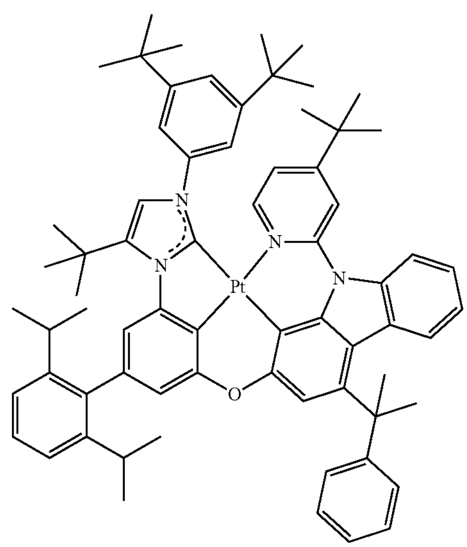

612
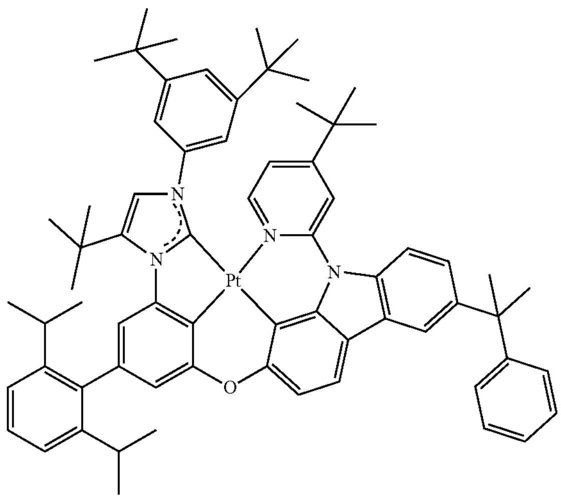
613
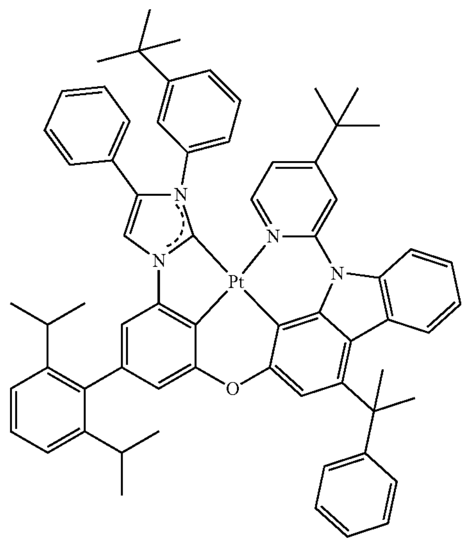
614
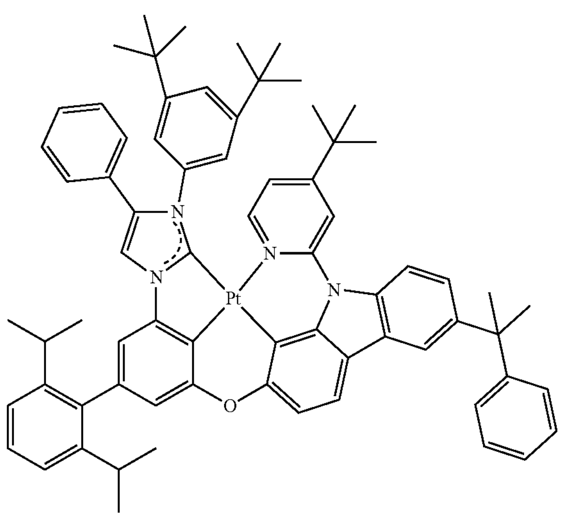
615
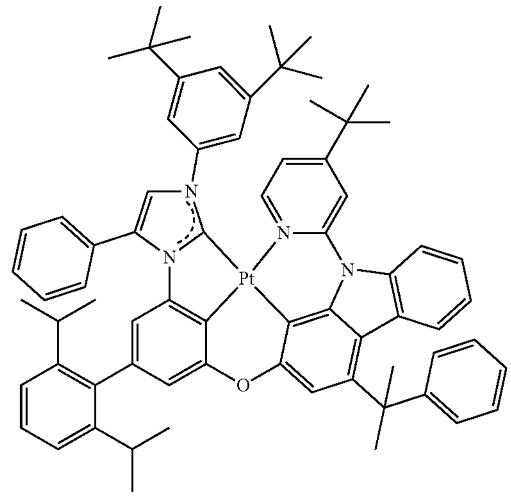
616
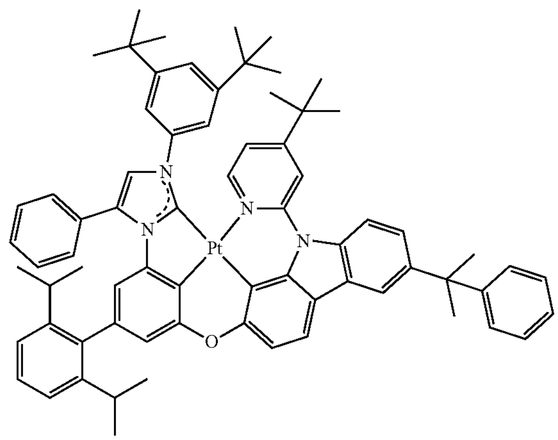
617
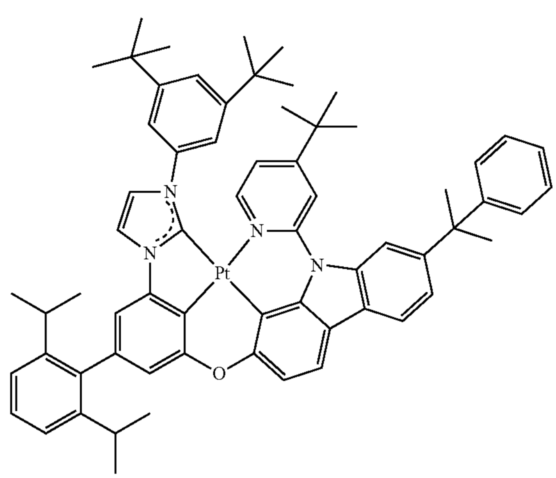

-continued
618
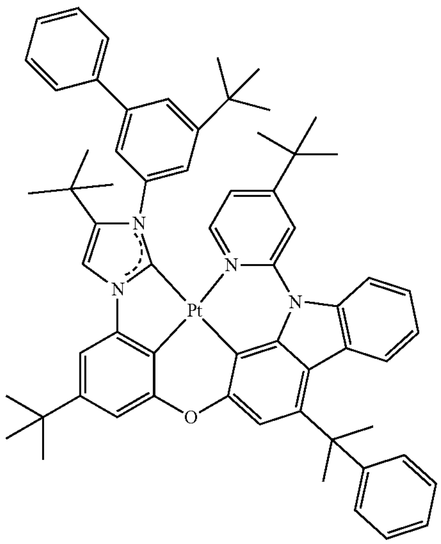
619
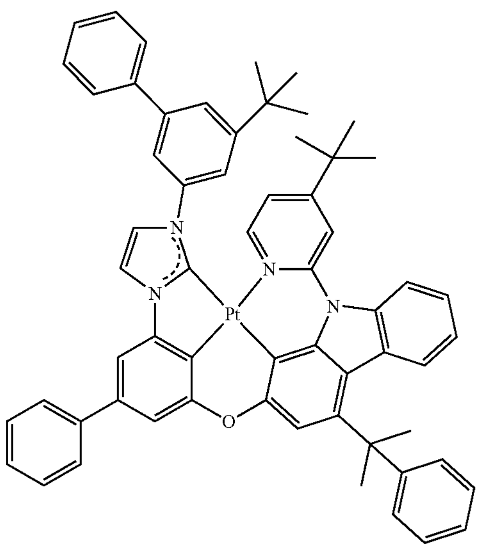
620
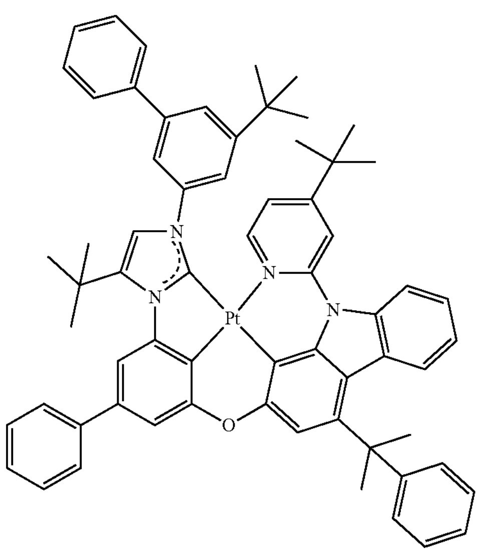
-continued
621
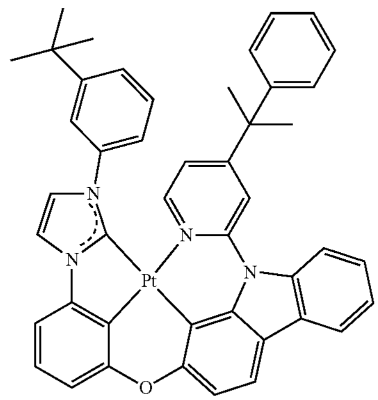
622
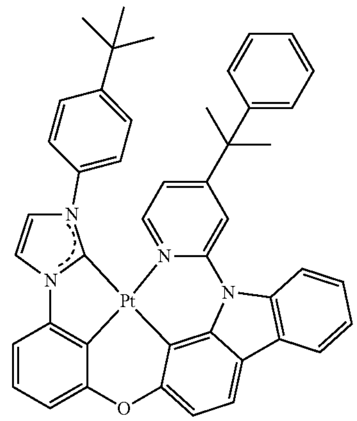
623
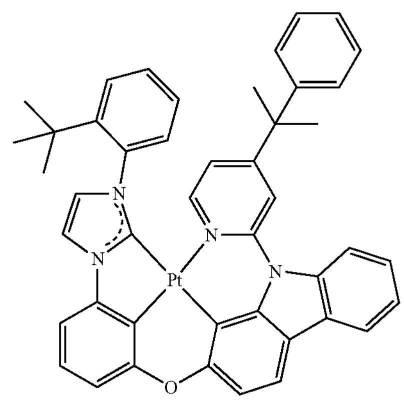
624
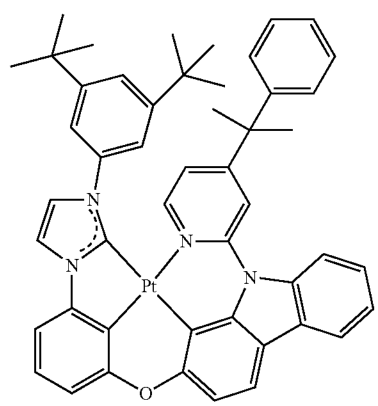

-continued
625
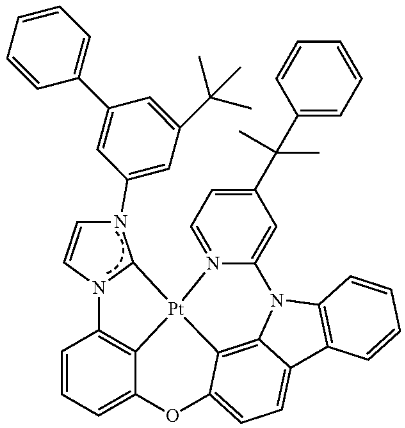
626
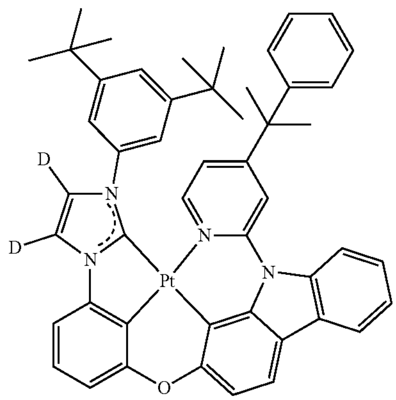
627
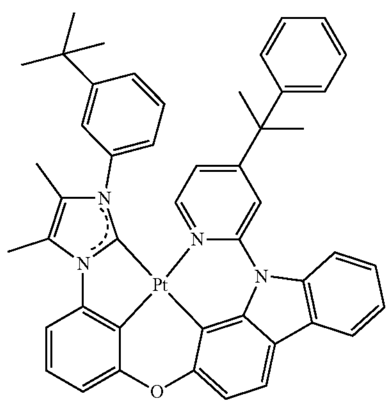
628
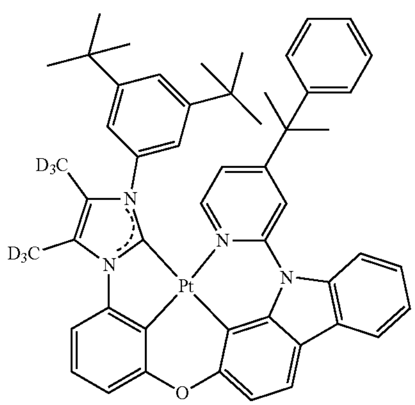
-continued
629
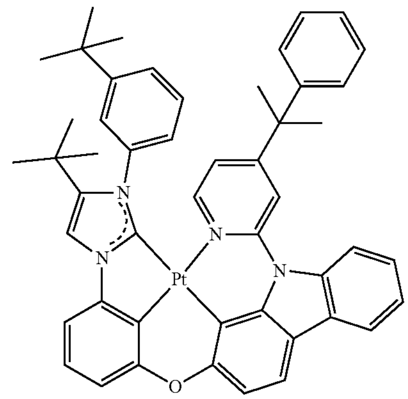
630
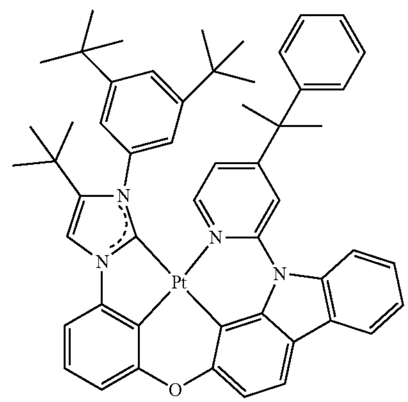
631
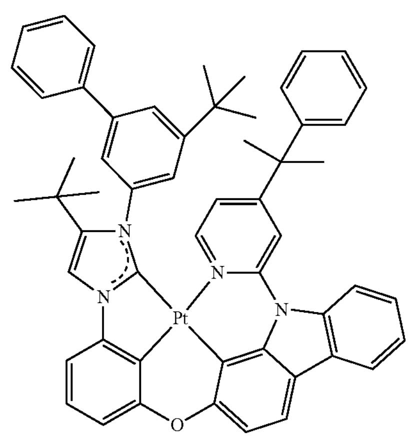
632
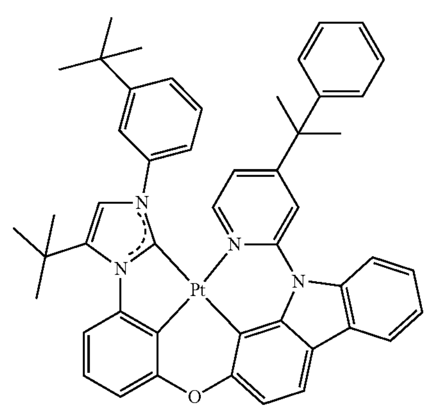

-continued
633
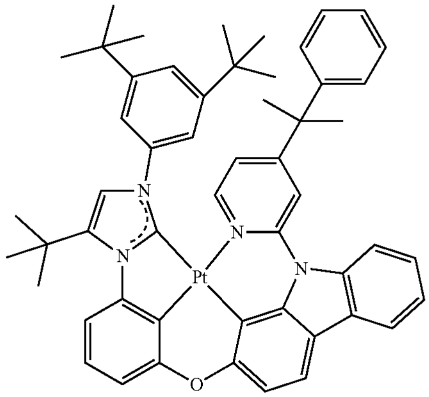
634
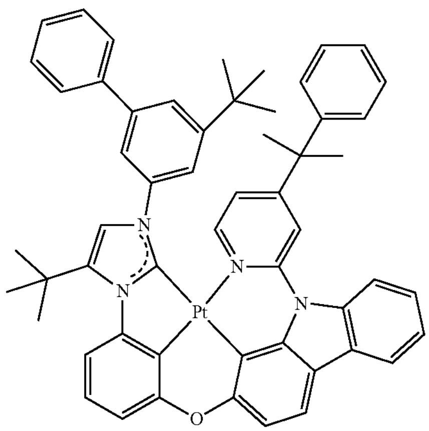
635
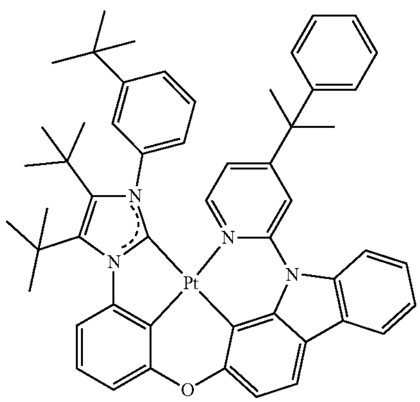
636
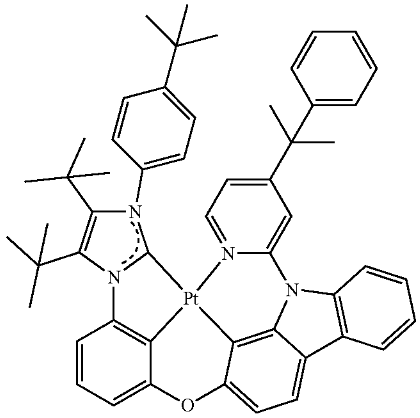
-continued
637
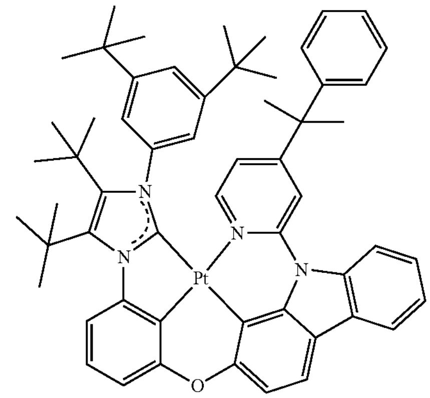
638
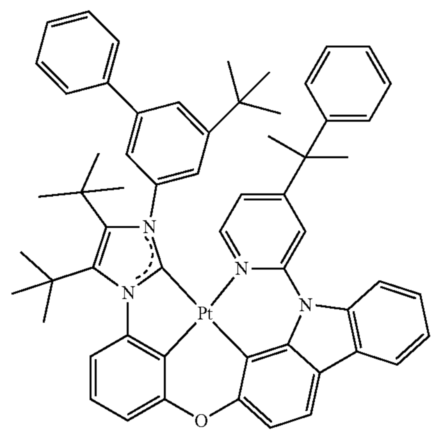
639
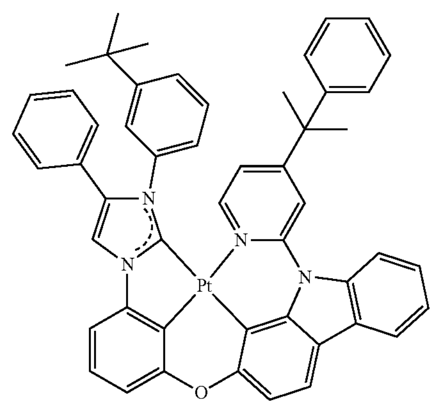
640
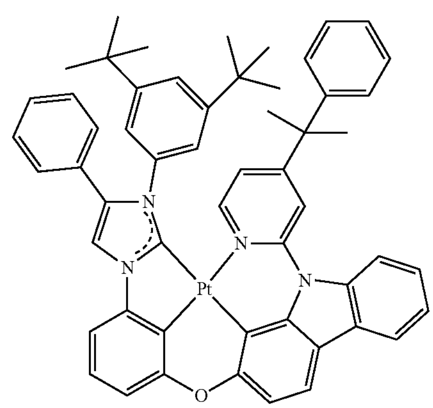

641
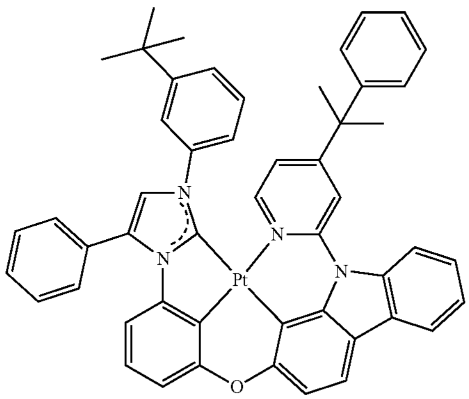
642
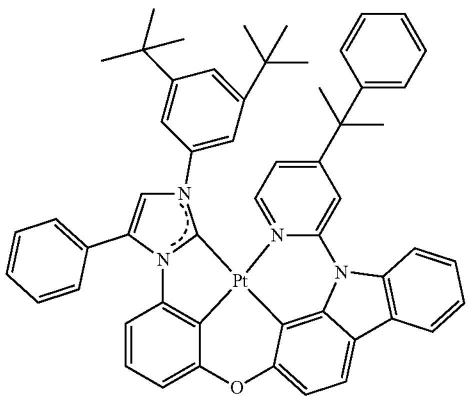
643
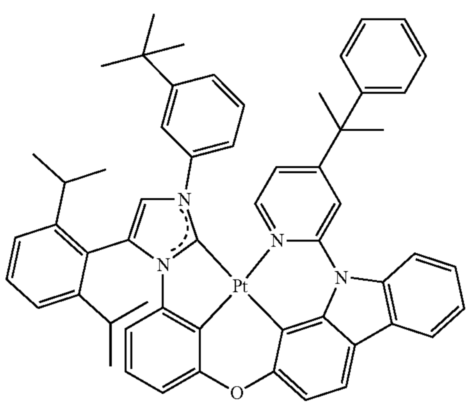
644
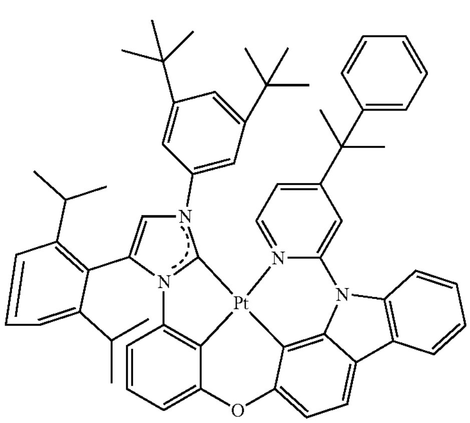
645
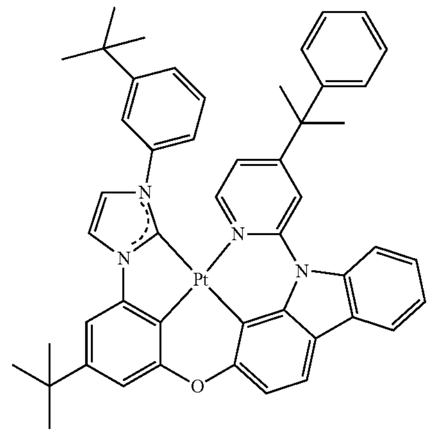
646
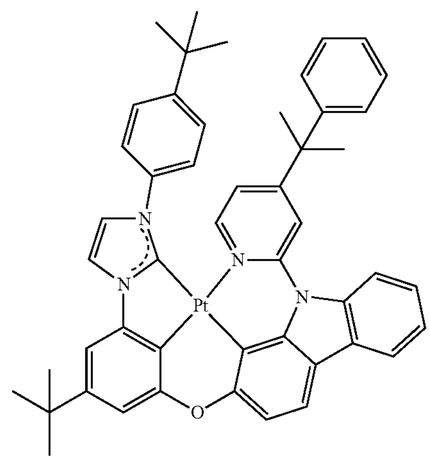
647
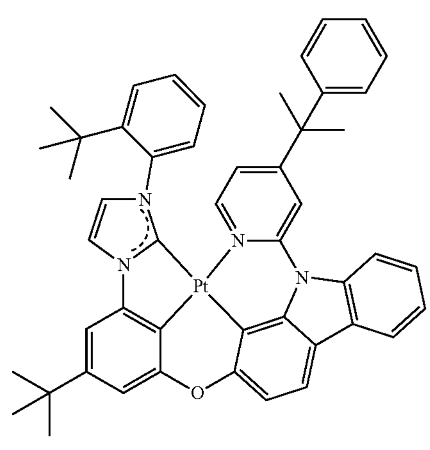

648
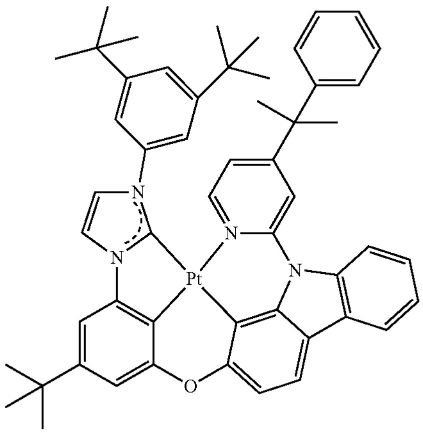
649
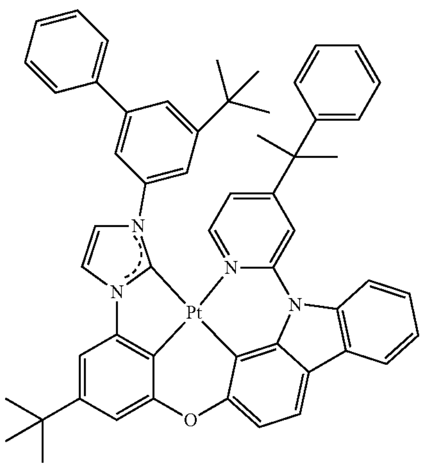
650
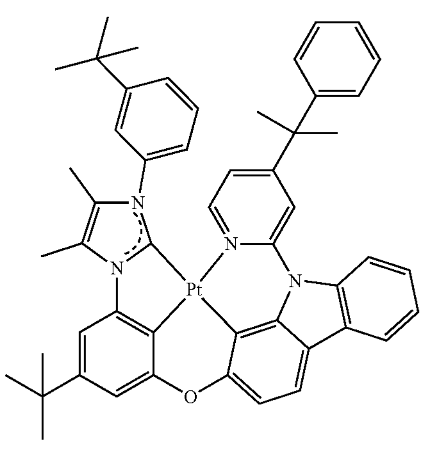
651
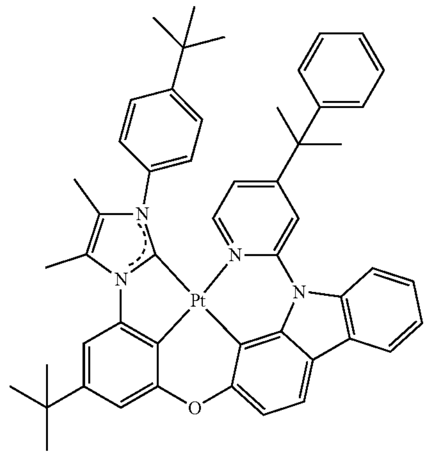
652
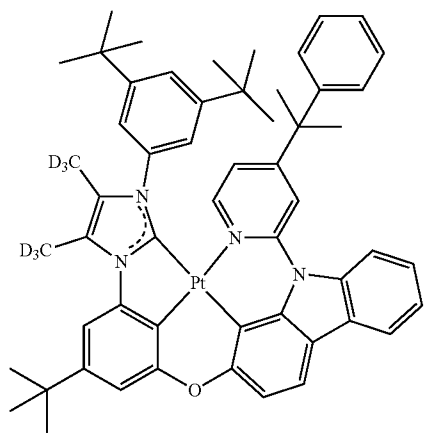
653
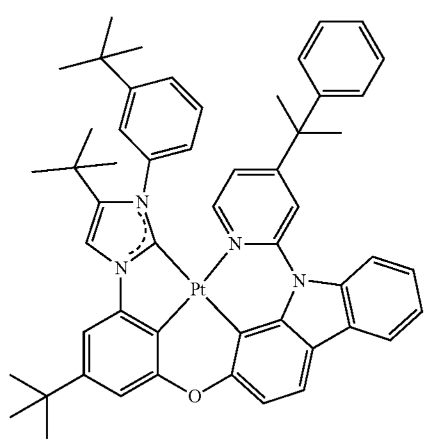

654
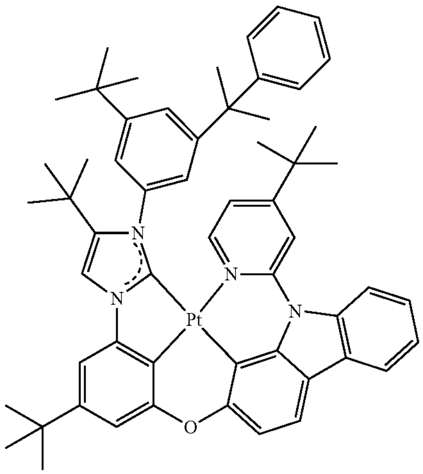
655
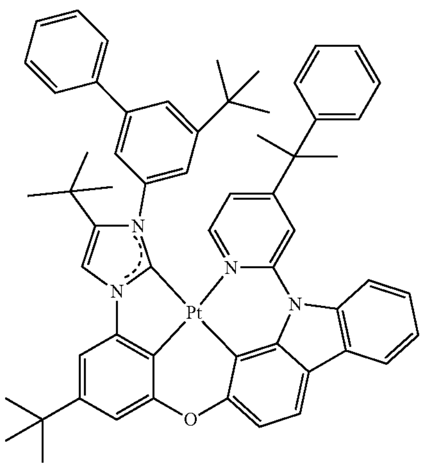
656
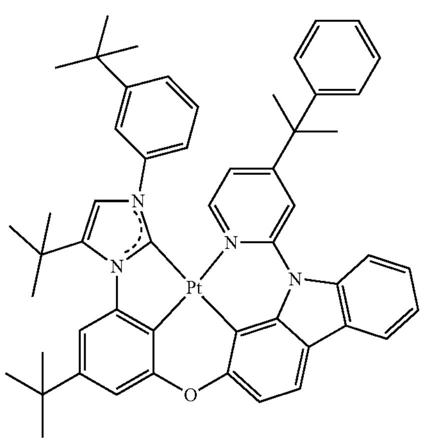
657
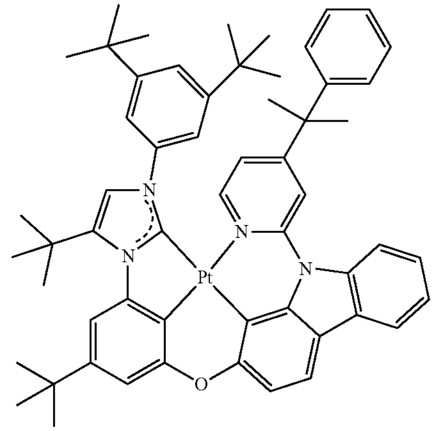
658
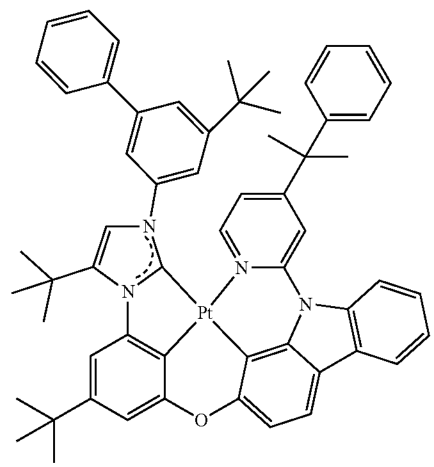
659
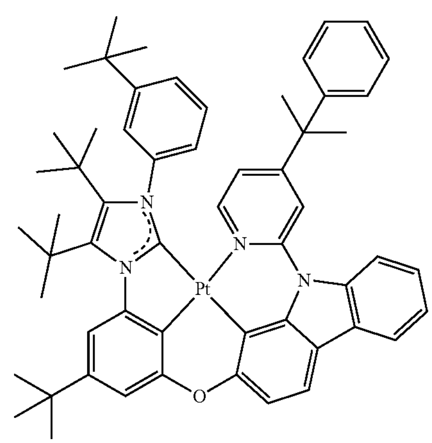

660
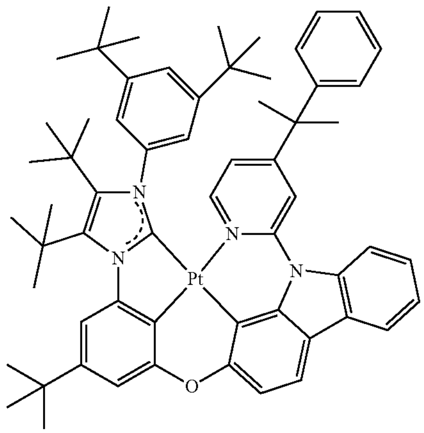
661
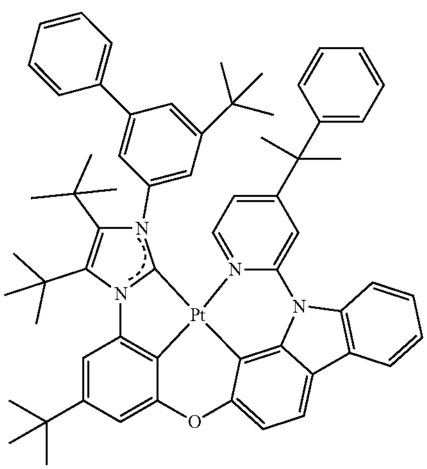
662
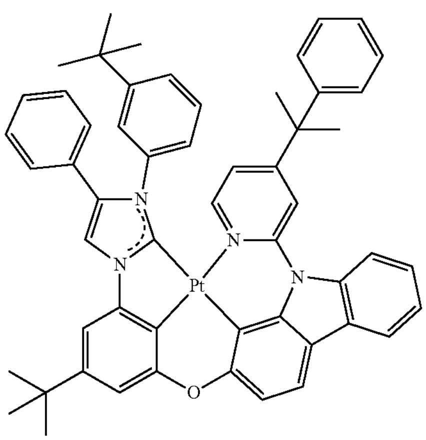
663
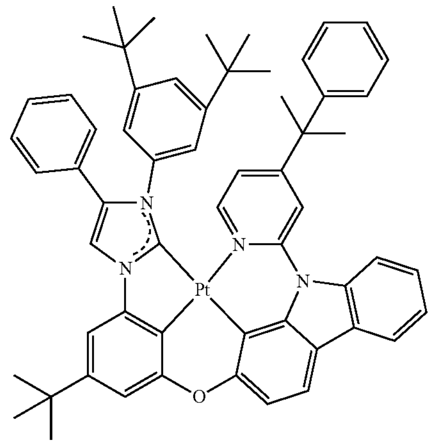
664
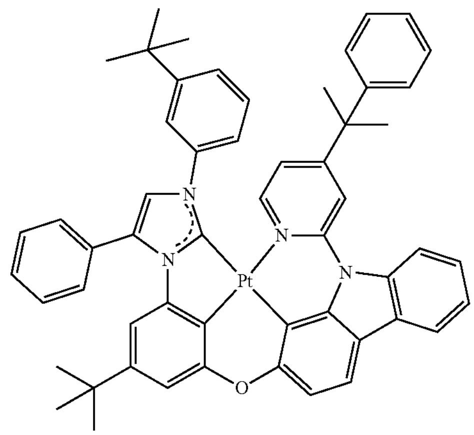
665
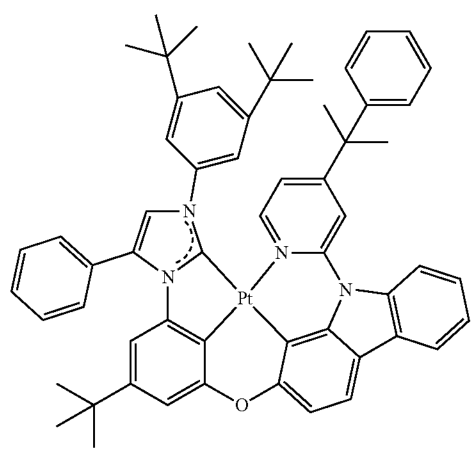

666
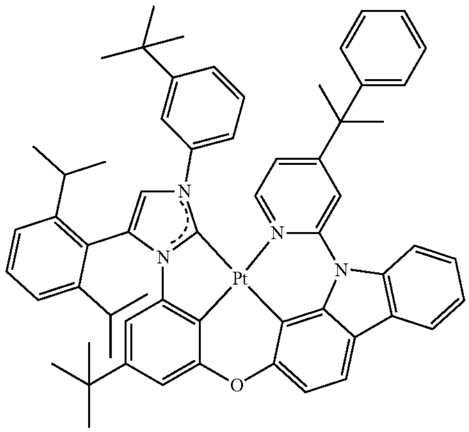
667
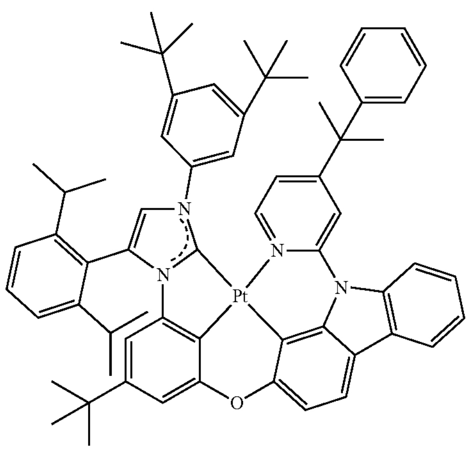
668
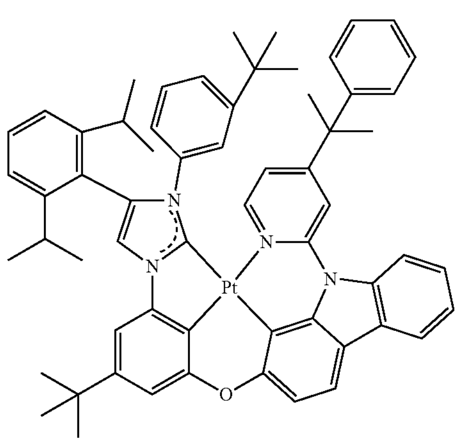
669
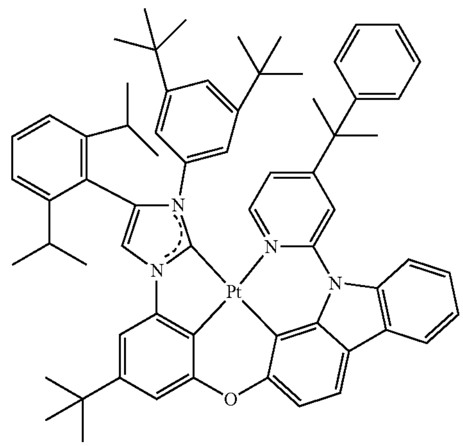
670
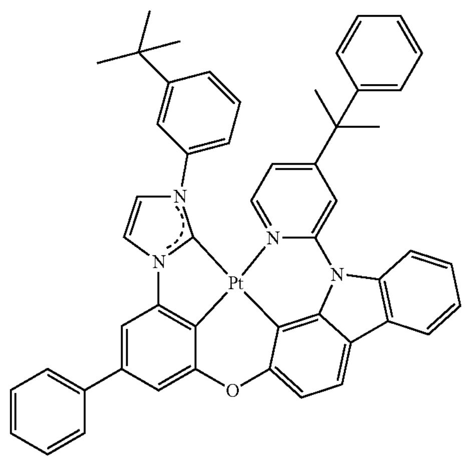
671
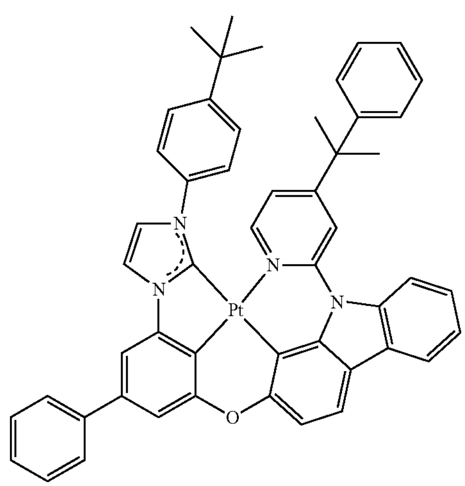

-continued
672
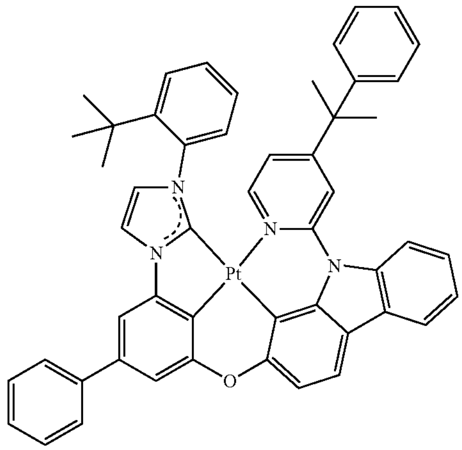
673
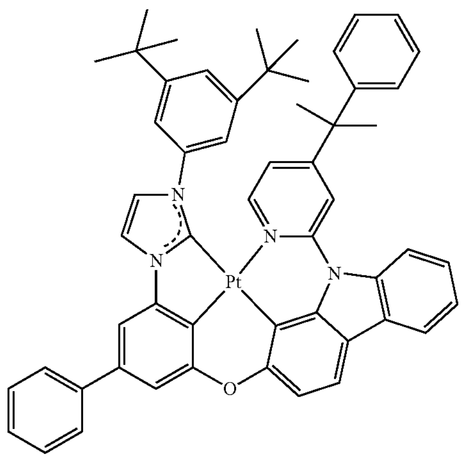
674
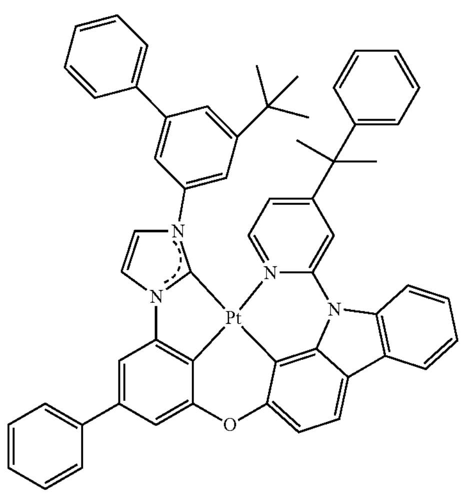
-continued
675
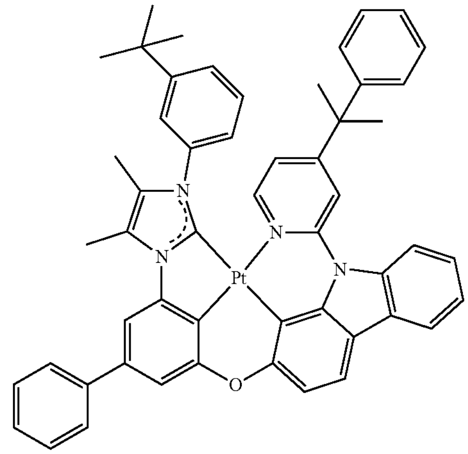
676
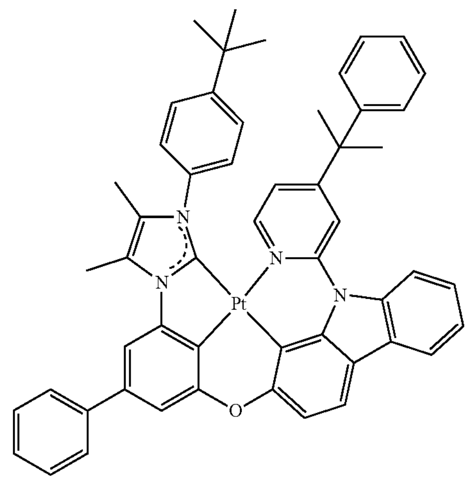
677
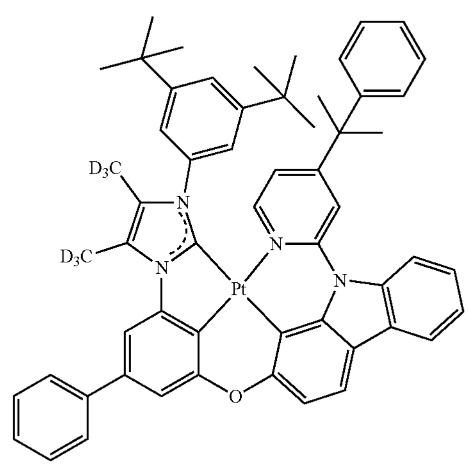

-continued
678
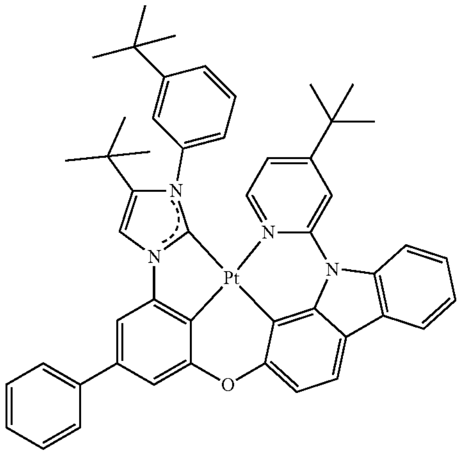
681
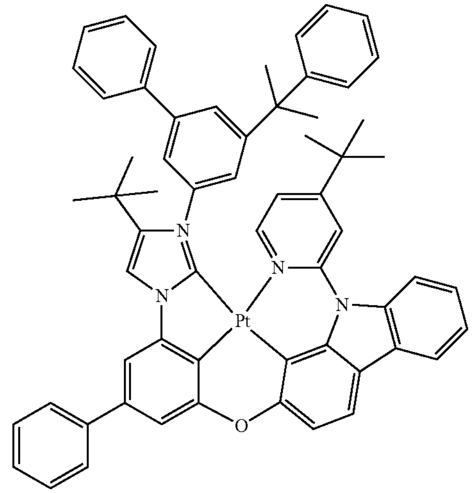
679
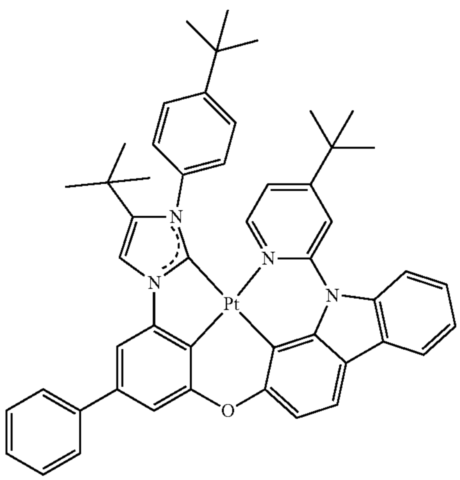
682
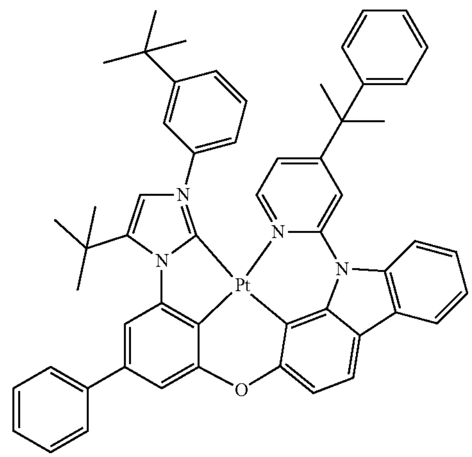
680
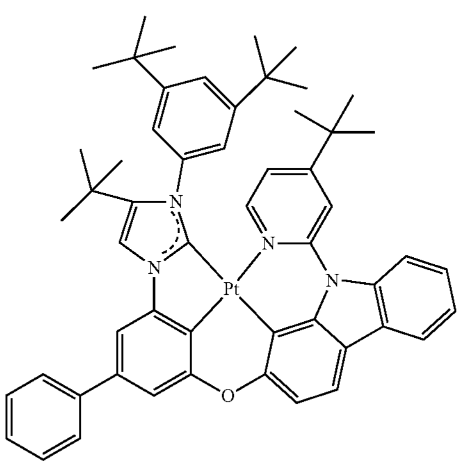
683
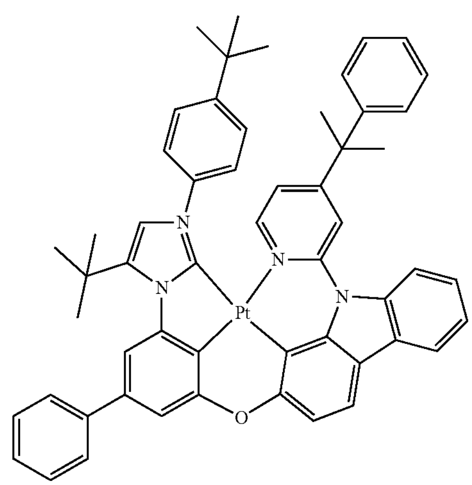

-continued
684
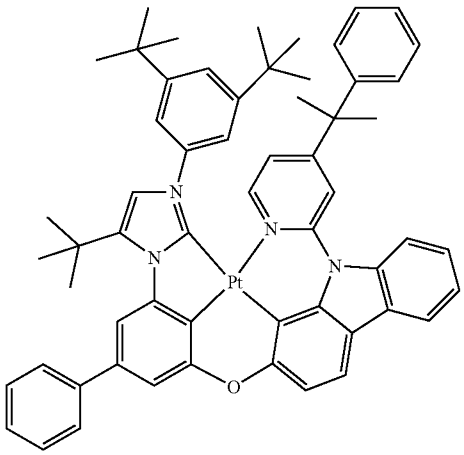
685
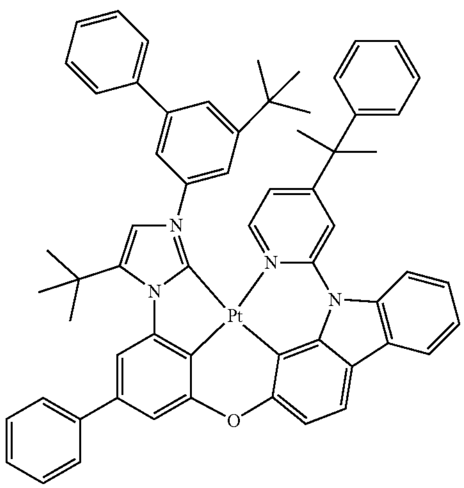
686
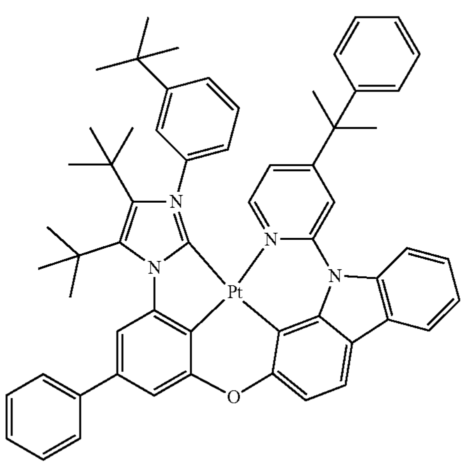
-continued
687
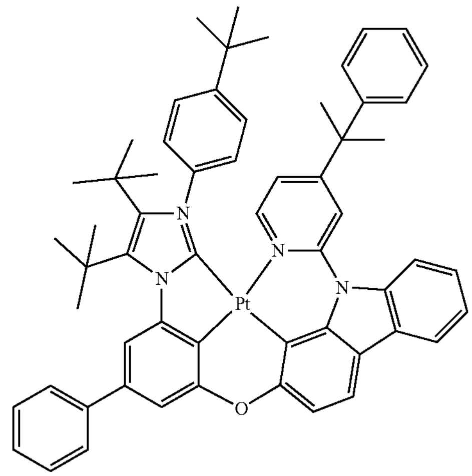
688
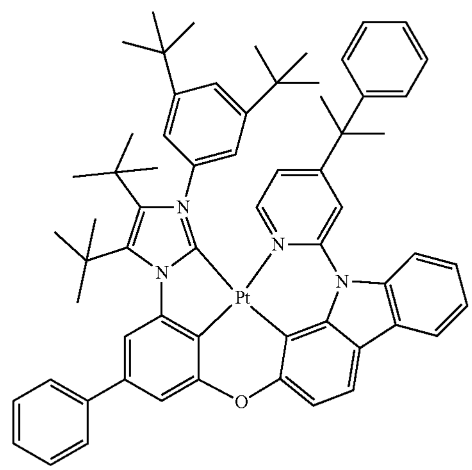
689
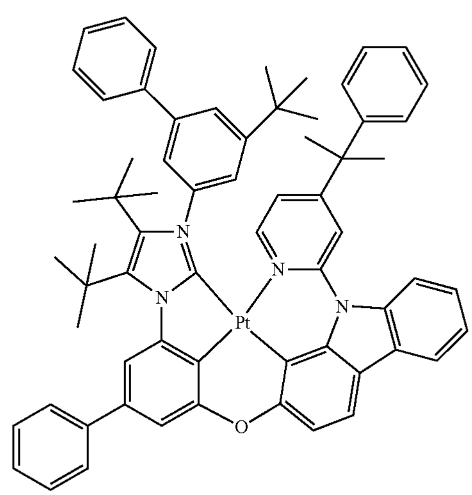

-continued
690
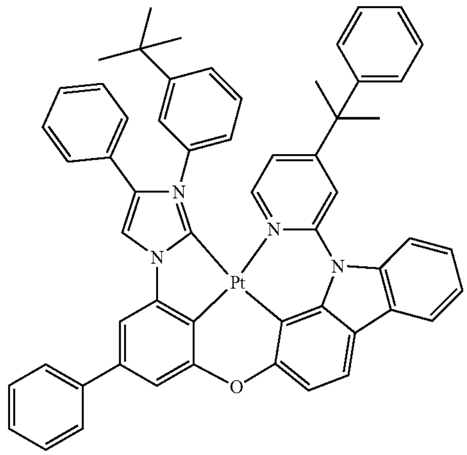
691
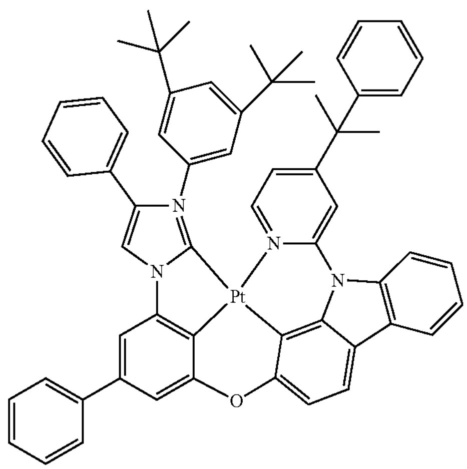
692
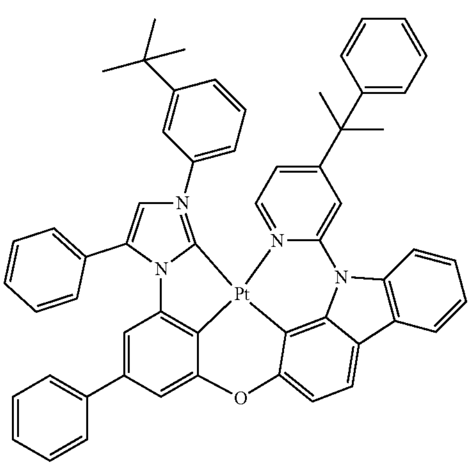
-continued
693
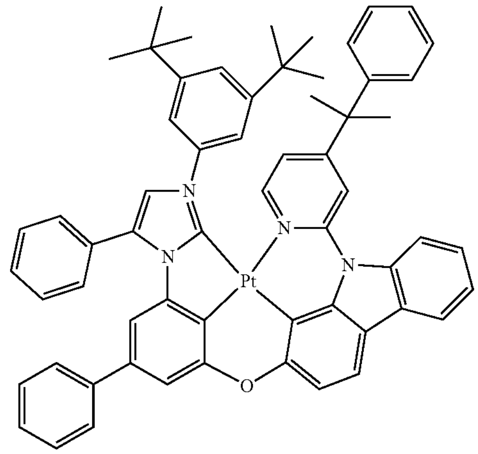
694
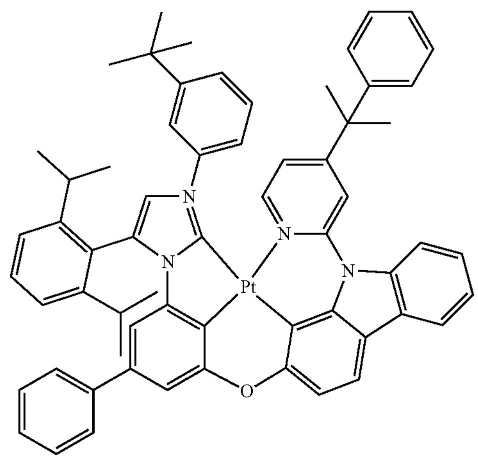
695
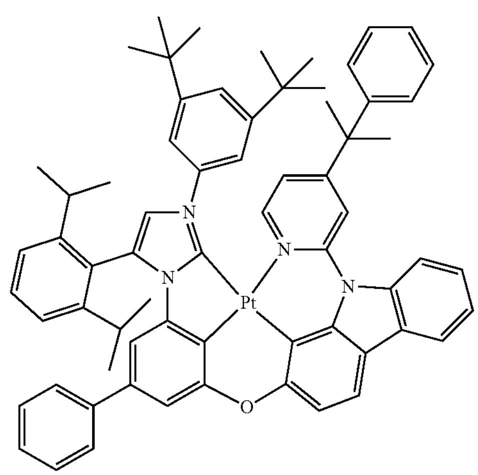

696
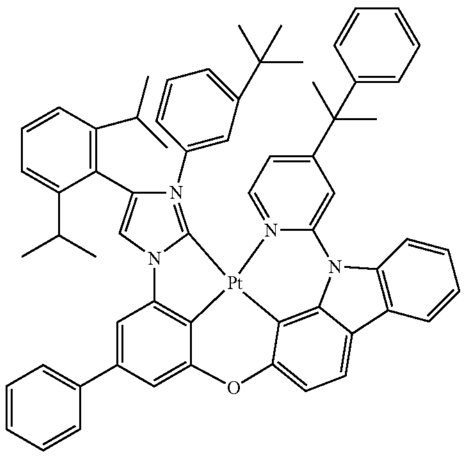
697
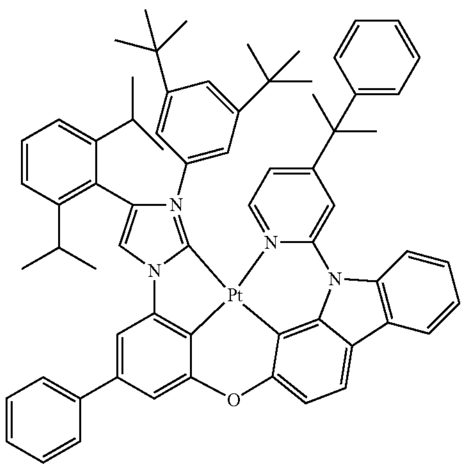
698
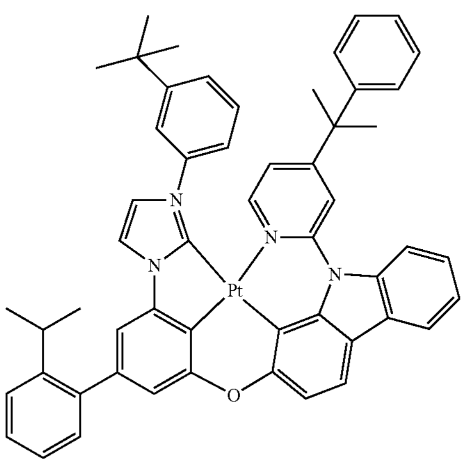
699
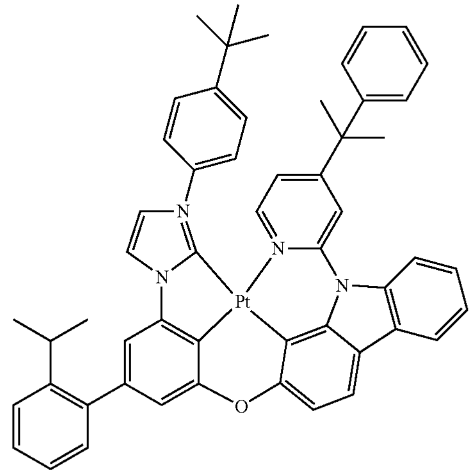
700
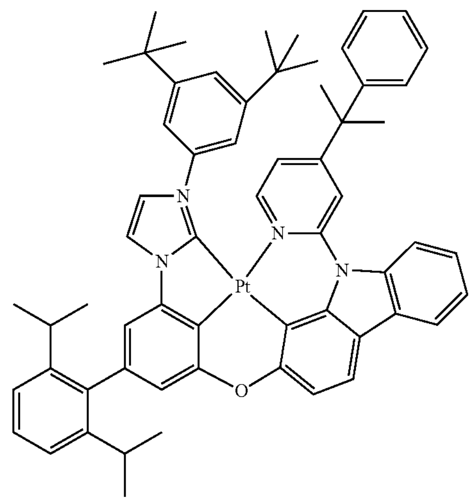
701
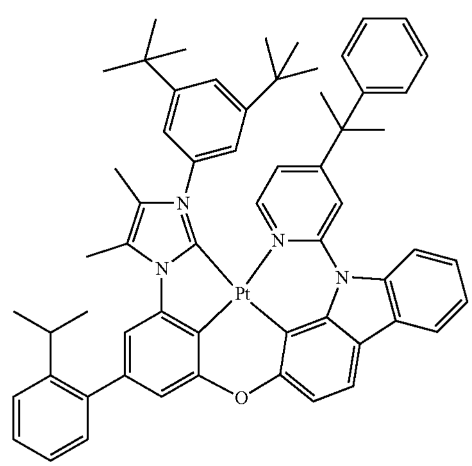

-continued
702
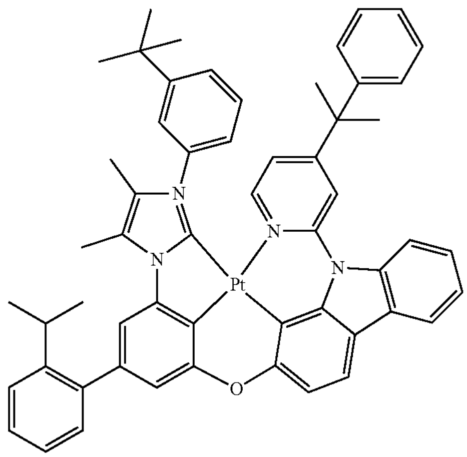
703
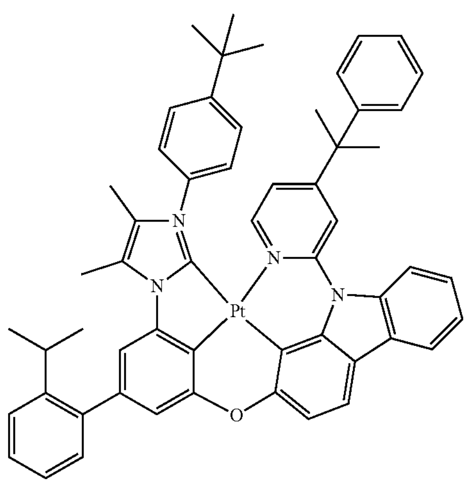
704
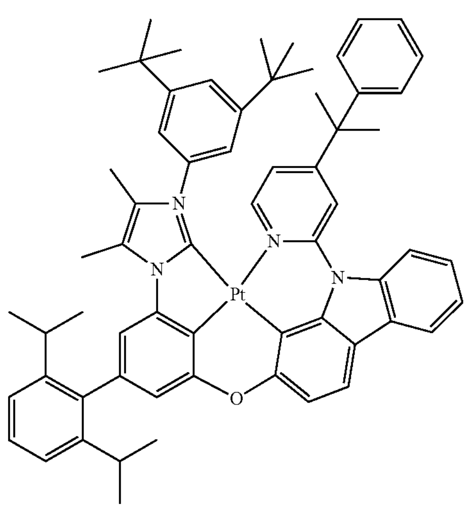
-continued
705
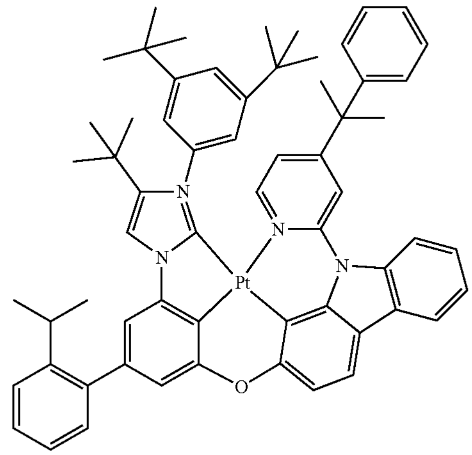
706
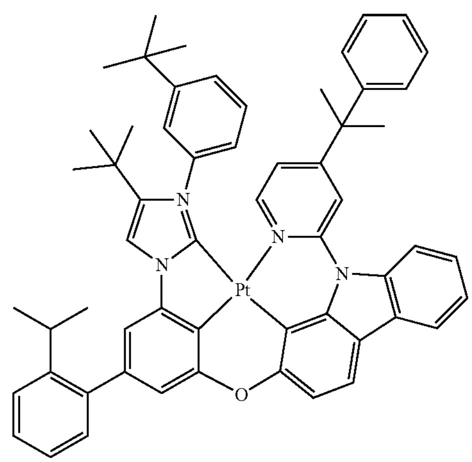
707
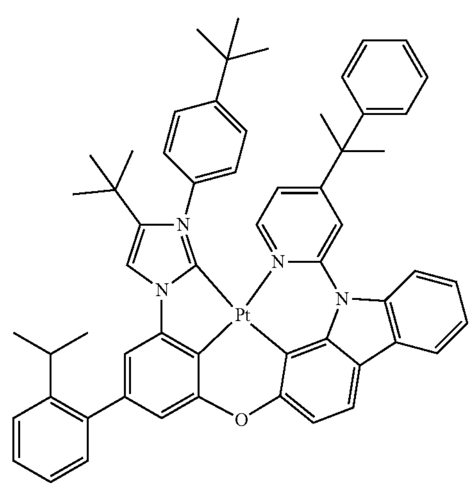

-continued
708
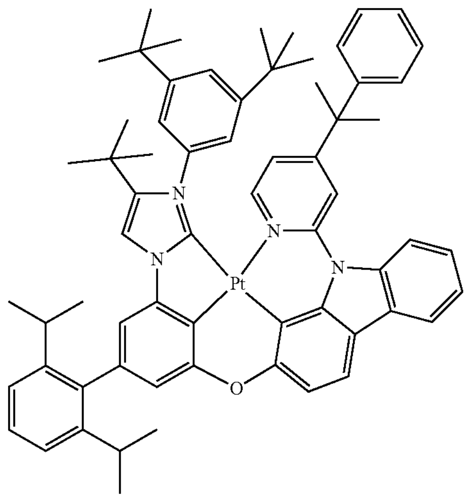
709
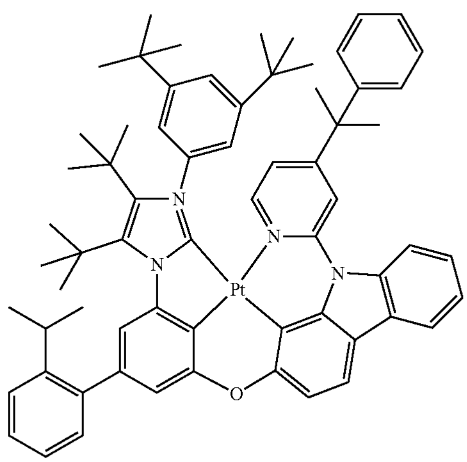
710
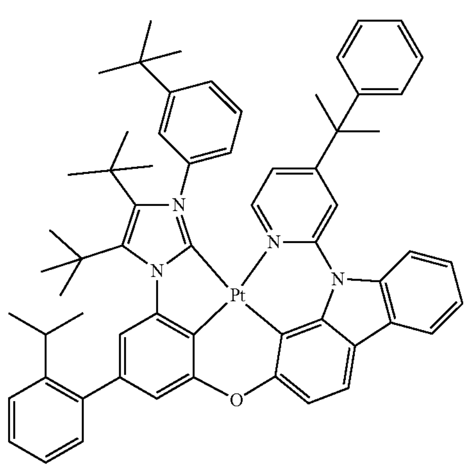
-continued
711
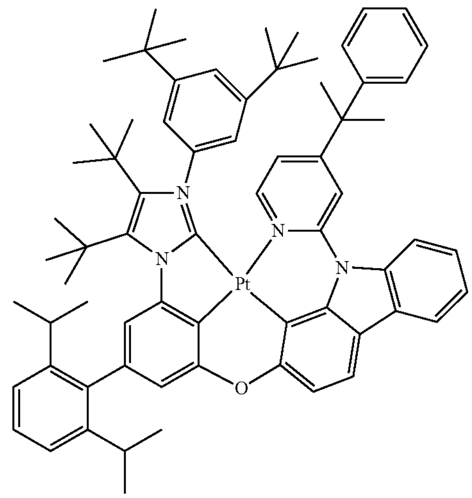
712
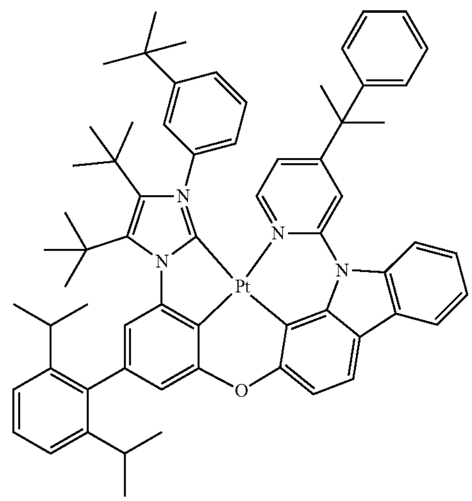
713
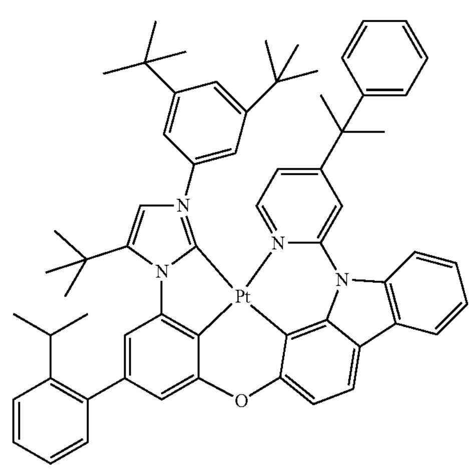

-continued
714
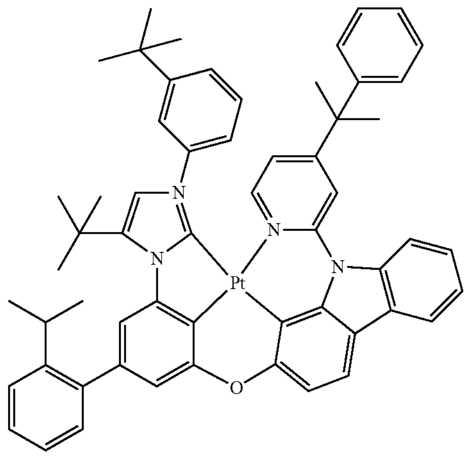
715
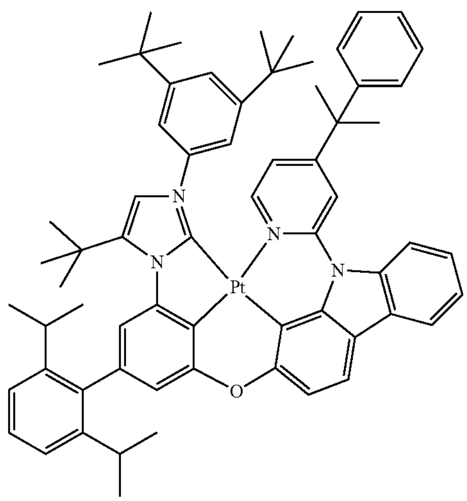
716
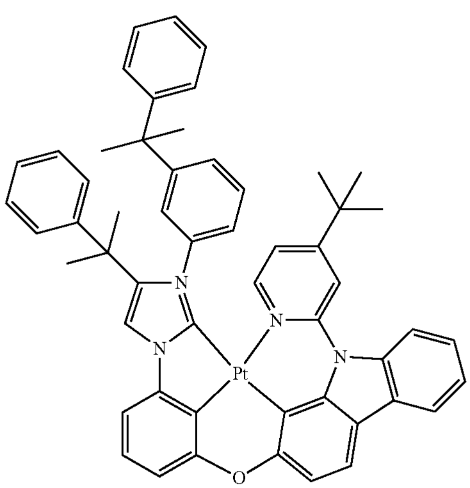
-continued
717
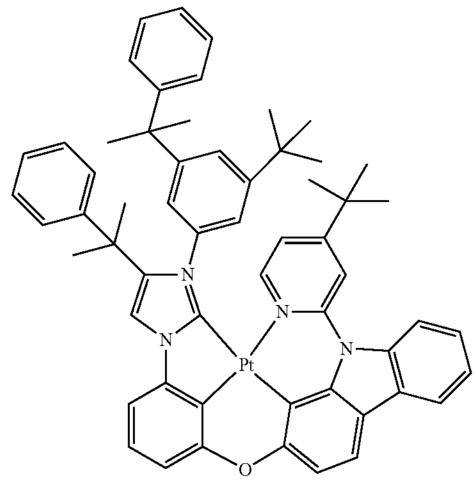
718
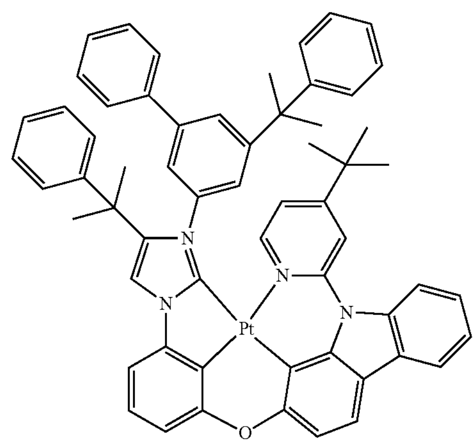
719
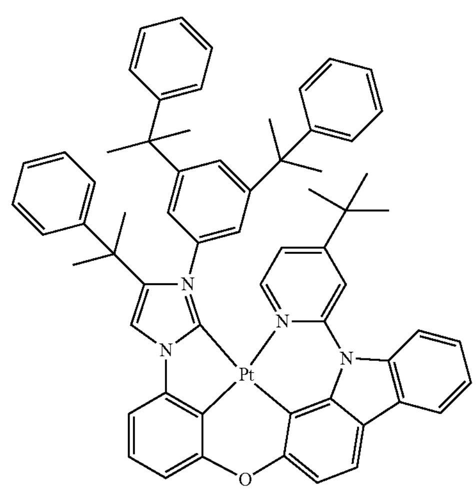

-continued
720
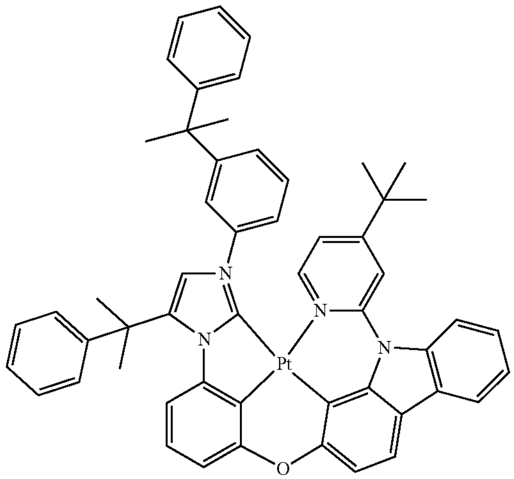
721
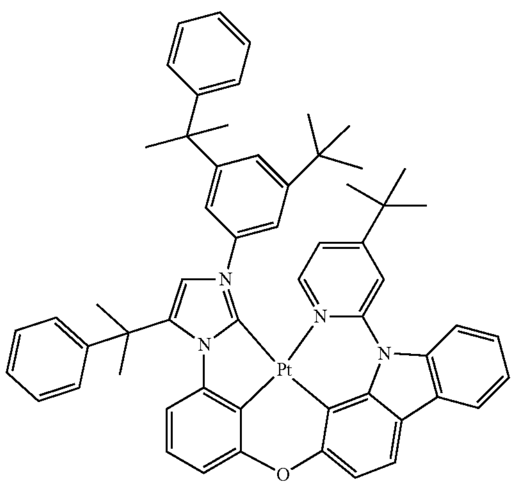
722
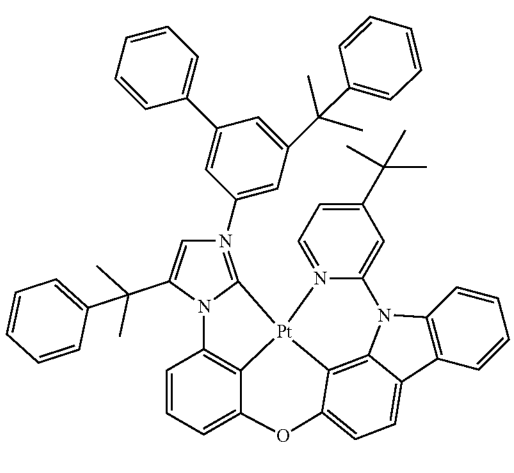
-continued
723
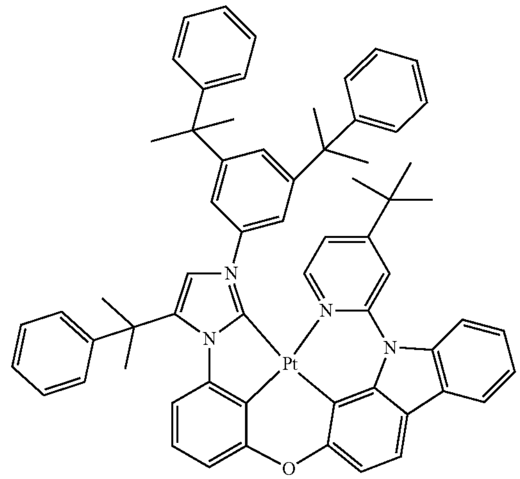
724
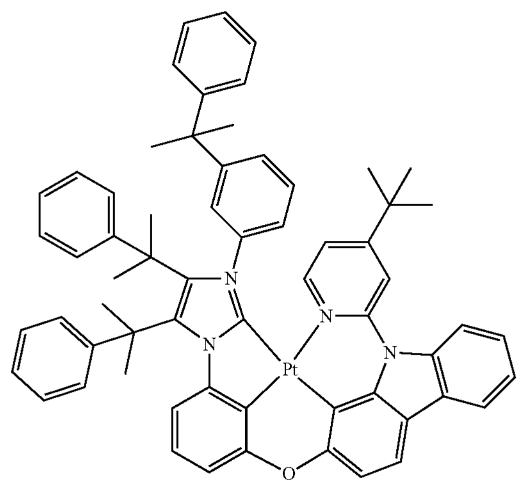
725
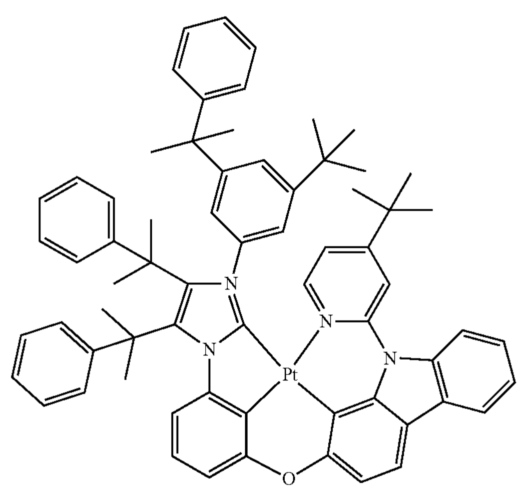

-continued
726
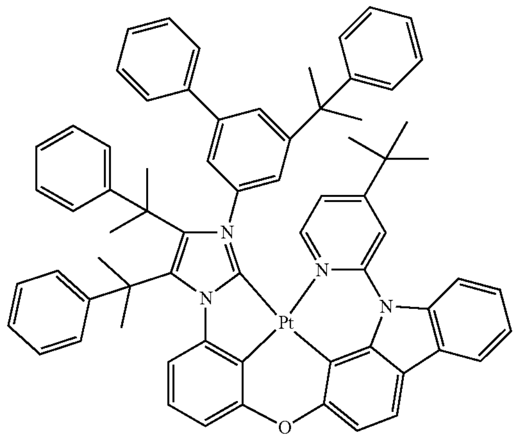
727
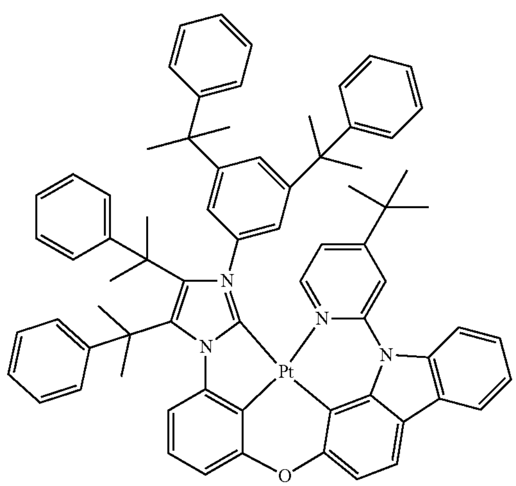
728
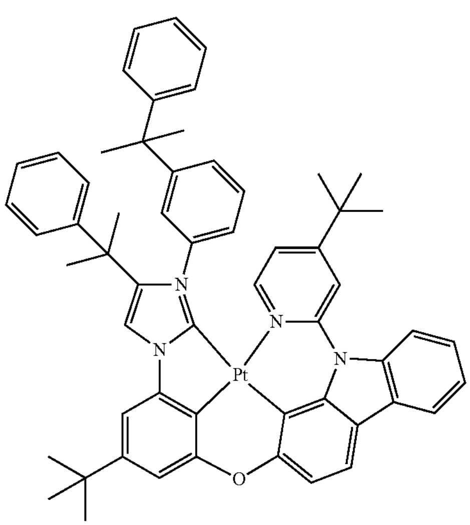
-continued
729
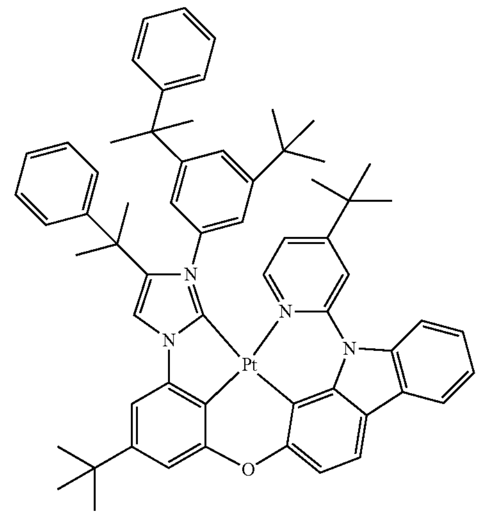
730
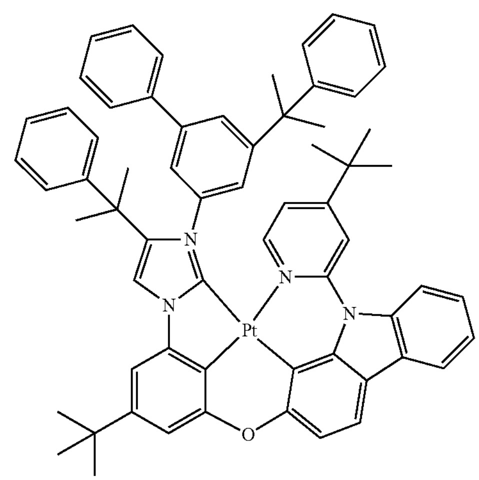
731
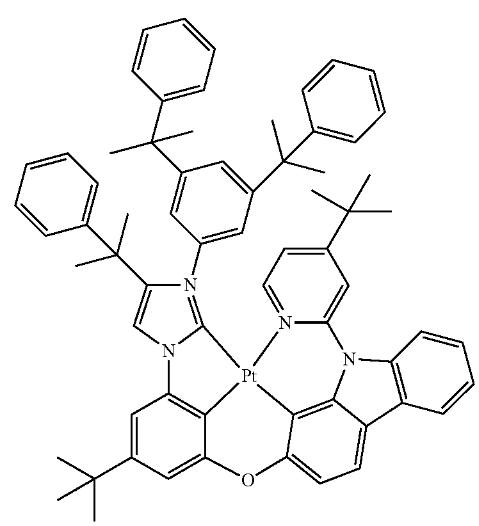

-continued
732
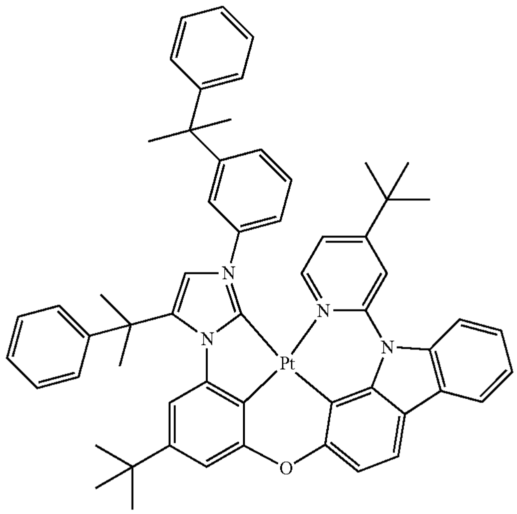
733
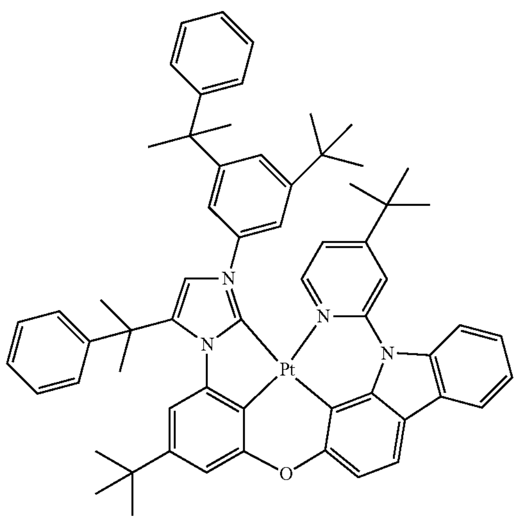
734
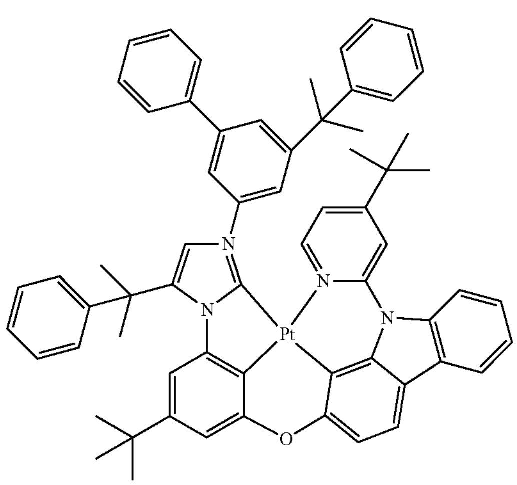
-continued
735
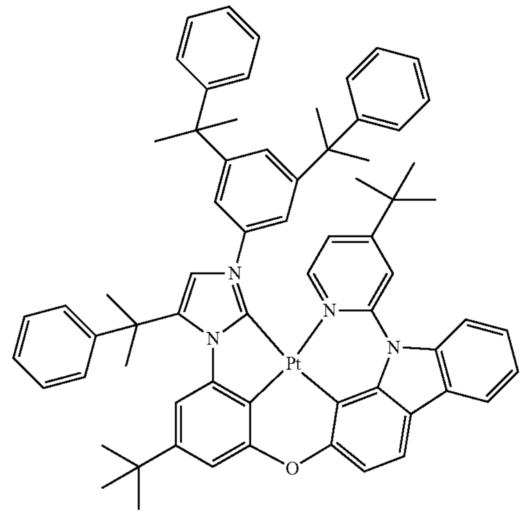
736
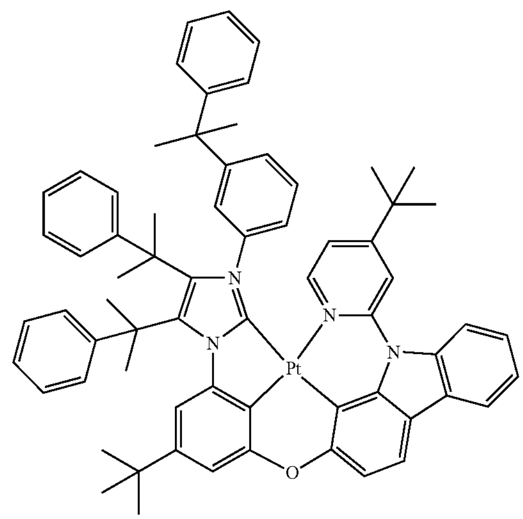
737
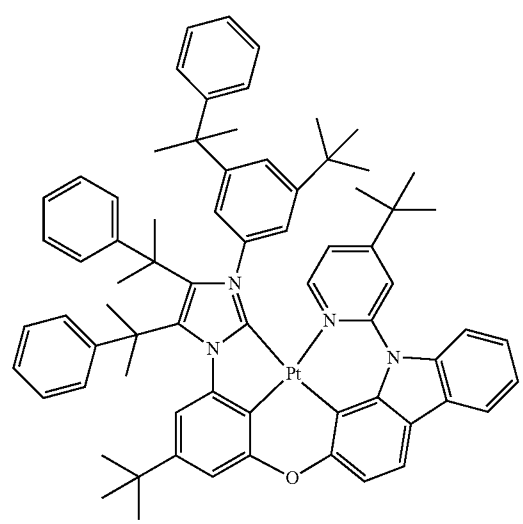

-continued
738
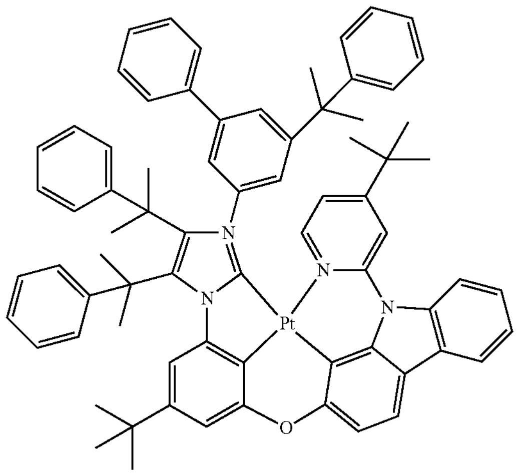
739
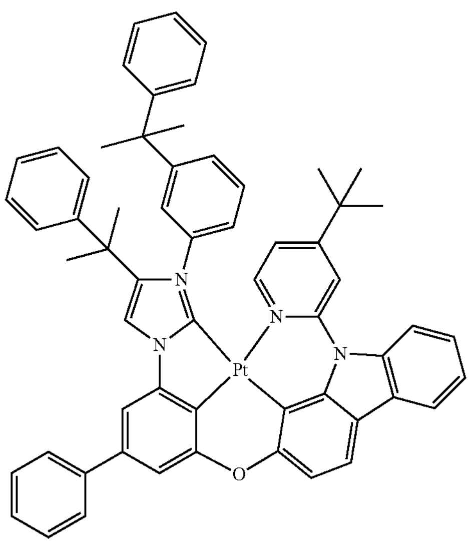
740
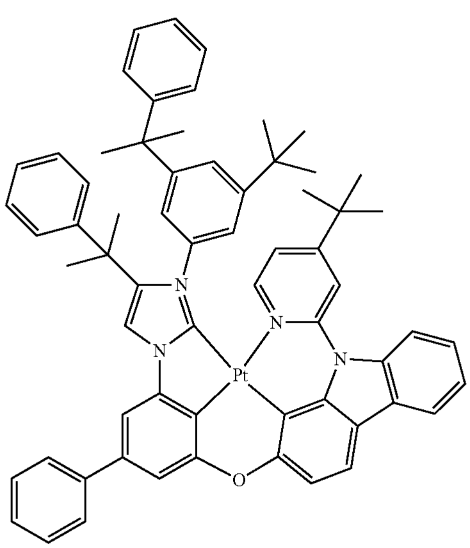
-continued
741
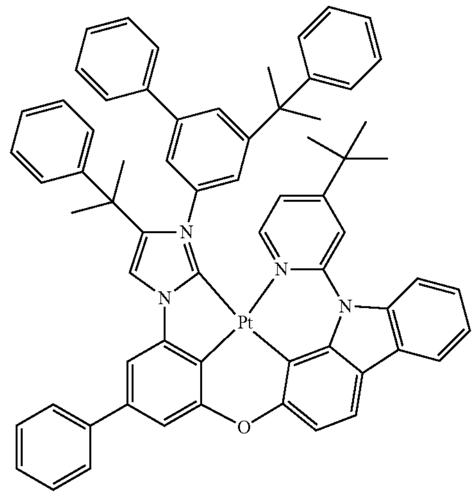
742
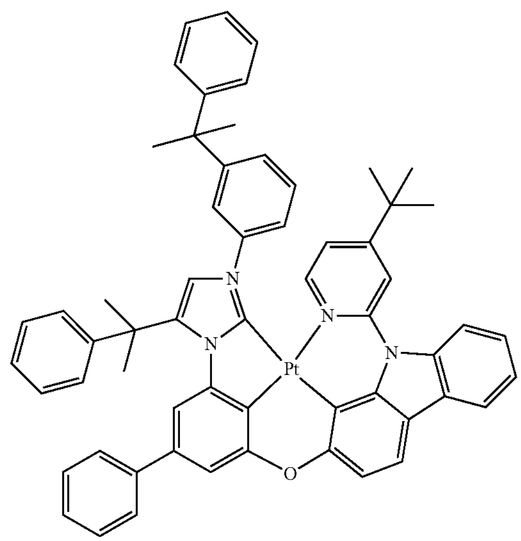
743
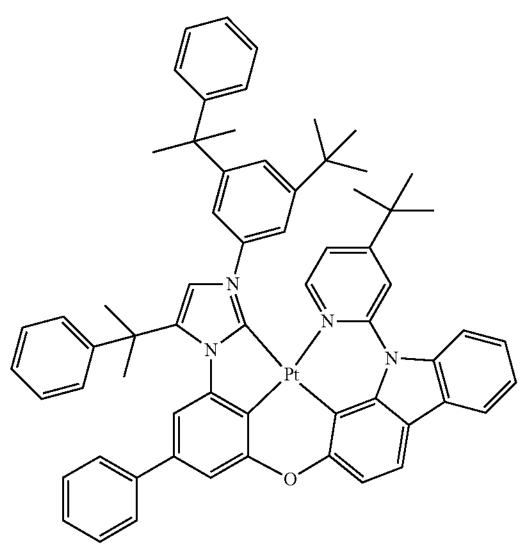

-continued
744
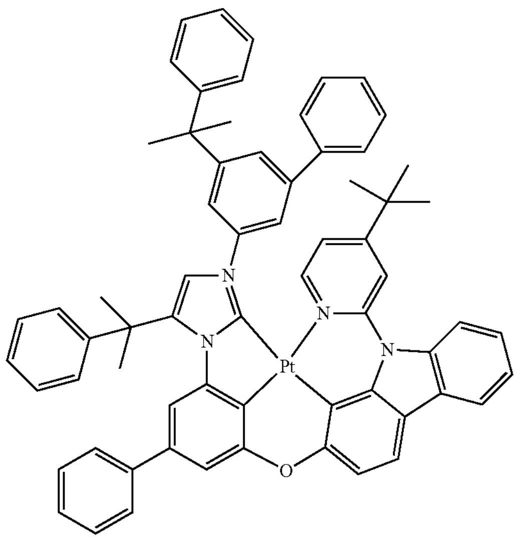
745
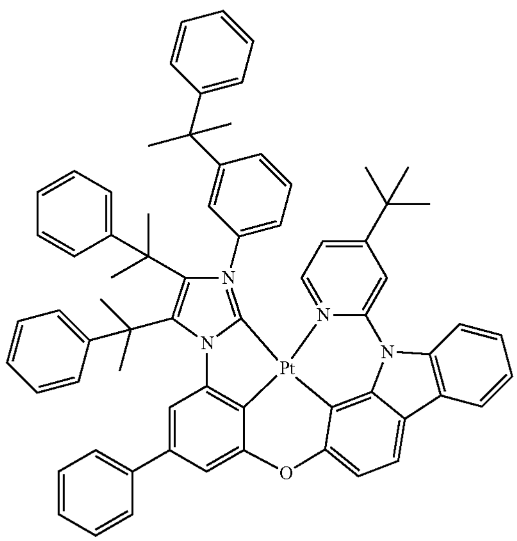
746
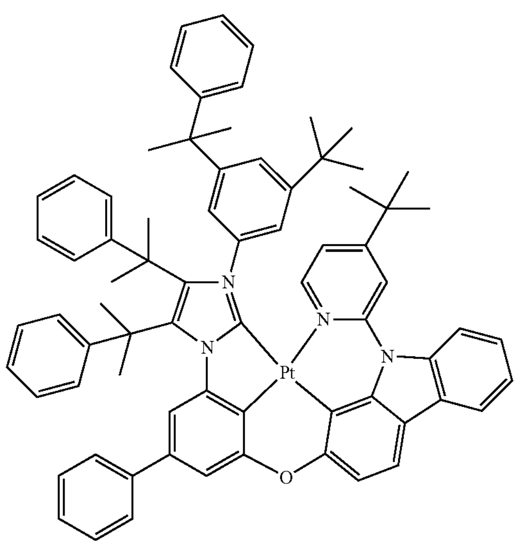
-continued
747
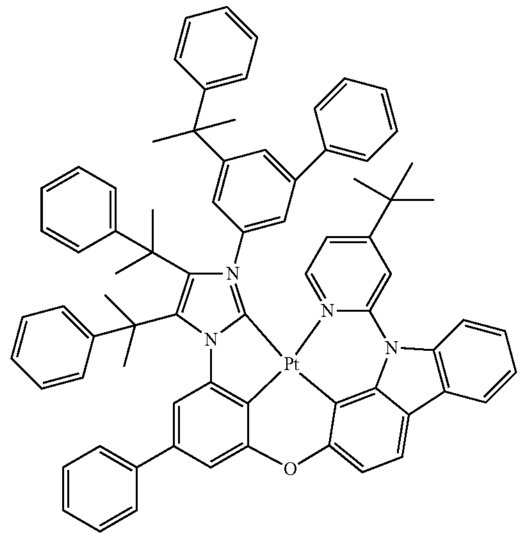
748
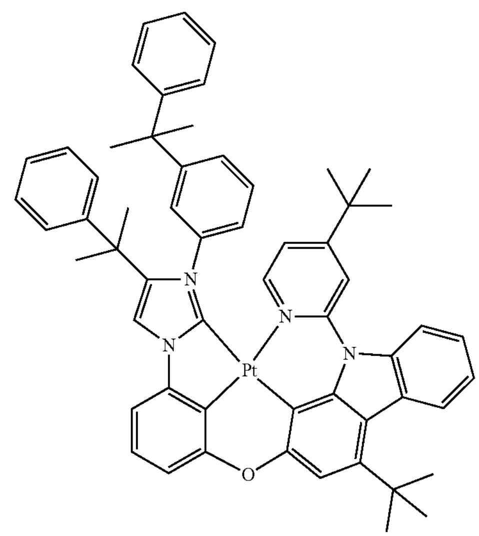
749
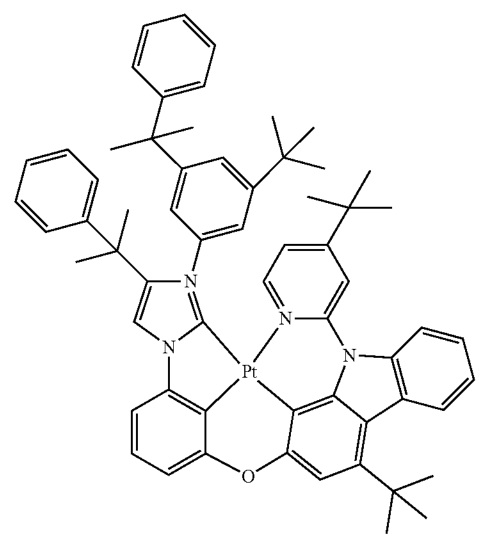

-continued
750
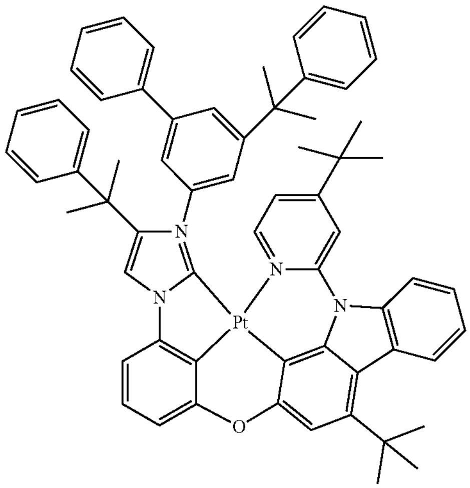
751
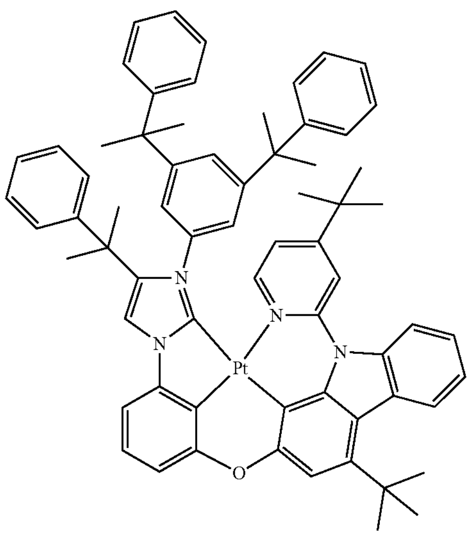
752
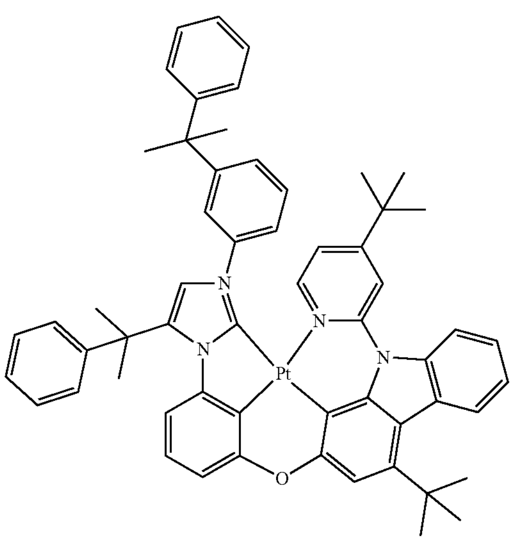
-continued
753
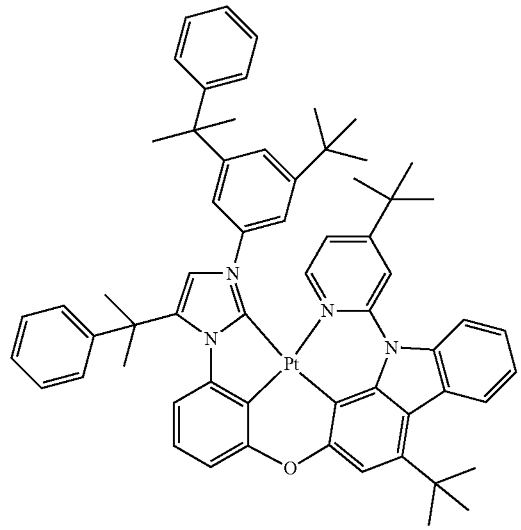
754
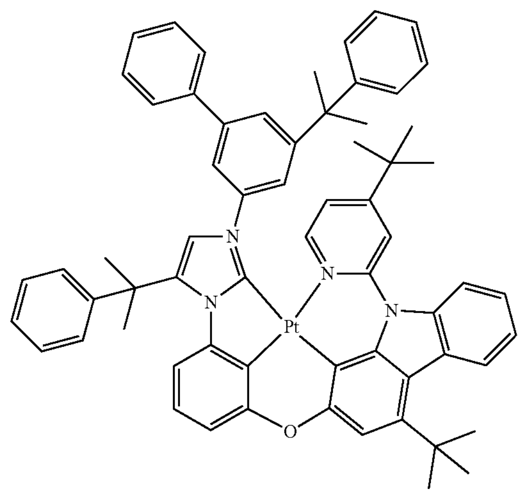
755
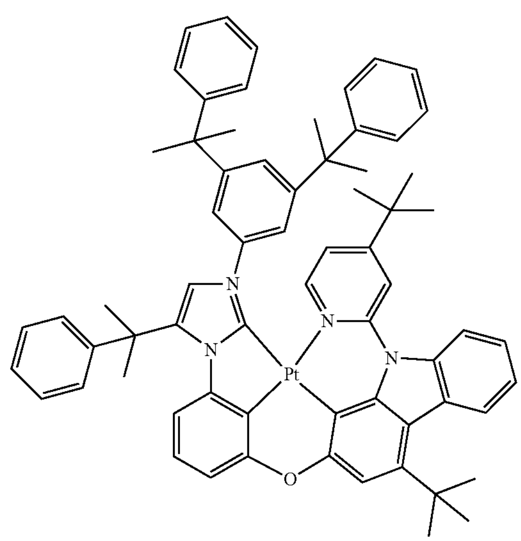

-continued
756
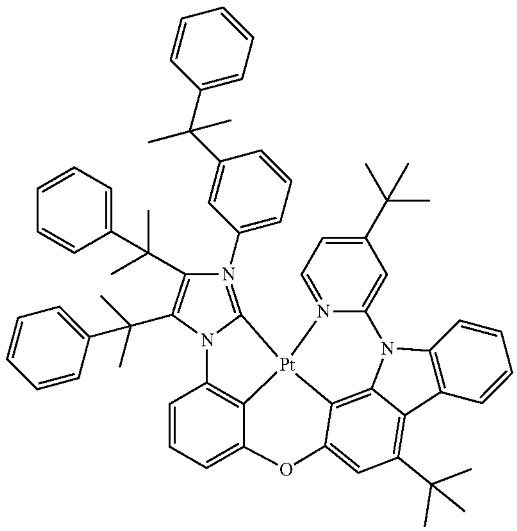
757
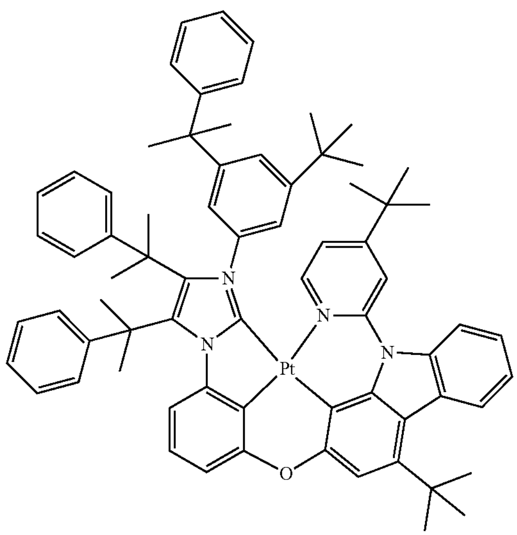
758
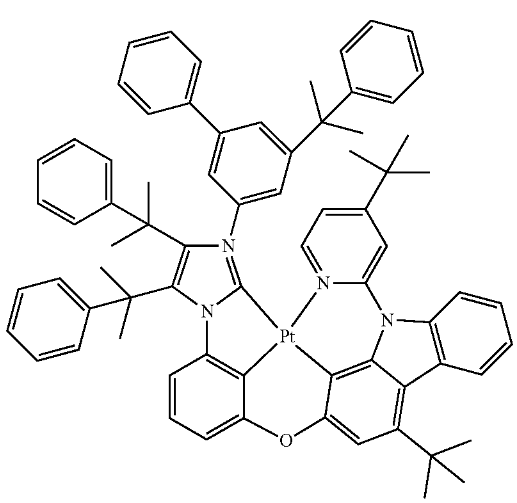
-continued
759
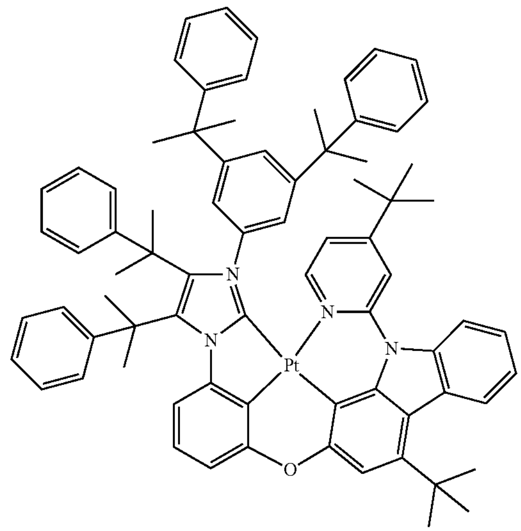
760
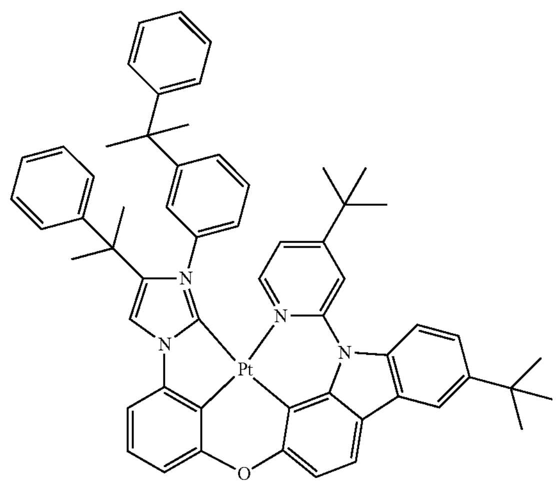
761
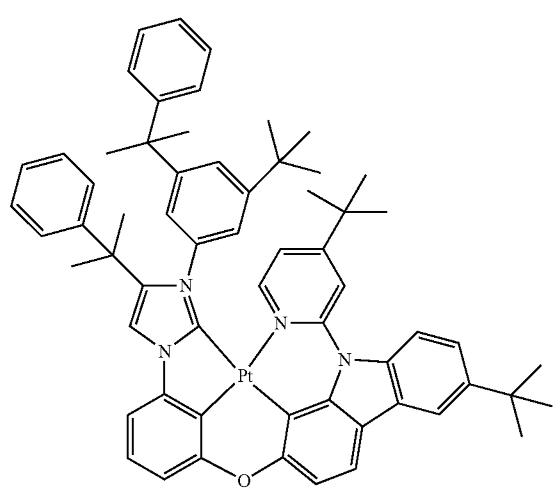

-continued
762
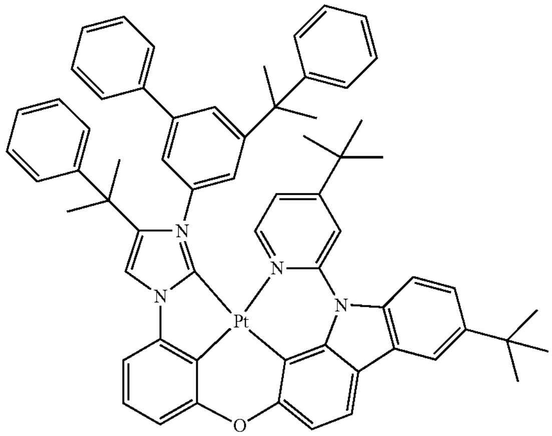
763
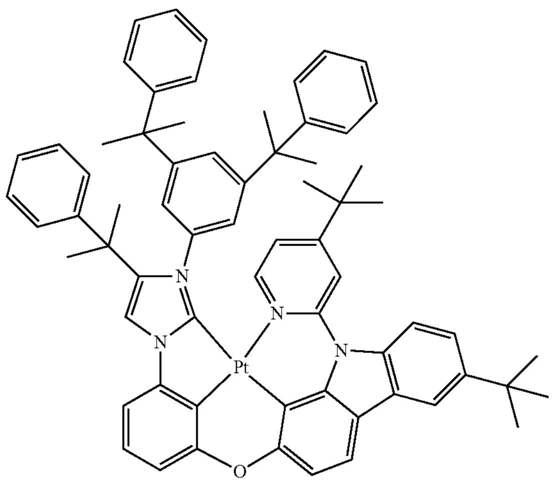
764
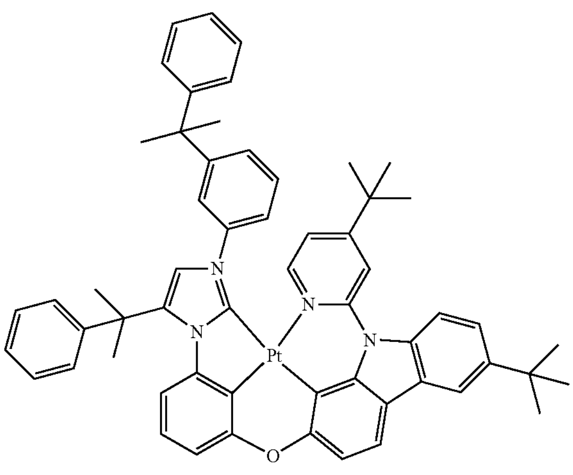
-continued
765
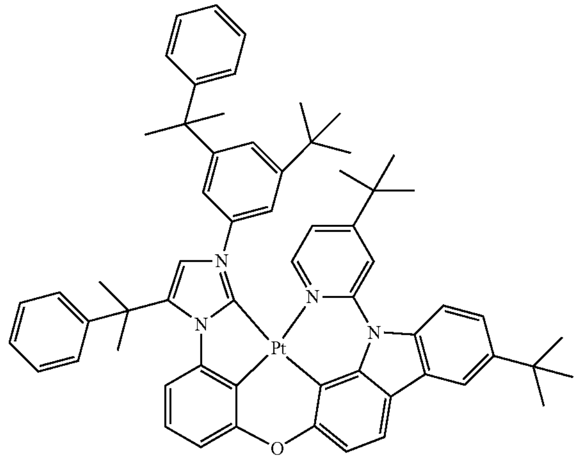
766
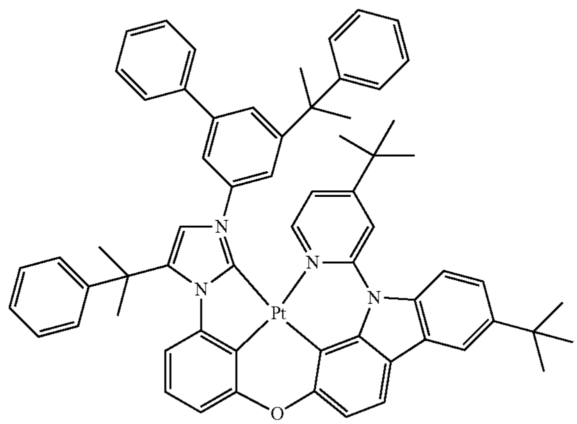
767
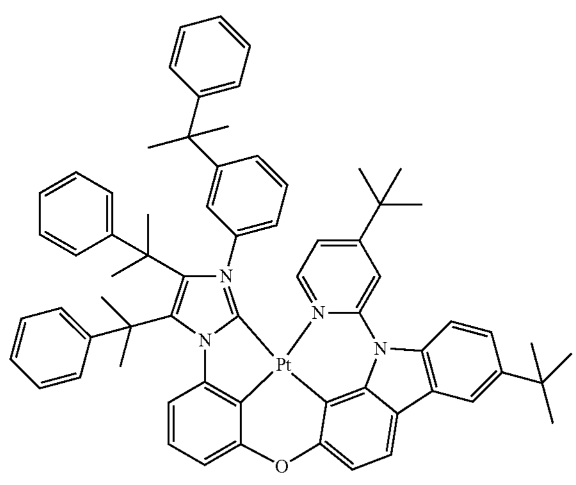

768
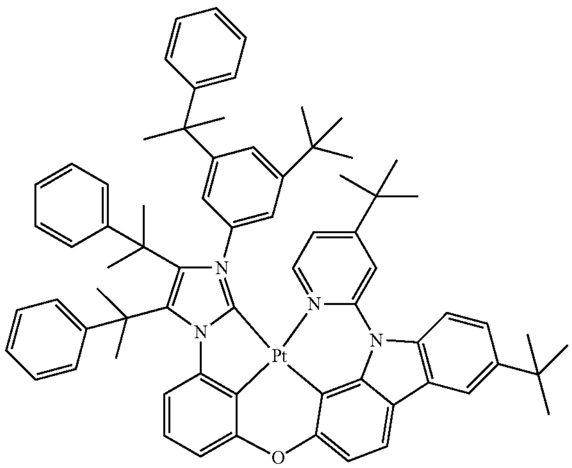
769
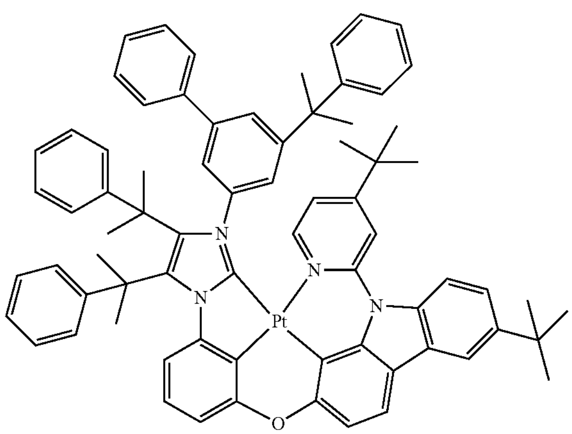
770
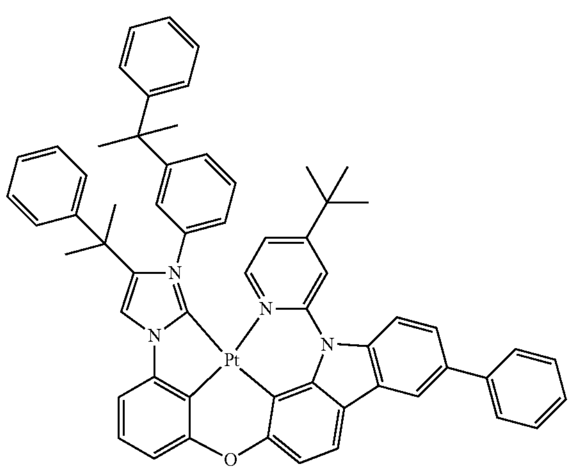
771
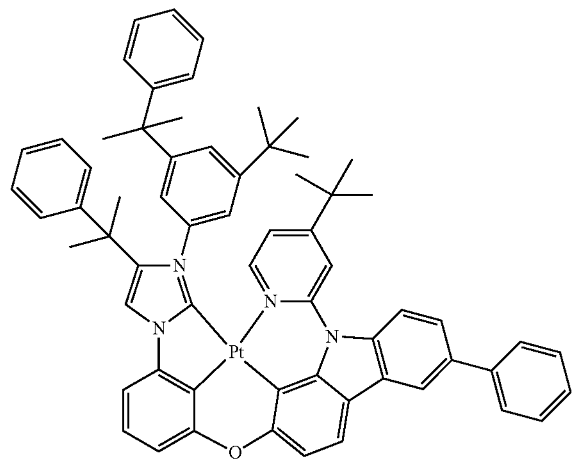
772
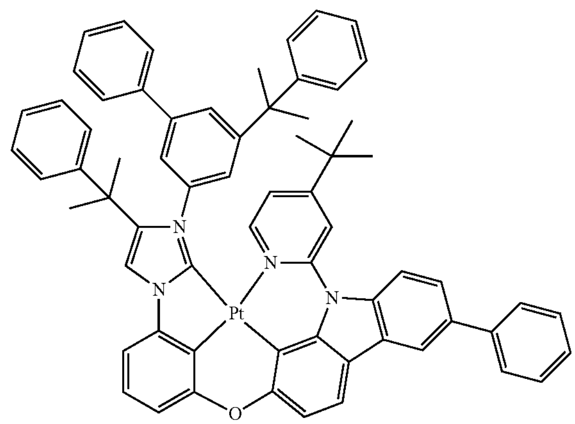
773
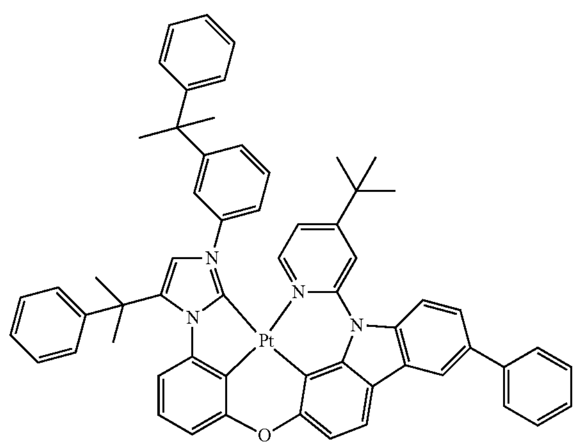

-continued
774
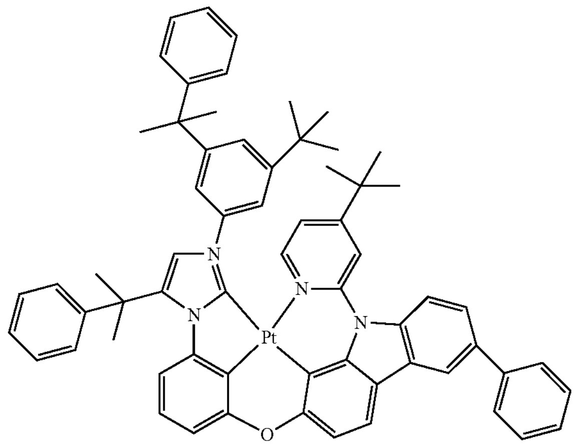
775
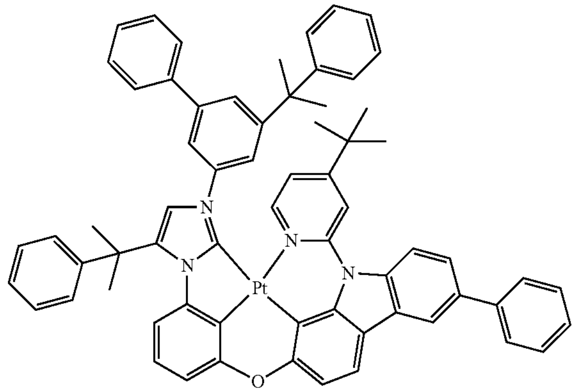
776
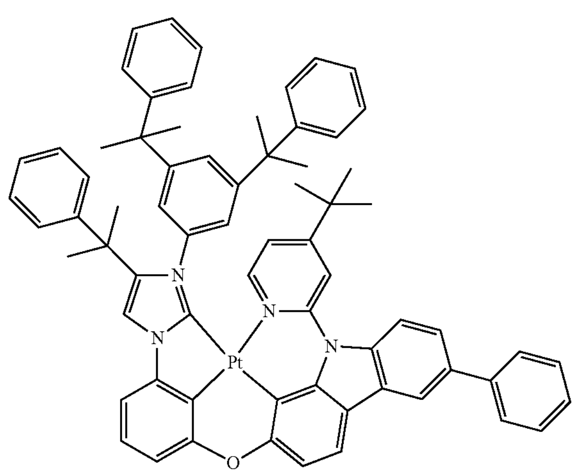
-continued
777
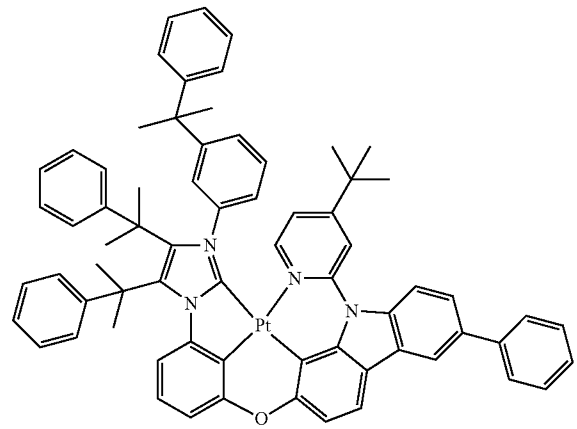
778
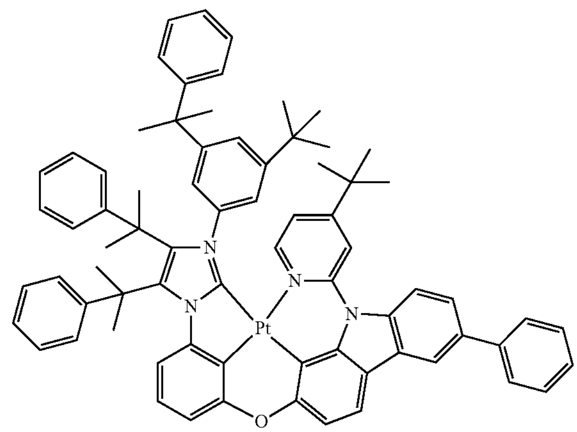
779
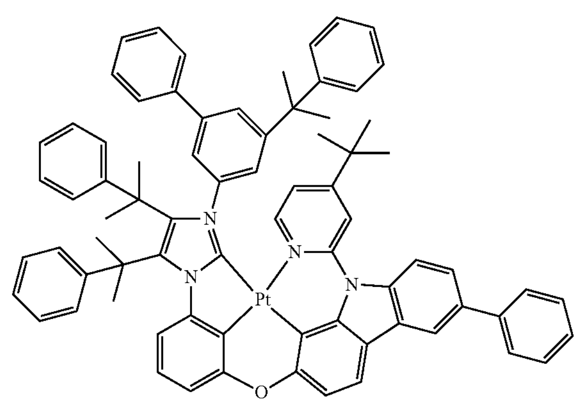

-continued
780
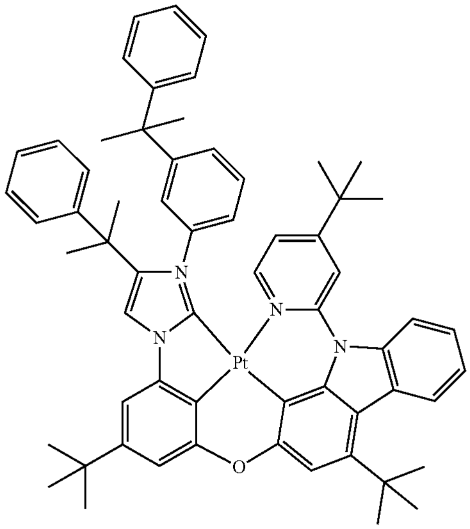
781
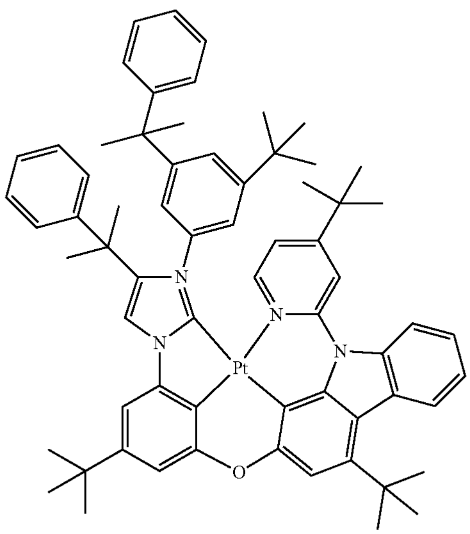
782
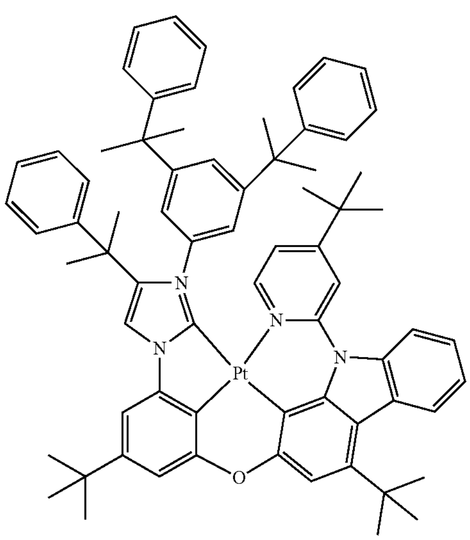
-continued
783
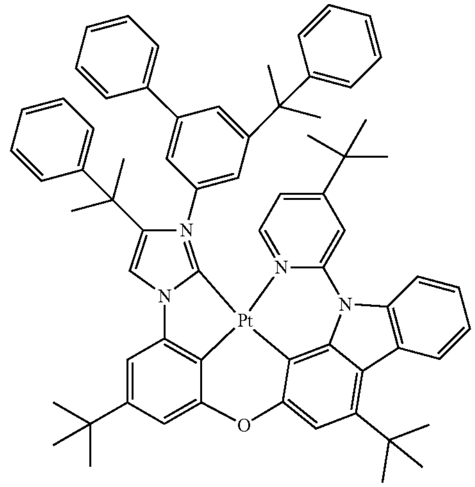
784
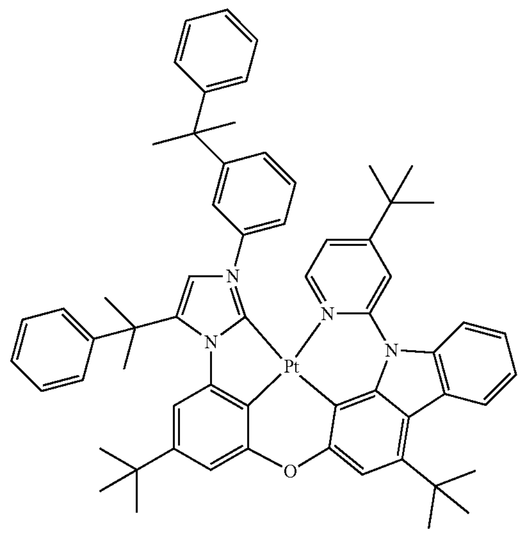
785
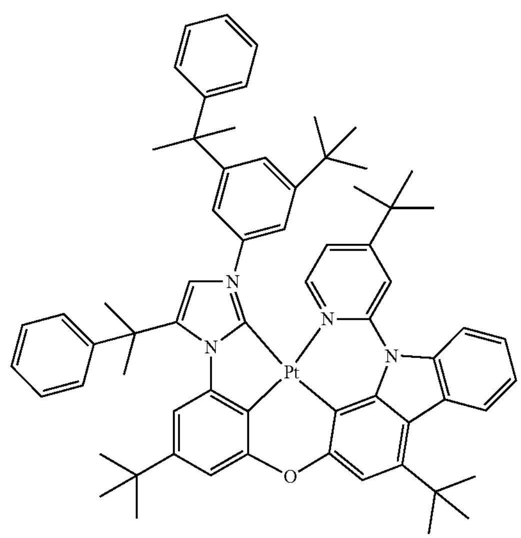

-continued
786
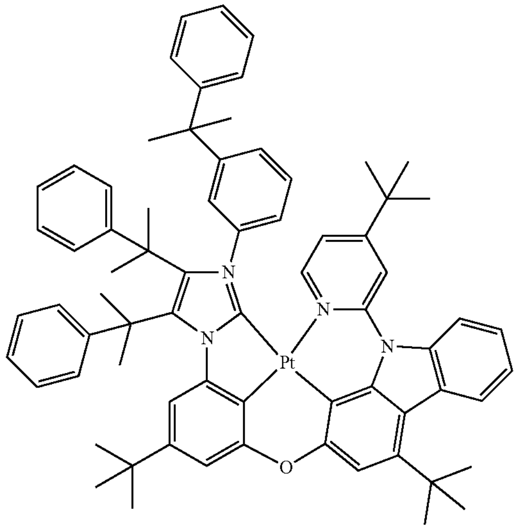
787
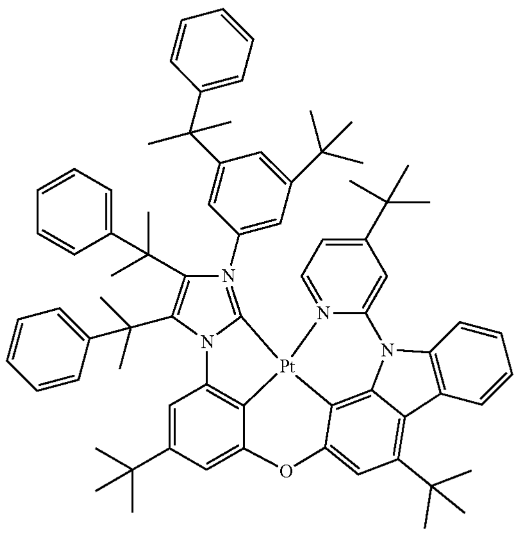
788
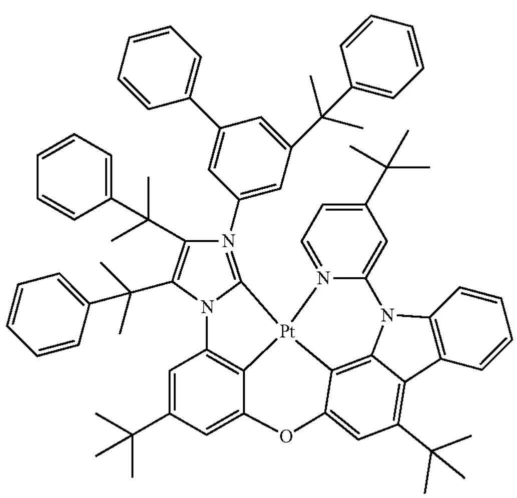
-continued
789
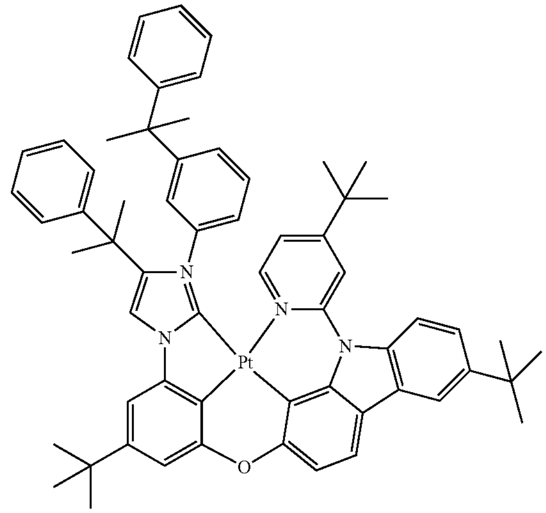
790
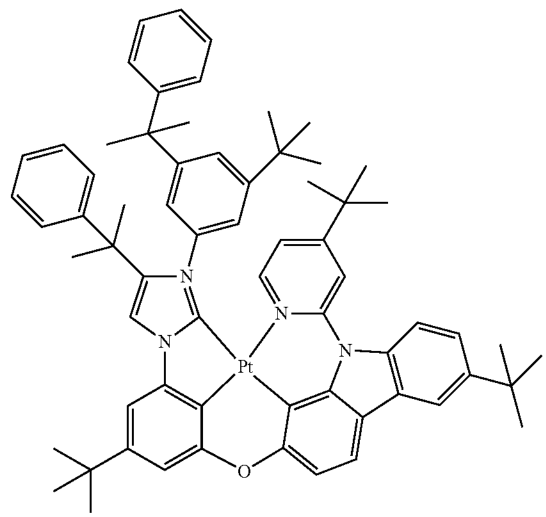
791
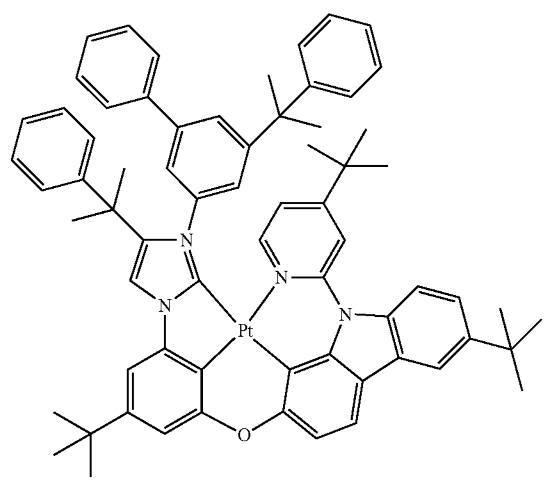

-continued
792
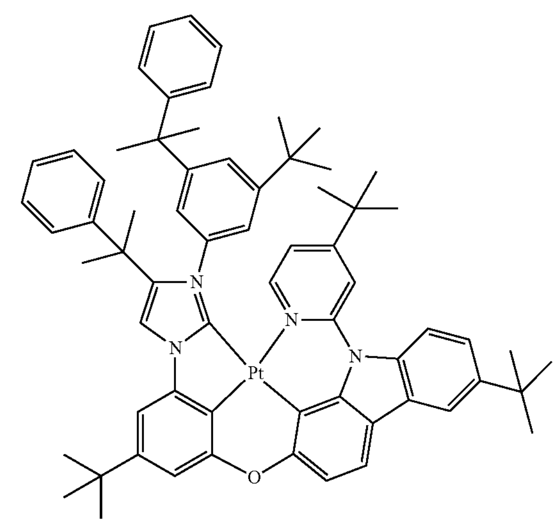
793
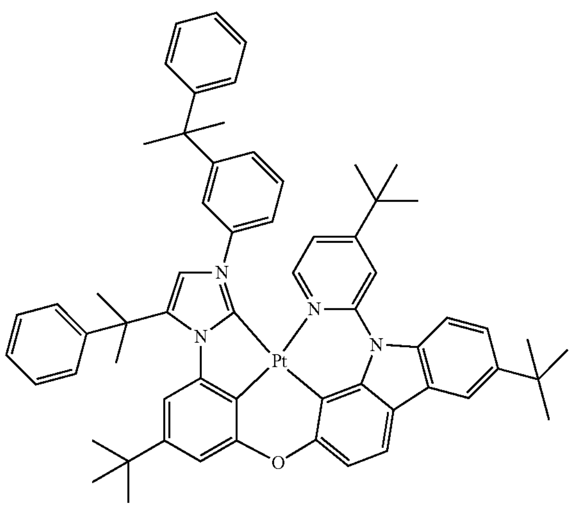
794
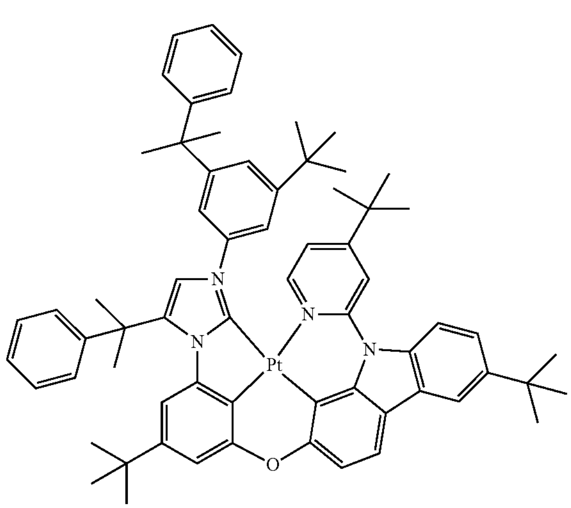
-continued
795
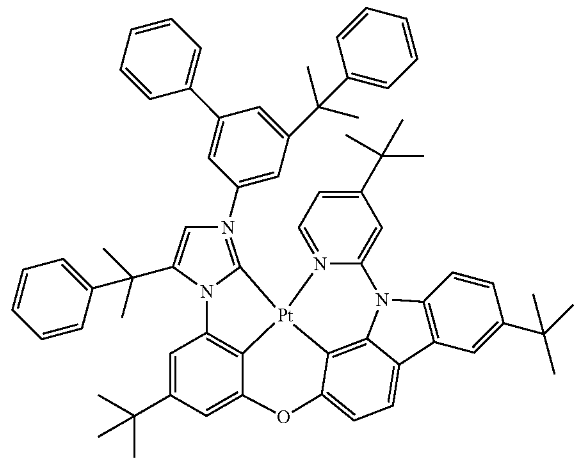
796
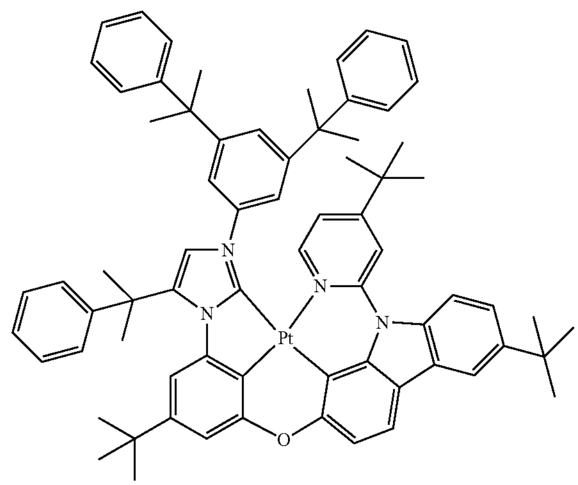
797
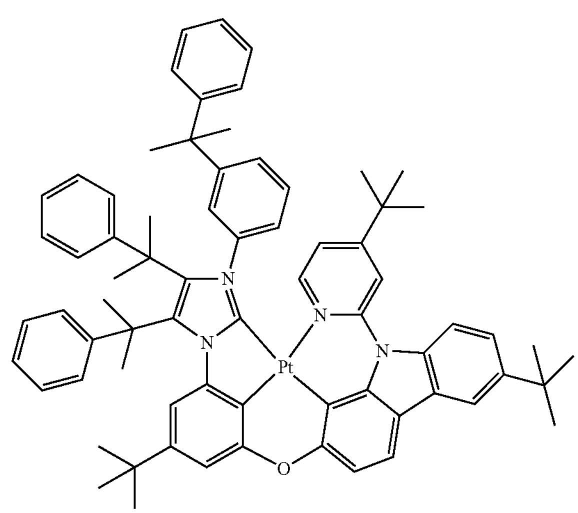

-continued
798
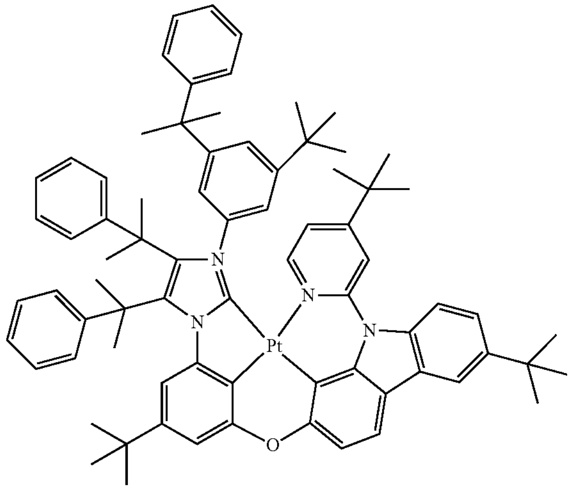
799
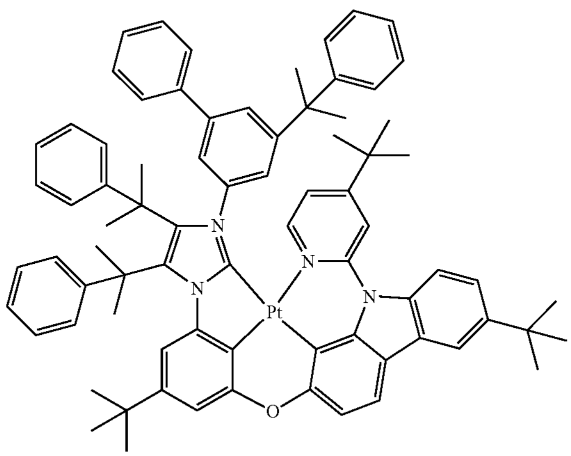
800
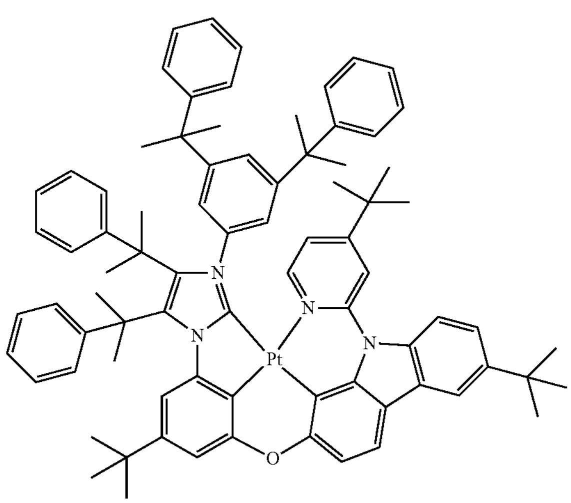
-continued
801
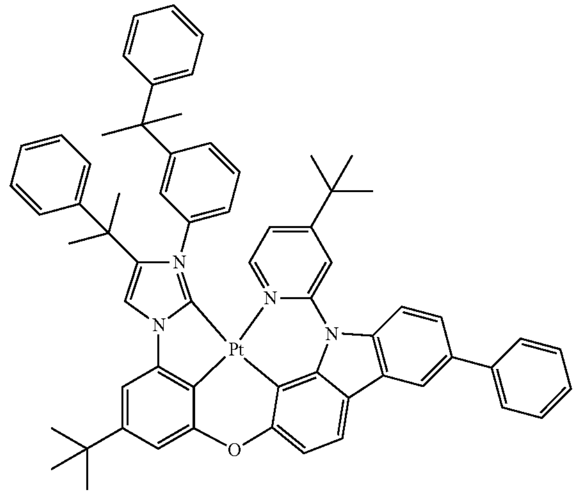
802
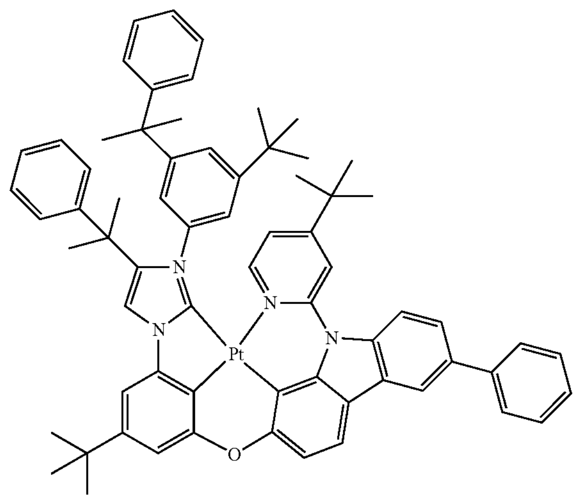
803
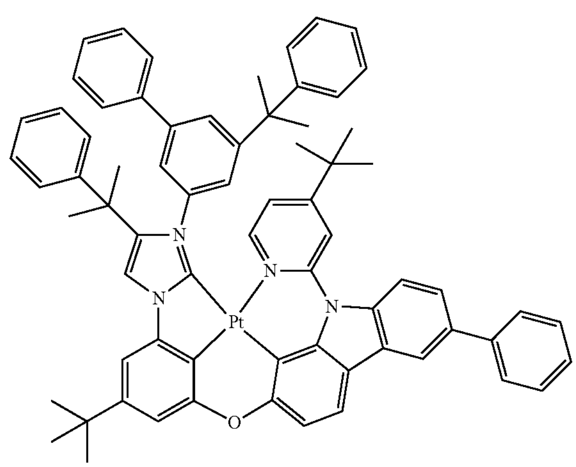

804
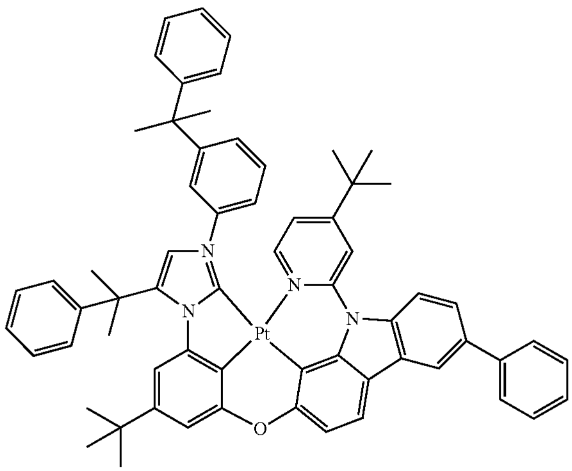
805
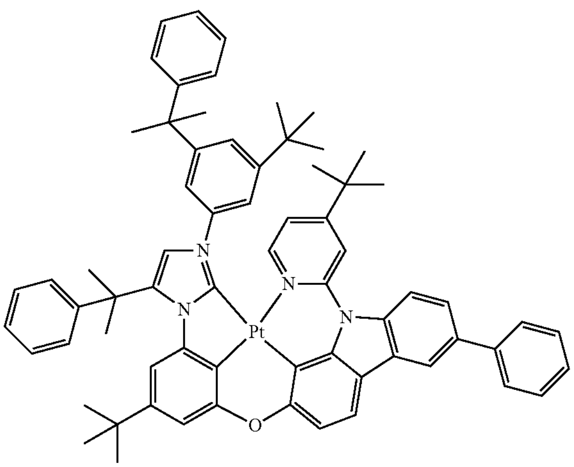
806
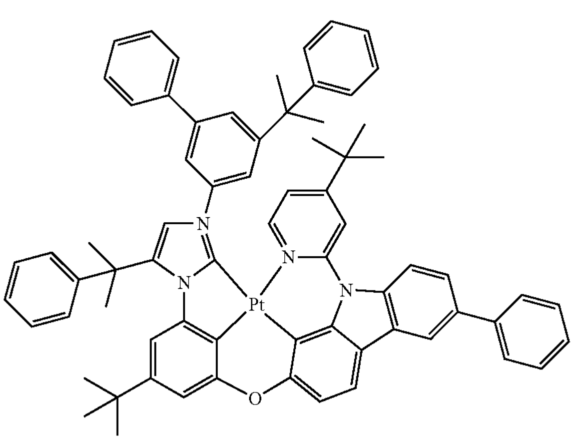
807
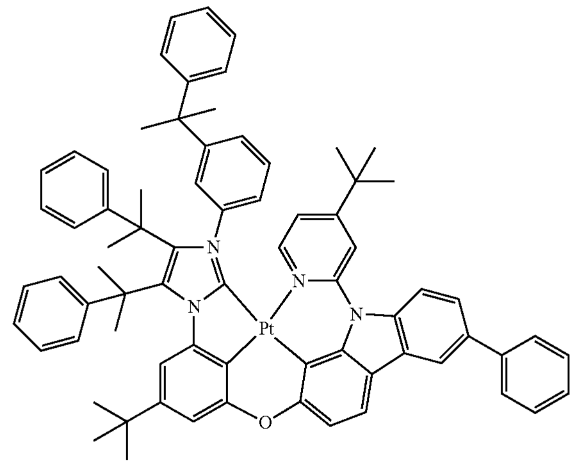
808
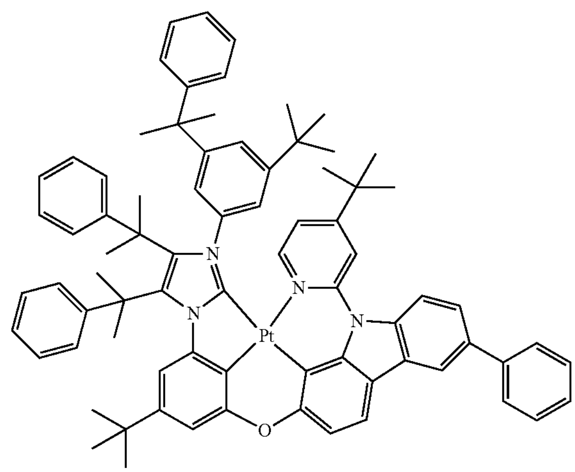
809
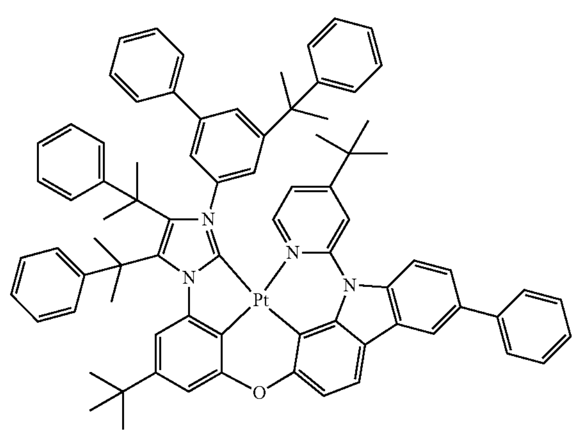

-continued
810
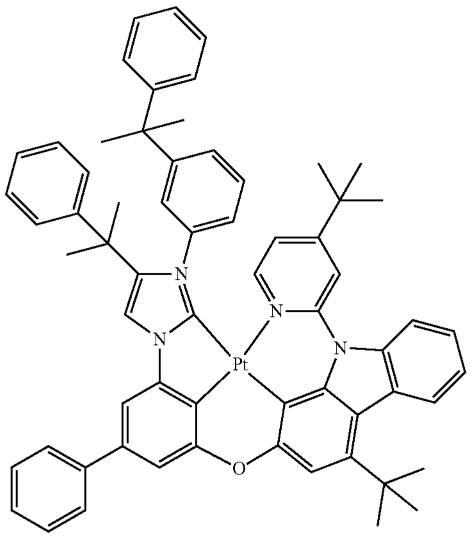
811
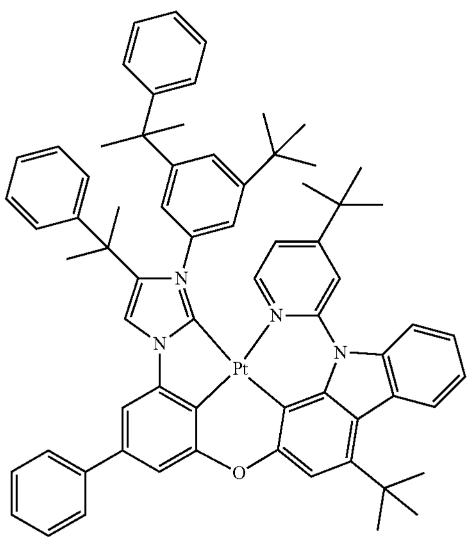
812
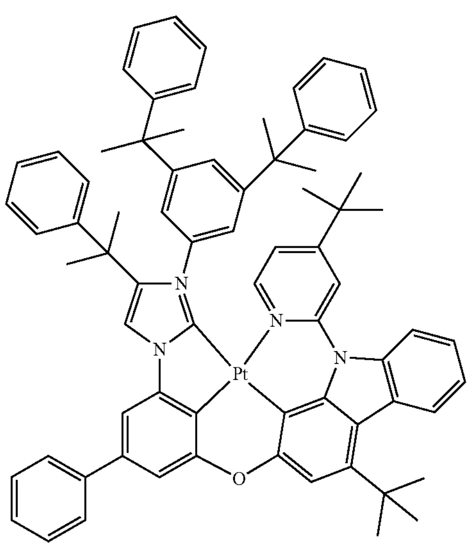
-continued
813
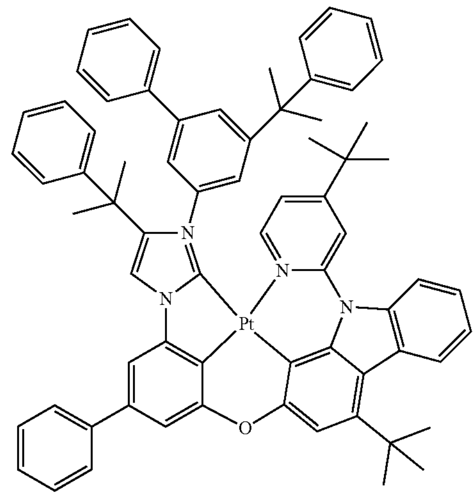
814
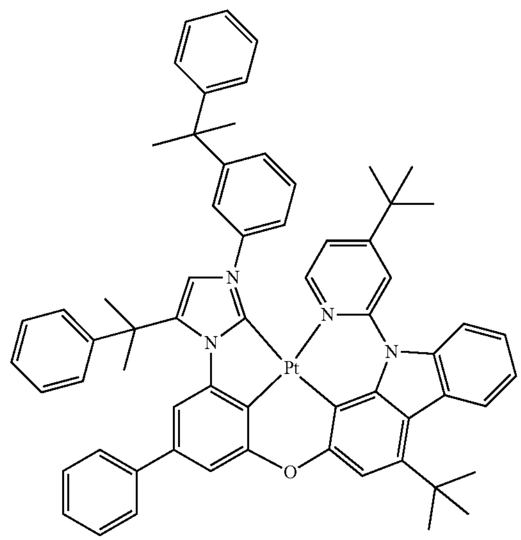
815
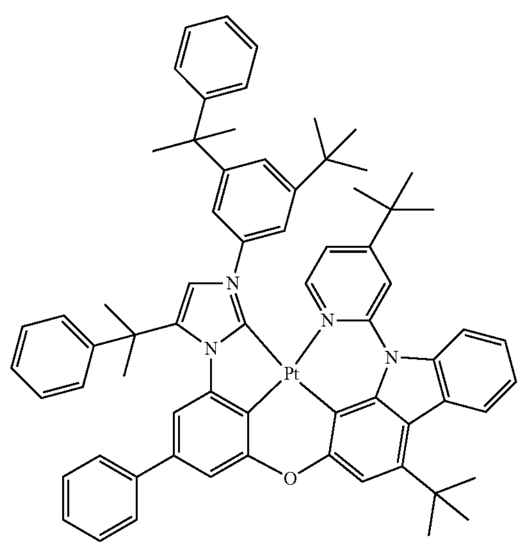

-continued
816
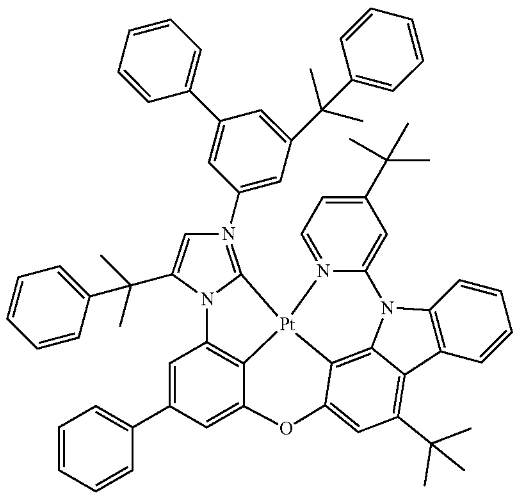
817
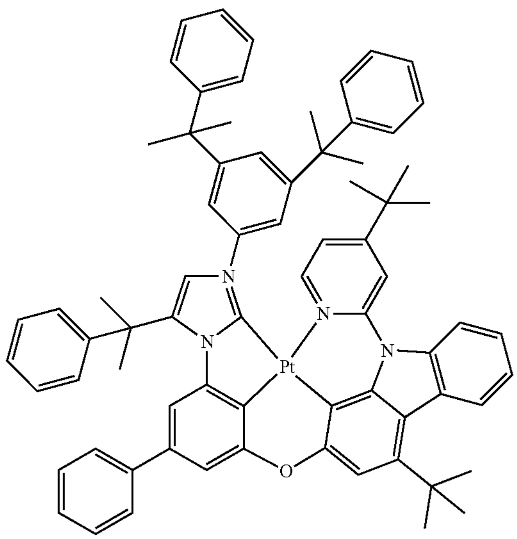
818
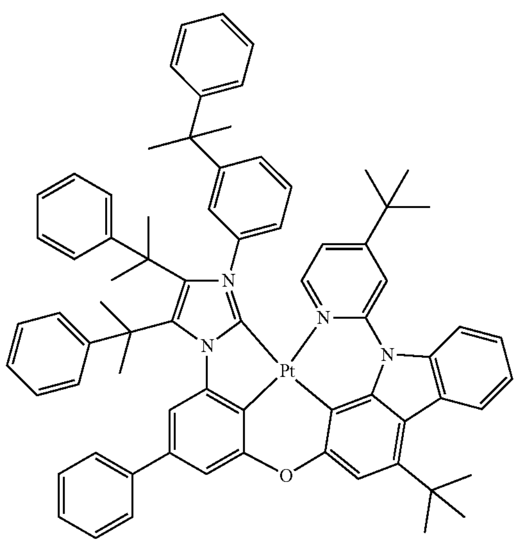
-continued
819
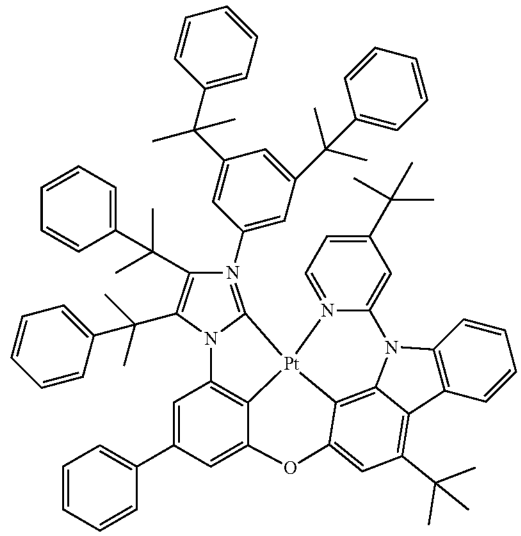
820
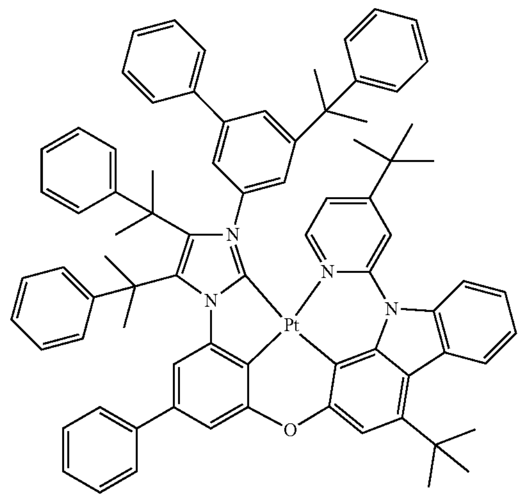
821
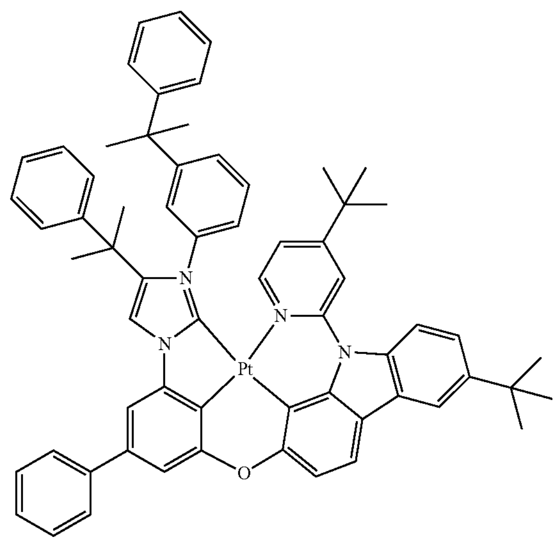

-continued
822
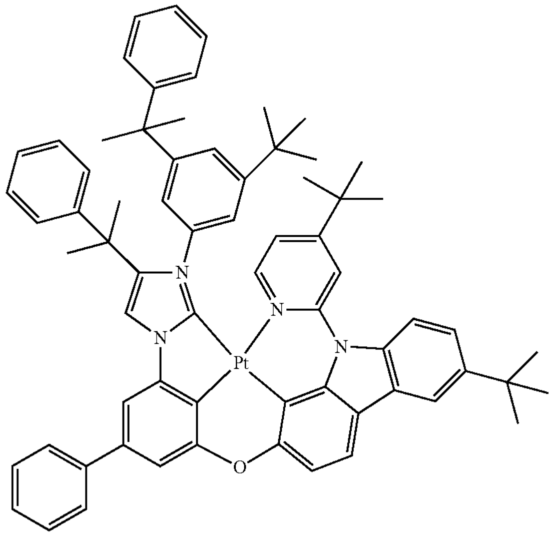
823
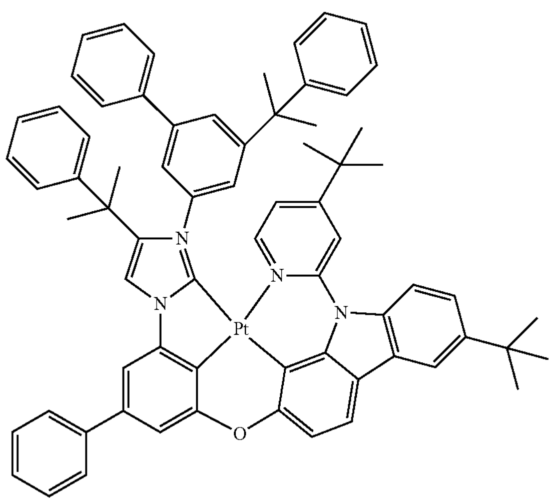
824
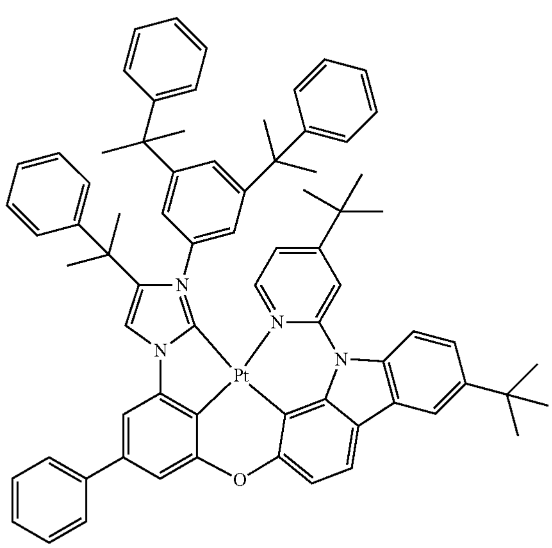
-continued
825
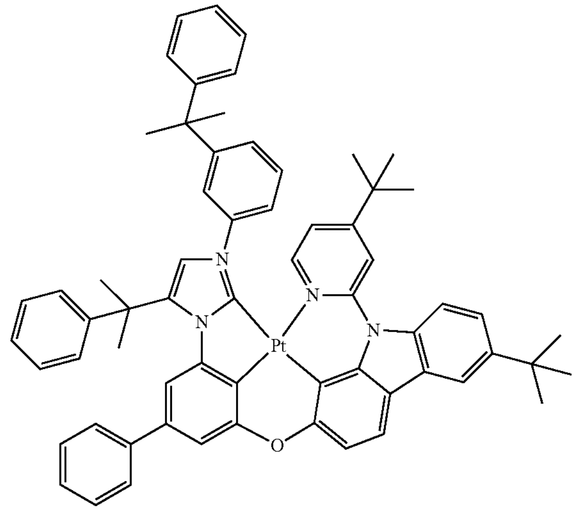
826
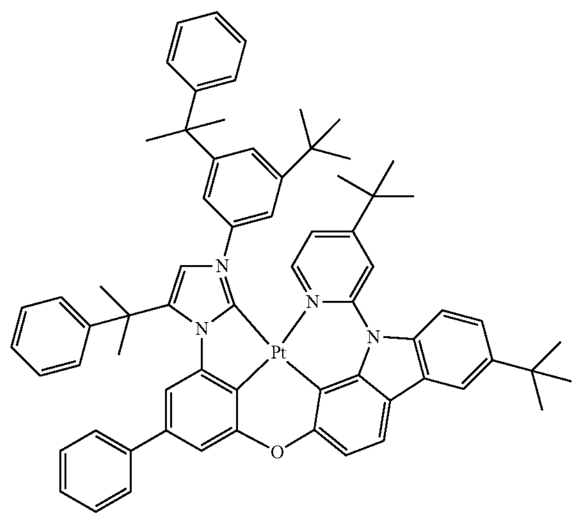
827
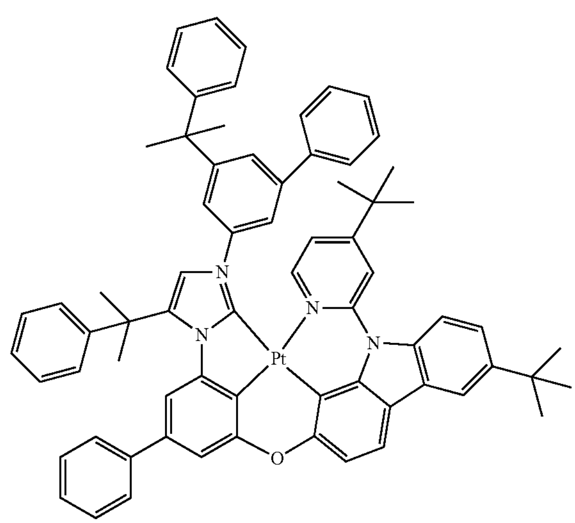

828
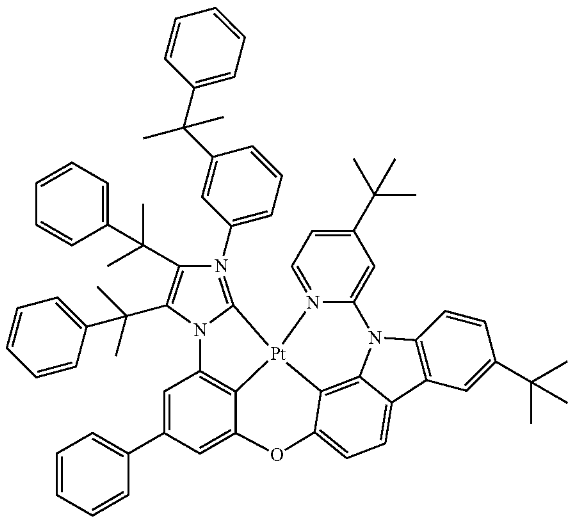
829
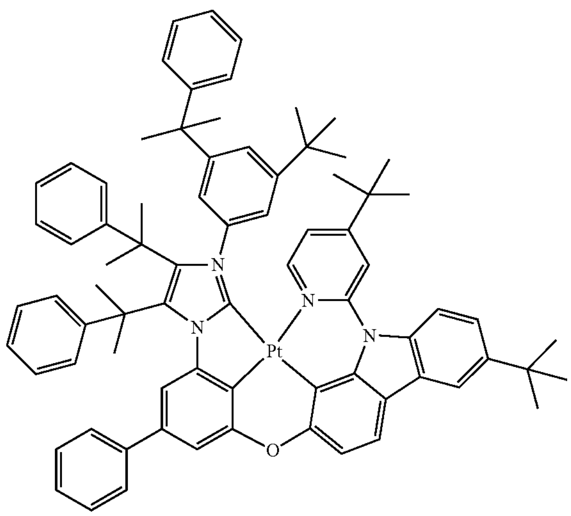
830
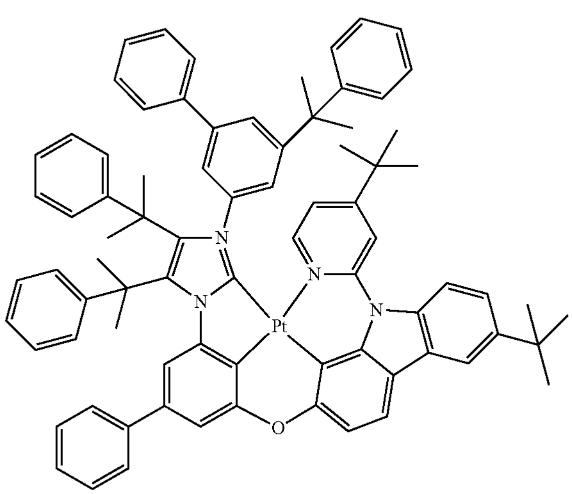
831
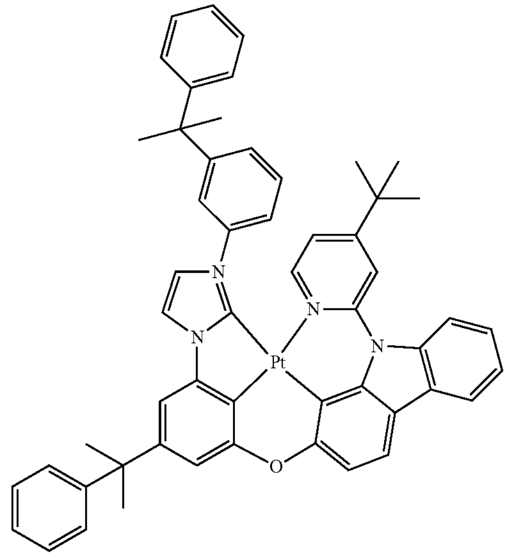
832
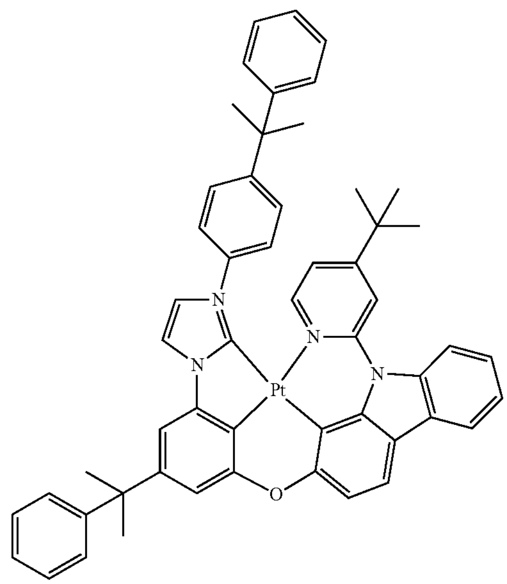
833
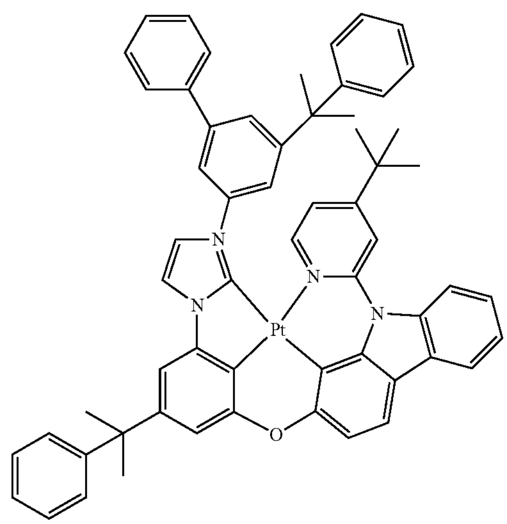

-continued
834
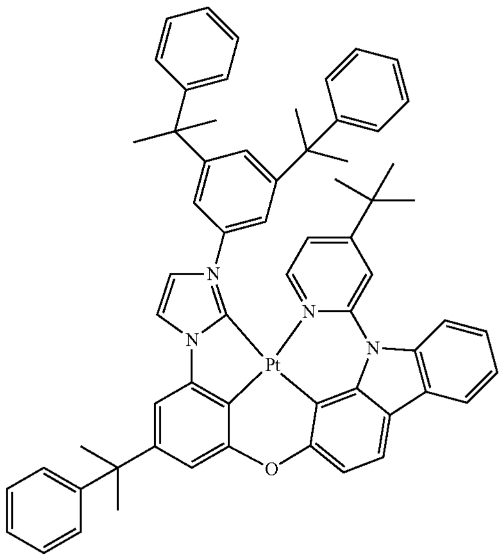
835
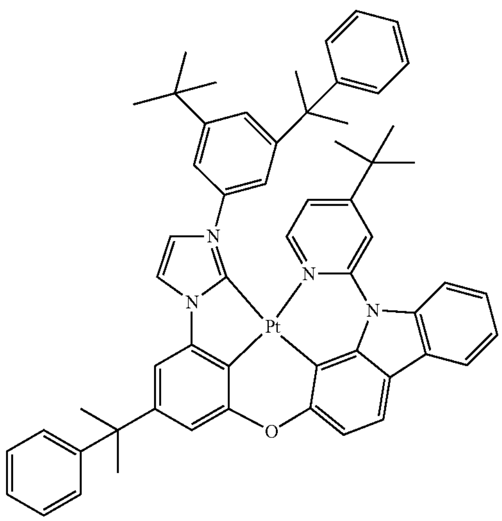
836
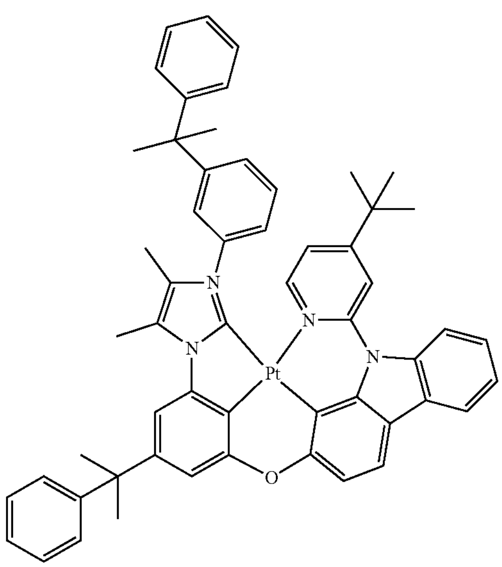
-continued
837
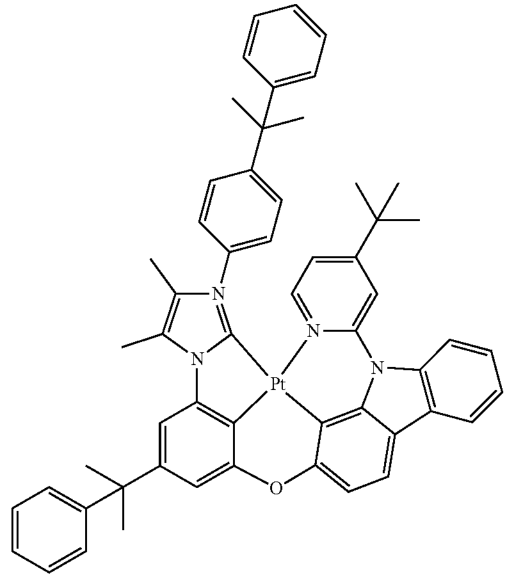
838
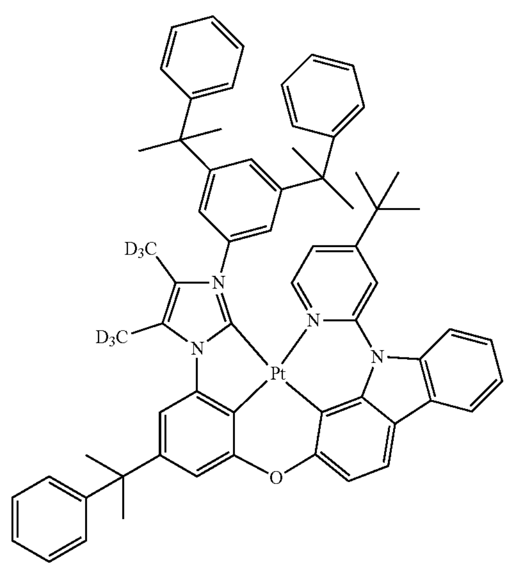

-continued
839
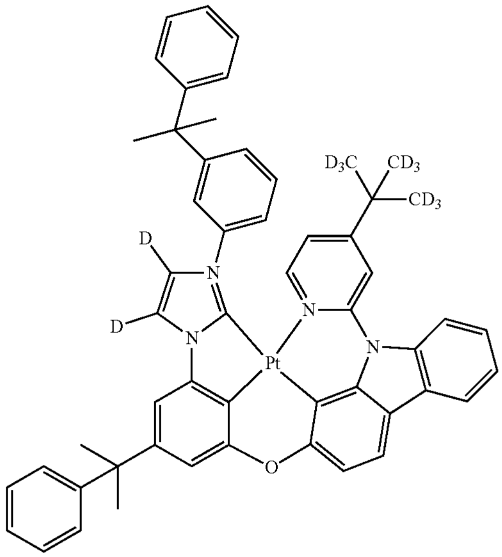
840
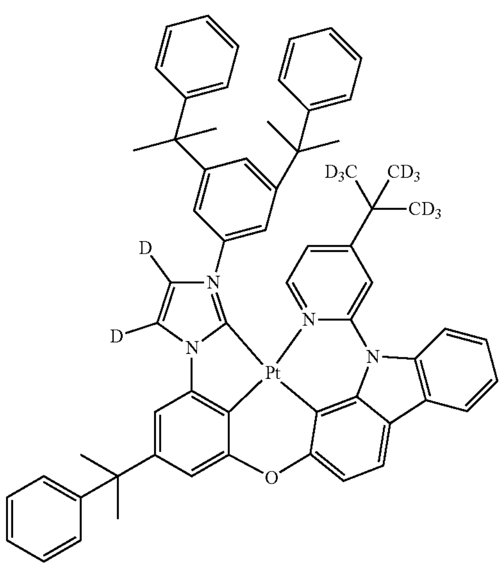
-continued
841
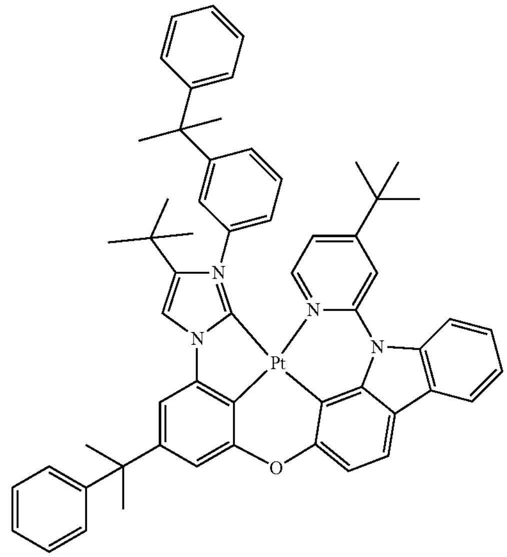
842
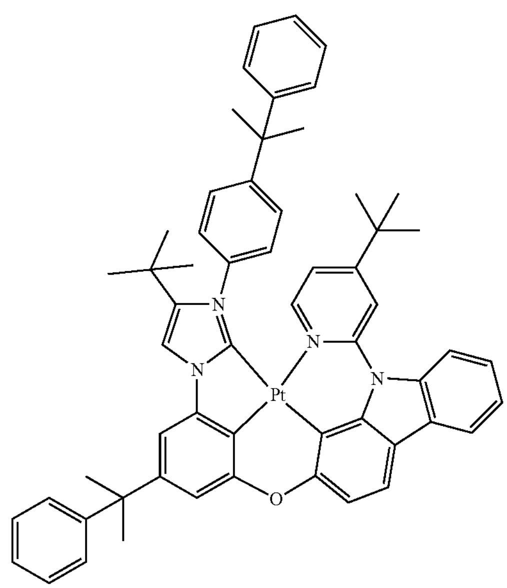

843
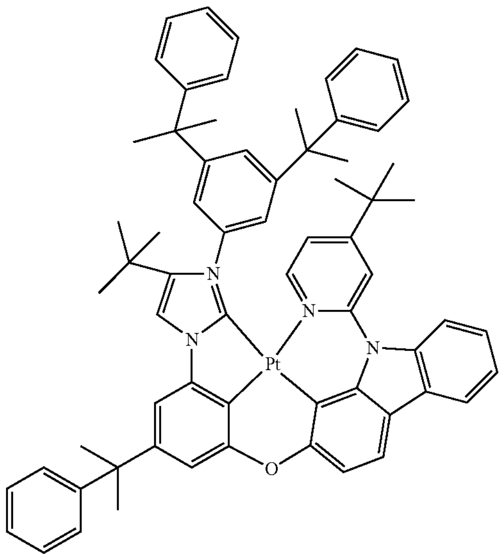
844
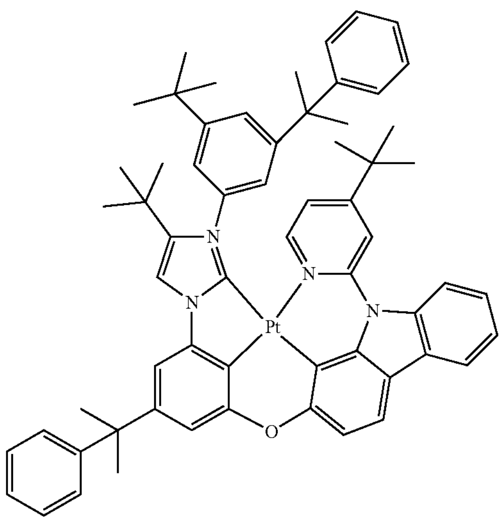
845
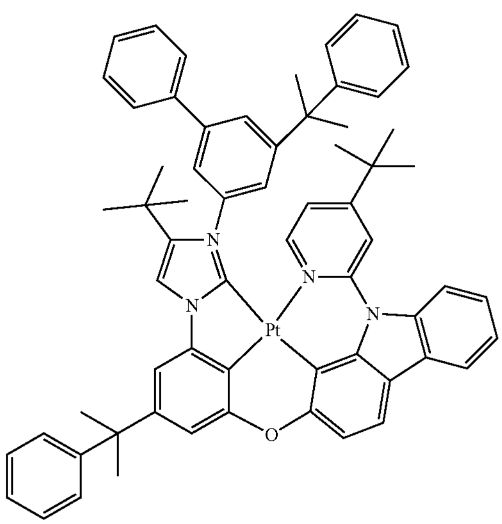
846
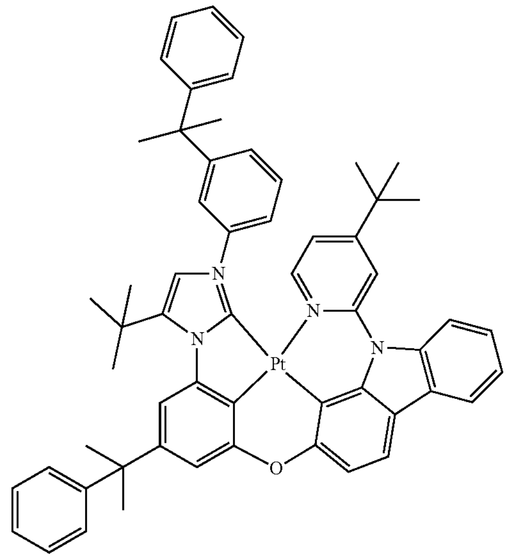
847
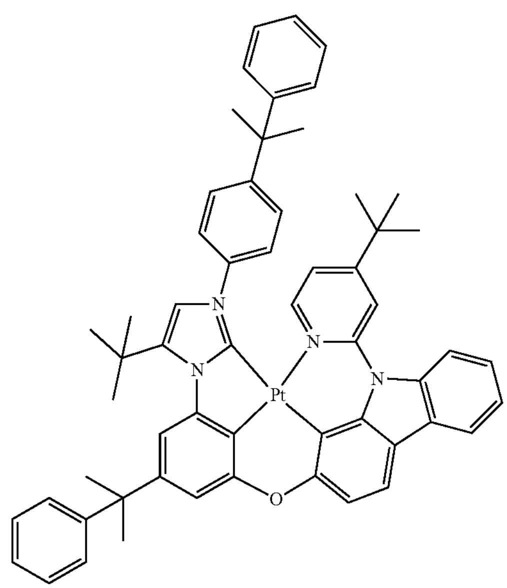

-continued
848
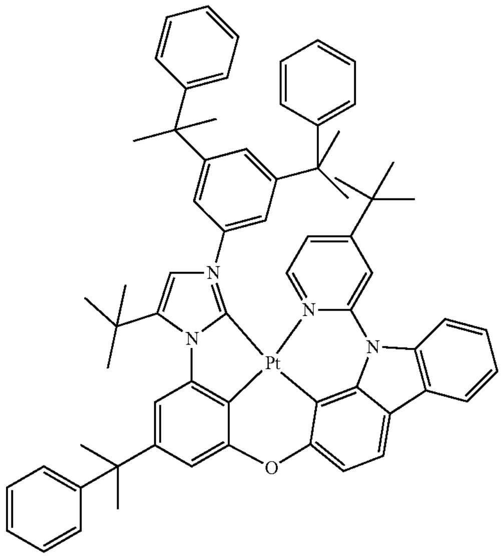
849
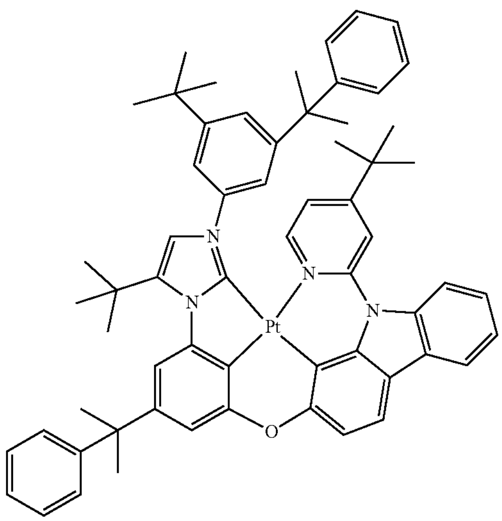
850
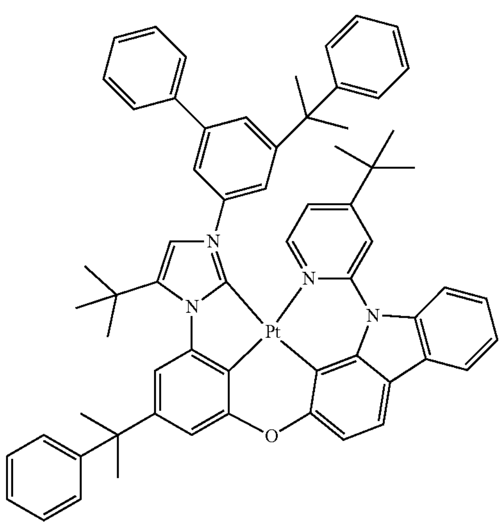
-continued
851
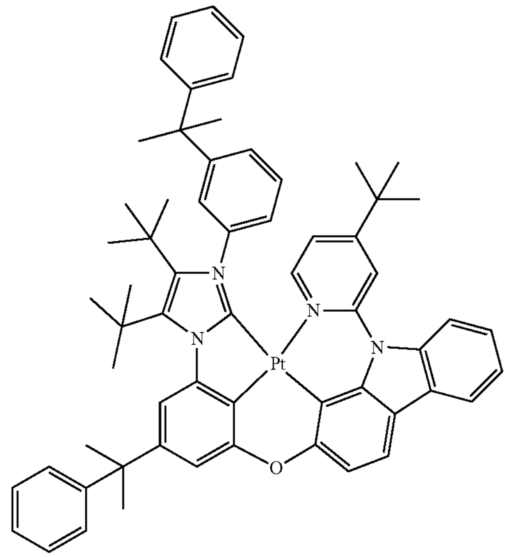
852
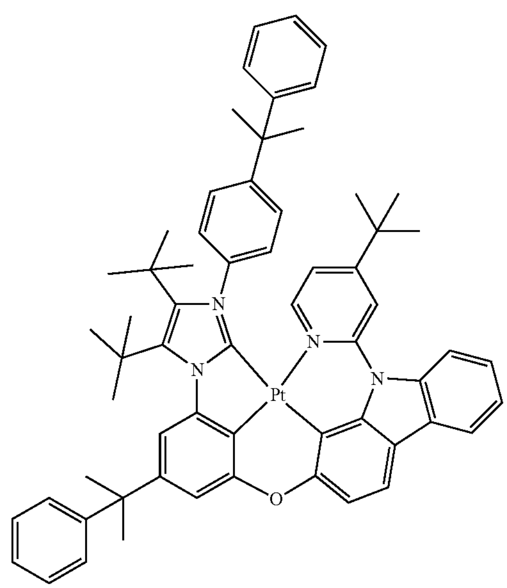

-continued
853
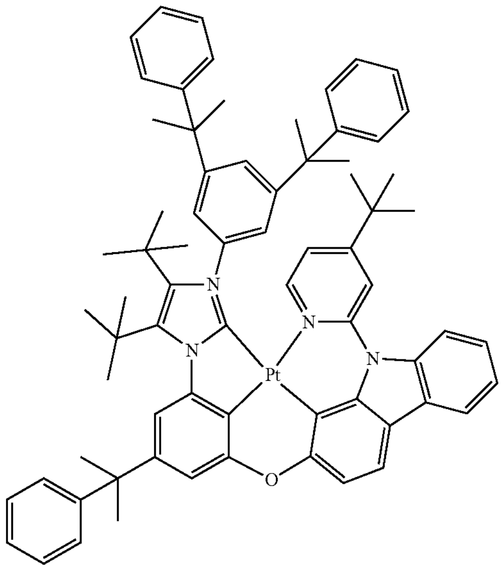
854
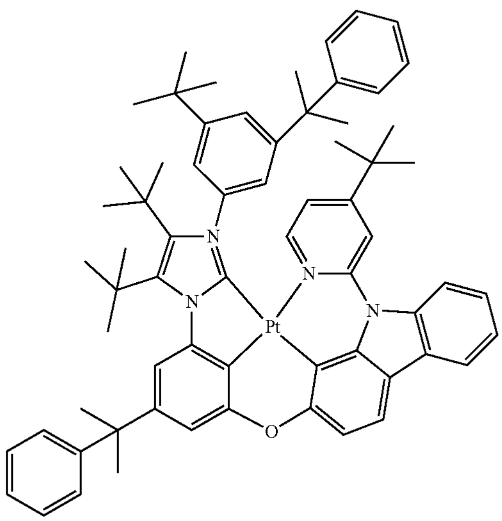
855
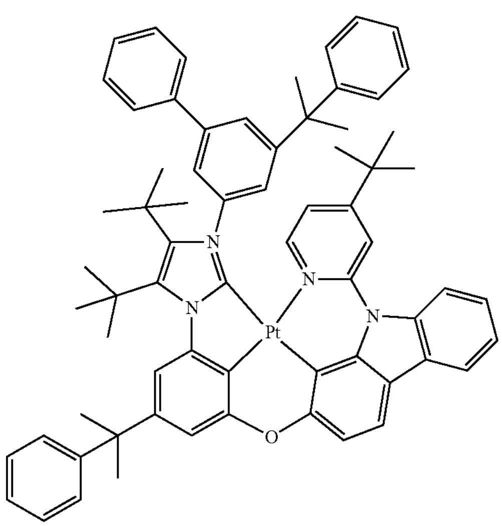
-continued
856
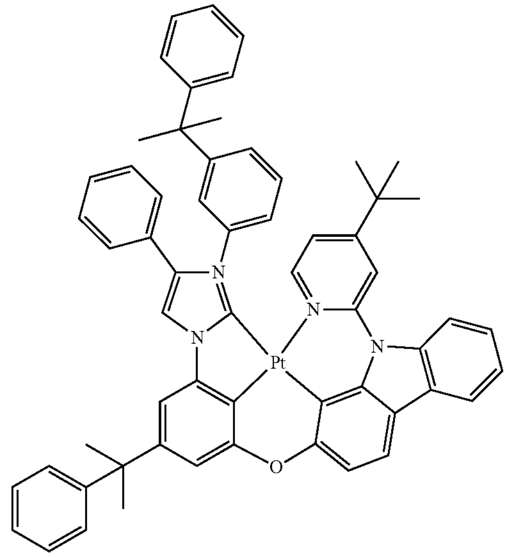
857
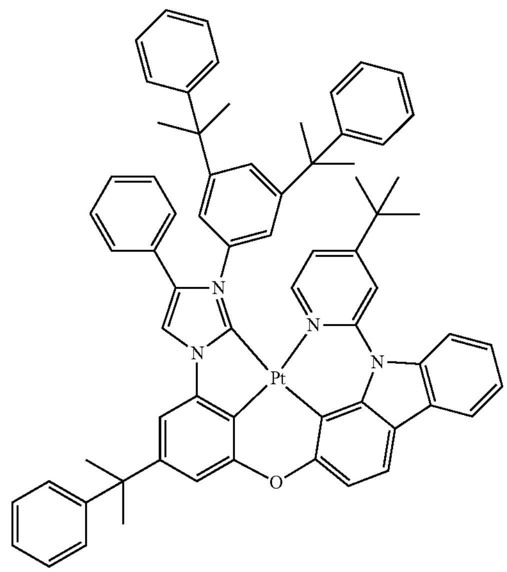
858
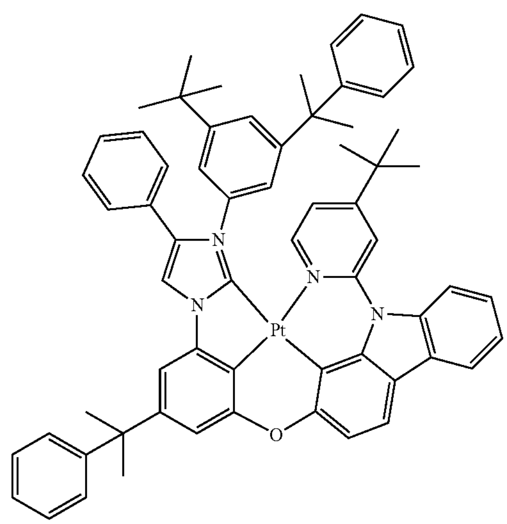

859
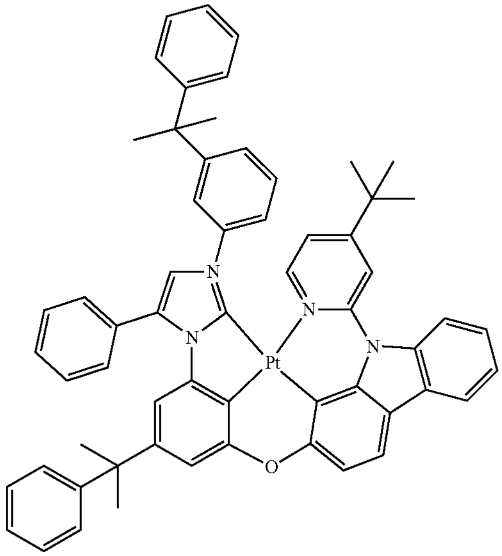
860
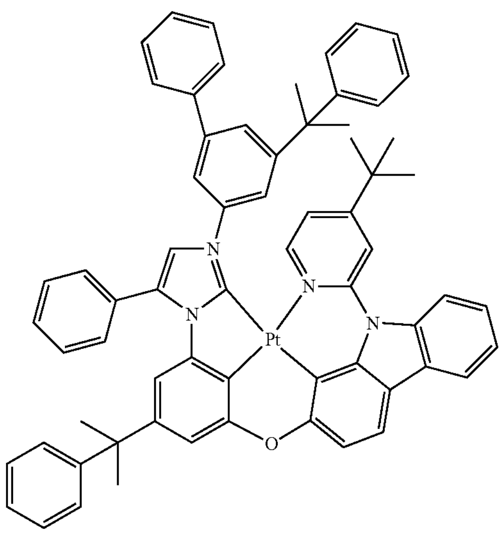
861
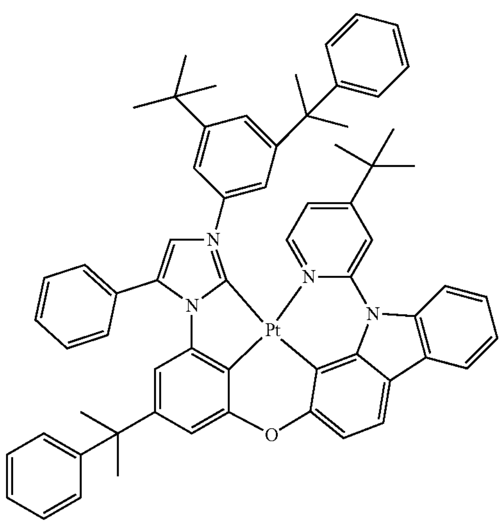
862
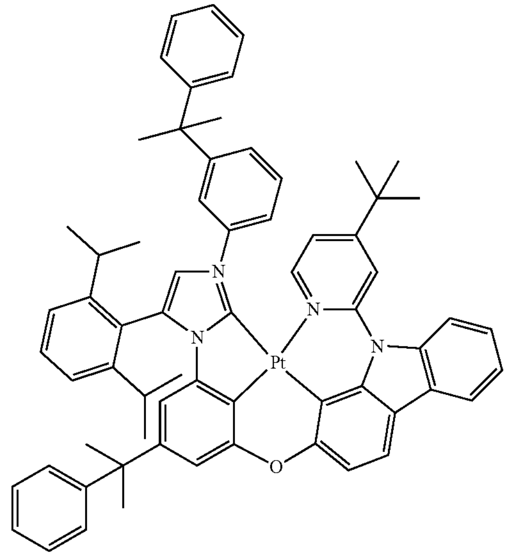
863
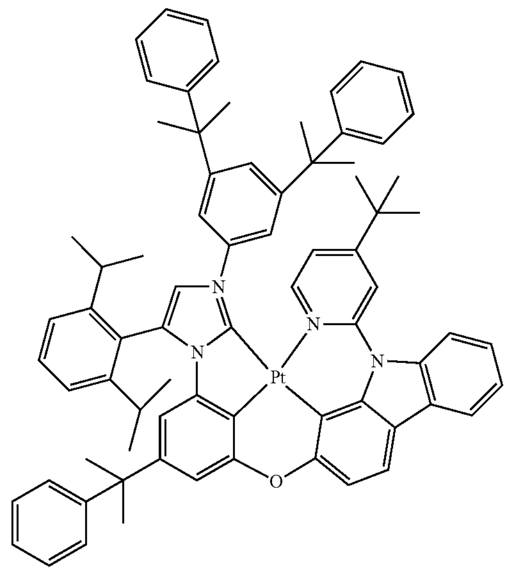
864
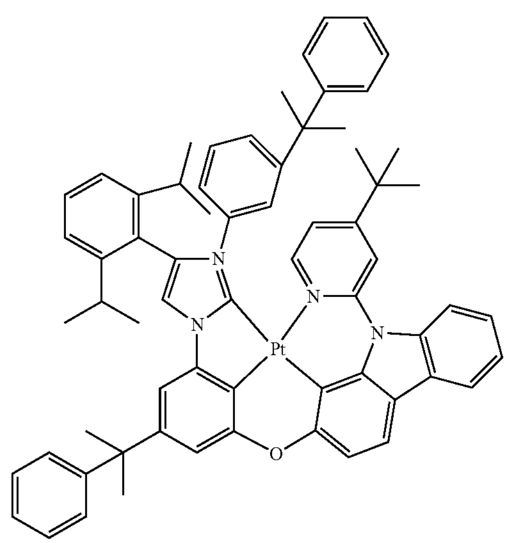

-continued
865
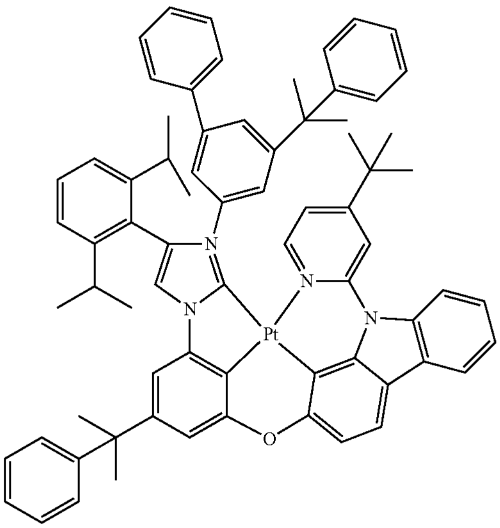
866
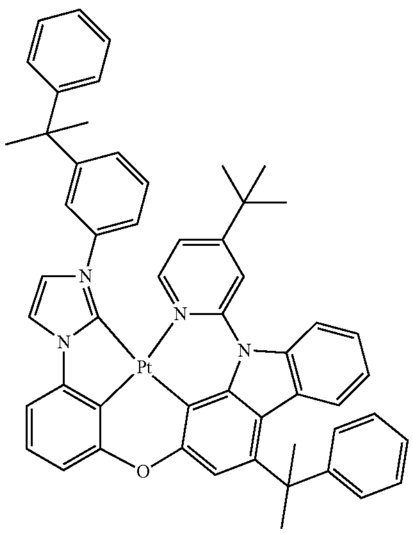
867
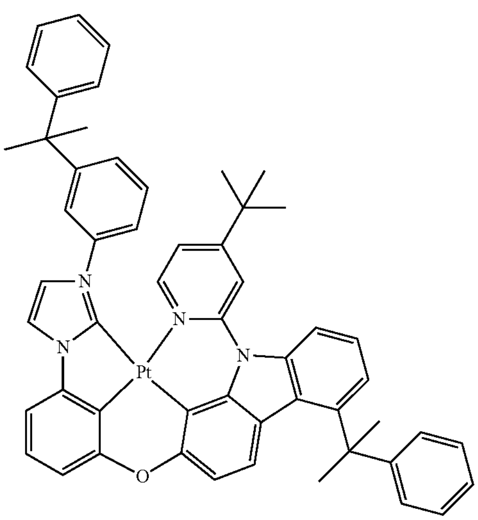
-continued
868
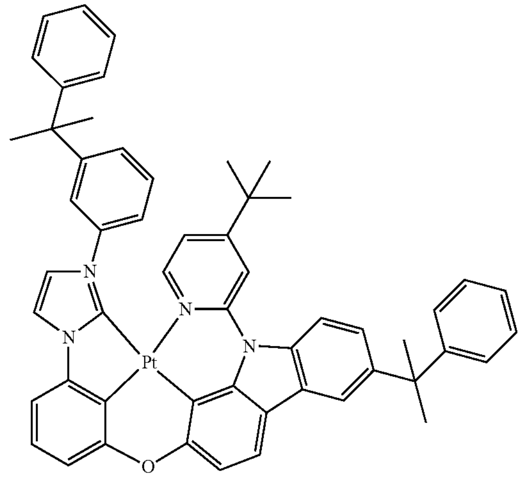
869
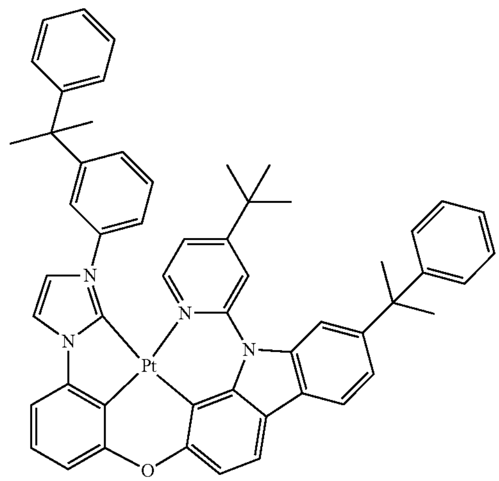
870
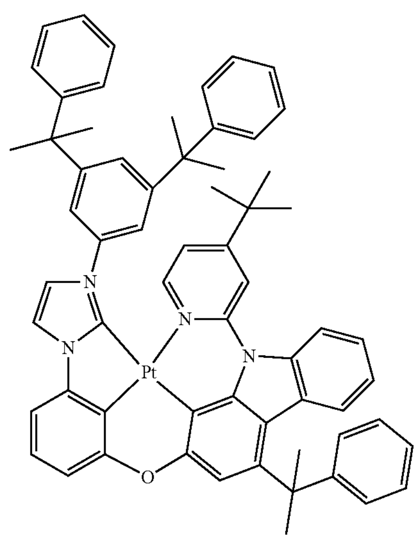

-continued
871
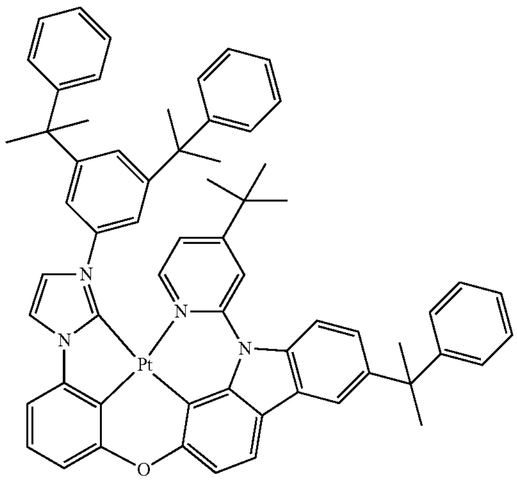
872
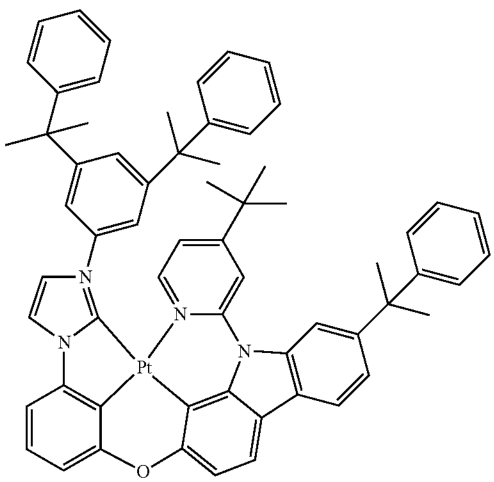
873
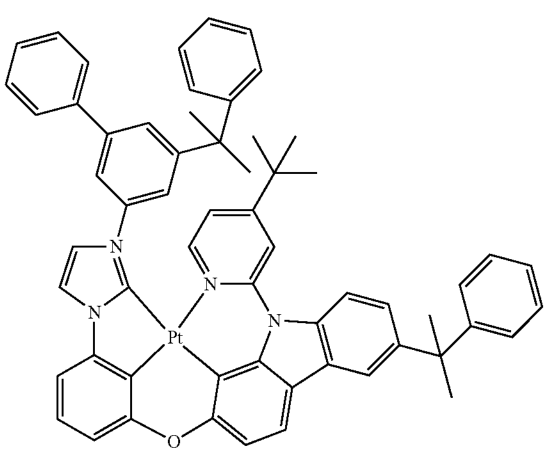
-continued
874
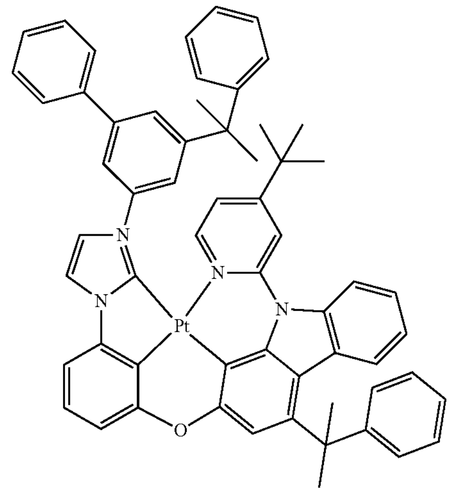
875
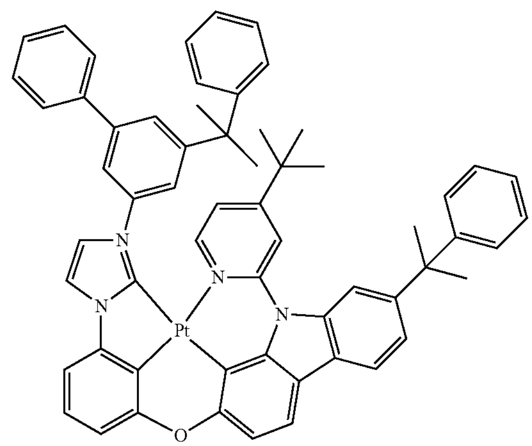
876
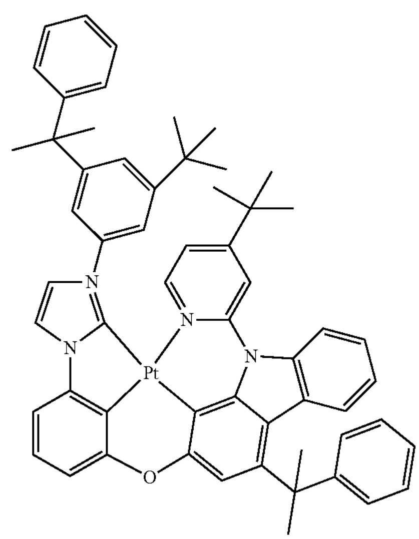

-continued
877
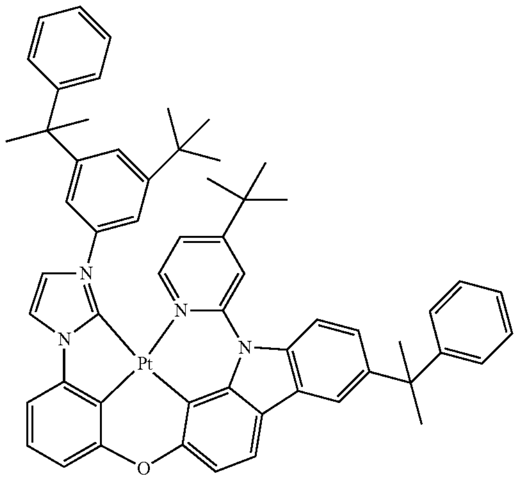
878
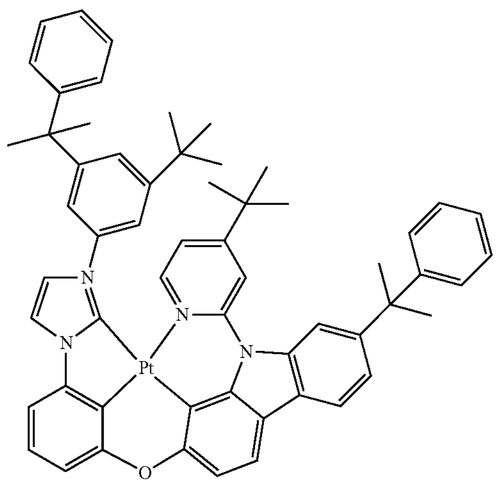
879
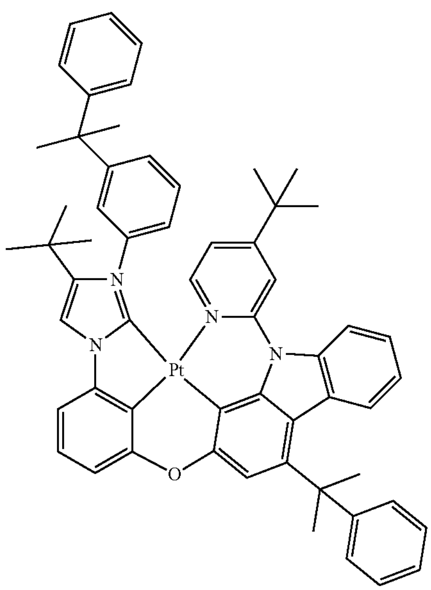
-continued
880
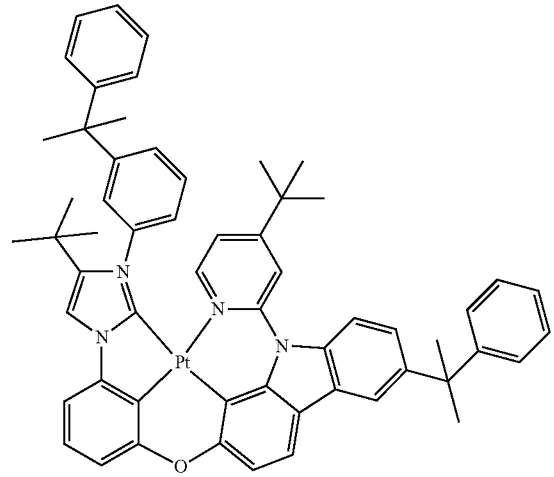
881
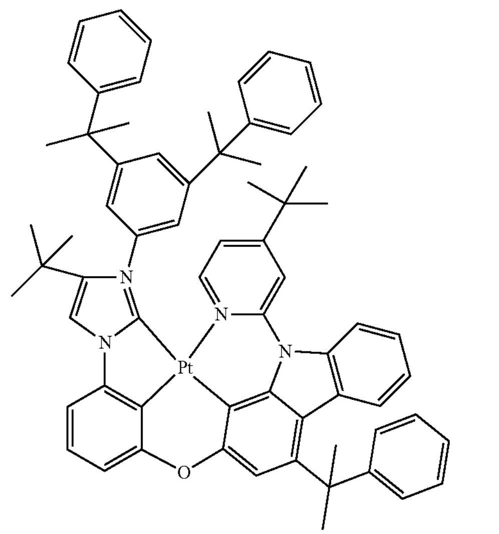
882
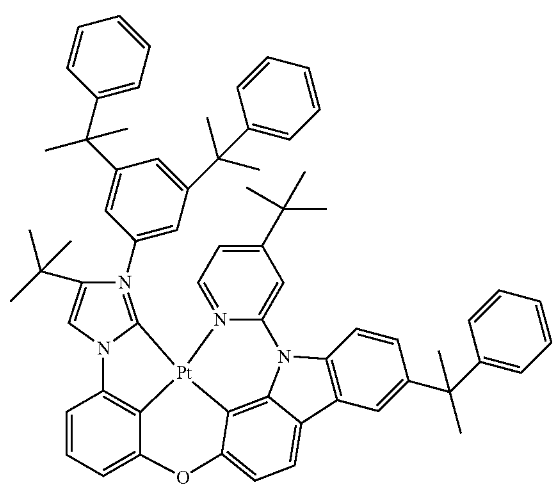

-continued
883
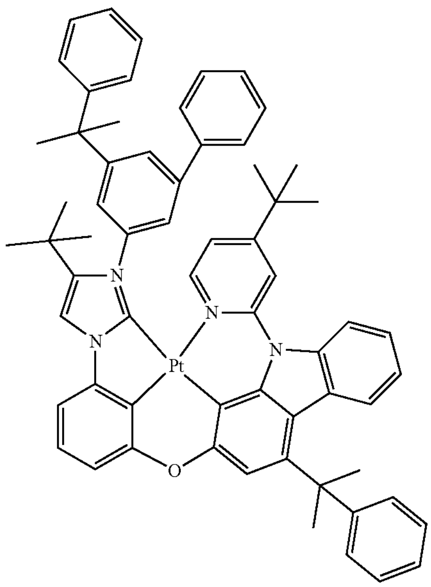
884
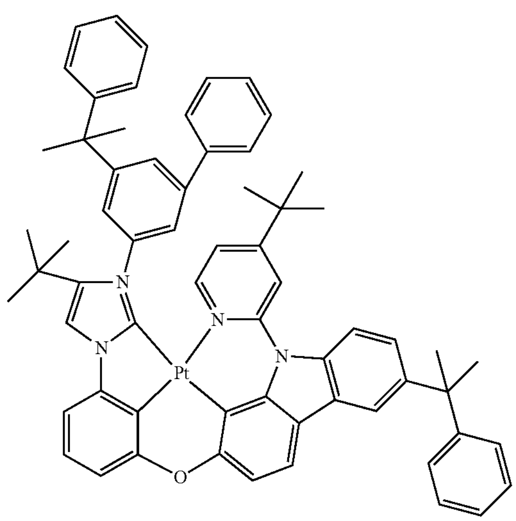
-continued
885
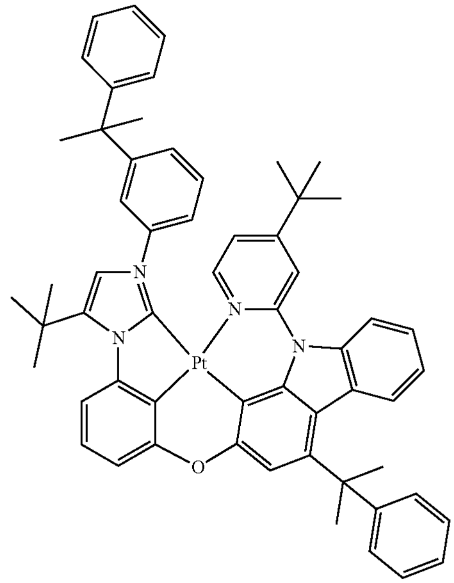
886
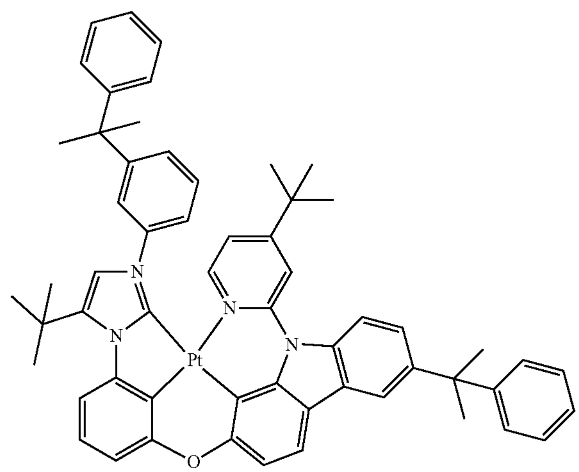
887
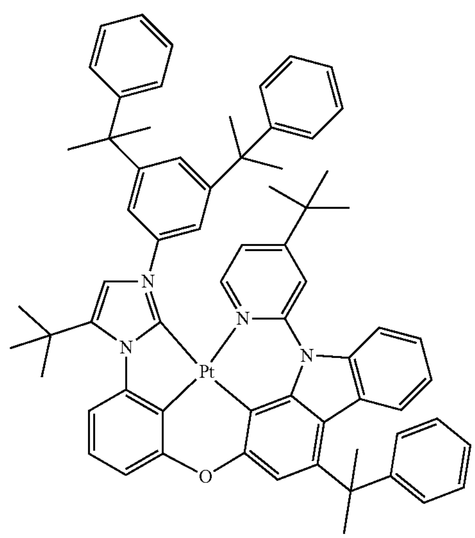

-continued
888
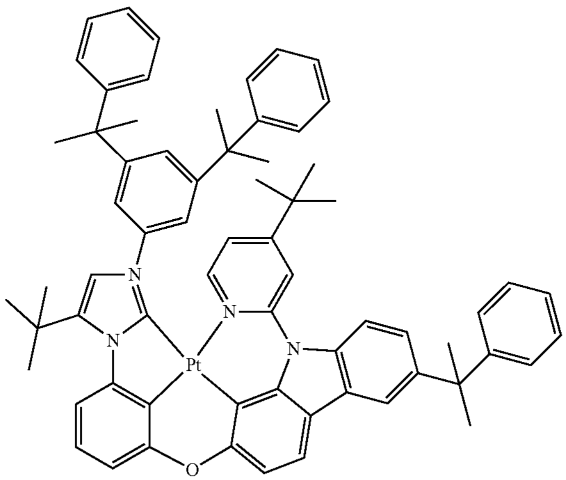
889
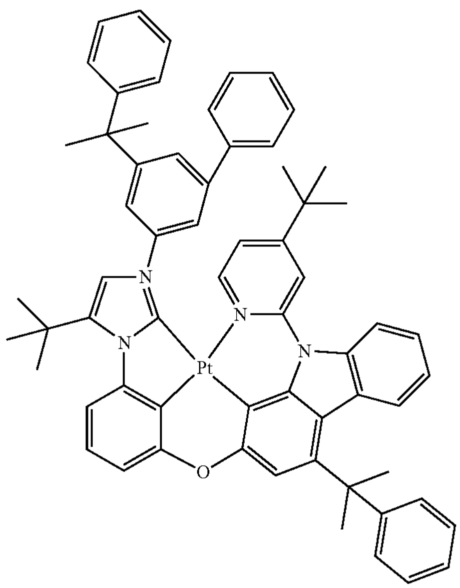
890
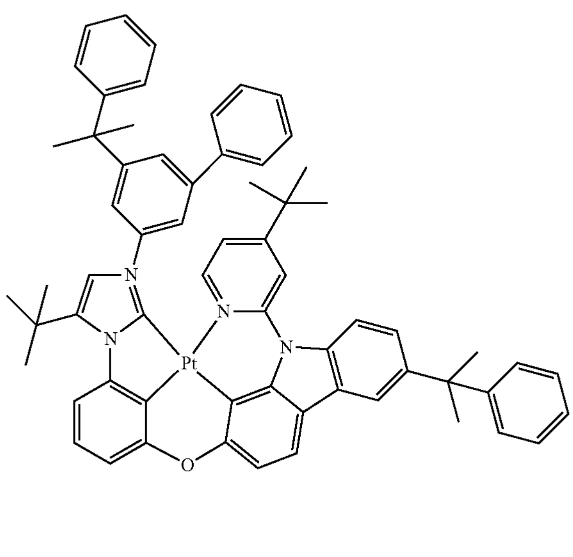
-continued
891
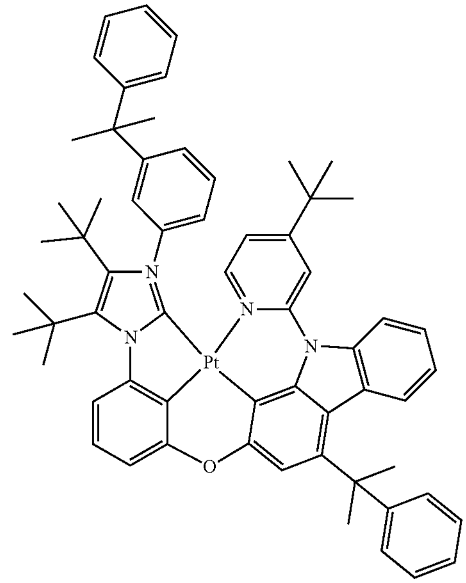
892
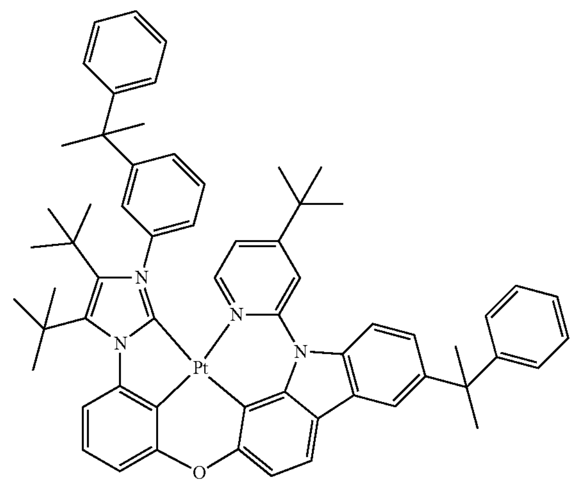
893
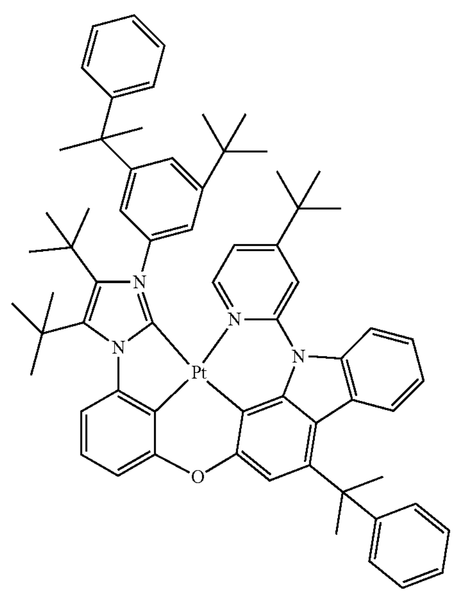

-continued
894
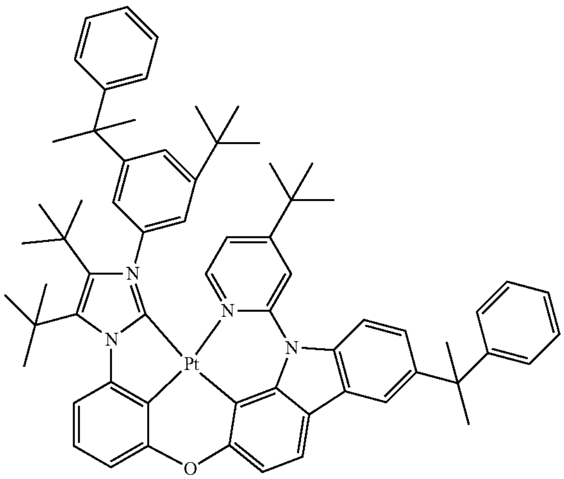
895
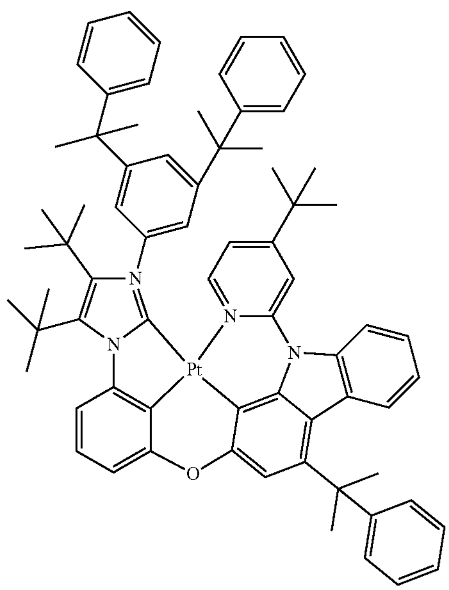
896
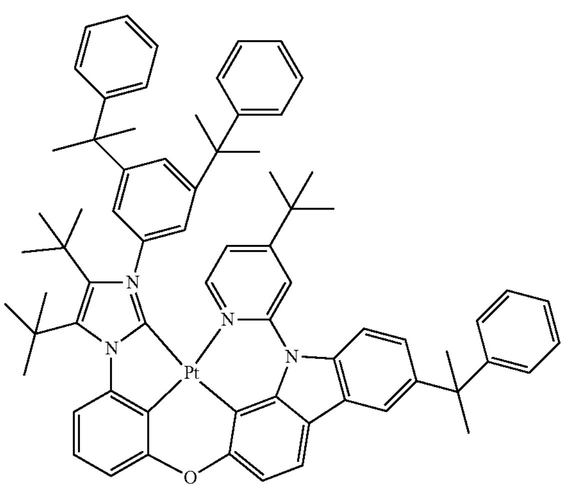
-continued
897
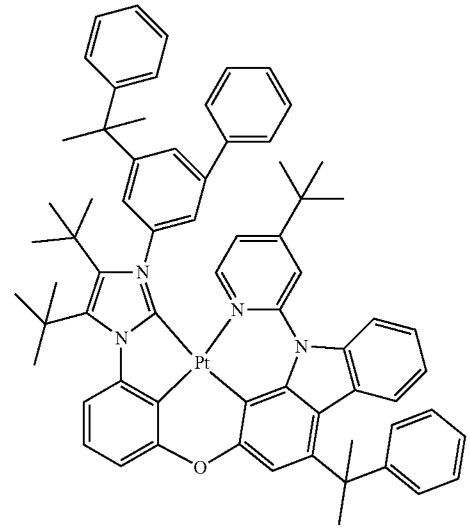
898
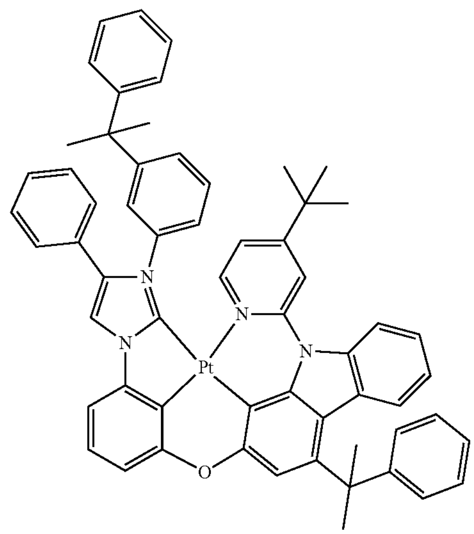
899
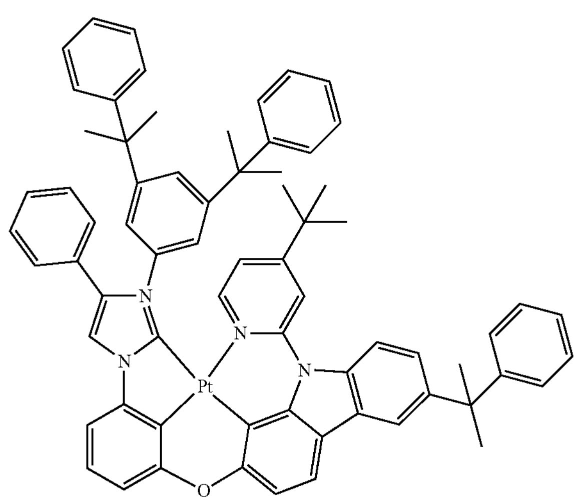

-continued
900
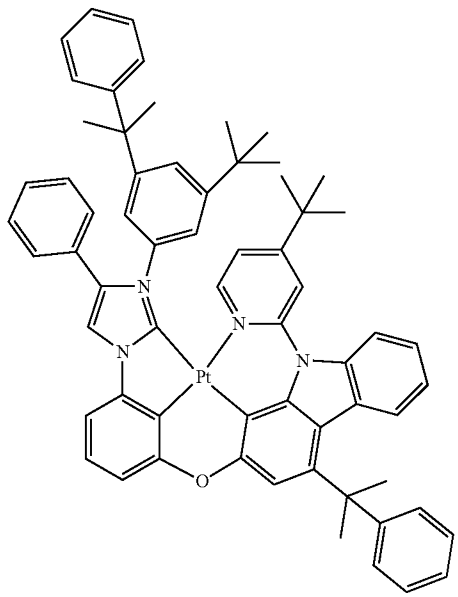
901
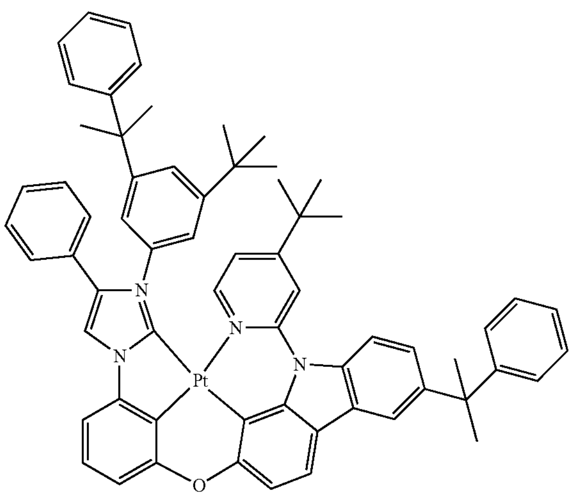
902
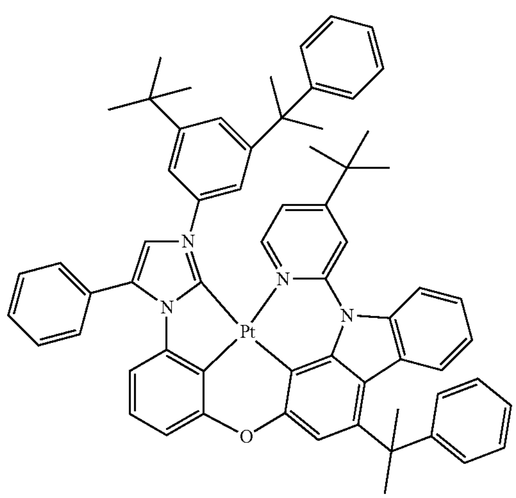
-continued
903
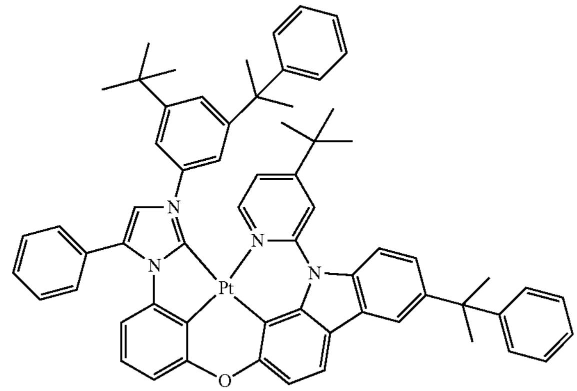
904
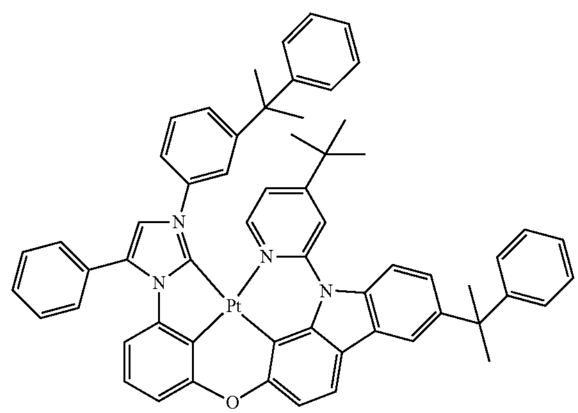
905
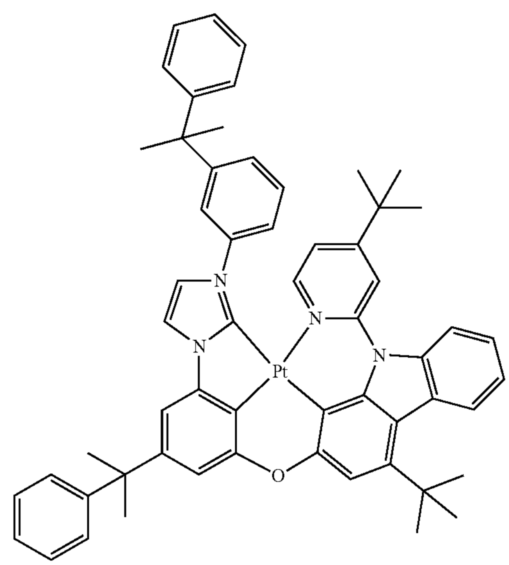

-continued
906
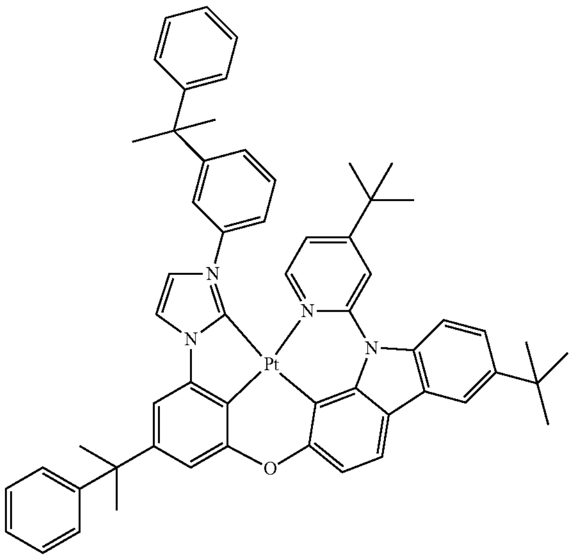
907
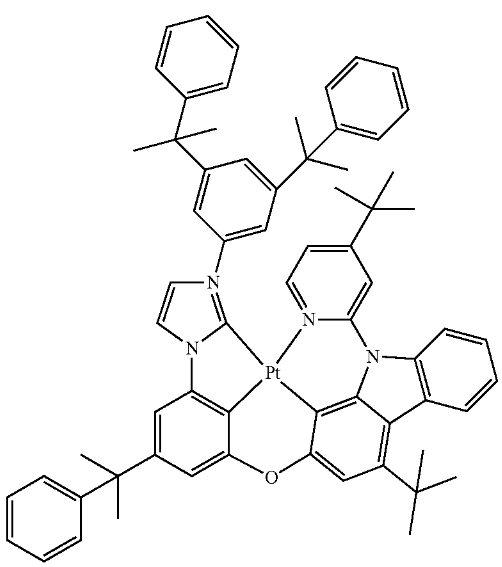
-continued
908
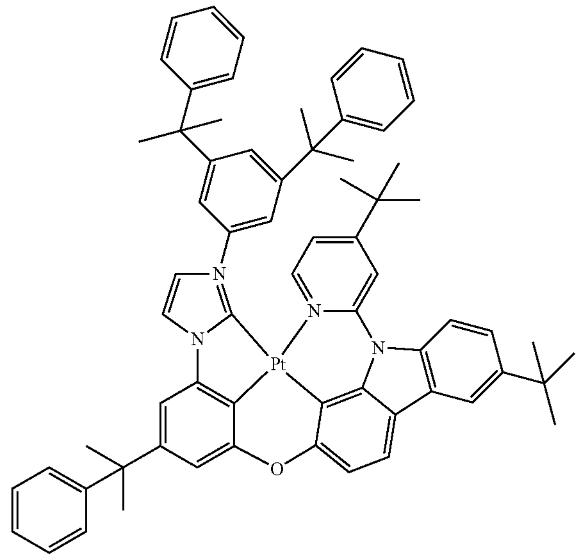
909
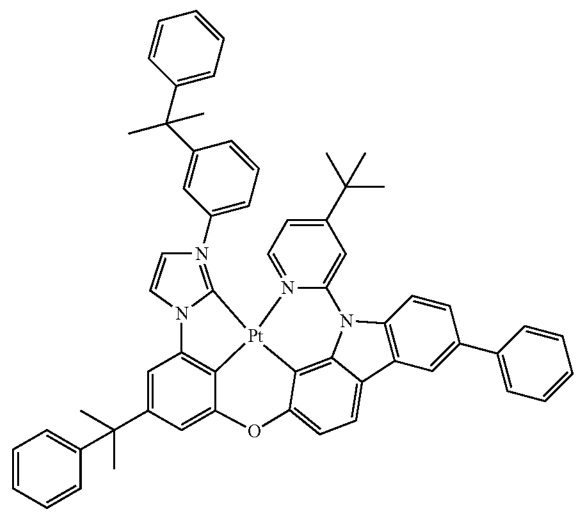
910
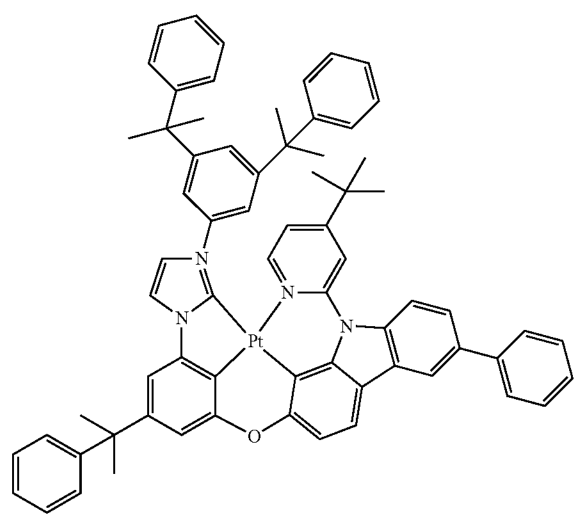

-continued
911
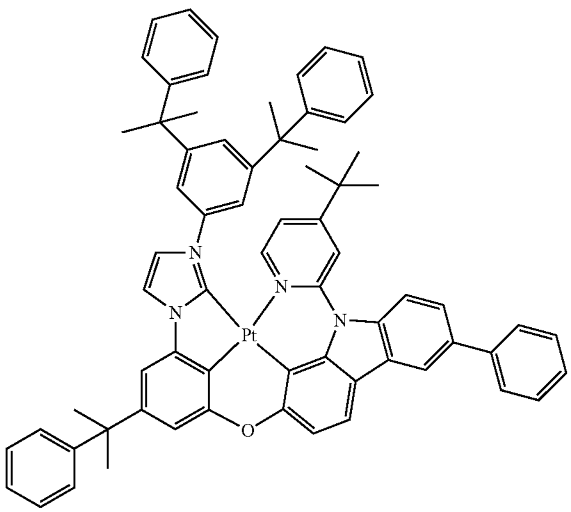
912
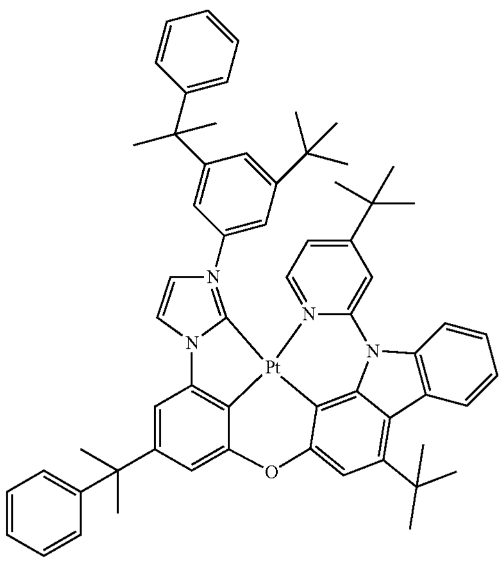
913
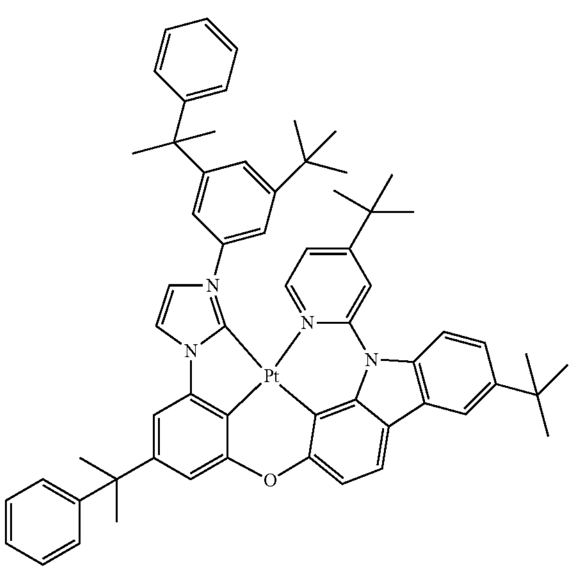
-continued
914
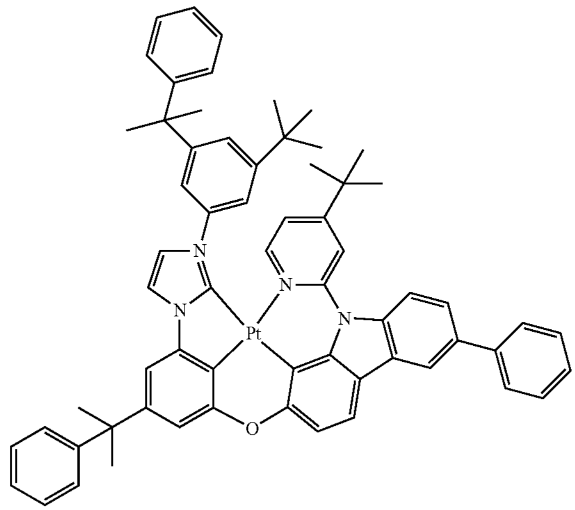
915
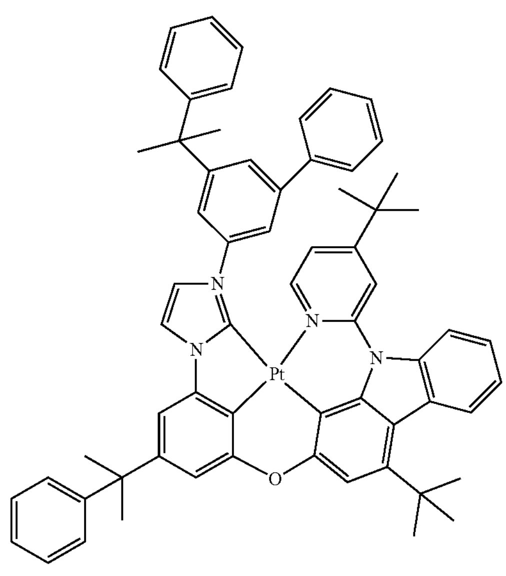

-continued
916
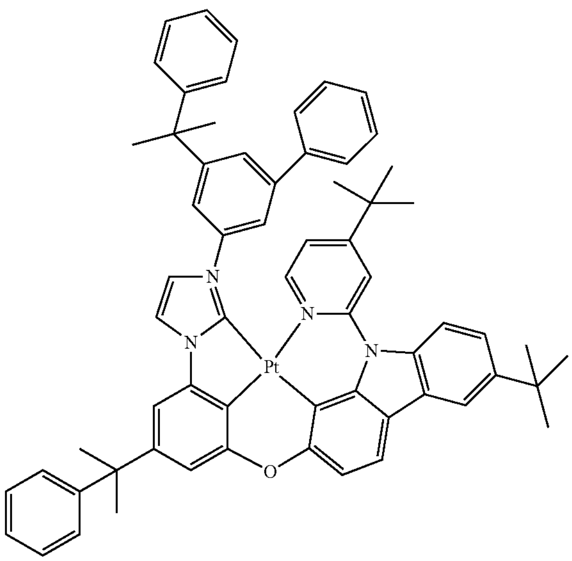
917
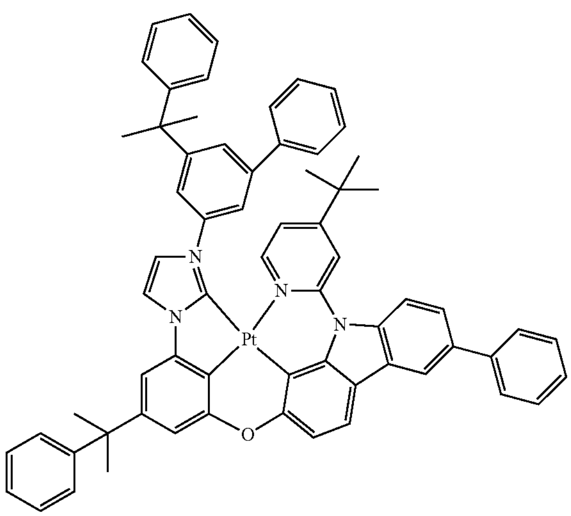
918
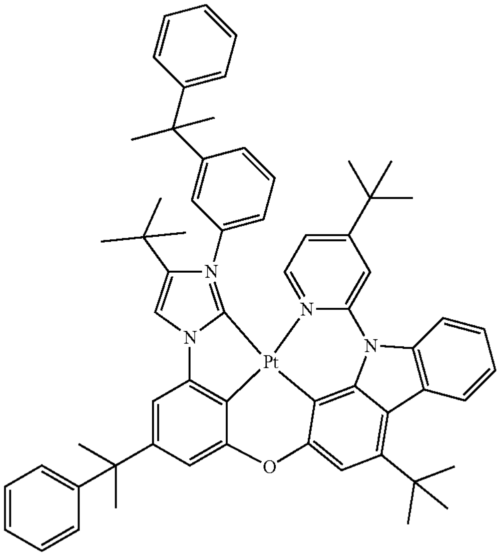
-continued
919
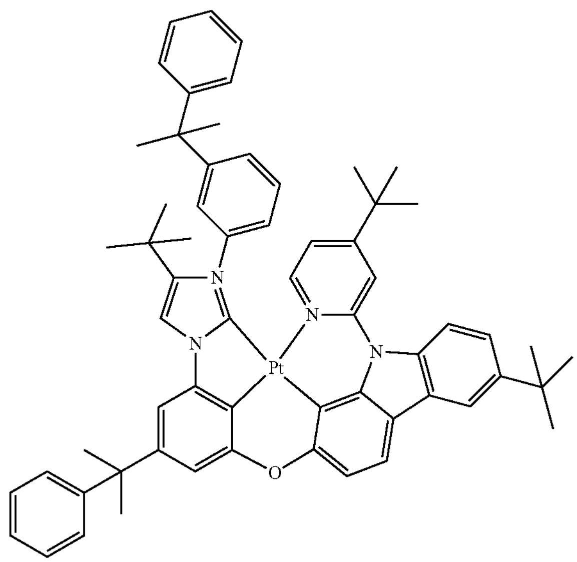
920
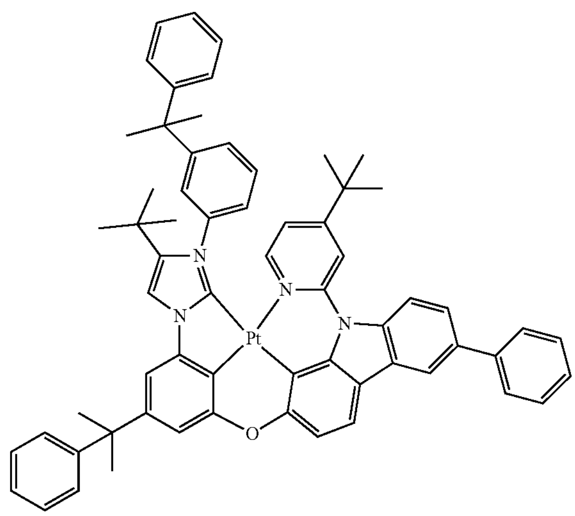
921
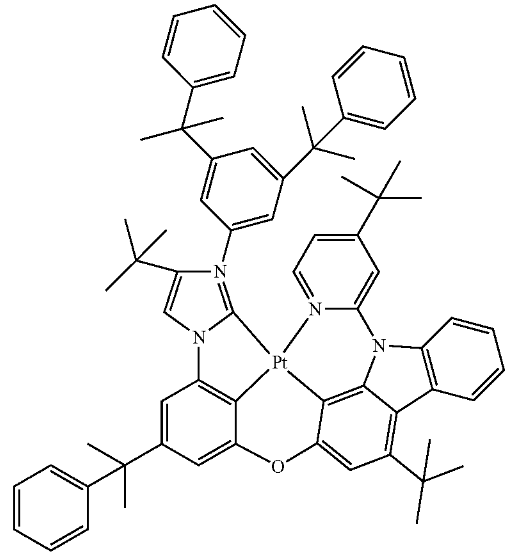

-continued
922
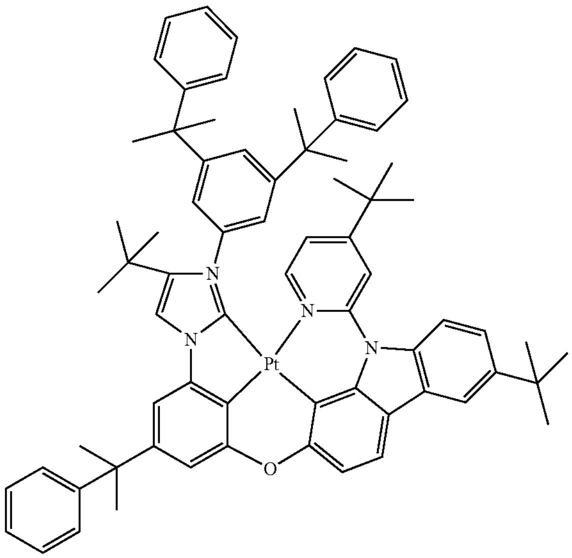
923
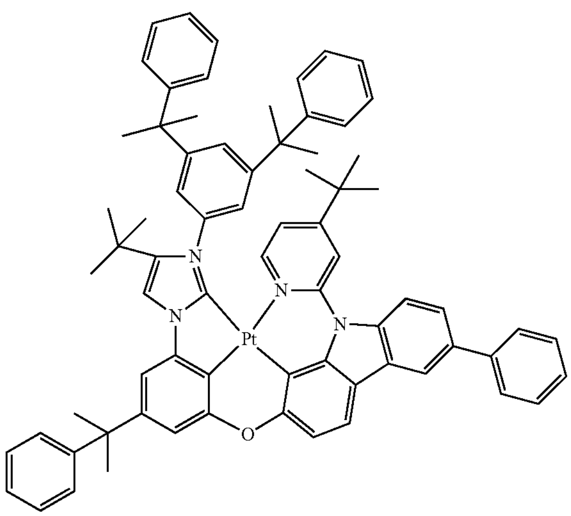
924
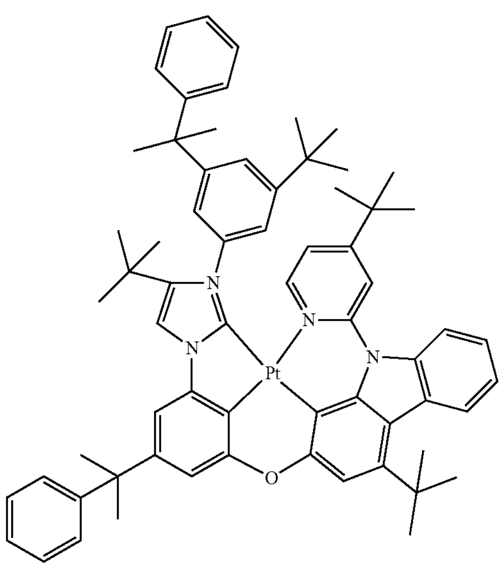
-continued
925
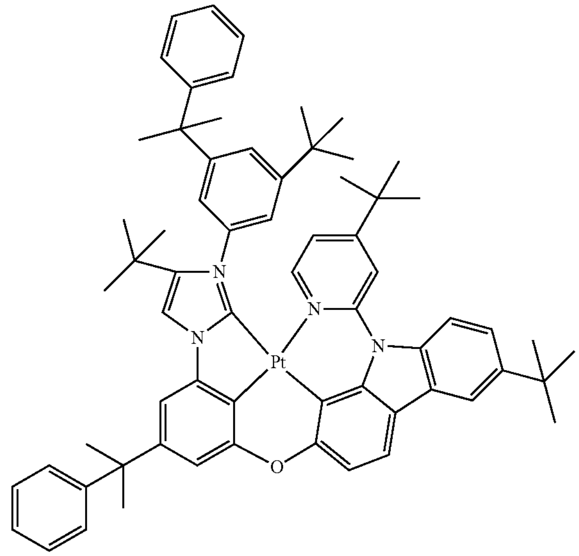
926
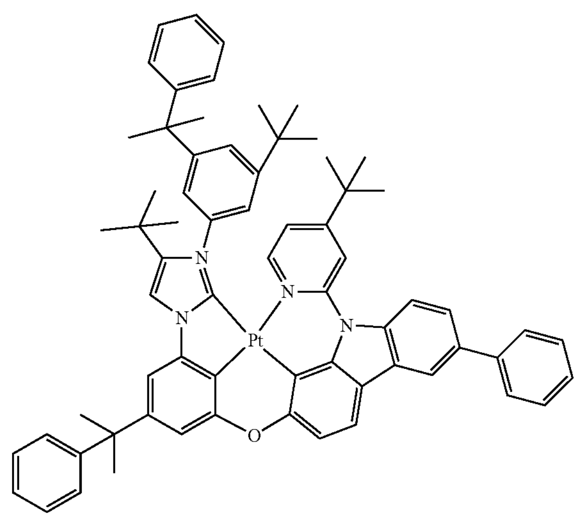

-continued
927
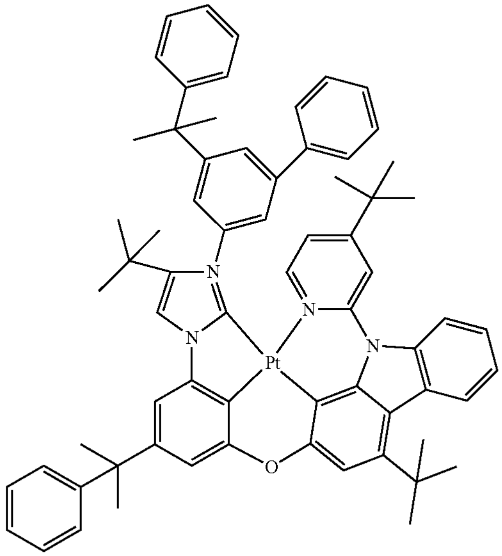
928
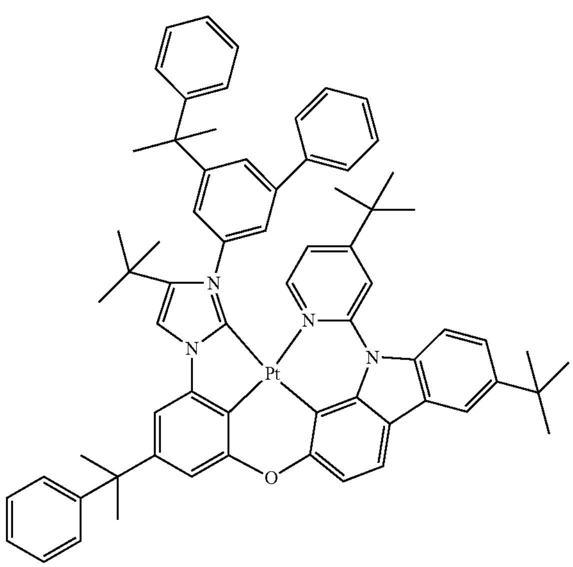
-continued
929
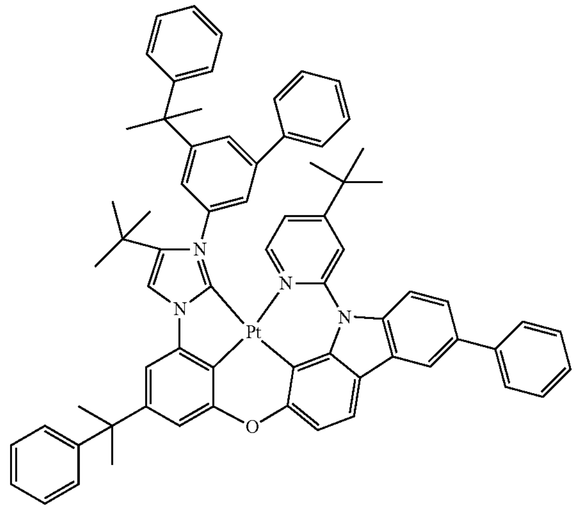
930
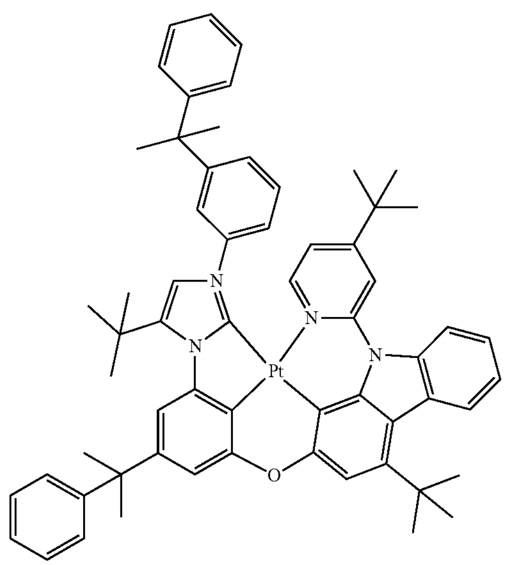

-continued
931
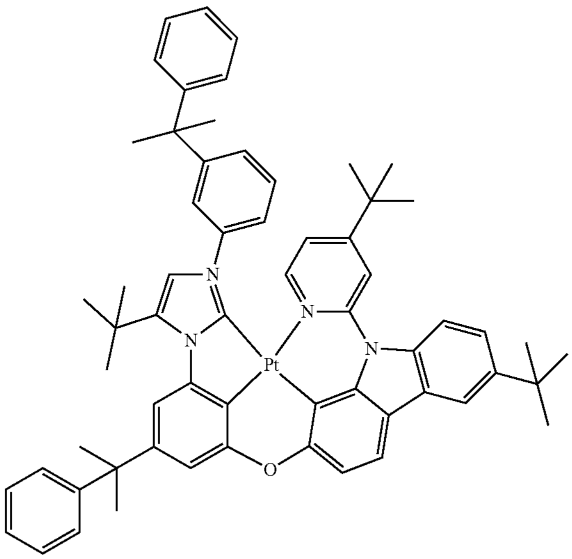
932
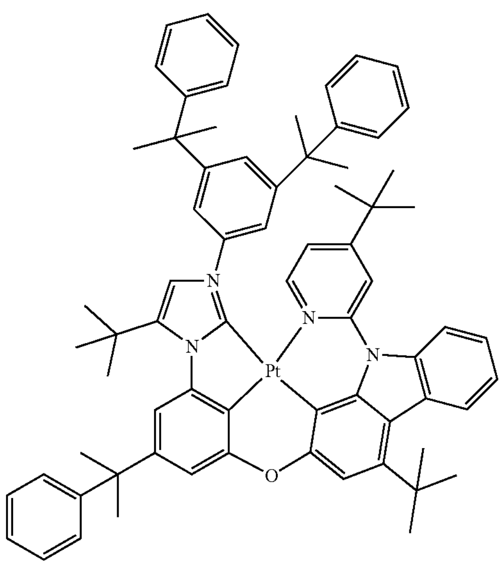
-continued
933
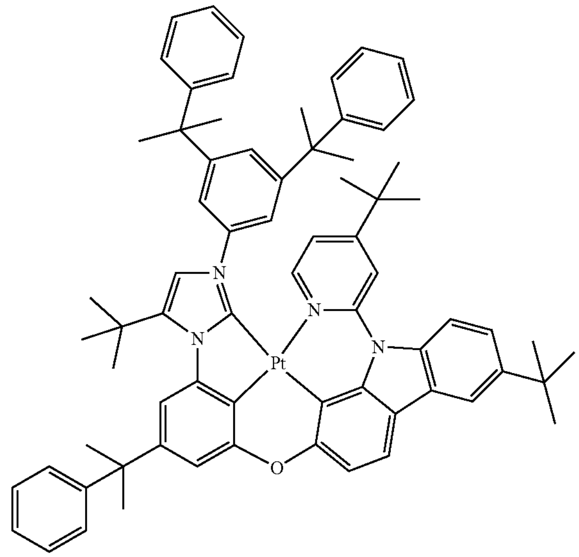
934
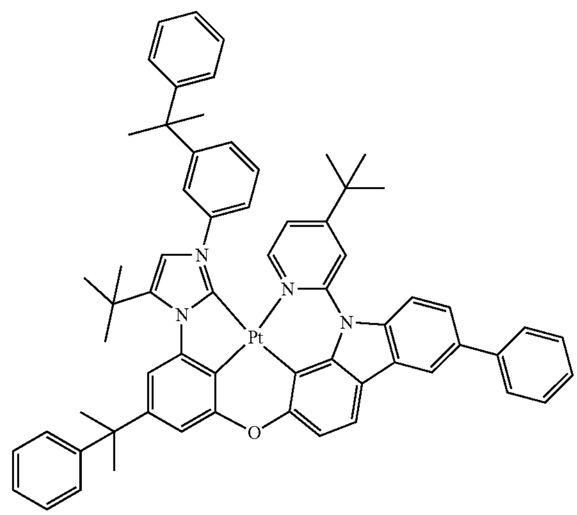
935
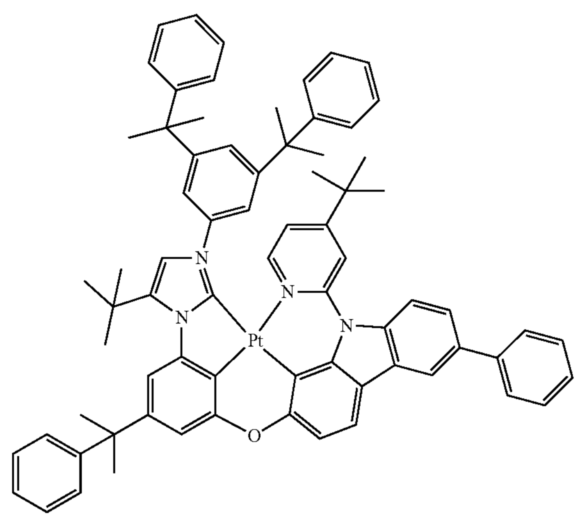

-continued
936
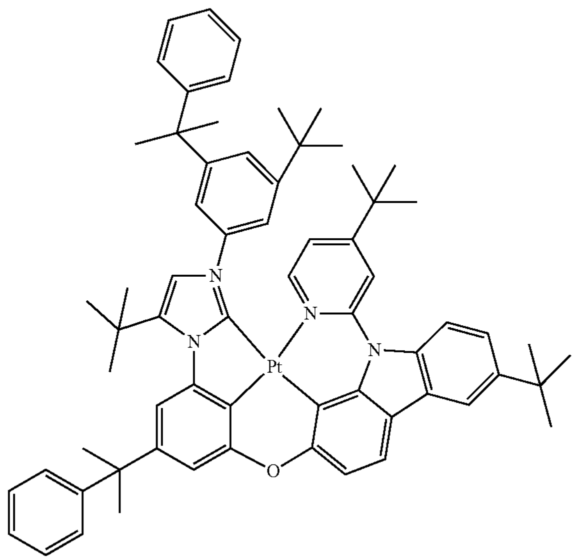
937
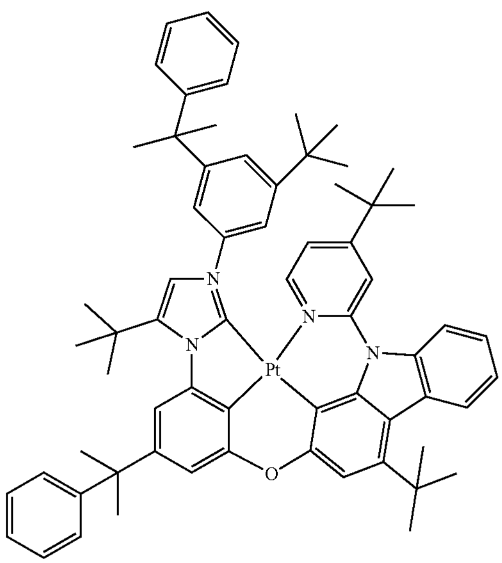
938
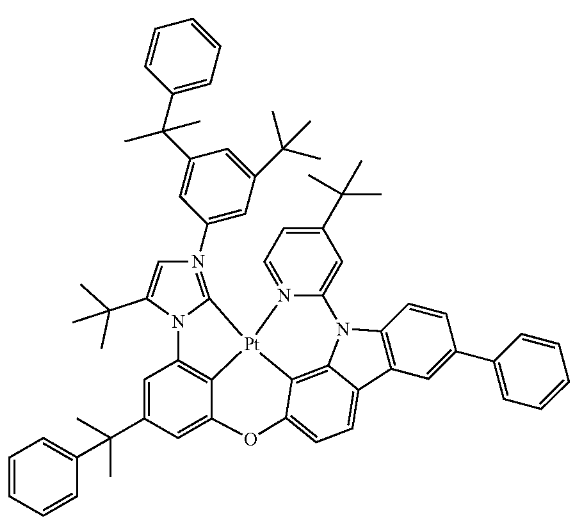
-continued
939
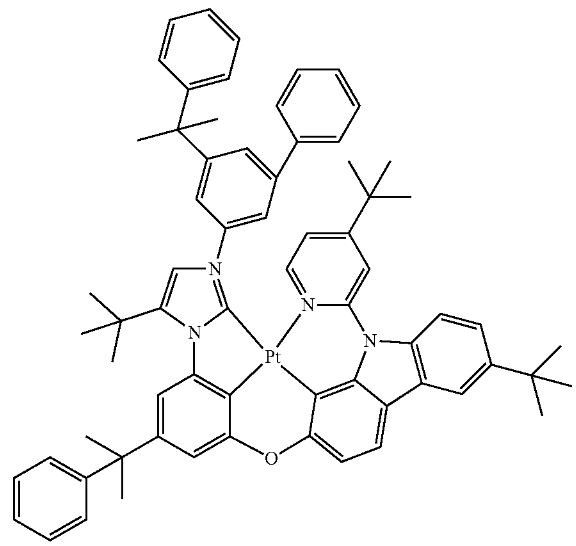
940
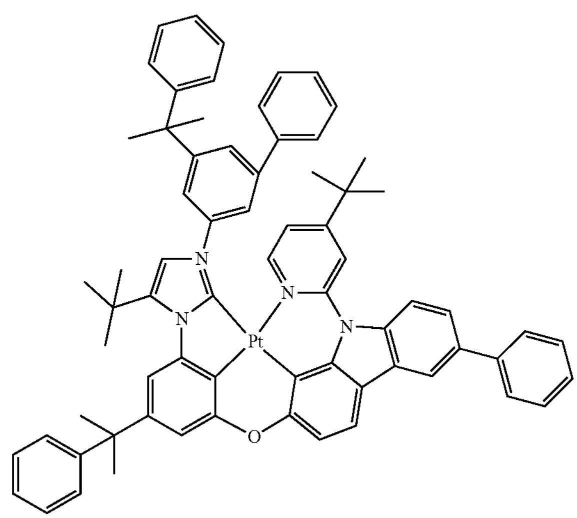
941
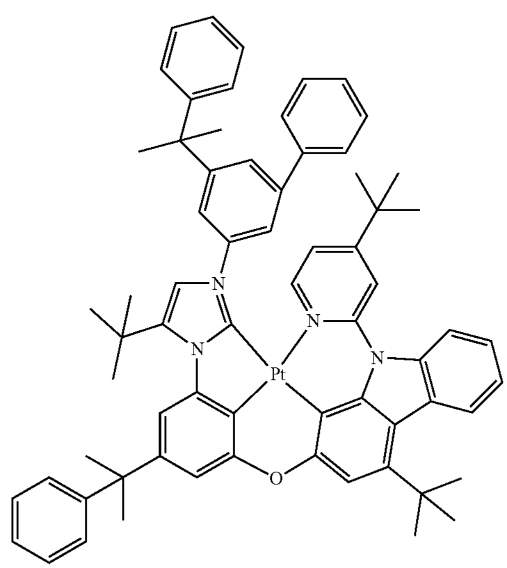

942
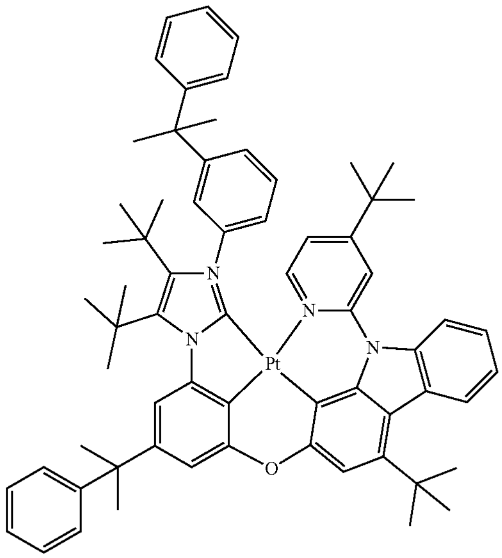
943
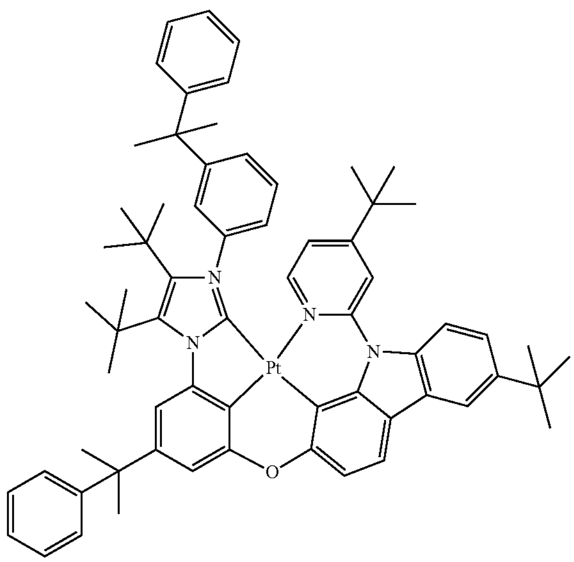
944
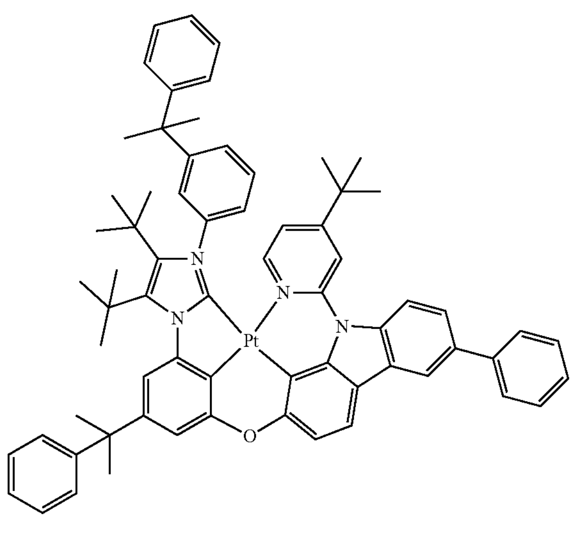
945
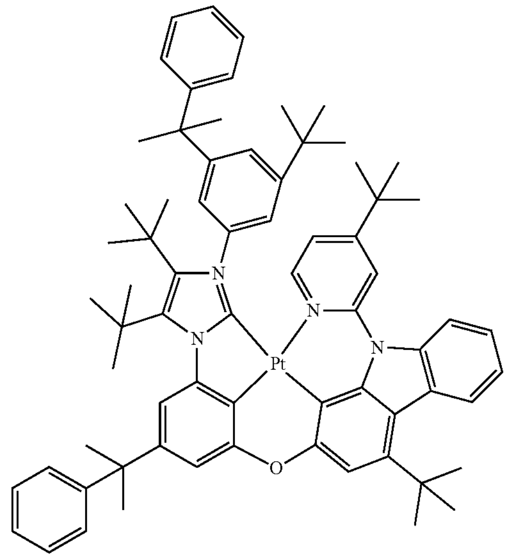
946
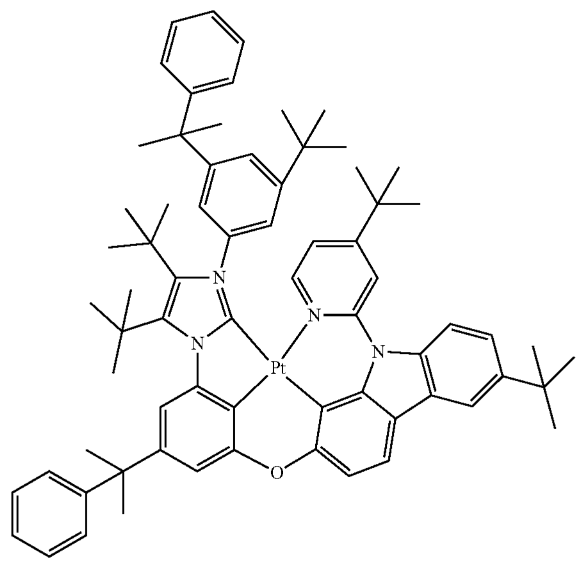
947
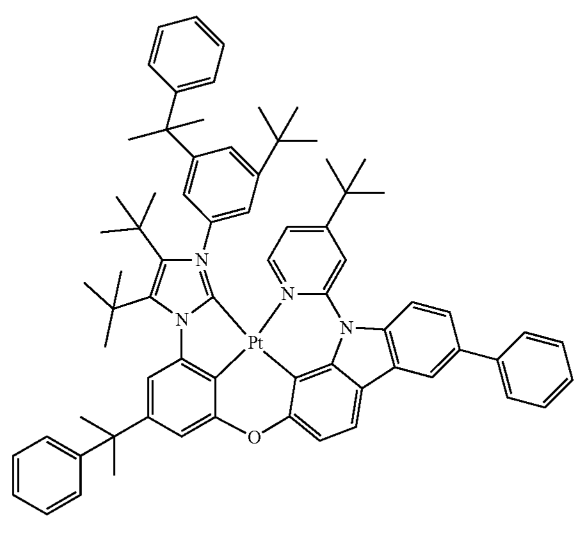

-continued
948
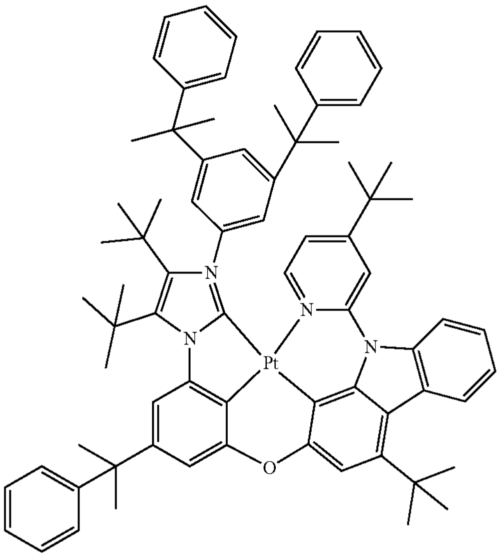
949
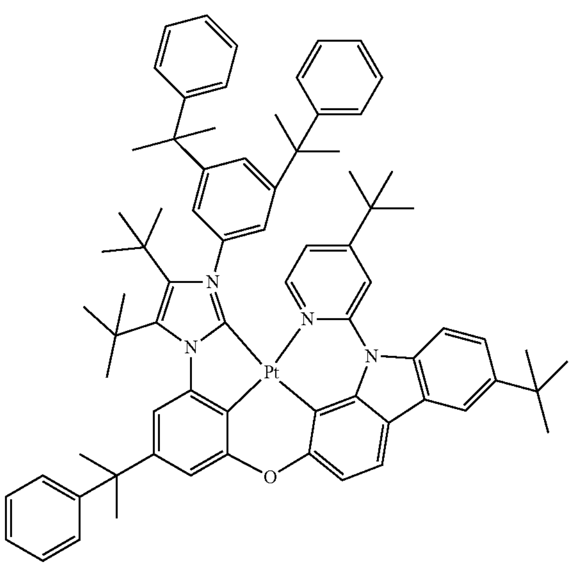
-continued
950
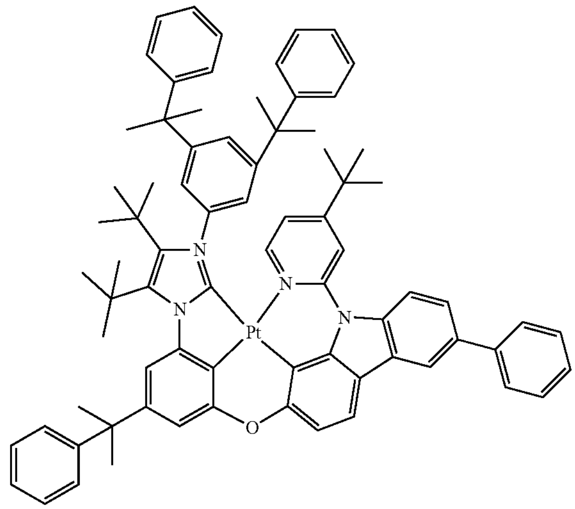
951
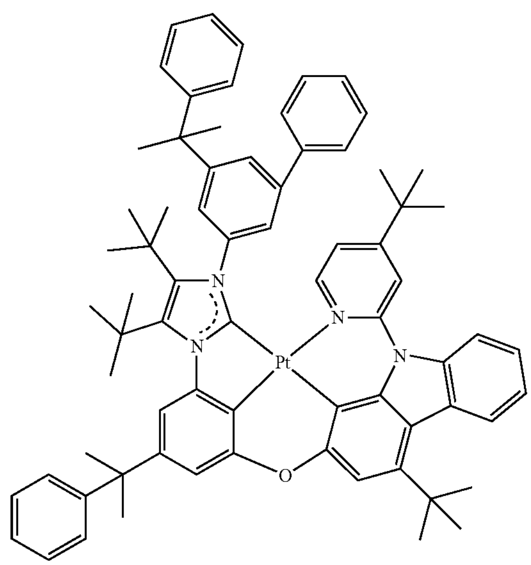

952
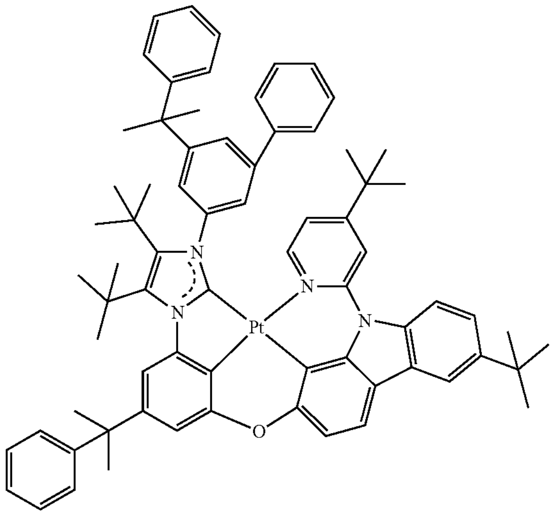
953
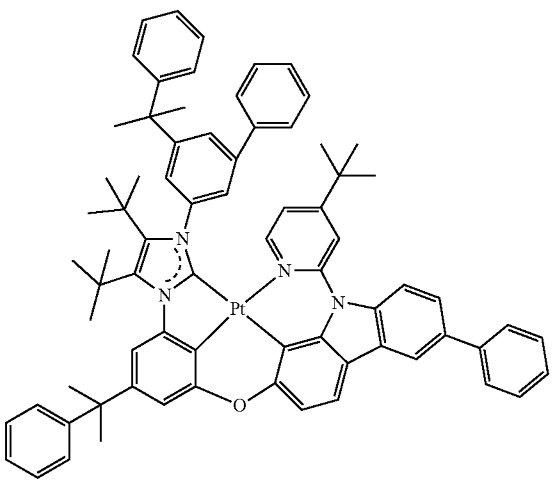
954
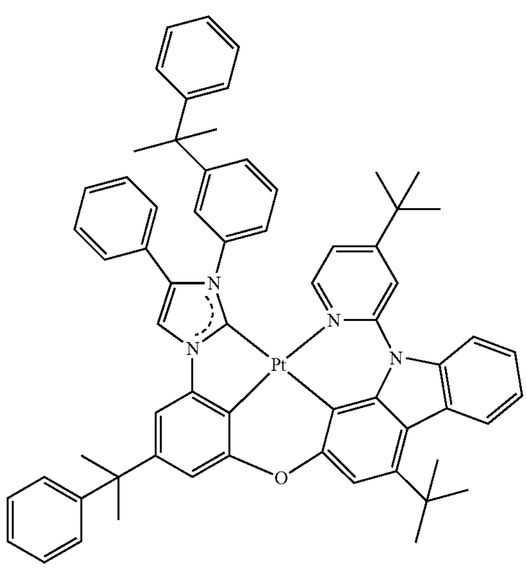
955
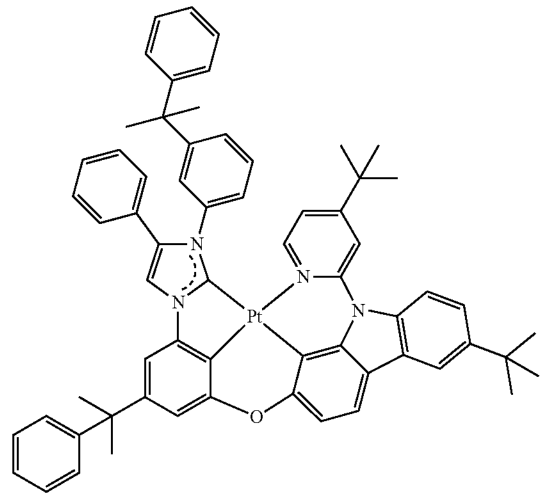
956
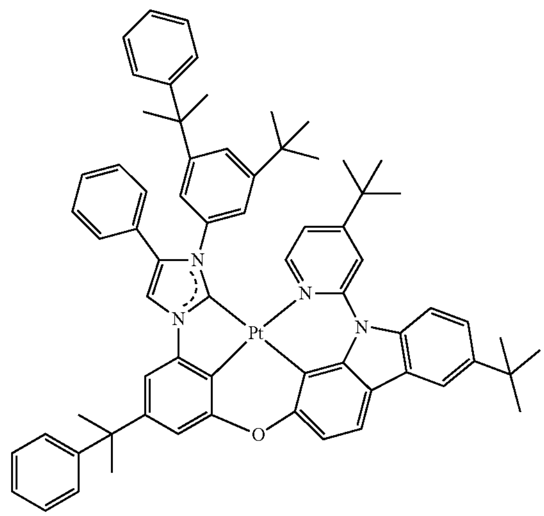
957
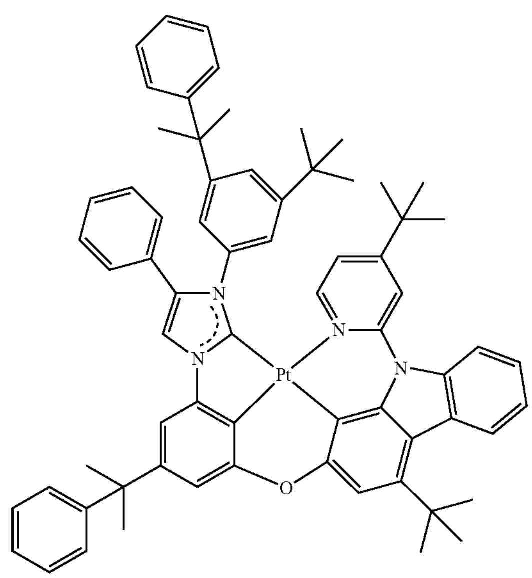

-continued
958
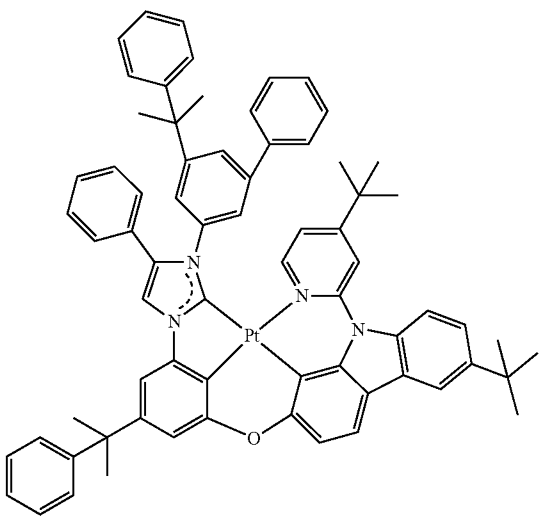
959
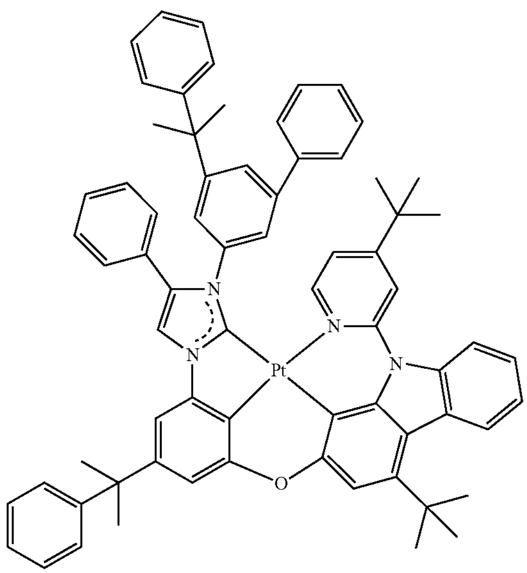
960
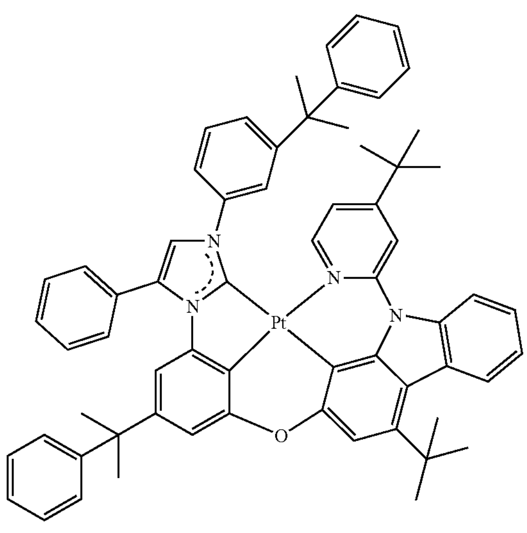
-continued
961
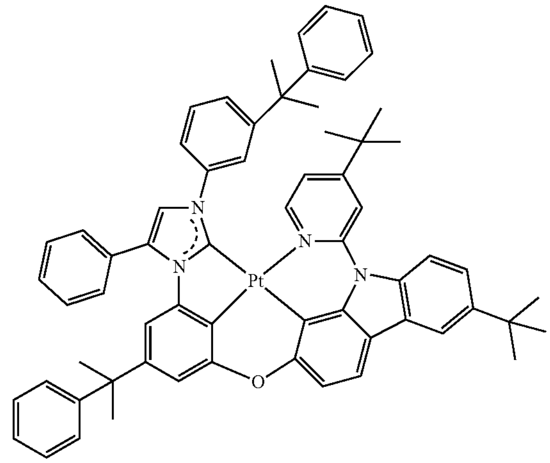
962
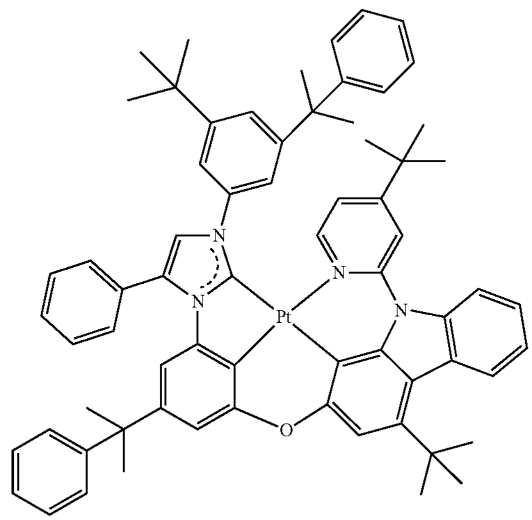
963
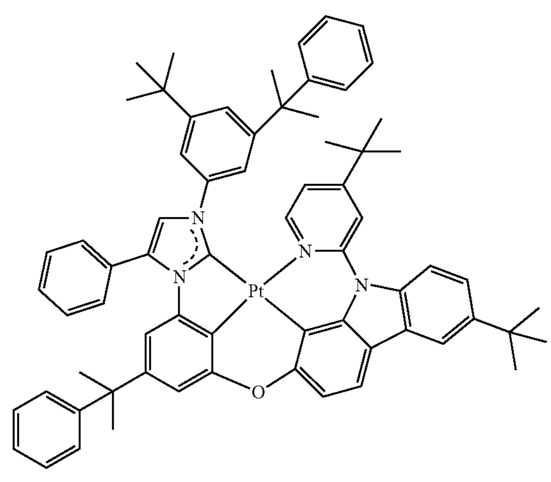

-continued
964
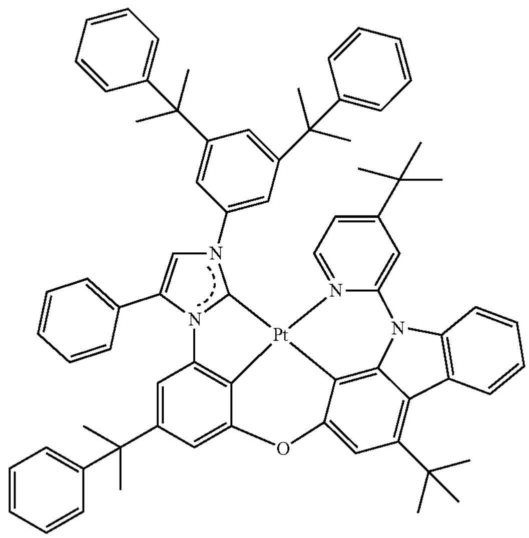
965
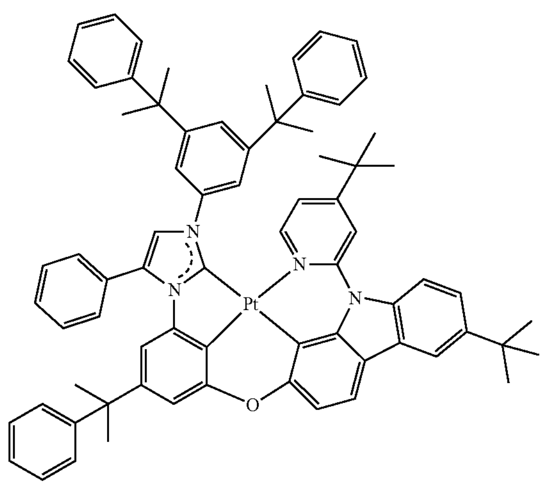
966
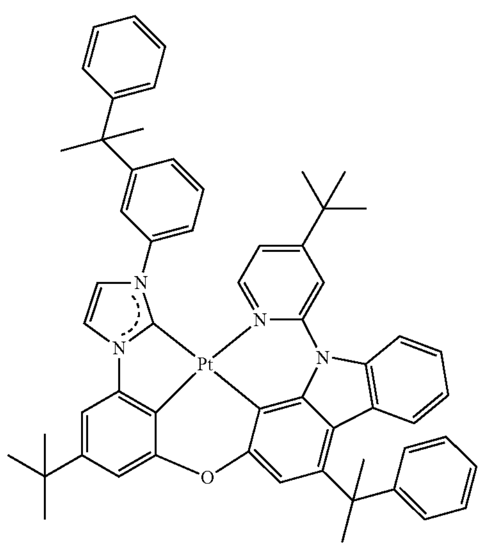
-continued
967
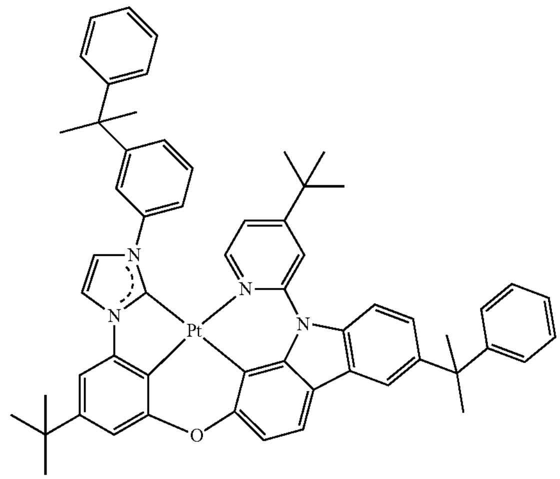
968
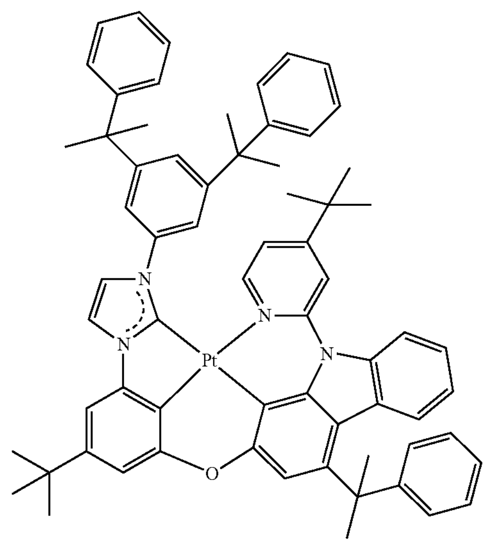
969
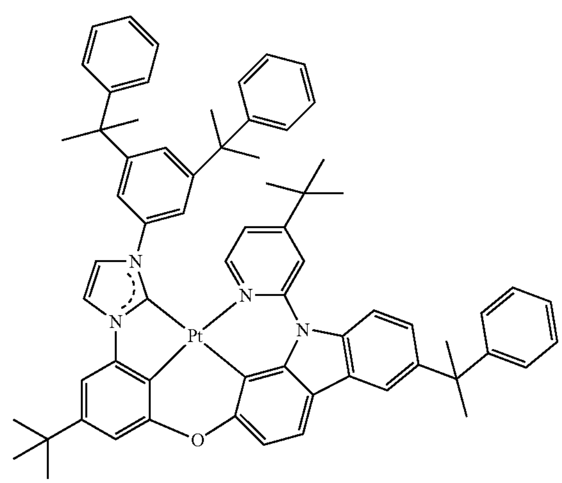

-continued
970
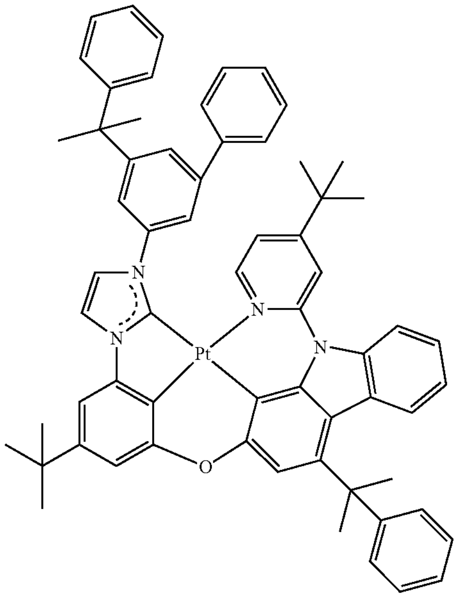
971
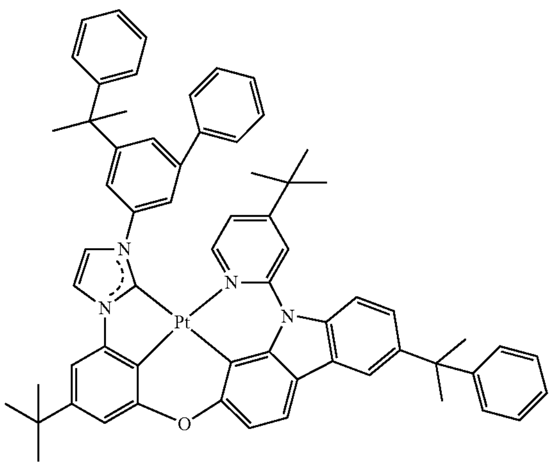
972
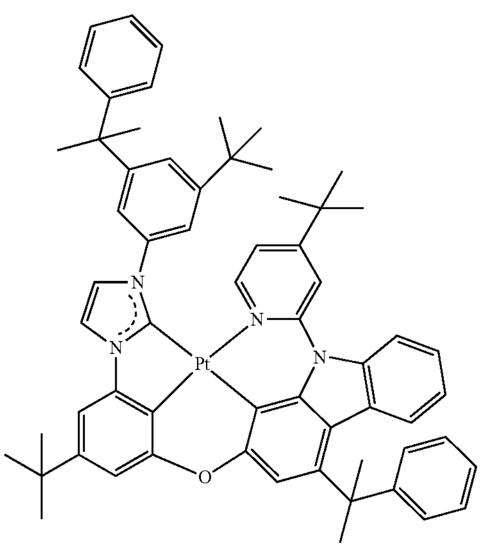
-continued
973
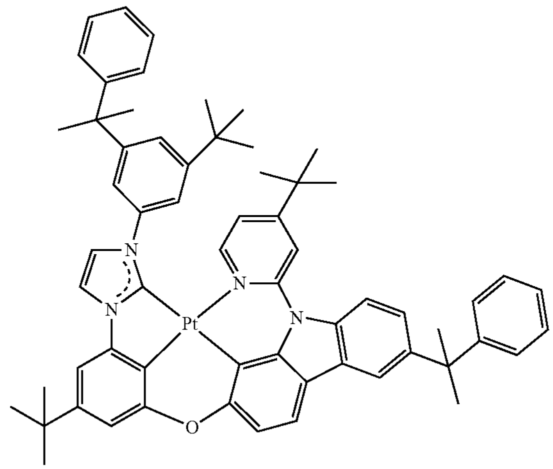
974
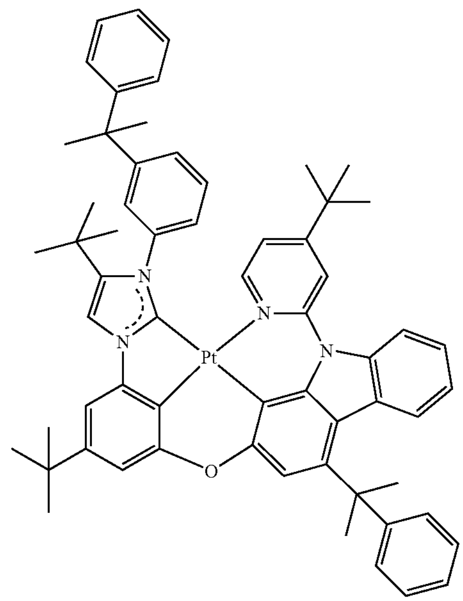
975
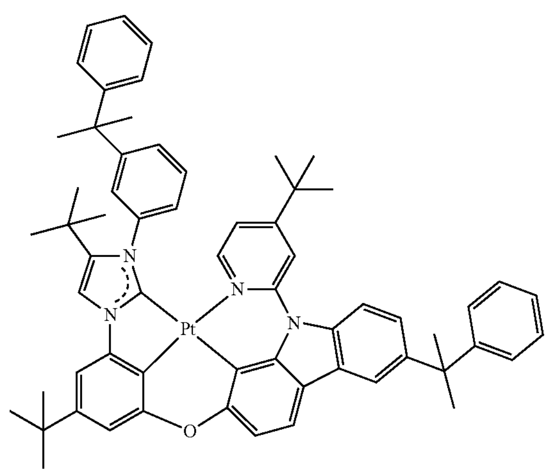

-continued
976
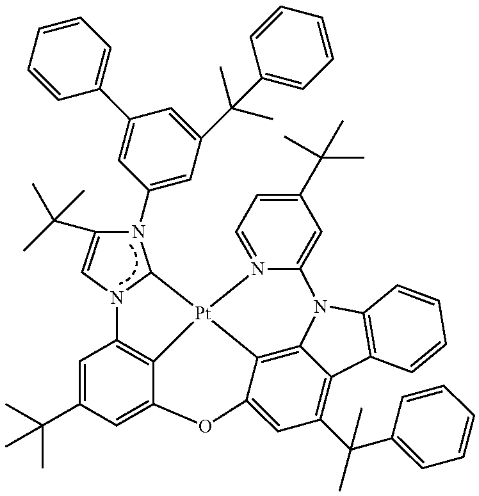
977
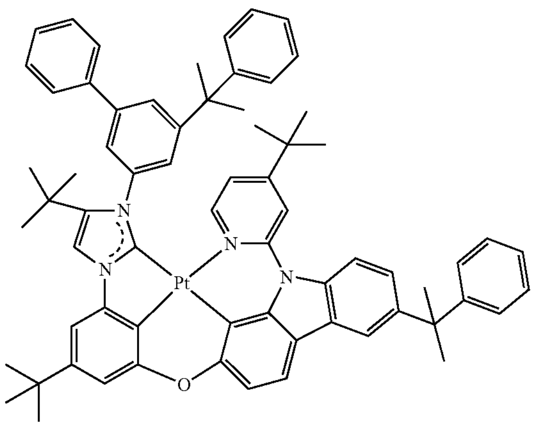
978
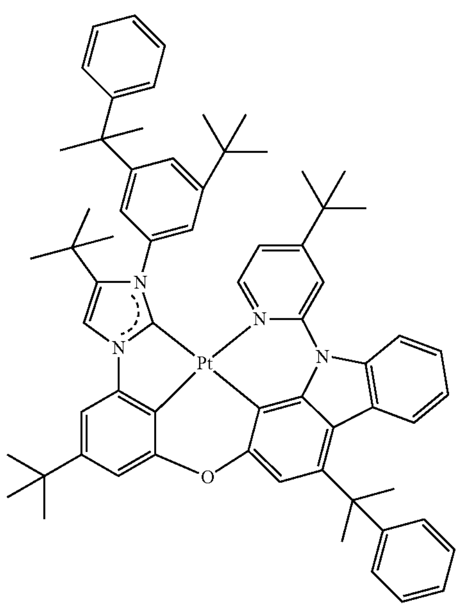
-continued
979
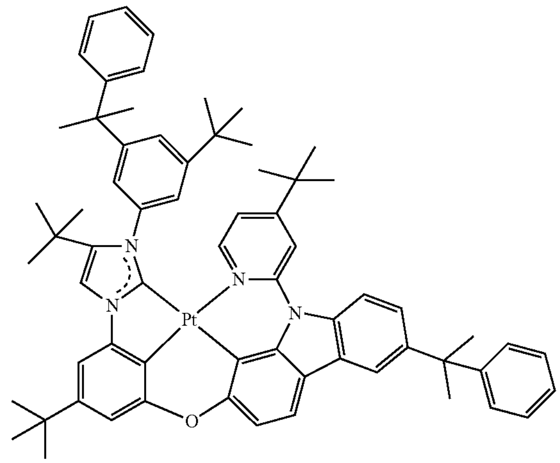
980
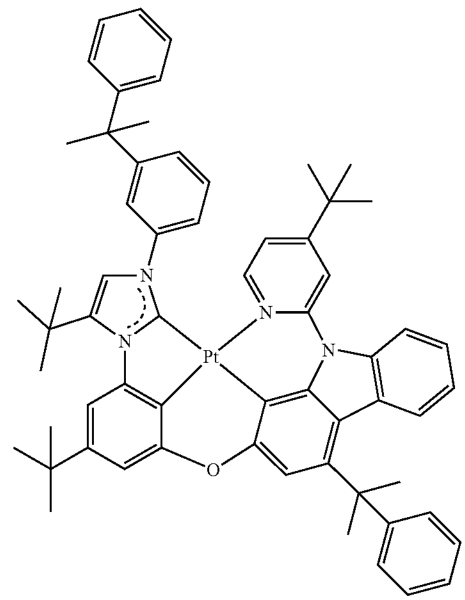
981
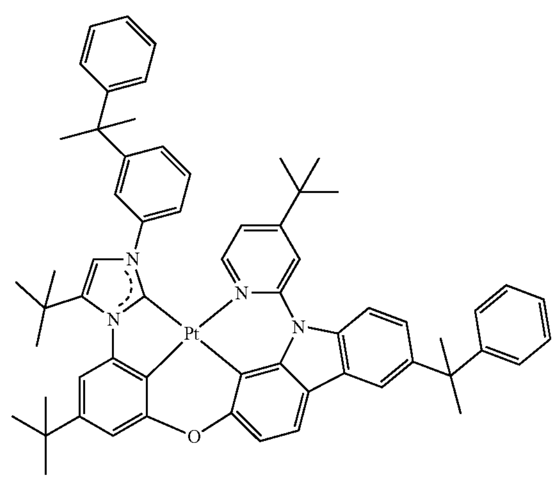

-continued
982
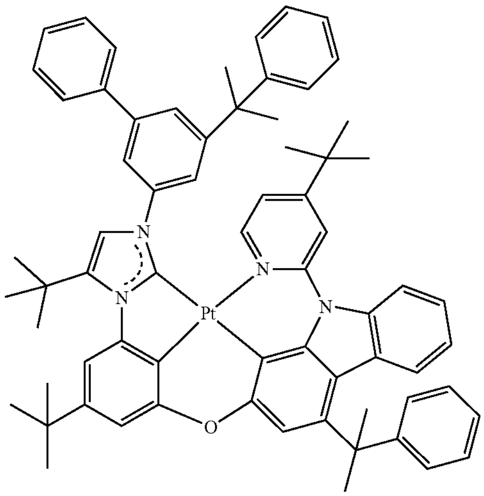
983
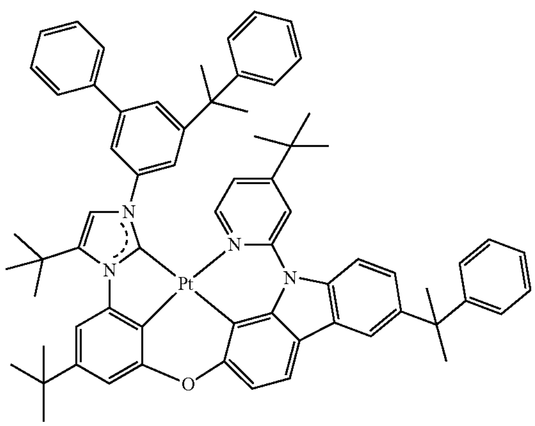
984
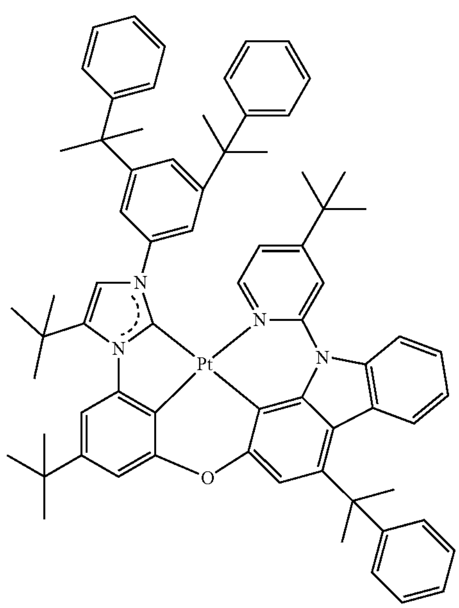
-continued
985
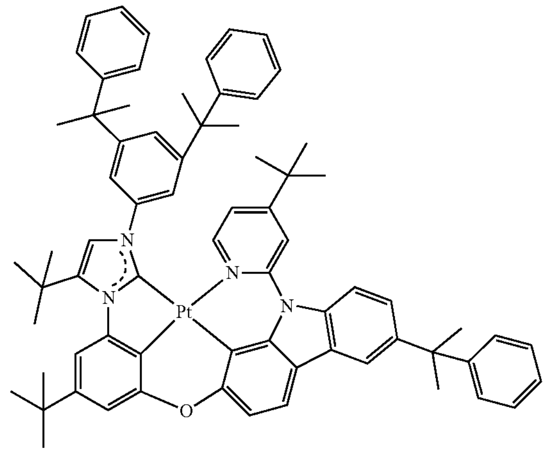
986
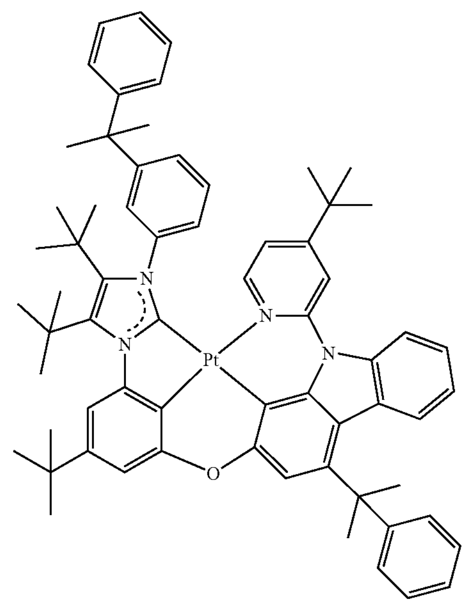
987
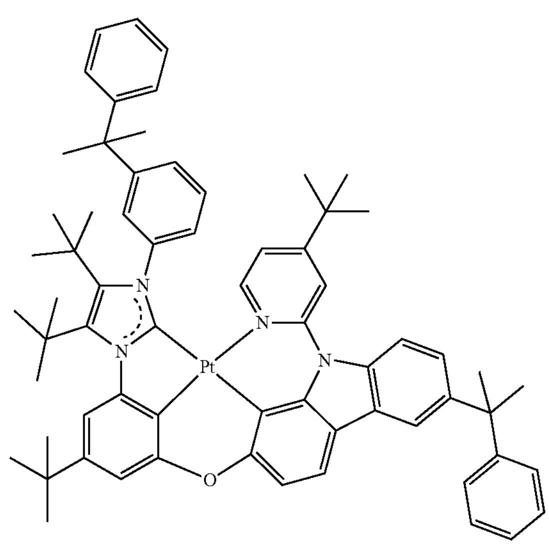

-continued
988
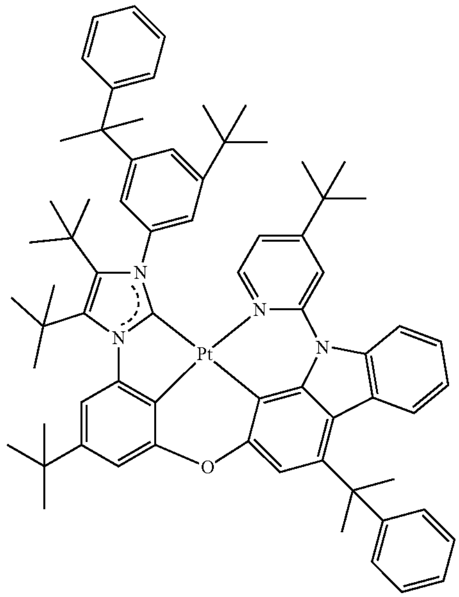
989
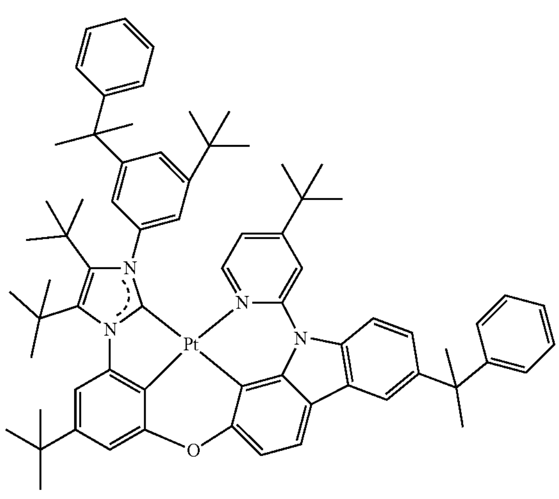
-continued
990
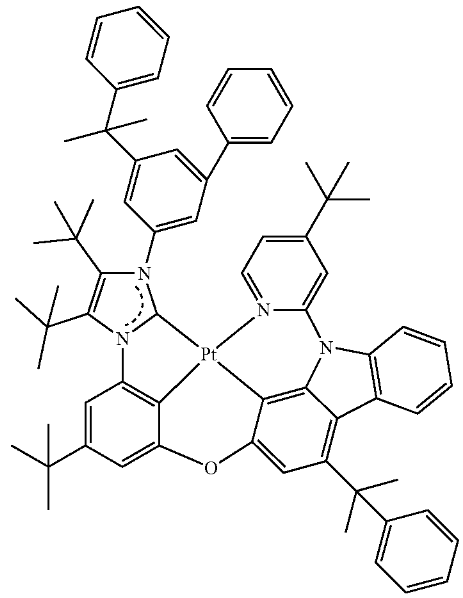
991
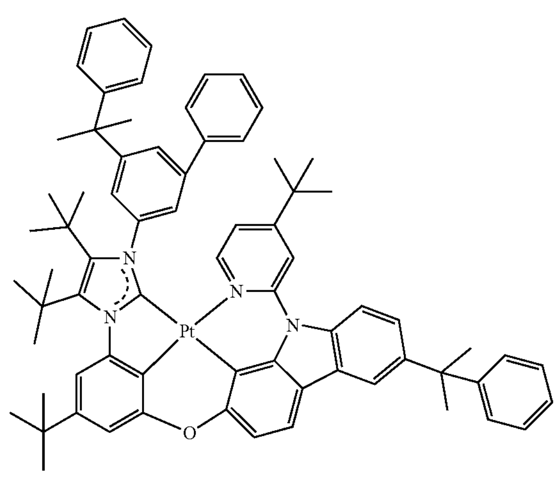

992
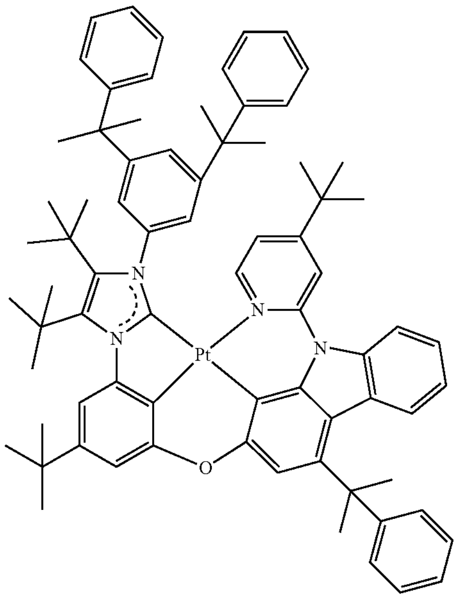
993
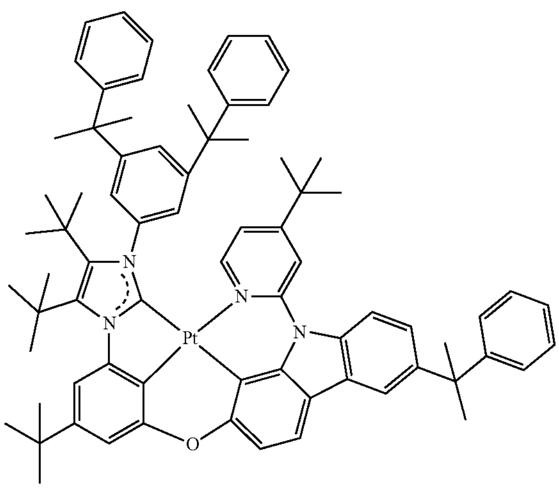
994
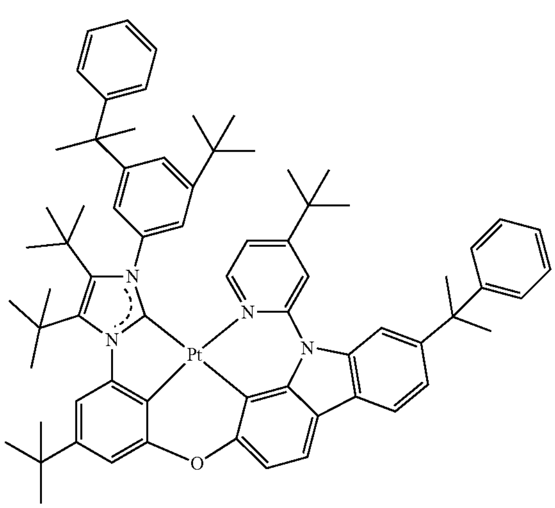
995
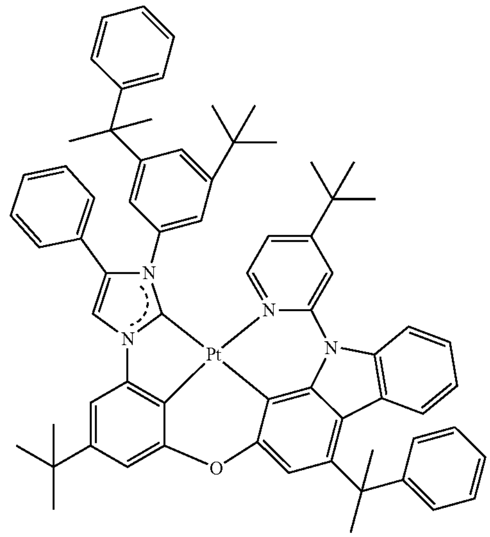
996
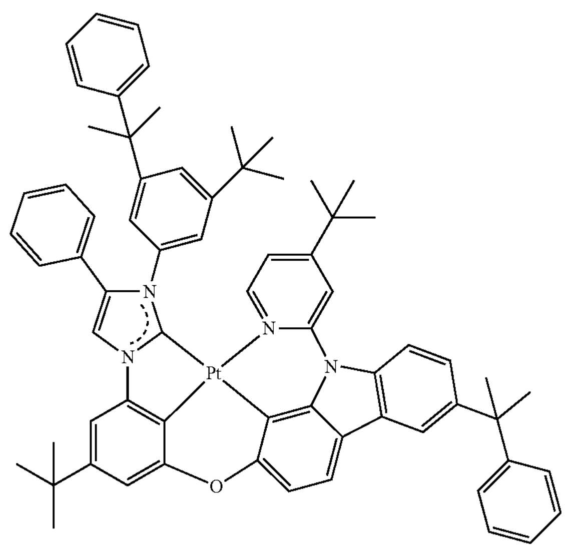
997
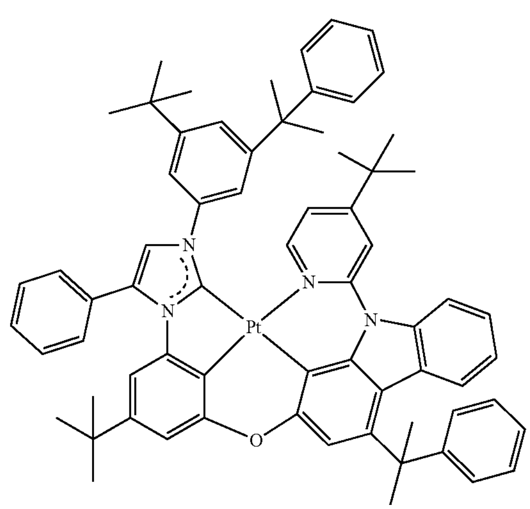

-continued
998
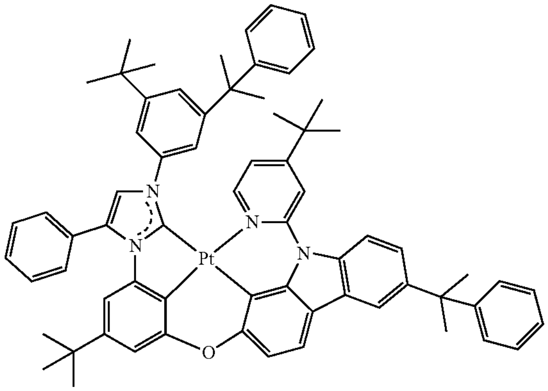
999
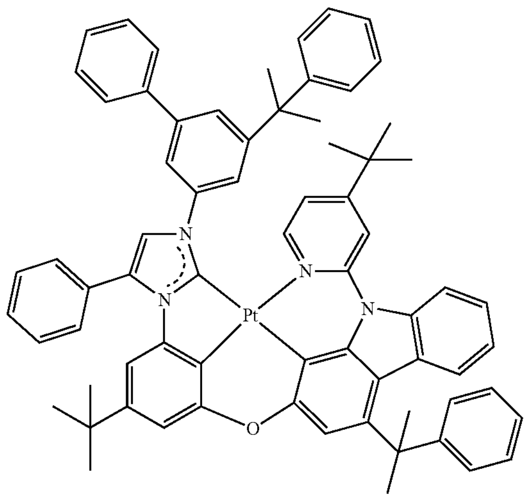
1000
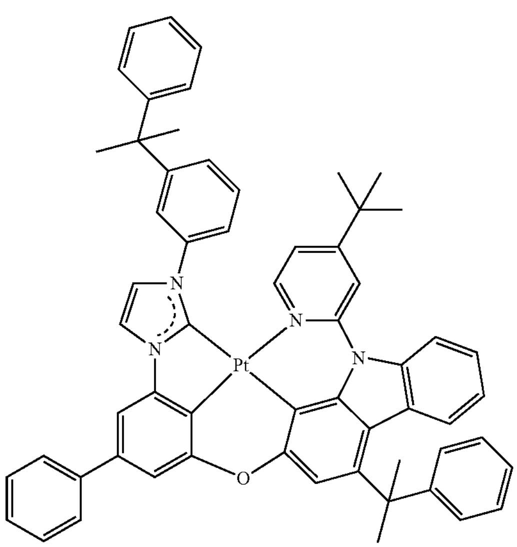
-continued
1001
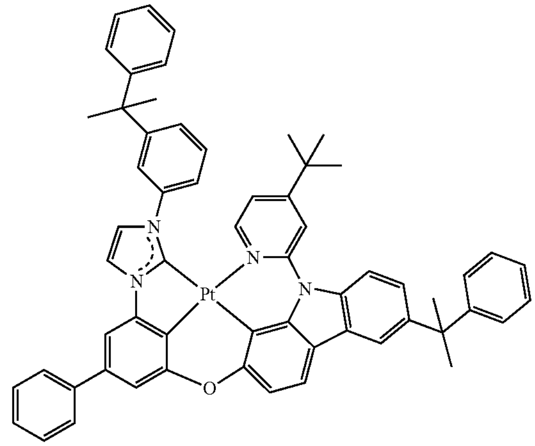
1002
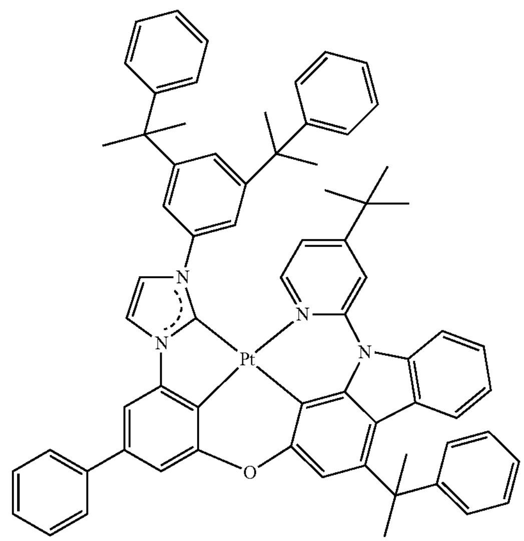
1003
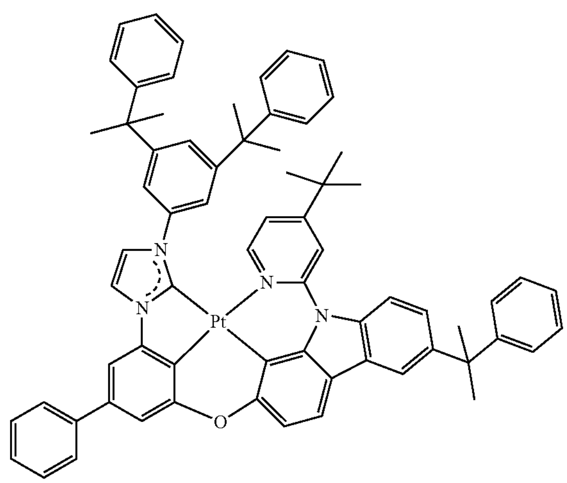

1004
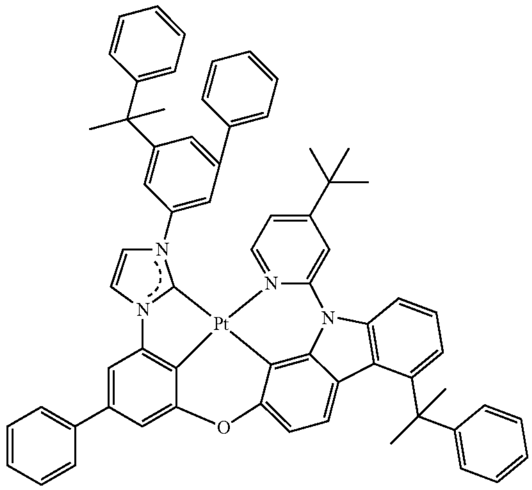
1005
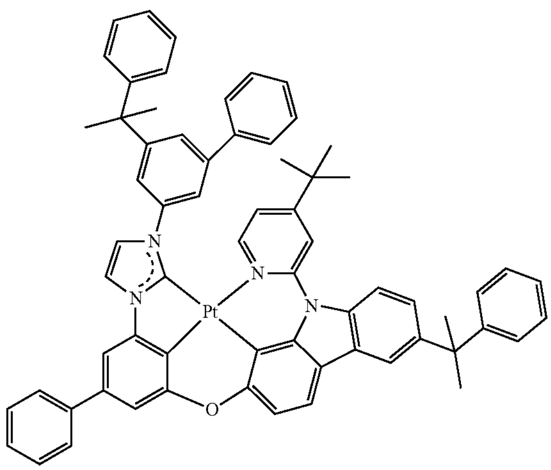
1006
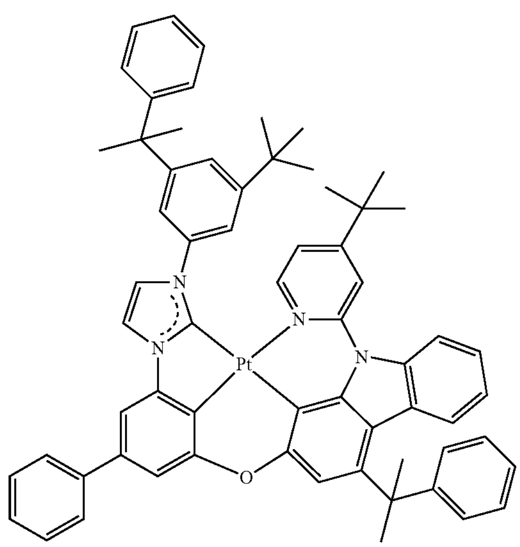
1007
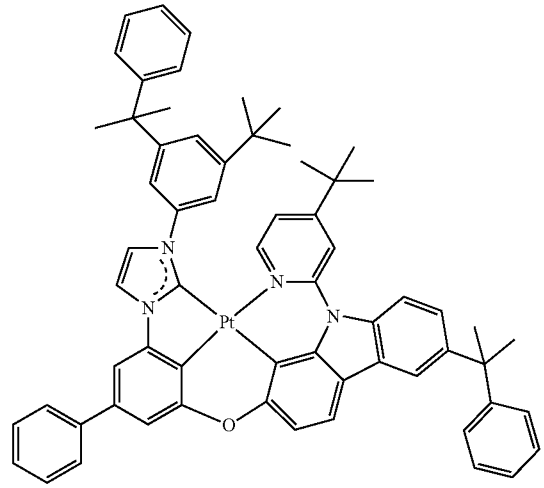
1008
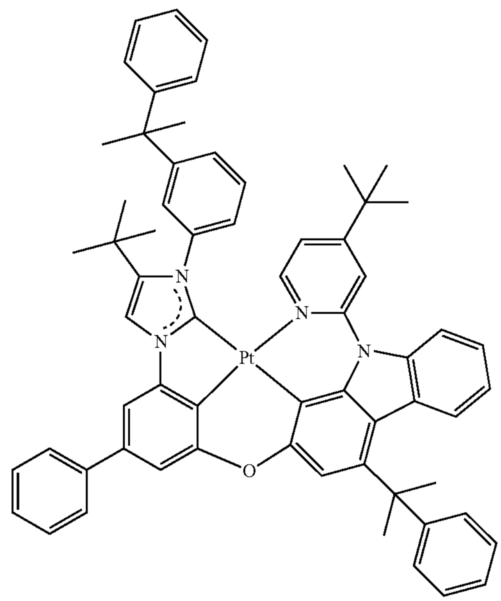
1009
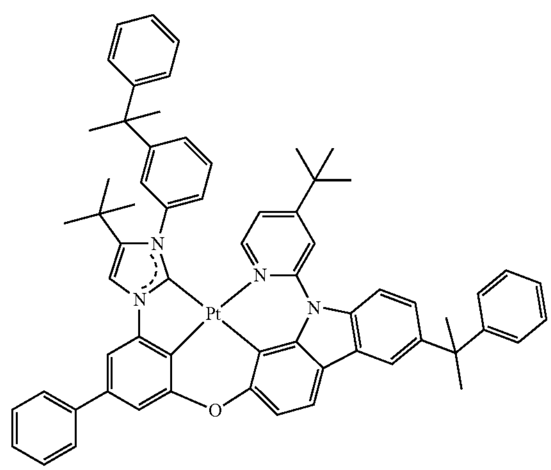

-continued
1010
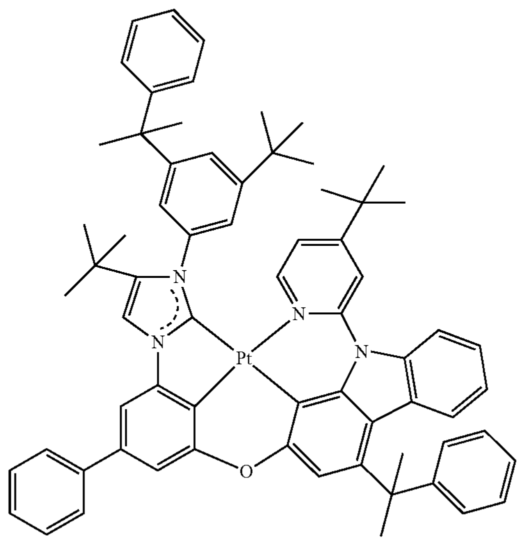
1011
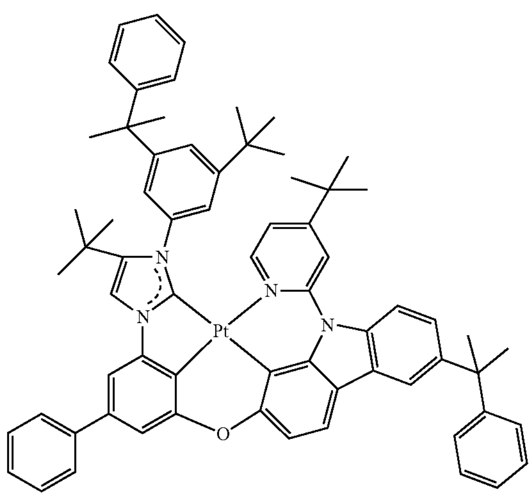
-continued
1012
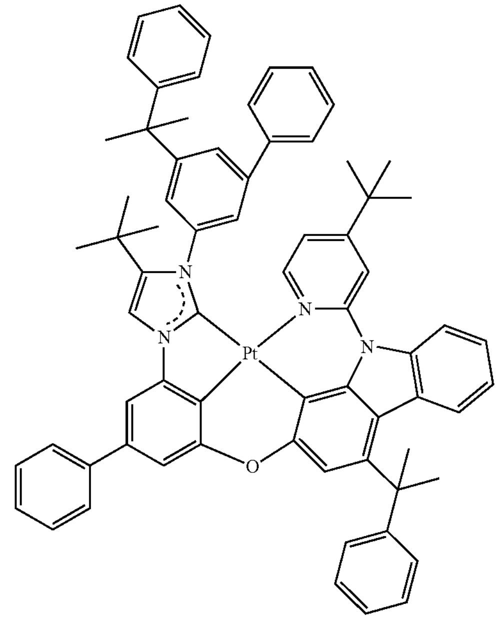
1013
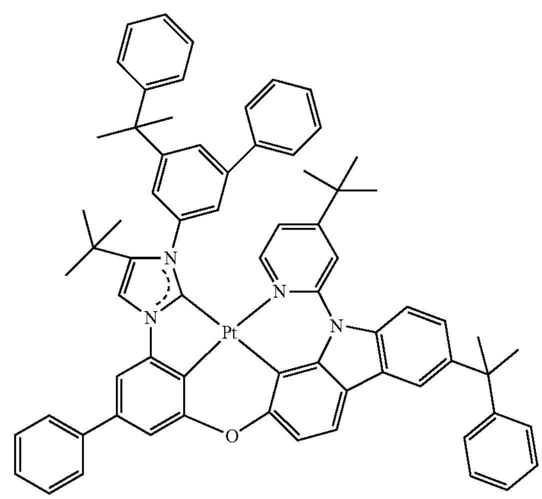

-continued
1014
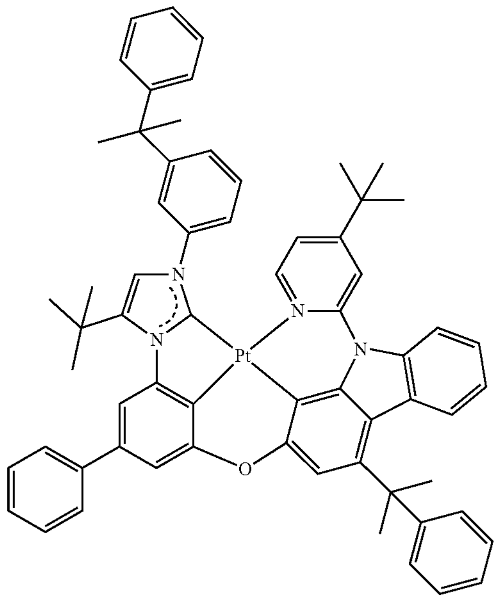
1015
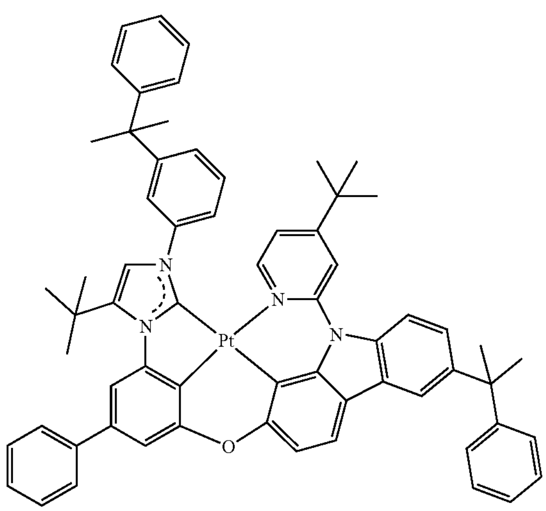
1016
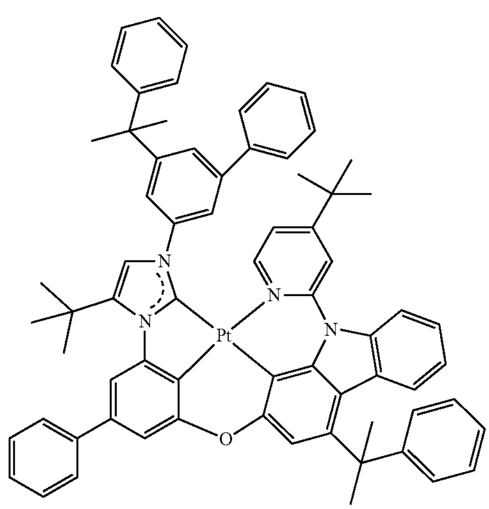
-continued
1017
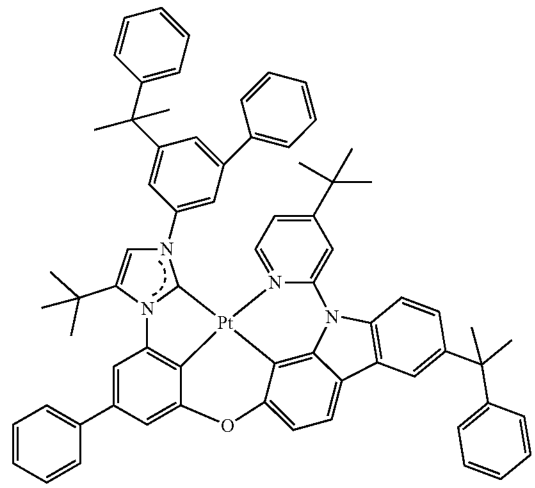
1018
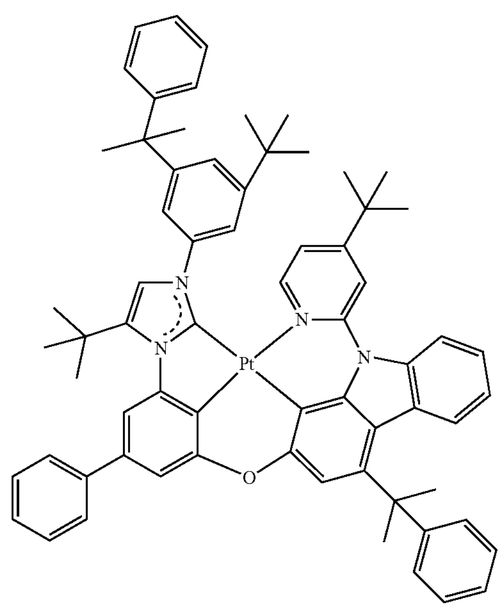
1019
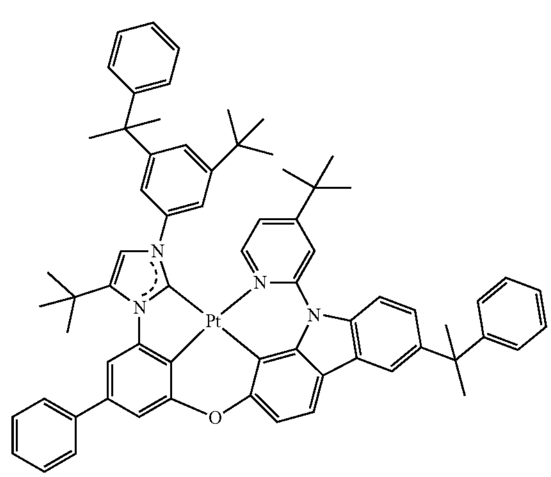

-continued
1020
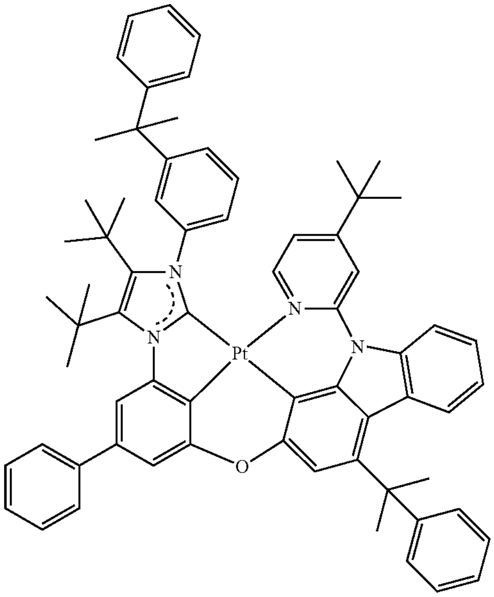
1021
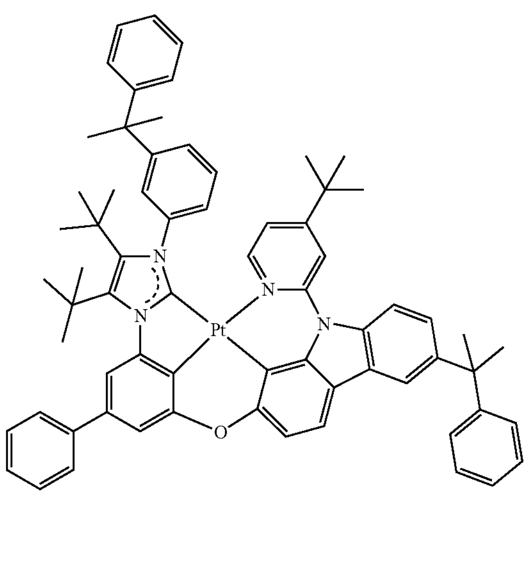
-continued
1022
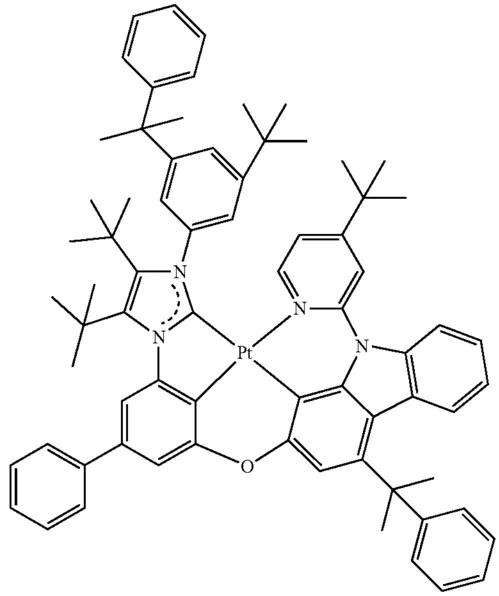
1023
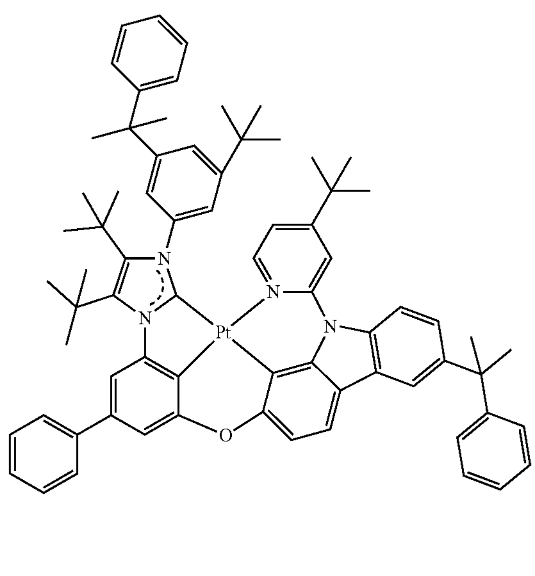

-continued
1024
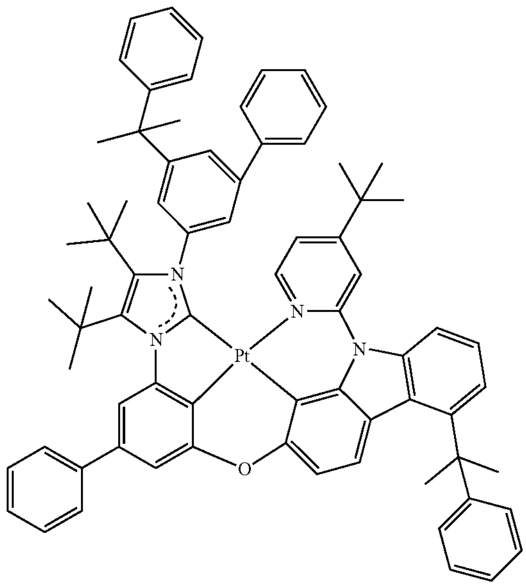
1025
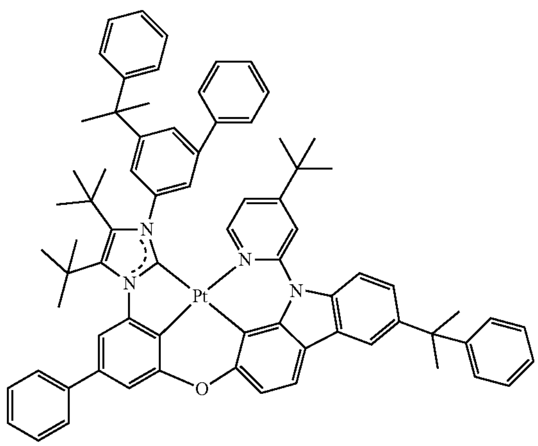
1026
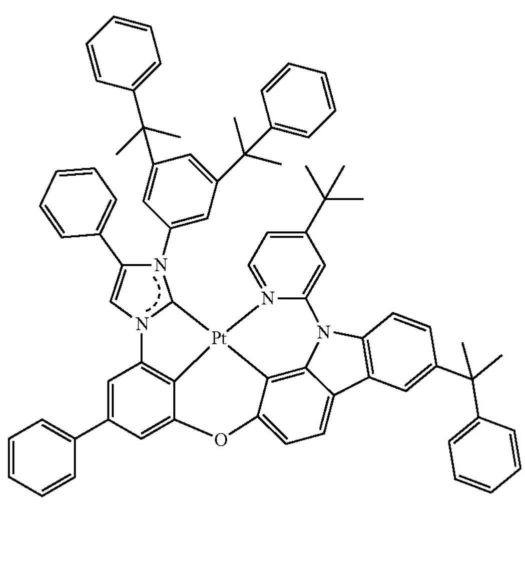
-continued
1027
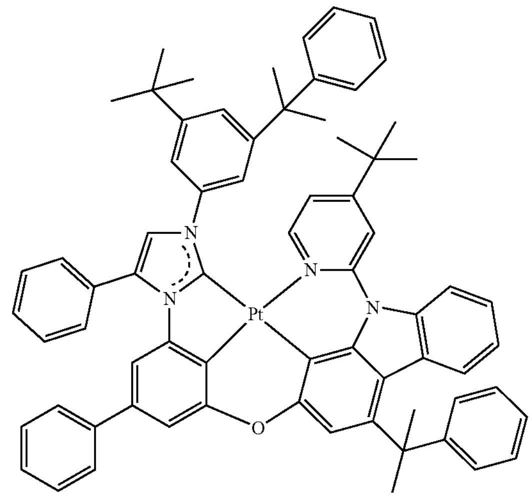
1028
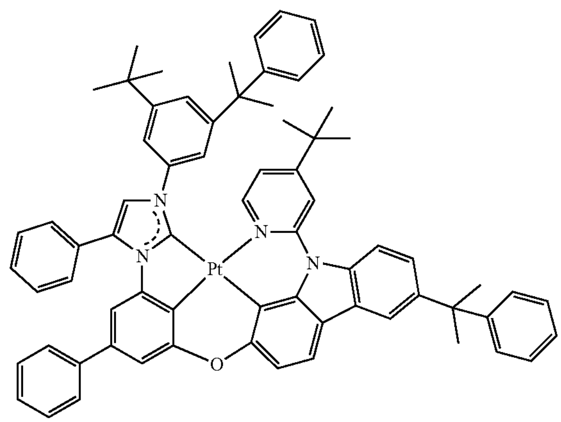
1029
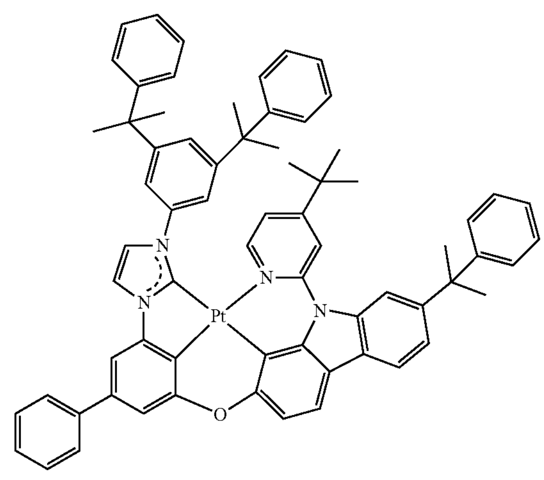

-continued
1030
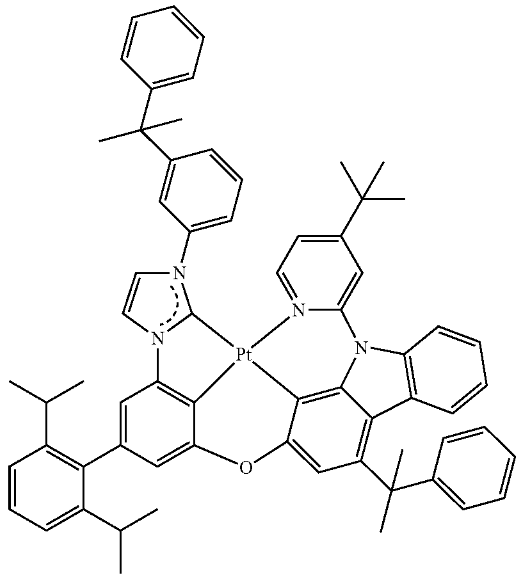
1031
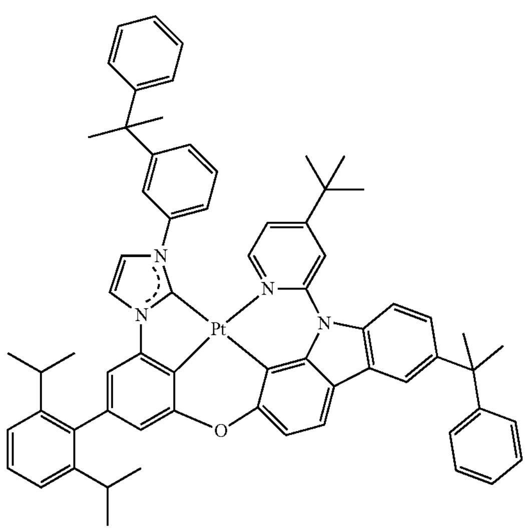
-continued
1032
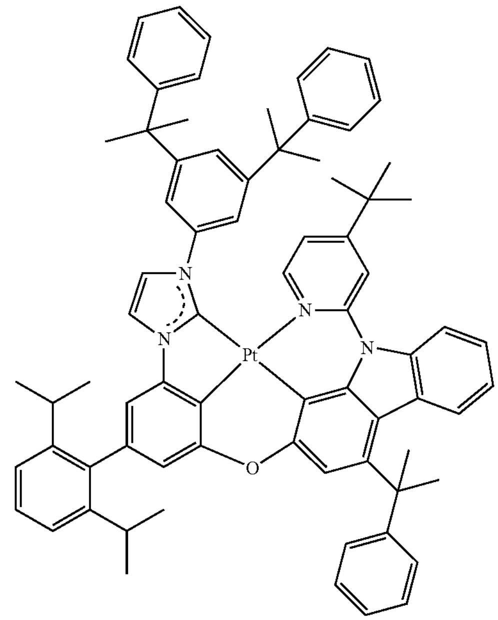
1033
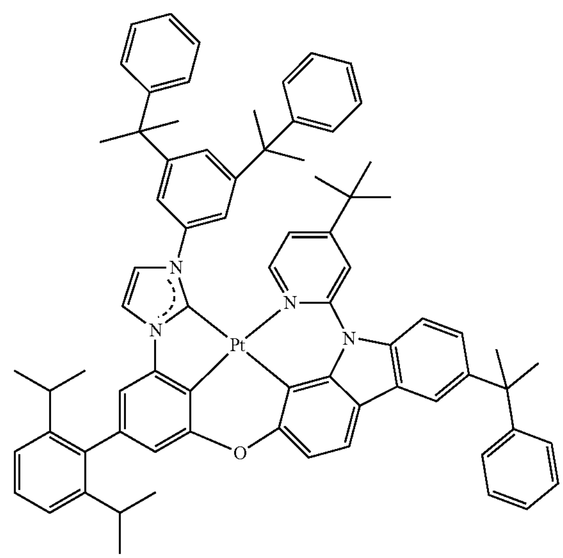

-continued
1034
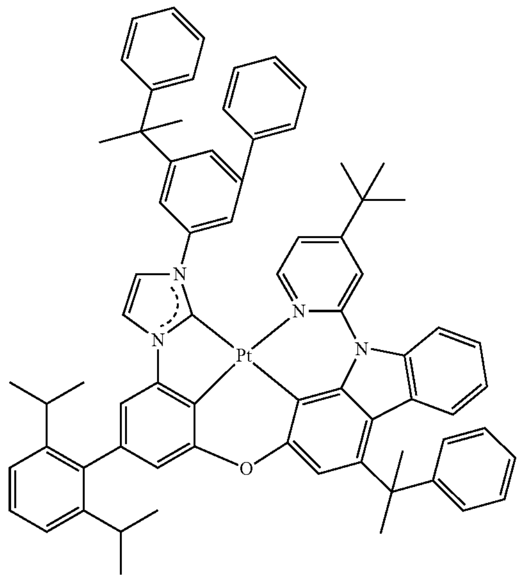
1035
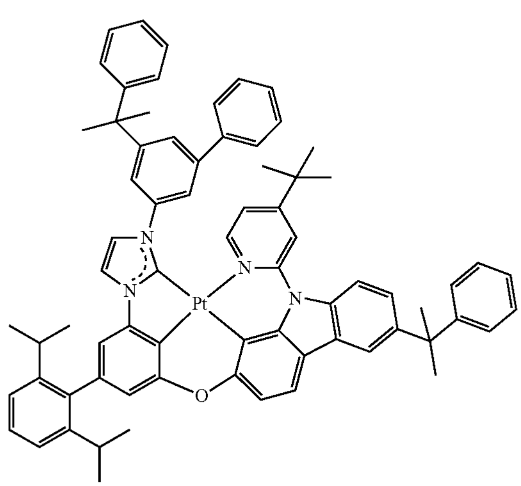
-continued
1036
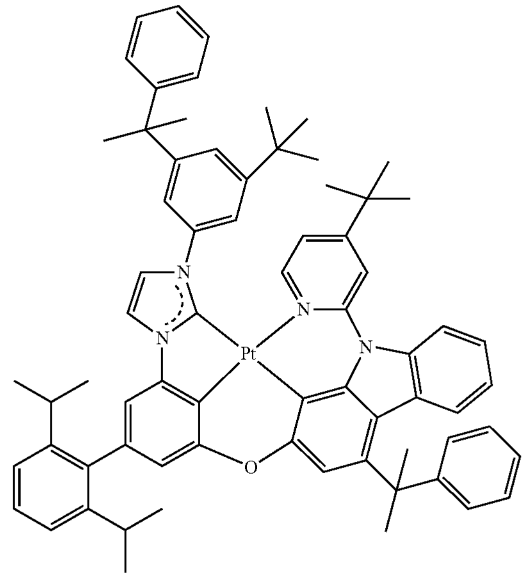
1037
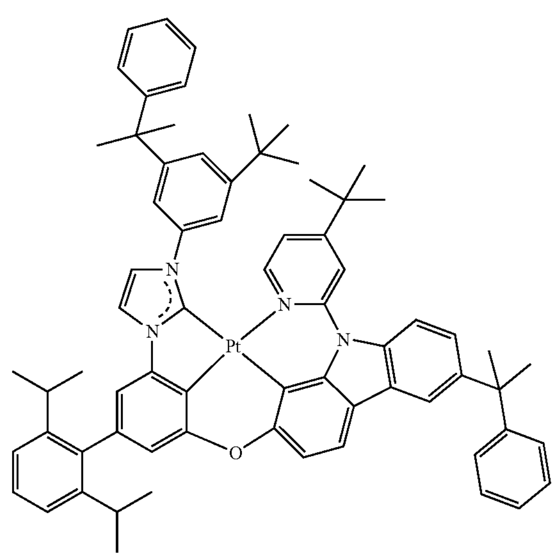

-continued
1038
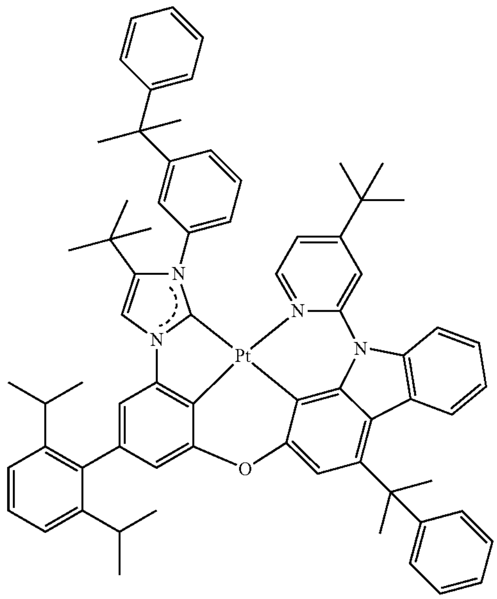
1039
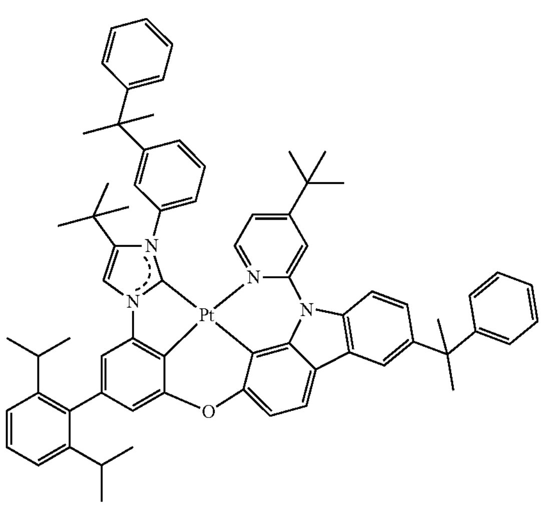
-continued
1040
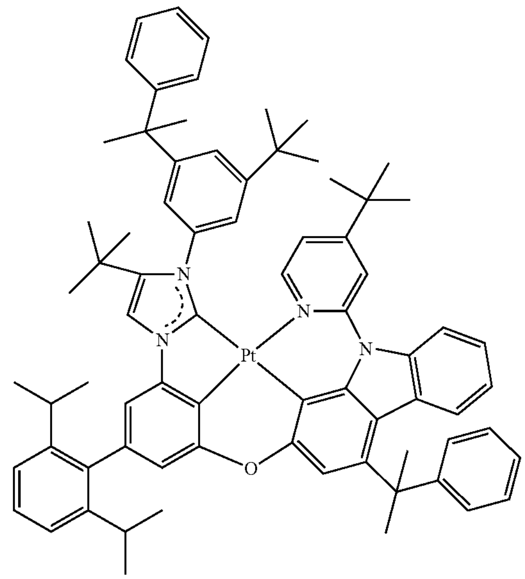
1041
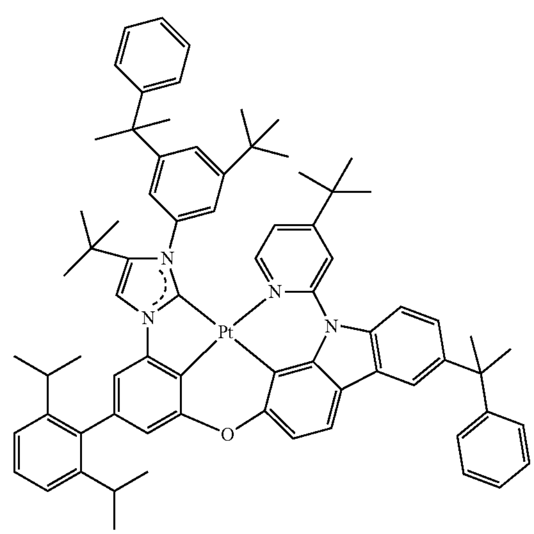

-continued
1042
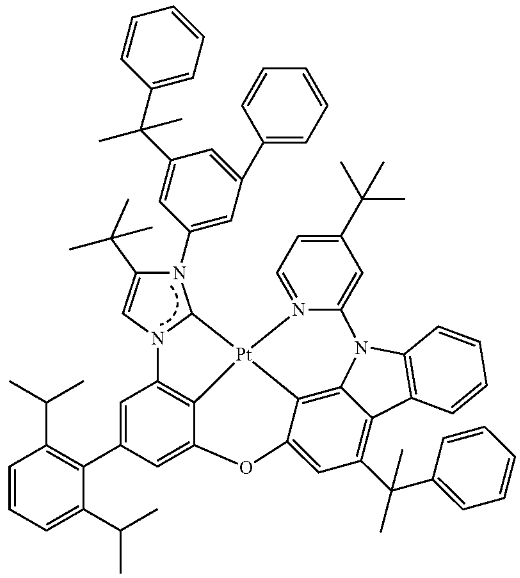
1043
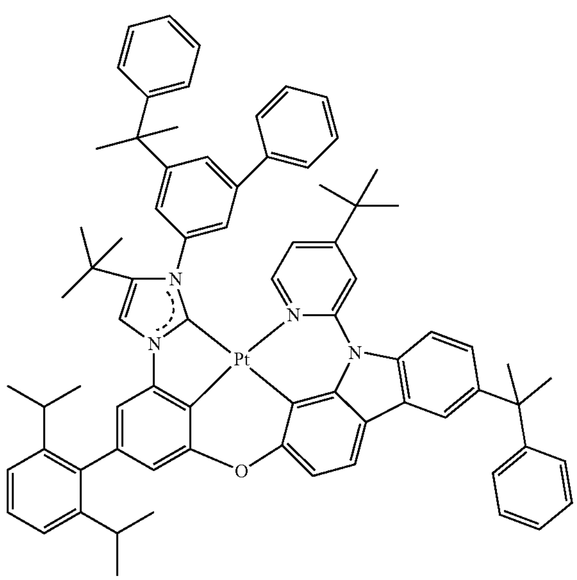
-continued
1044
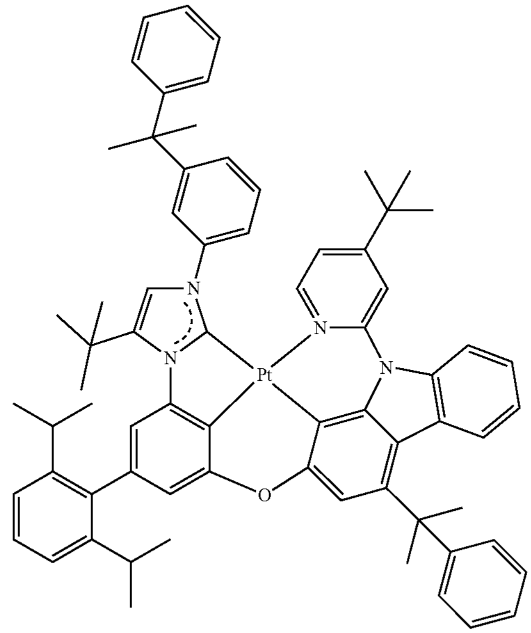
1045
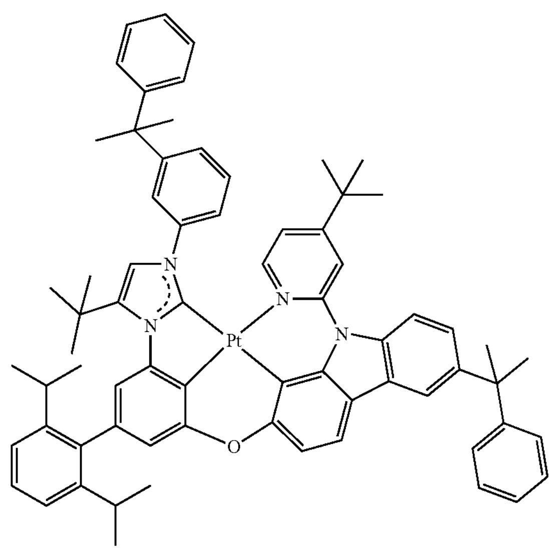

-continued
1046
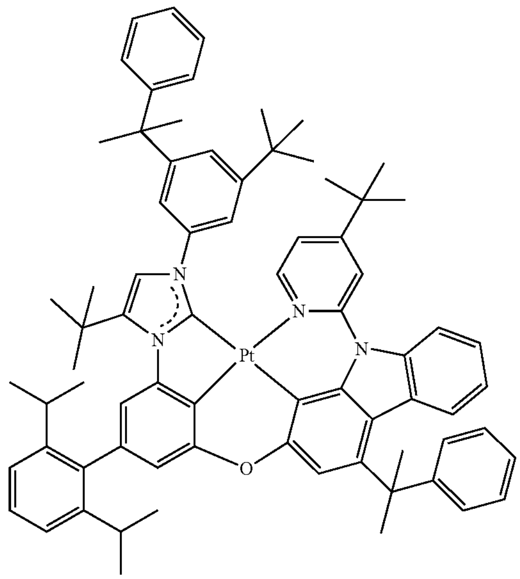
1047
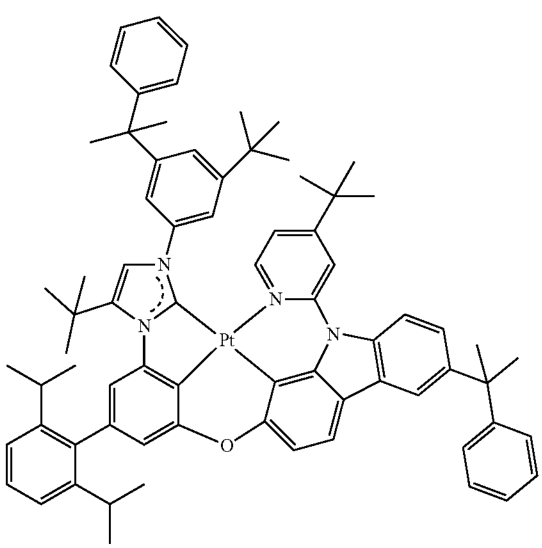
-continued
1048
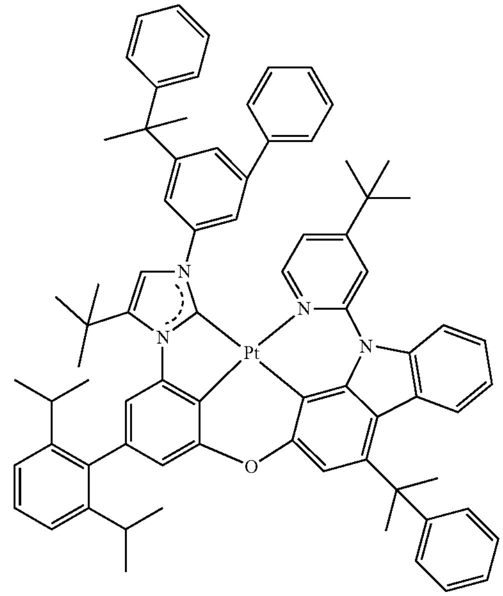
1049
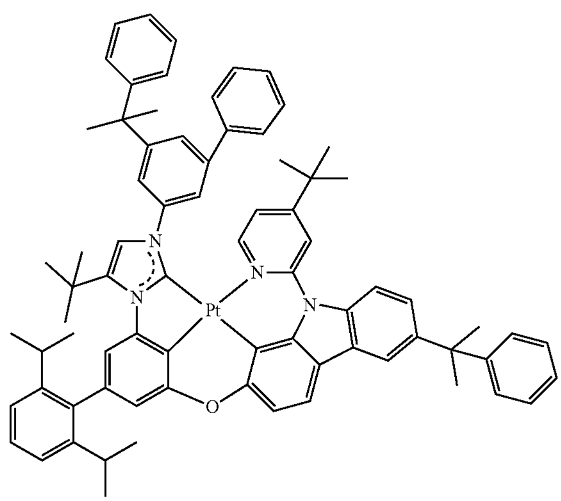

-continued
1050
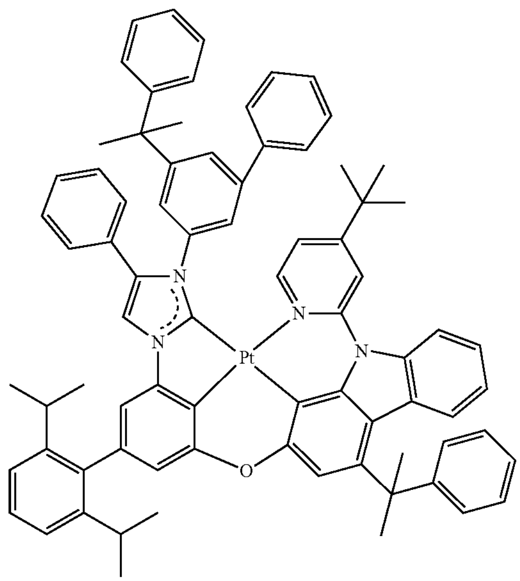
1051
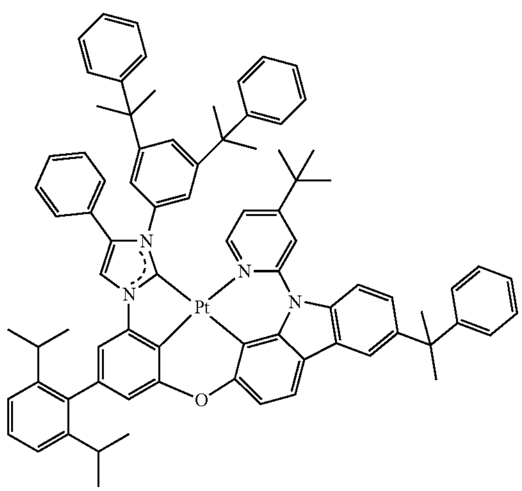
1052
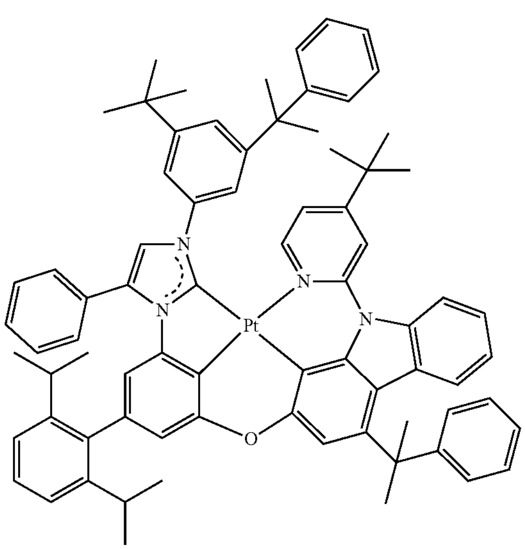
-continued
1053
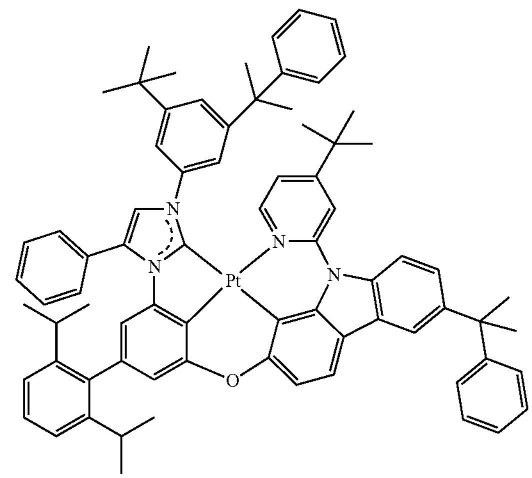
1054
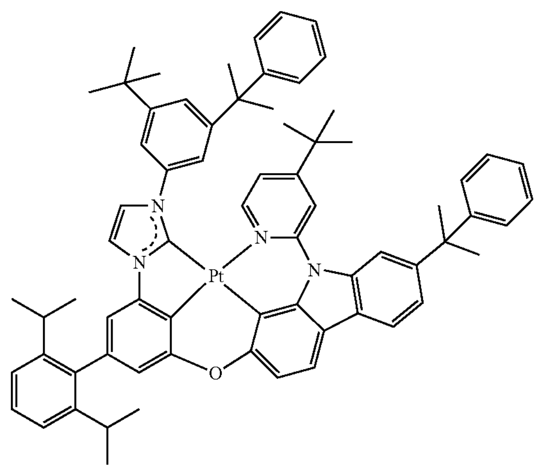
1055
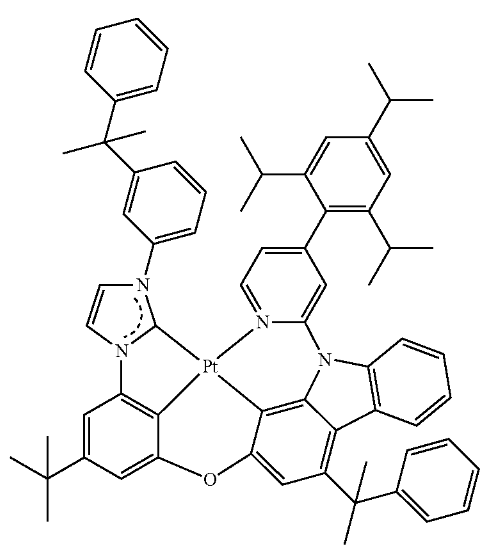

1056
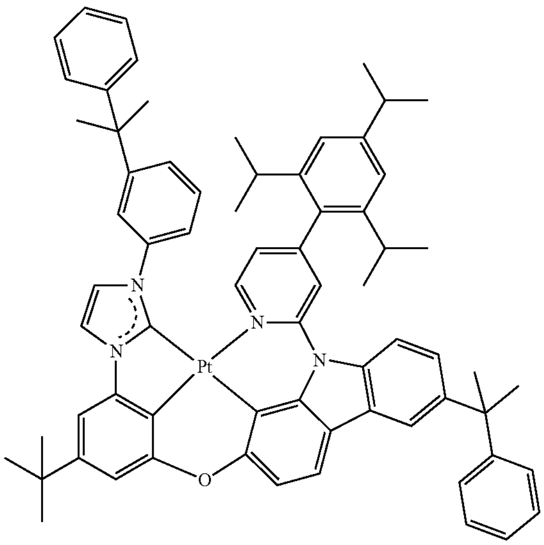
1057
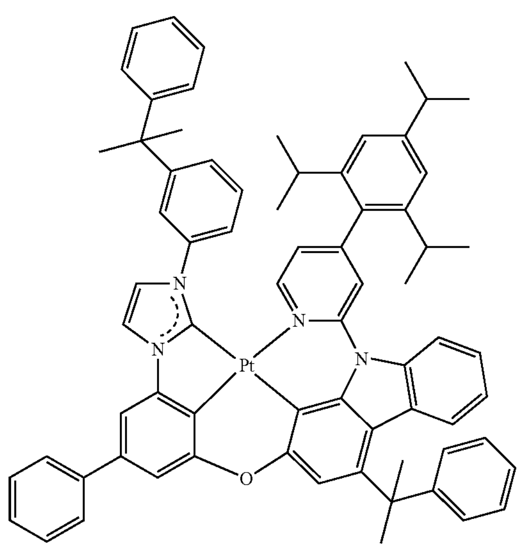
1058
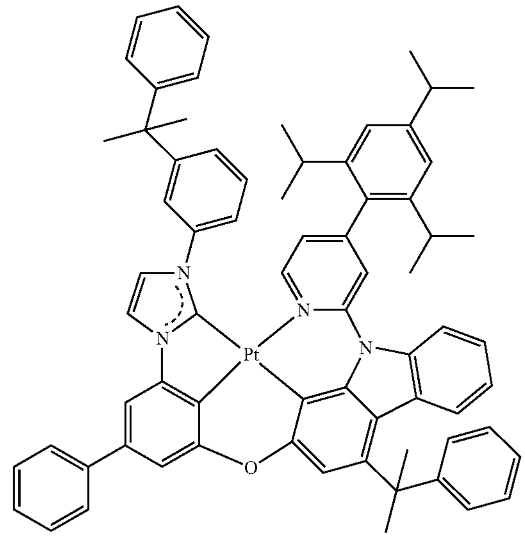
1059
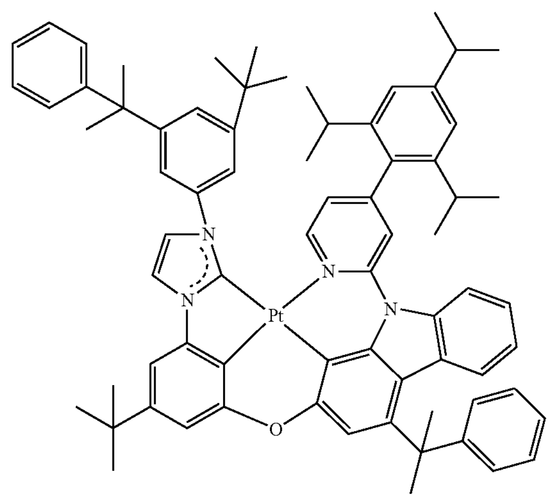
1060
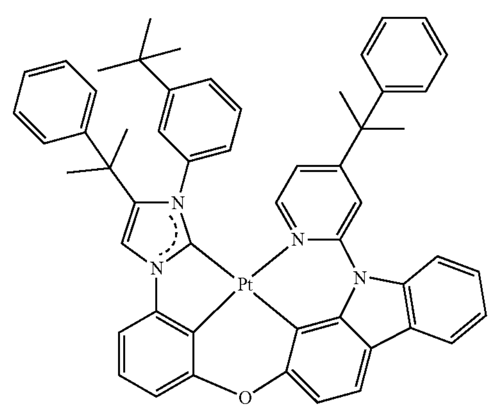

-continued
1061
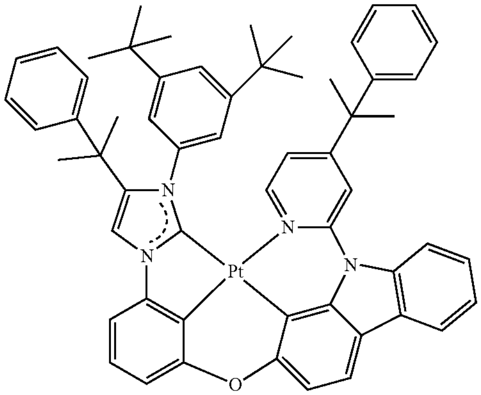
1062
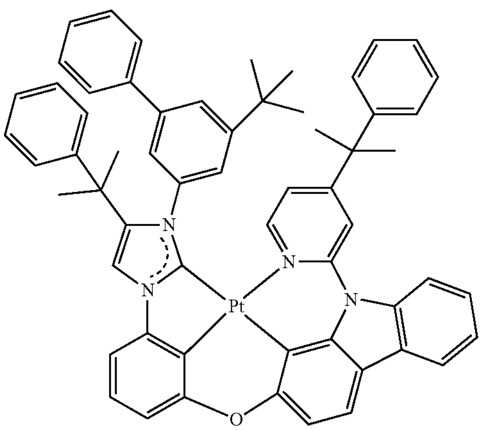
1063
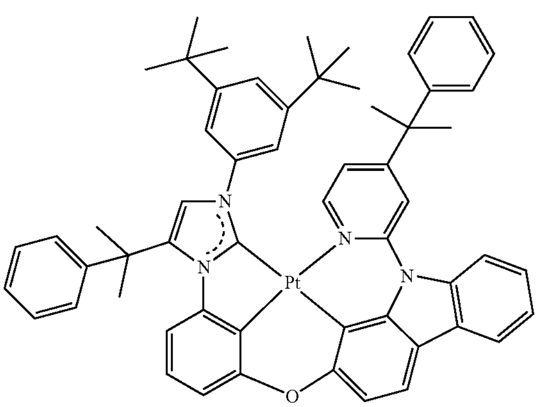
-continued
1064
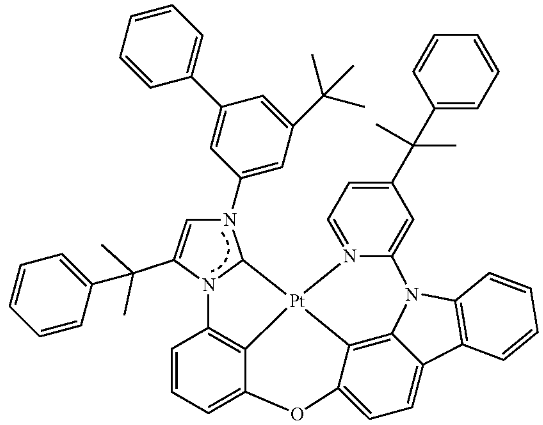
1065
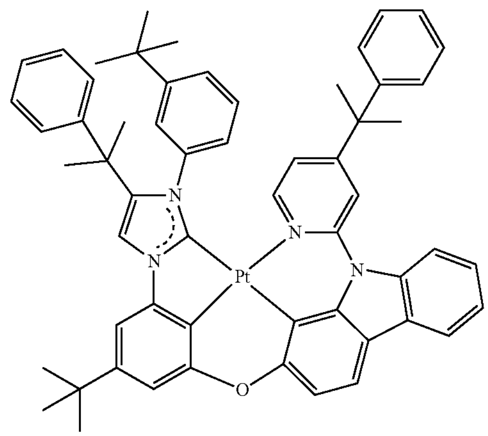
1066
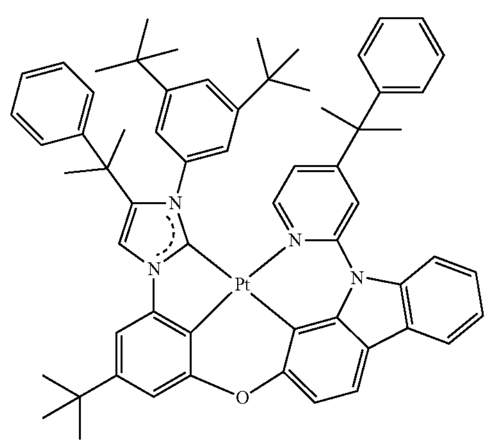

-continued
1067
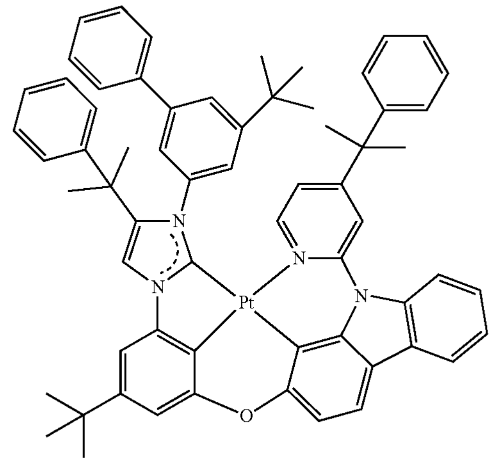
1068
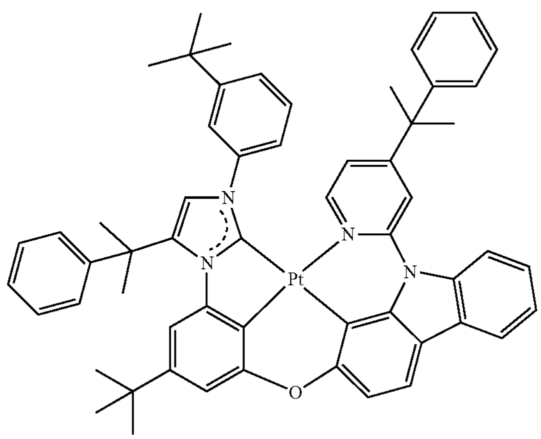
1069
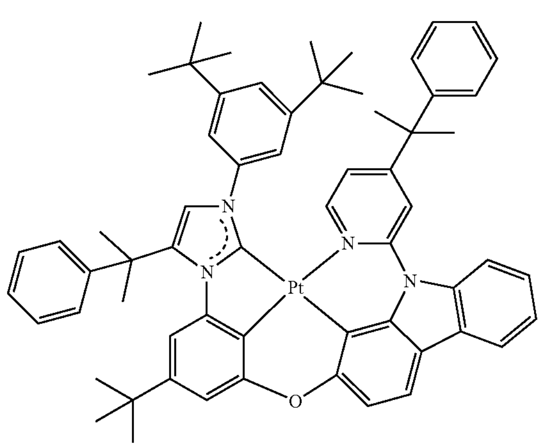
-continued
1070
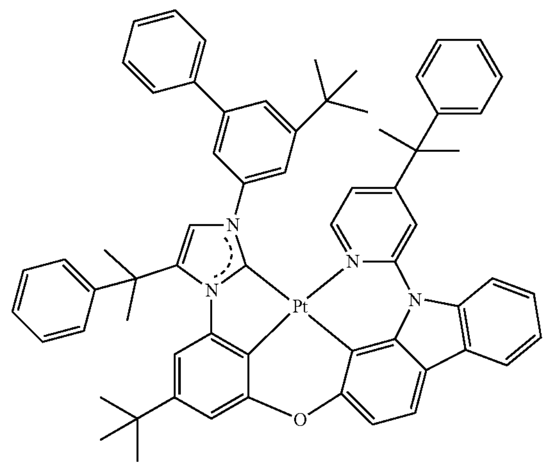
1071
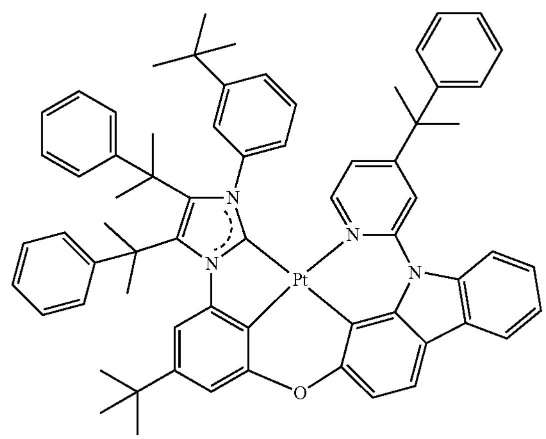
1072
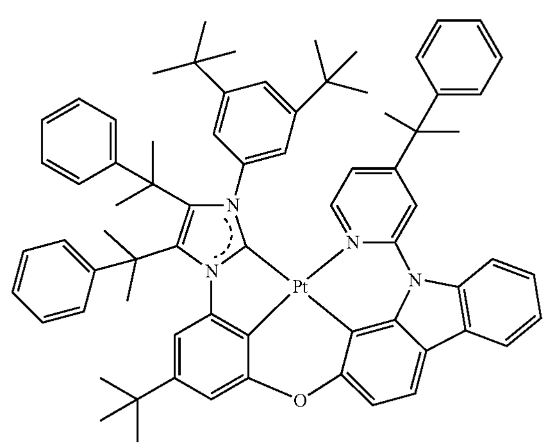

-continued
1073
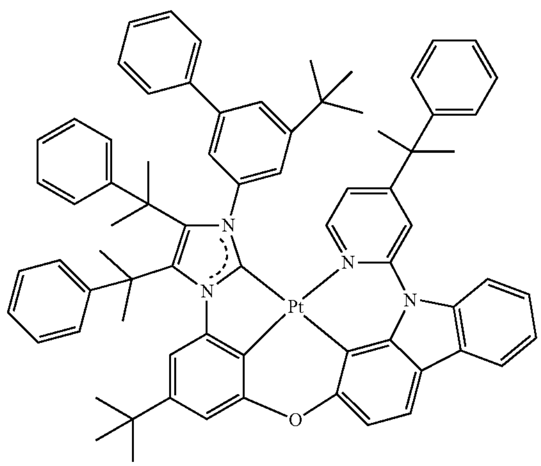
1074
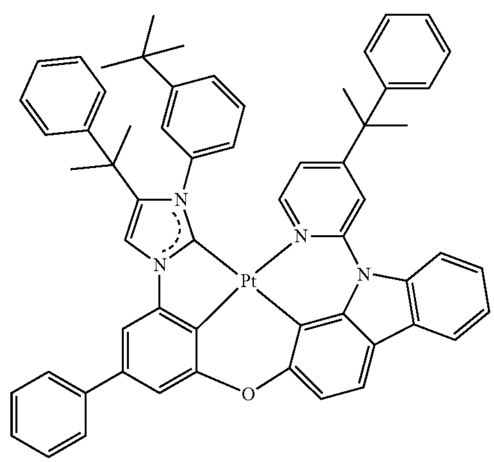
1075
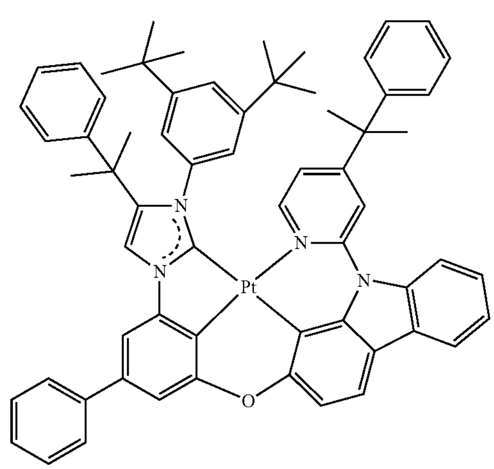
-continued
1076
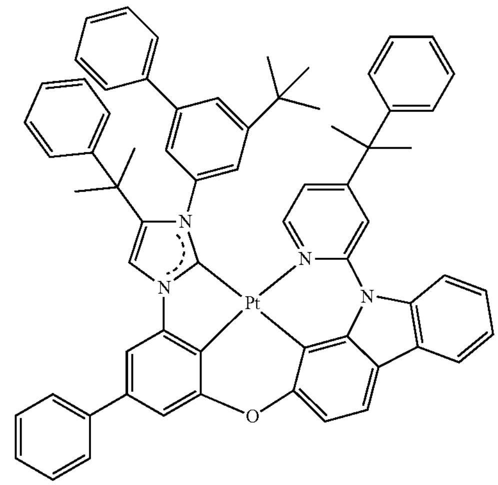
1077
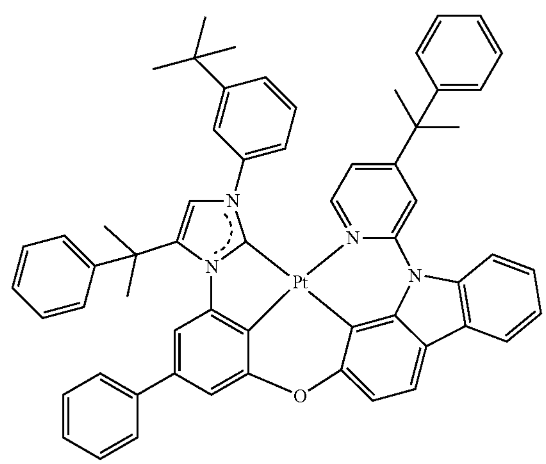
1078
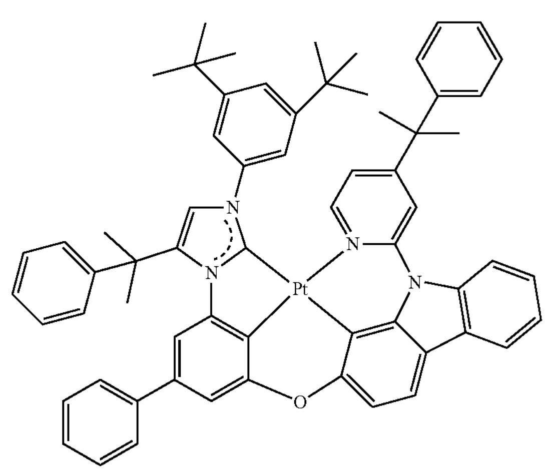

1079
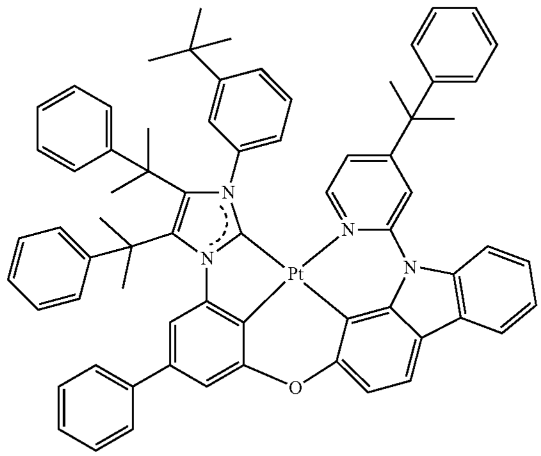
1080
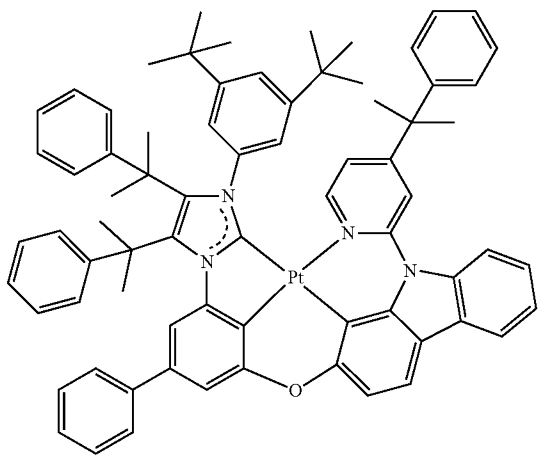
1081
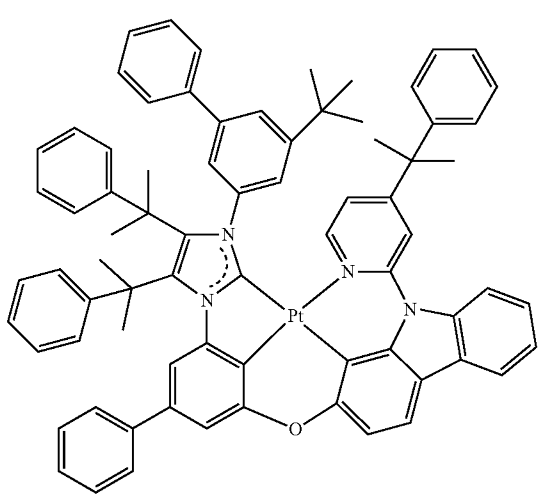
1082
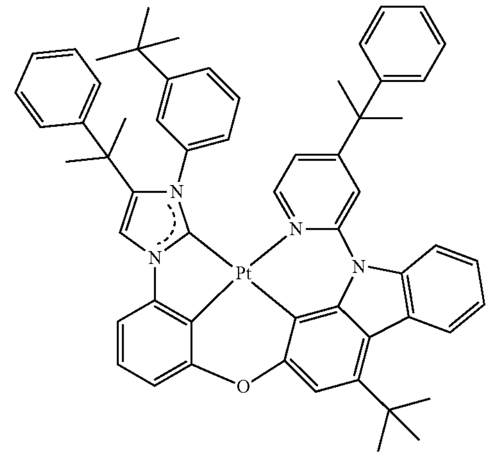
1083
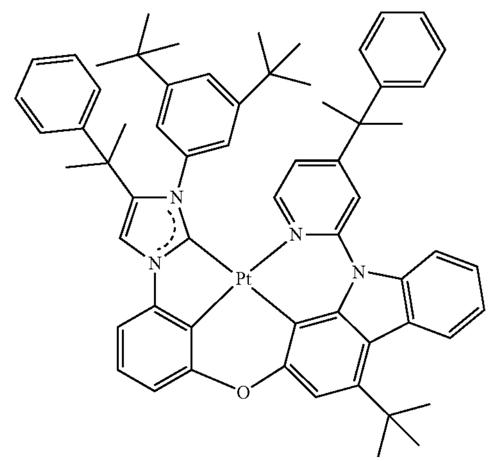
1084
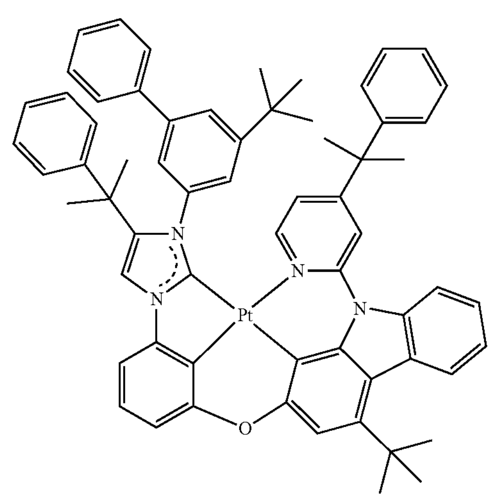

-continued
1085
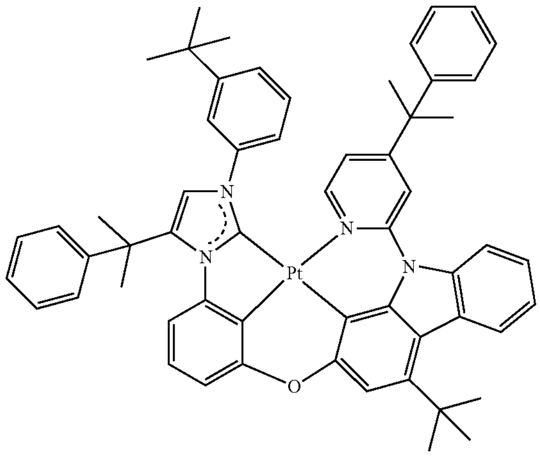
1086
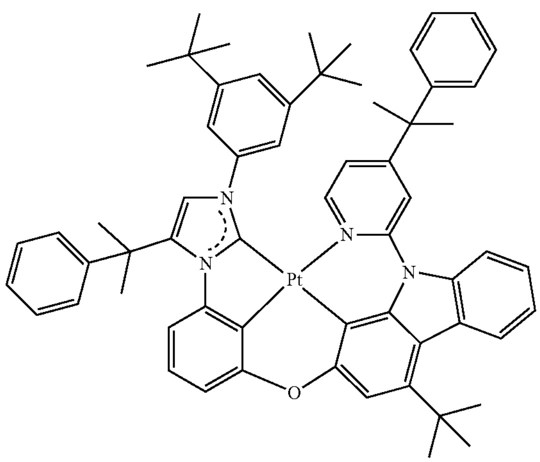
1087
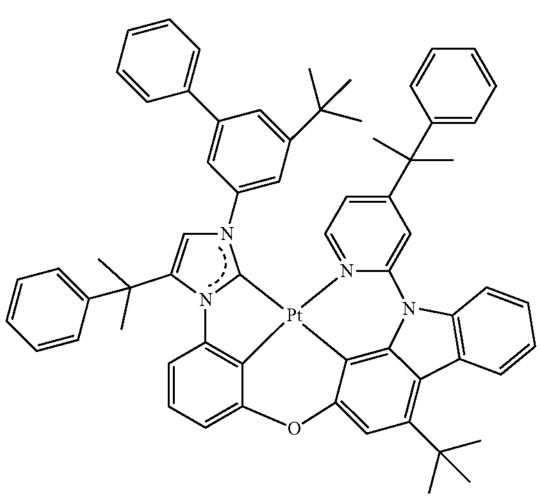
-continued
1088
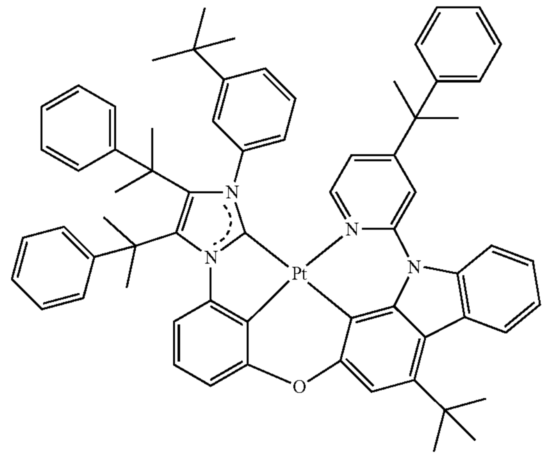
1089
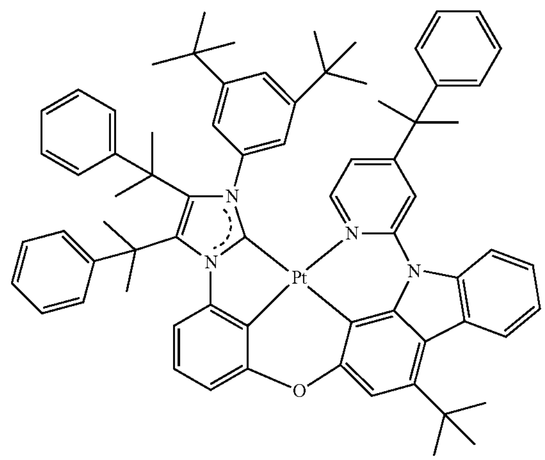
1090
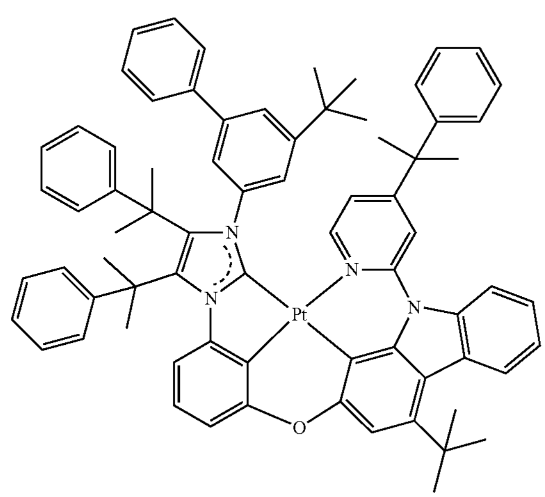

-continued
1091
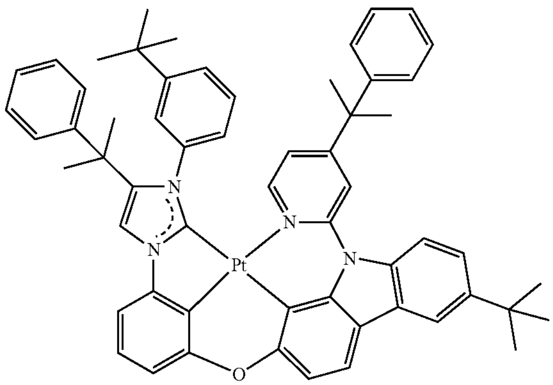
1092
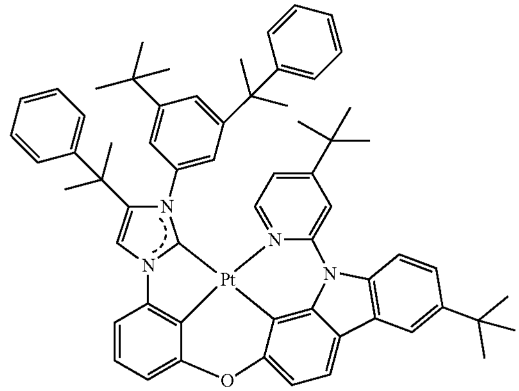
1093
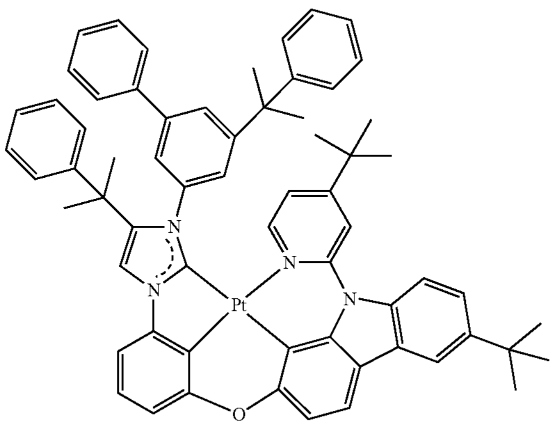
1094
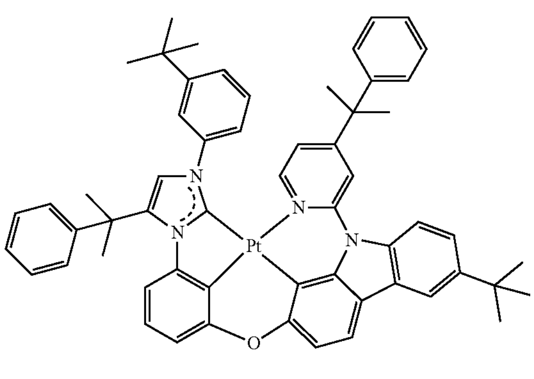
-continued
1095
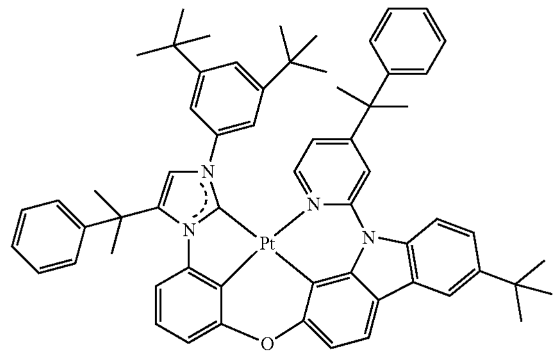
1096
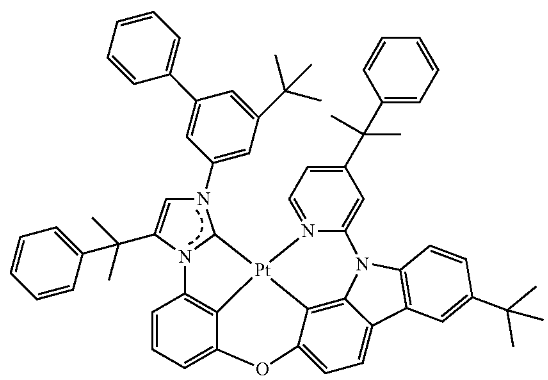
1097
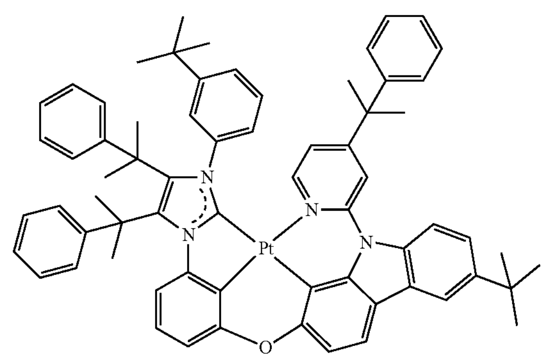
1098
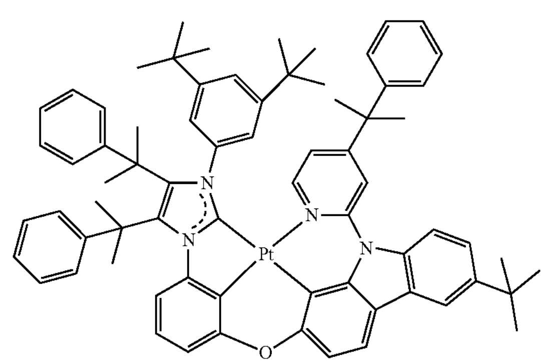

-continued
1099
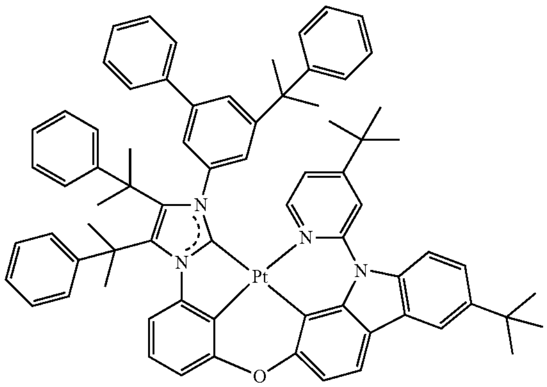
1100
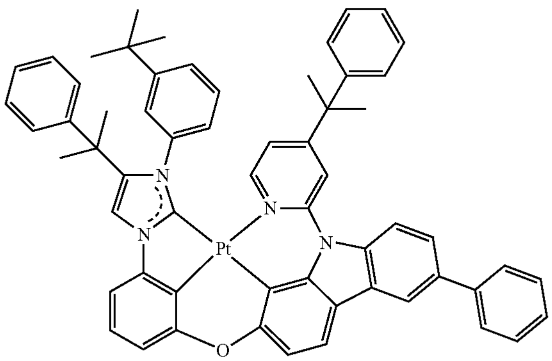
1101
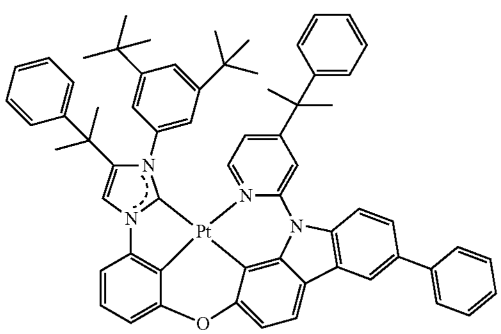
1102
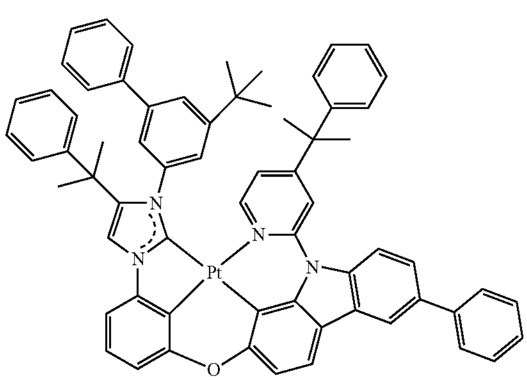
-continued
1103
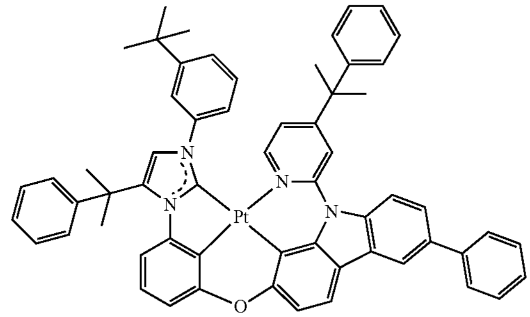
1104
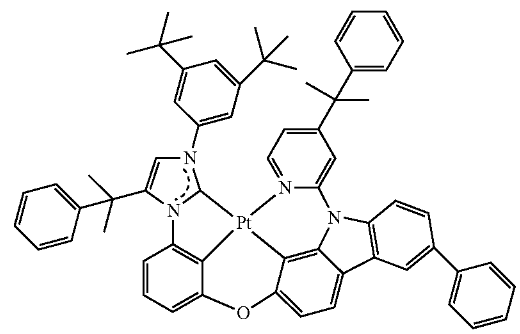
1105
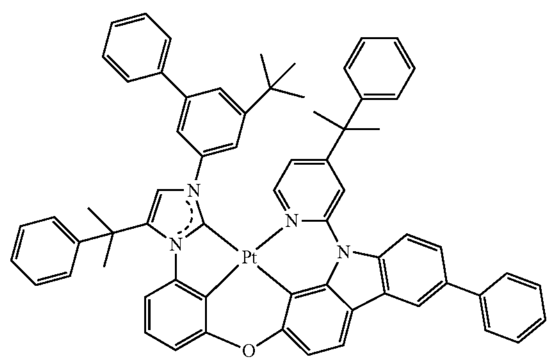
1106
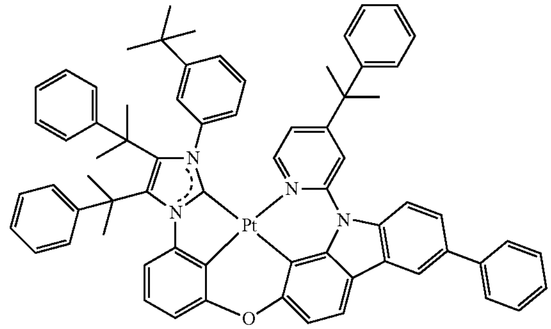

-continued
1107
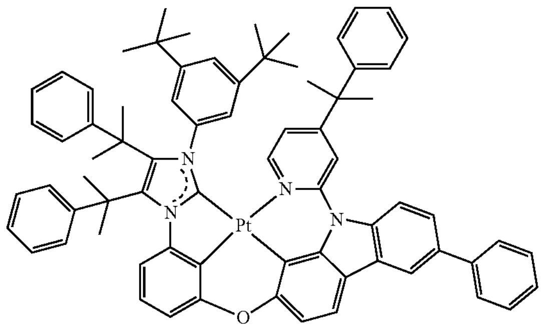
1108
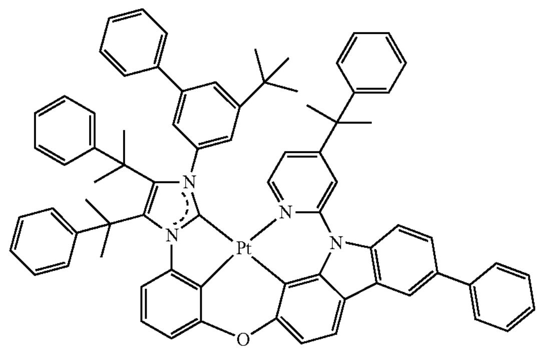
1109
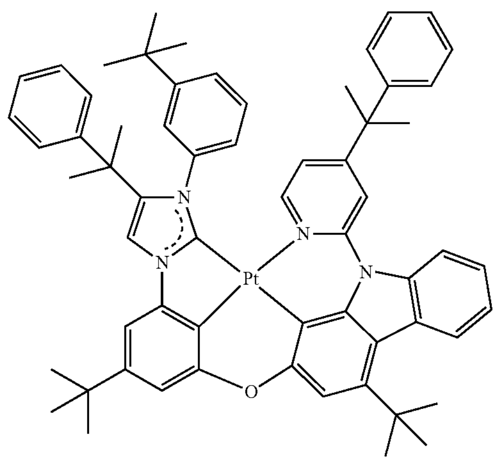
1110
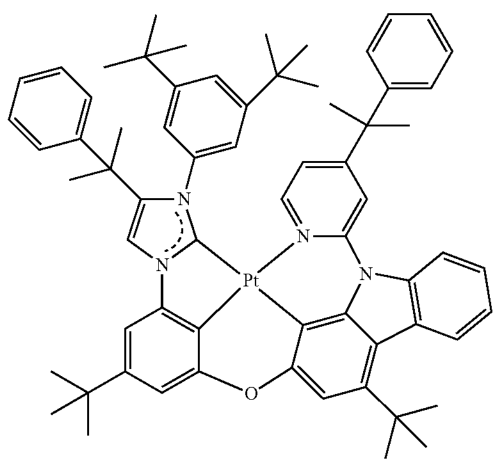
-continued
1111
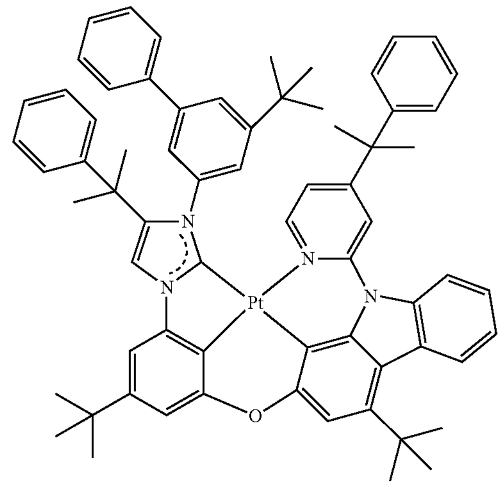
1112
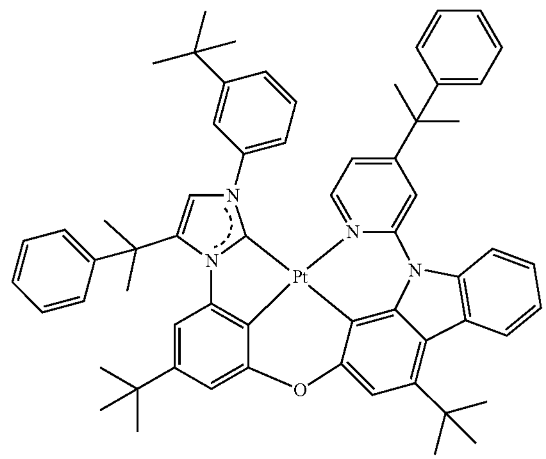
1113
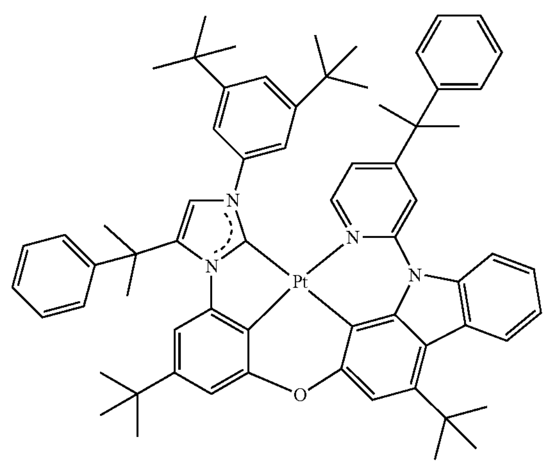

-continued
1114
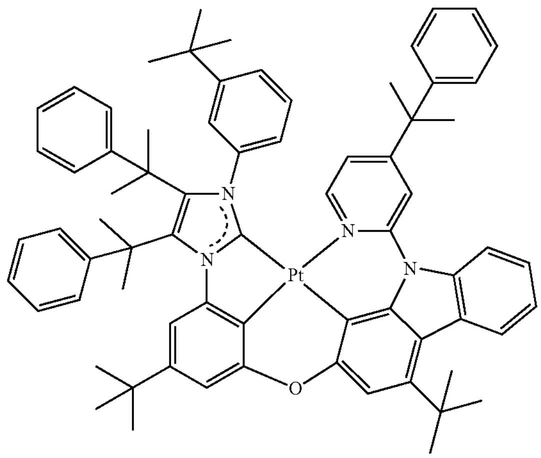
1115
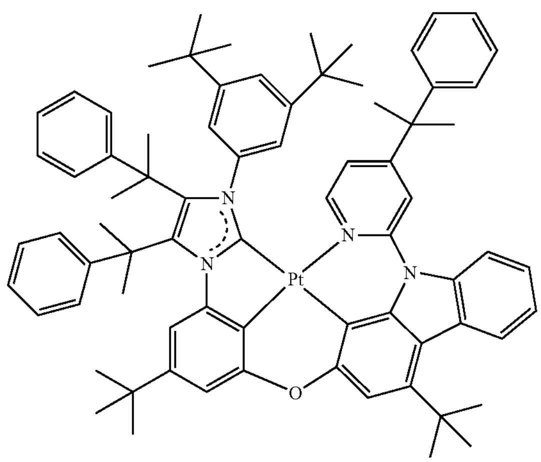
1116
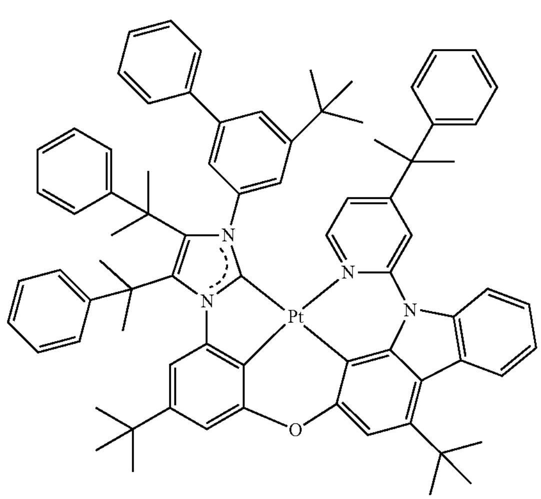
-continued
1117
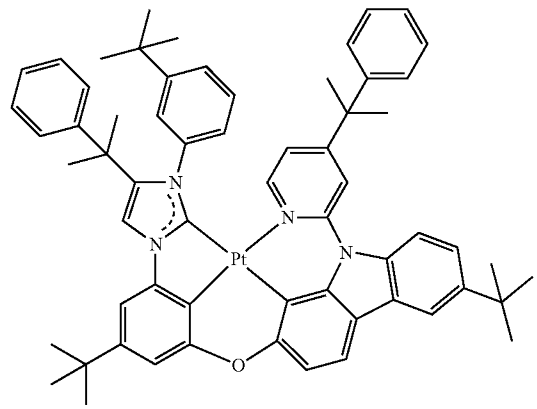
1118
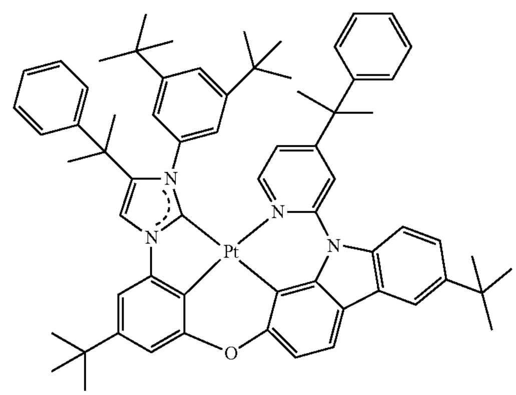
1119
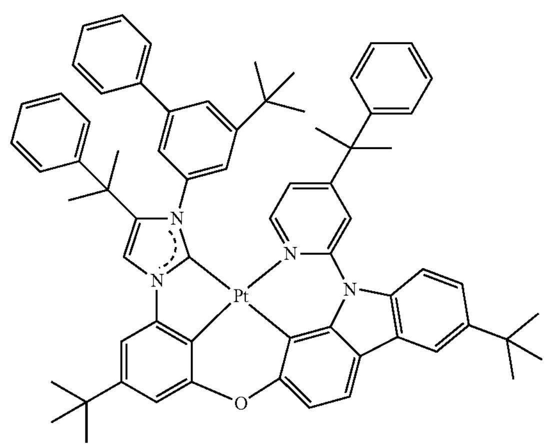

-continued
1120
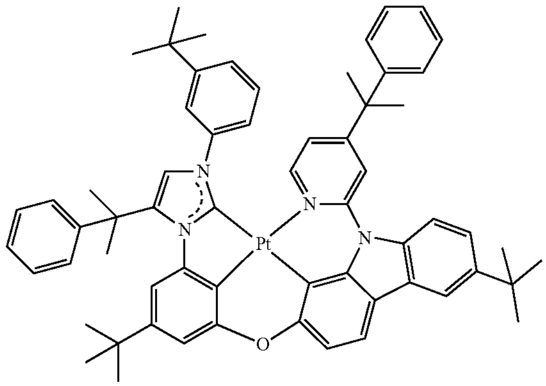
1121
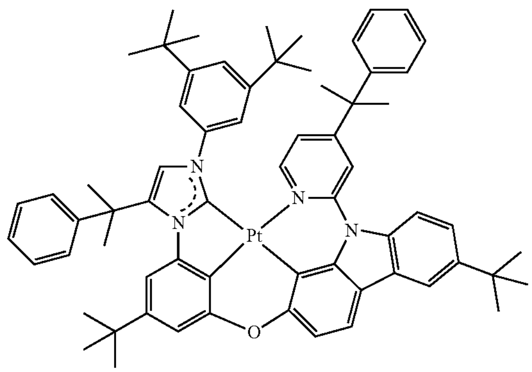
1122
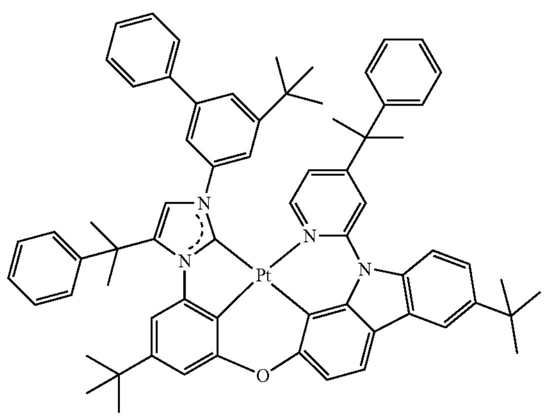
1123
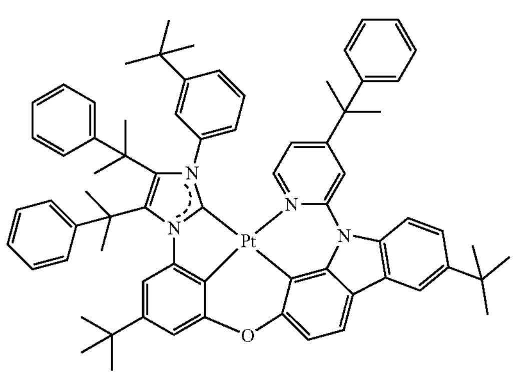
-continued
1124
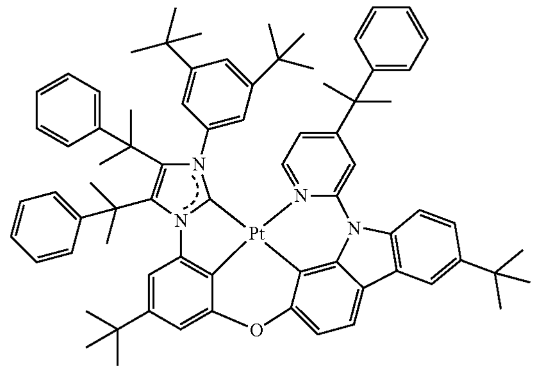
1125
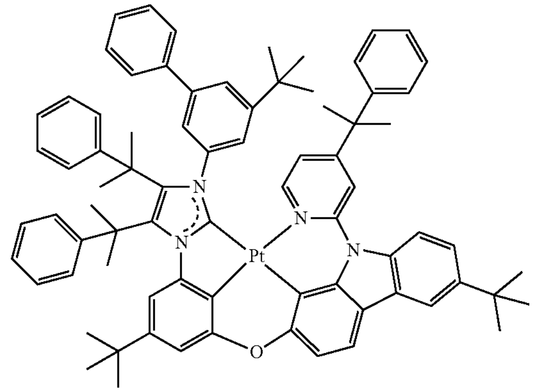
1126
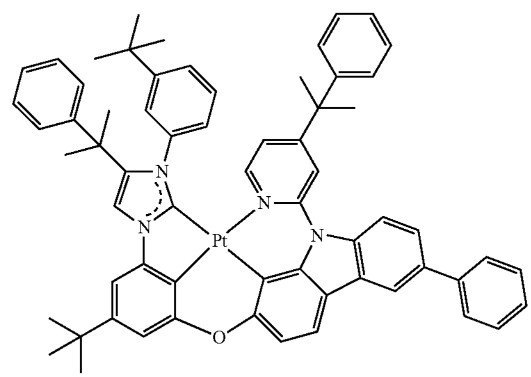
1127
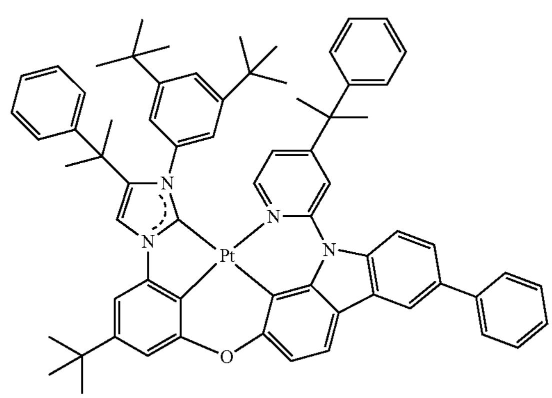

1128
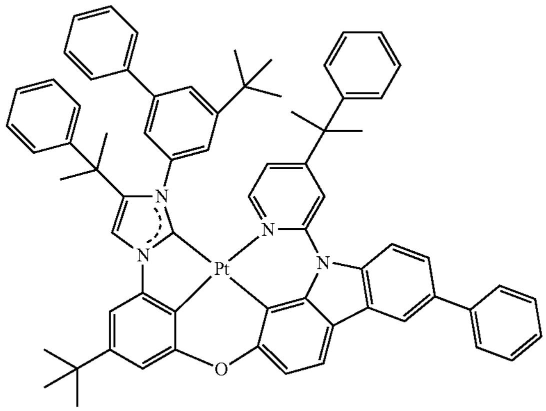
1129
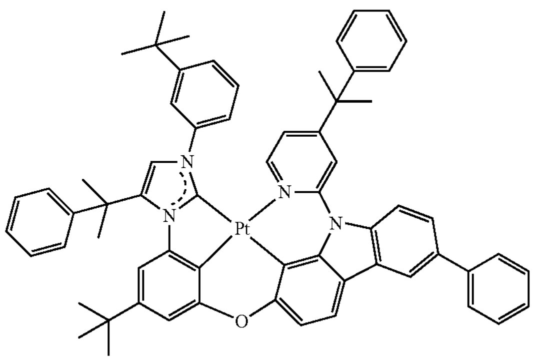
1130
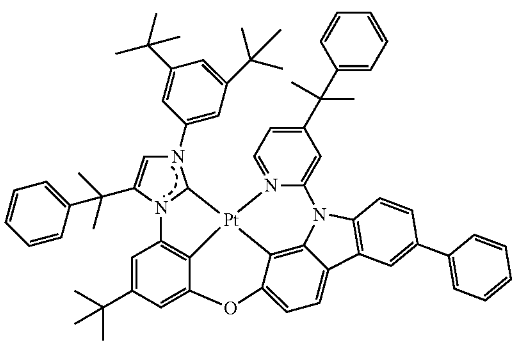
1131
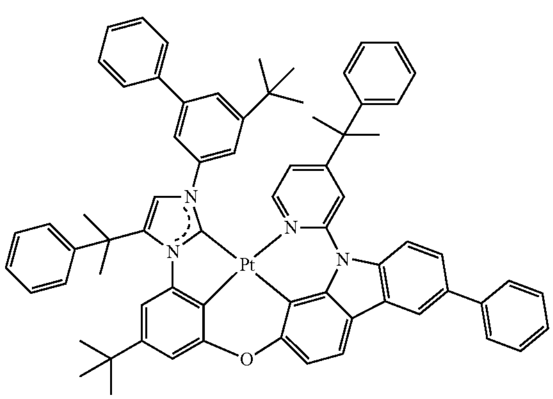
1132
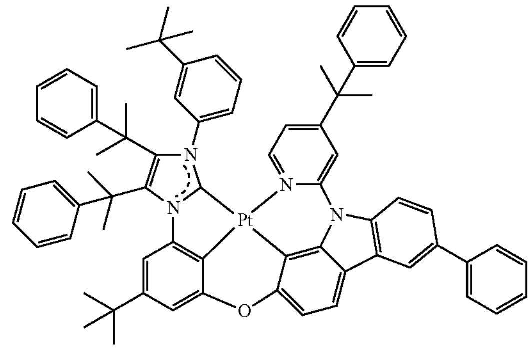
1133
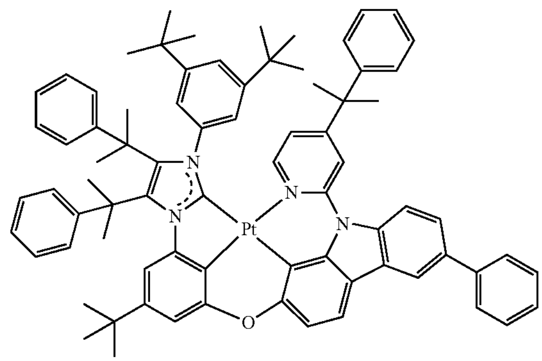
1134
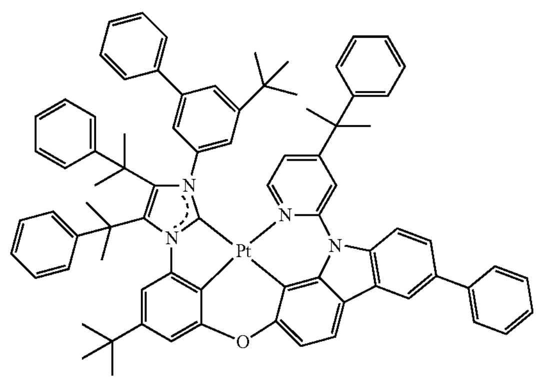
1135
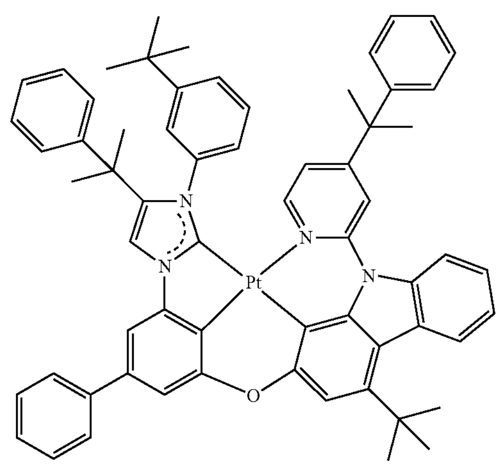

1136
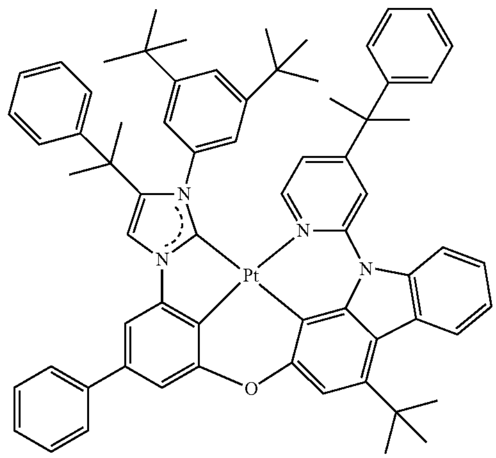
1137
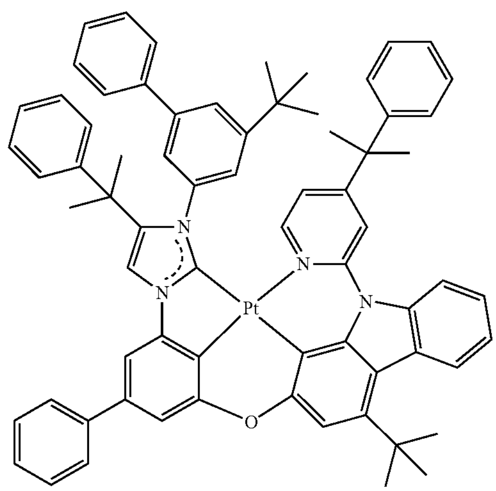
1138
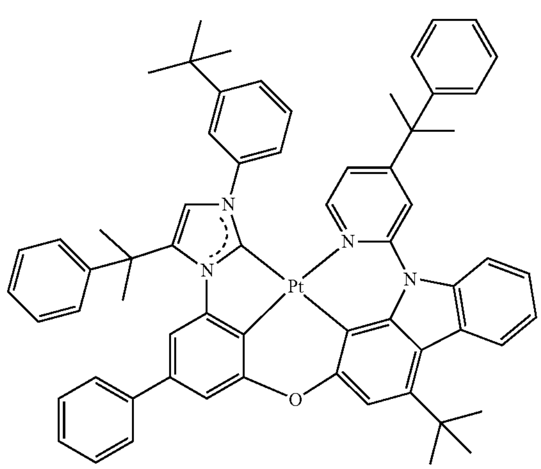
1139
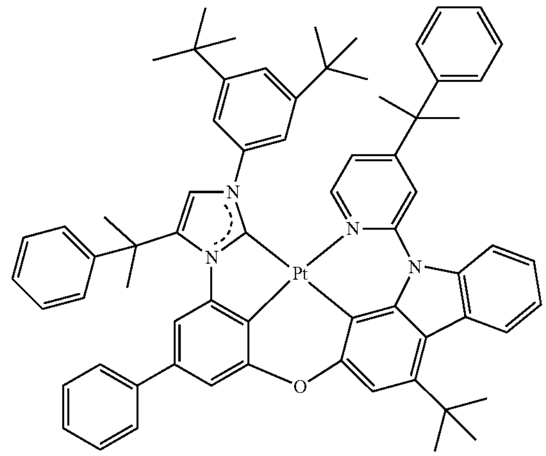
1140
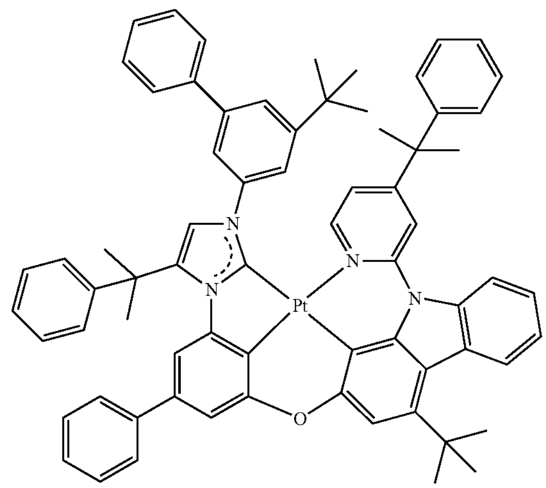
1141
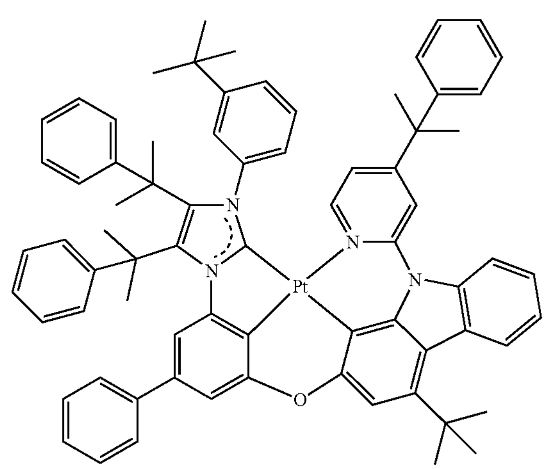

1142
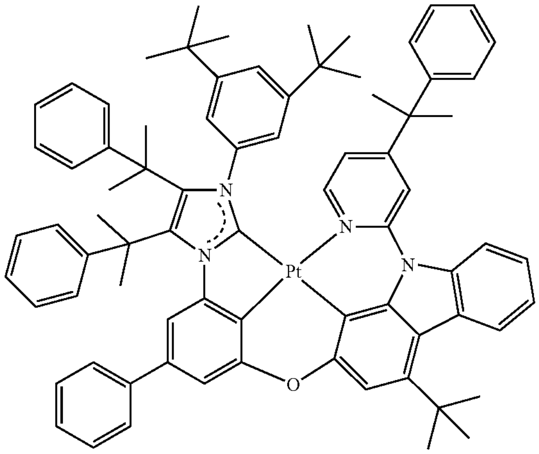
1143
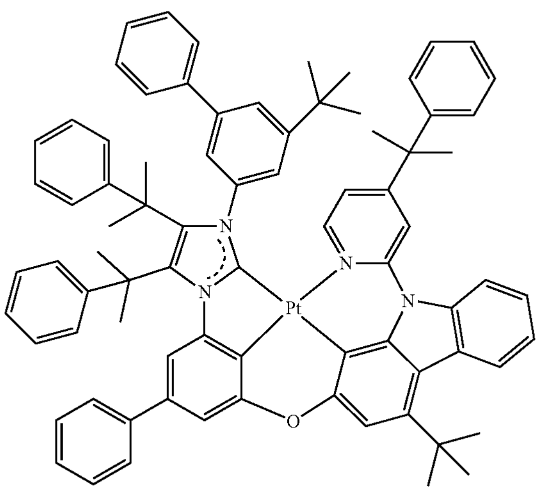
1144
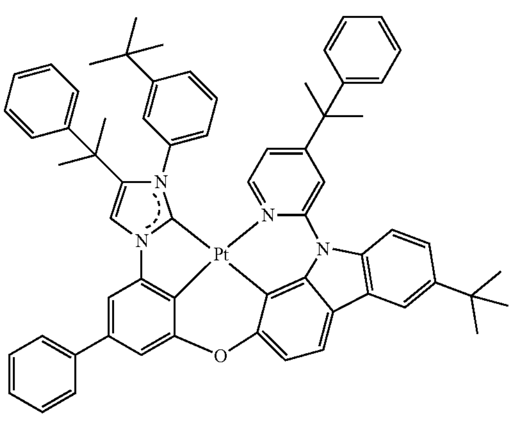
1145
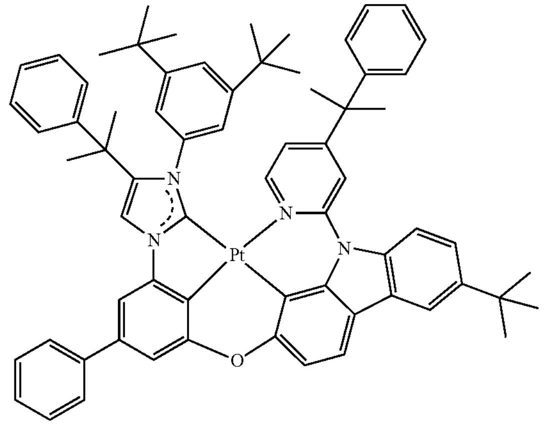
1146
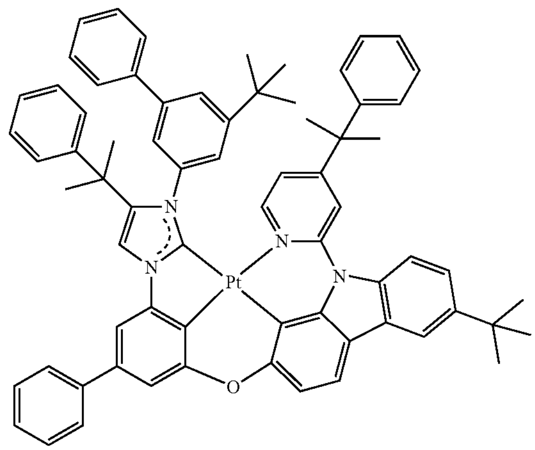
1147
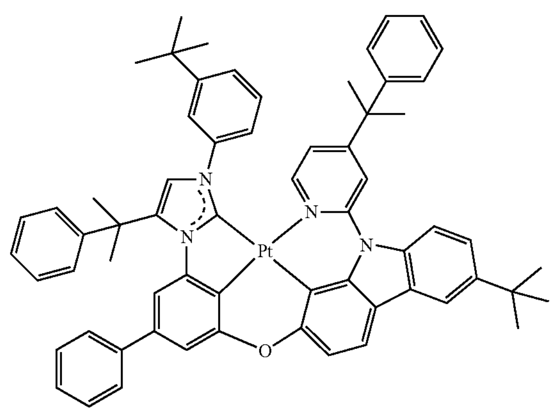

-continued
1148
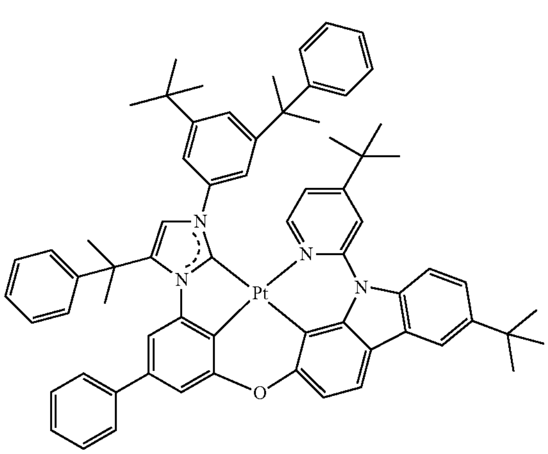
1149
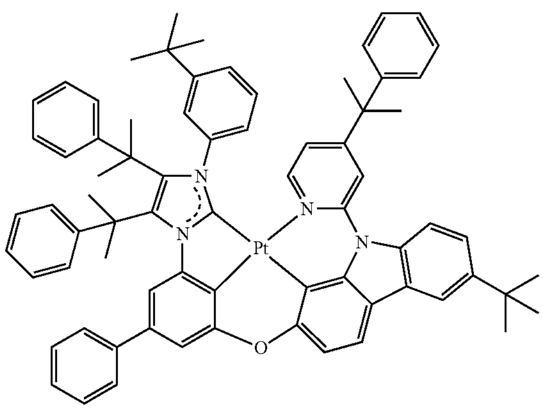
1150
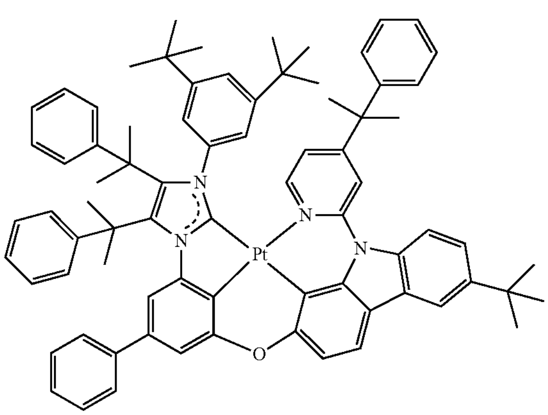
-continued
1151
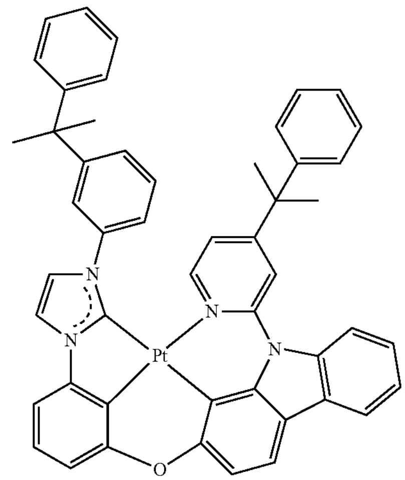
1152
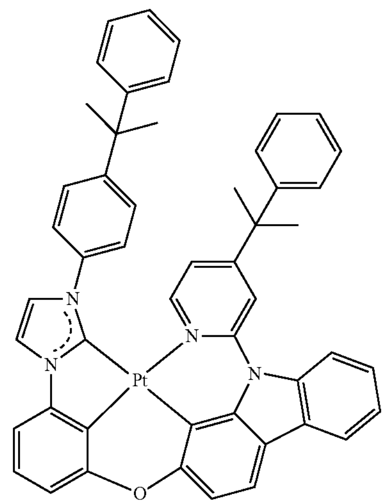
1153
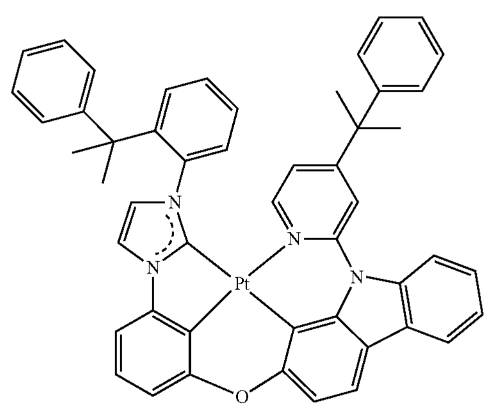

-continued
1154
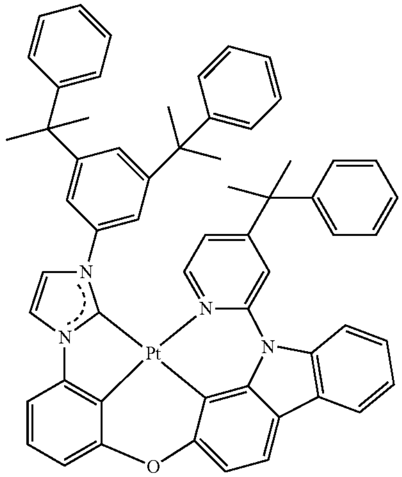
1155
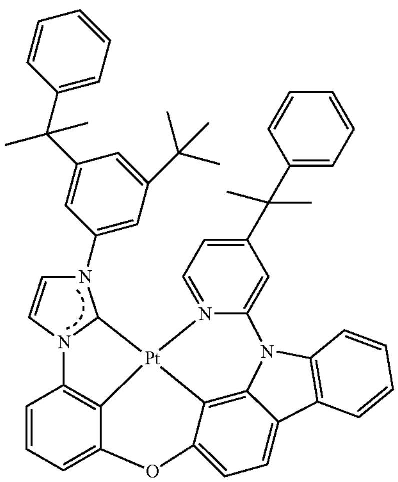
1156
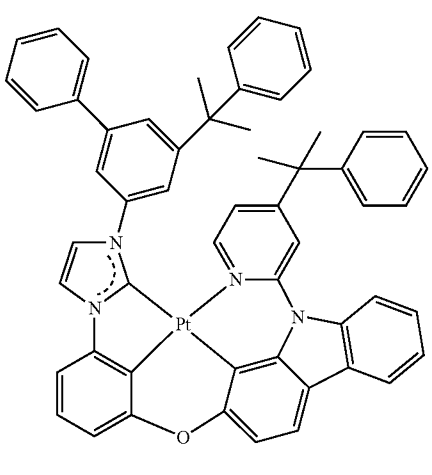
-continued
1157
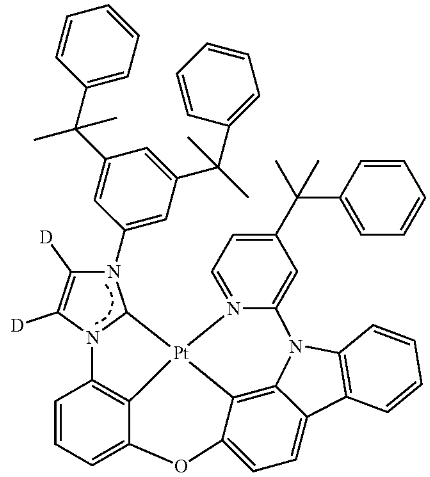
1158
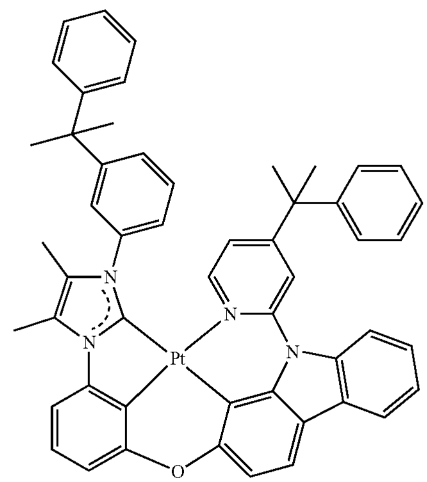
1159
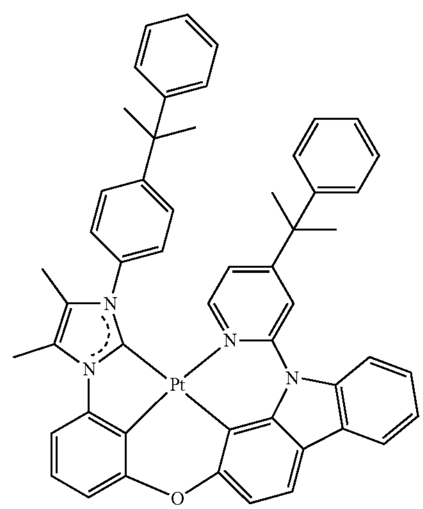

-continued
1160
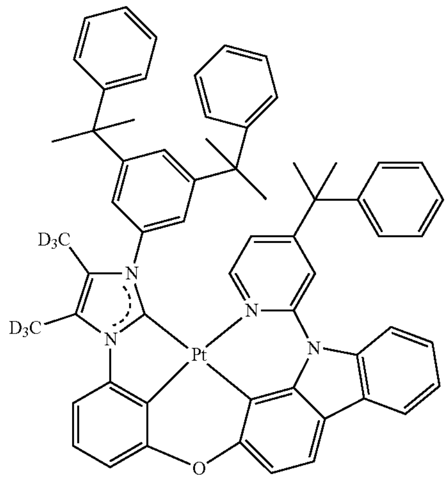
1161
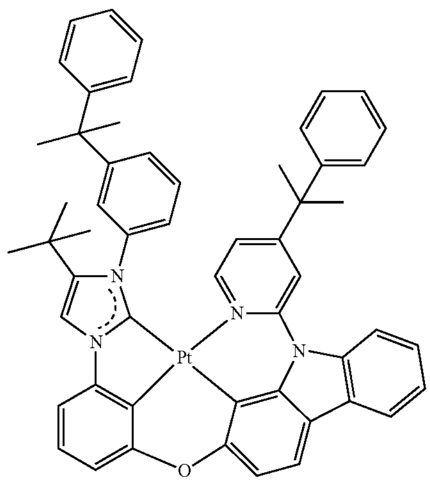
1162
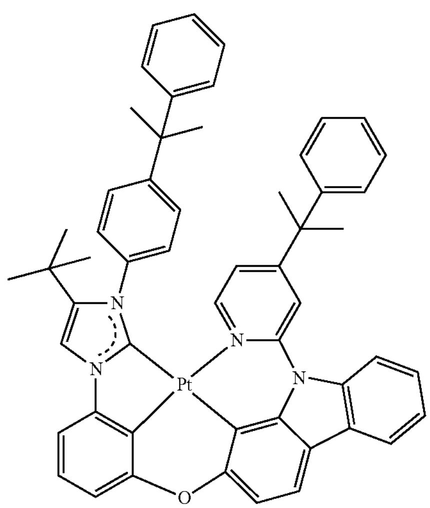
-continued
1163
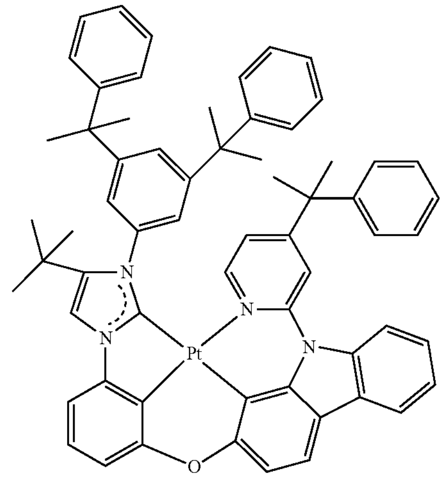
1164
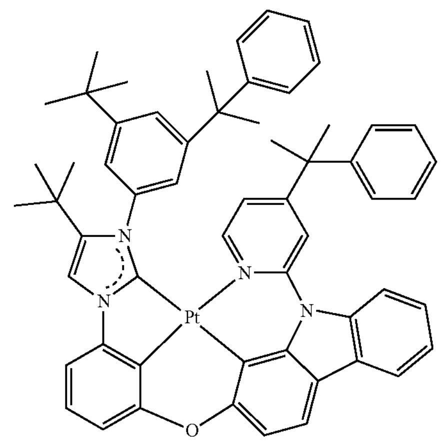
1165
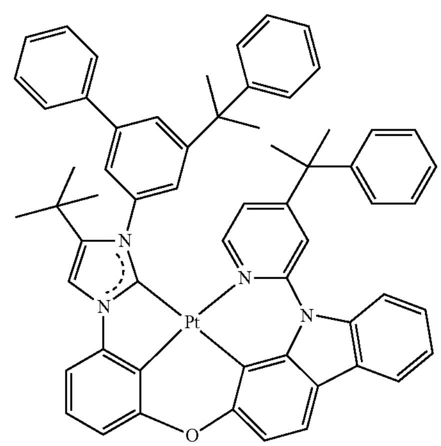

-continued
1166
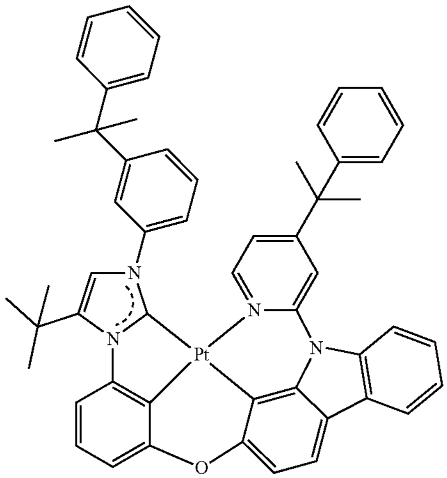
1167
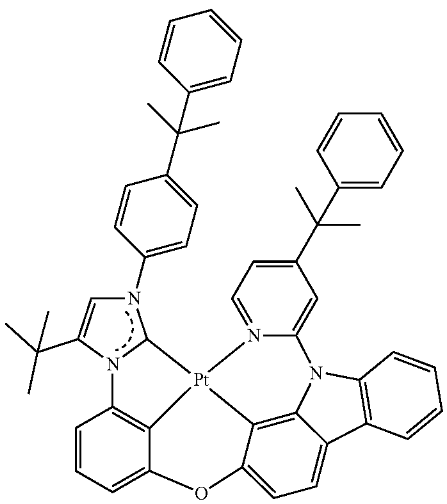
1168
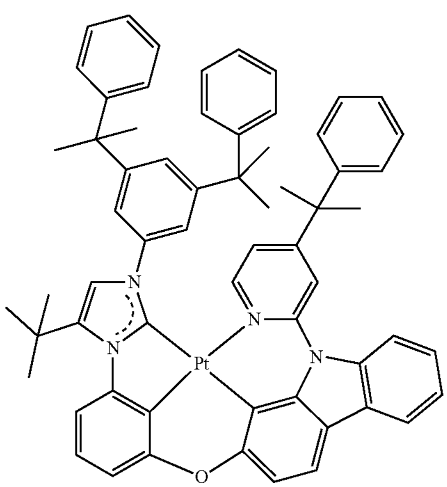
-continued
1169
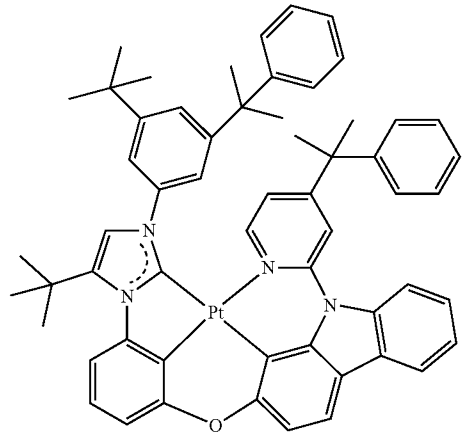
1170
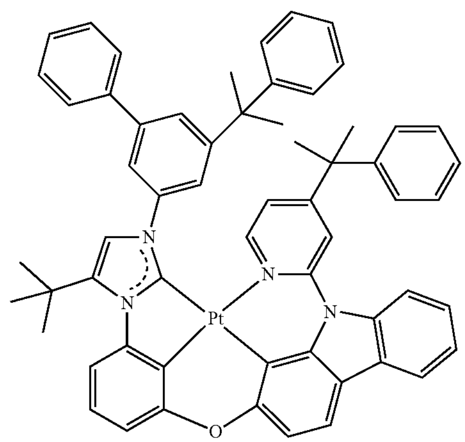
1171
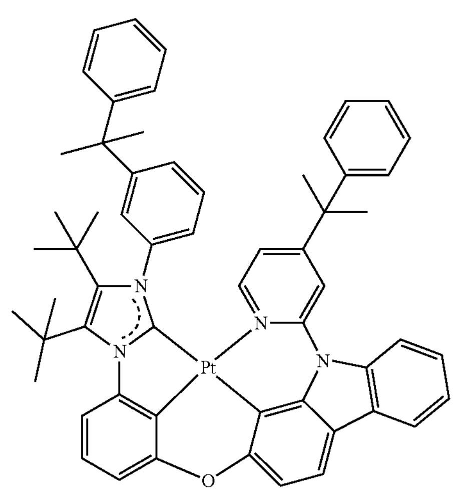

-continued
1172
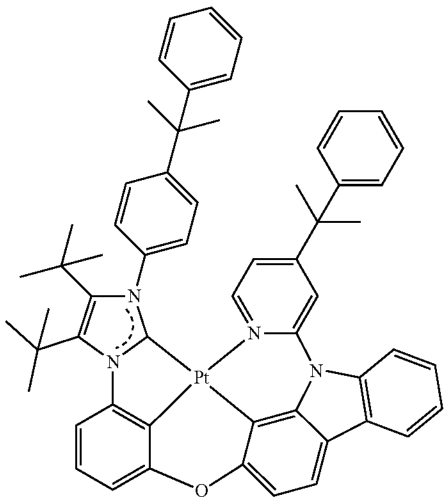
1173
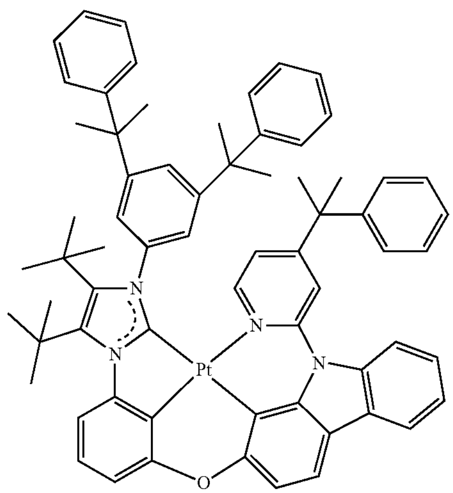
1174
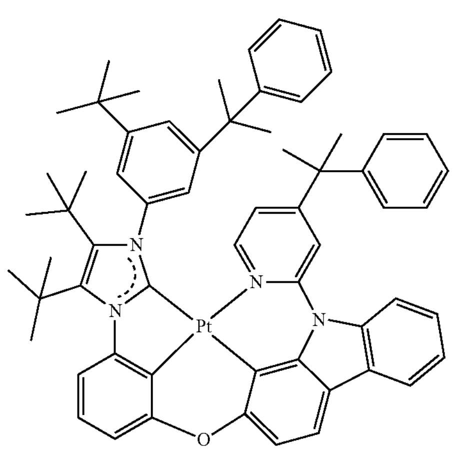
-continued
1175
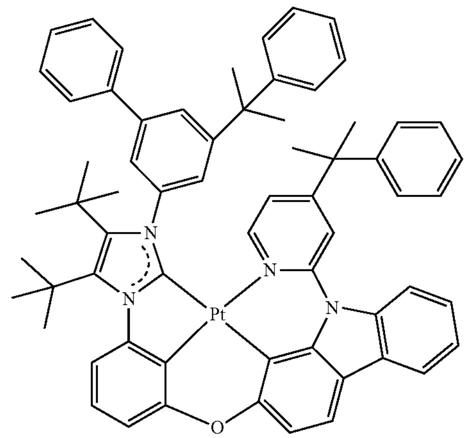
1176
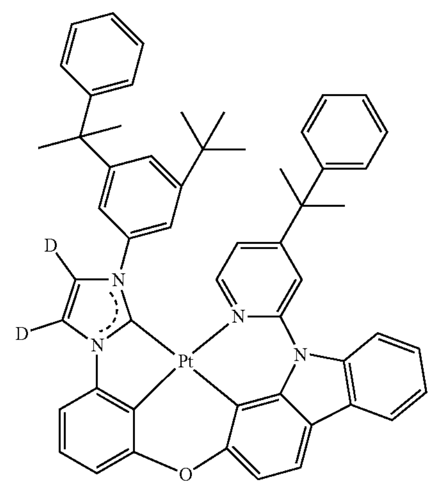
1177
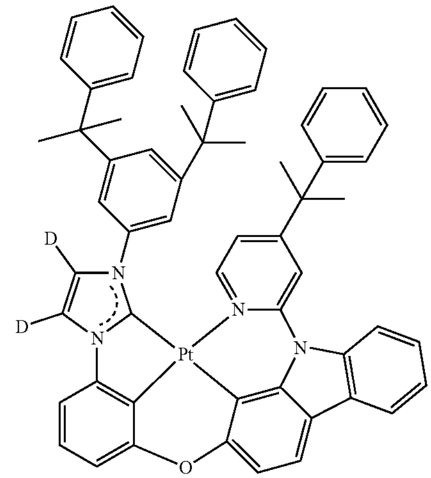

-continued
1178
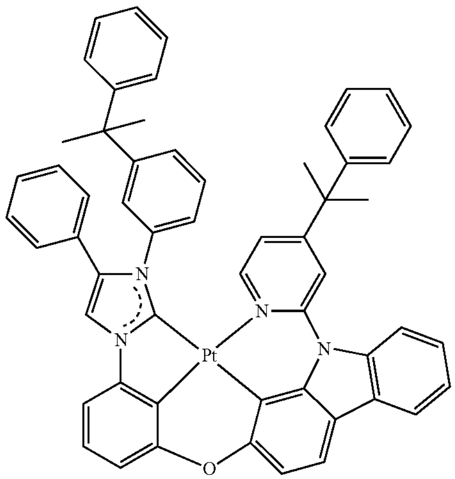
1179
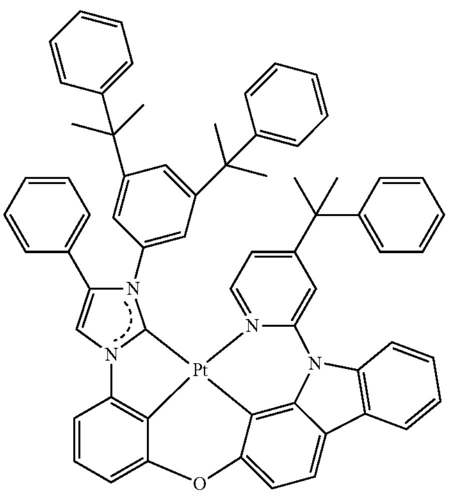
1180
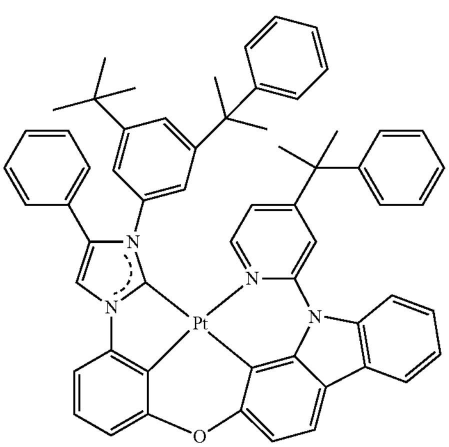
-continued
1181
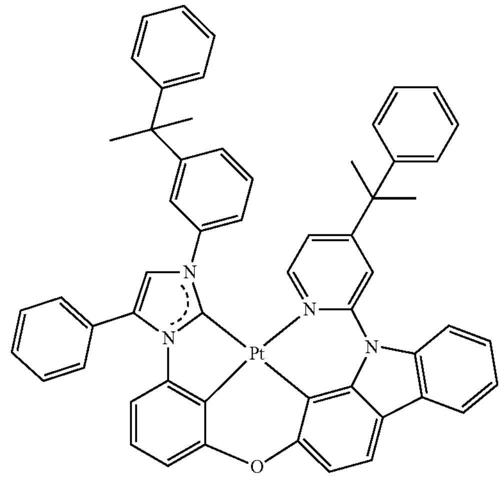
1182
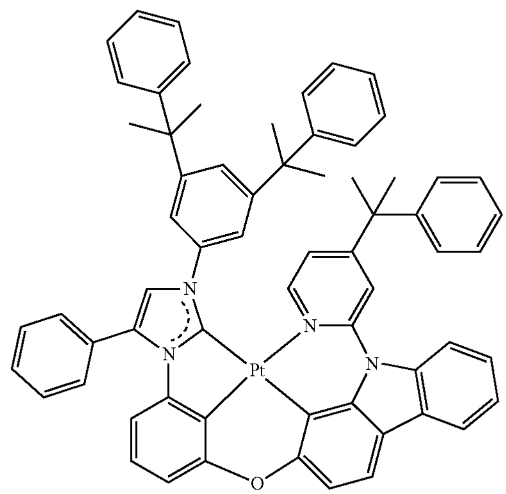
1183
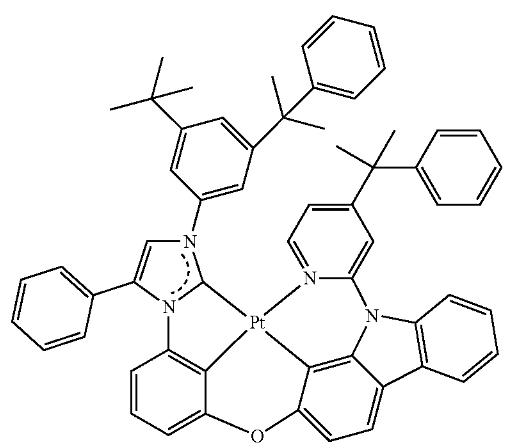

-continued
1184
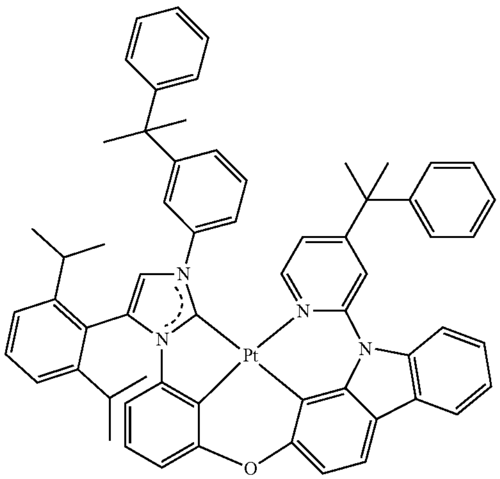
1185
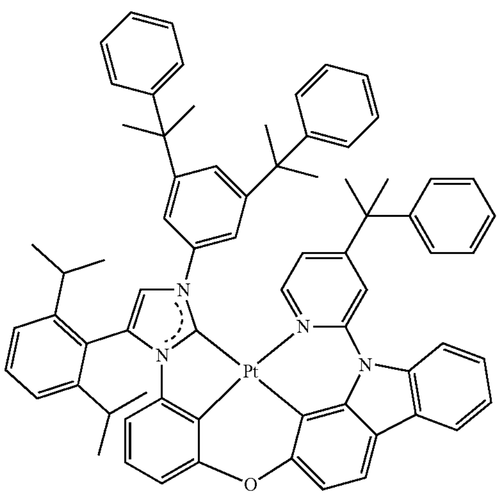
1186
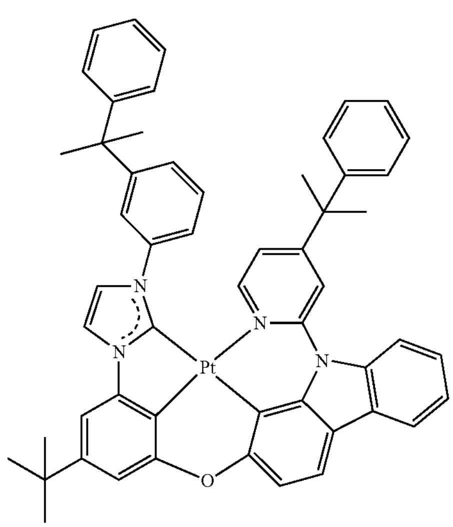
-continued
1187
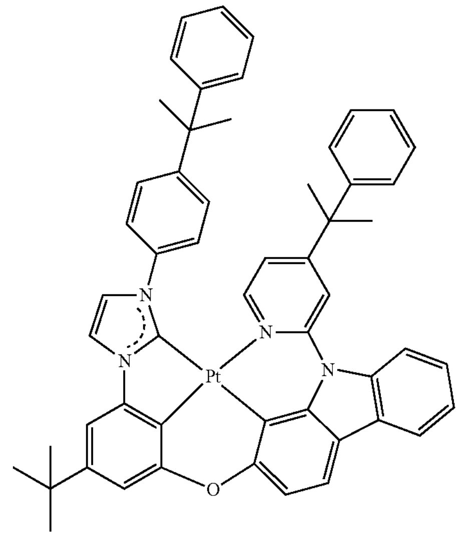
1188
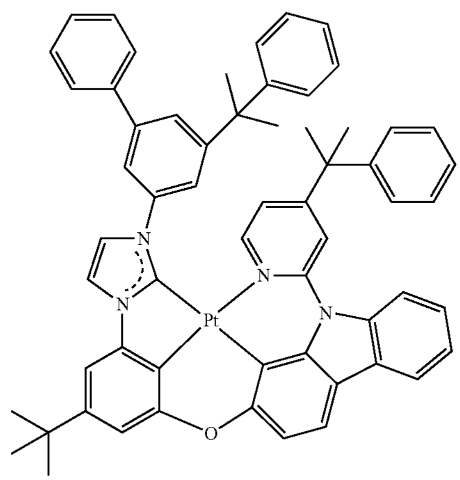
1189
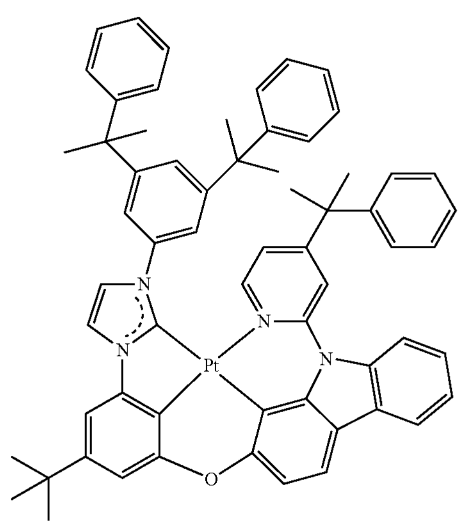

-continued
1190
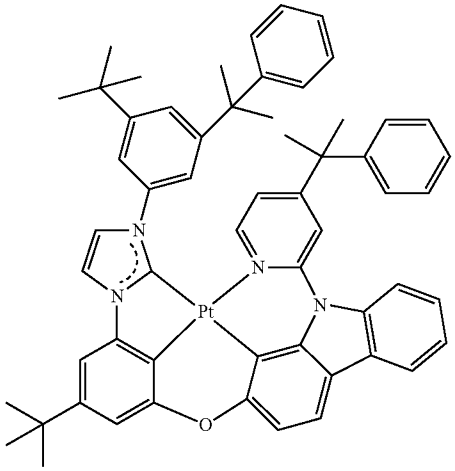
1191
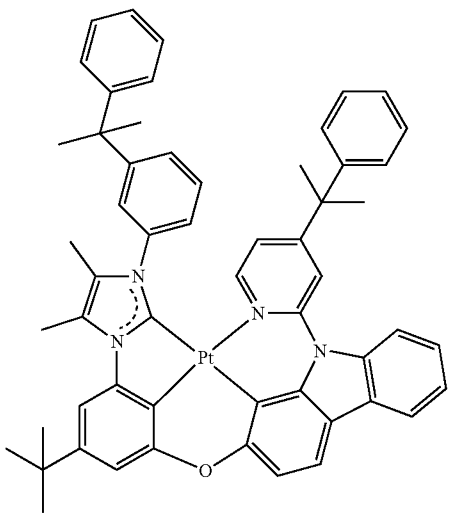
1192
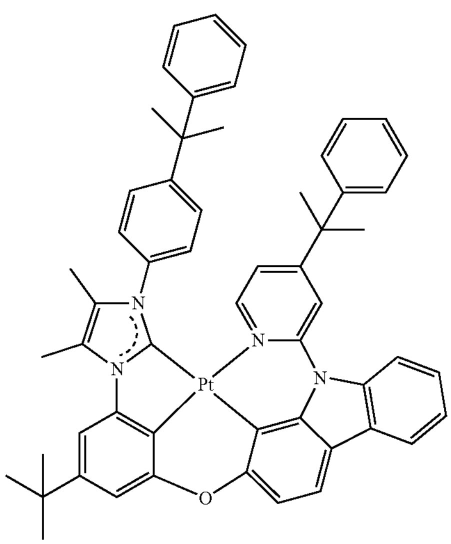
-continued
1193
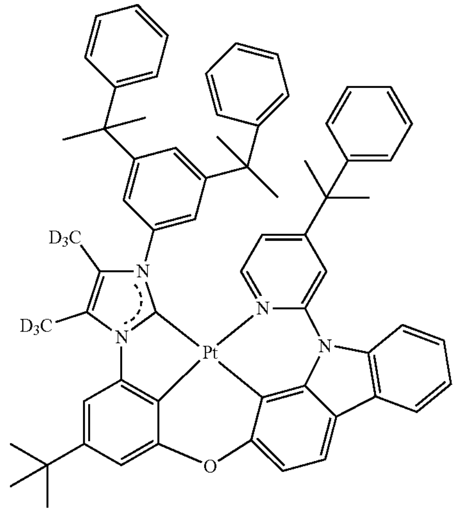
1194
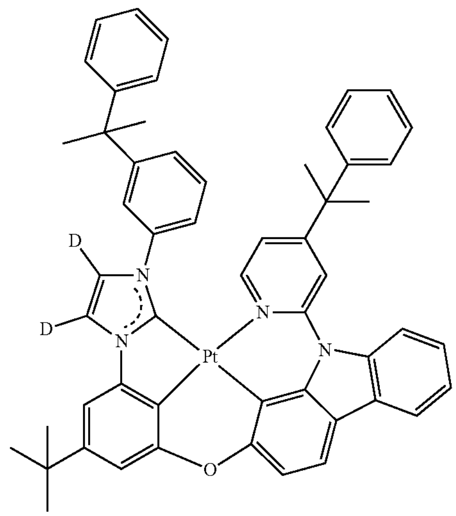
1195
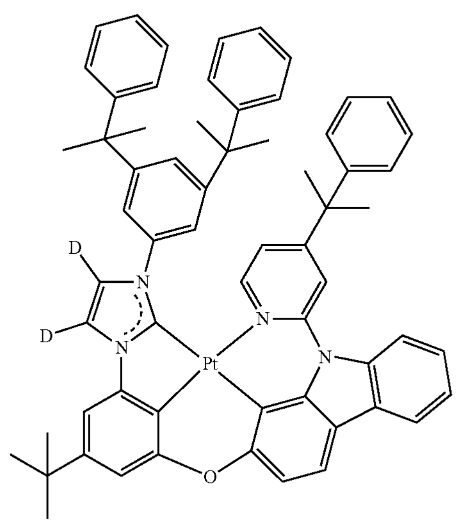

-continued
1196
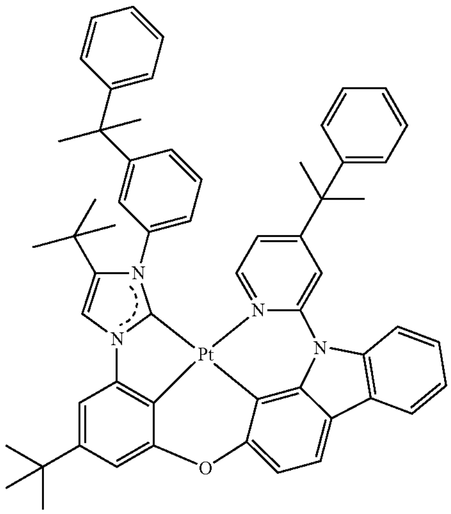
1197
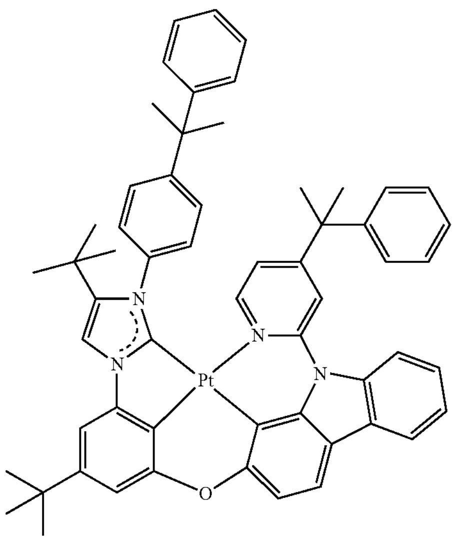
1198
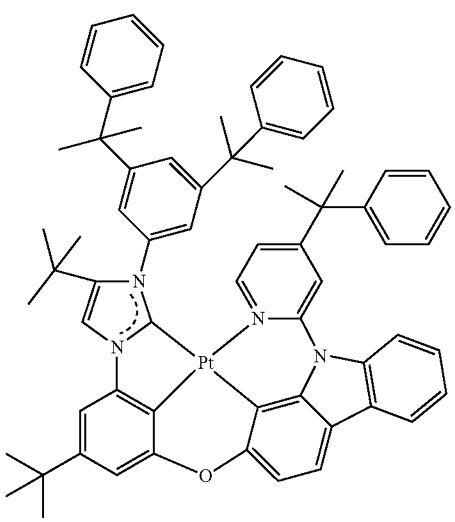
-continued
1199
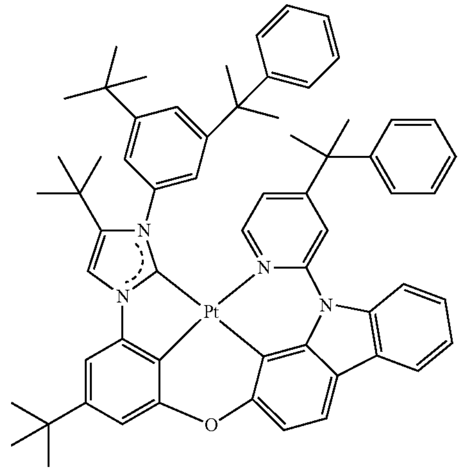
1200
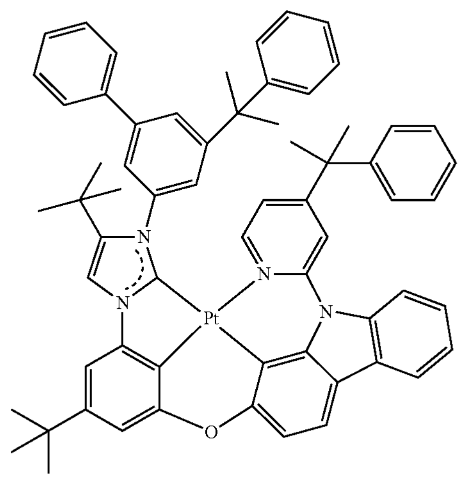
1201
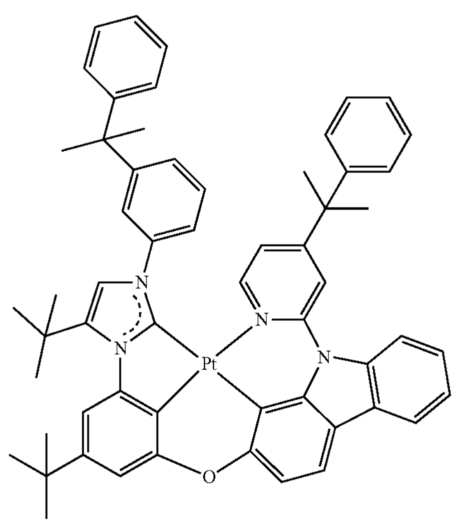

-continued
1202
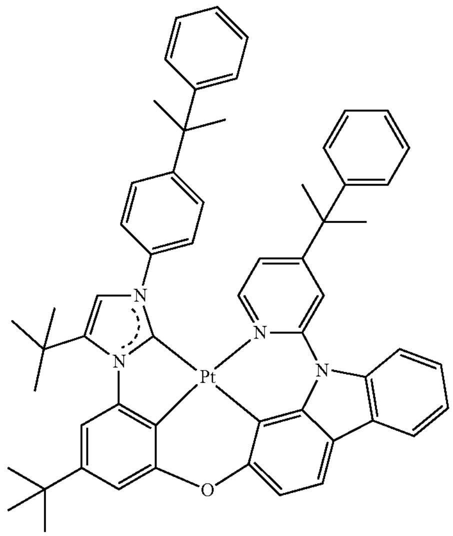
1203
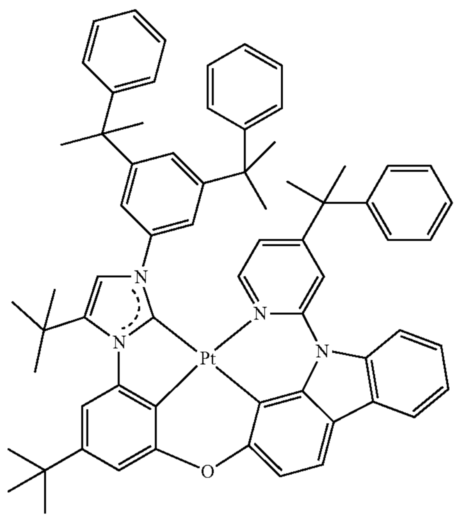
1204
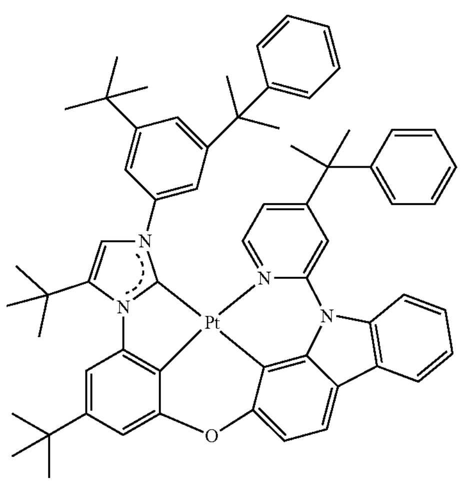
-continued
1205
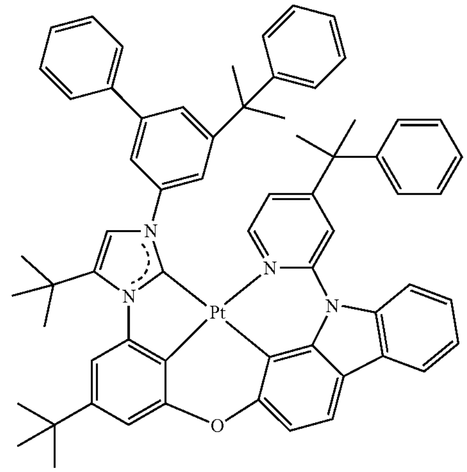
1206
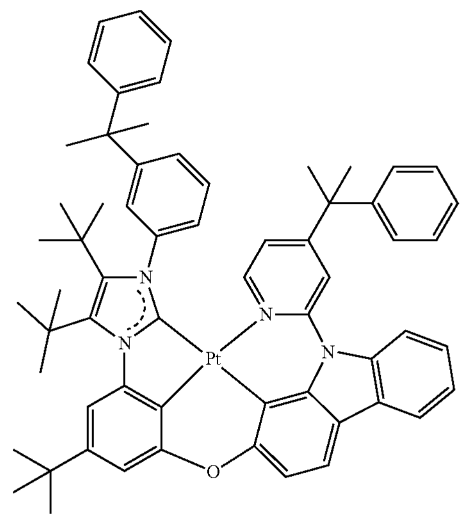
1207
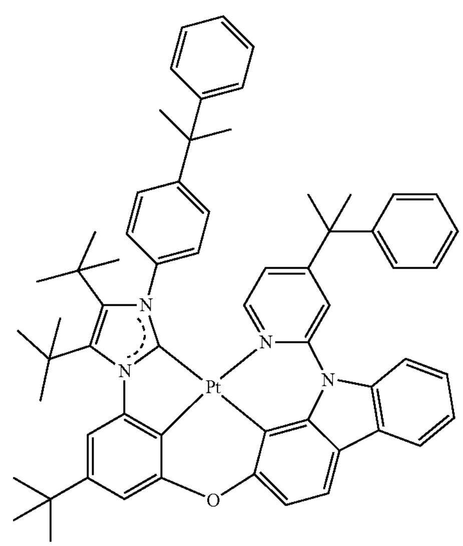

-continued
1208
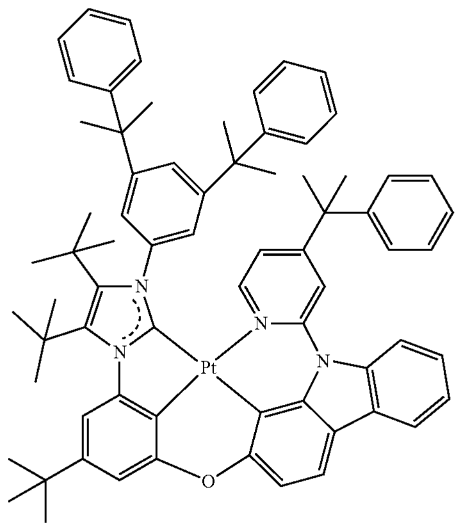
1209
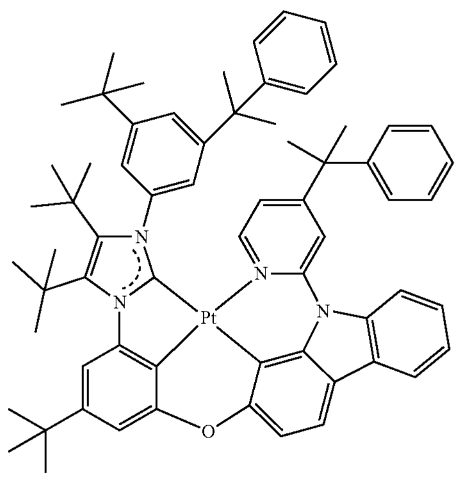
1210
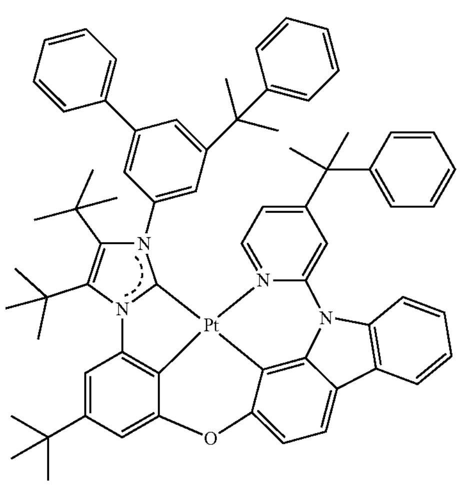
-continued
1211
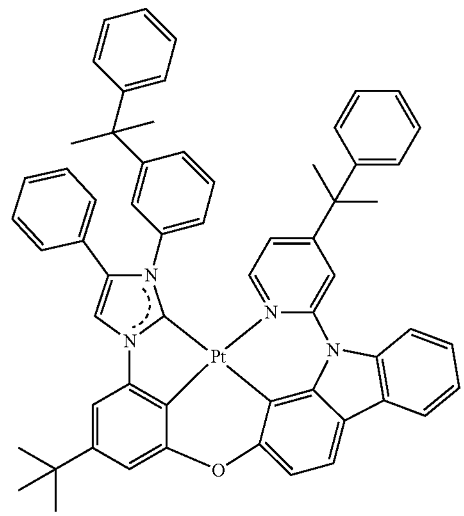
1212
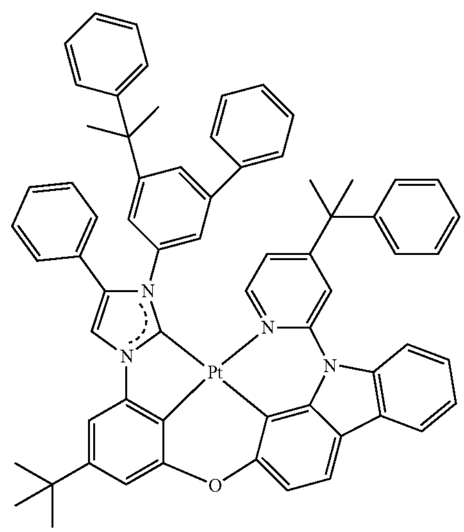
1213
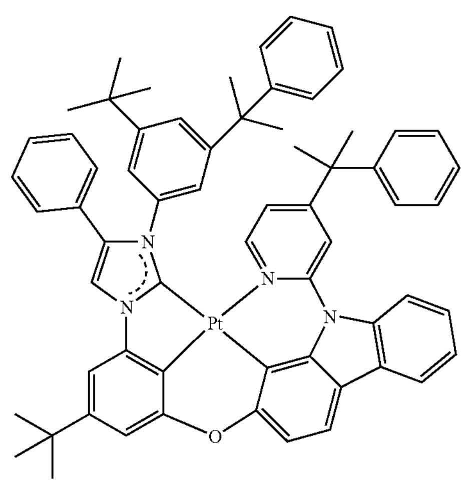

-continued
1214
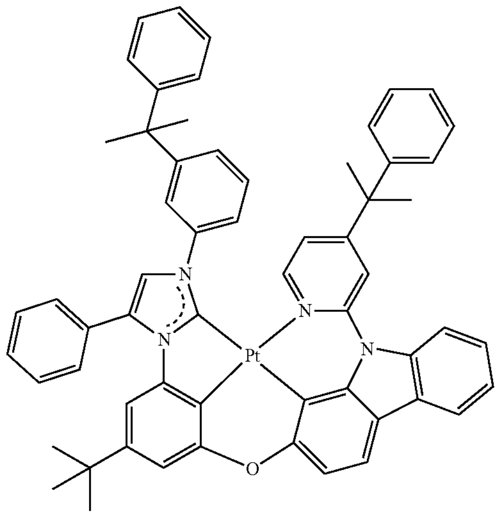
1215
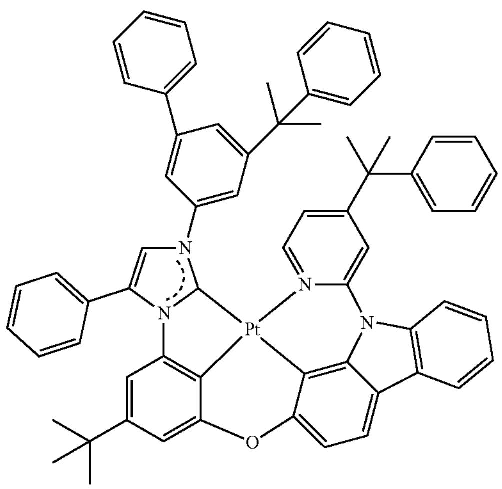
1216
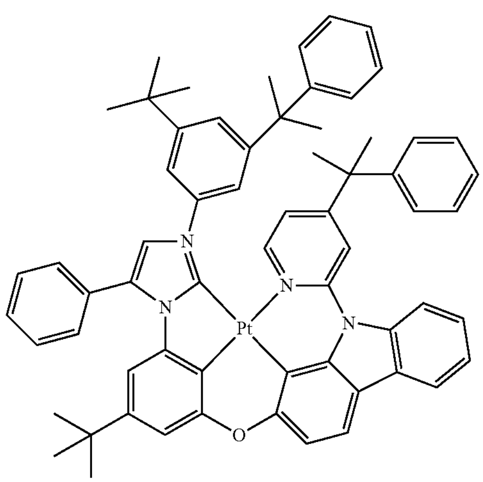
-continued
1217
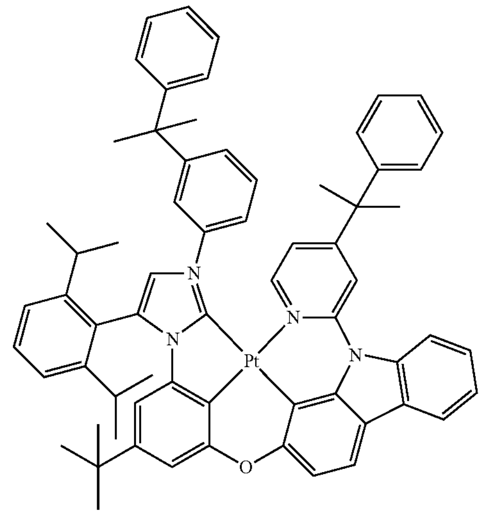
1218
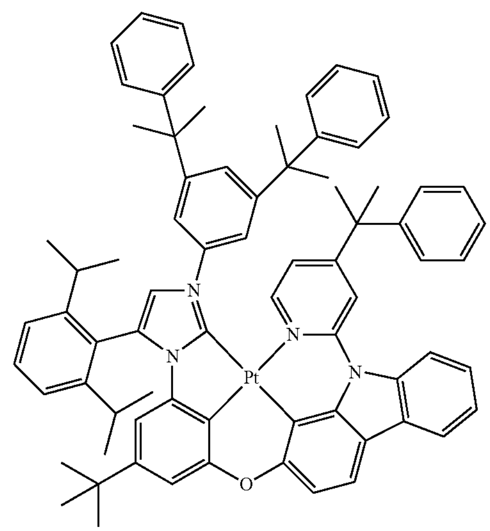
1219
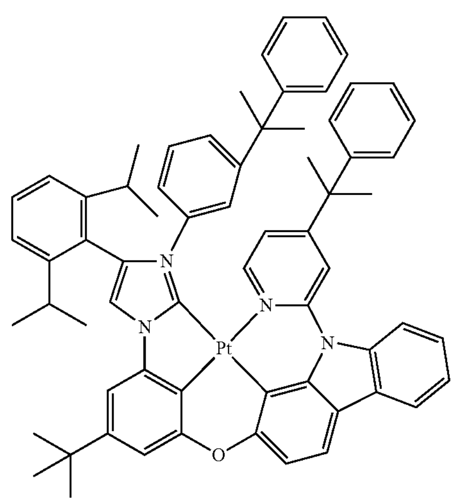

1220
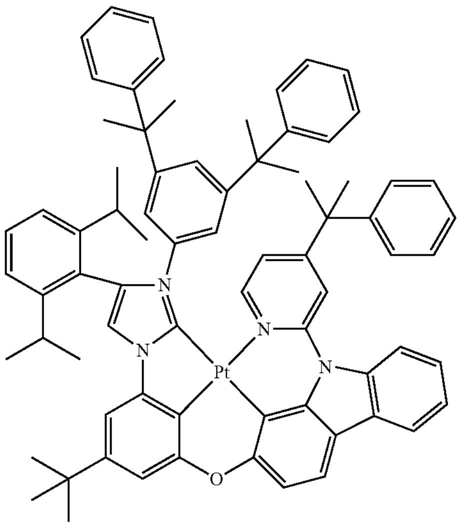
1221
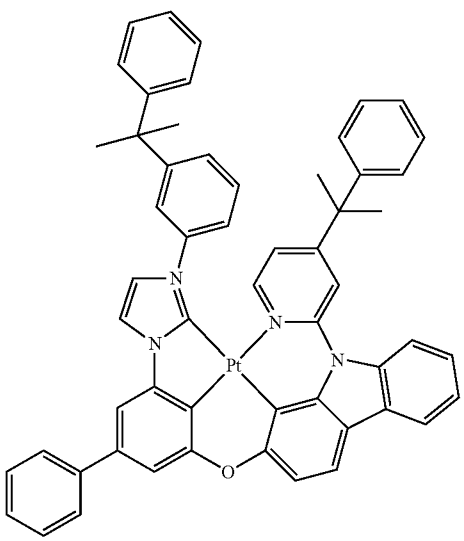
1222
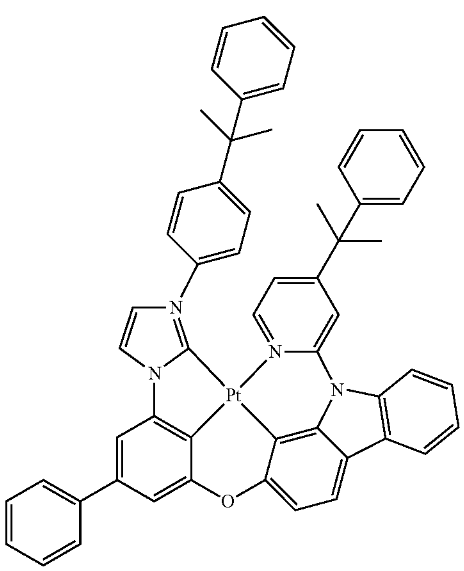
1223
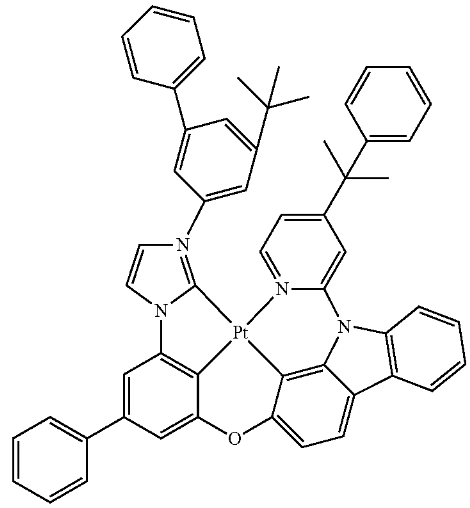
1224
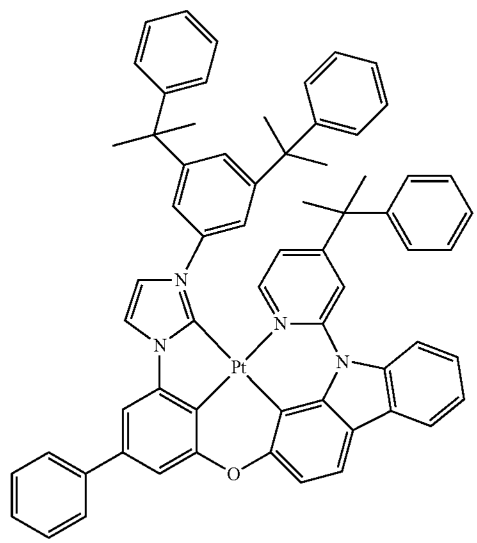
1225
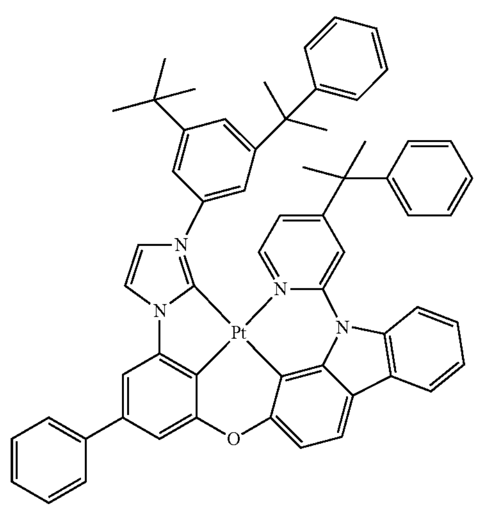

1226
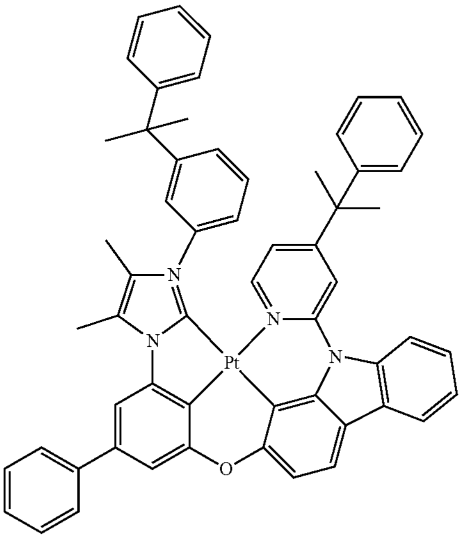
1227
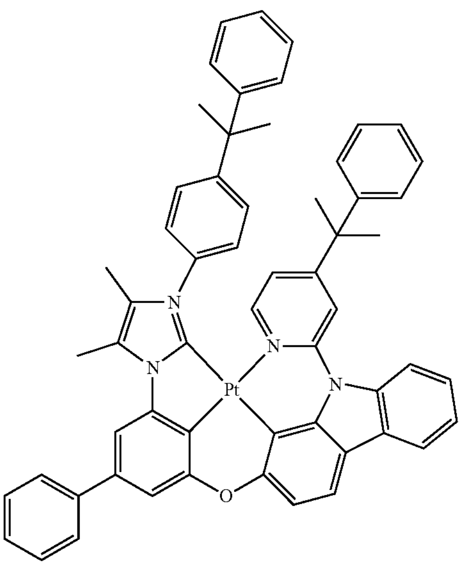
1228
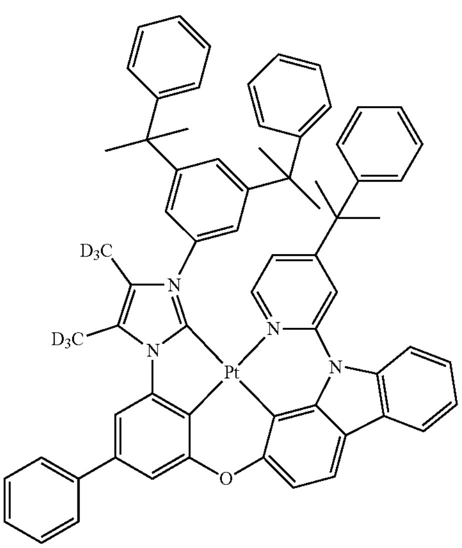
1229
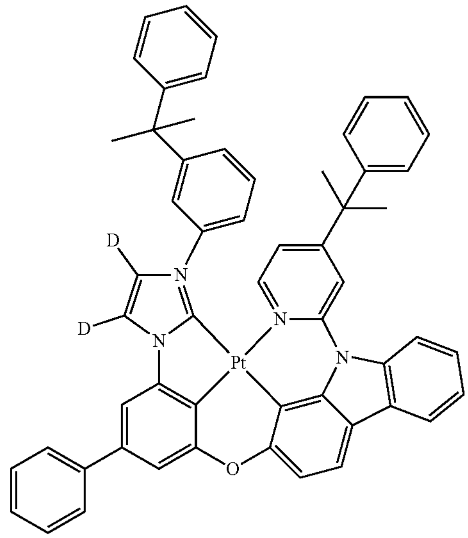
1230
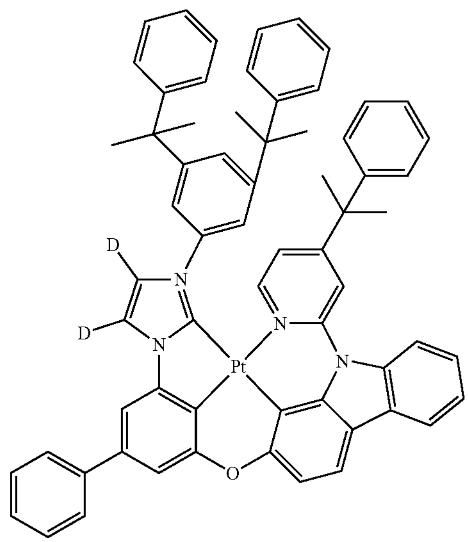
1231
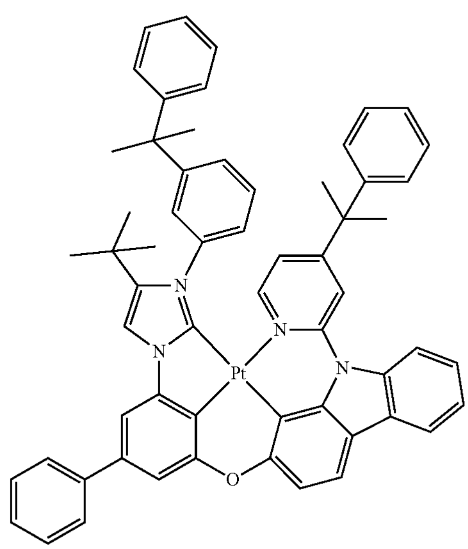

1232
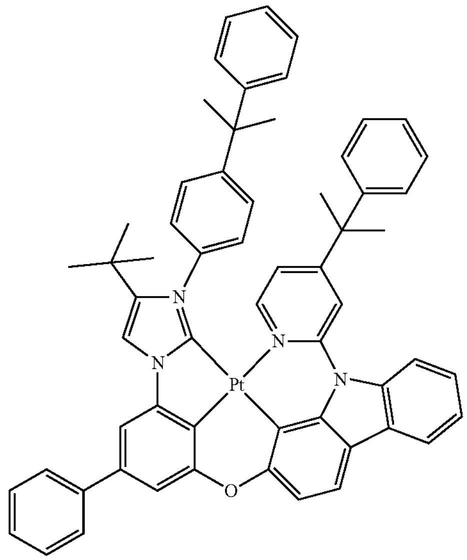
1233
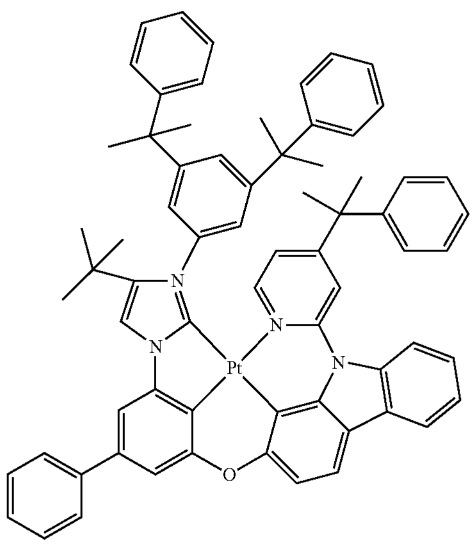
1234
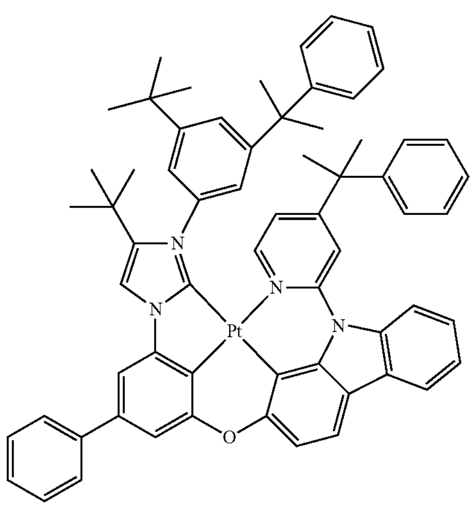
1235
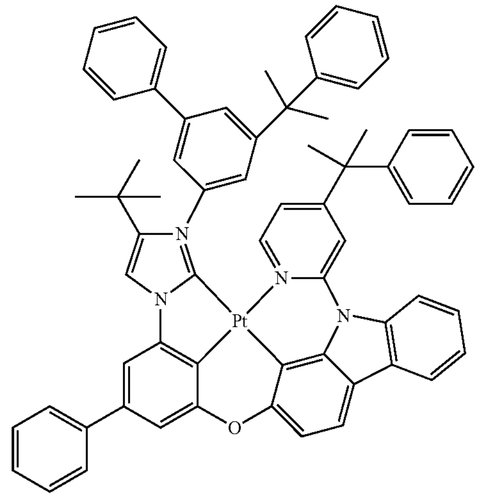
1236
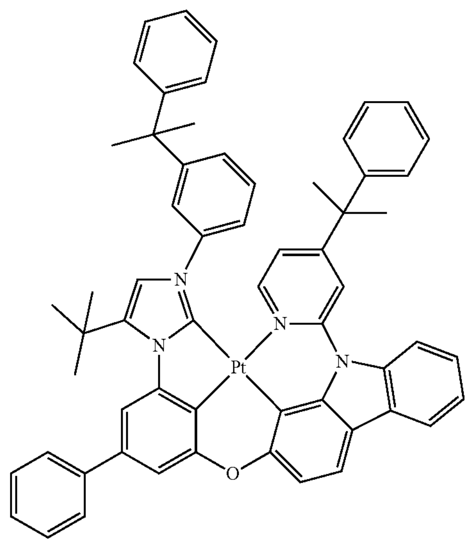
1237
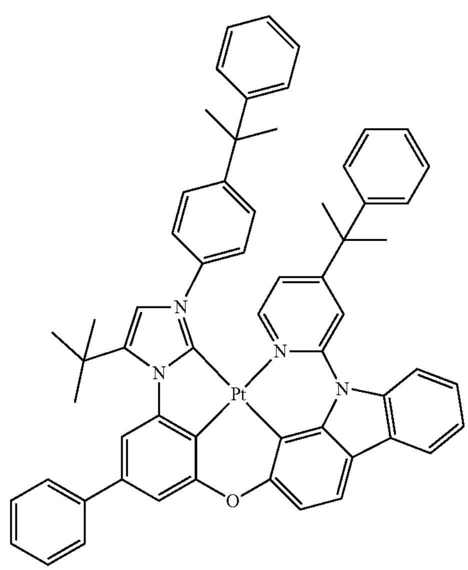

-continued
1238
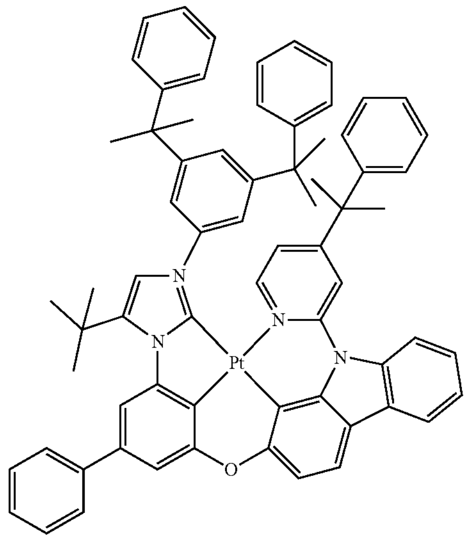
1239
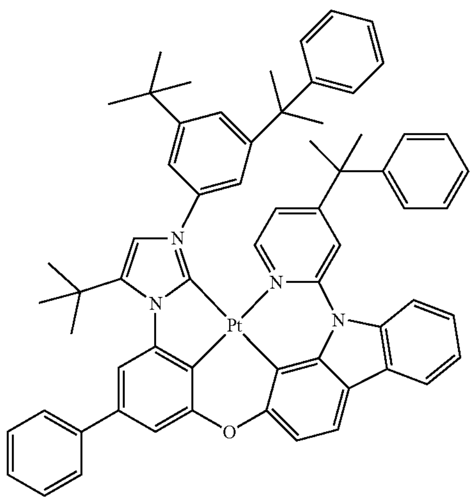
1240
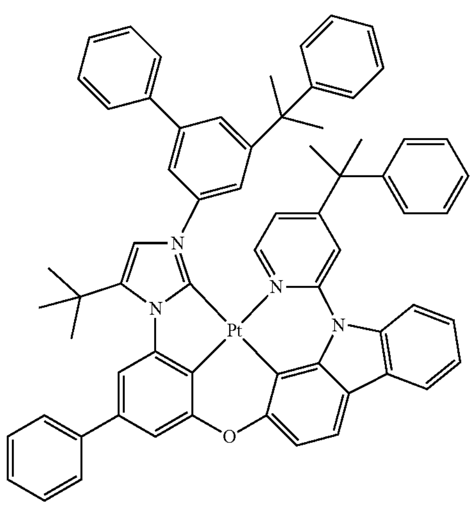
-continued
1241
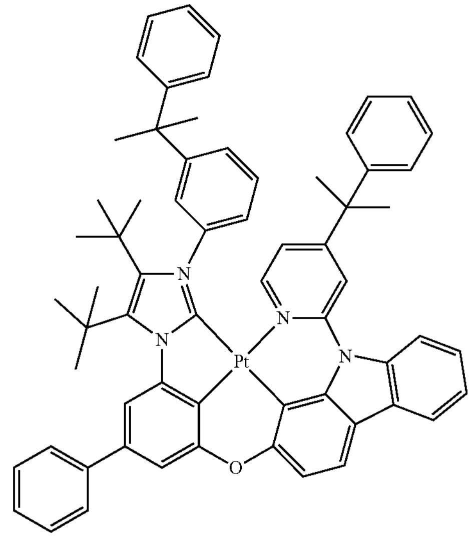
1242
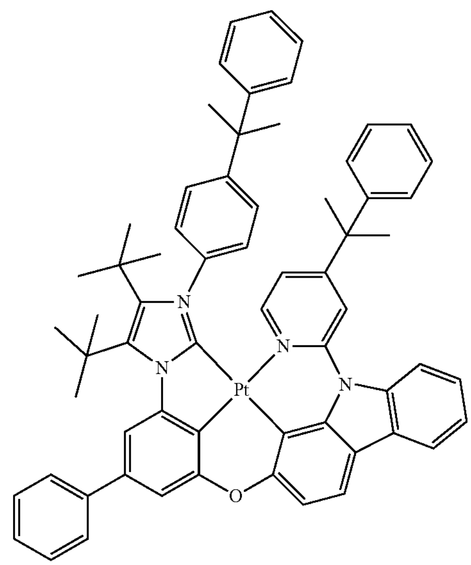
1243
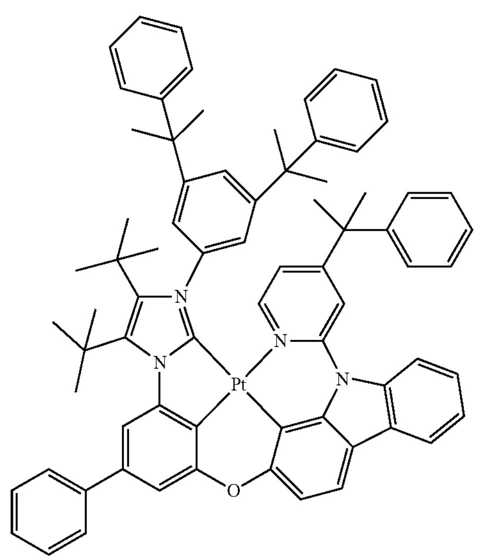

-continued
1244
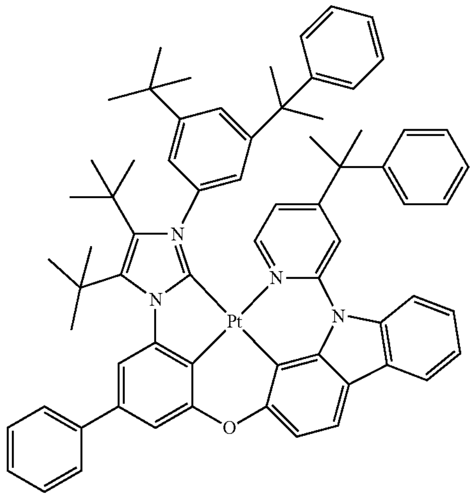
1245
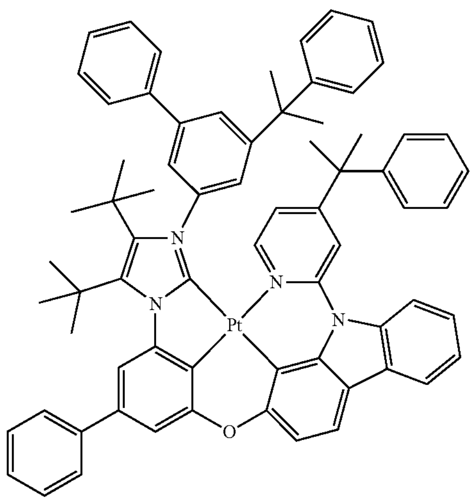
1246
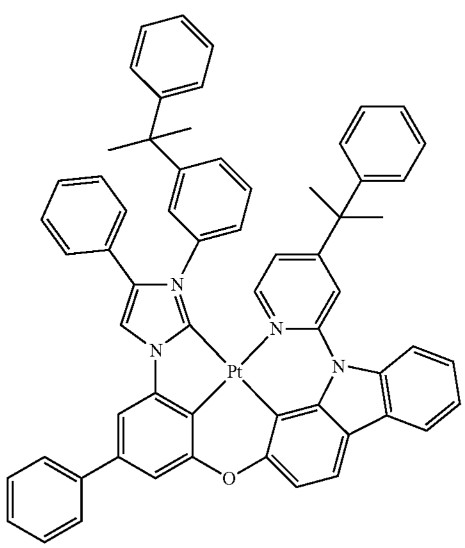
-continued
1247
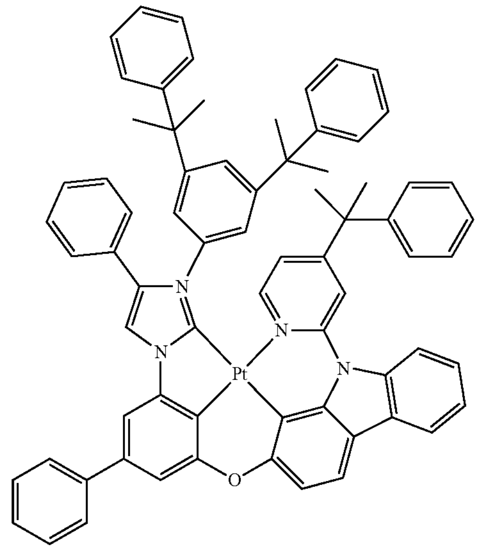
1248
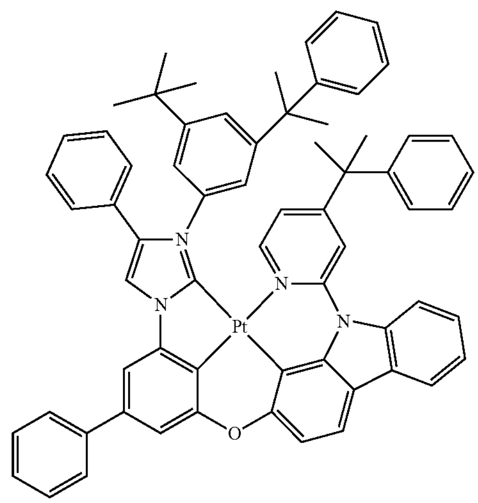
1249
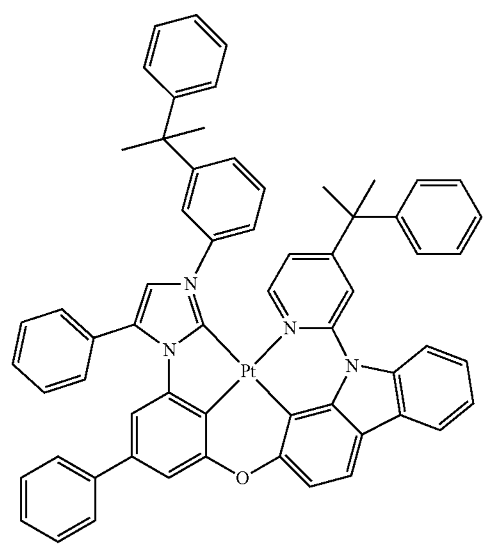

-continued
1250
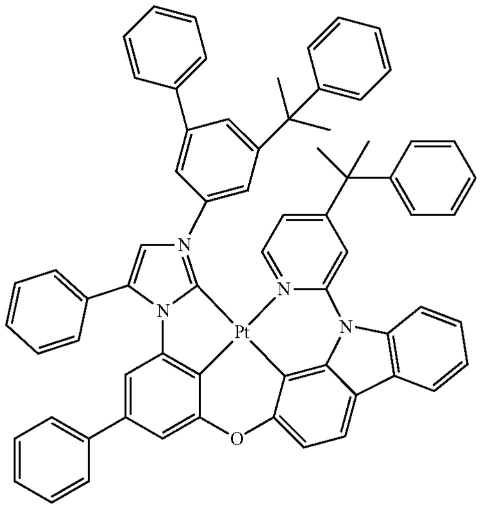
1251
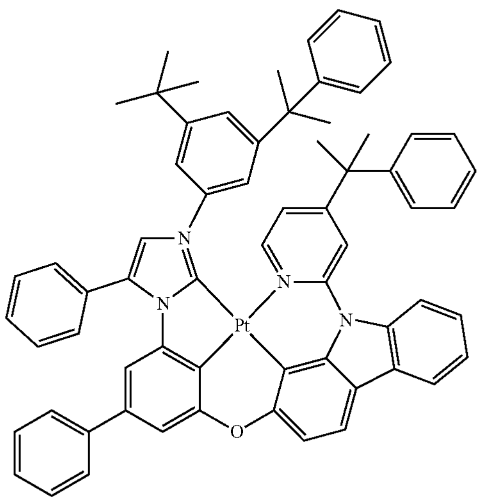
1252
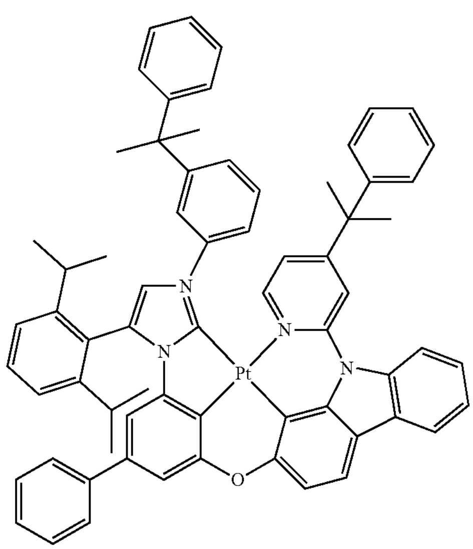
-continued
1253
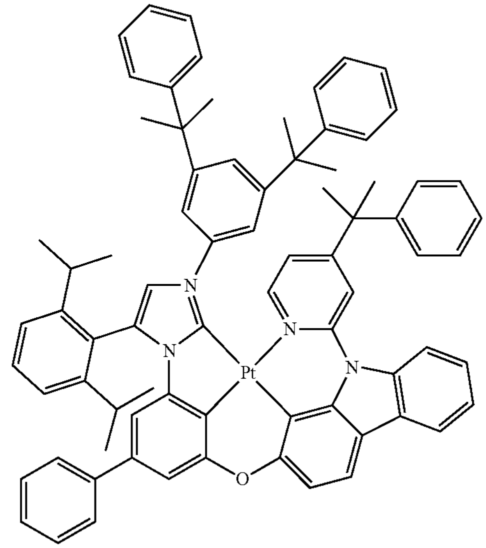
1254
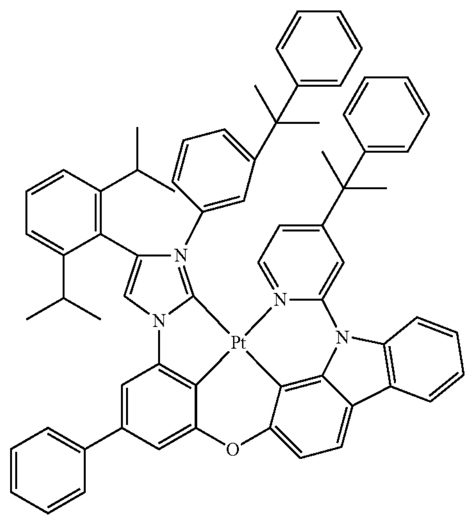
1255
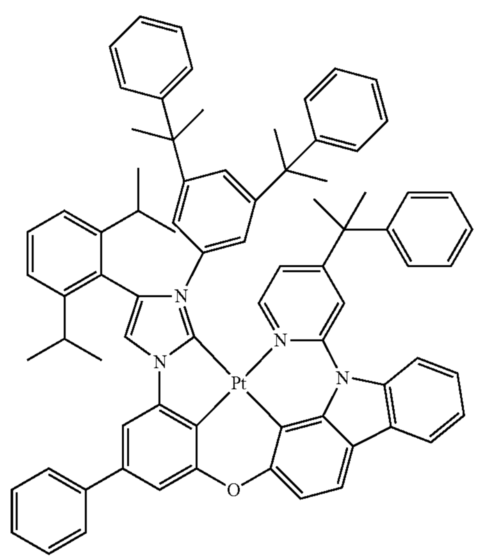

1256
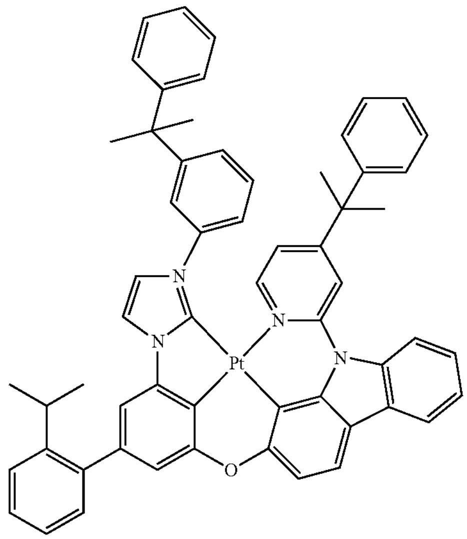
1257
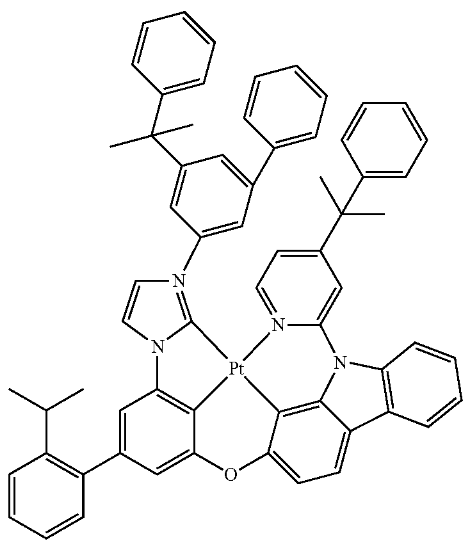
1258
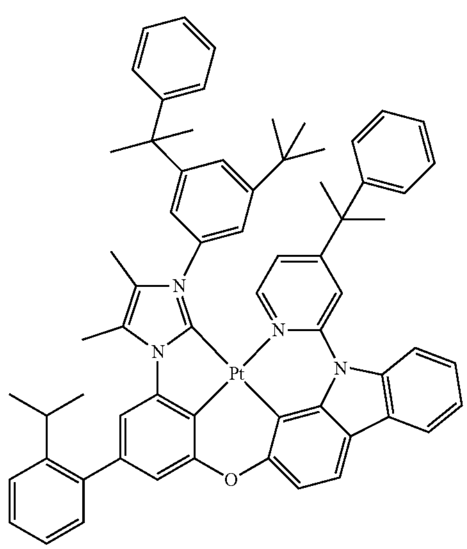
1259
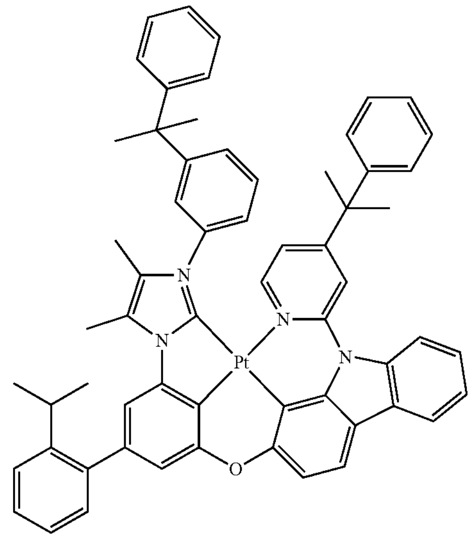
1260
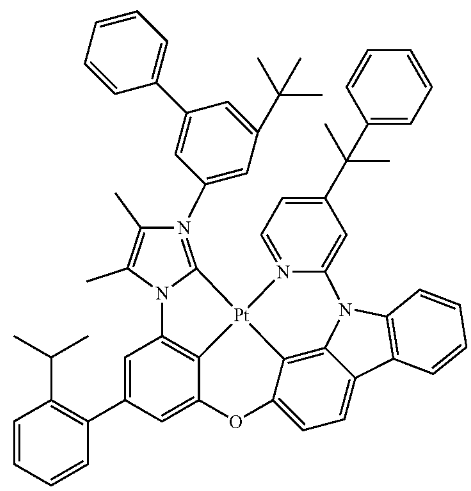
1261
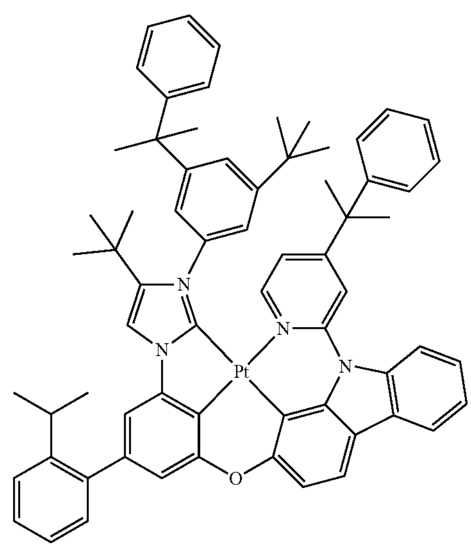

-continued
1262
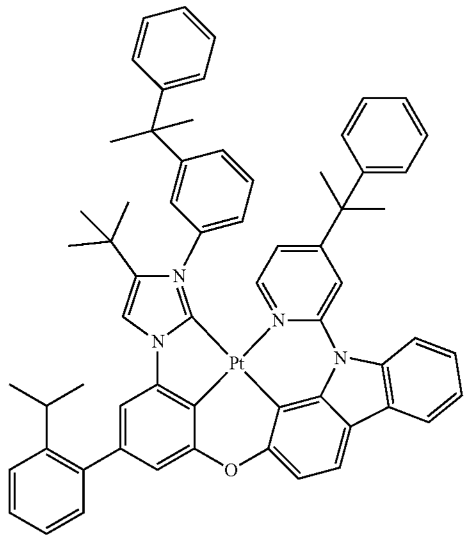
1263
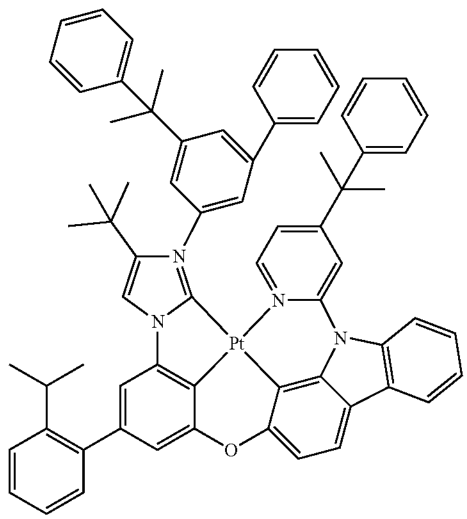
1264
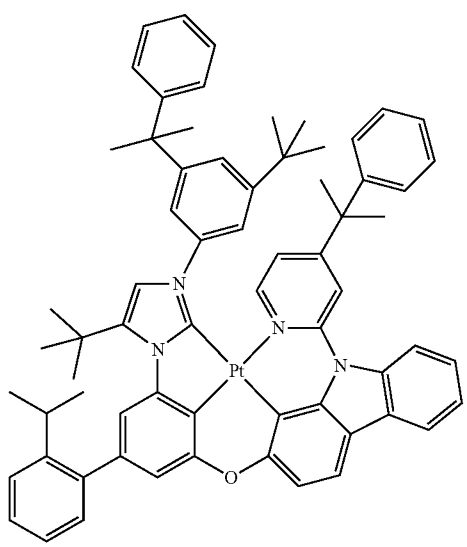
-continued
1265
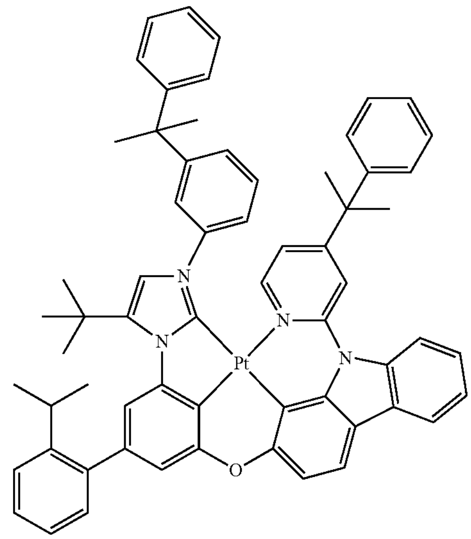
1266
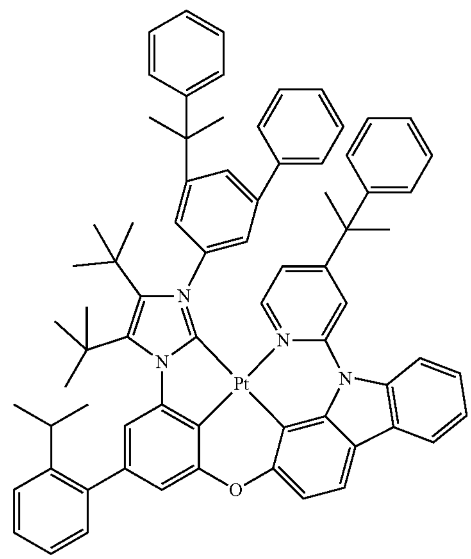
1267
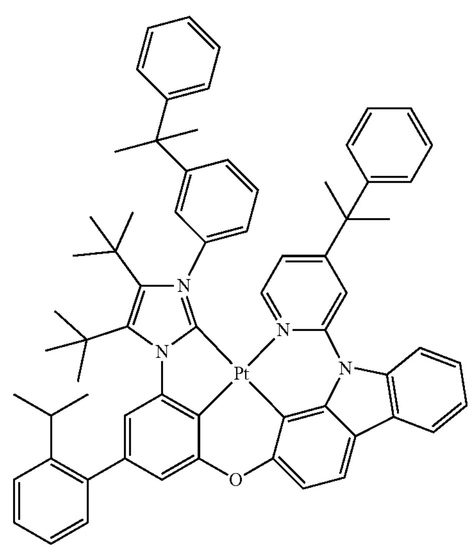

-continued
1268
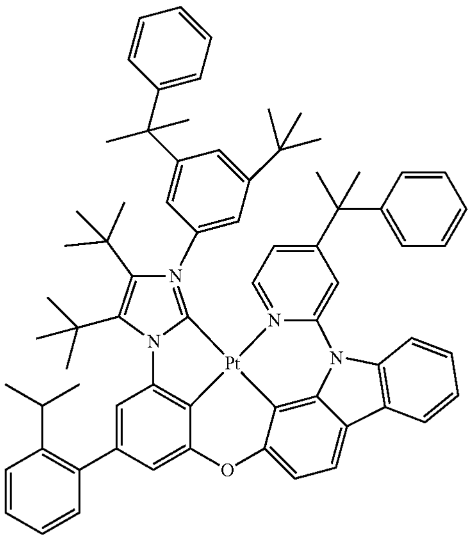
1269
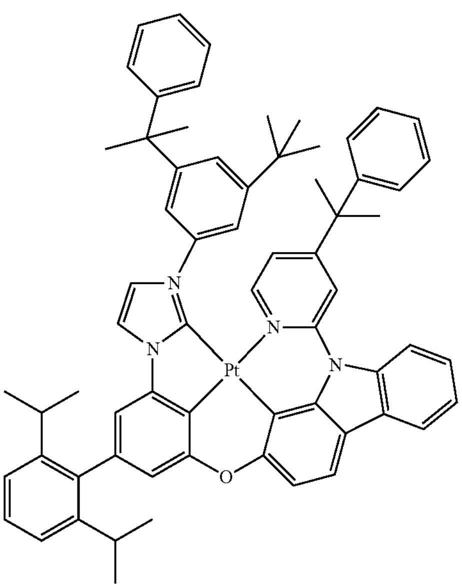
-continued
1270
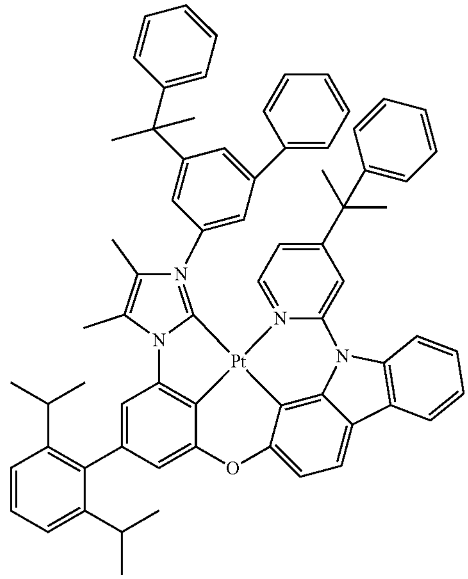
1271
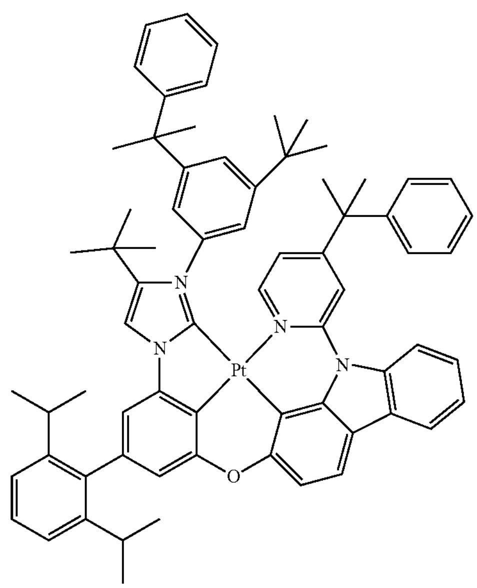

1272
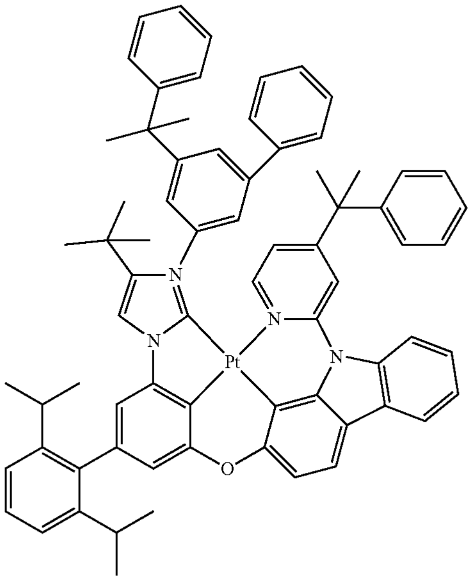
1273
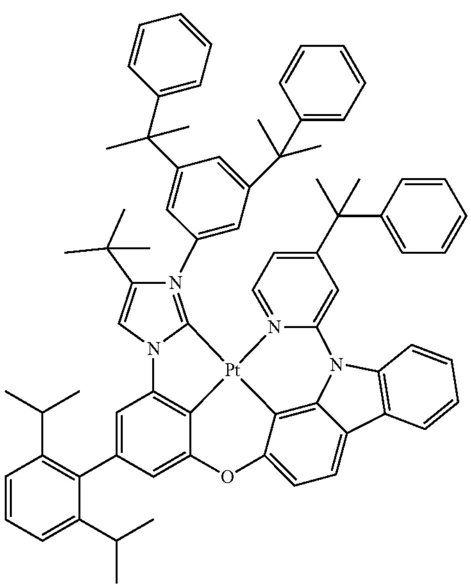
1274
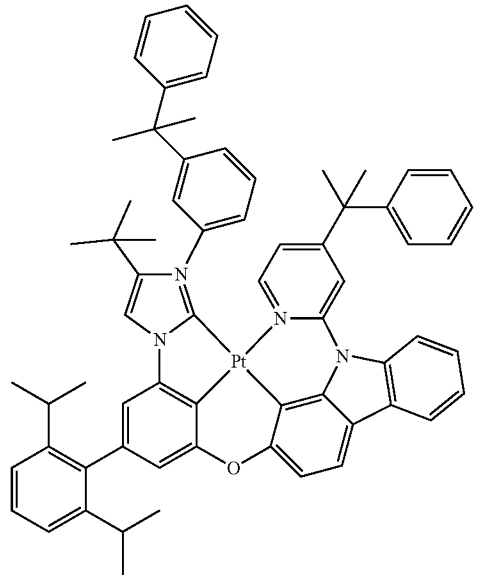
1275
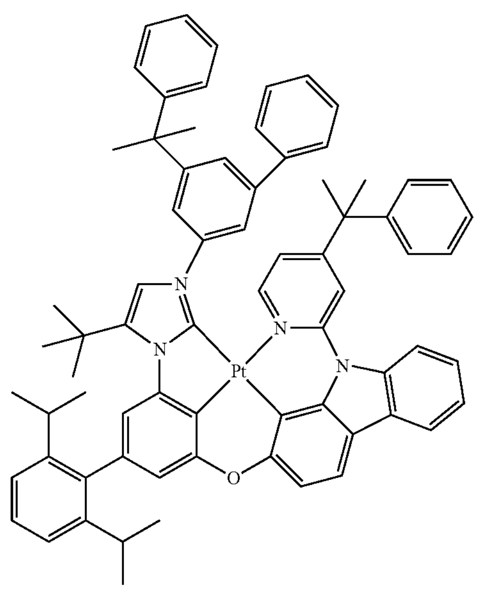

1276
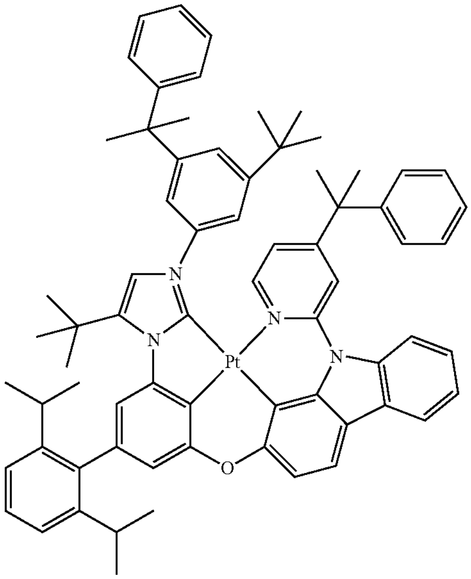
1277
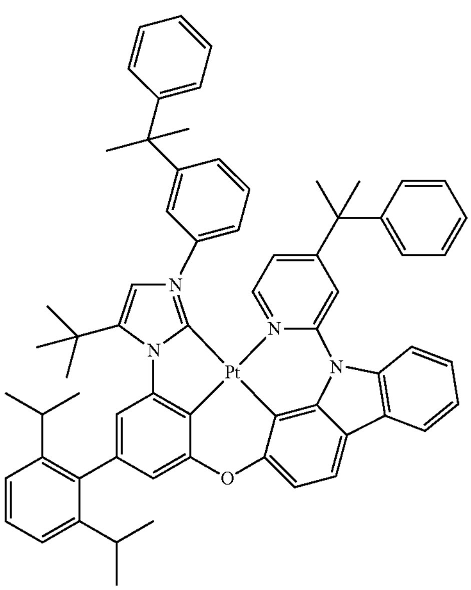
1278
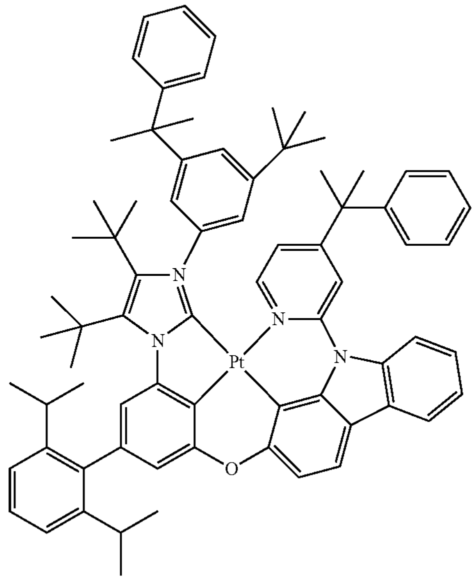
1279
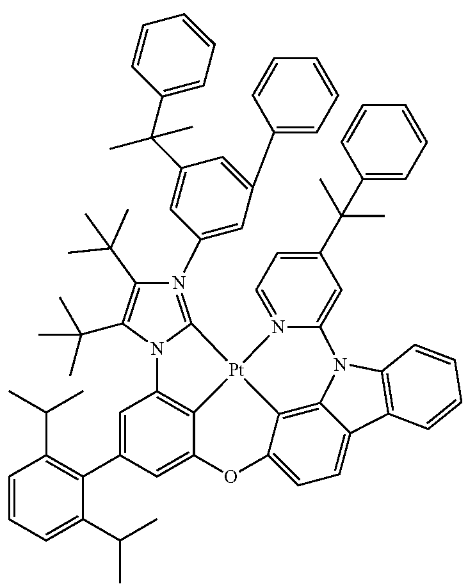

-continued
1280
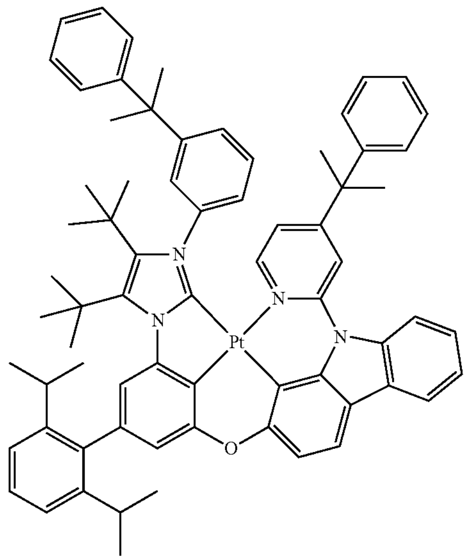
1281
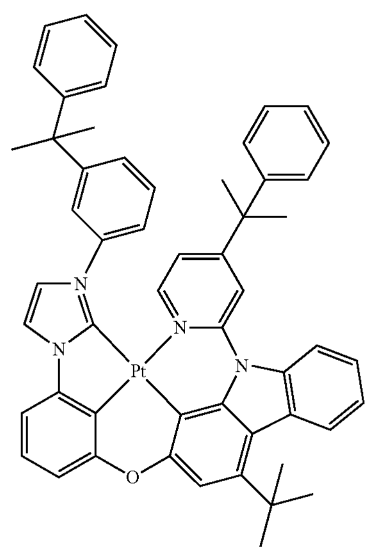
1282
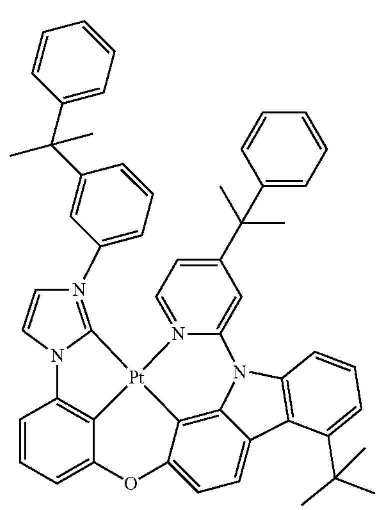
-continued
1283
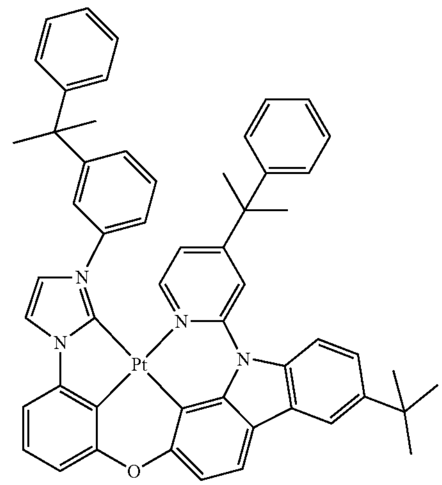
1284
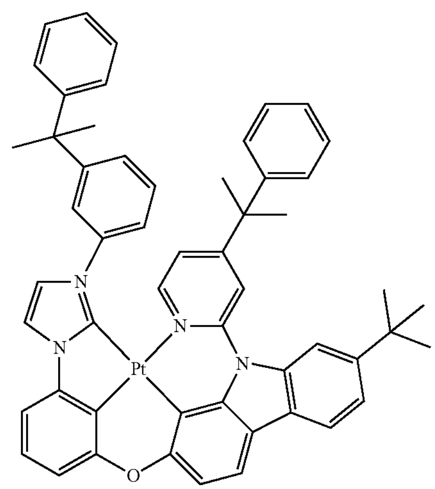
1285
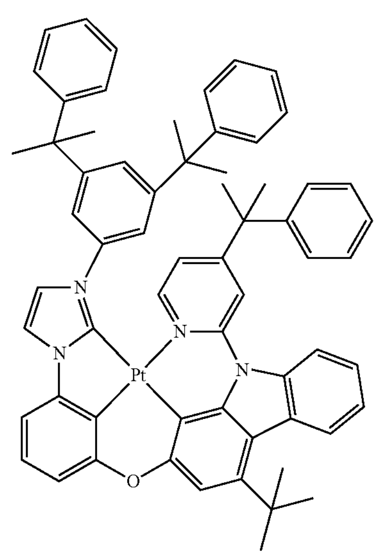

-continued
1286
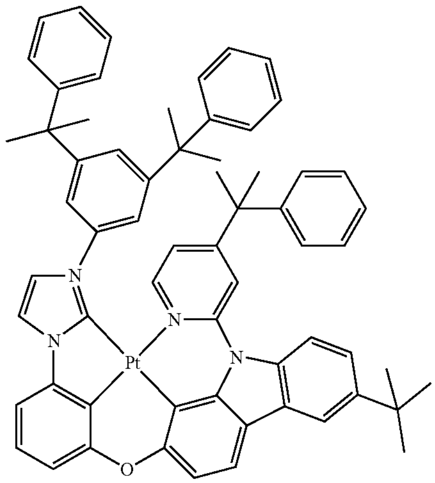
1287
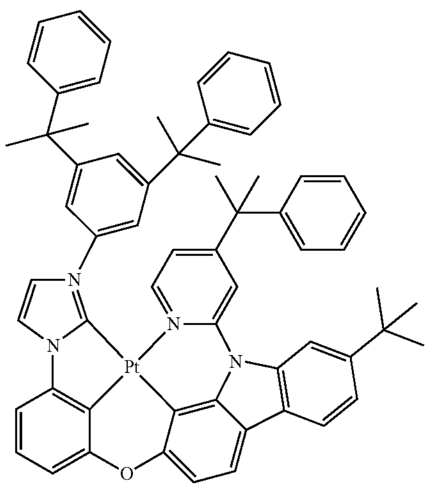
1288
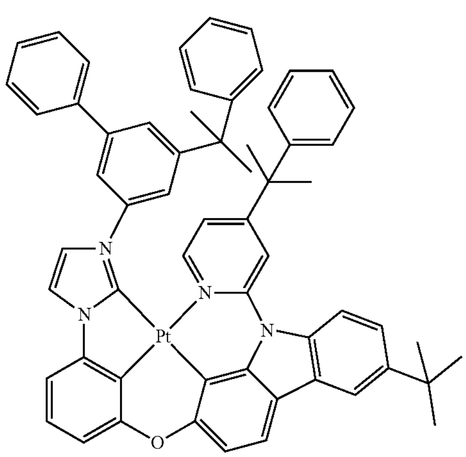
-continued
1289
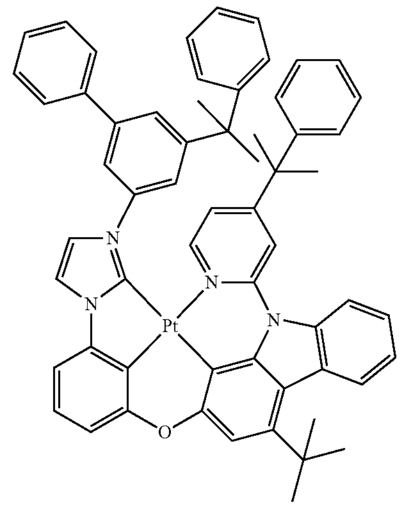
1290
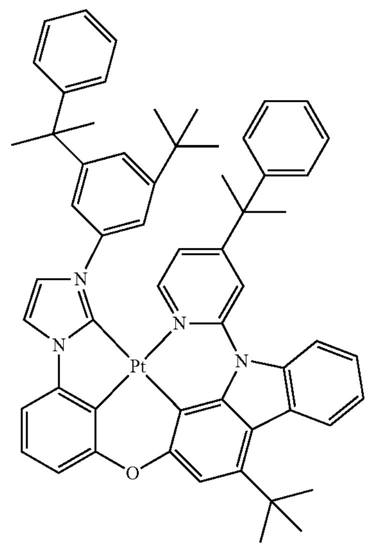
1291
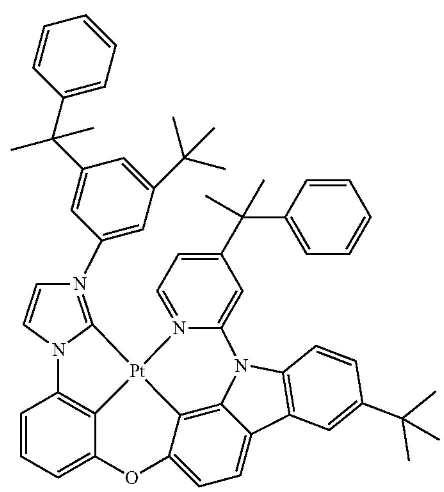

-continued
1292
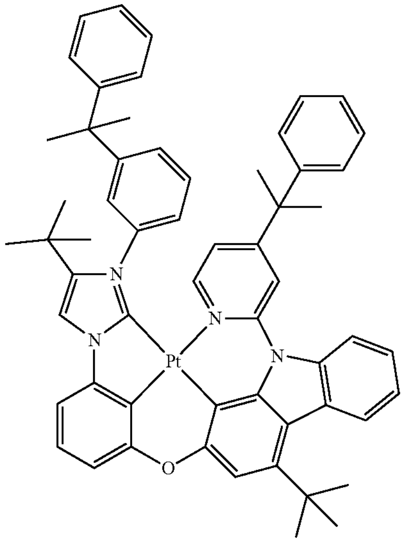
1293
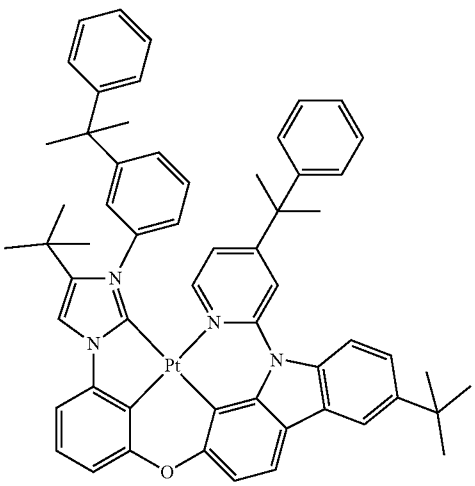
1294
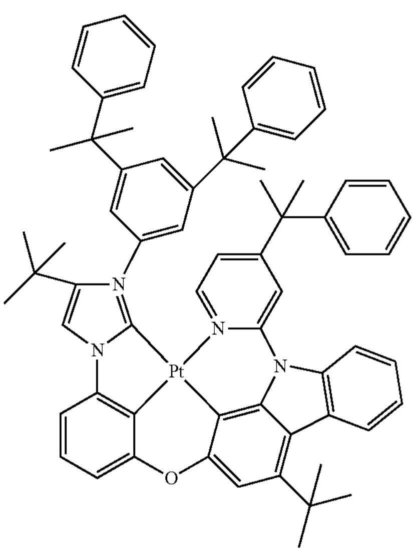
-continued
1295
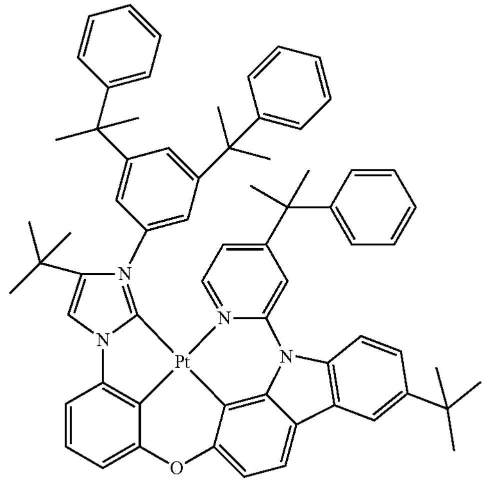
1296
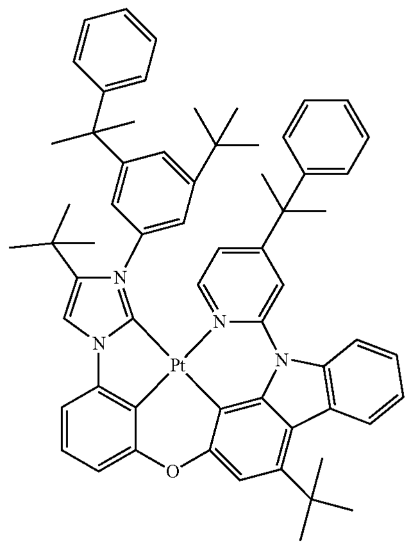
1297
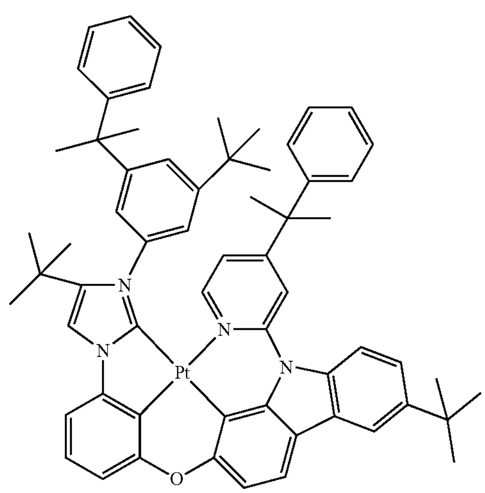

-continued
1298
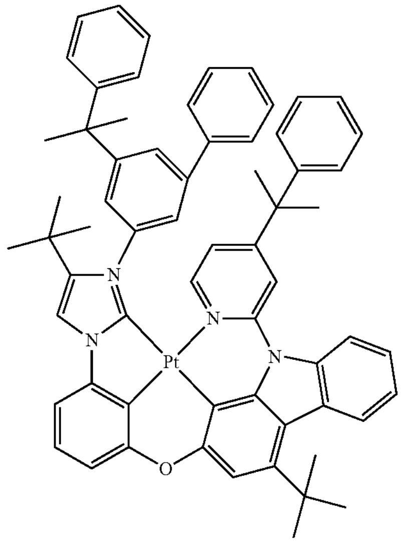
1299
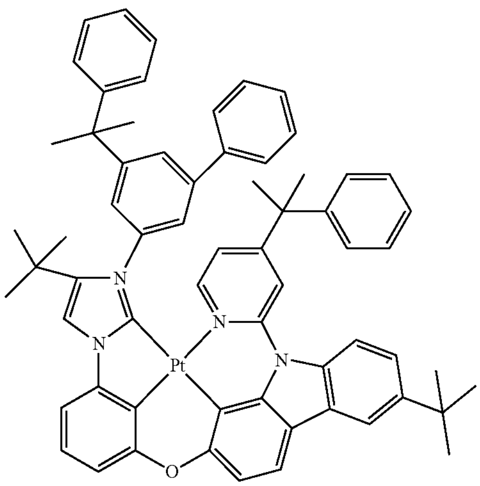
1300
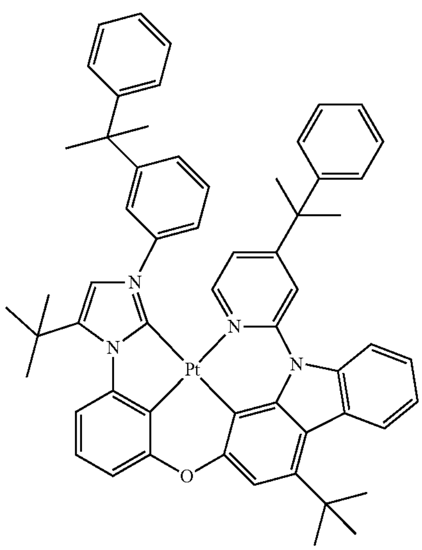
-continued
1301
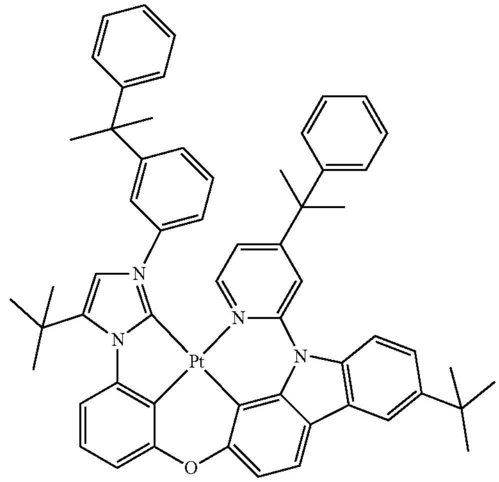
1302
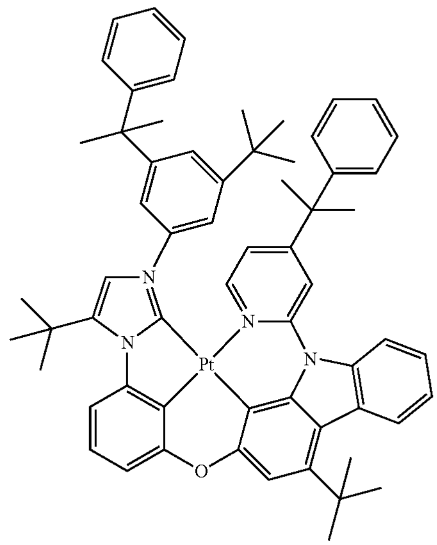
1303
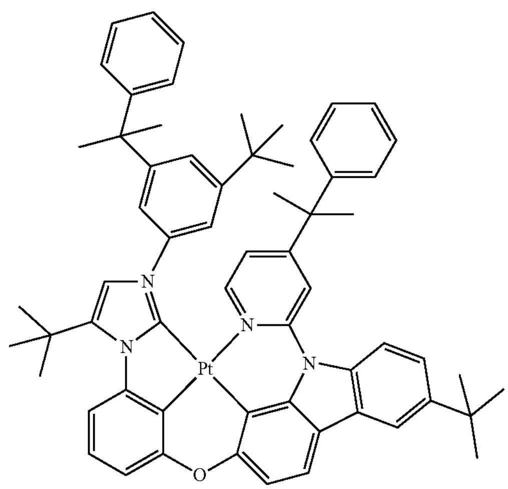

-continued
1304
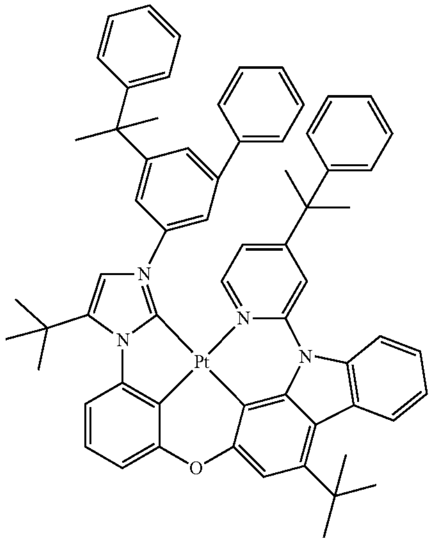
1305
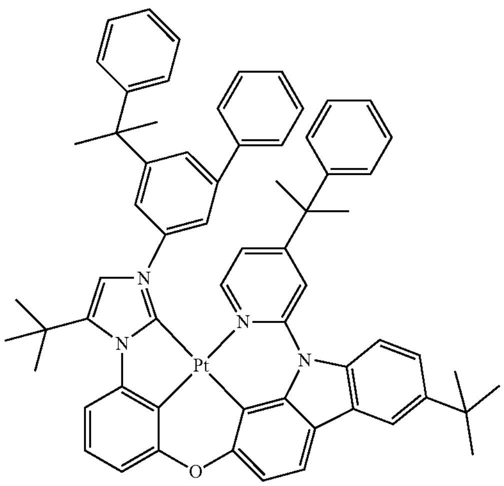
1306
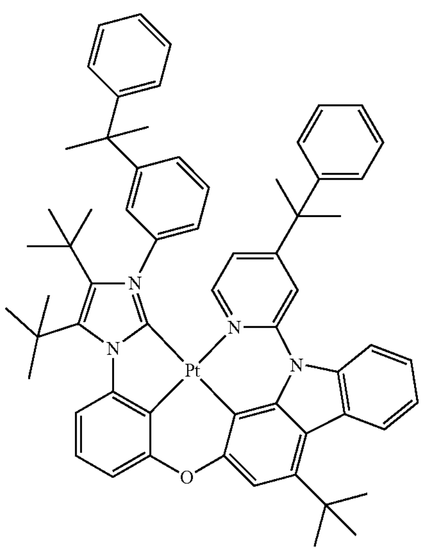
-continued
1307
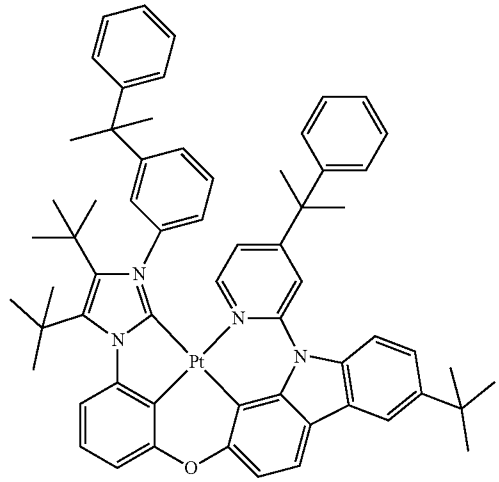
1308
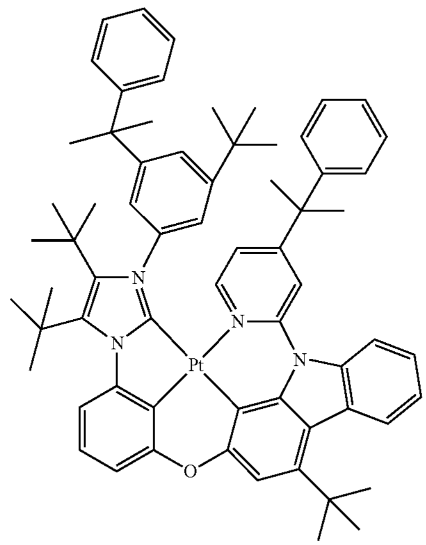
1309
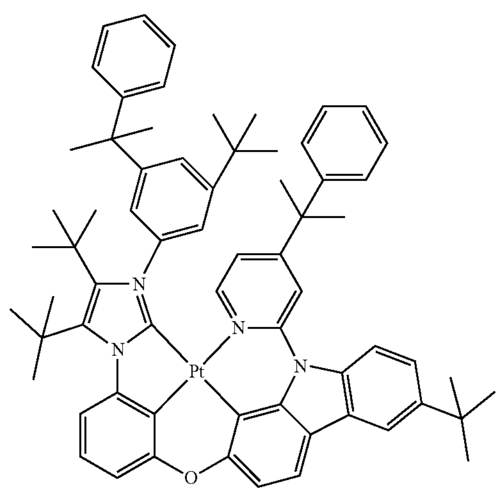

-continued
1310
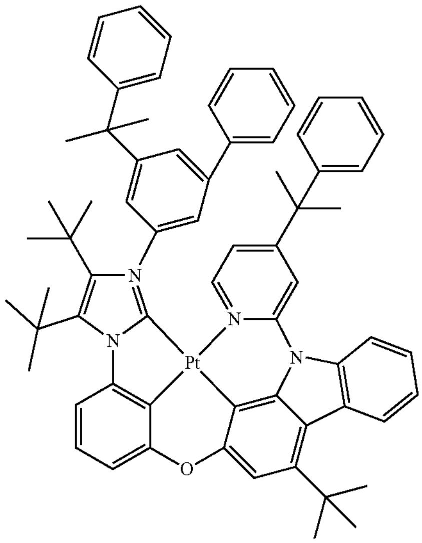
1311
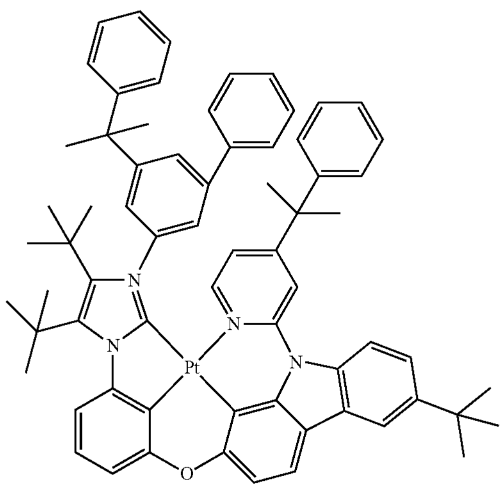
1312
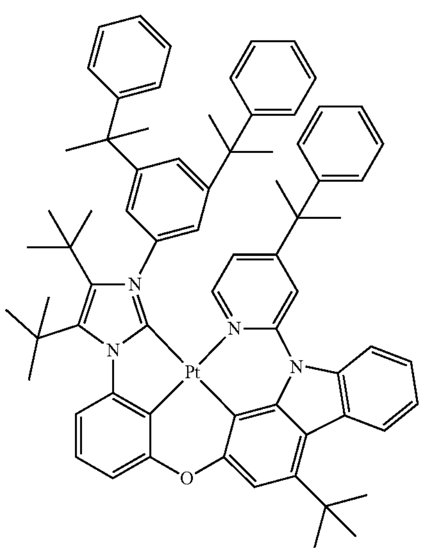
-continued
1313
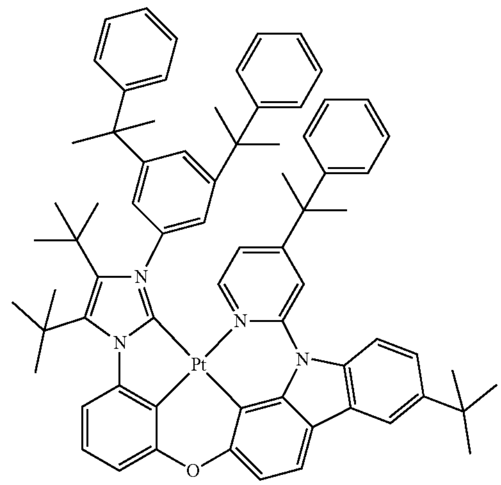
1314
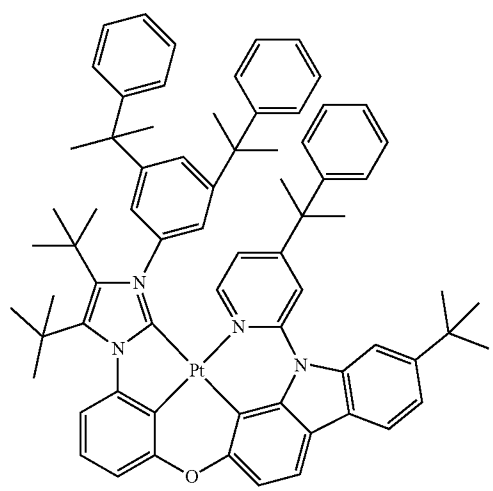
1315
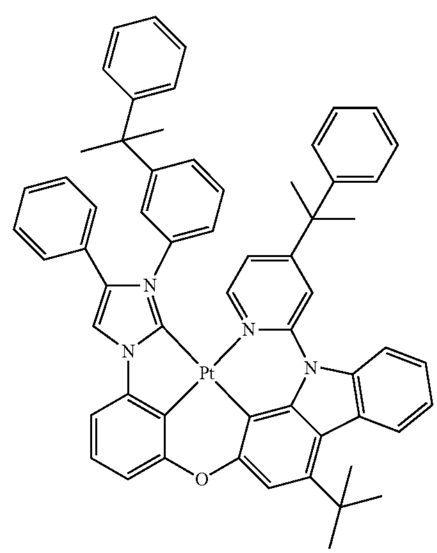

-continued
1316
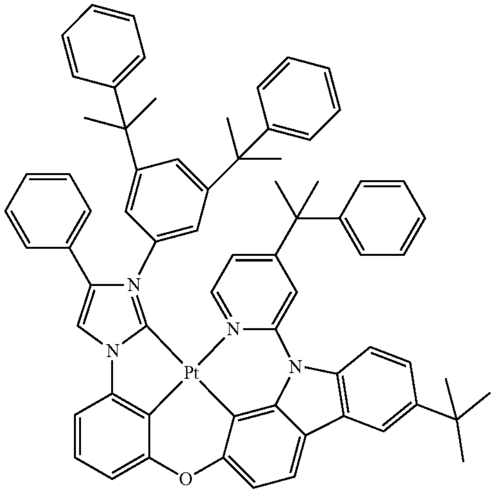
1317
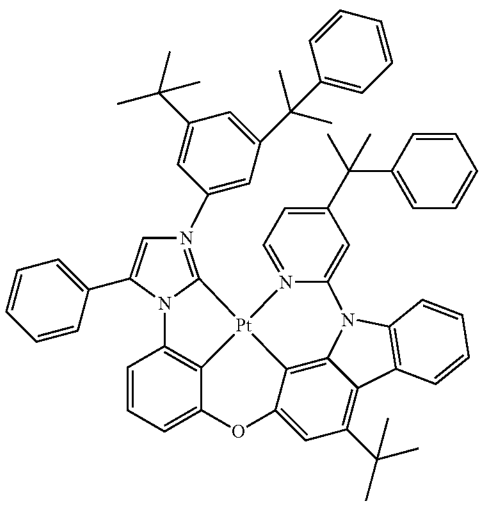
1318
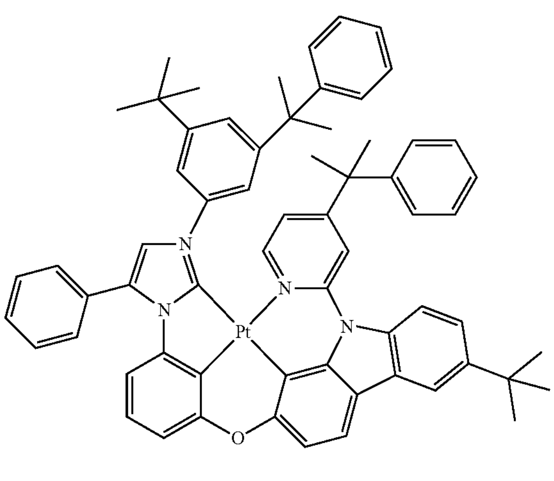
-continued
1319
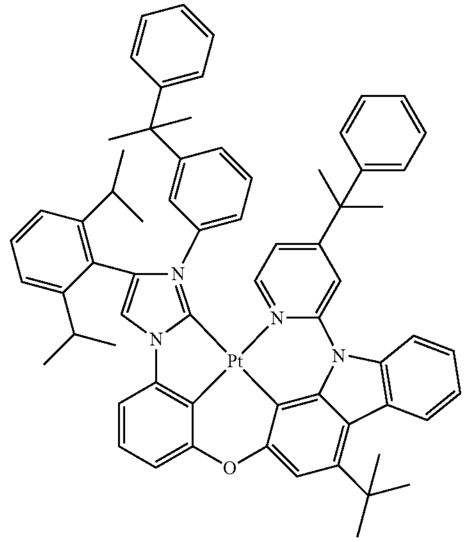
1320
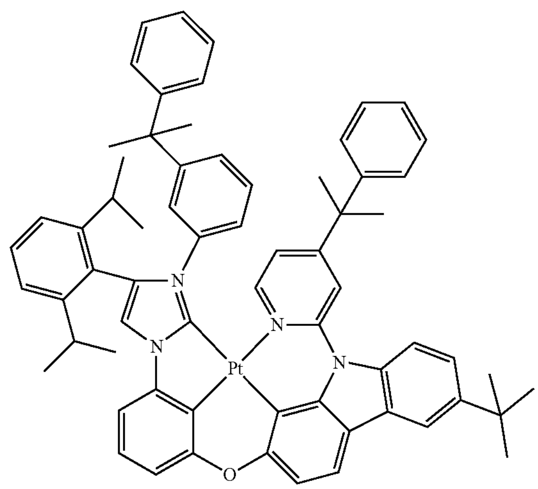
1321
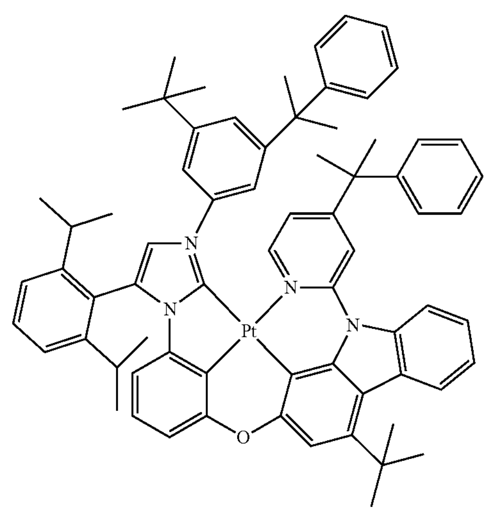

-continued
1322
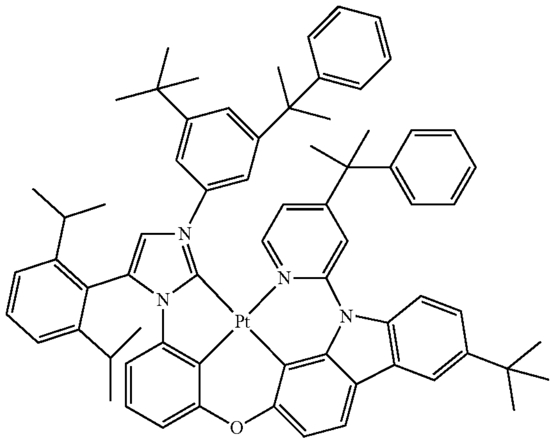
1323
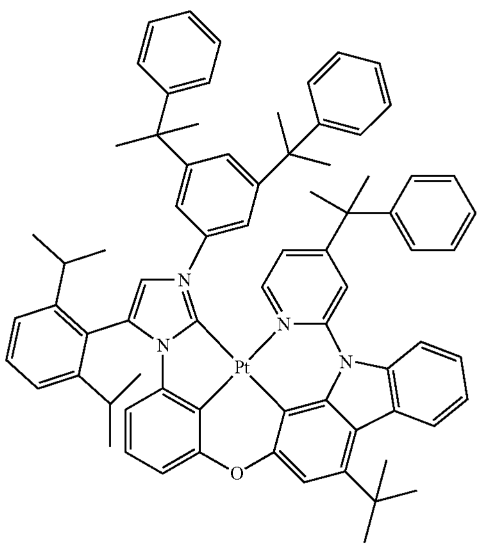
1324
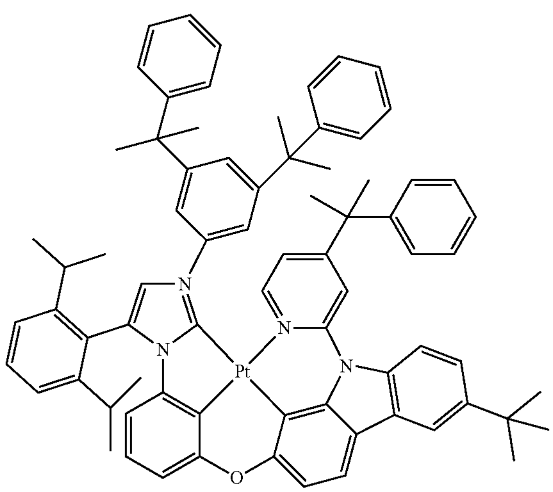
-continued
1325
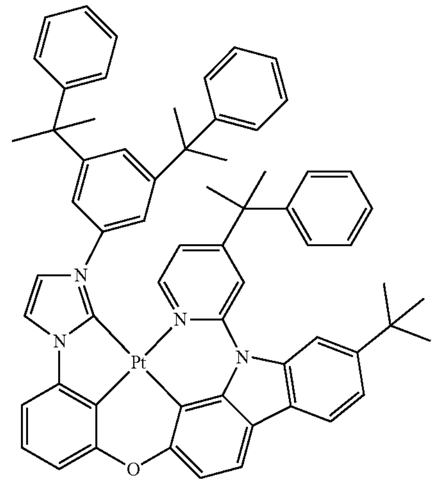
1326
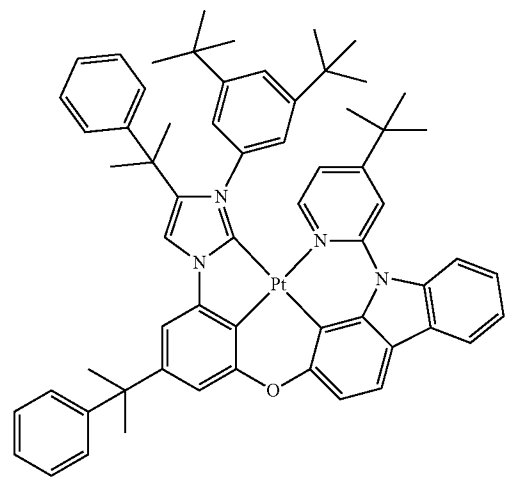
1327
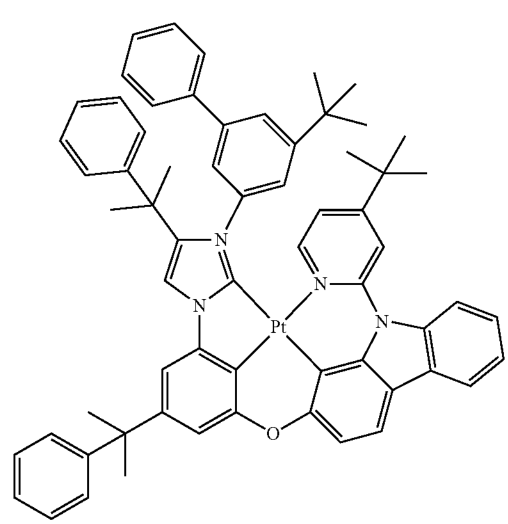

-continued
1328
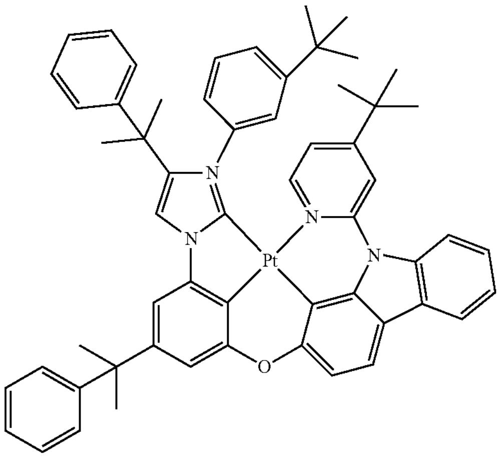
1329
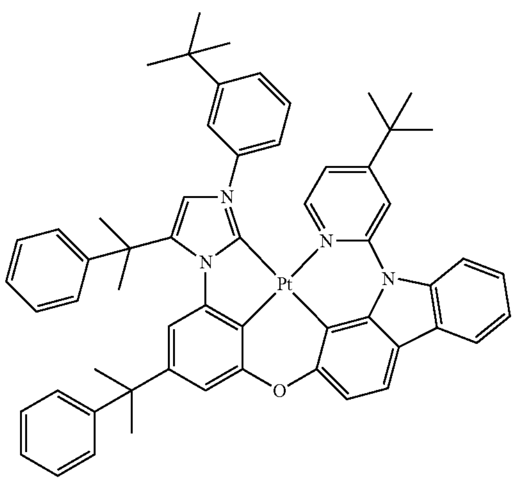
1330
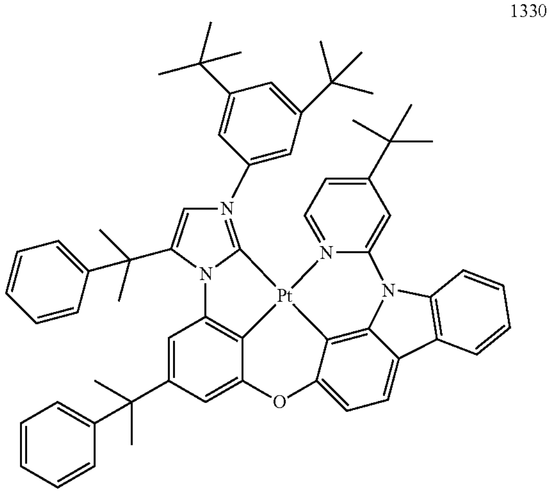
-continued
1331
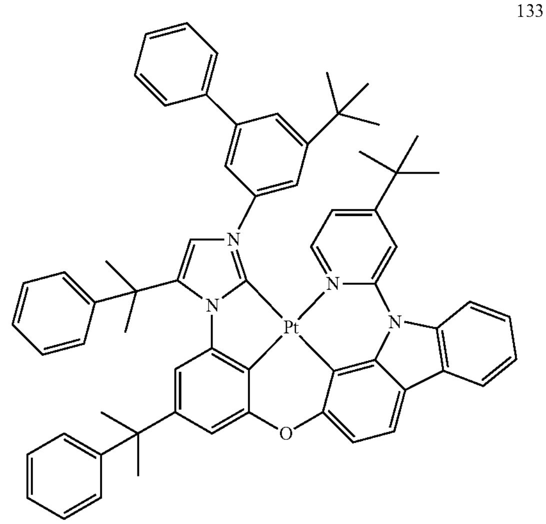
1332
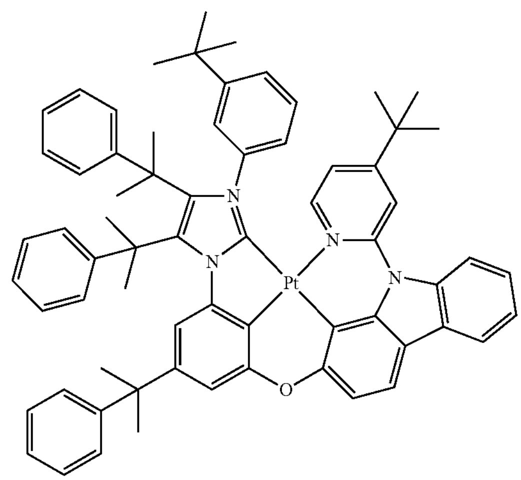
1333
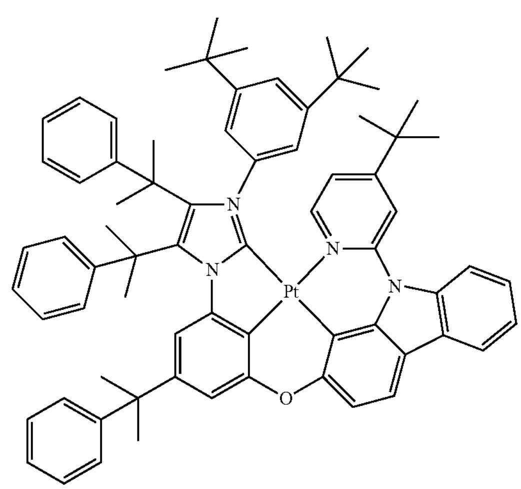

1334
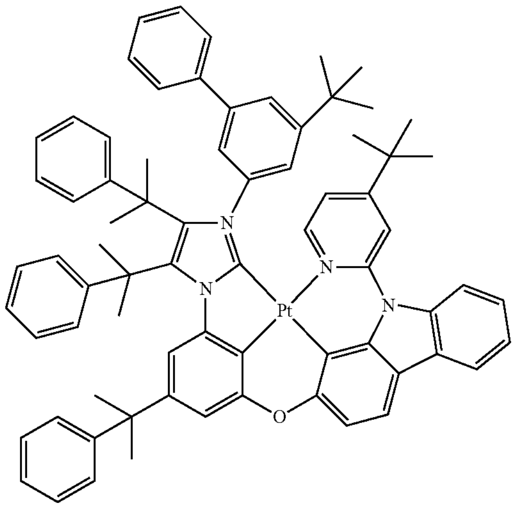
1335
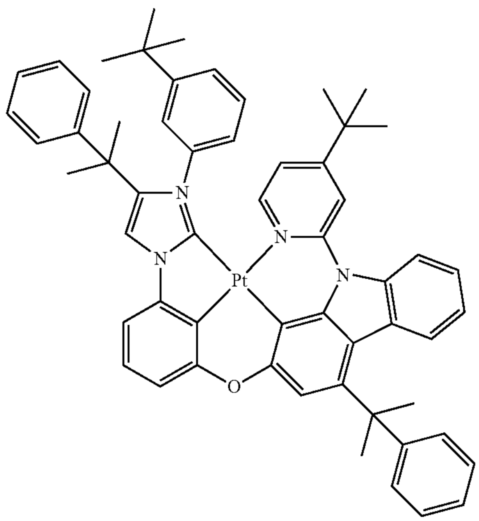
1336
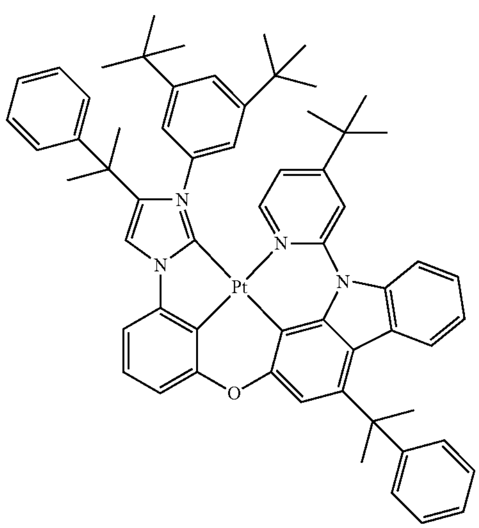
1337
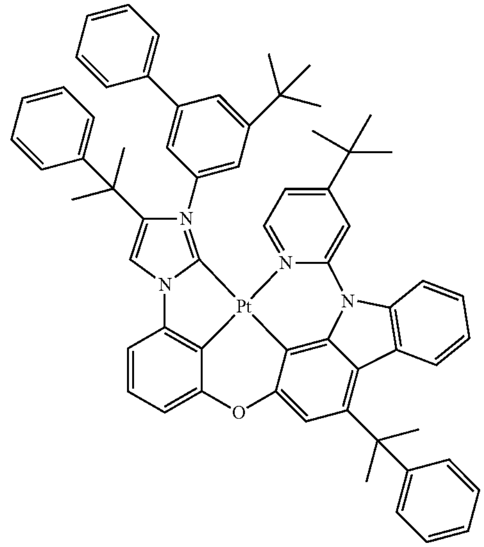
1338
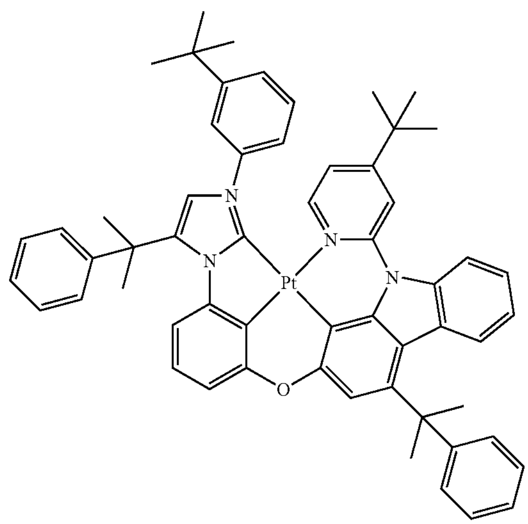
1339
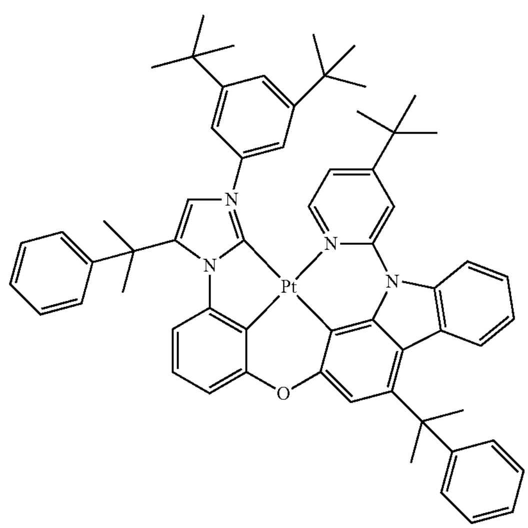

1340
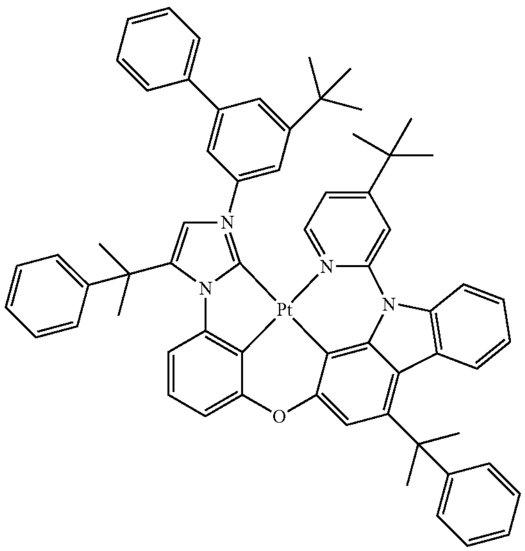
1341
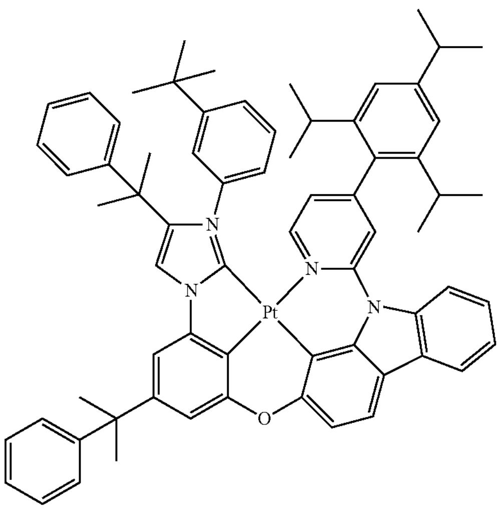
1342
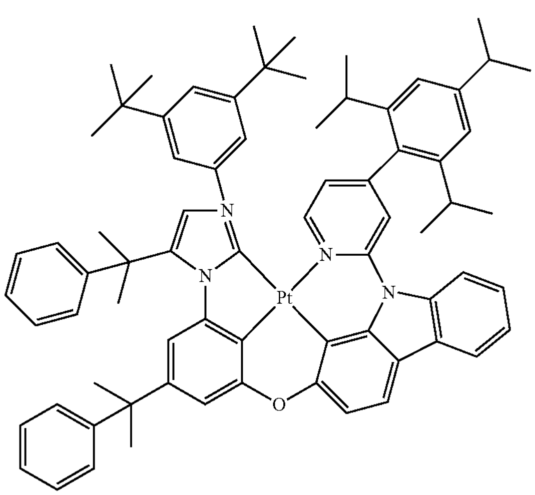
1343
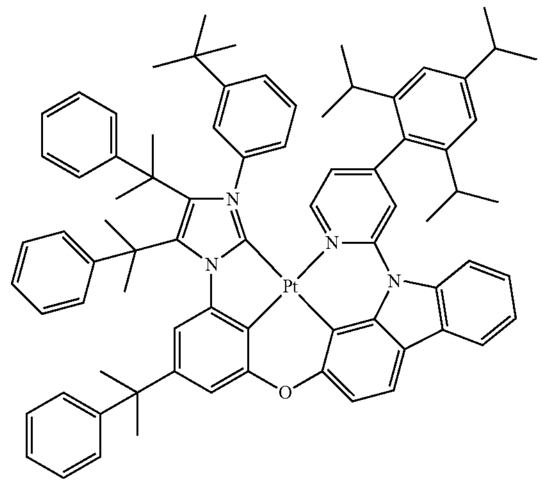
1344
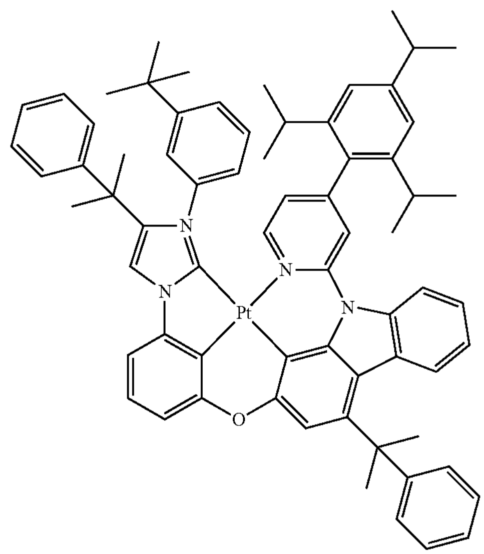
1345
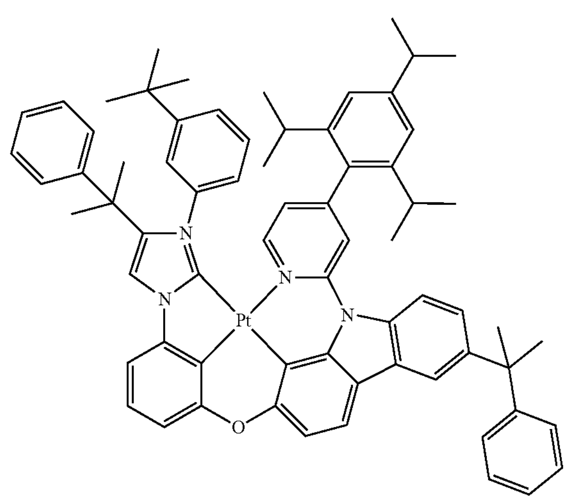

-continued
1346
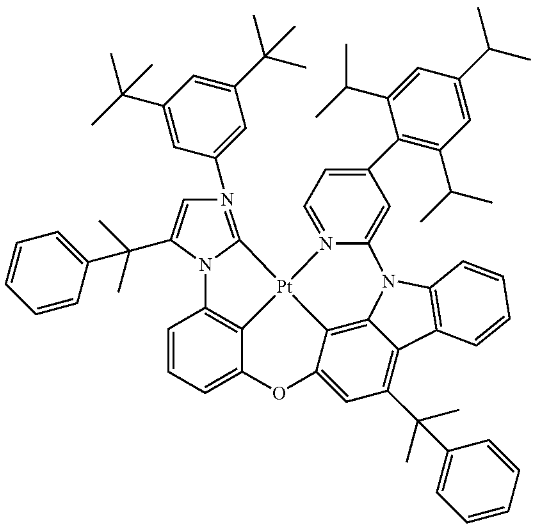
1347
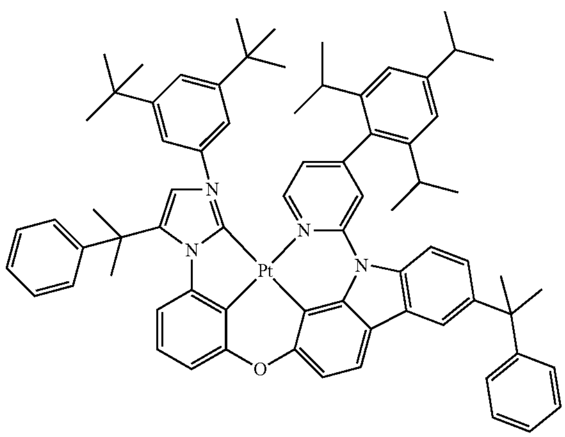
1348
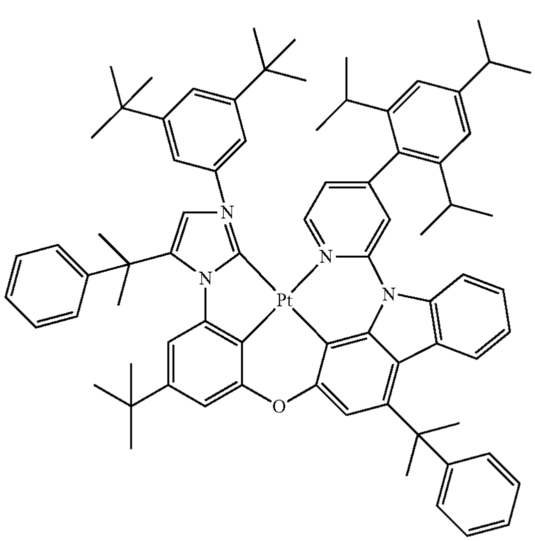
-continued
1349
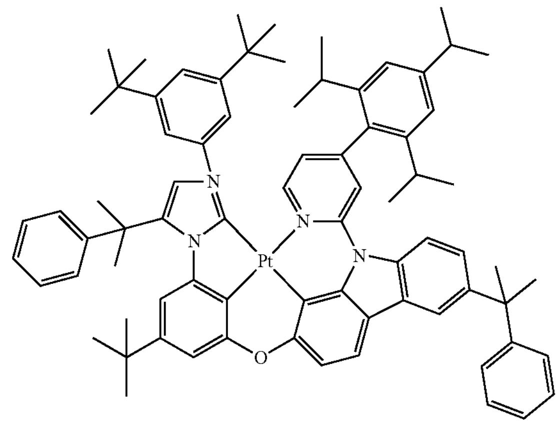
1350
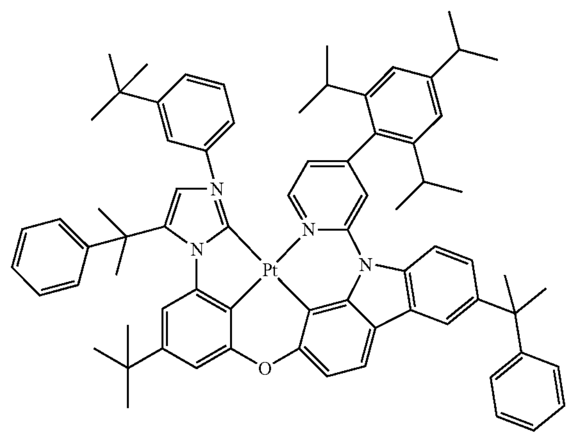
1351
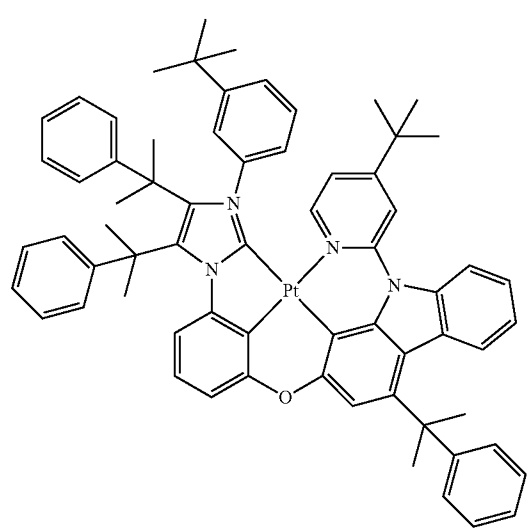

-continued
1352
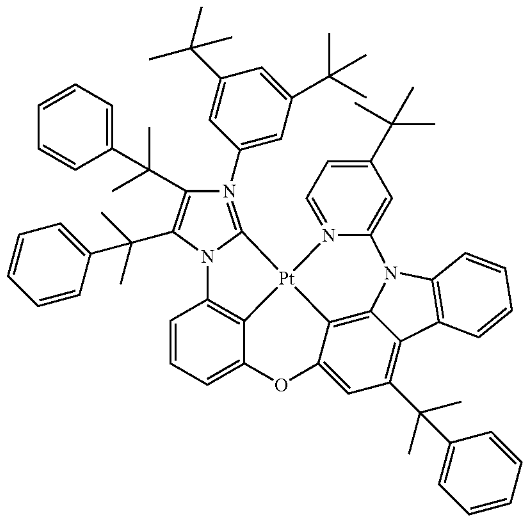
1353
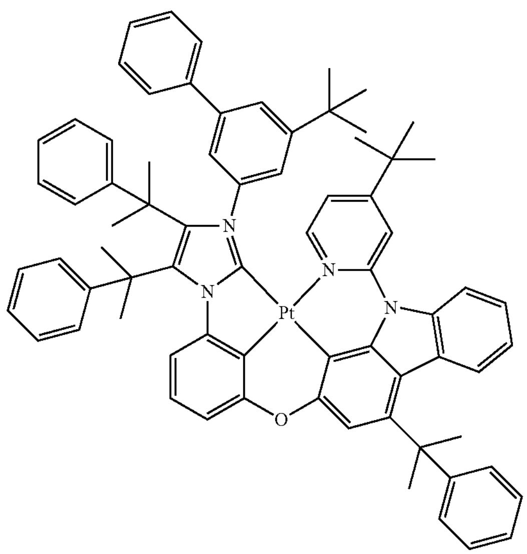
1354
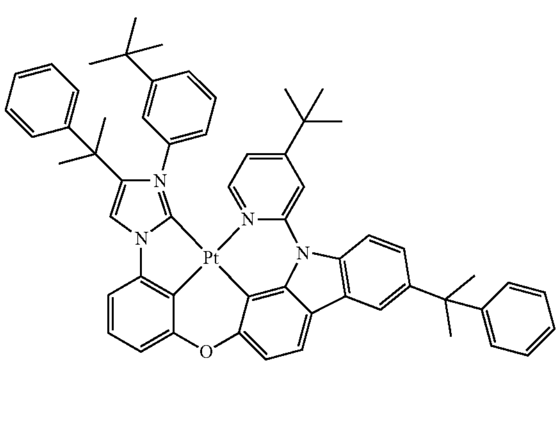
-continued
1355
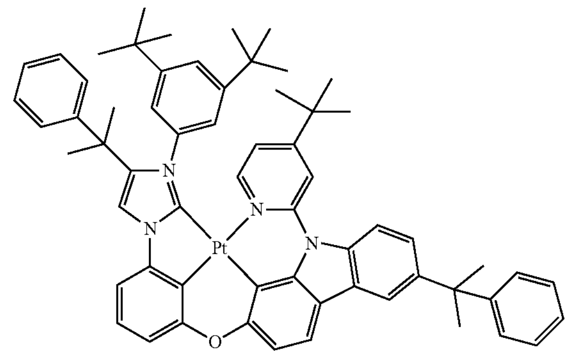
1356
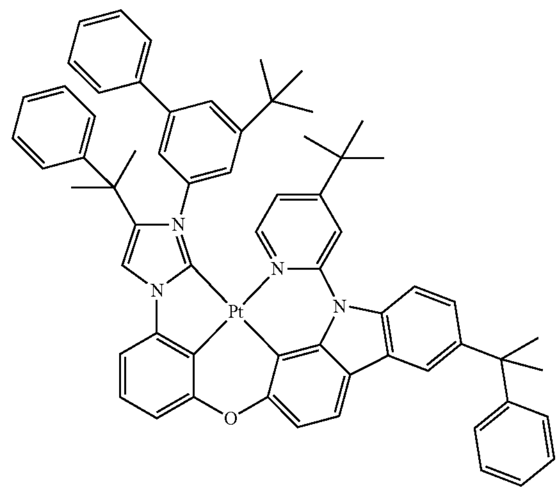
1357
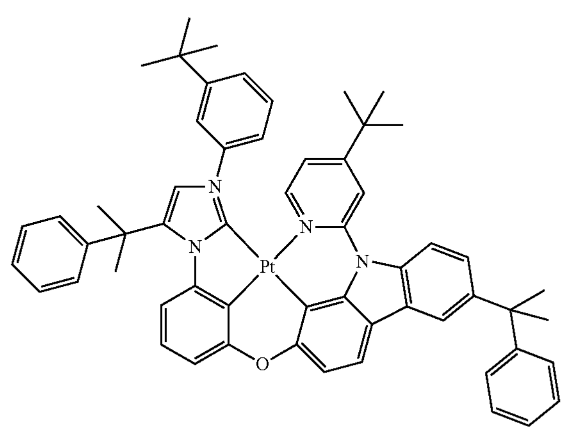

-continued
1358
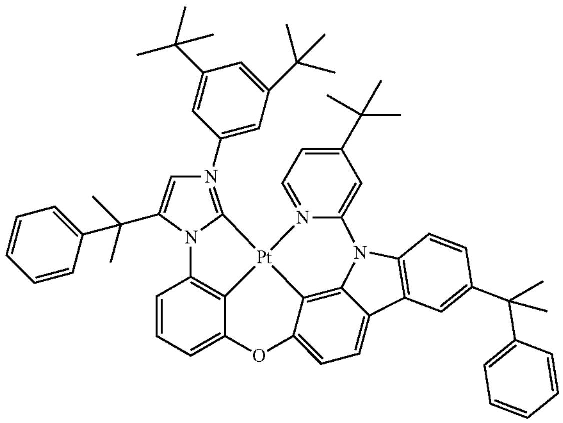
1359
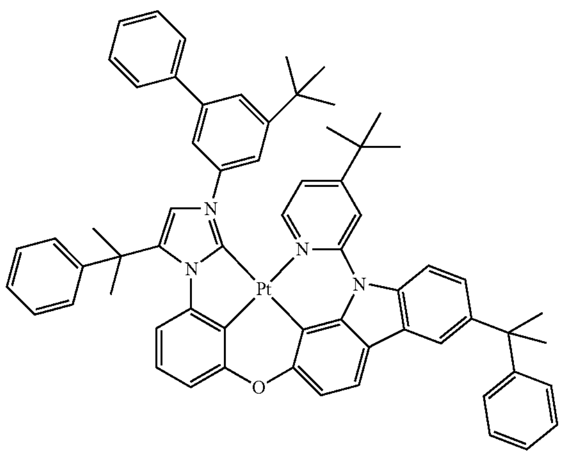
1360
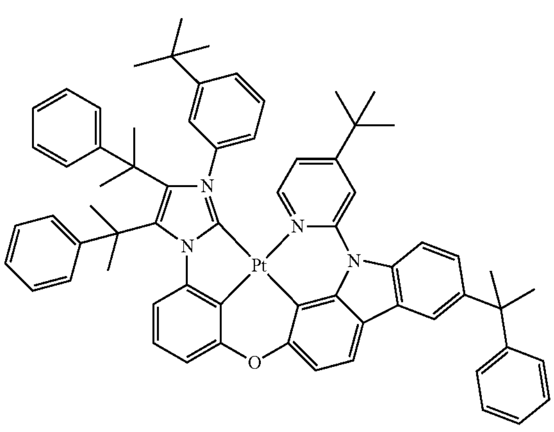
-continued
1361
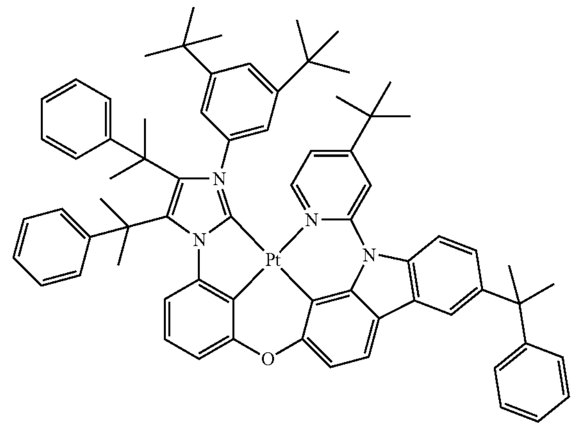
1362
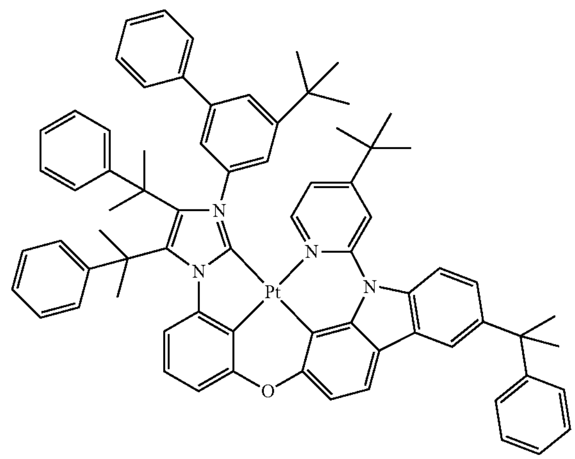
1363
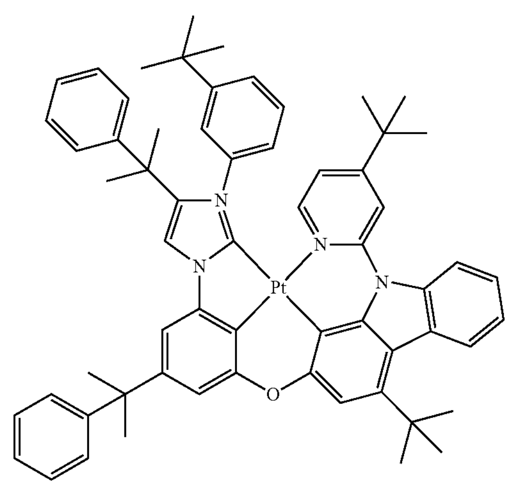

-continued
1364
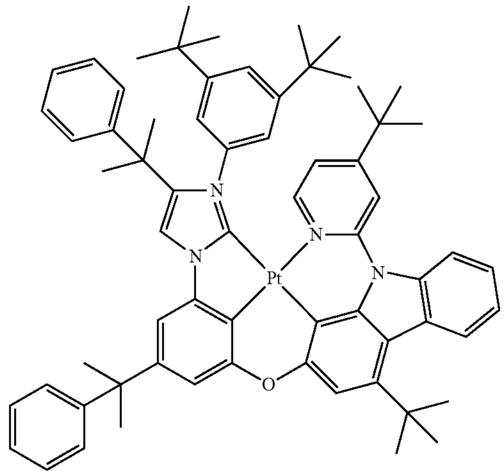
1365
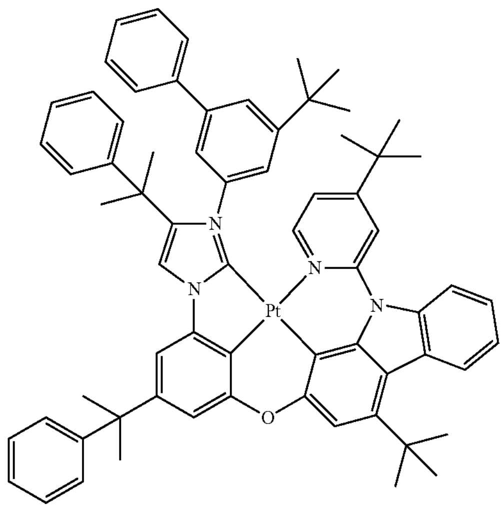
1366
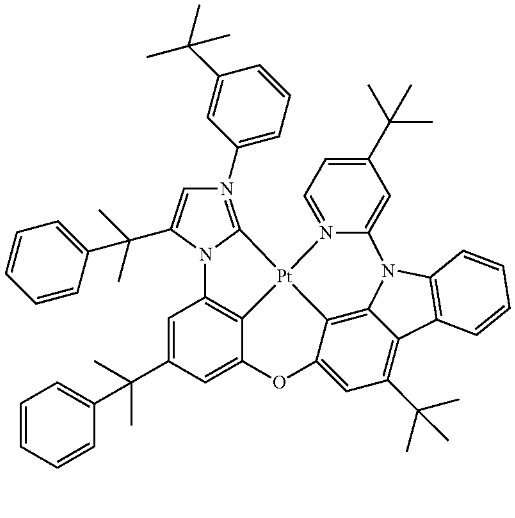
-continued
1367
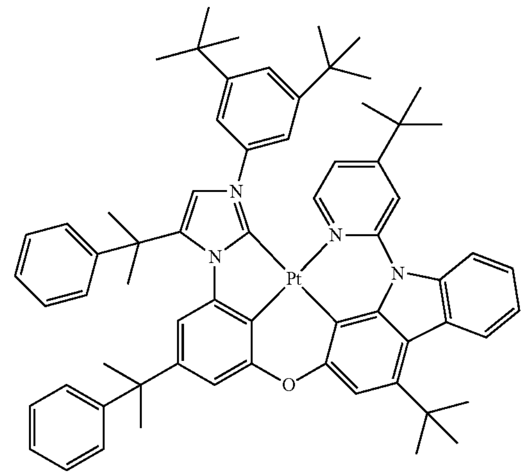
1368
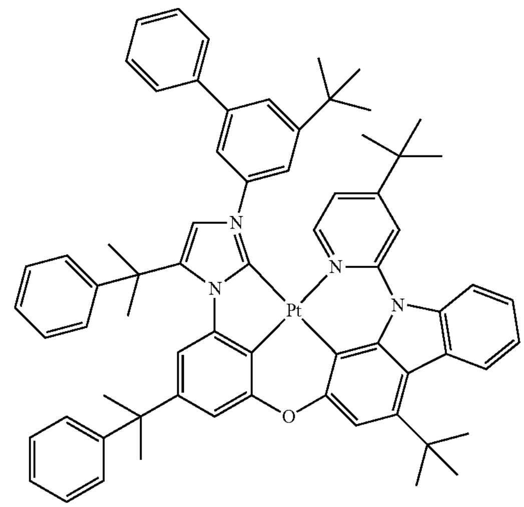
1369
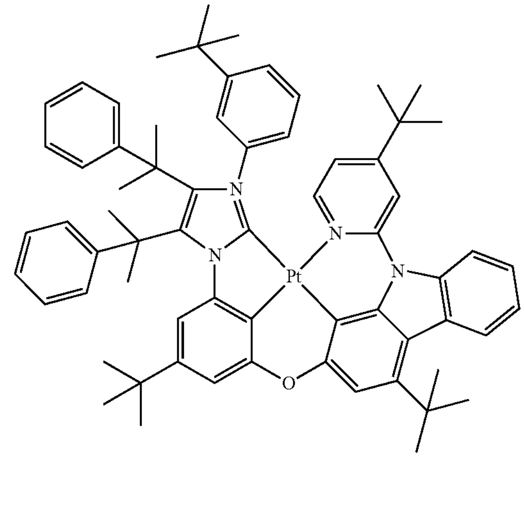

1370
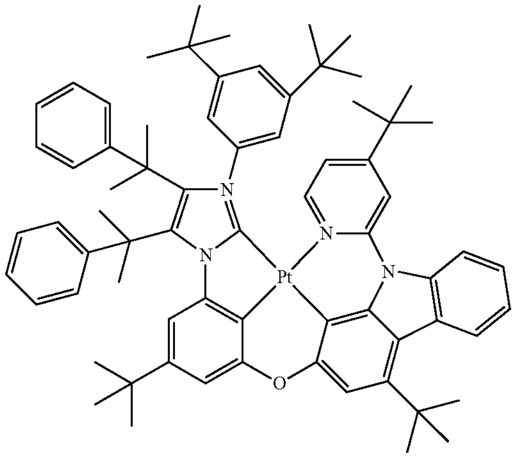
1371
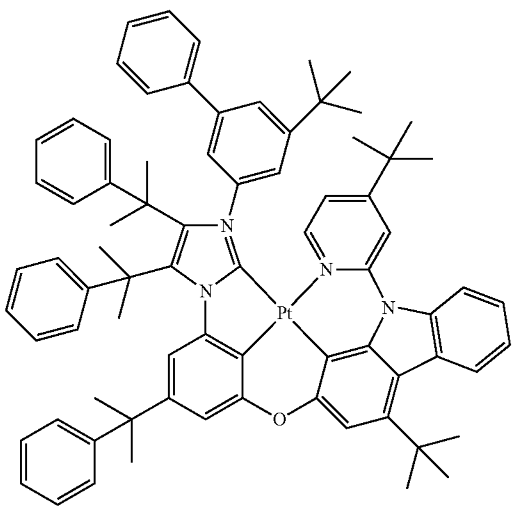
1372
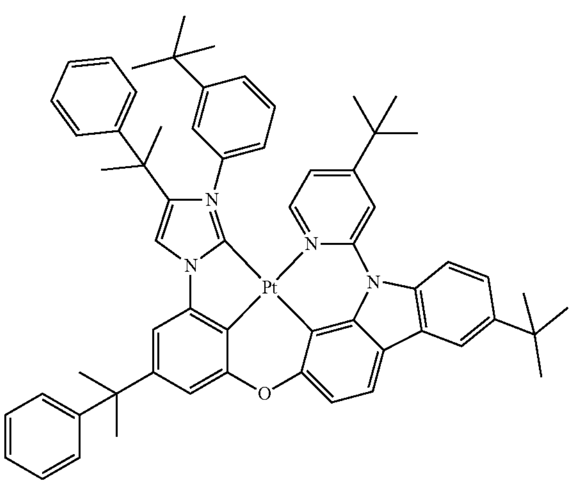
1373
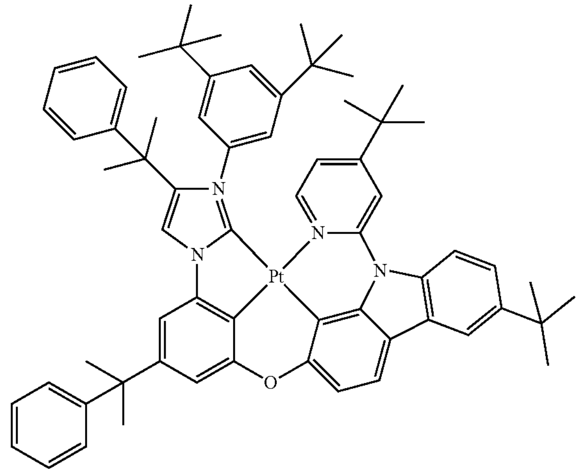
1374
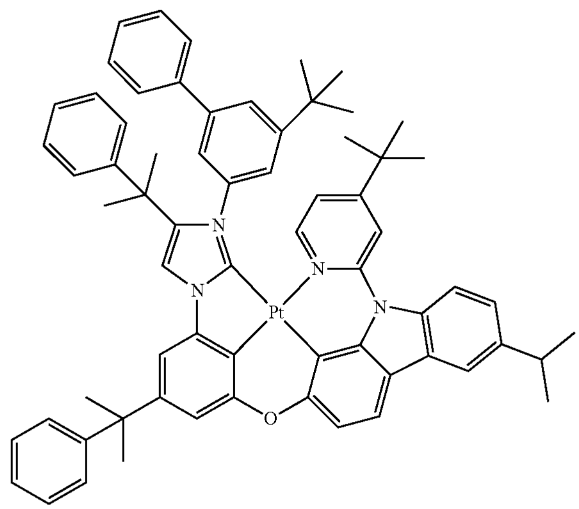
1375
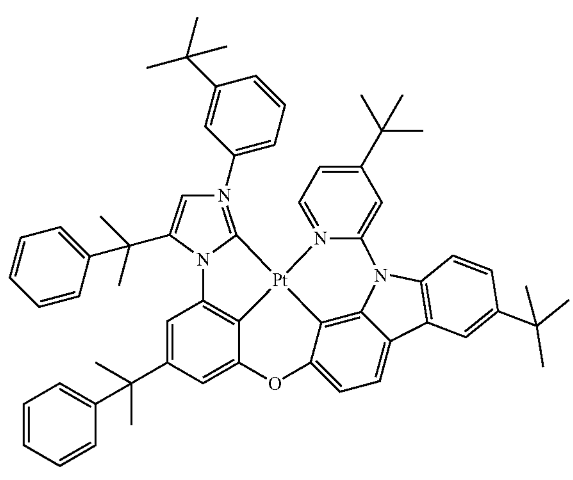

1376
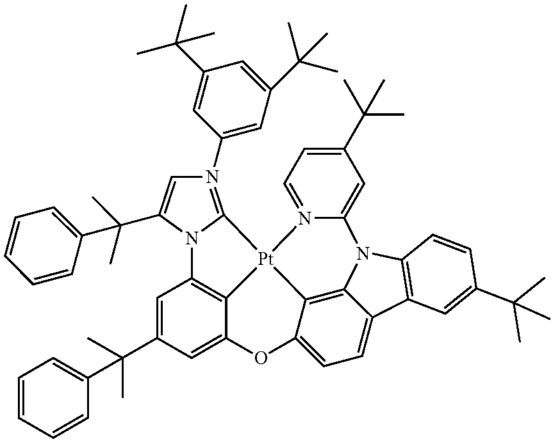
1377
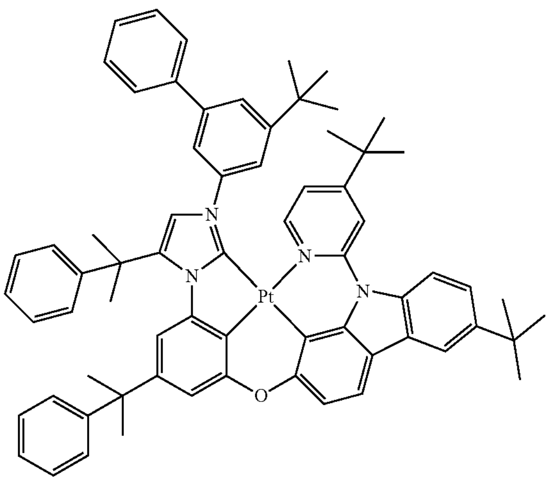
1378
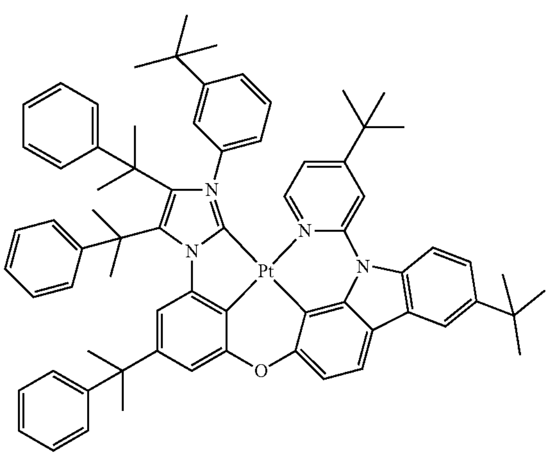
1379
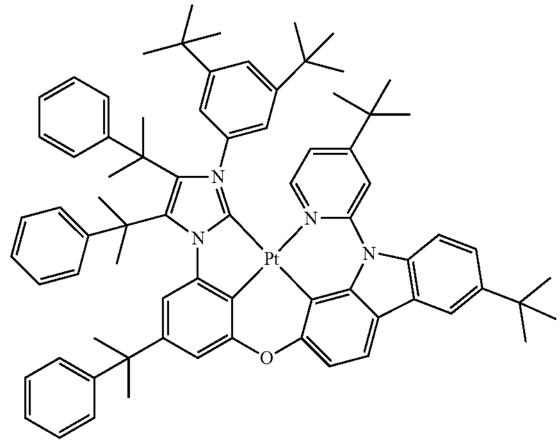
1380
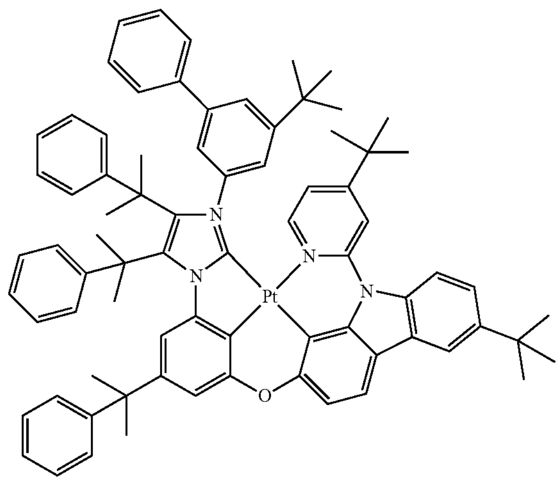
1381
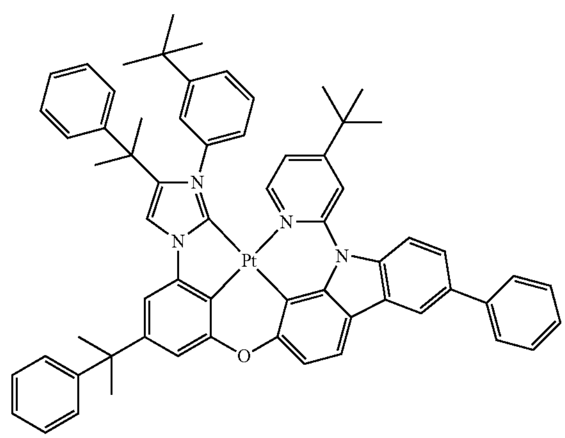

-continued
1382
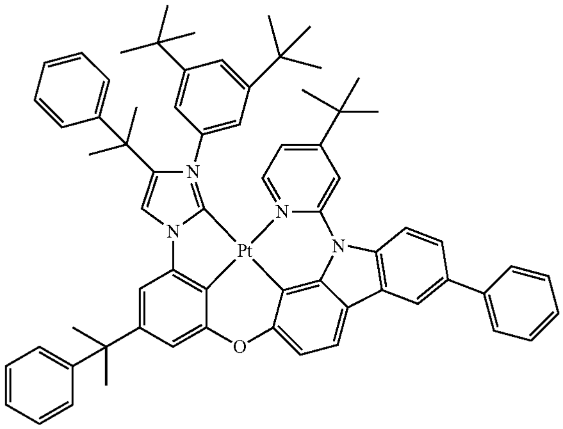
1383
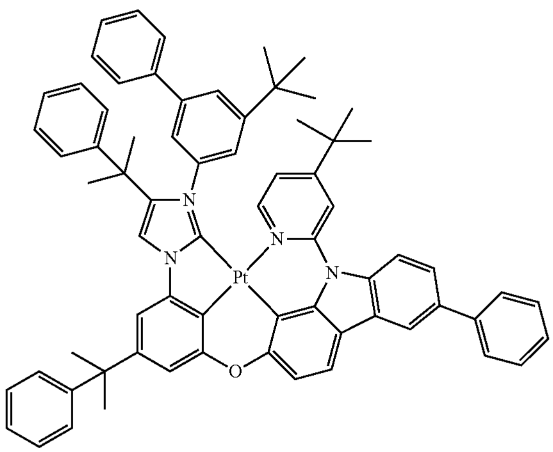
1384
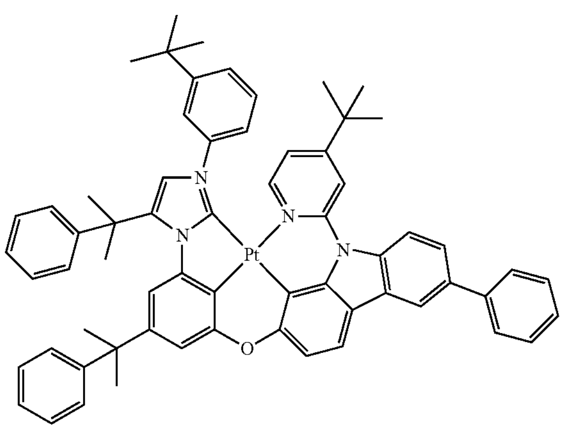
-continued
1385
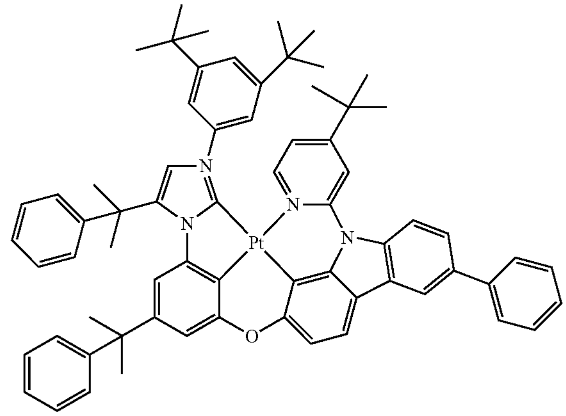
1386
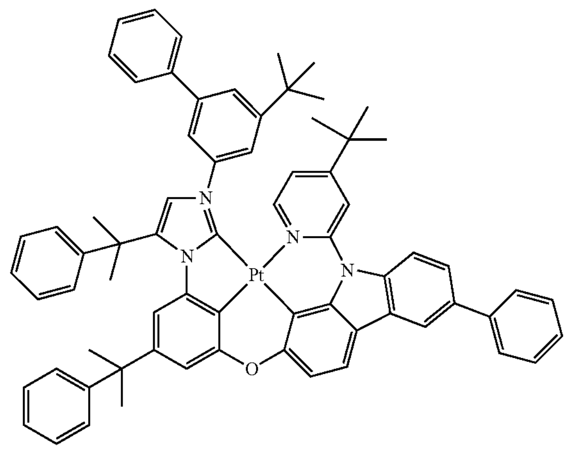
1387
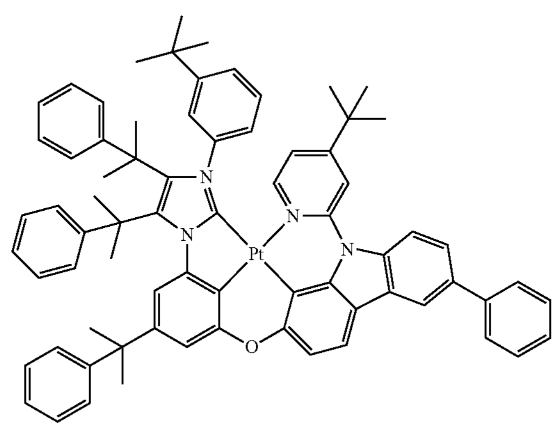

1388
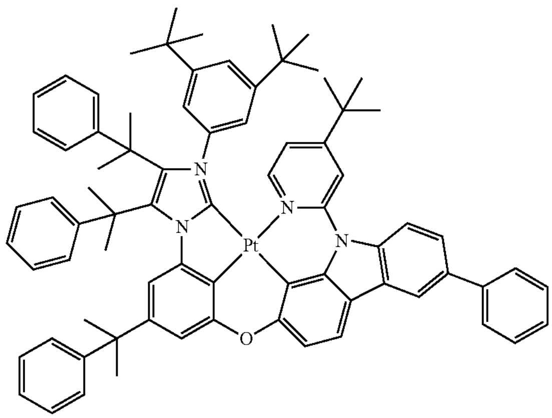
1389
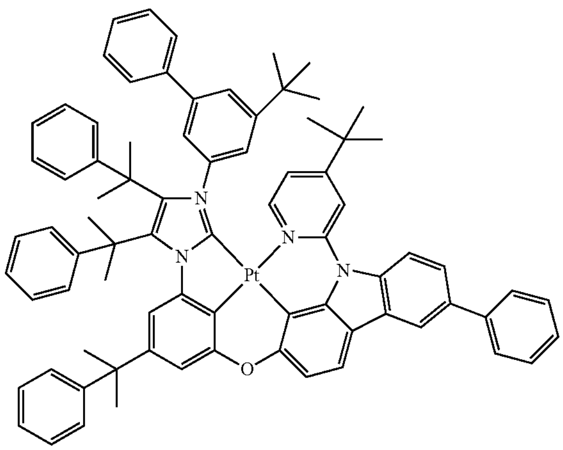
1390
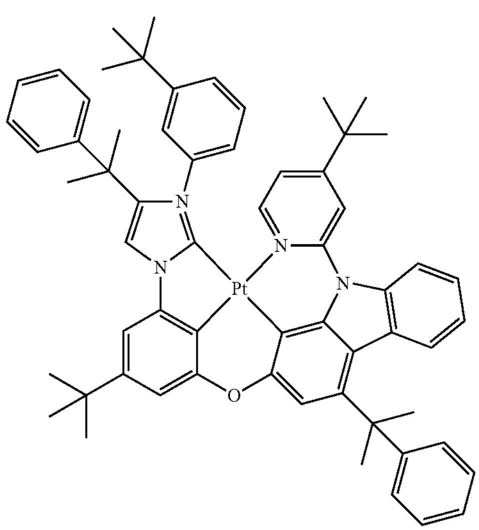
1391
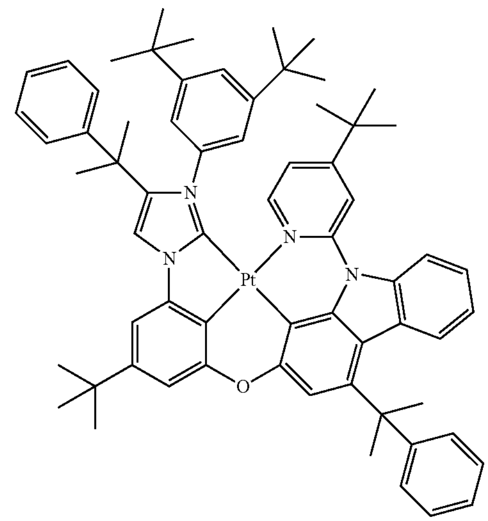
1392
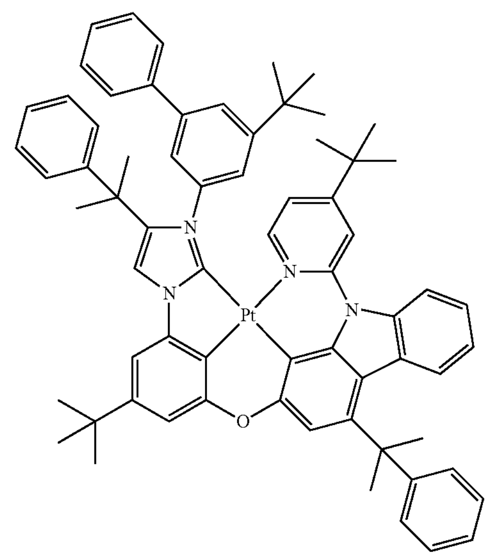
1393
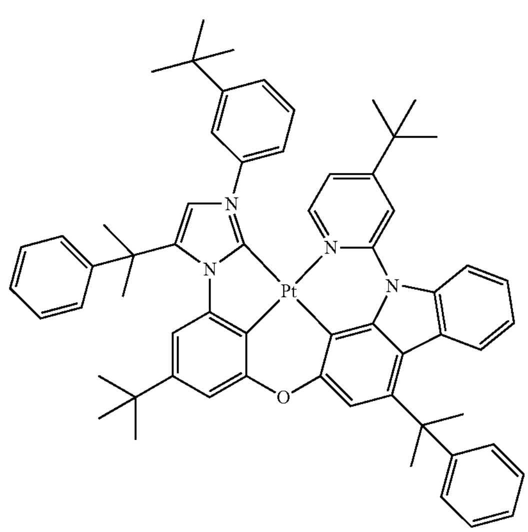

1394
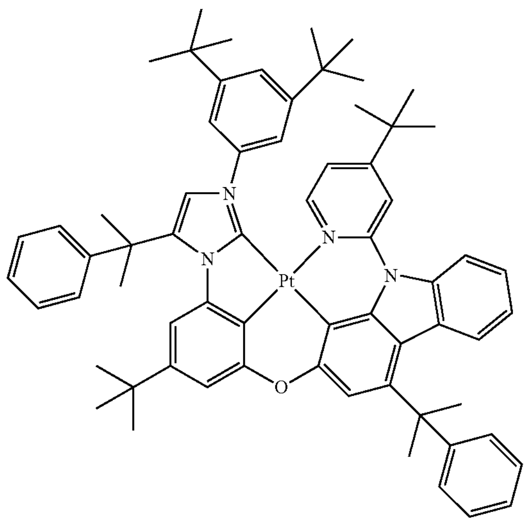
1395
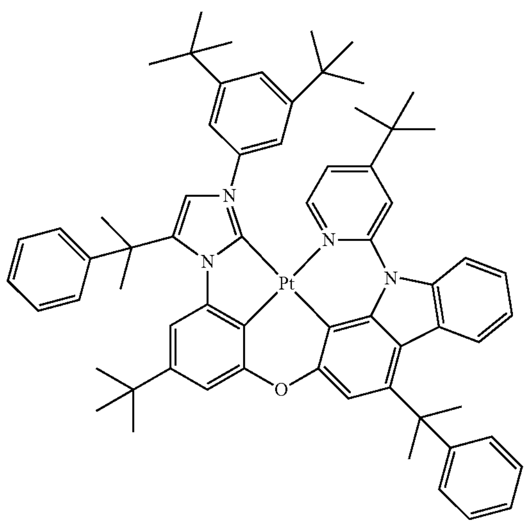
1396
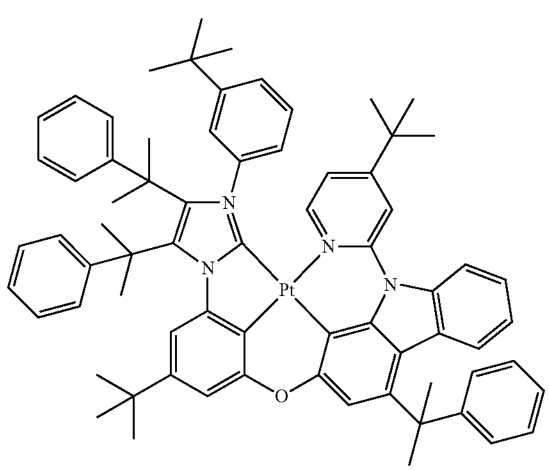
1397
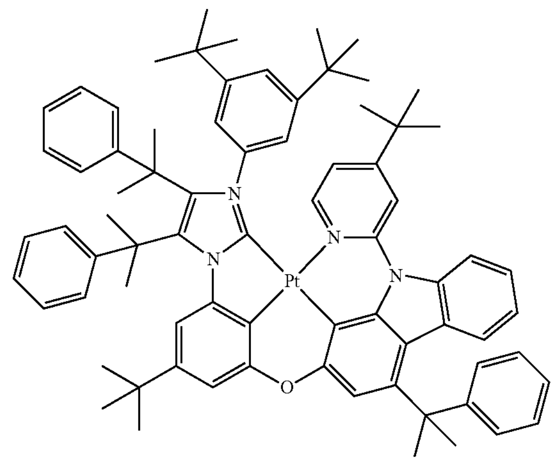
1398
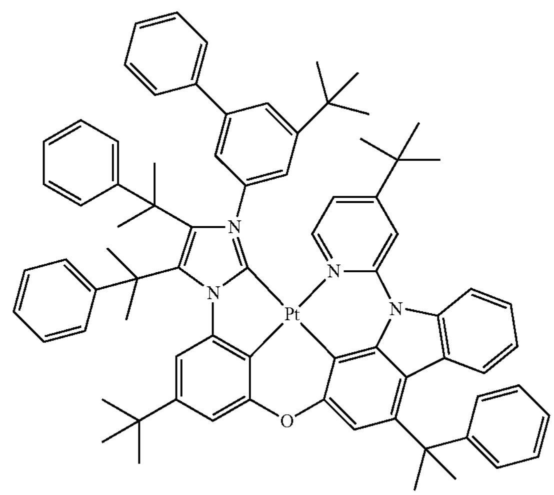
1399
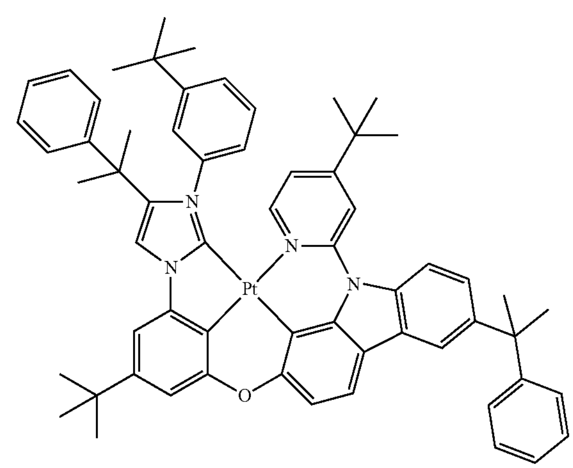

1400
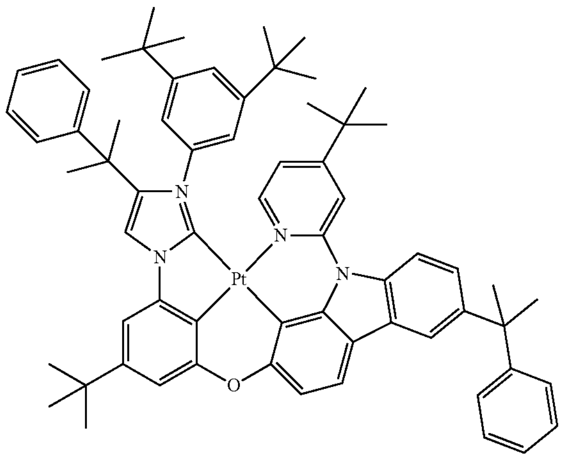
1401
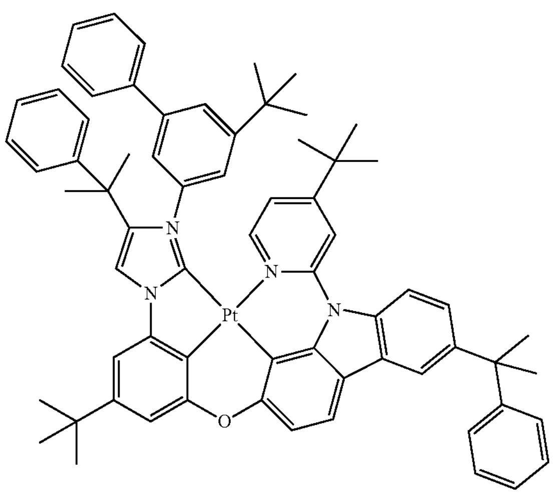
1402
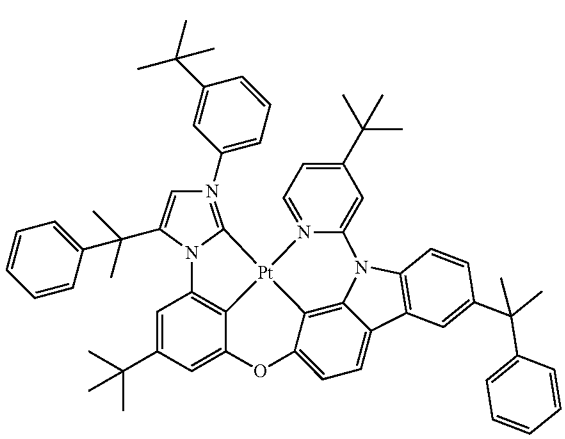
1403
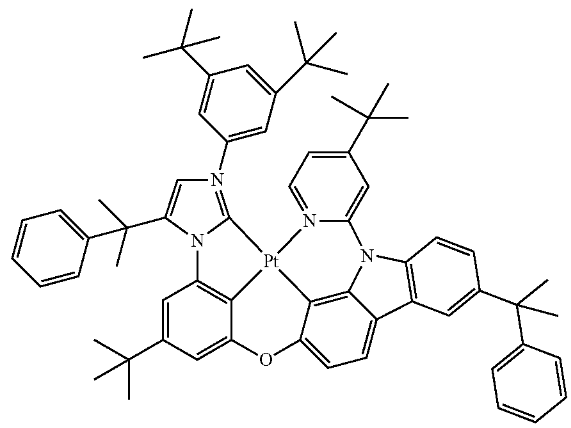
1404
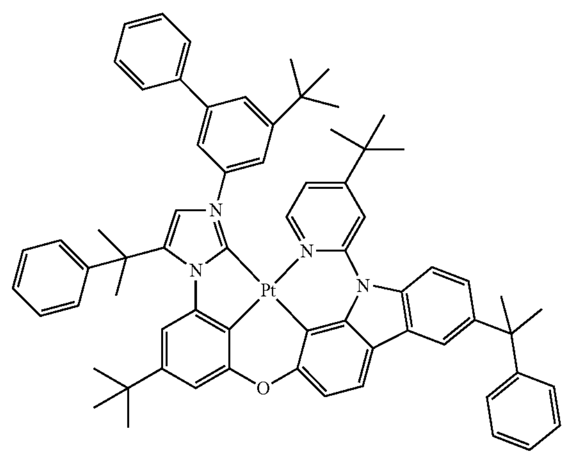
1405
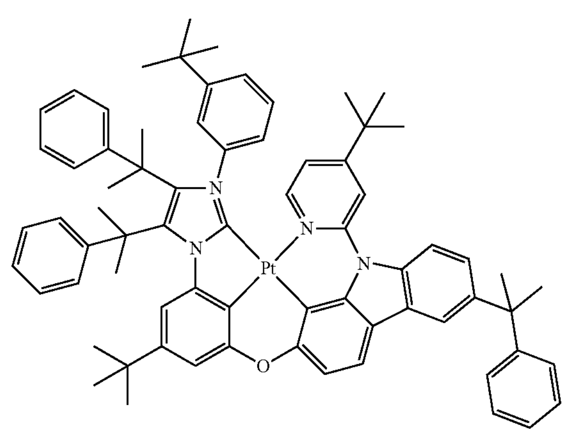

-continued
1406
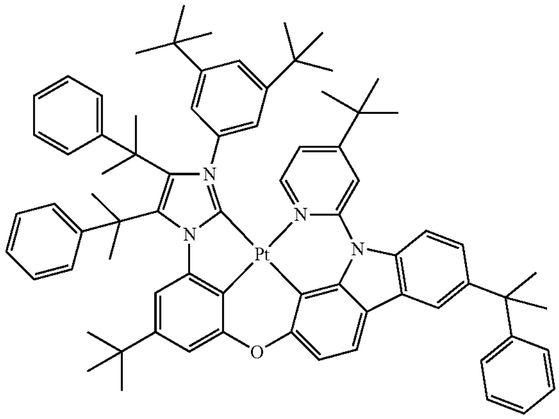
1407
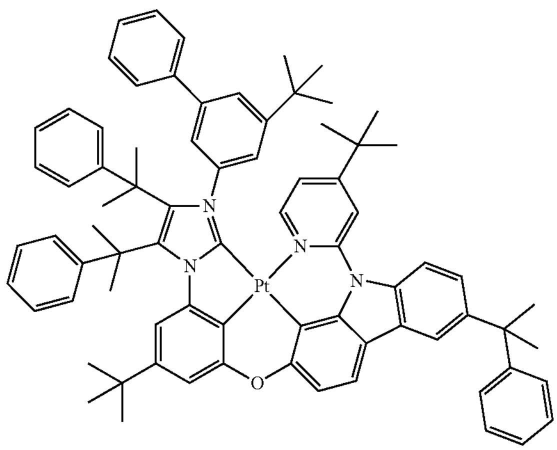
1408
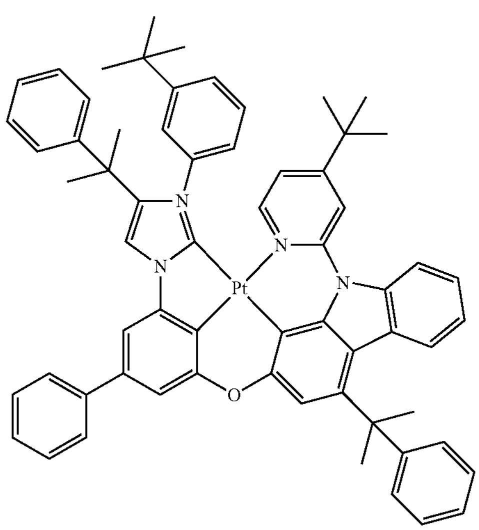
-continued
1409
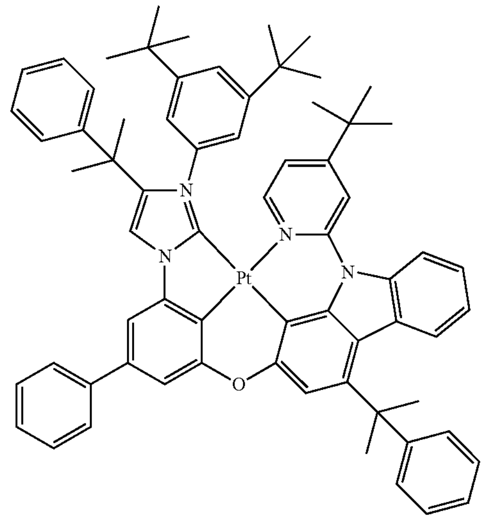
1410
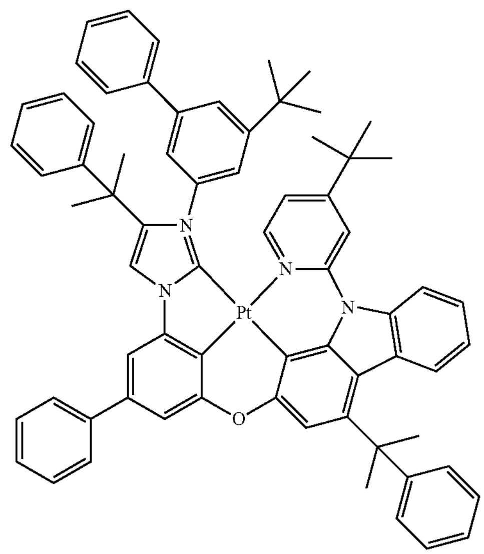
1411
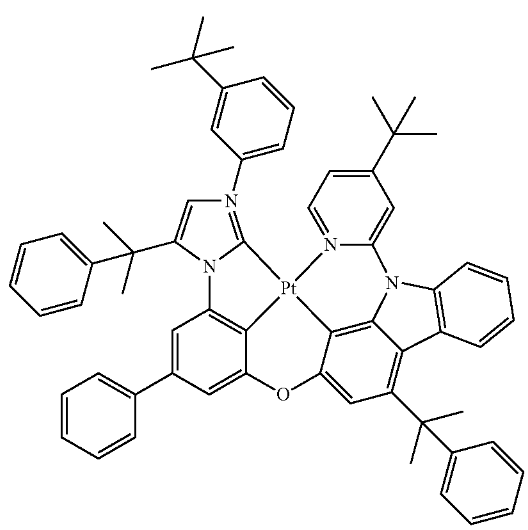

-continued
1412
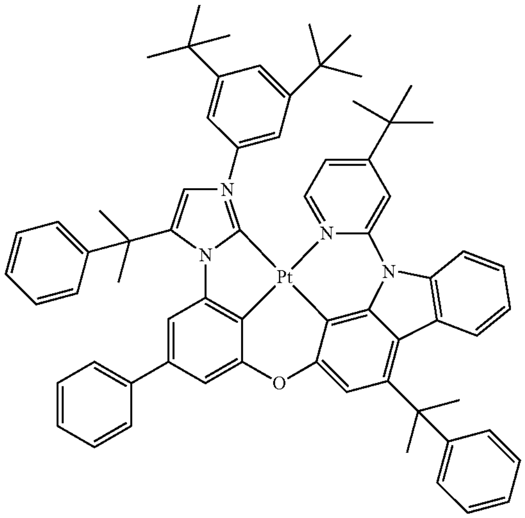
1413
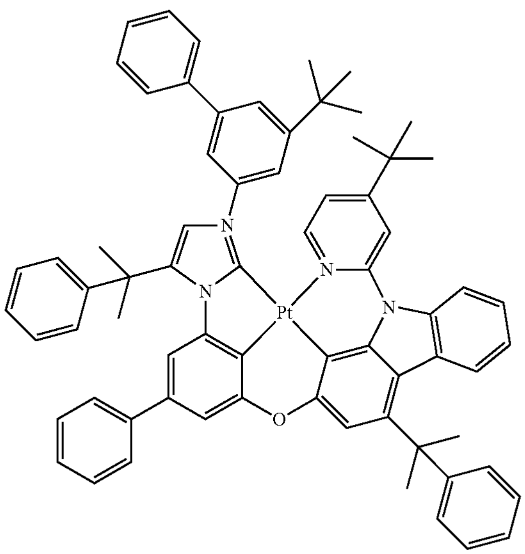
1414
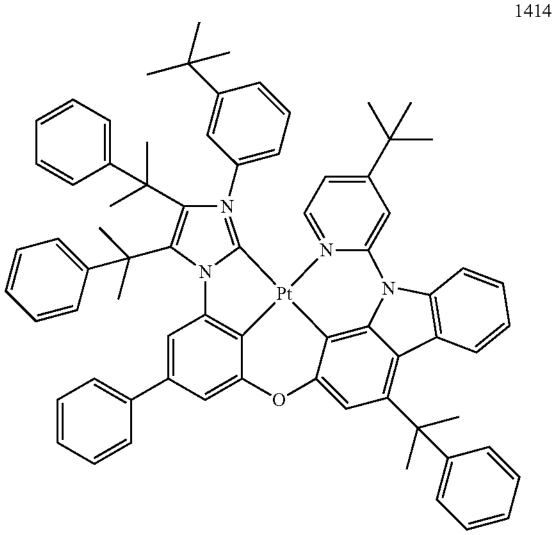
-continued
1415
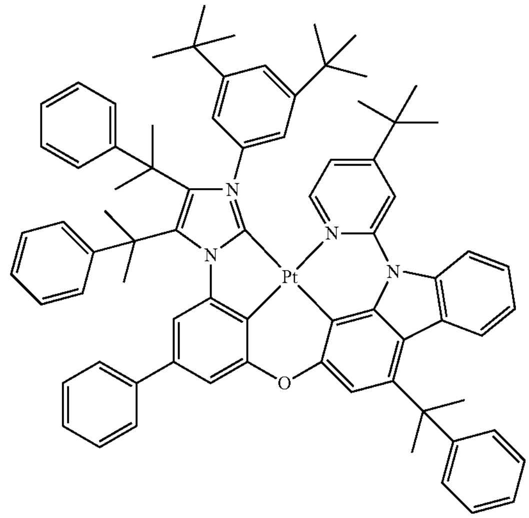
1416
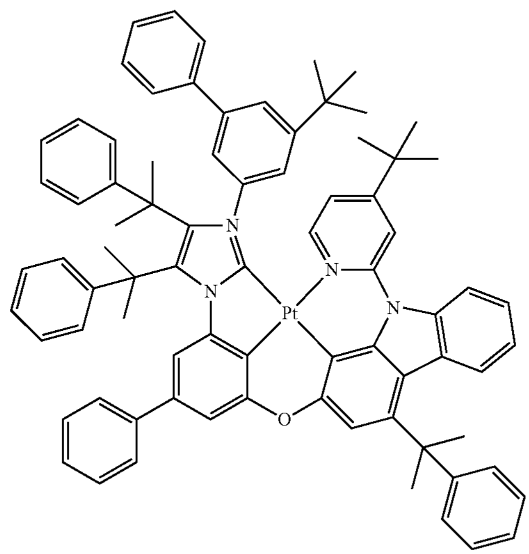
1417
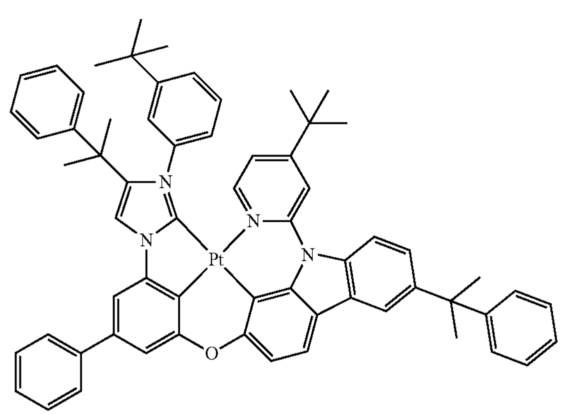

1418
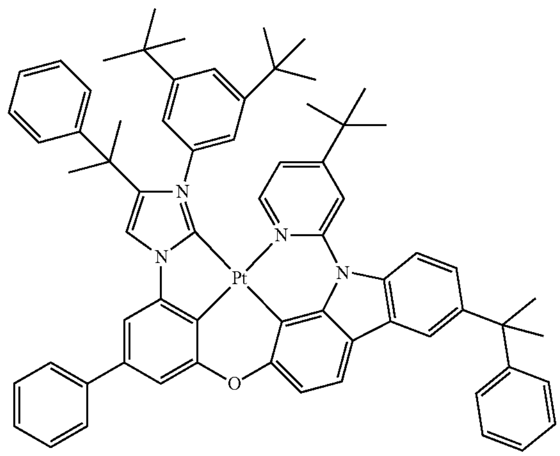
1419
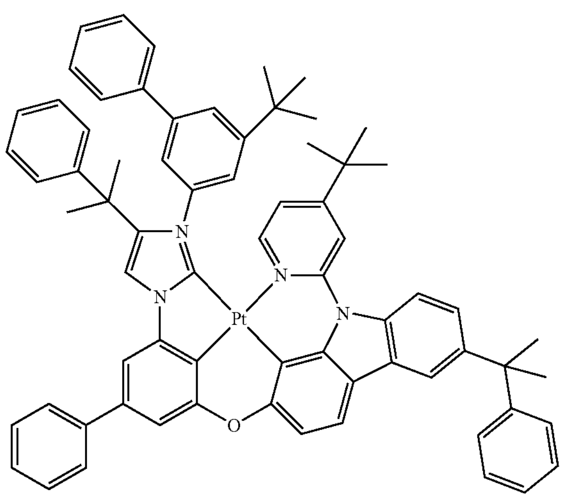
1420
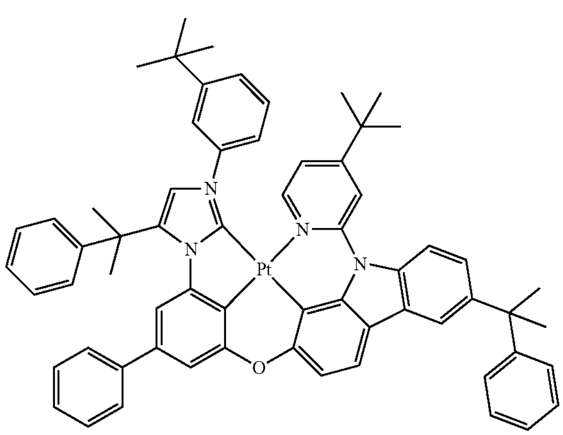
1421
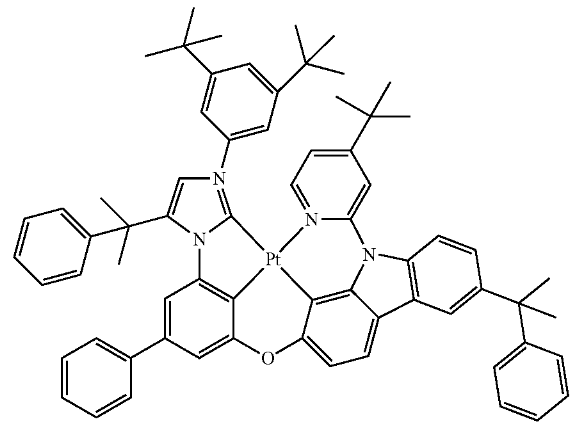
1422
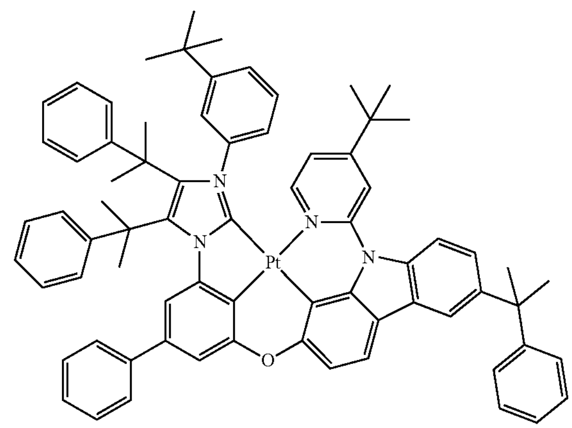
1423
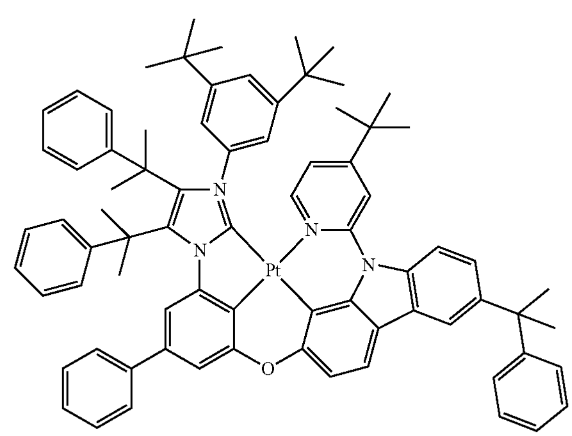

-continued
1424
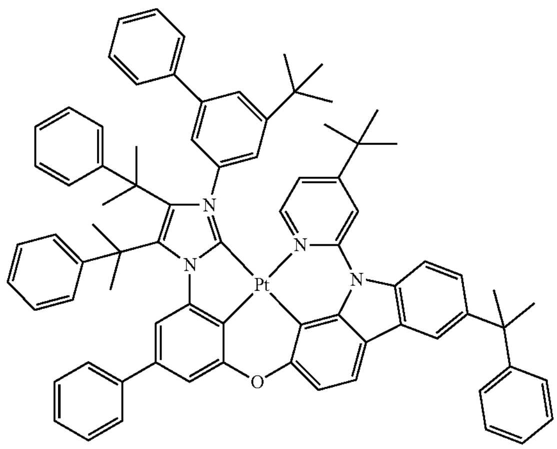
1425
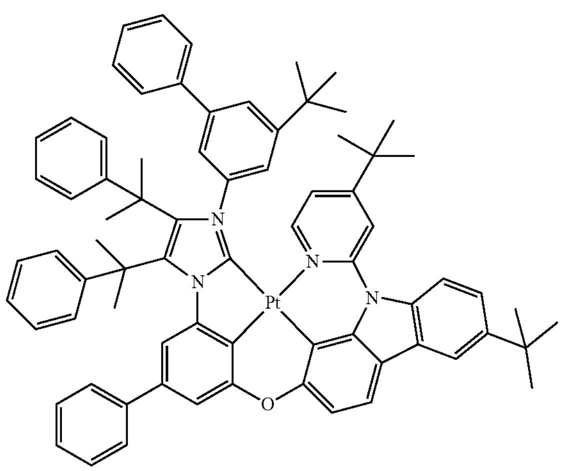
1426
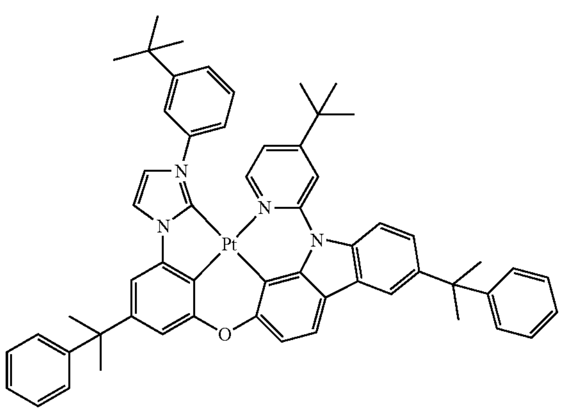
-continued
1427
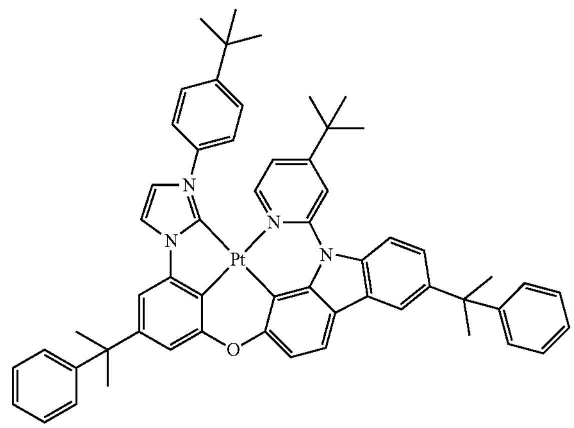
1428
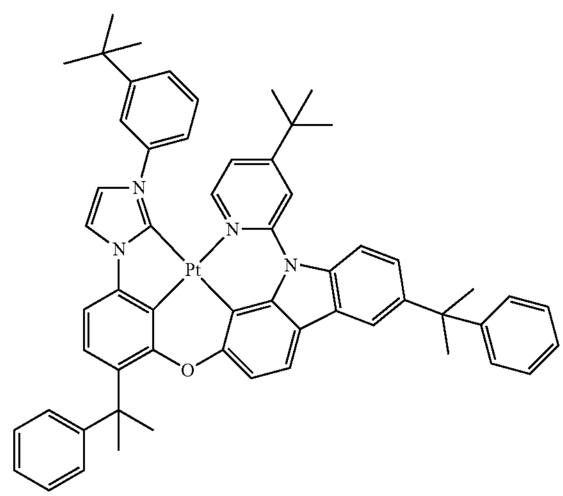
1429
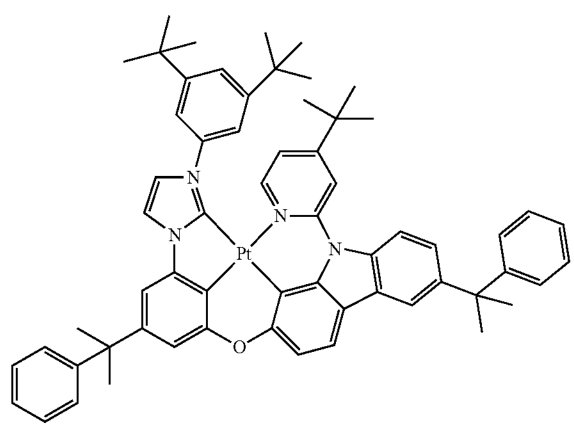

-continued
1430
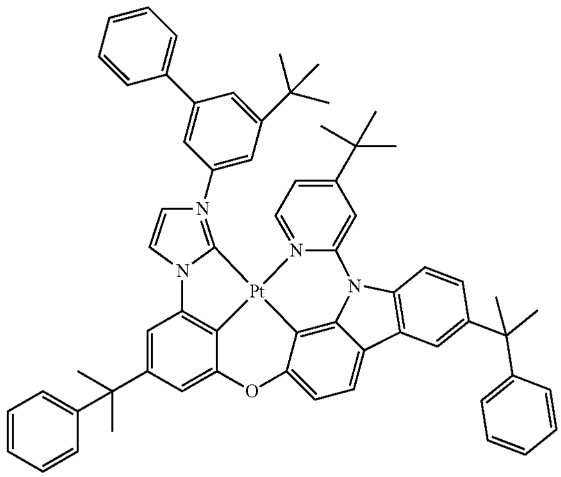
1431
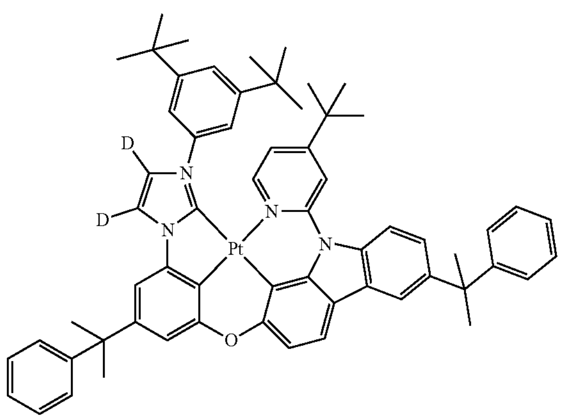
1432
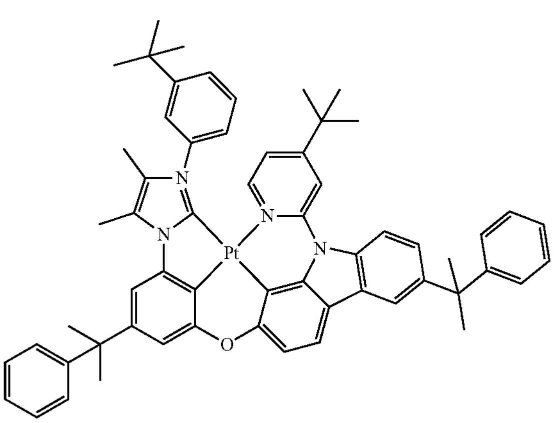
-continued
1433
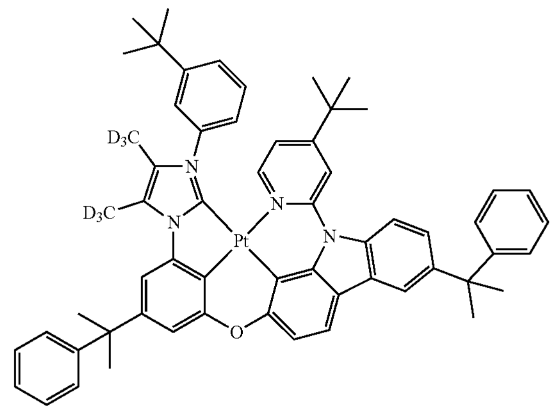
1434
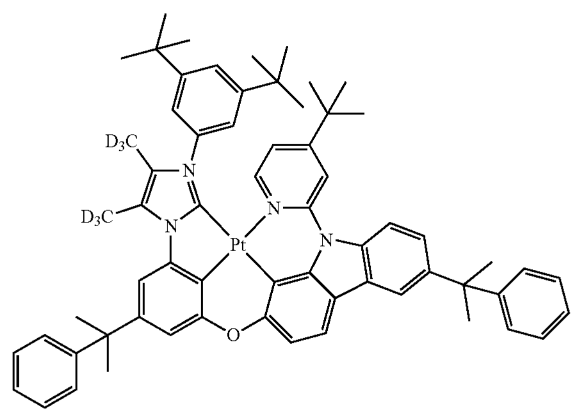
1435
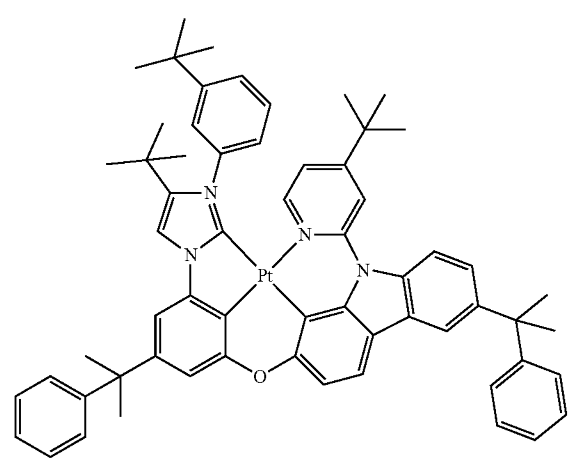

-continued
1436
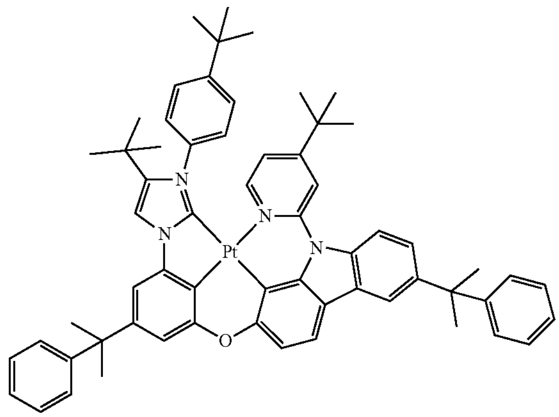
1437
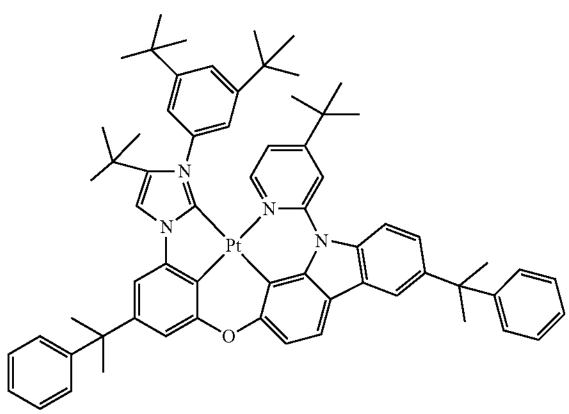
1438
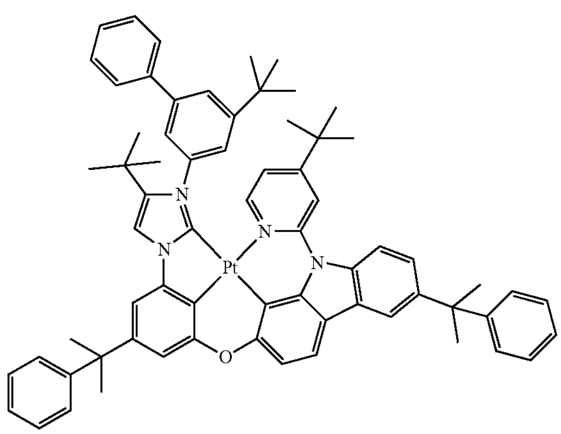
-continued
1439
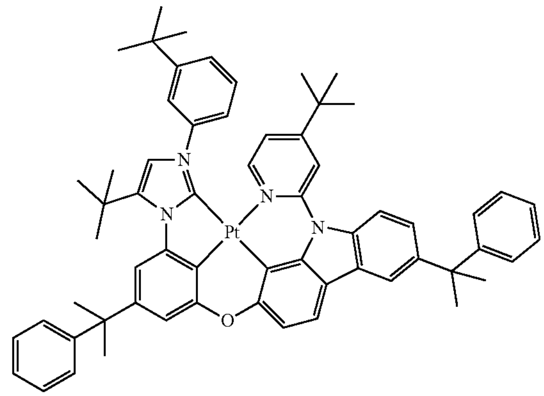
1440
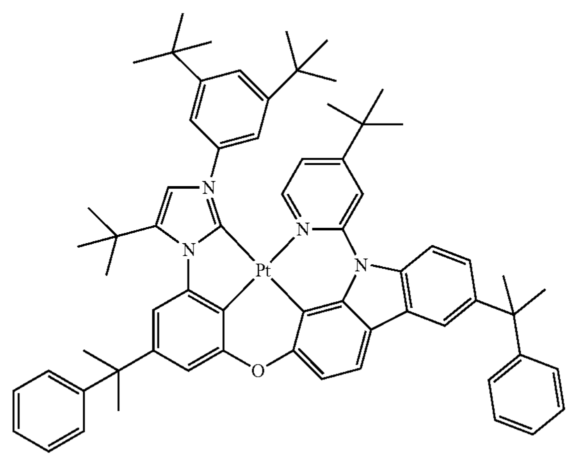
1441
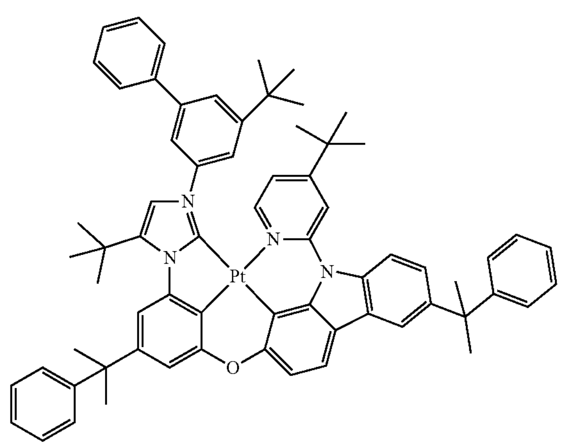

1442
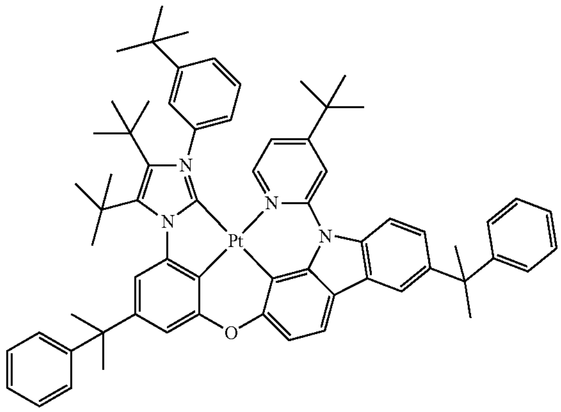
1443
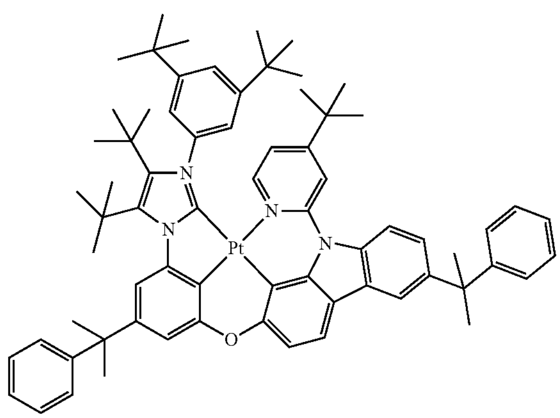
1444
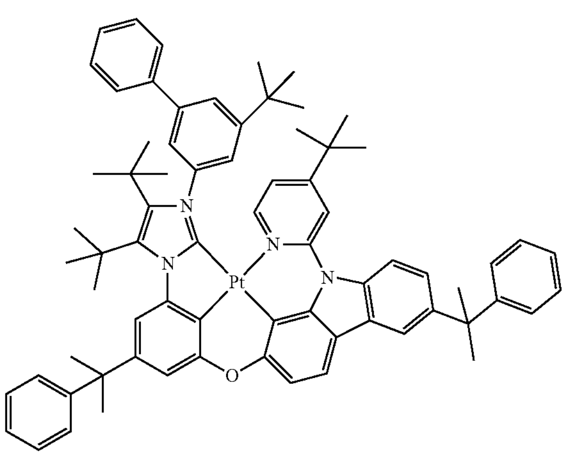
1445
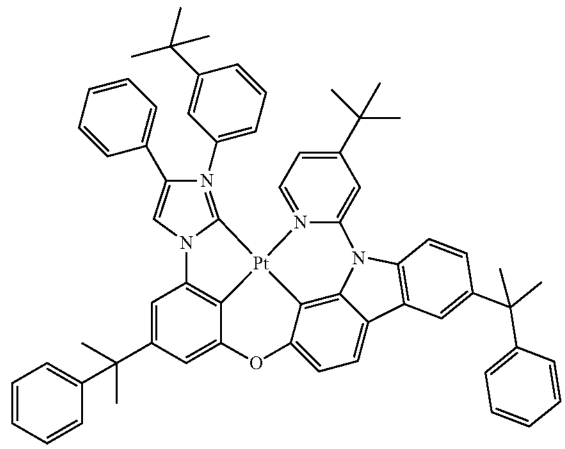
1446
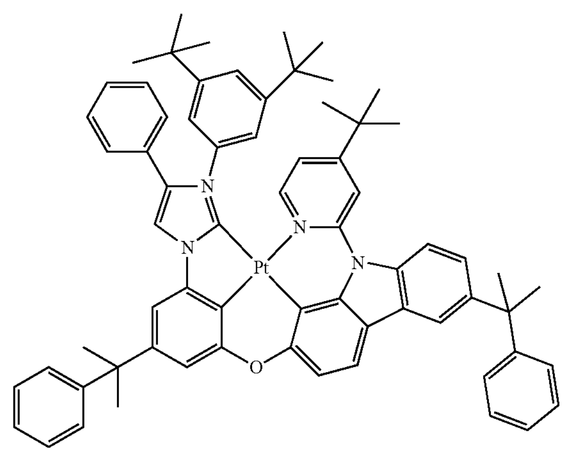
1447
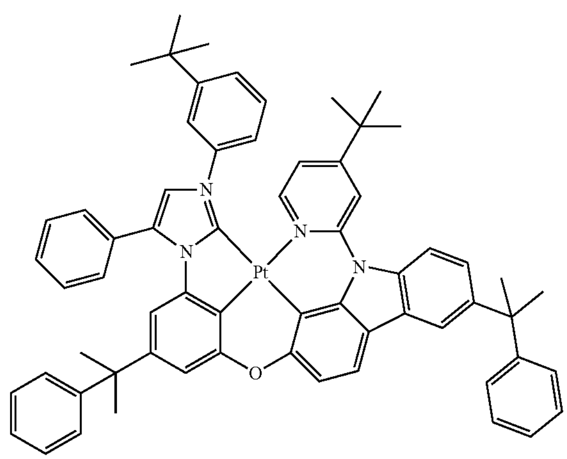

-continued
1448
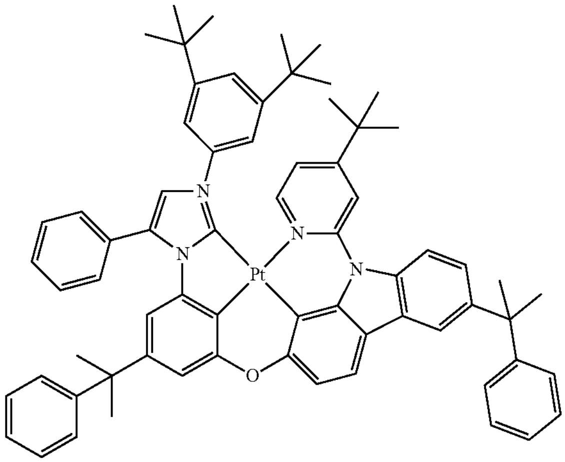
1449
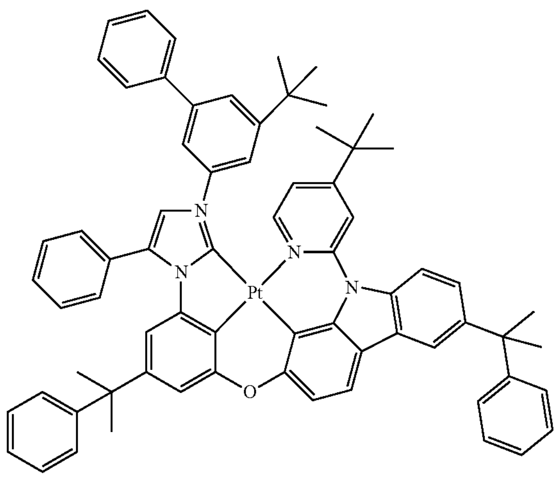
1450
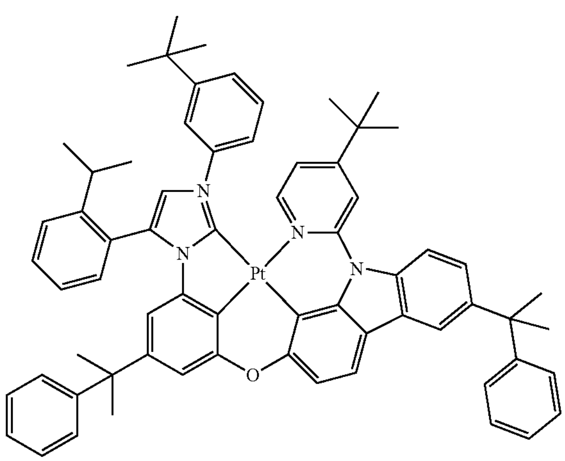
-continued
1451
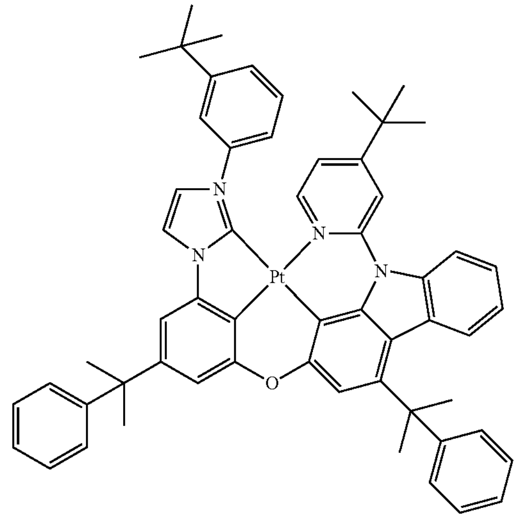
1452
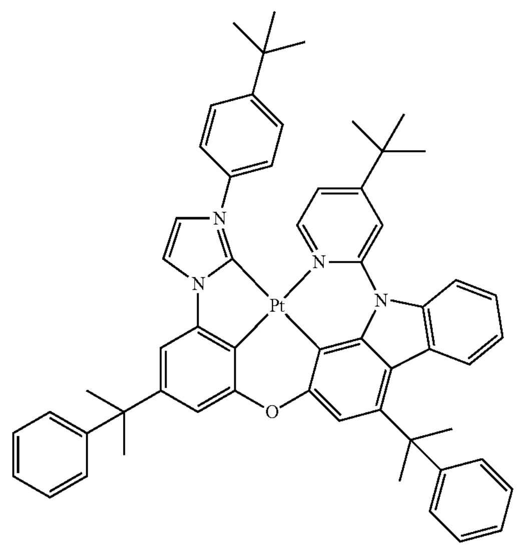
1453
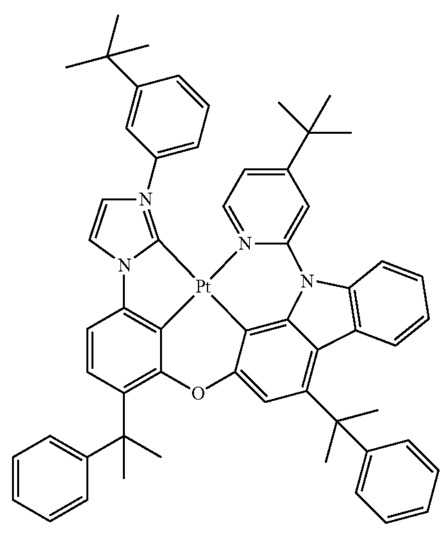

-continued
1454
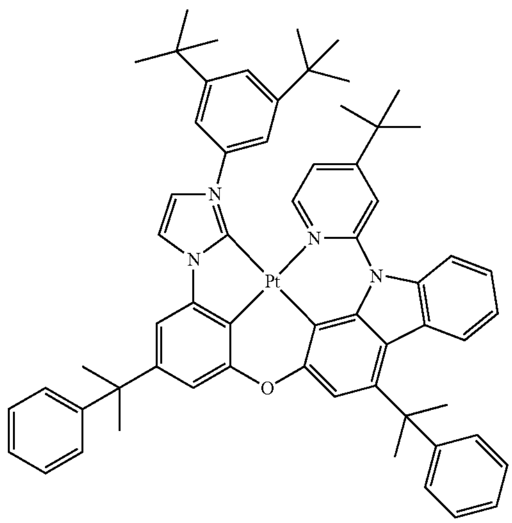
1455
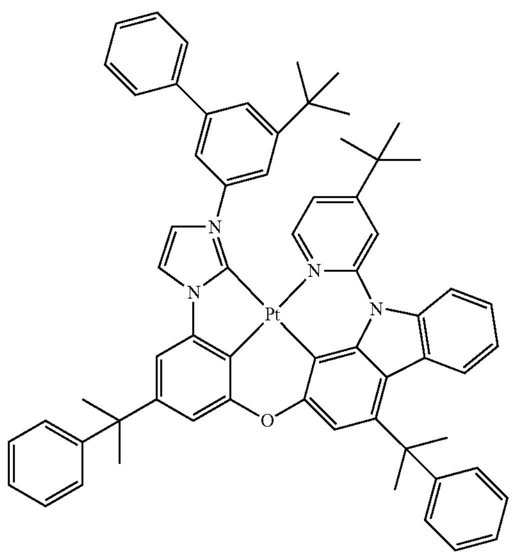
1456
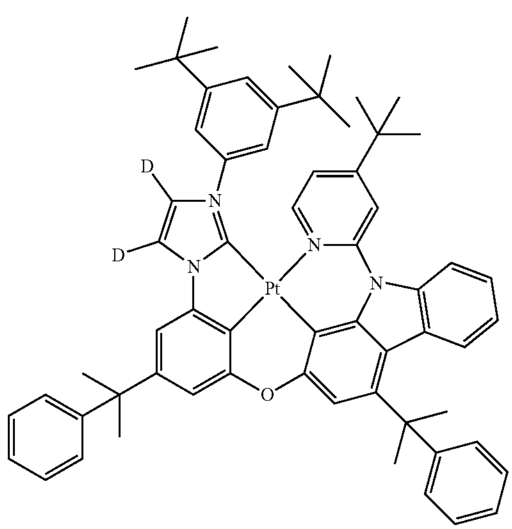
-continued
1457
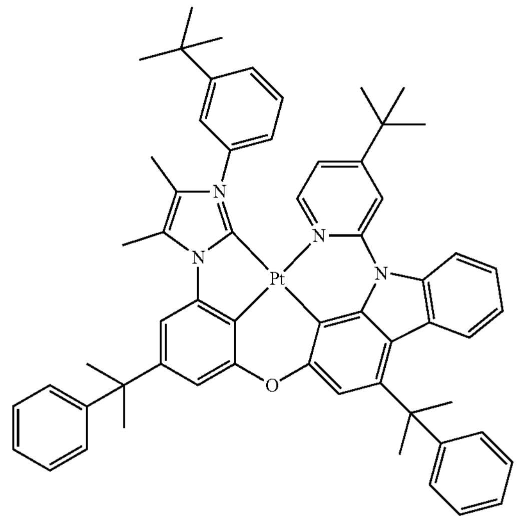
1458
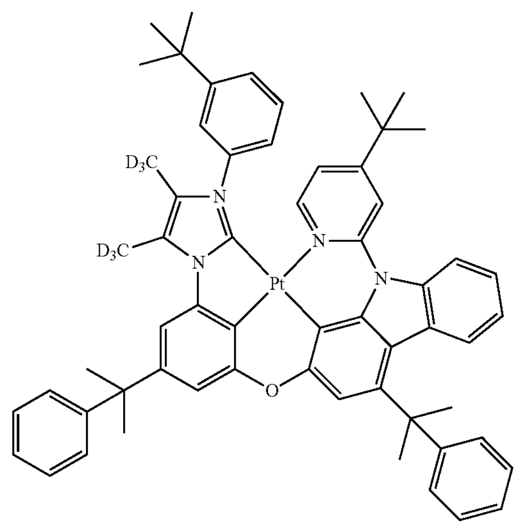
1459
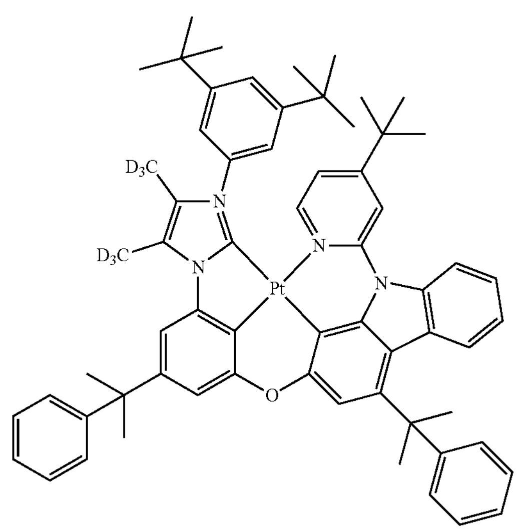

1460
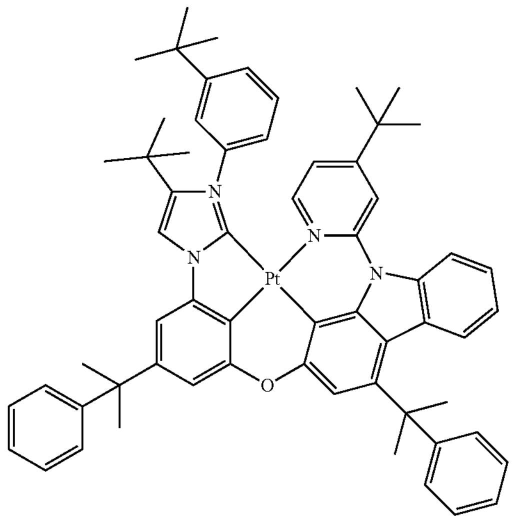
1461
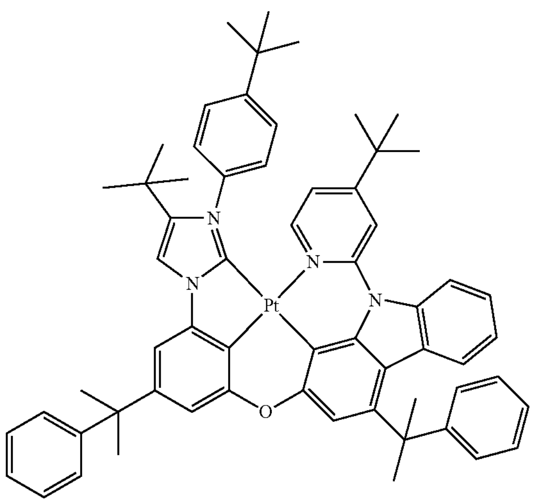
1462
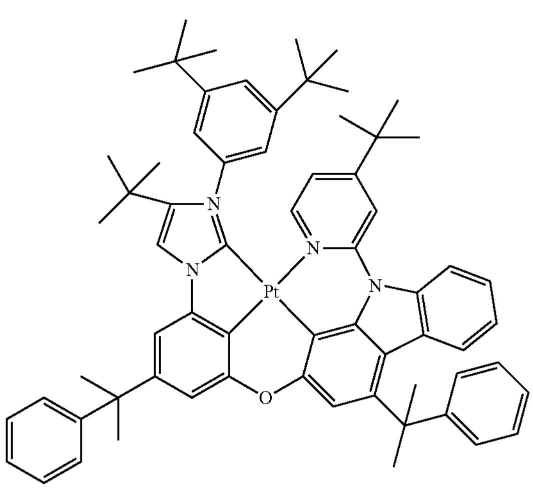
1463
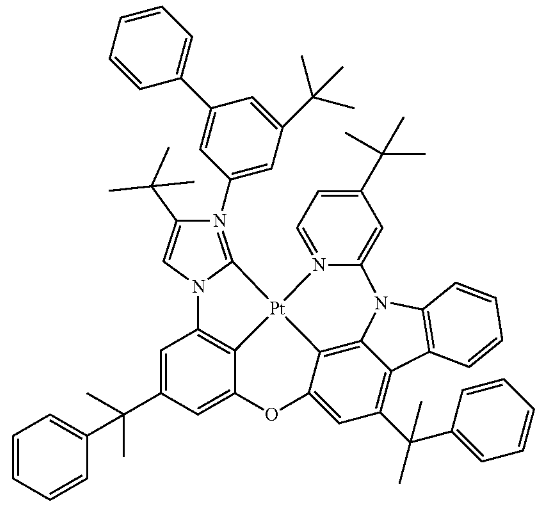
1464
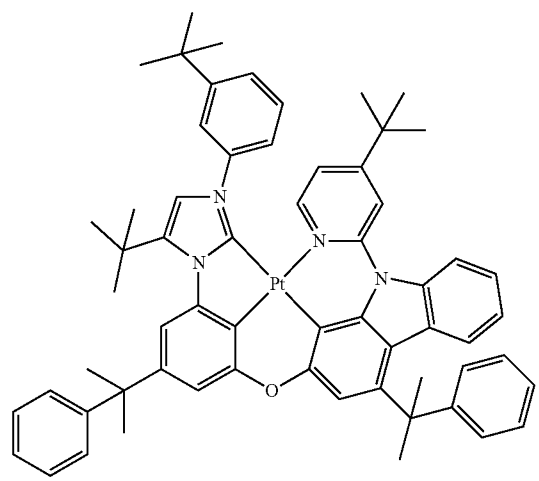
1465
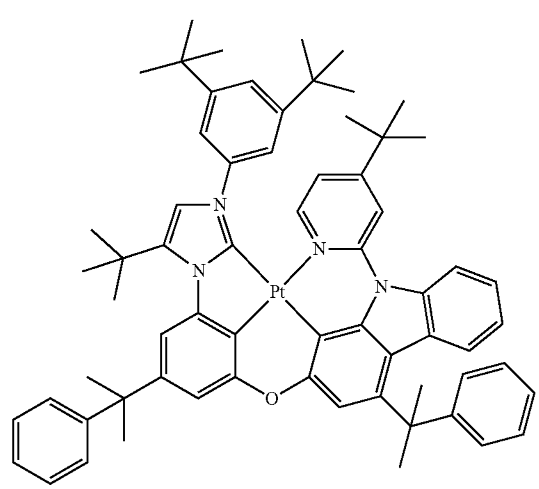

1466
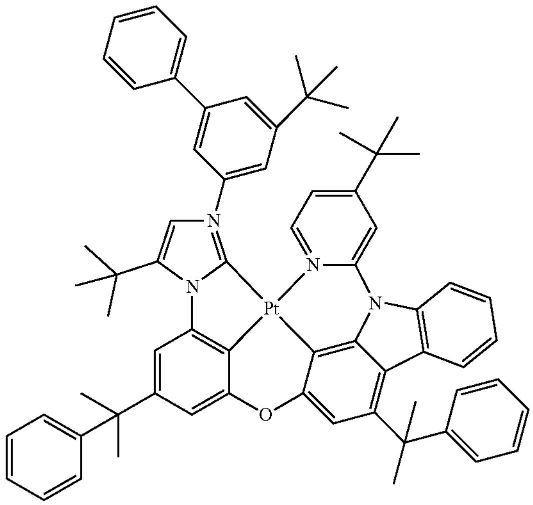
1467
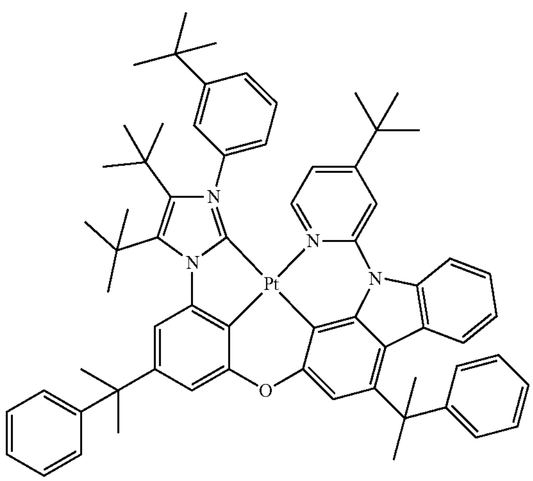
1468
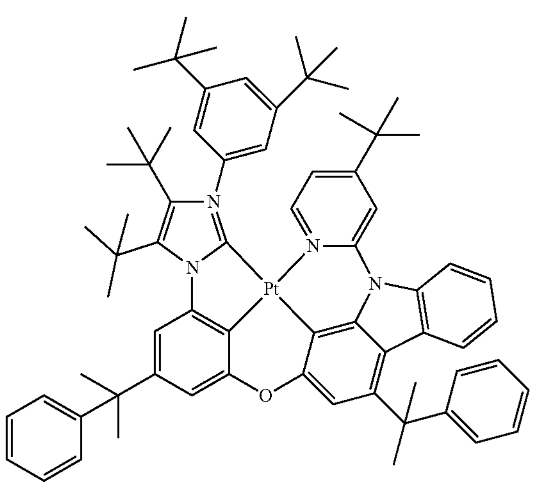
1469
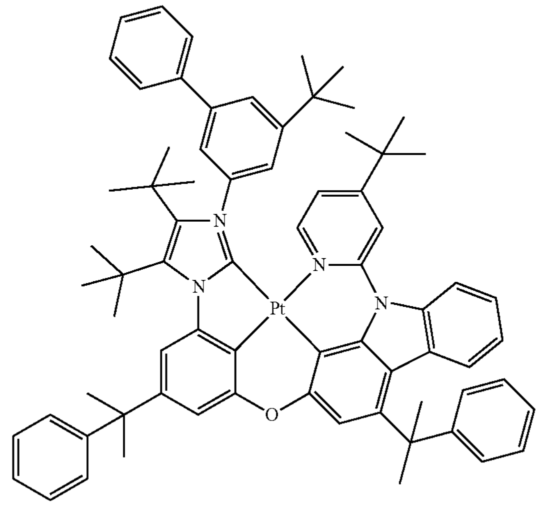
1470
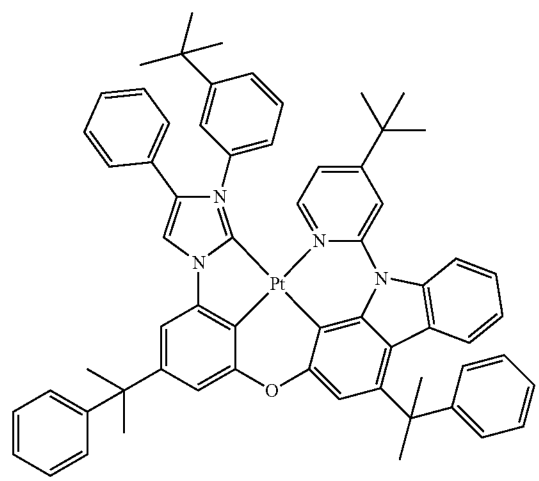
1471
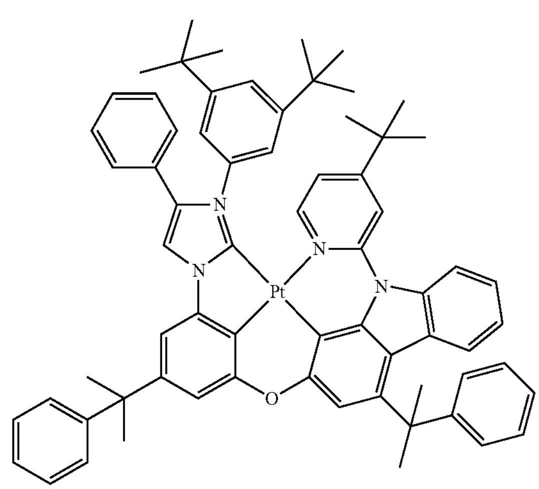

1472
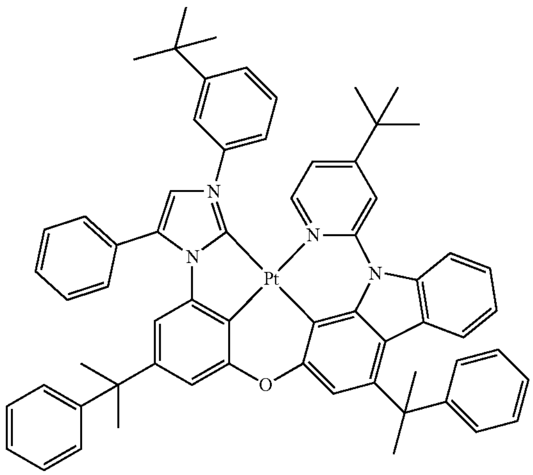
1473
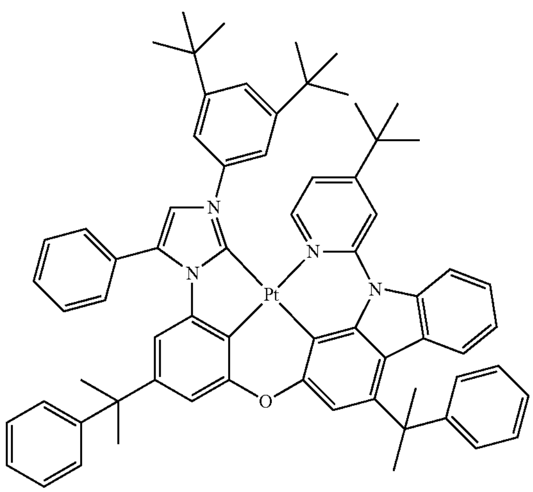
1474
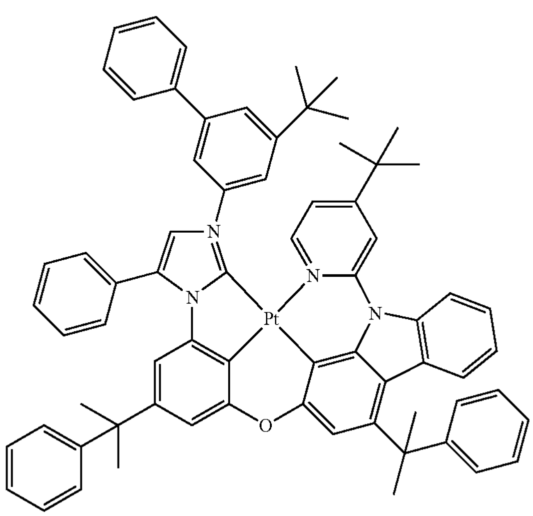
1475
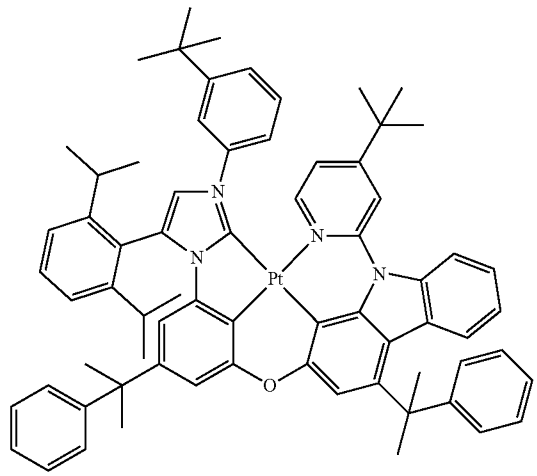
1476
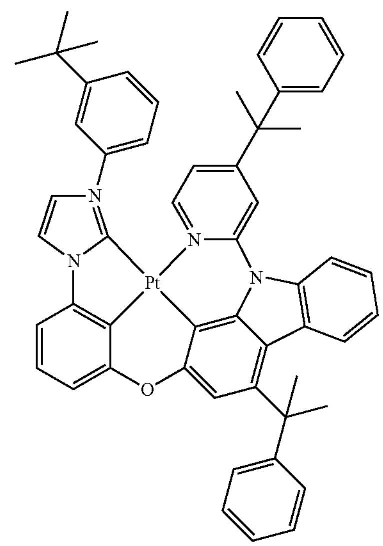
1477
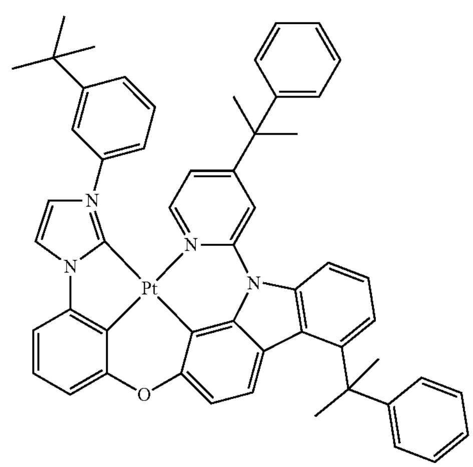

1478
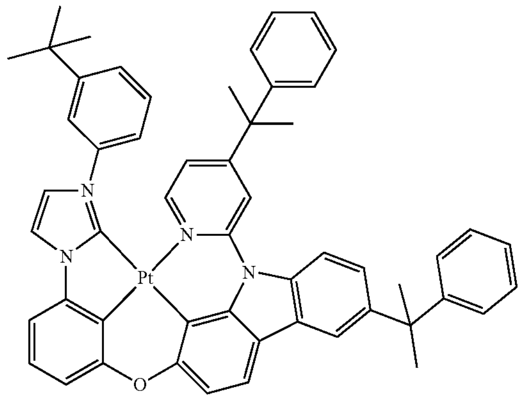
1479
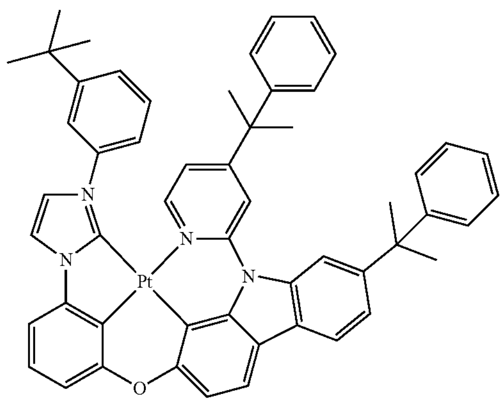
1480
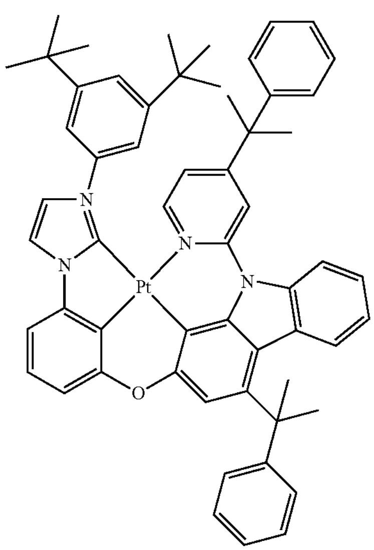
1481
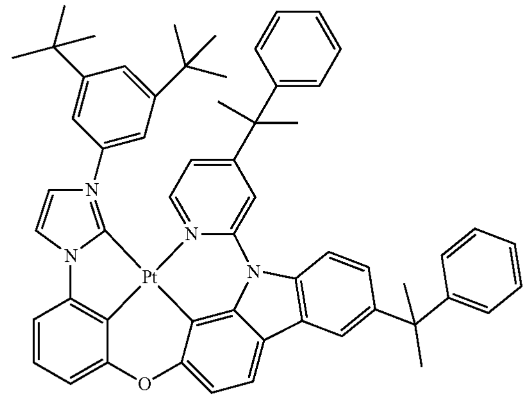
1482
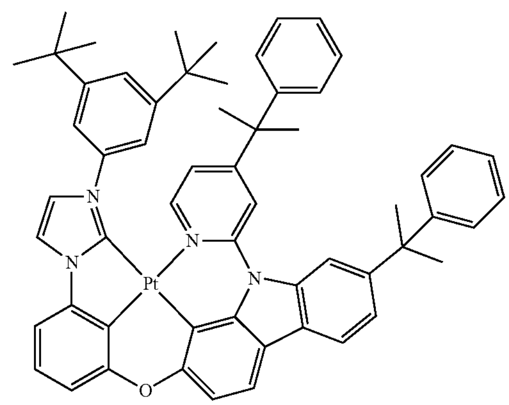
1483
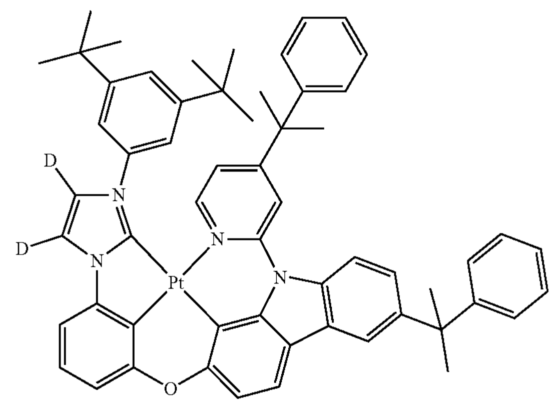

-continued
1484
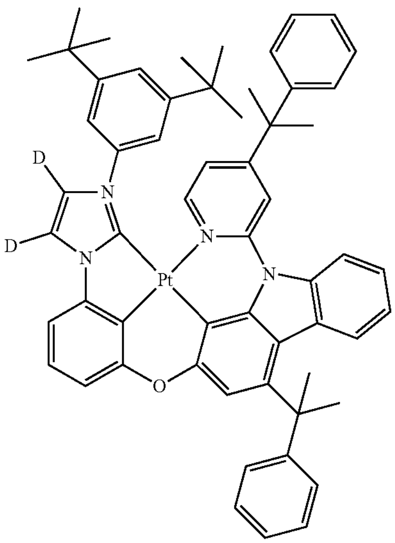
1485
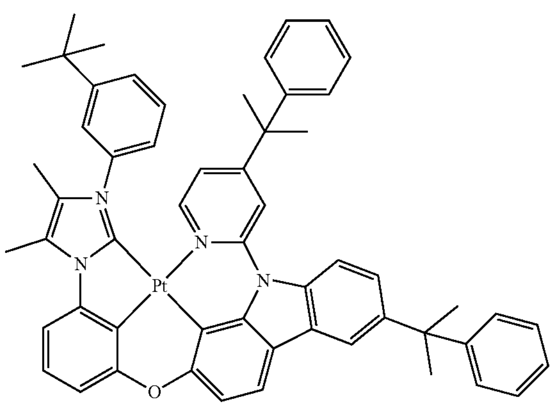
1486
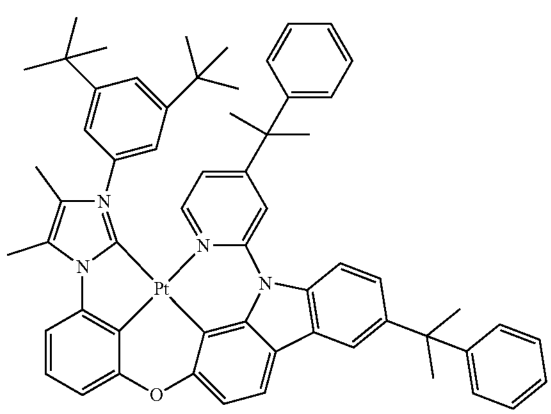
1487
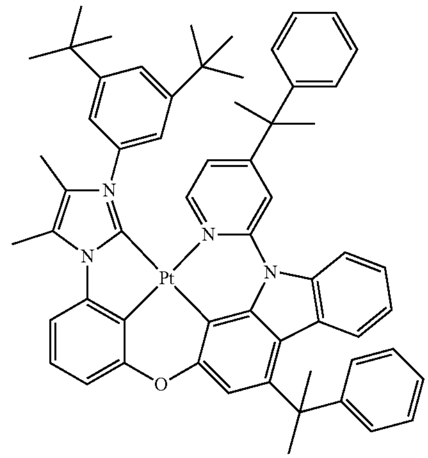
1488
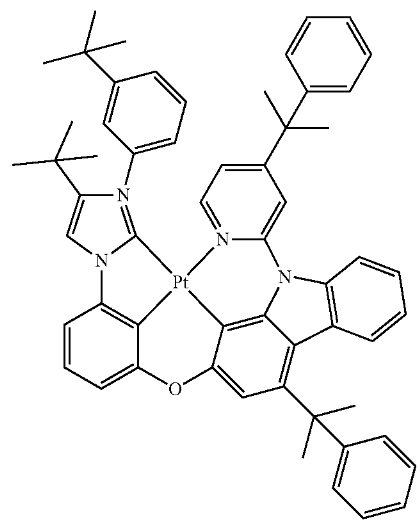
1489
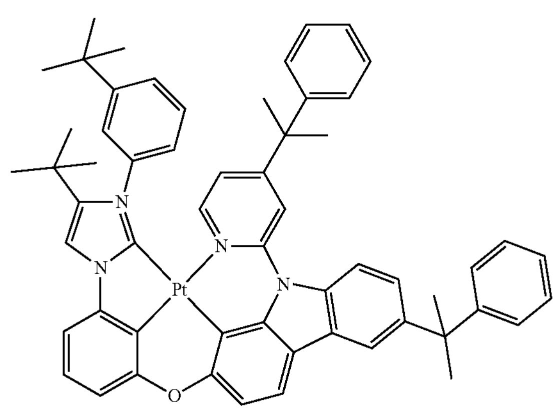

-continued
1490
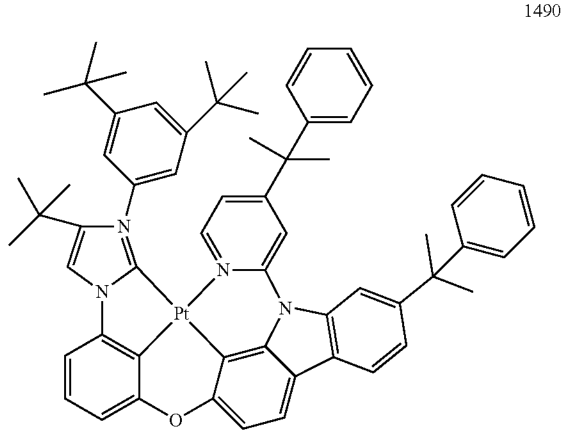
1491
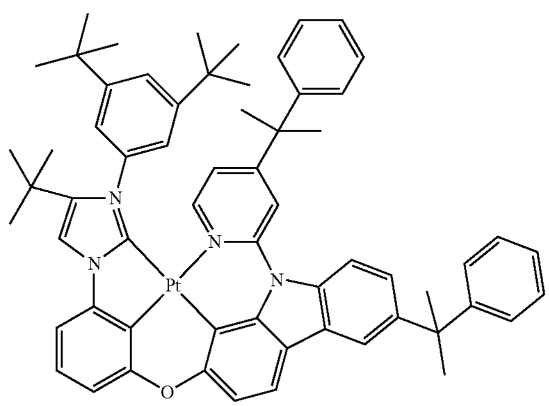
1492
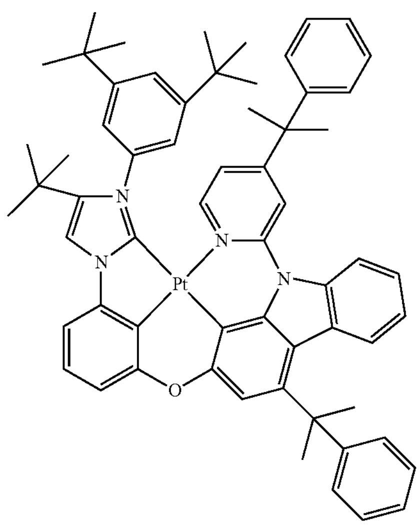
-continued
1493
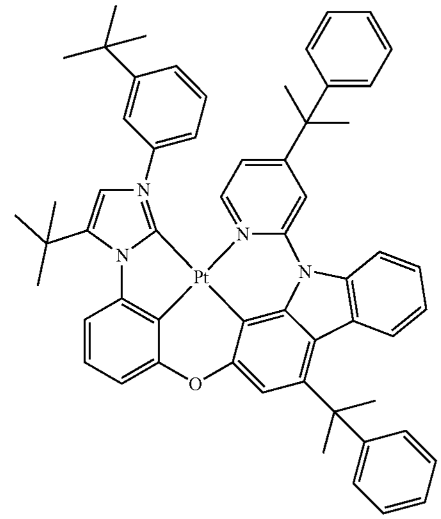
1494
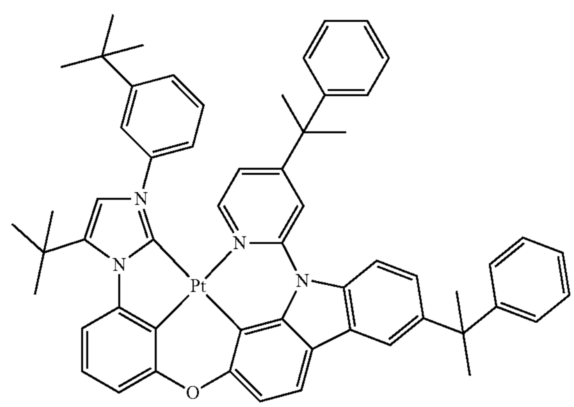
1495
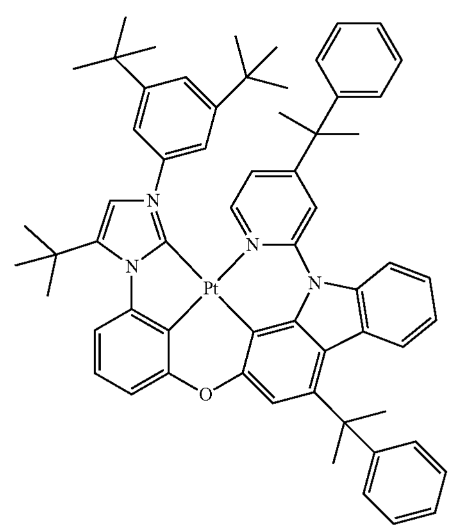

-continued
1496
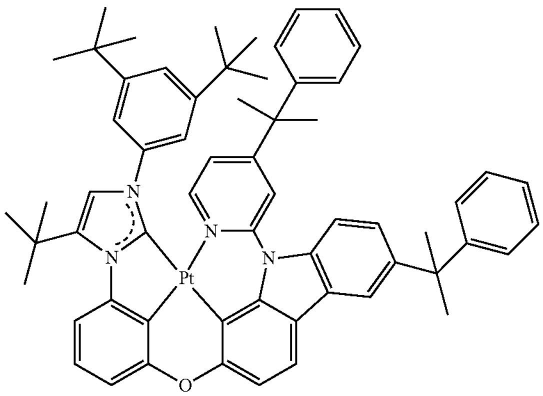
1497
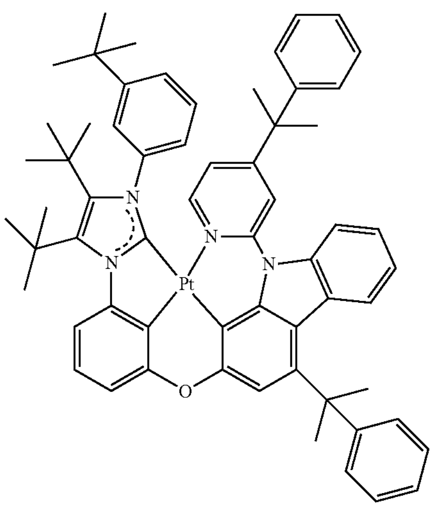
1498
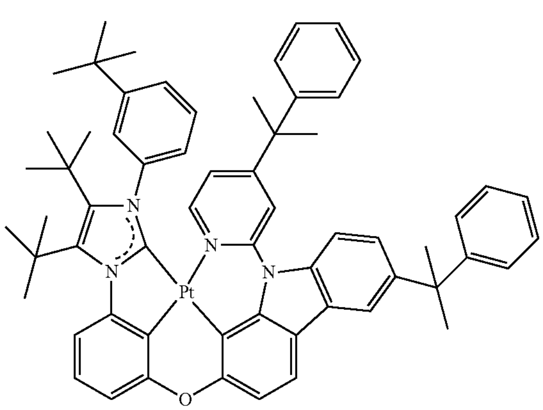
1499
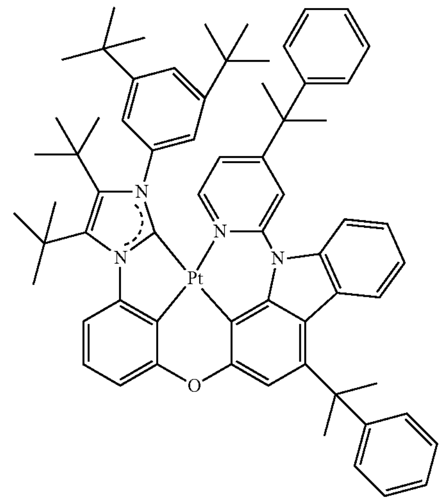
1500
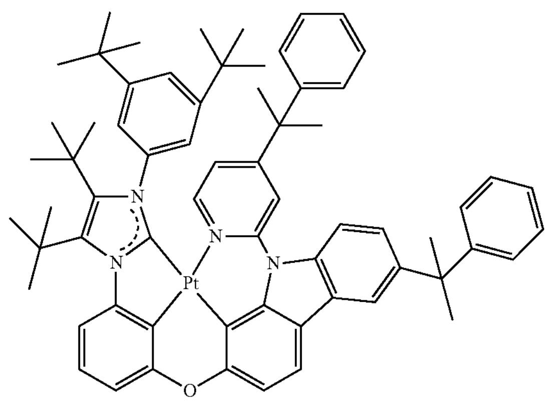
1501
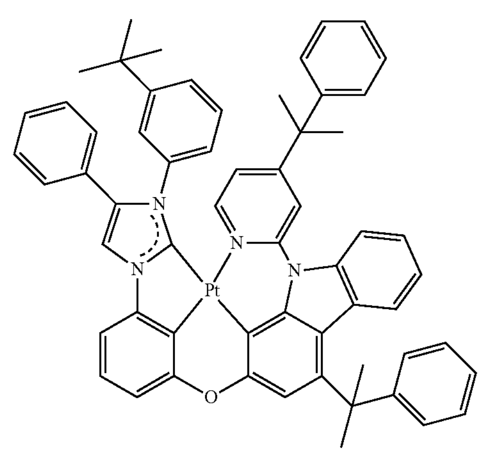

-continued
1502
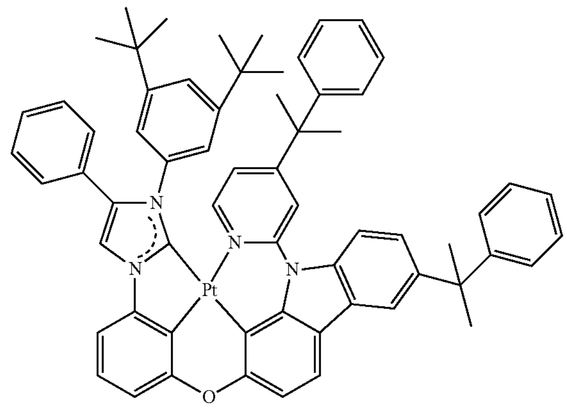
1503
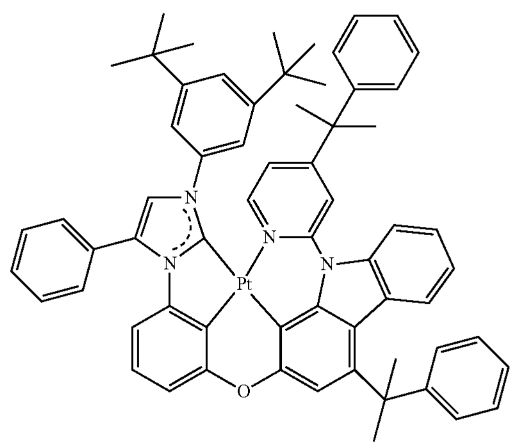
1504
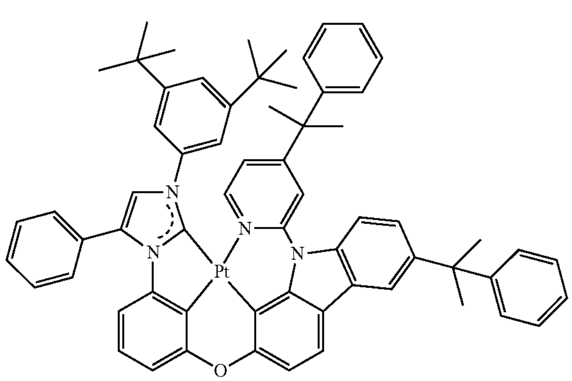
-continued
1505
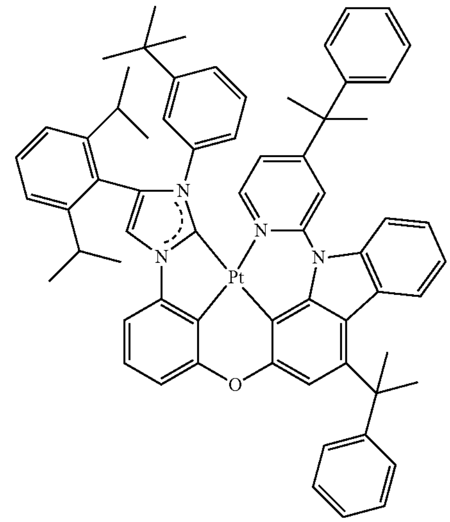
1506
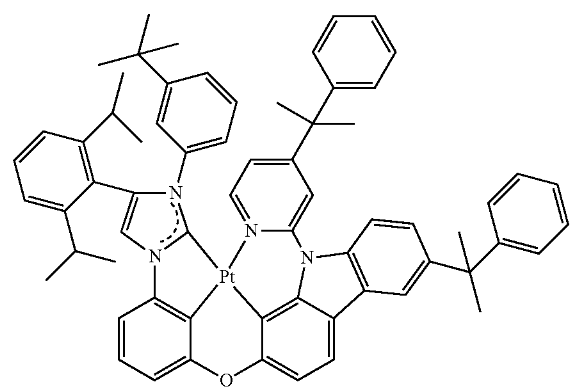
1507
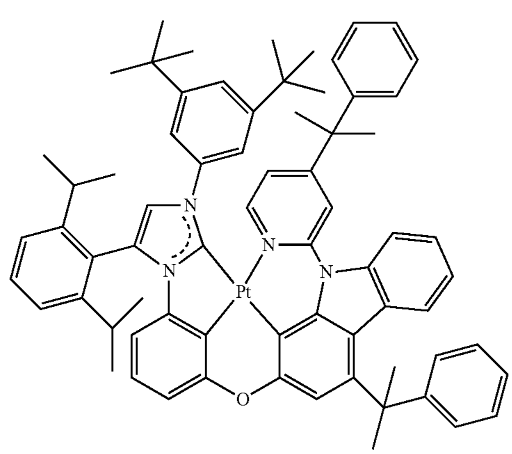

-continued
1508
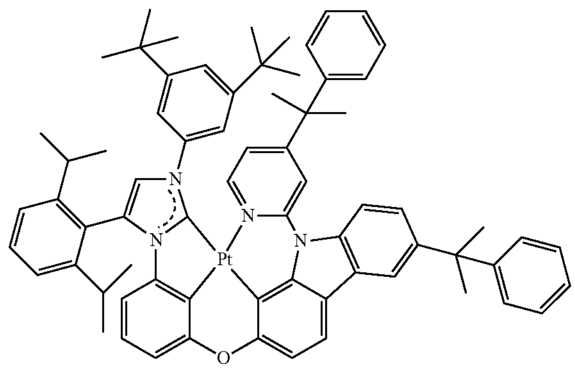
1509
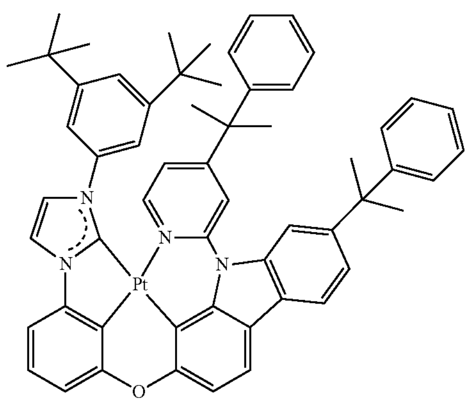
1510
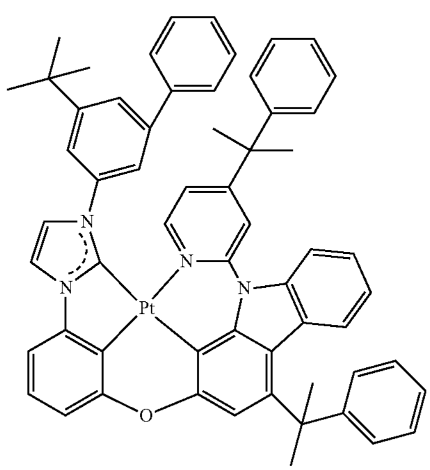
-continued
1511
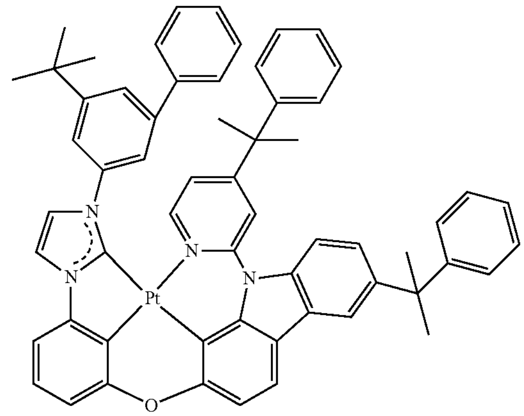
1512
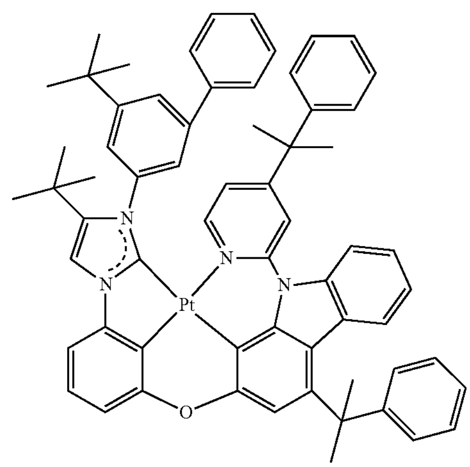
1513
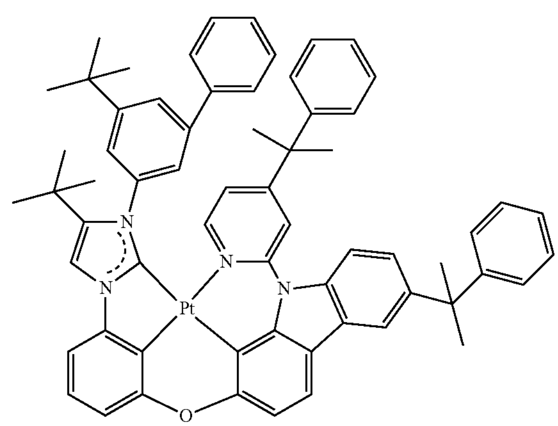

1514
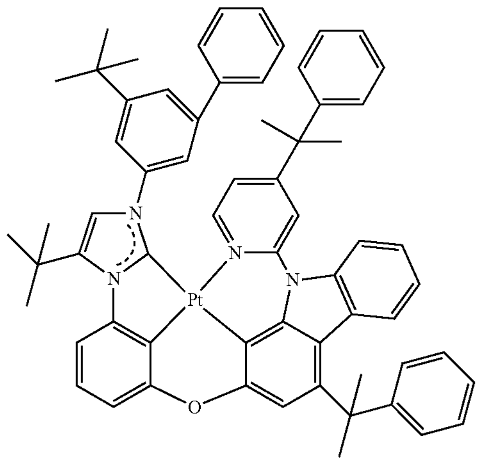
1517
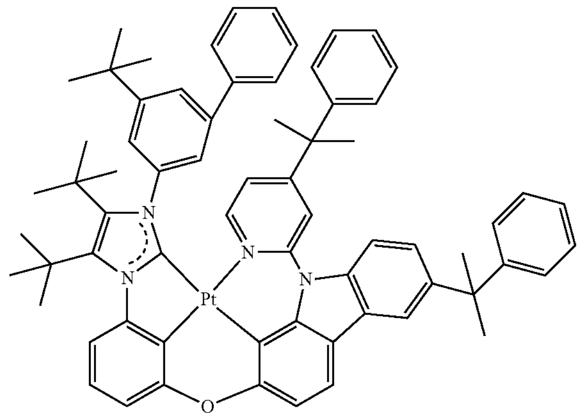
1515
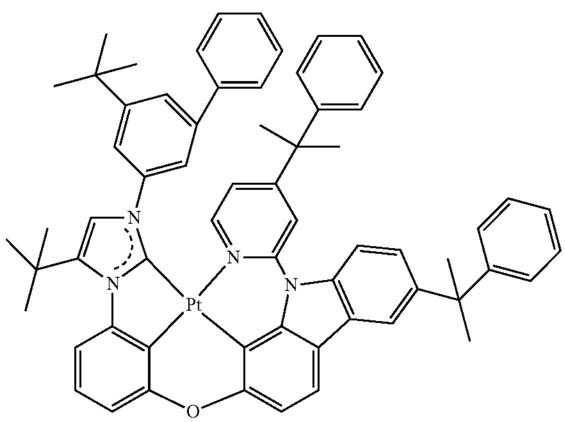
1518
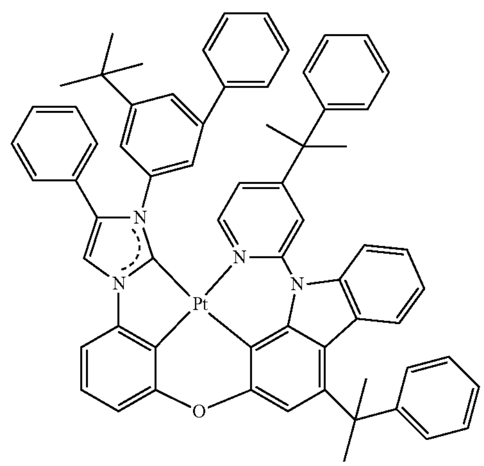
1516
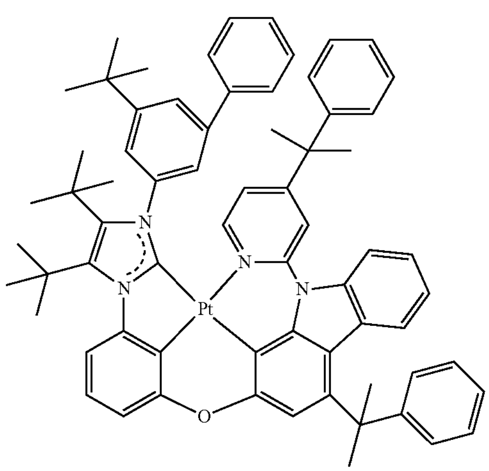
1519
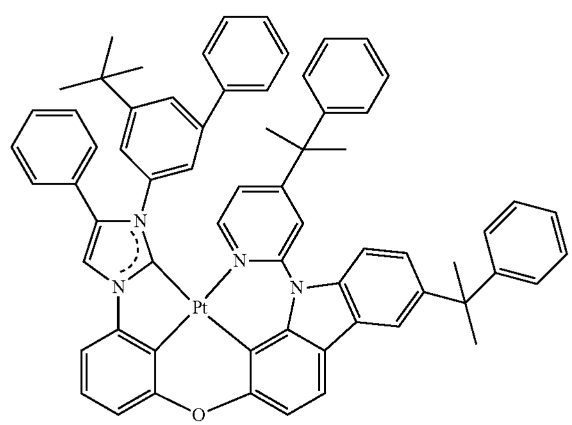

-continued
1520
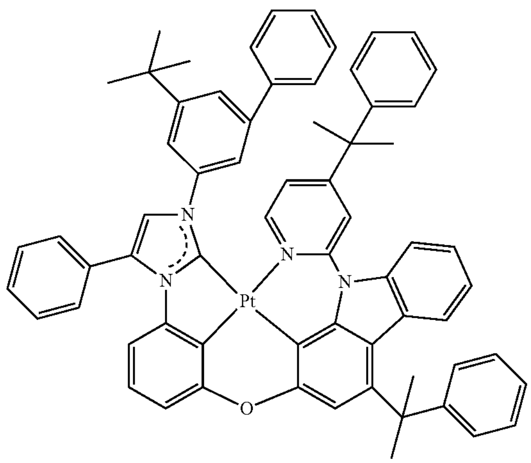
1521
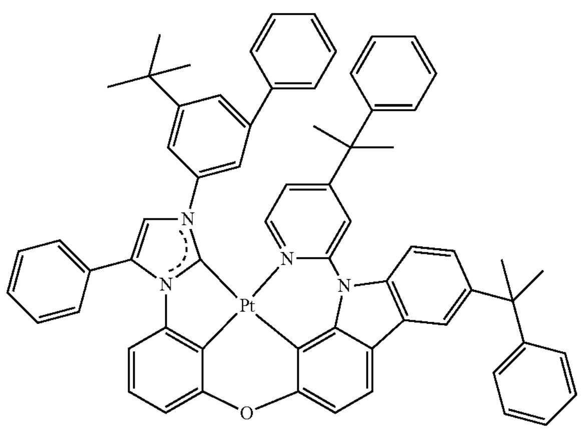
1522
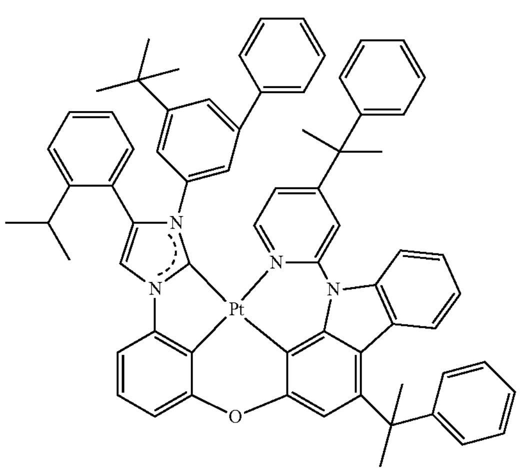
-continued
1523
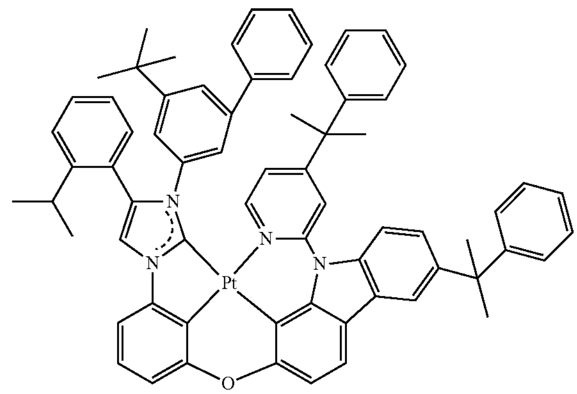
1524
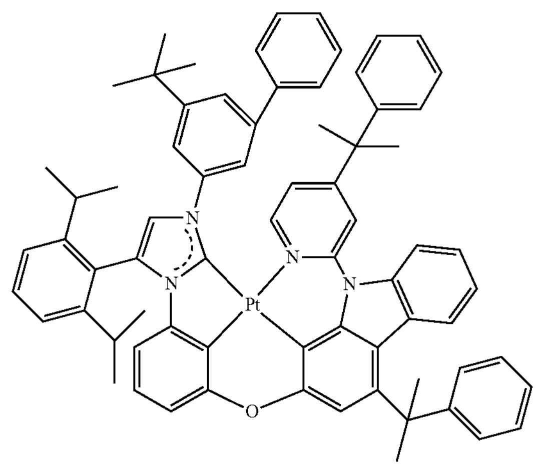
1525
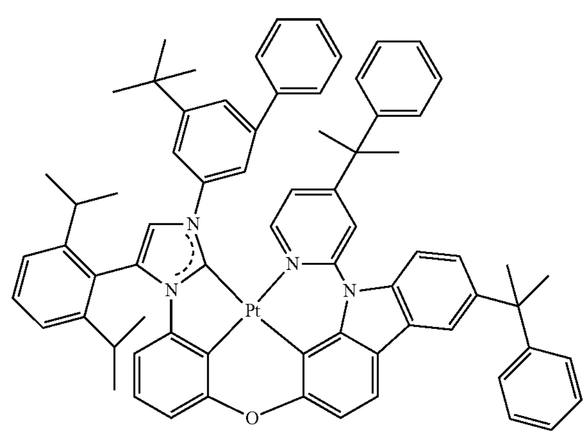

-continued
1526
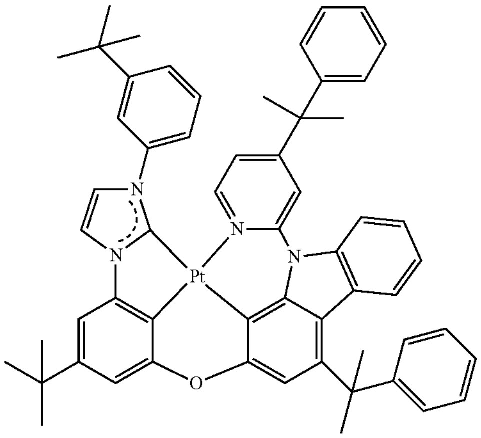
1527
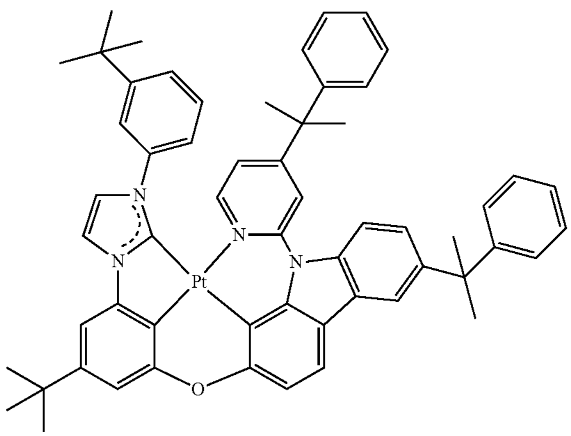
1528
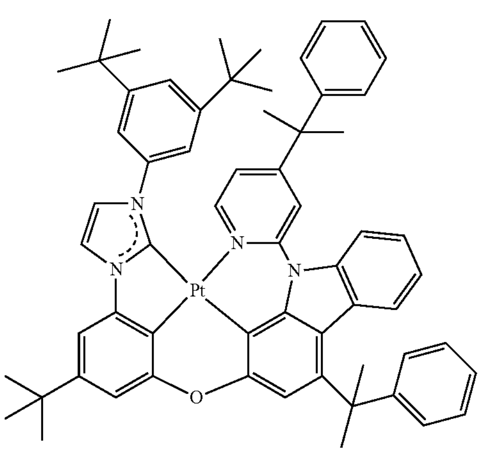
-continued
1529
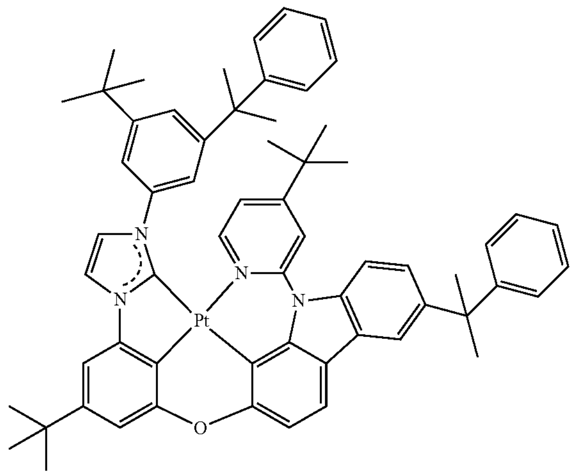
1530
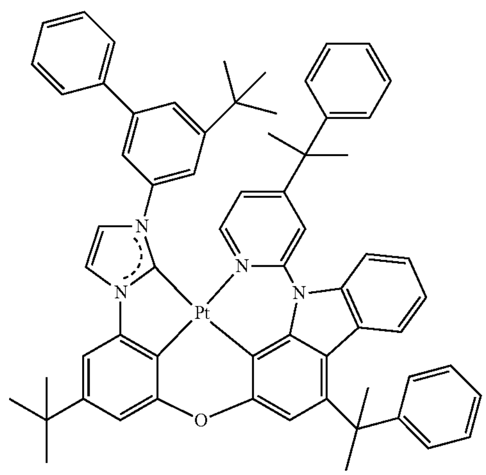
1531
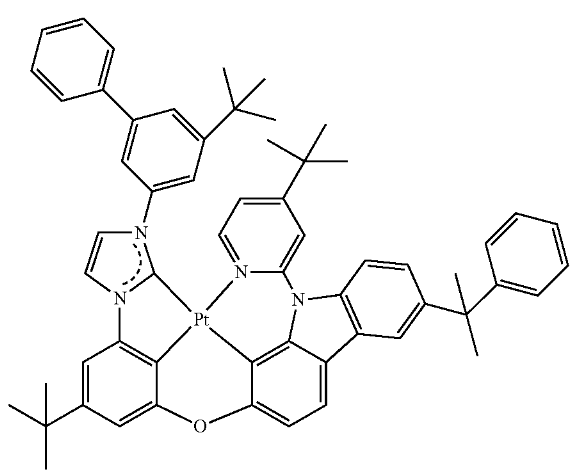

1532
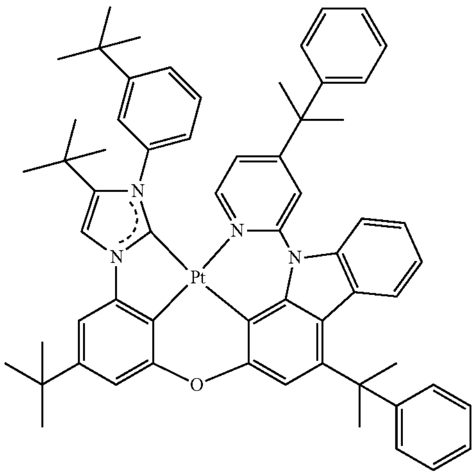
1533
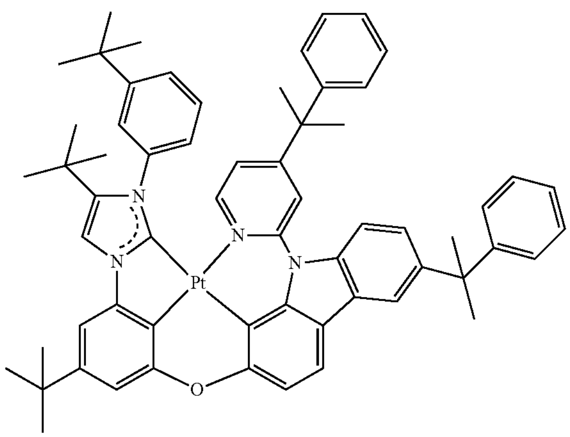
1534
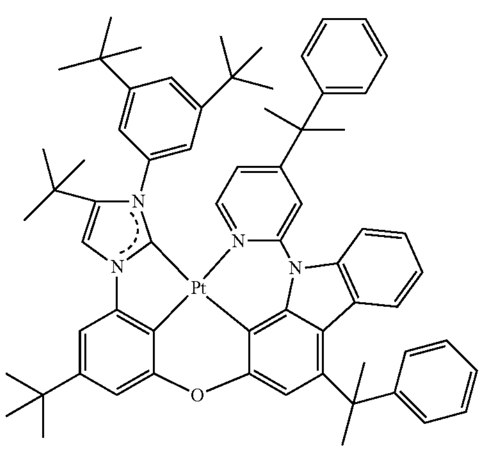
1535
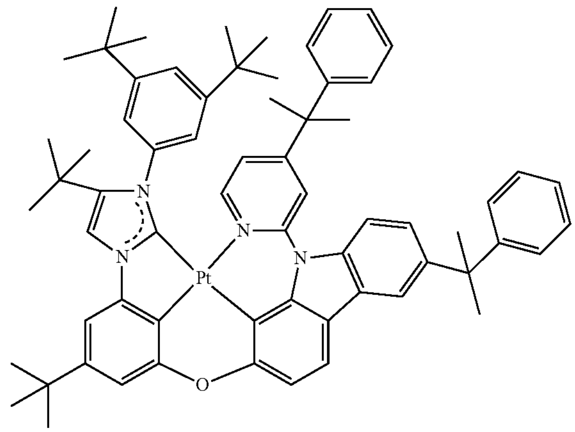
1536
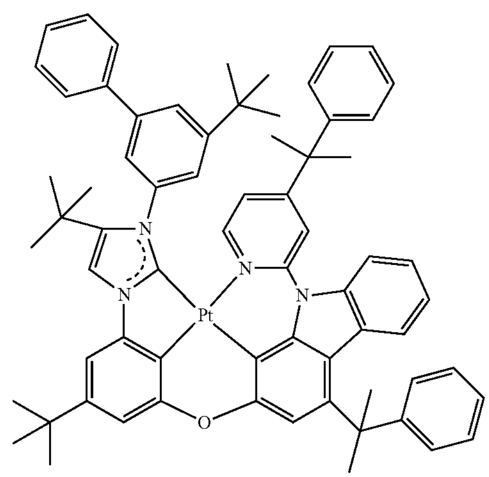
1537
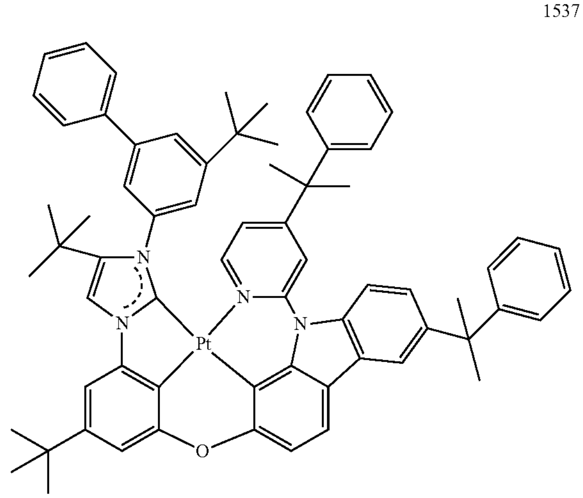

-continued
1538
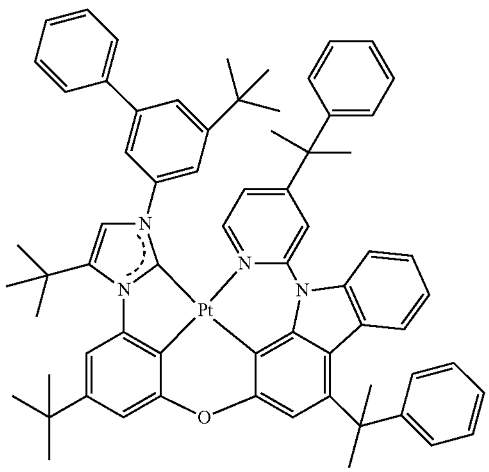
1539
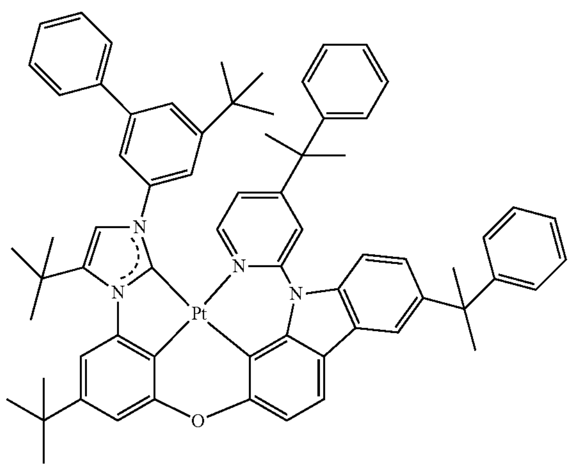
1540
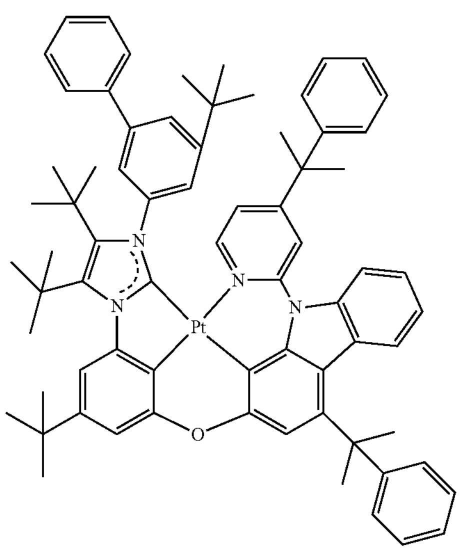
-continued
1541
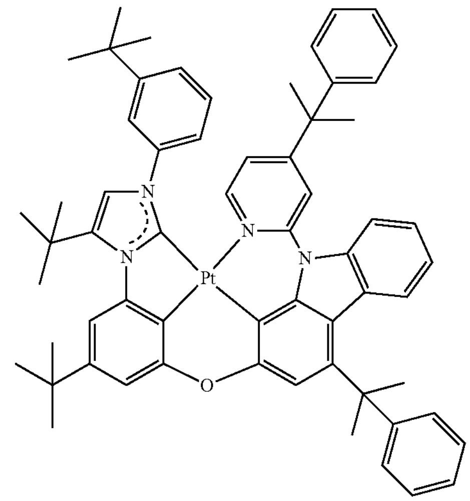
1542
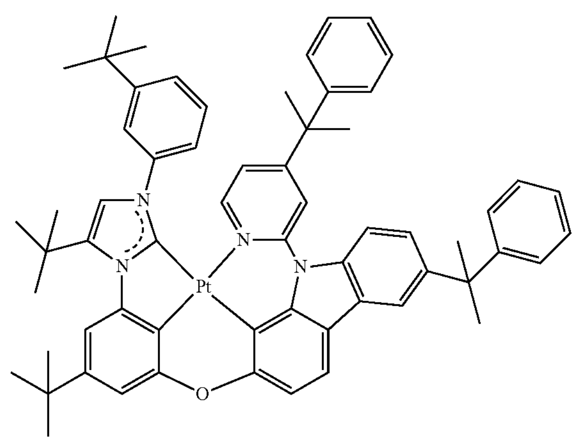
1543
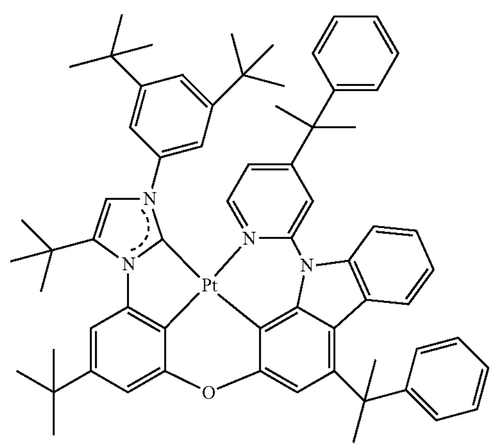

1544
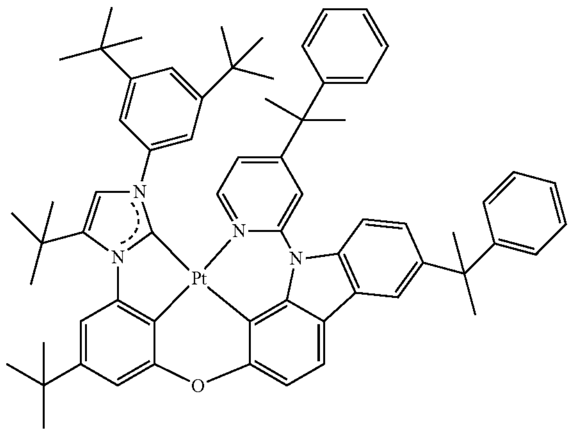
1545
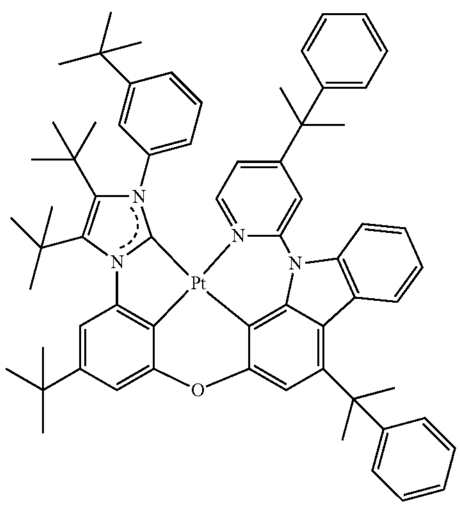
1546
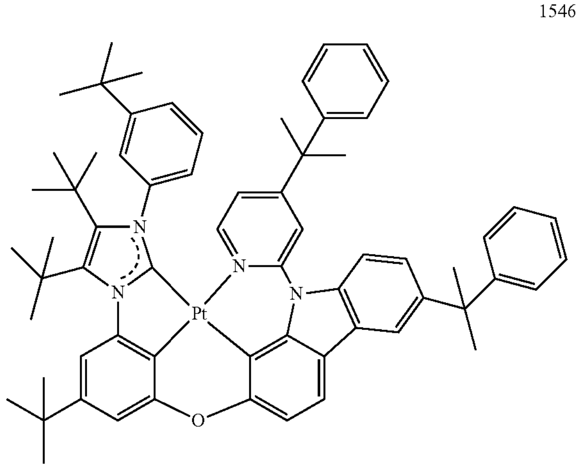
1547
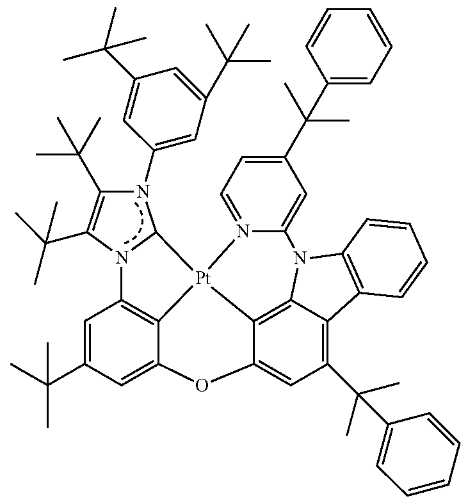
1548
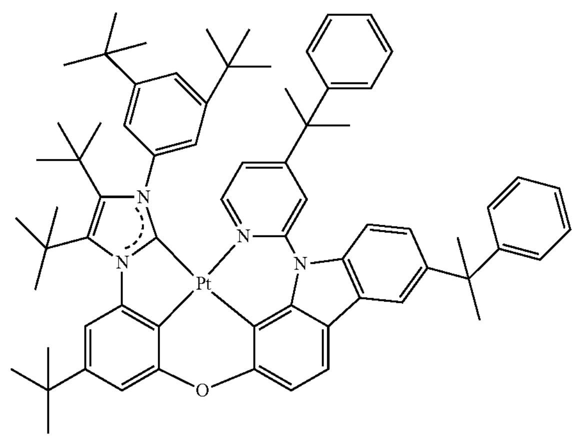
1549
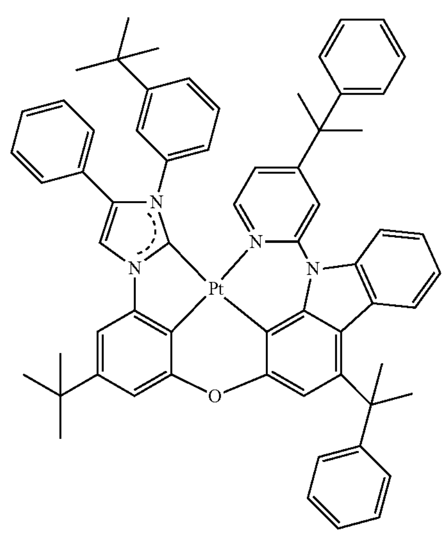

-continued
1550
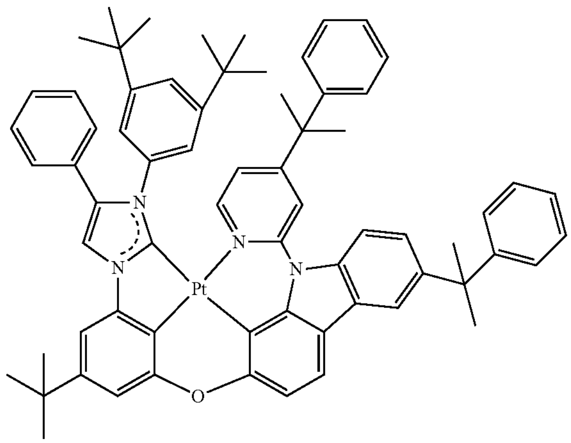
1551
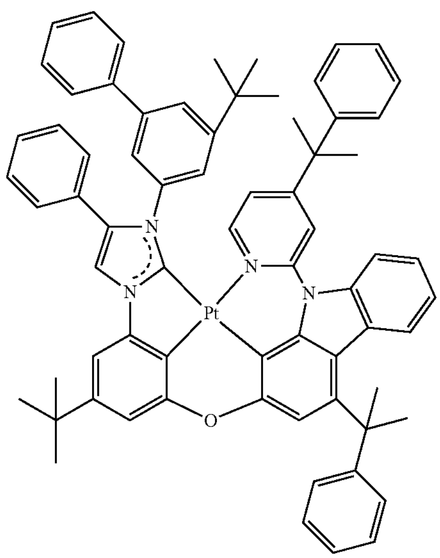
1552
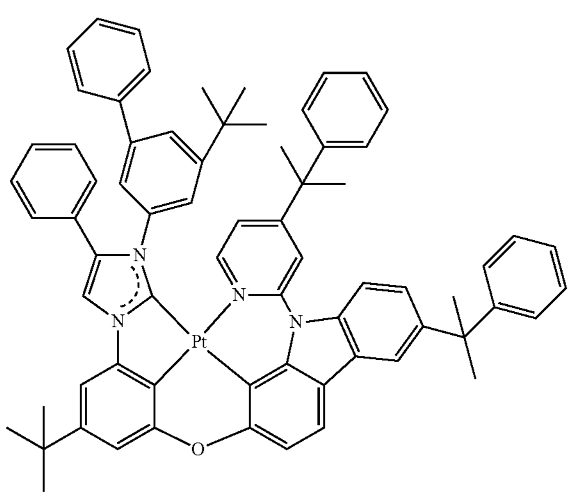
-continued
1553
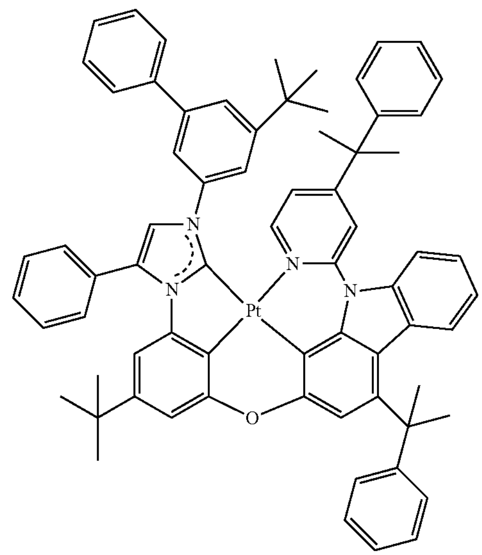
1554
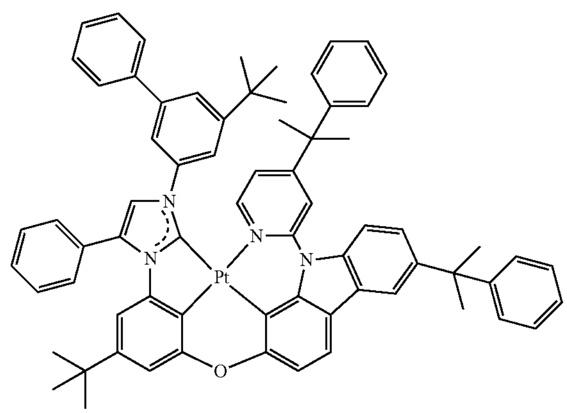
1555
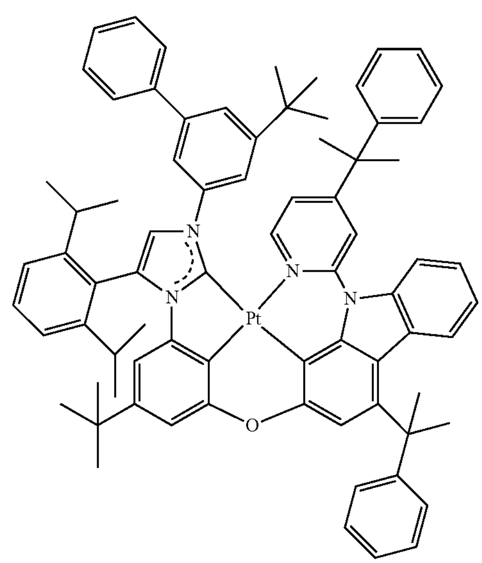

-continued
1556
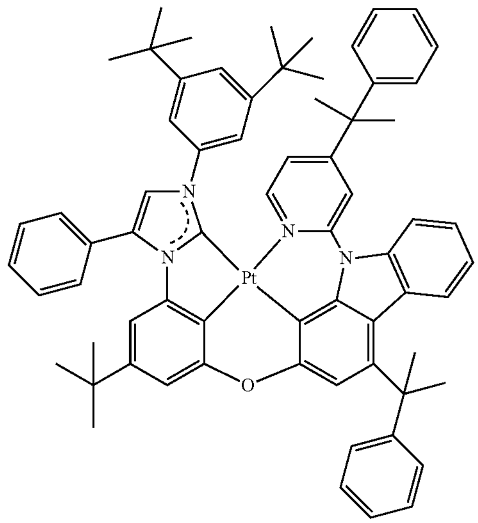
1557
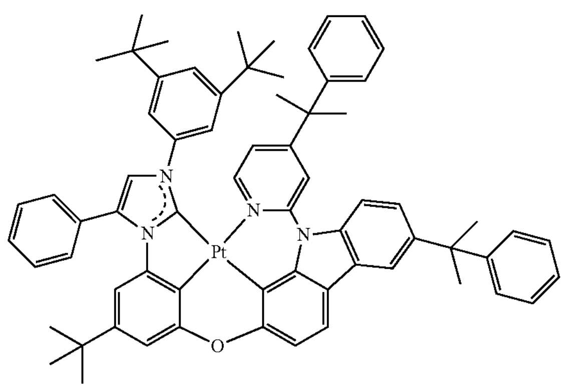
1558
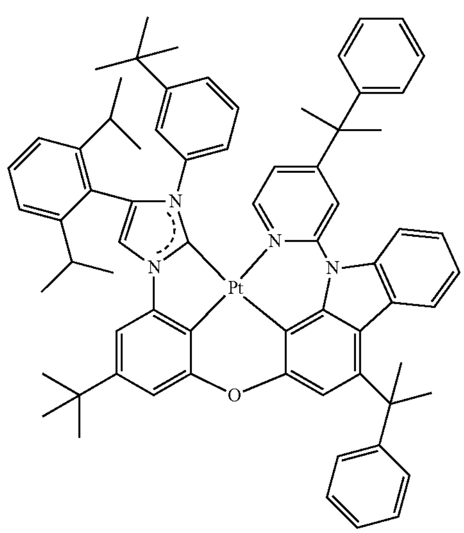
-continued
1559
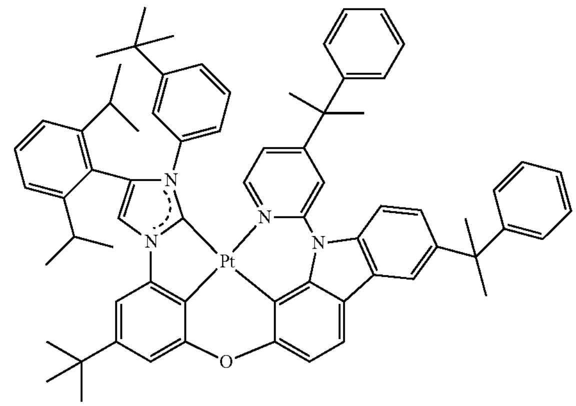
1560
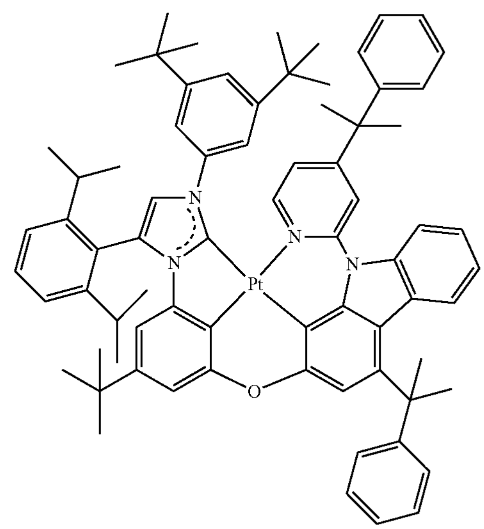
1561
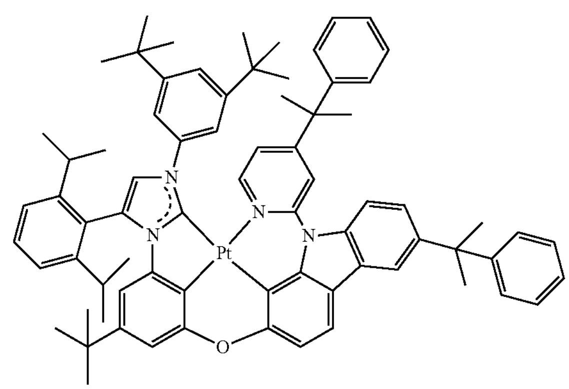

-continued
1562
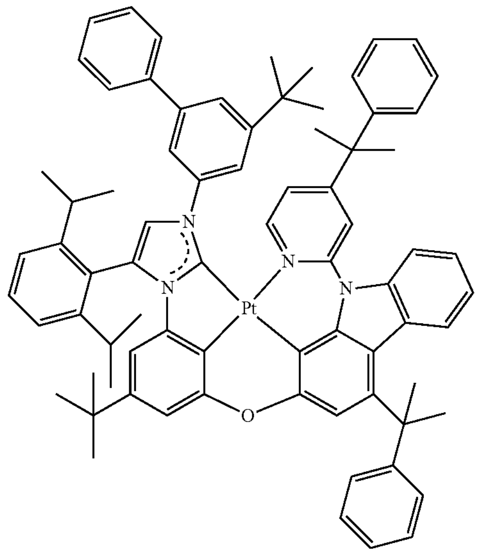
1563
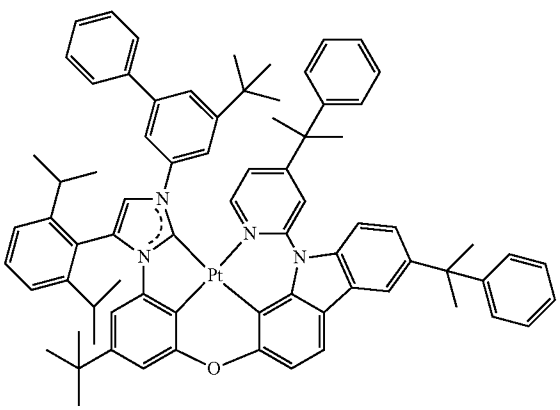
1564
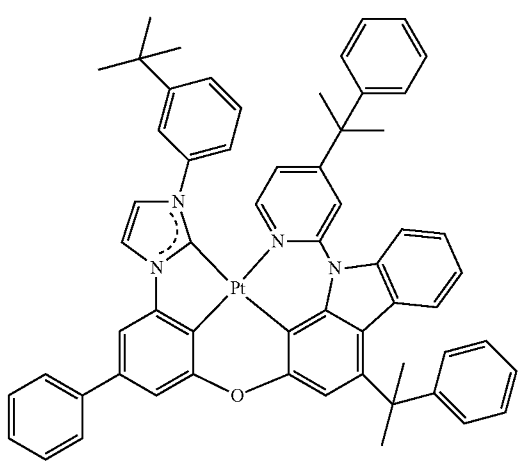
-continued
1565
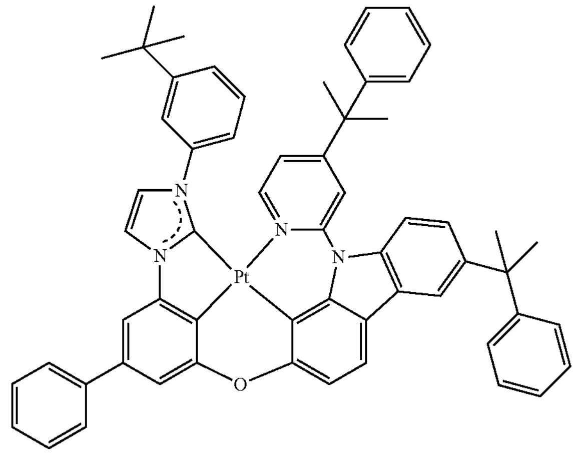
1566
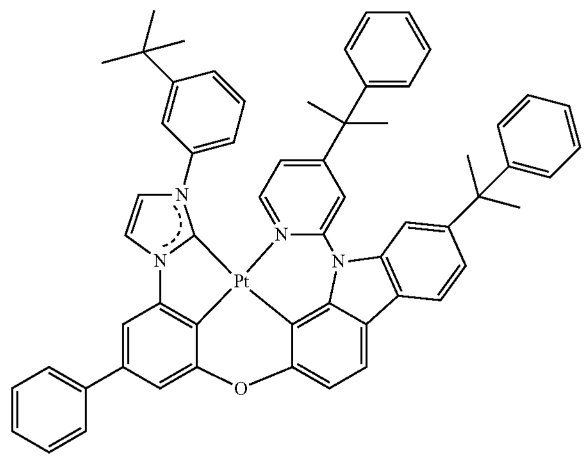
1567
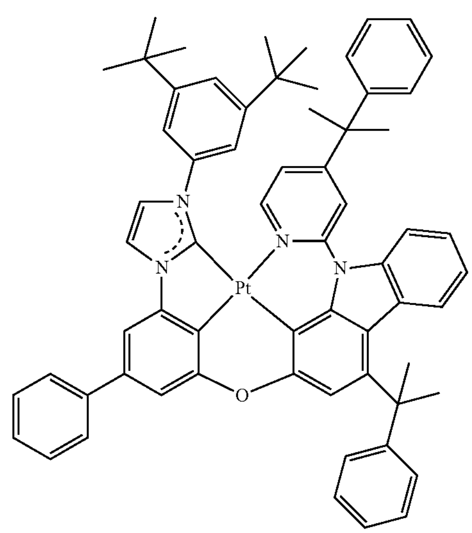

-continued
1568
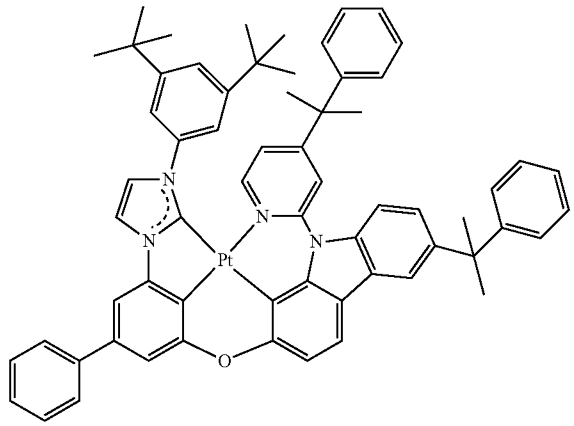
1569
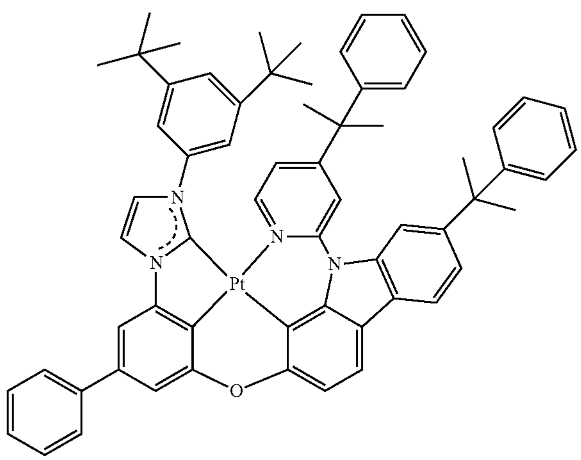
1570
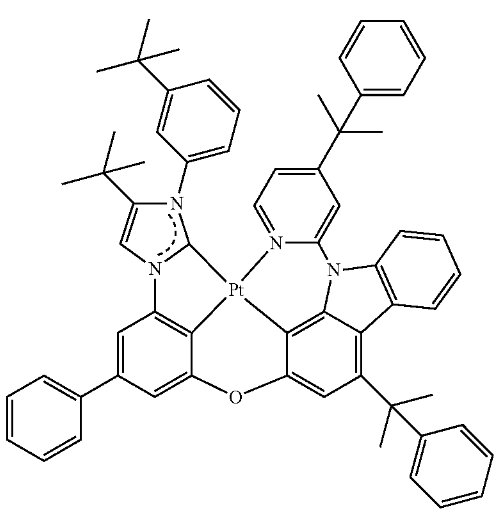
-continued
1571
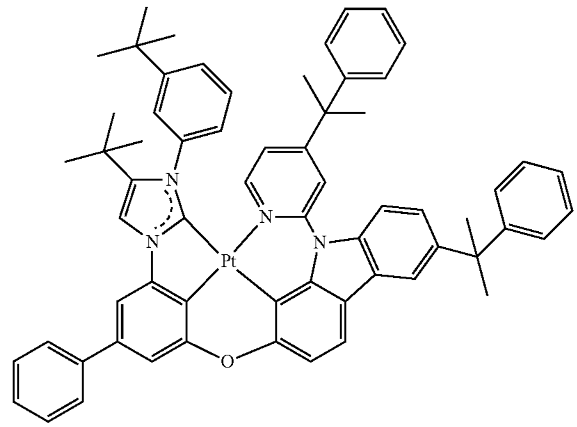
1572
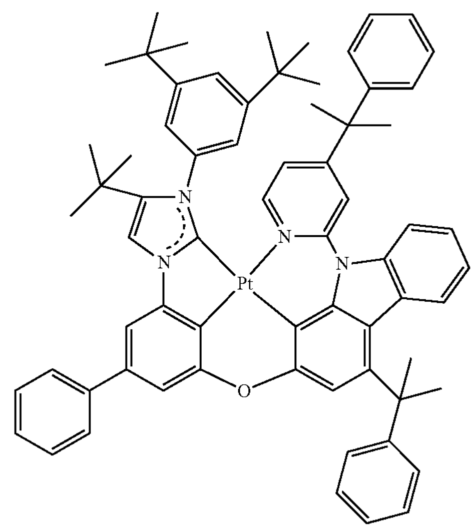
1573
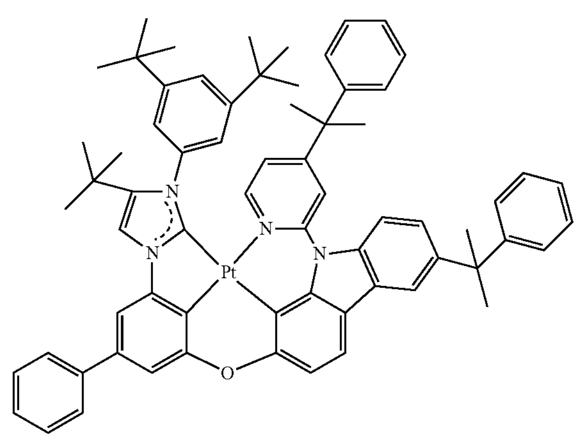

-continued
1574
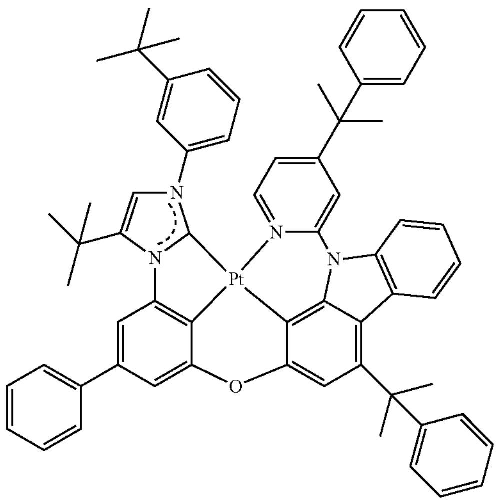
1575
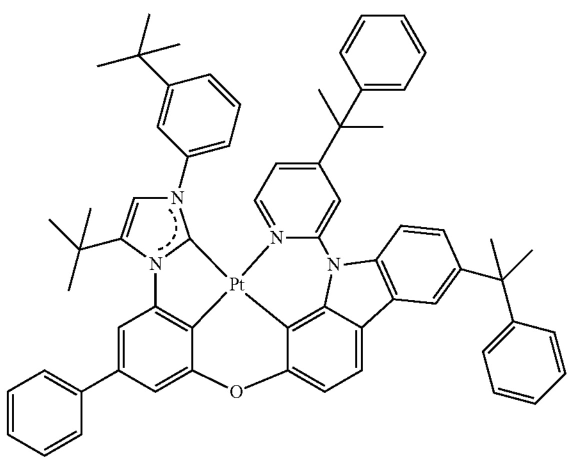
1576
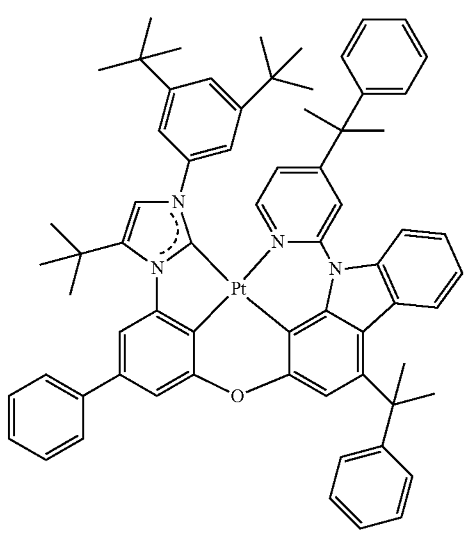
-continued
1577
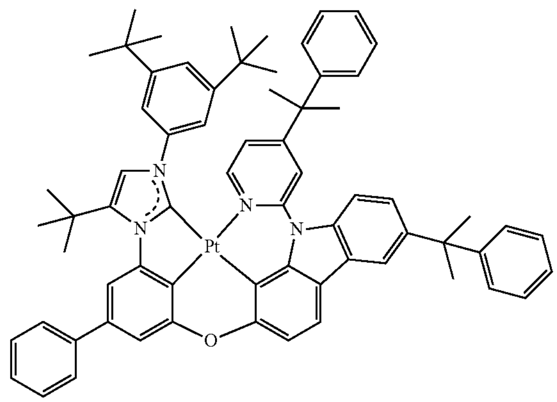
1578
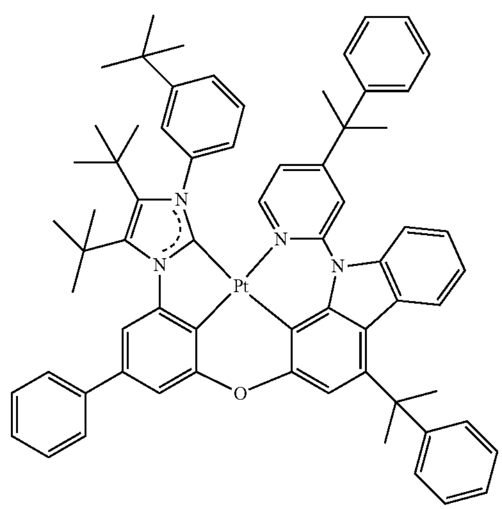
1579
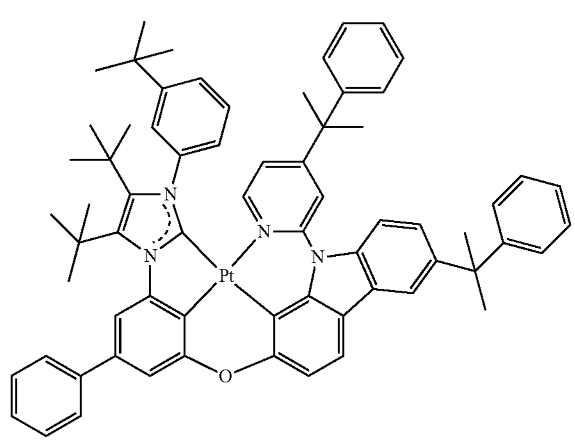

-continued
1580
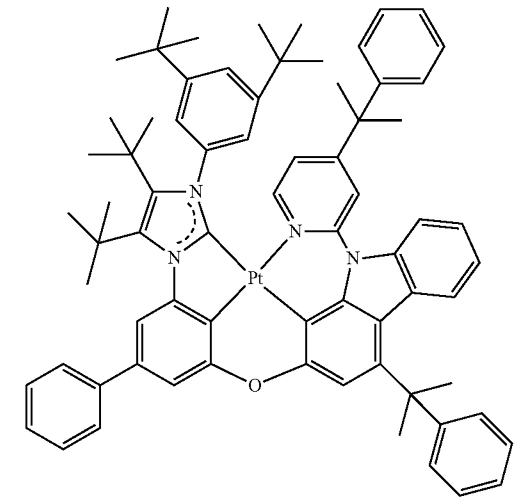
1581
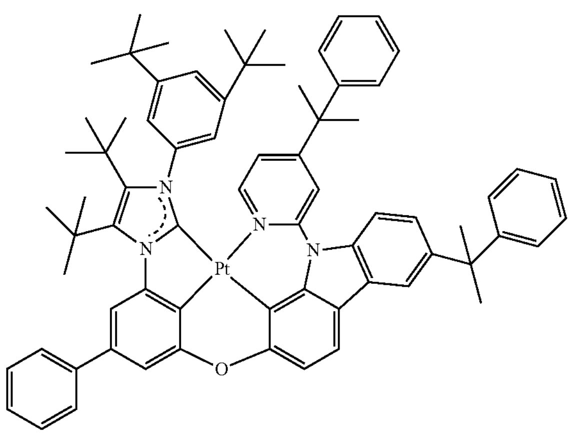
1582
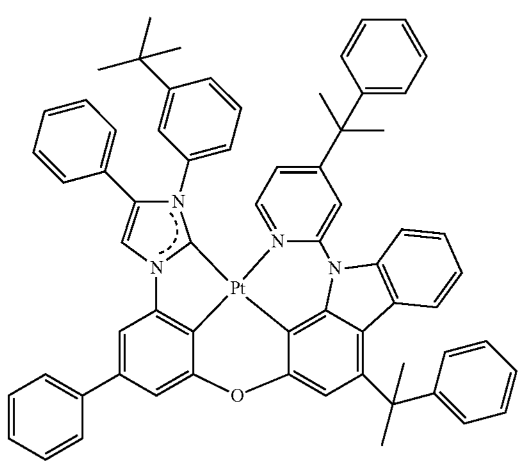
-continued
1583
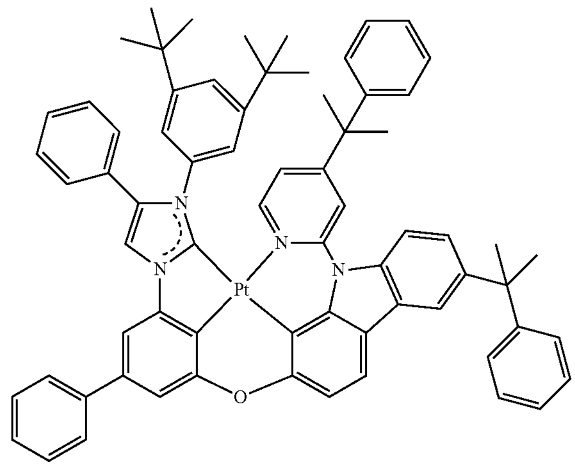
1584
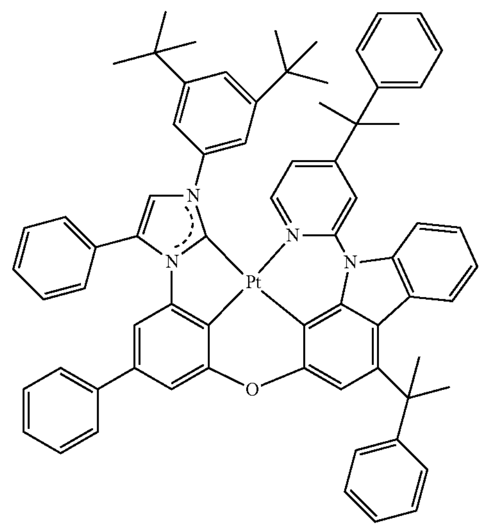
1585
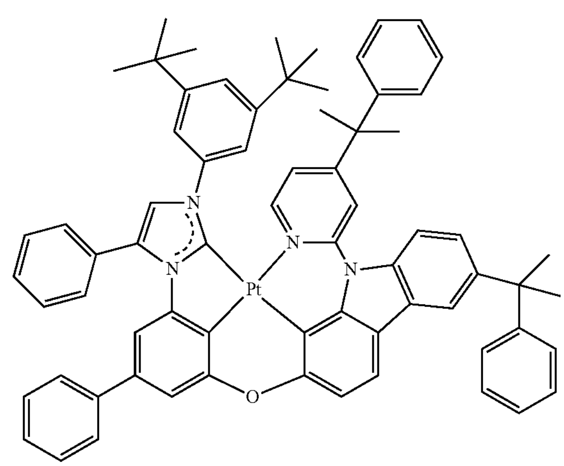

1586
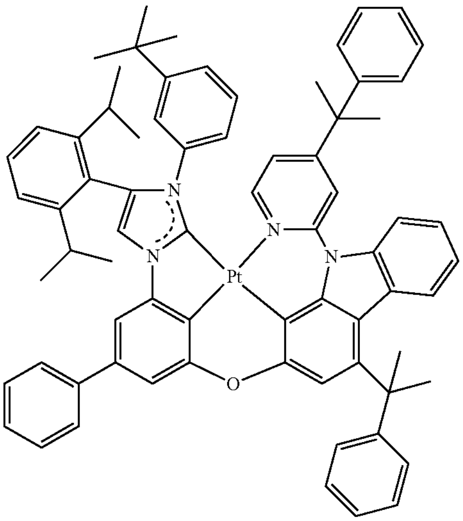
1587
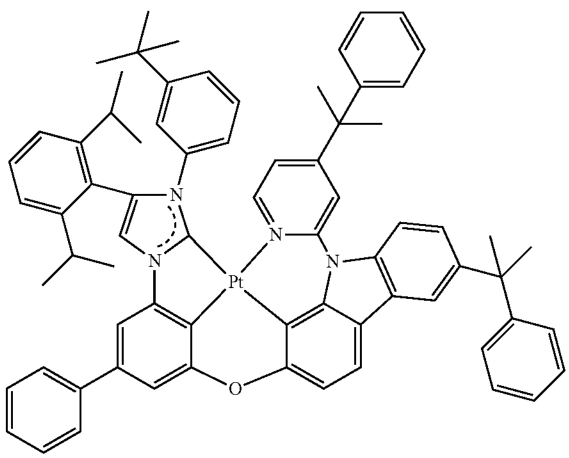
1588
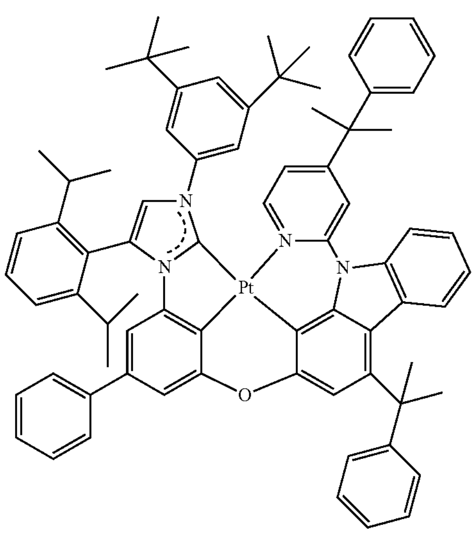
1589
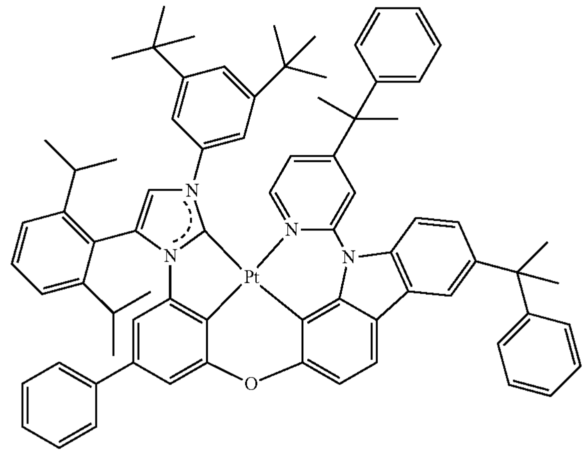
1590
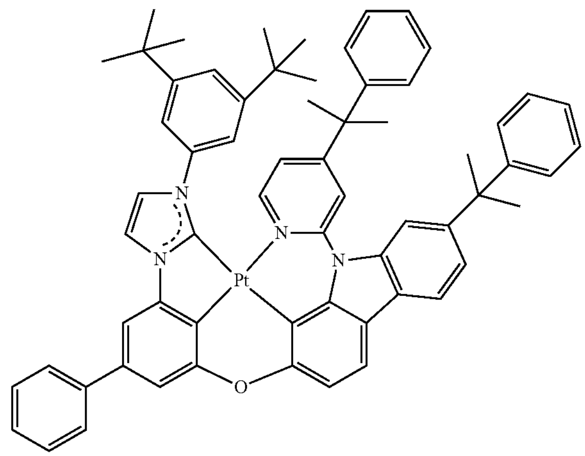
1591
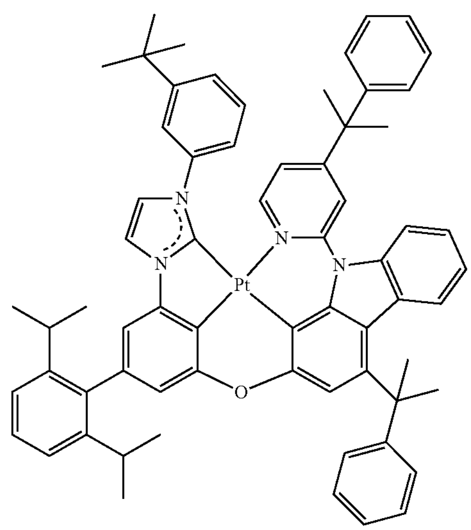

1592
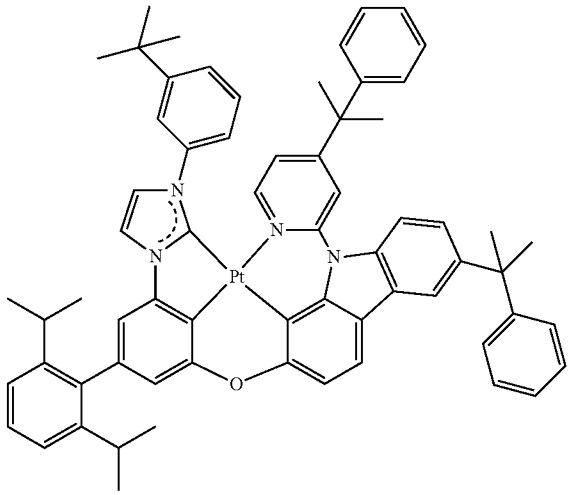
1593
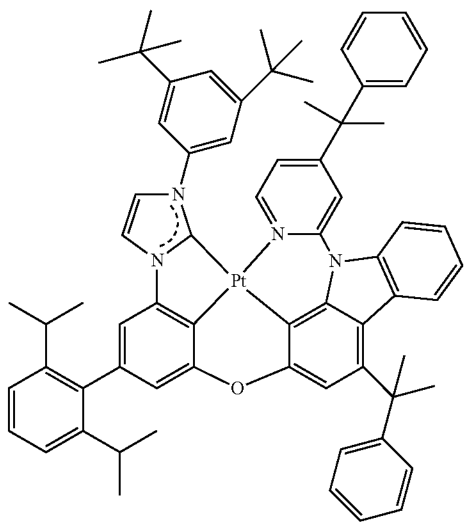
1594
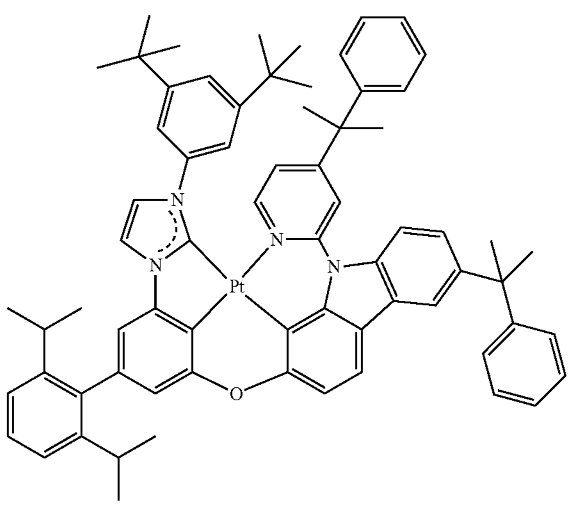
1595
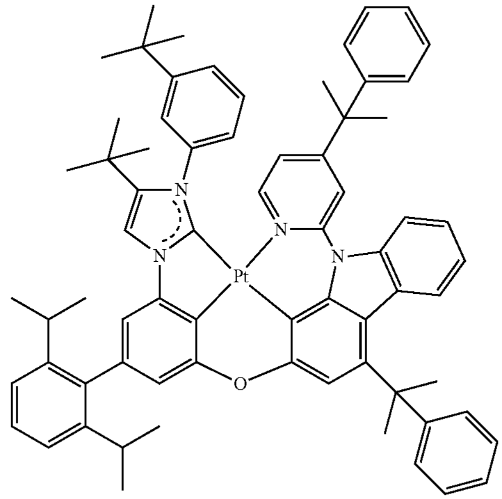
1596
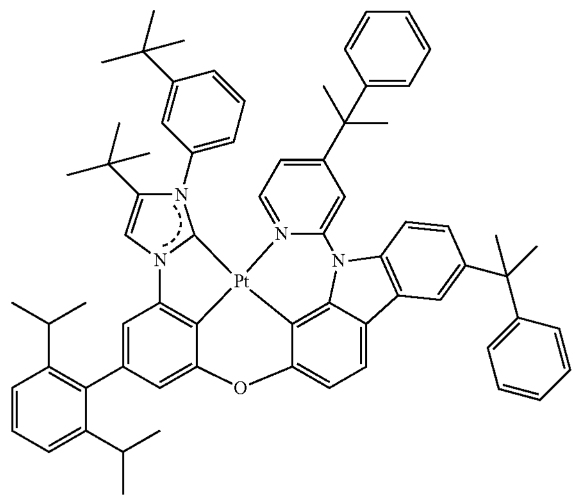
1597
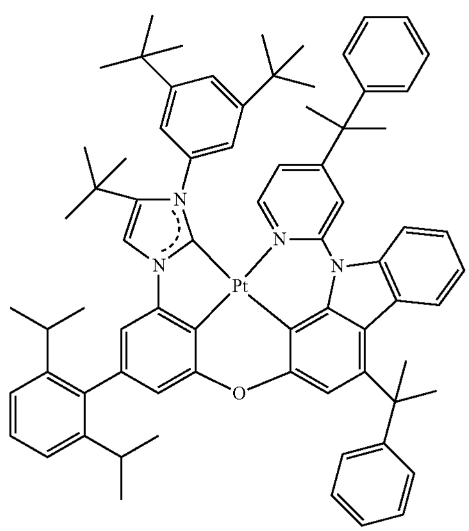

-continued
1598
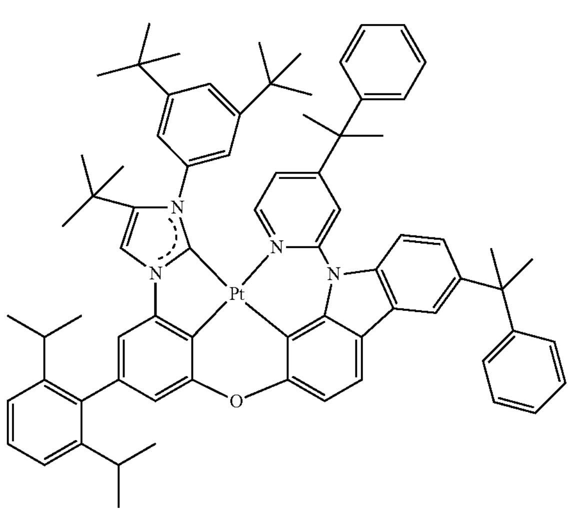
1599
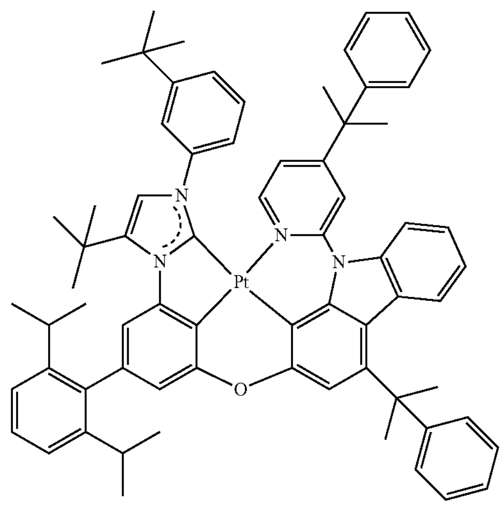
1600
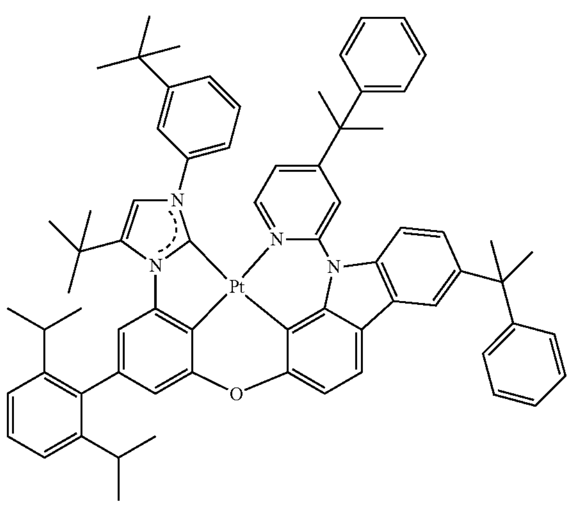
-continued
1601
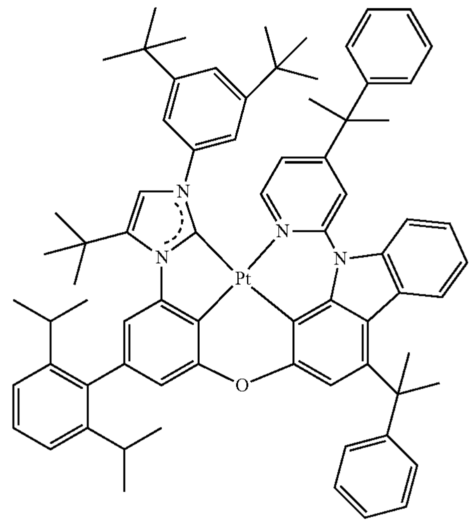
1602
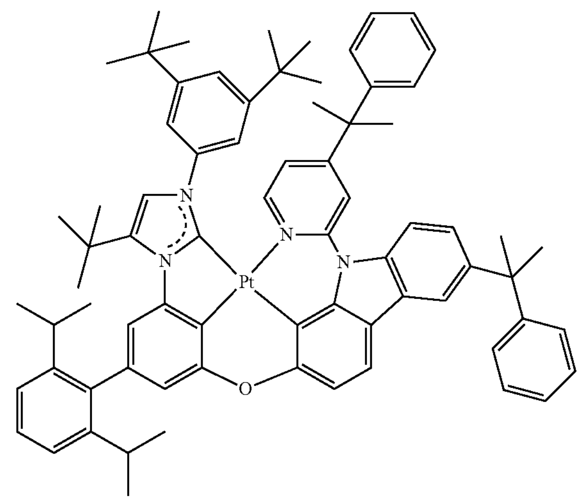
1603
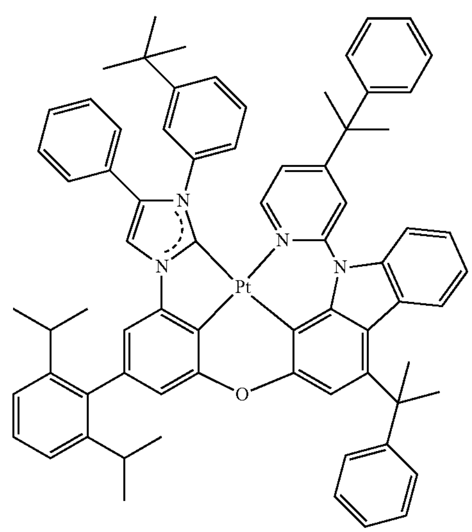

-continued
1604
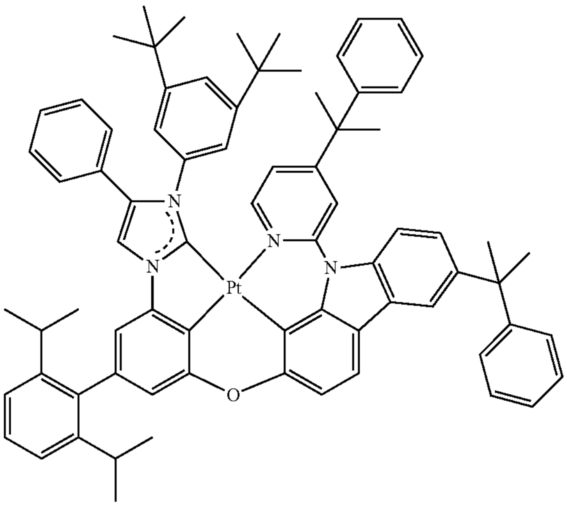
1605
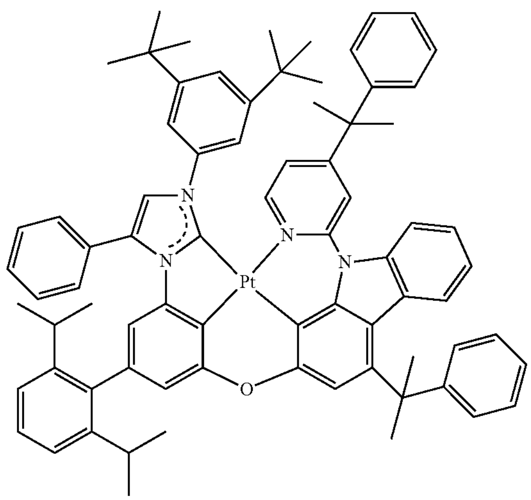
1606
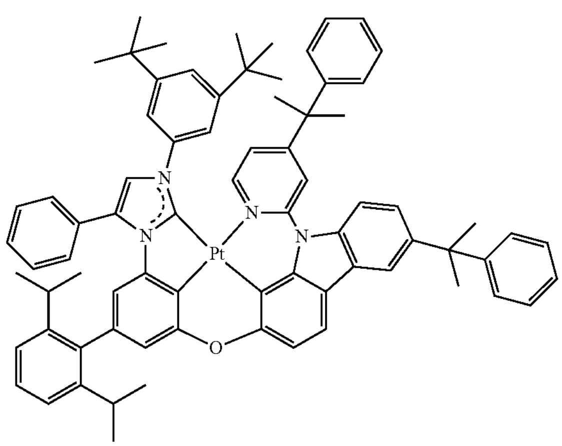
-continued
1607
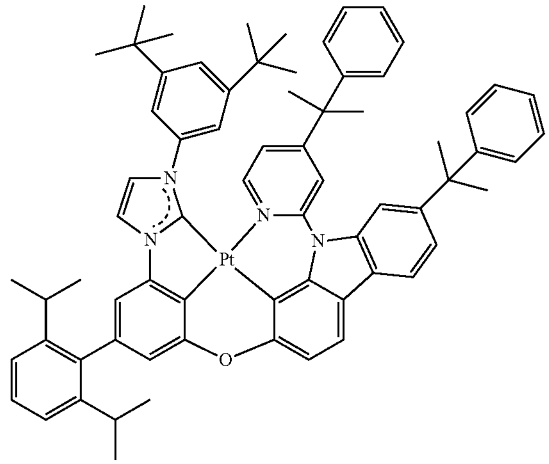
1608
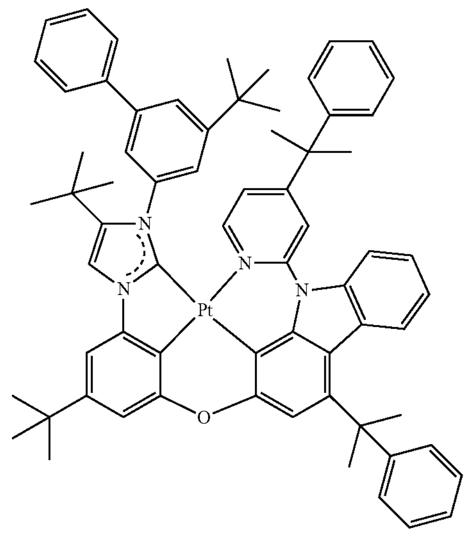
1609
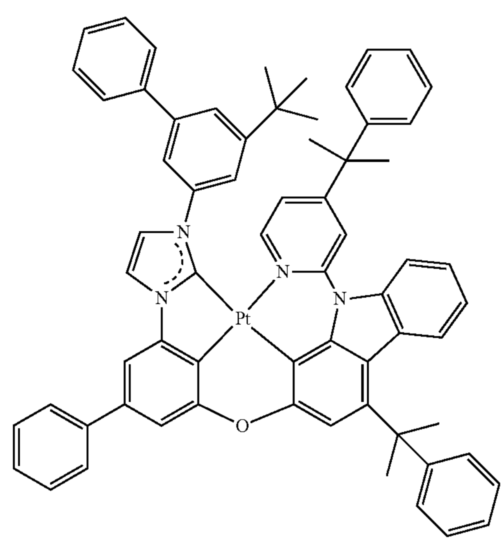

-continued
1610
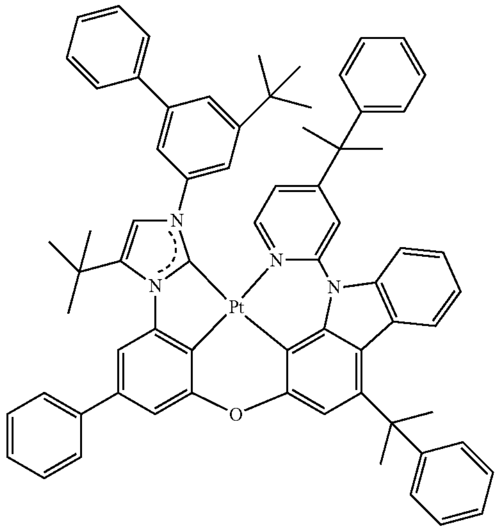
1611
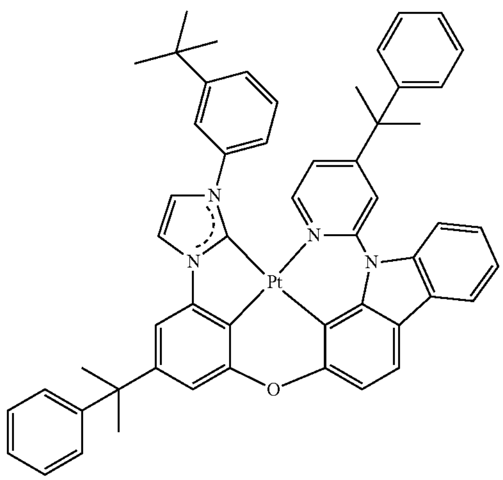
1612
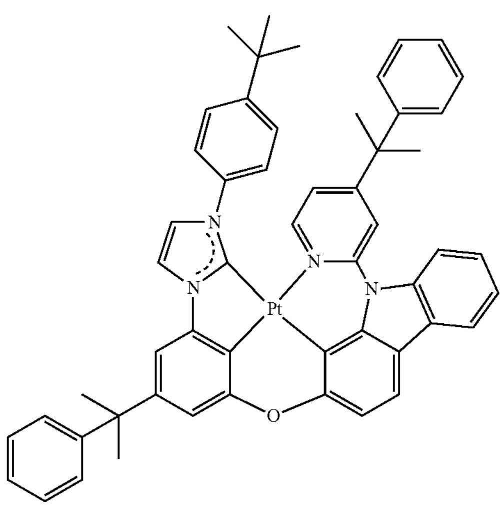
-continued
1613
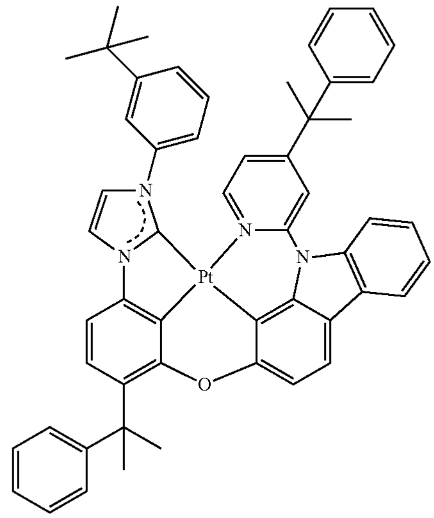
1614
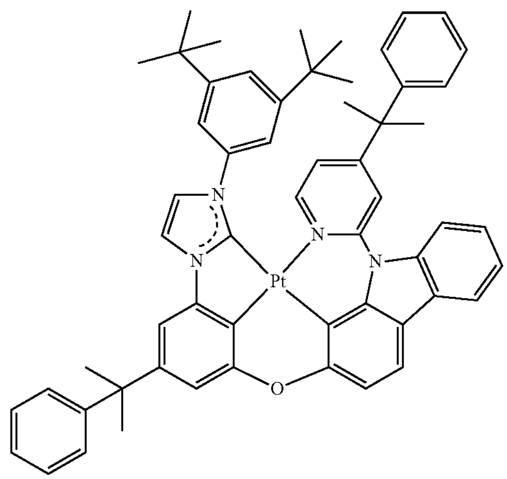
1615
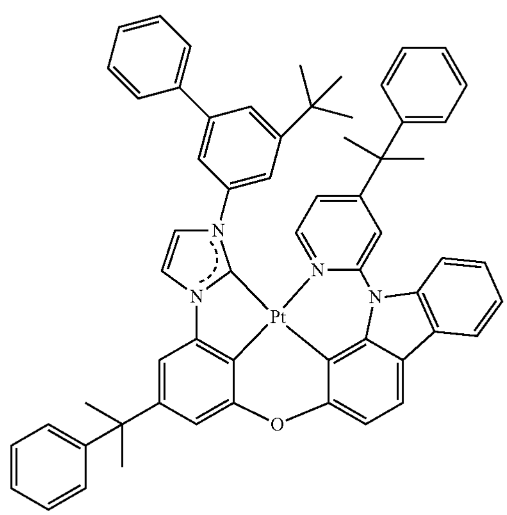

1616
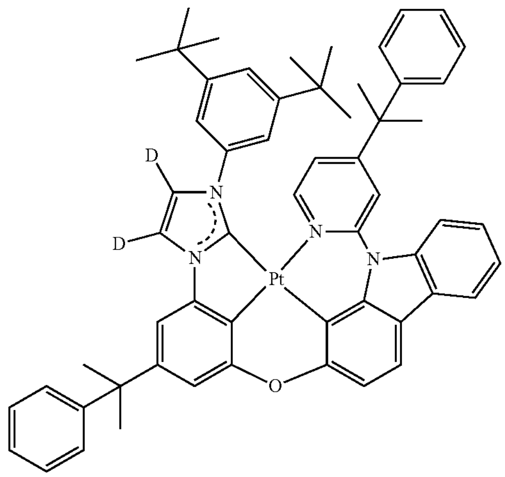
1617
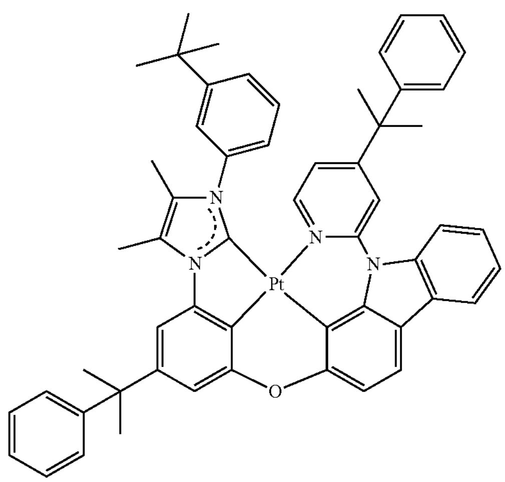
1618
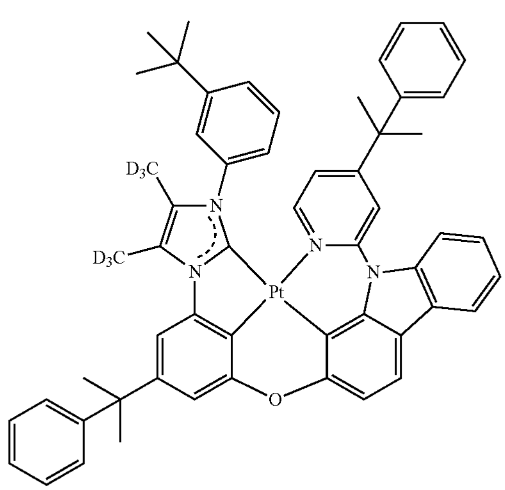
1619
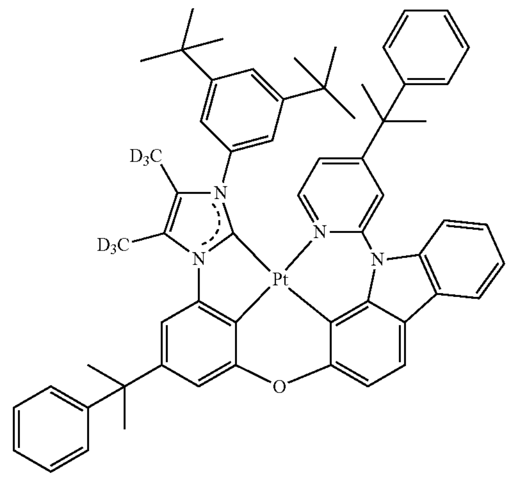
1620
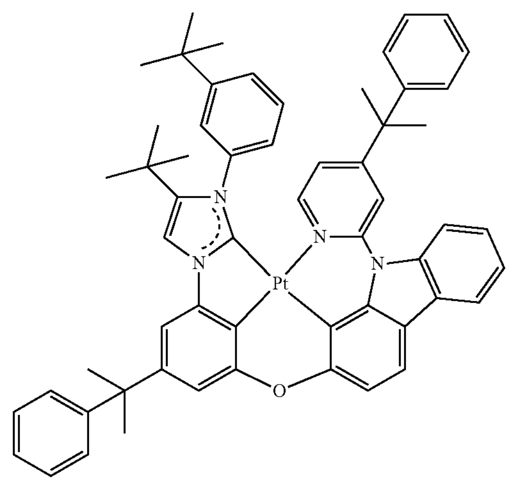
1621
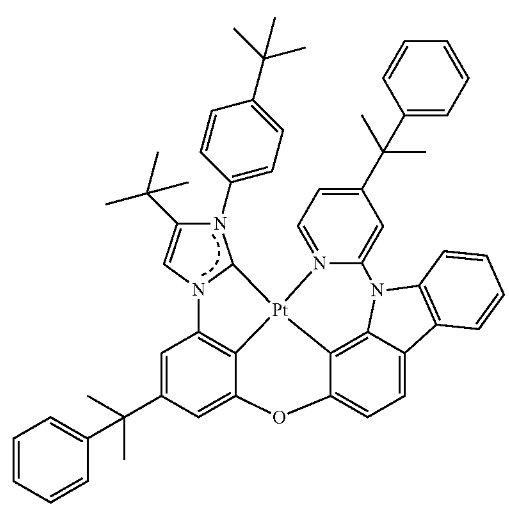

-continued
1622
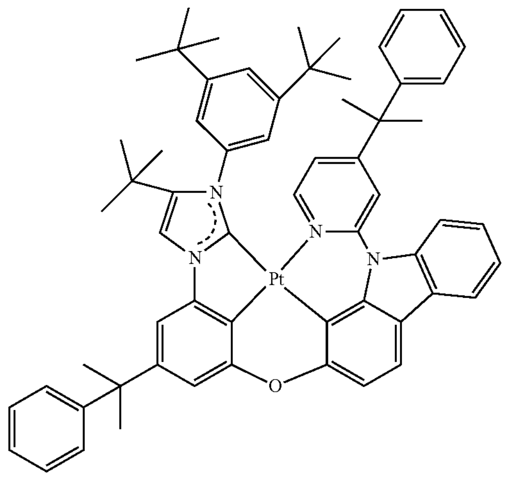
1623
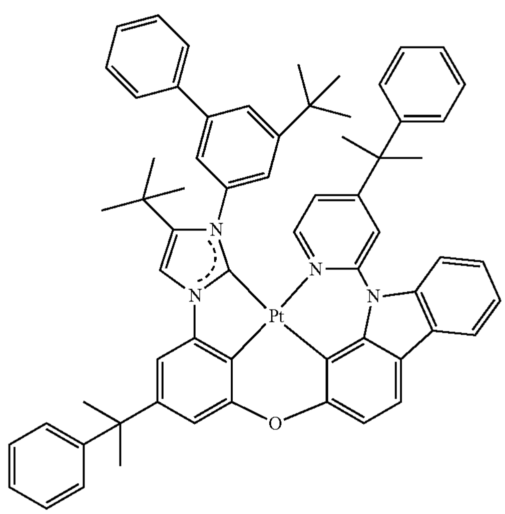
1624
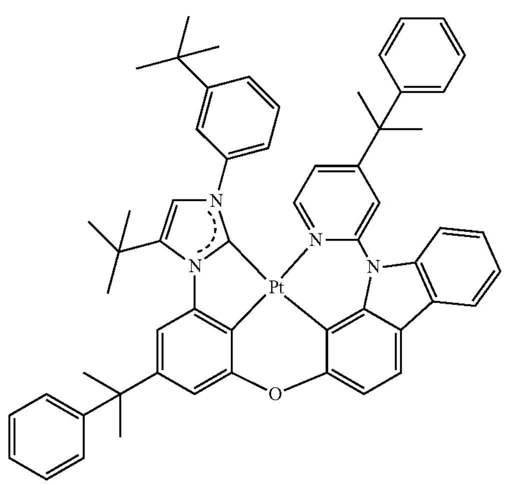
-continued
1625
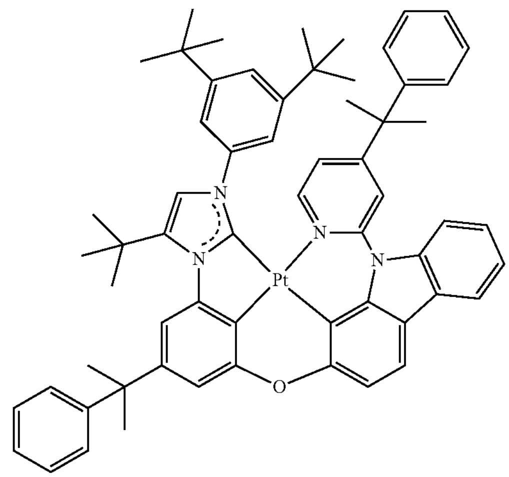
1626
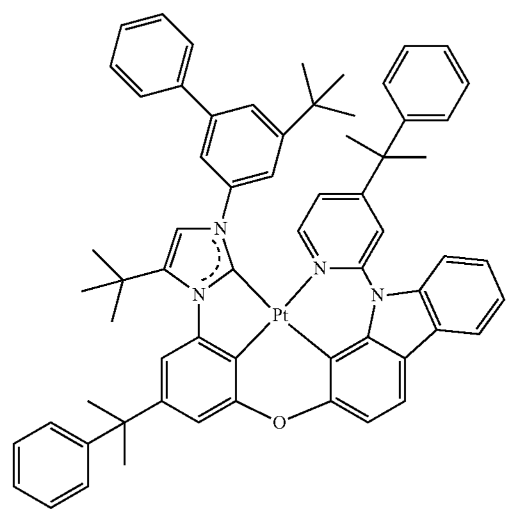
1627
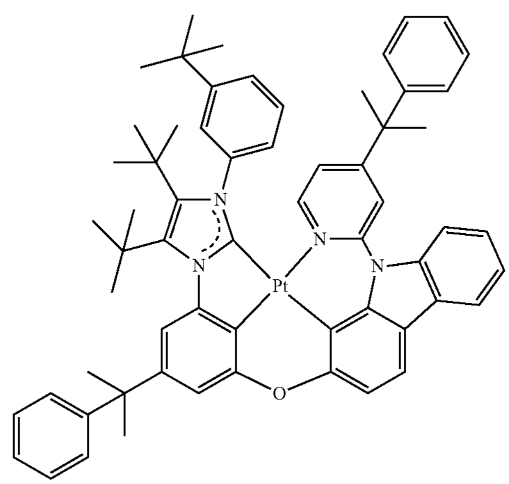

-continued
1628
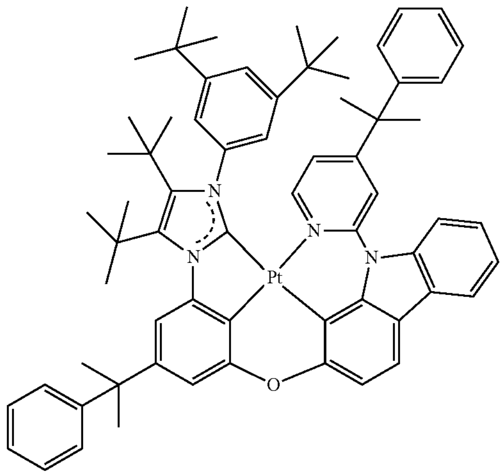
1629
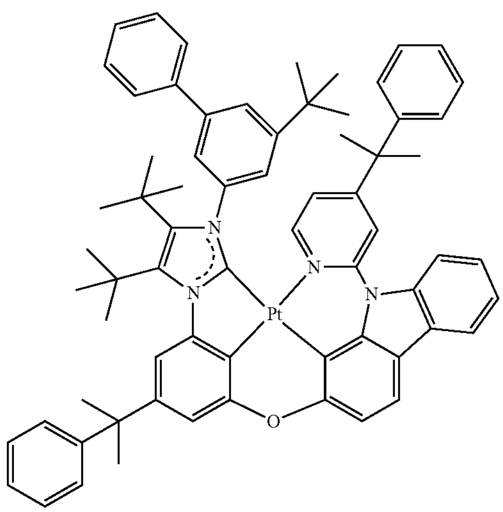
1630
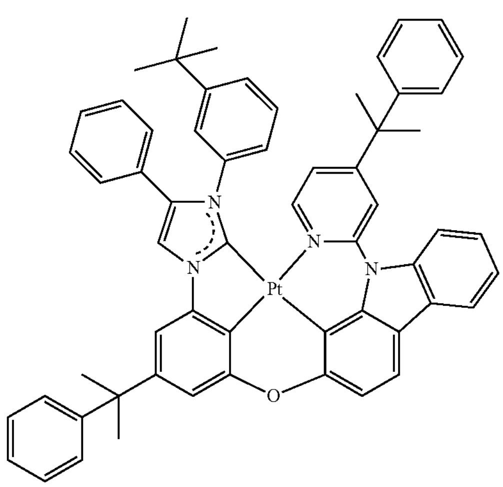
-continued
1631
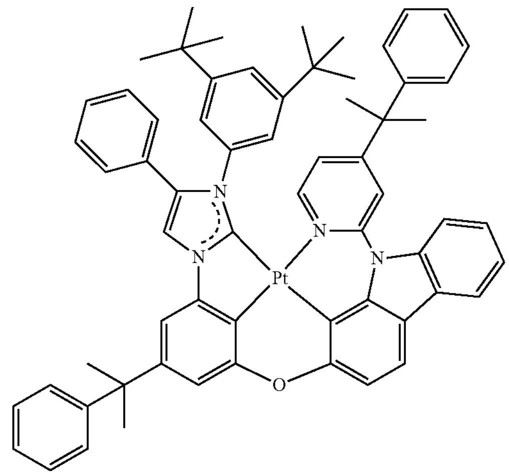
1632
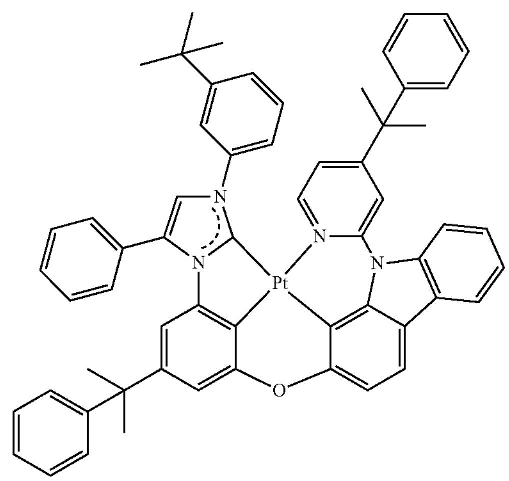
1633
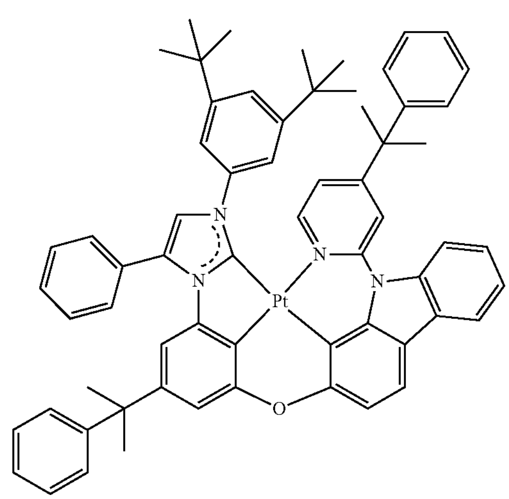

-continued
1634
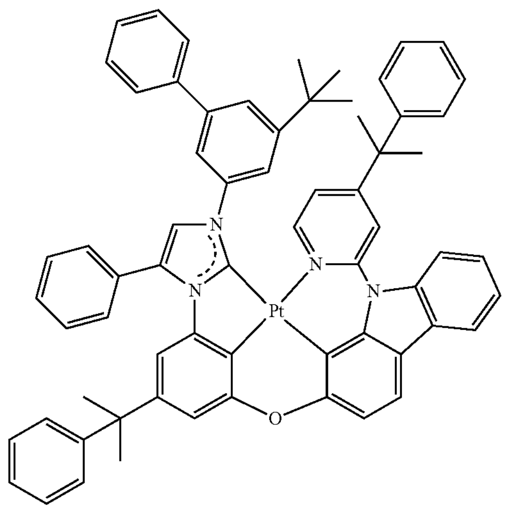
1635
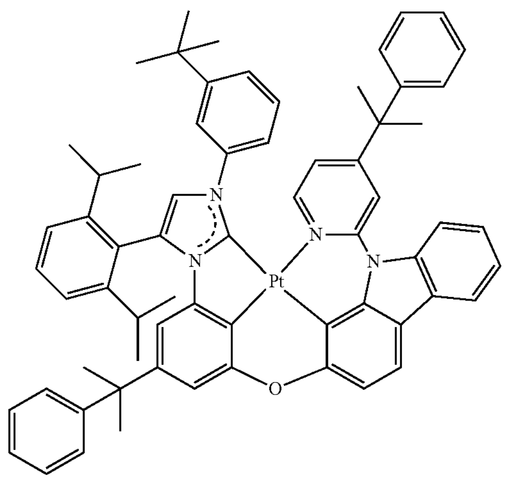
1636
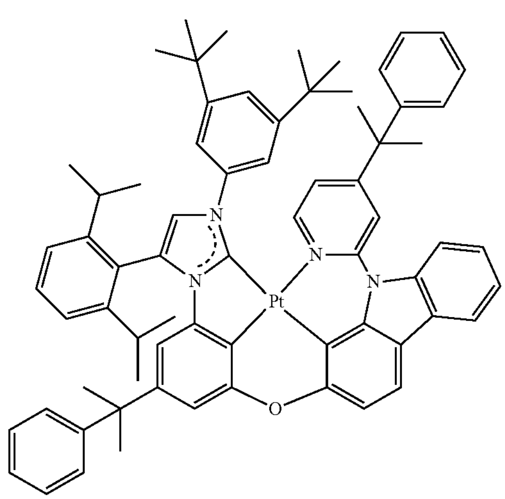
-continued
1637
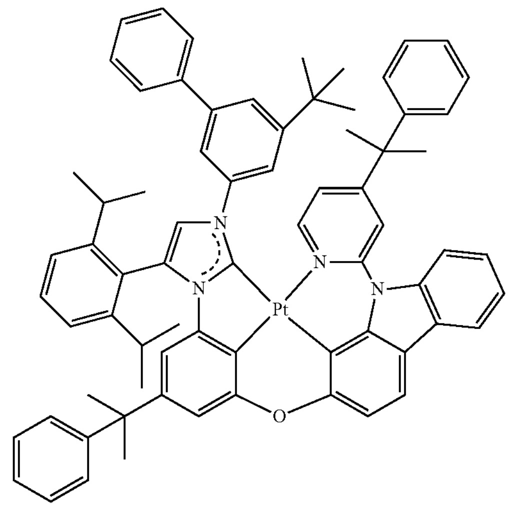
1638
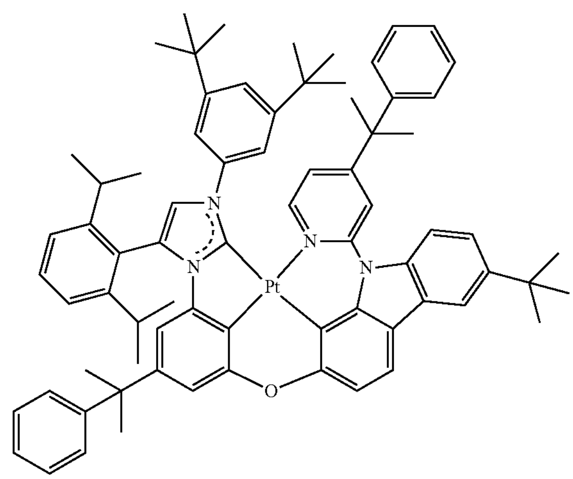
1639
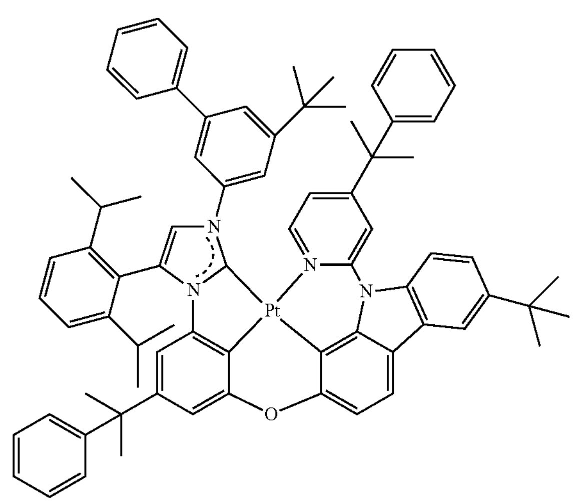

-continued
1640
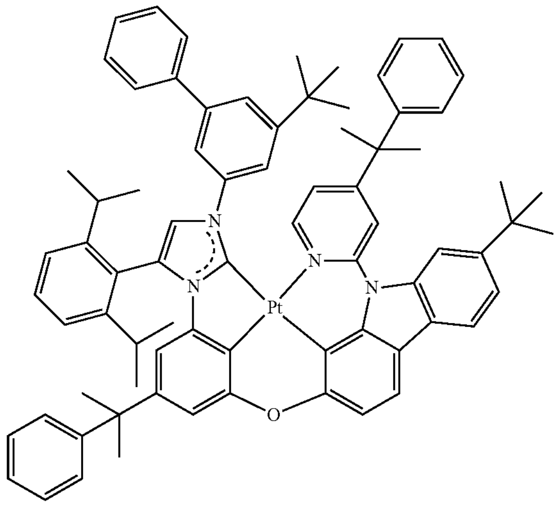
1641
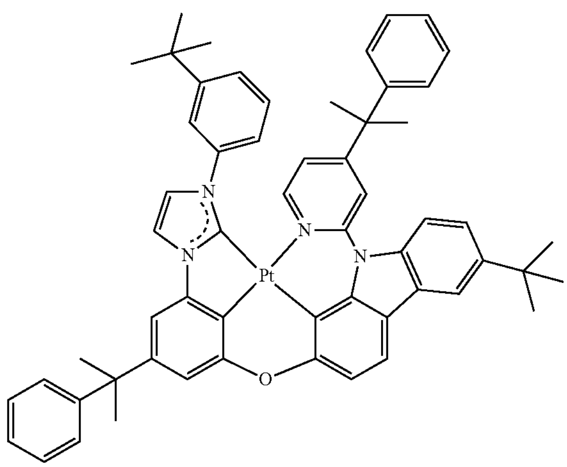
1642
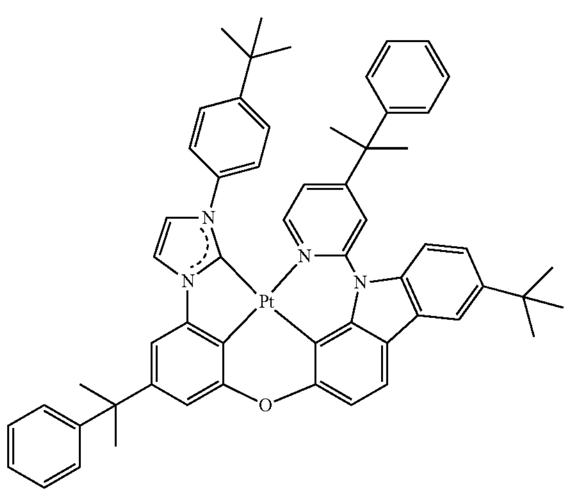
-continued
1643
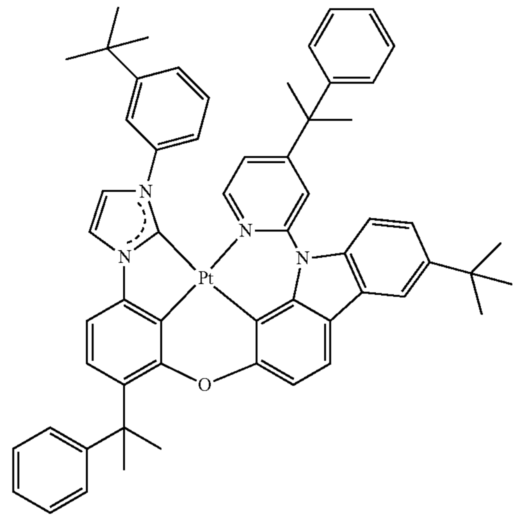
1644
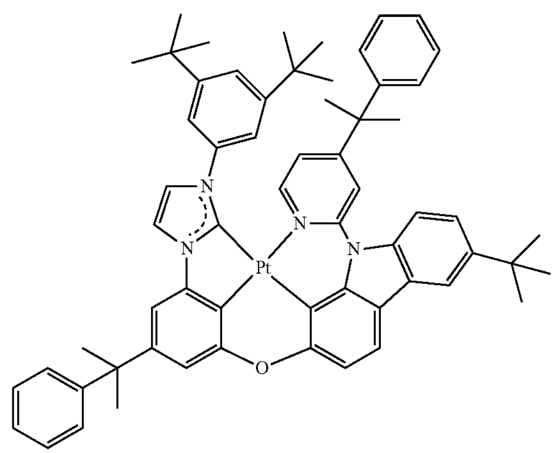
1645
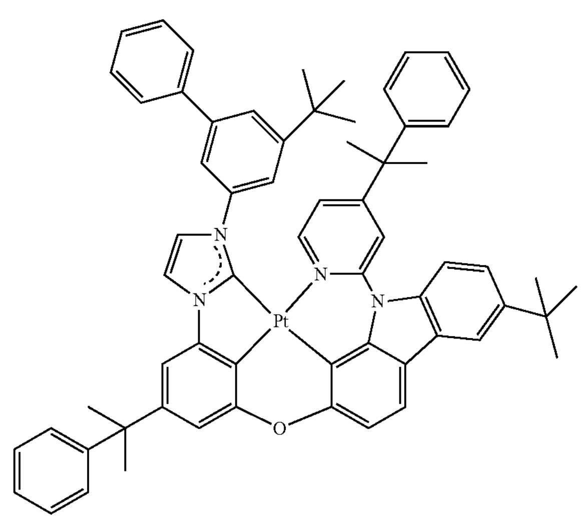

-continued
1646
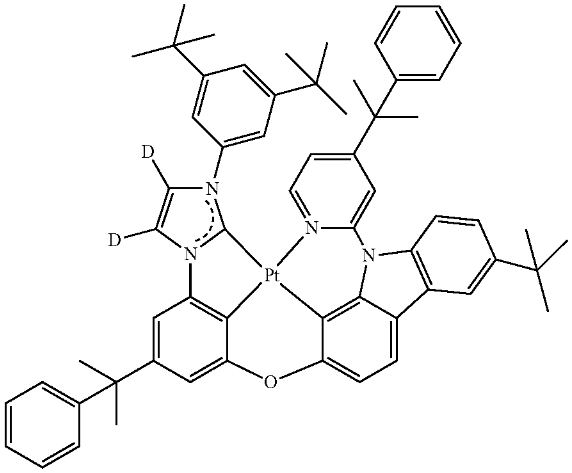
1647
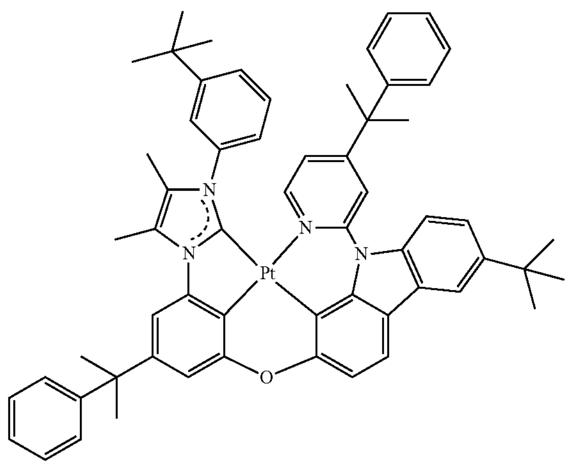
1648
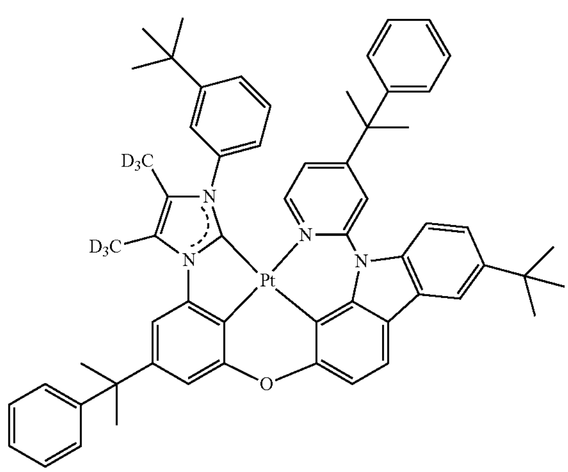
-continued
1649
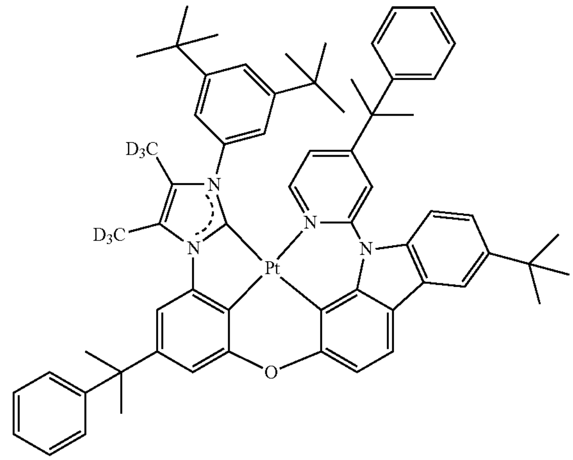
1650
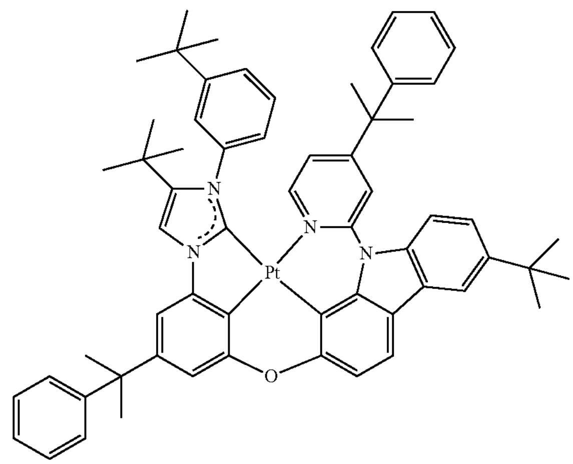
1651
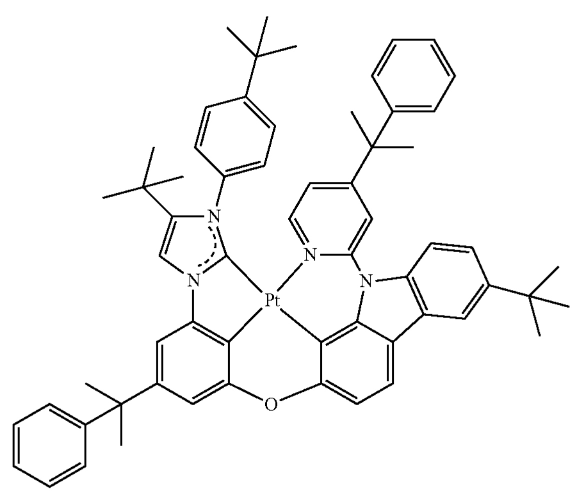

-continued
1652
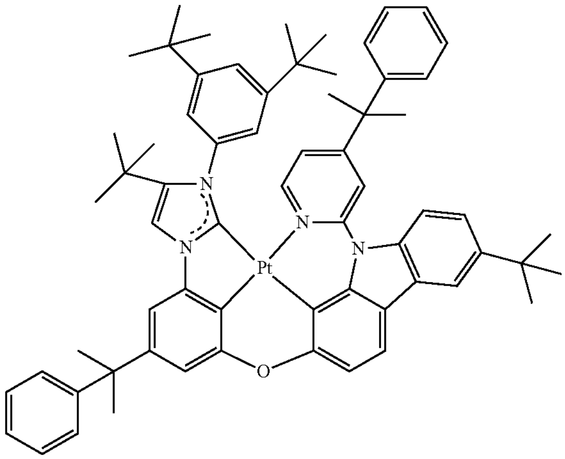
1653
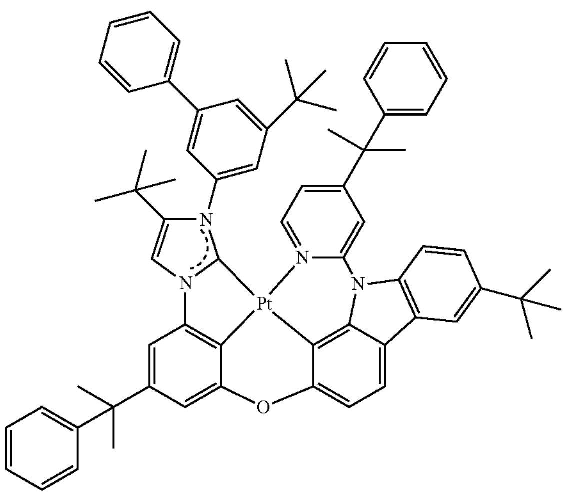
1654
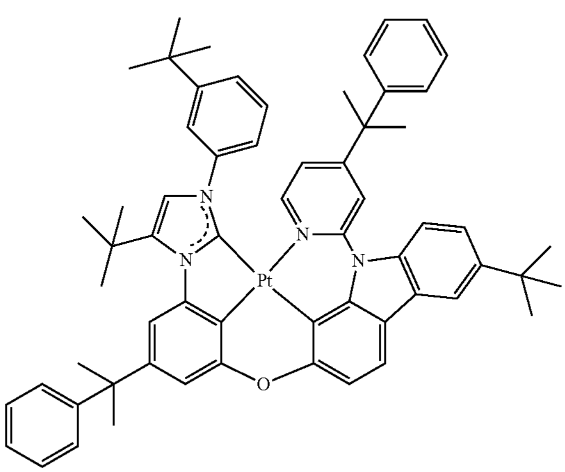
-continued
1655
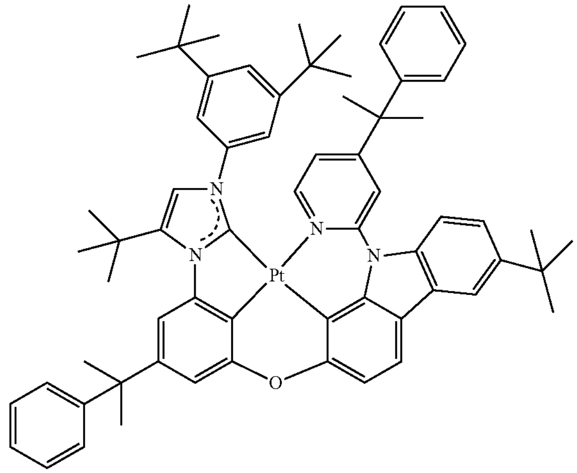
1656
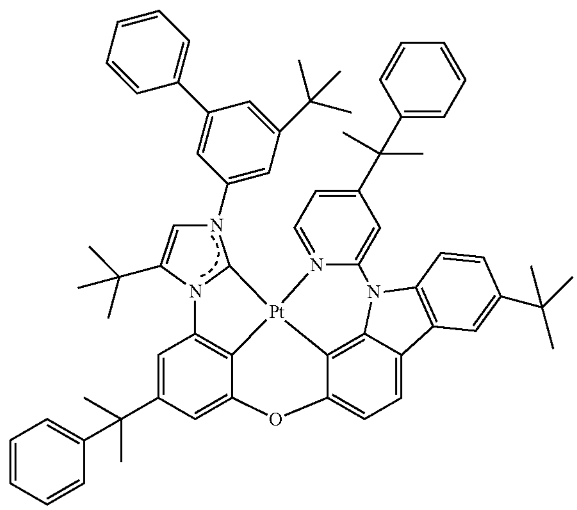
1657
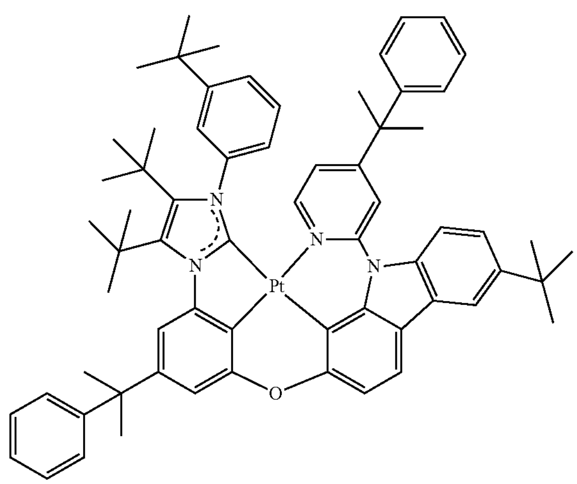

-continued
1658
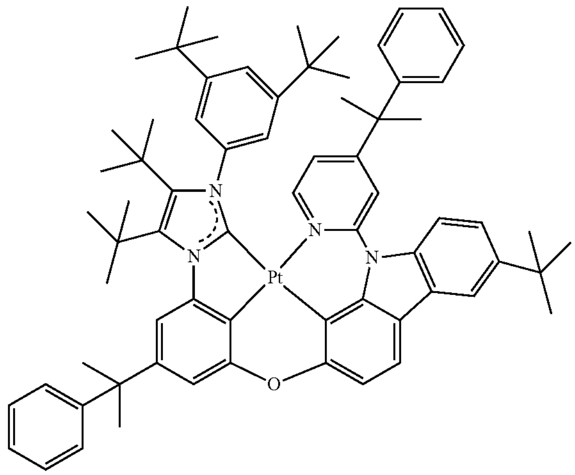
1659
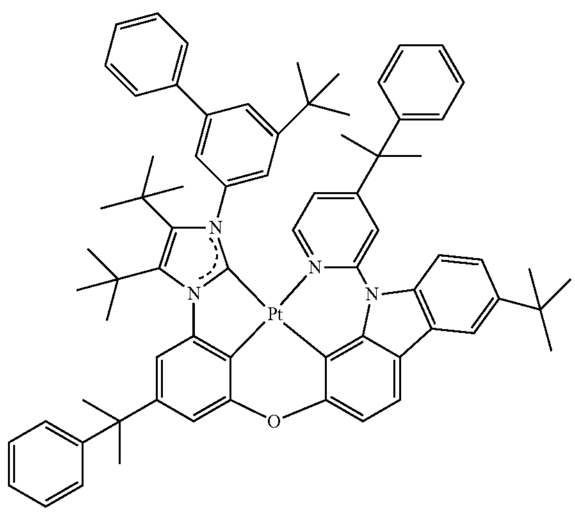
1660
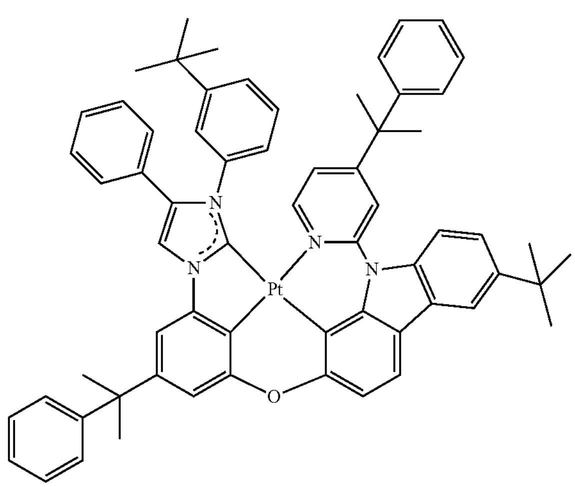
-continued
1661
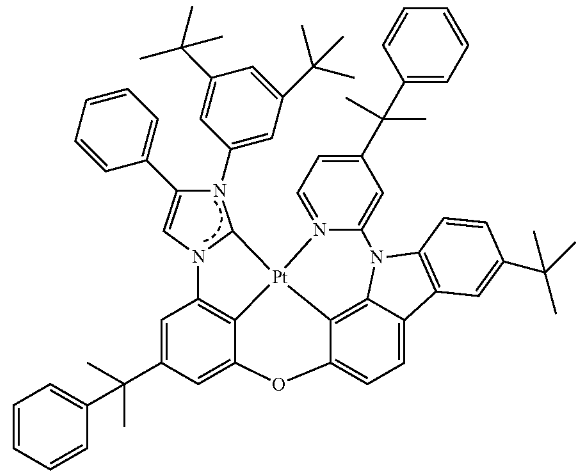
1662
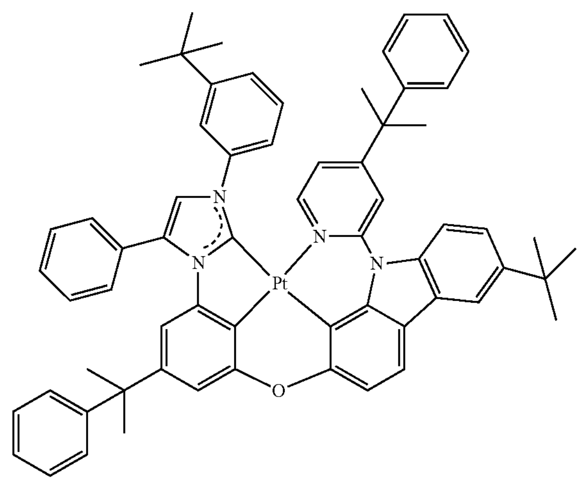
1663
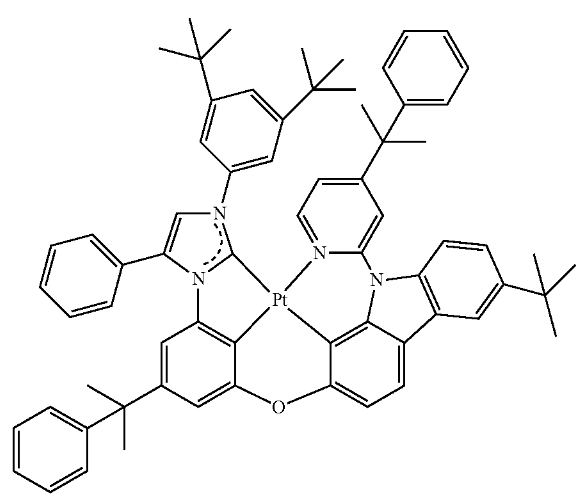

-continued
1664
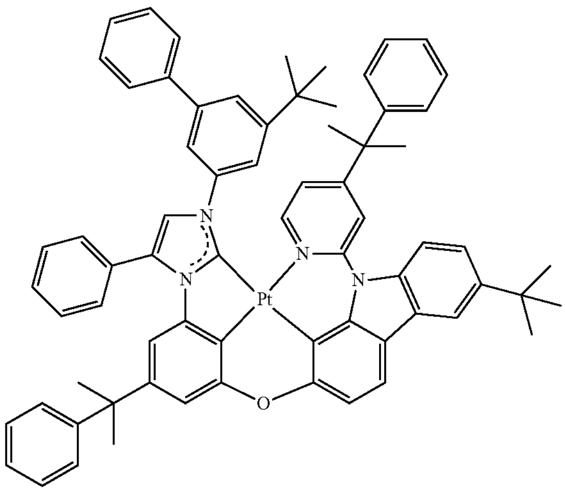
1665
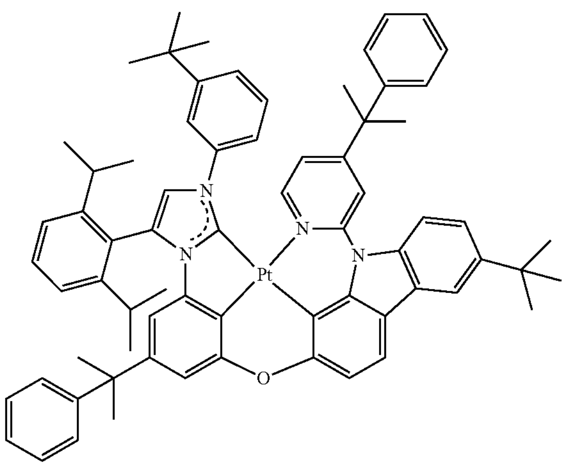
1666
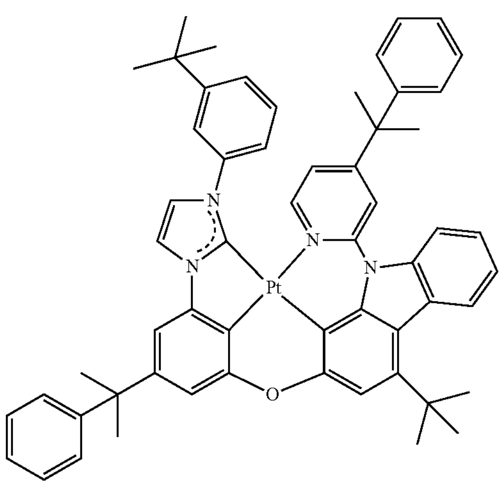
-continued
1667
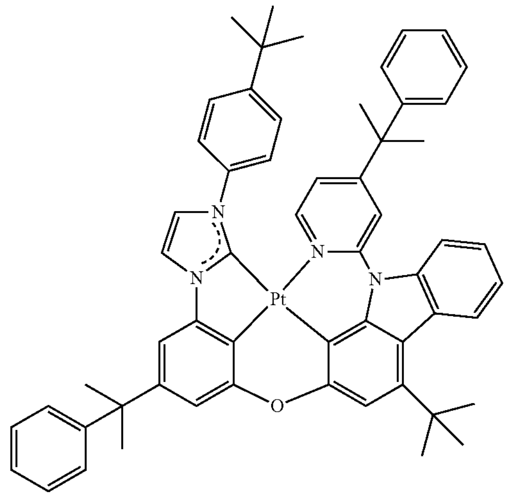
1668
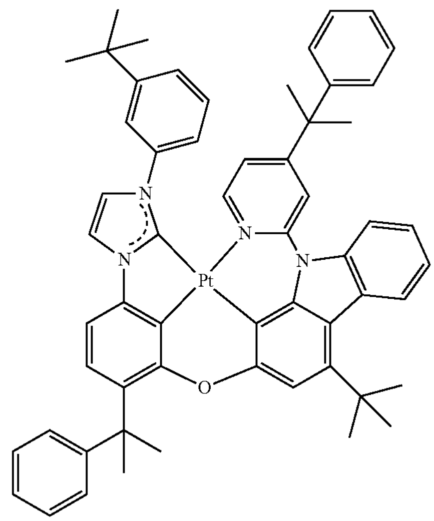
1669
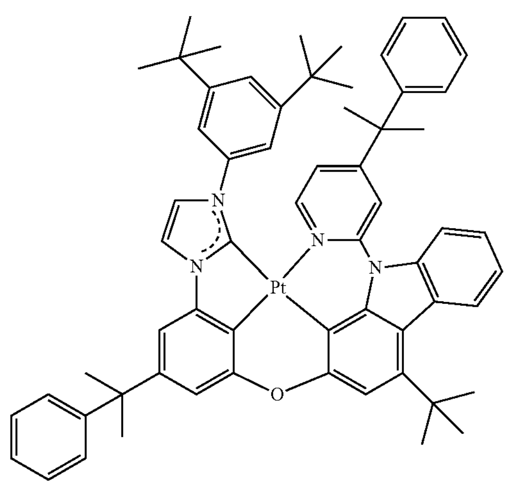

1670
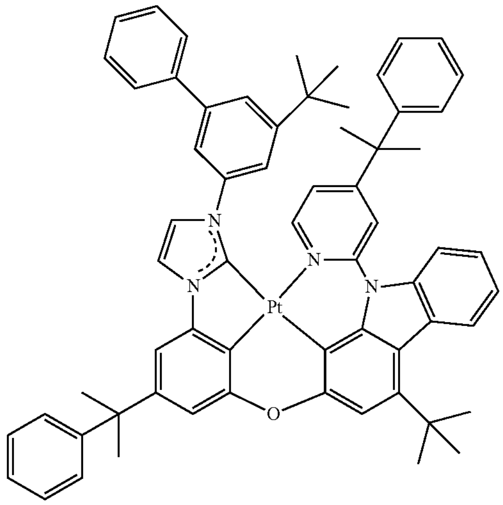
1671
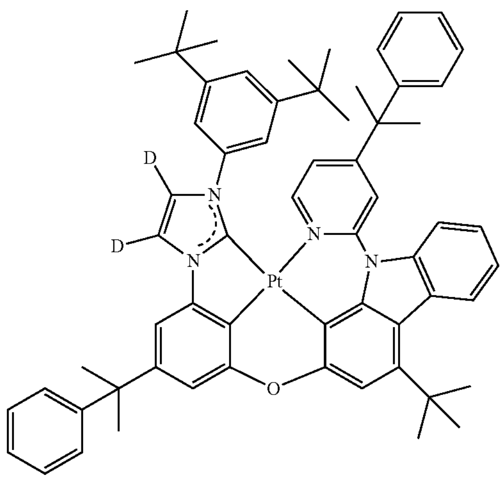
1672
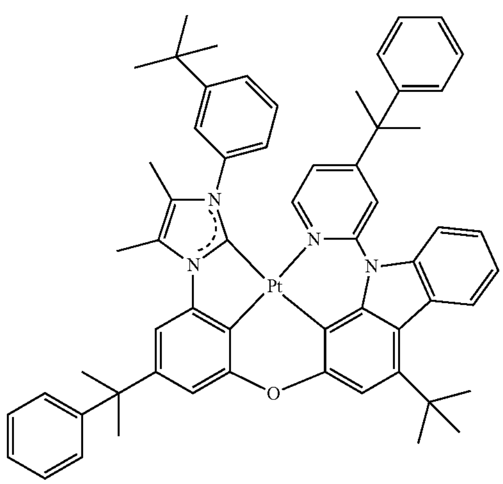
1673
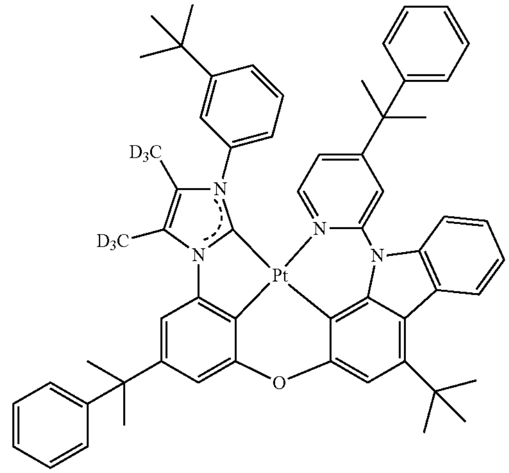
1674
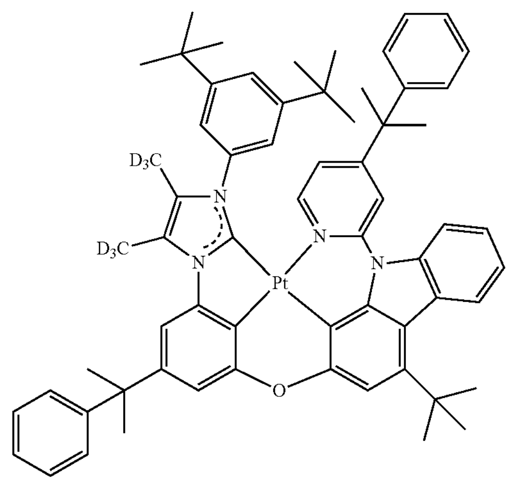
1675
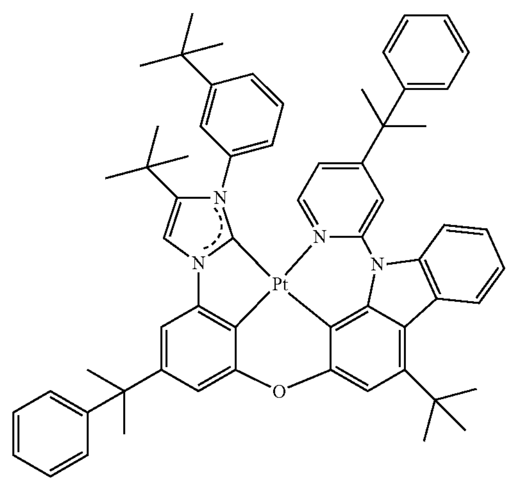

-continued
1676
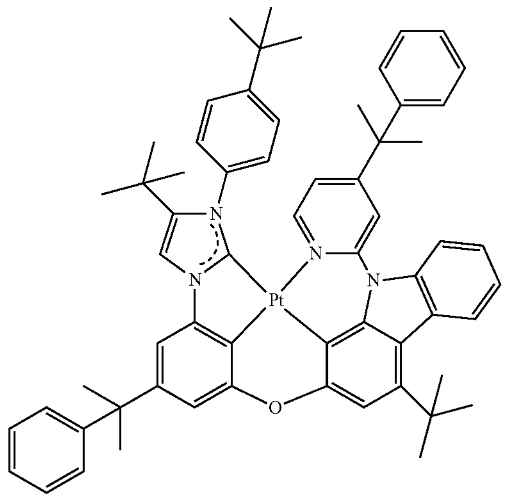
1677
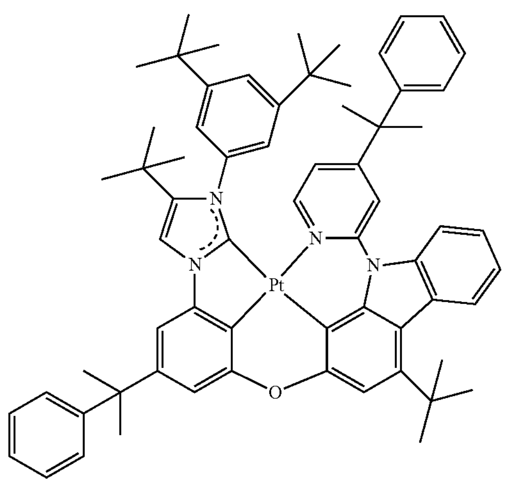
1678
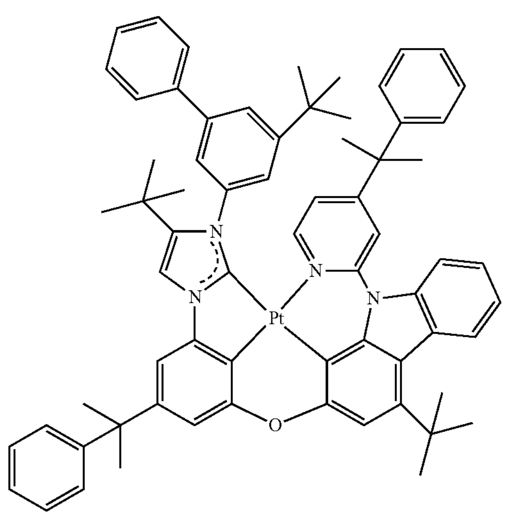
-continued
1679
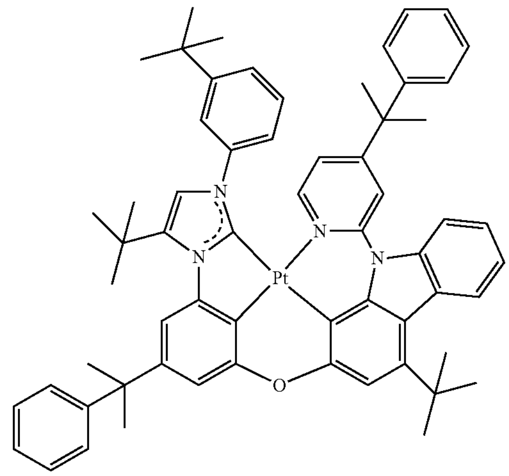
1680
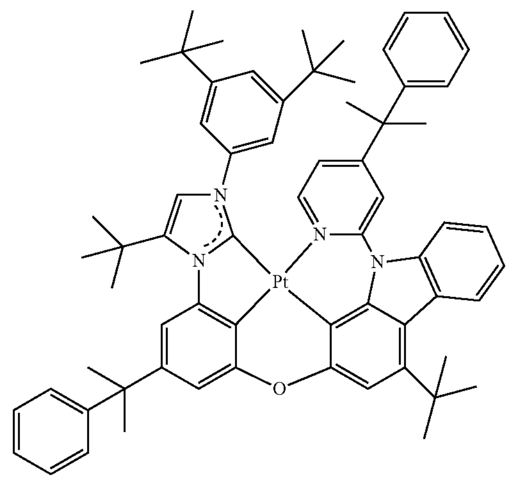
1681
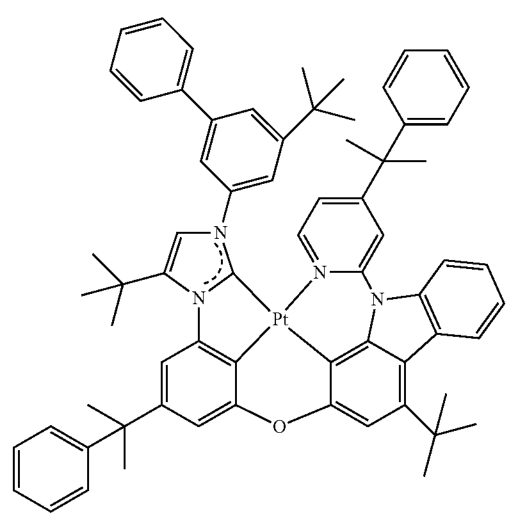

-continued
1682
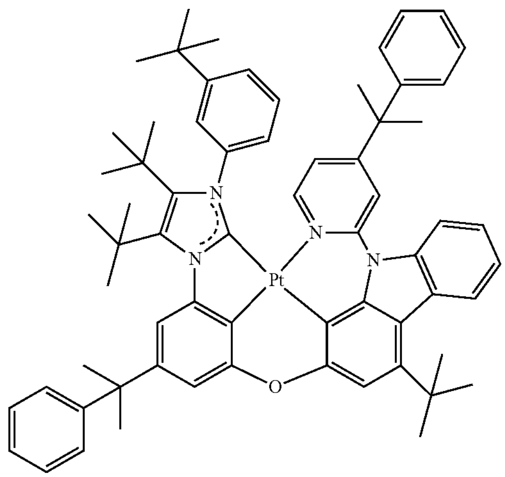
1683
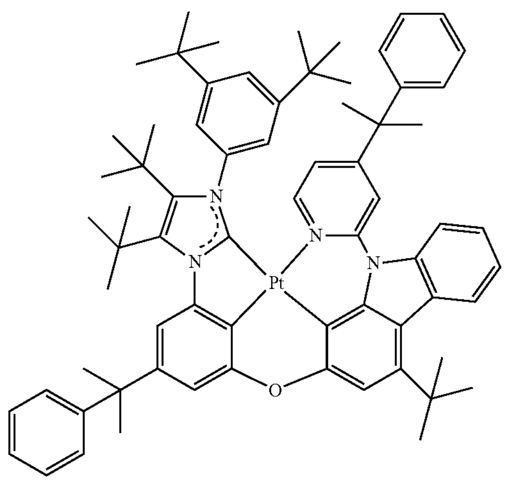
1684
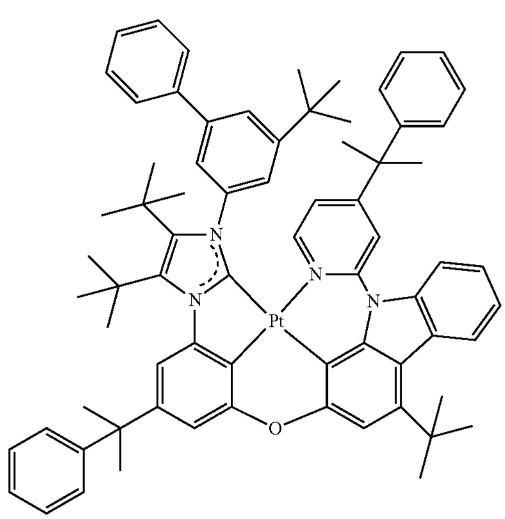
-continued
1685
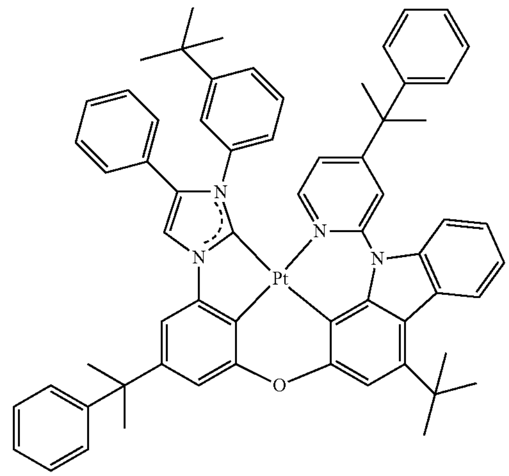
1686
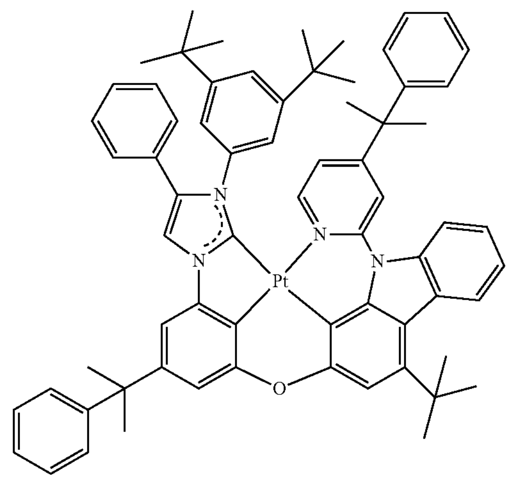
1687
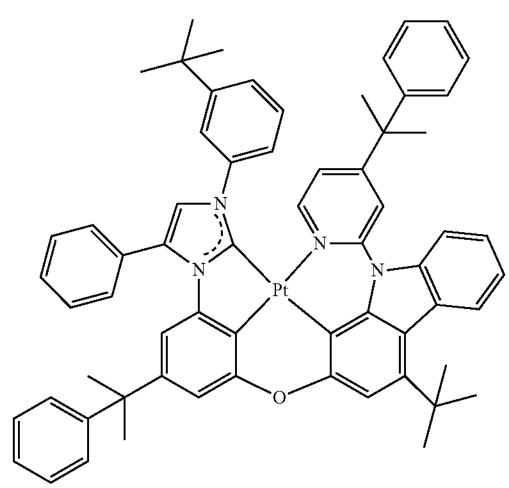

-continued
1688
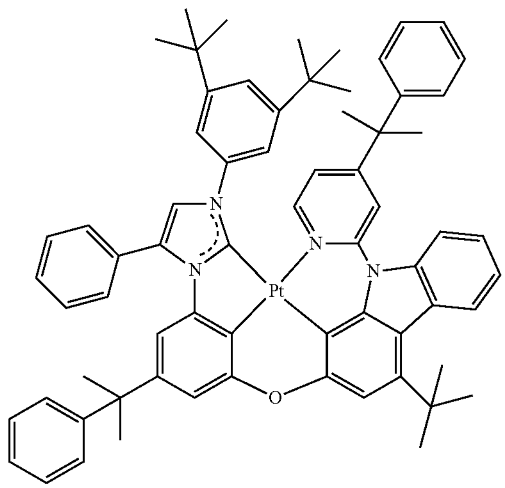
1689
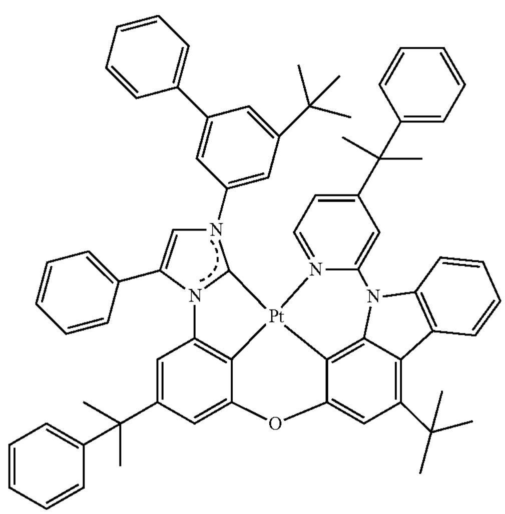
1690
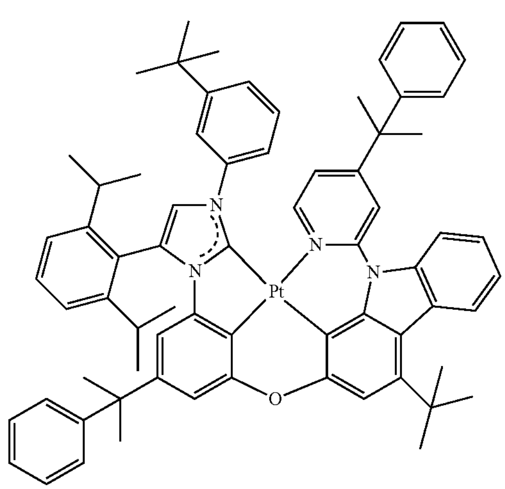
-continued
1691
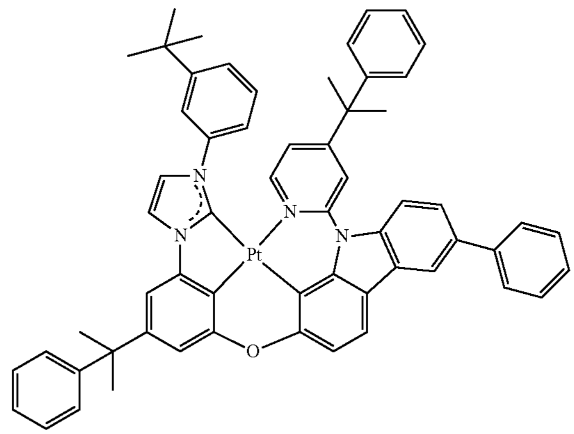
1692
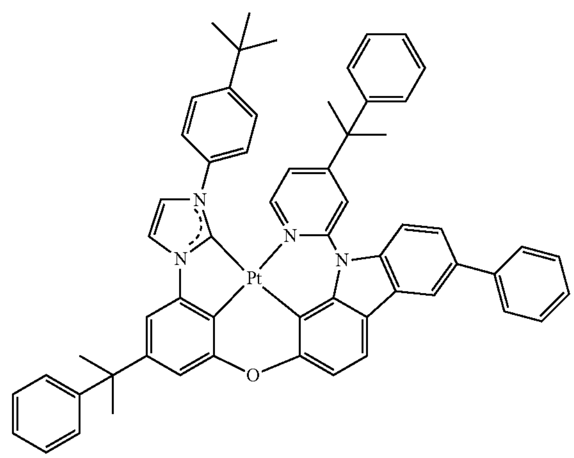
1693
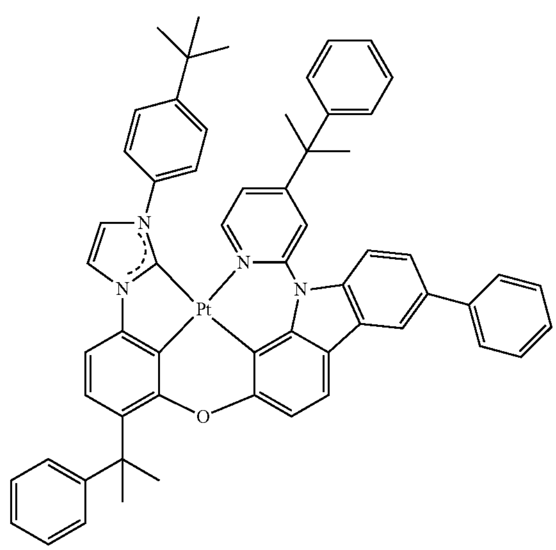

1694
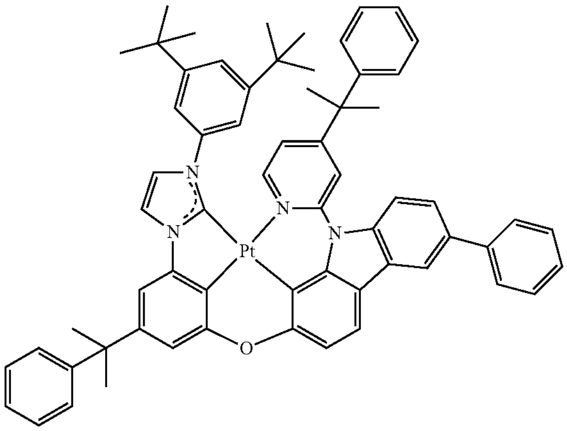
1695
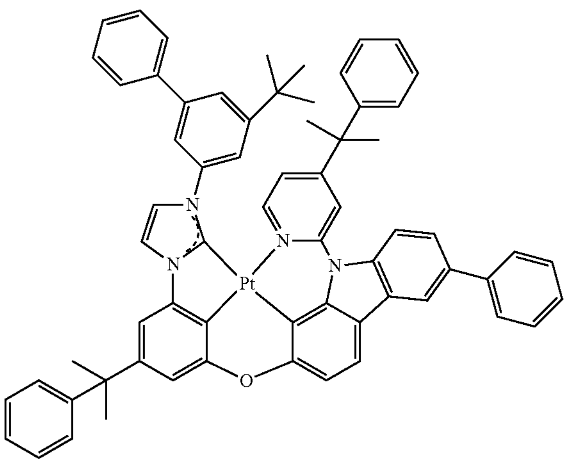
1696
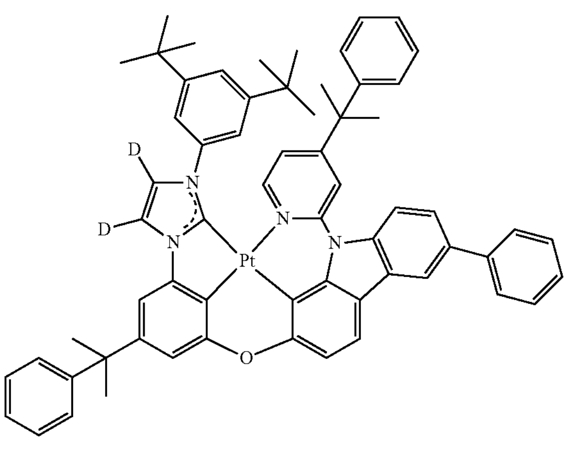
1697
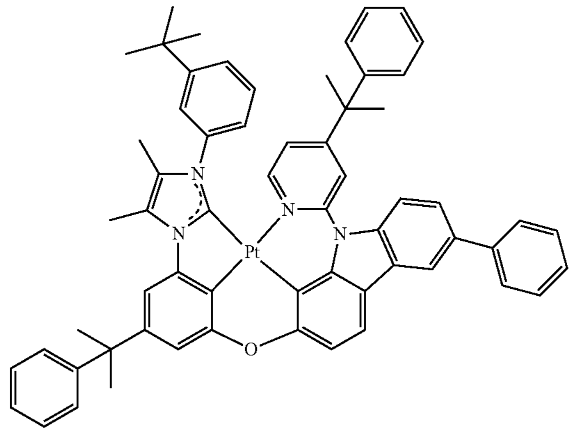
1698
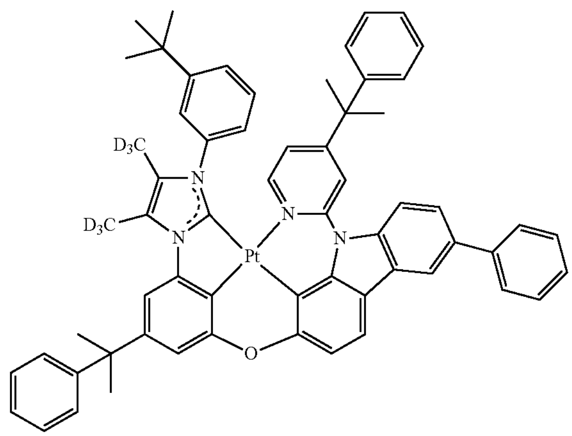
1699
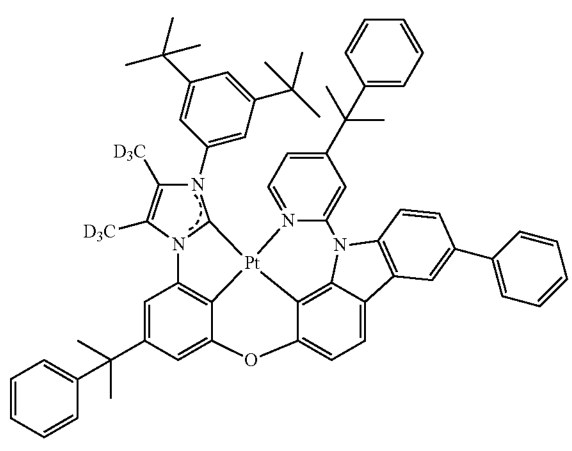

-continued
1700
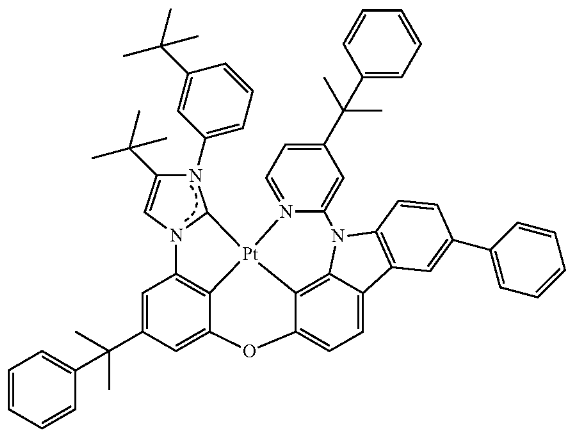
1701
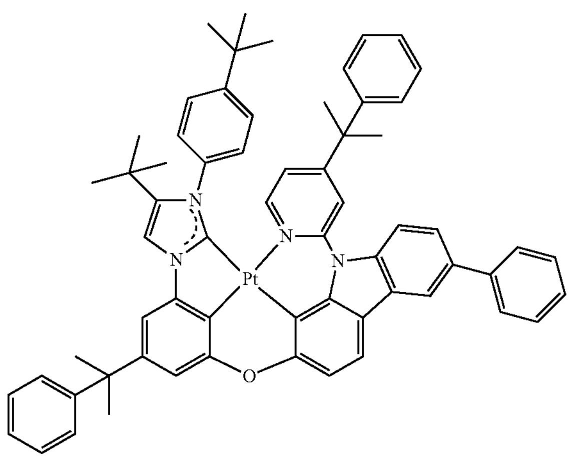
1702
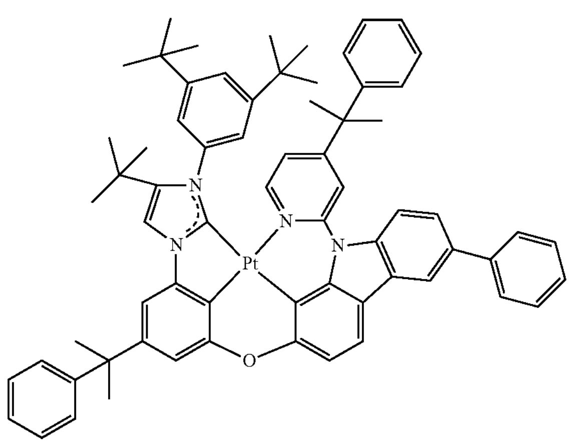
-continued
1703
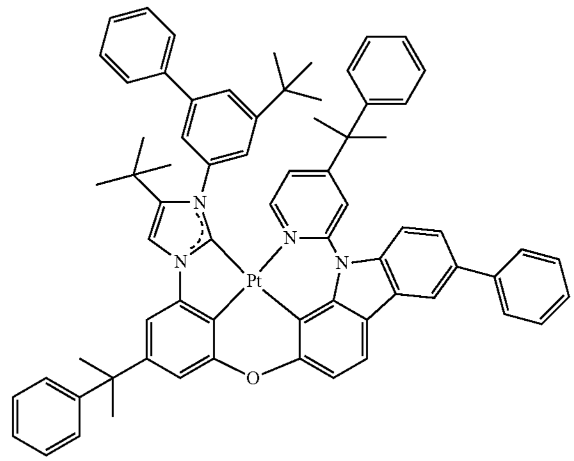
1704
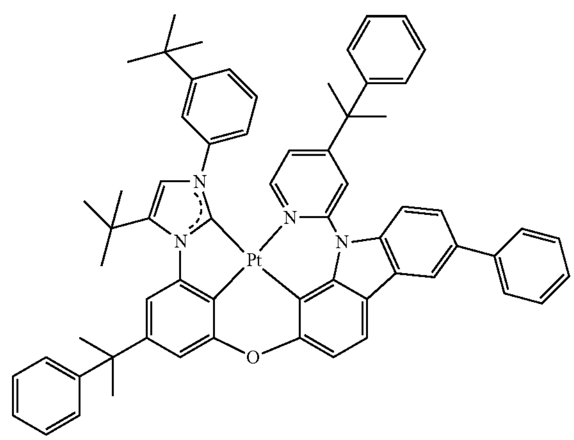
1705
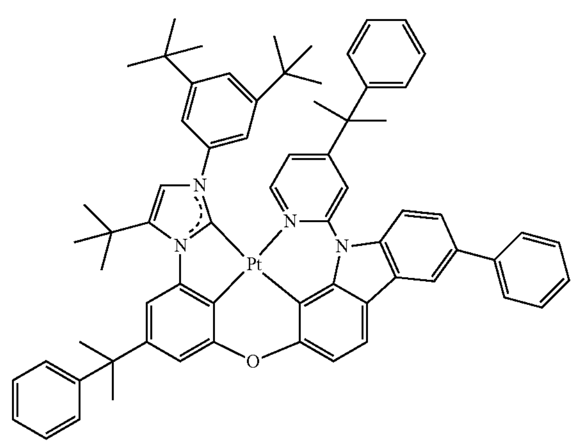

-continued
1706
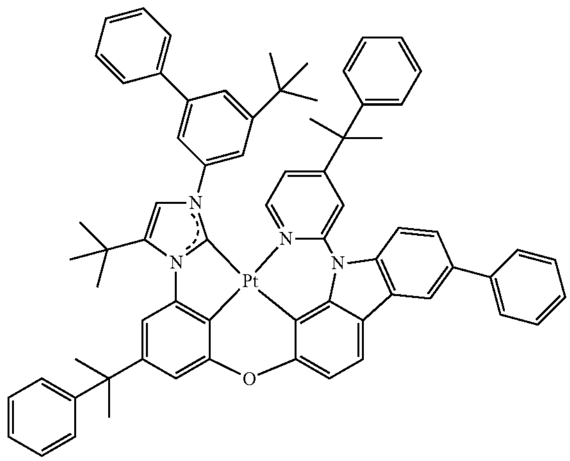
1707
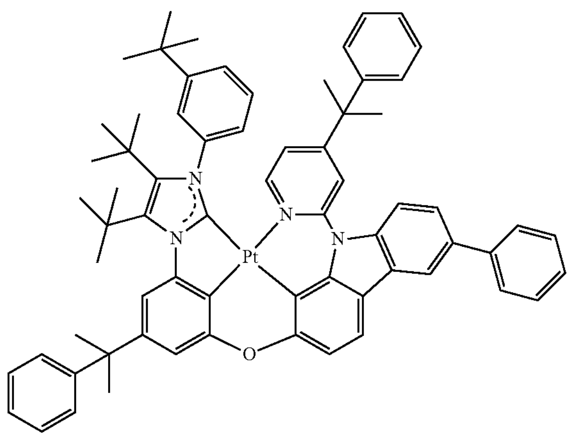
1708
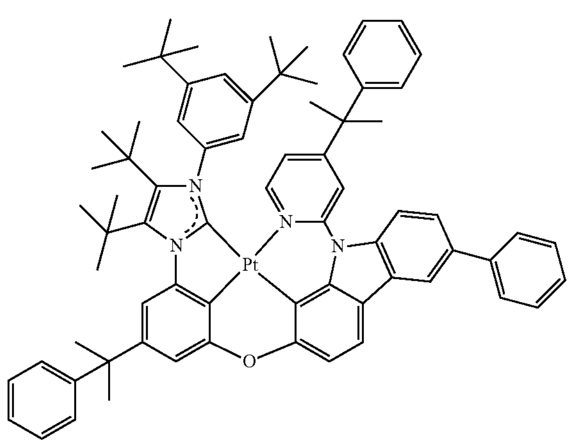
-continued
1709
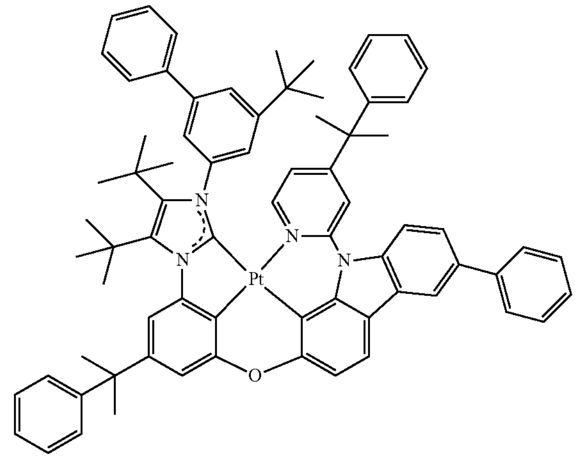
1710
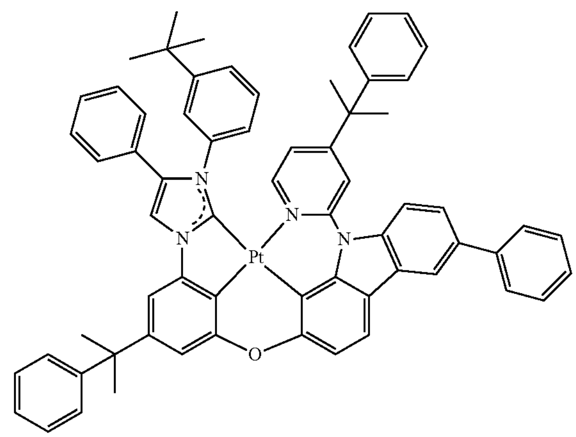
1711
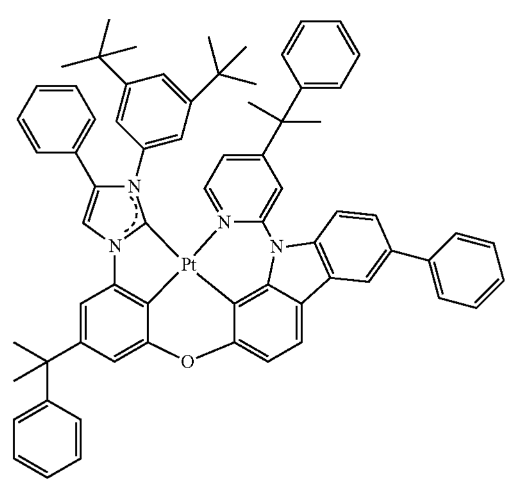

-continued
1712
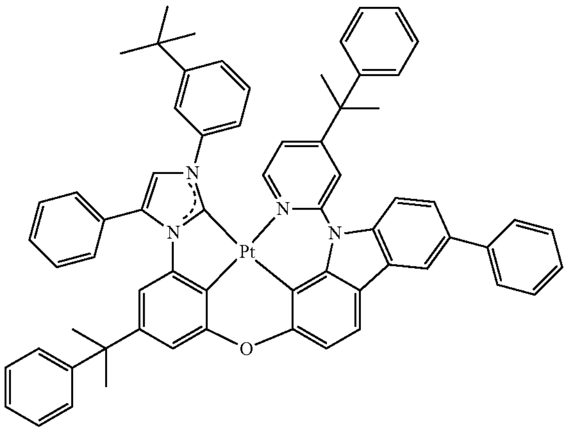
1713
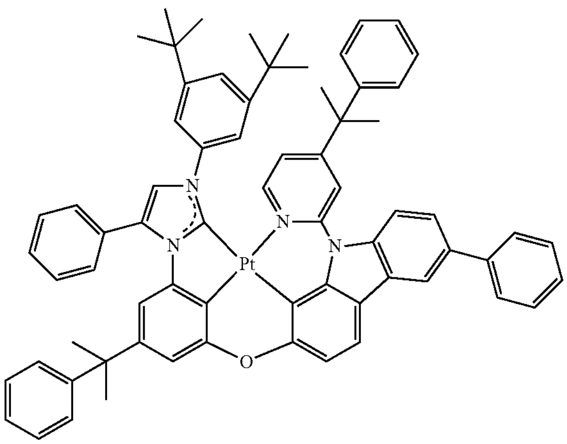
1714
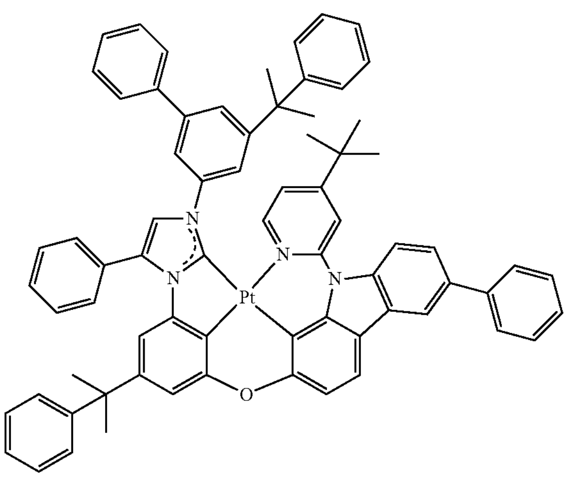
-continued
1715
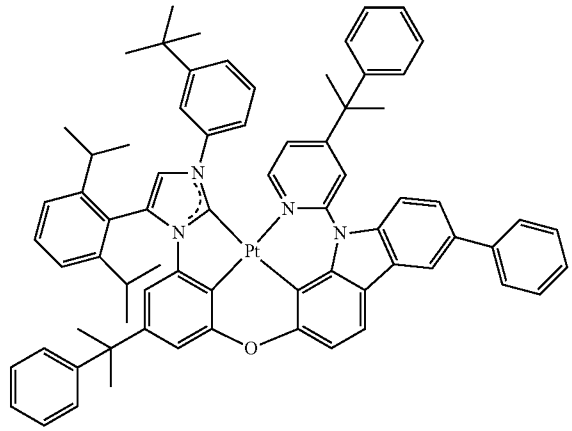
1716
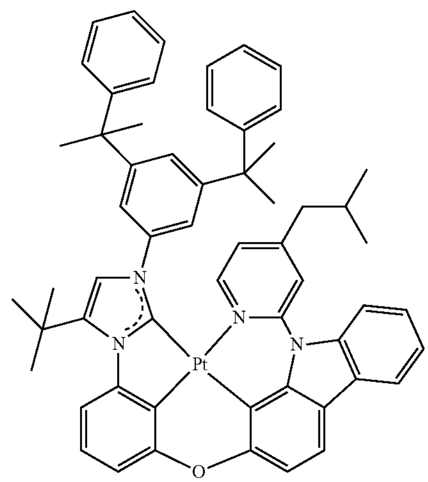
1717
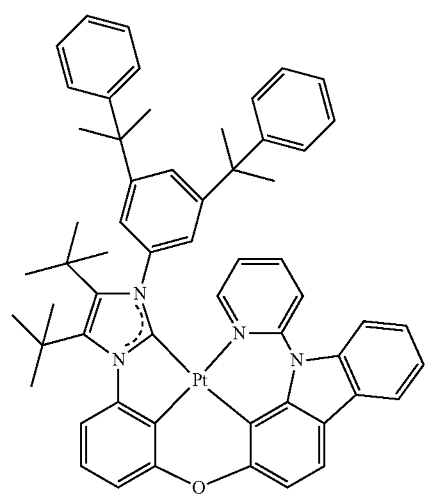

-continued
1718
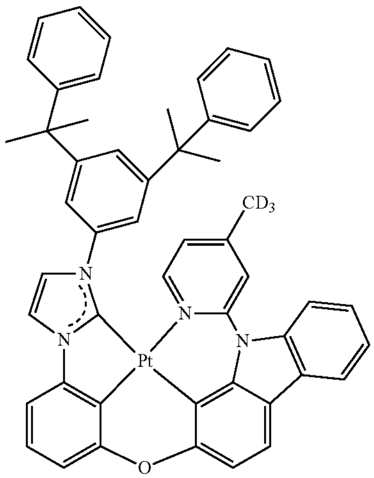
1719
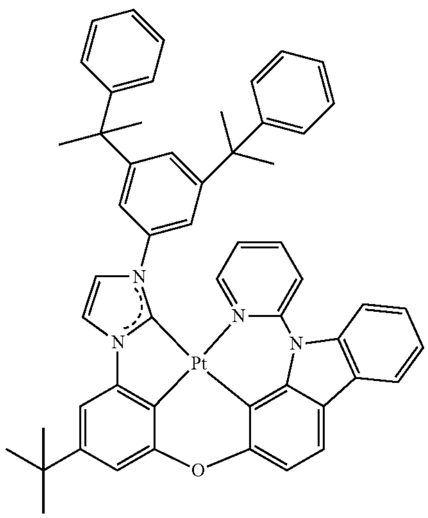
1720
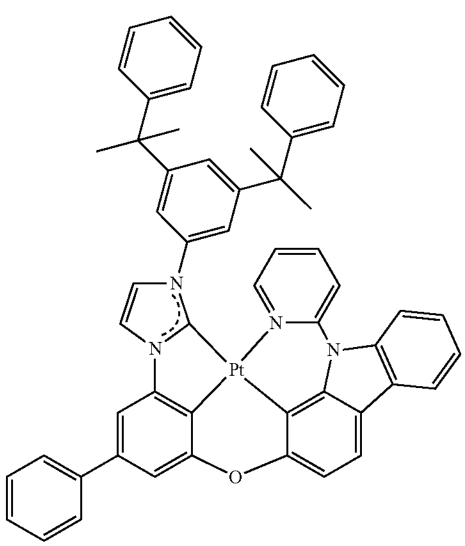
-continued
1721
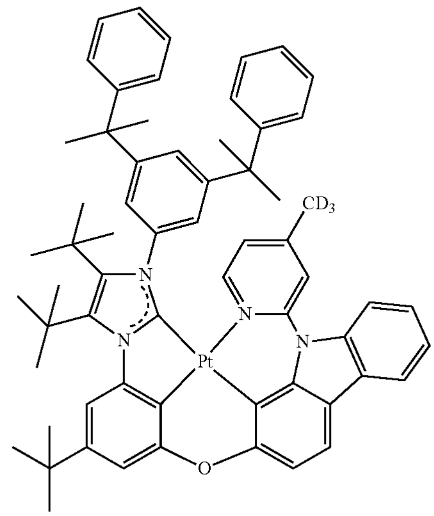
1722
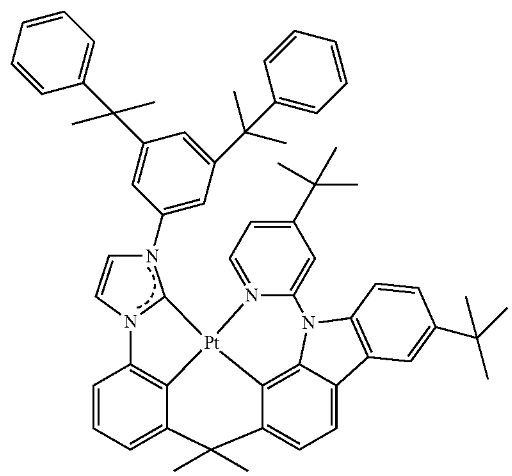
1723
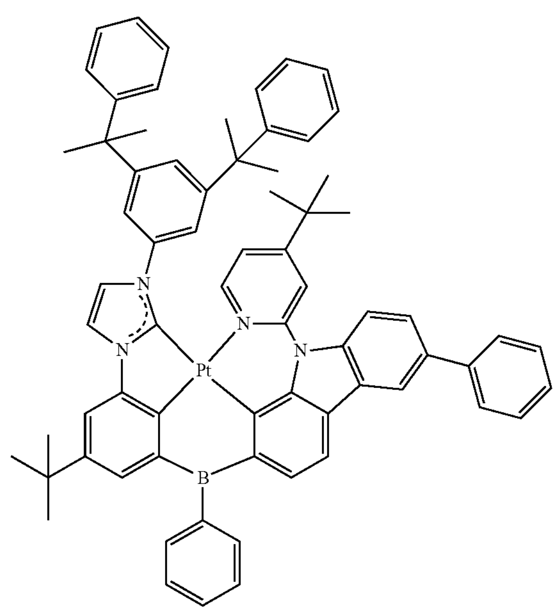

-continued
1724
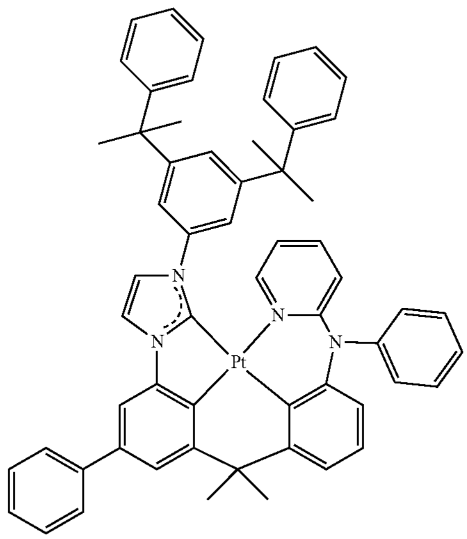
1725
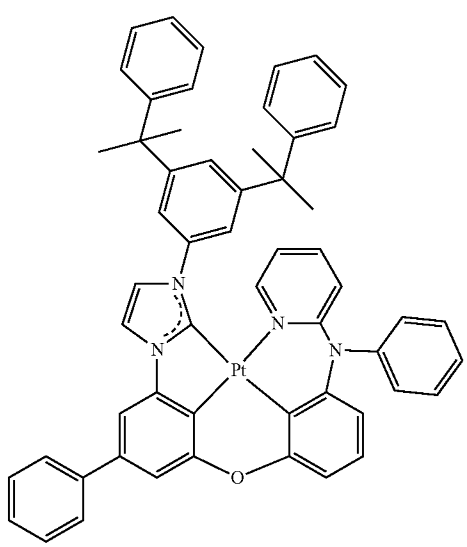
-continued
1726
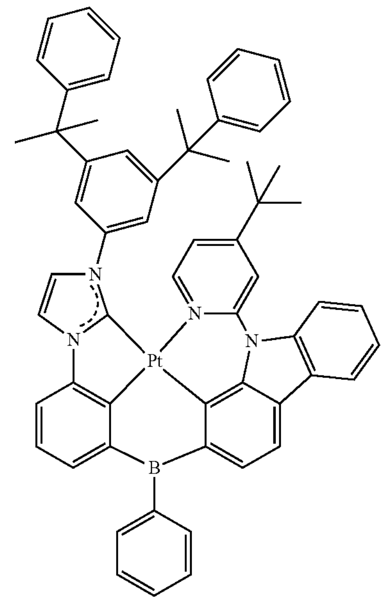
1727
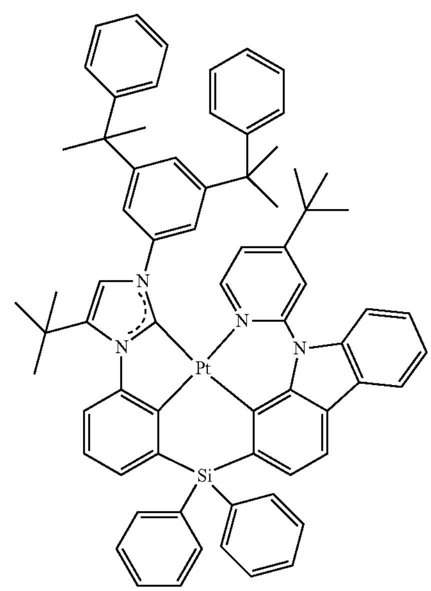
1728
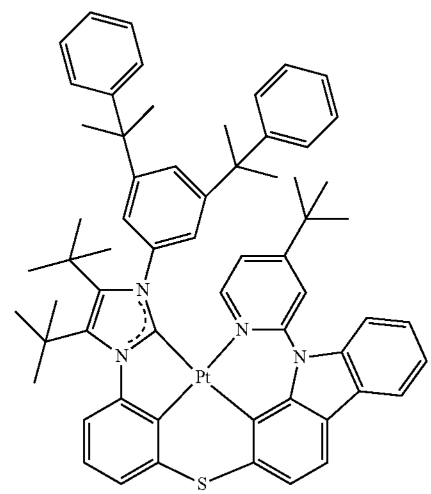

1729
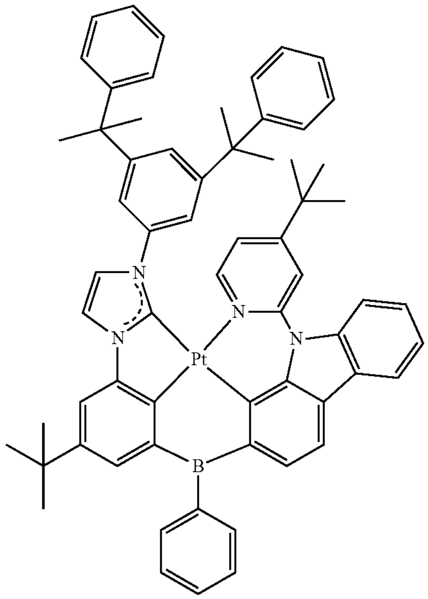
1730
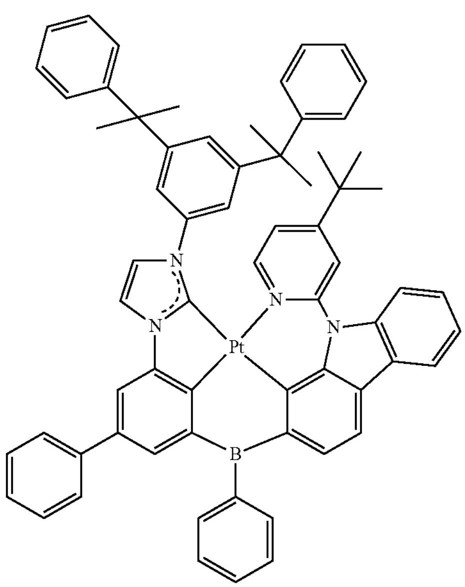
1731
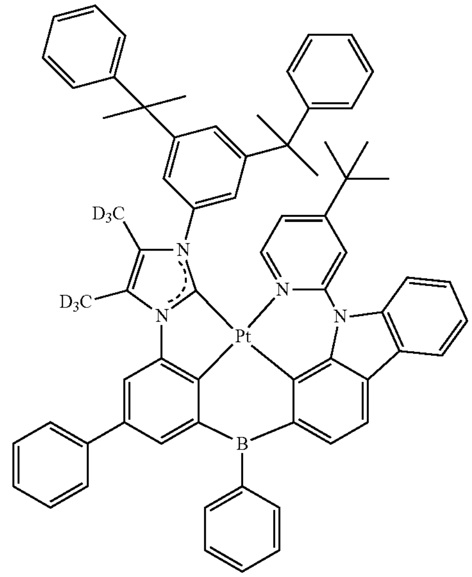
1732
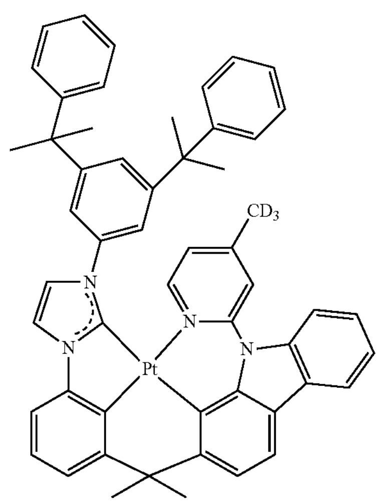

-continued
1733
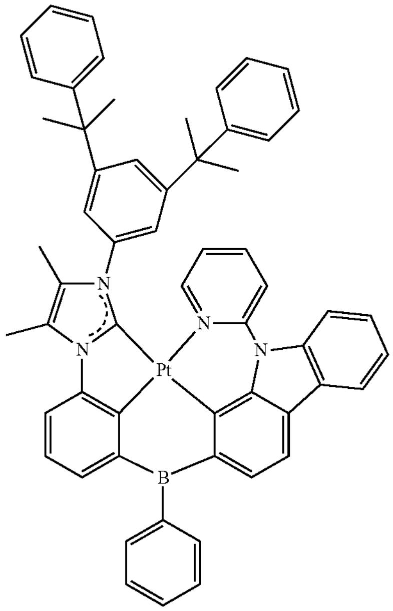
1734
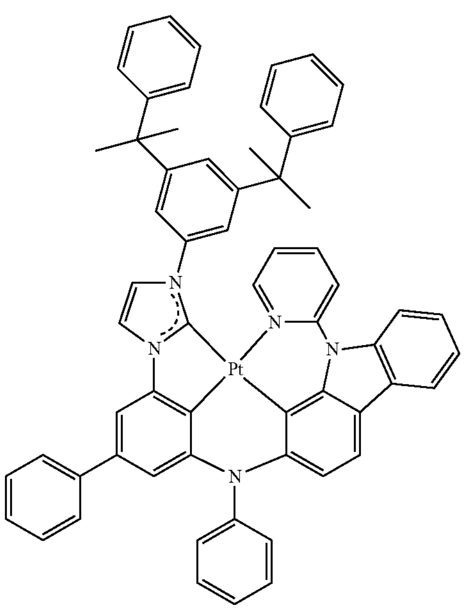
-continued
1735
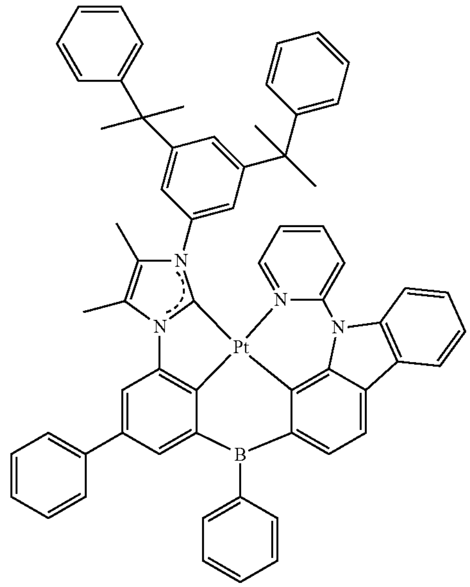
1736
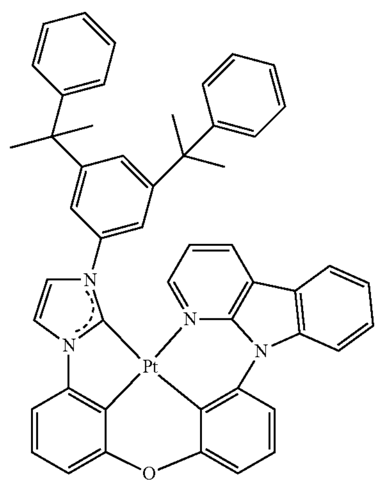
1737
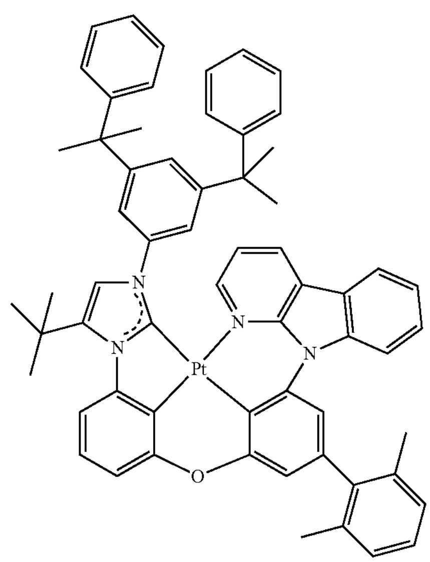

-continued
1738
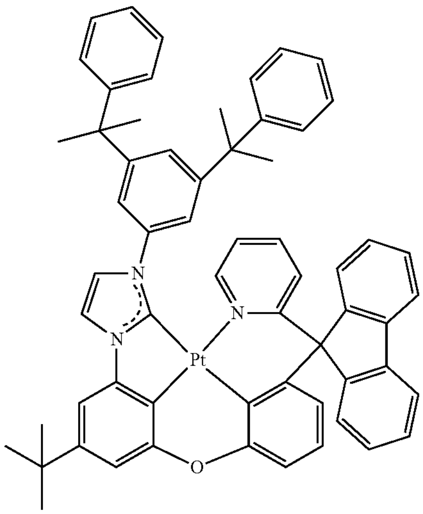
1739
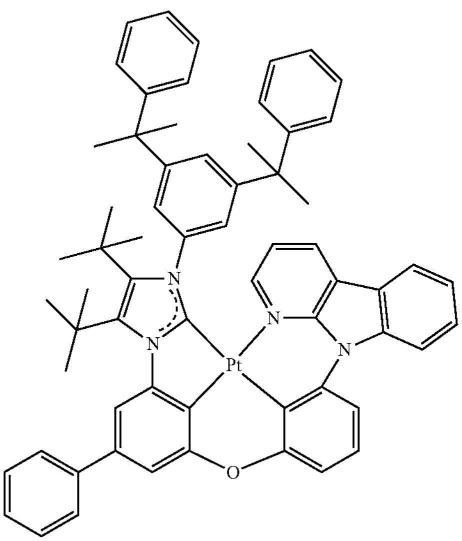
1740
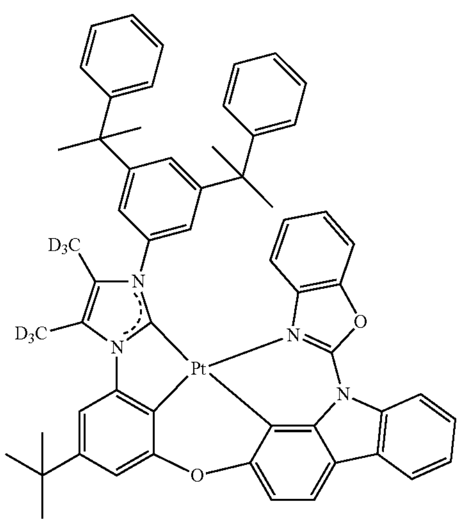
-continued
1741
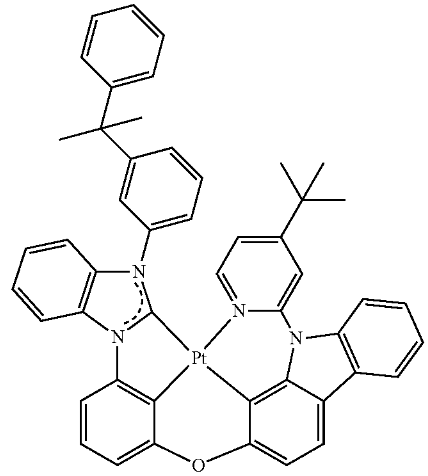
1742
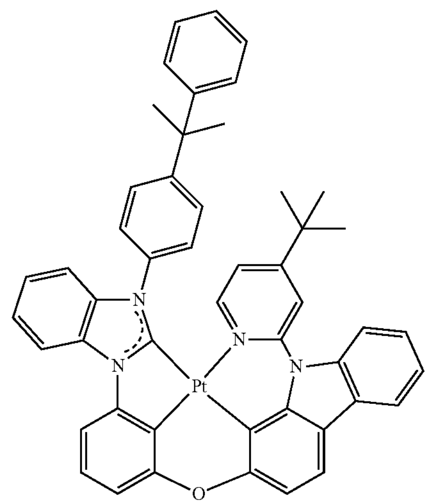
1743
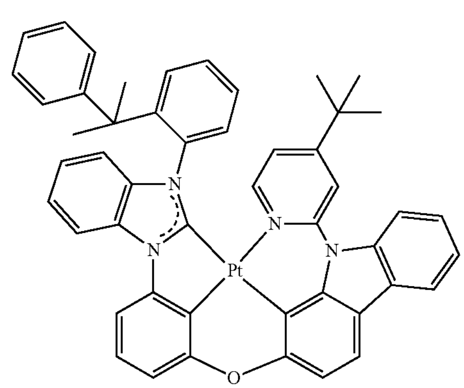

-continued
1744
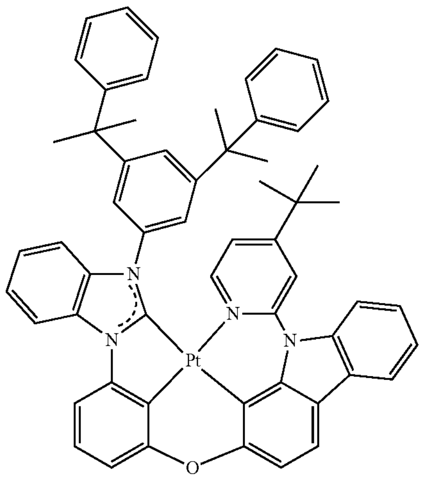
1745
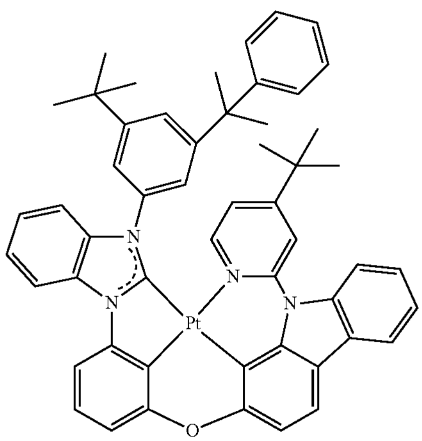
1746
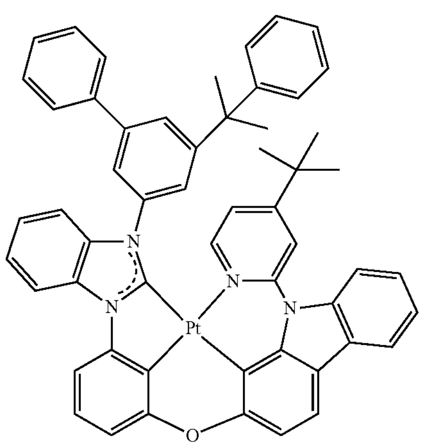
-continued
1747
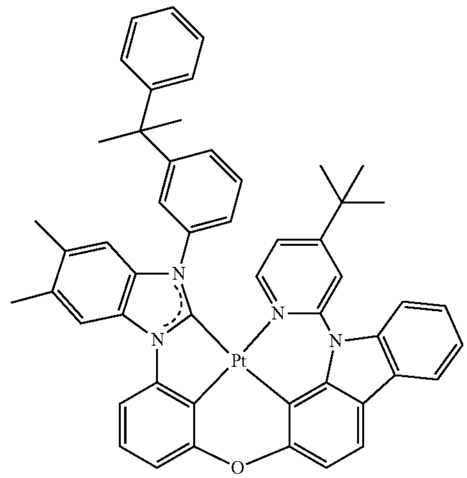
1748
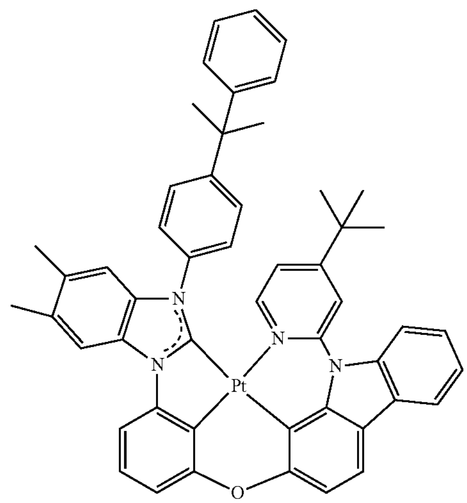
1749
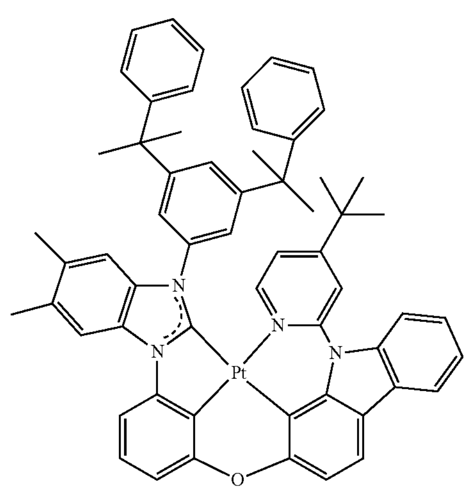

-continued
1750
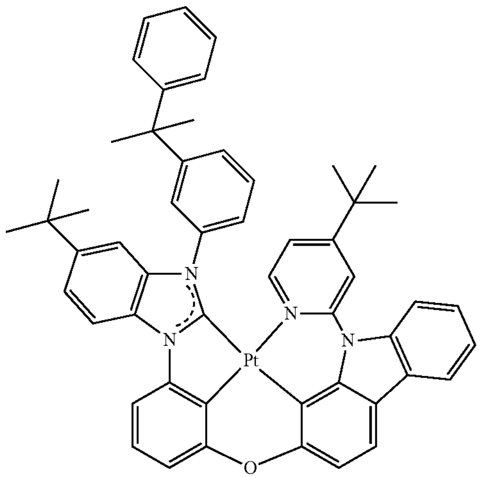
1751
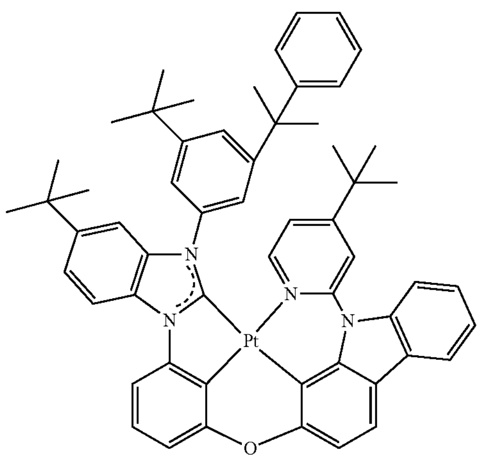
1752
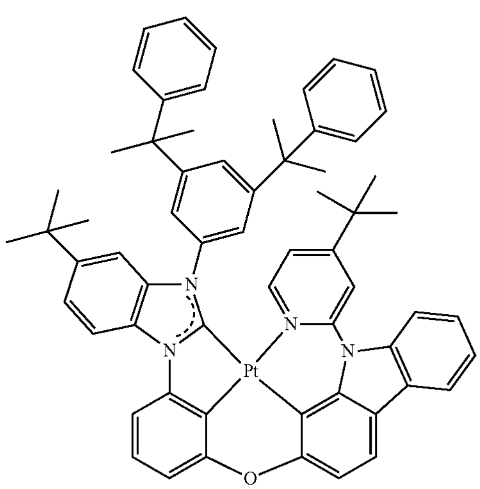
-continued
1753
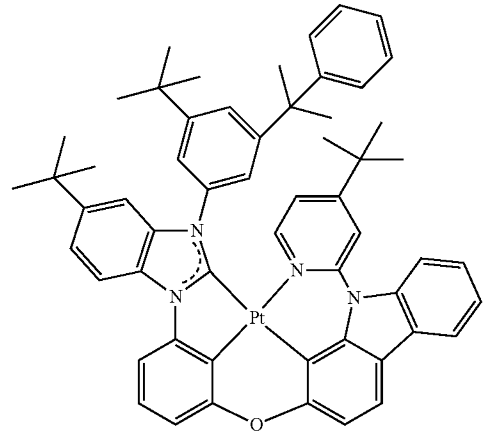
1754
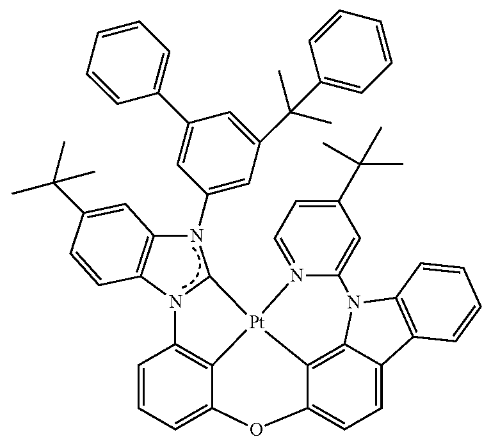
1755
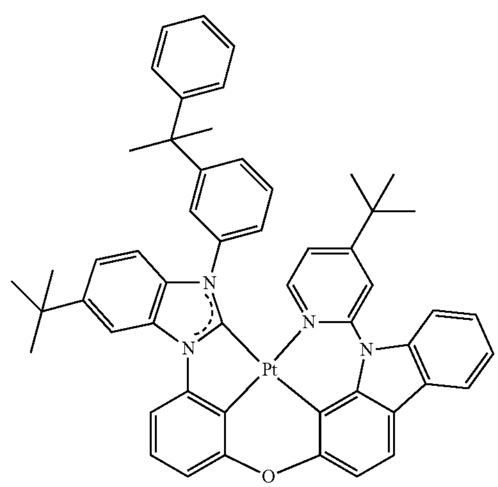

-continued
1756
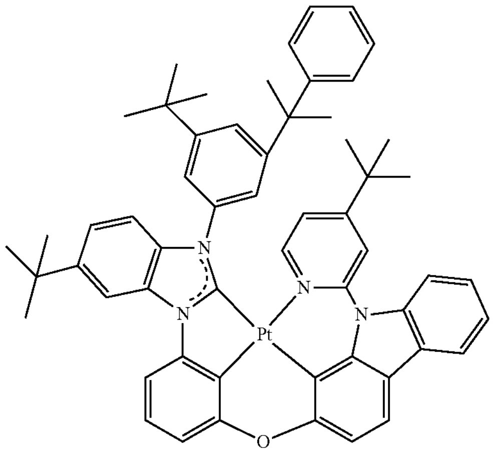
1757
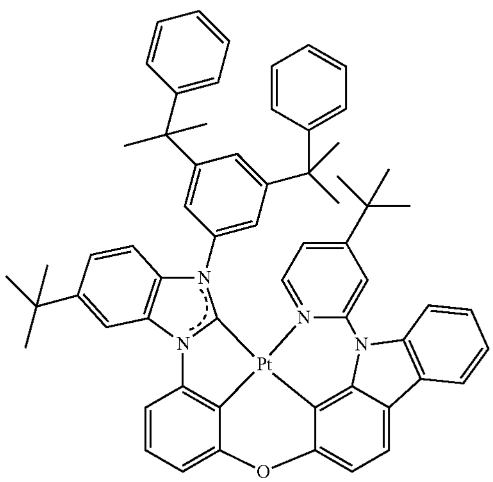
1758
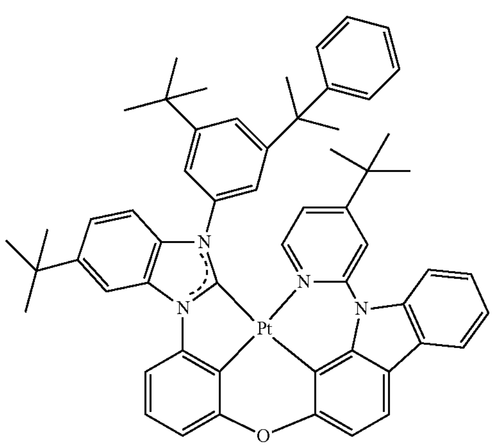
-continued
1759
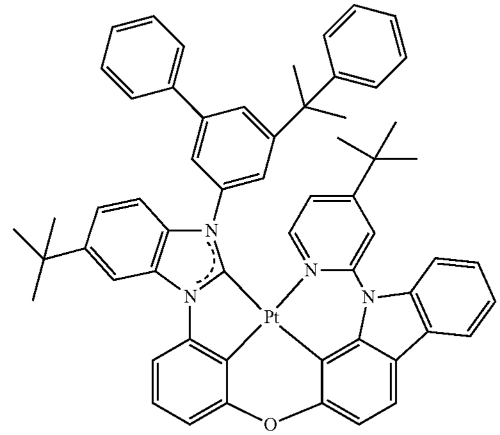
1760
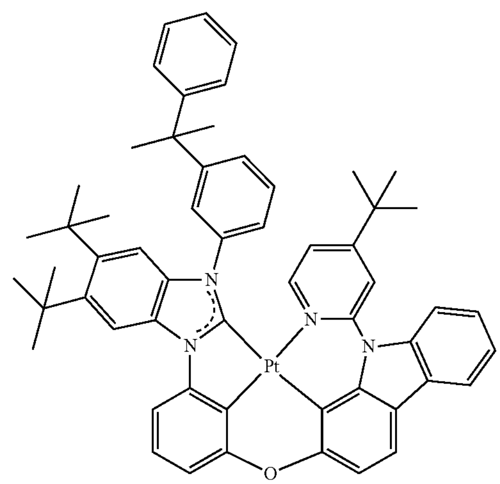
1761
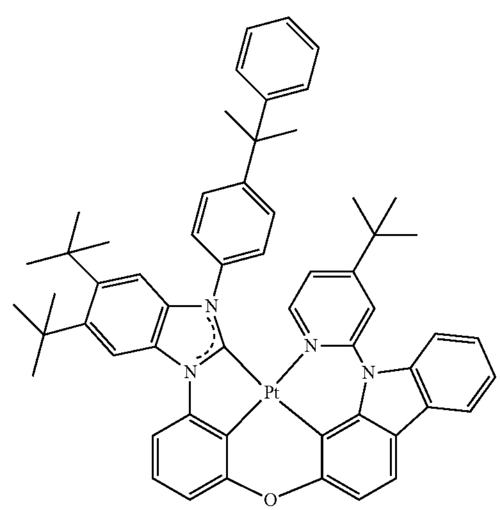

1762
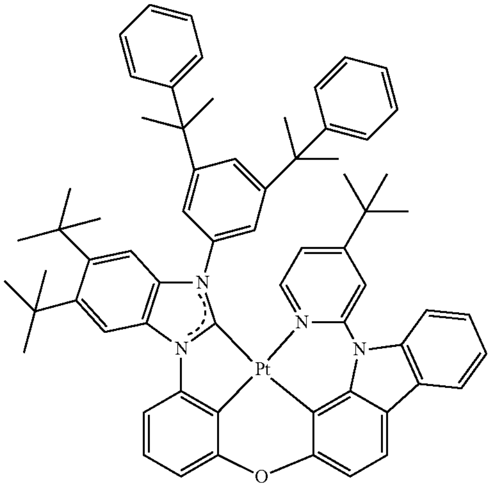
1763
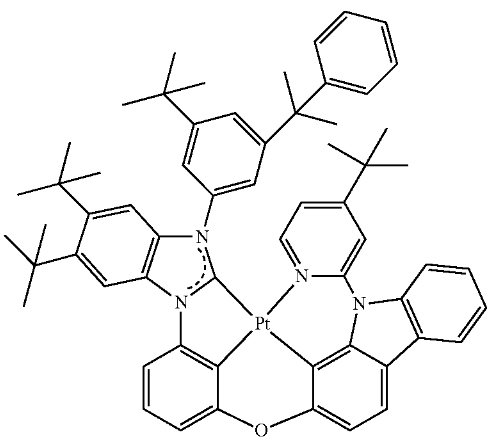
1764
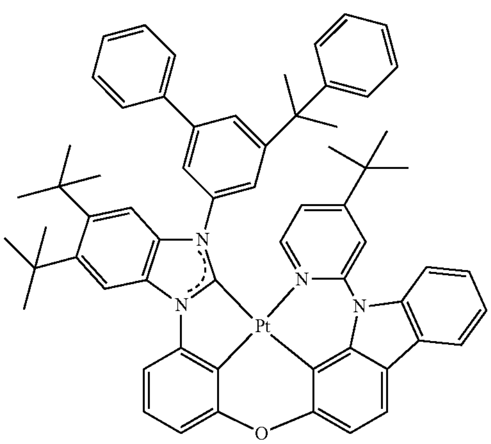
1765
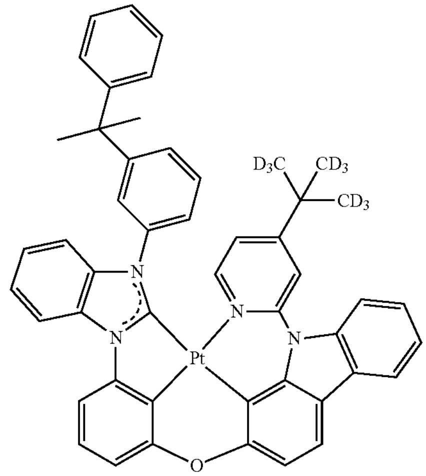
1766
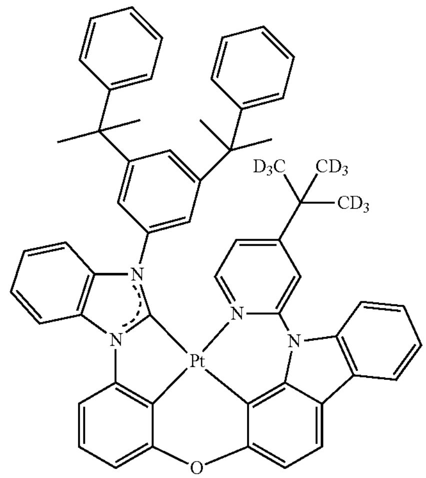
1767
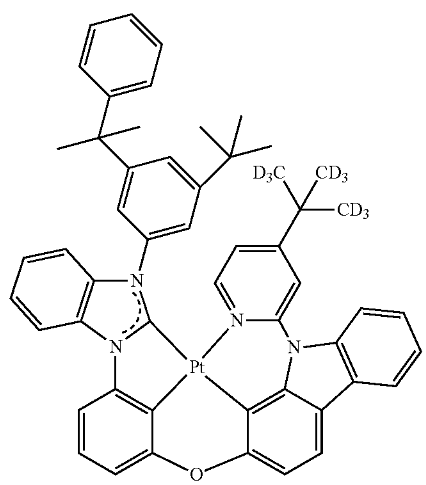

-continued
1768
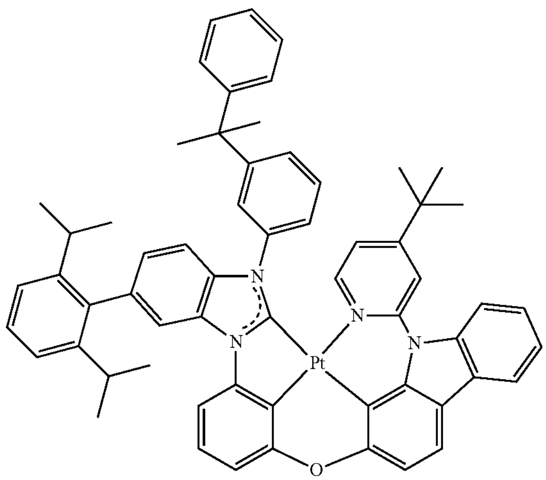
1769
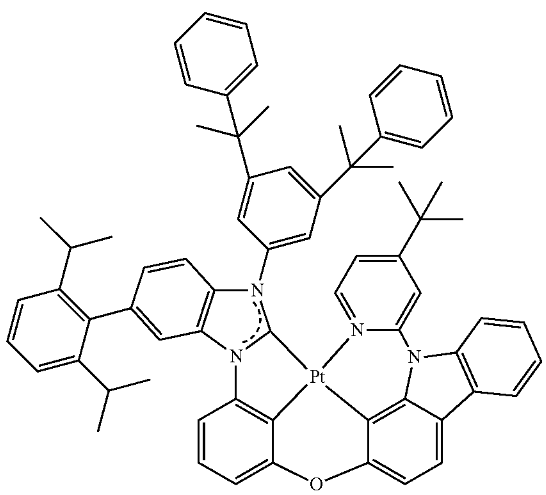
1770
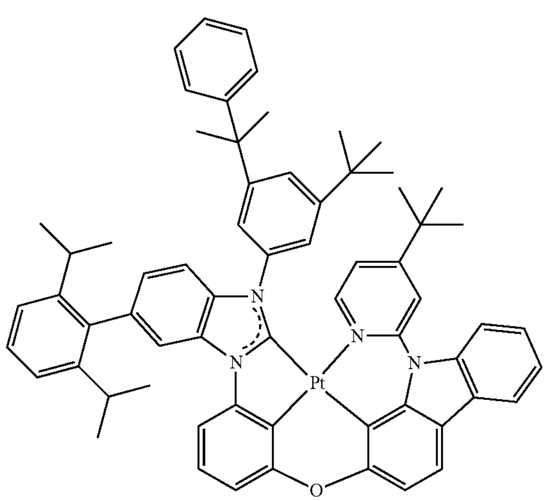
-continued
1771
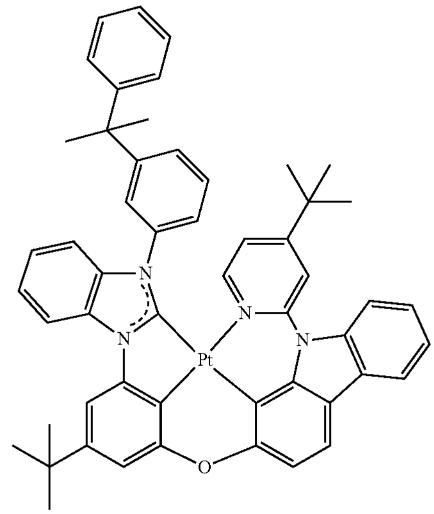
1772
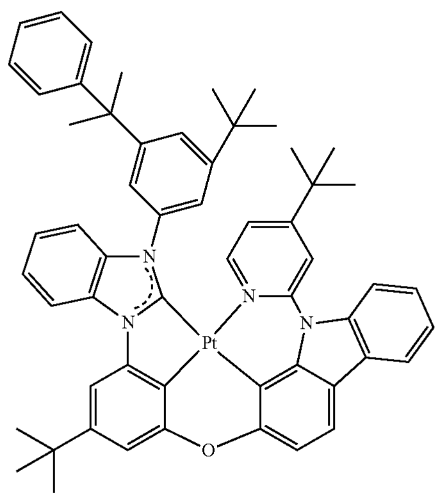
1773
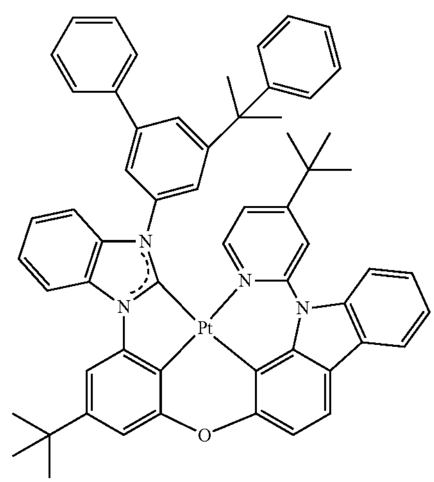

-continued
1774
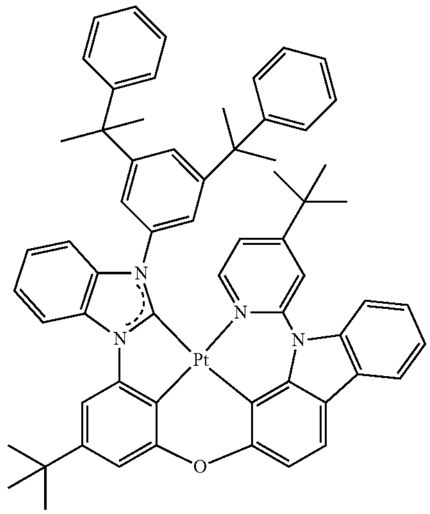
1775
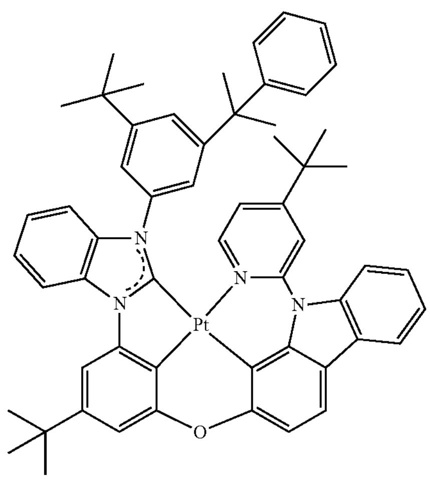
1776
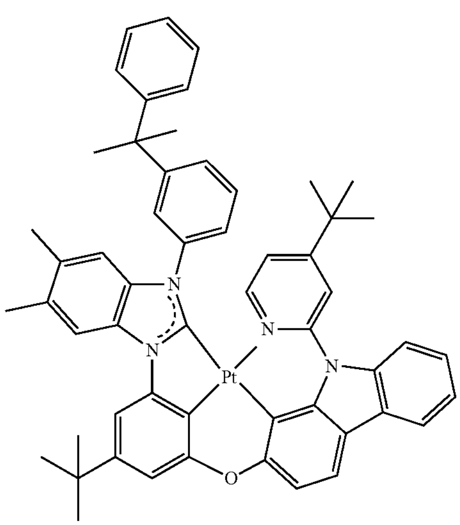
-continued
1777
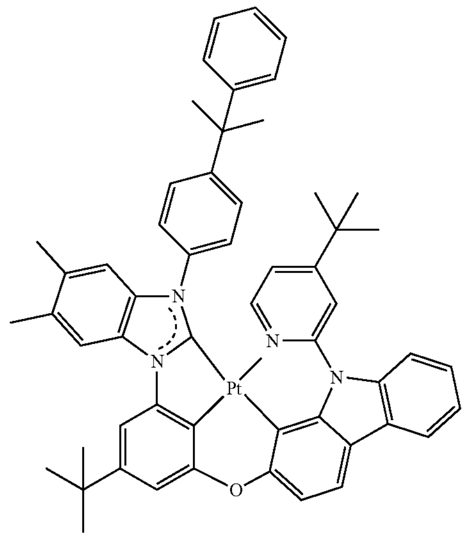
1778
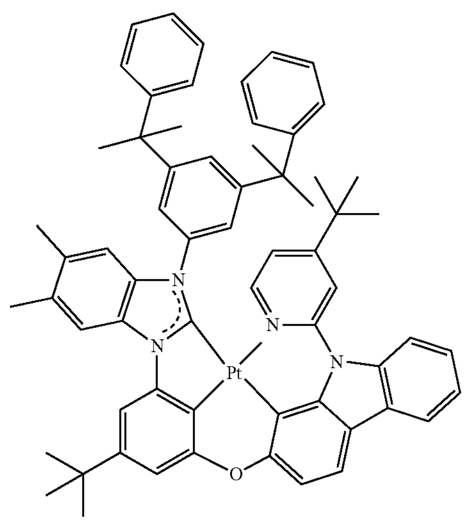
1779
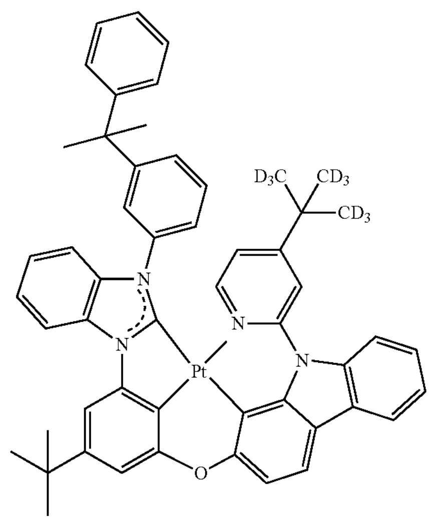

-continued
1780
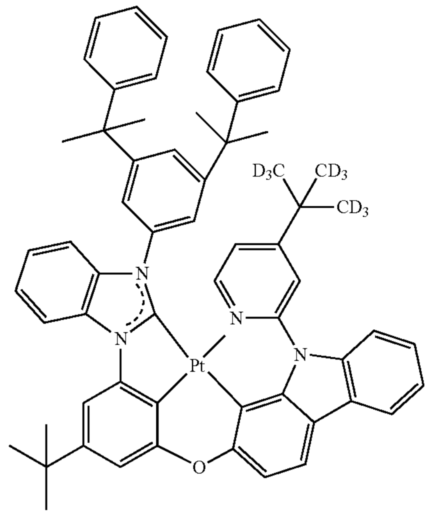
1781
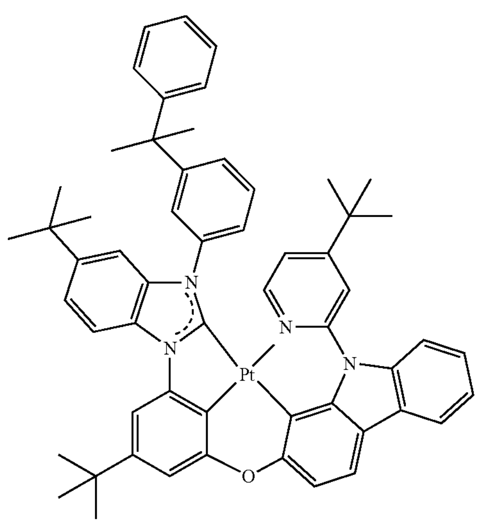
1782
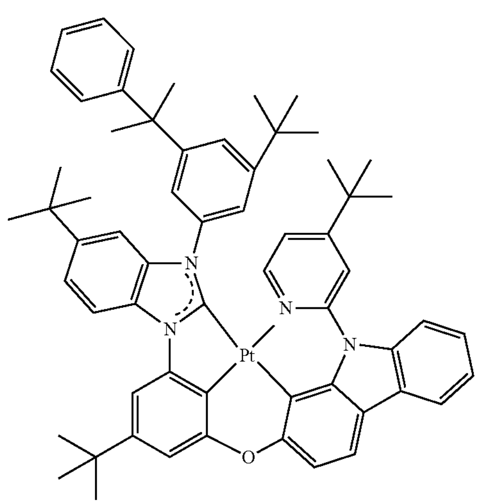
-continued
1783
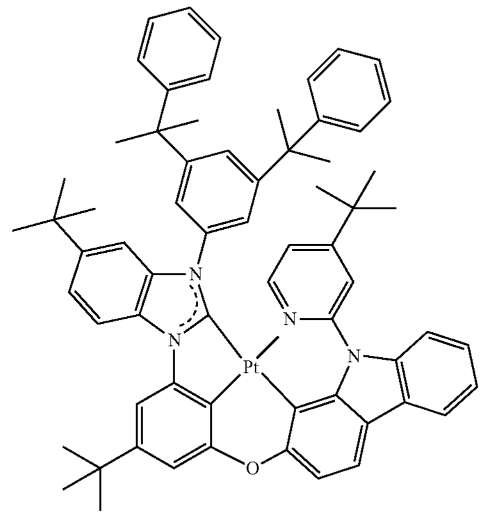
1784
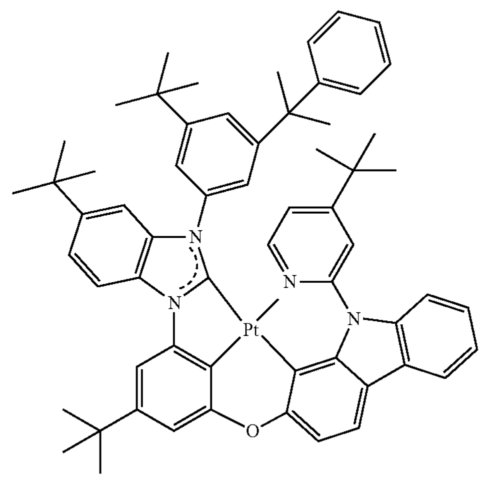
1785
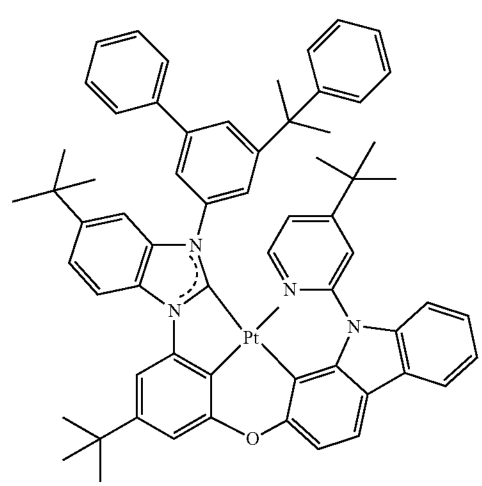

1786
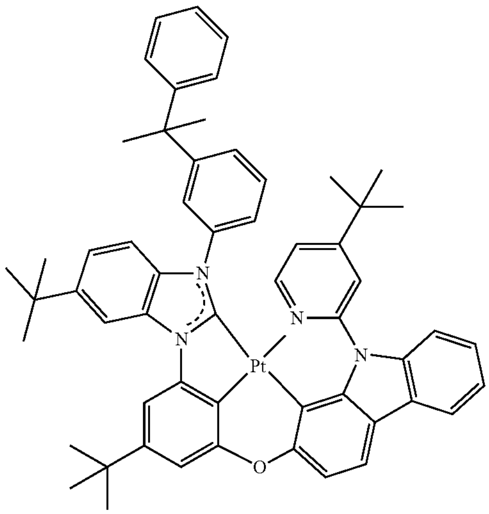
1787
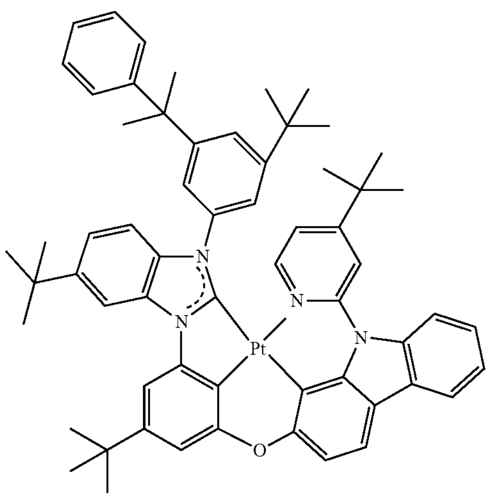
1788
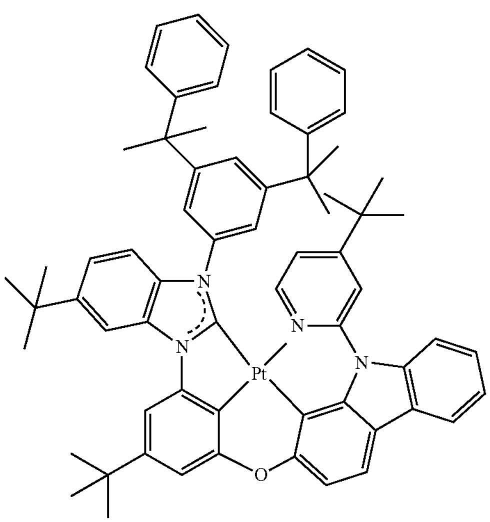
1789
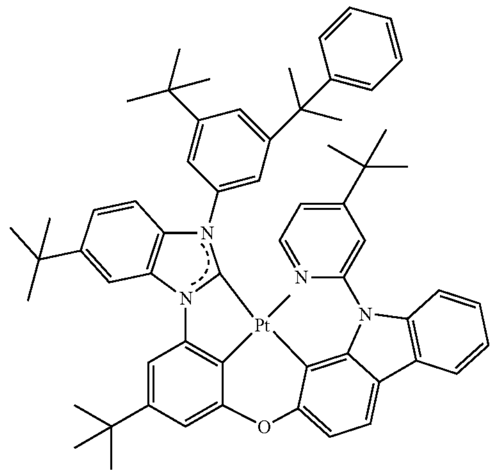
1790
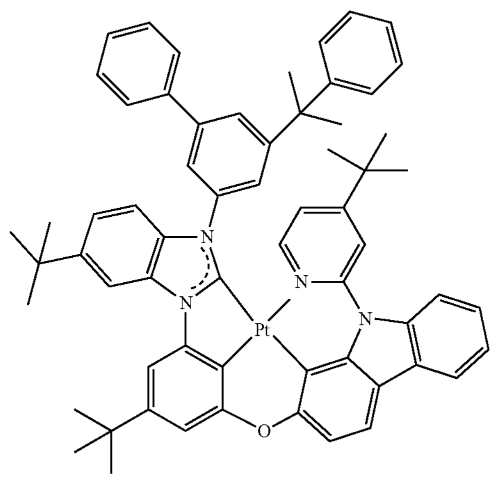
1791
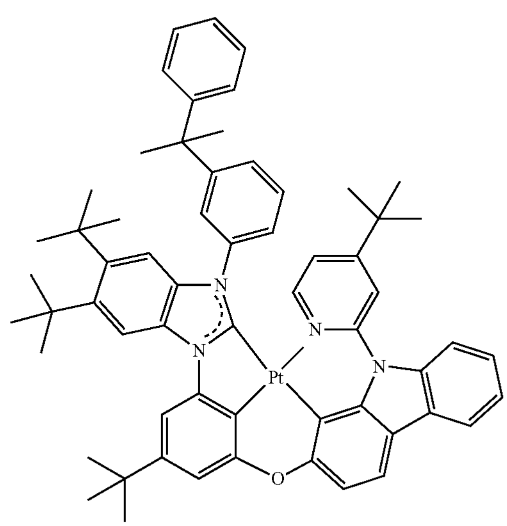

-continued
1792
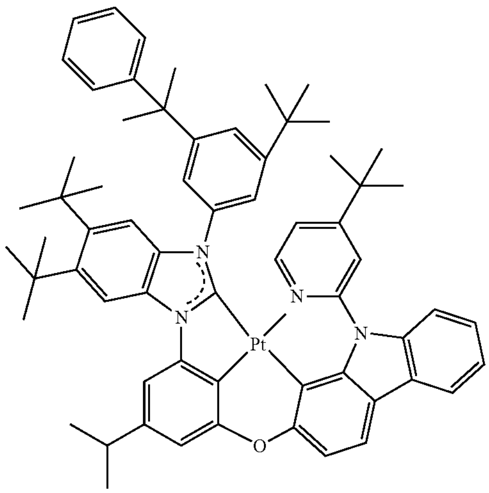
1793
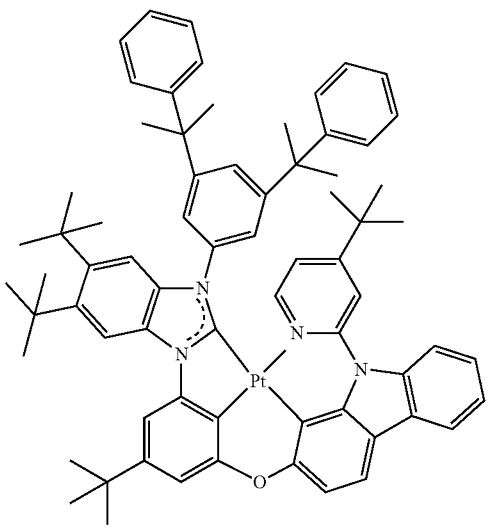
1794
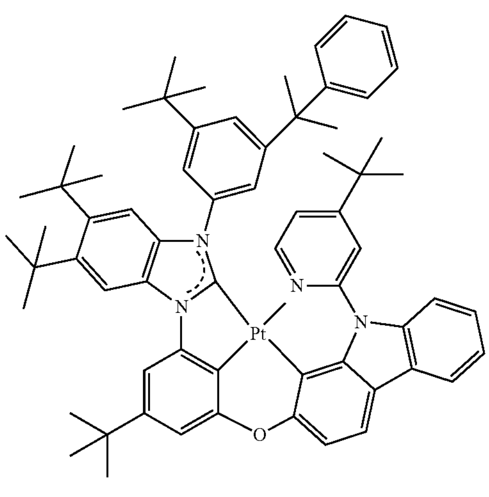
-continued
1795
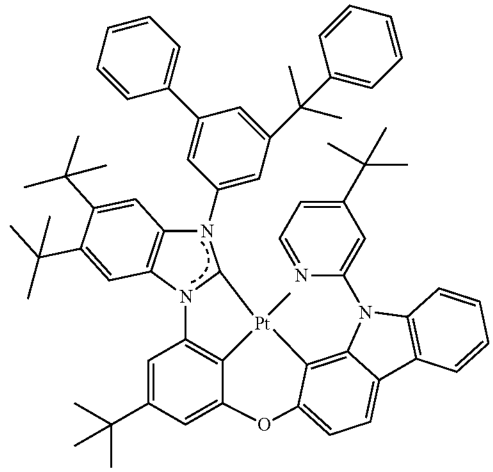
1796
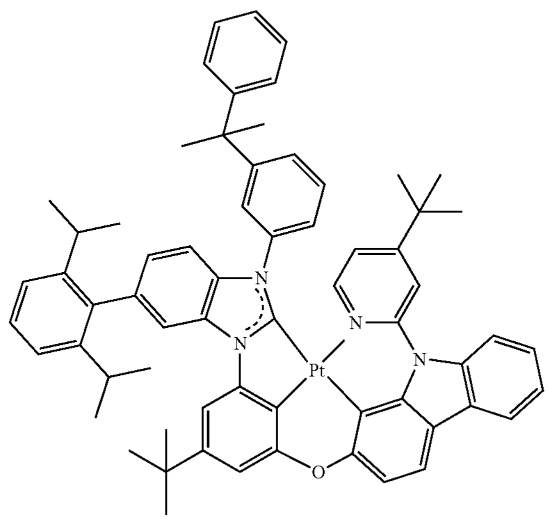
1797
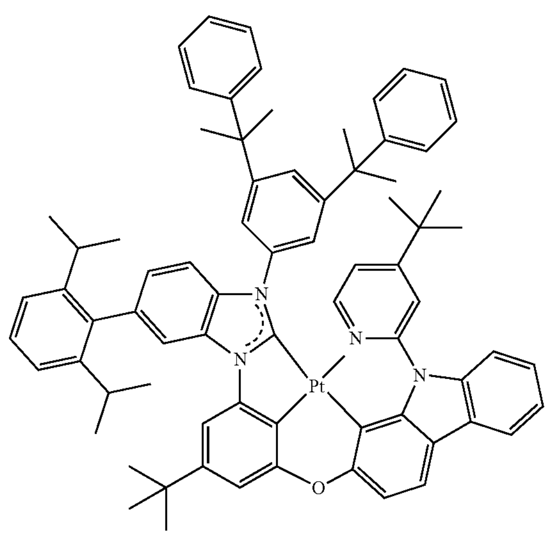

1798
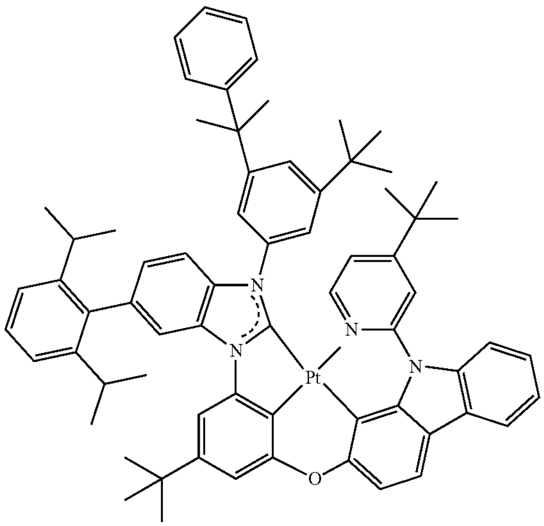
1799
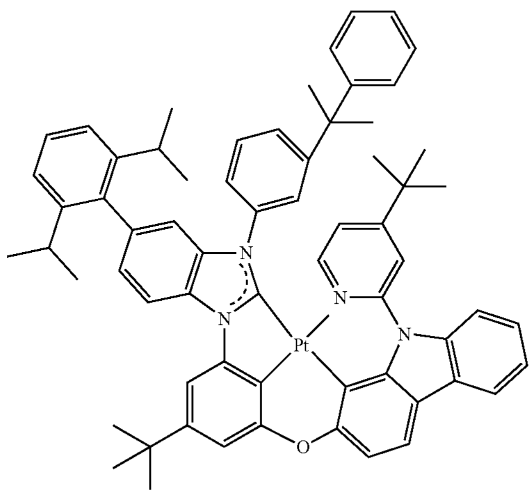
1800
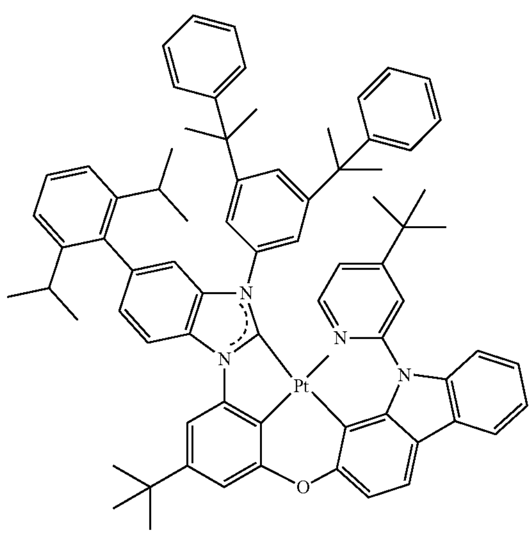
1801
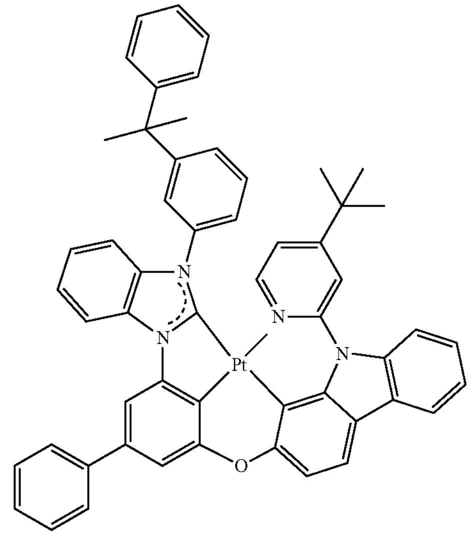
1802
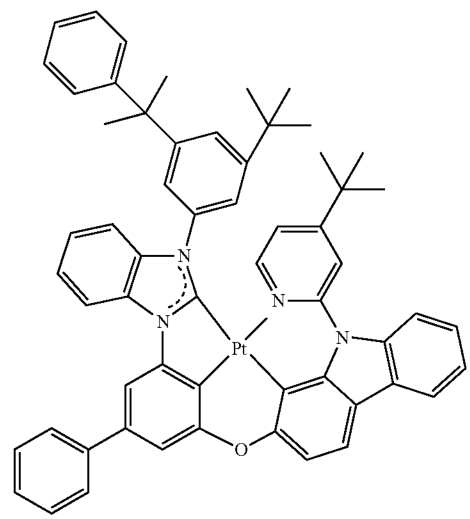
1803
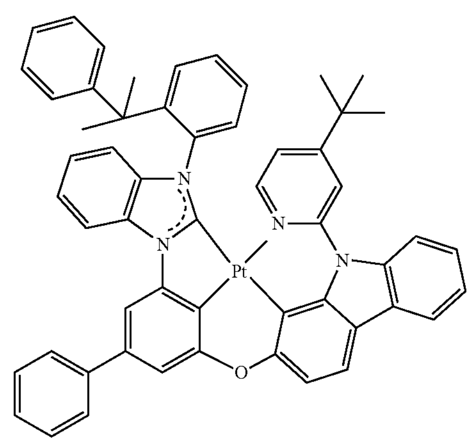

-continued
1804
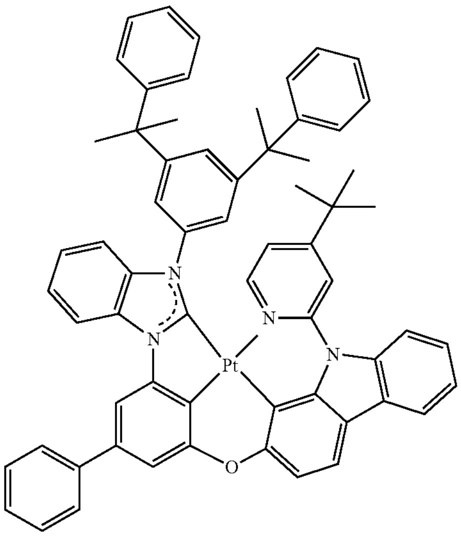
1805
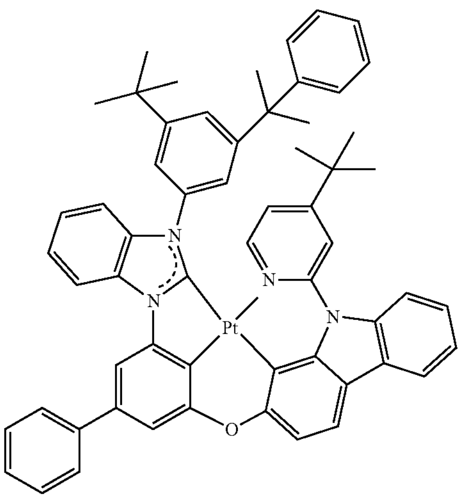
1806
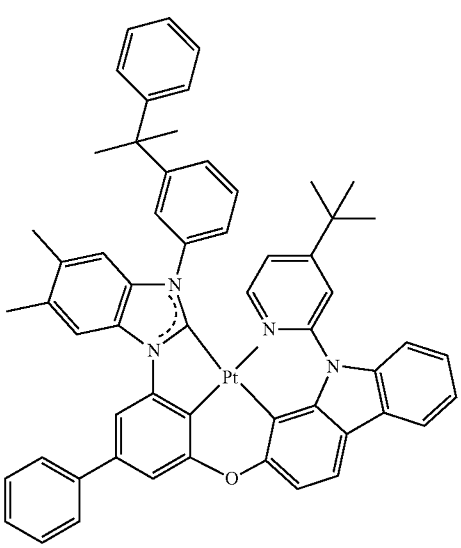
-continued
1807
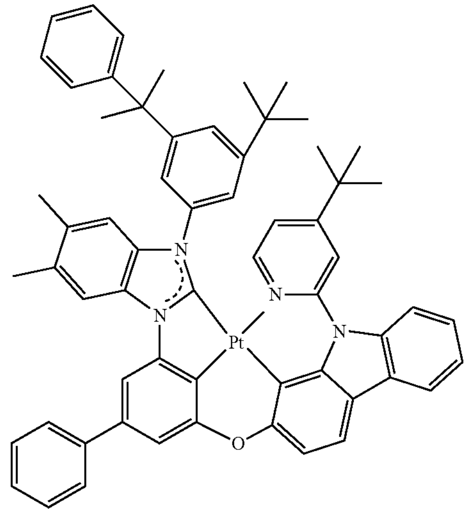
1808
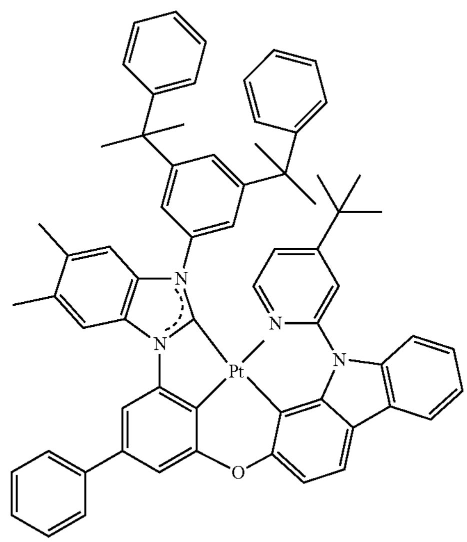
1809
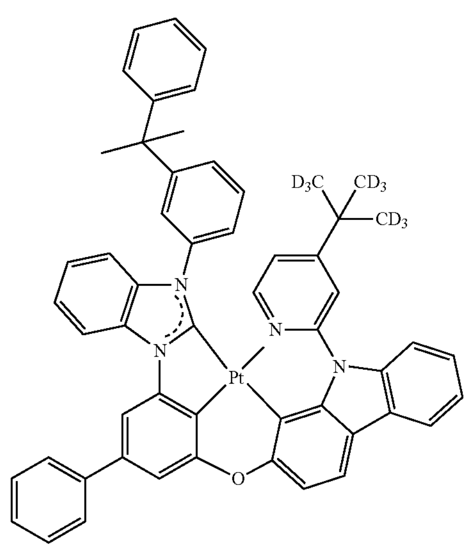

-continued
1810
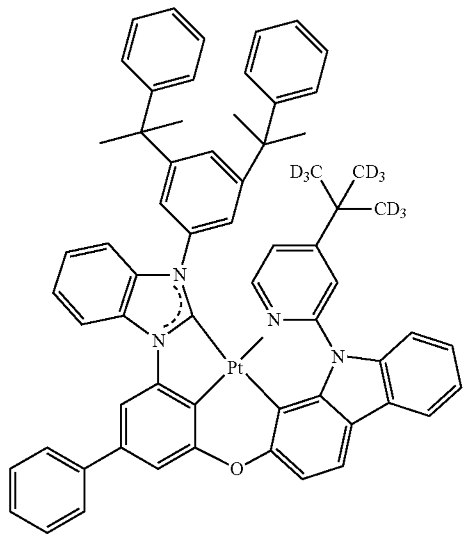
1811
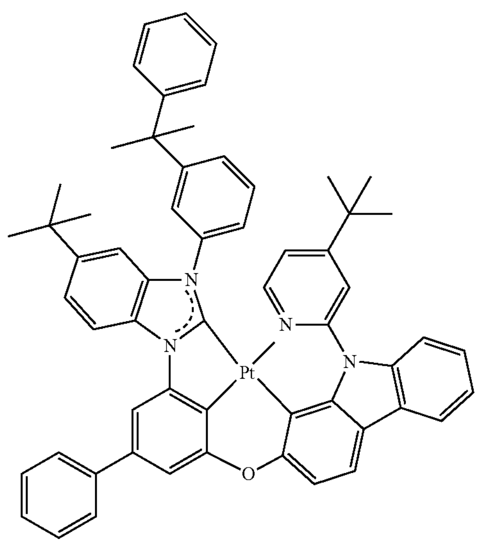
1812
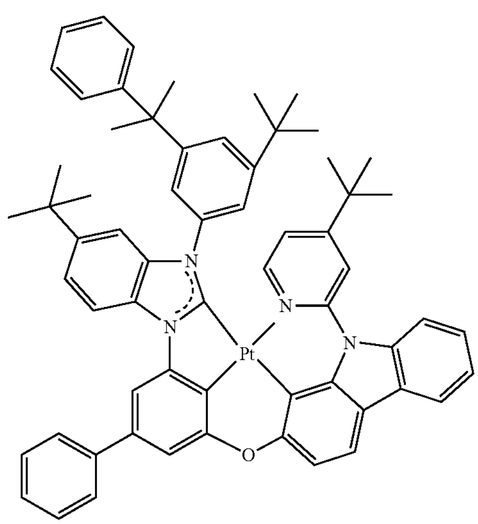
-continued
1813
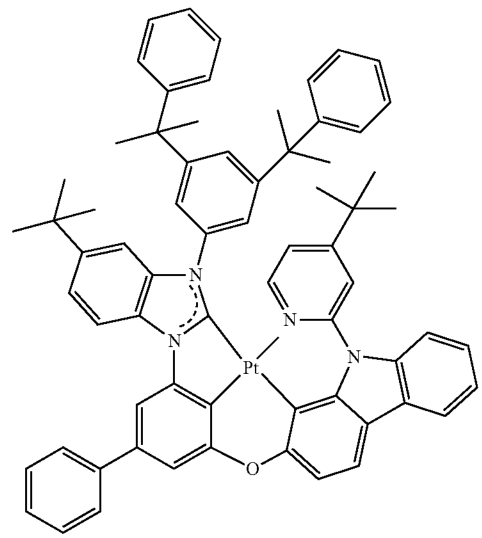
1814
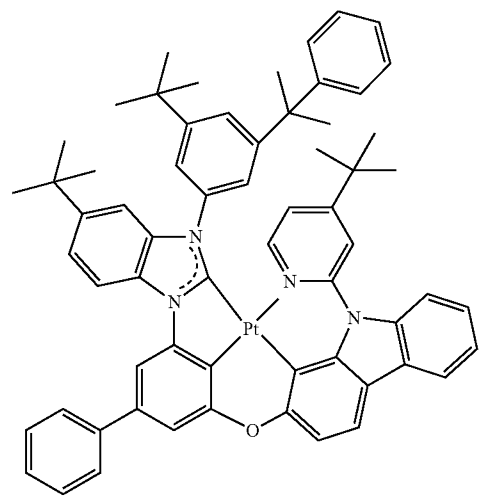
1815
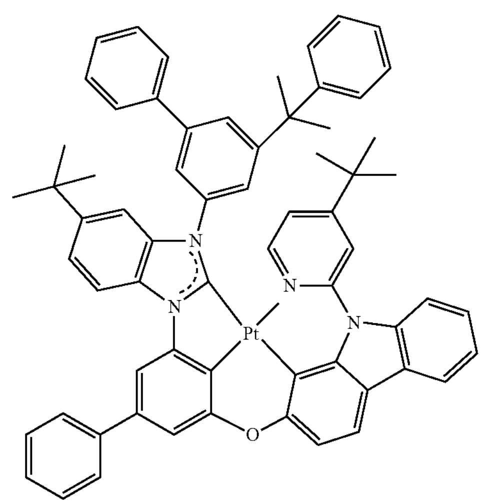

-continued
1816
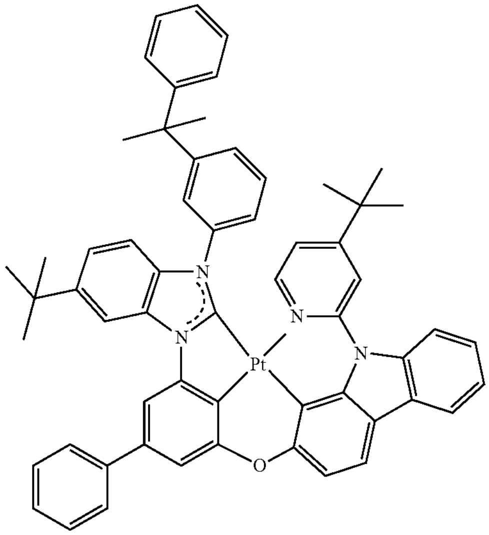
1817
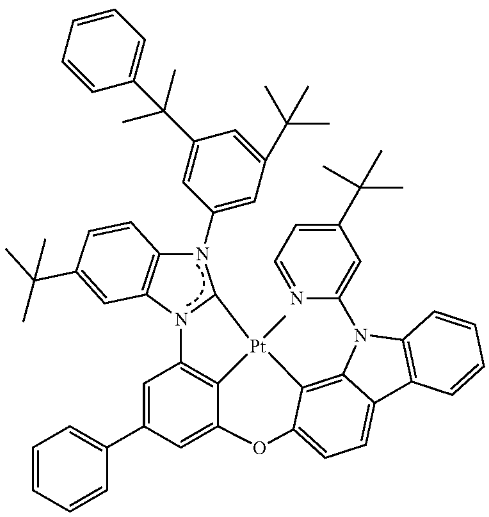
1818
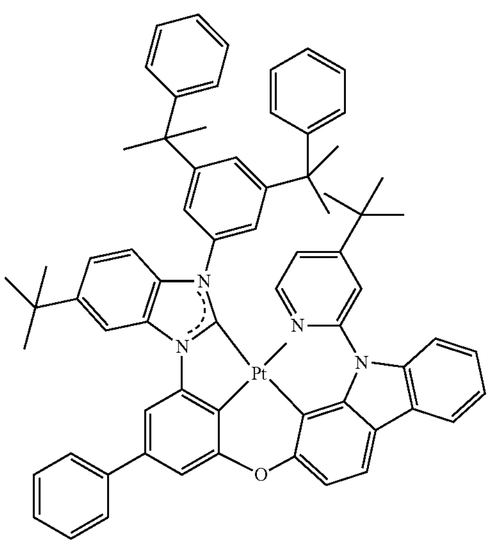
-continued
1819
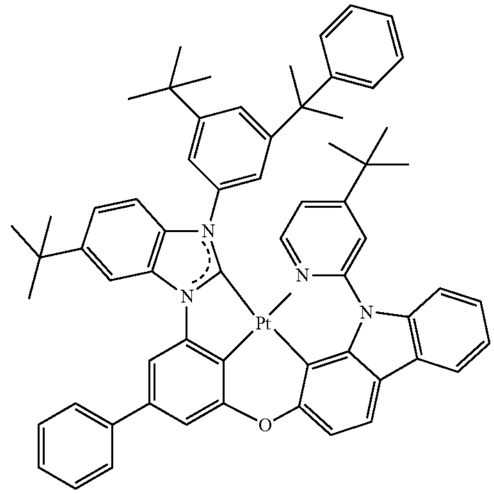
1820
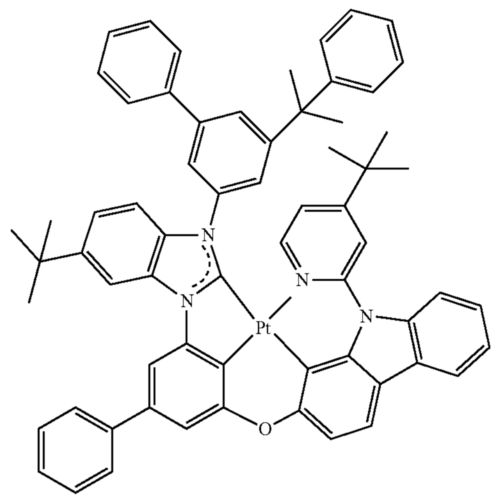
1821
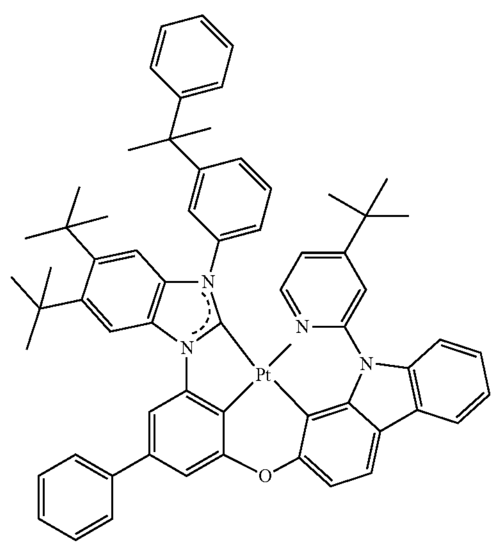

-continued
1822
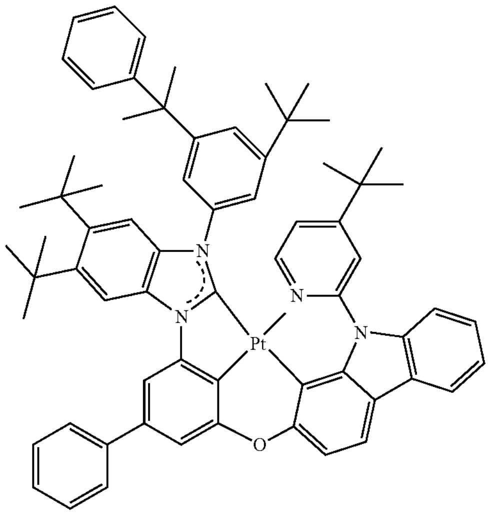
1823
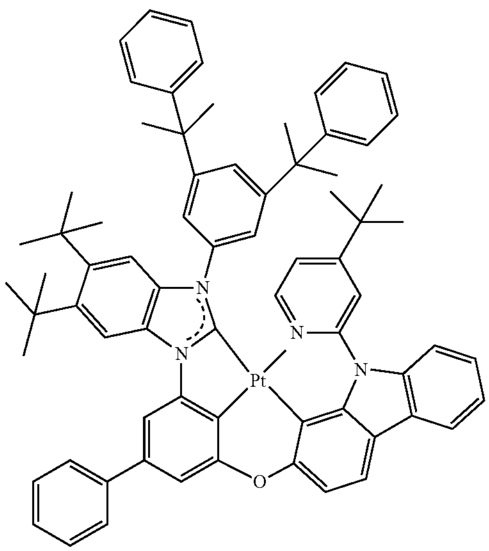
1824
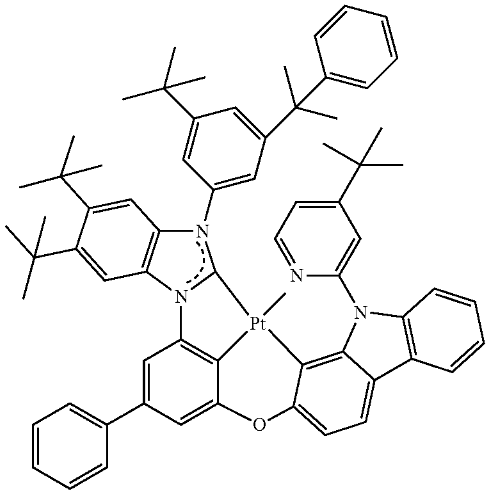
-continued
1825
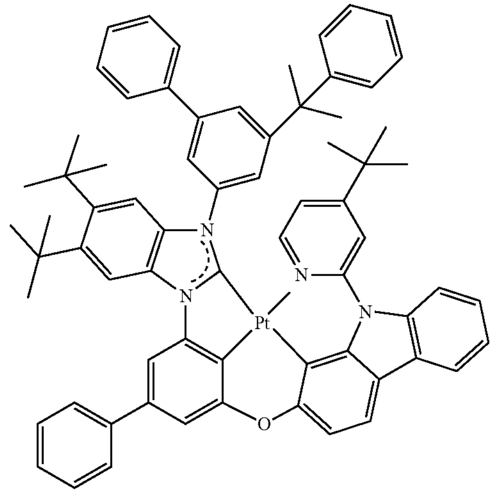
1826
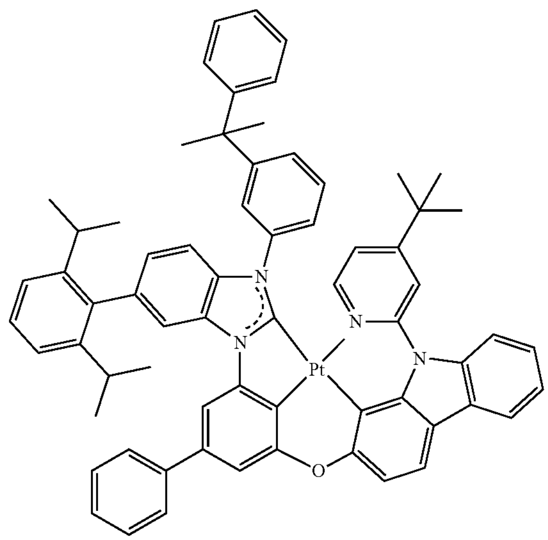
1827
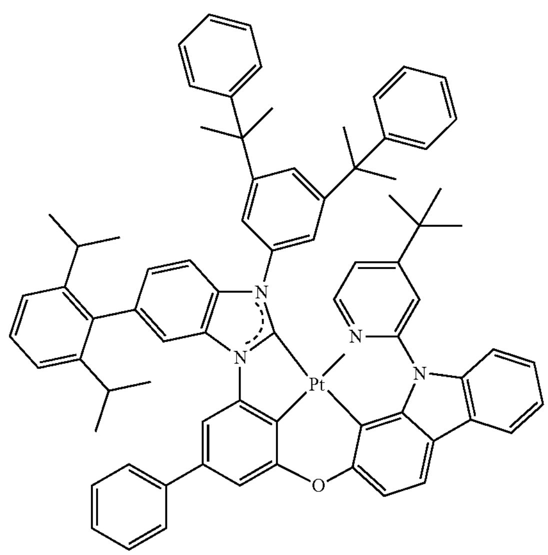

-continued
1828
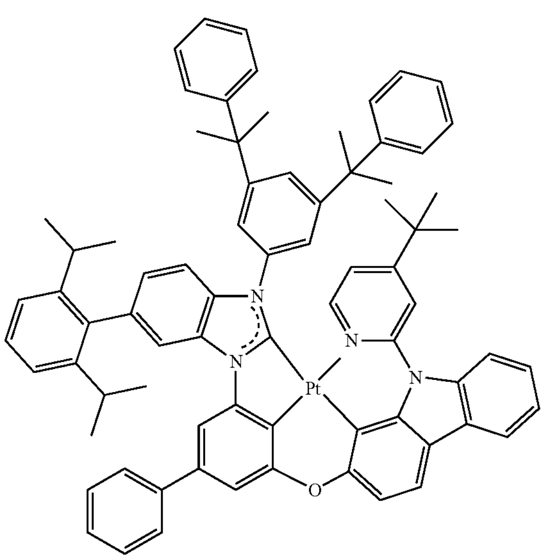
1829
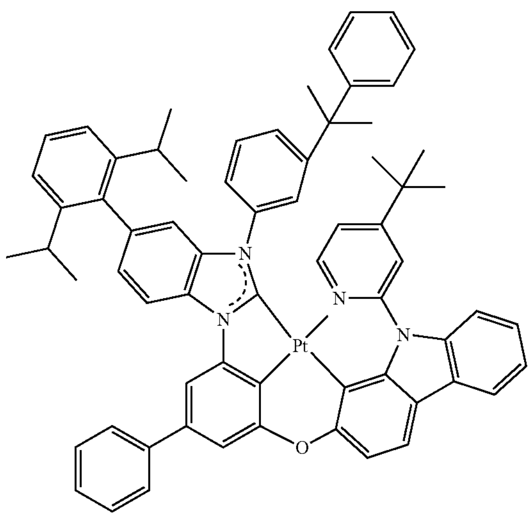
1830
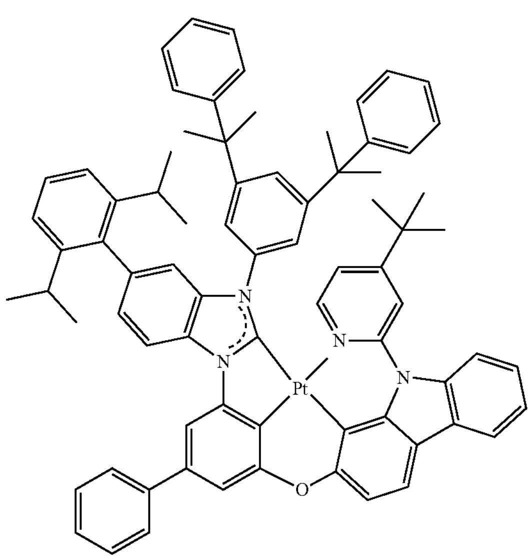
-continued
1831
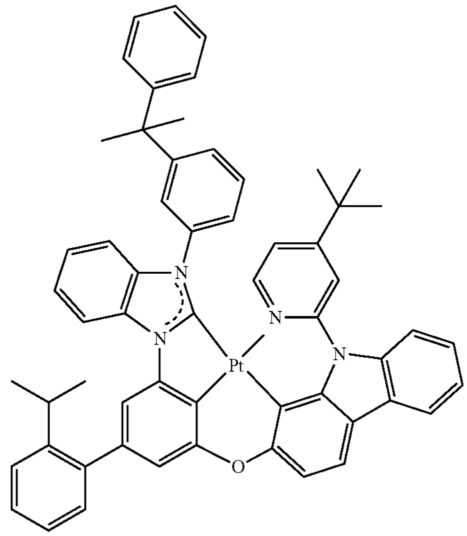
1832
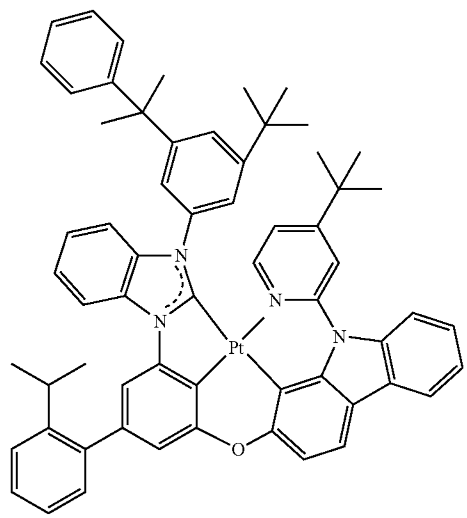
1833
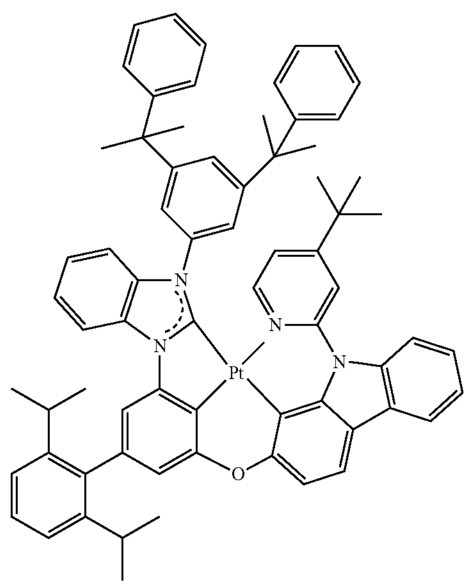

-continued
1834
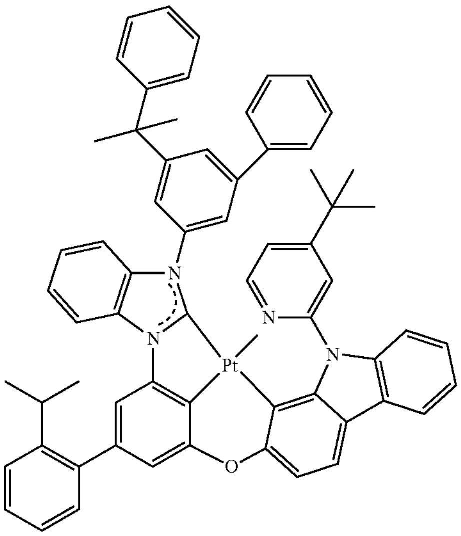
1835
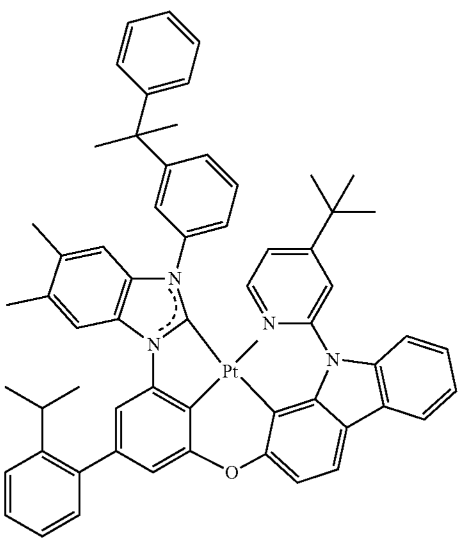
1836
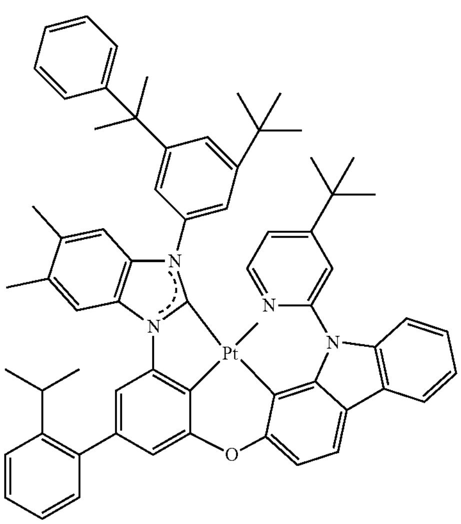
-continued
1837
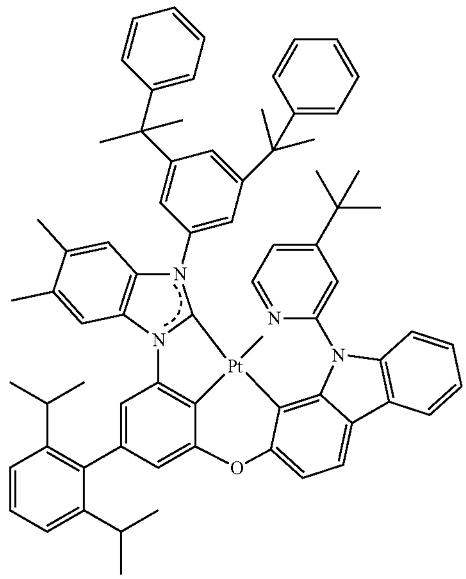
1838
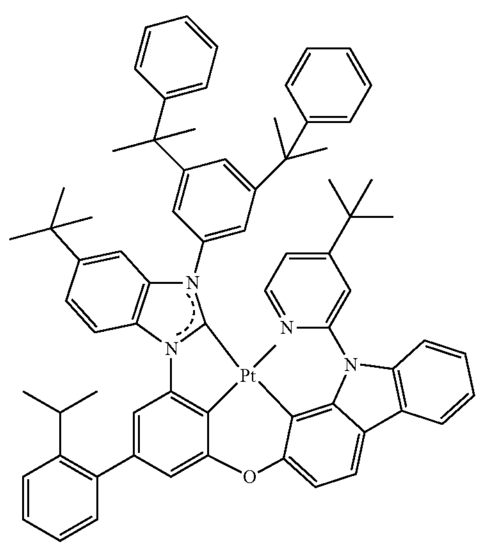

-continued
1839
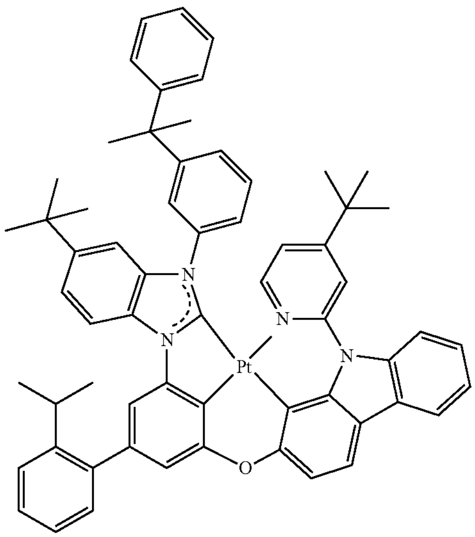
1840
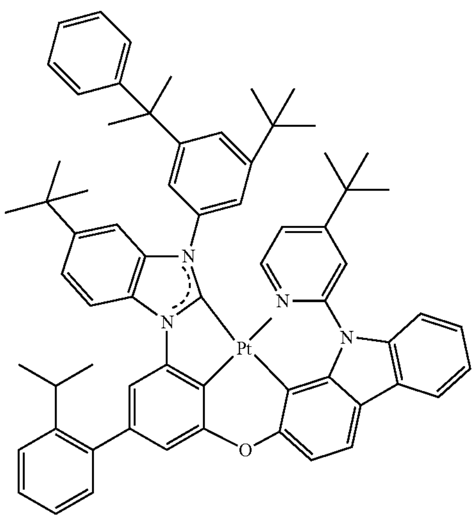
1841
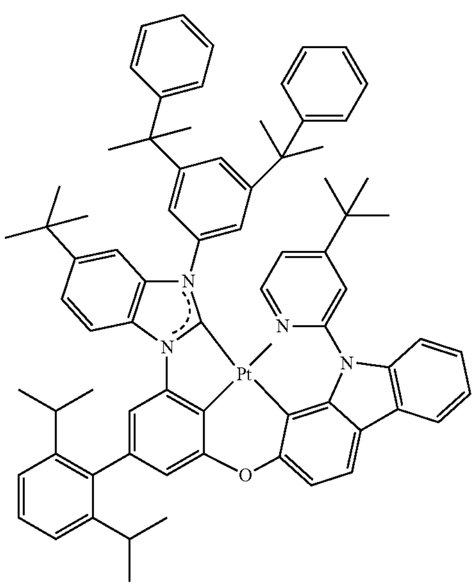
-continued
1842
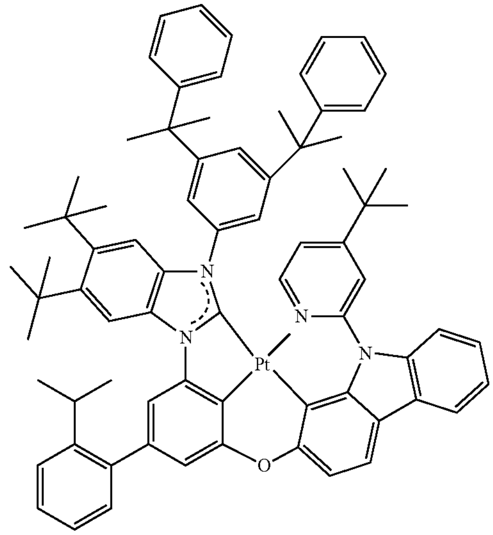
1843
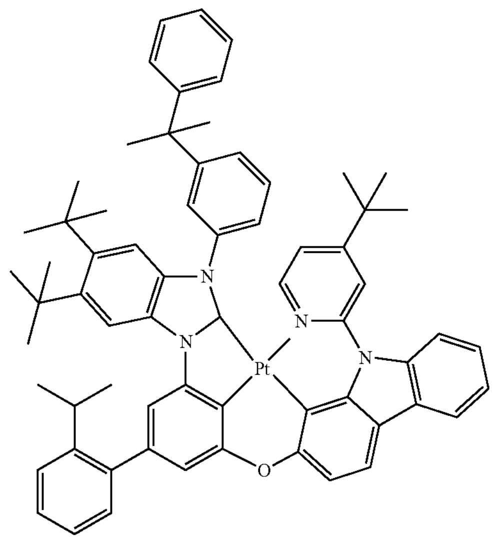
1844
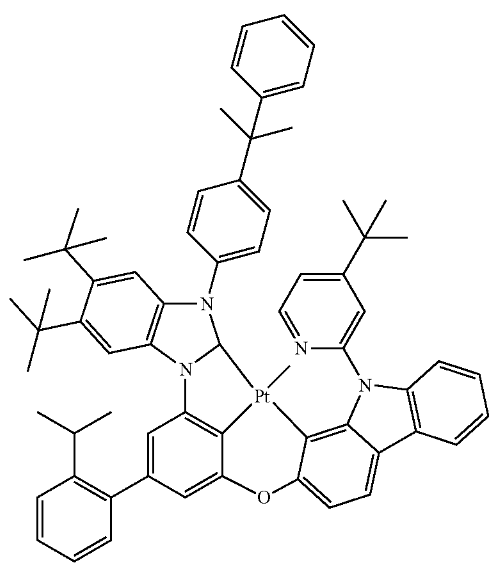

-continued
1845
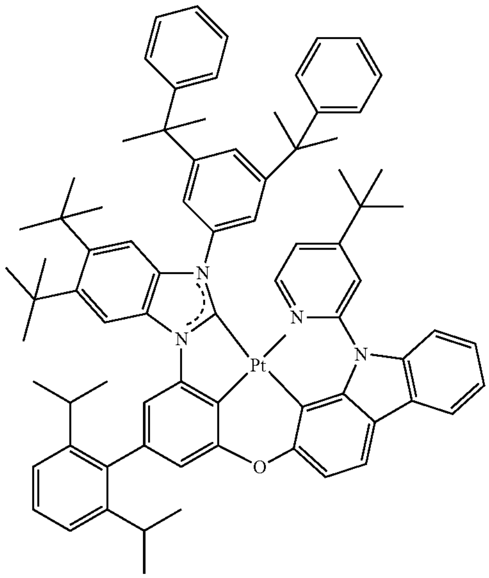
1846
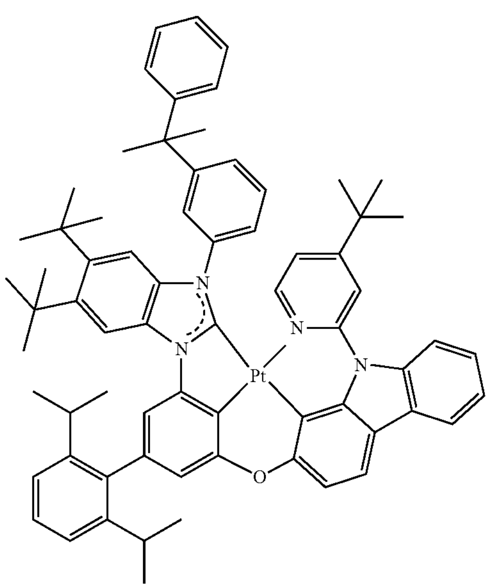
-continued
1847
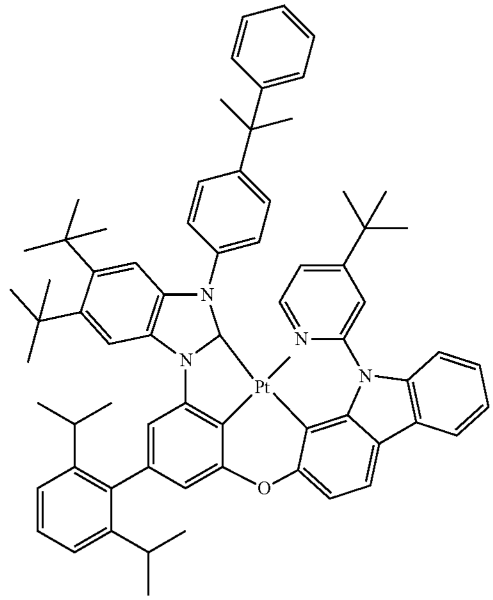
1848
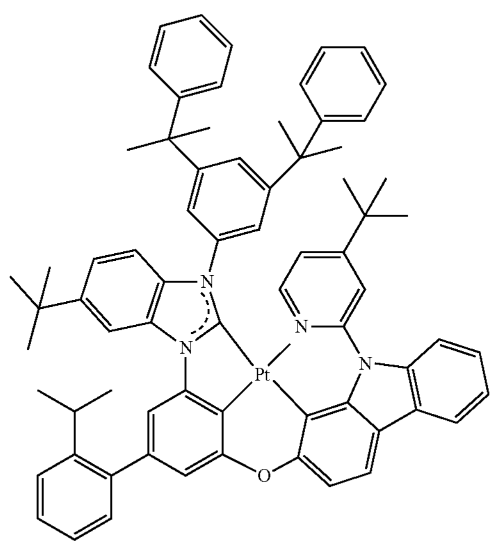

-continued
1849
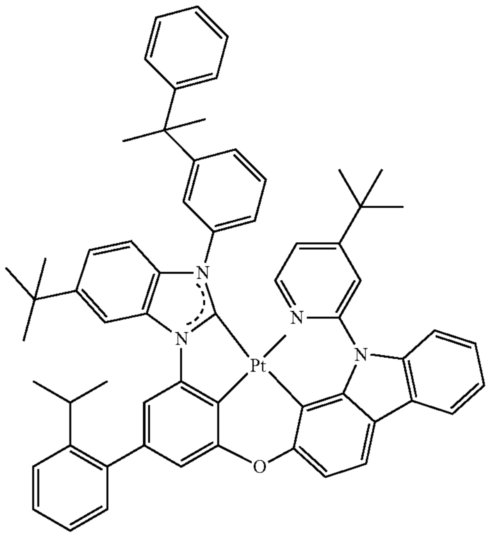
1850
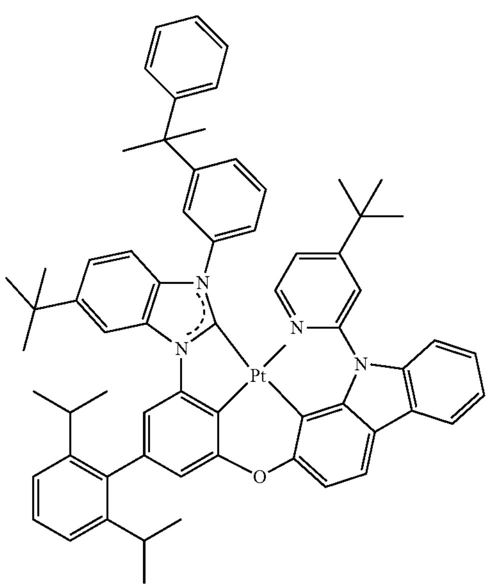
-continued
1851
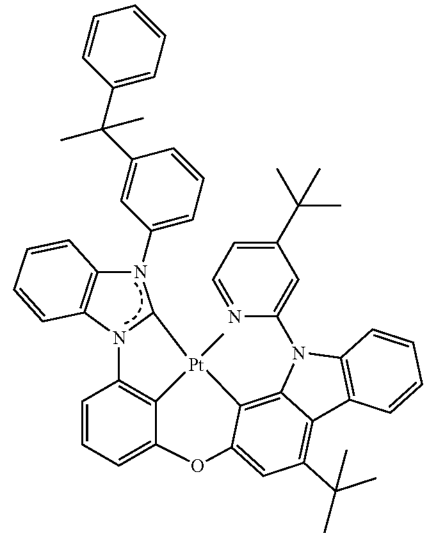
1852
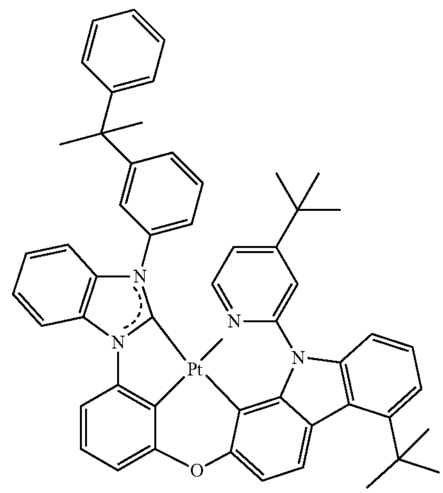
1853
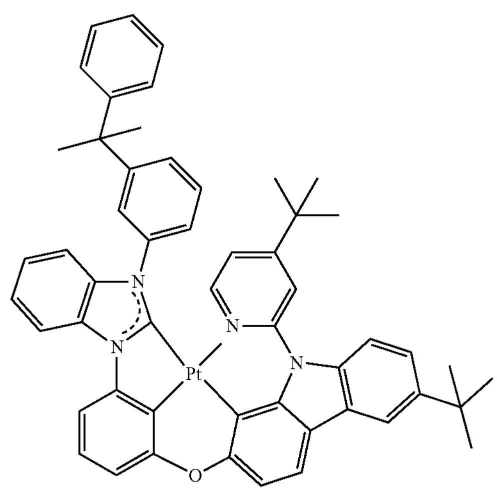

-continued
1854
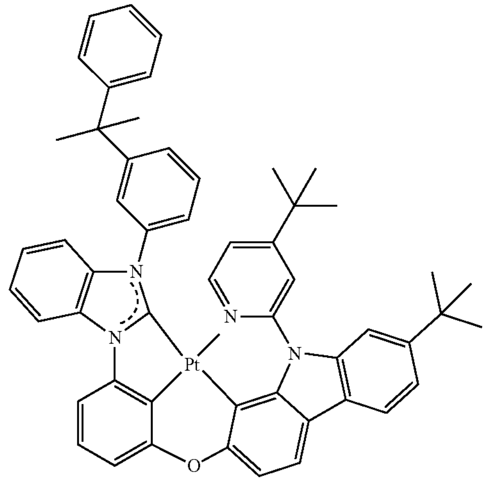
1855
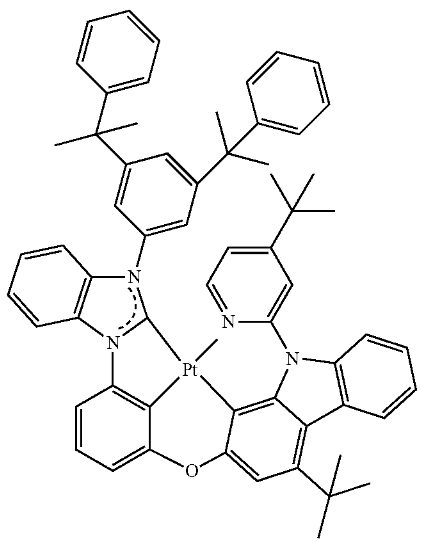
1856
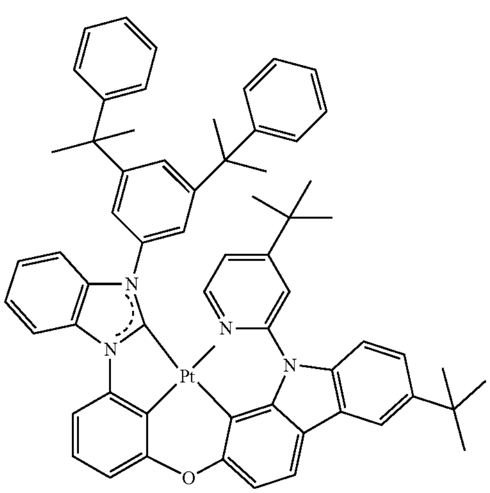
-continued
1857
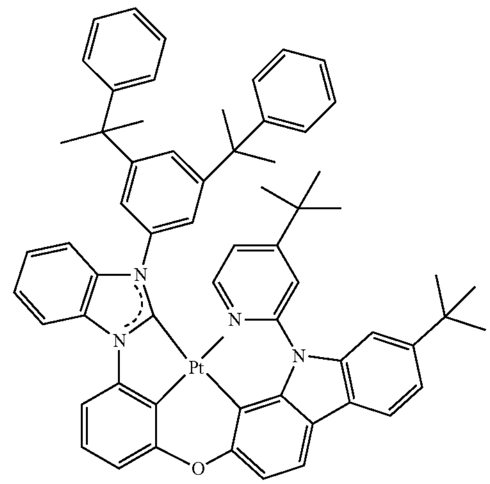
1858
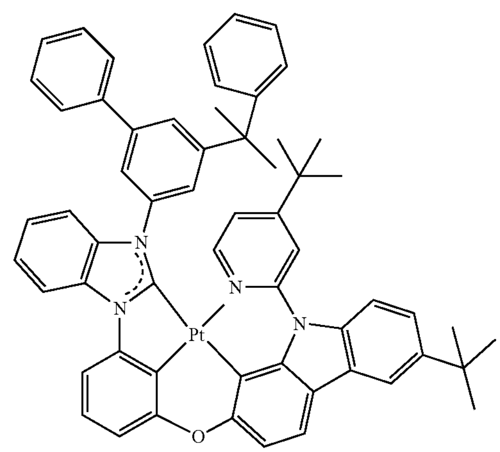
1859
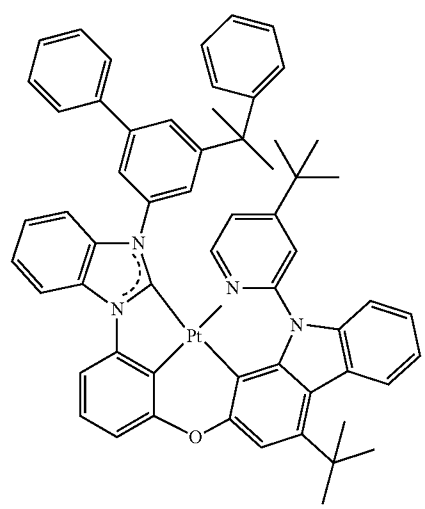

-continued
1860
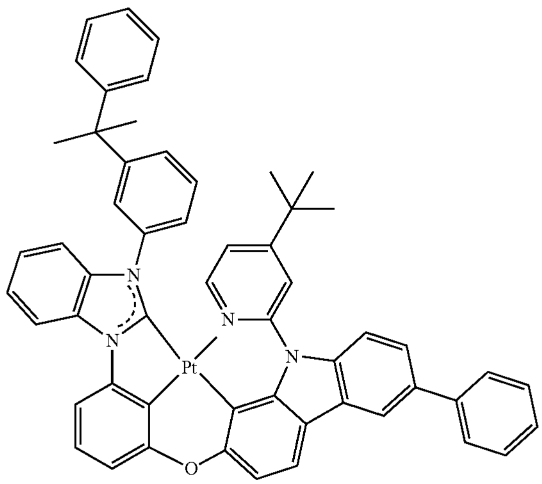
1861
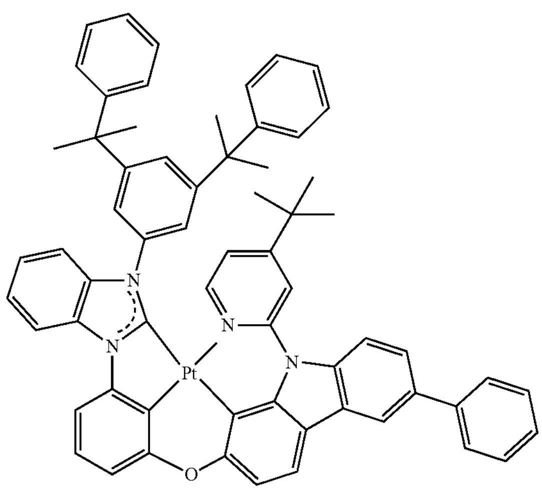
1862
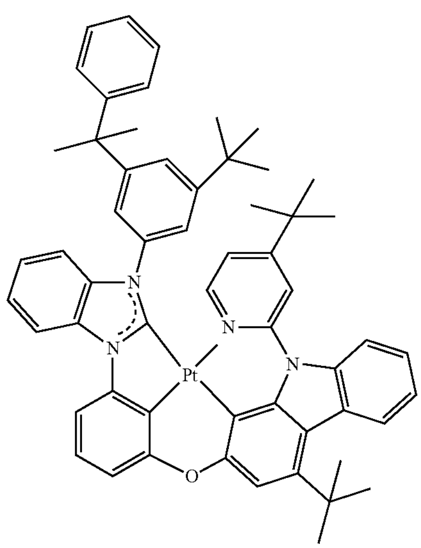
-continued
1863
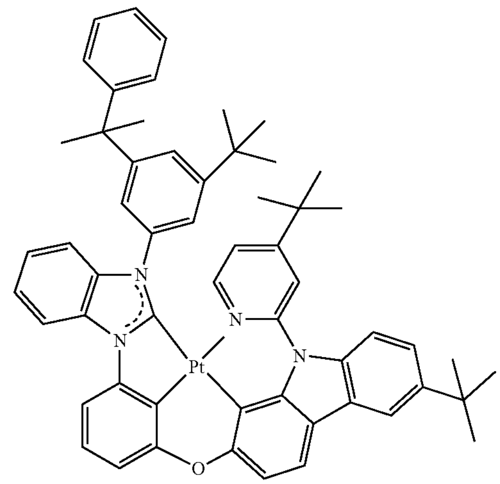
1864
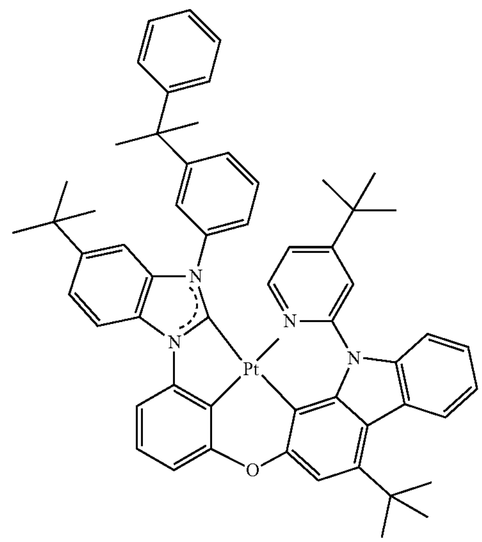
1865
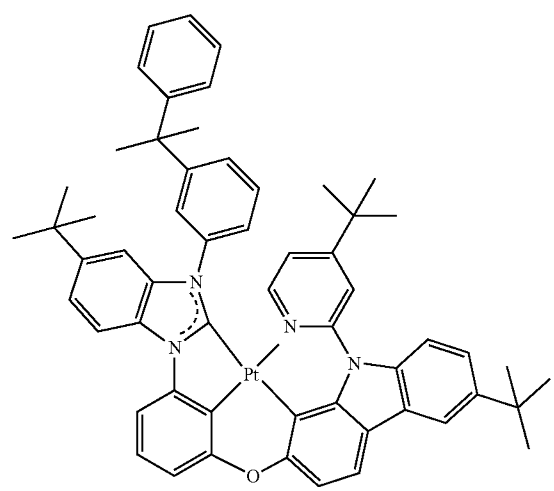

-continued
1866
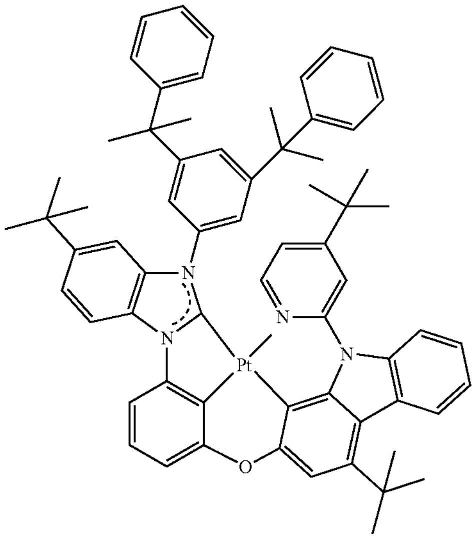
1867
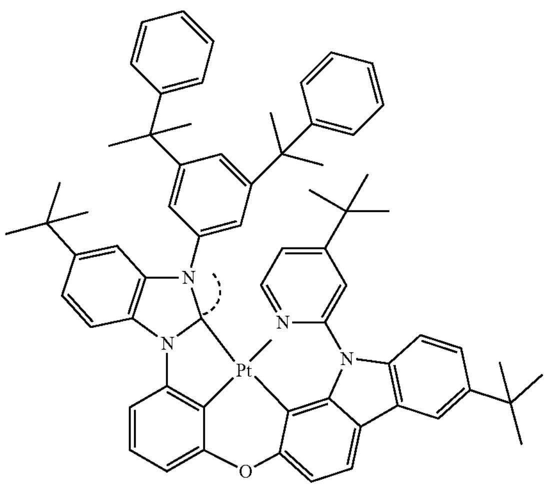
1868
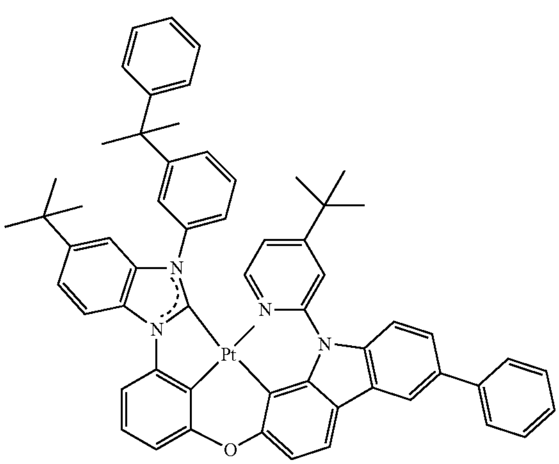
-continued
1869
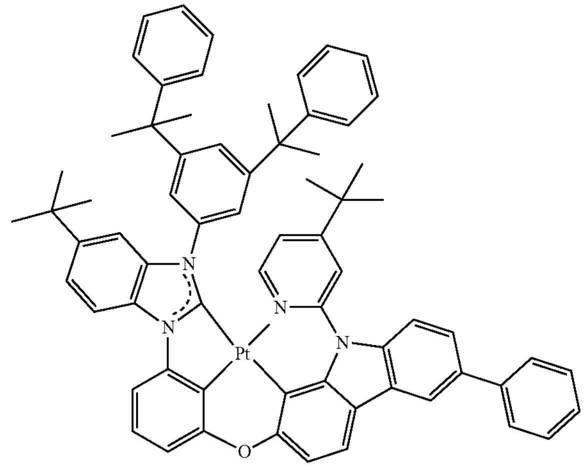
1870
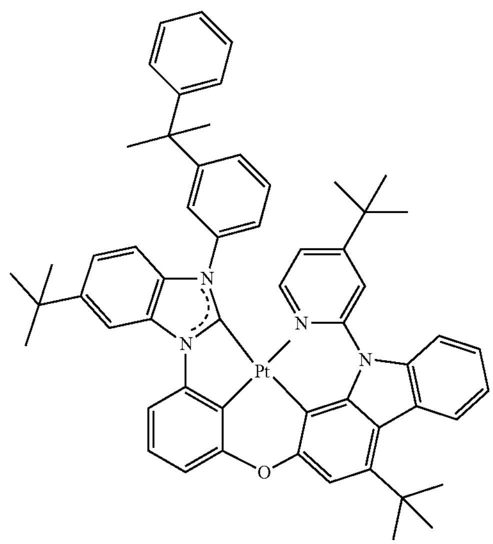
1871
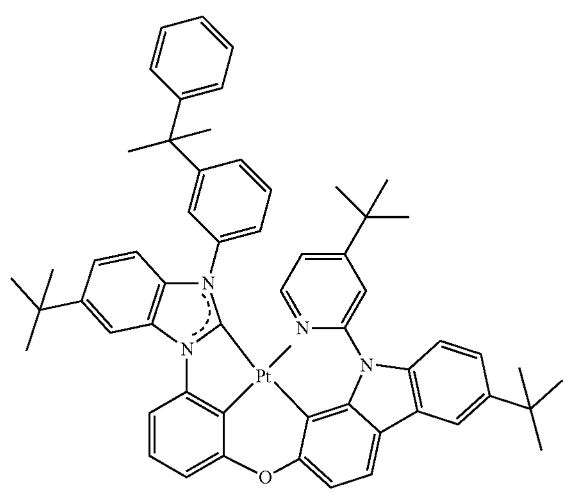

1872
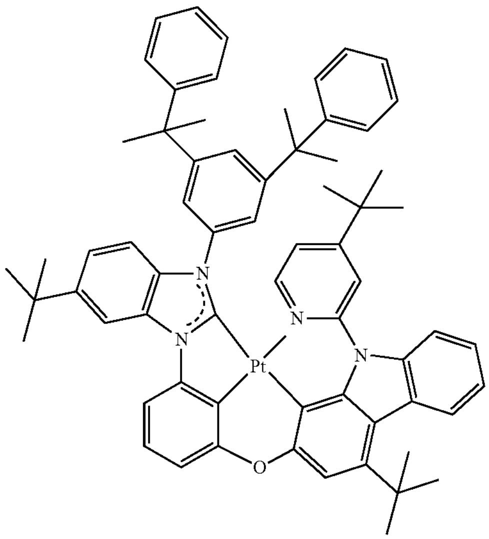
1873
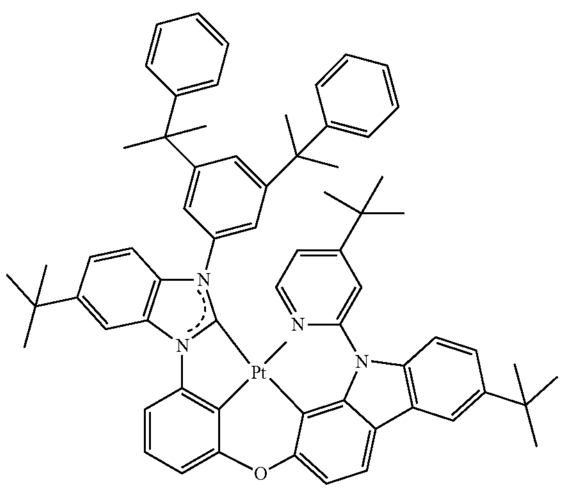
1874
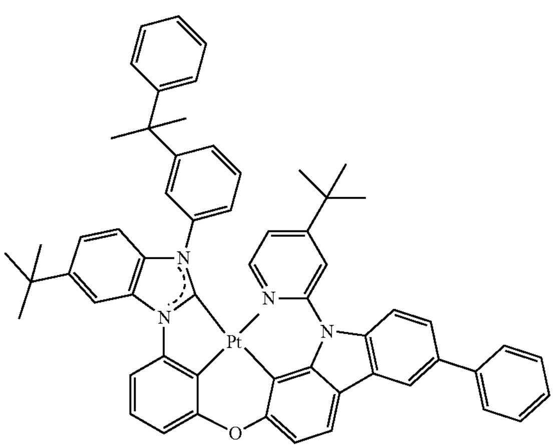
1875
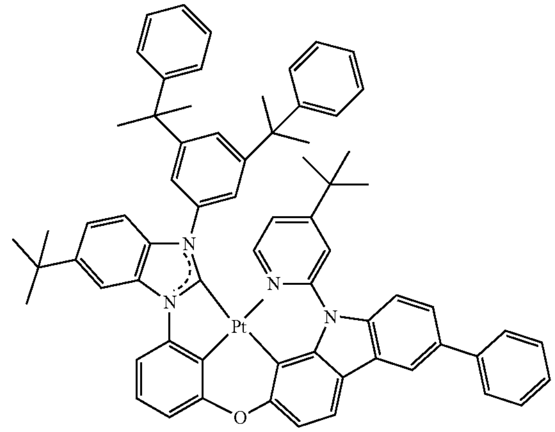
1876
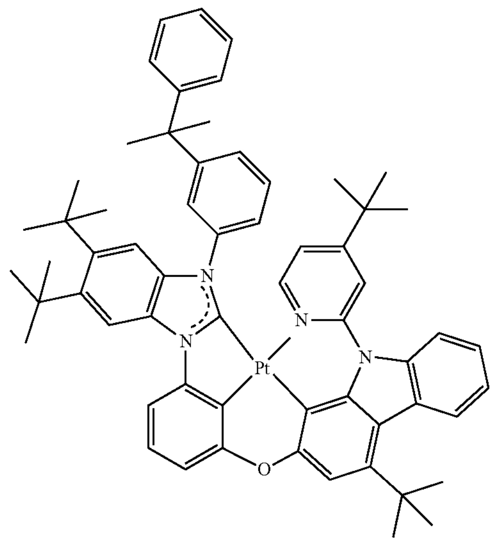
1877
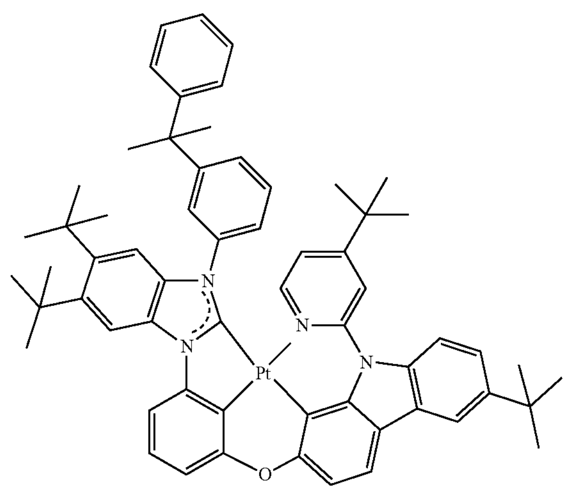

-continued
1878
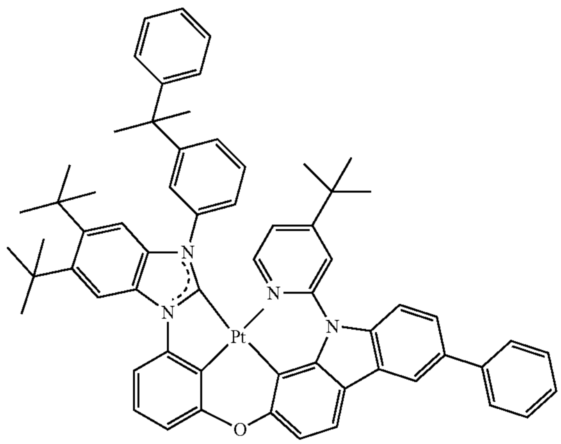
1879
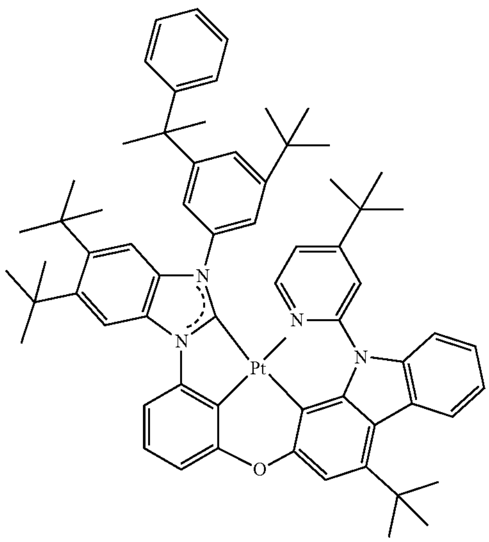
1880
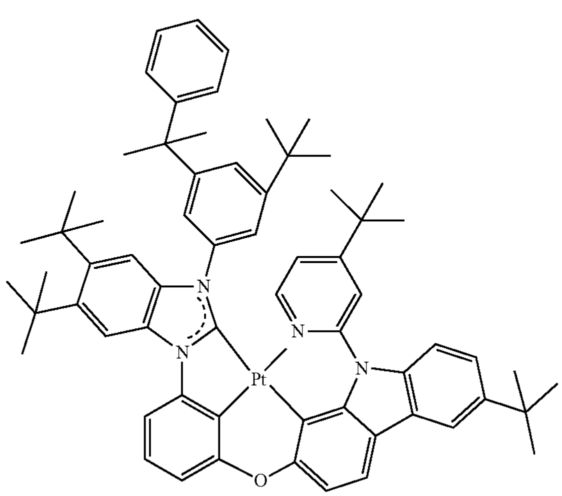
-continued
1881
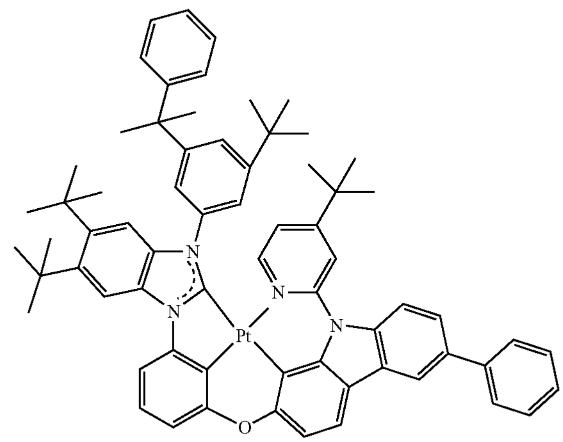
1882
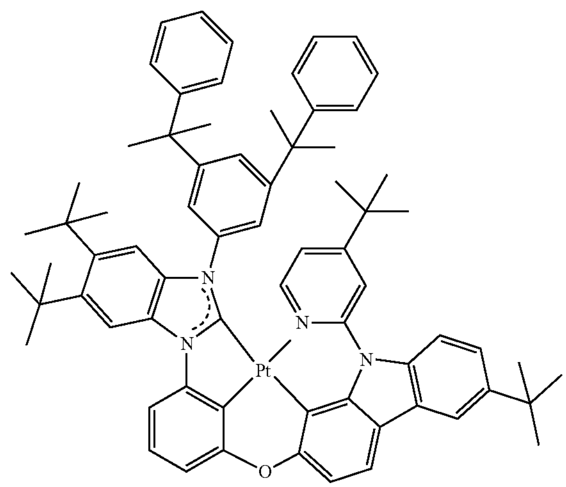
1883
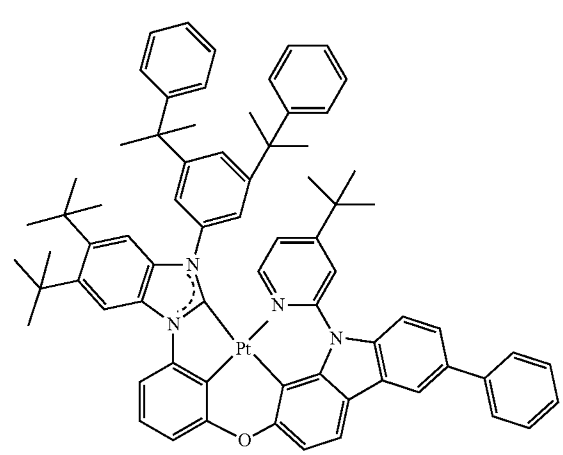

-continued
1884
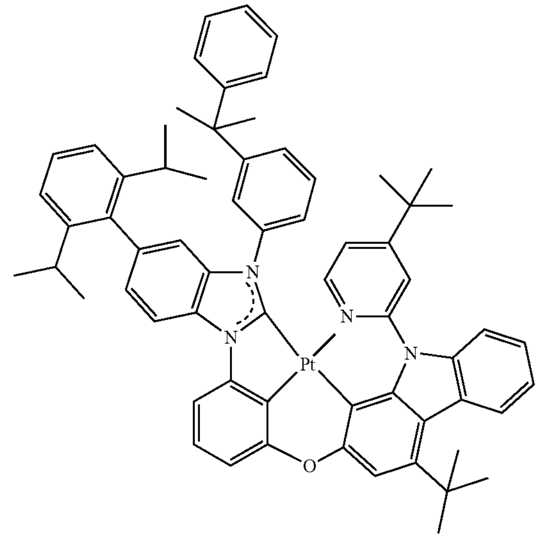
1885
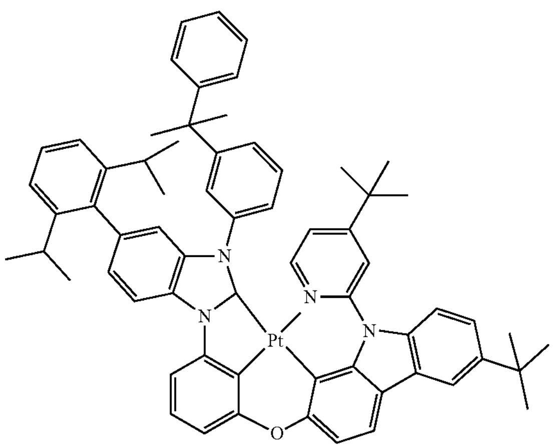
1886
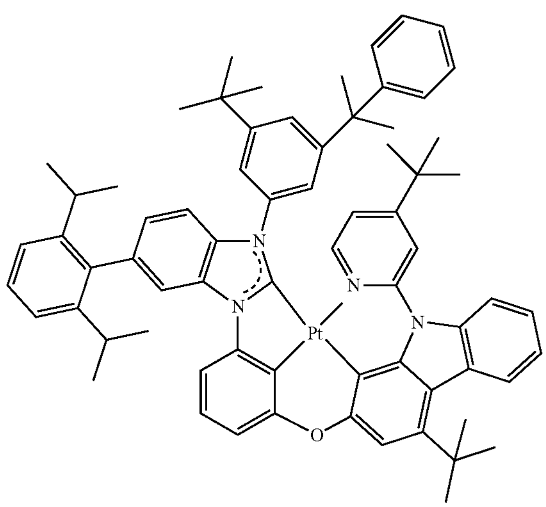
-continued
1887
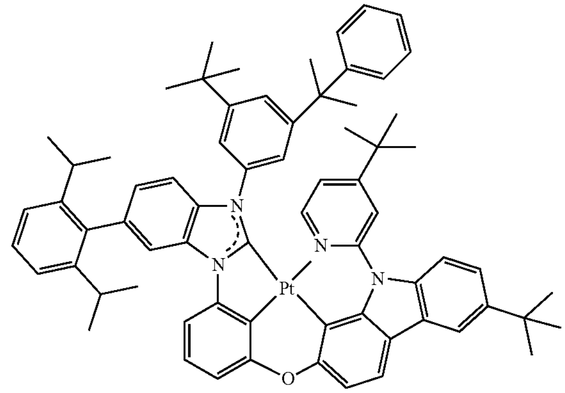
1888
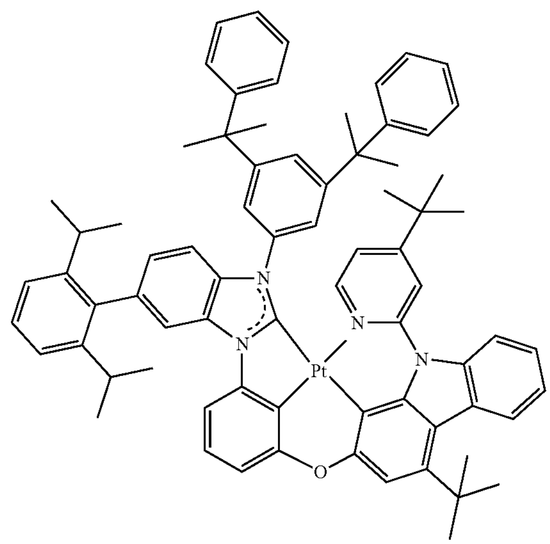
1889
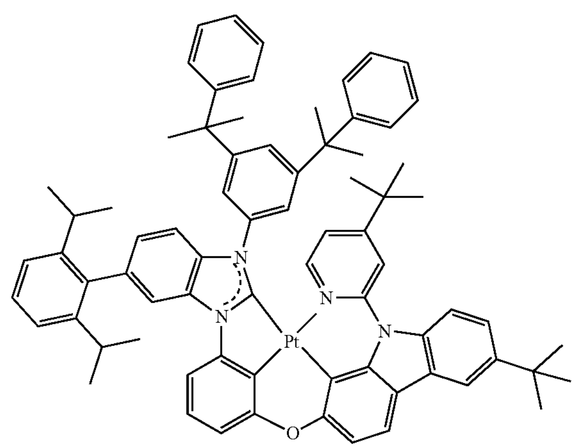

-continued
1890
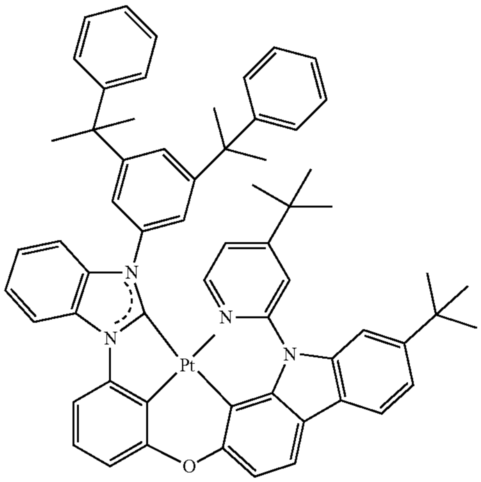
1891
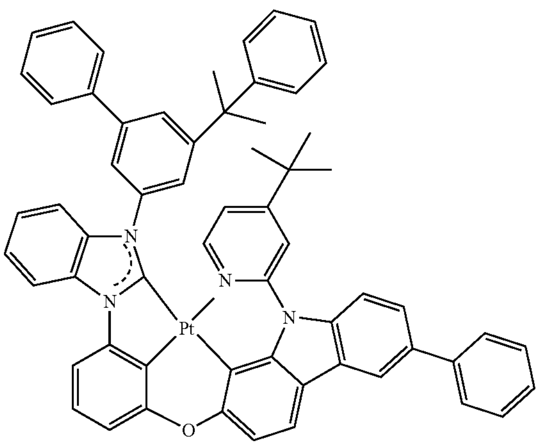
1892
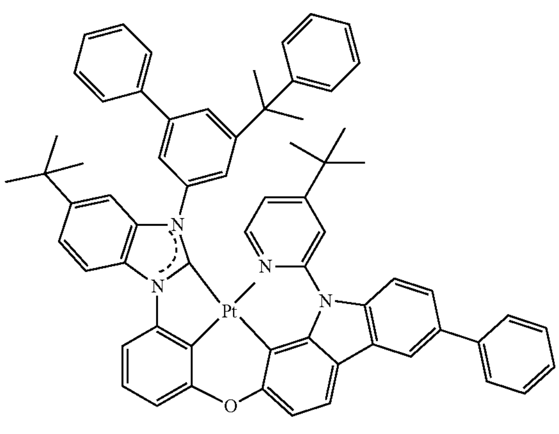
-continued
1893
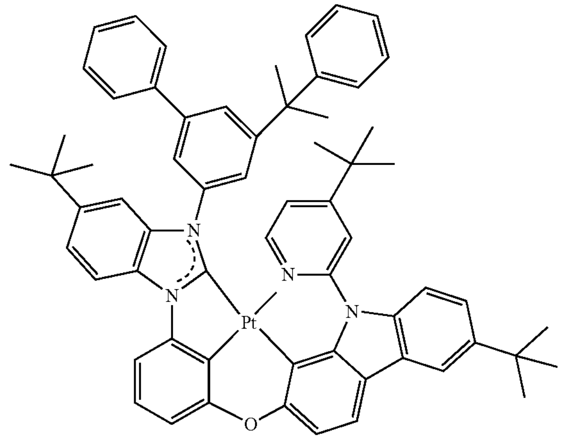
1894
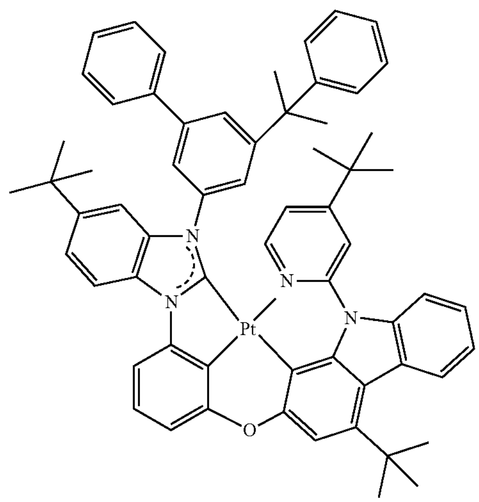
1895
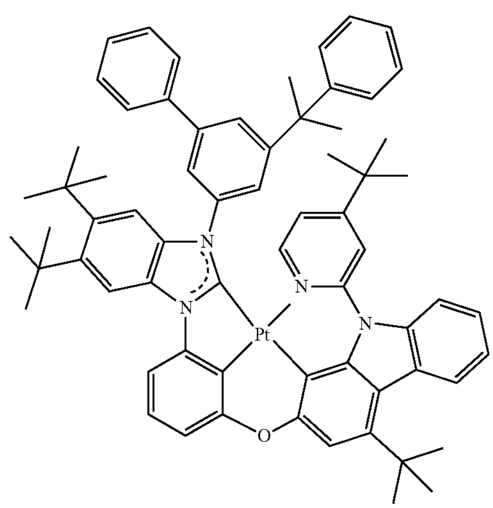

-continued
1896
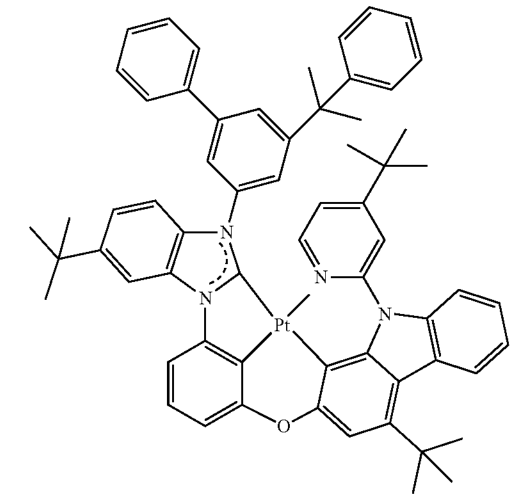
1897
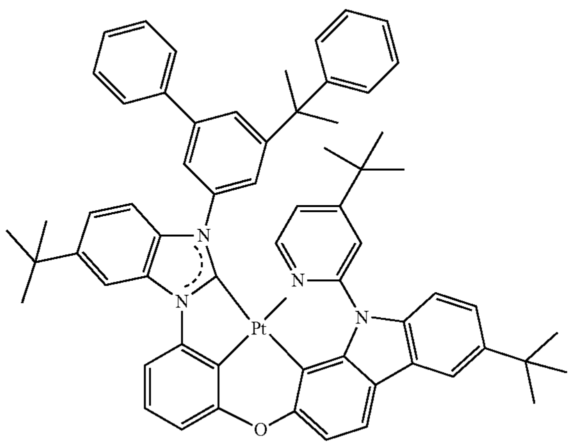
1898
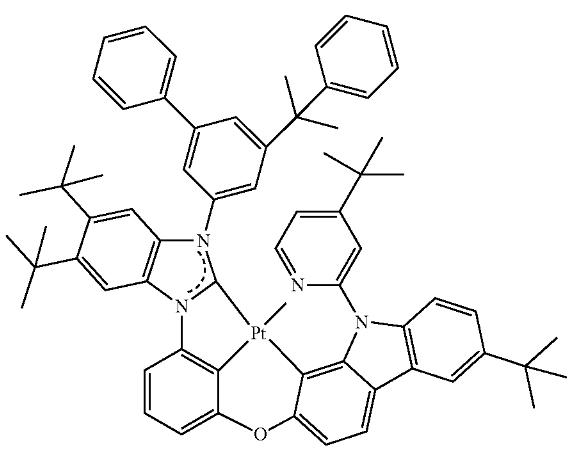
-continued
1899
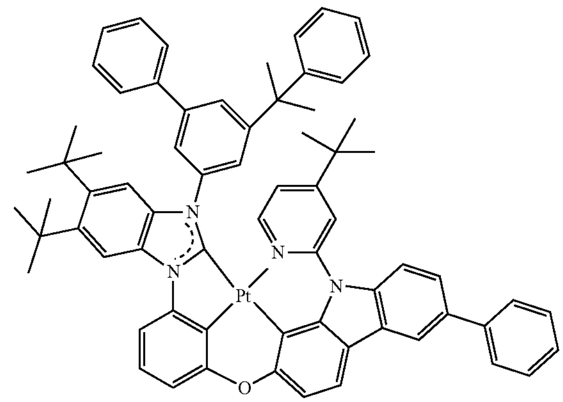
1900
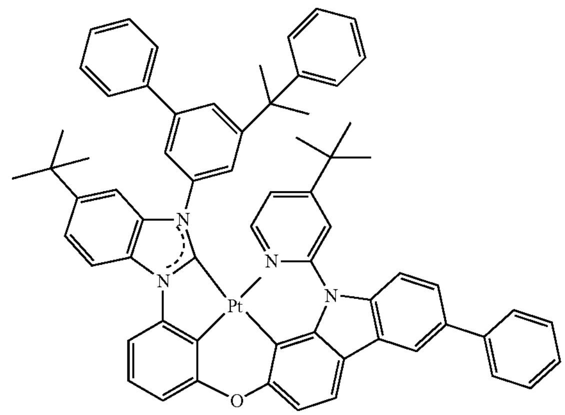
1901
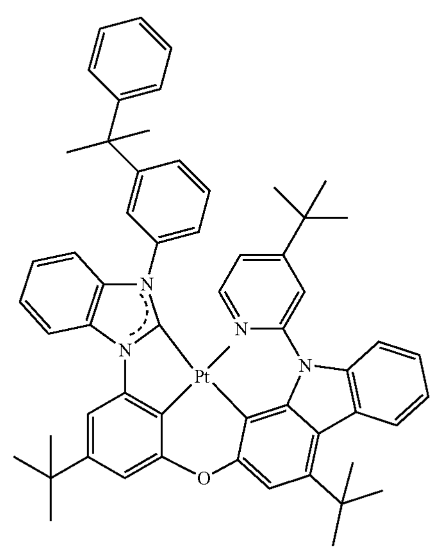

-continued
1902
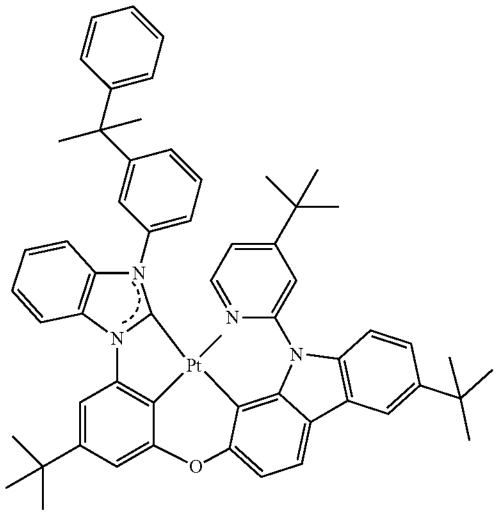
1903
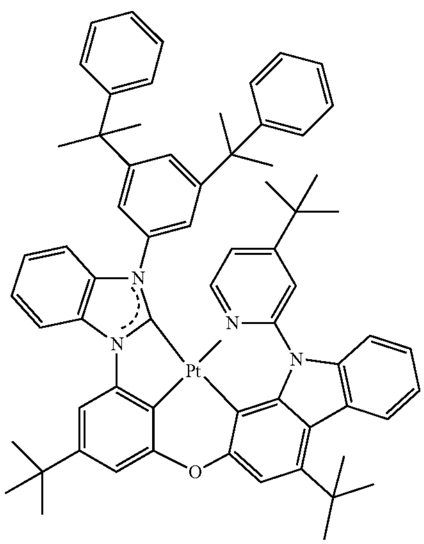
1904
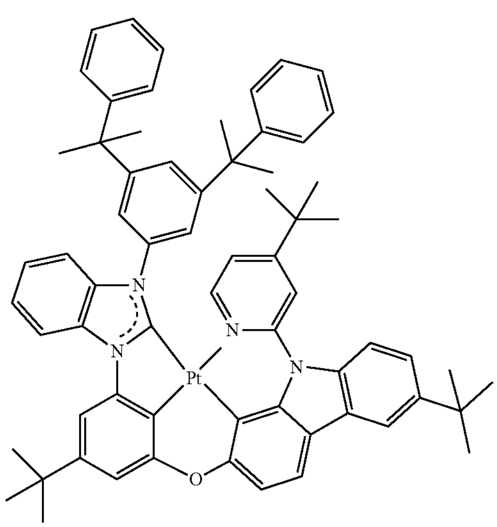
-continued
1905
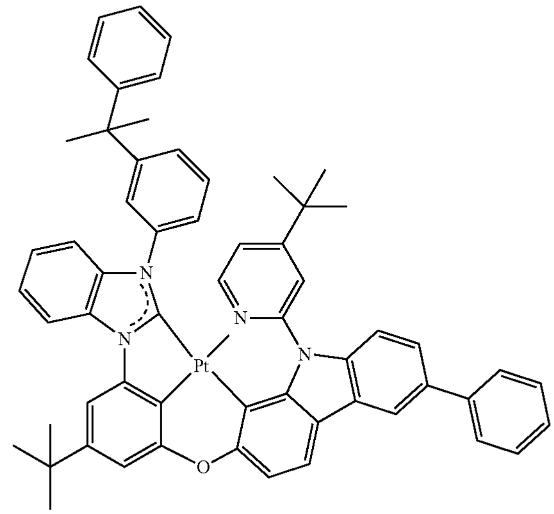
1906
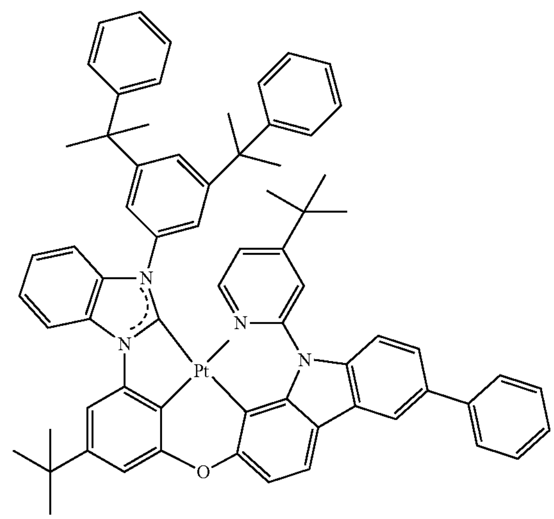
1907
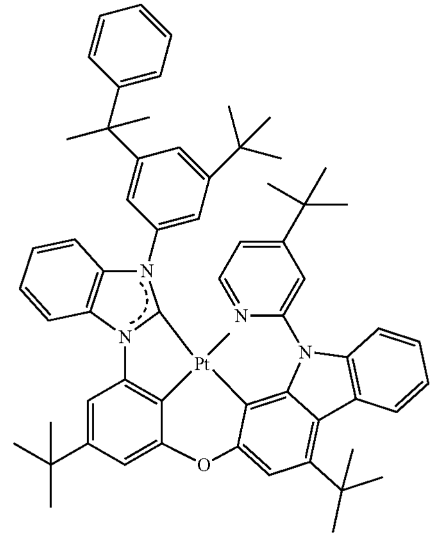

-continued
1908
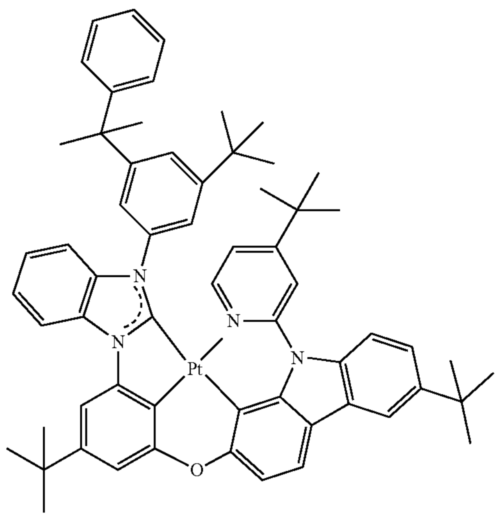
1909
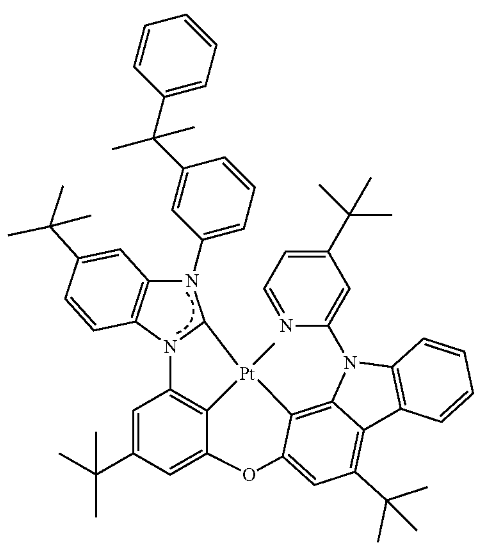
1910
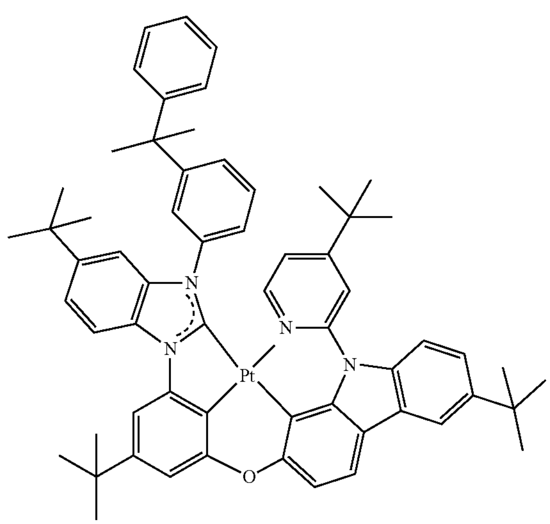
-continued
1911
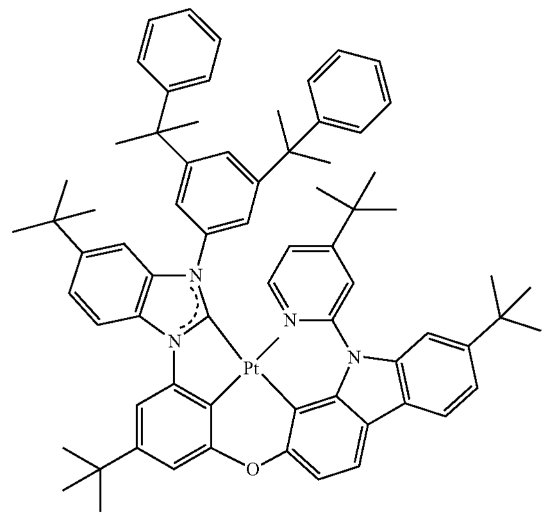
1912
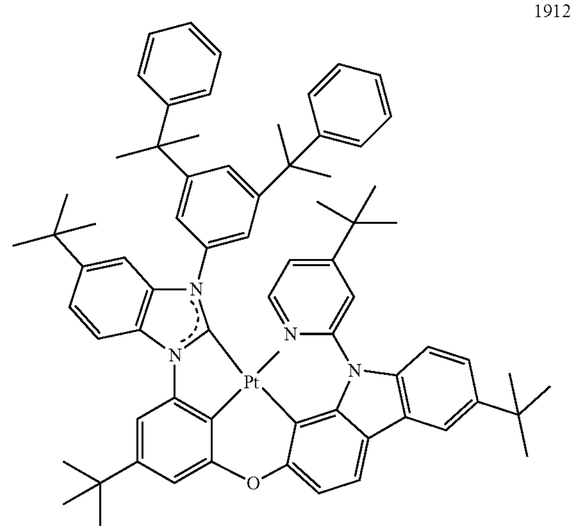
1913
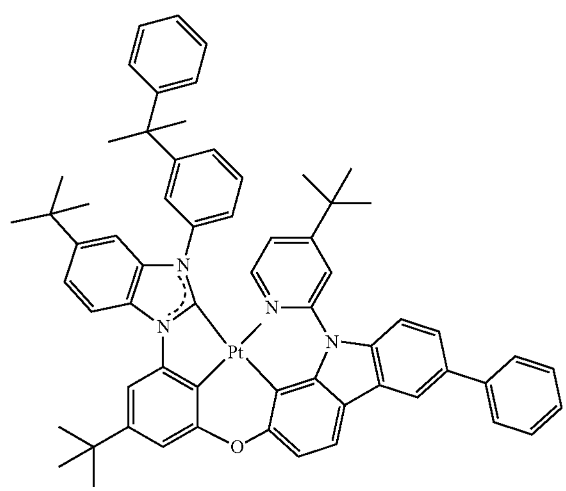

-continued
1914
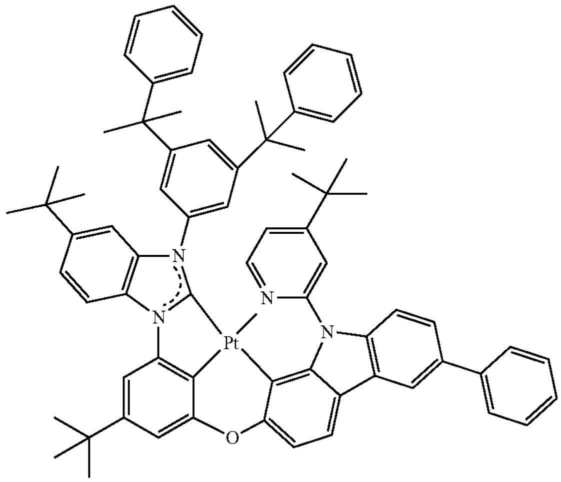
1915
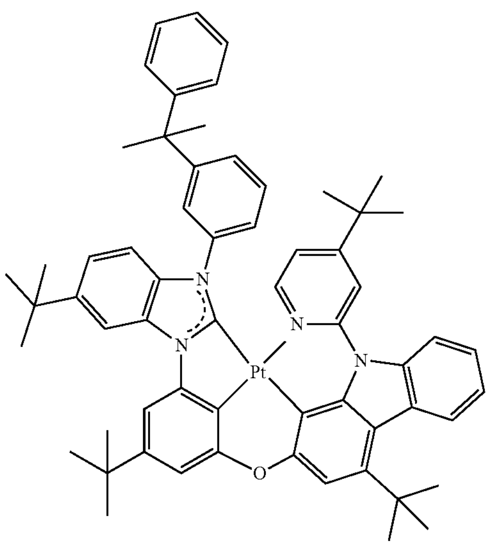
1916
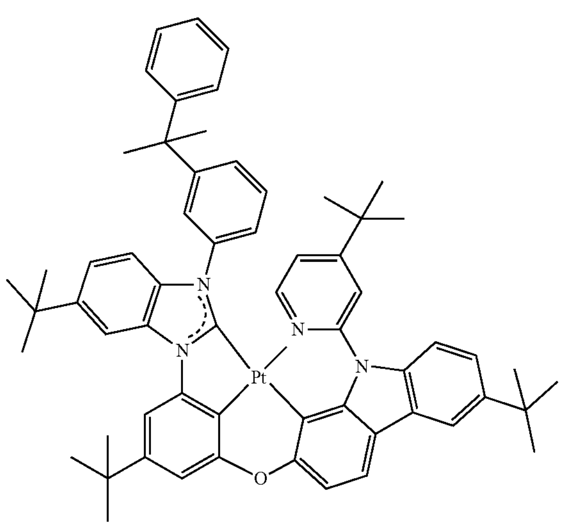
-continued
1917
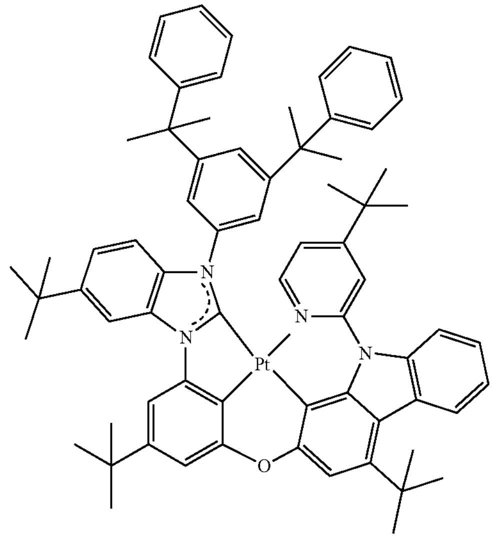
1918
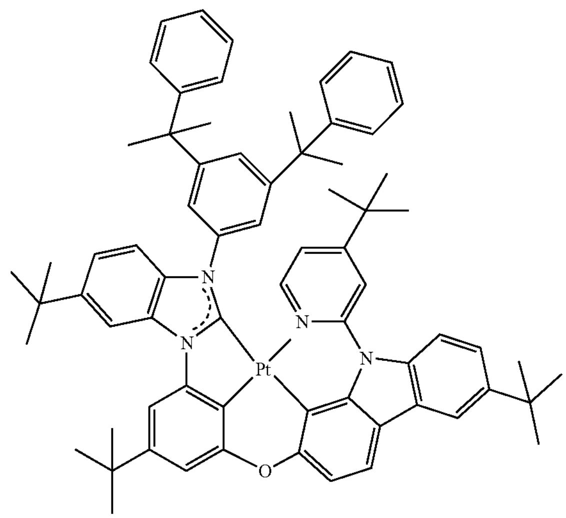
1919
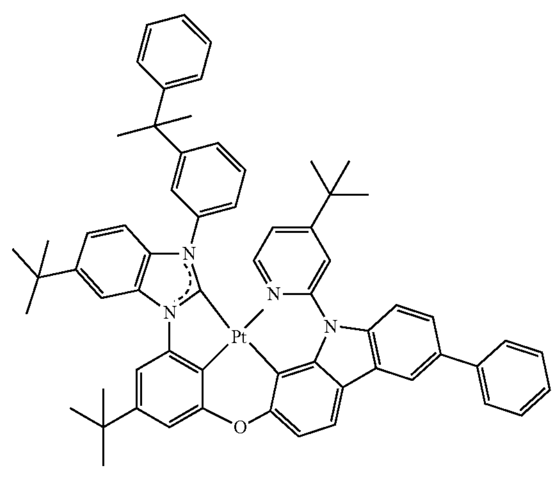

-continued
1920
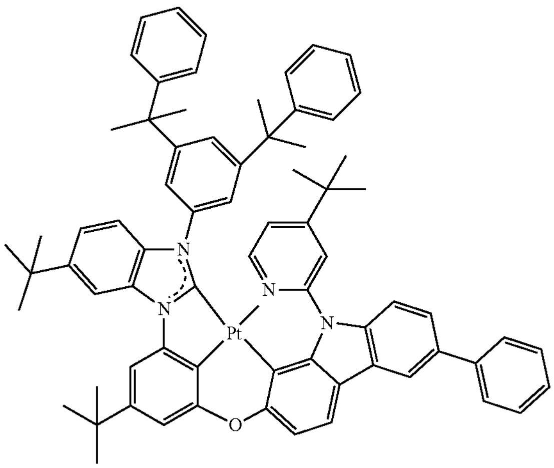
1921
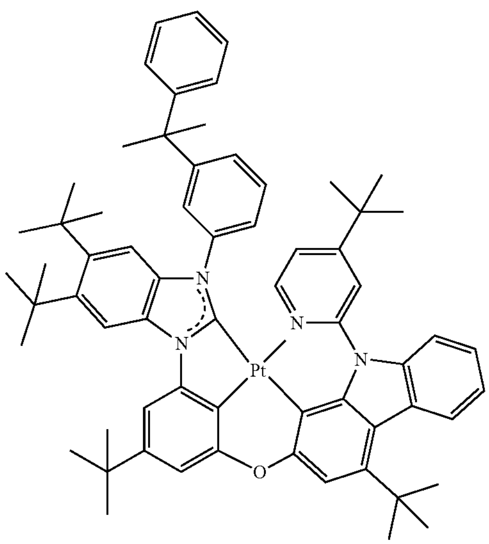
1922
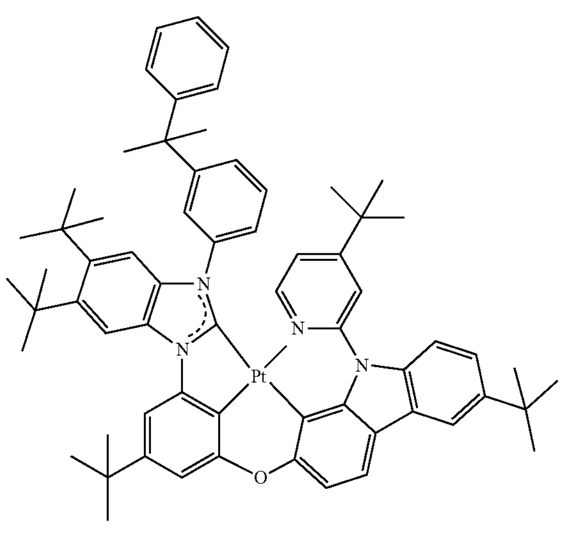
-continued
1923
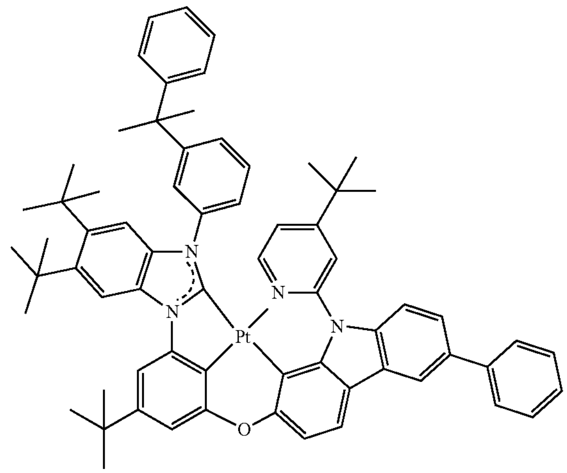
1924
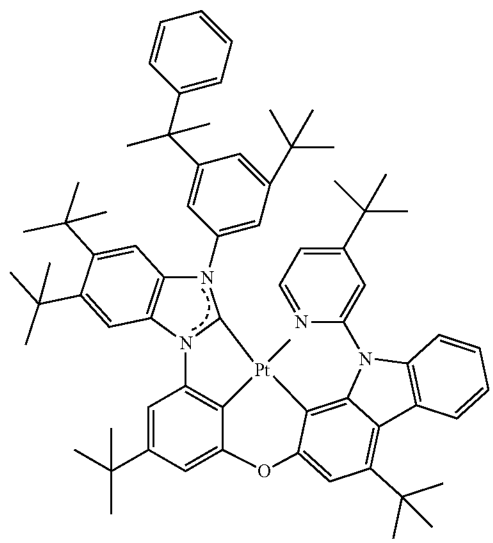
1925
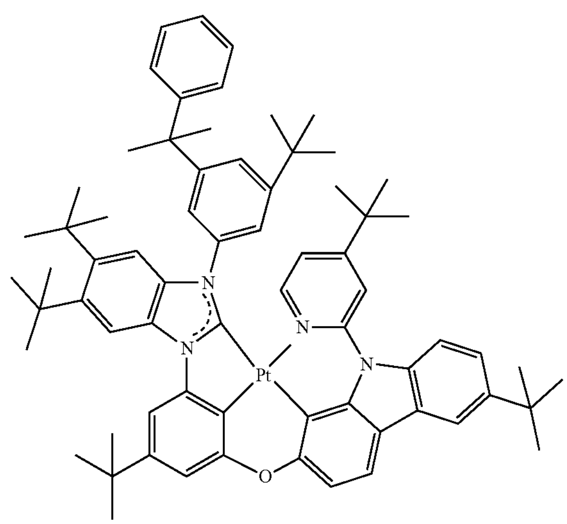

-continued
1926
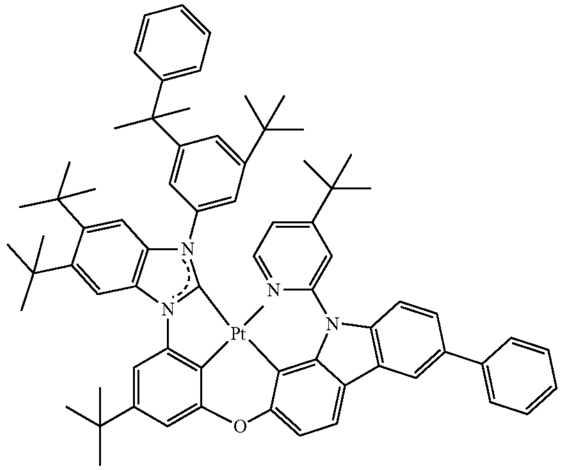
1927
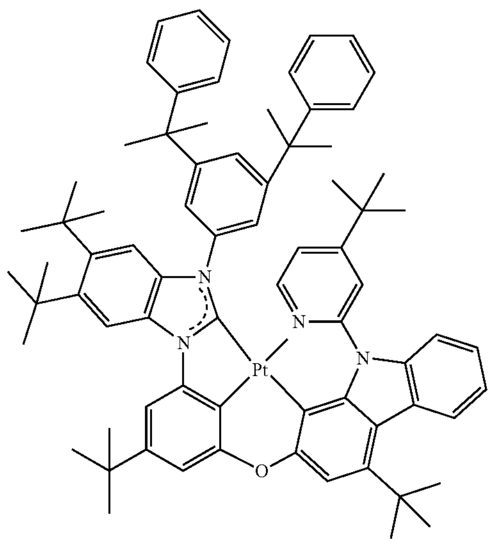
1928
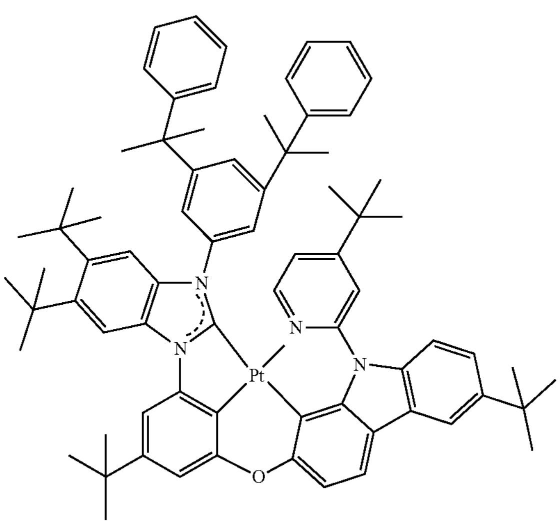
-continued
1929
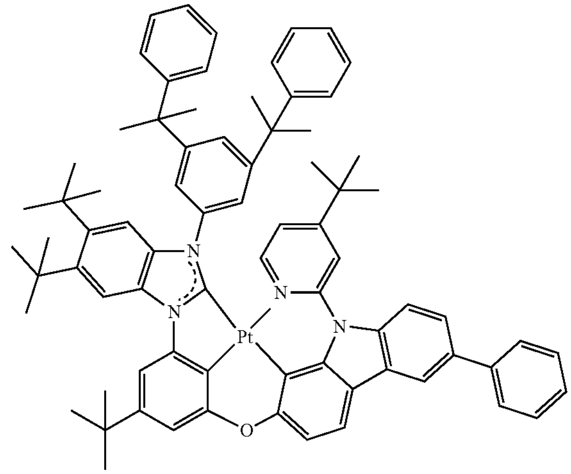
1930
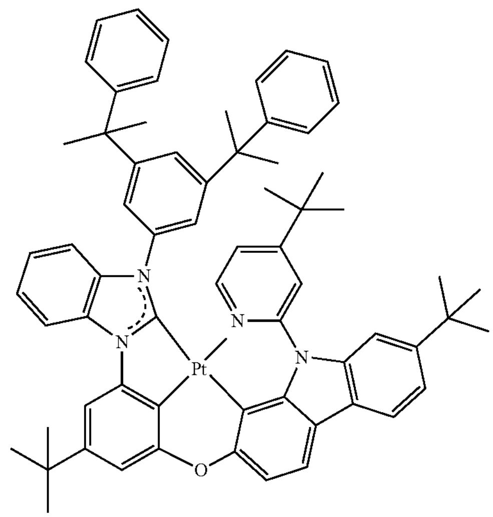
1931
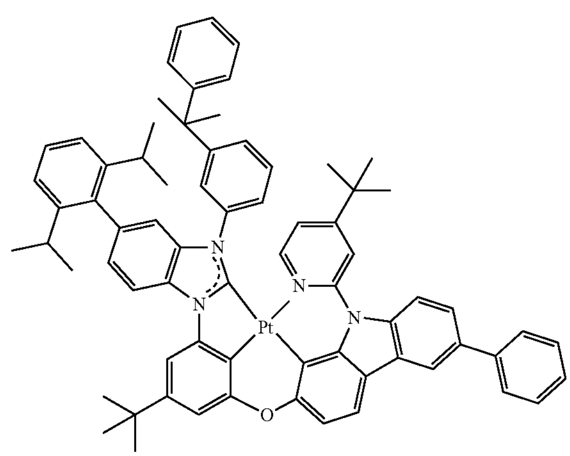

1932
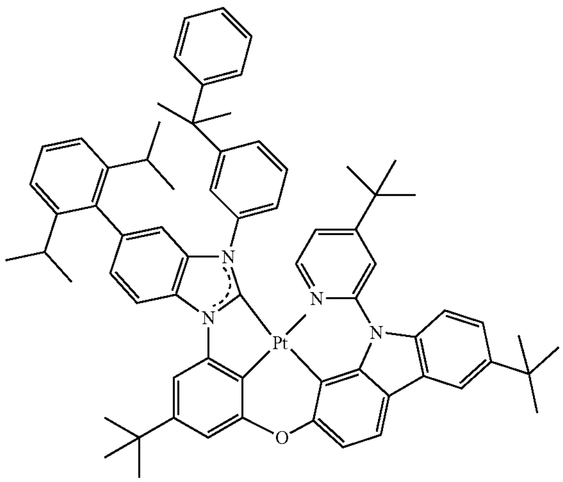
1933
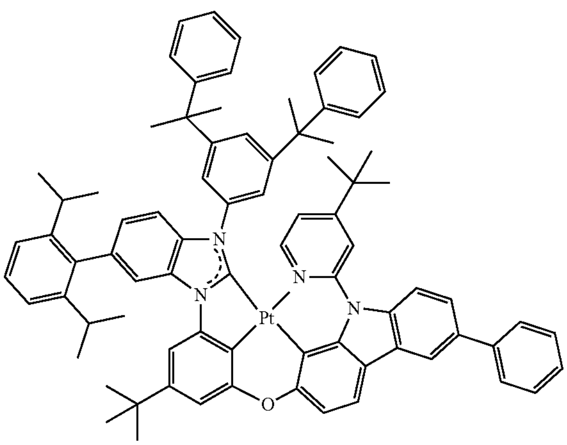
1934
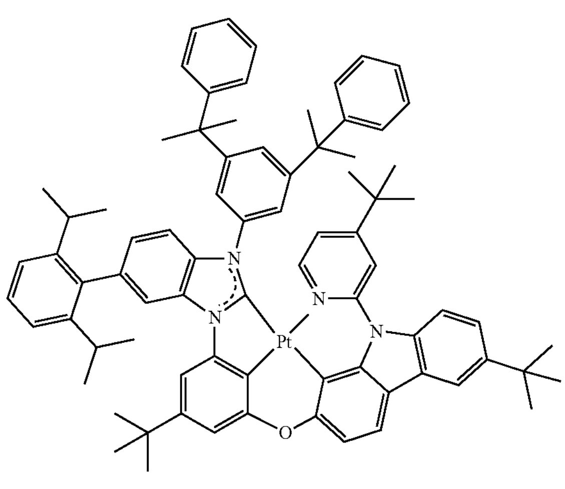
1935
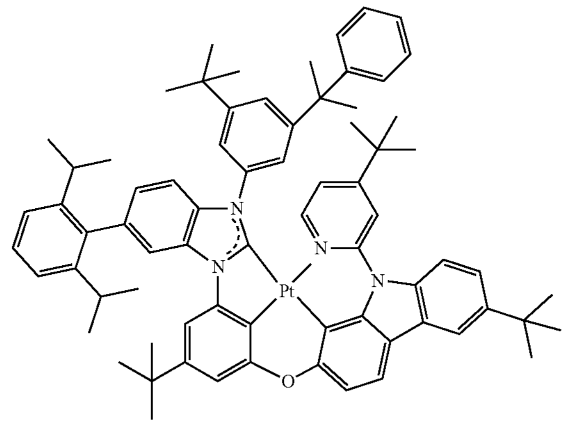
1936
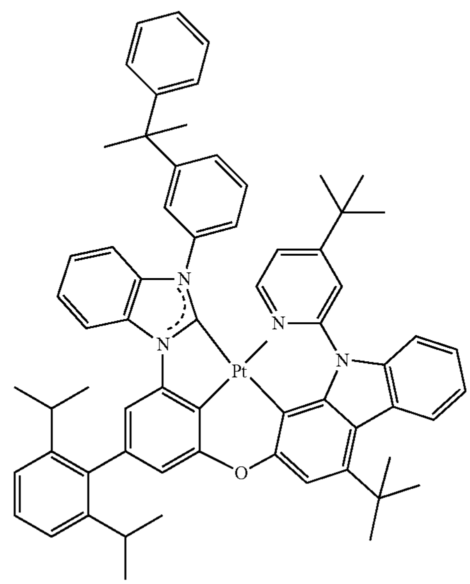
1937
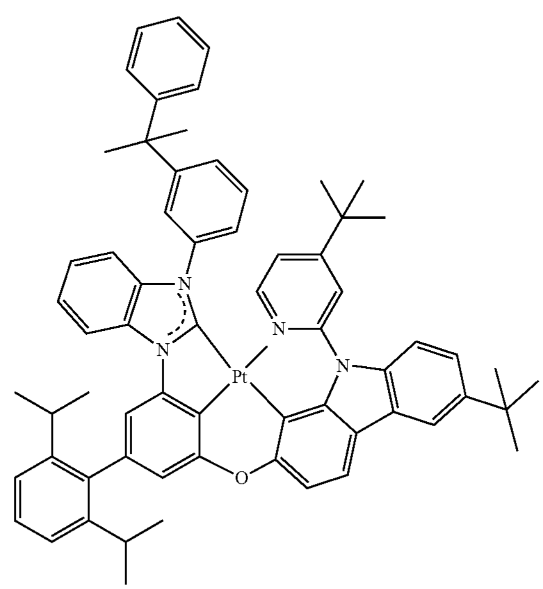

-continued
1938
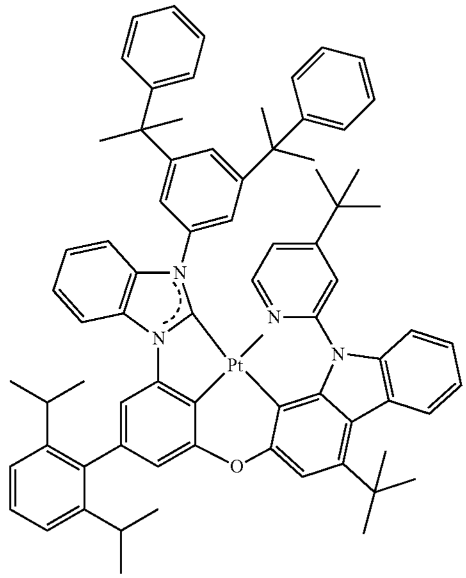
1939
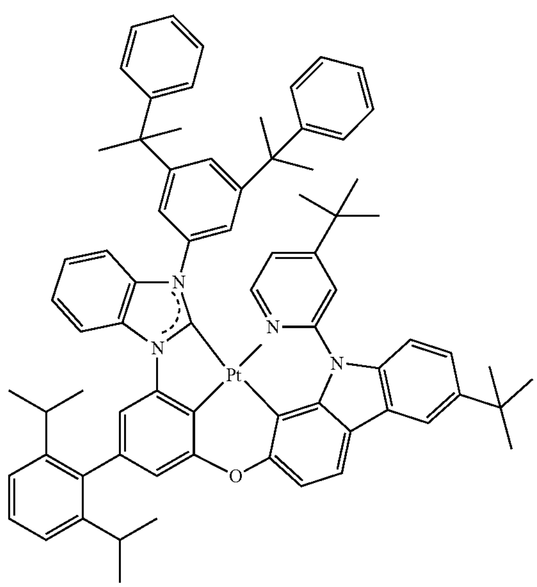
-continued
1940
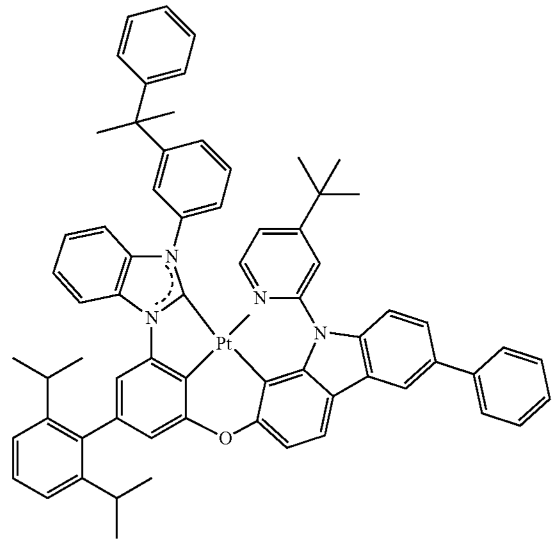
1941
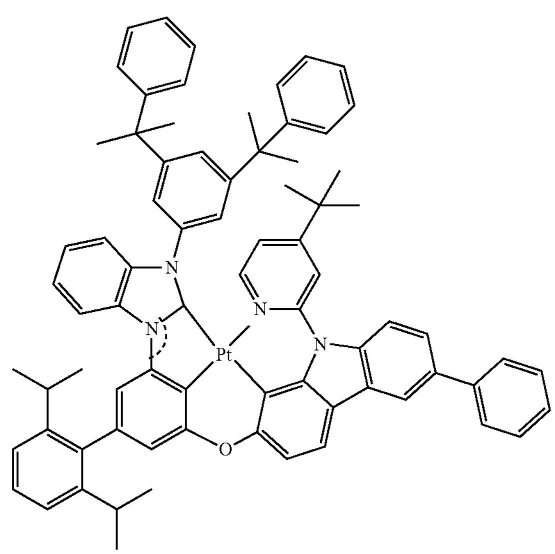

1942
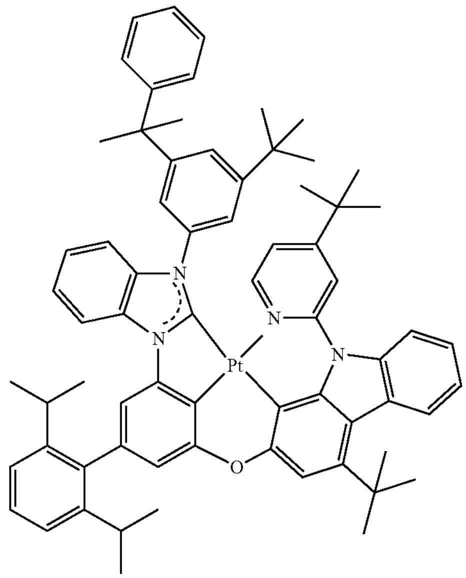
1943
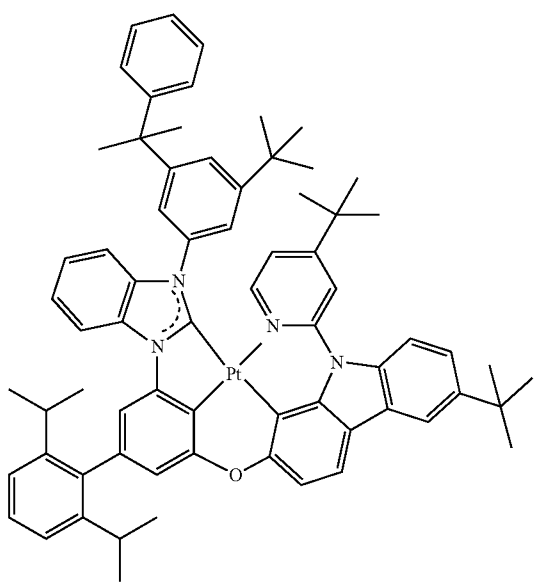
1944
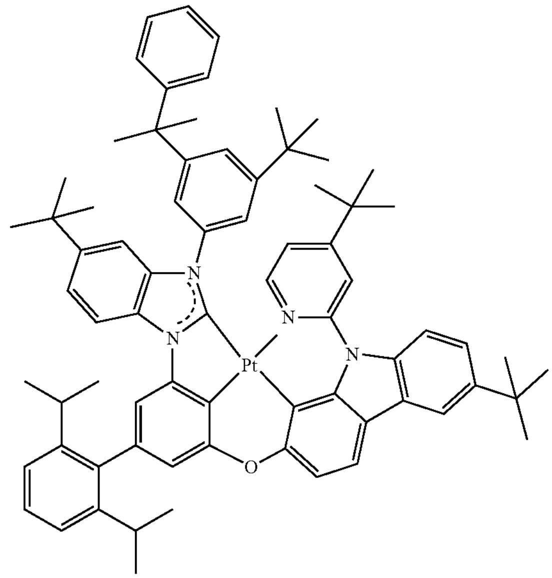
1945
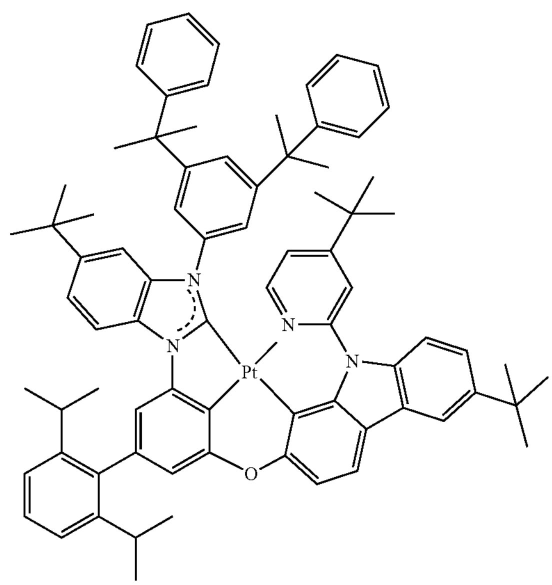

-continued
1946
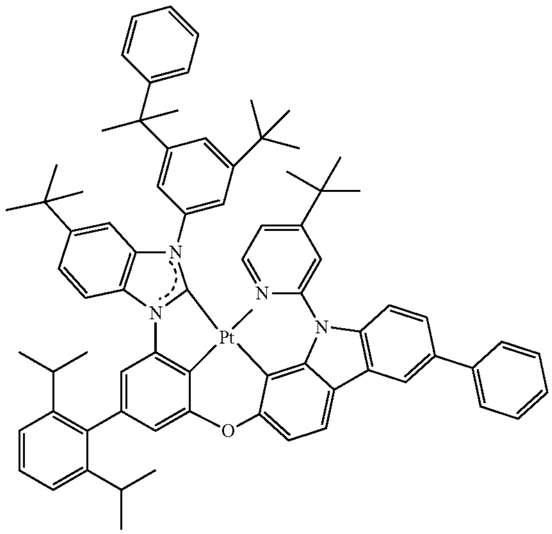
1947
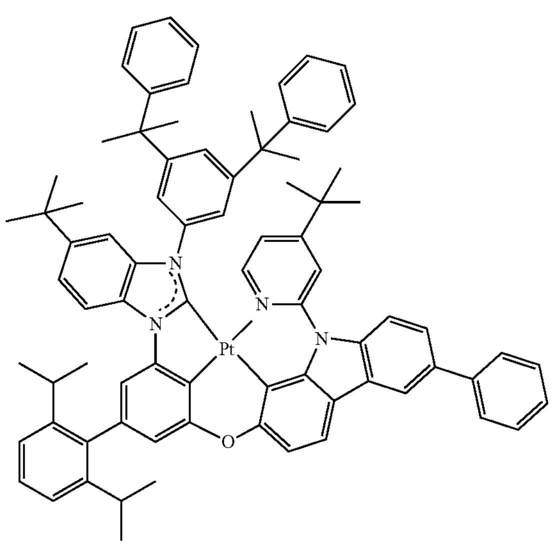
-continued
1948
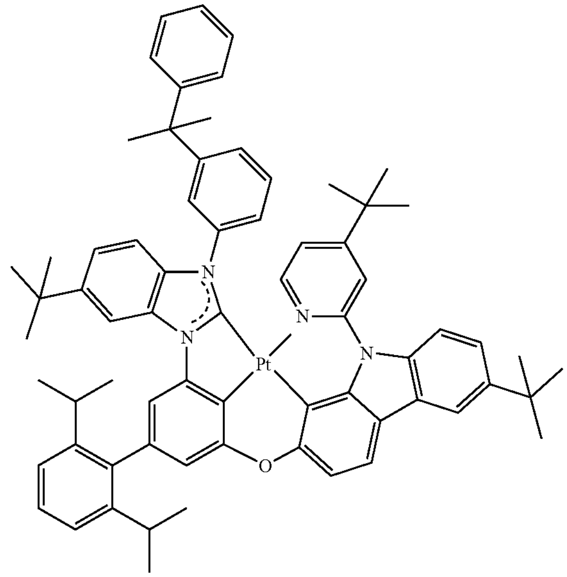
1949
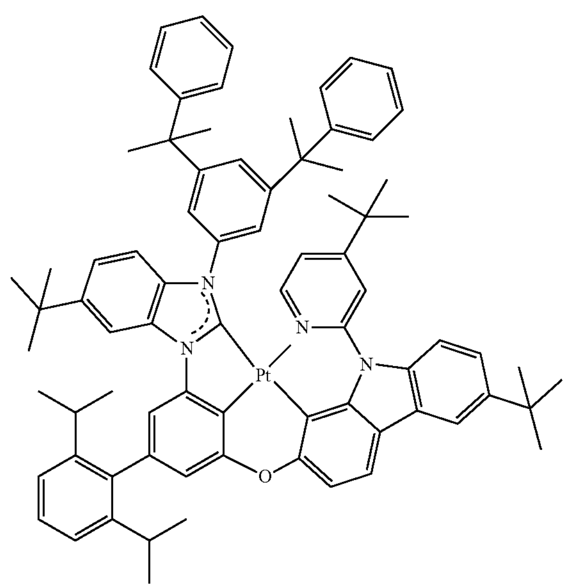

-continued
1950
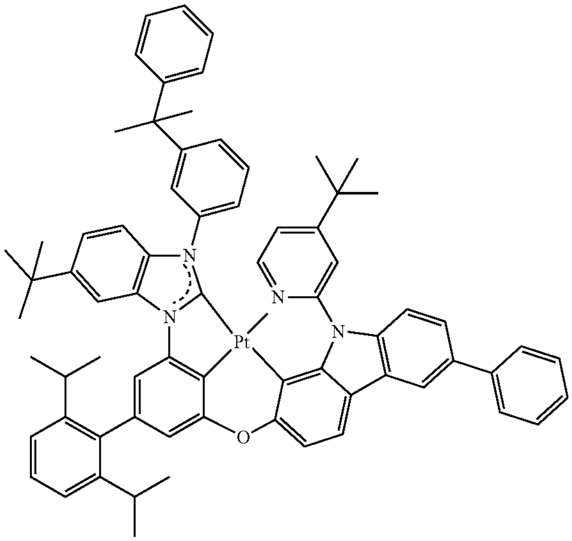
1951
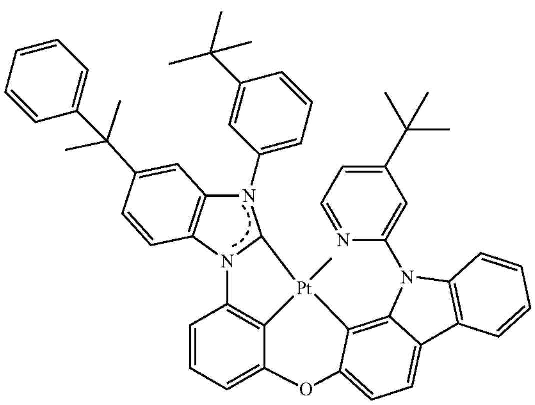
1952
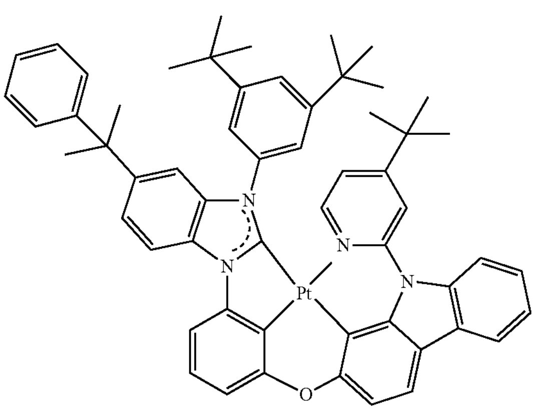
-continued
1953
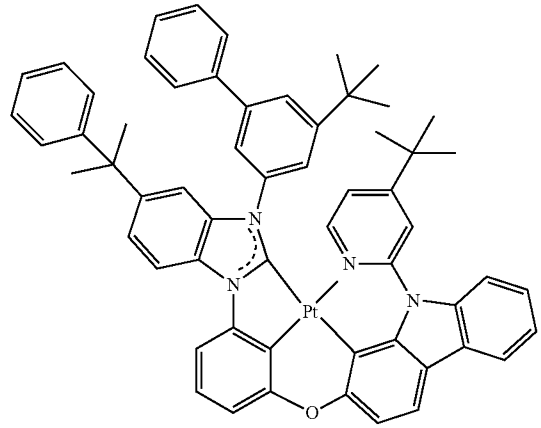
1954
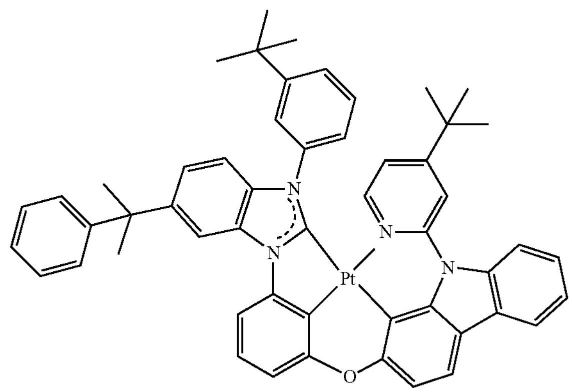
1955
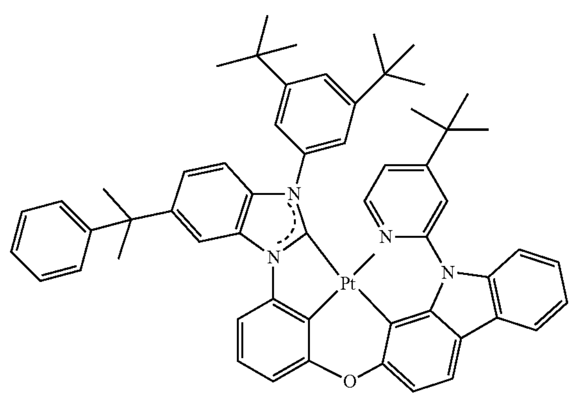

-continued
1956
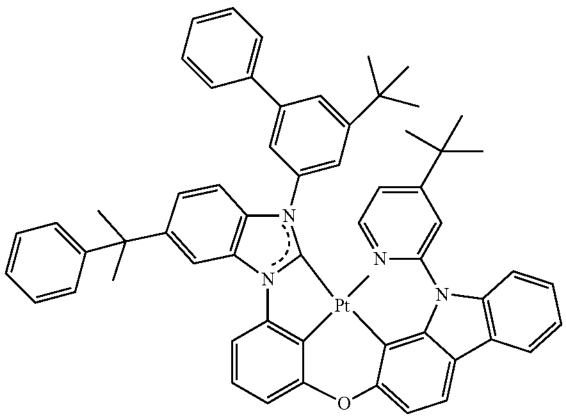
1957
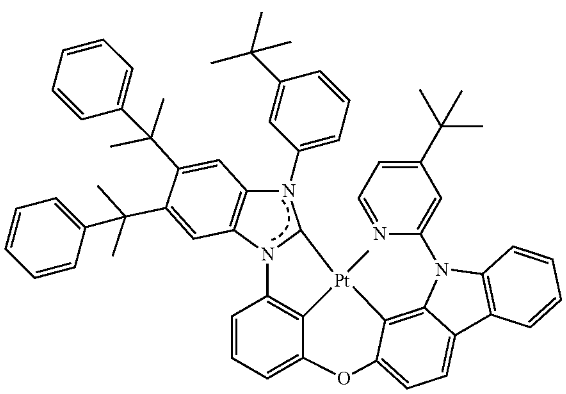
1958
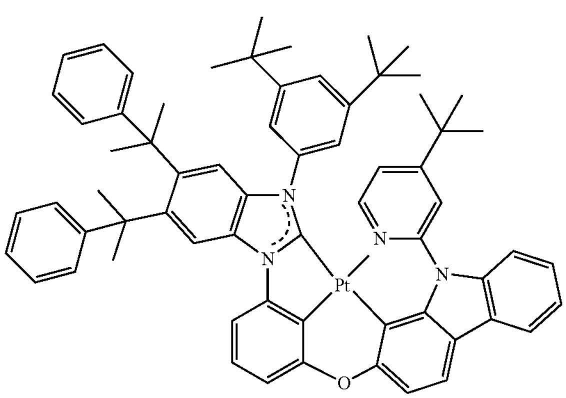
-continued
1959
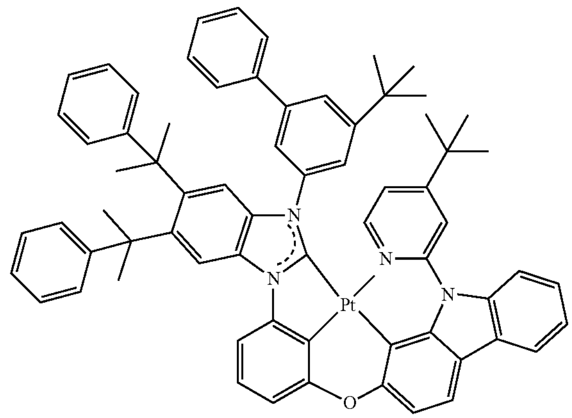
1960
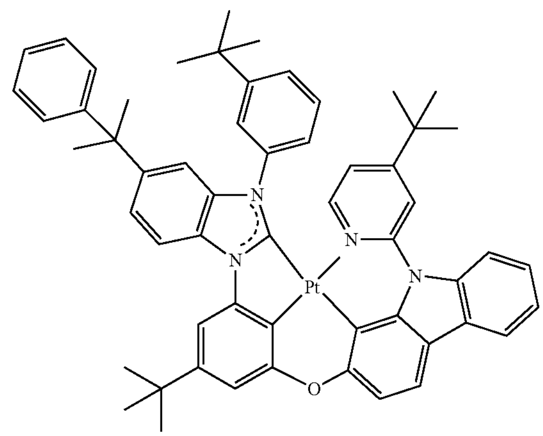
1961
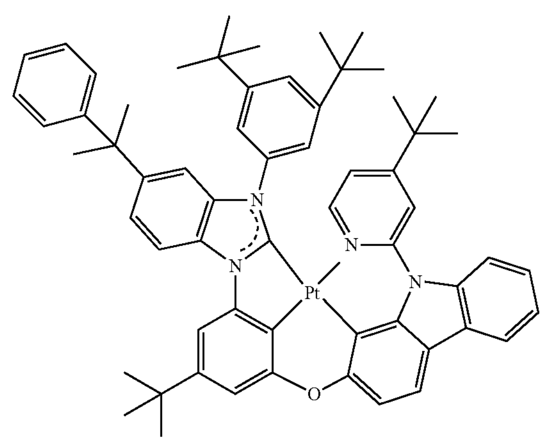

-continued
1962
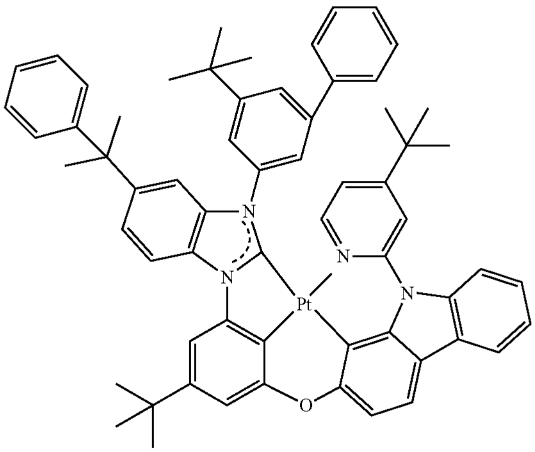
1963
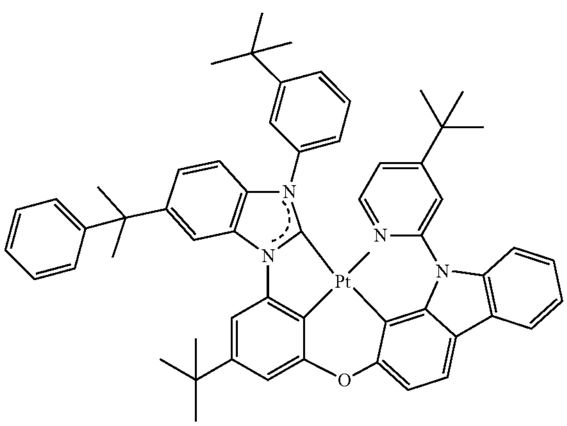
1964
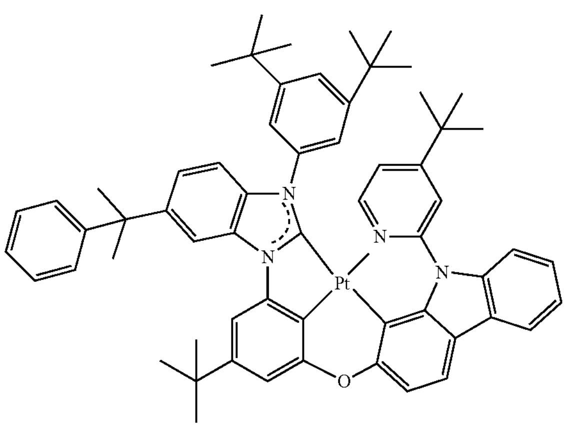
-continued
1965
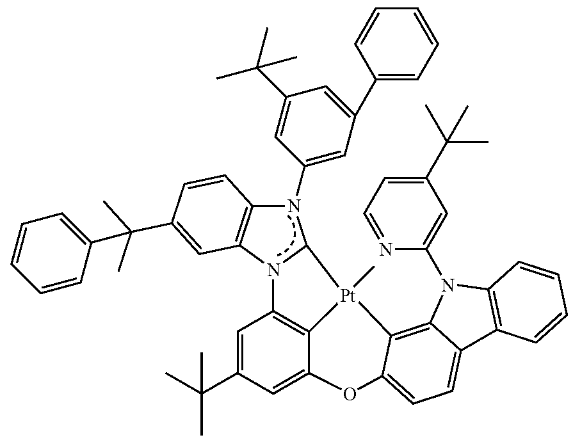
1966
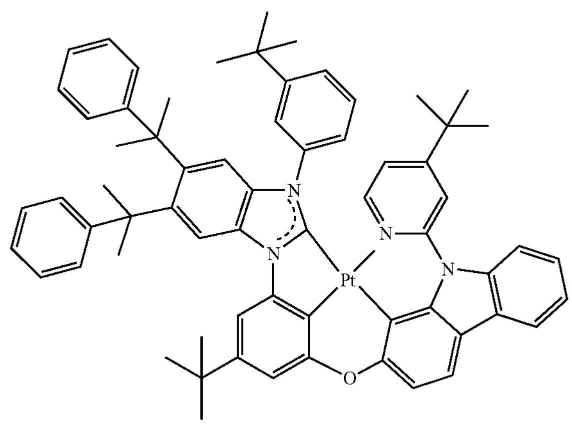
1967
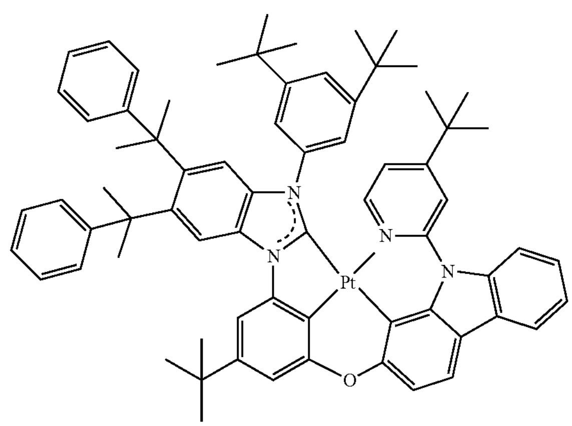

1968
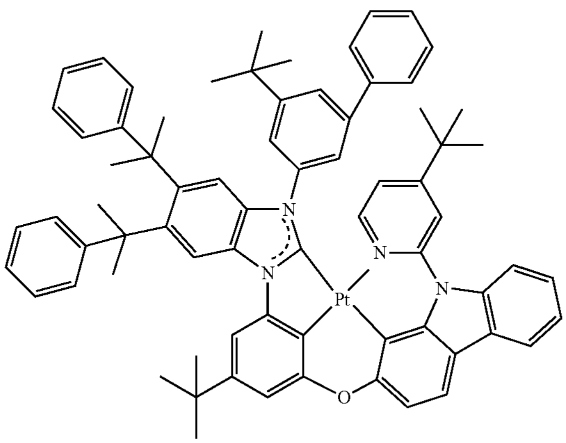
1969
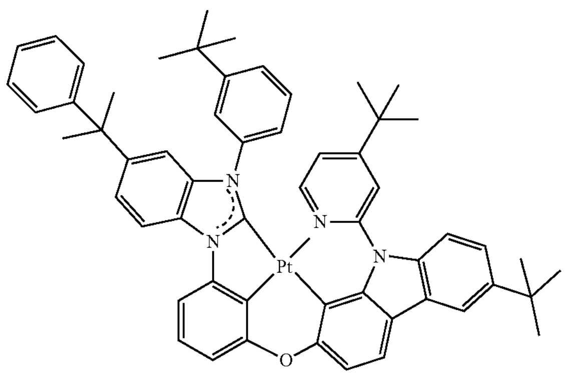
1970
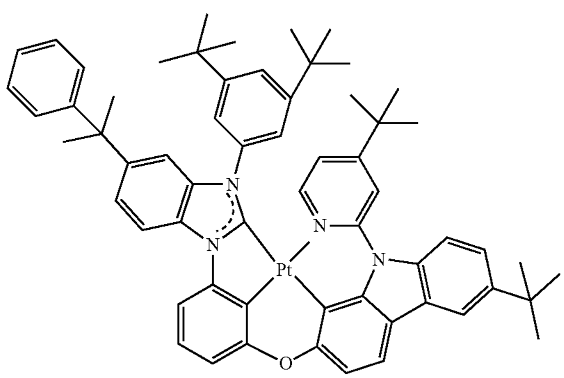
1971
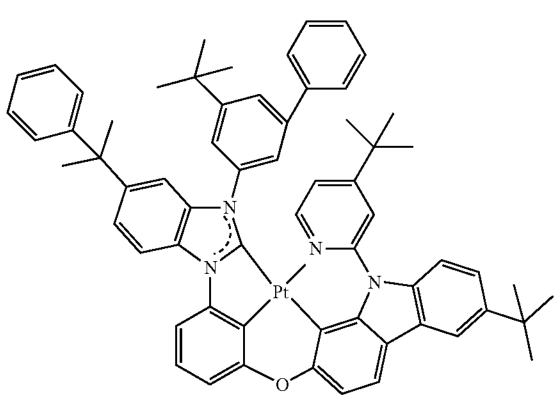
1972
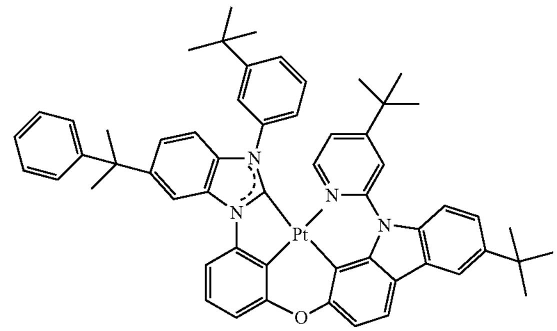
1973
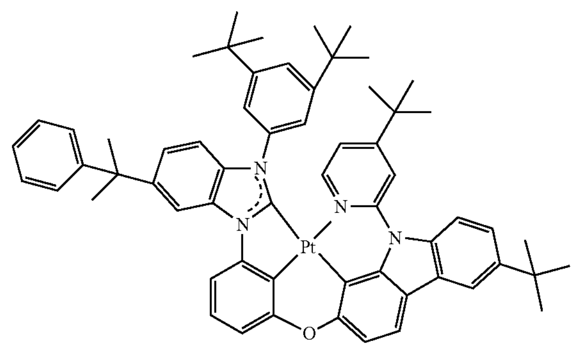
1974
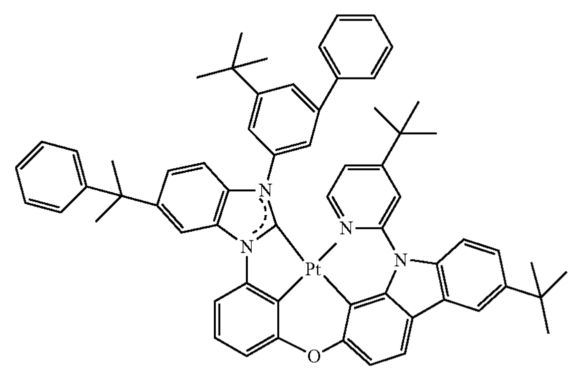
1975
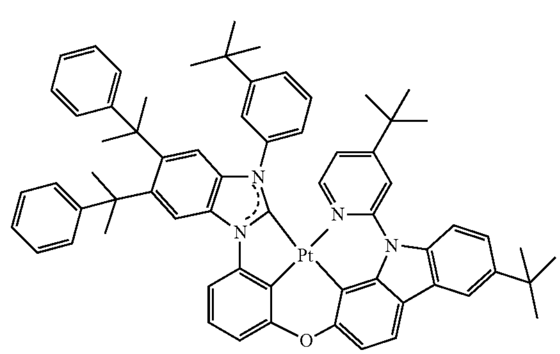

-continued
1976
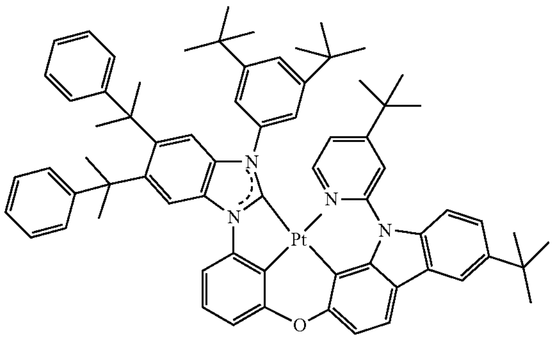
1977
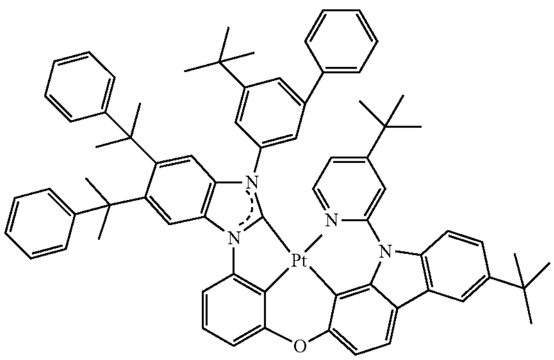
1978
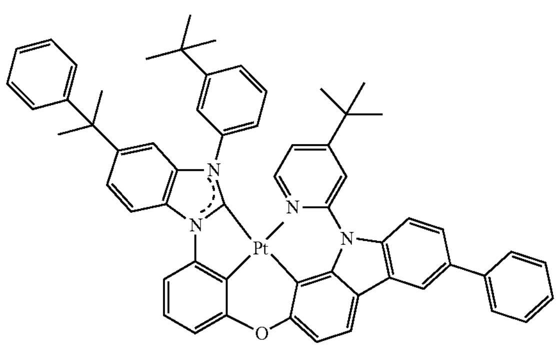
1979
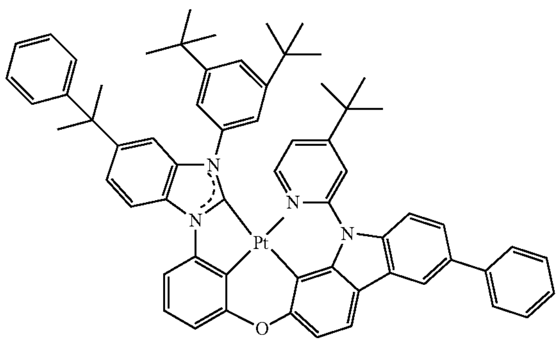
-continued
1980
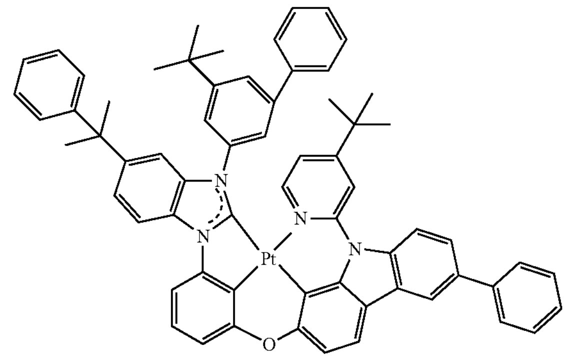
1981
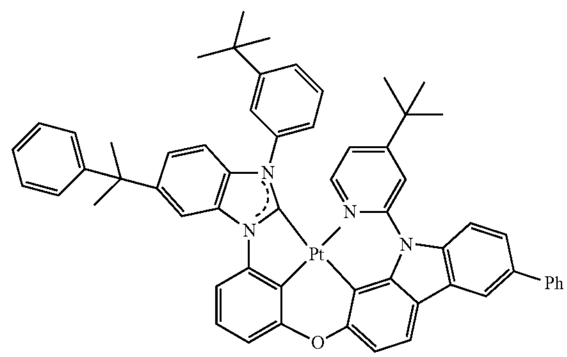
1982
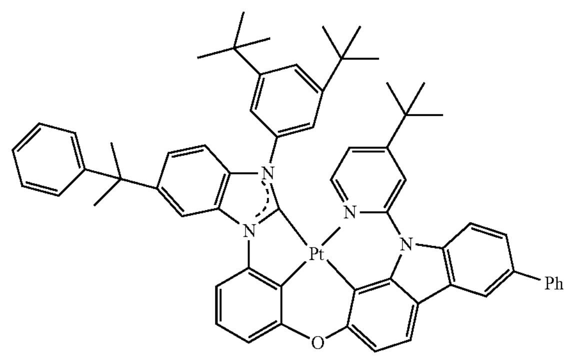
1983
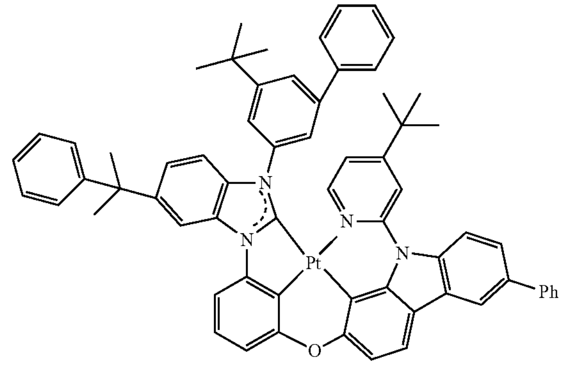

1984
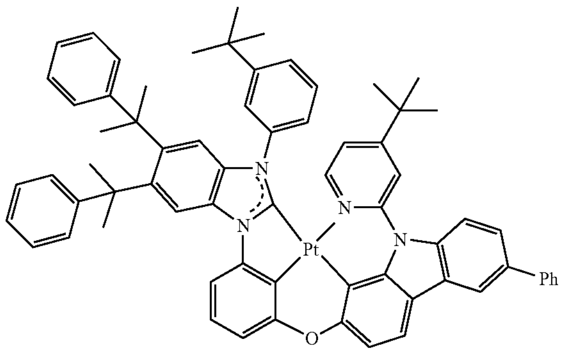
1985
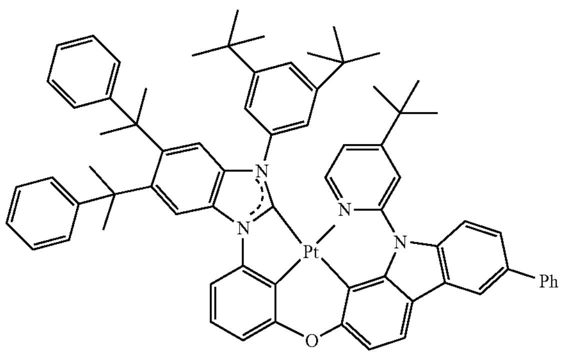
1986
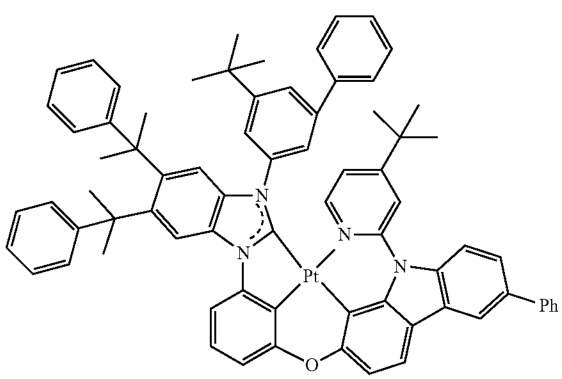
1987
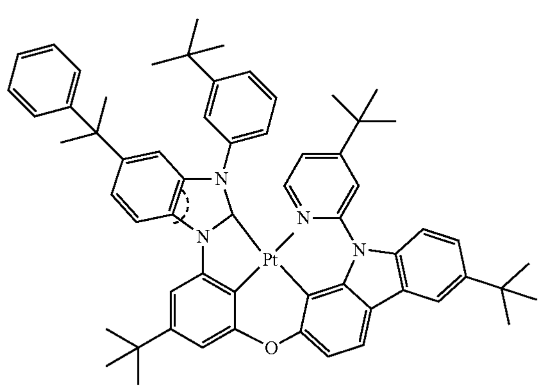
1988
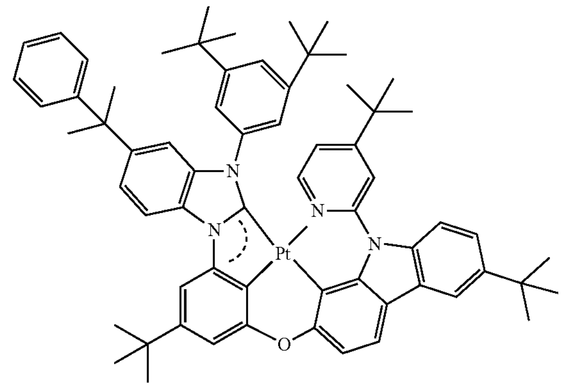
1989
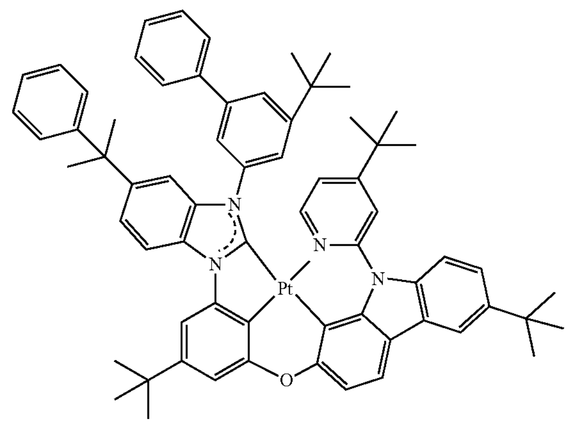
1990
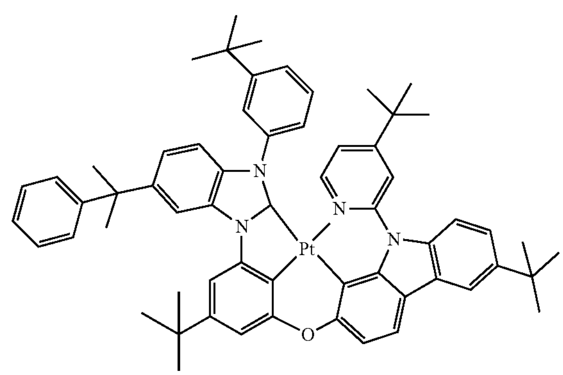

-continued
1991
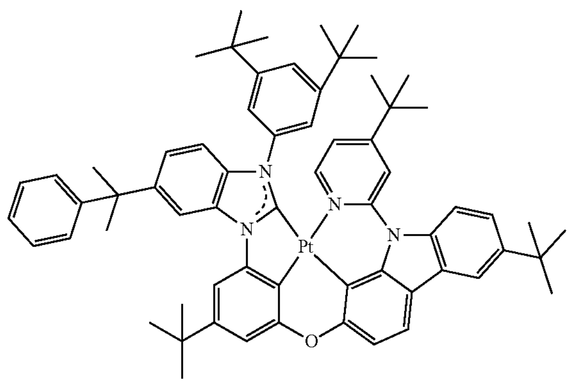
1992
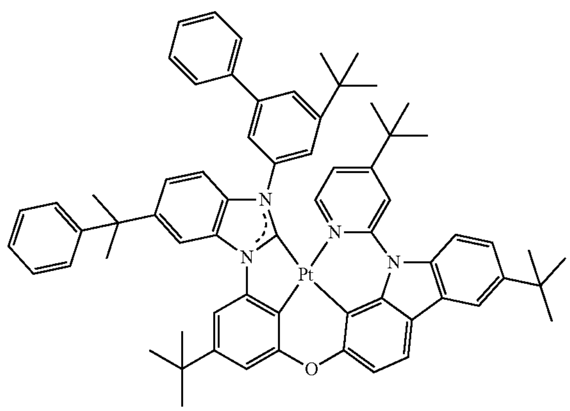
1993
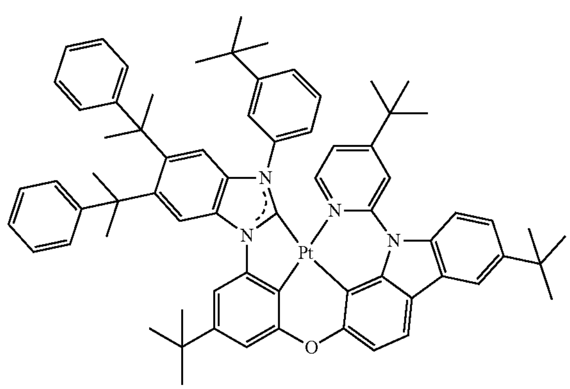
1994
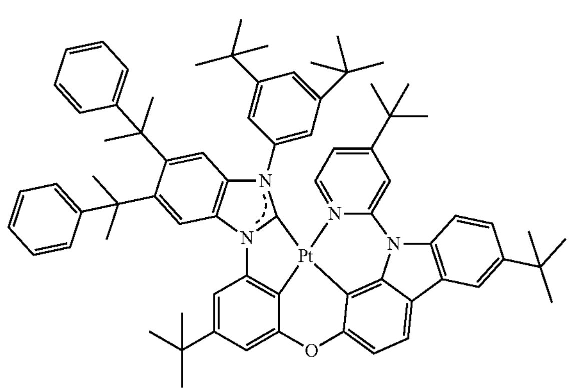
1995
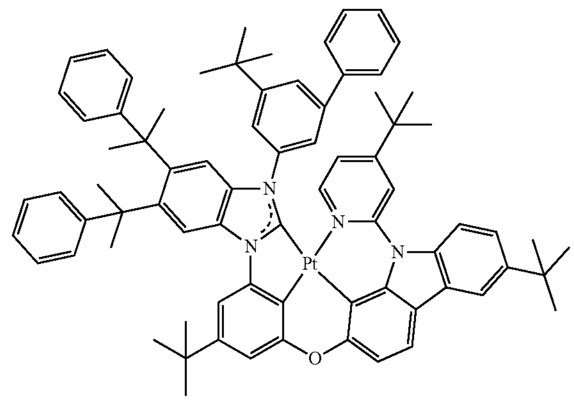
1996
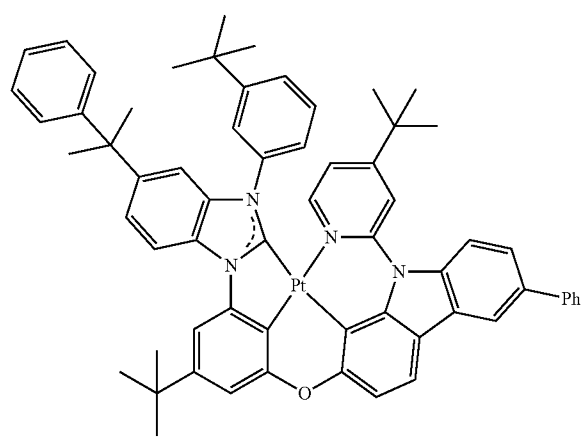
1997
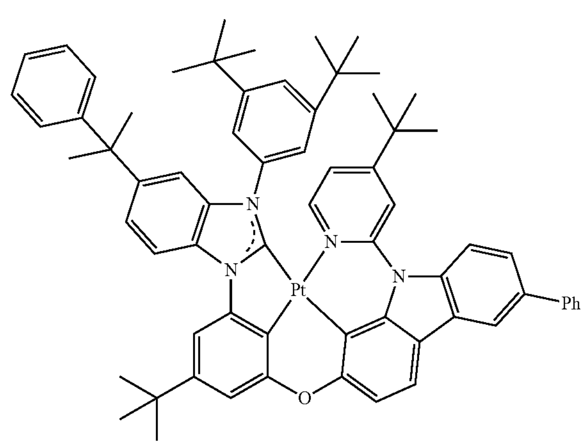

-continued
1998
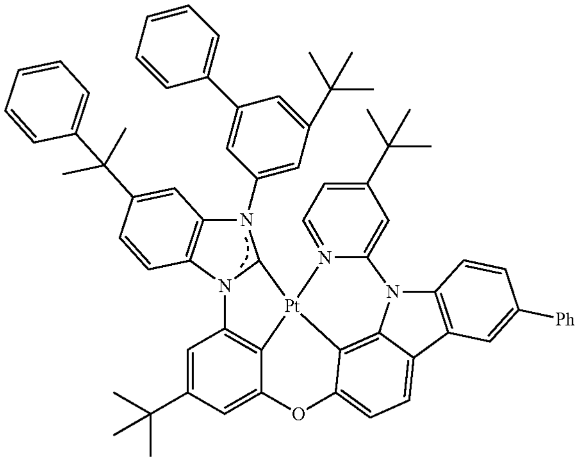
1999
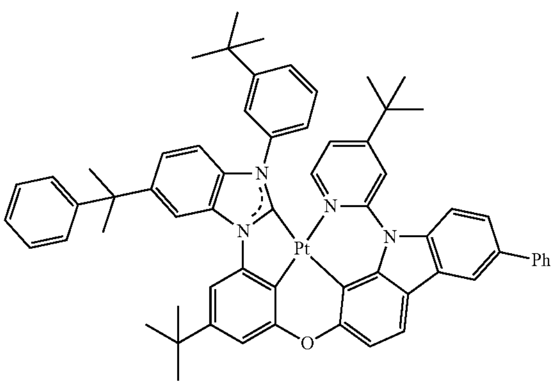
2000
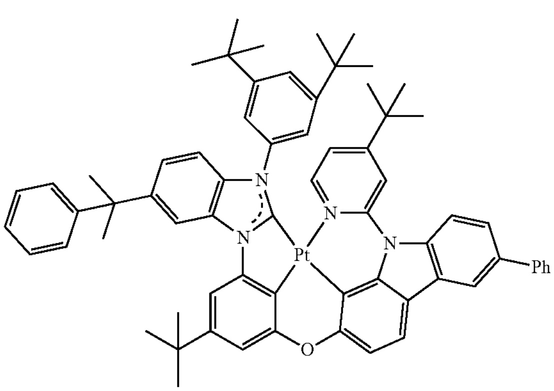
-continued
2001
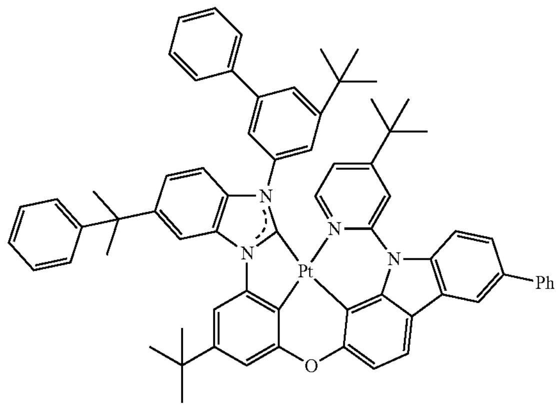
2002
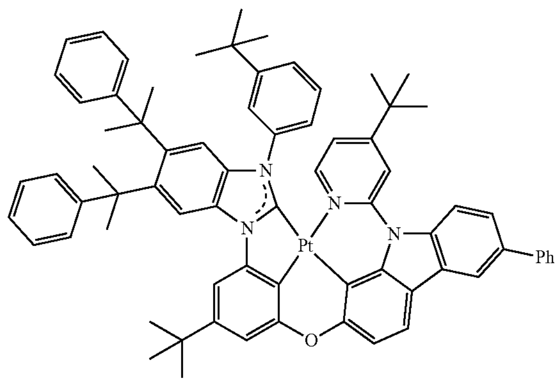
2003
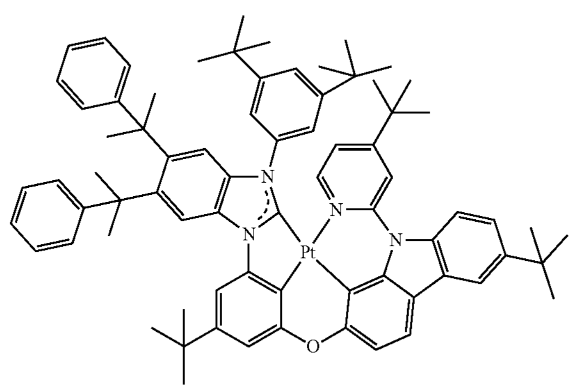
2004
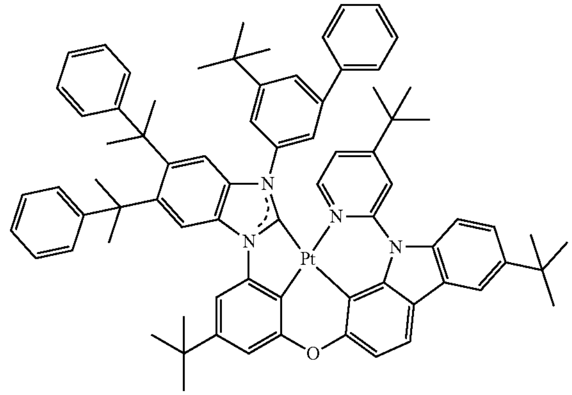

2005
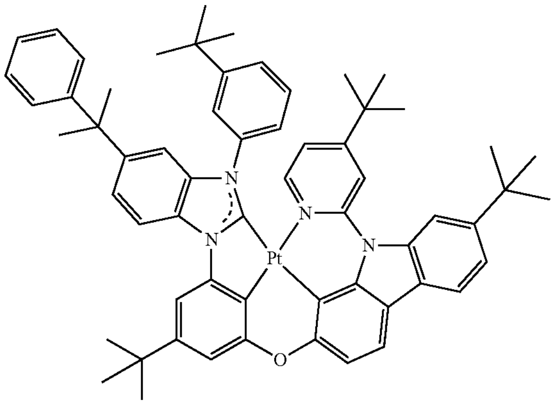
2006
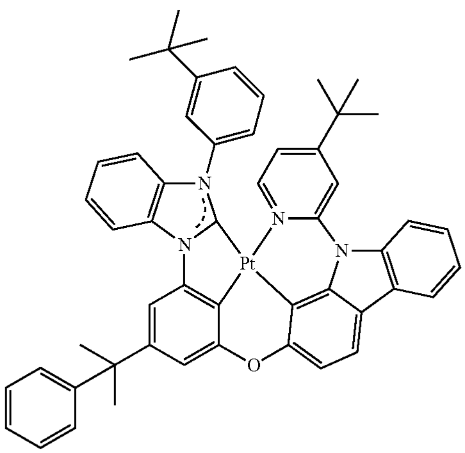
2007
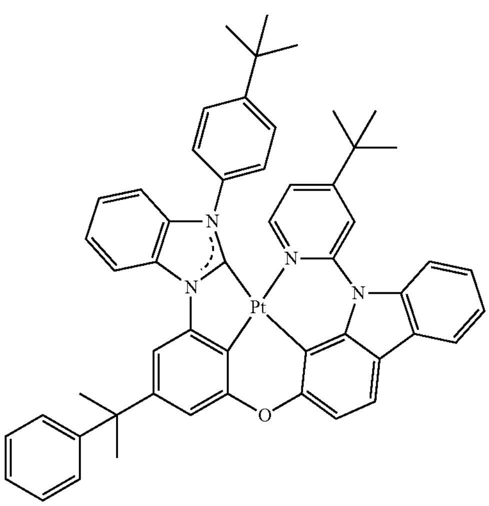
2008
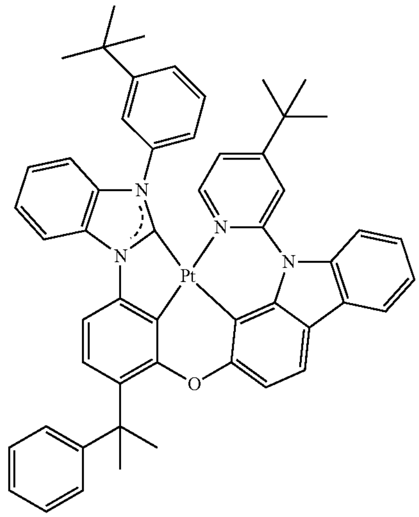
2009
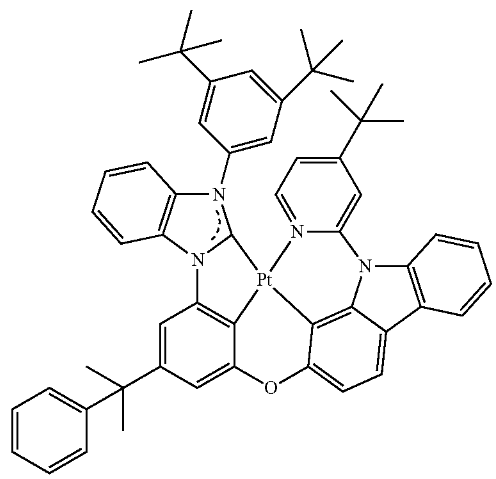
2010
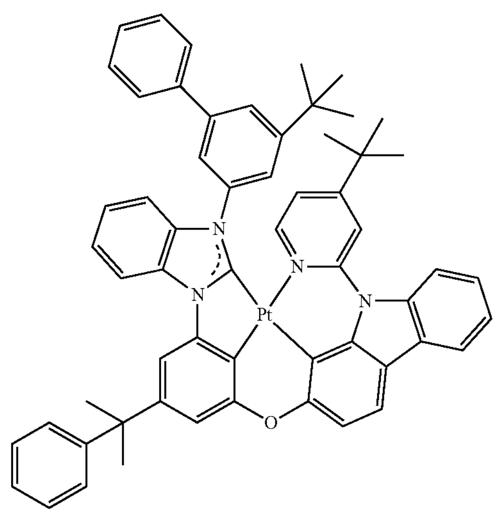

-continued
2011
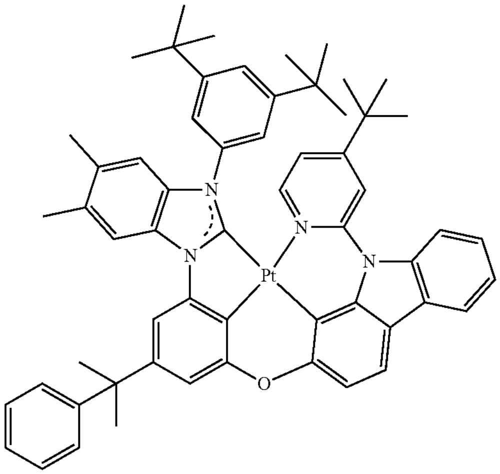
2012
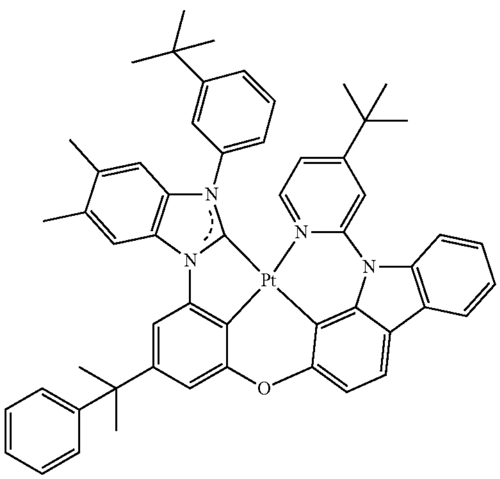
2013
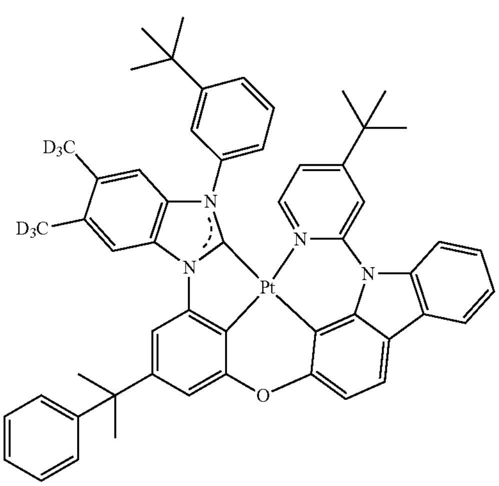
-continued
2014
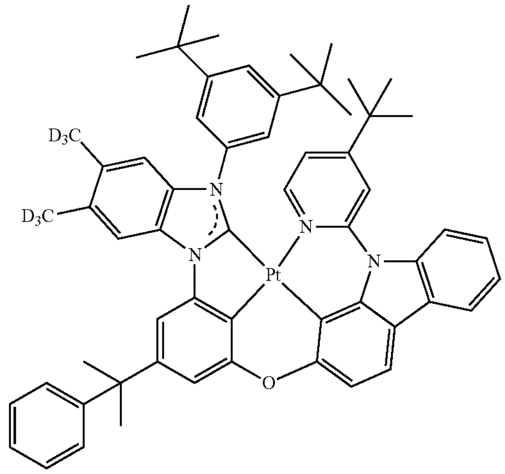
2015
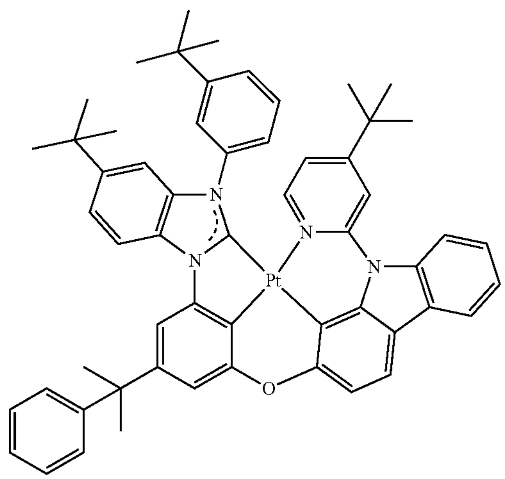
2016
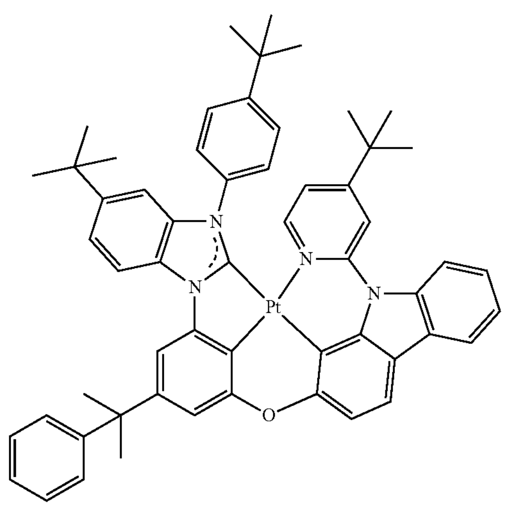

-continued
2017
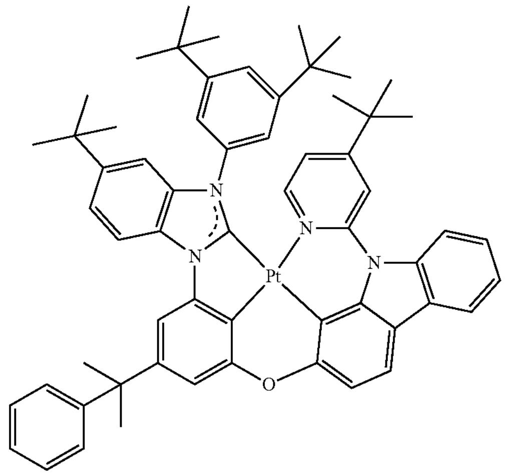
2018
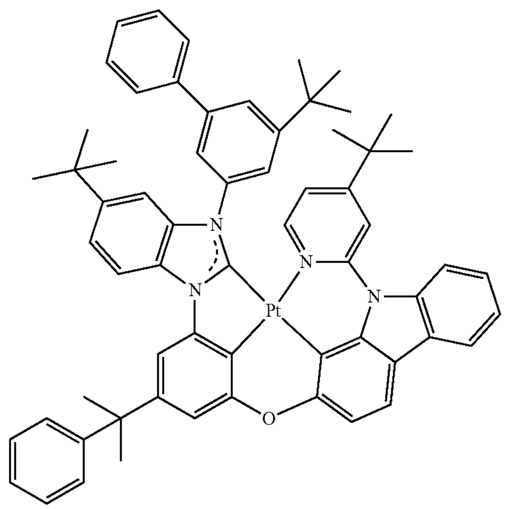
2019
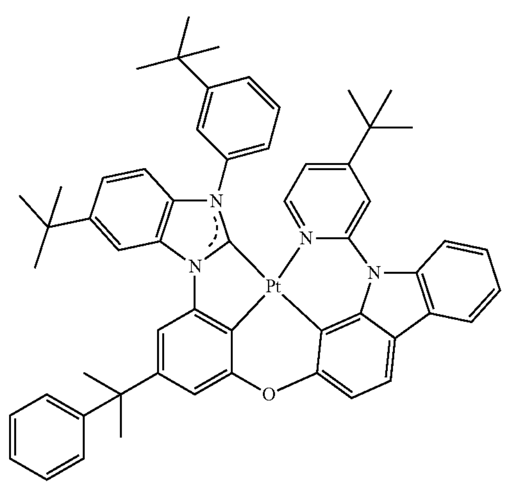
-continued
2020
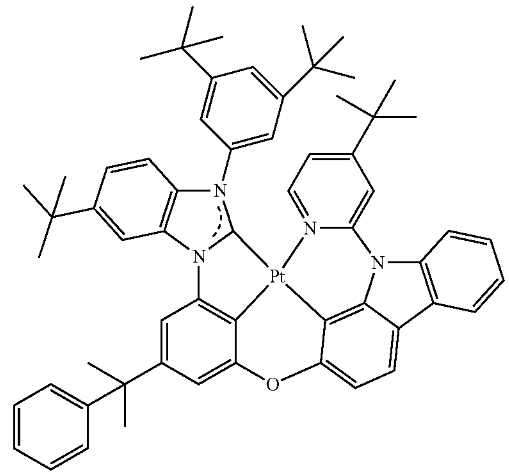
2021
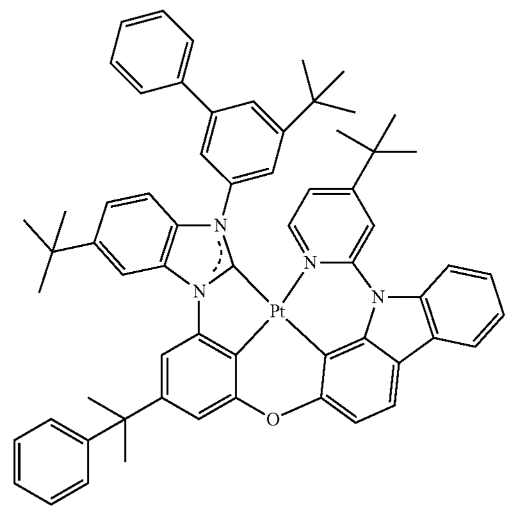
2022
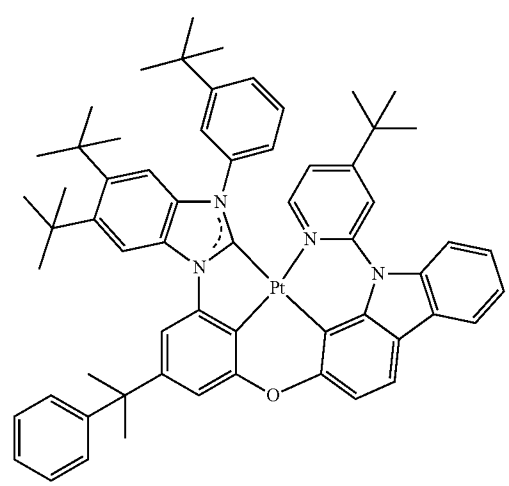

-continued
2023
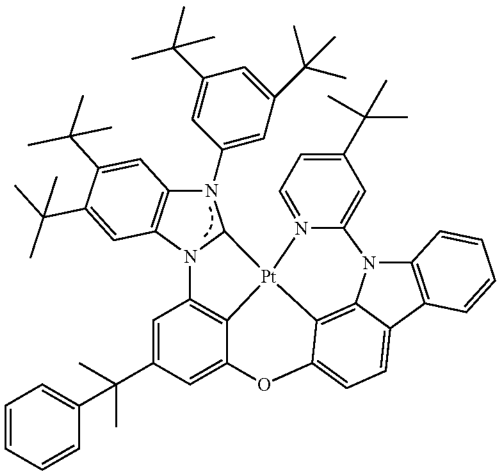
2024
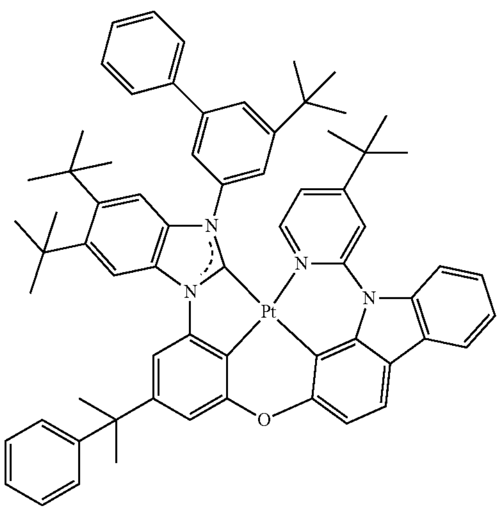
2025
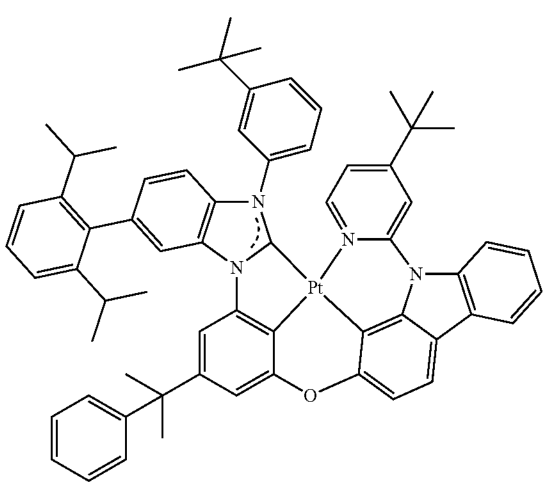
-continued
2026
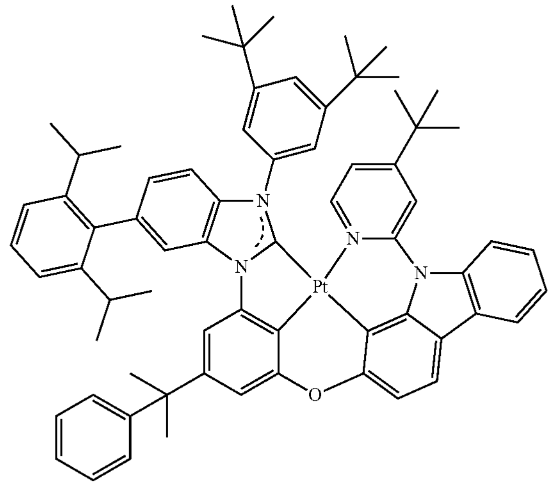
2027
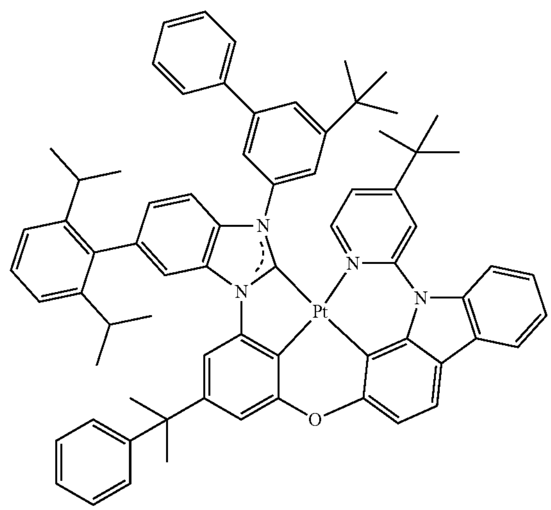
2028
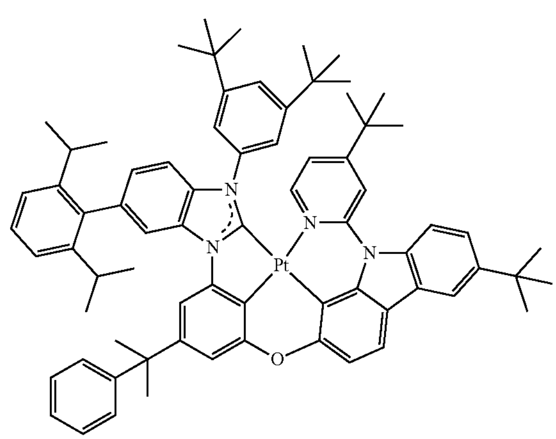

-continued
2029
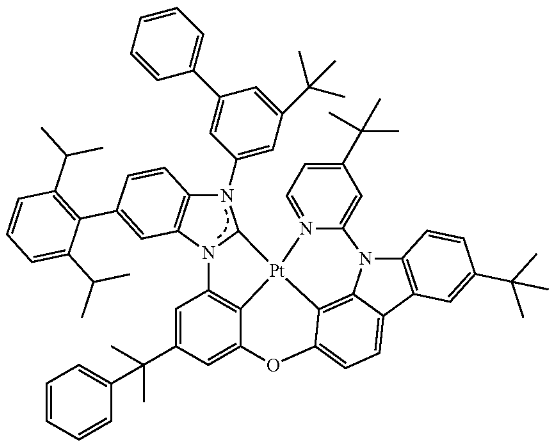
2030
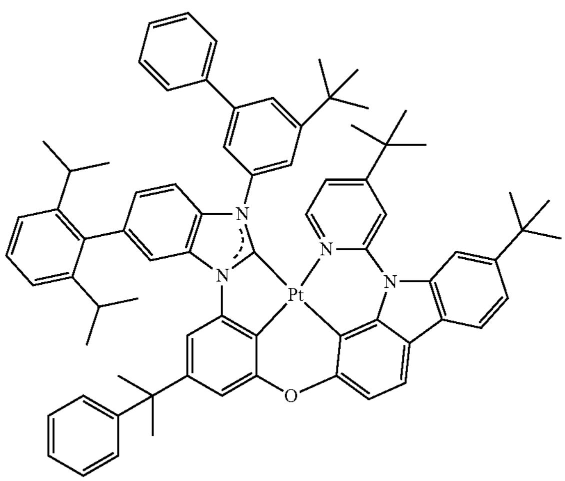
2031
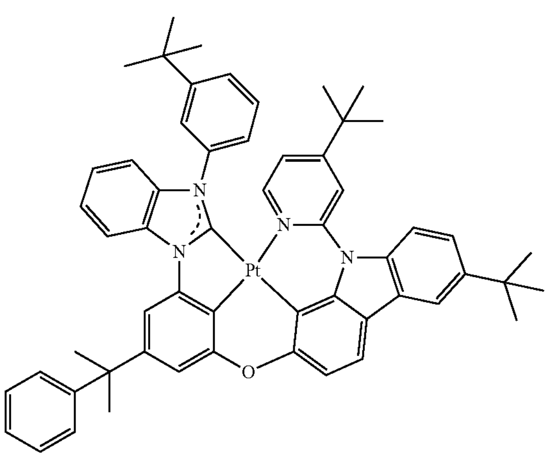
-continued
2032
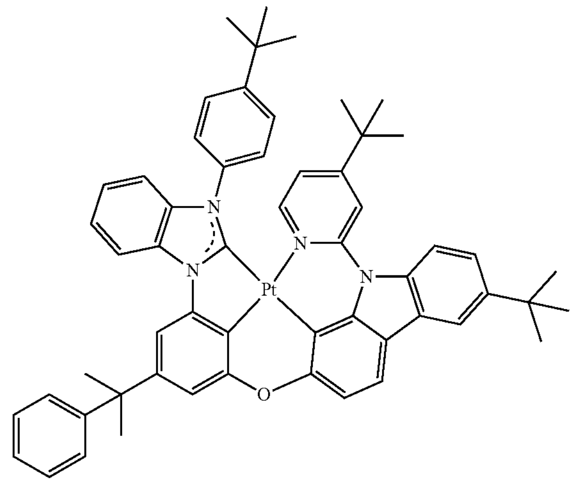
2033
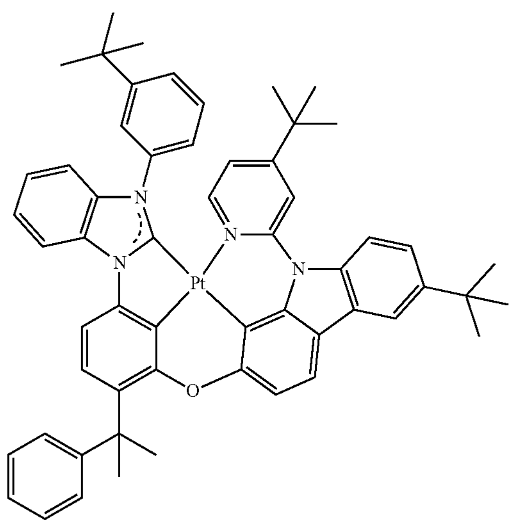
2034
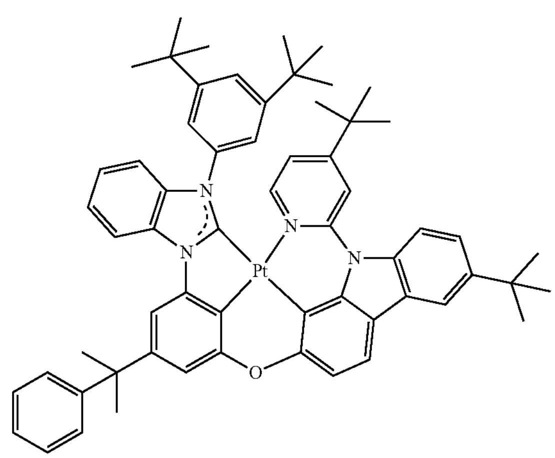

-continued
2035
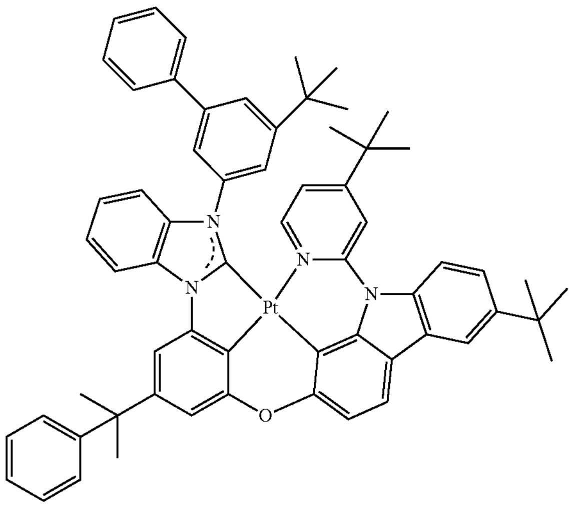
2036
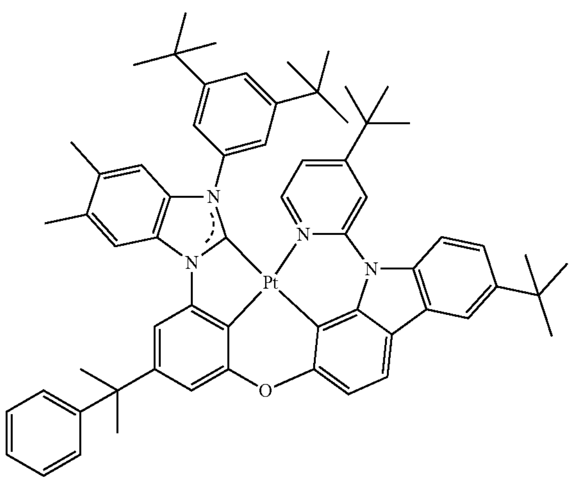
2037
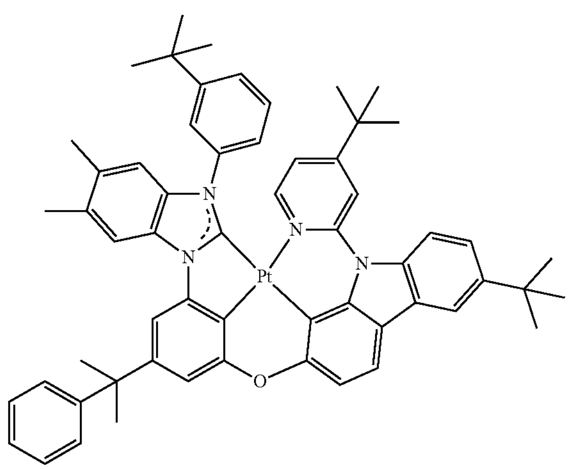
-continued
2038
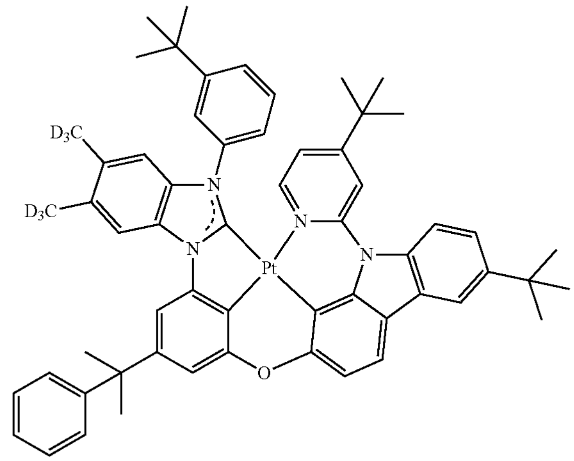
2039
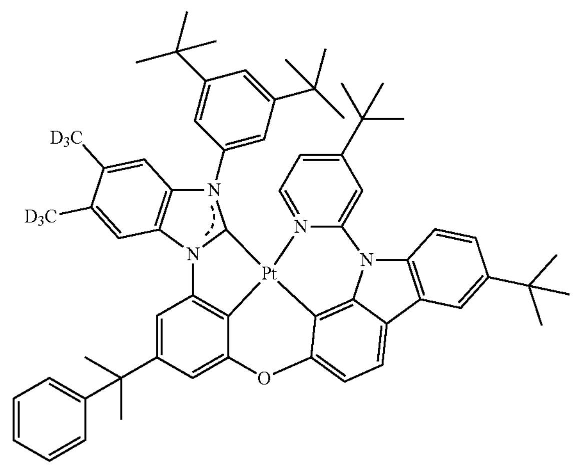
2040
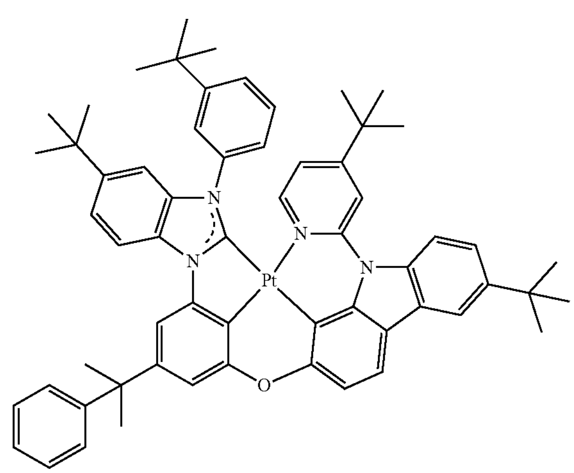

-continued
2041
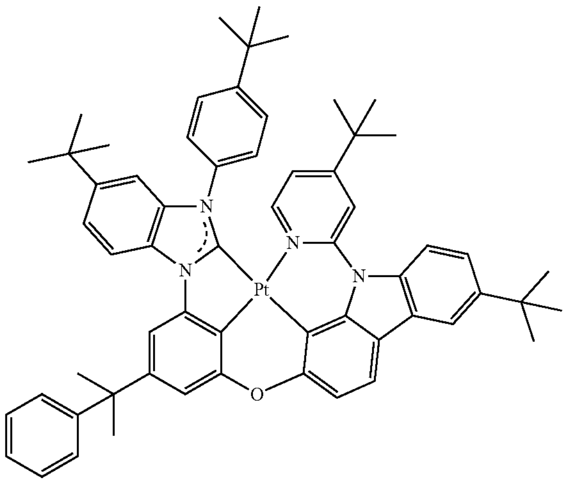
2042
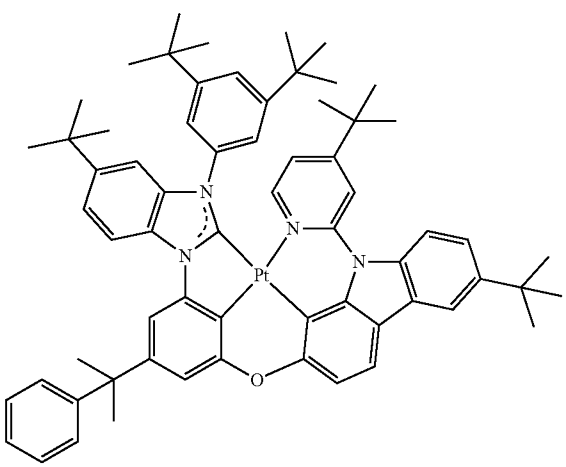
2043
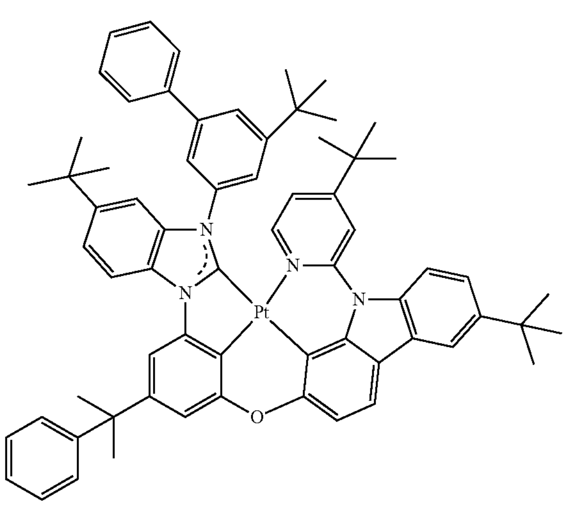
-continued
2044
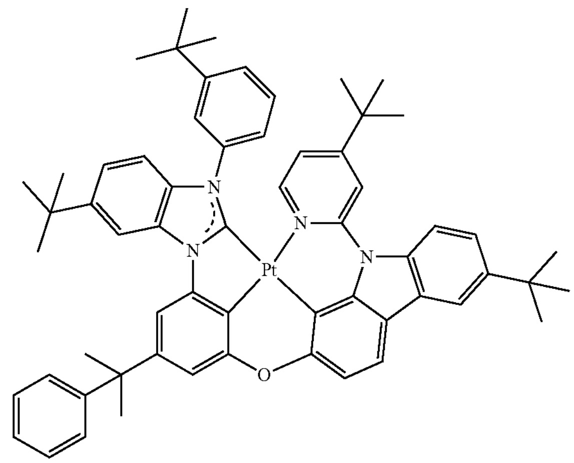
2045
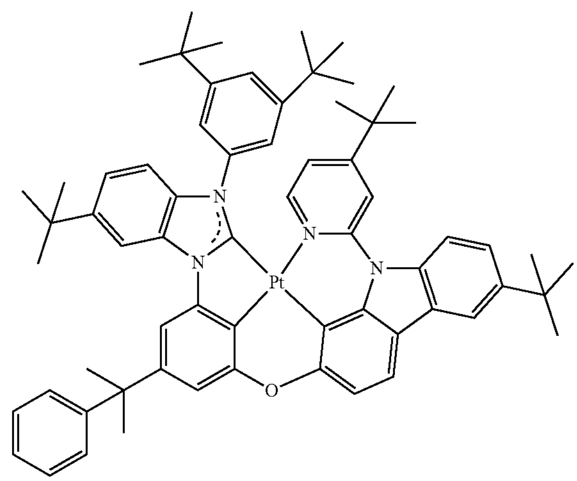
2046
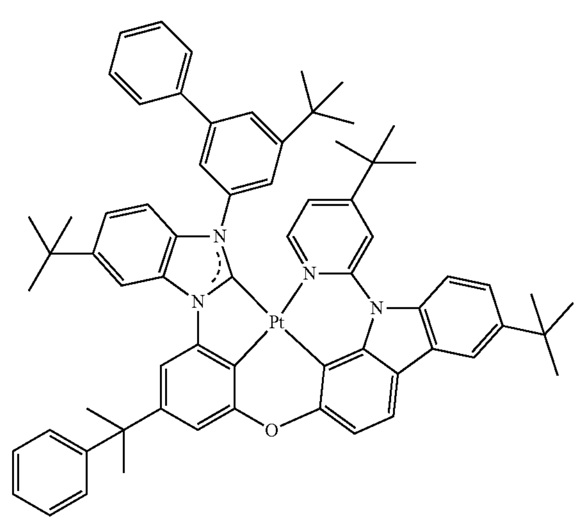

-continued
2047
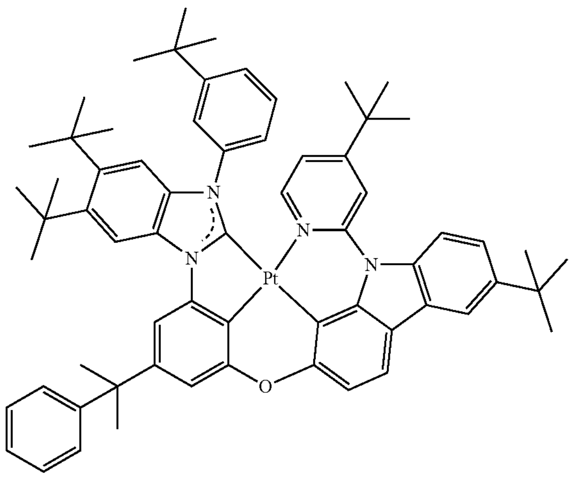
2048
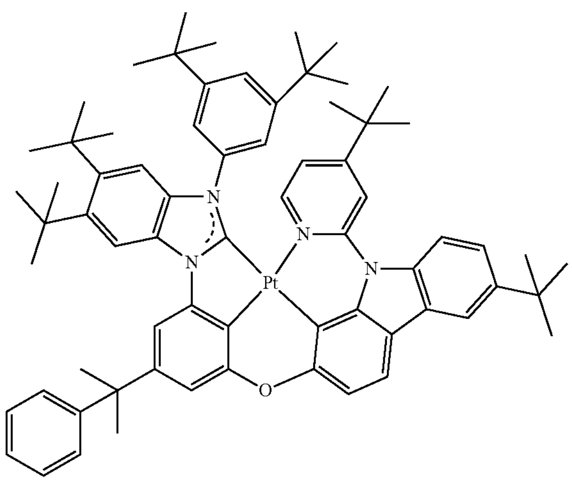
2049
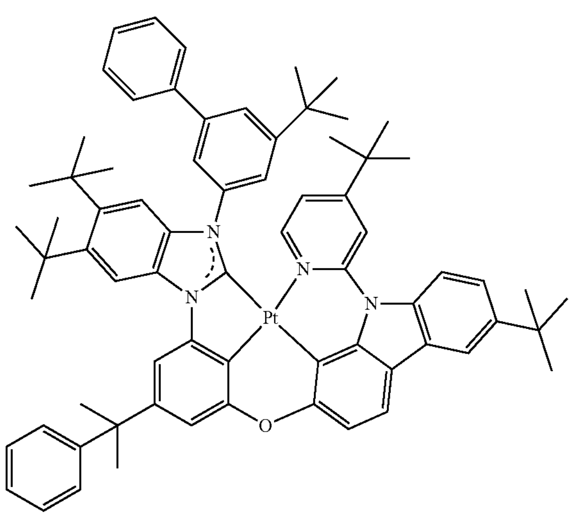
-continued
2050
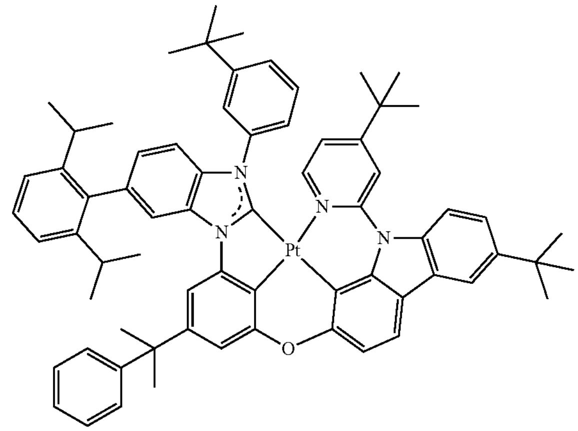
2051
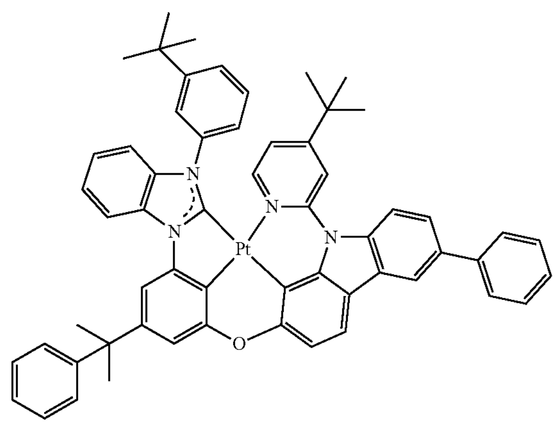
2052
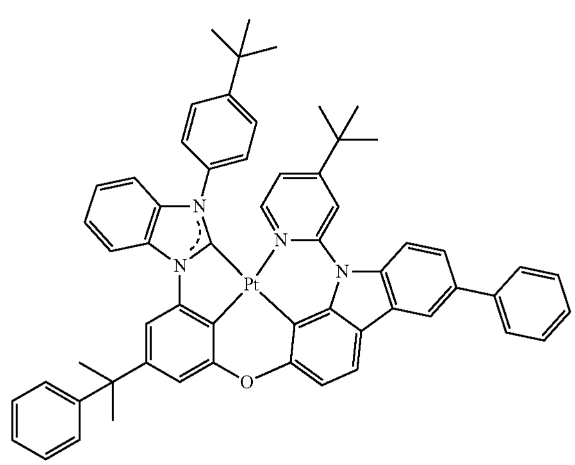

-continued
2053
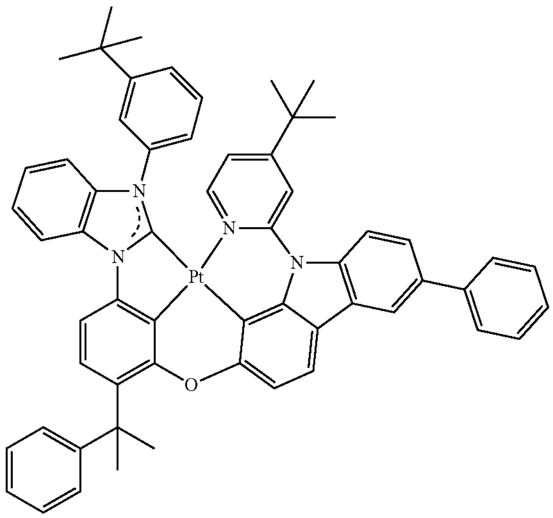
2054
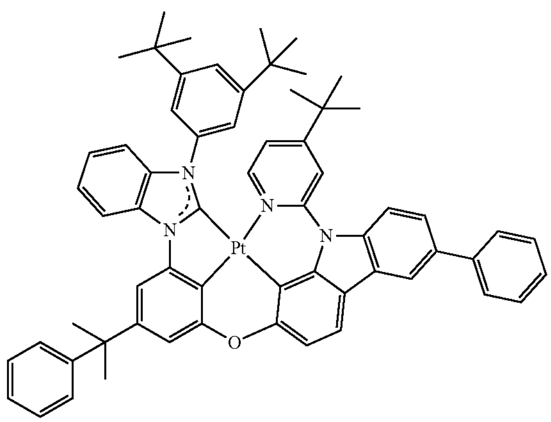
2055
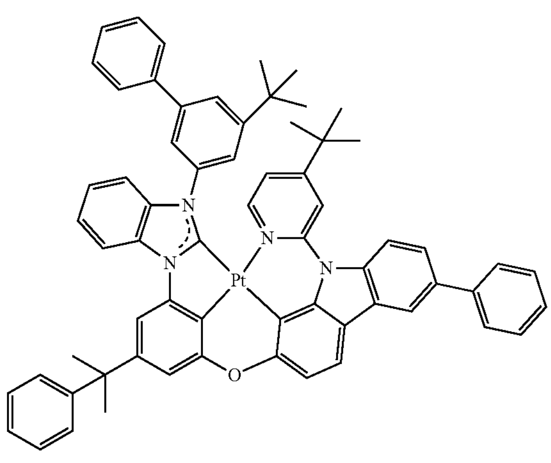
-continued
2056
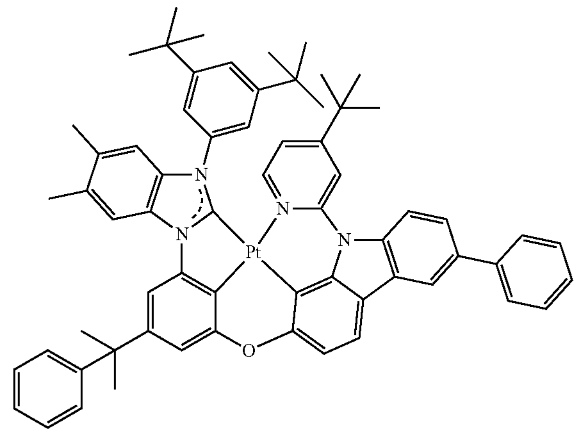
2057
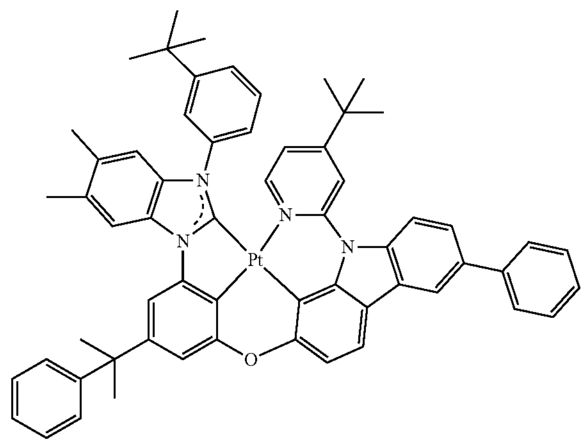
2058
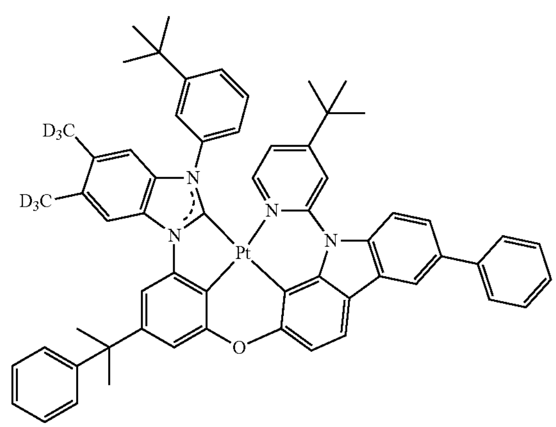

-continued
2059
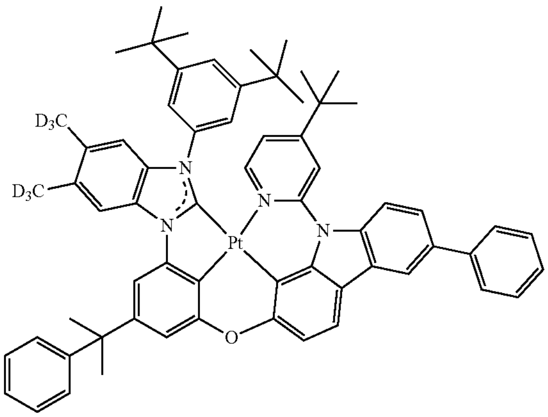
2060
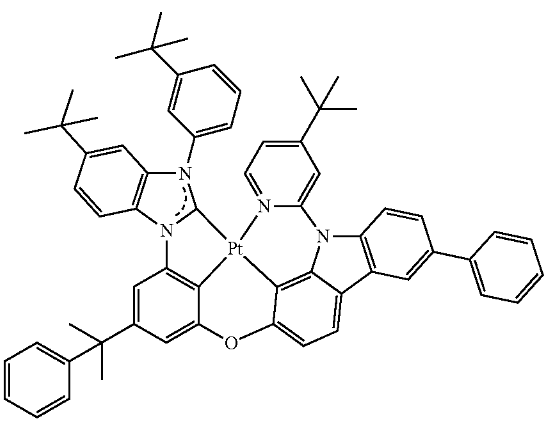
2061
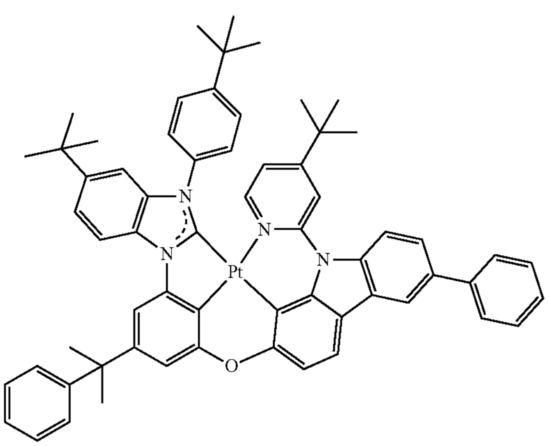
-continued
2062
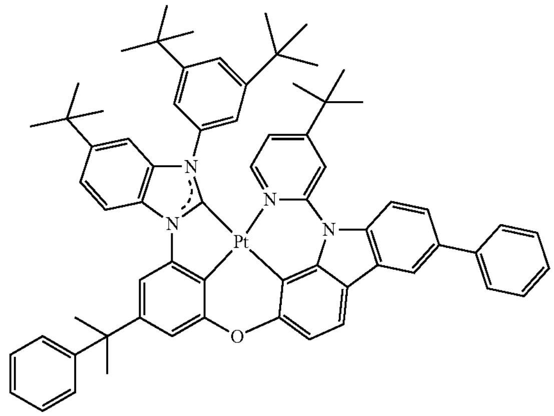
2063
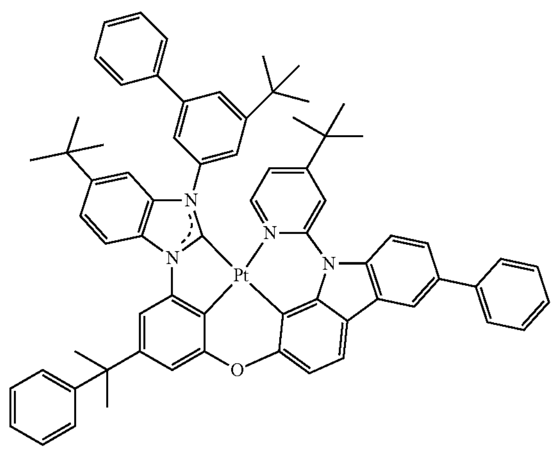
2064
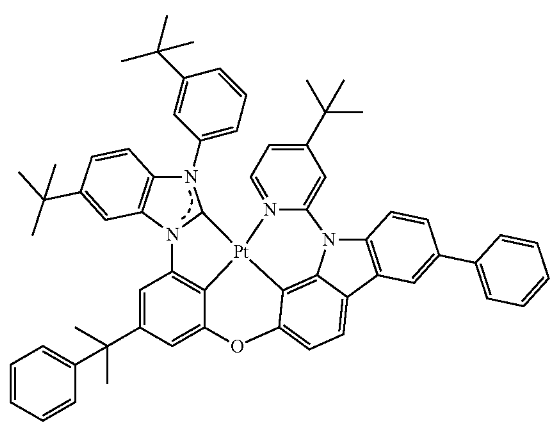

-continued
2065
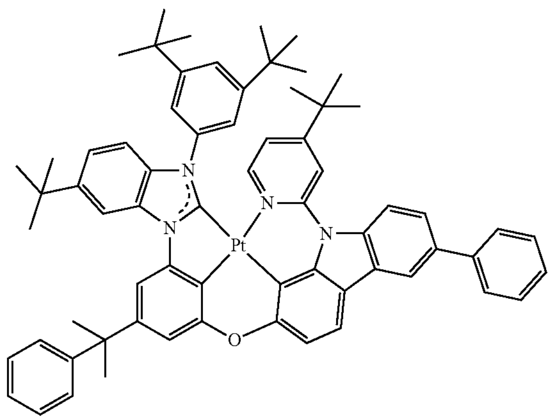
2066
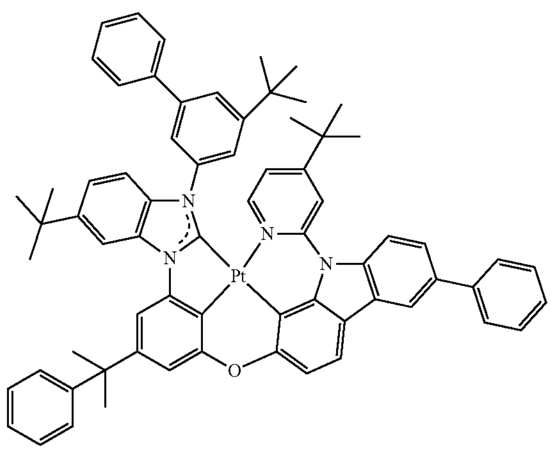
2067
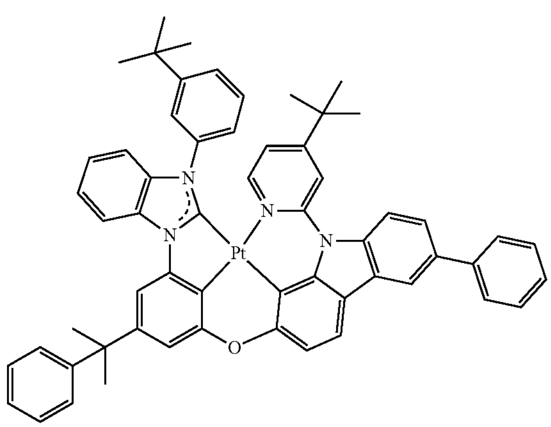
-continued
2068
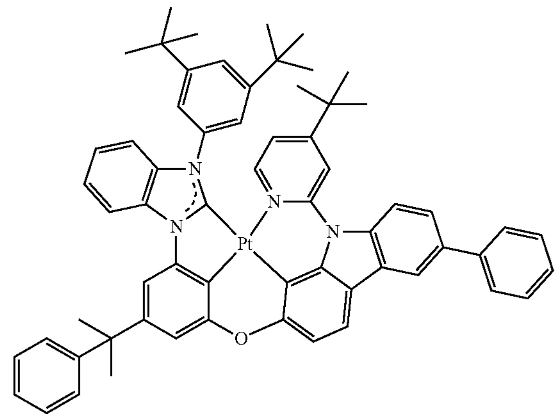
2069
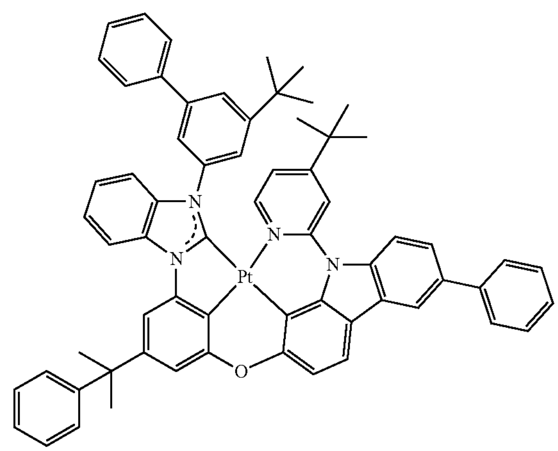
2070
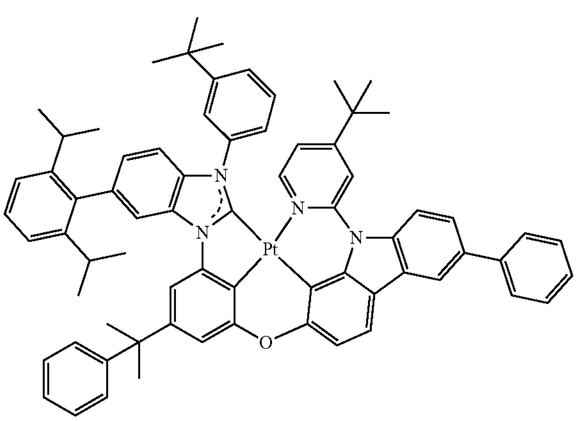

-continued
2071
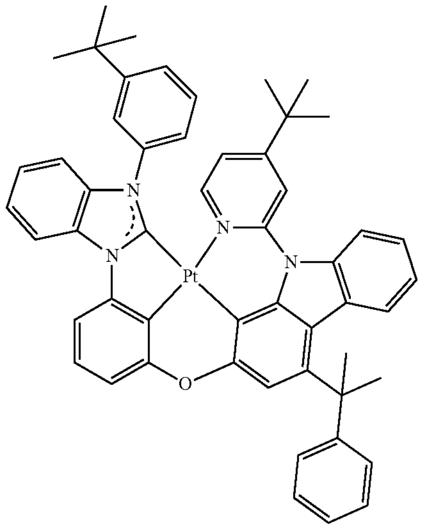
2072
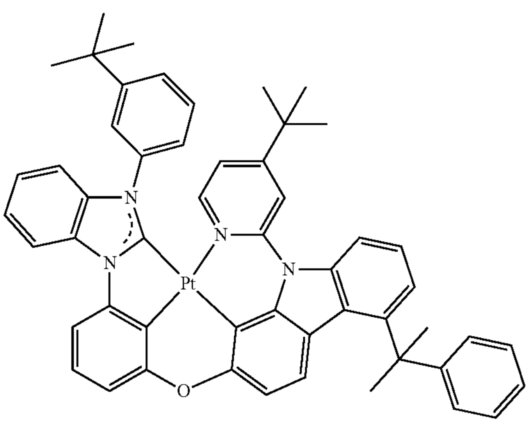
2073
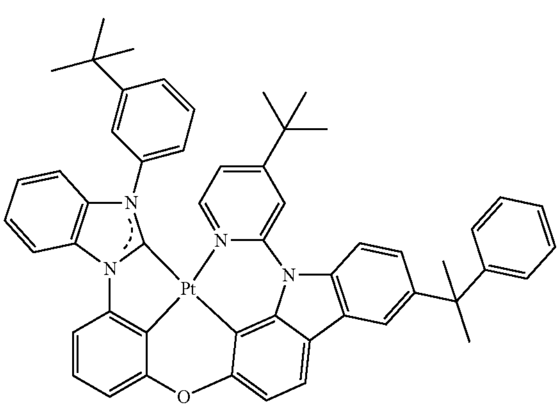
-continued
2074
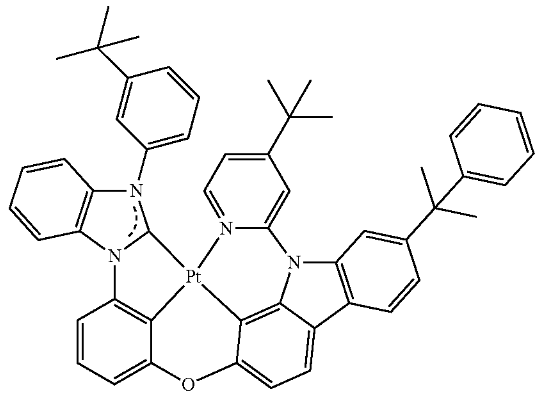
2075
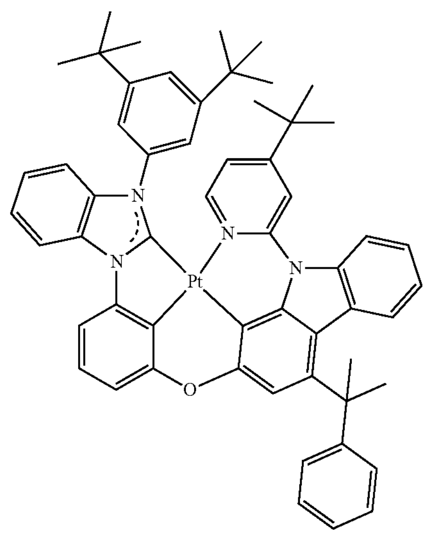
2076
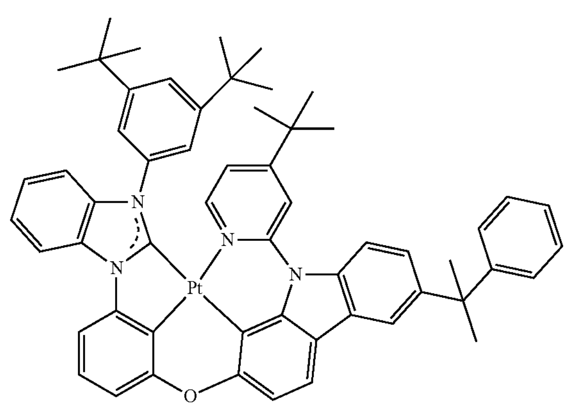

-continued
2077
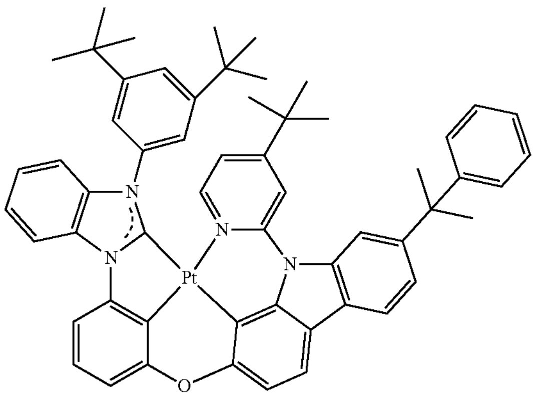
2078
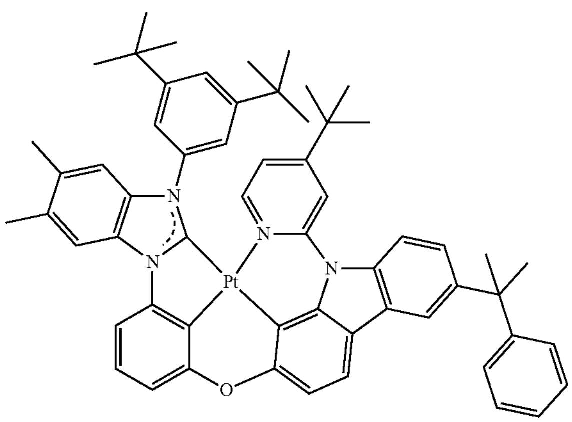
2079
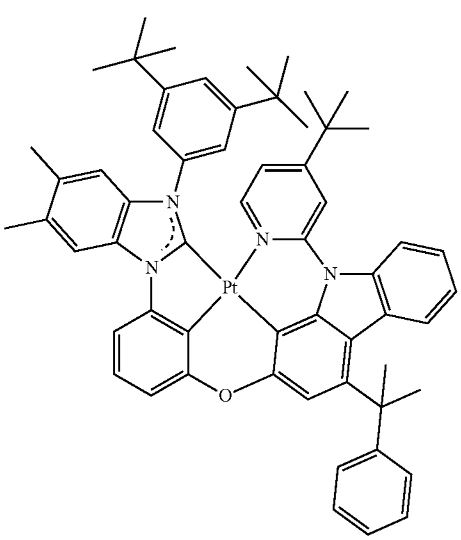
-continued
2080
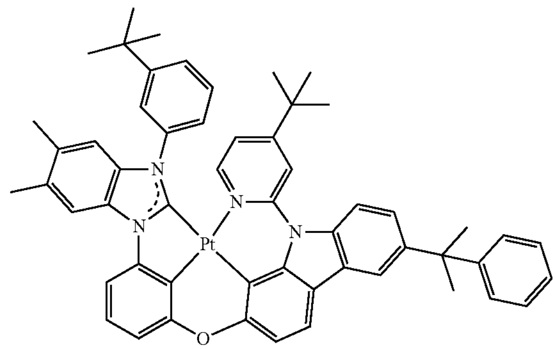
2081
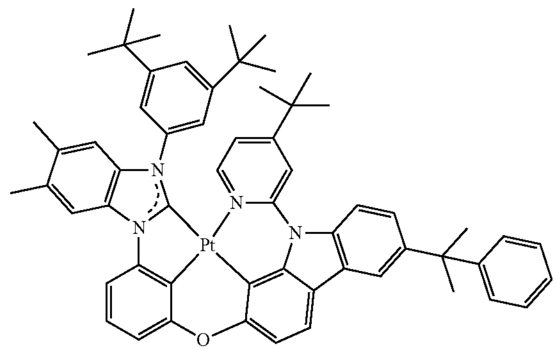
2082
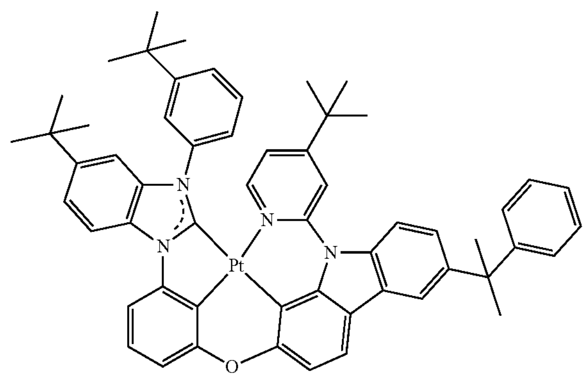
2083
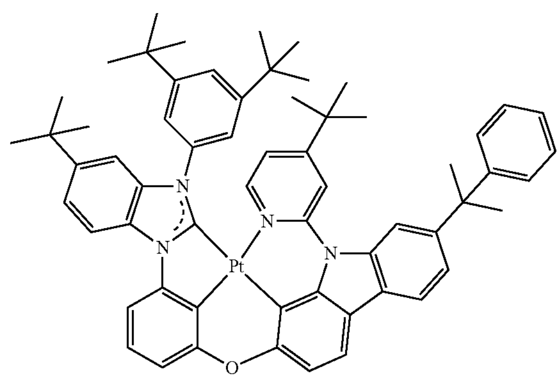

2084
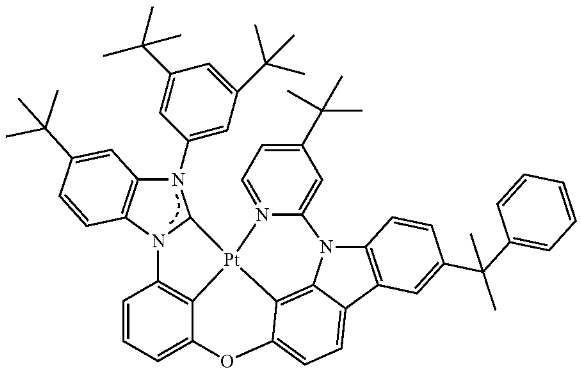
2085
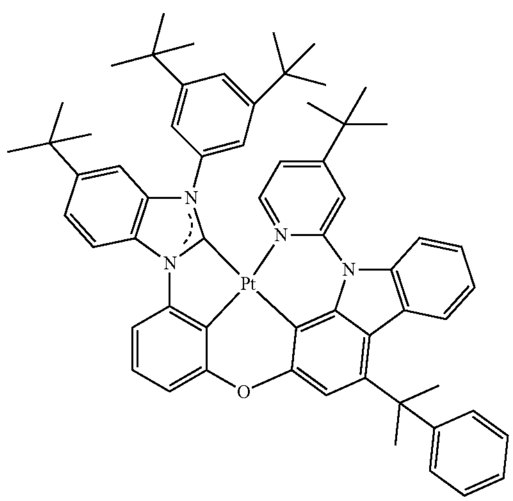
2086
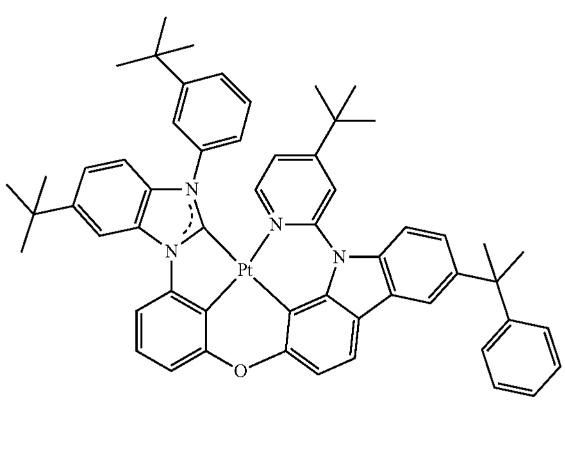
2087
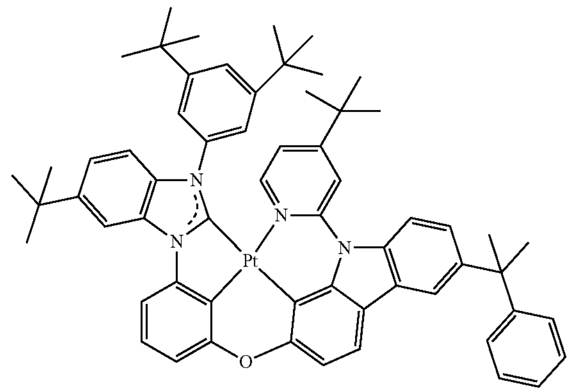
2088
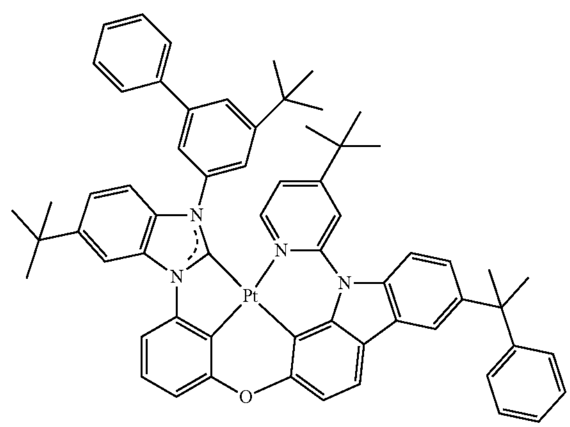
2089
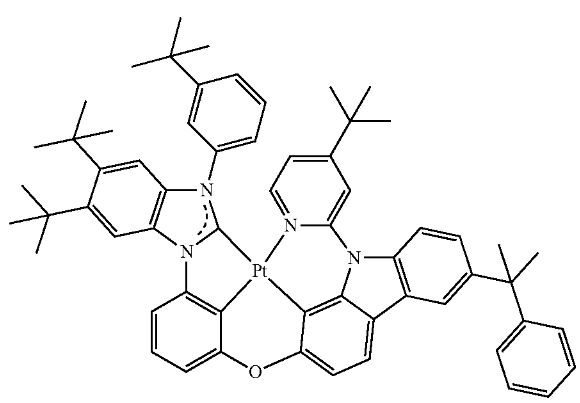

-continued
2090
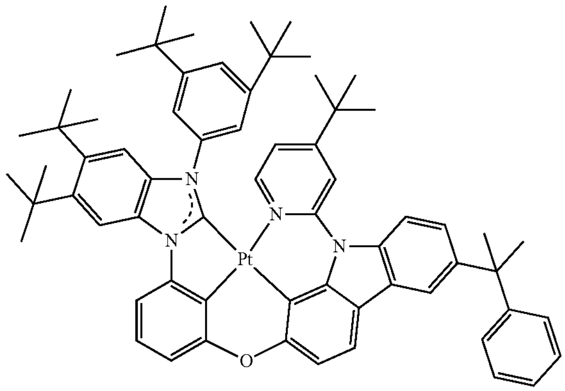
2091
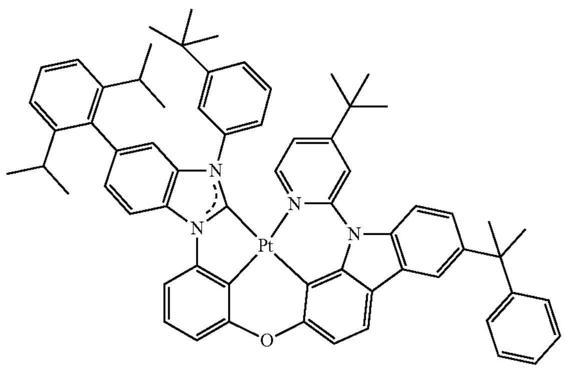
2092
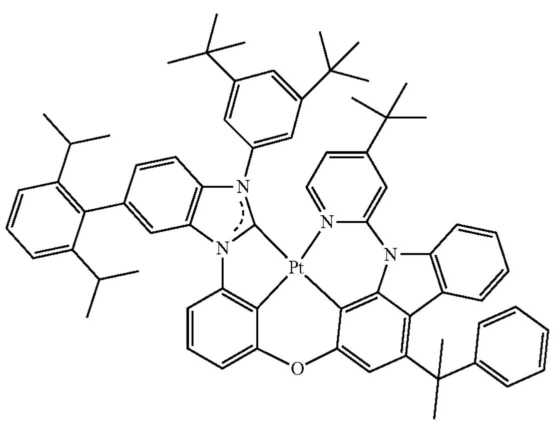
2093
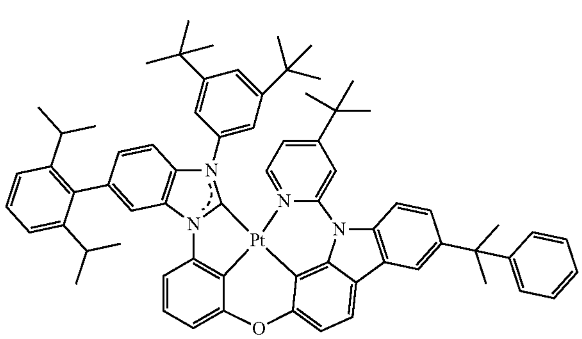
-continued
2094
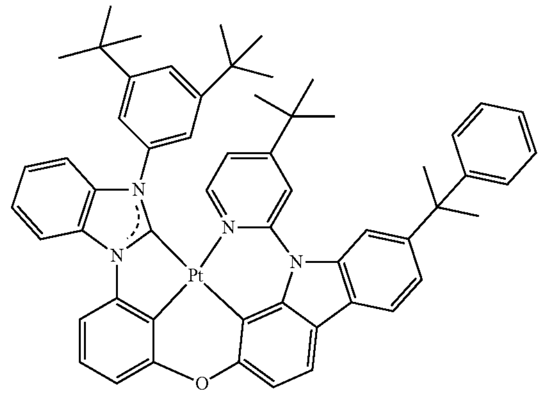
2095
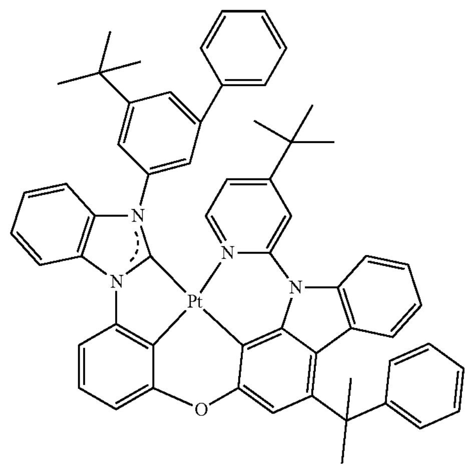
2096
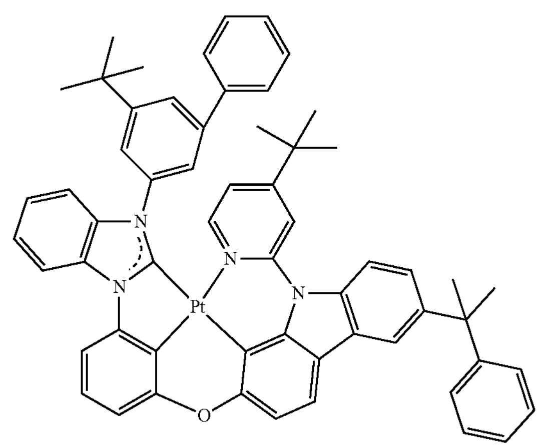

2097
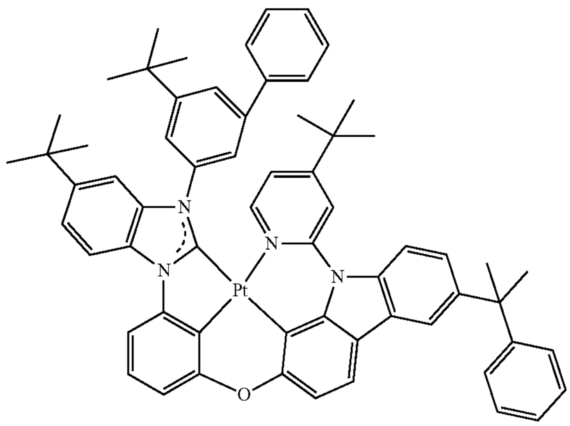
2098
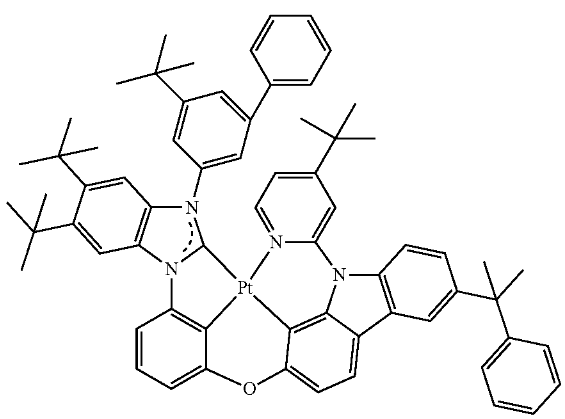
2099
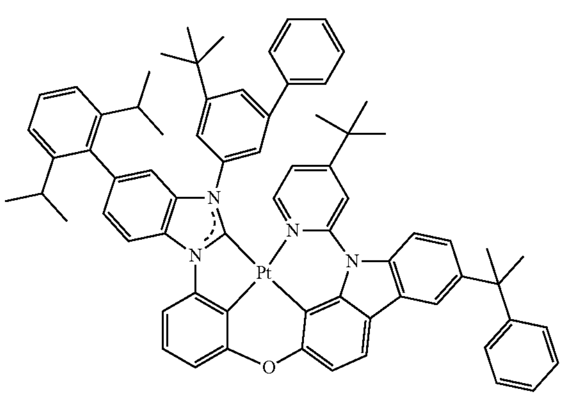
2100
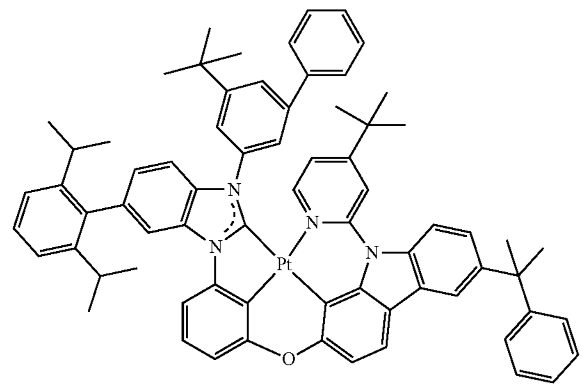
2101
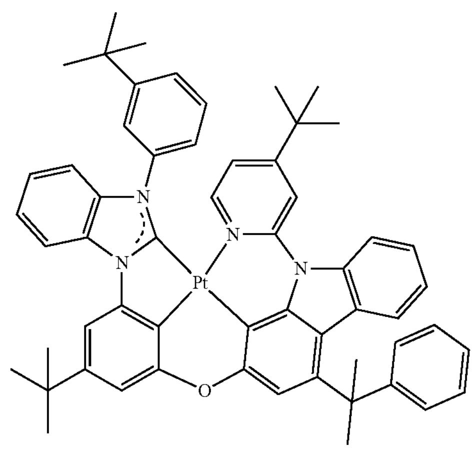
2102
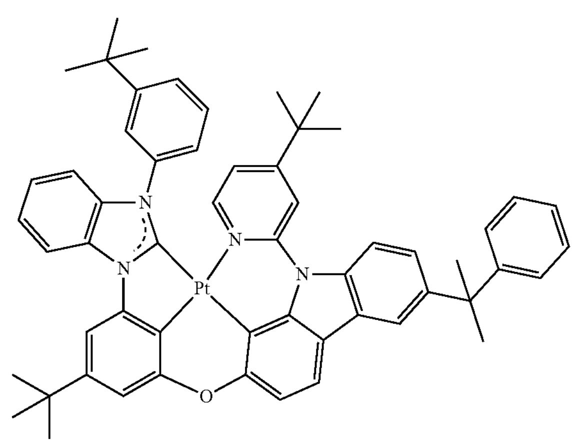

2103
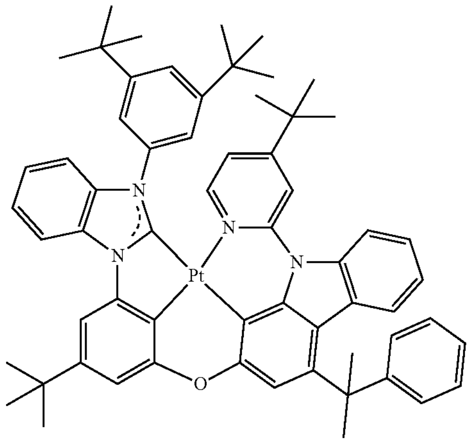
2104
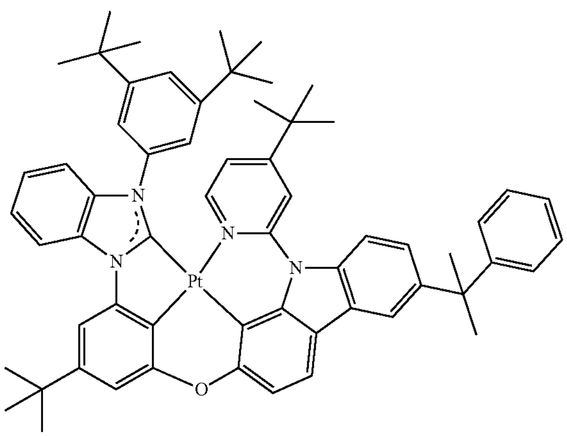
2105
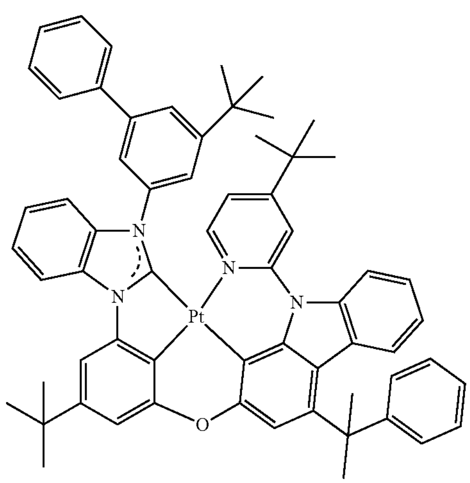
2106
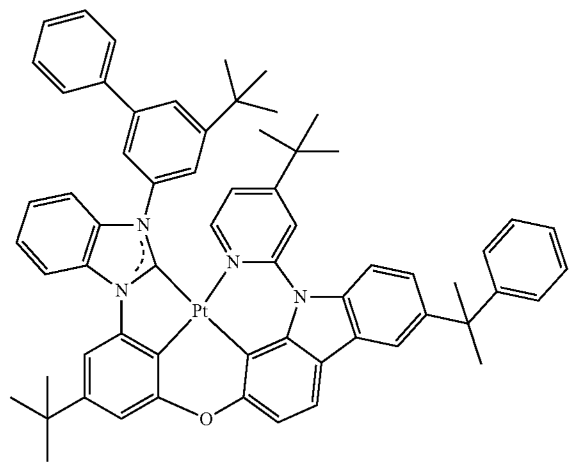
2107
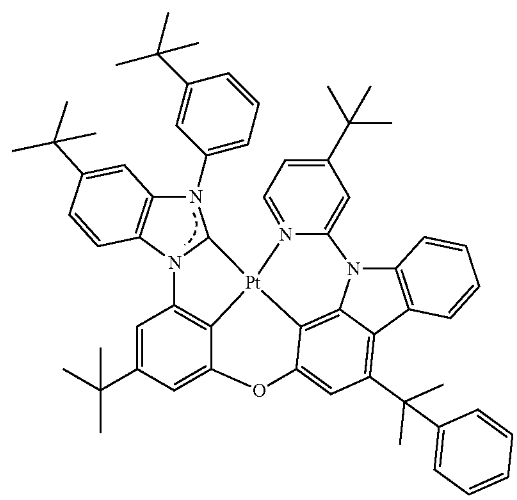
2108
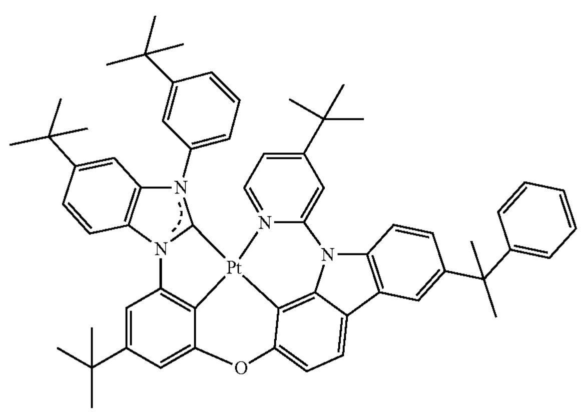

2109
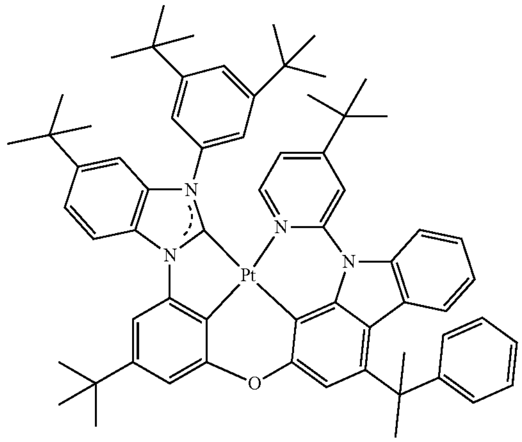
2110
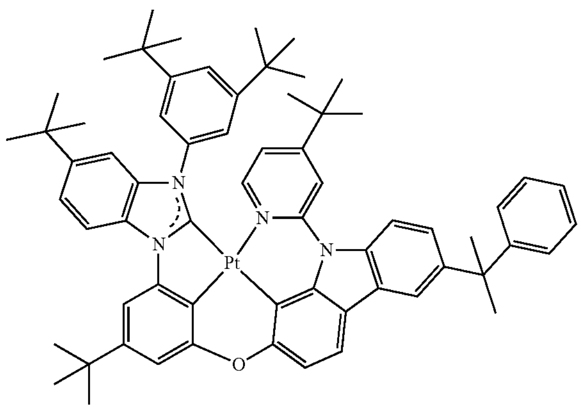
2111
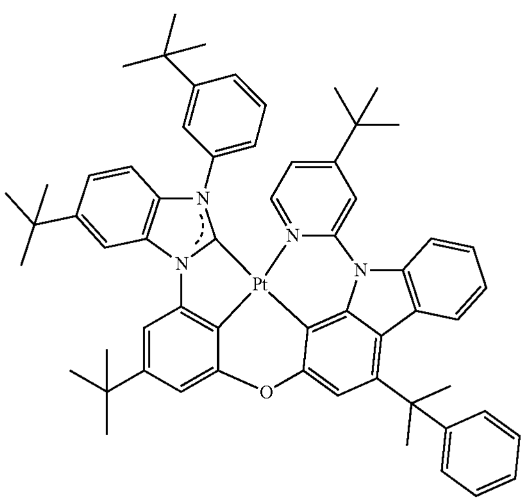
2112
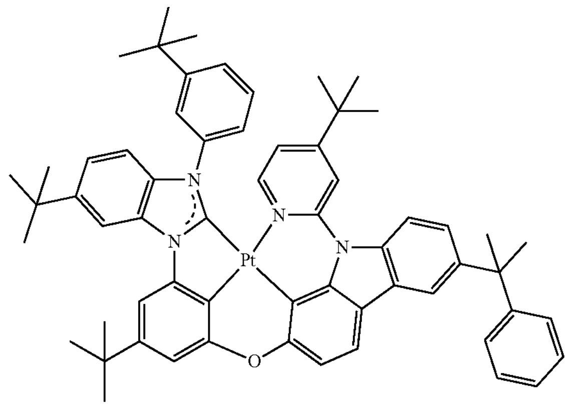
2113
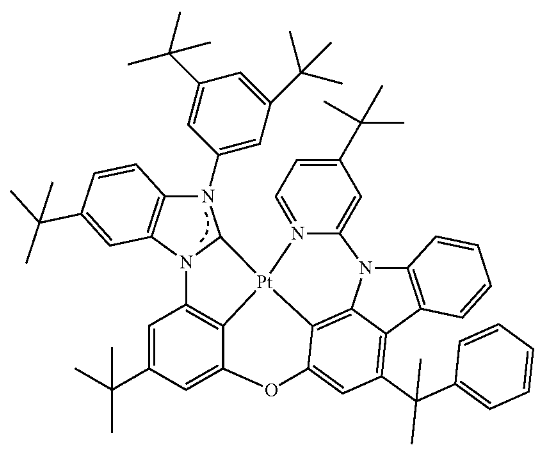
2114
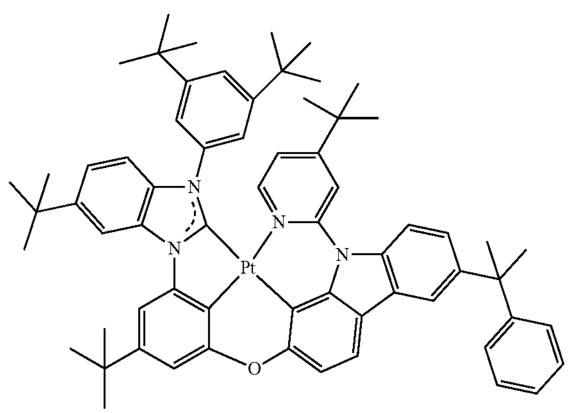

-continued
2115
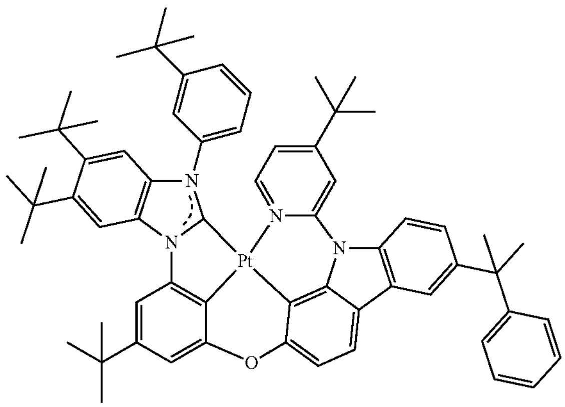
2116
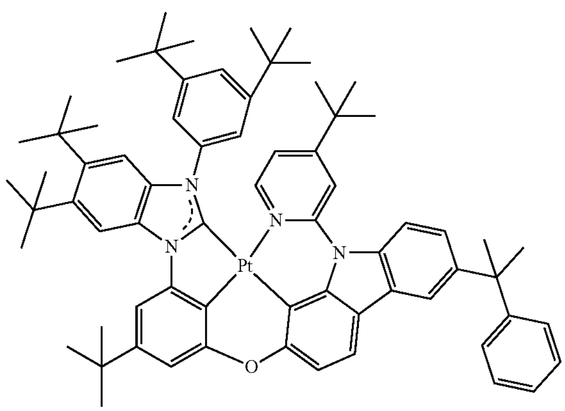
2117
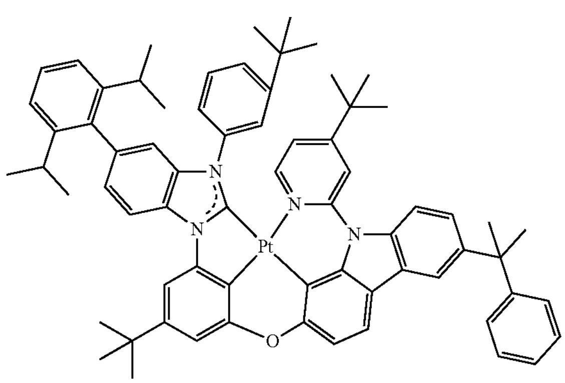
2118
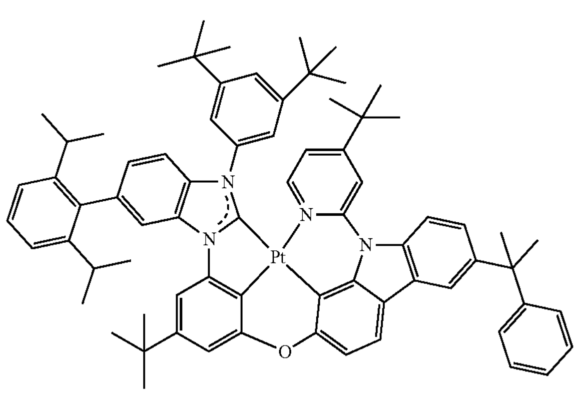
-continued
2119
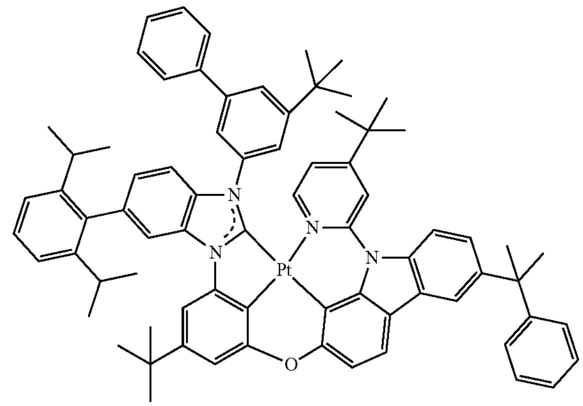
2120
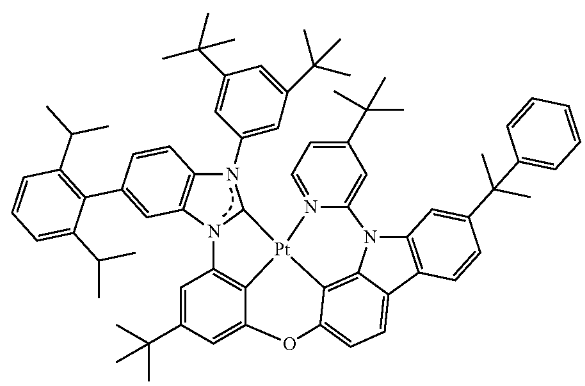
2121
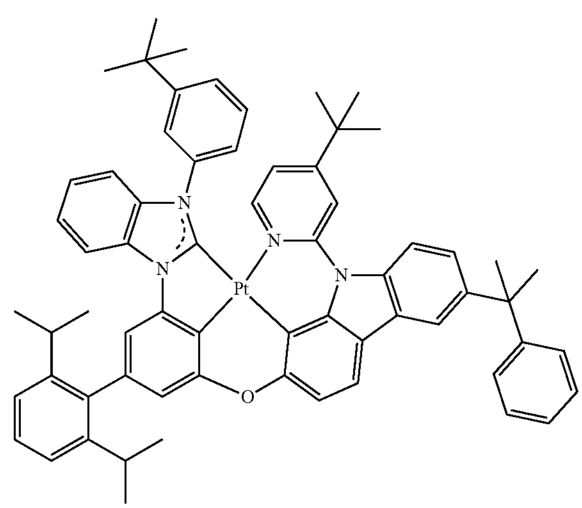

2122
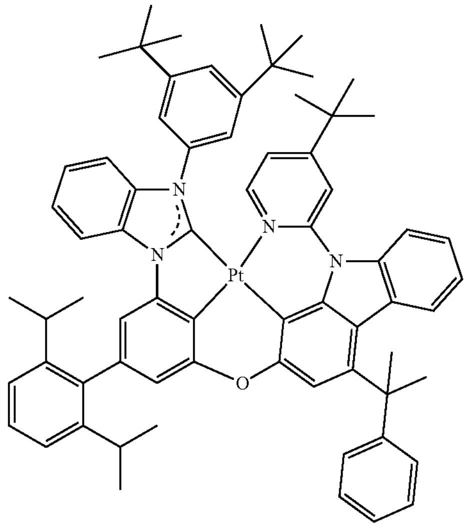
2123
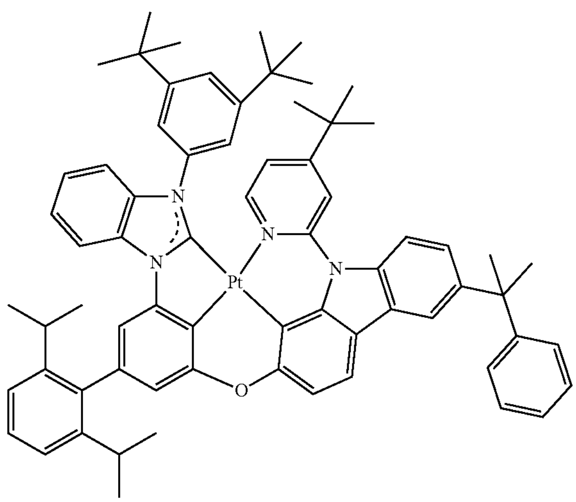
2124
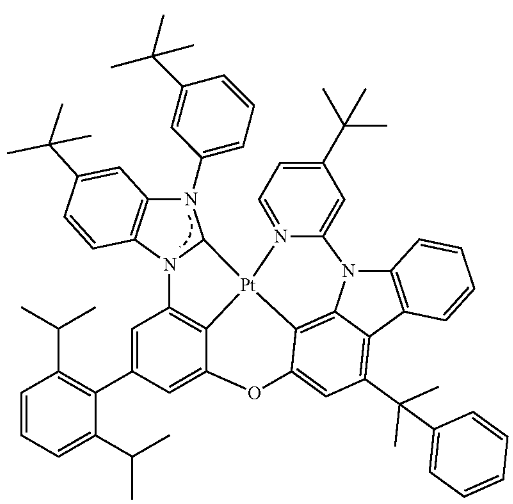
2125
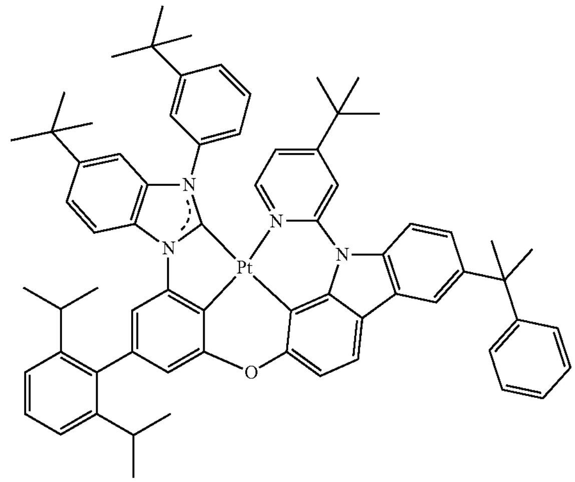
2126
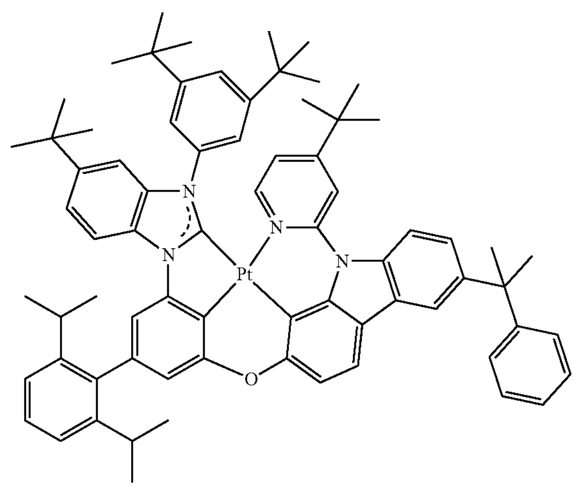
2127
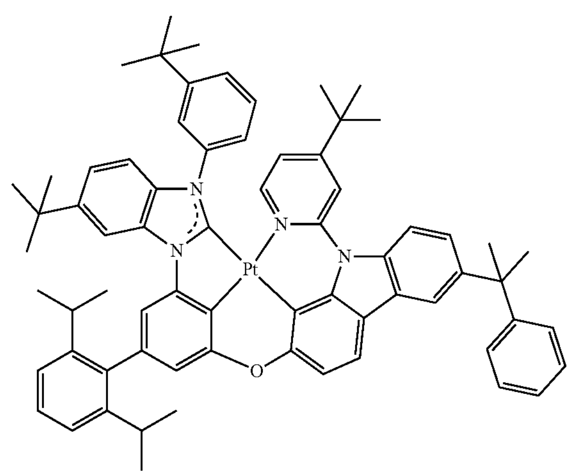

-continued
2128
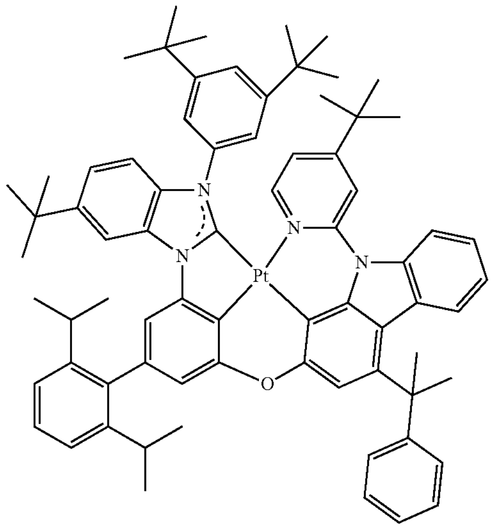
2129
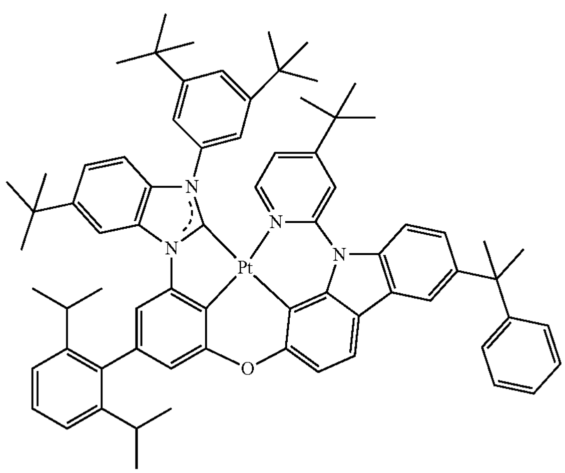
2130
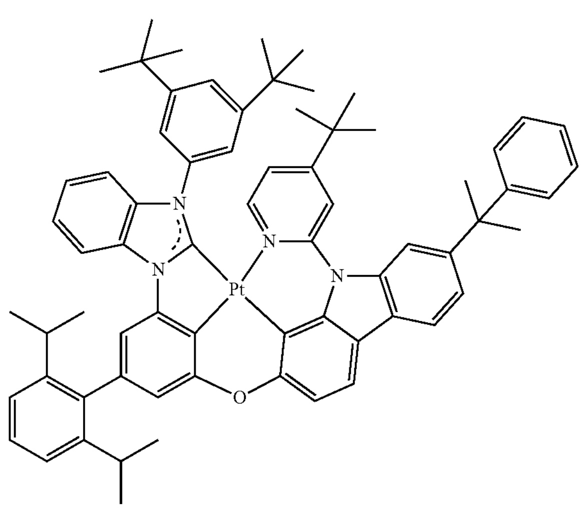
-continued
2131
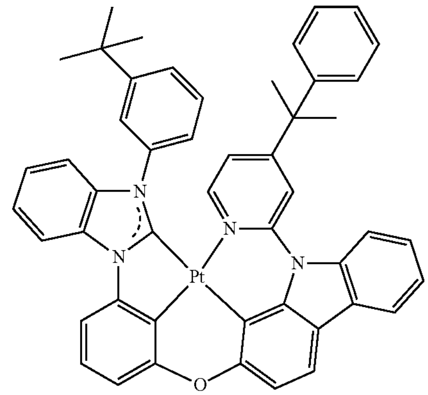
2132
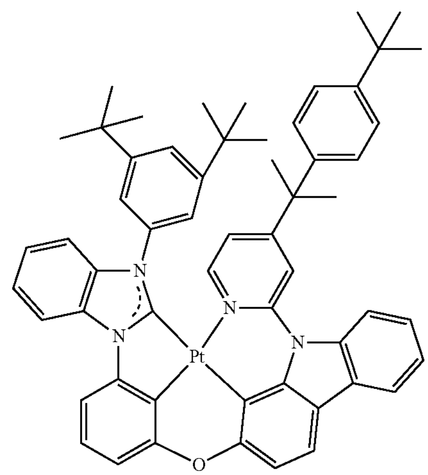
2133
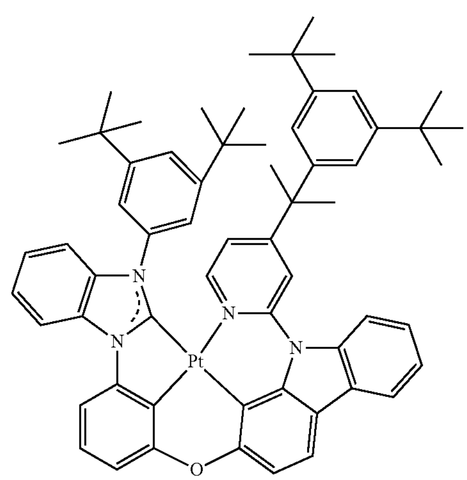

-continued
2134
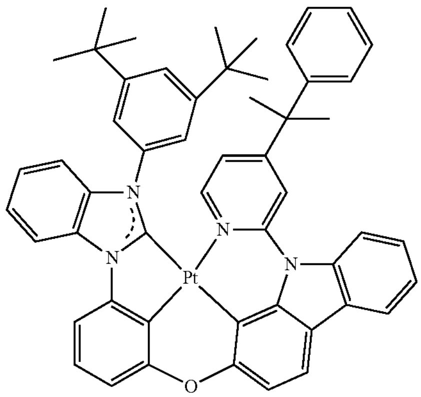
2135
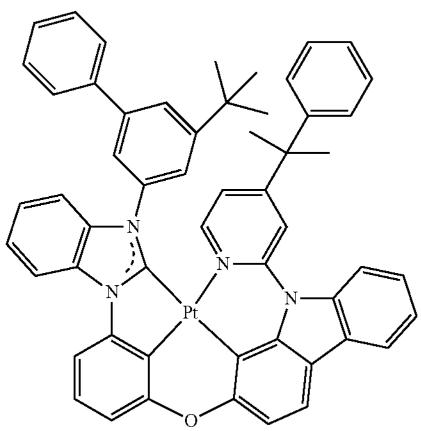
2136
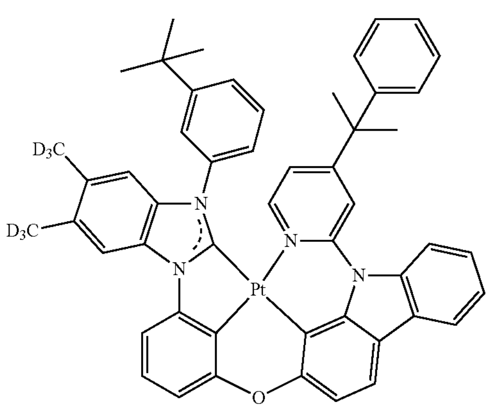
2137
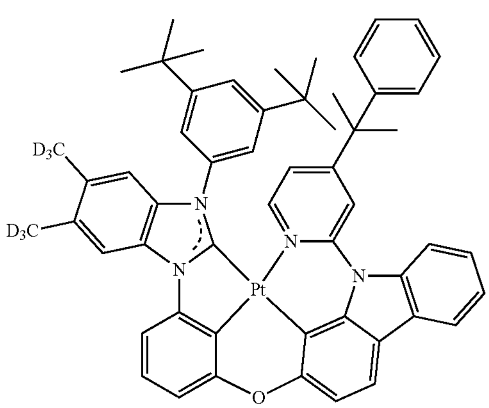
-continued
2138
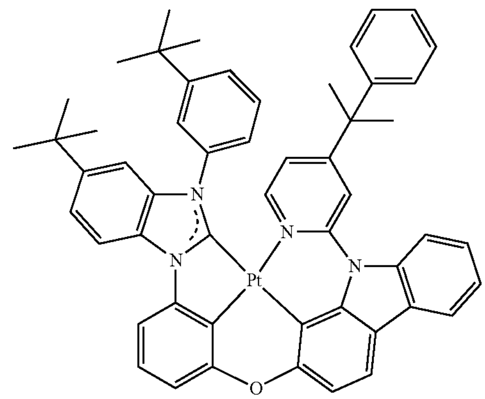
2139
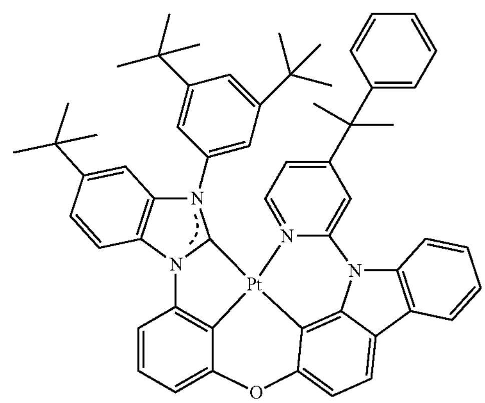
2140
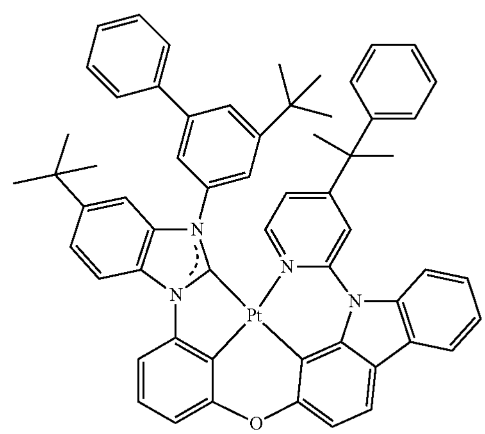
2141
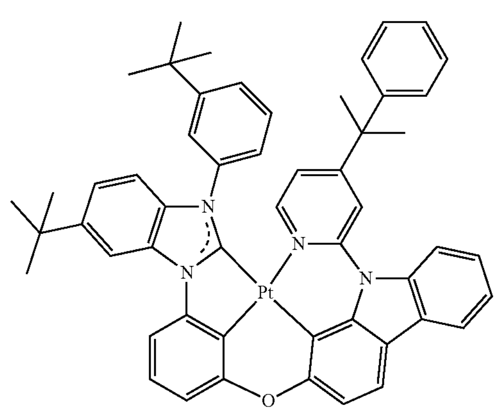

2142
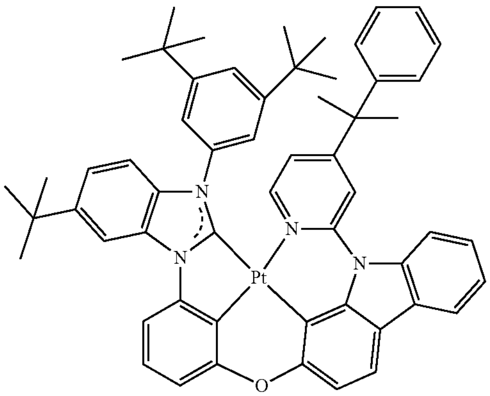
2143
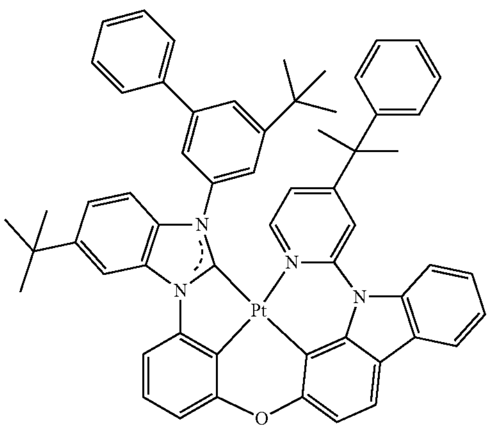
2144
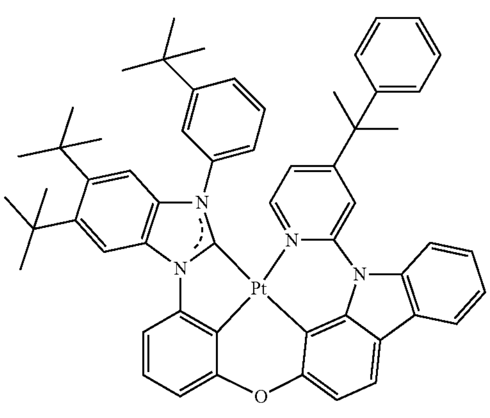
2145
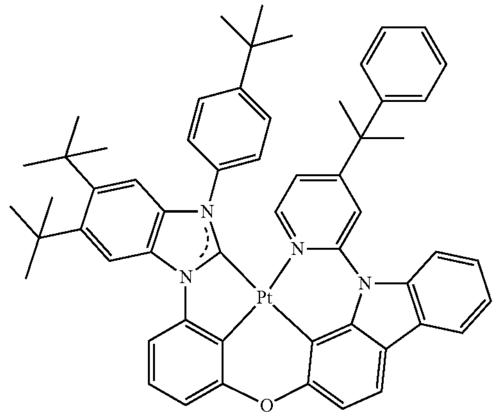
2146
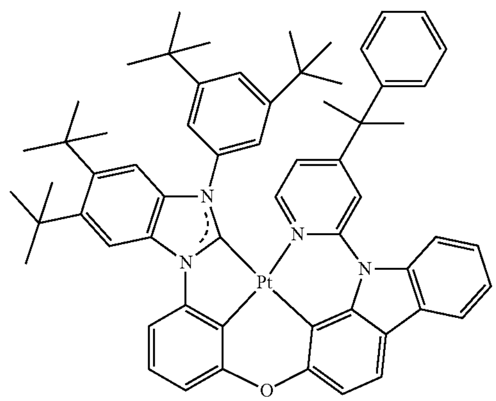
2147
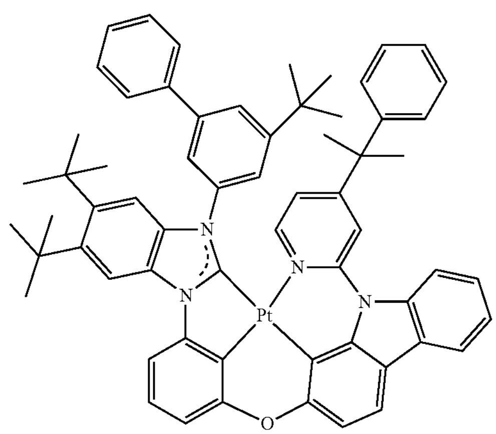

-continued
2148
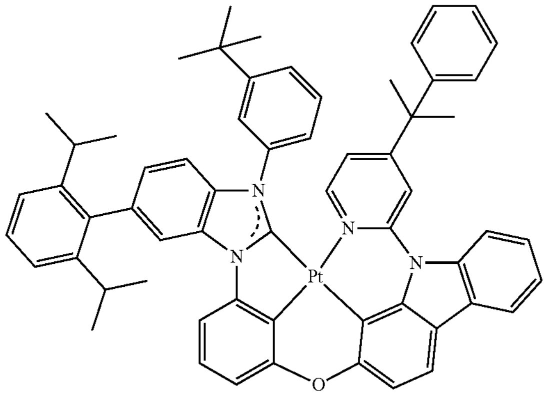
2149
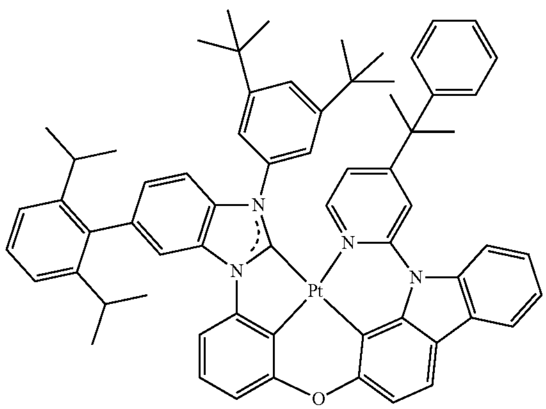
2150
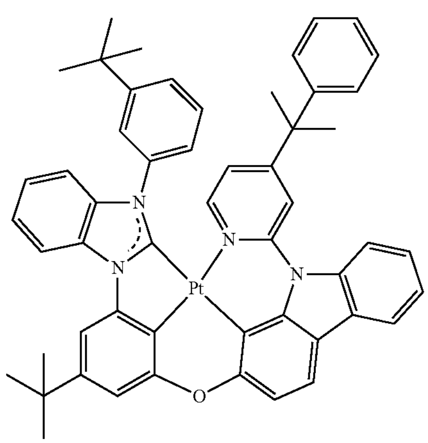
-continued
2151
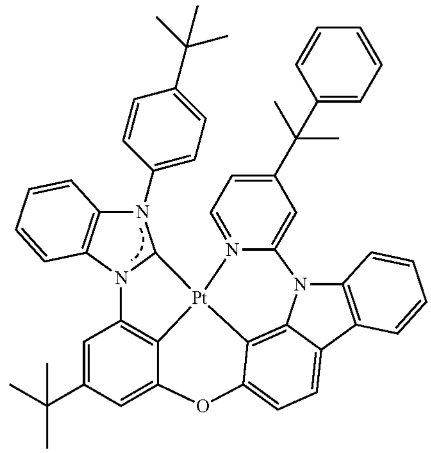
2152
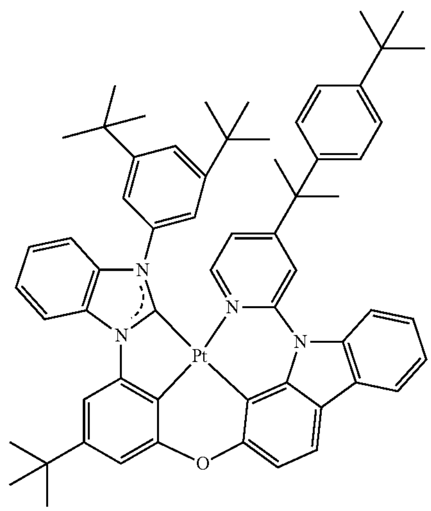
2153
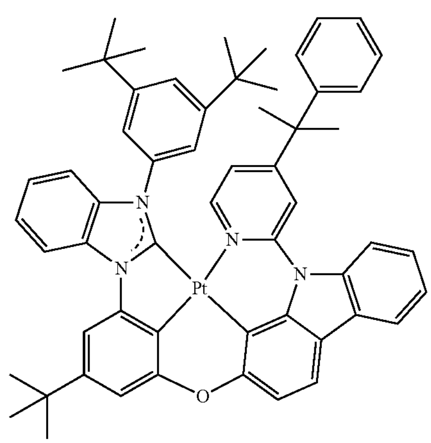

-continued
2154
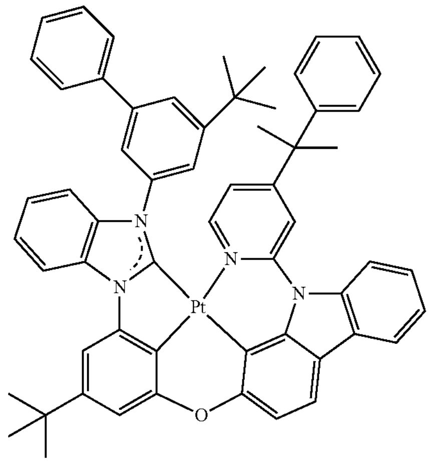
2155
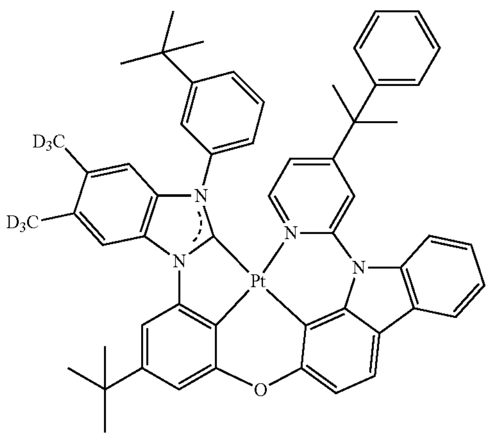
2156
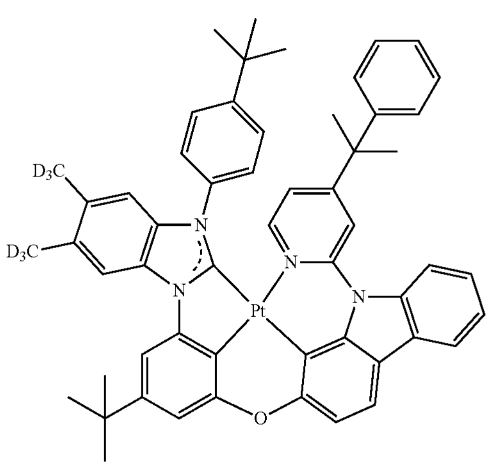
-continued
2157
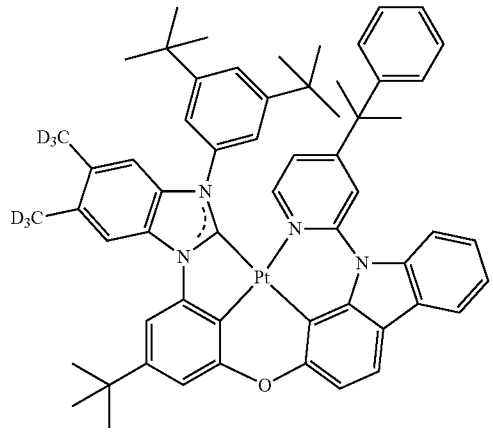
2158
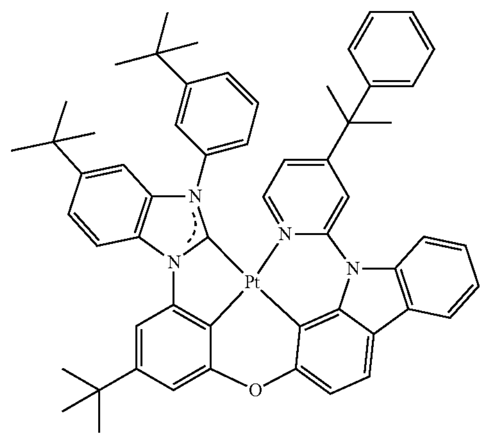
2159
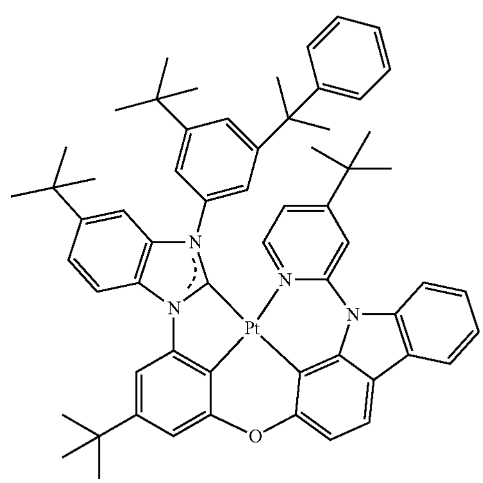

-continued
2160
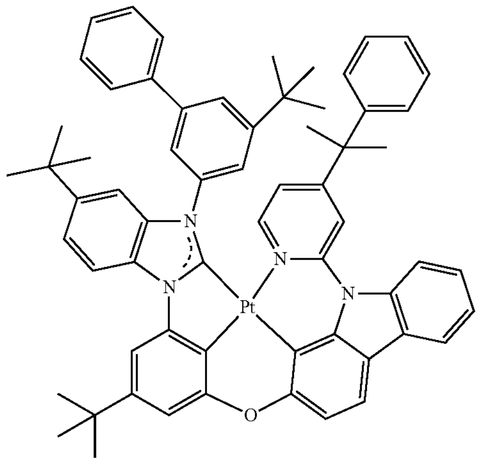
2161
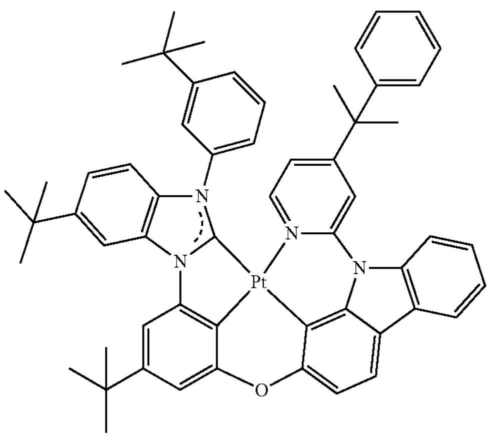
2162
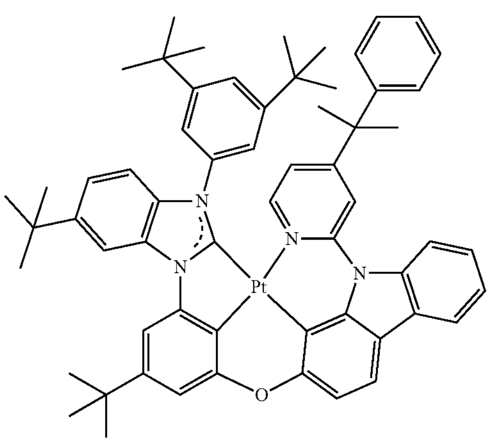
-continued
2163
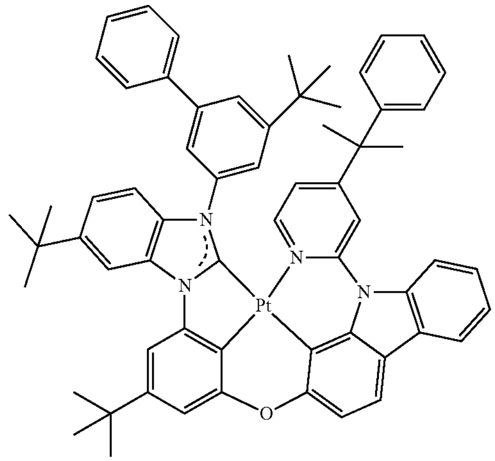
2164
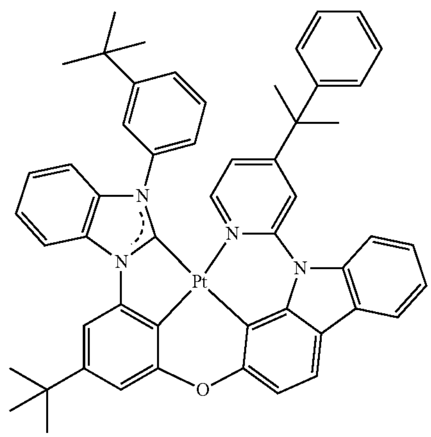
2165
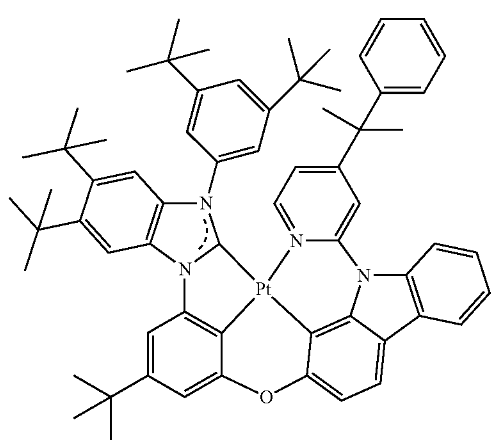

-continued
2166
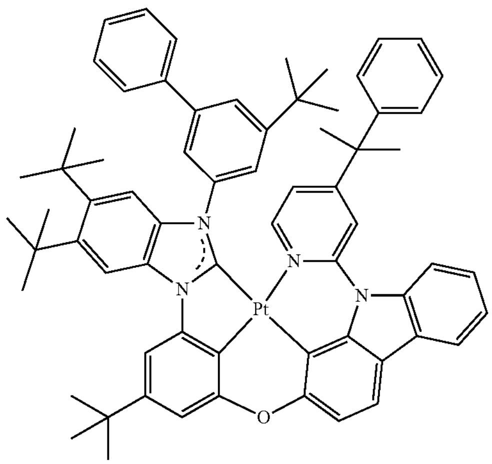
2167
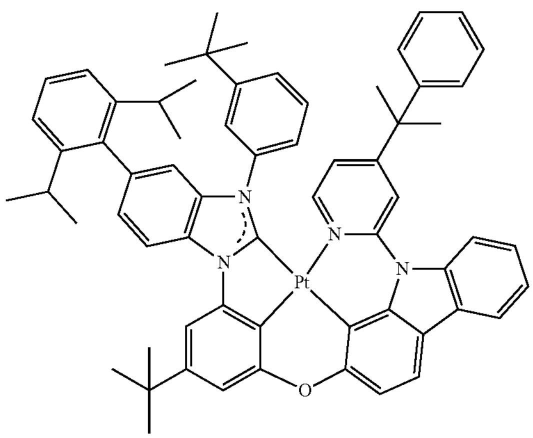
2168
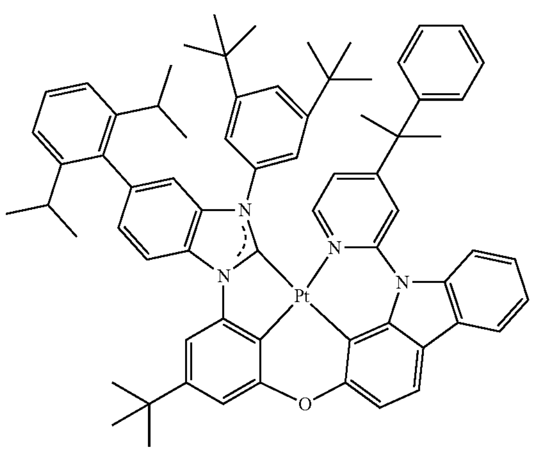
-continued
2169
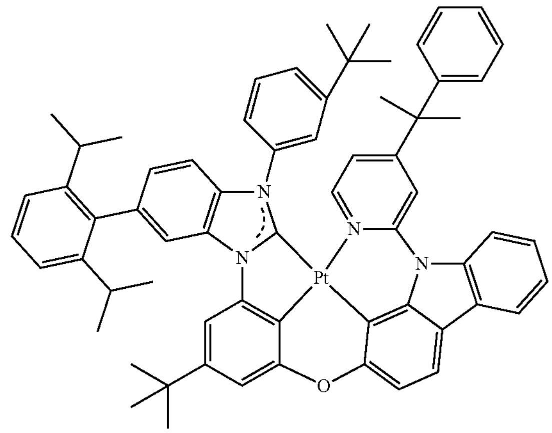
2170
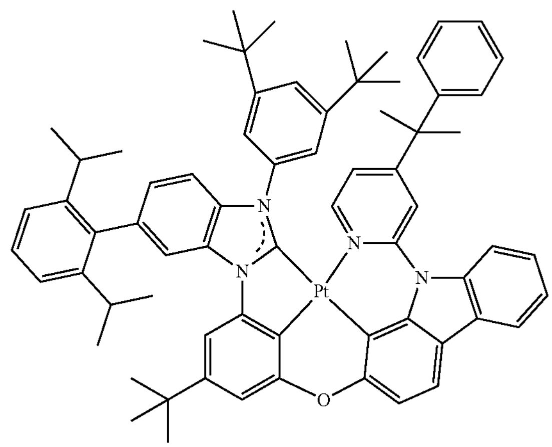
2171
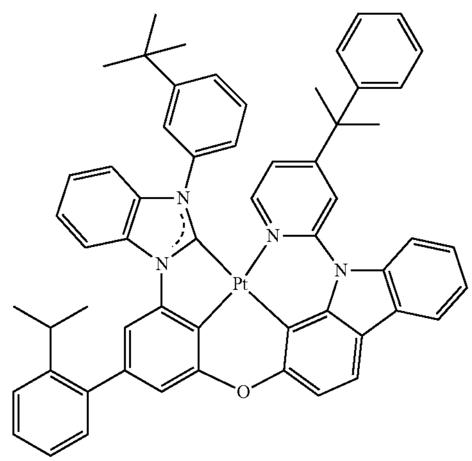

-continued
2172
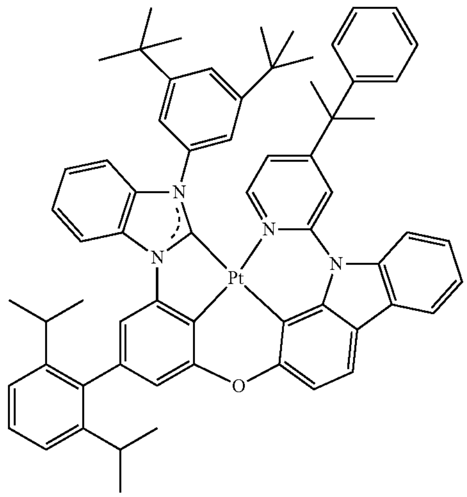
2173
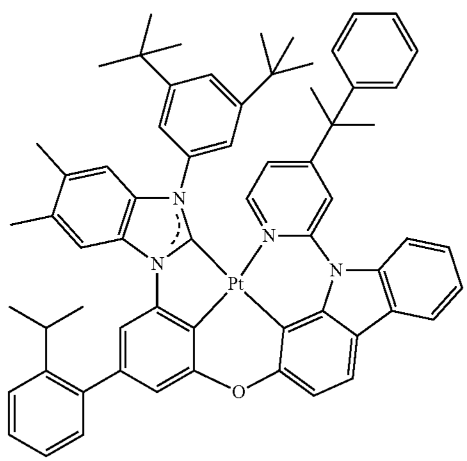
2174
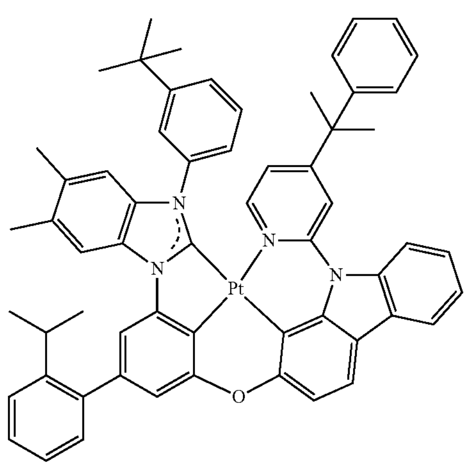
-continued
2175
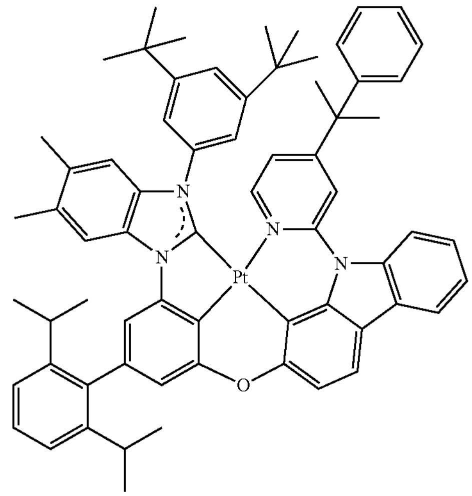
2176
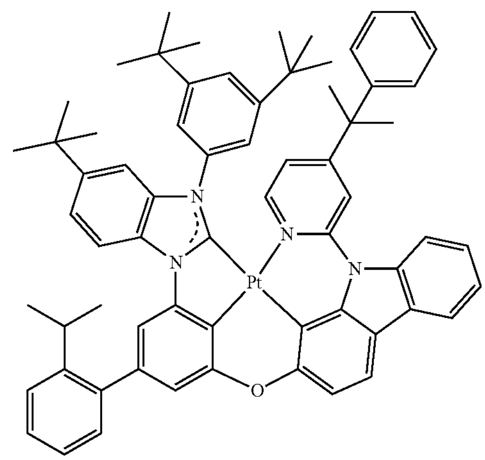
2177
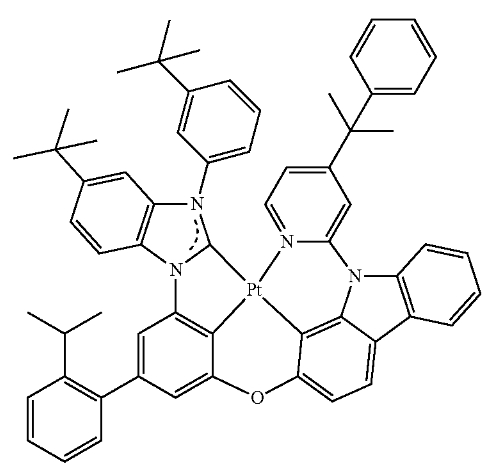

-continued
2178
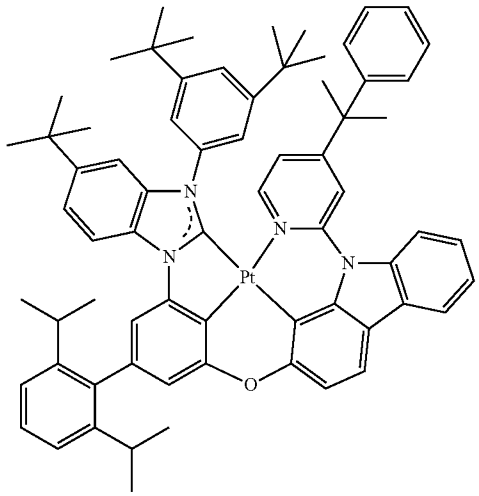
2179
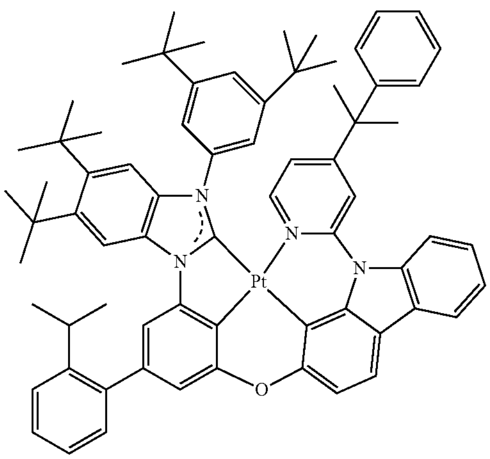
2180
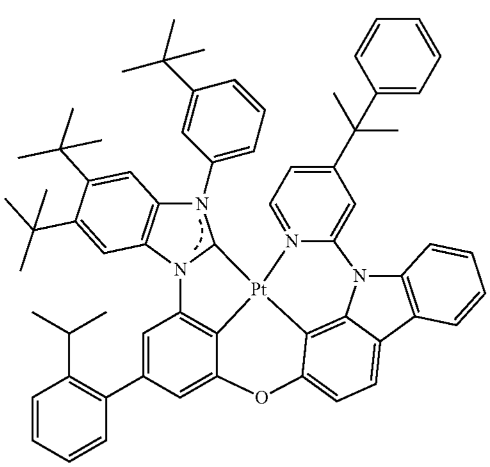
-continued
2181
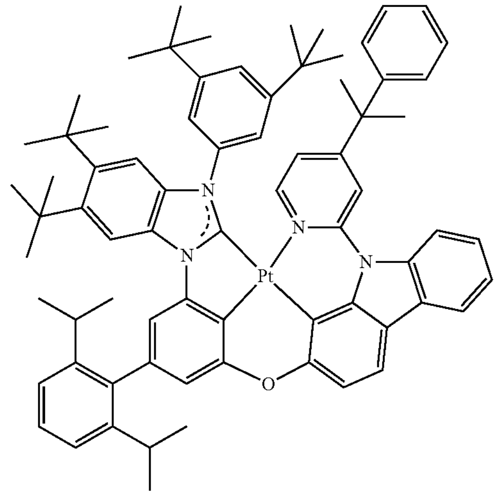
2182
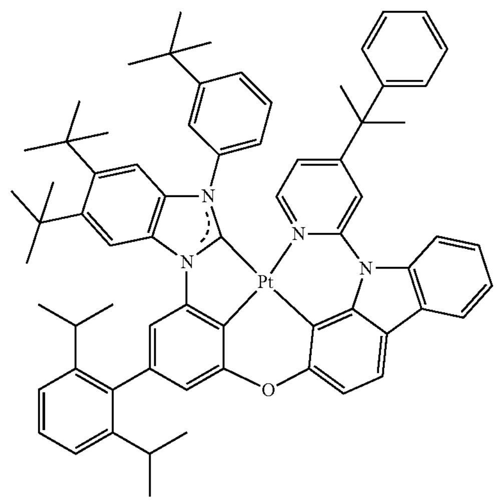
2183
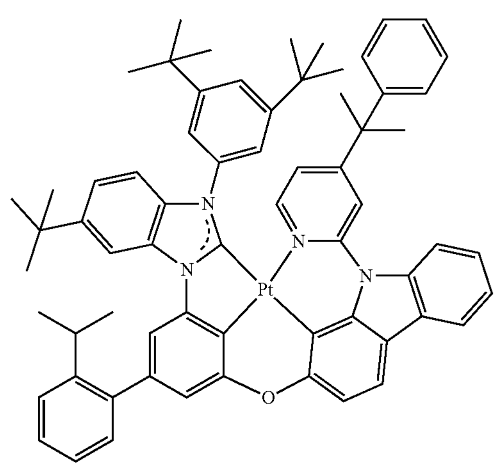

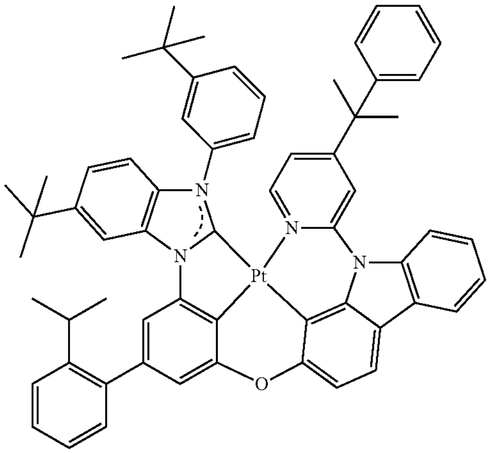
2184
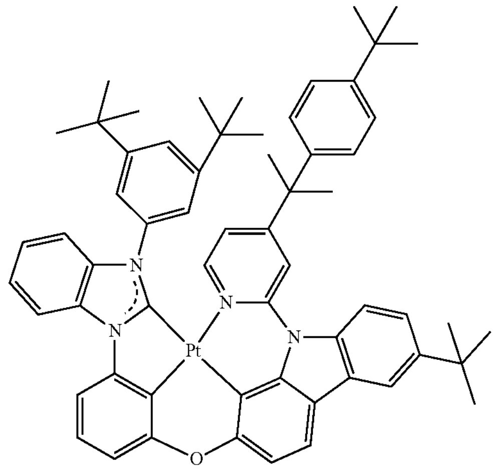
2187
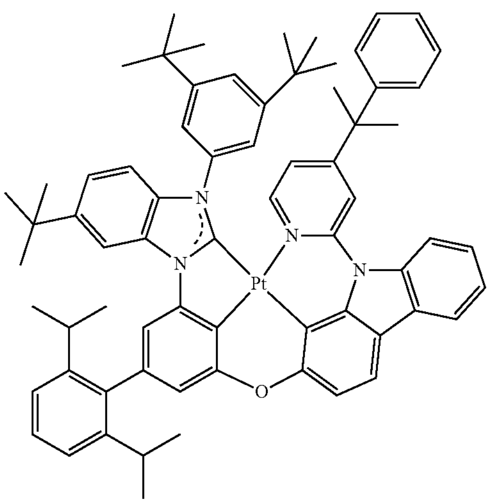
2185
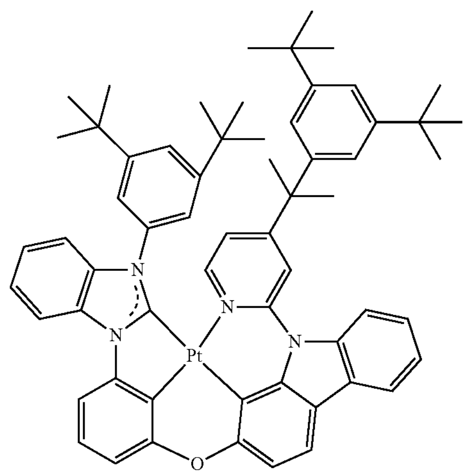
2188
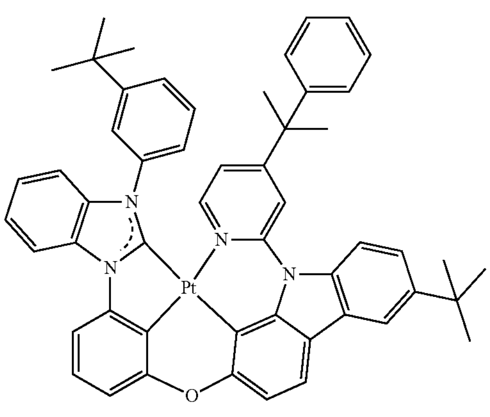
2186
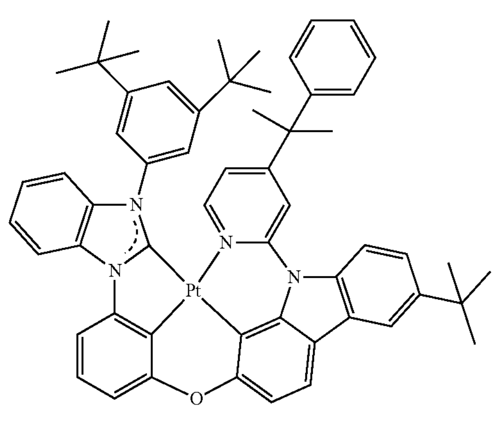
2189

2190
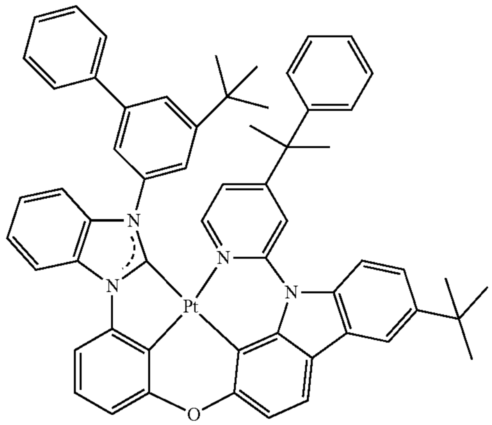
2191
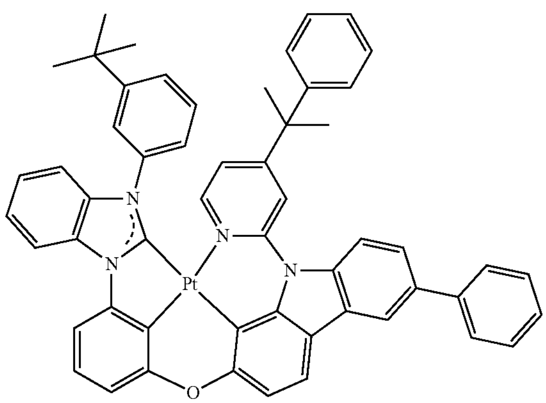
2192
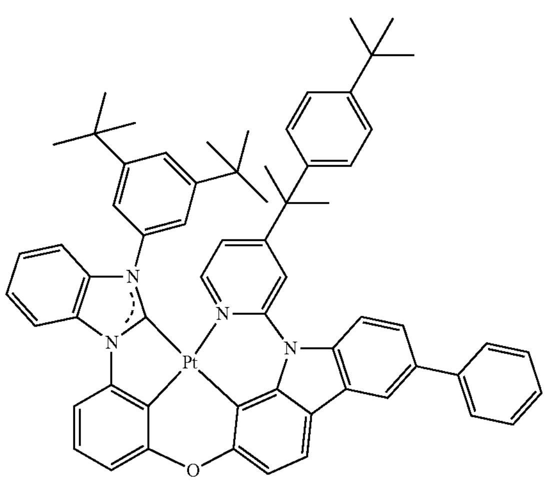
2193
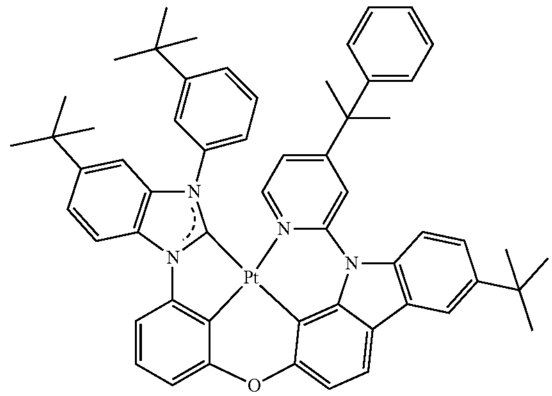
2194
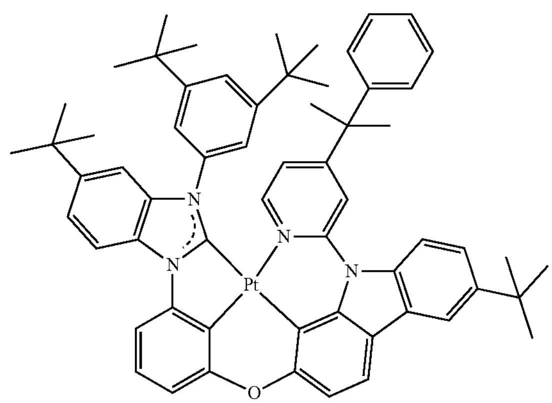
2195
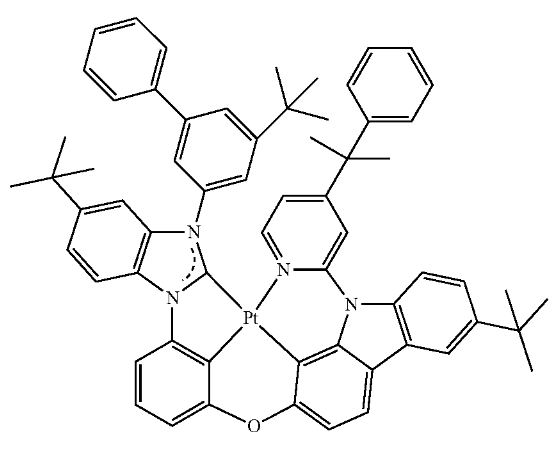

-continued
2196
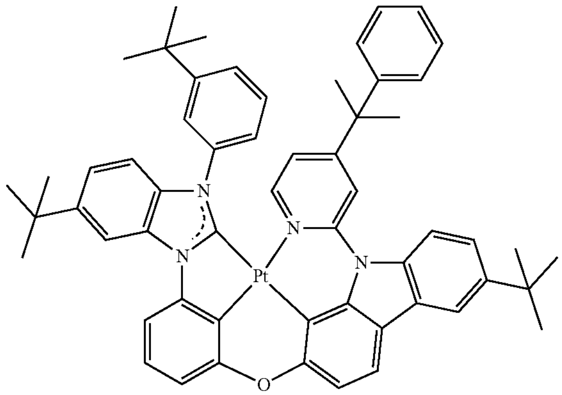
2197
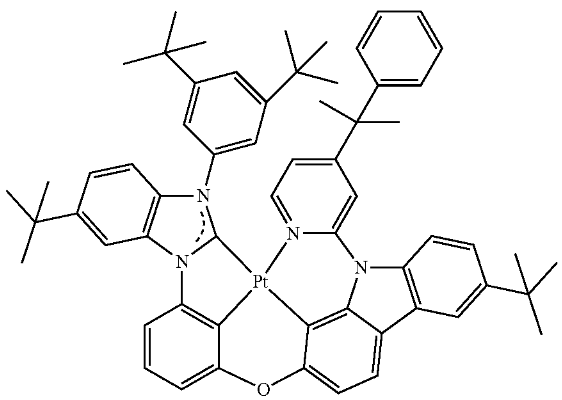
2198
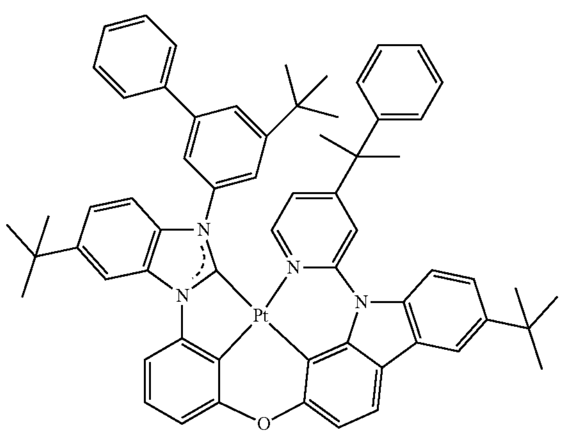
-continued
2199
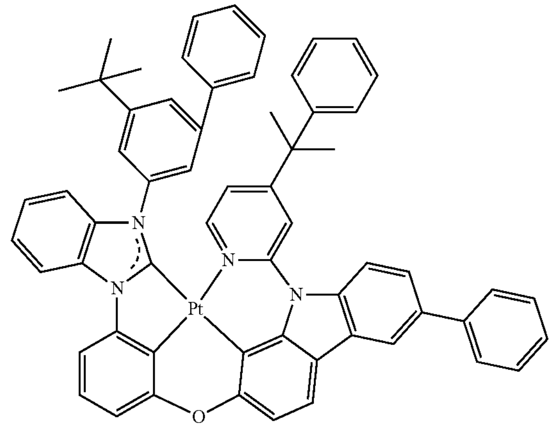
2200
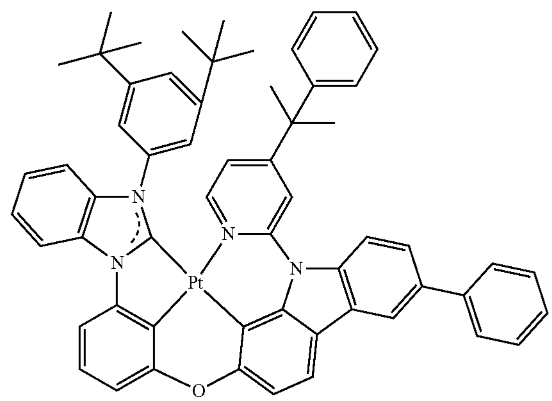
2201
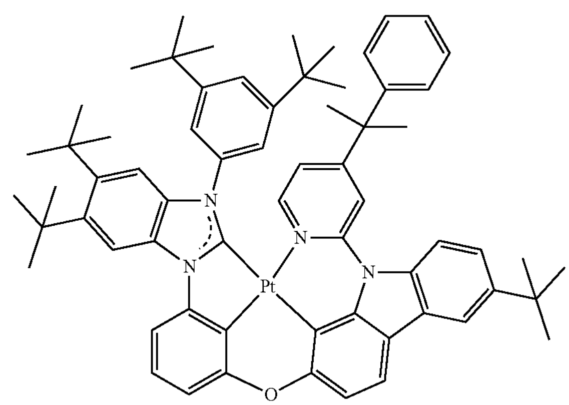

2202
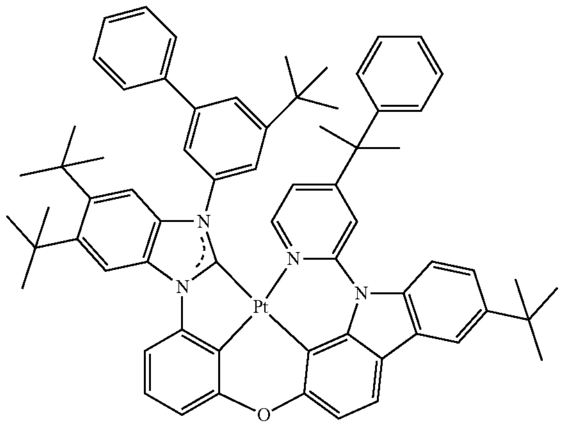
2203
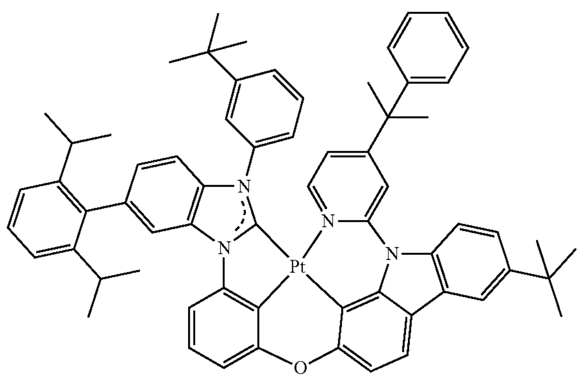
2204
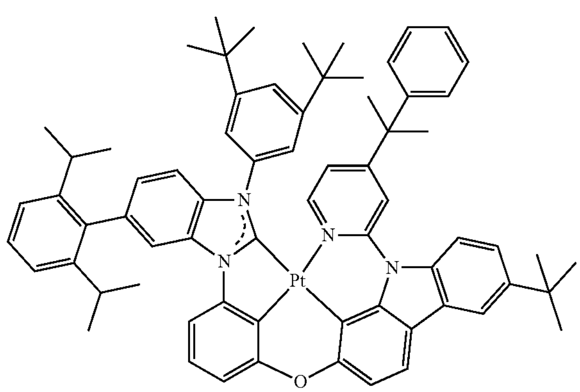
2205
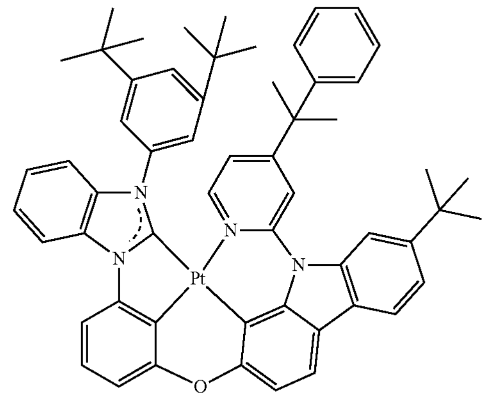
2206
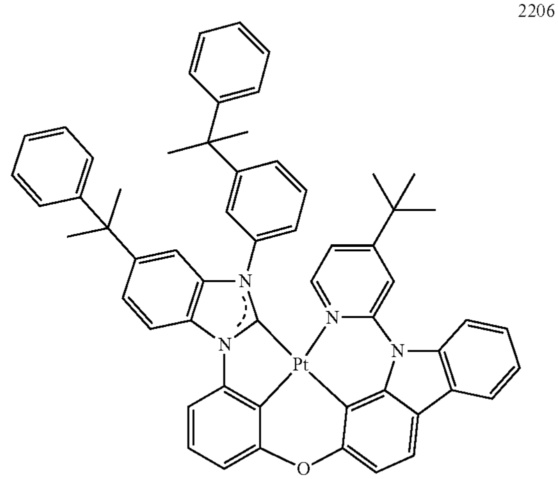
2207
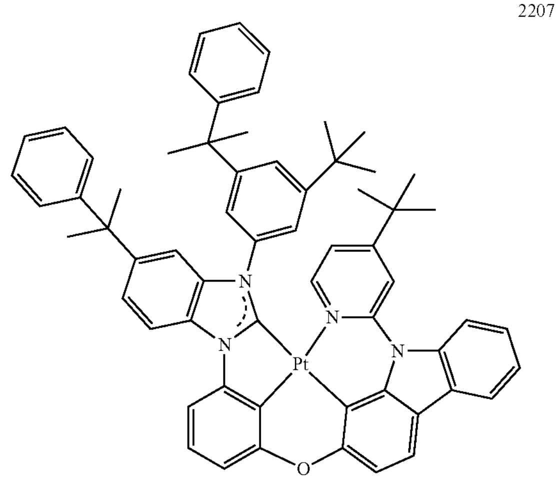

2208
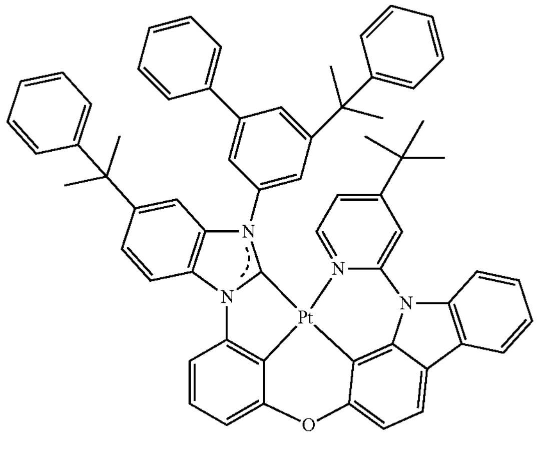
2209
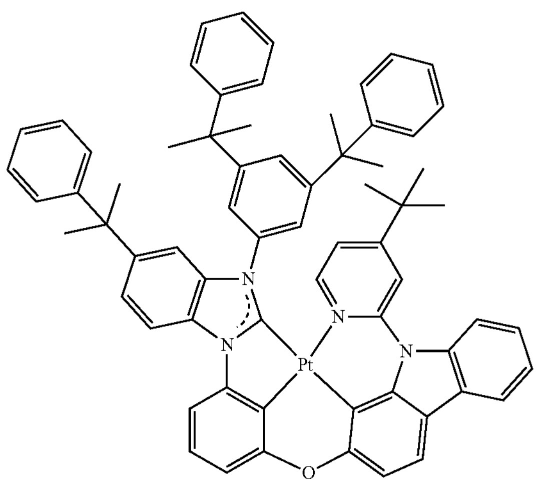
2210
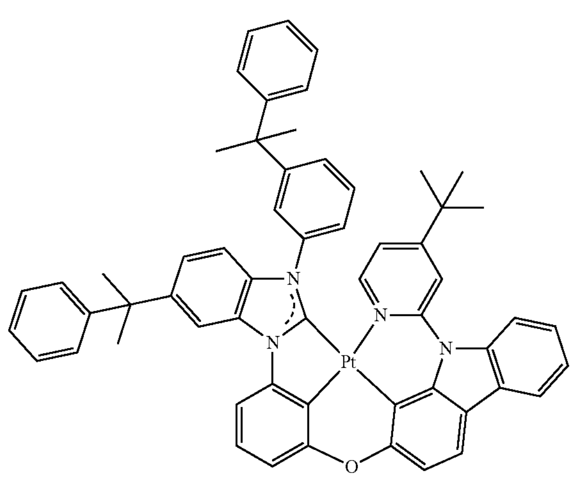
2211
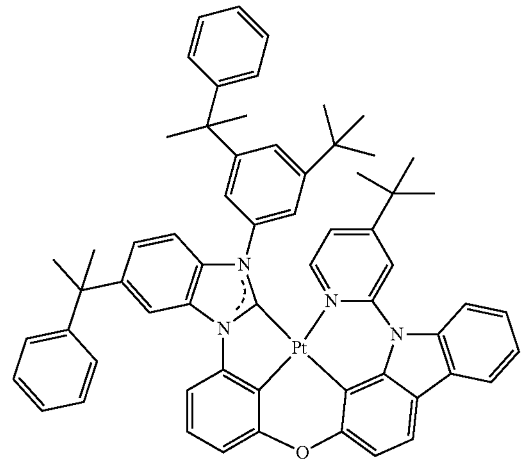
2212
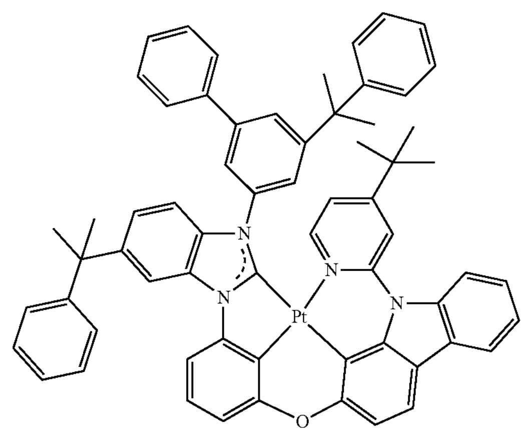
2213
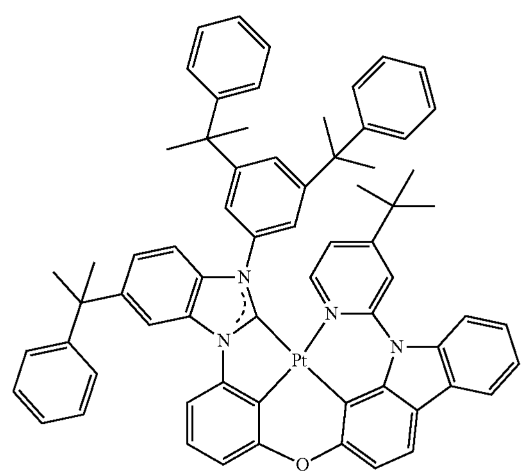

-continued
2214
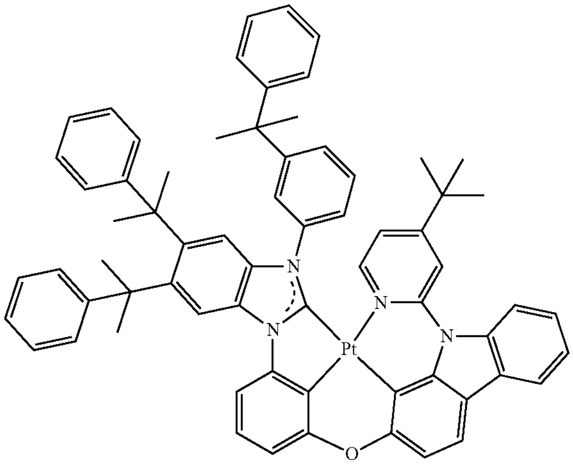
2215
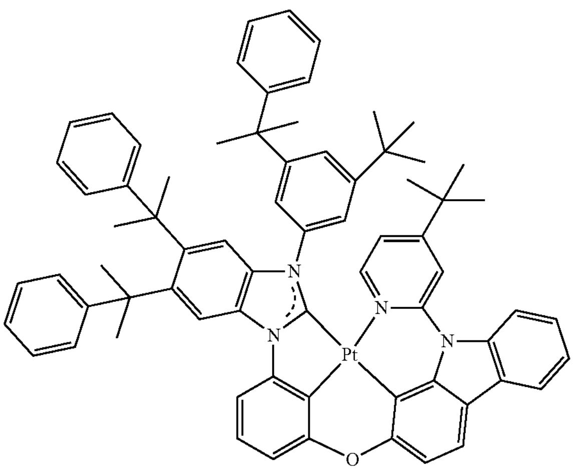
2216
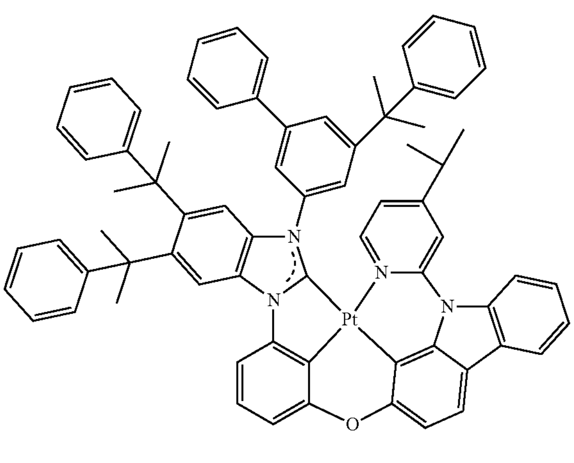
-continued
2217
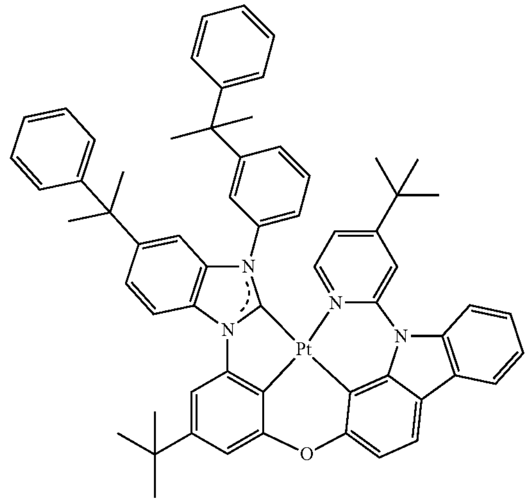
2218
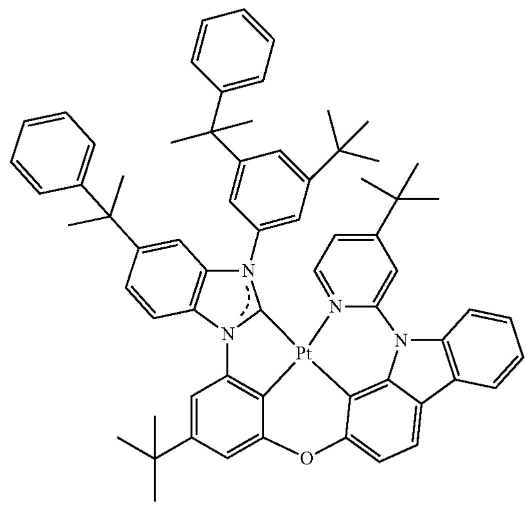
2219
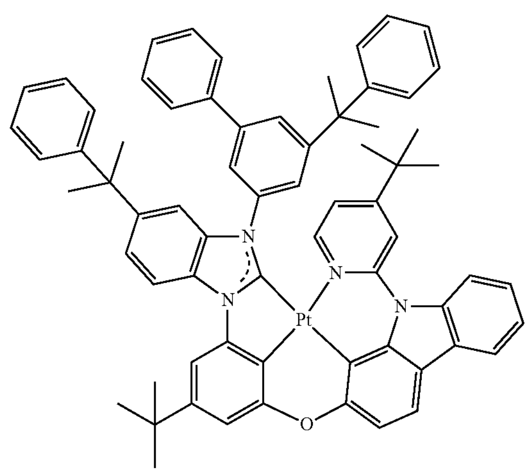

-continued
2220
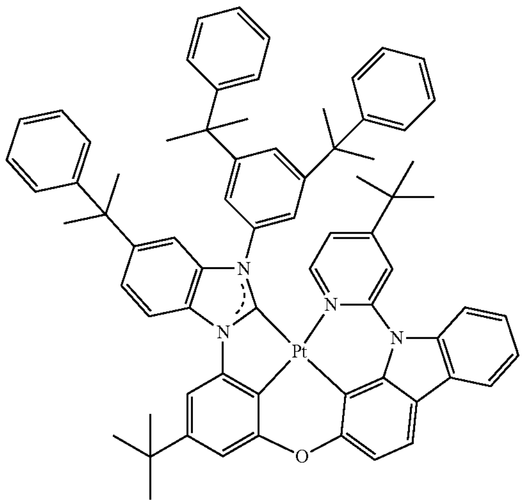
2221
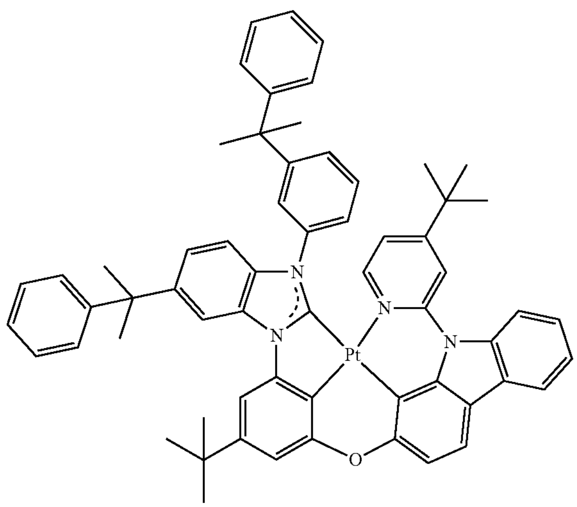
2222
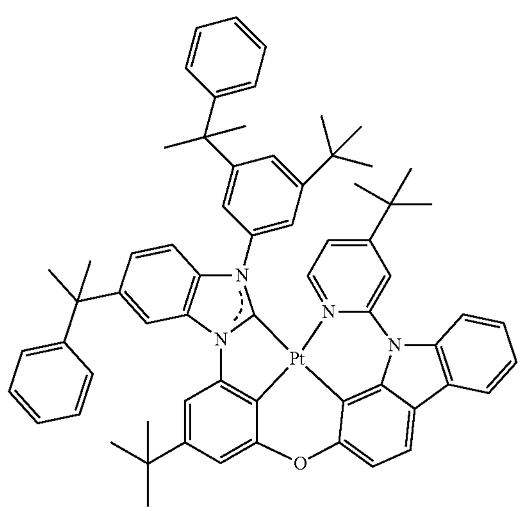
-continued
2223
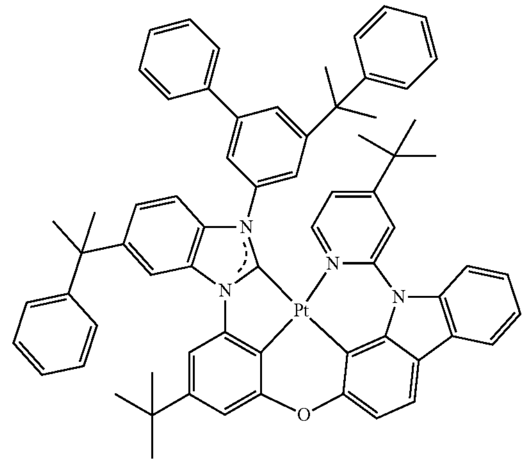
2224
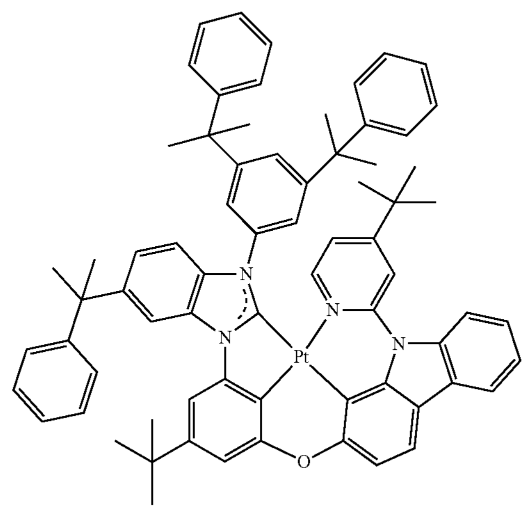
2225
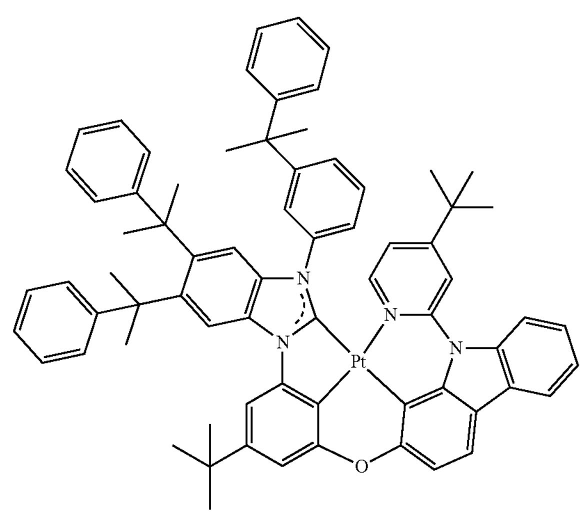

-continued
2226
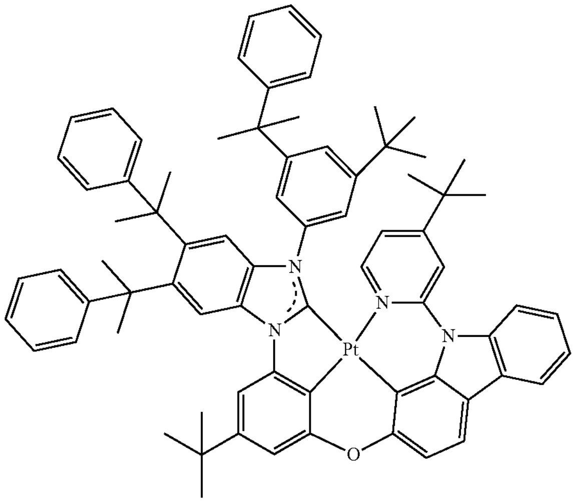
2227
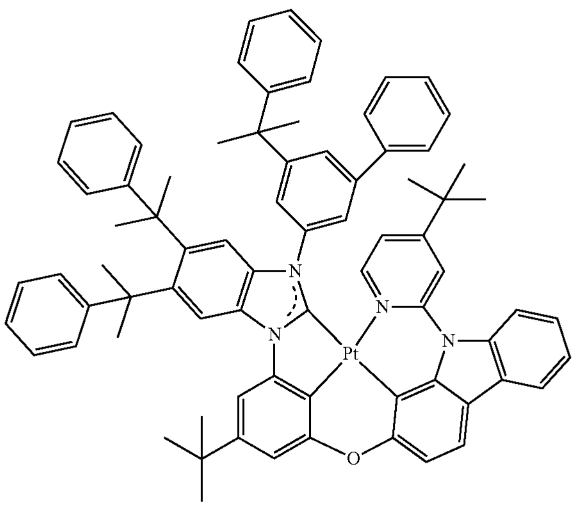
2228
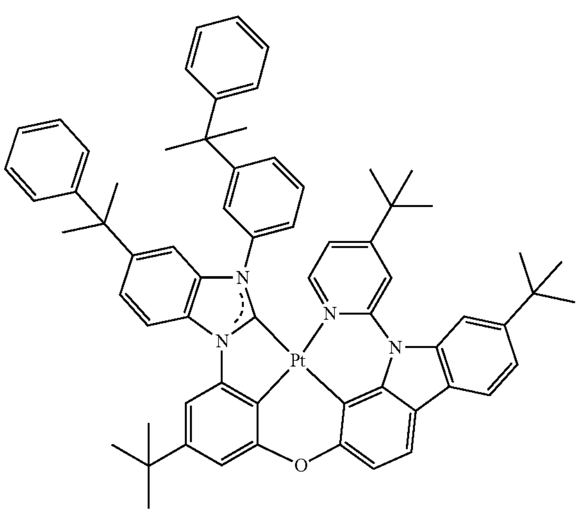
-continued
2229
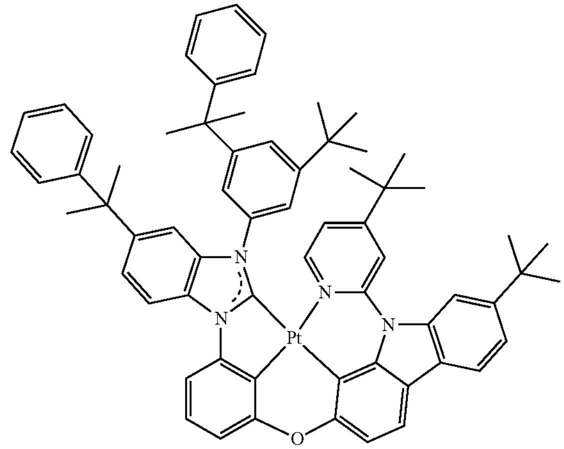
2230
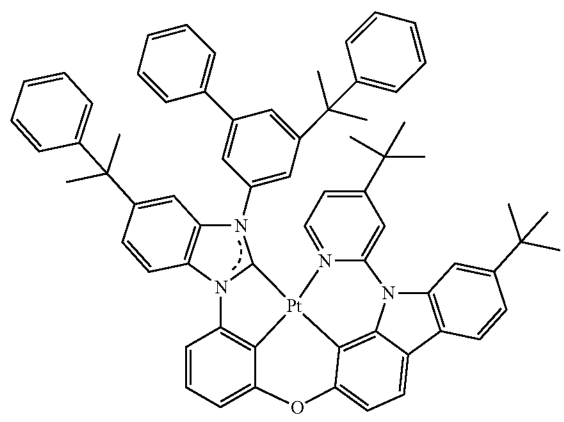
2231
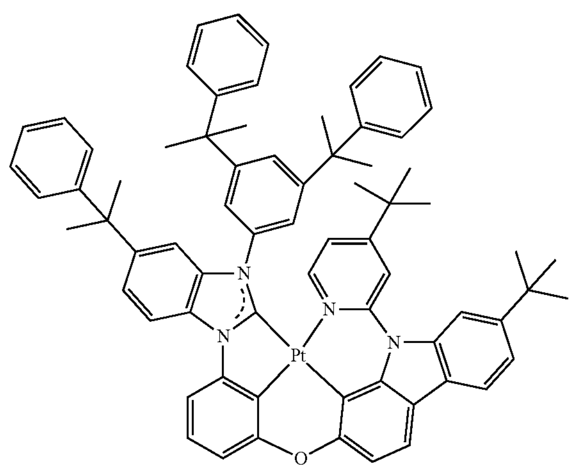

-continued
2232
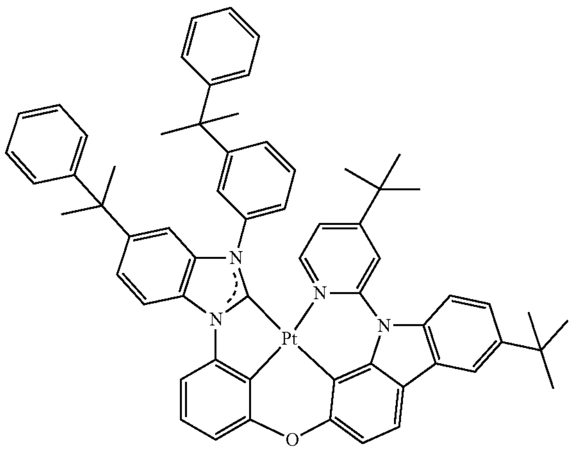
2233
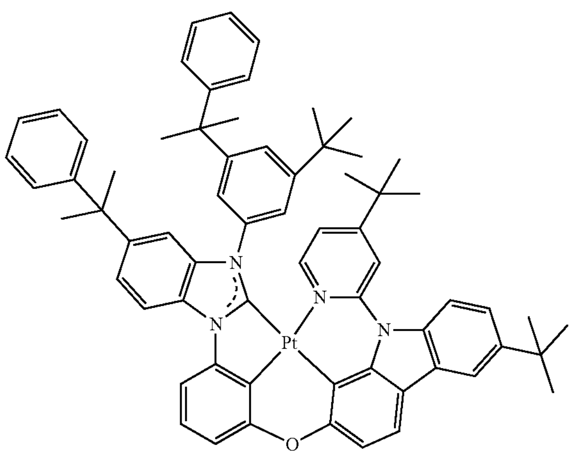
2234
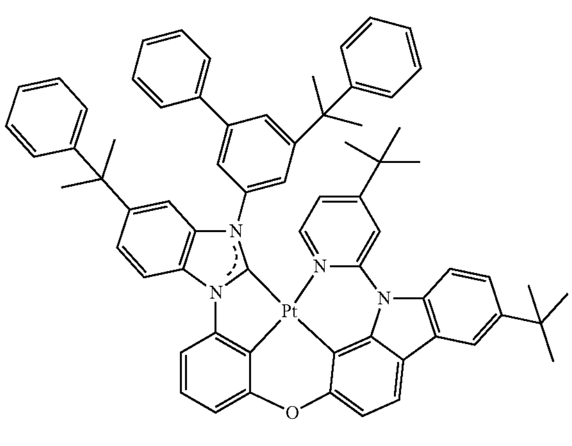
-continued
2235
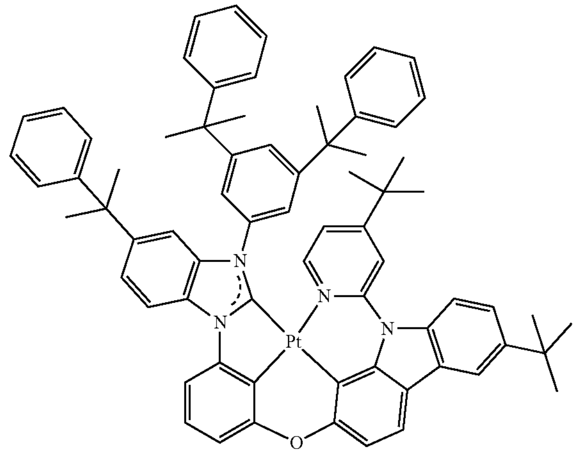
2236
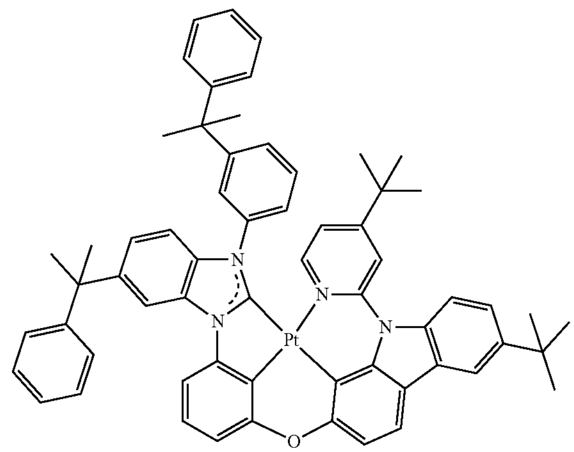
2237
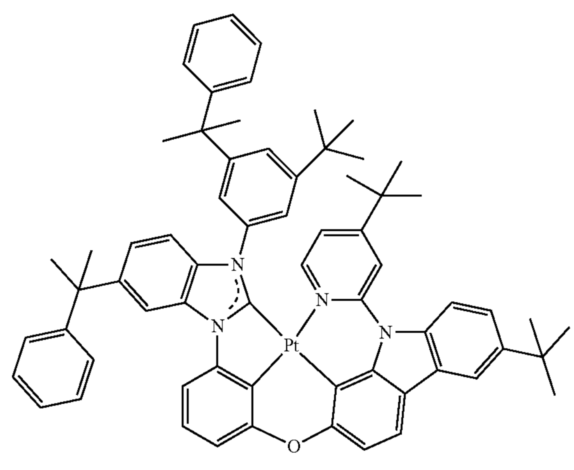

-continued
2238
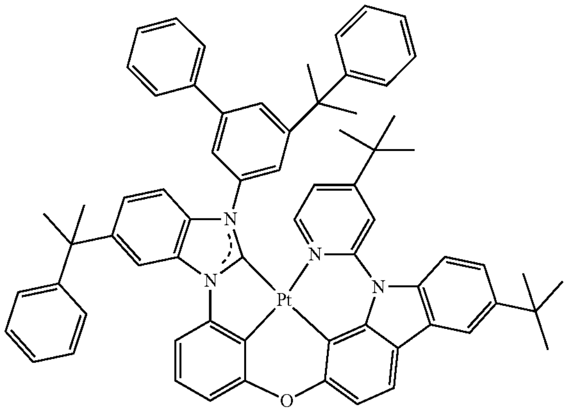
2239
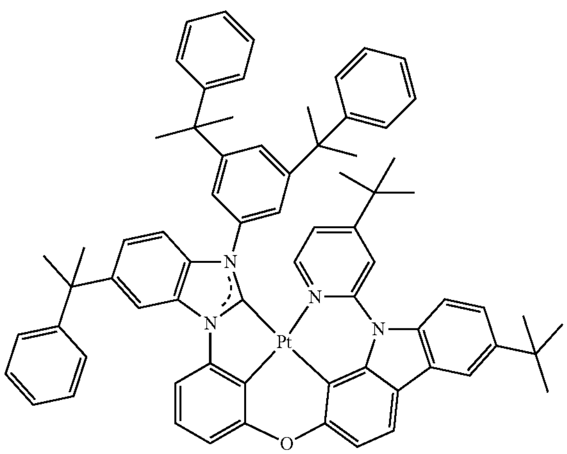
2240
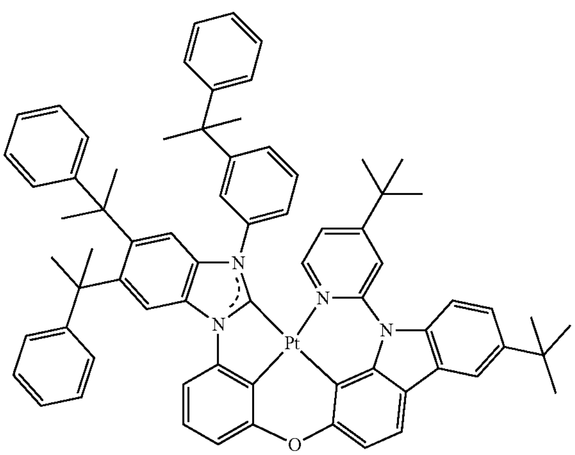
2241
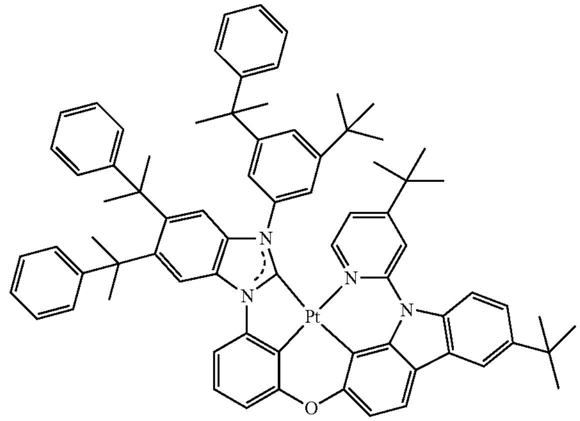
2242
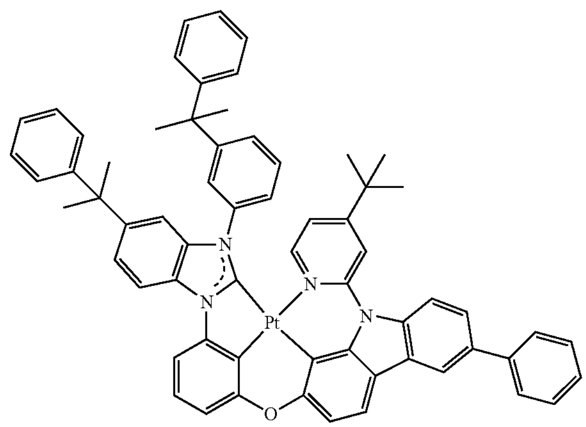
2243
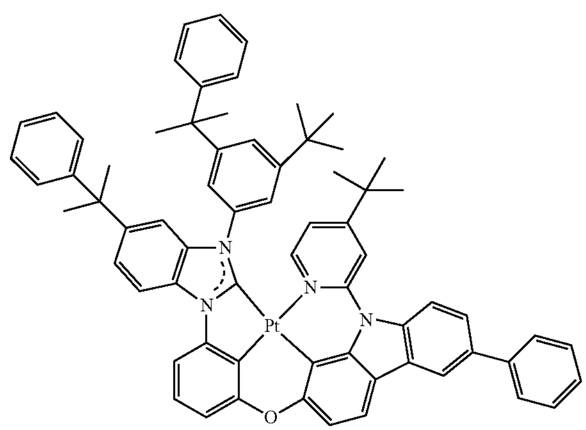

2244
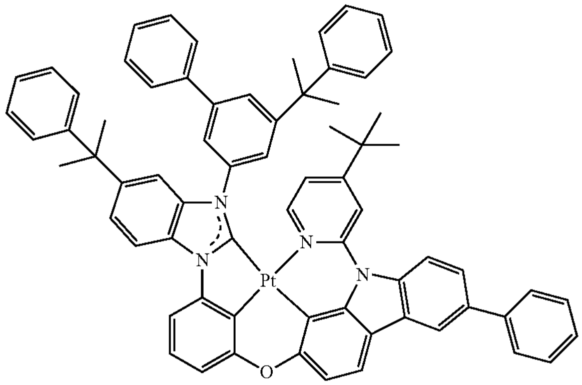
2245
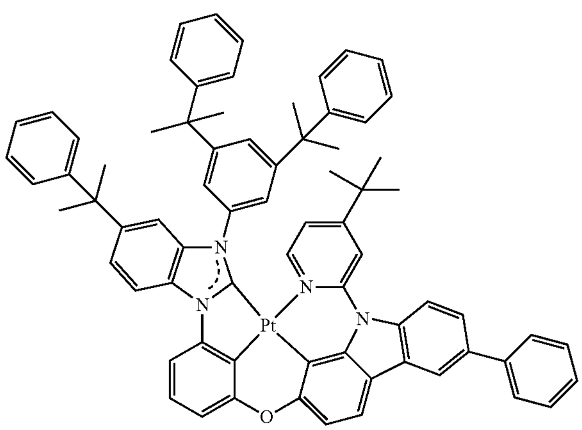
2246
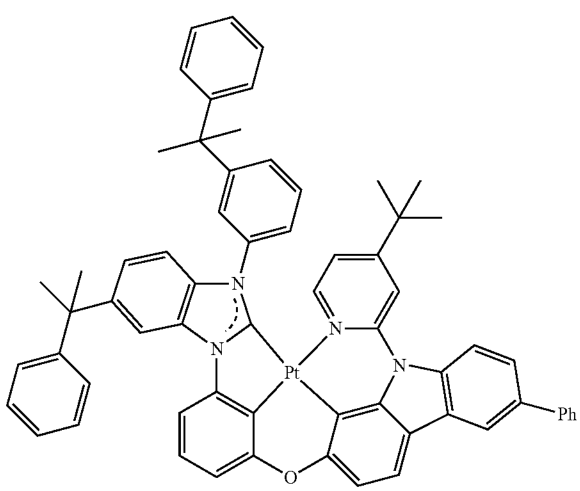
2247
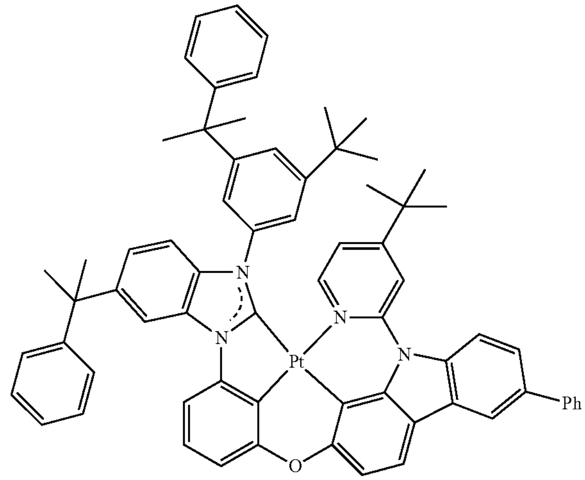
2248
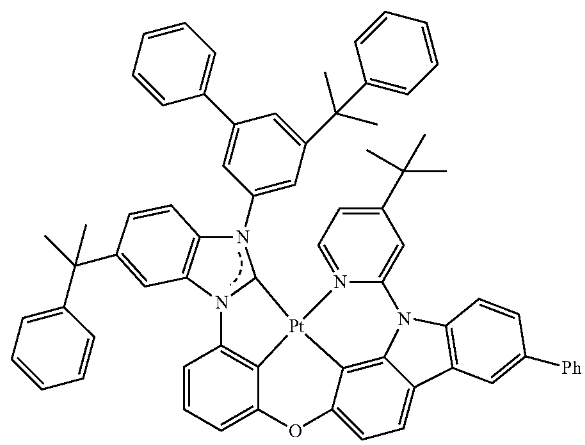
2249
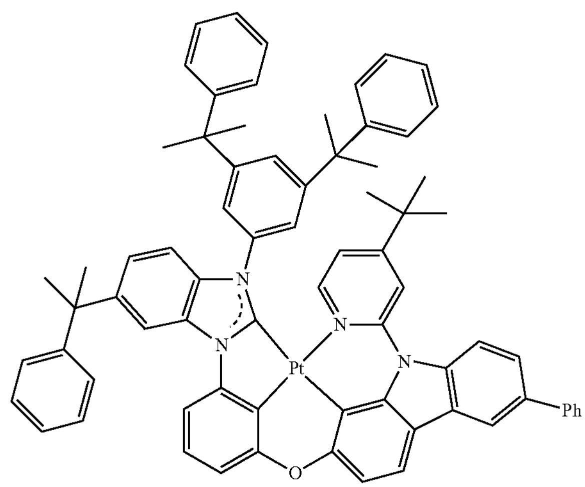

-continued
2250
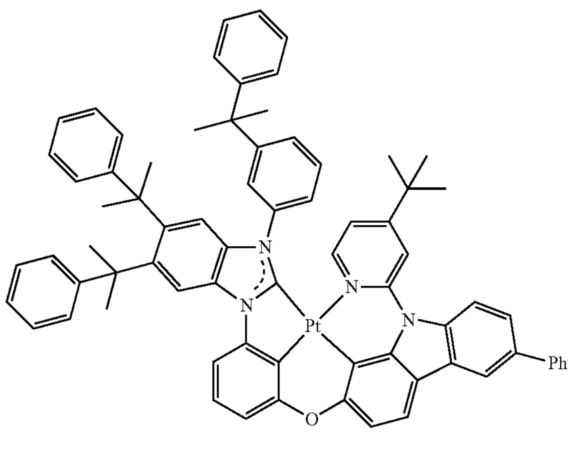
2251
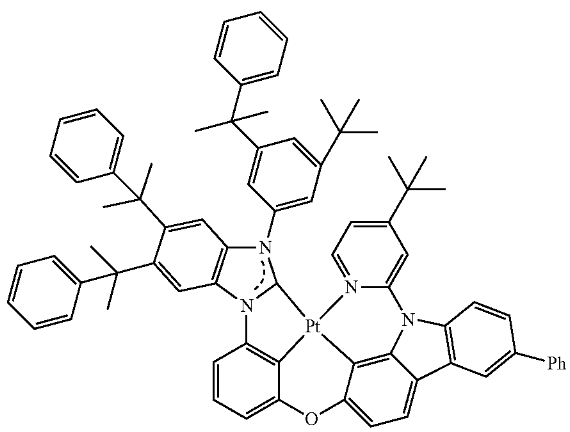
2252
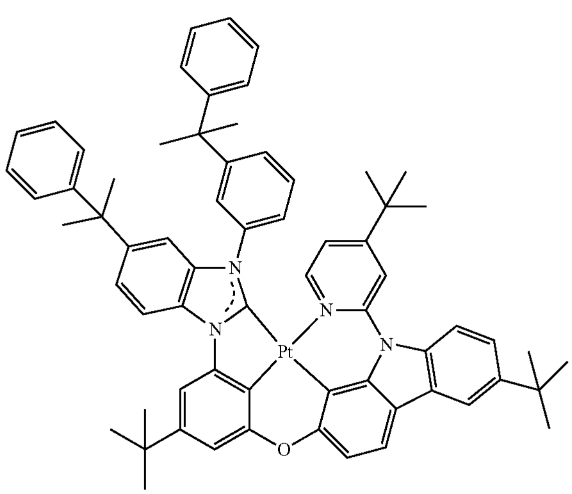
-continued
2253
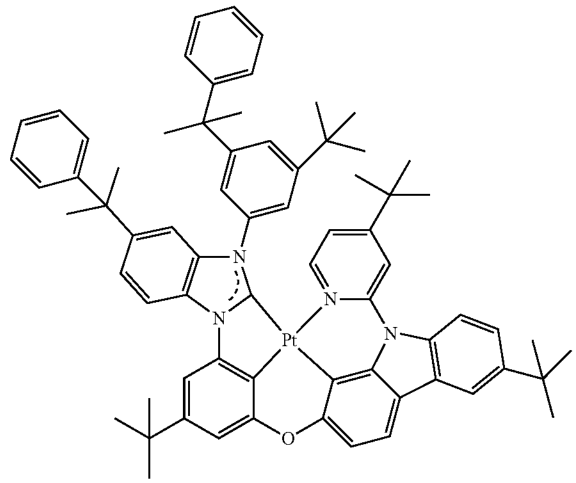
2254
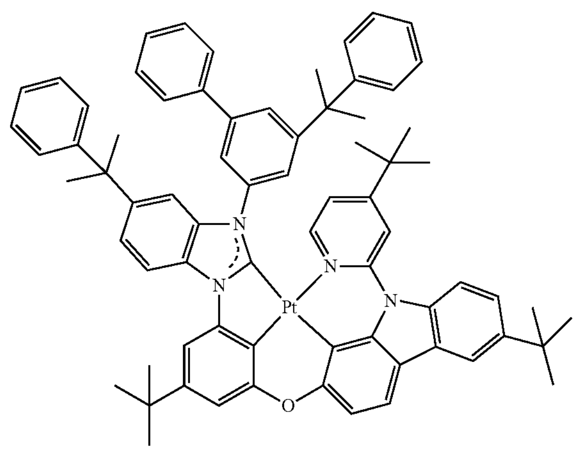
2255
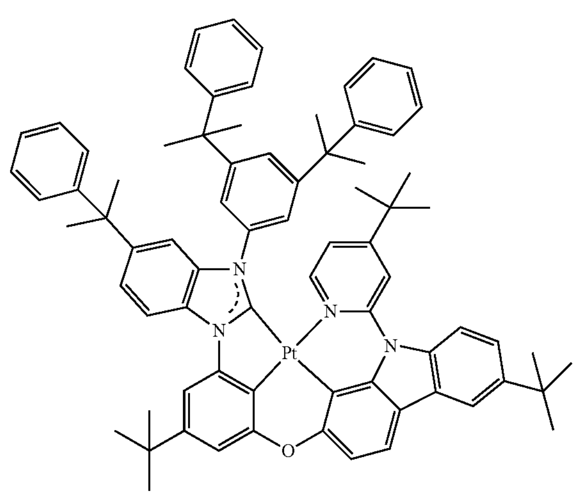

-continued
2256
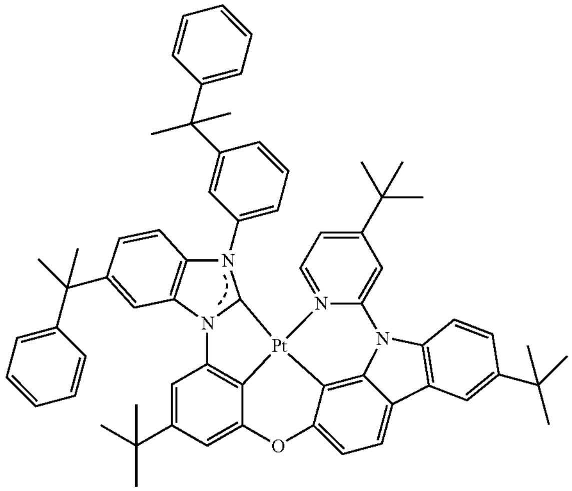
2257
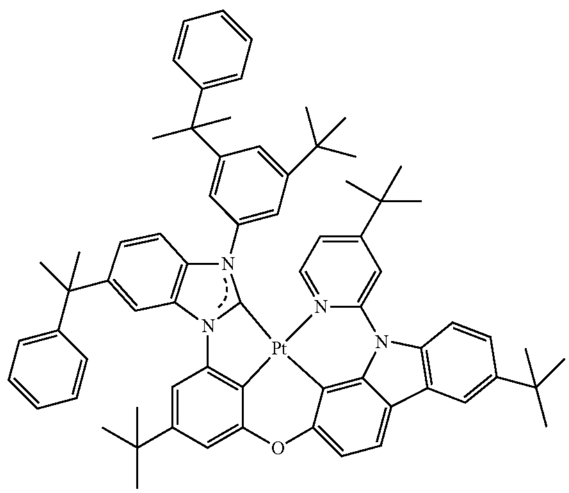
2258
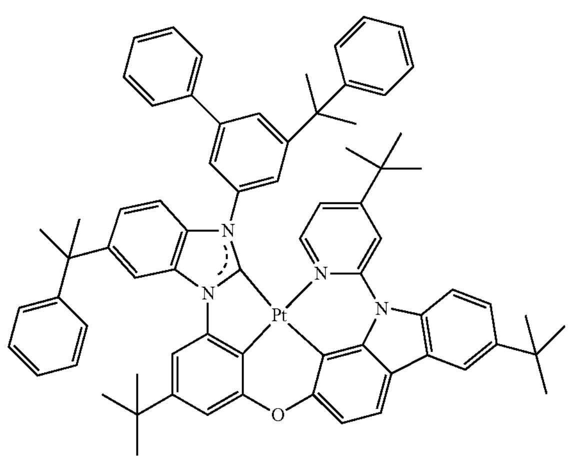
-continued
2259
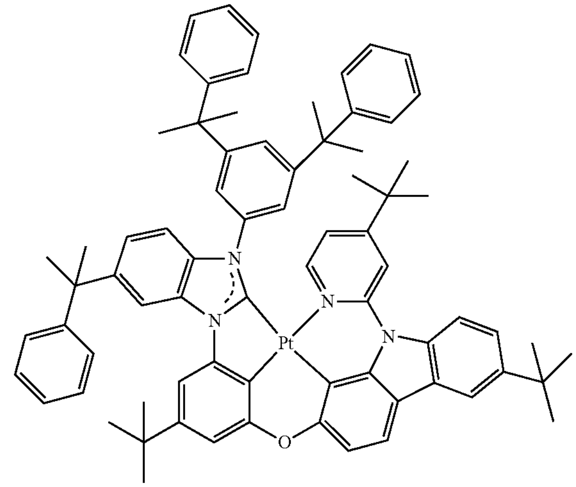
2260
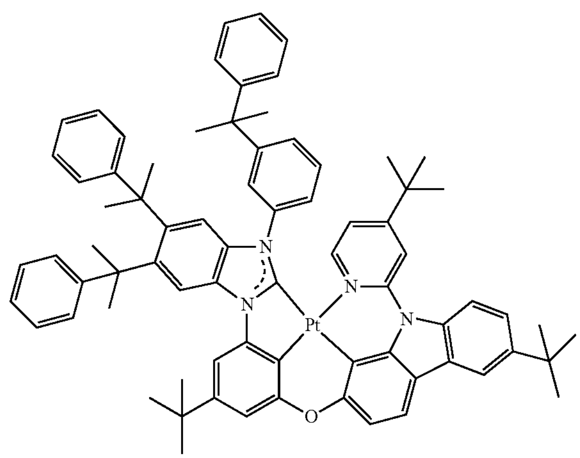
2261
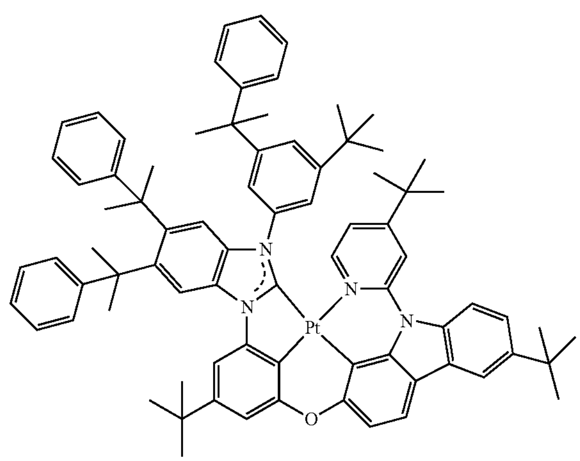

2262
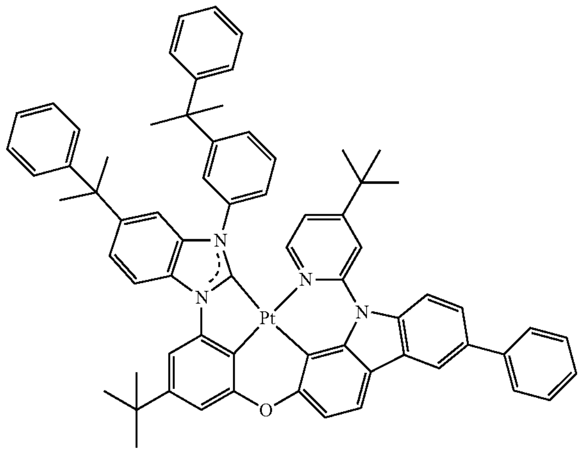
2263
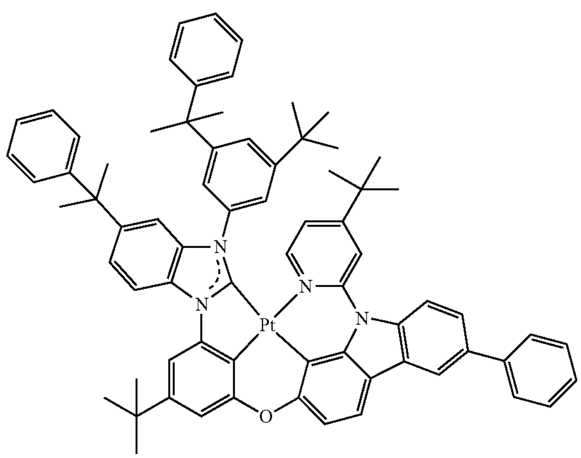
2264
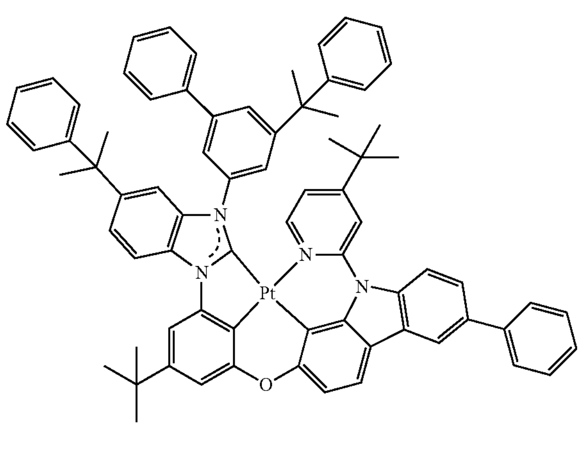
2265
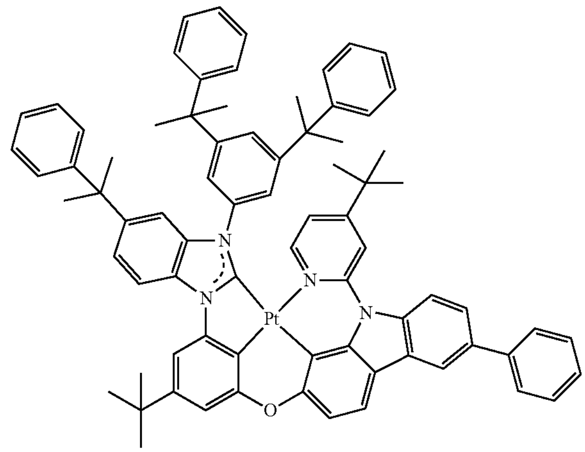
2266
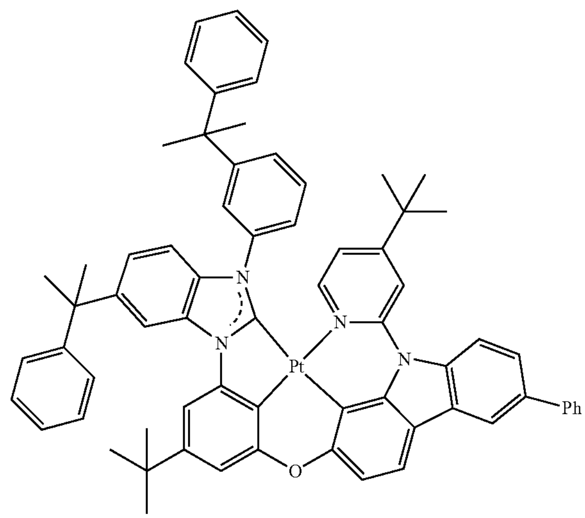
2267
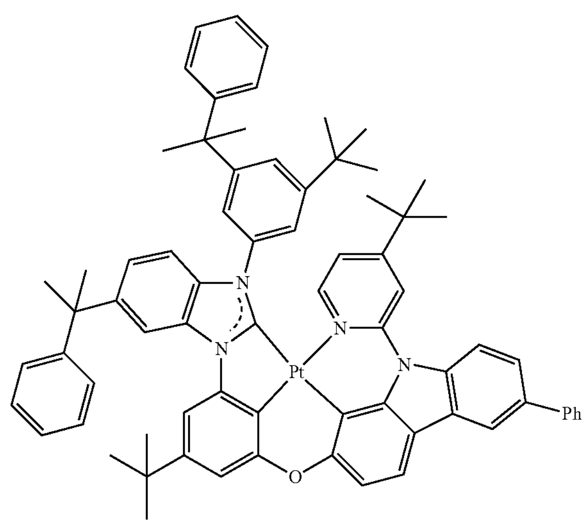

-continued
2268
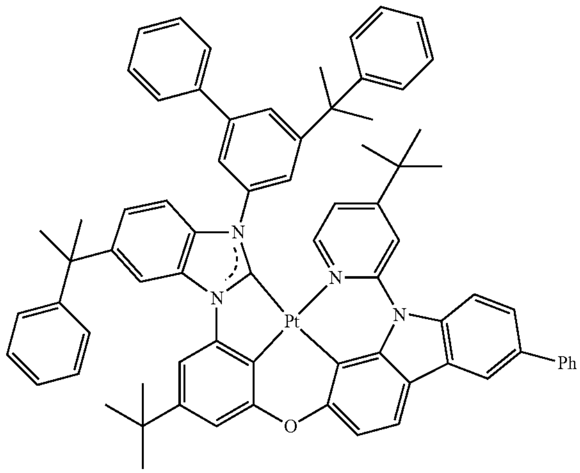
2269
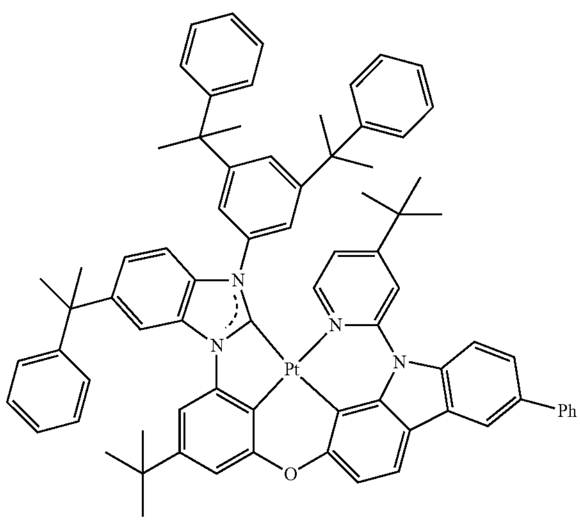
2270
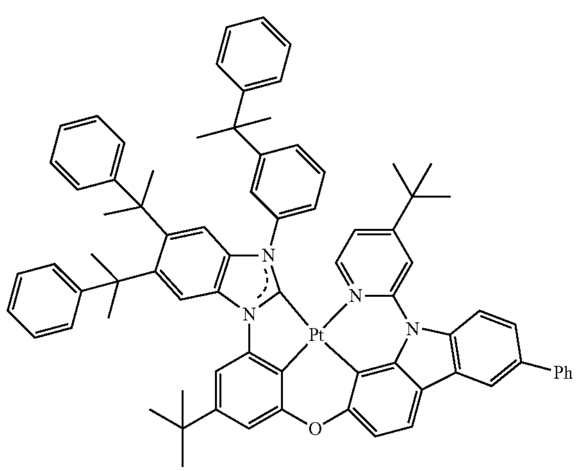
-continued
2271
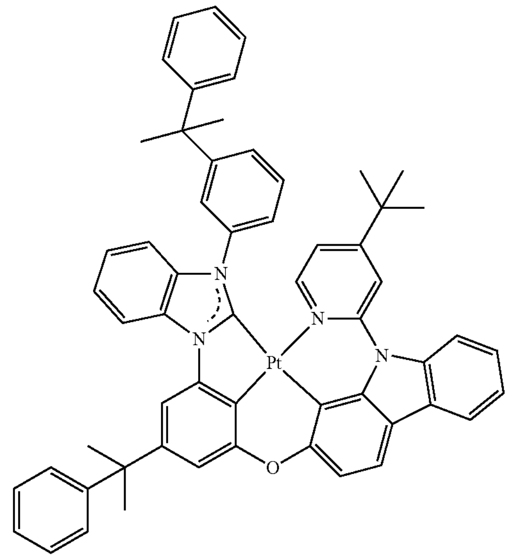
2272
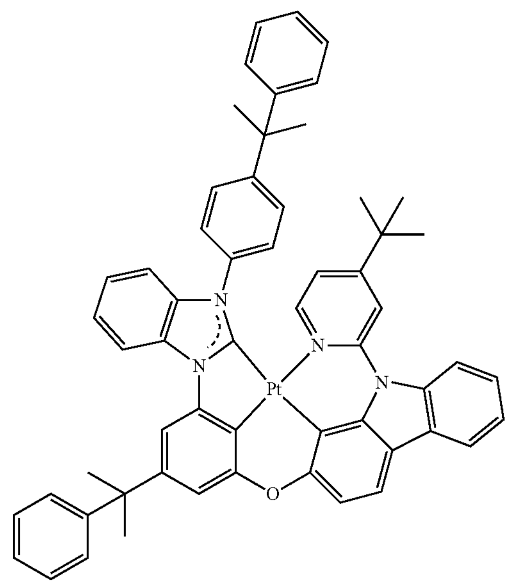
2273
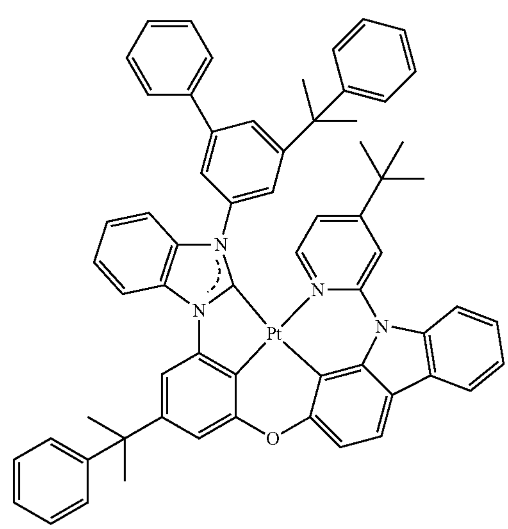

-continued
2274
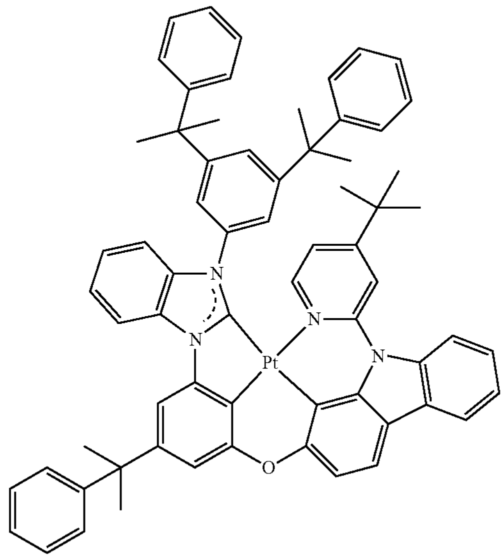
2275
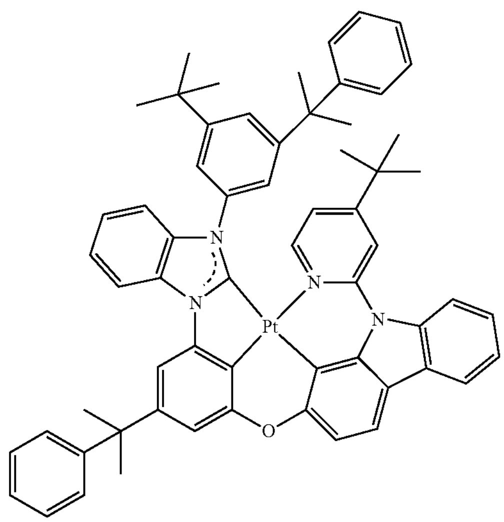
2276
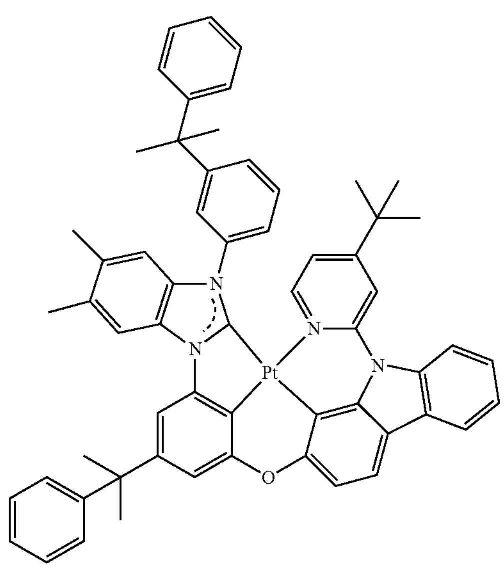
-continued
2277
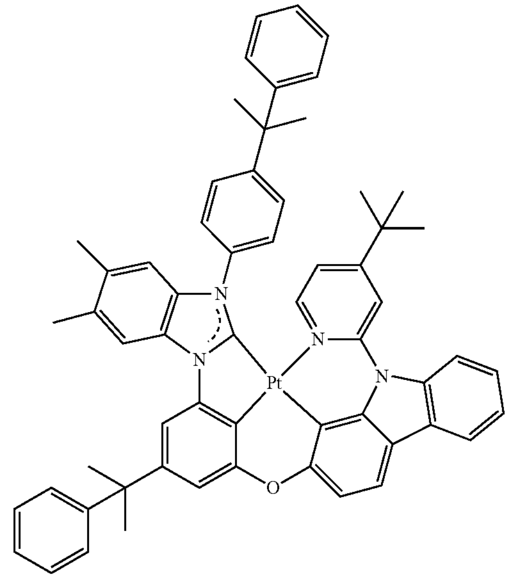
2278
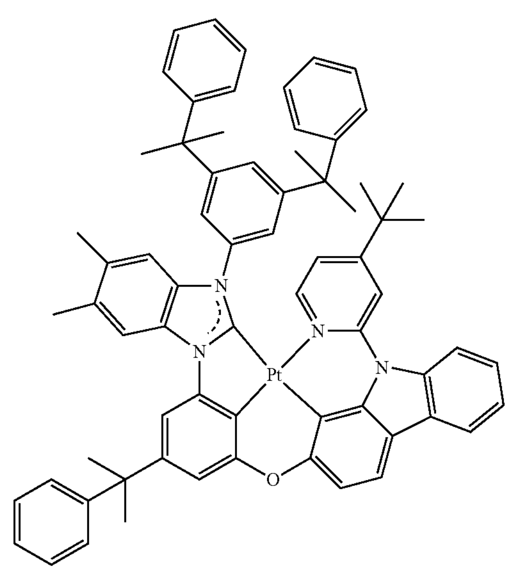

-continued
2279
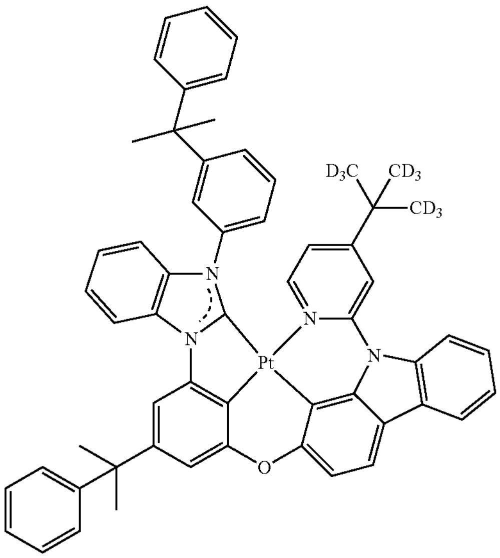
2280
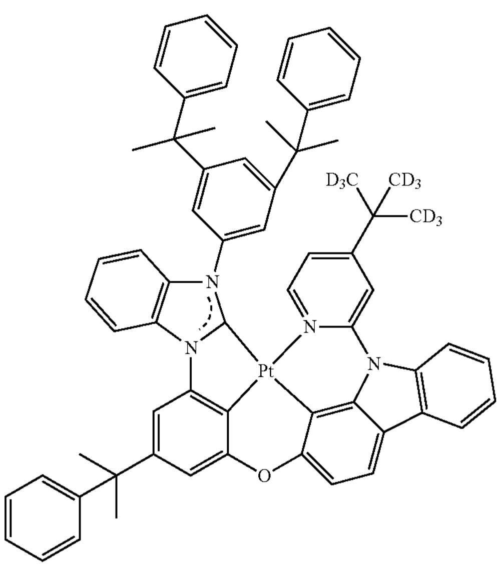
-continued
2281
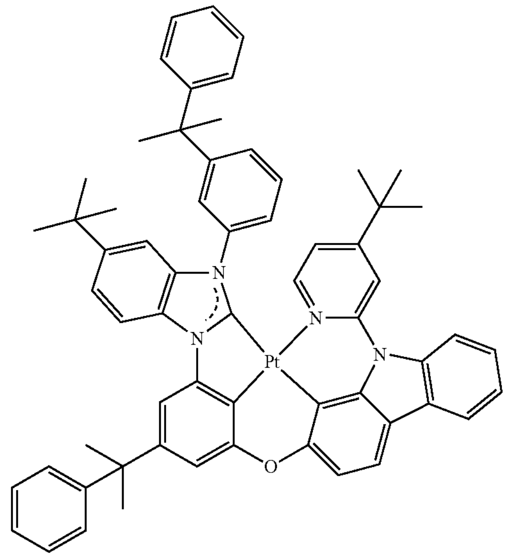
2282
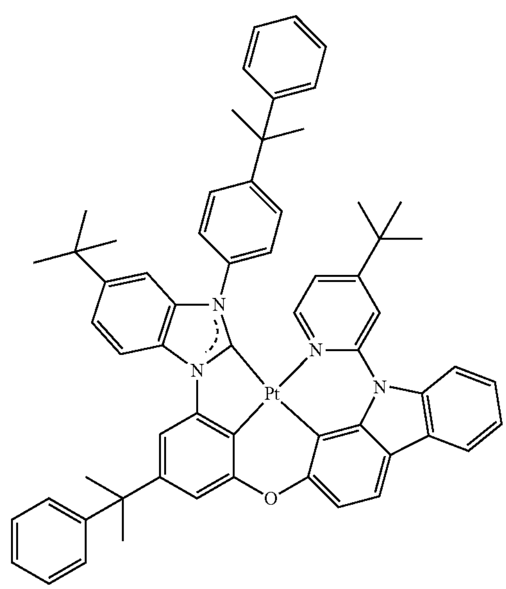

-continued
2283
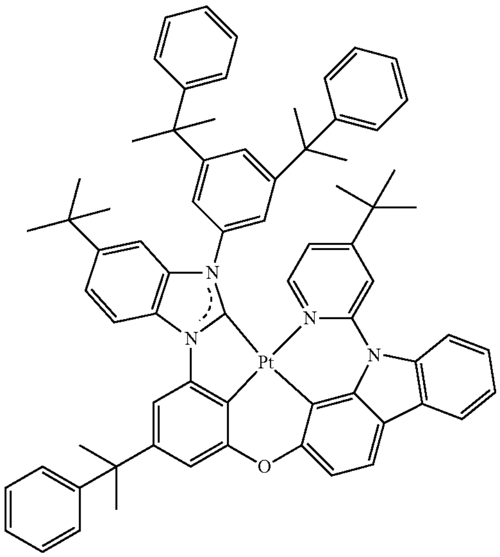
2284
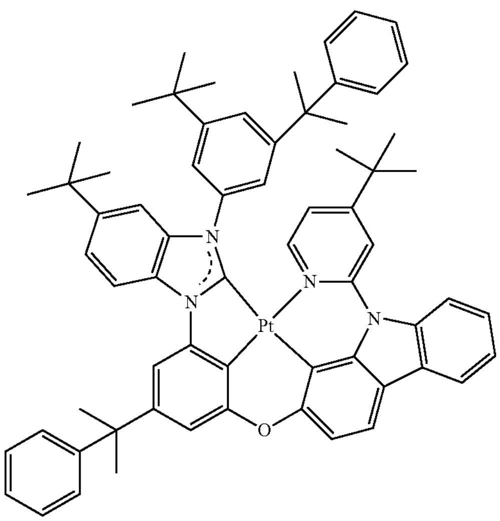
2285
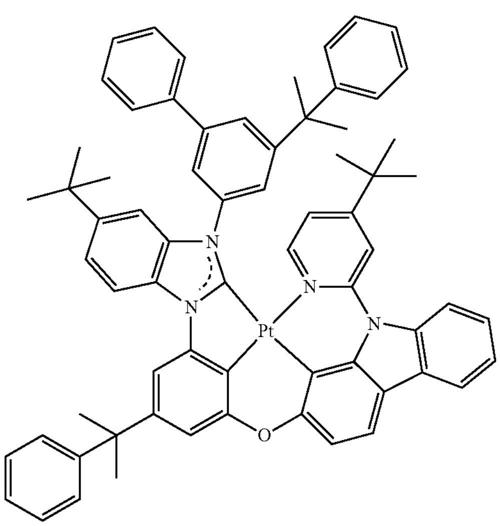
-continued
2286
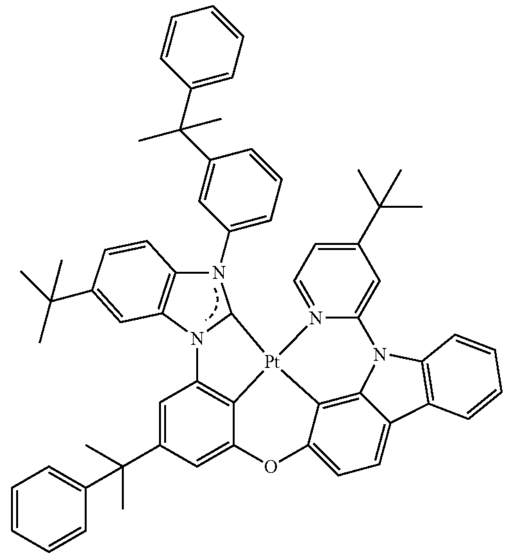
2287
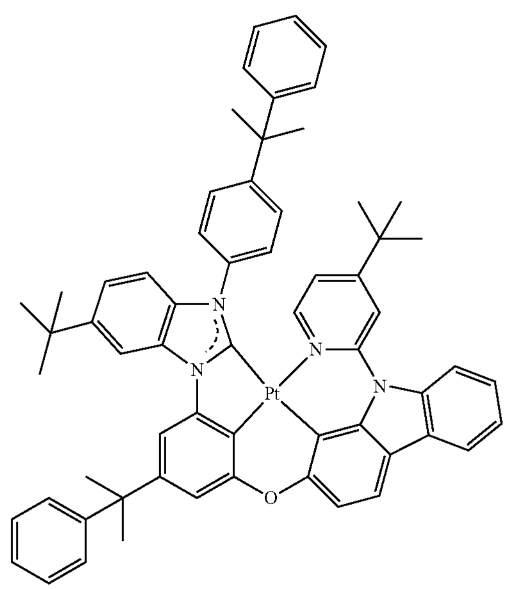

-continued
2288
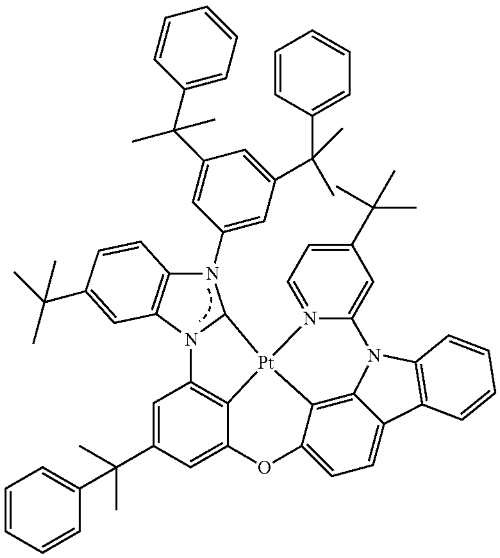
2289
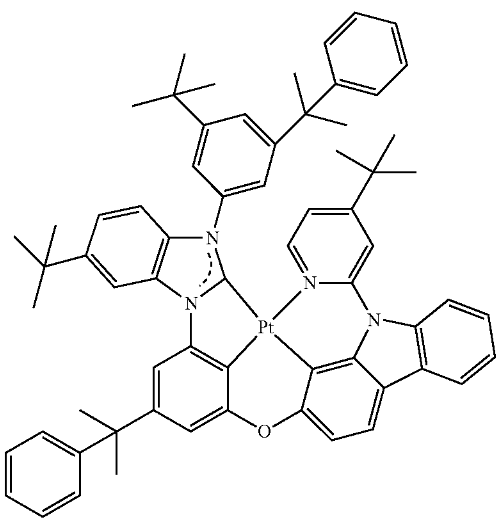
2290
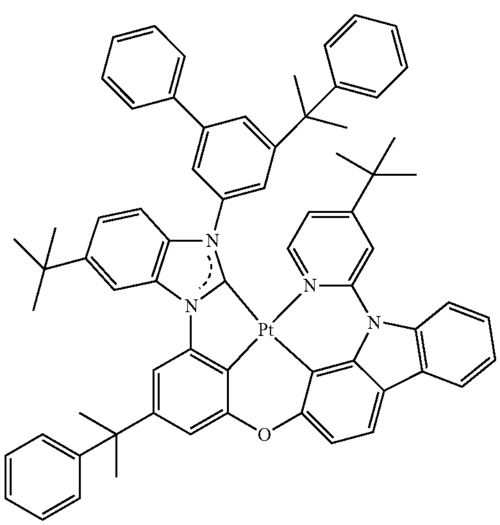
-continued
2291
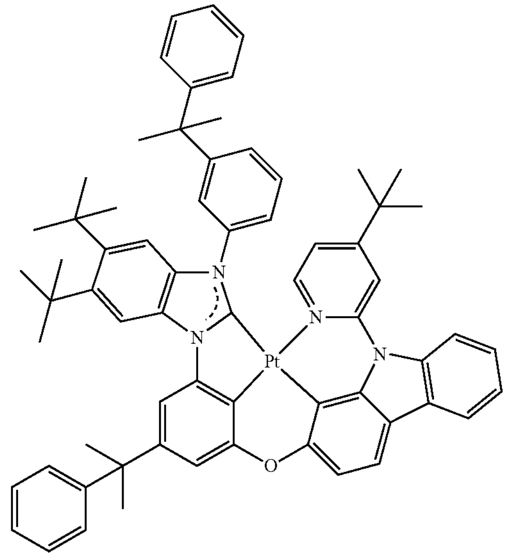
2292
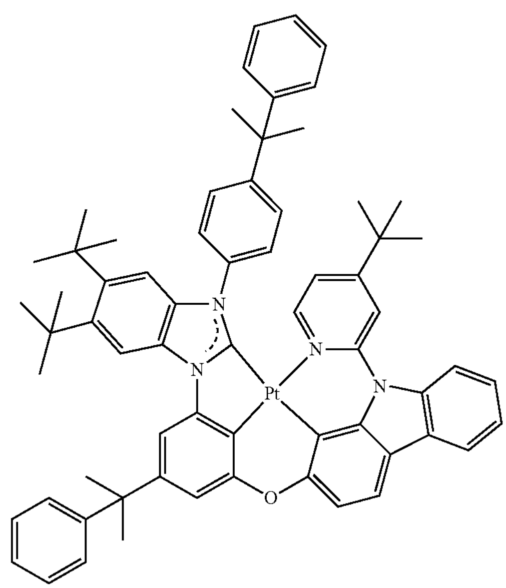

2293
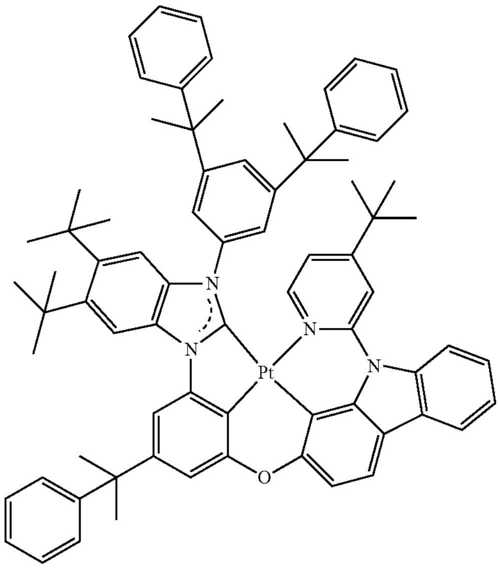
2294
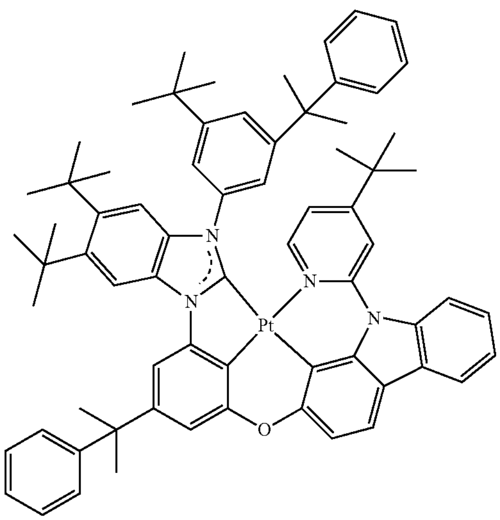
2295
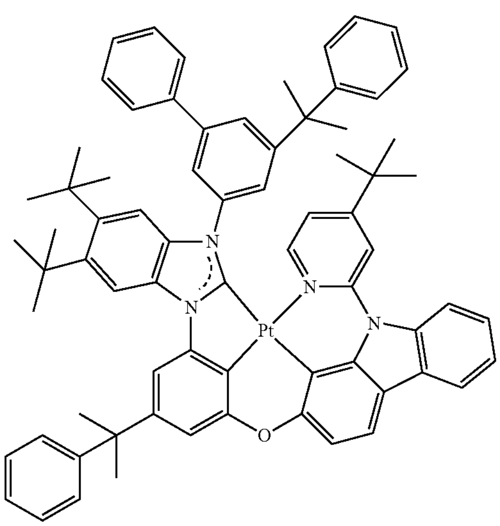
2296
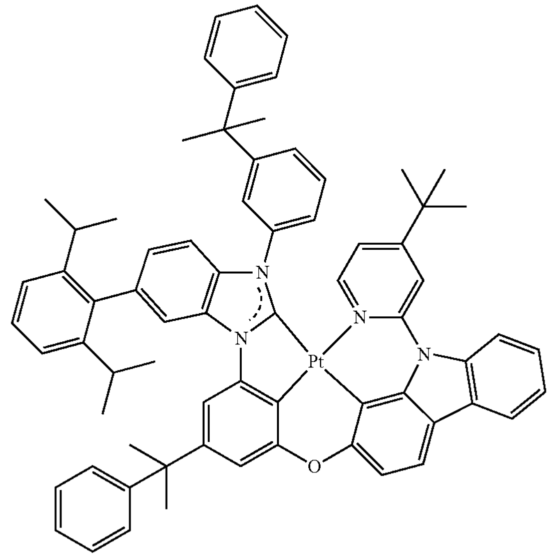
2297
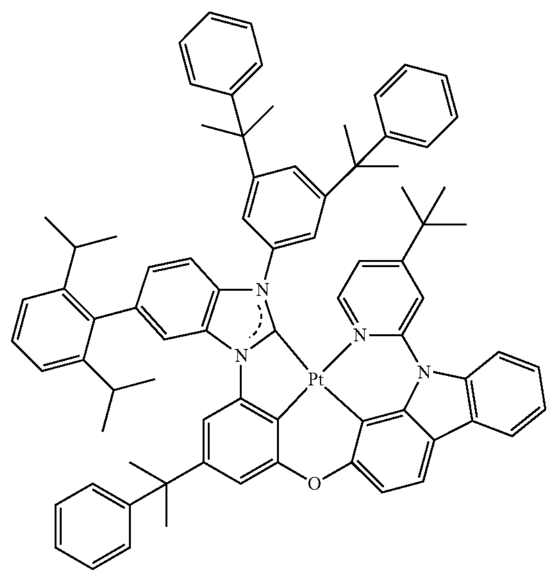

-continued
2298
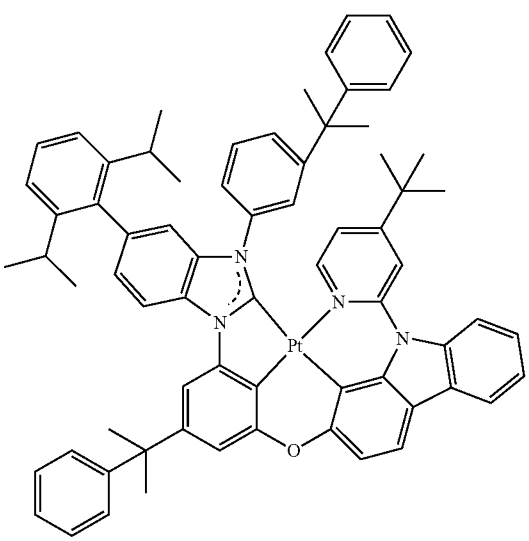
2299
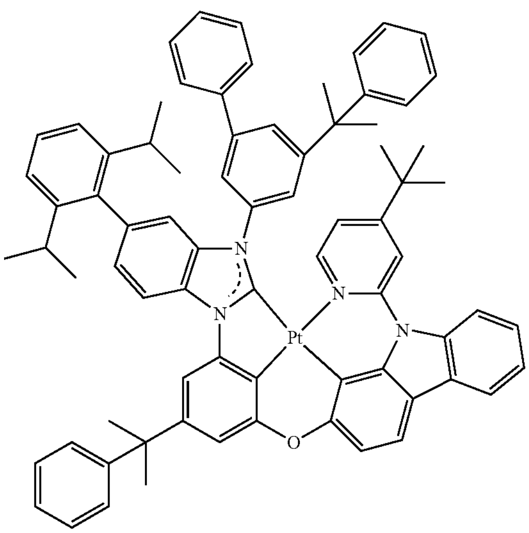
2300
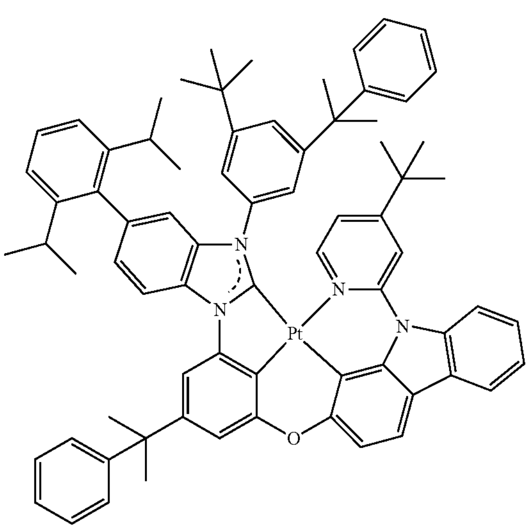
-continued
2301
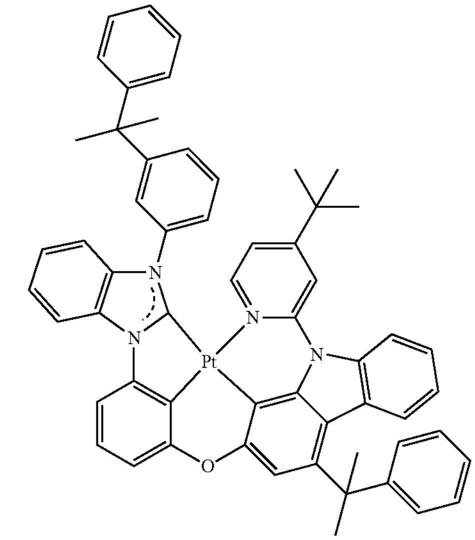
2302
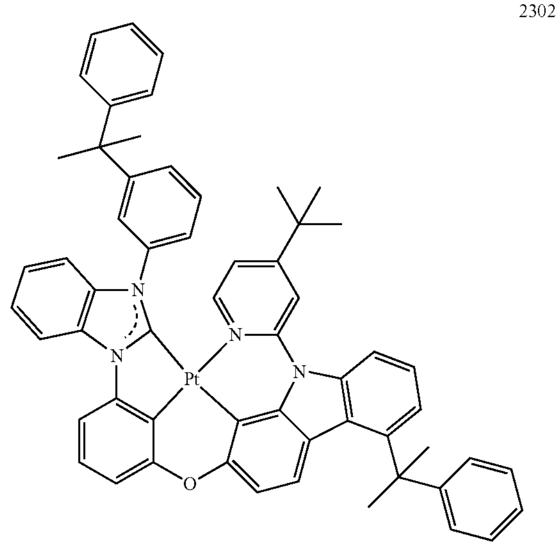
2303
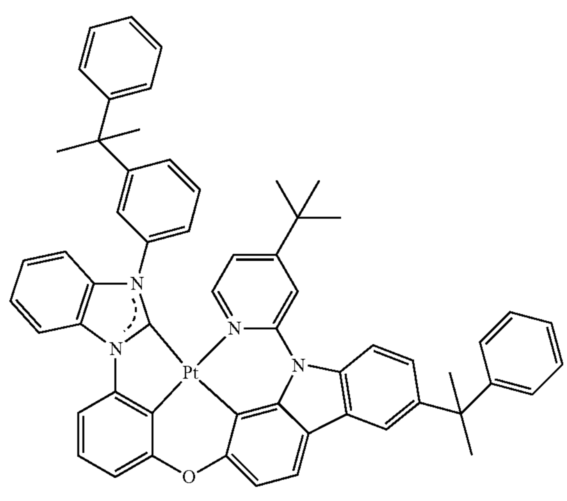

-continued
2304
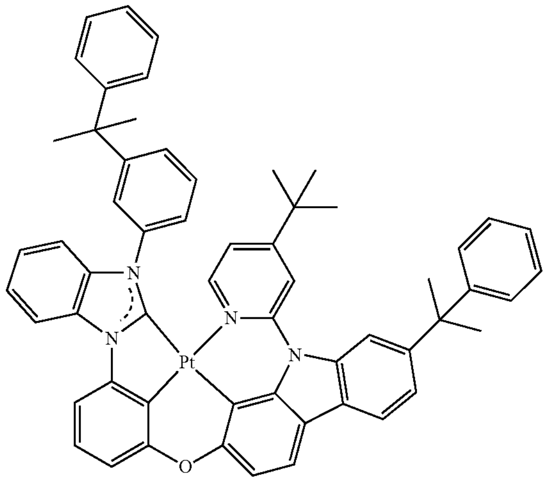
2305
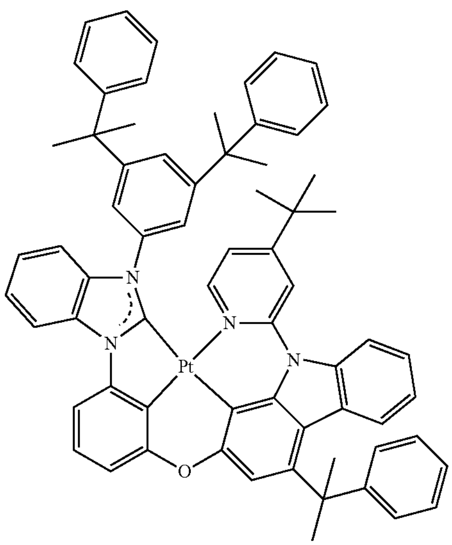
2306
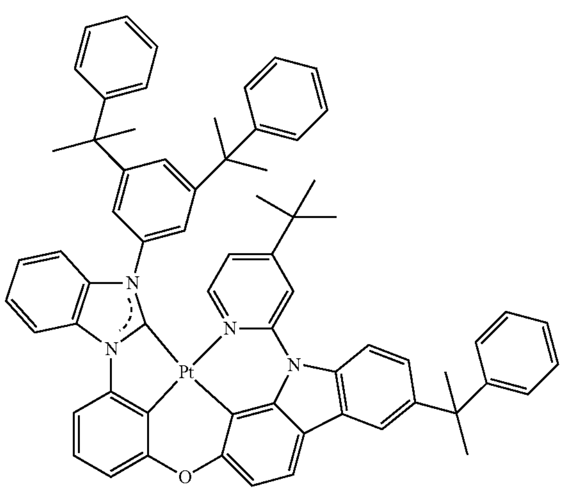
-continued
2307
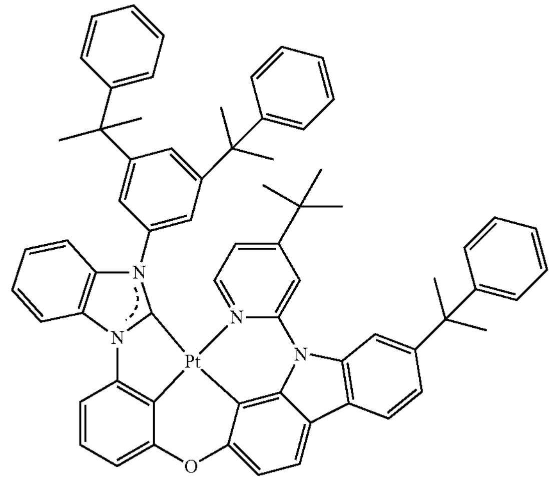
2308
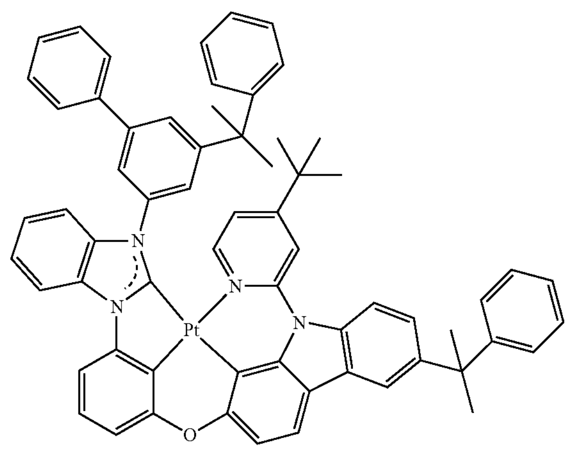
2309
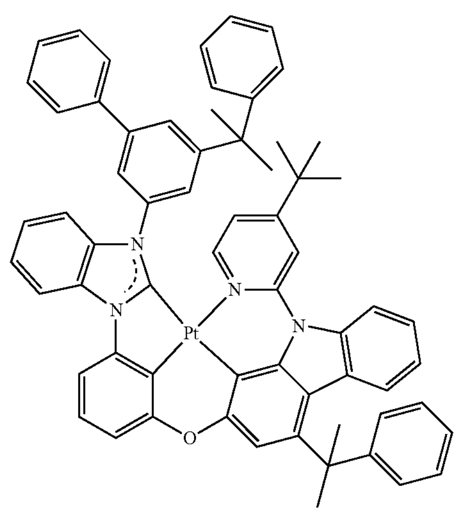

2310
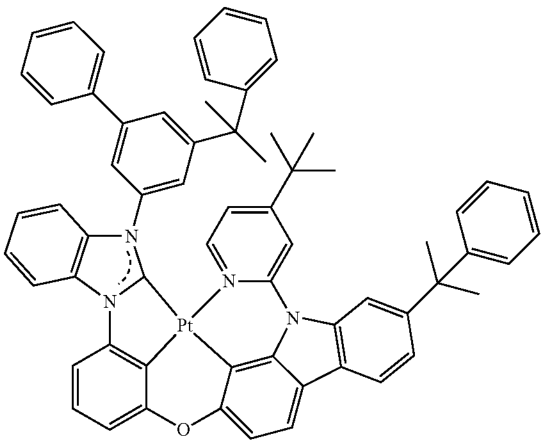
2311
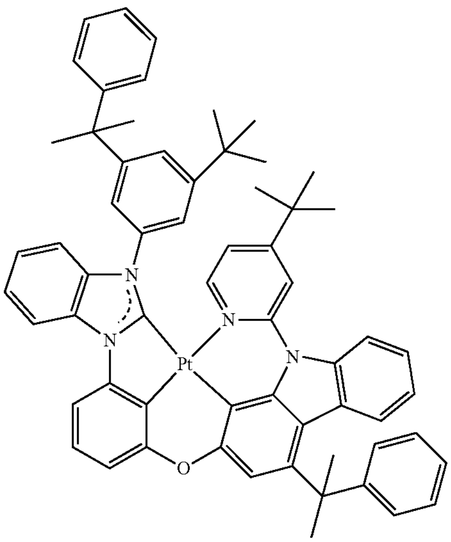
2312
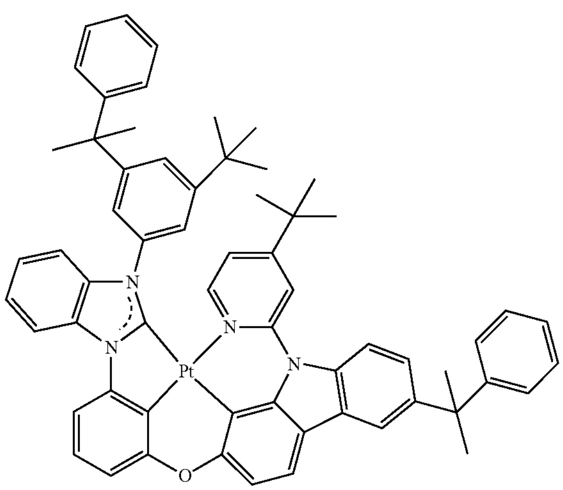
2313
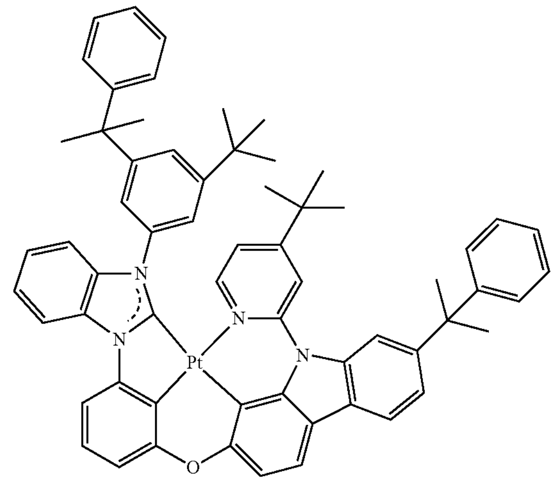
2314
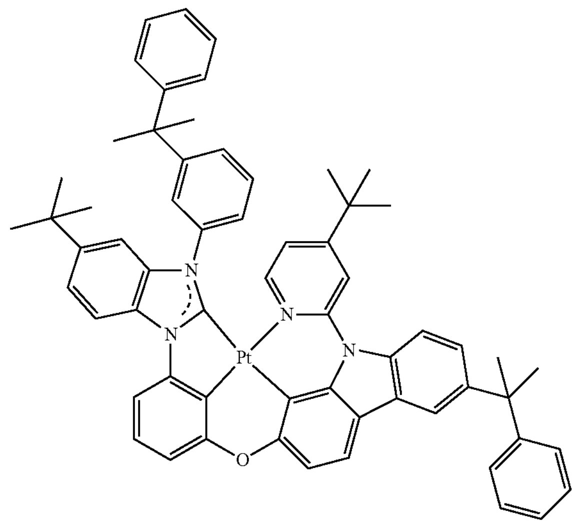
2315
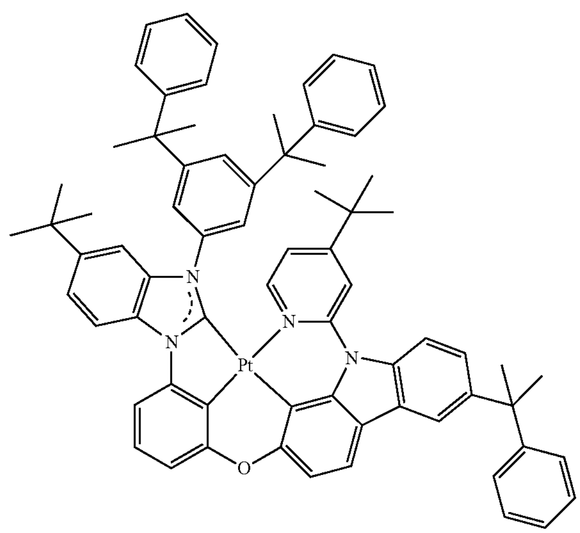

-continued
2316
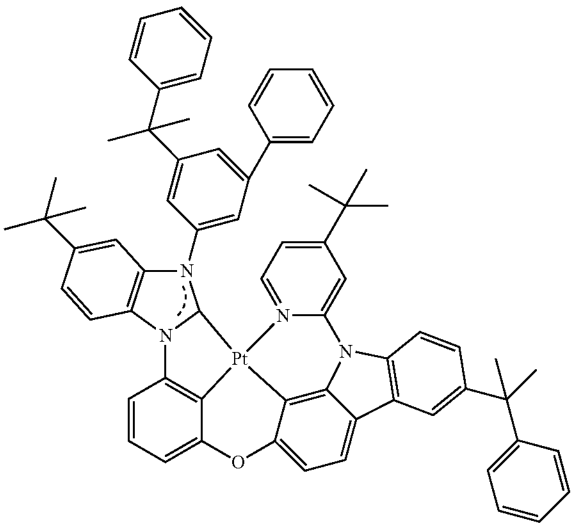
2317
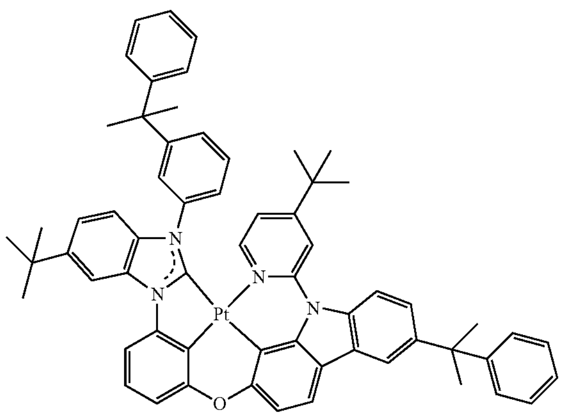
2318
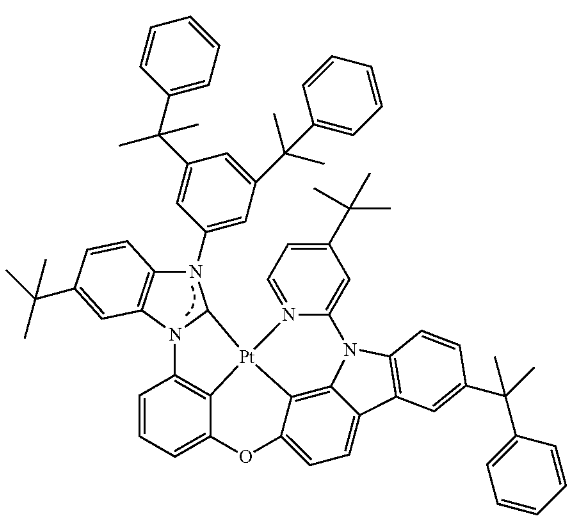
-continued
2319
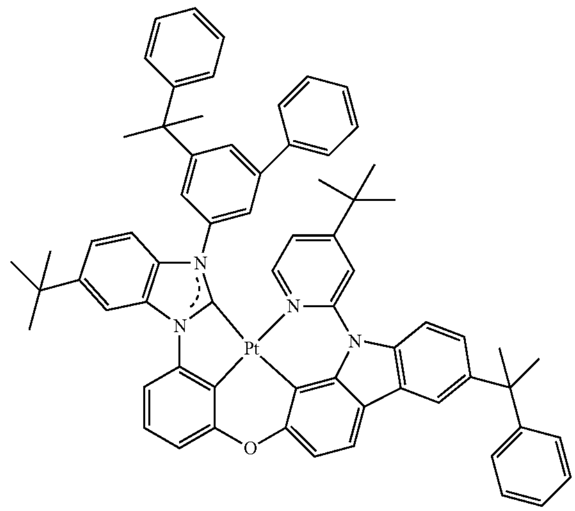
2320
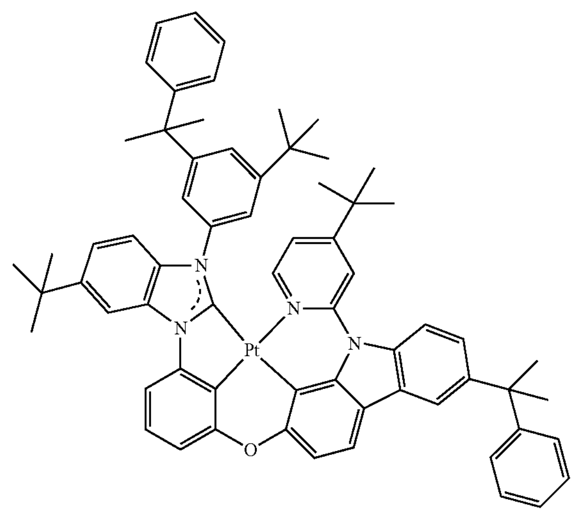
2321
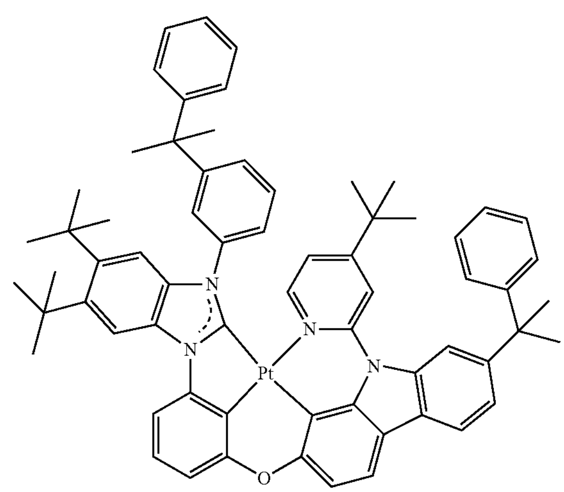

-continued
2322
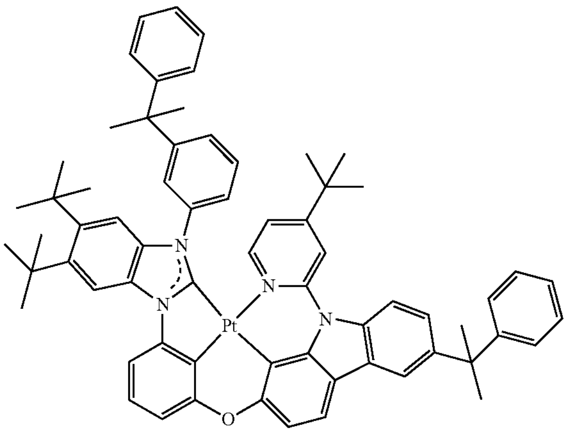
2323
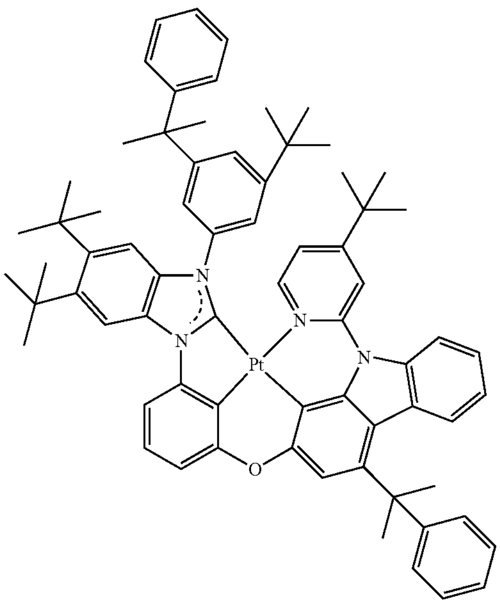
2324
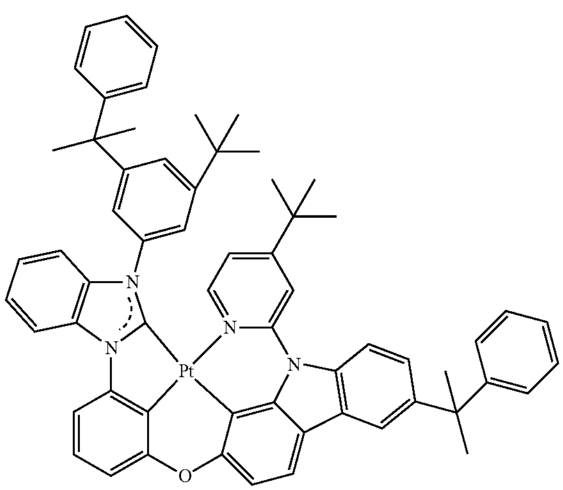
-continued
2325
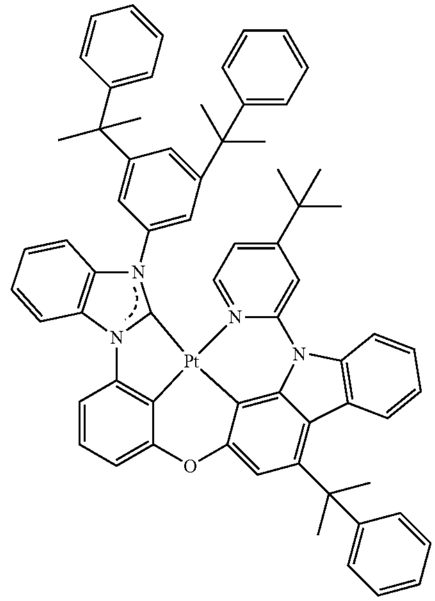
2326
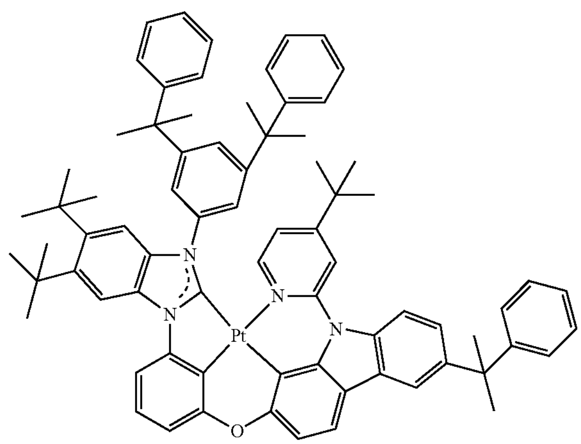
2327
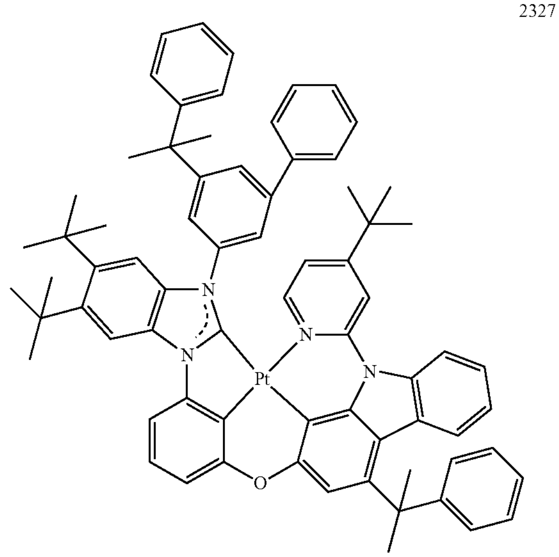

2328
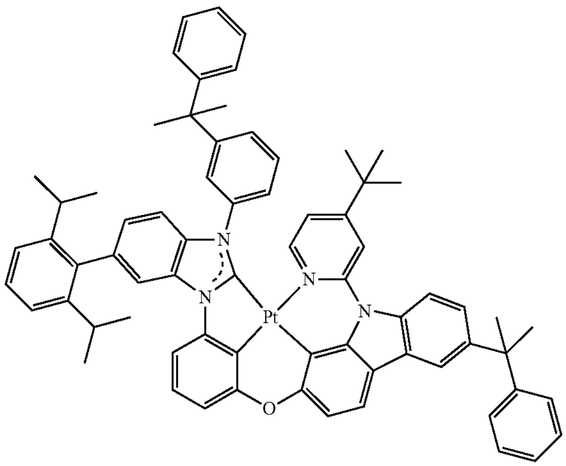
2329
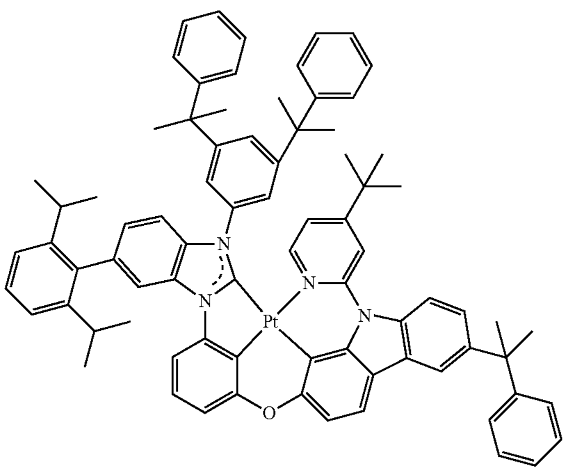
2330
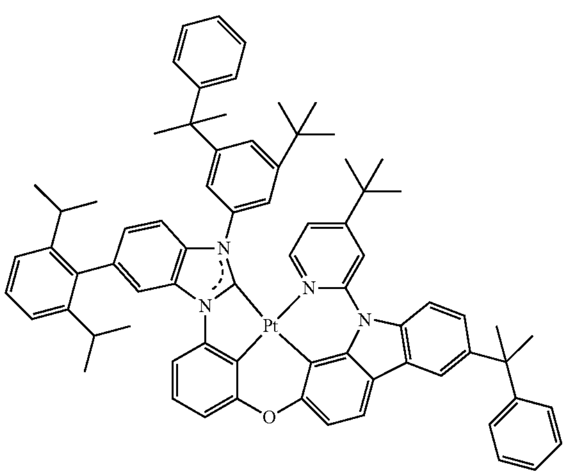
2331
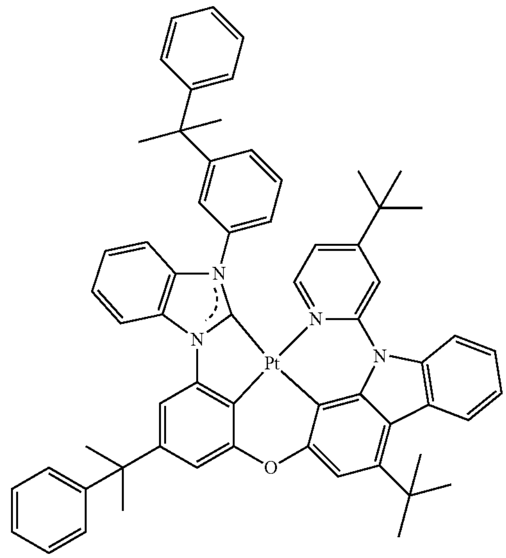
2332
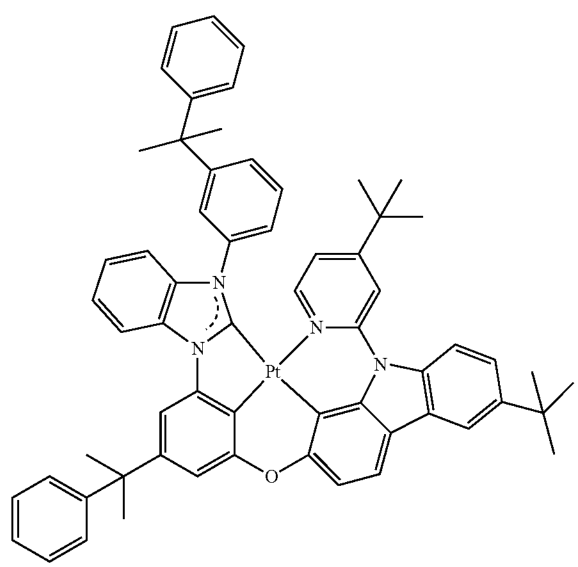

2333
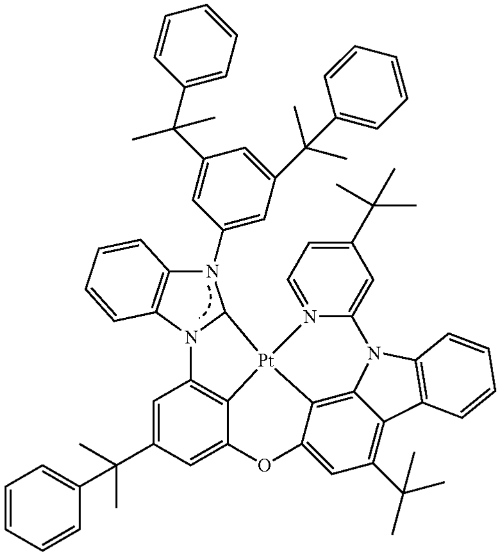
2334
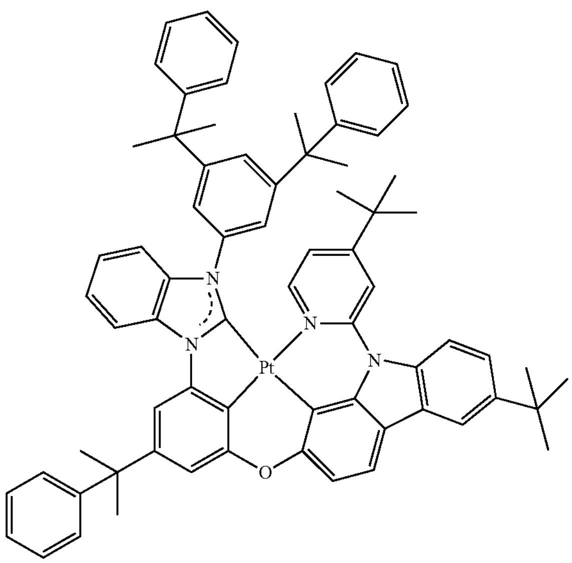
2335
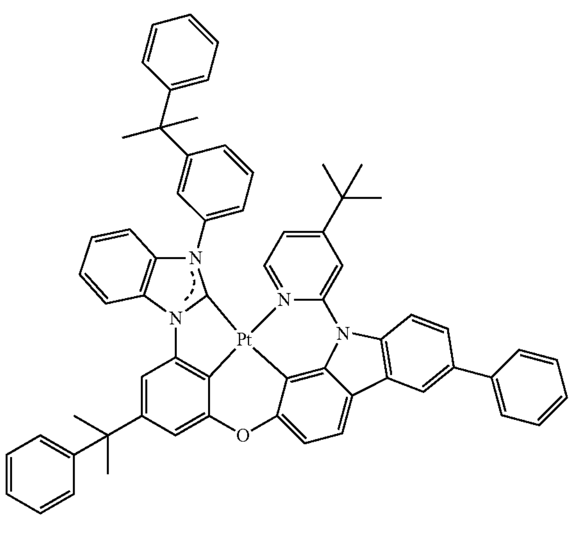
2336
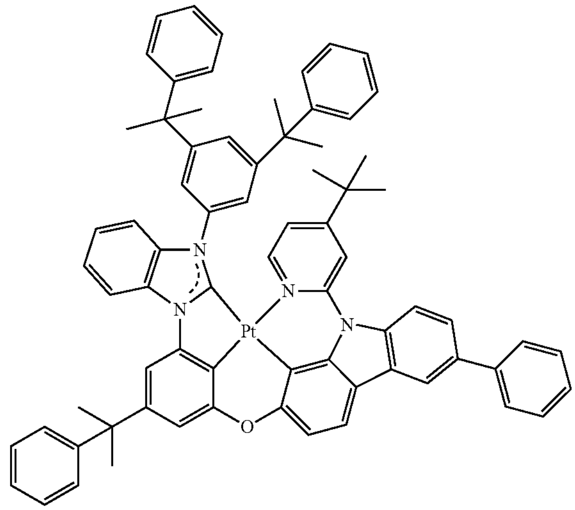
2337
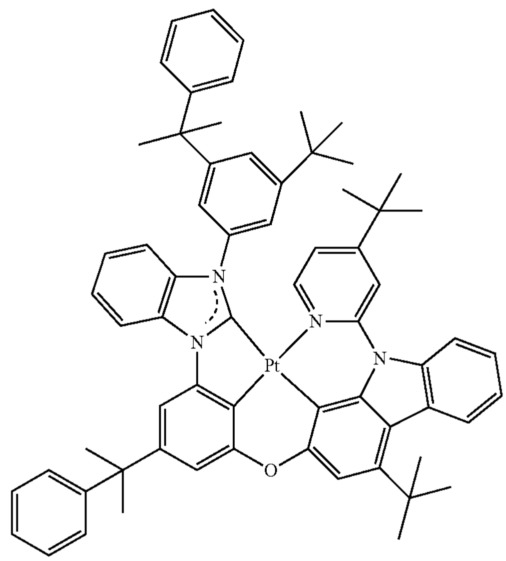
2338
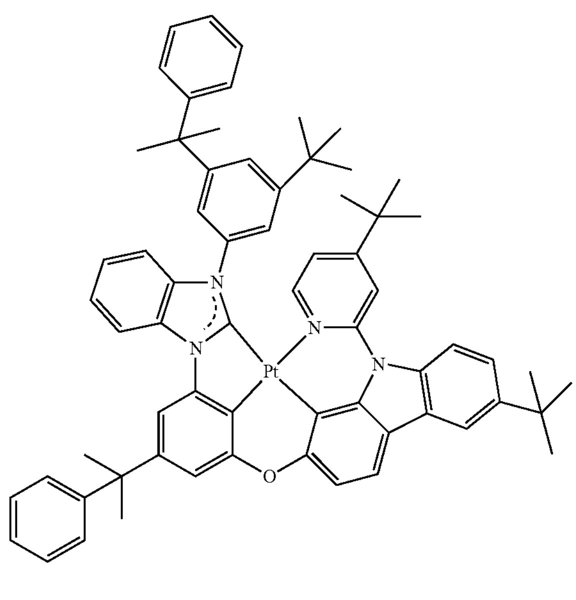

-continued
2339
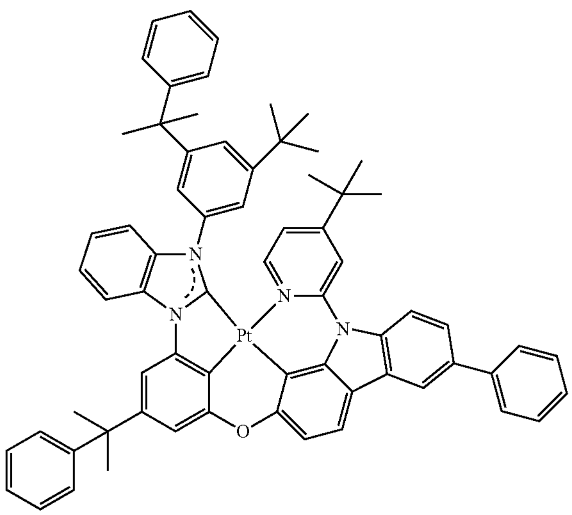
2340
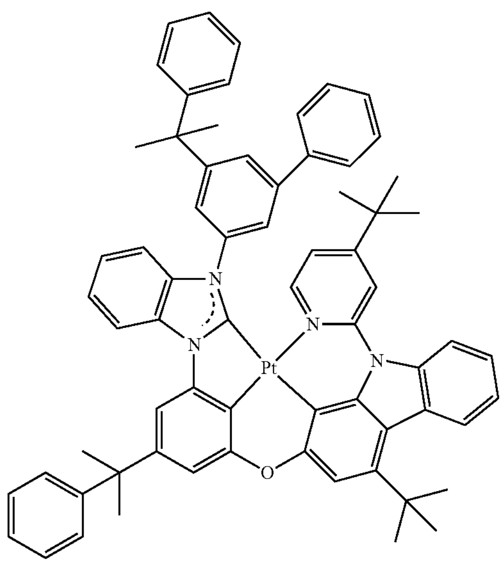
2341
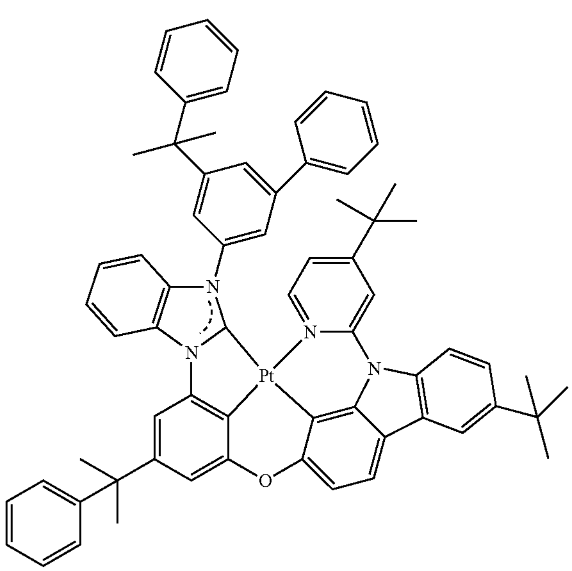
-continued
2342
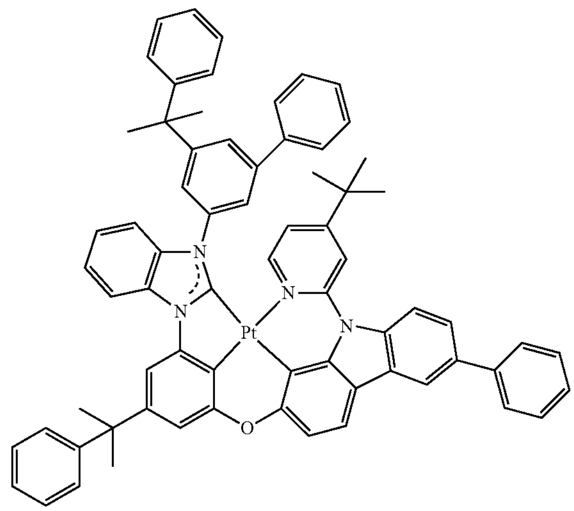
2343
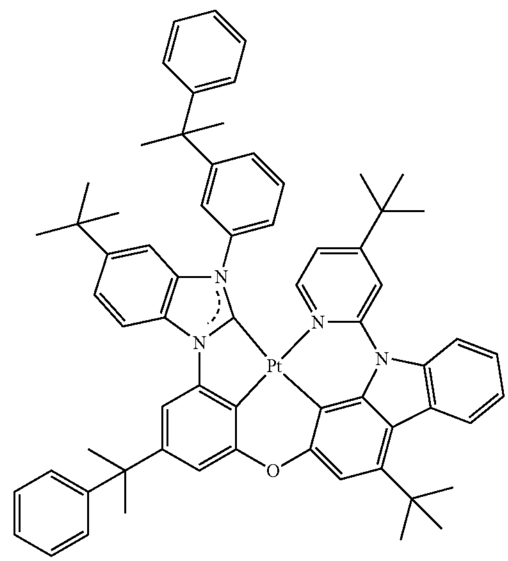
2344
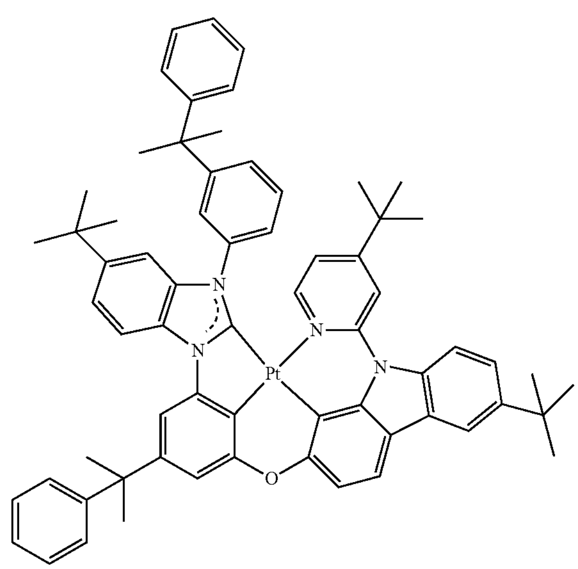

2345
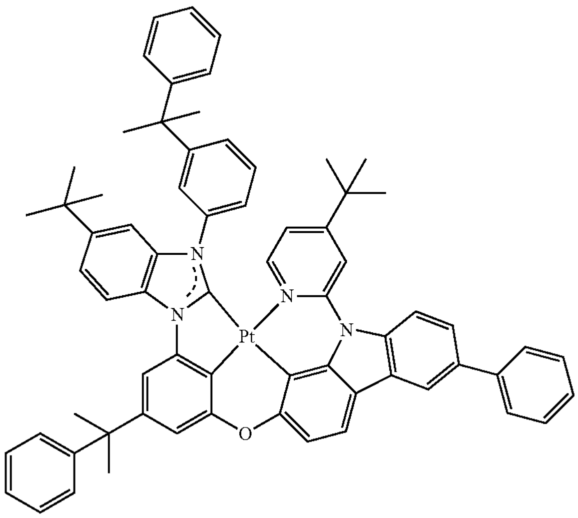
2346
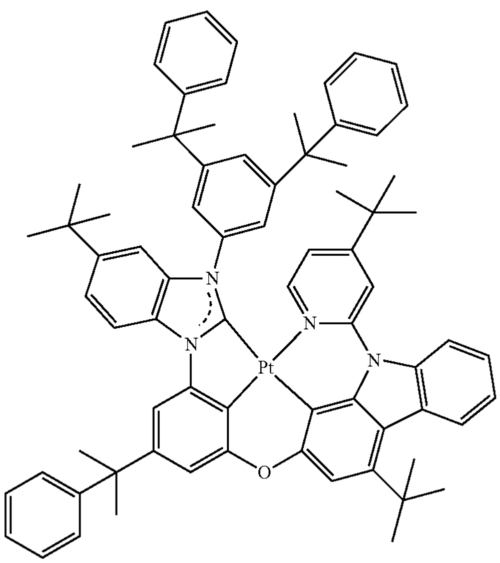
2347
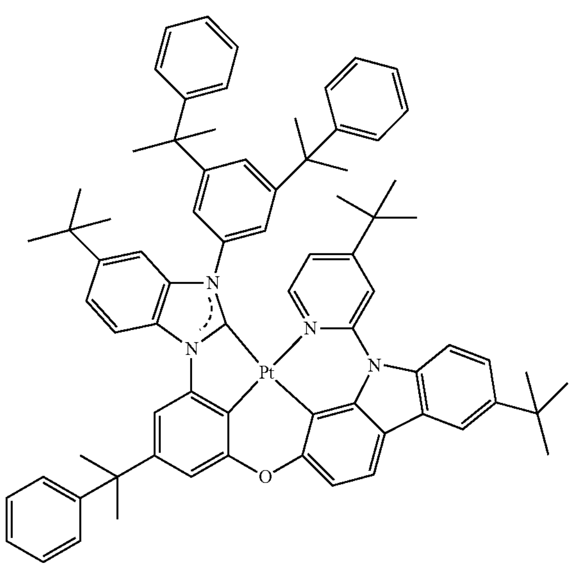
2348
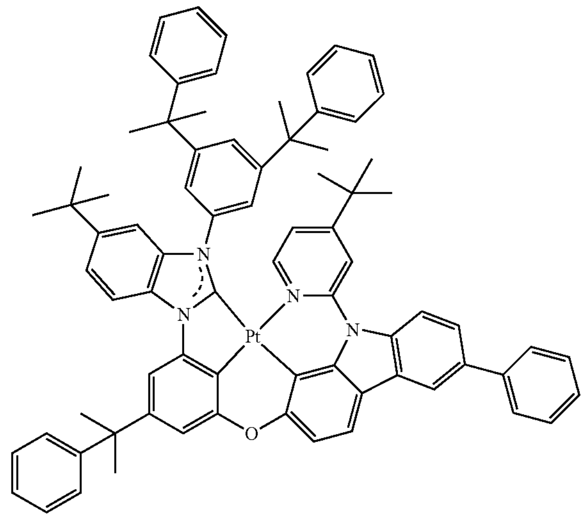
2349
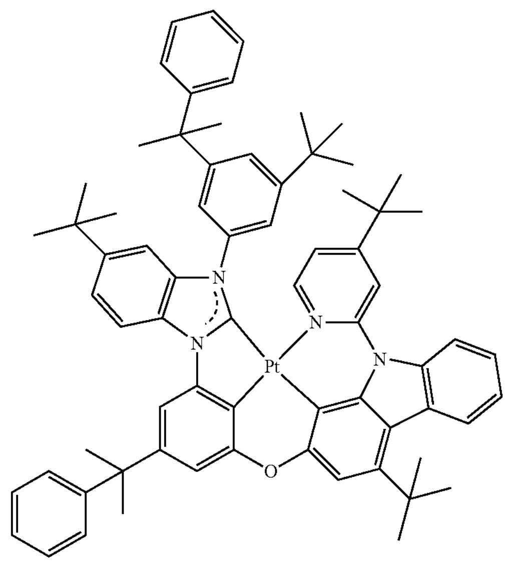
2350
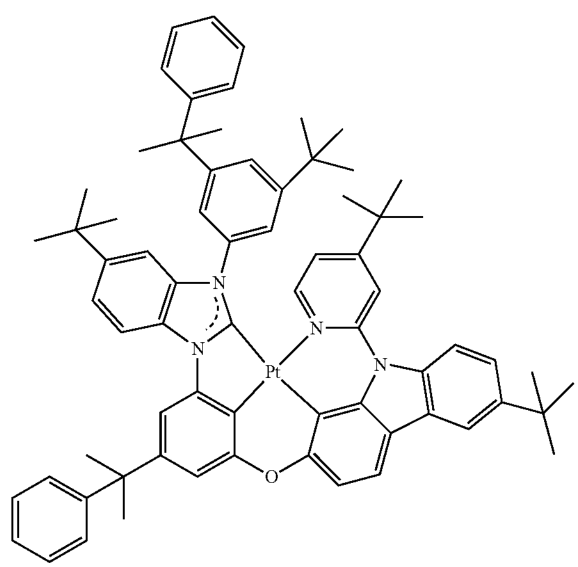

-continued
2351
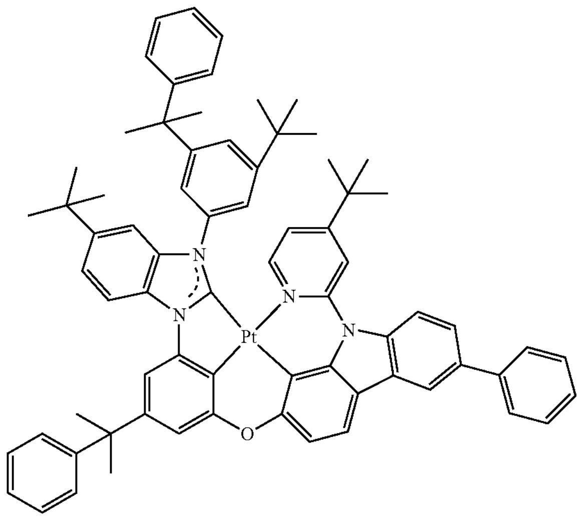
2352
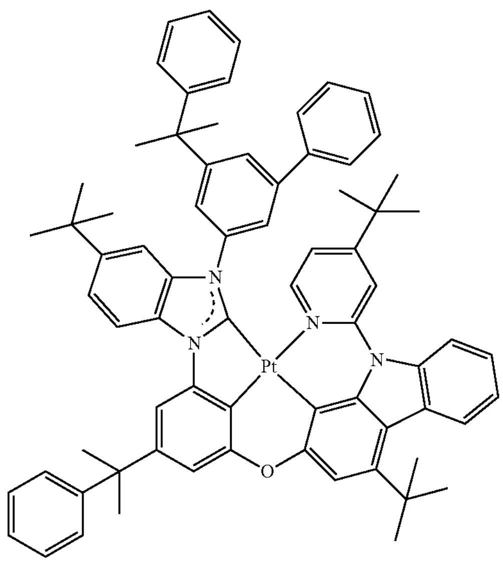
2353
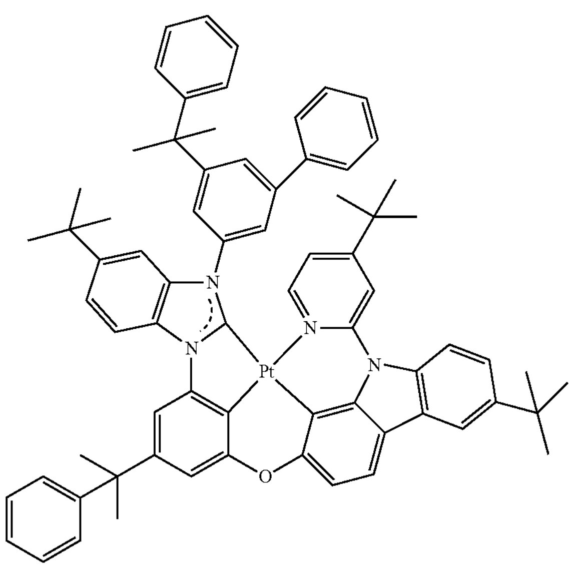
-continued
2354
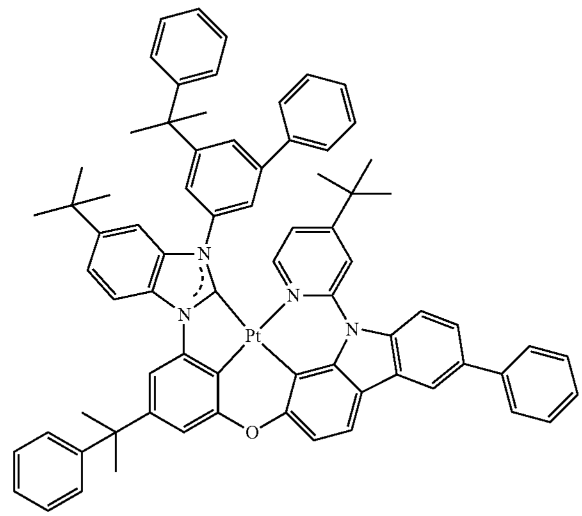
2355
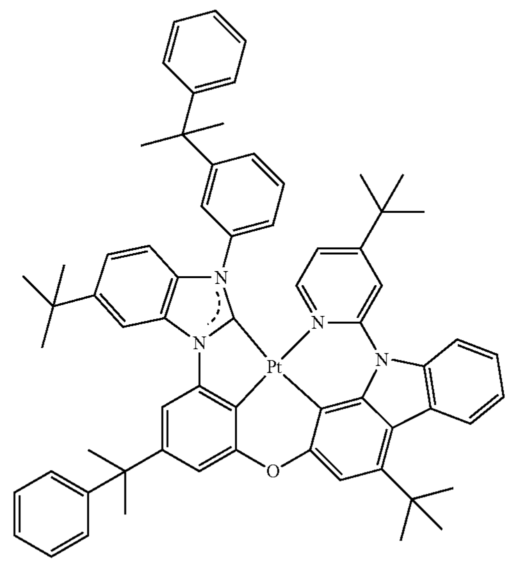
2356
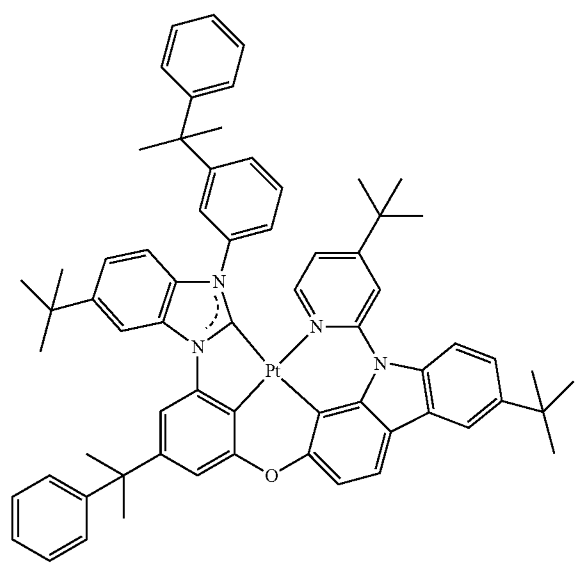

2357
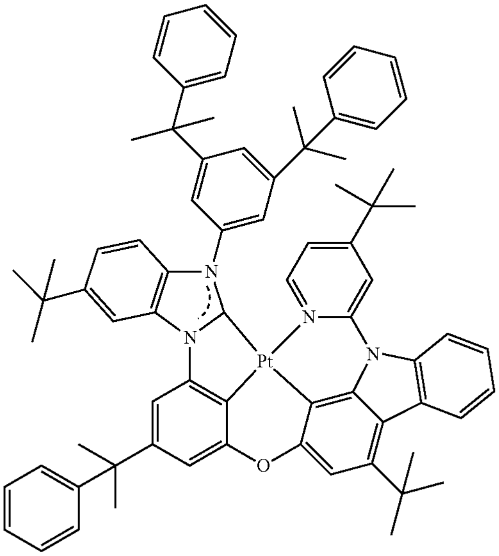
2358
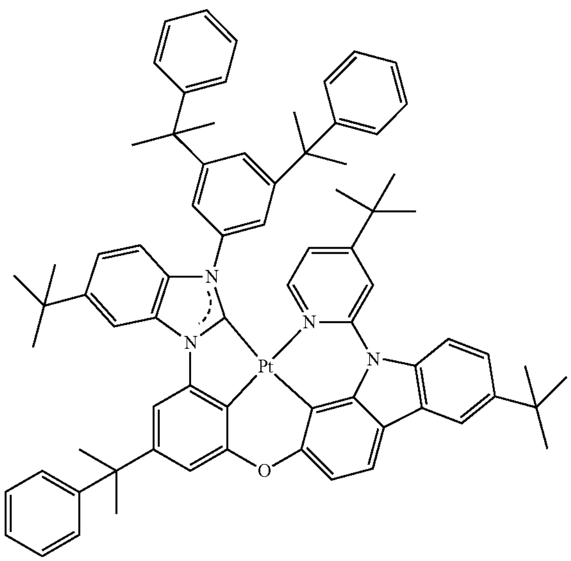
2359
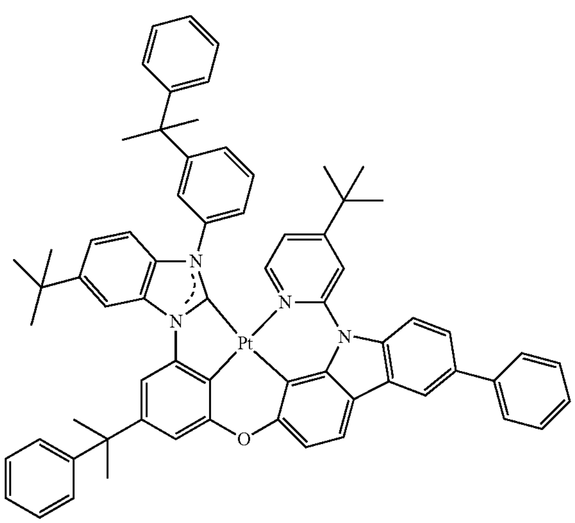
2360
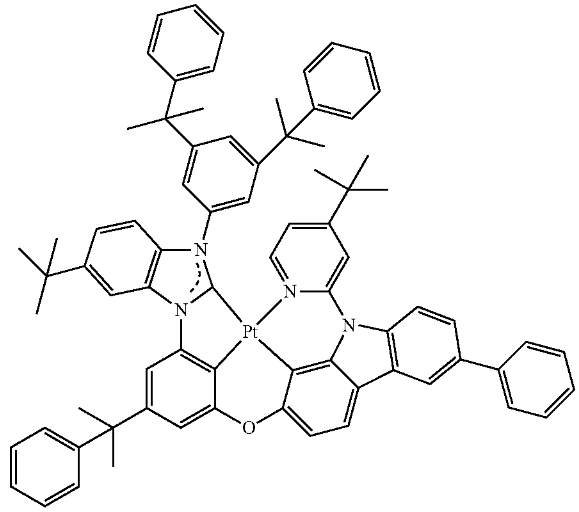
2361
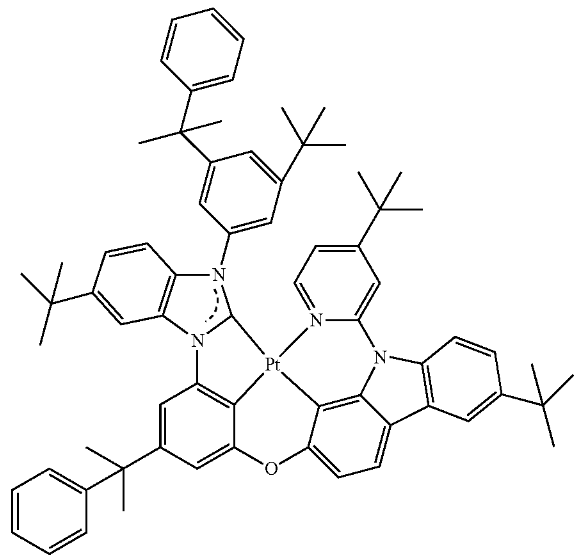
2362
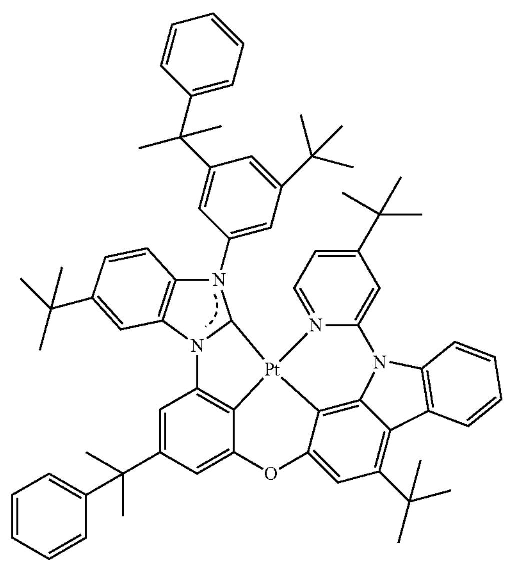

-continued
2363
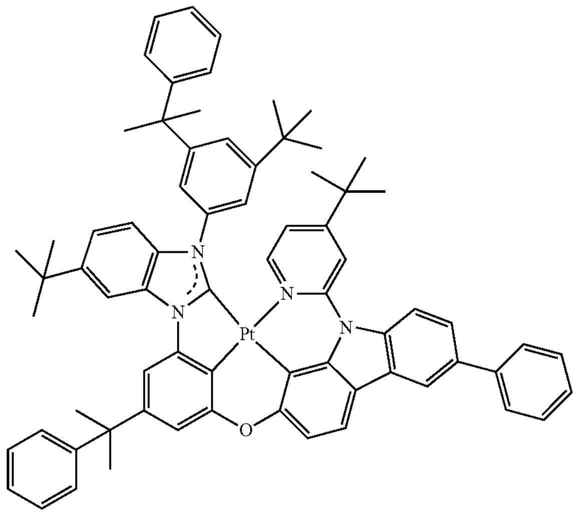
2364
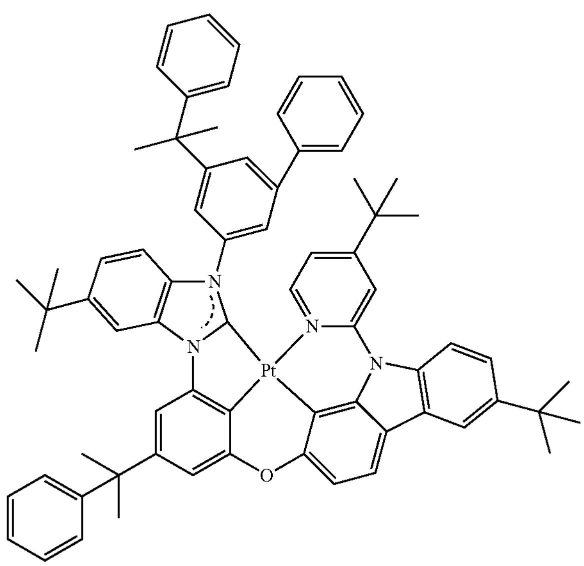
2365
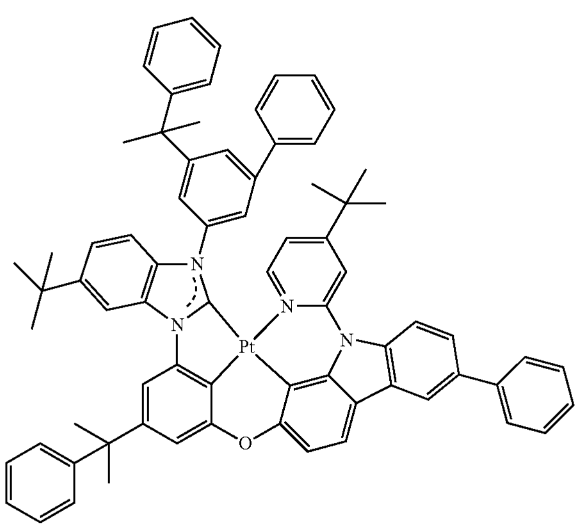
-continued
2366
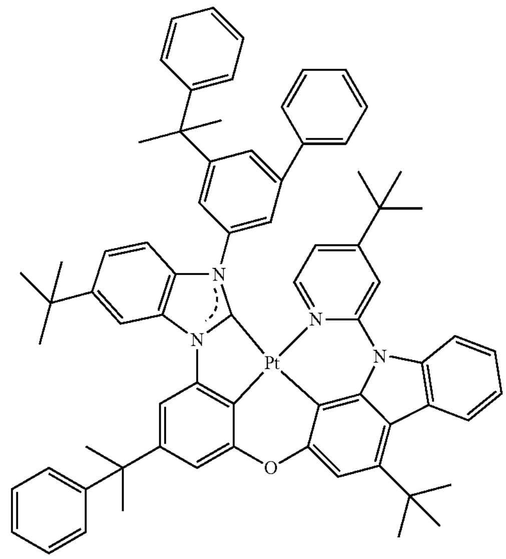
2367
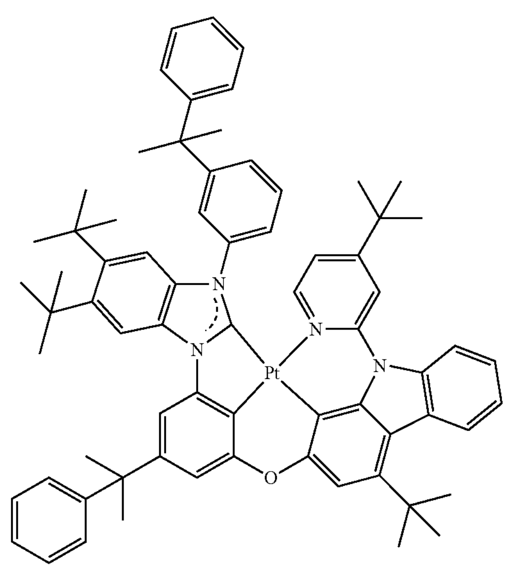

-continued
2368
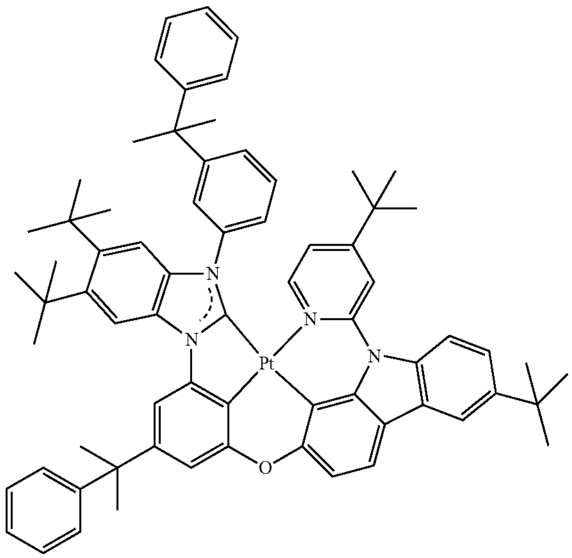
2369
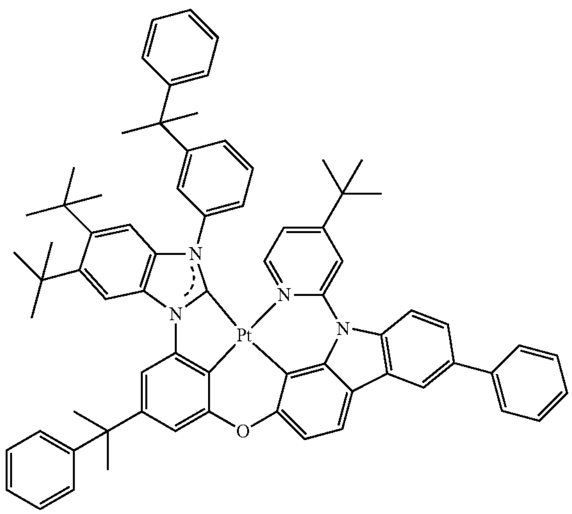
2370
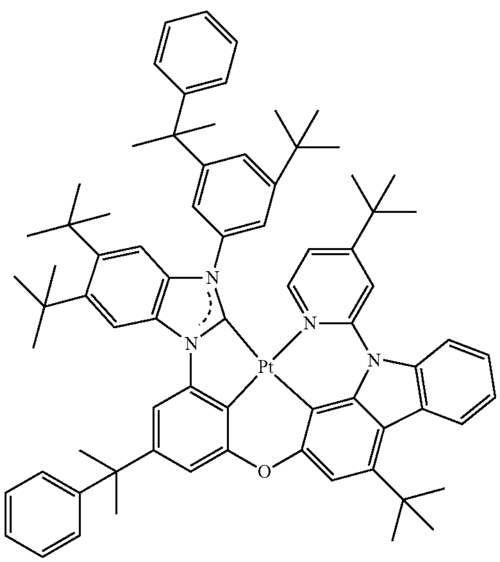
-continued
2371
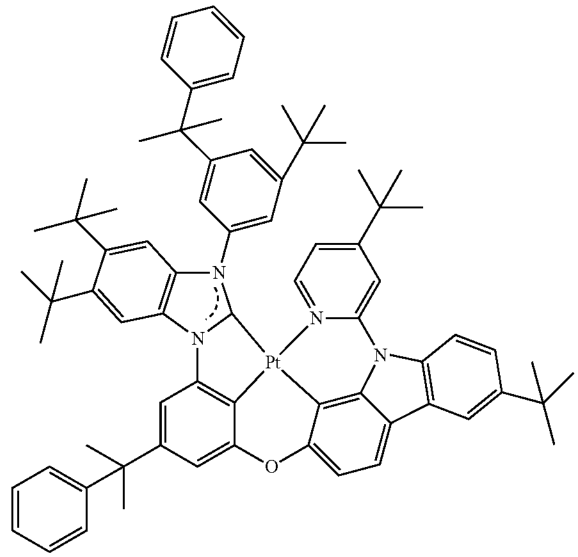
2372
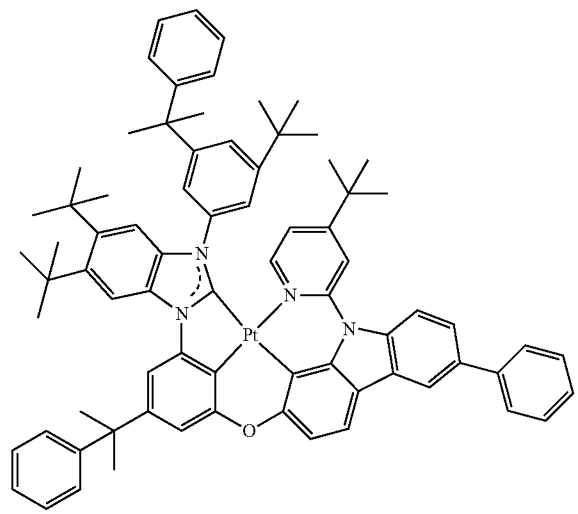
2373
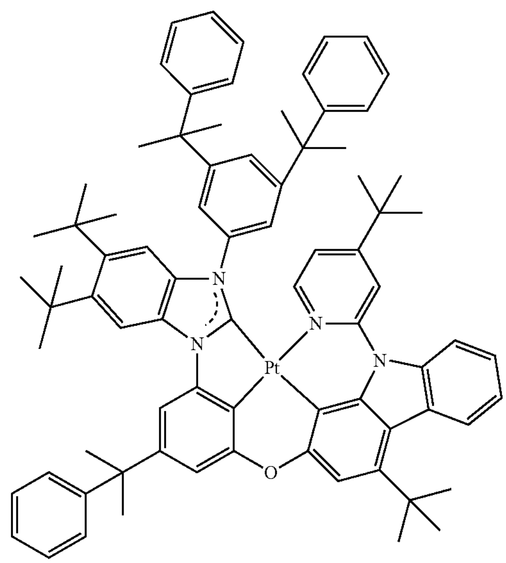

2374
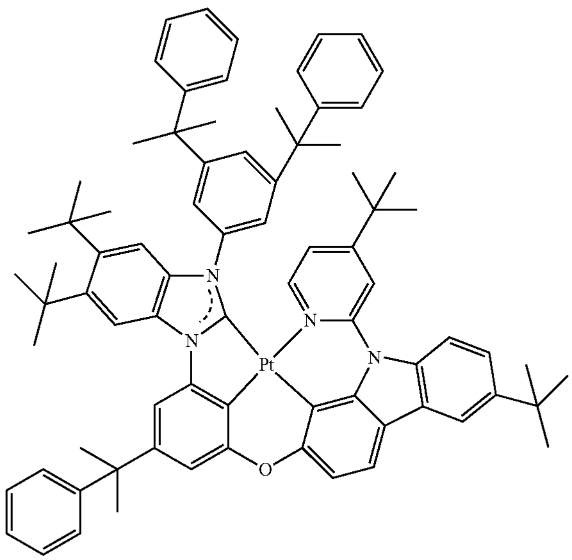
2375
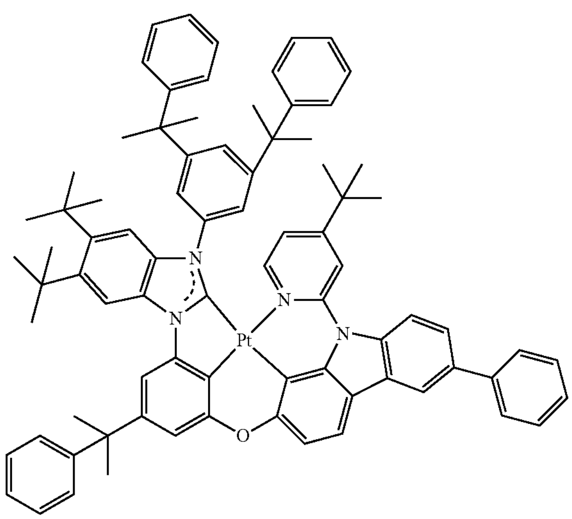
2376
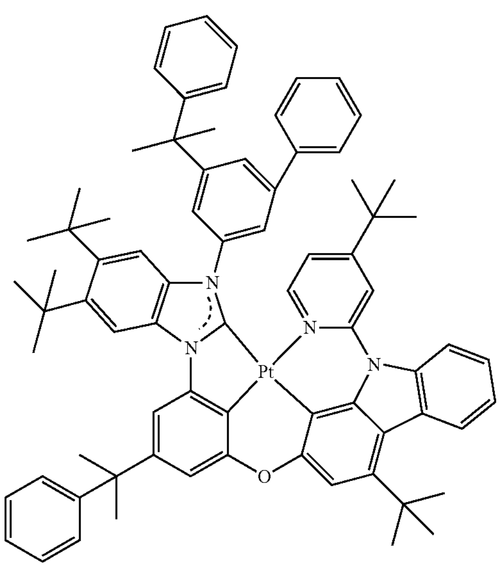
2377
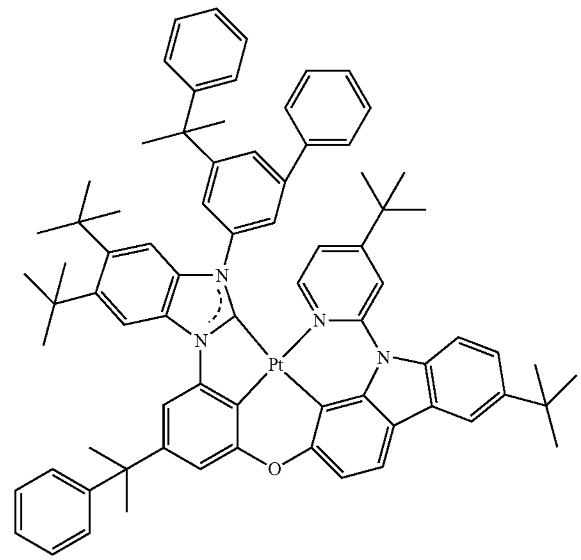
2378
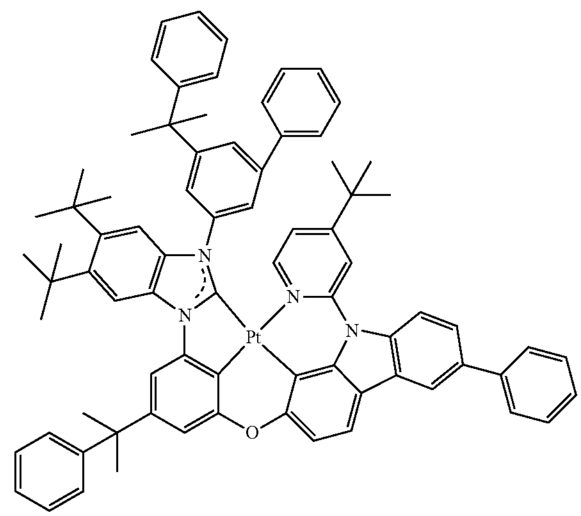
2379
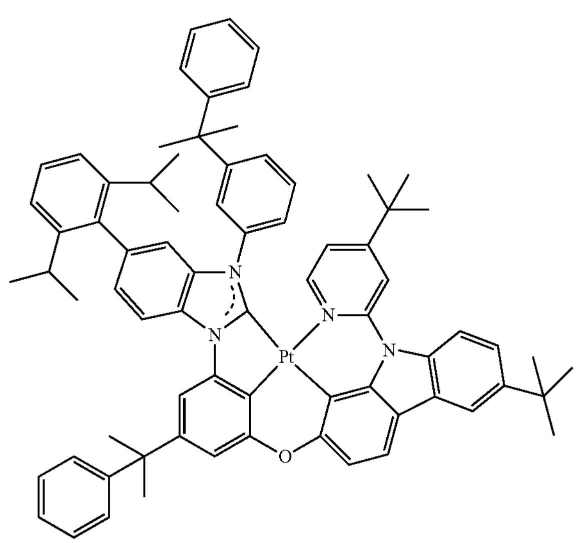

-continued
2380
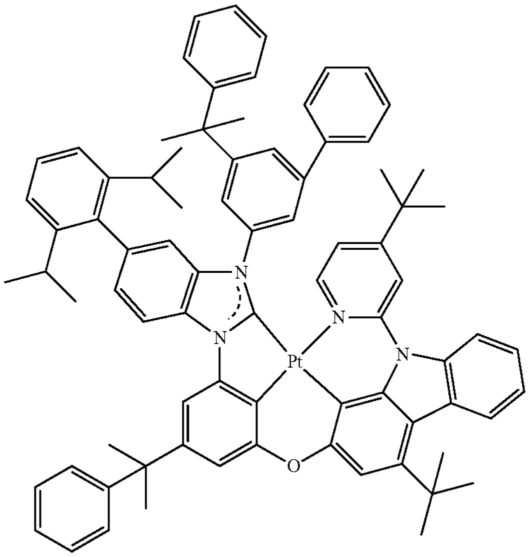
2381
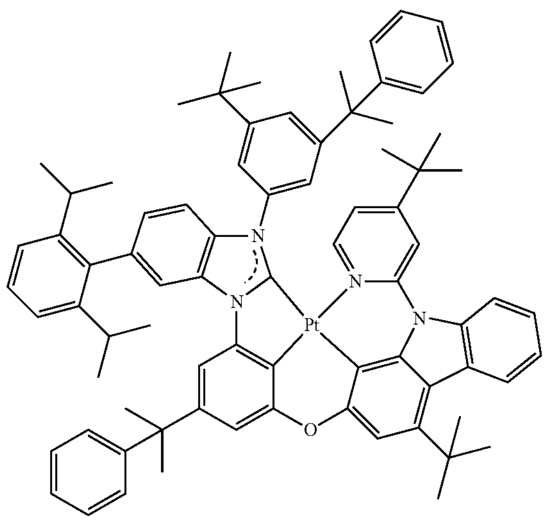
2382
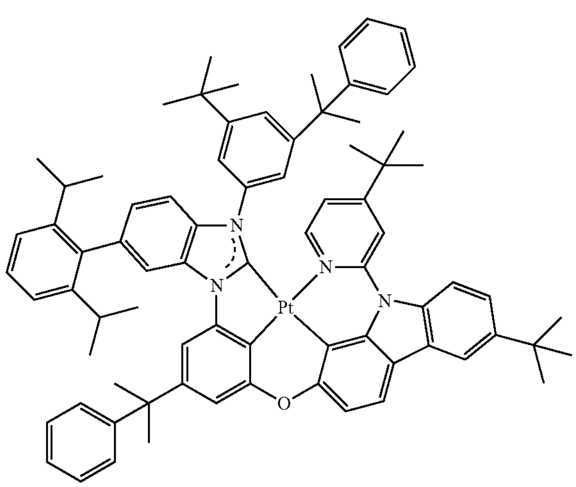
-continued
2383
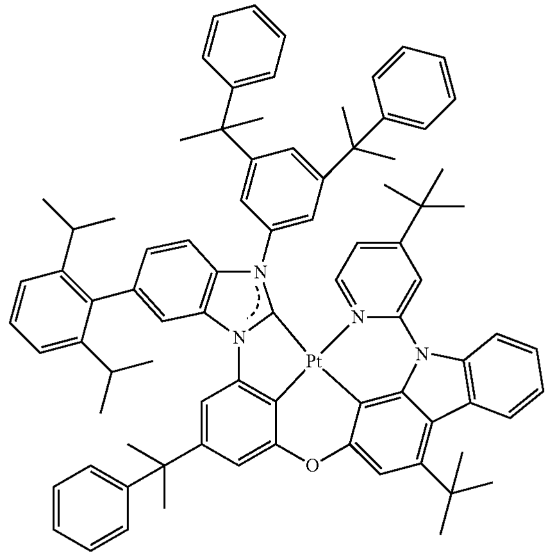
2384
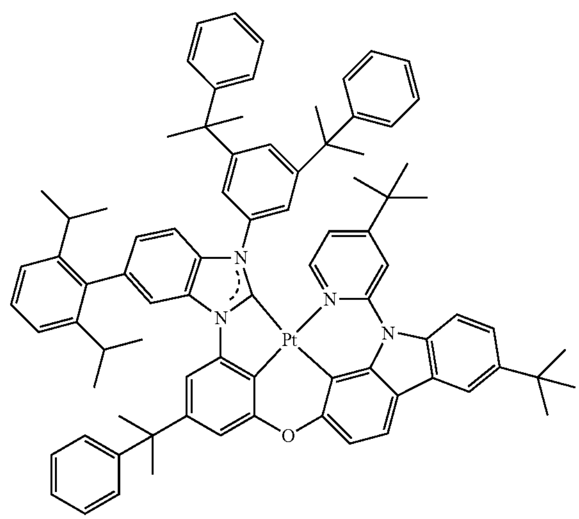
2385
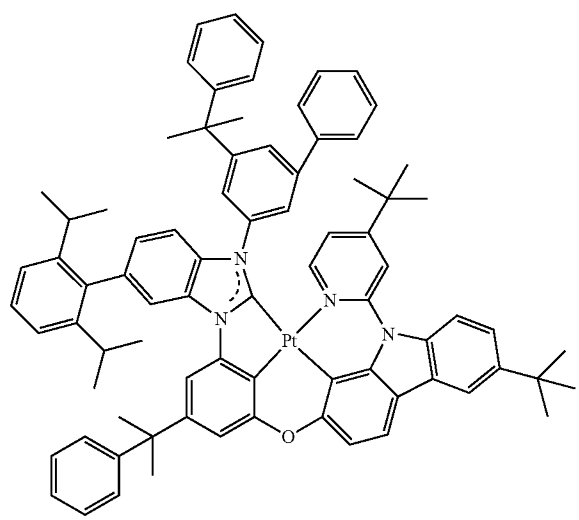

-continued
2386
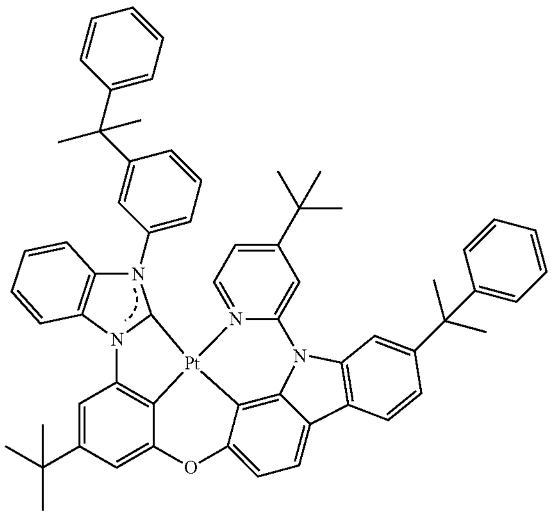
2387
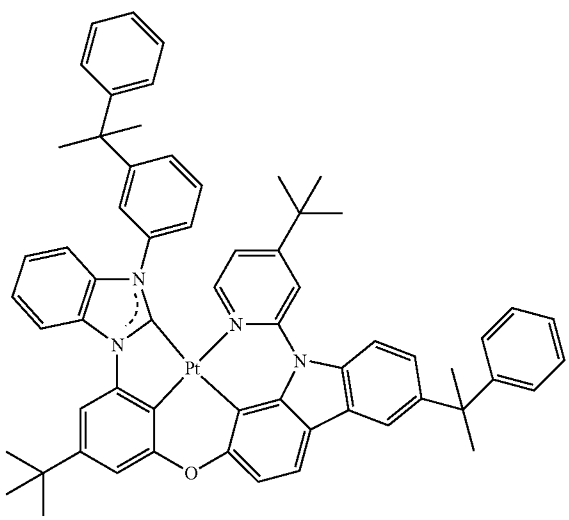
2388
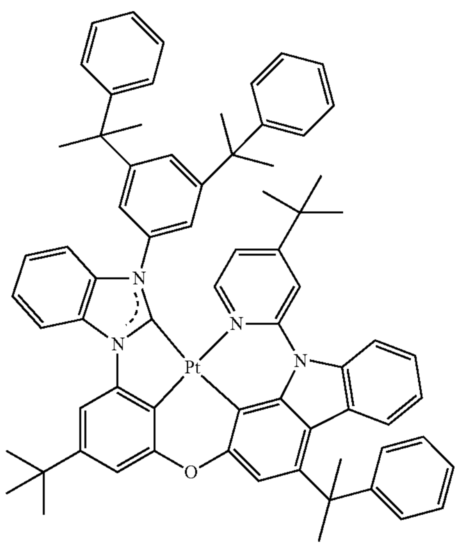
-continued
2389
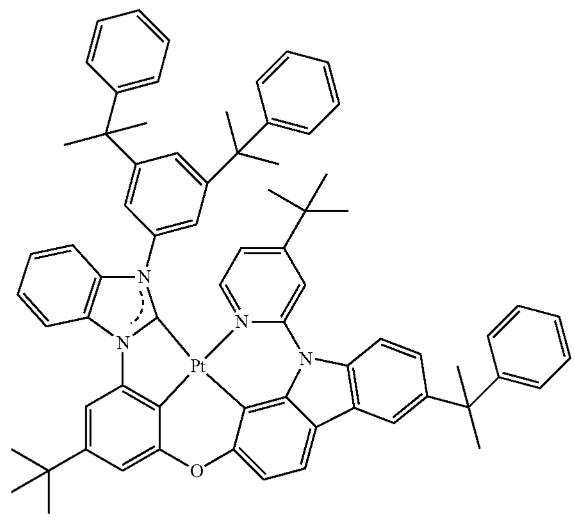
2390
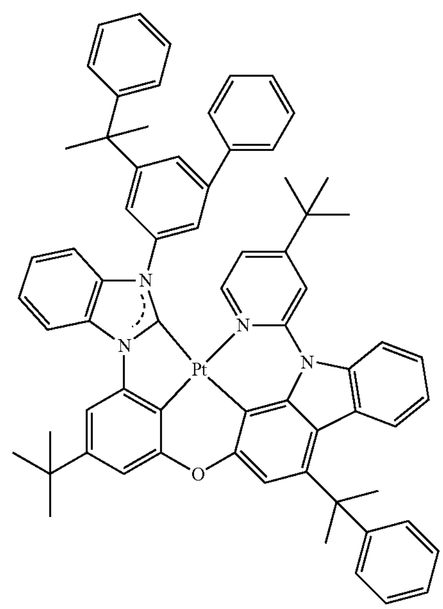
2391
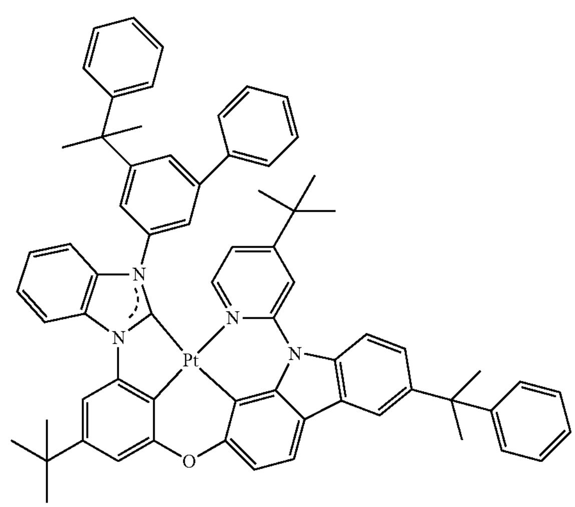

-continued
2392
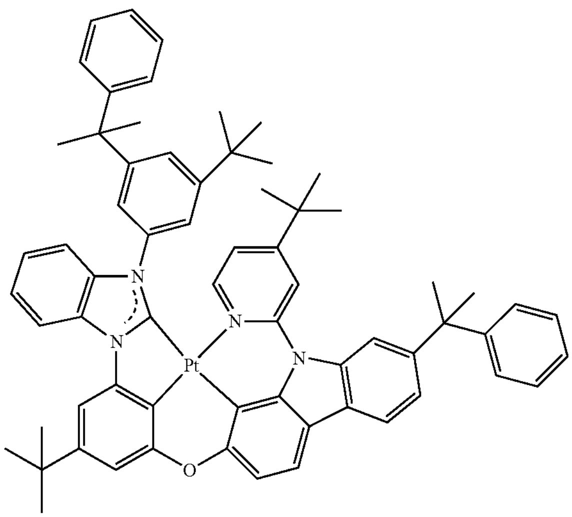
2393
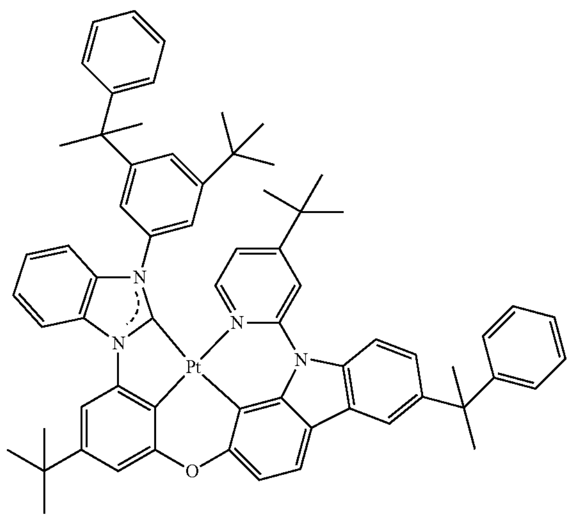
2394
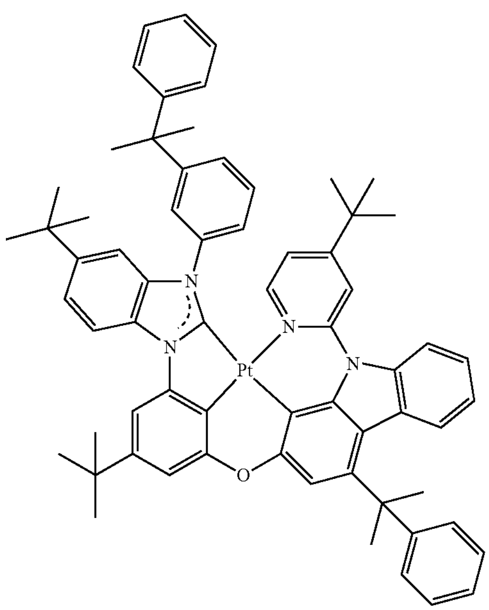
-continued
2395
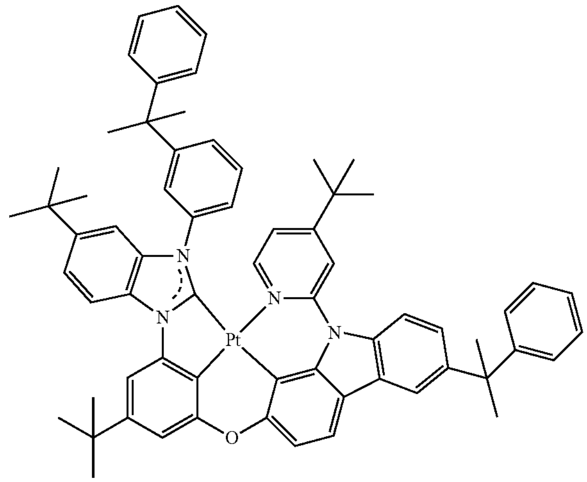
2396
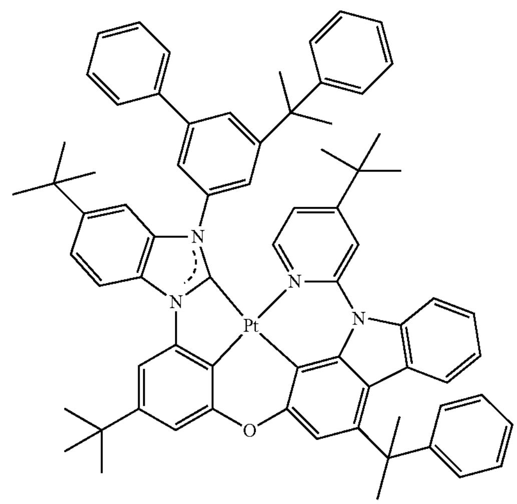
2397
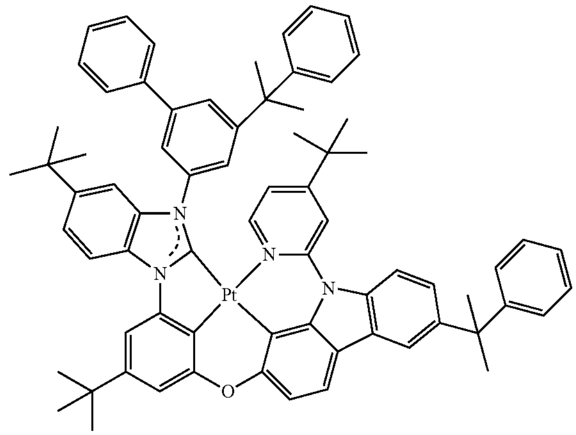

-continued
2398
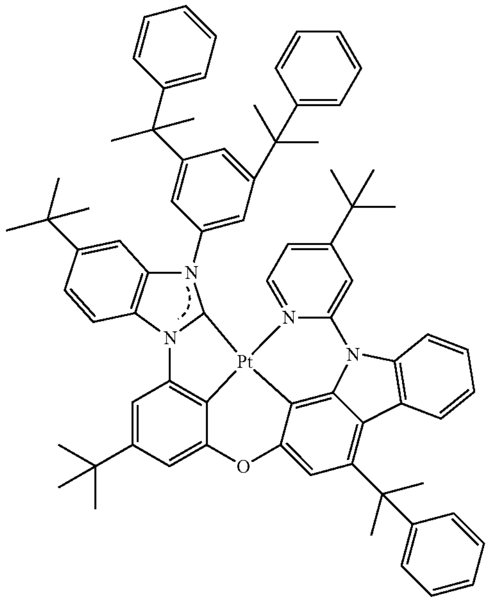
2399
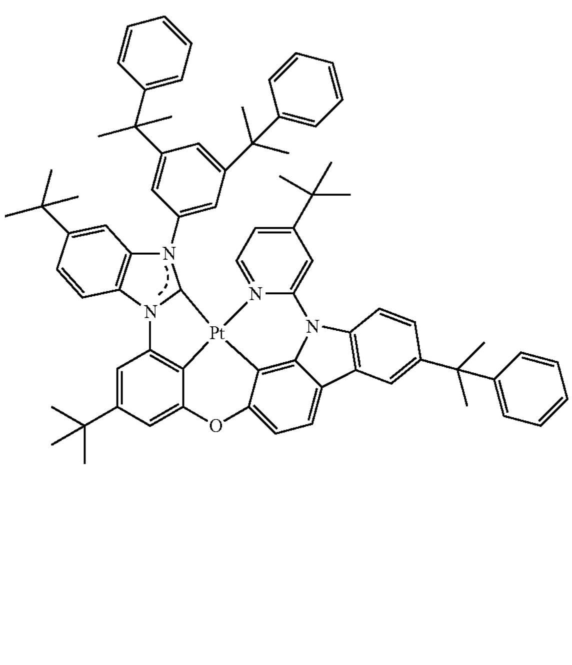
-continued
2400
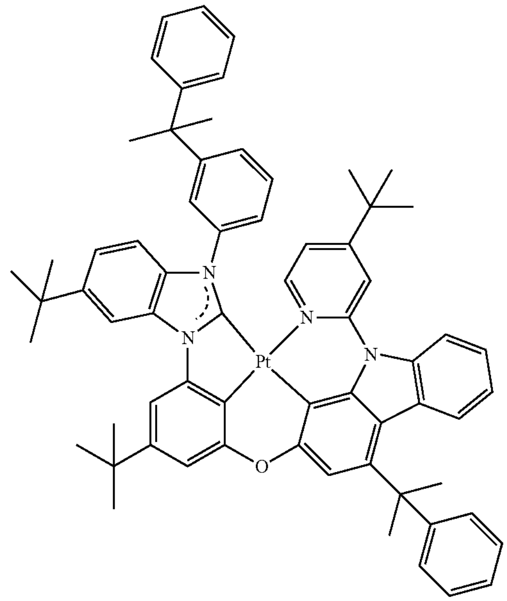
2401
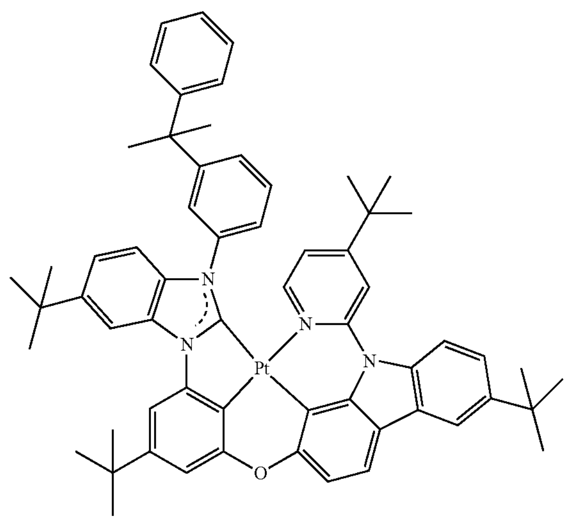
2402
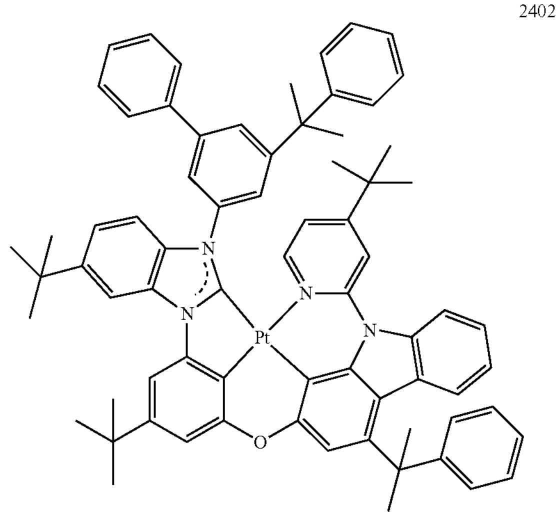

-continued
2403
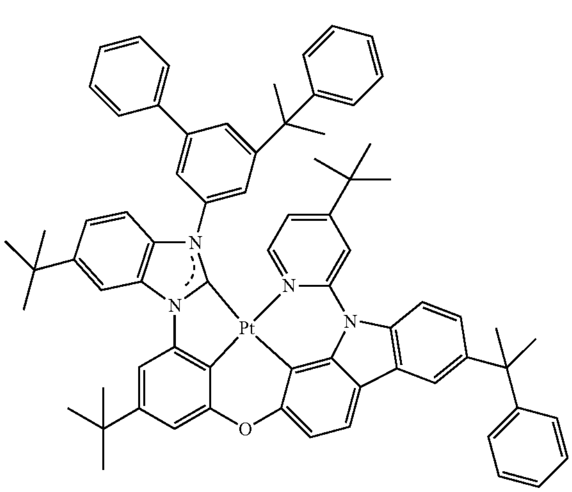
2404
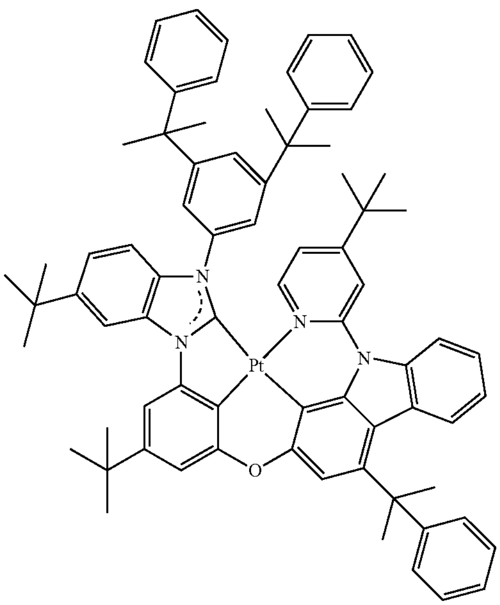
2405
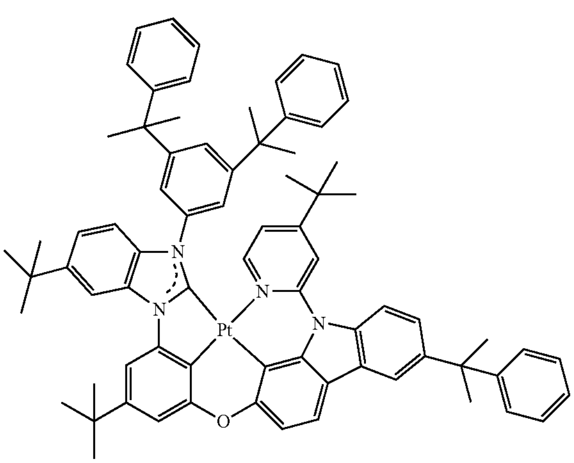
-continued
2406
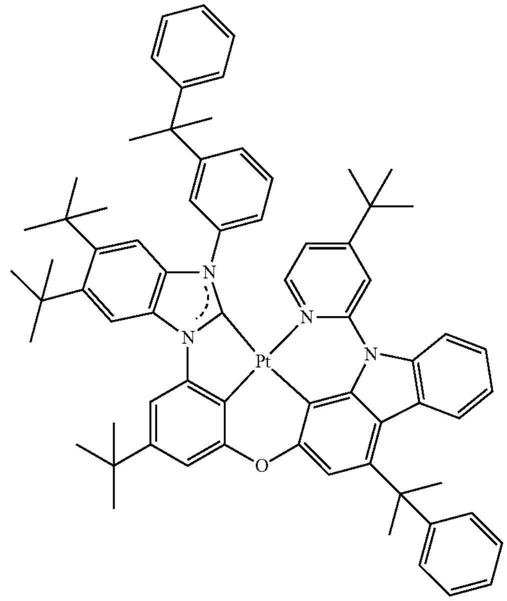
2407
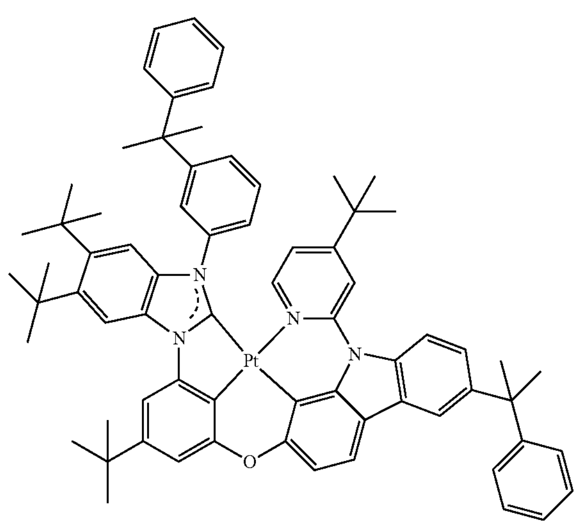

-continued
2408
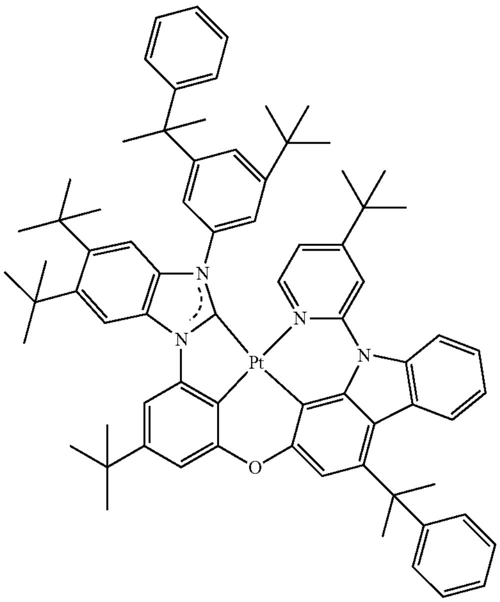
2409
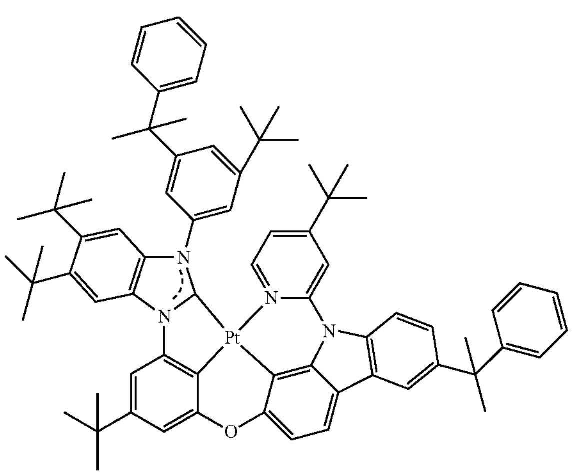
-continued
2410
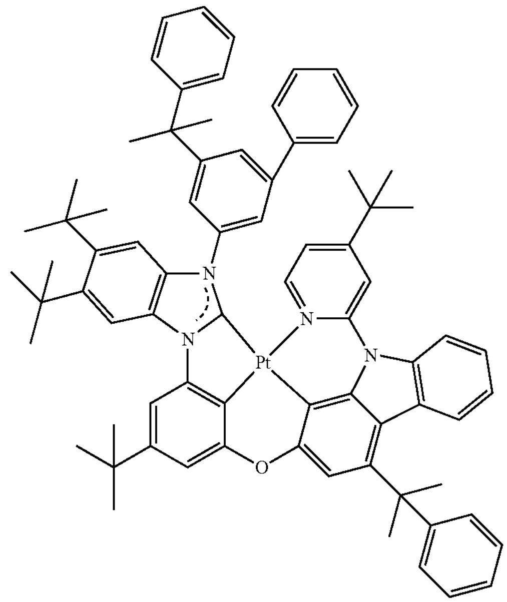
2411
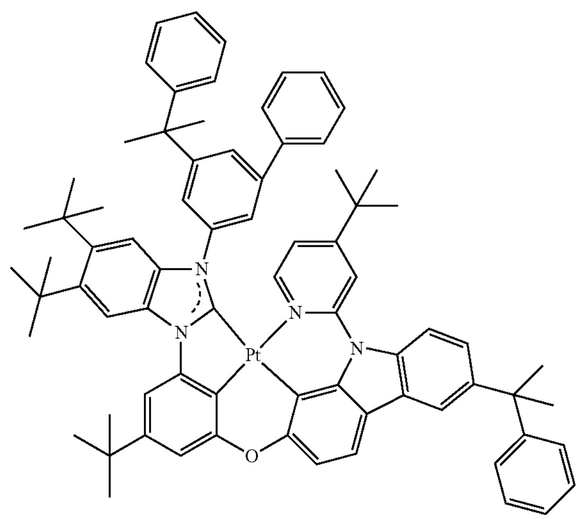
2412
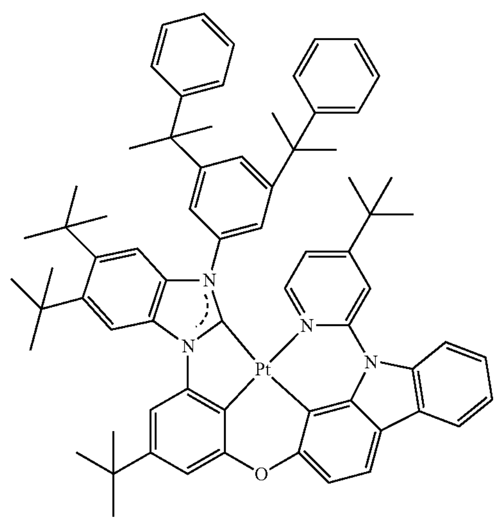

-continued
2413
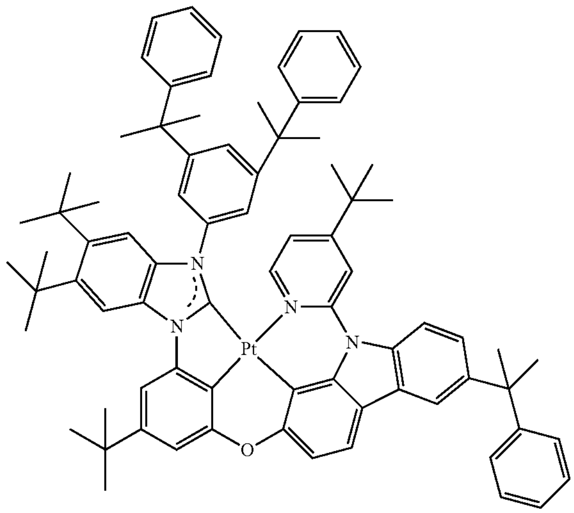
2414
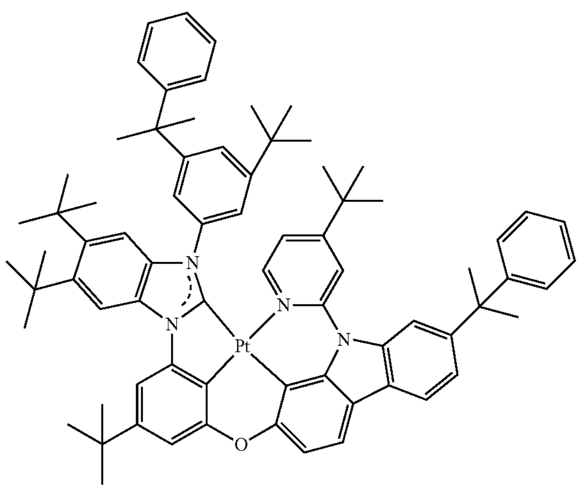
2415
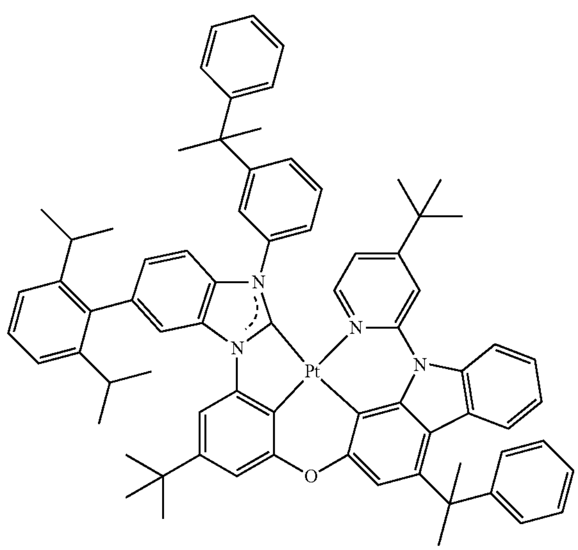
-continued
2416
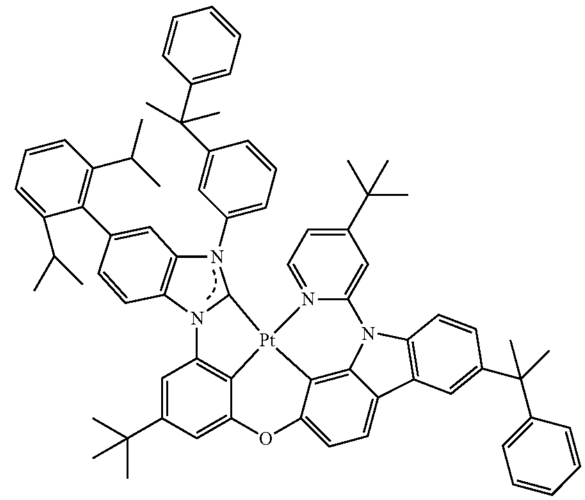
2417
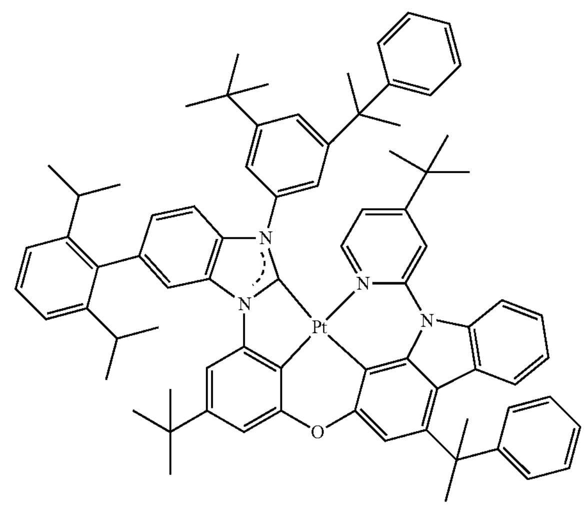
2418
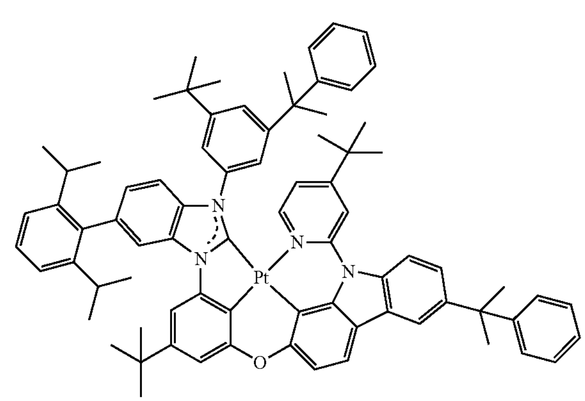

2419
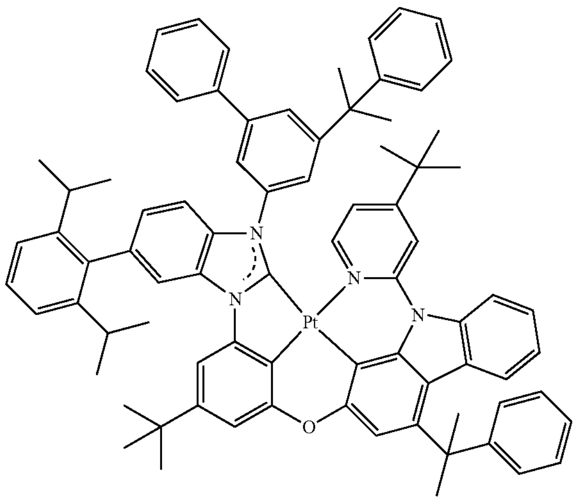
2420
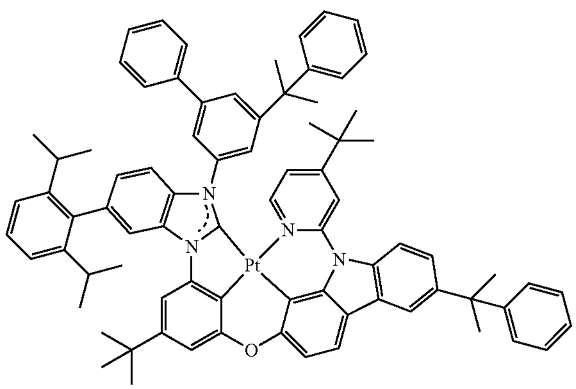
2421
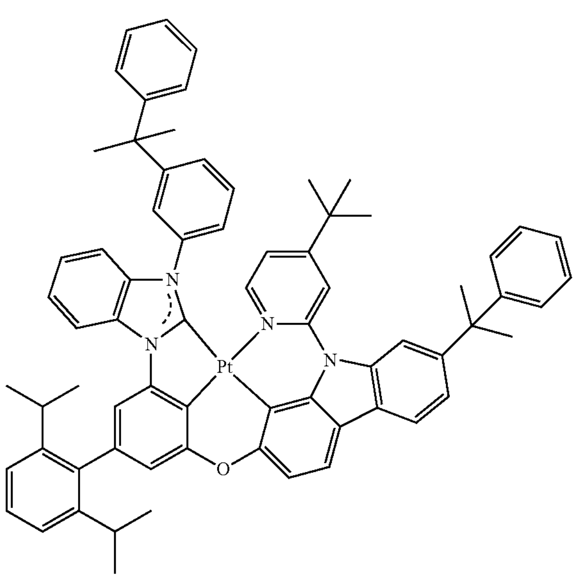
2422
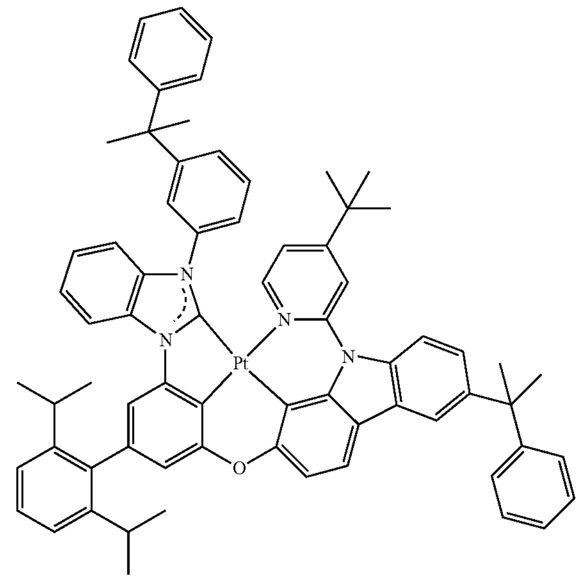
2423
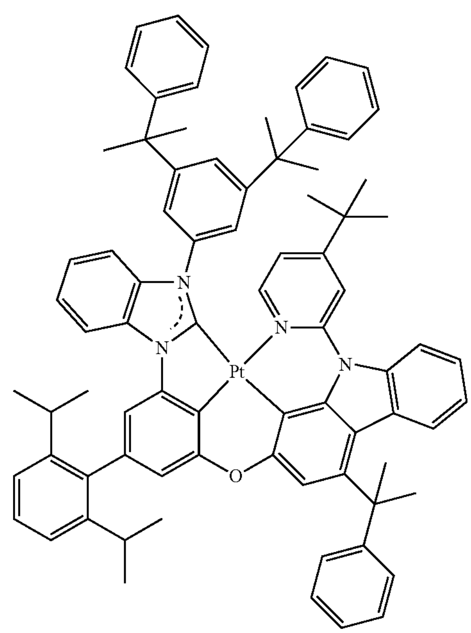

2424
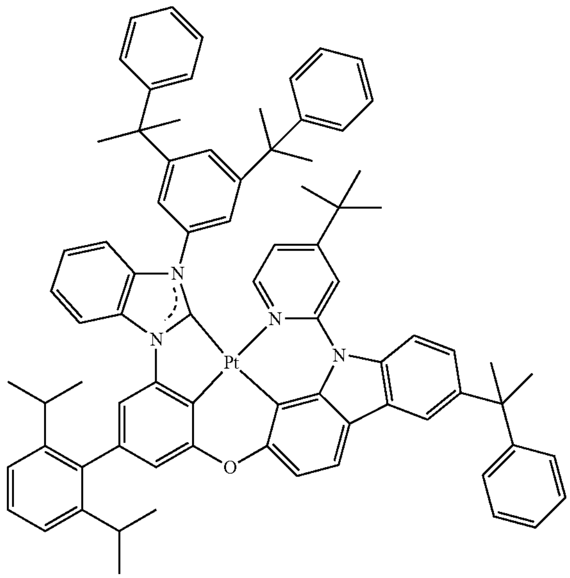
2426
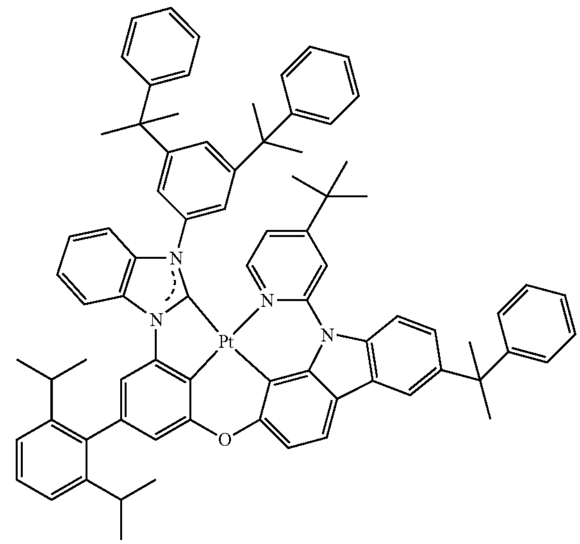
2425
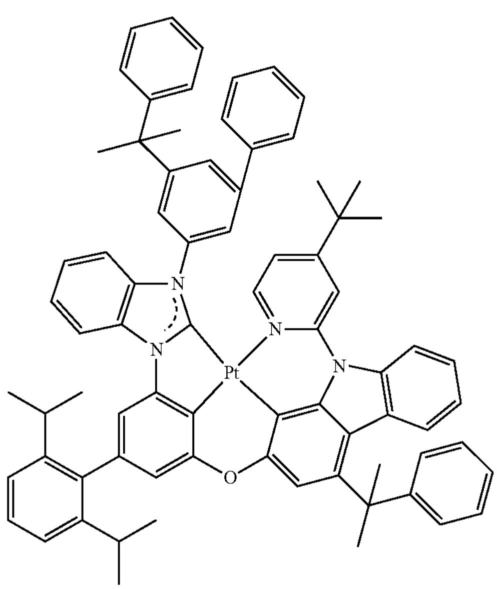
2427
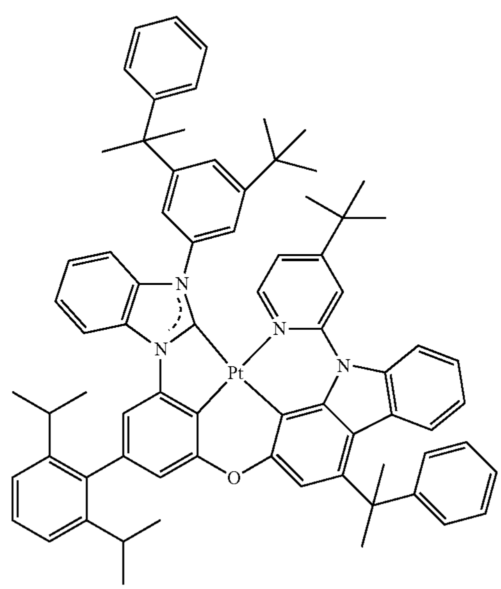

-continued
2428
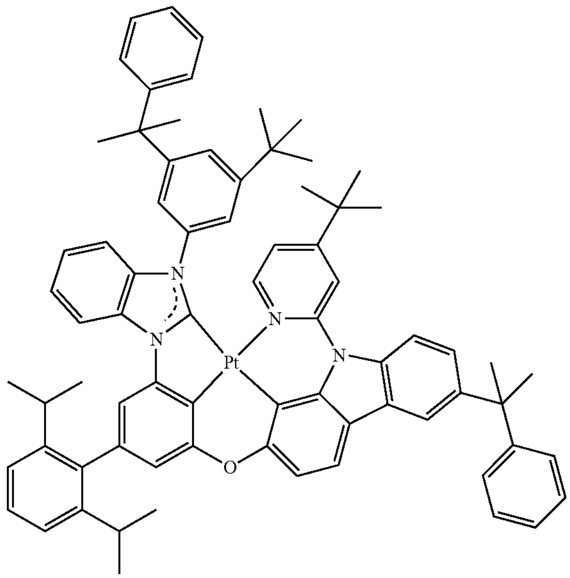
2429
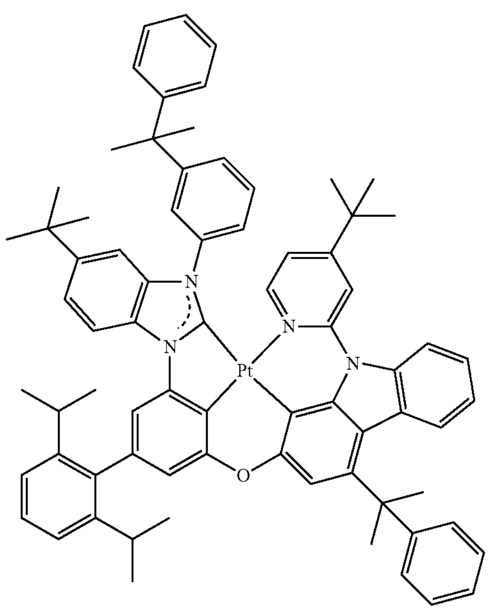
-continued
2430
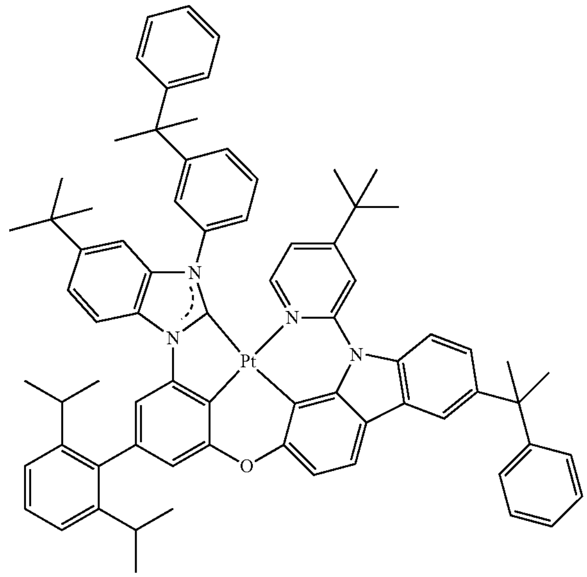
2431
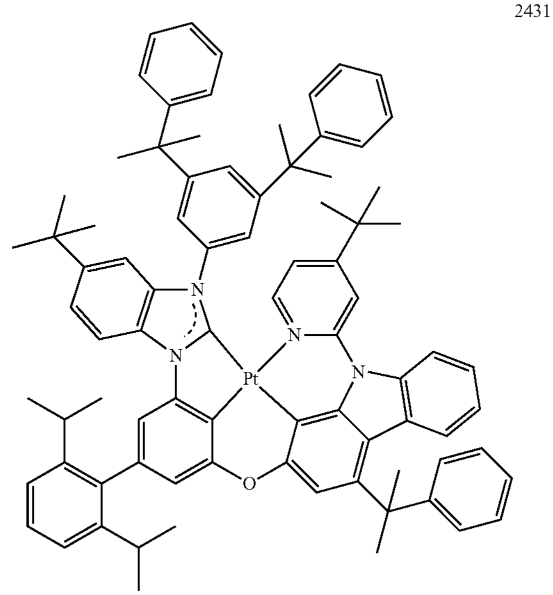

2432
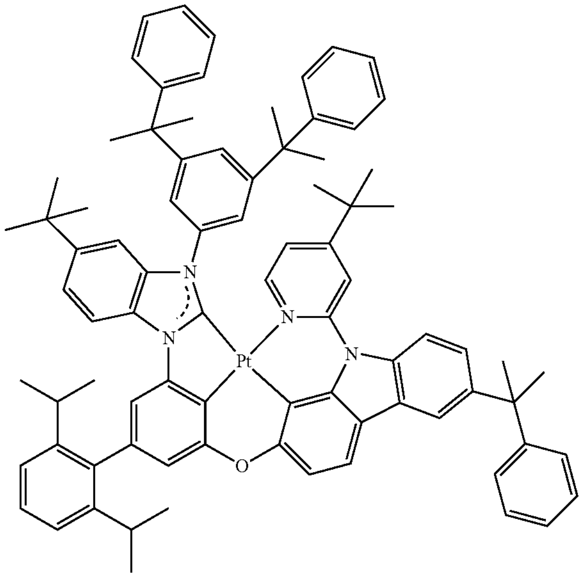
2433
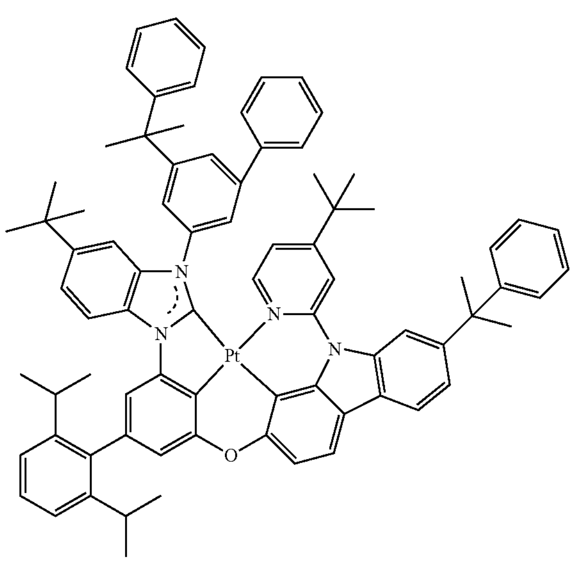
2434
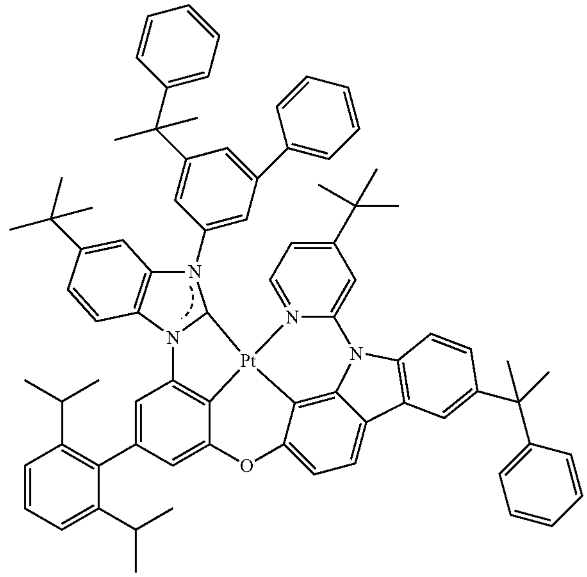
2435
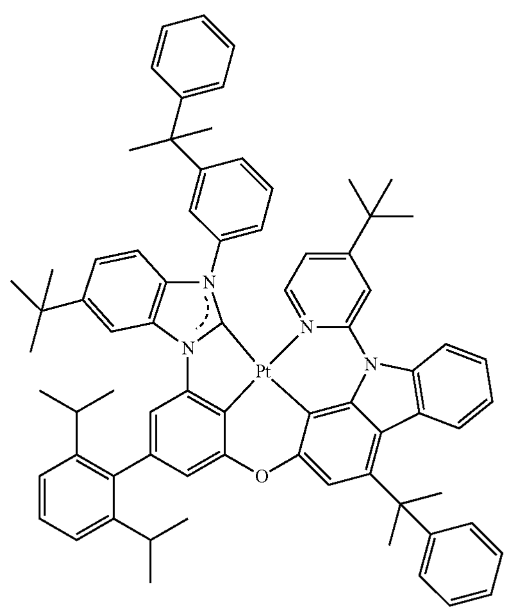

-continued
2436
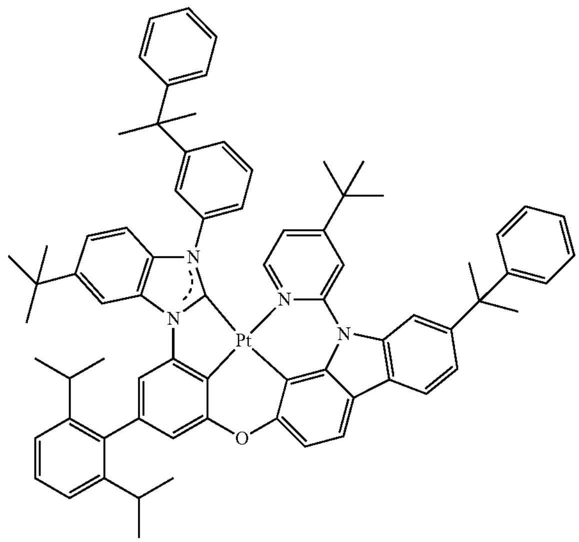
2437
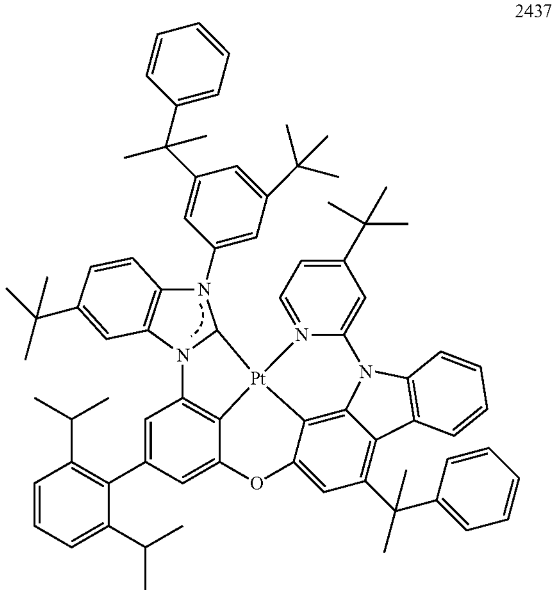
-continued
2438
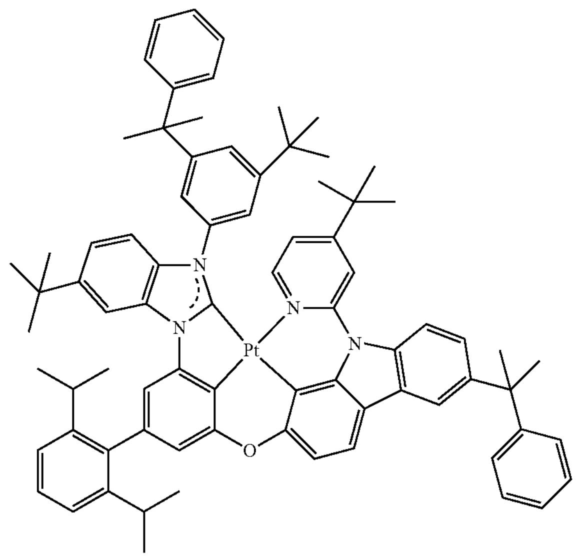
2439
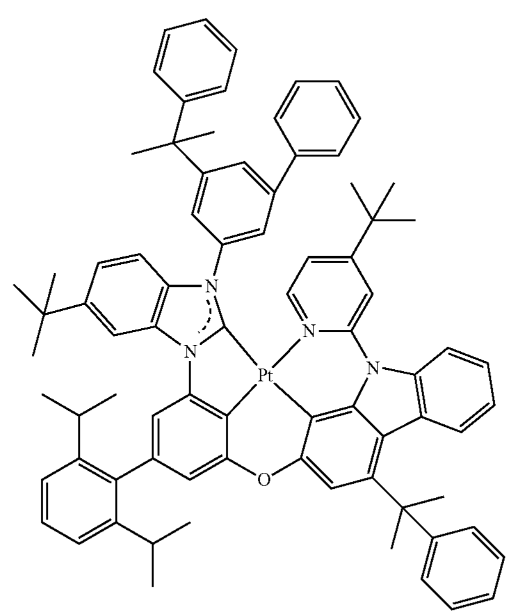

-continued
2440
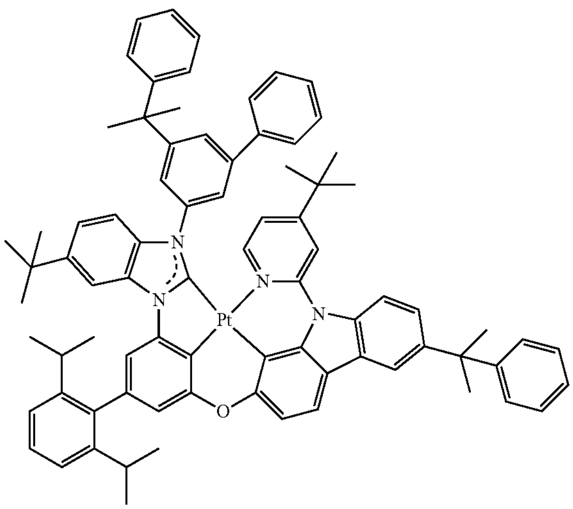
2441
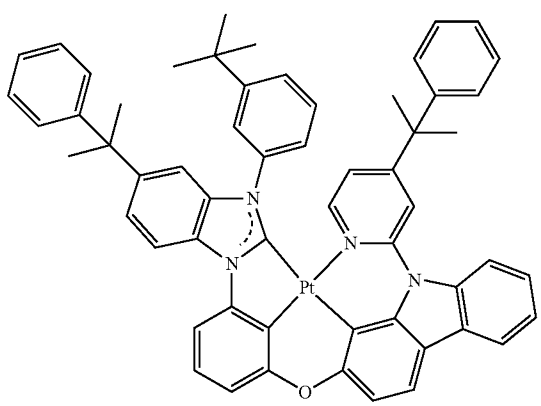
2442
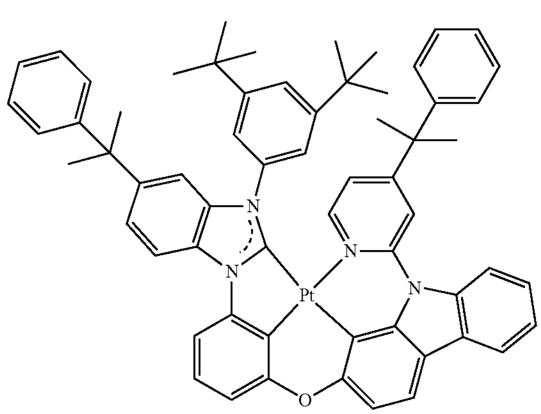
-continued
2443
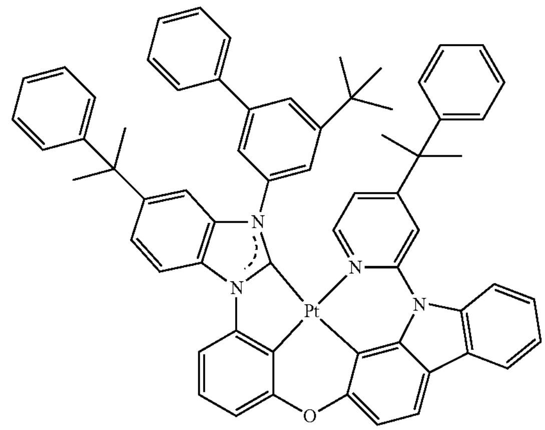
2444
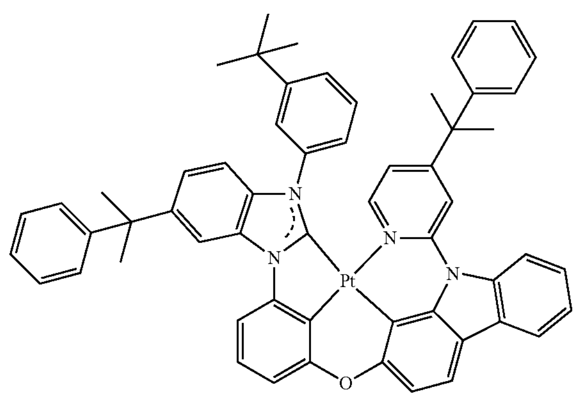
2445
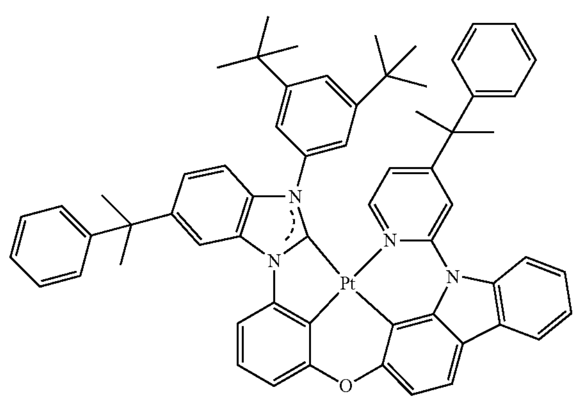

-continued
2446
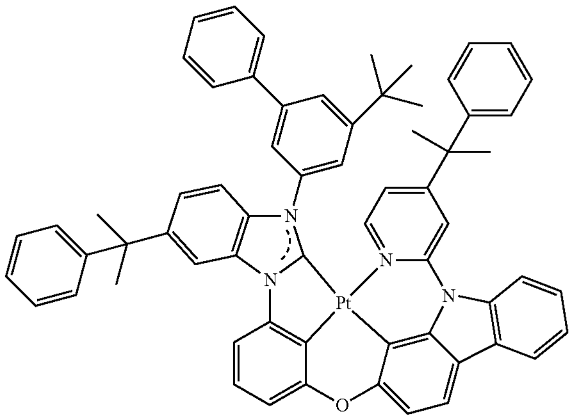
2447
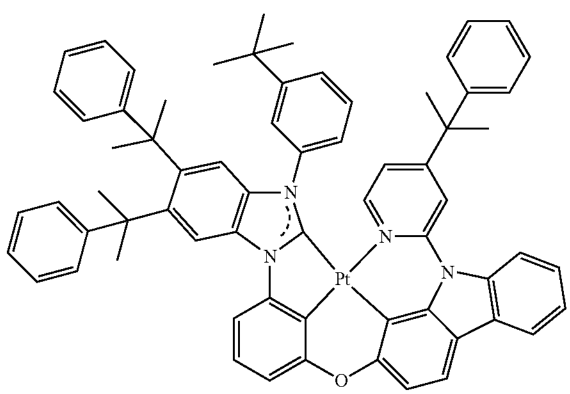
2448
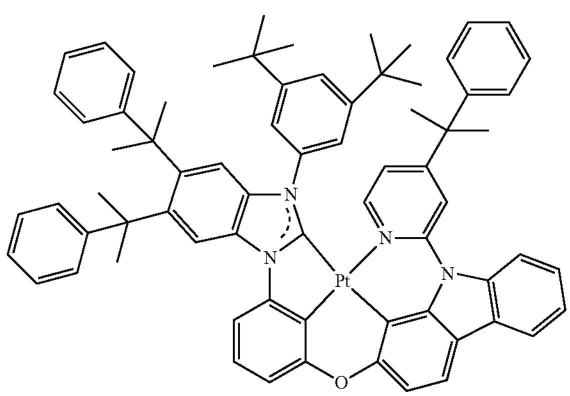
-continued
2449
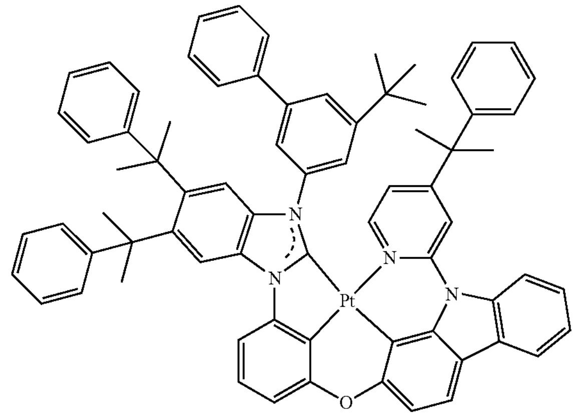
2450
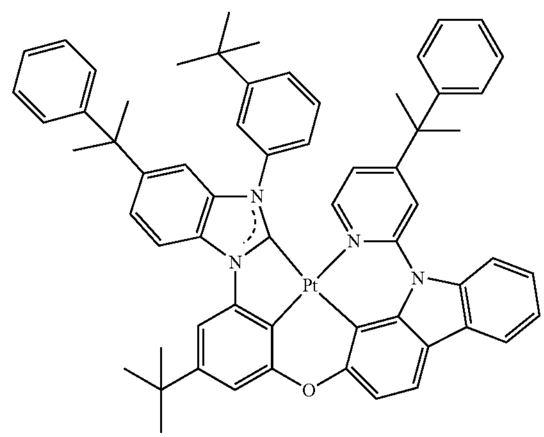
2451
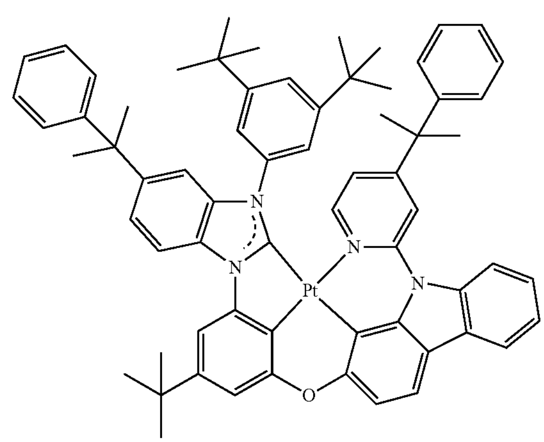

-continued
2452
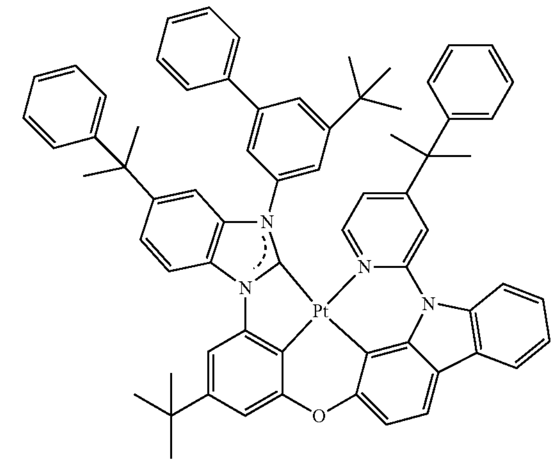
2453
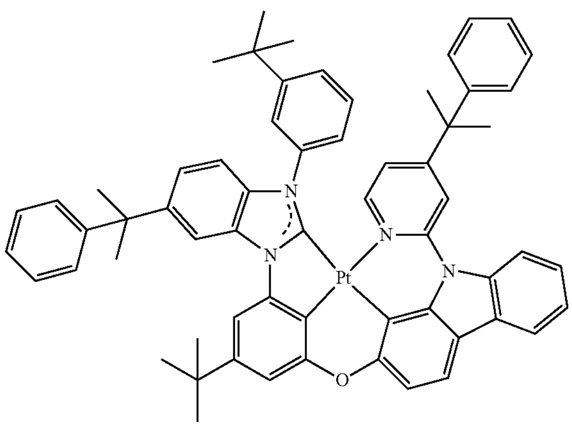
2454
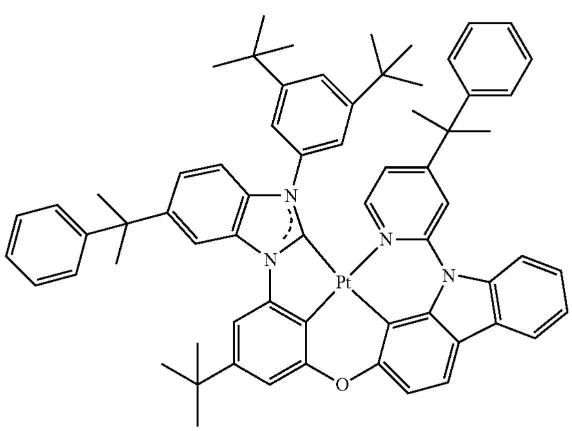
-continued
2455
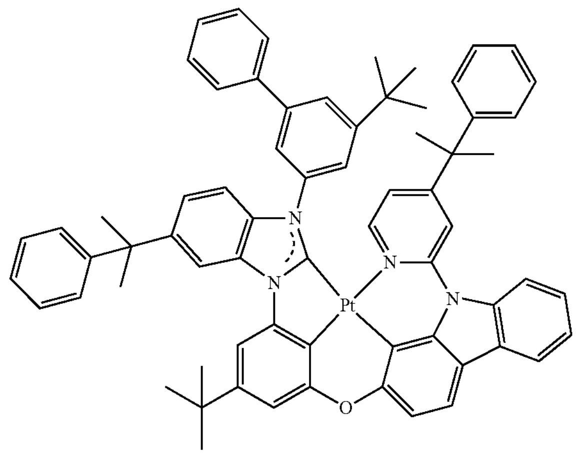
2456
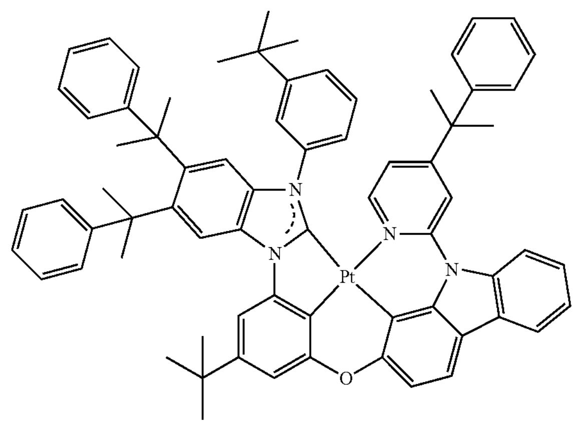
2457
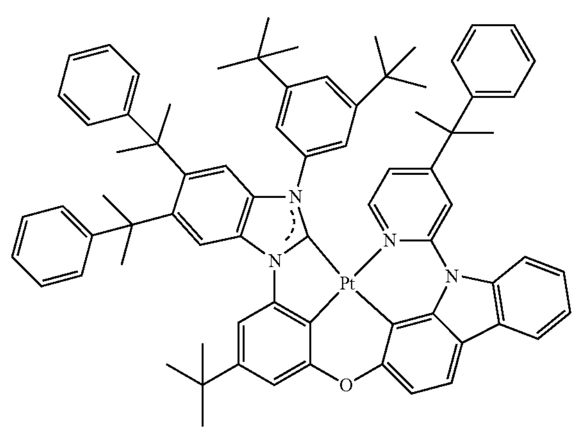

-continued
2458
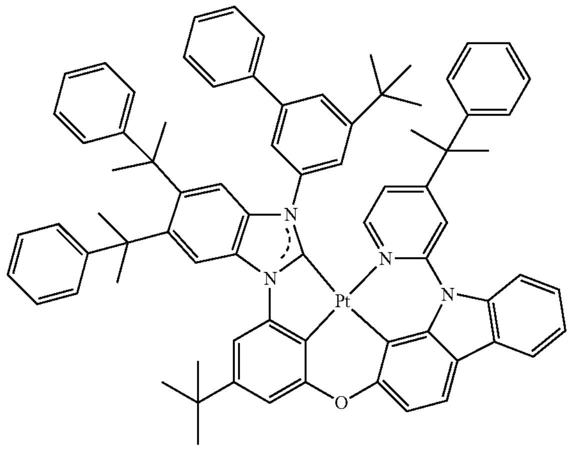
2459
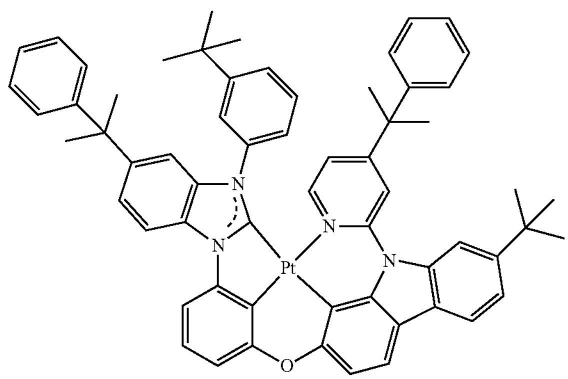
2460
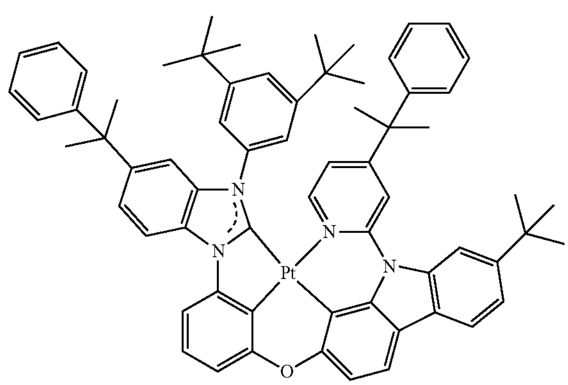
-continued
2461
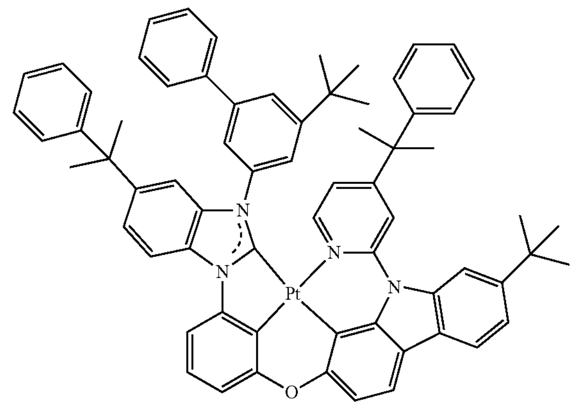
2462
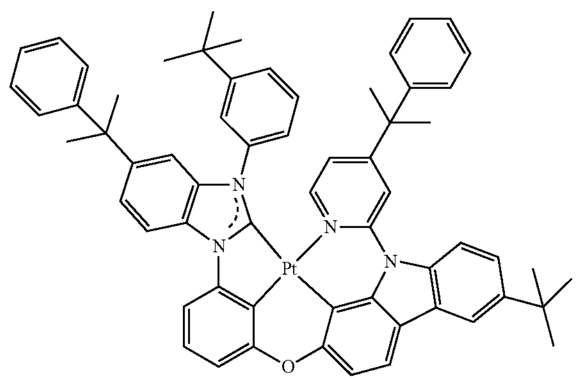
2463
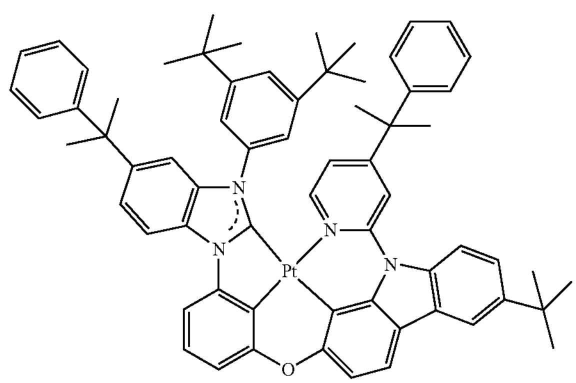
2464
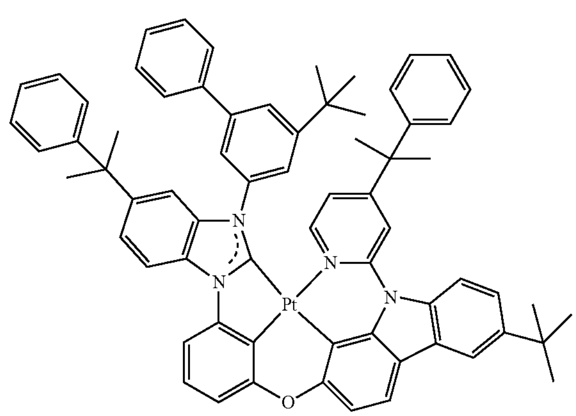

2465
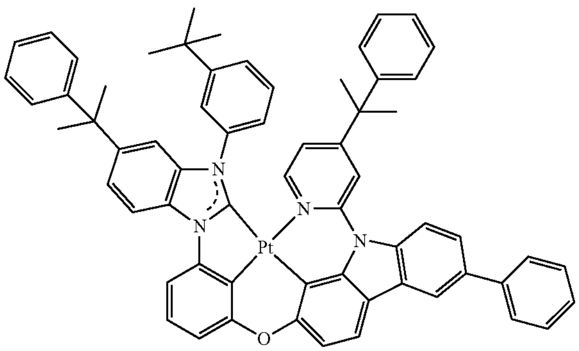
2466
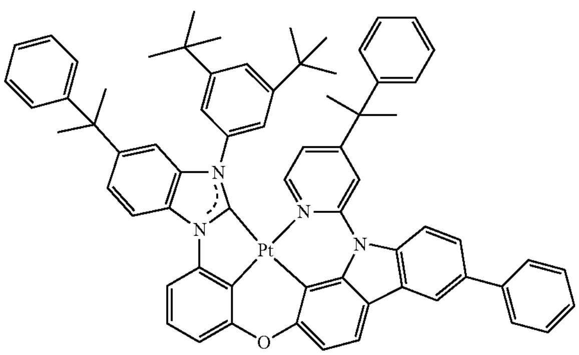
2467
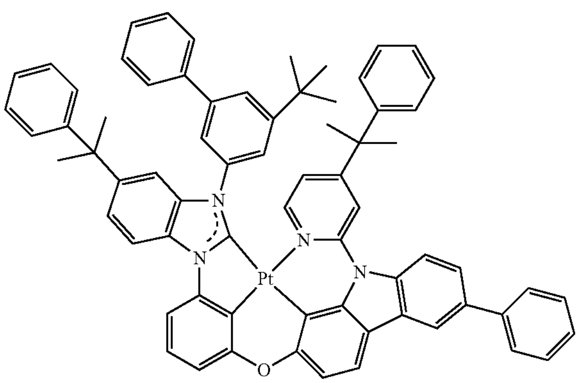
2468
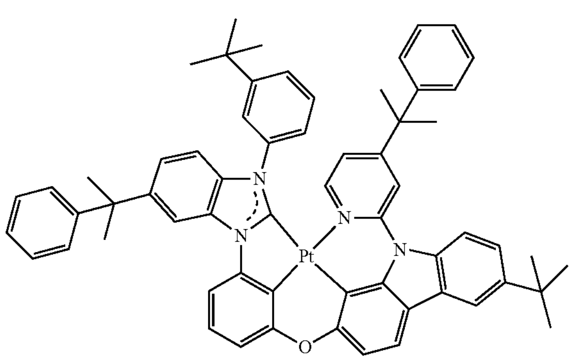
2469
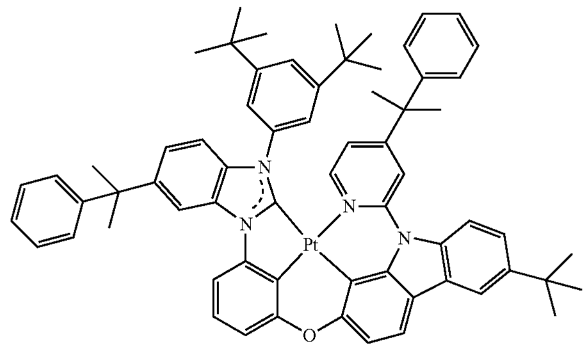
2470
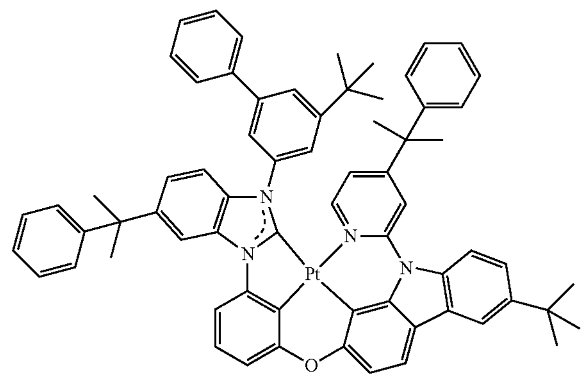
2471
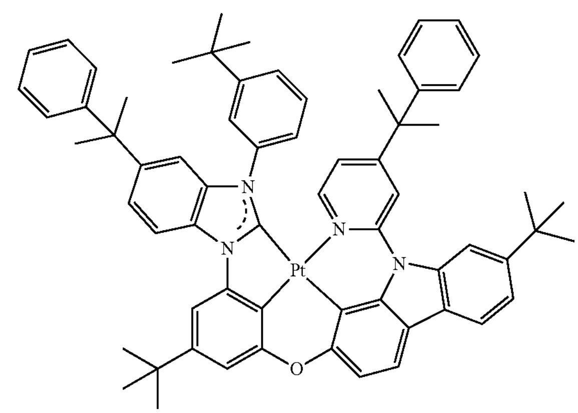
2472
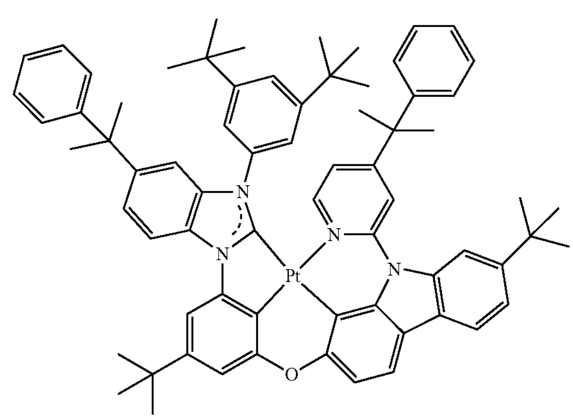

-continued
2473
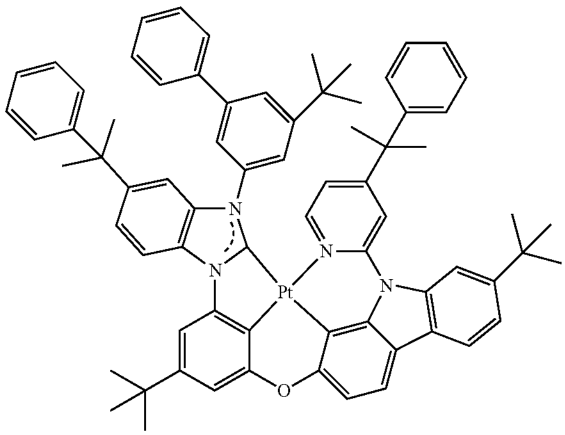
2474
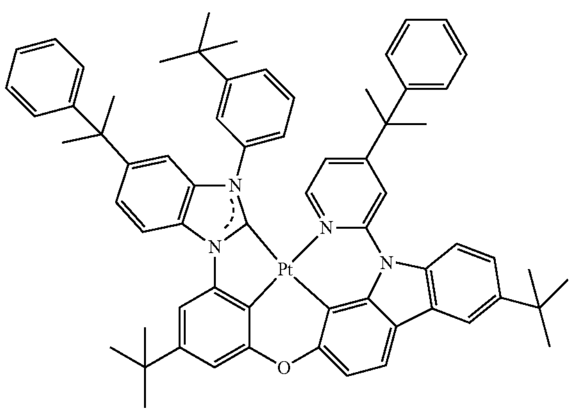
2475
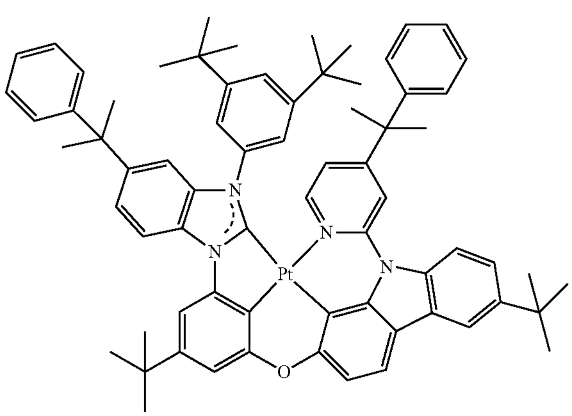
-continued
2476
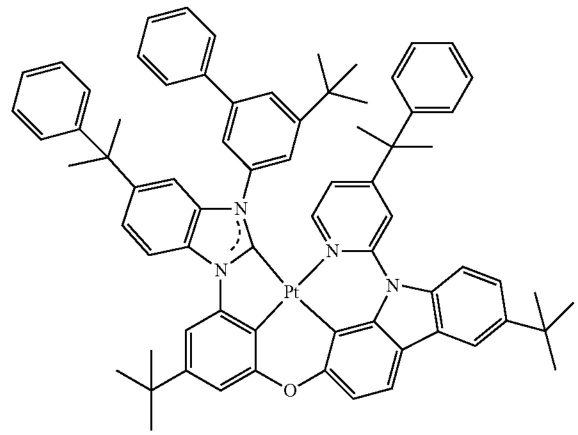
2477
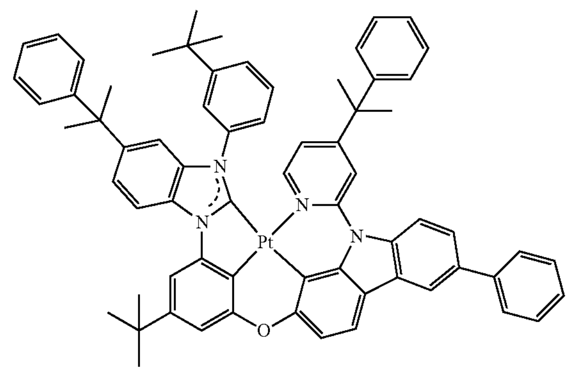
2478
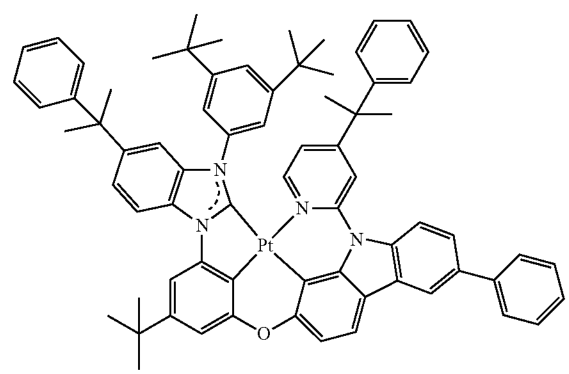
2479
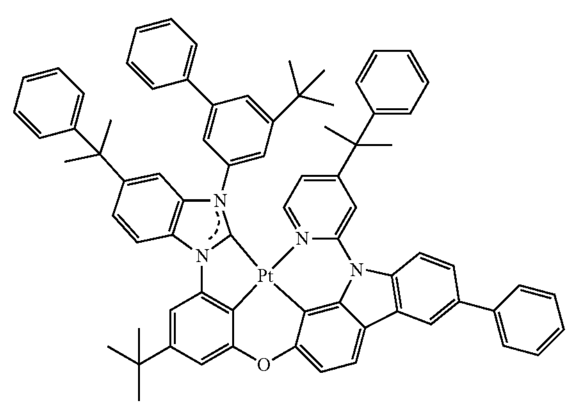

2480
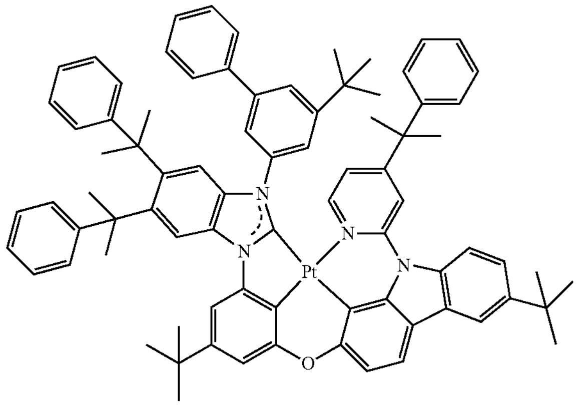
2481
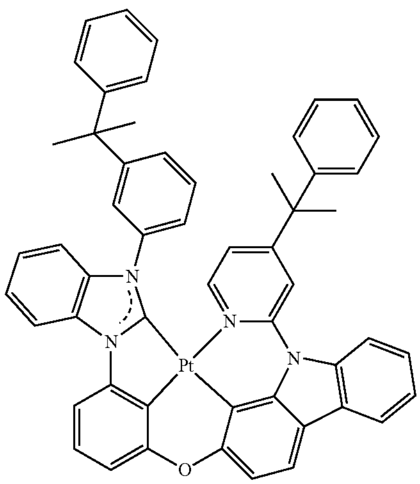
2482
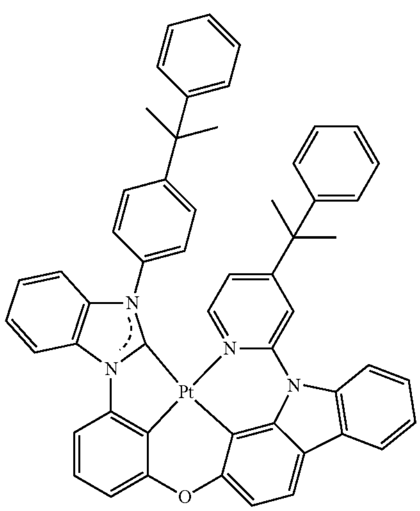
2483
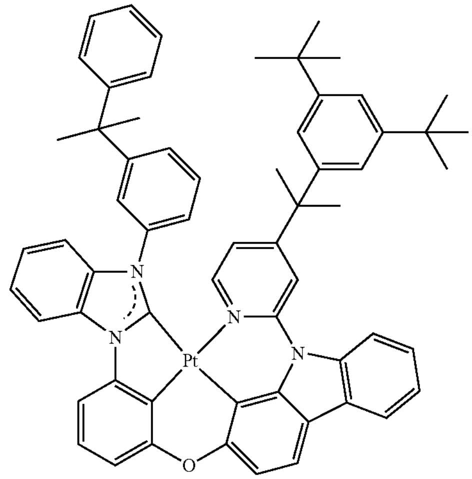
2484
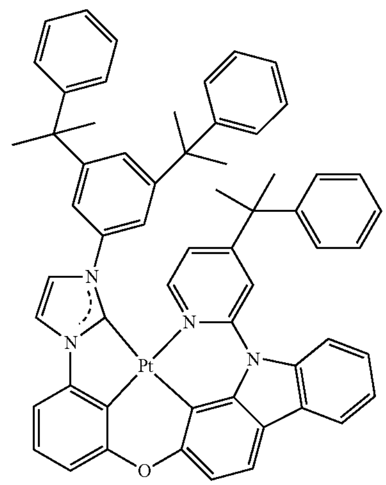
2485
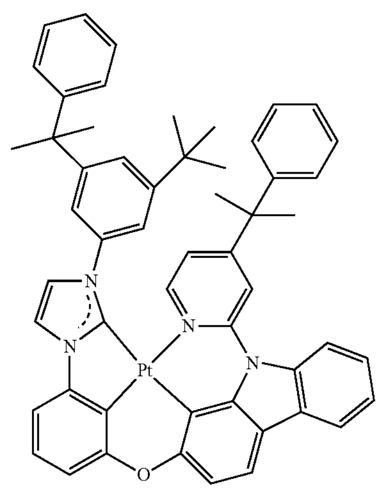

-continued
2486
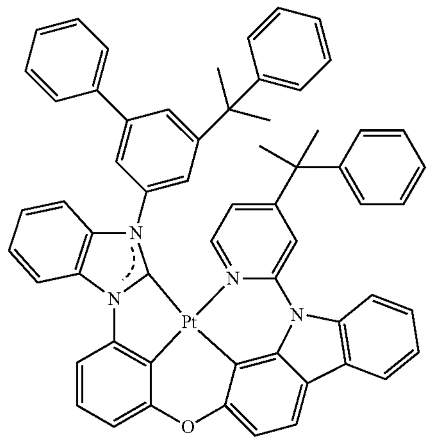
2487
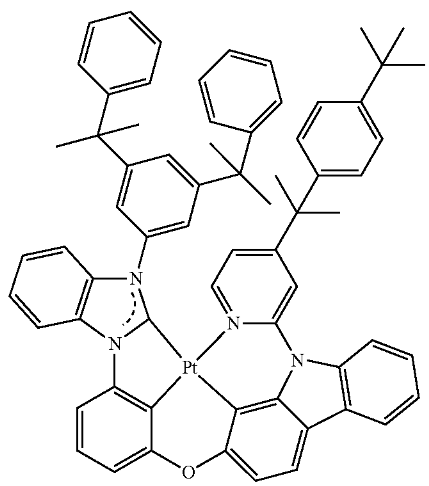
2488
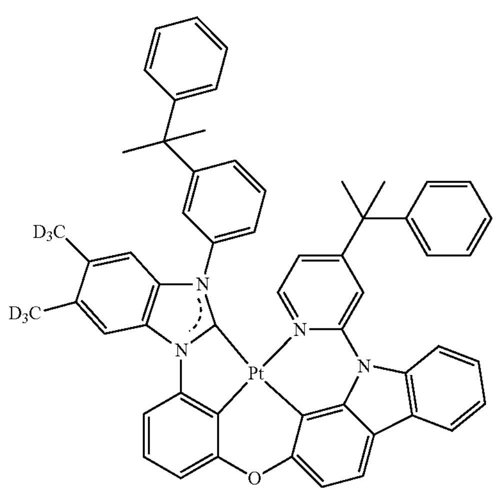
-continued
2489
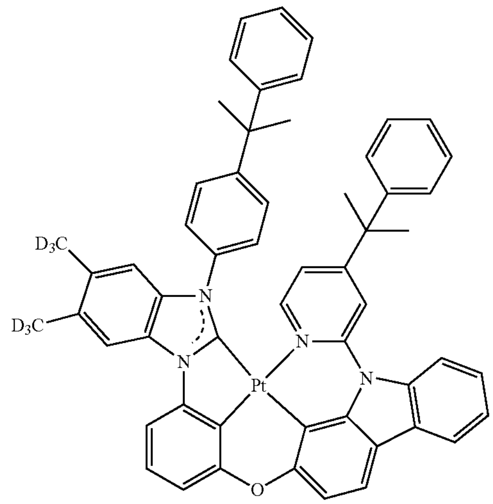
2490
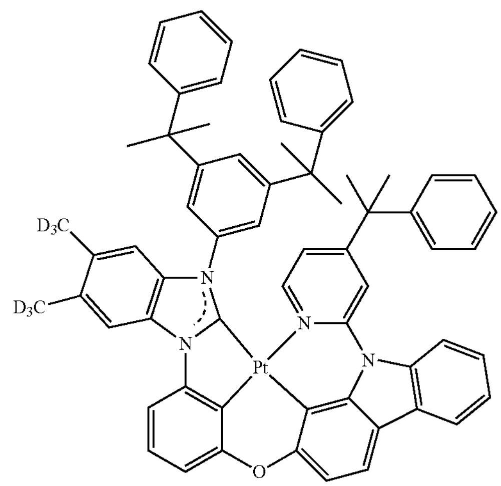
2491
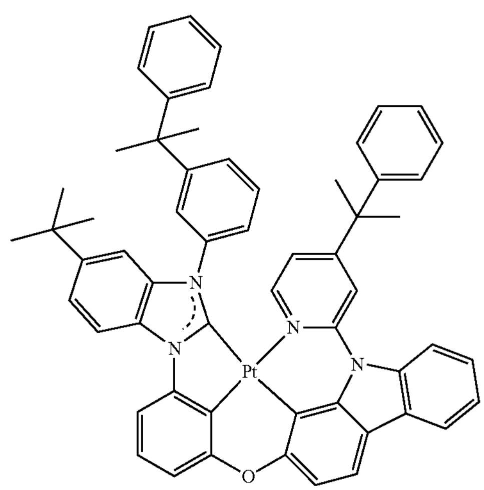

-continued
2492
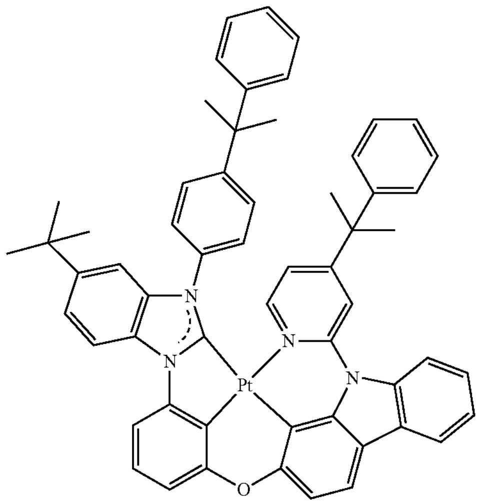
2493
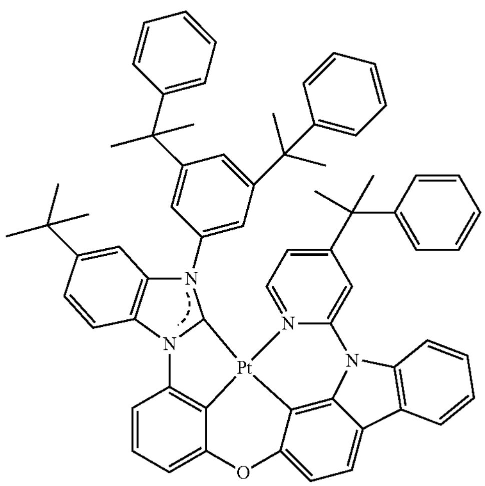
2494
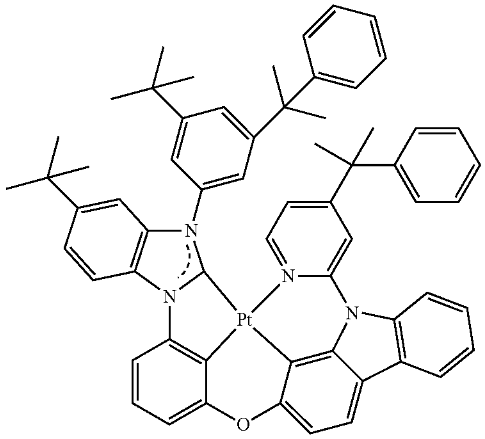
-continued
2495
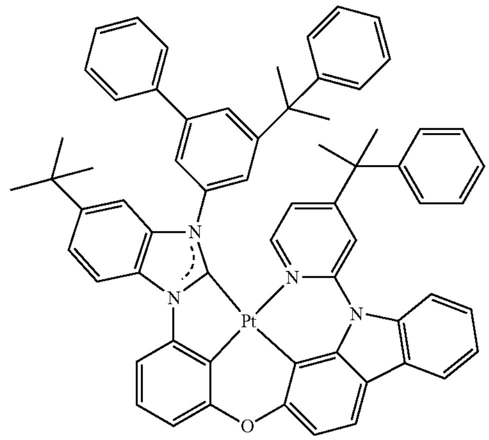
2496
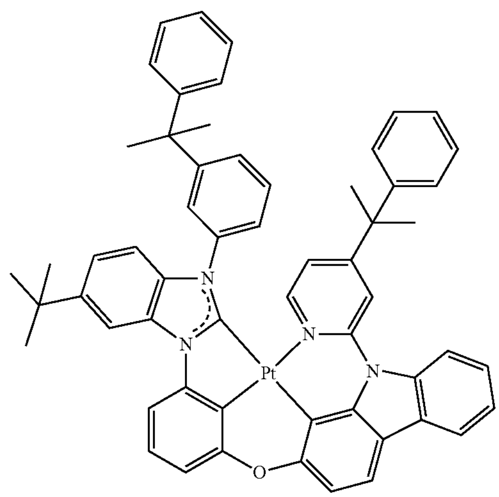
2497
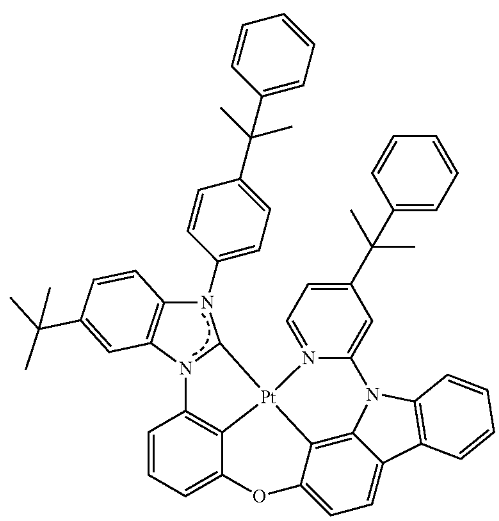

-continued
2498
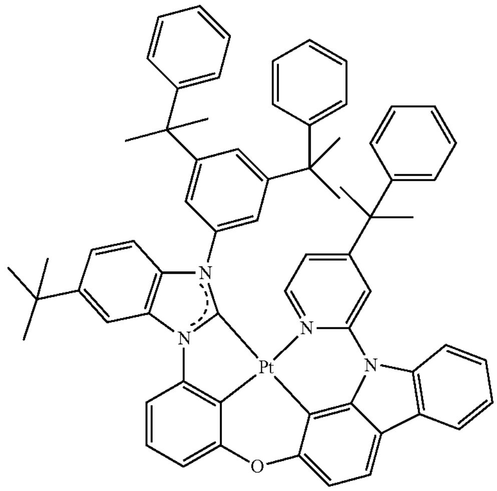
2499
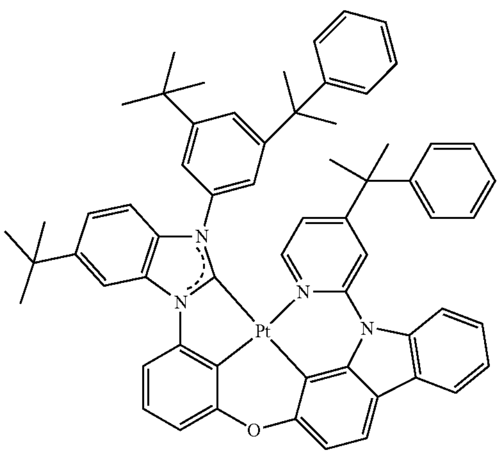
2500
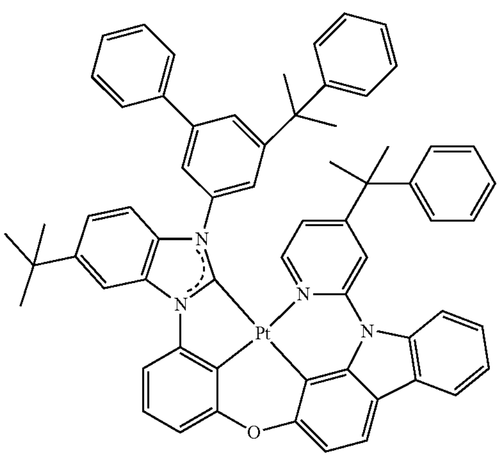
-continued
2501
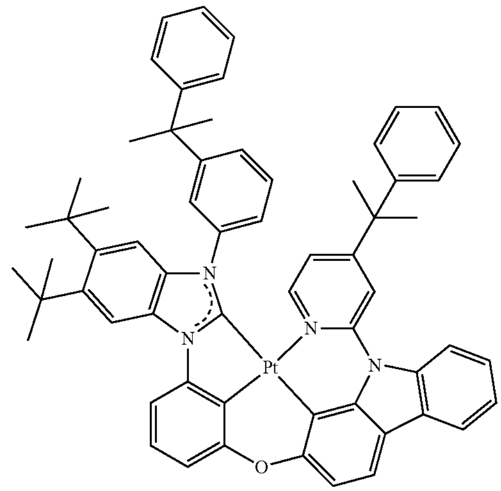
2502
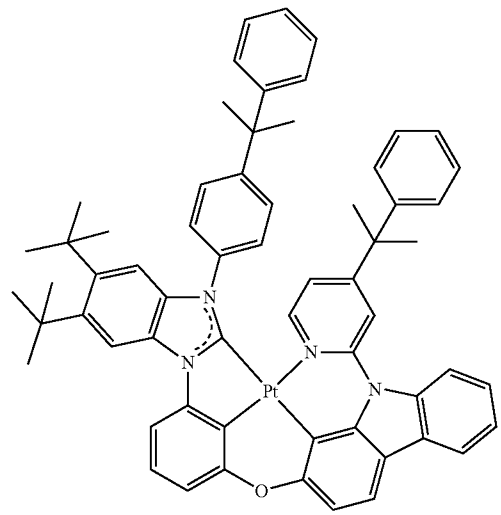
2503
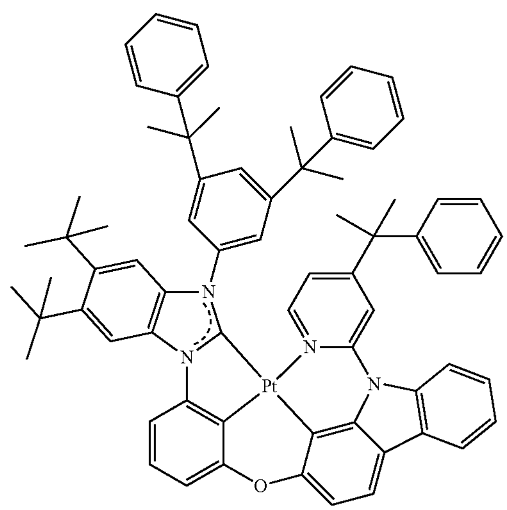

-continued
2504
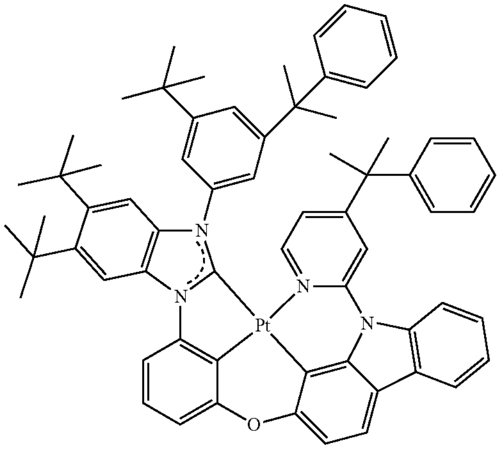
2505
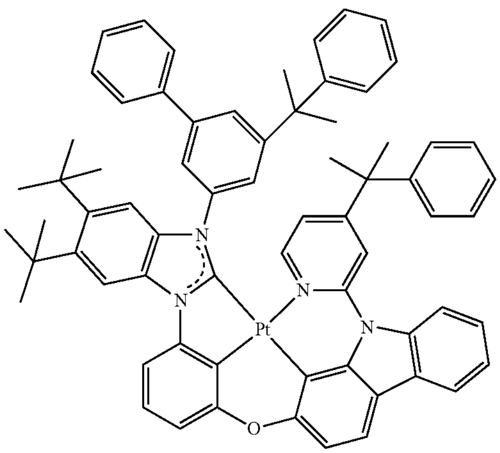
2506
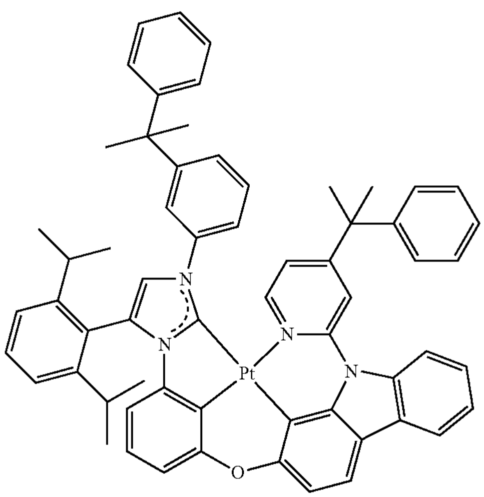
-continued
2507
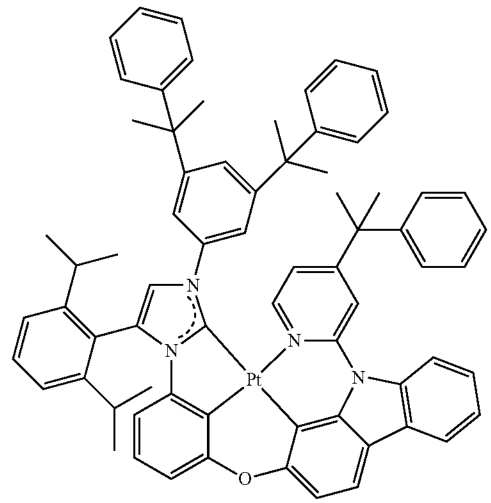
2508
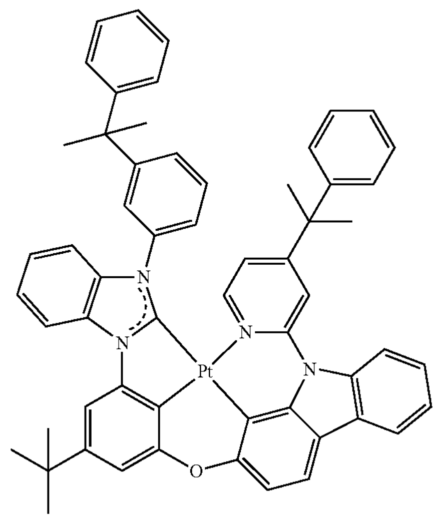
2509
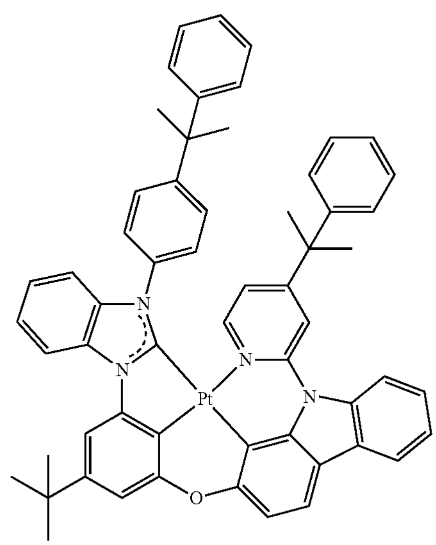

-continued
2510
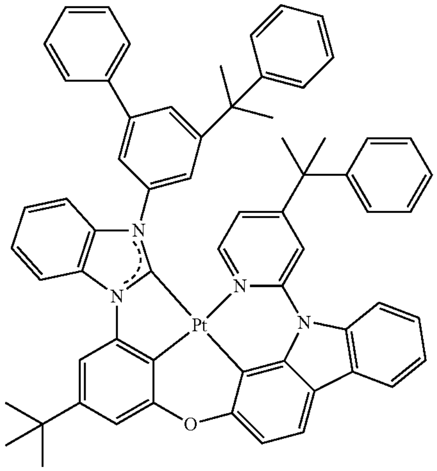
2511
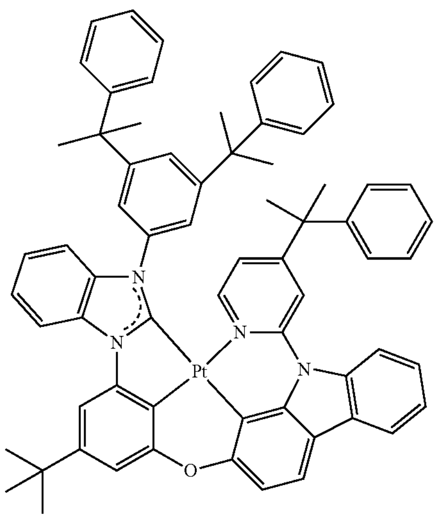
2512
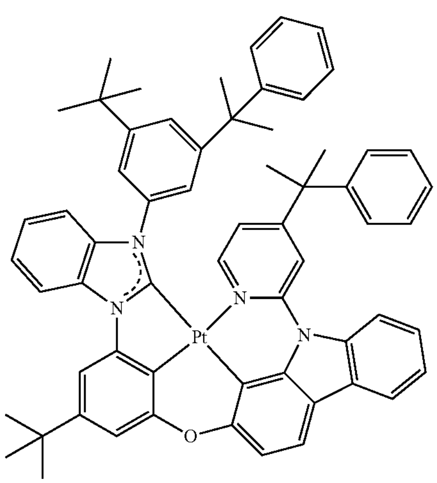
-continued
2513
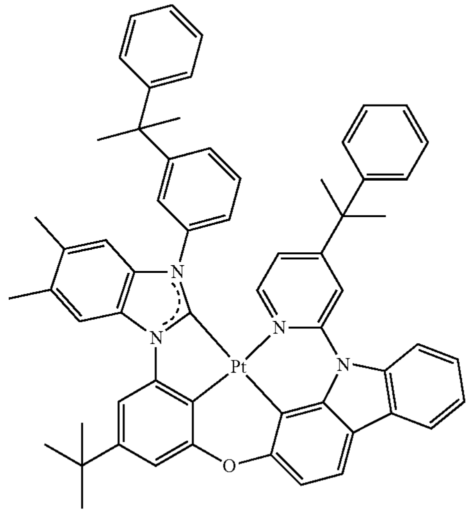
2514
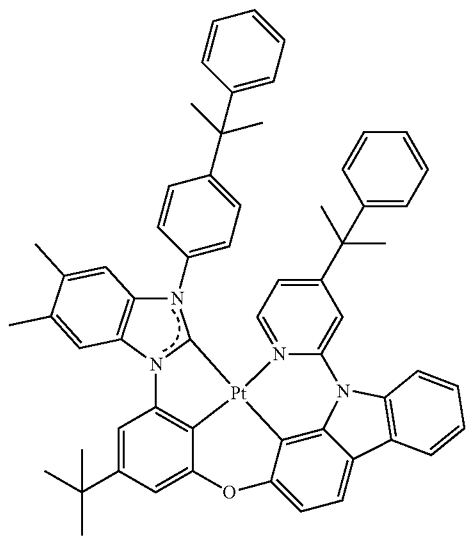
2515
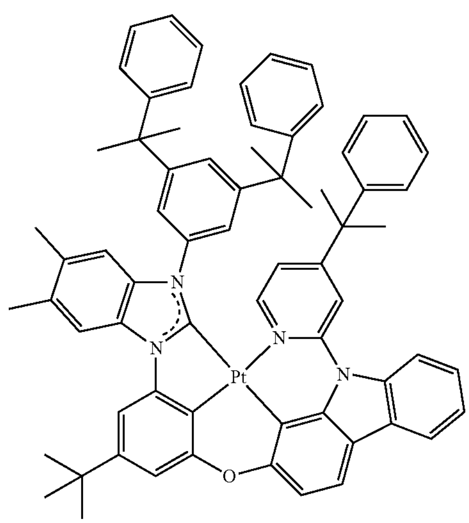

-continued
2516
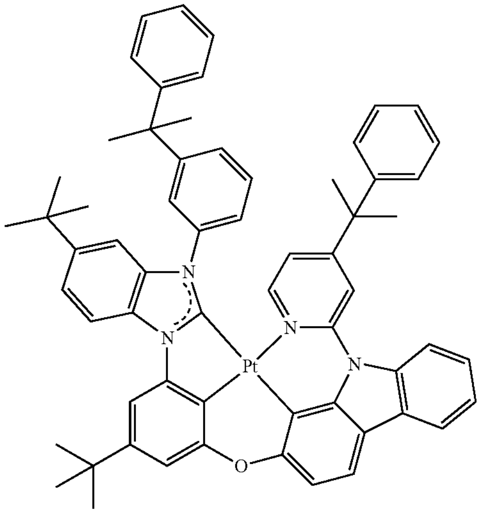
2517
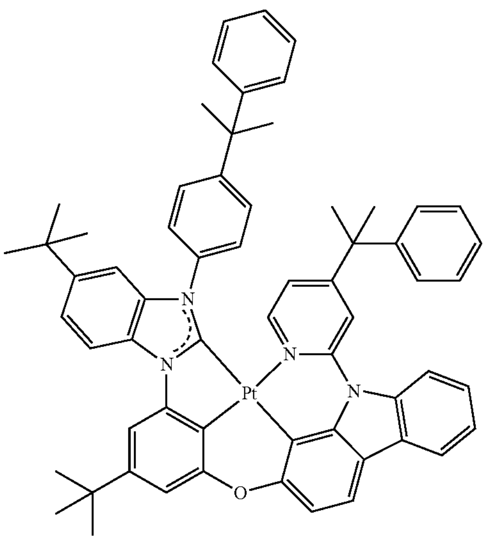
2518
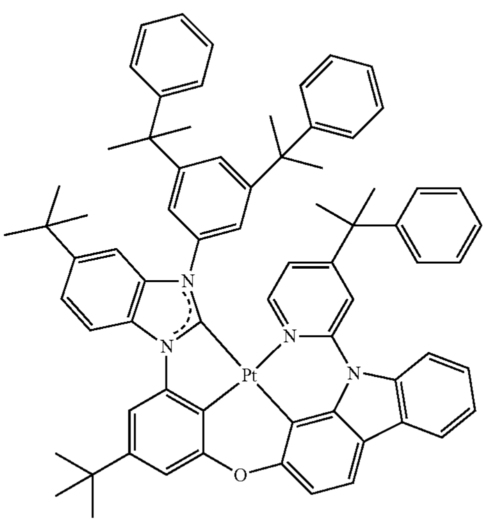
-continued
2519
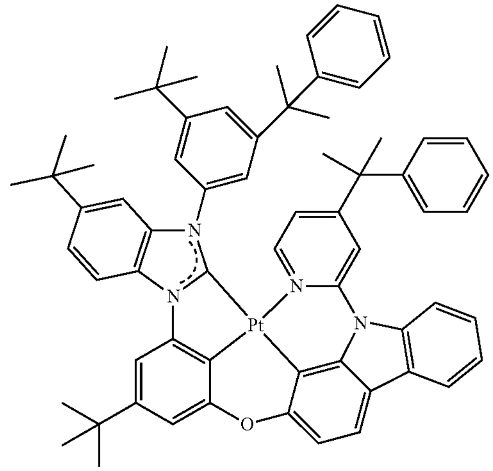
2520
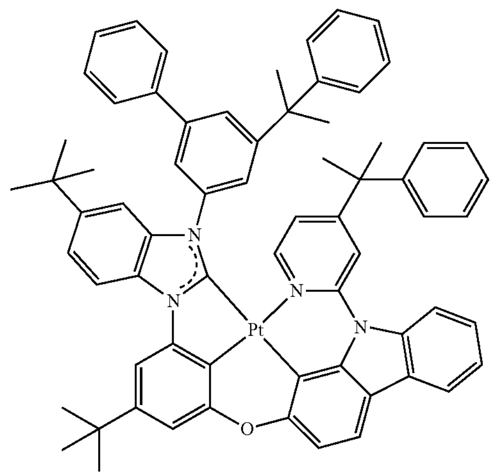
2521
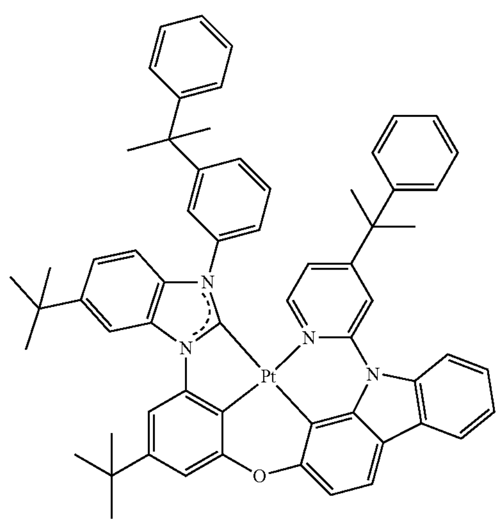

-continued
2522
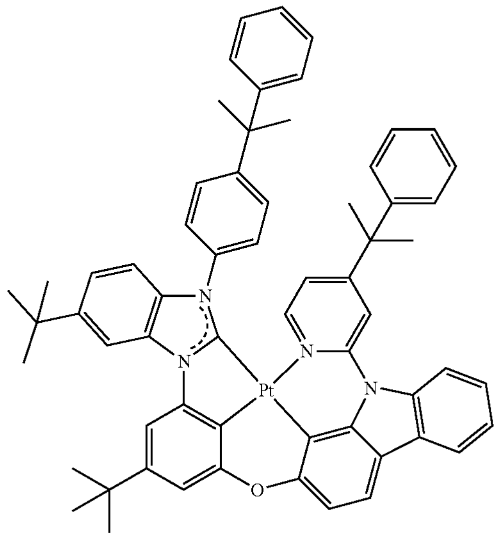
2523
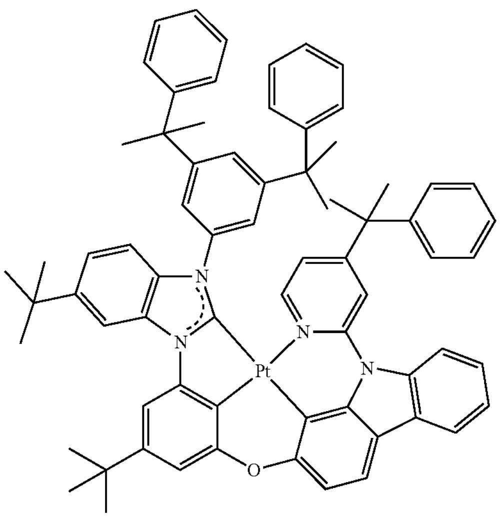
2524
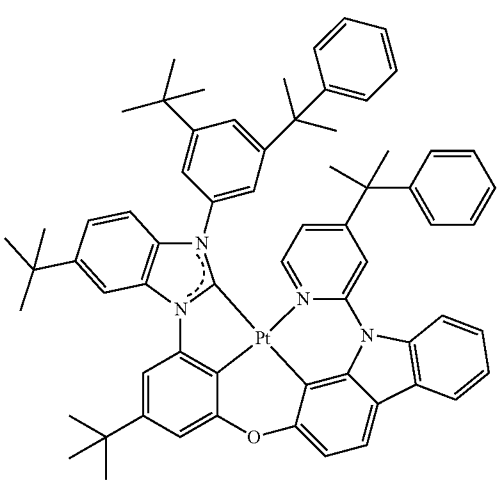
-continued
2525
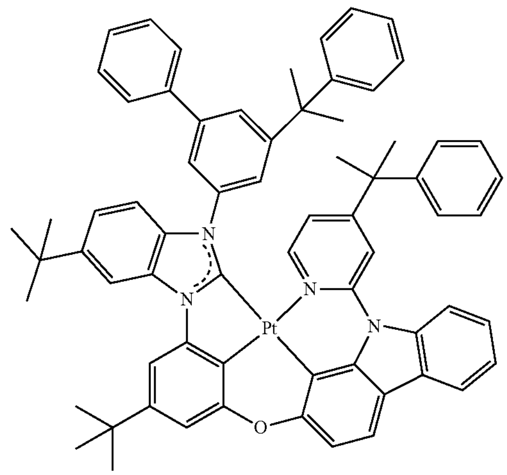
2526
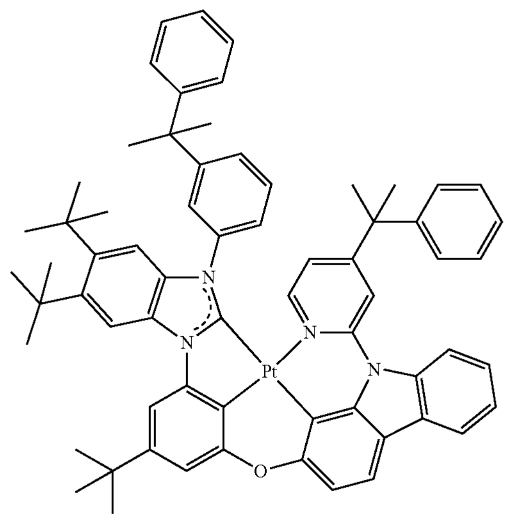
2527
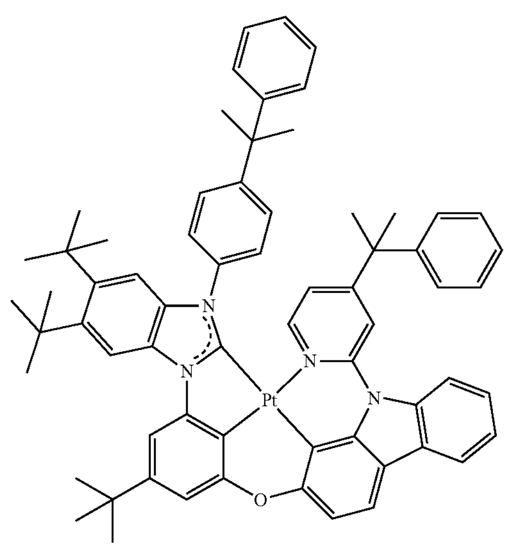

-continued
2528
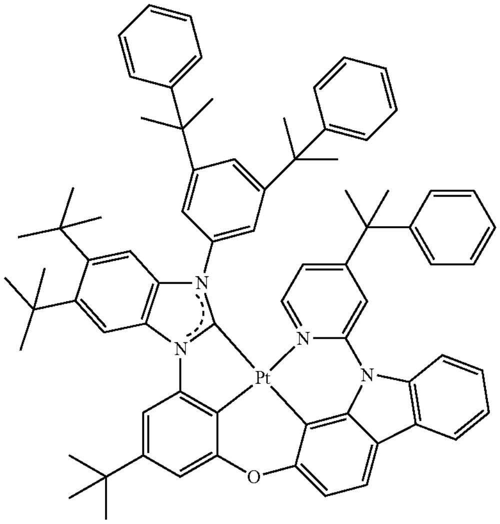
2529
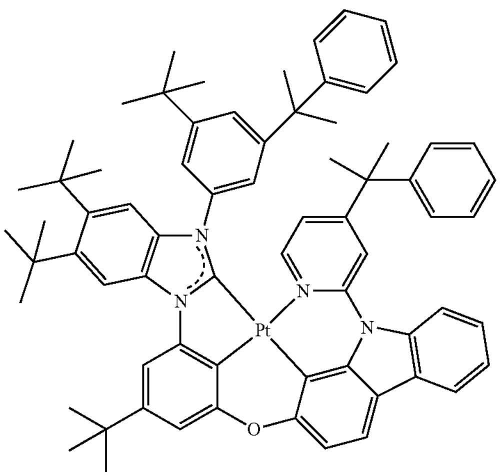
2530
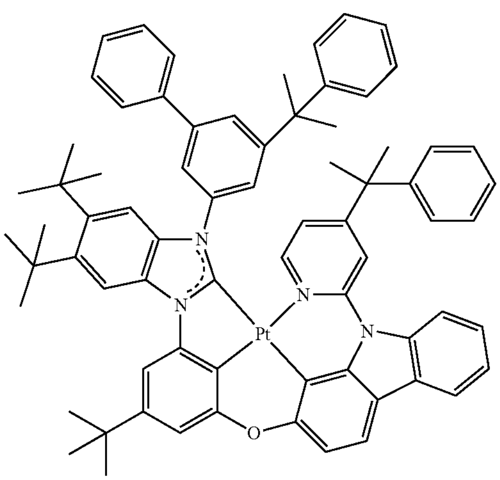
-continued
2531
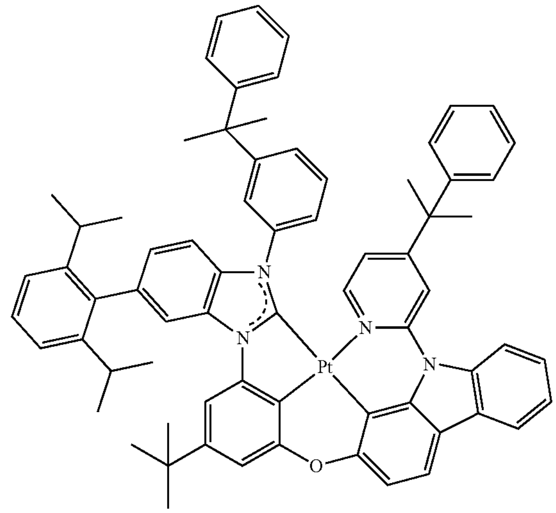
2532
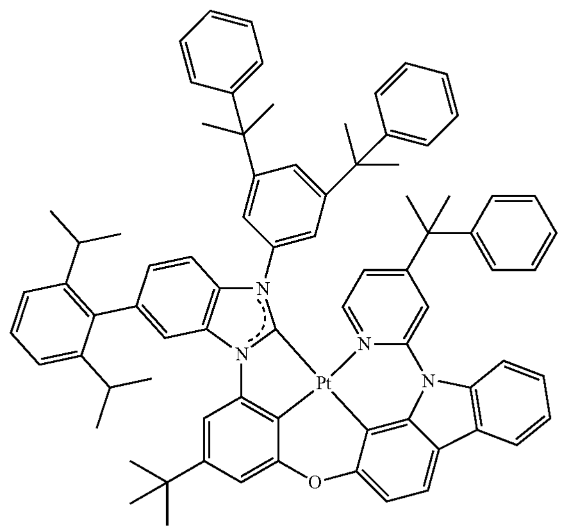
2533
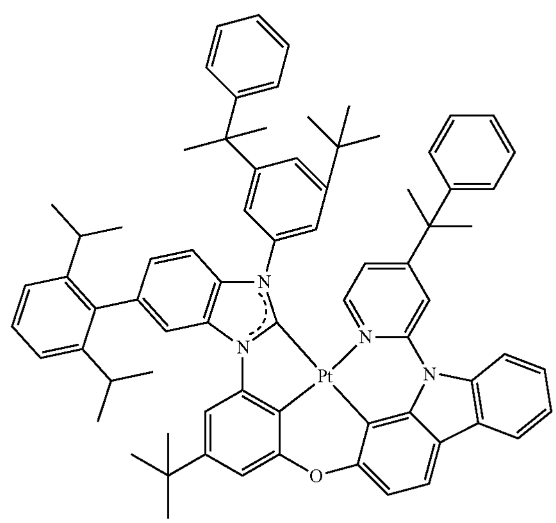

-continued
2534
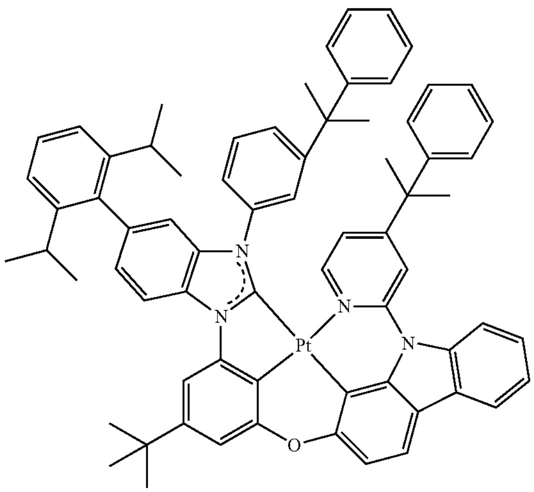
2535
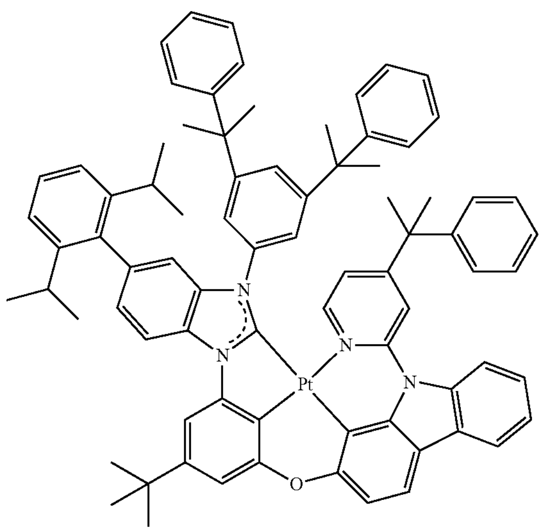
2536
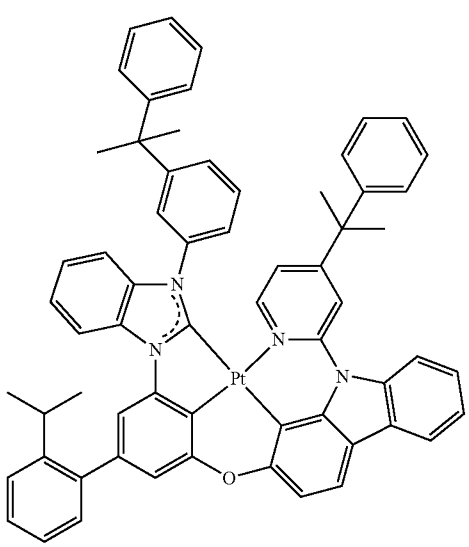
-continued
2537
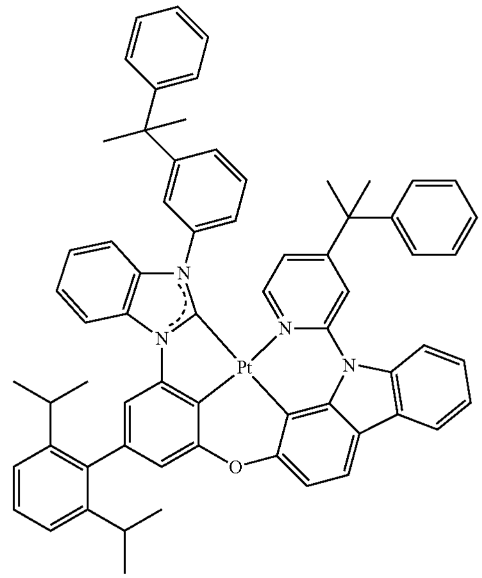
2538
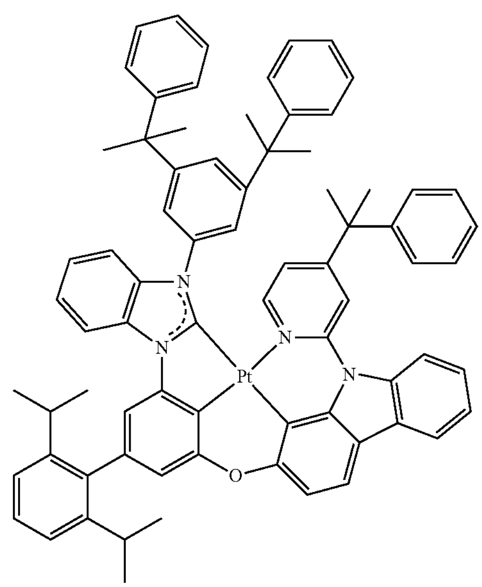

-continued
2539
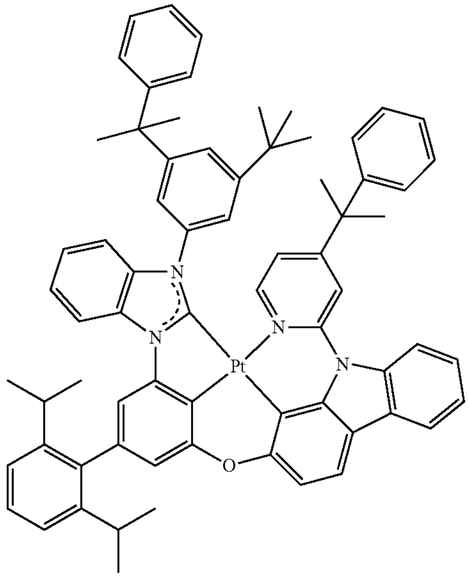
2540
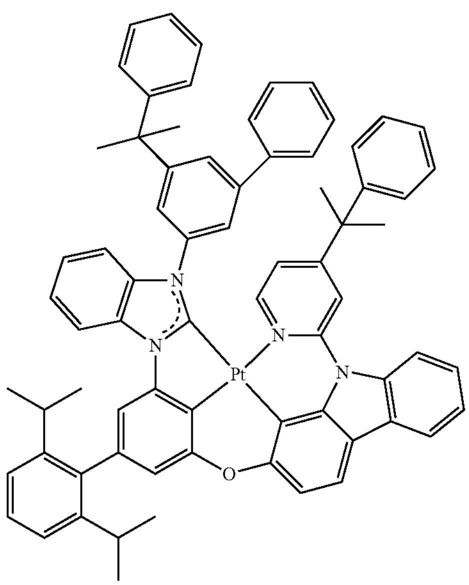
-continued
2541
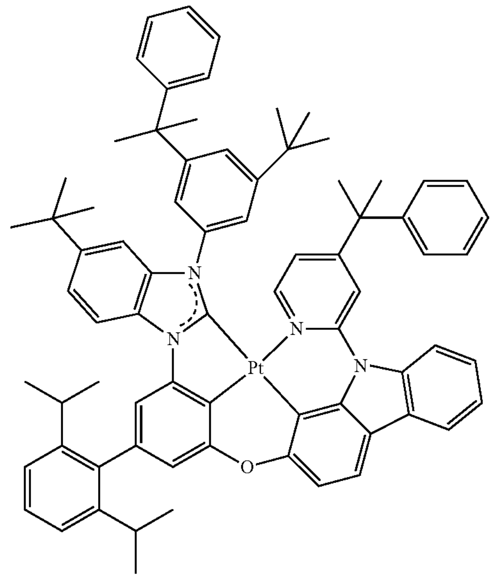
2542
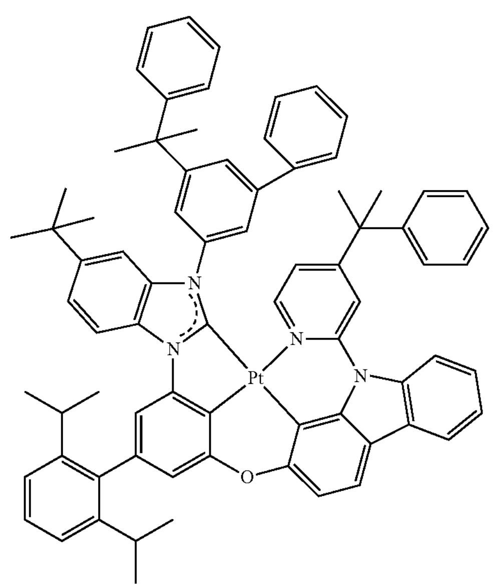

2543
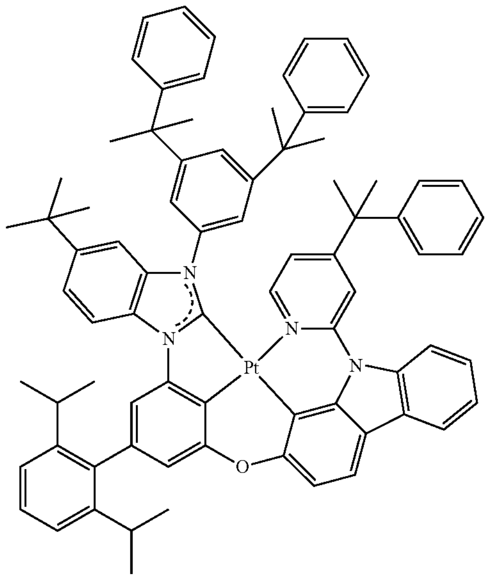
2544
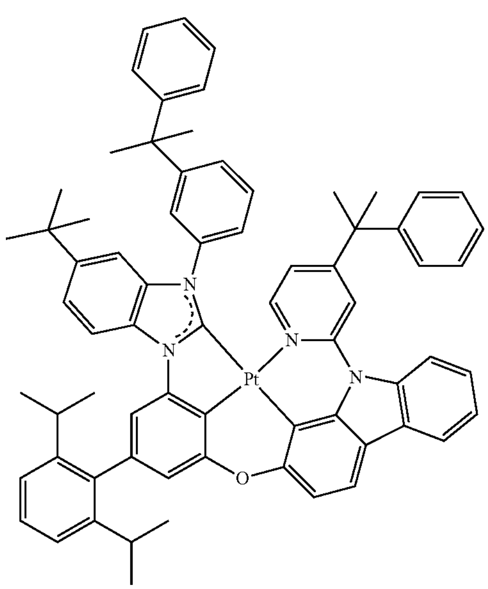
2545
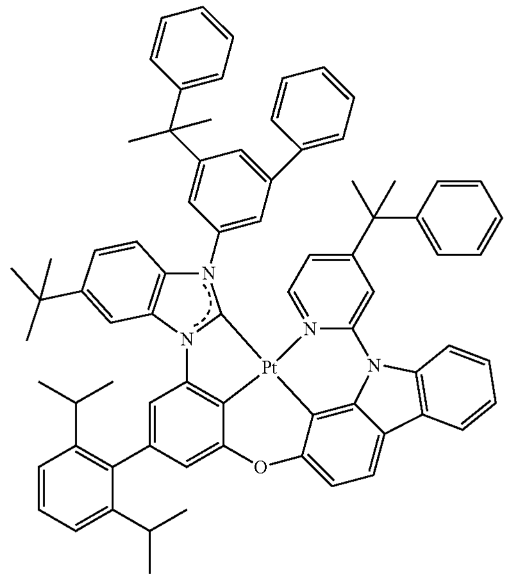
2546
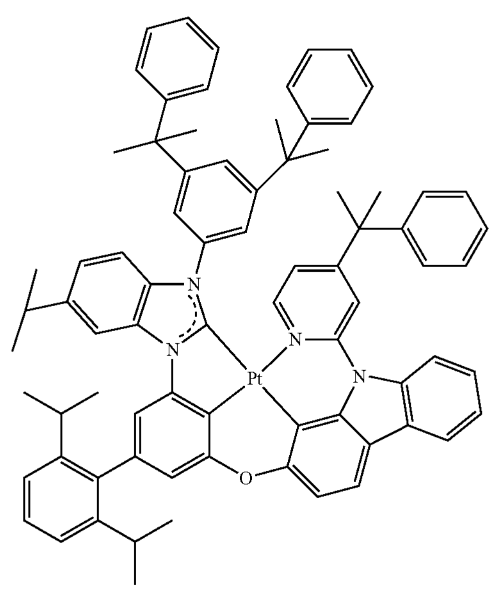

-continued
2547
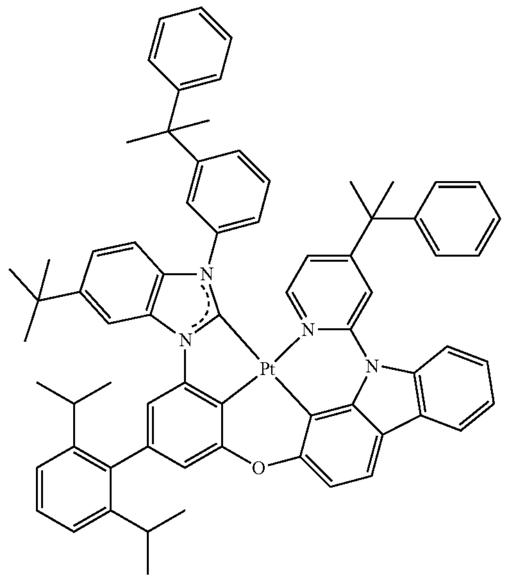
2548
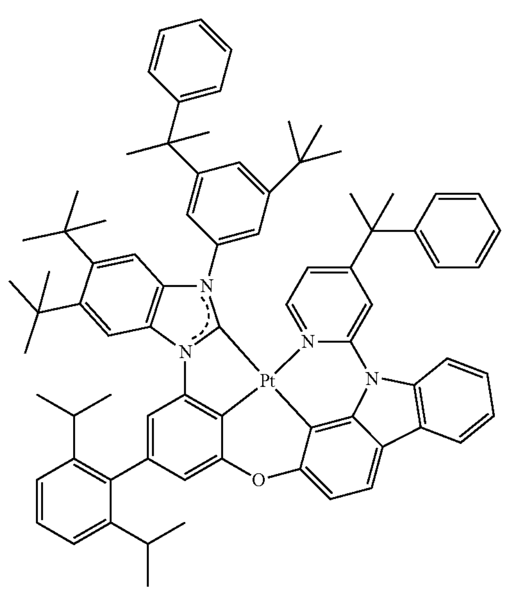
-continued
2549
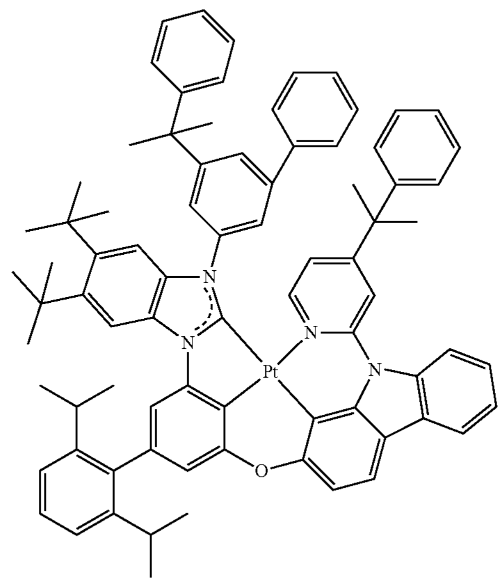
2550
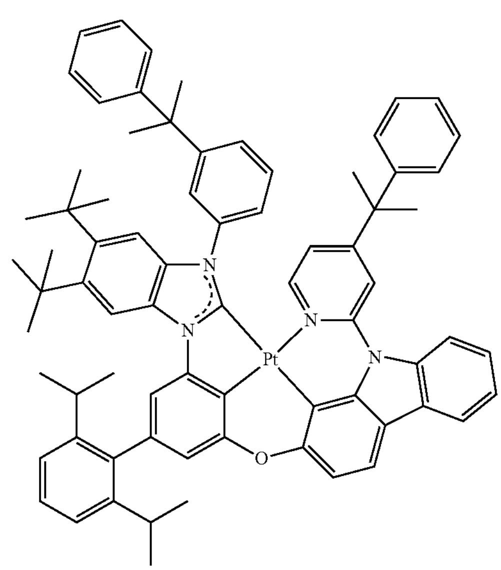

-continued
2551
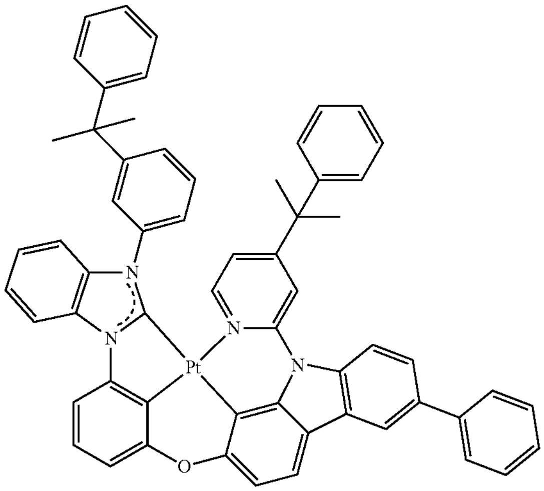
2552
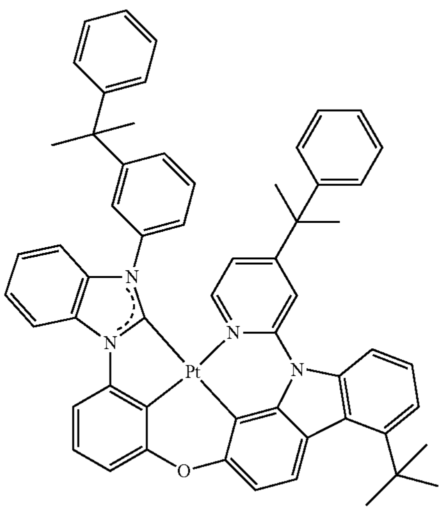
2553
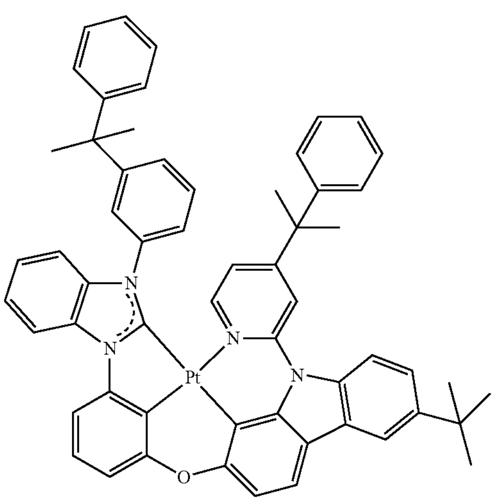
-continued
2554
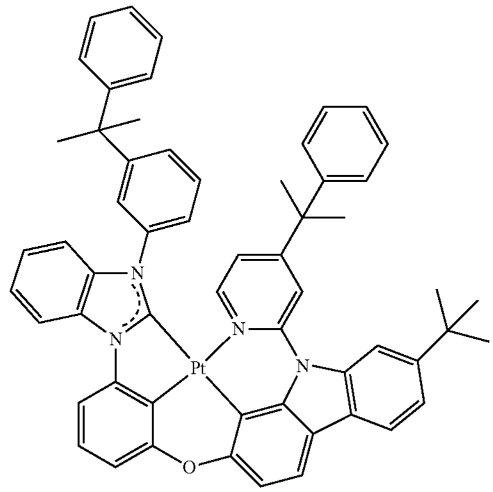
2555
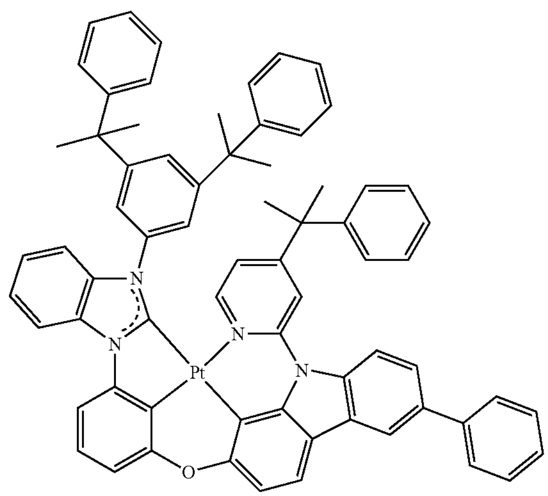
2556
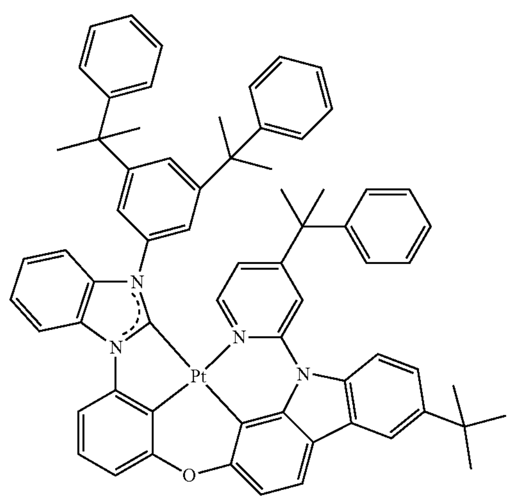

-continued
2557
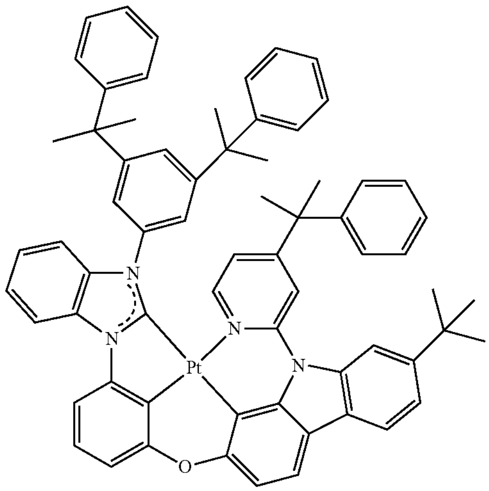
2558
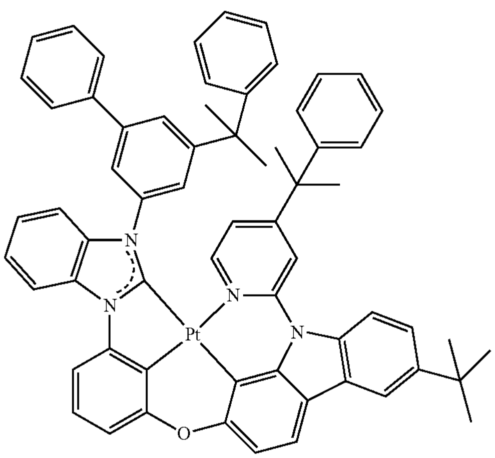
2559
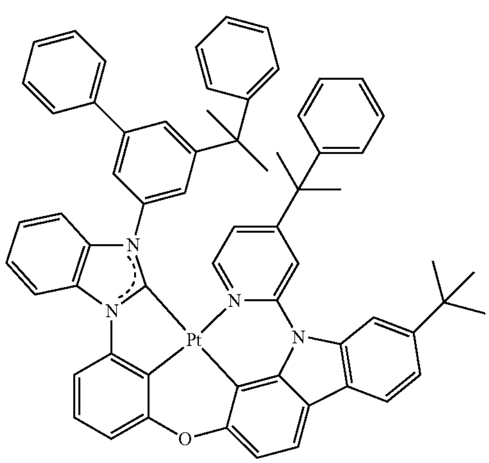
-continued
2560
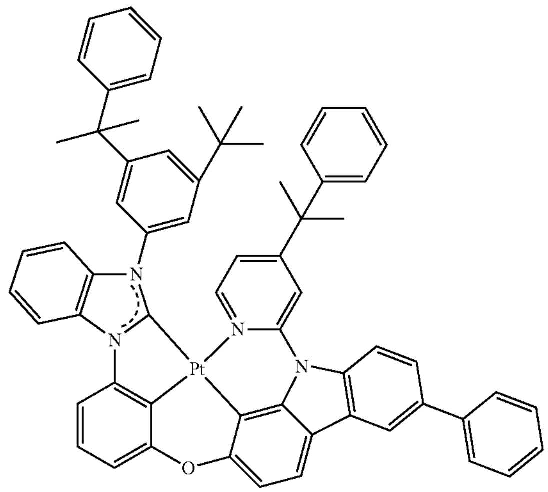
2561
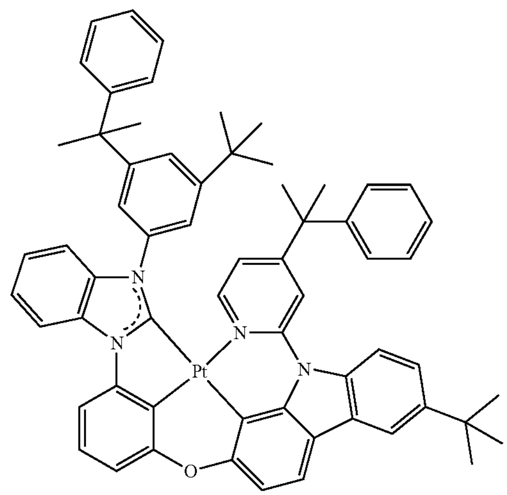
2562
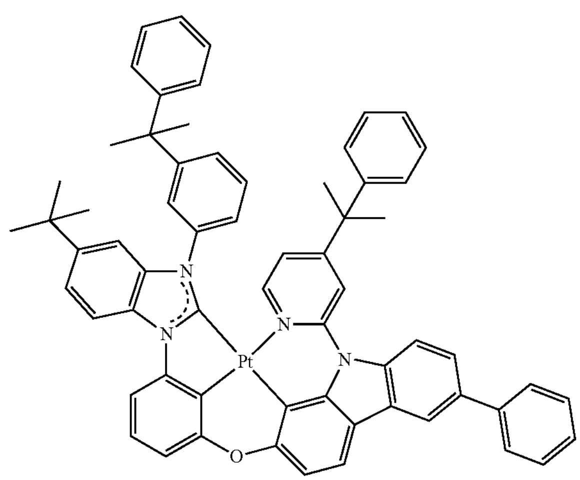

-continued
2563
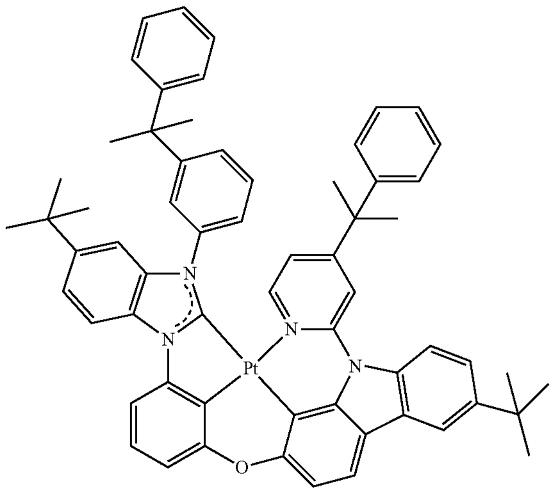
2564
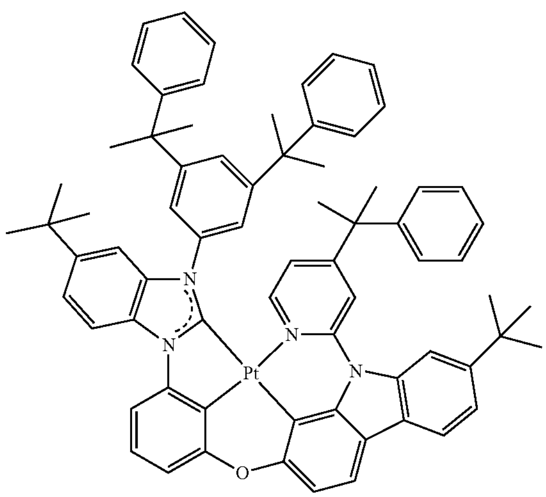
2565
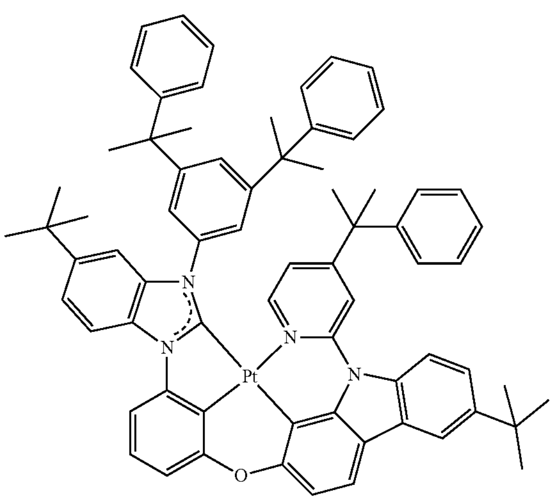
-continued
2566
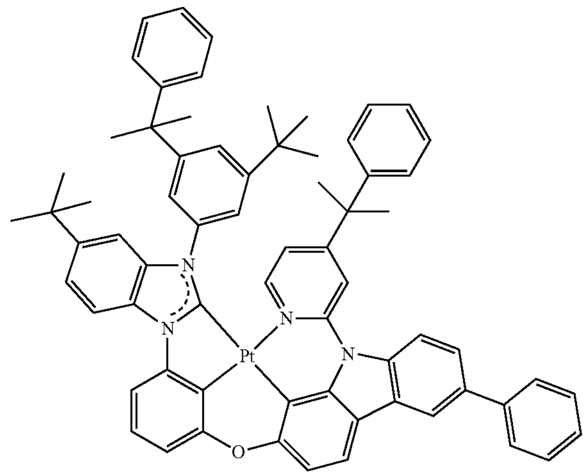
2567
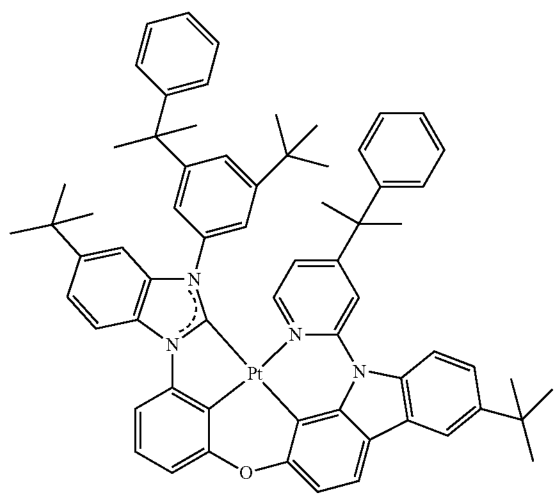
2568
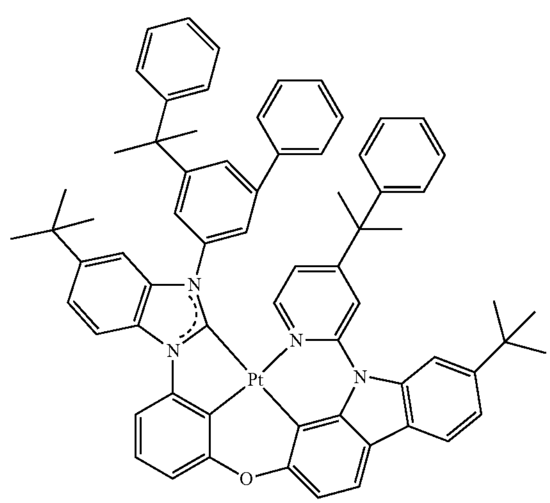

-continued
2569
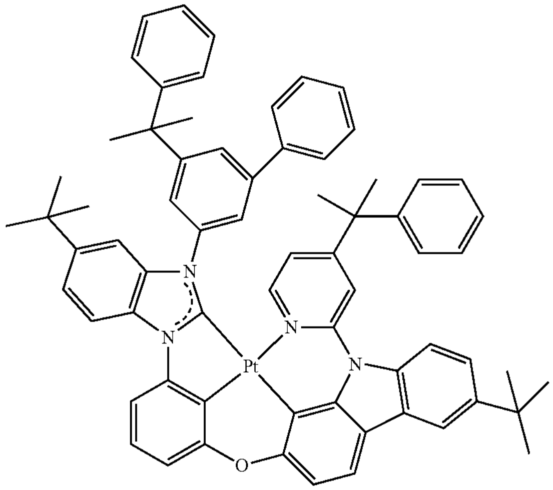
2570
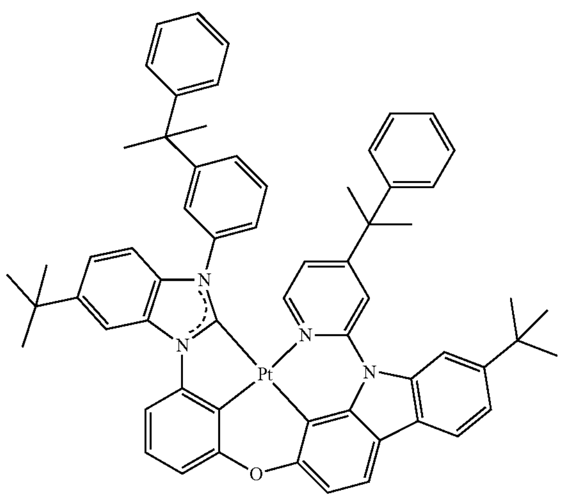
2571
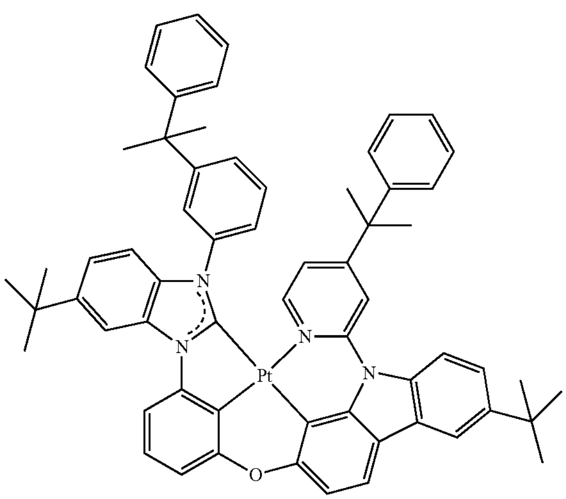
-continued
2572
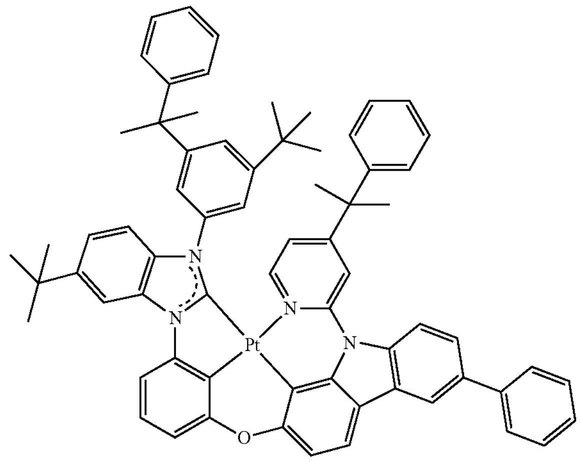
2573
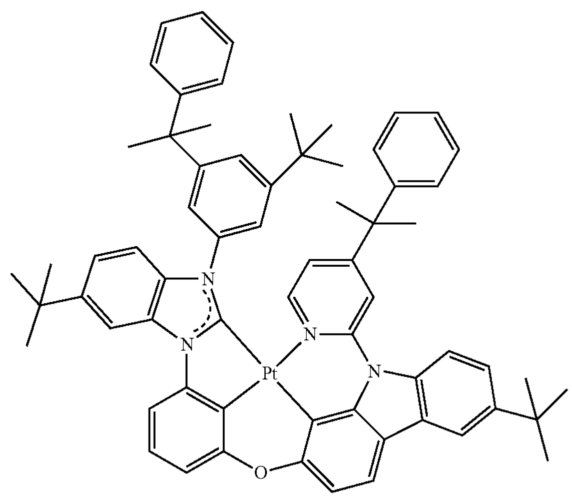
2574
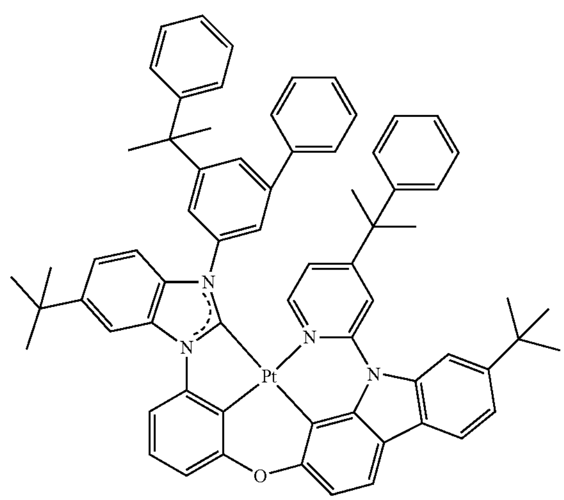

2575
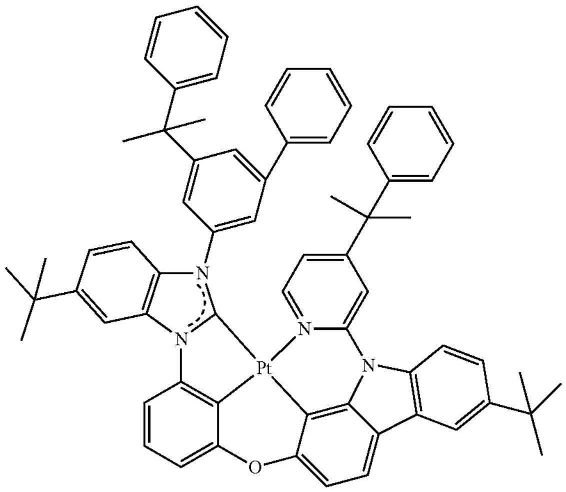
2576
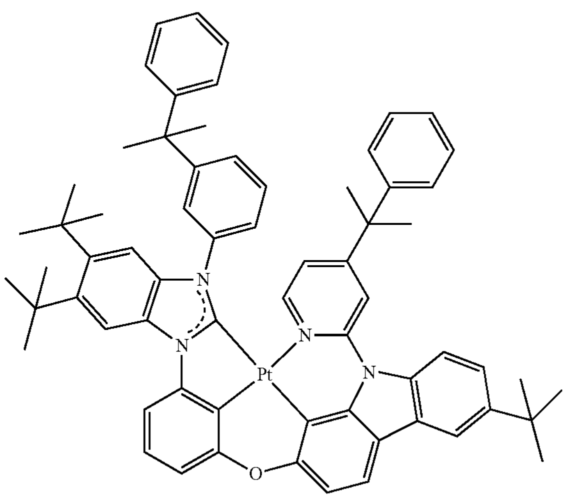
2577
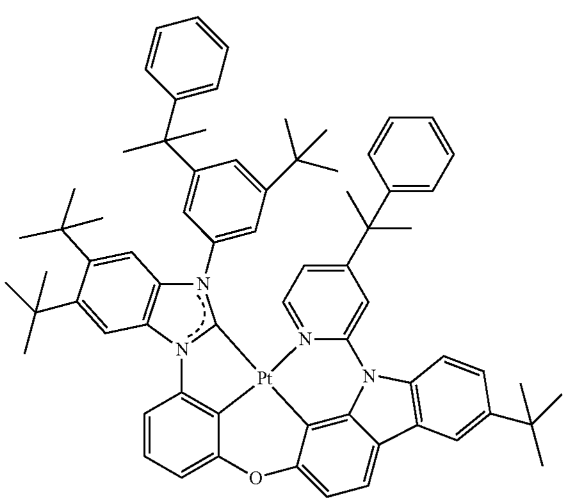
2578
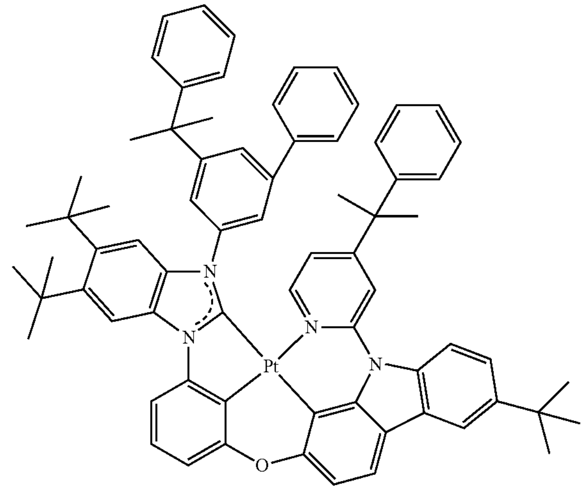
2579
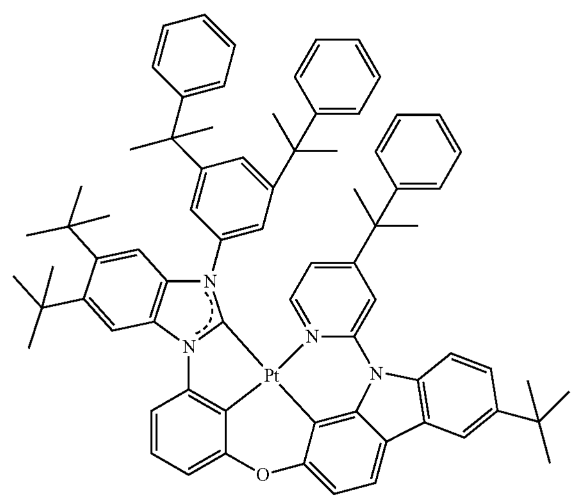
2580
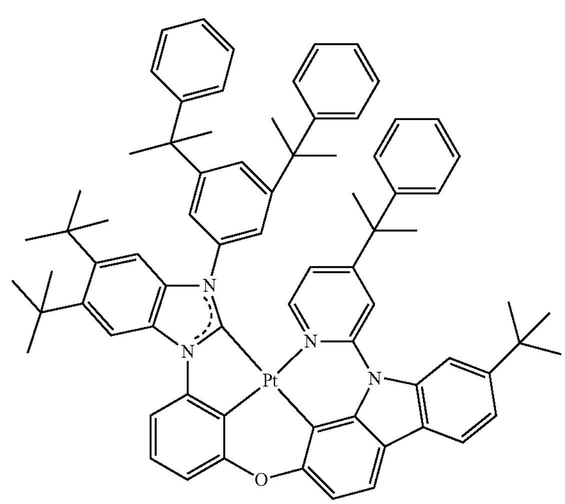

-continued
2581
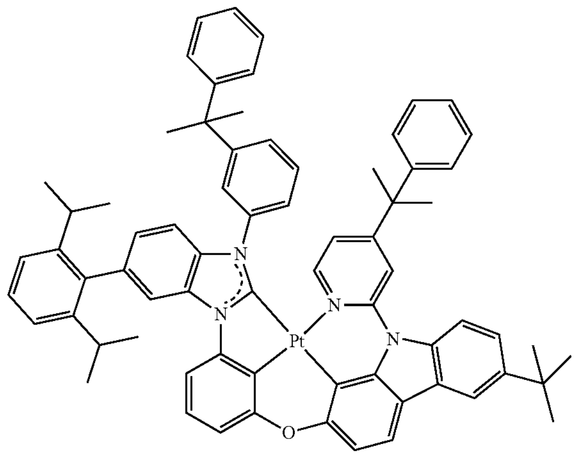
2582
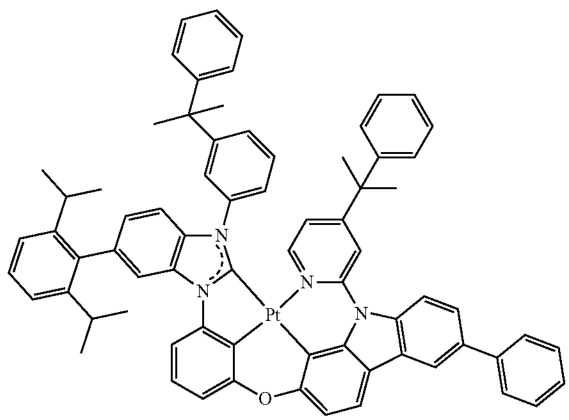
2583
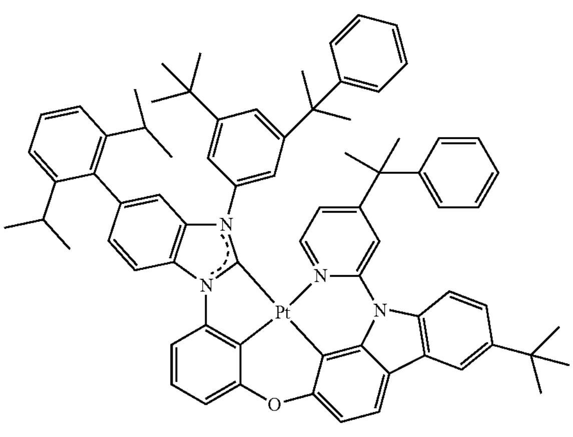
-continued
2584
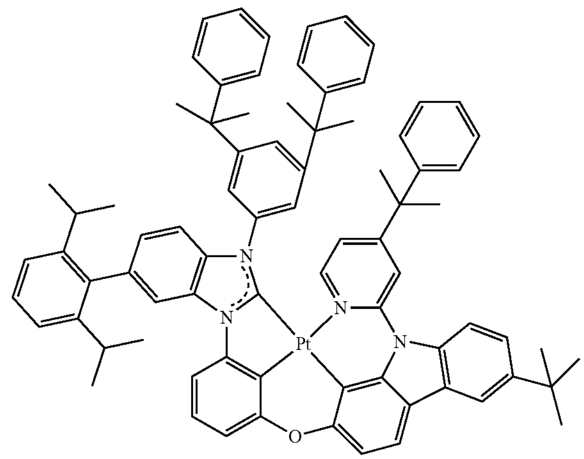
2585
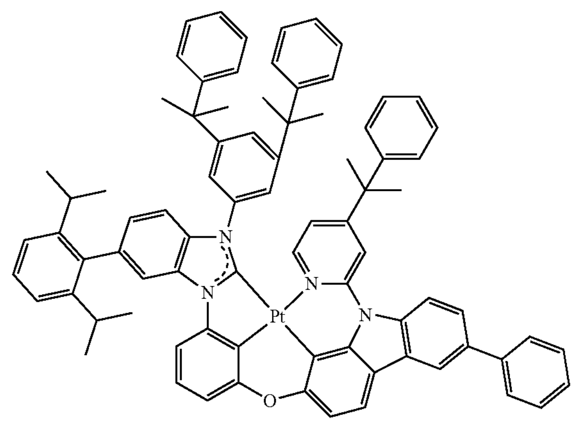
2586
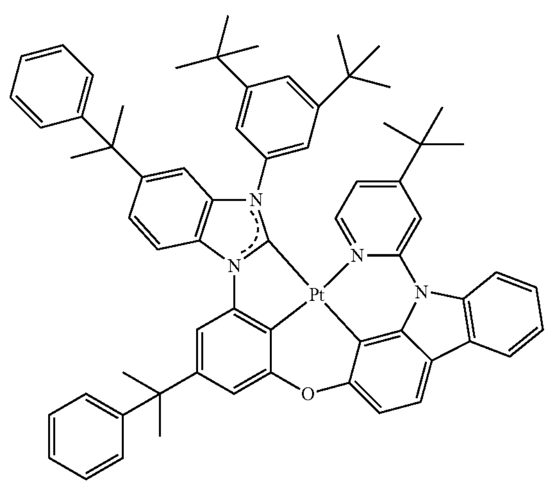

-continued
2587
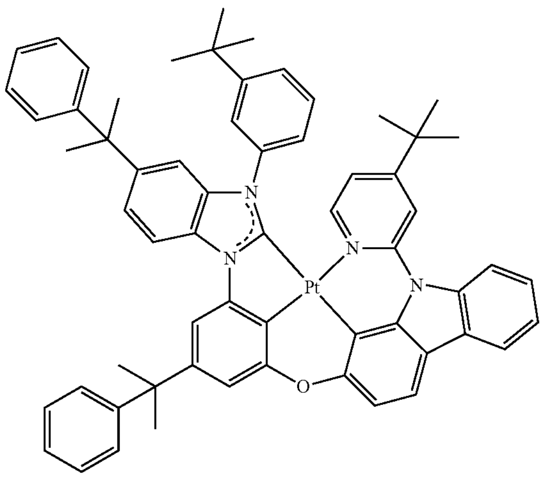
2588
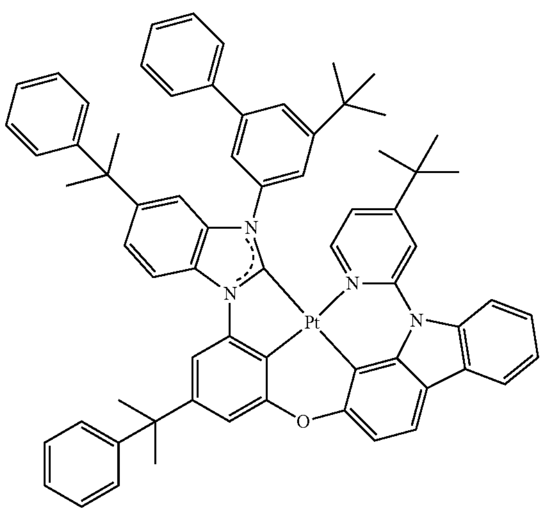
2589
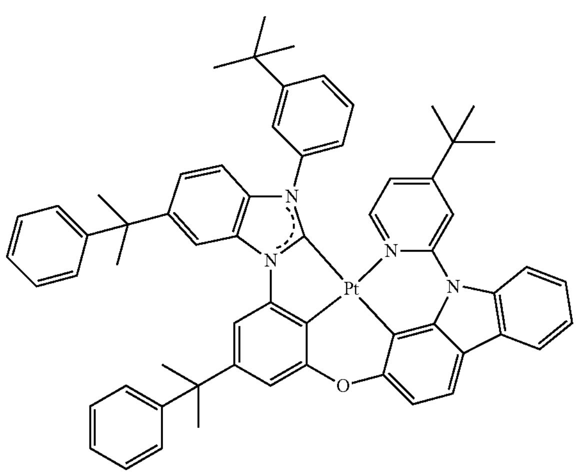
-continued
2590
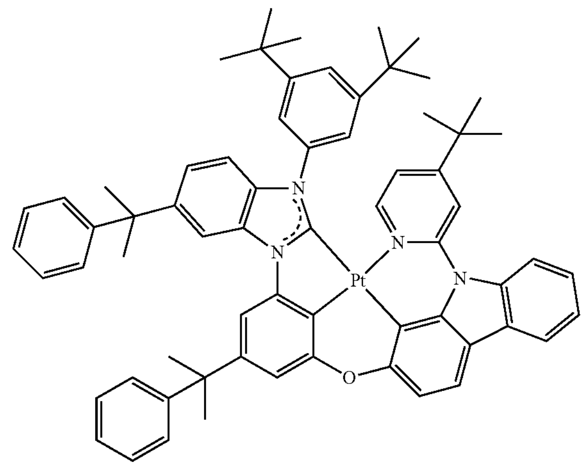
2591
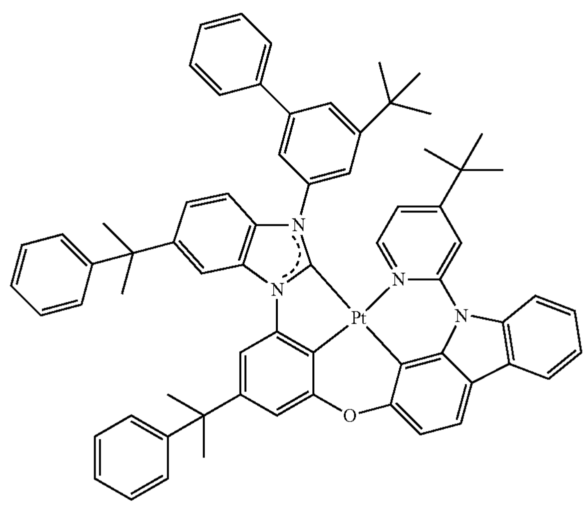
2592
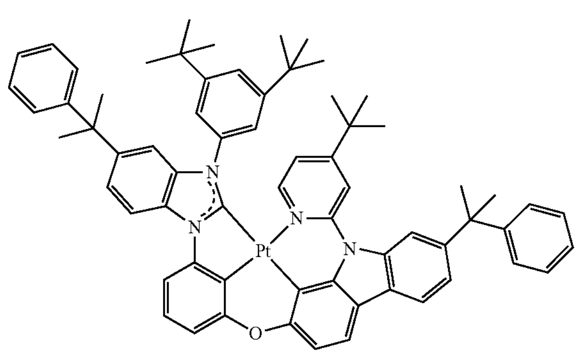

-continued
2593
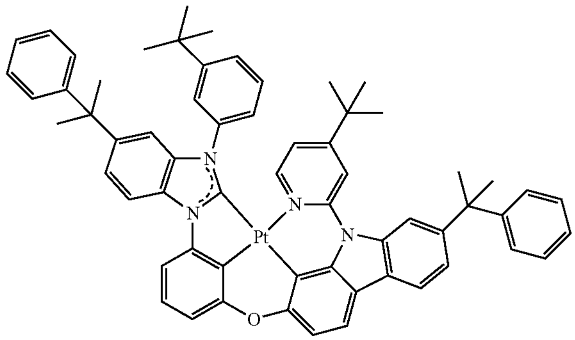
2594
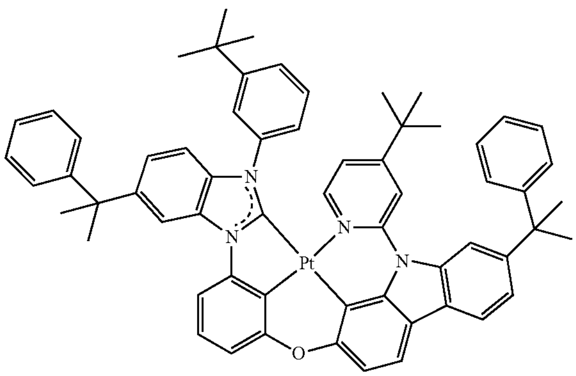
2595
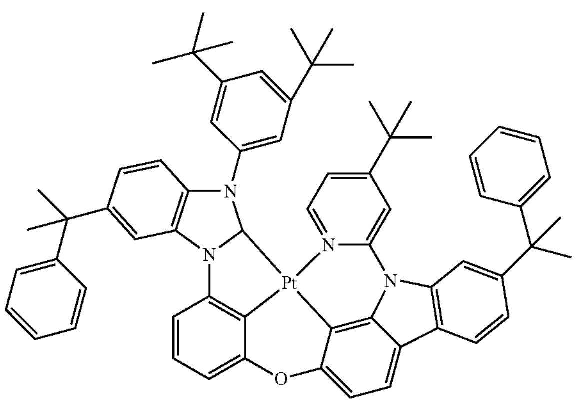
2596
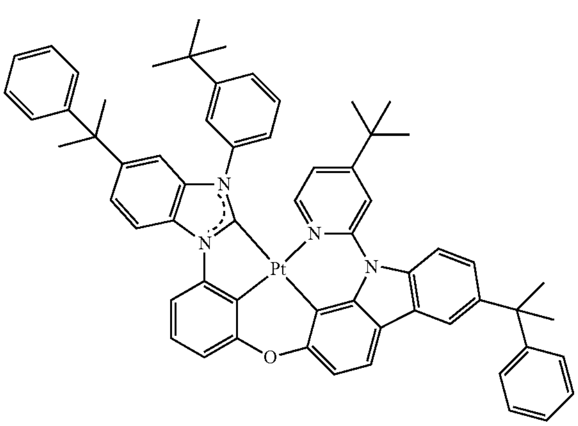
-continued
2597
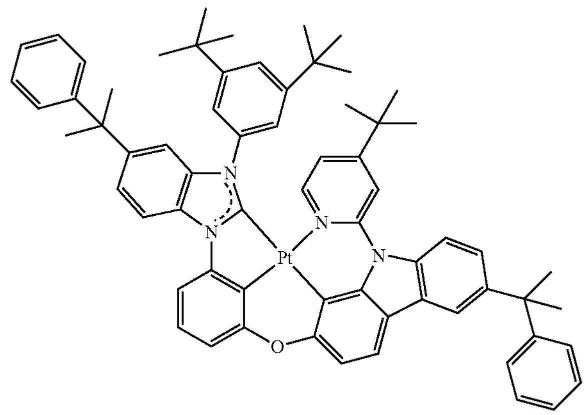
2598
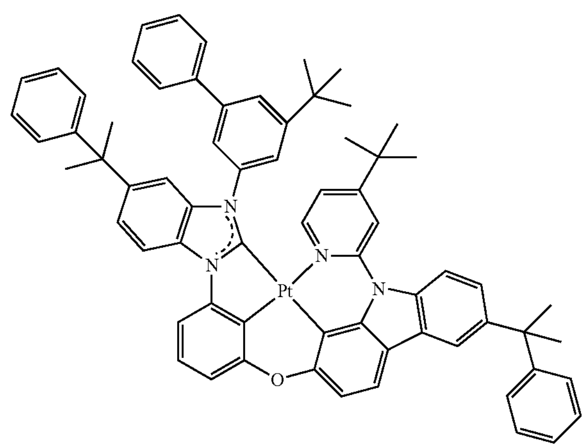
2599
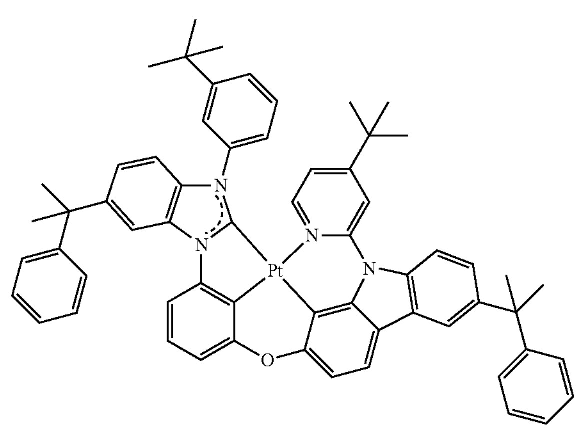

2600
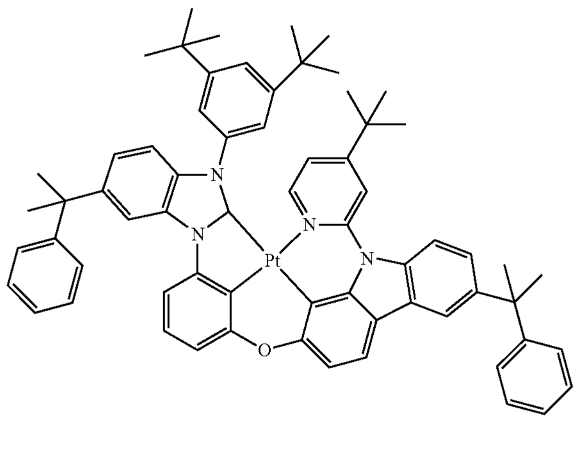
2601
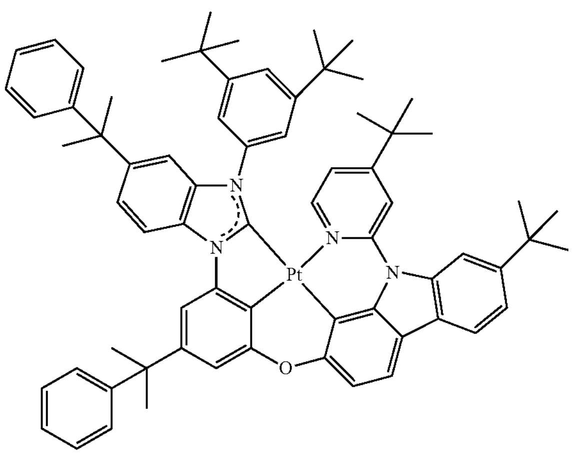
2602
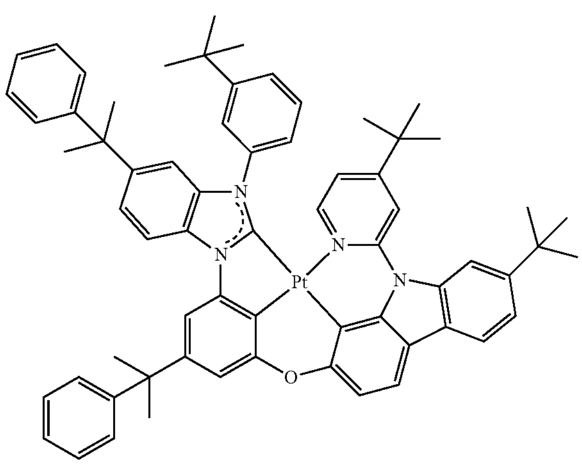
2603
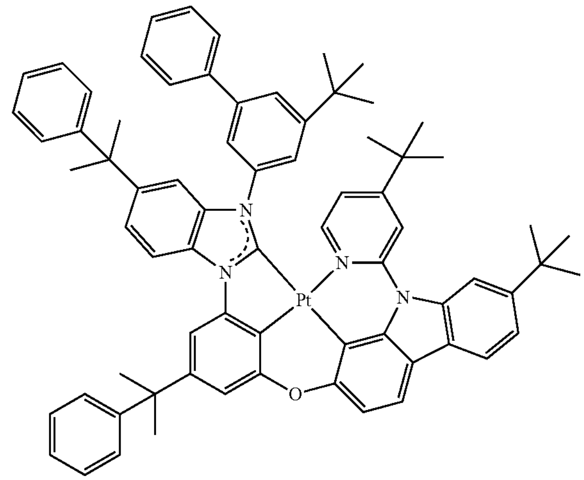
2604
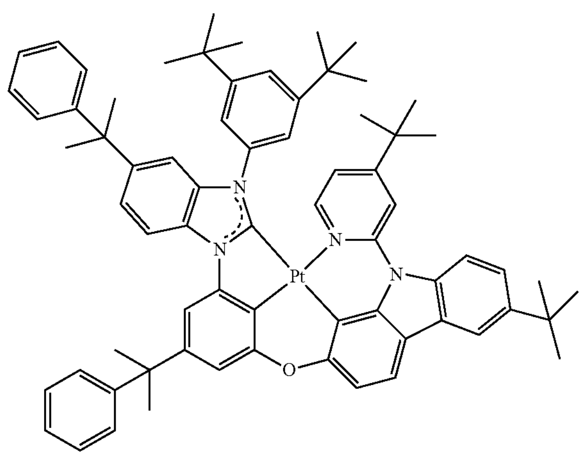
2605
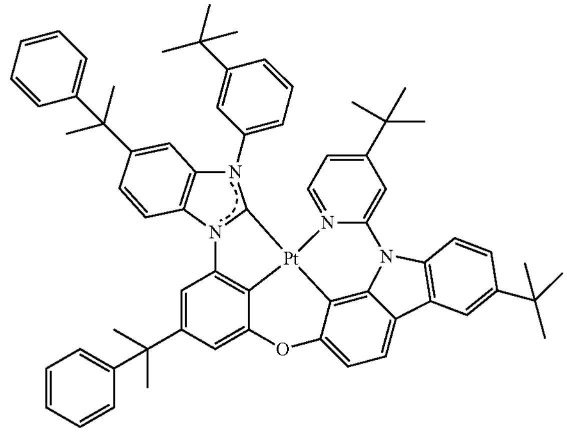

2606
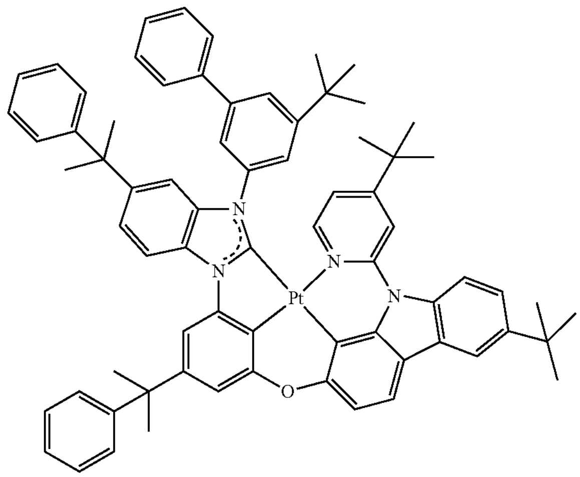
2607
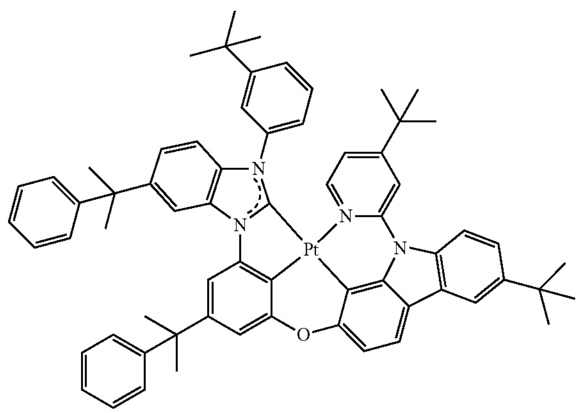
2608
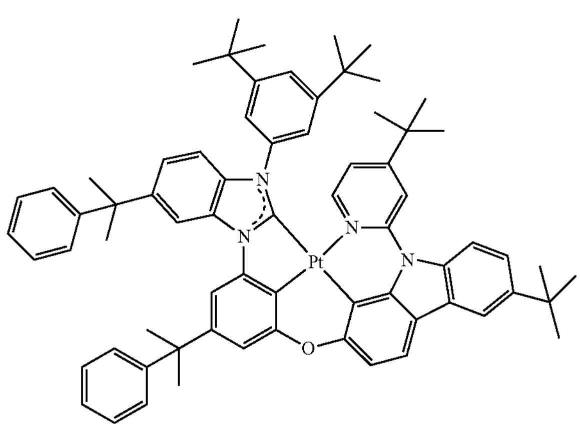
2609
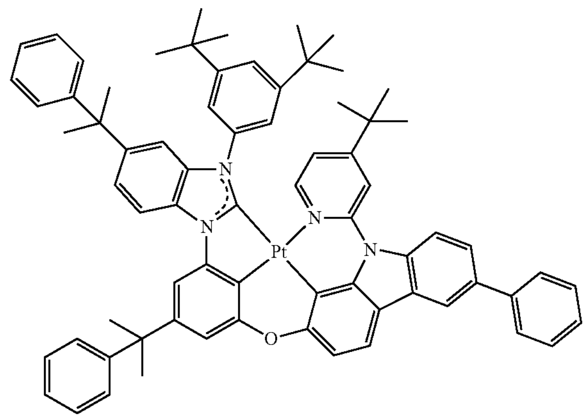
2610
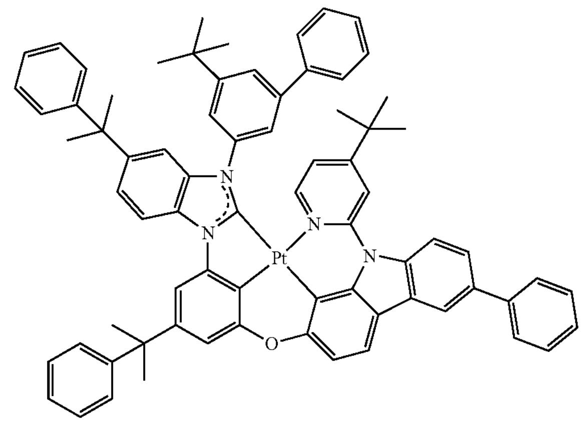
2611
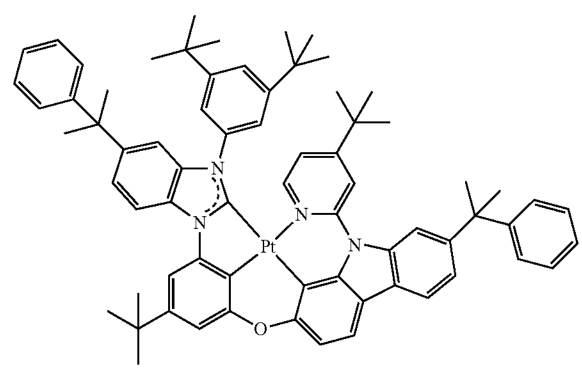
2612
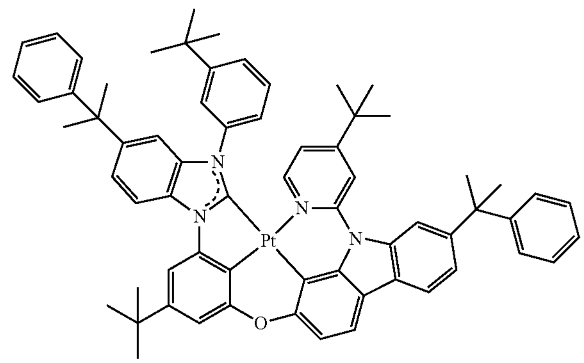

-continued
2613
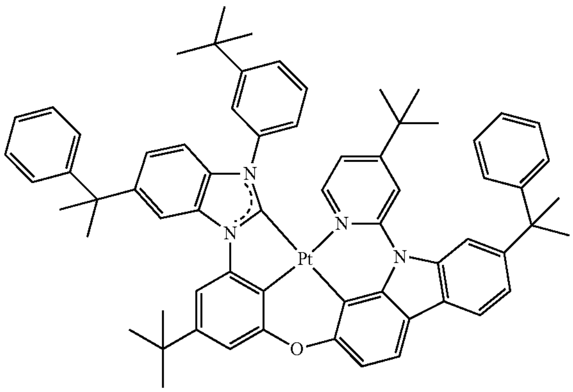
2614
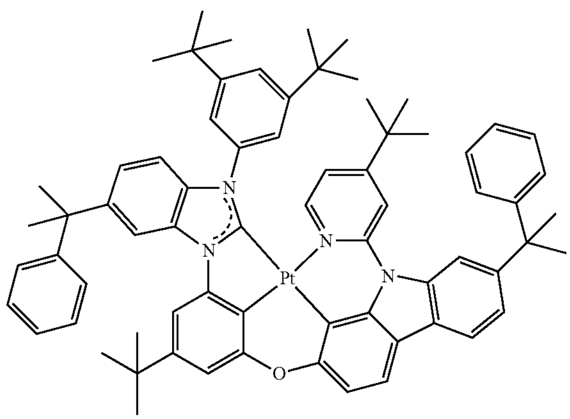
2615
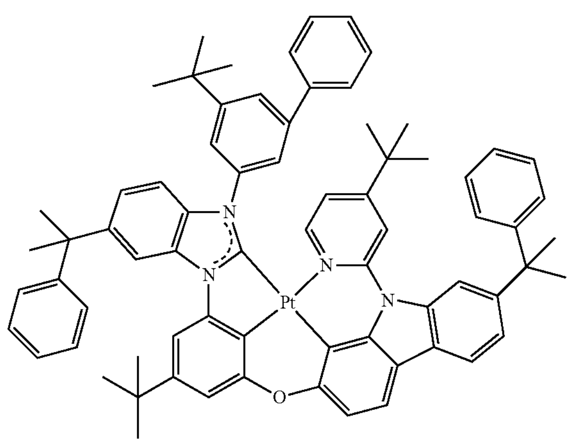
-continued
2616
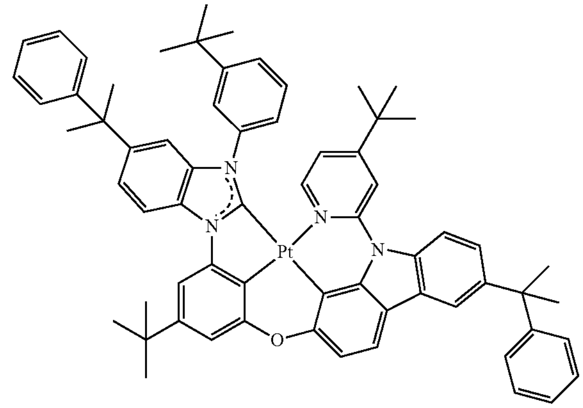
2617
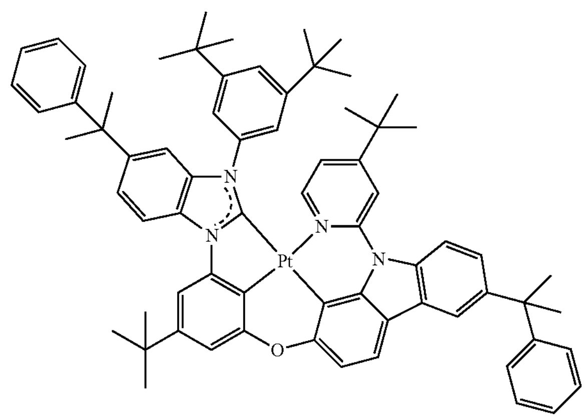
2618
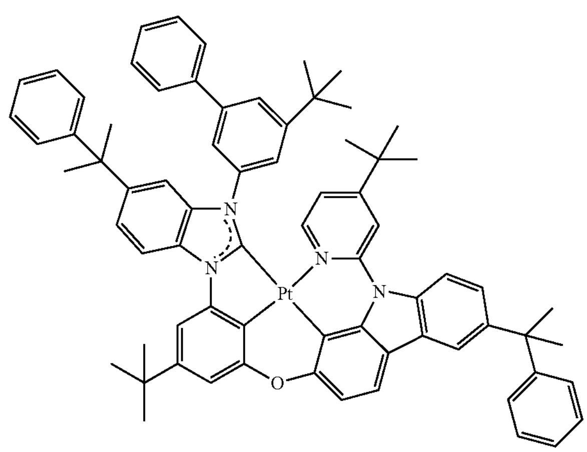

-continued
2619
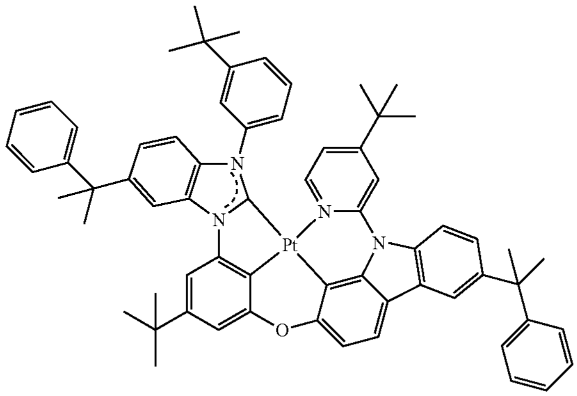
2620
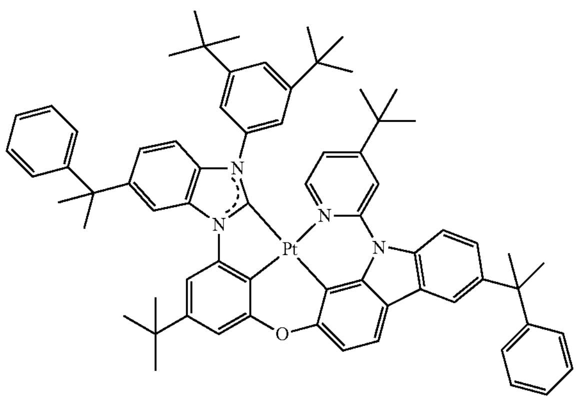
2621
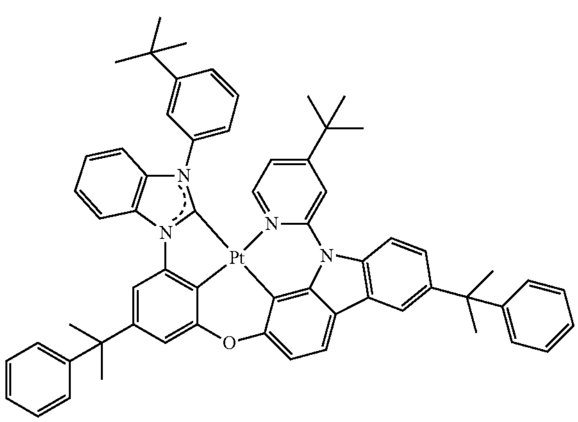
-continued
2622
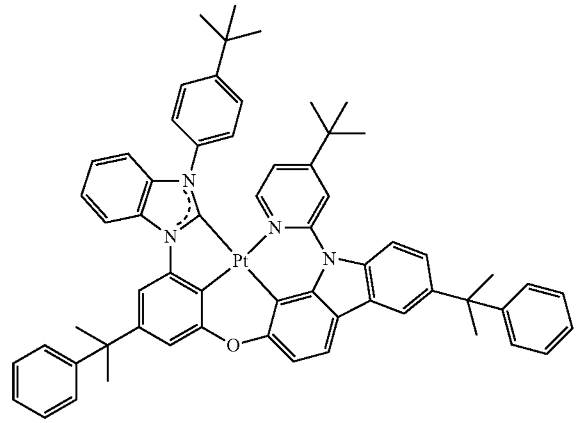
2623
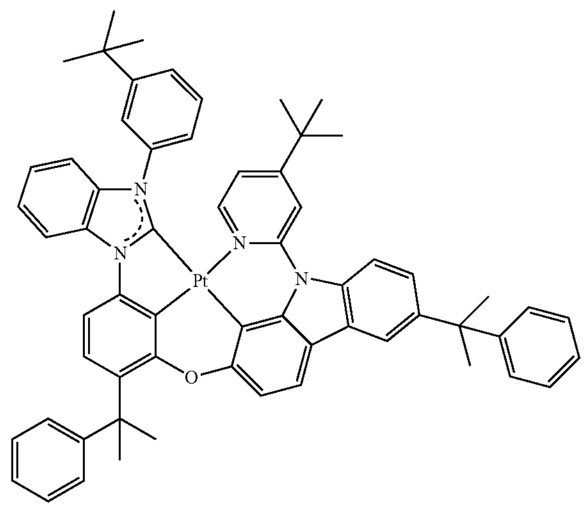
2624
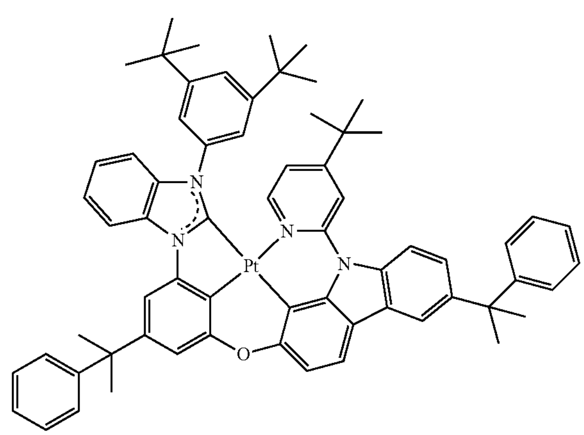

-continued
2625
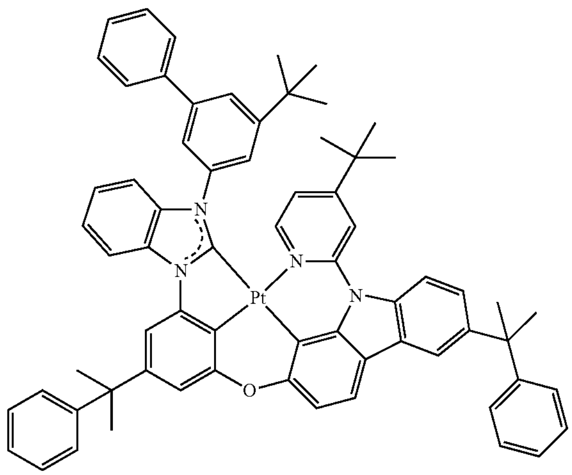
2626
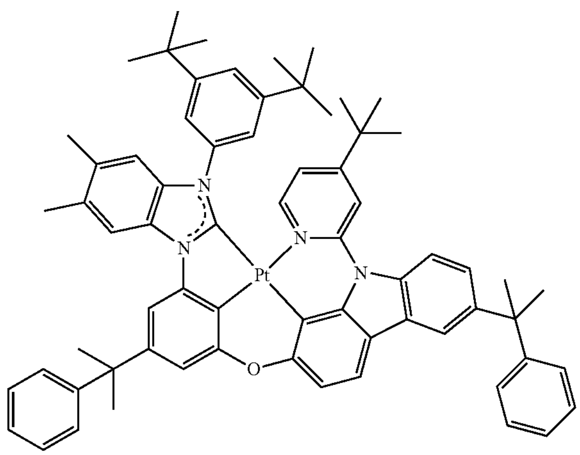
2627
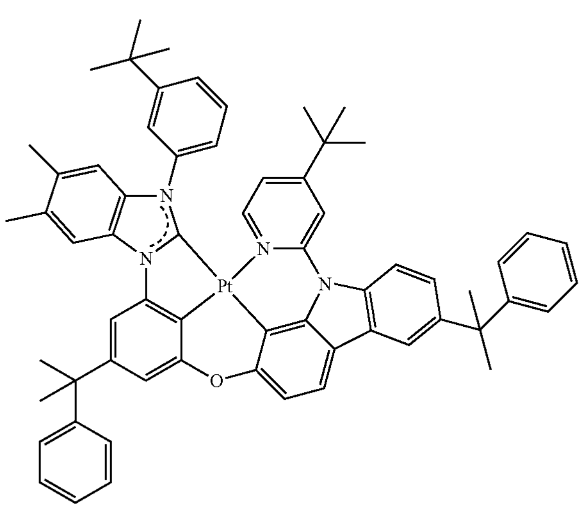
-continued
2628
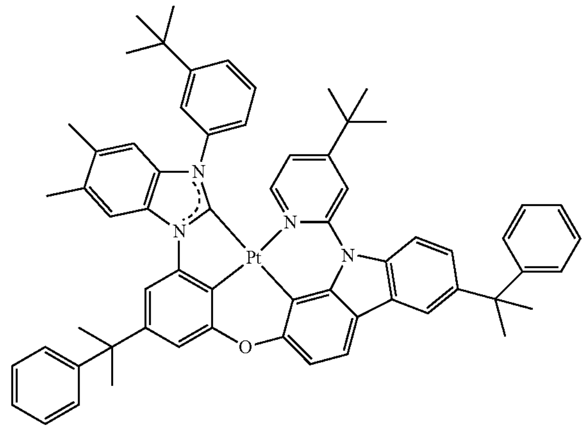
2629
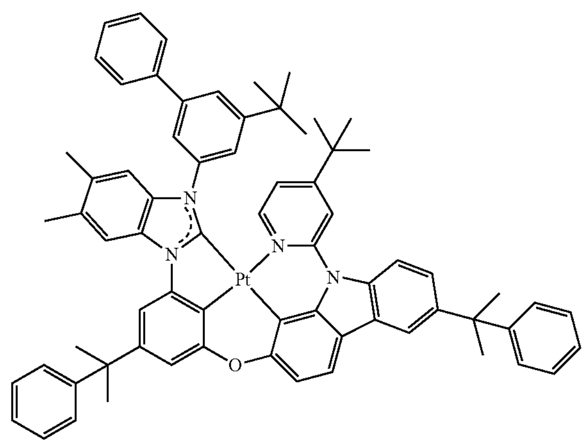
2630
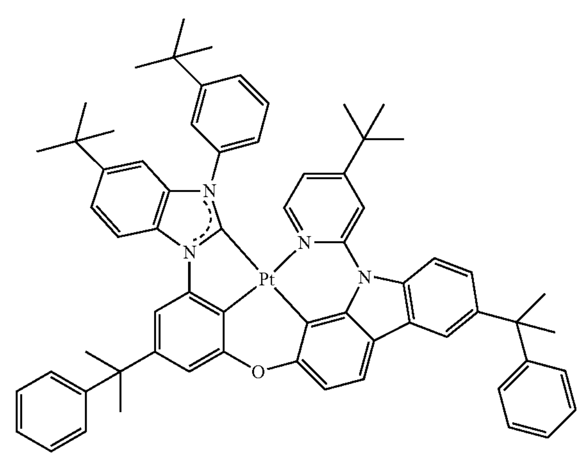

2631
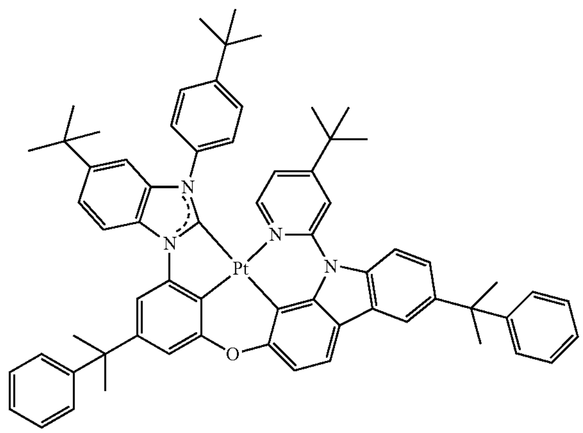
2632
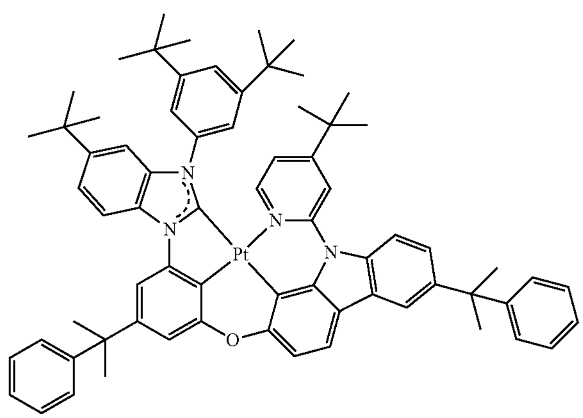
2633
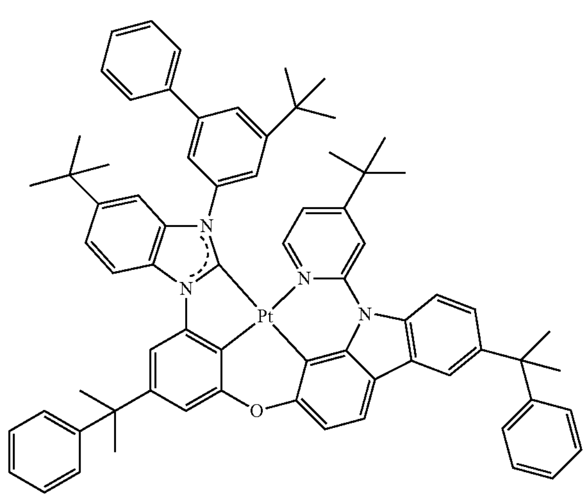
2634
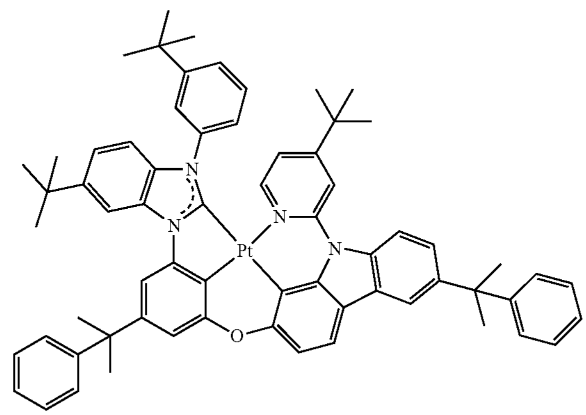
2635
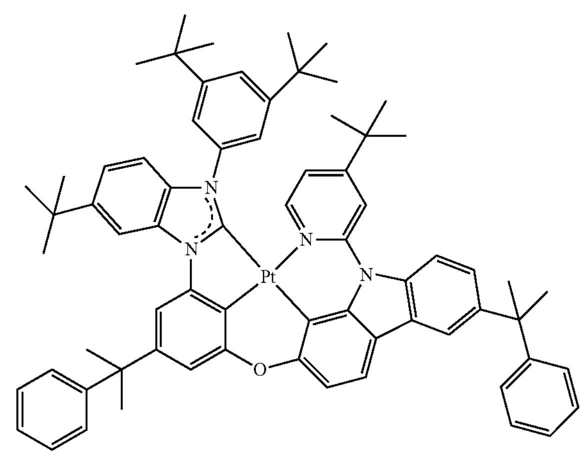
2636
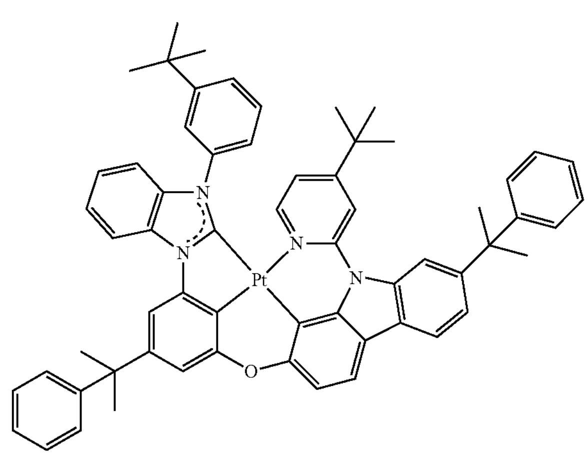

-continued
2637
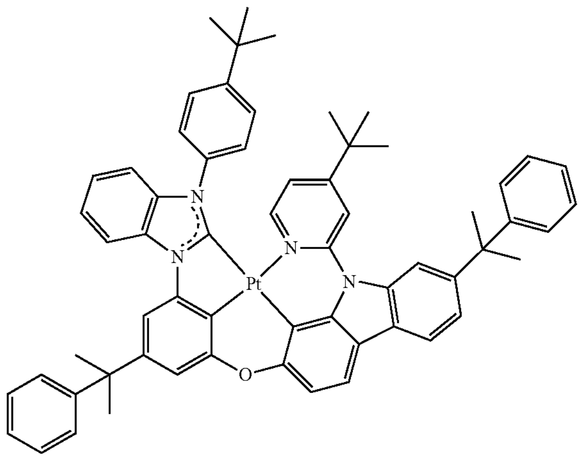
2638
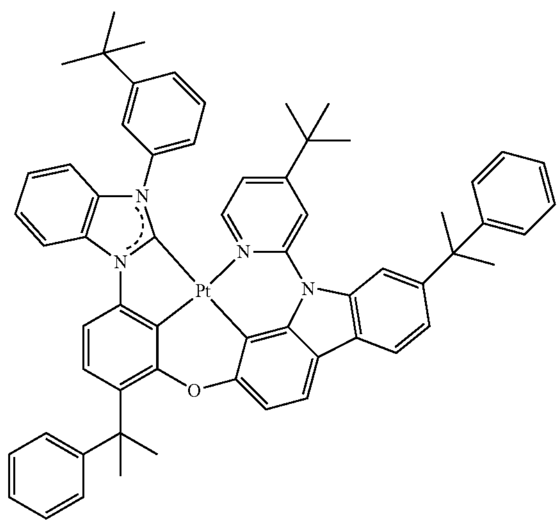
2639
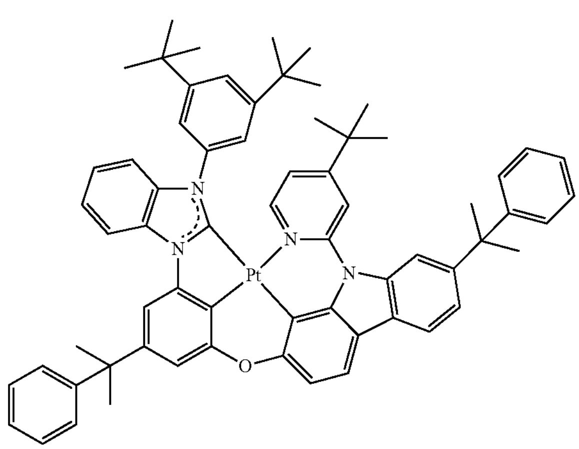
-continued
2640
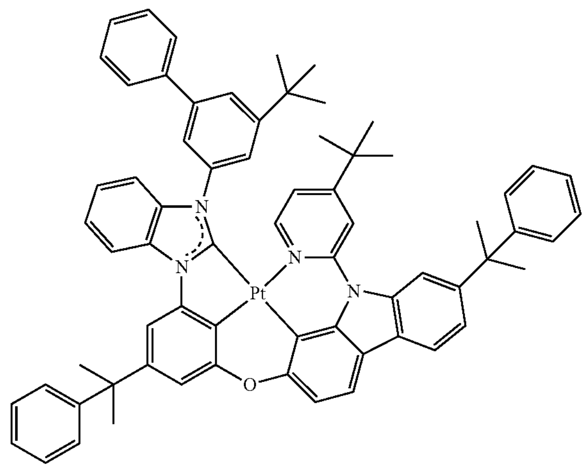
2641
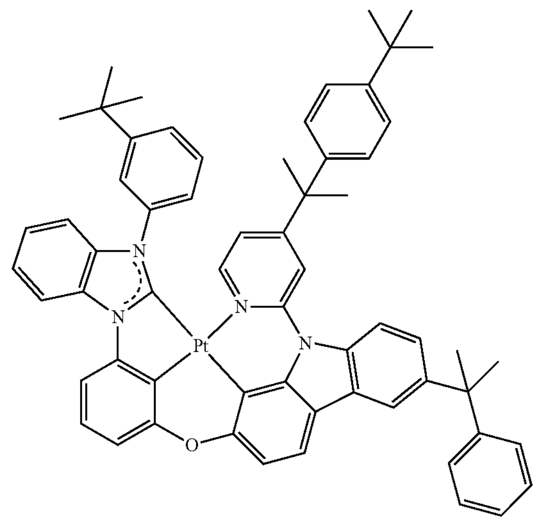
2642
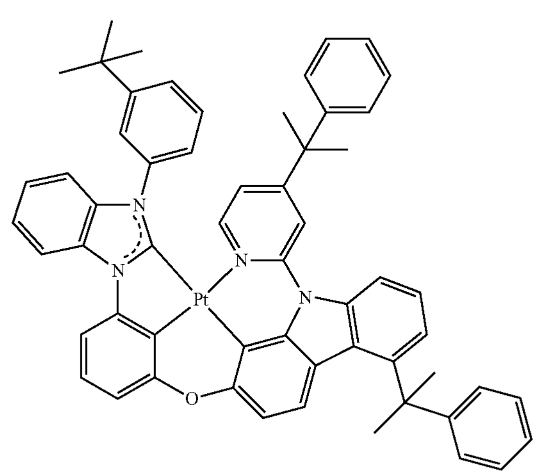

2643
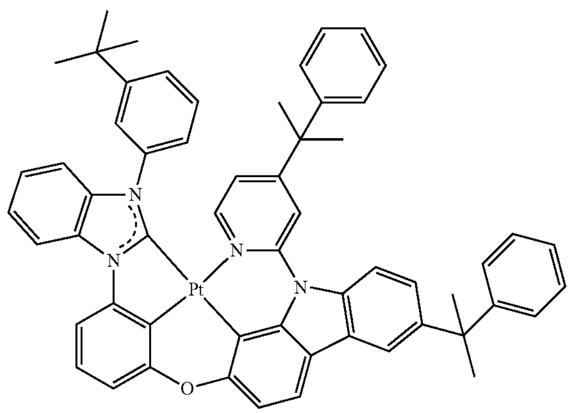
2644
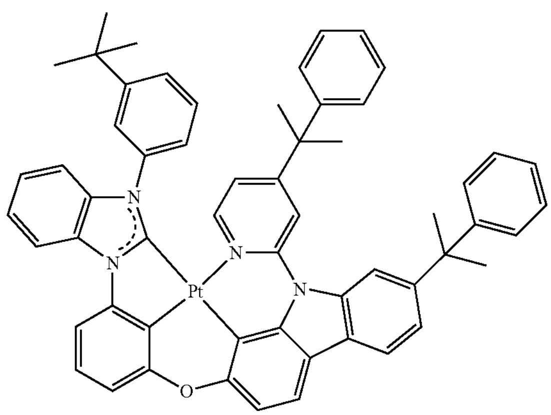
2645
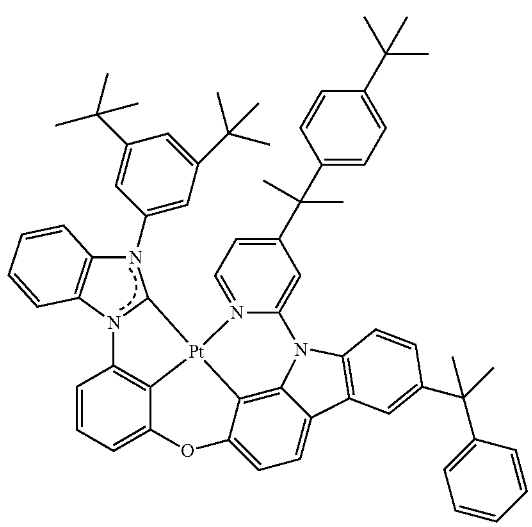
2646
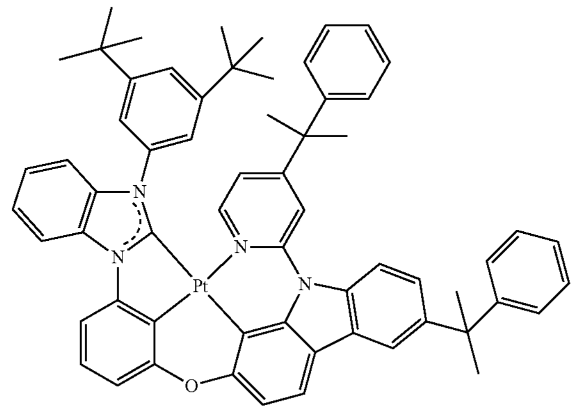
2647
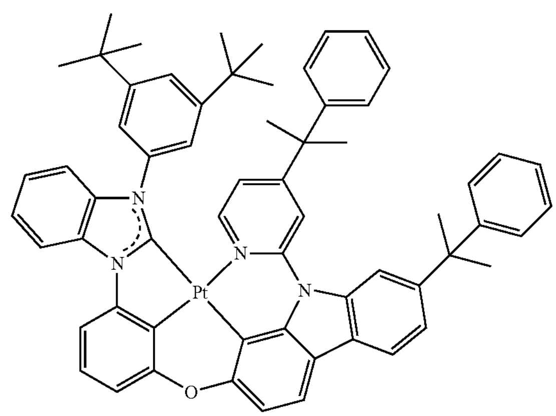
2648
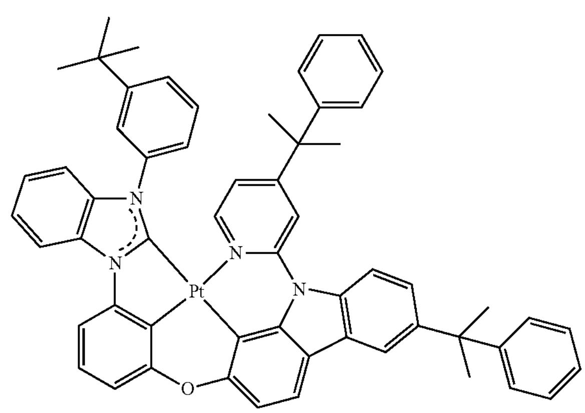

2649
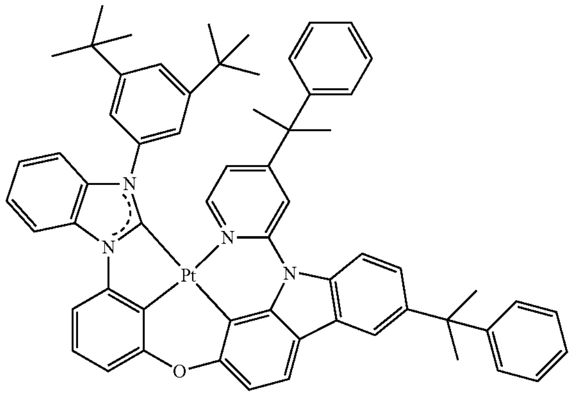
2650
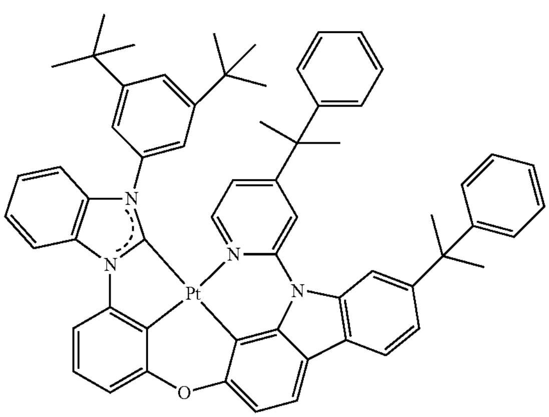
2651
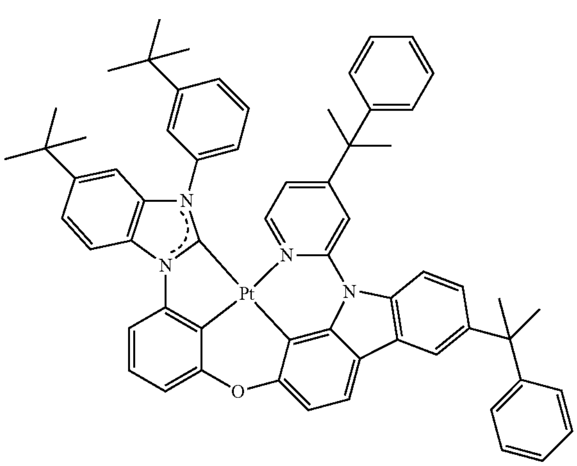
2652
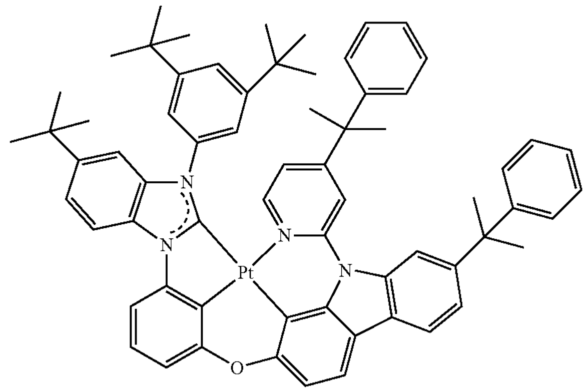
2653
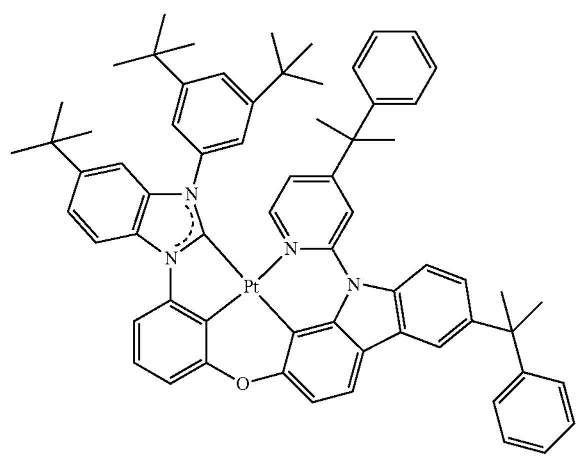
2654
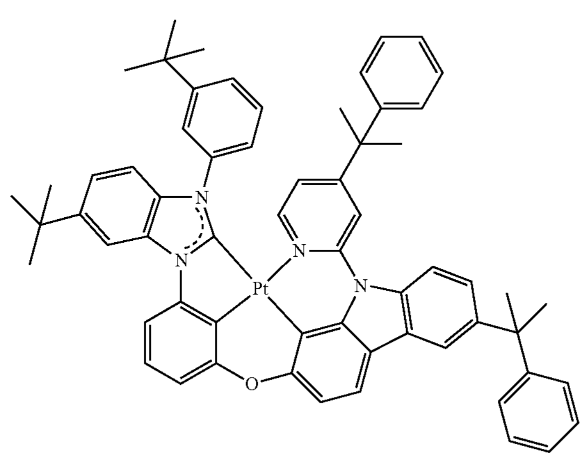

-continued
2655
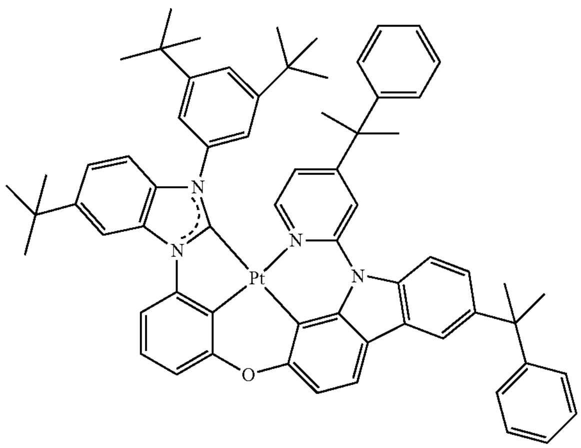
2656
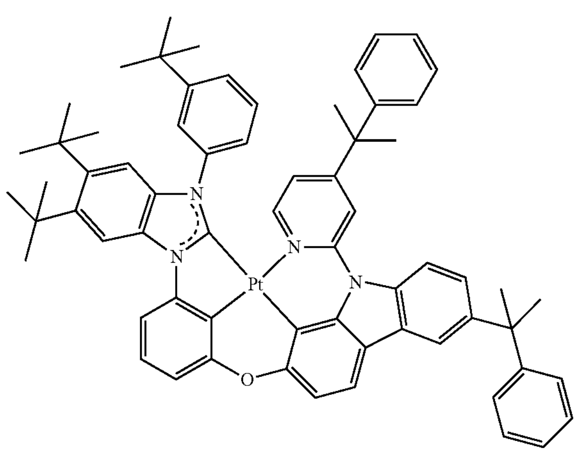
2651
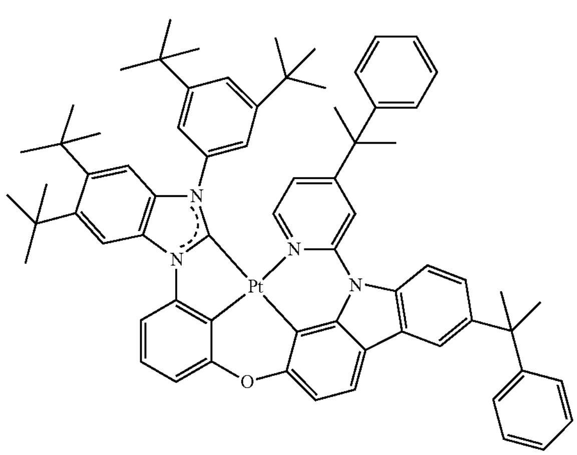
-continued
2658
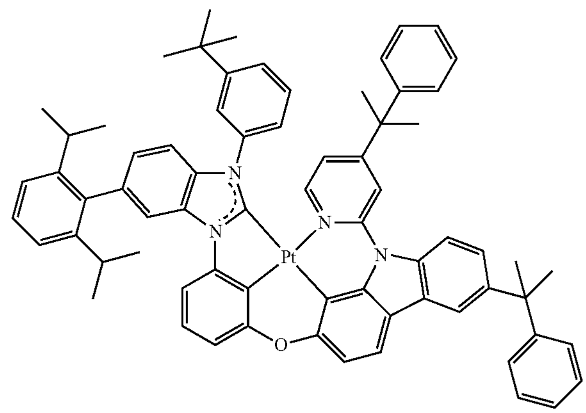
2659
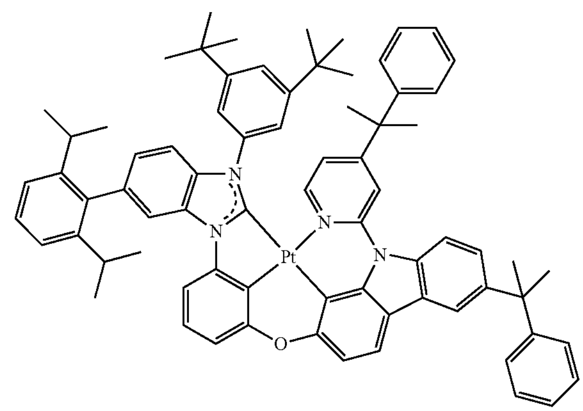
2660
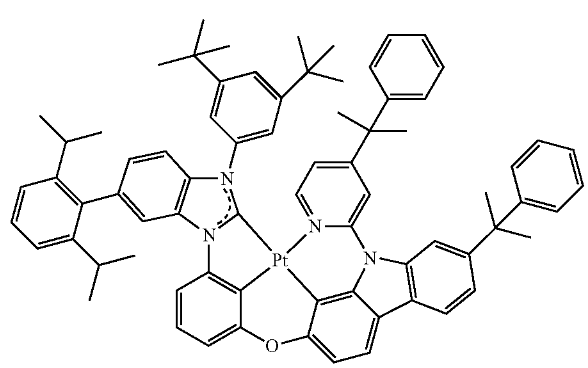

2661
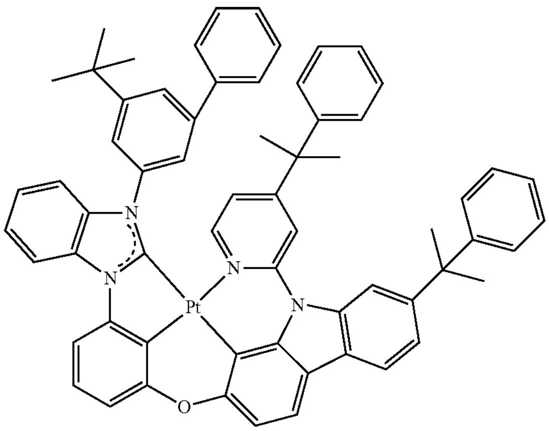
2662
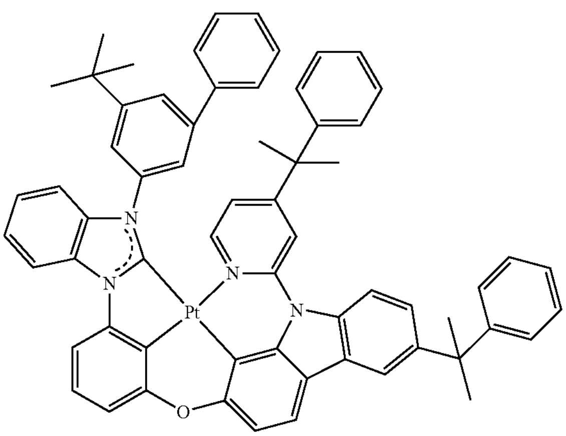
2663
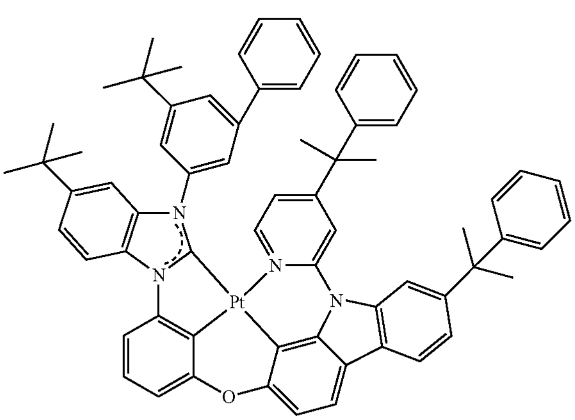
2664
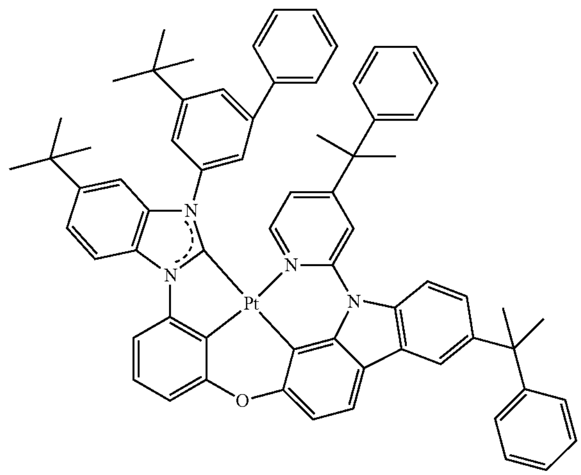
2665
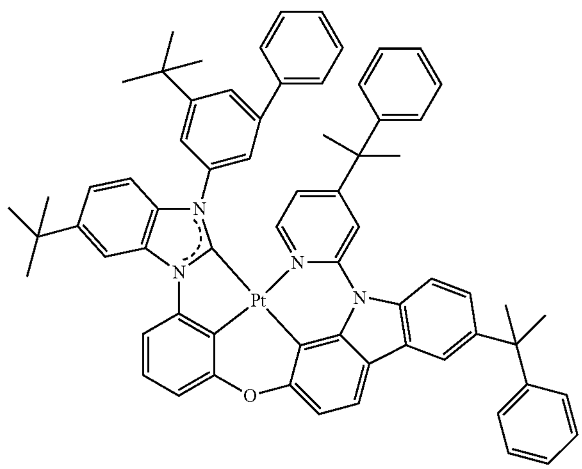
2666
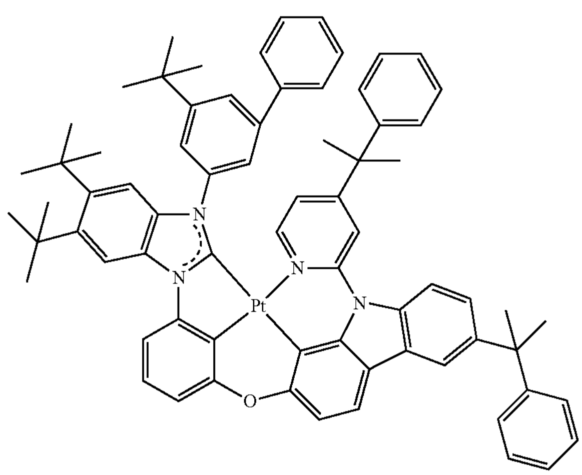

-continued
2667
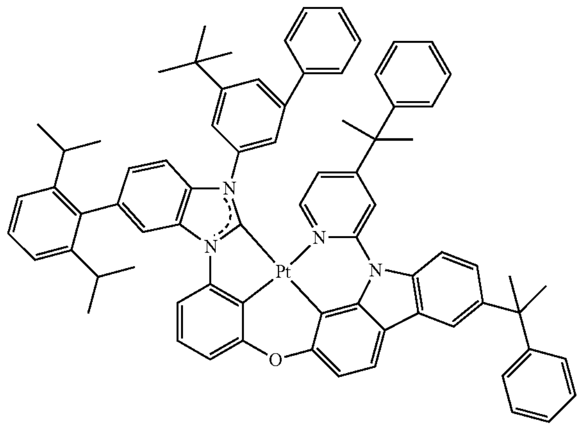
2668
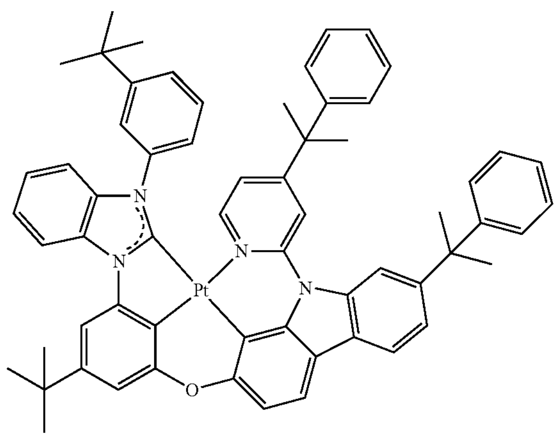
2669
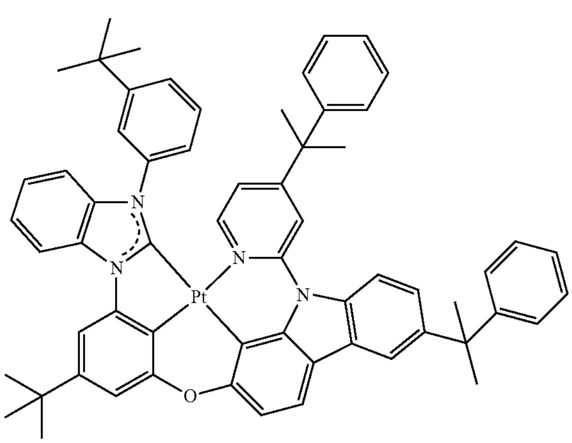
-continued
2670
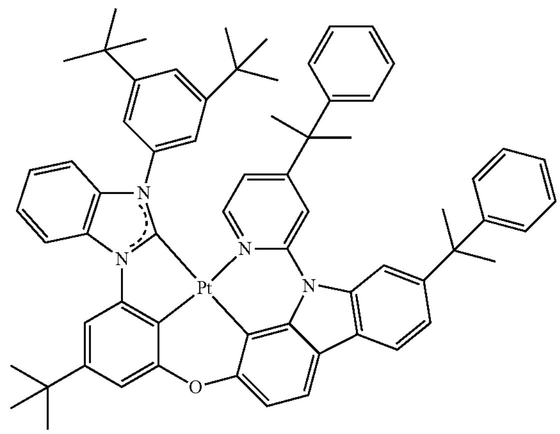
2671
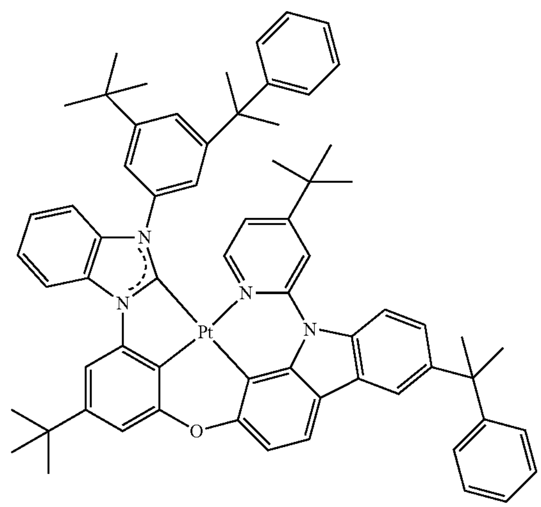
2672
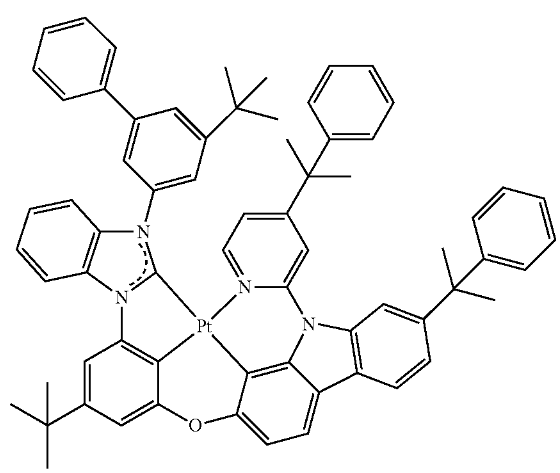

2673
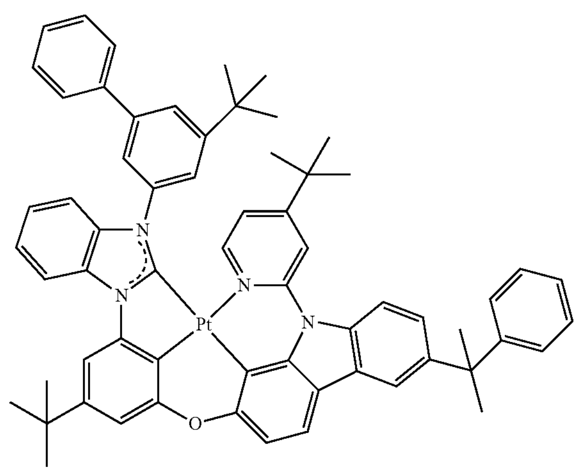
2674
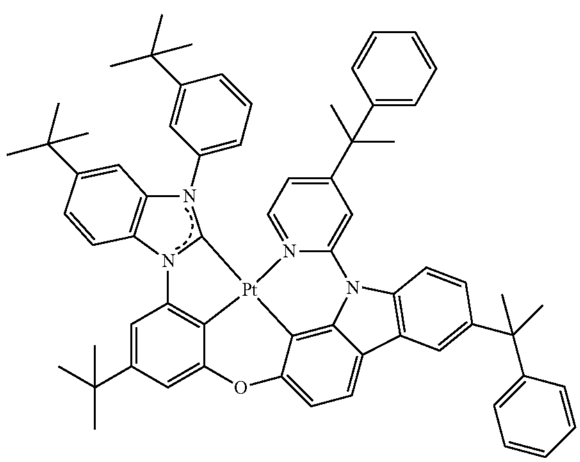
2675
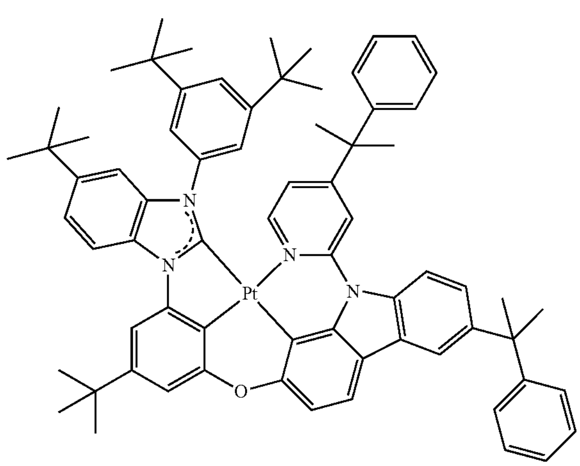
2676
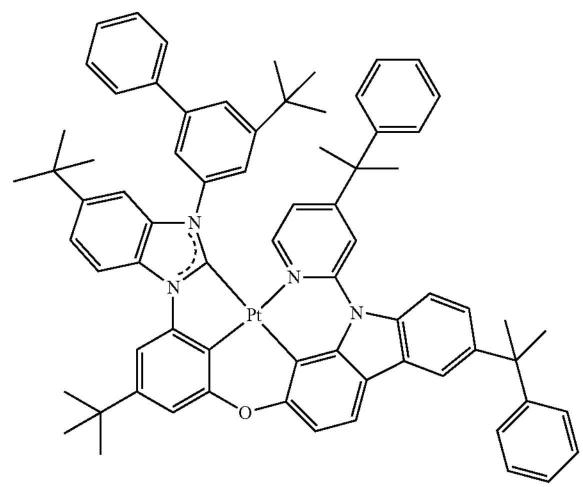
2677
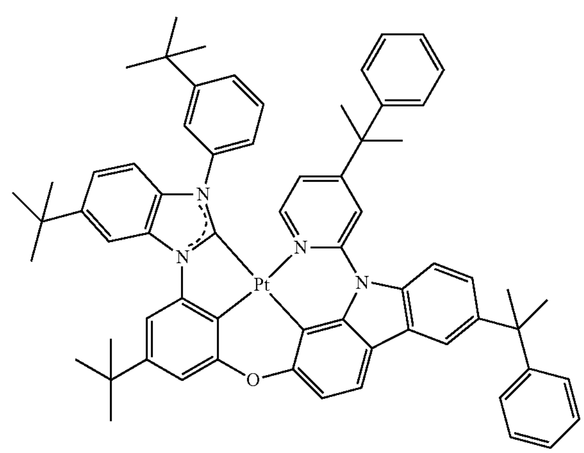
2678
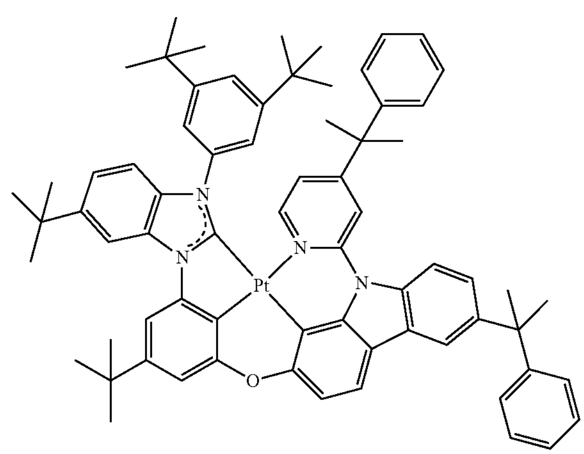

-continued
2679
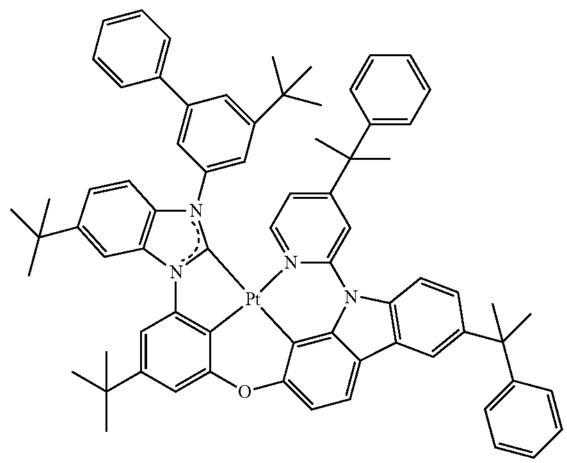
2680
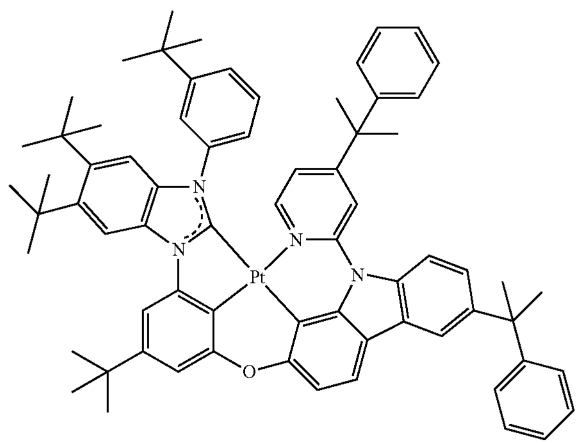
2681
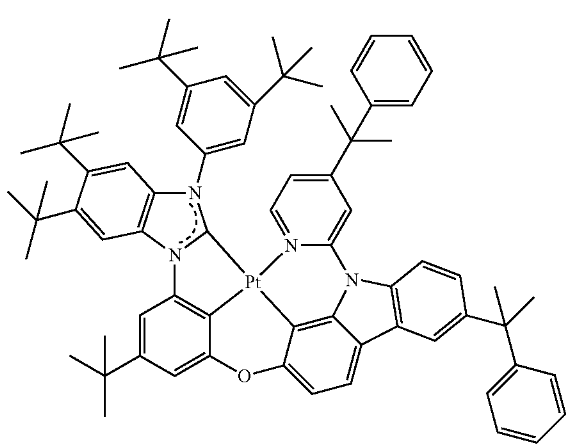
-continued
2682
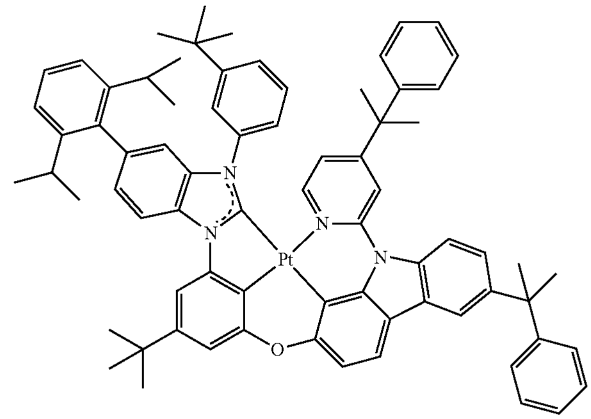
2683
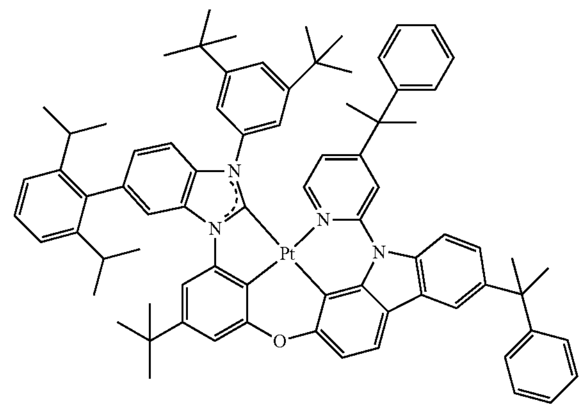
2684
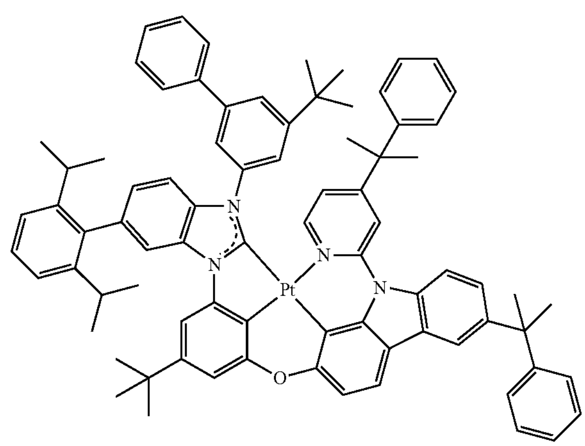

-continued
2685
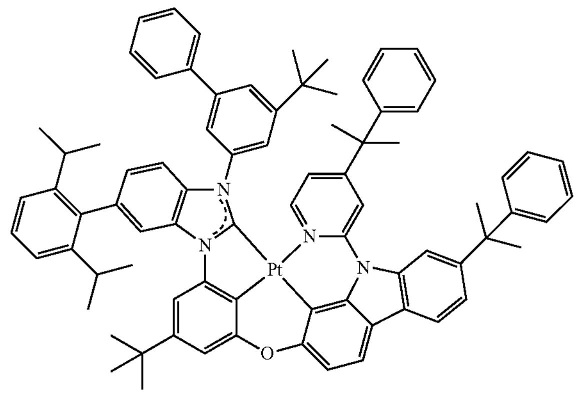
2686
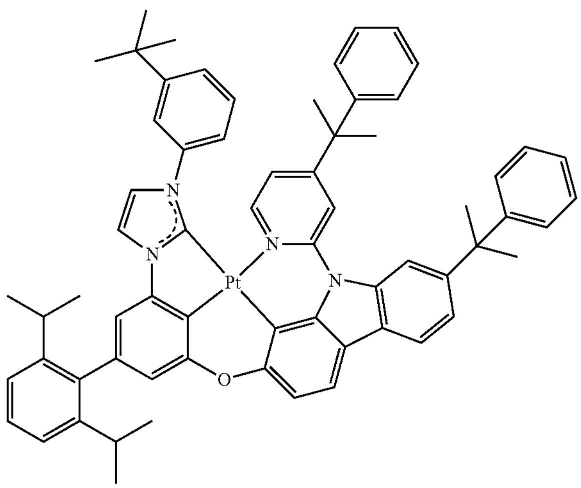
2687
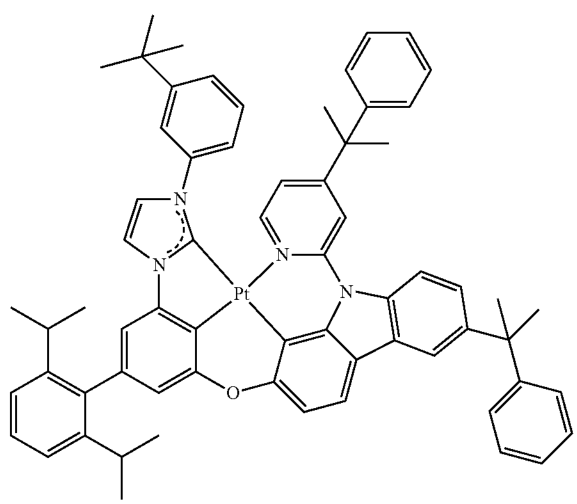
-continued
2688
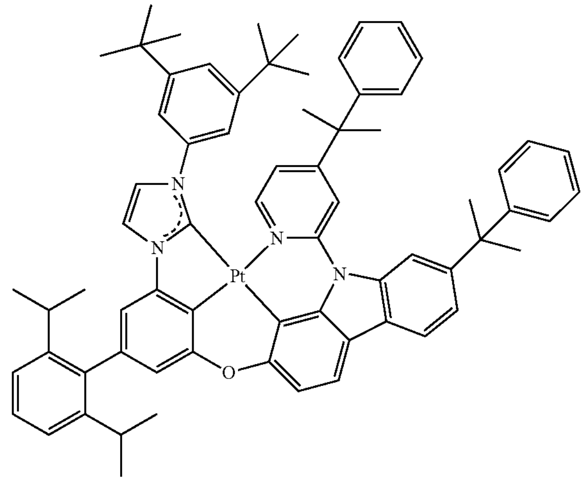
2689
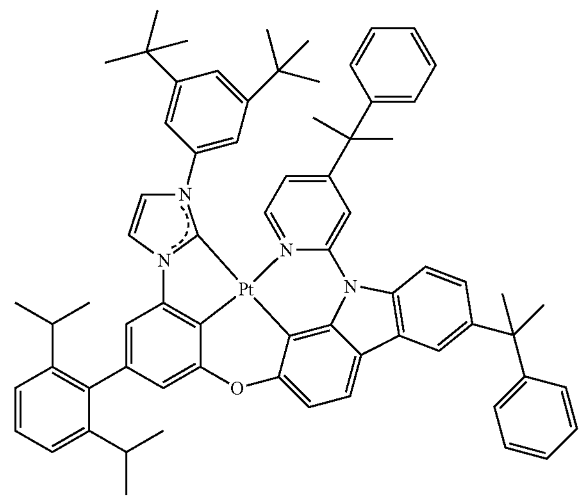
2690
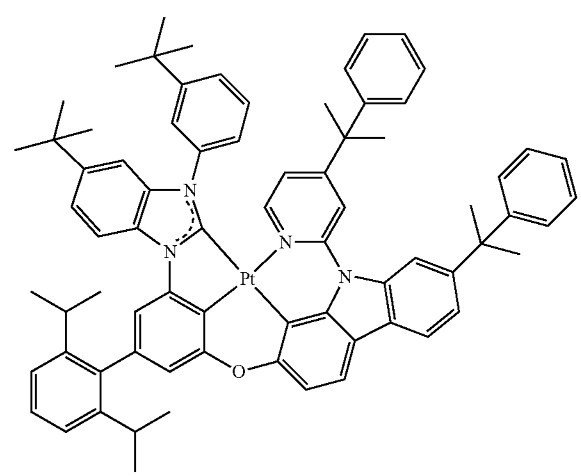

-continued
2691
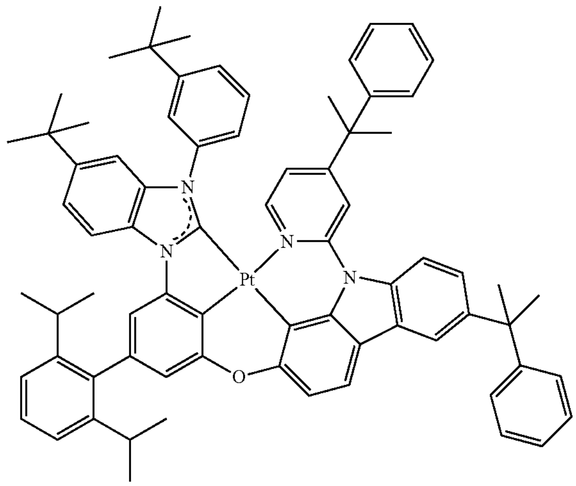
2692
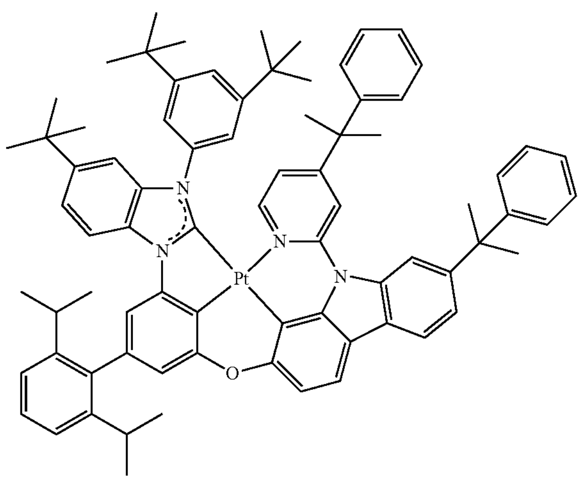
2693
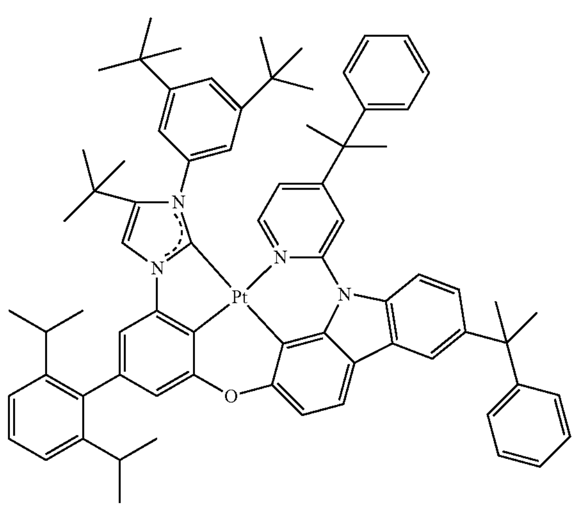
-continued
2694
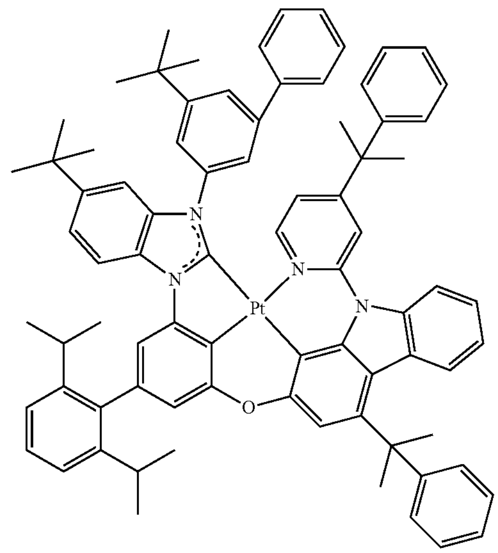
2695
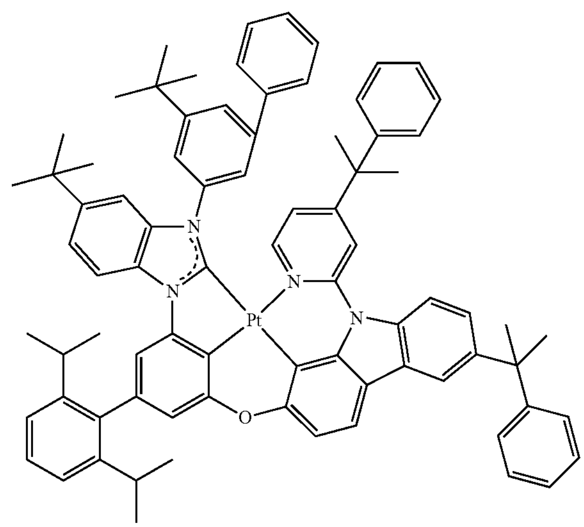
2696
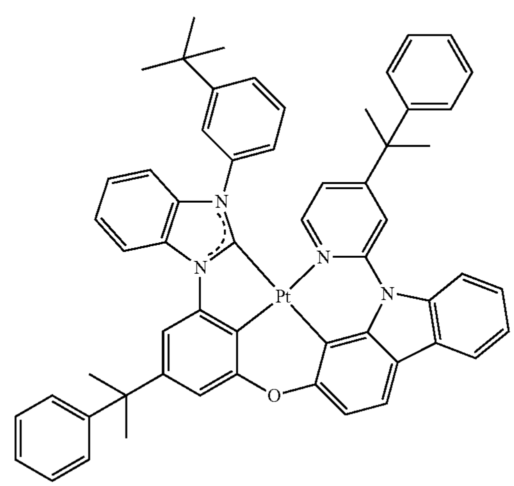

-continued
2697
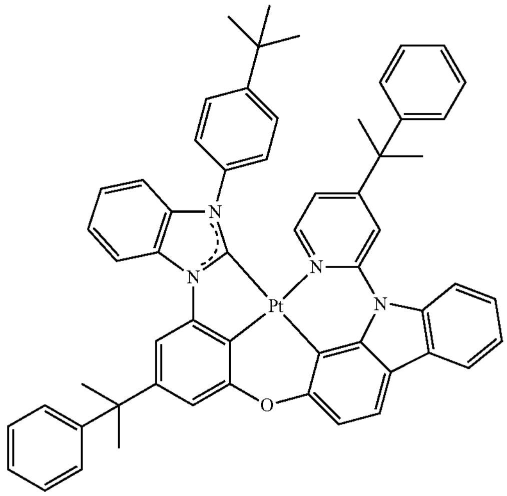
2698
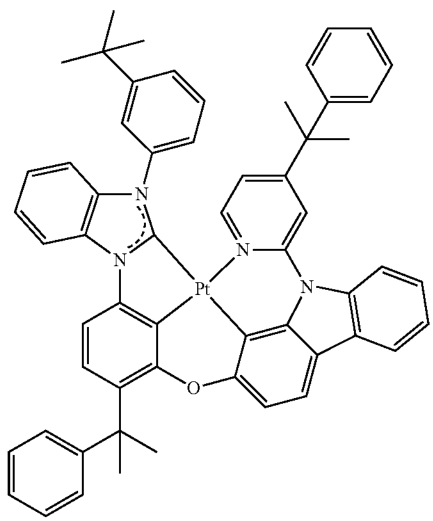
2699
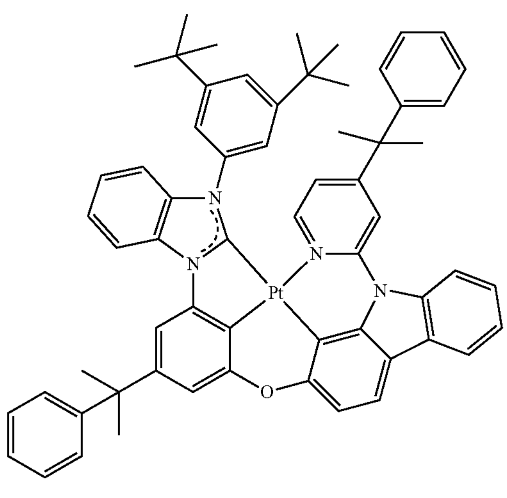
-continued
2700
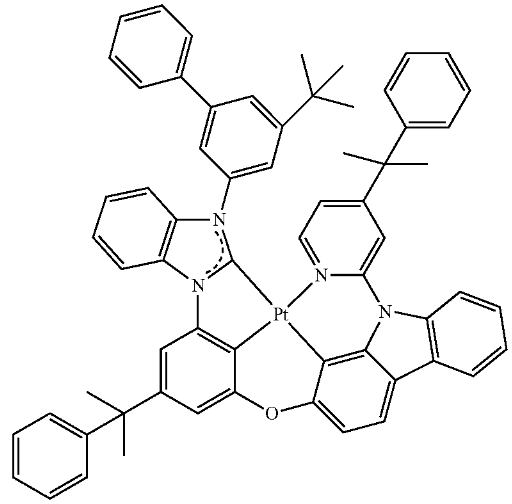
2701
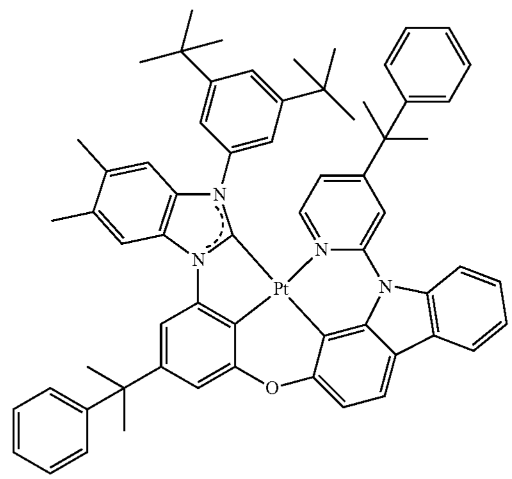
2702
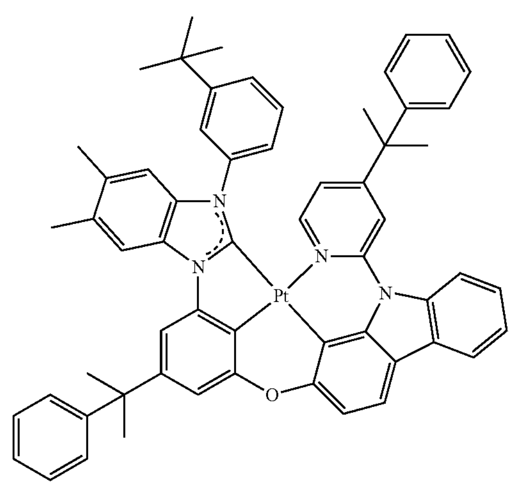

-continued
2703
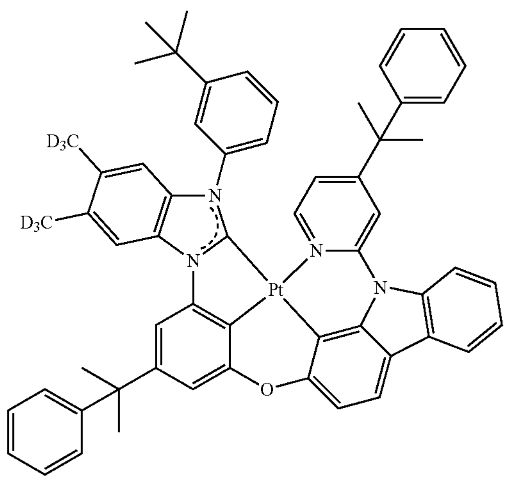
2704
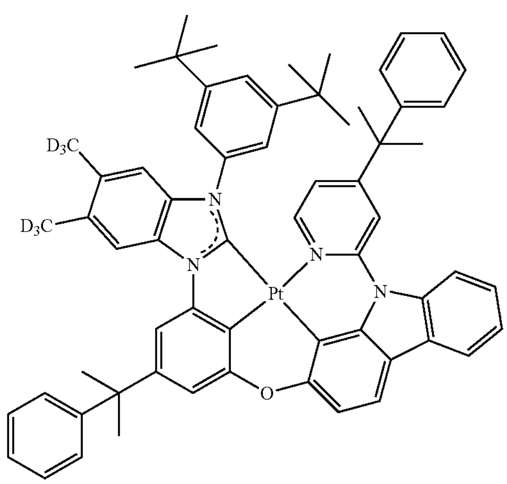
2705
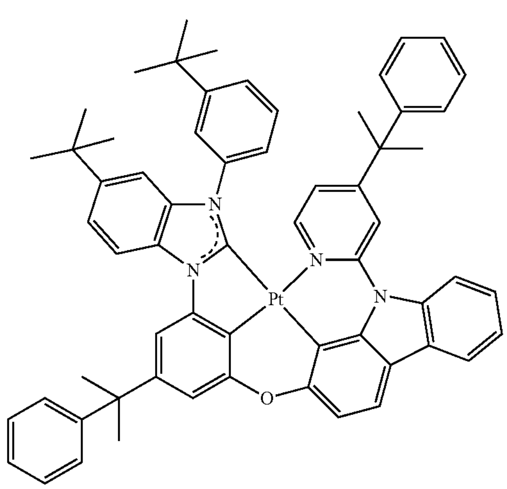
-continued
2706
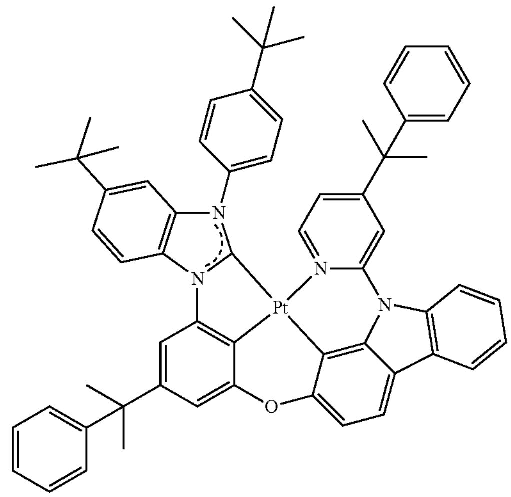
2707
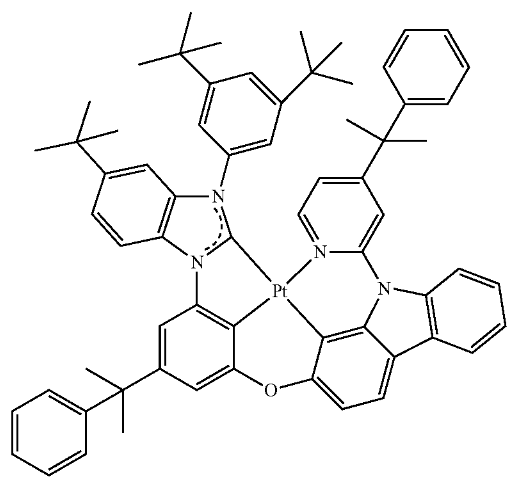
2708
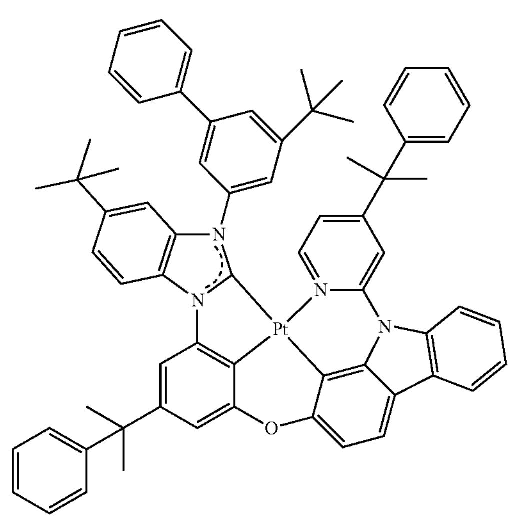

-continued
2709
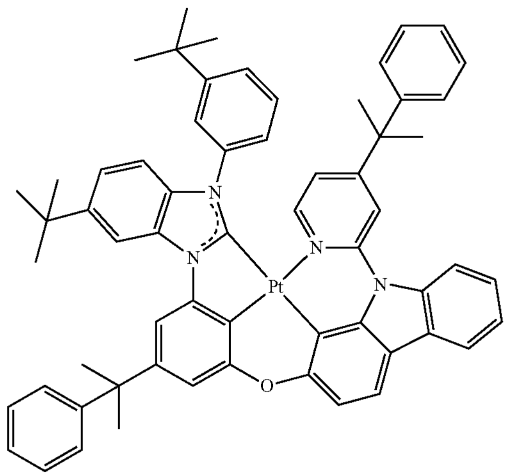
2710
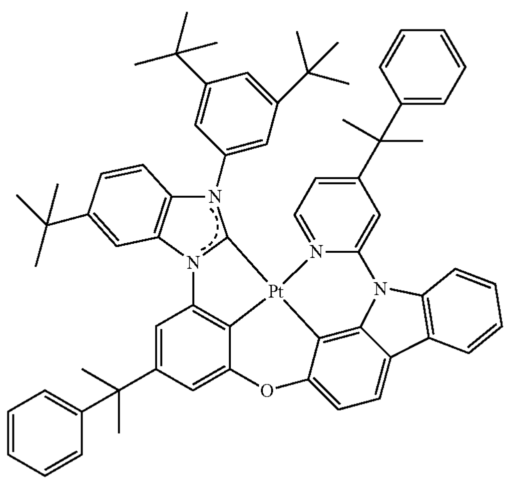
2711
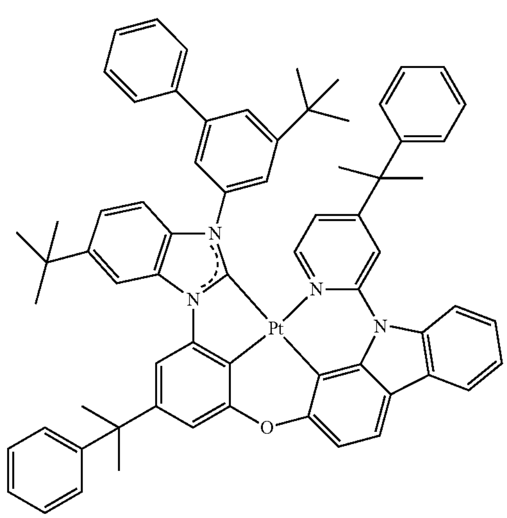
-continued
2712
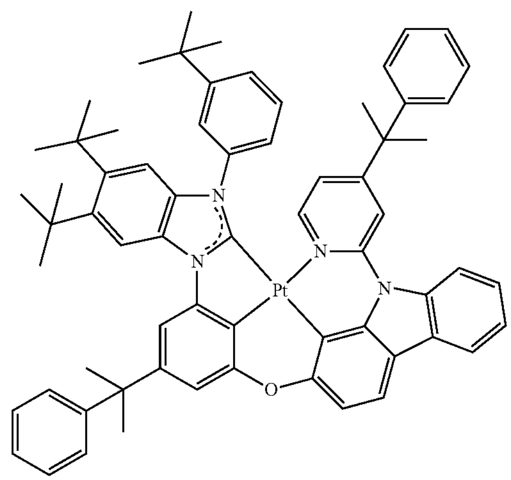
2713
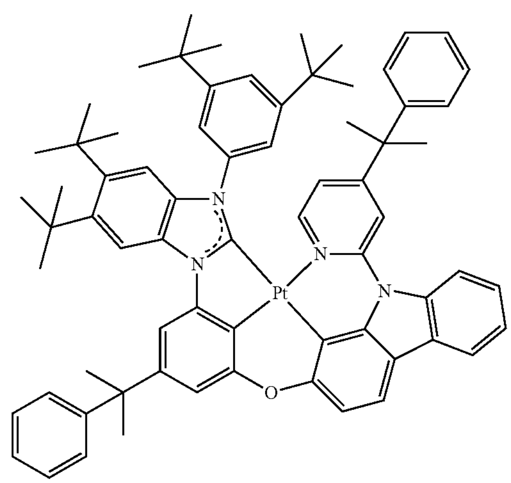
2714
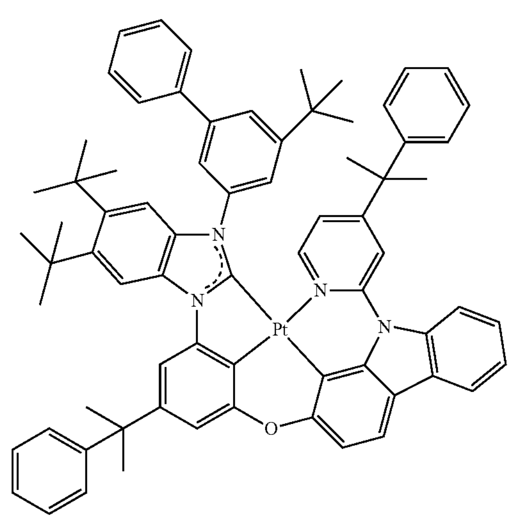

-continued
2715
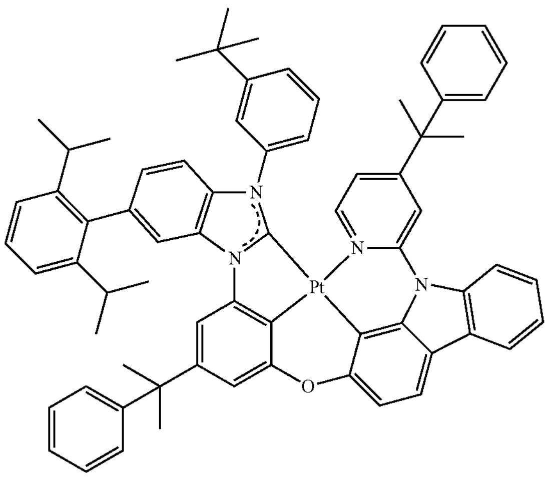
2716
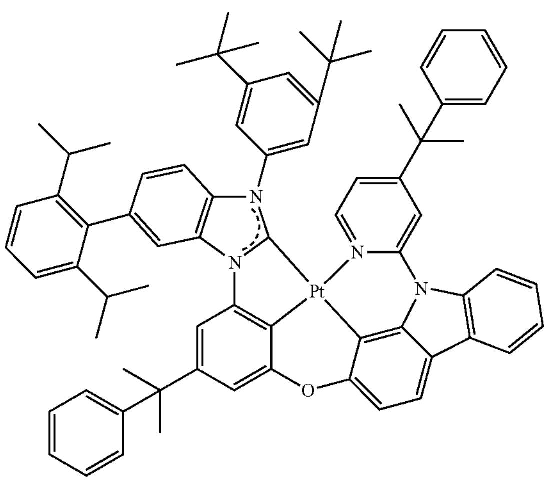
2717
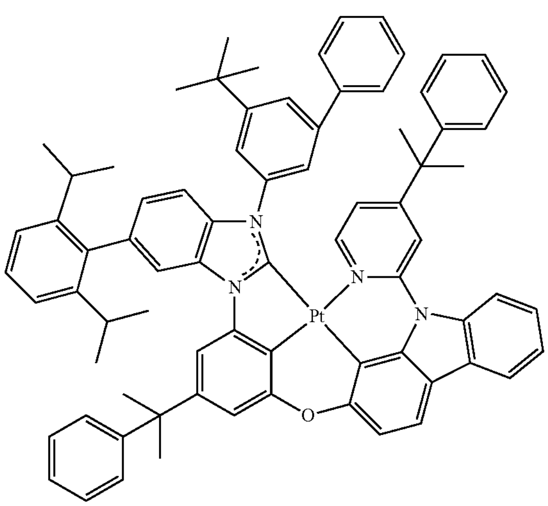
-continued
2718
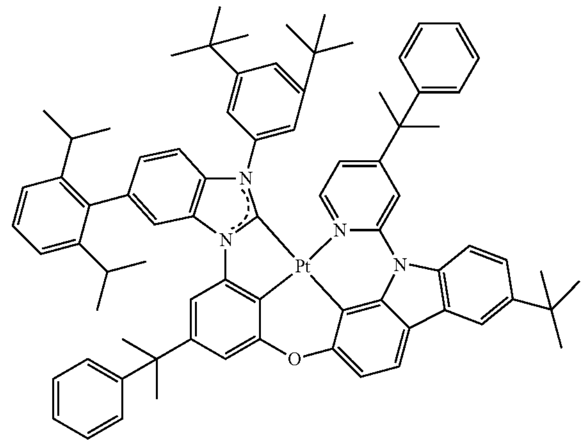
2719
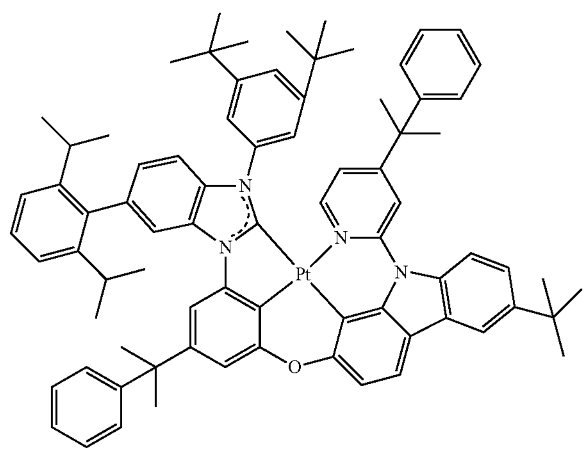
2720
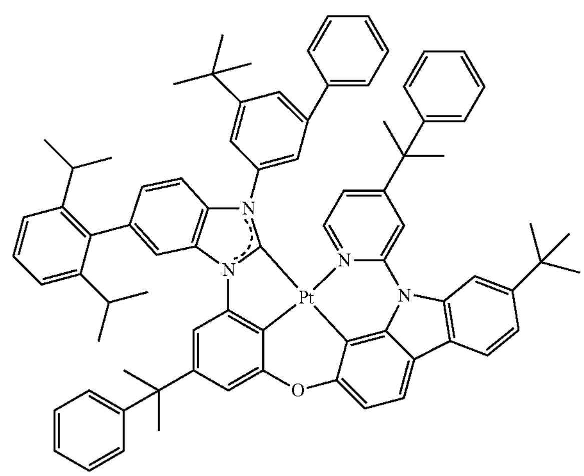

-continued
2721
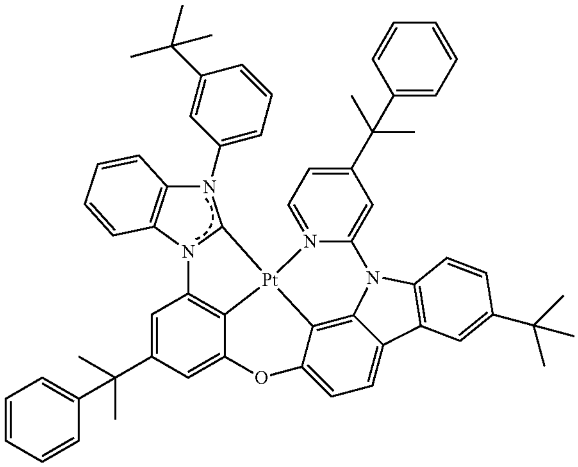
2722
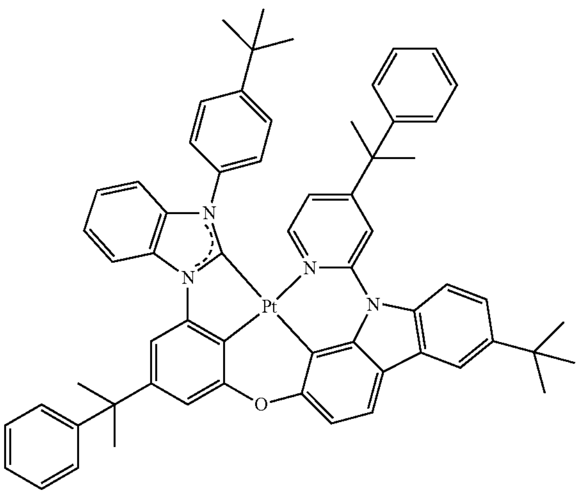
2723
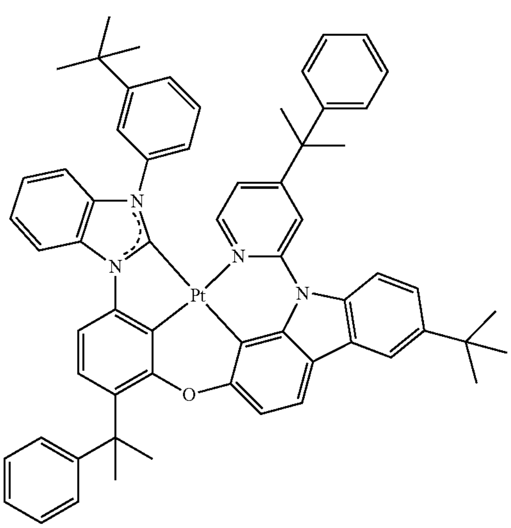
-continued
2724
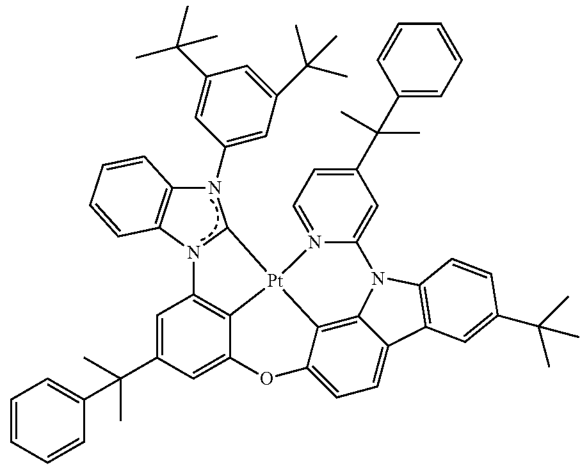
2725
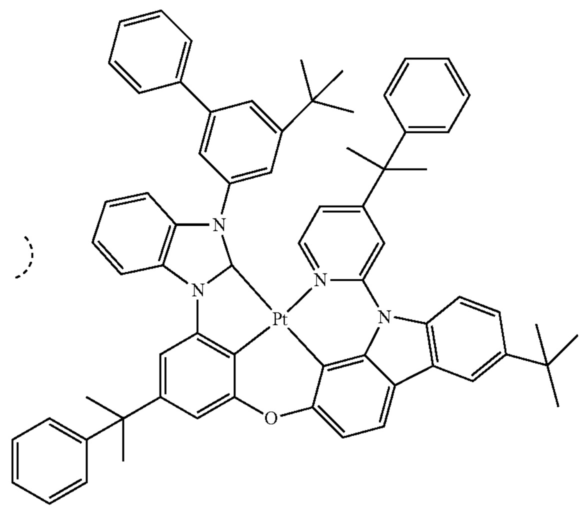
2726
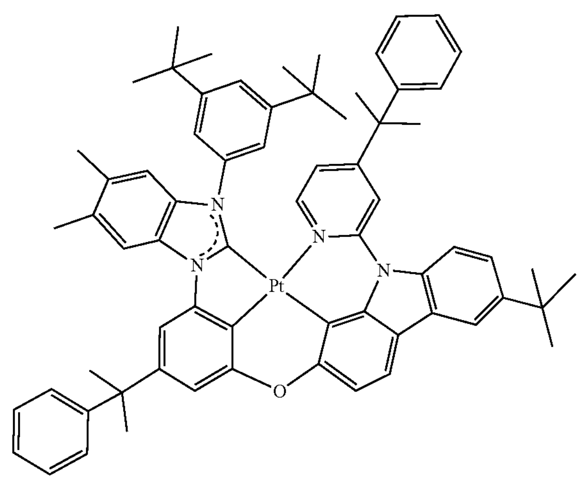

-continued
2727
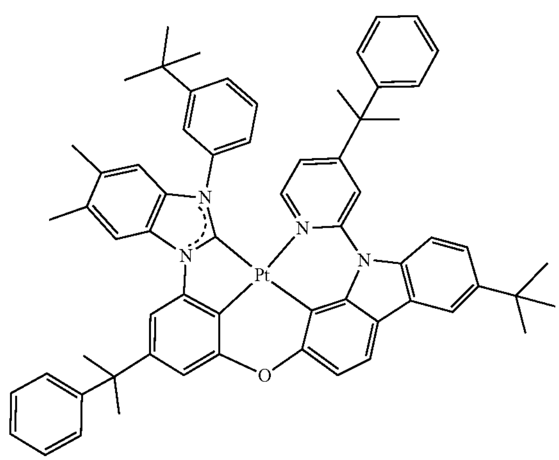
2728
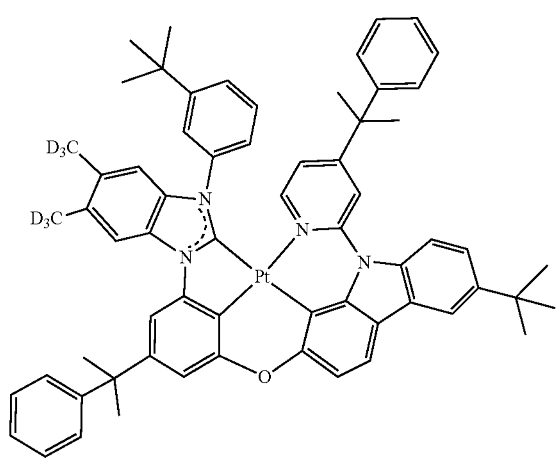
2729
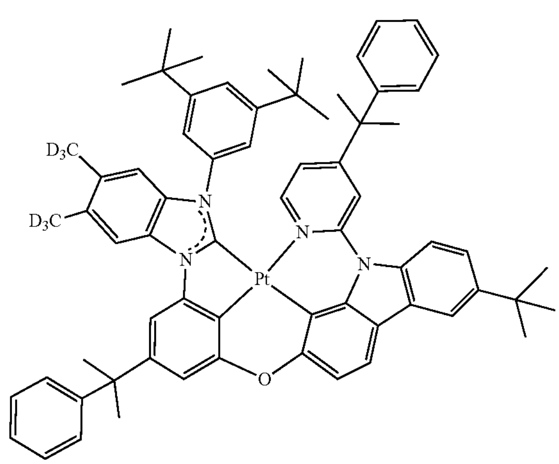
-continued
2730
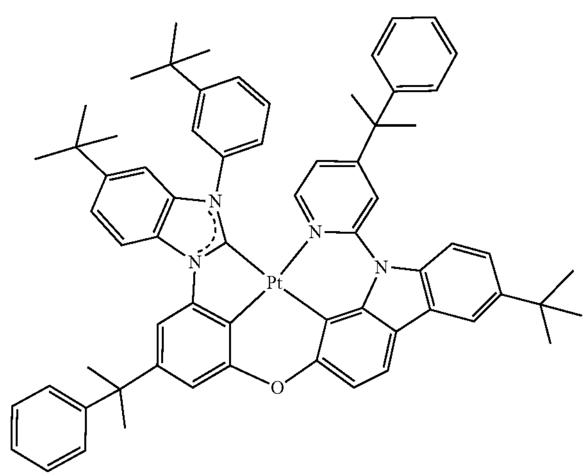
2731
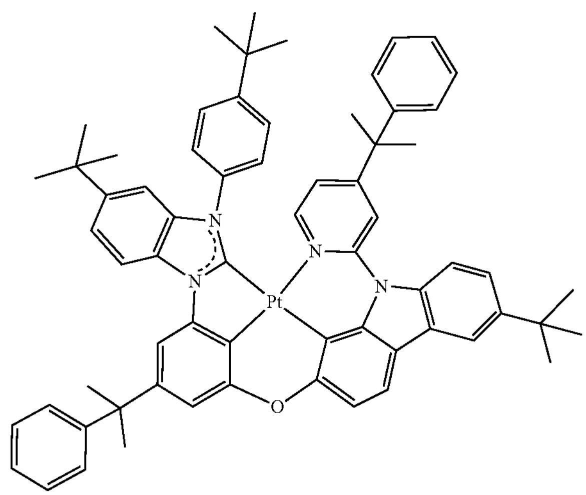
2732
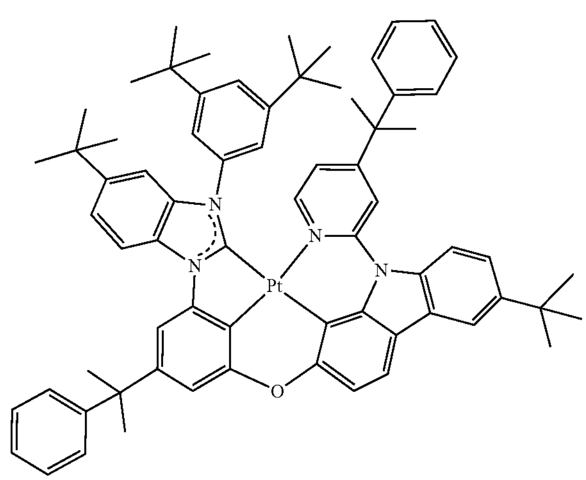

-continued
2733
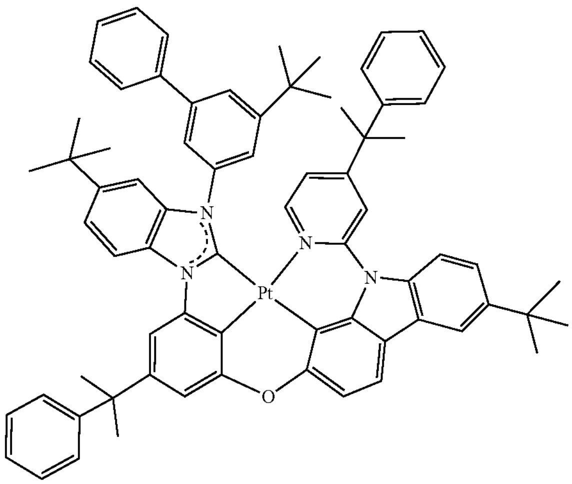
2734
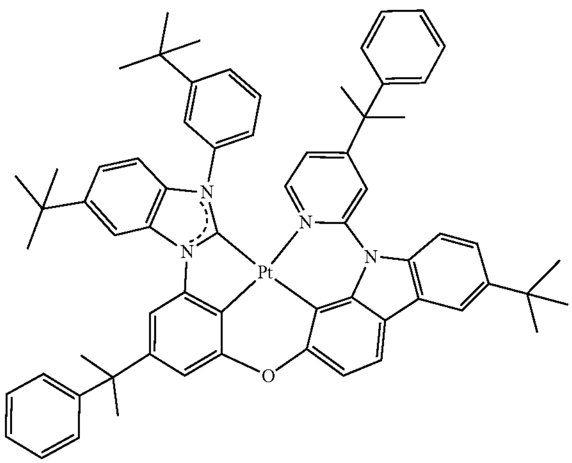
2735
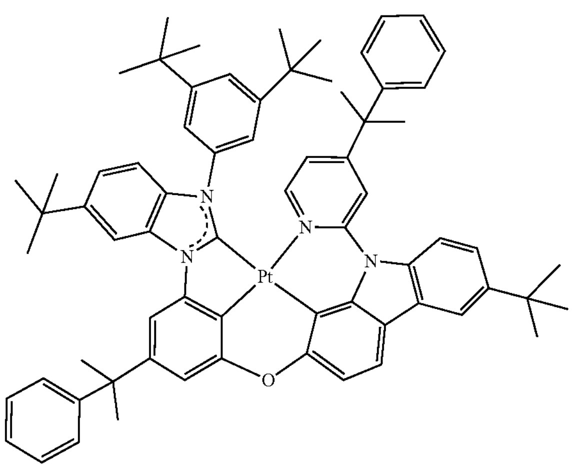
-continued
2736
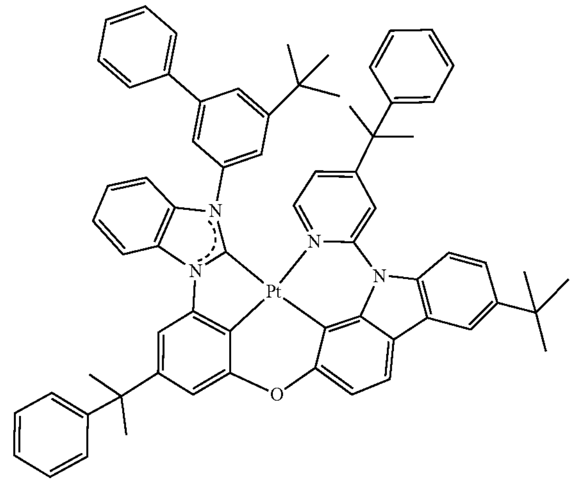
2737
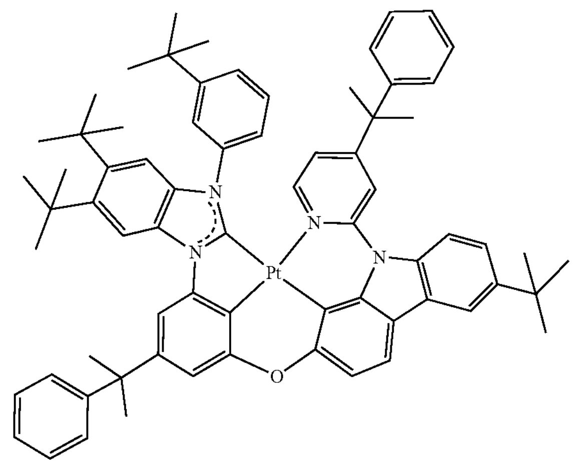
2738
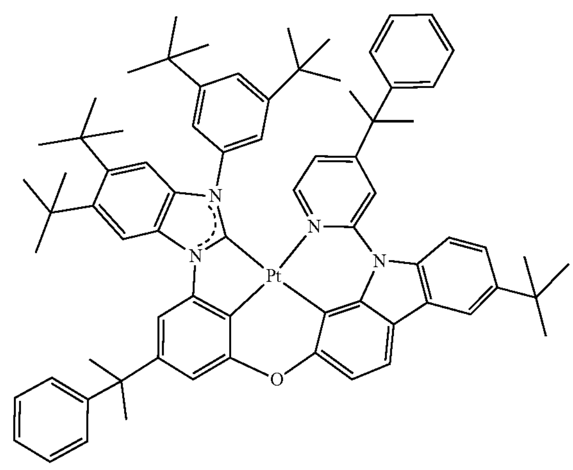

-continued
2739
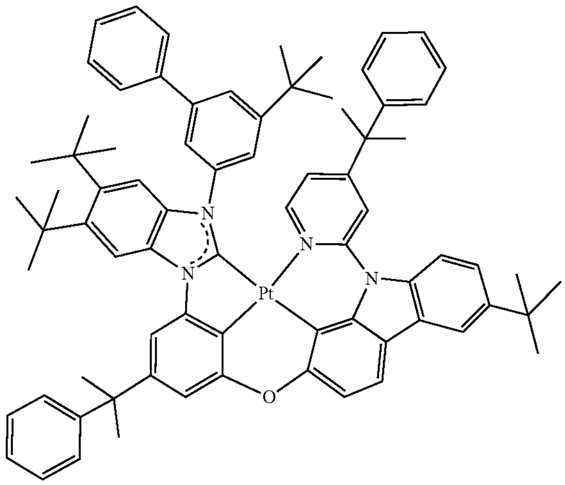
2740
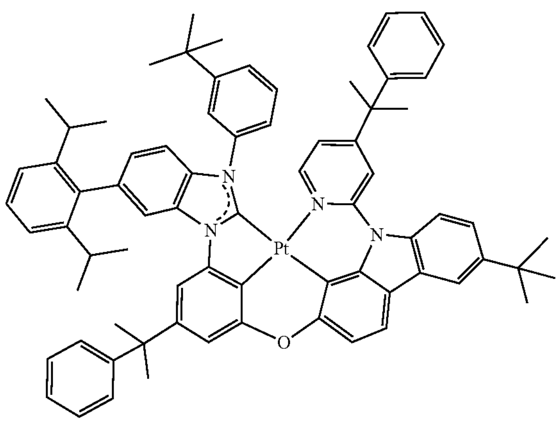
2741
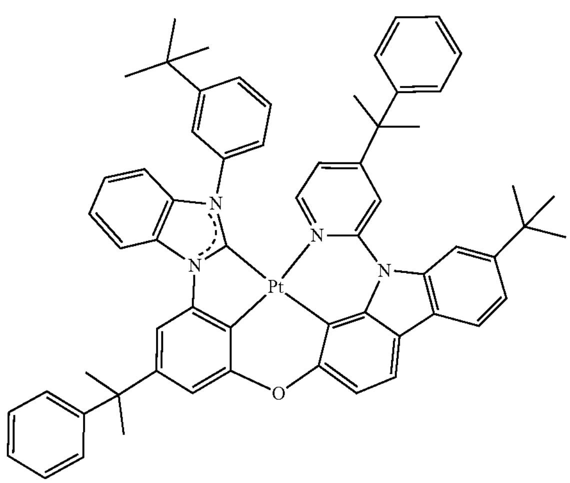
-continued
2742
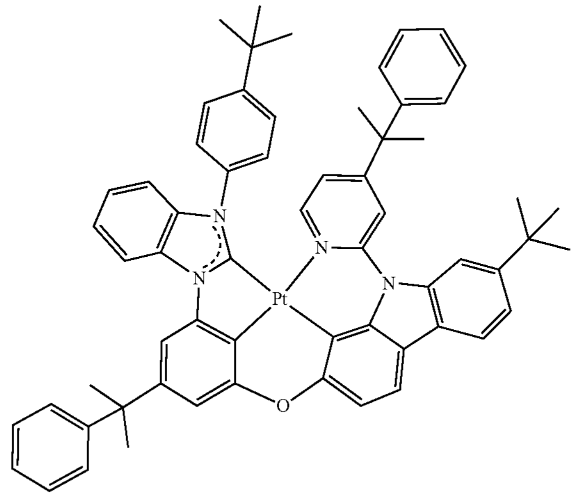
2743
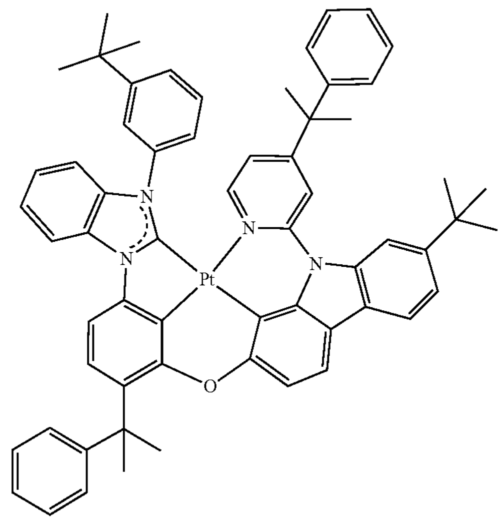
2744
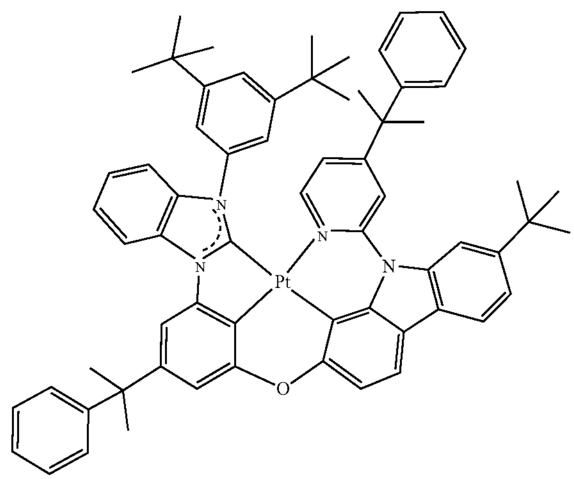

-continued
2745
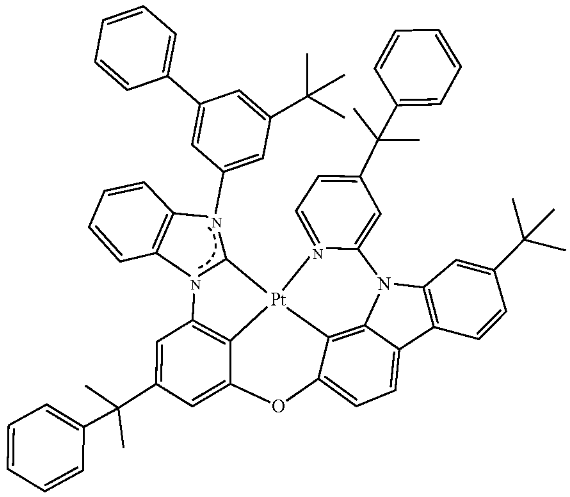
2746
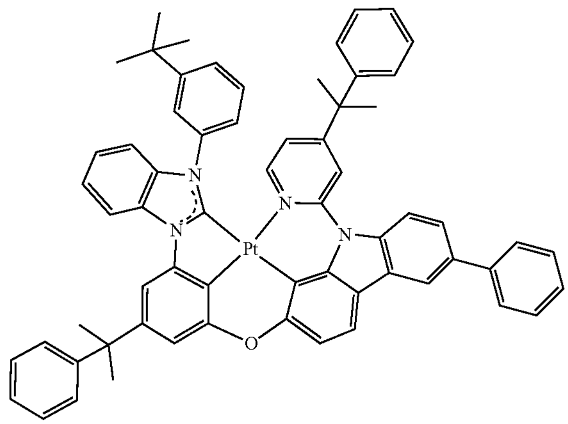
2747
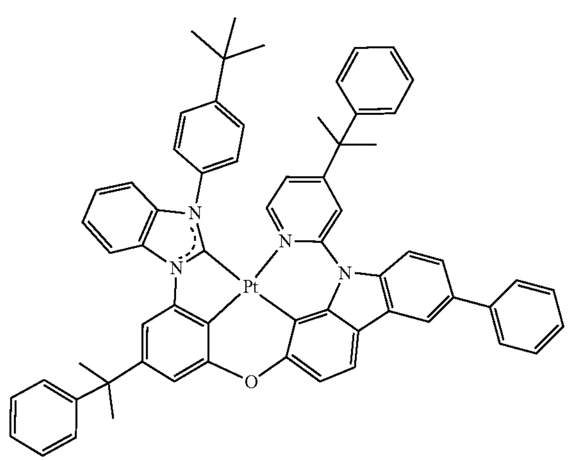
-continued
2748
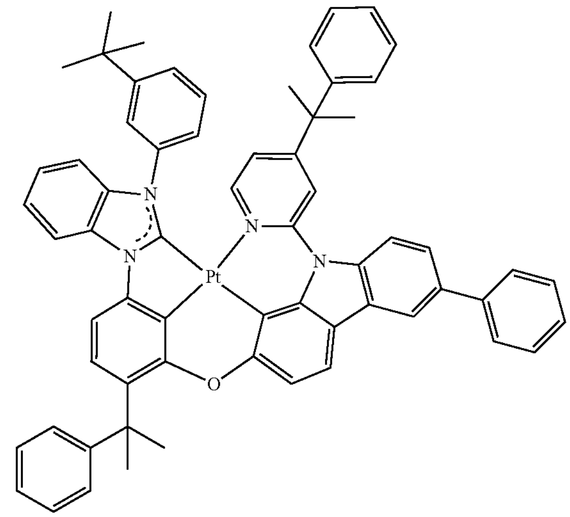
2749
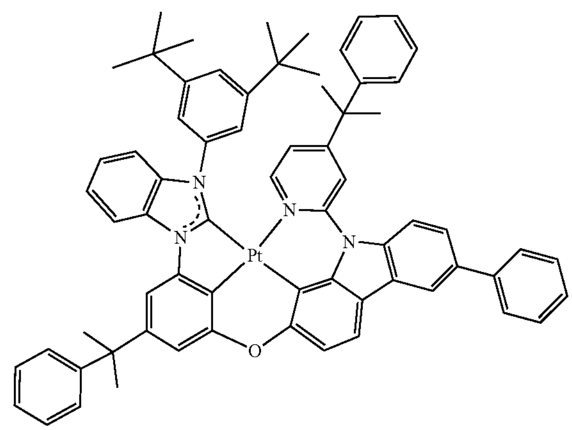
2750
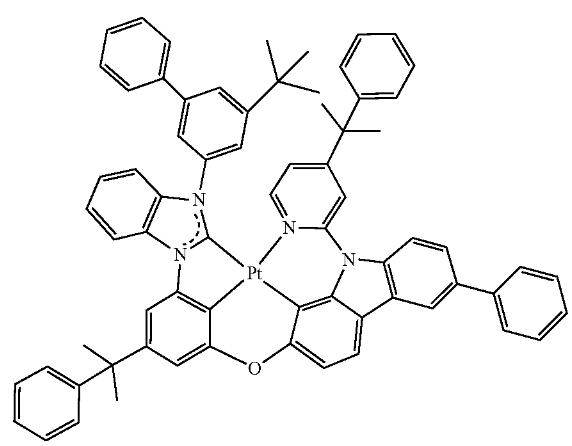

-continued
2751
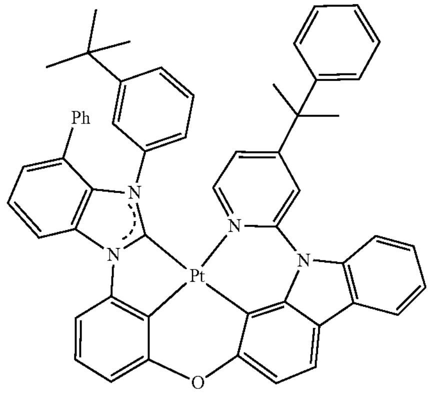
2752
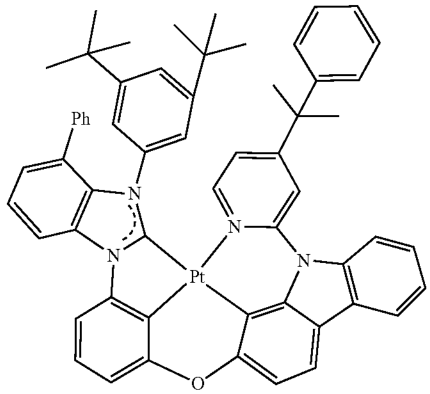
2753
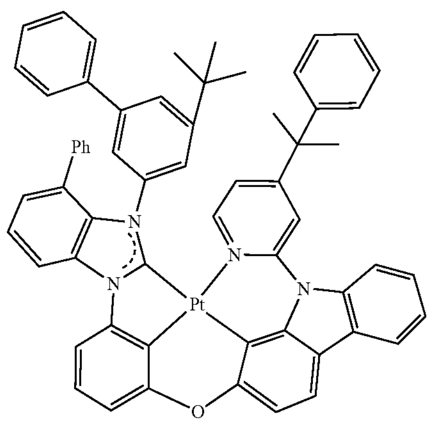
2754
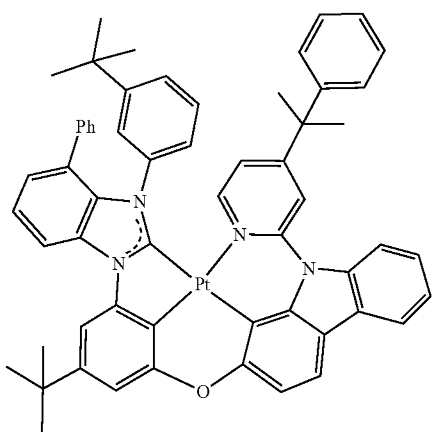
-continued
2755
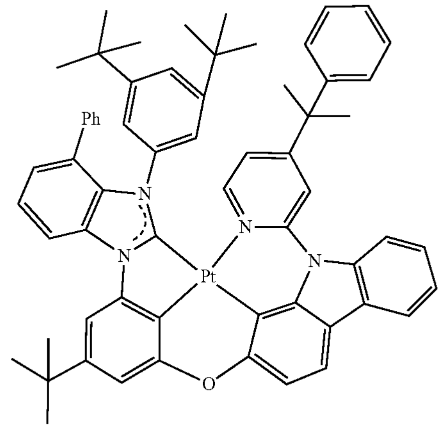
2756
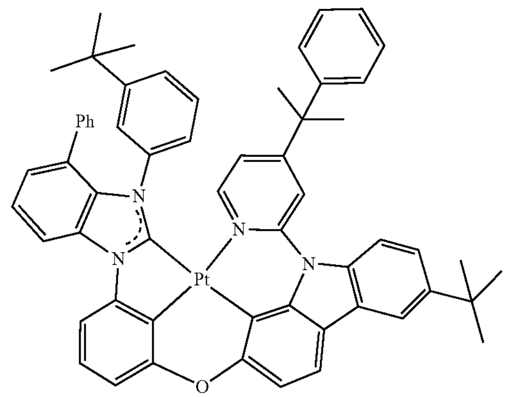
2757
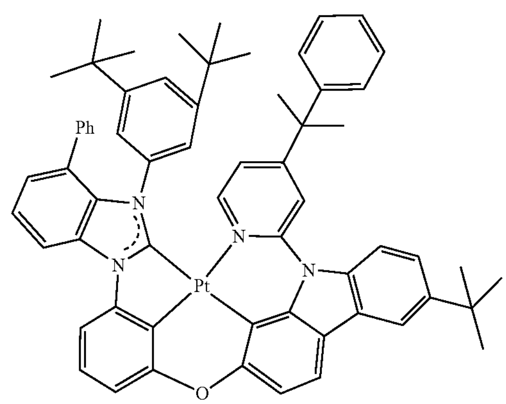

-continued
2758
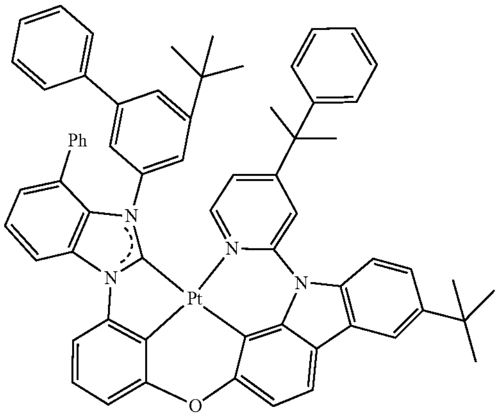
2759
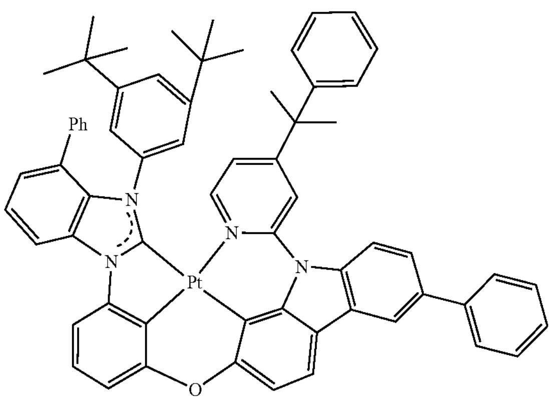
2760
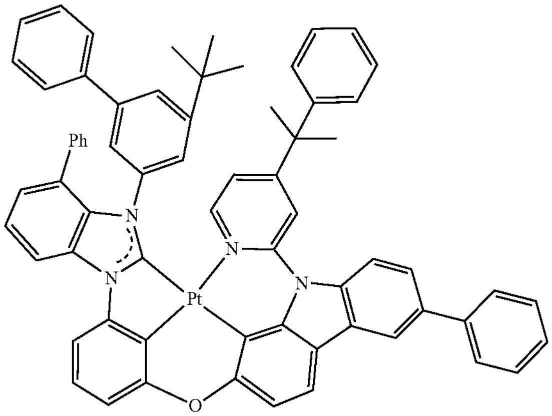
-continued
2761
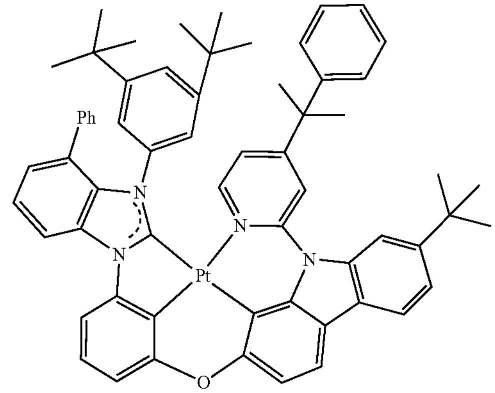
2762
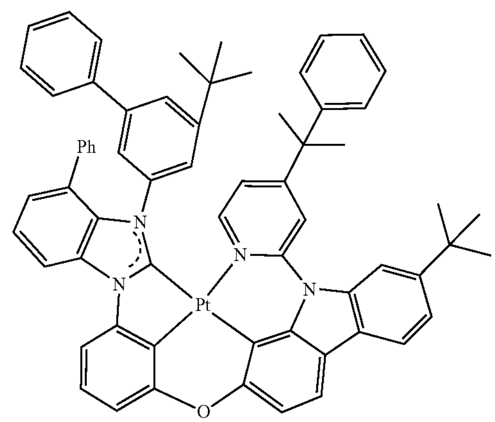
2763
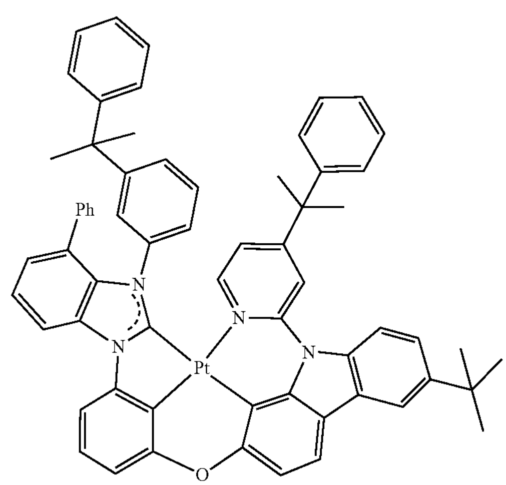

-continued
2764
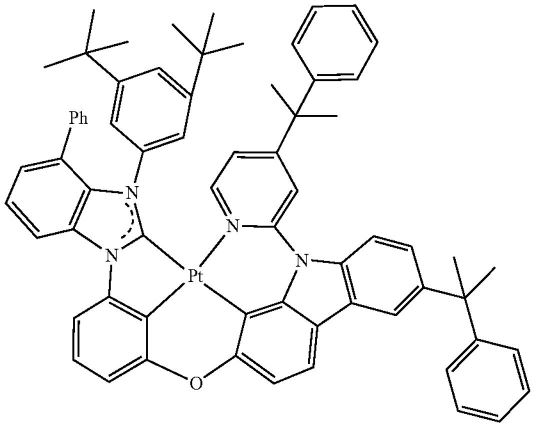
2765
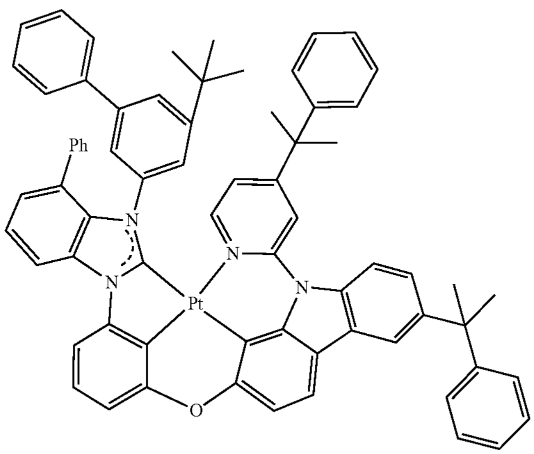
2766
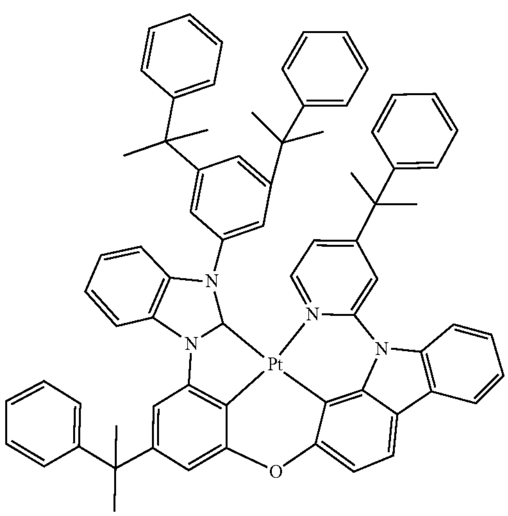
-continued
2767
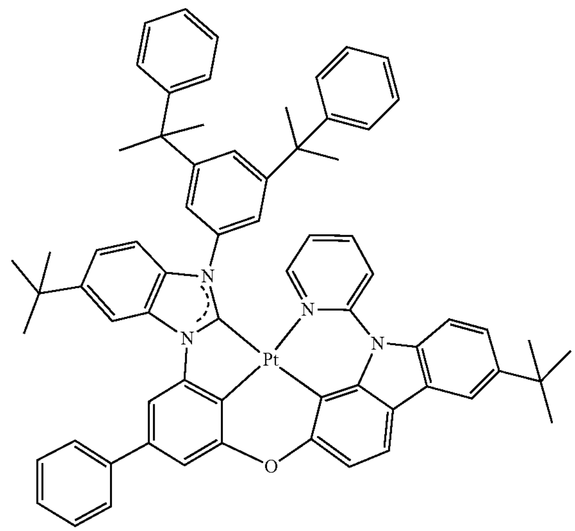
2768
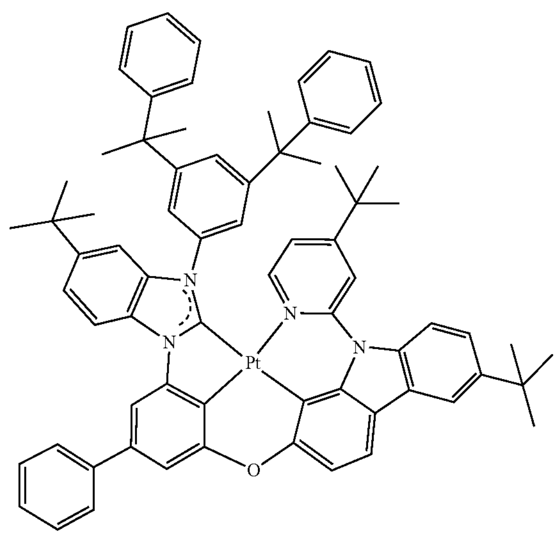
2769
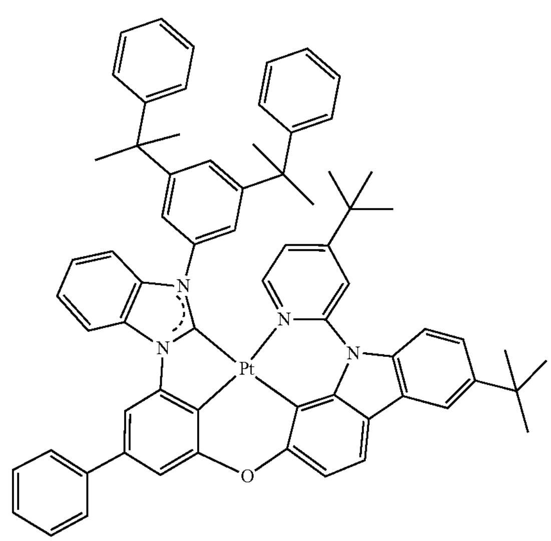

-continued
2770
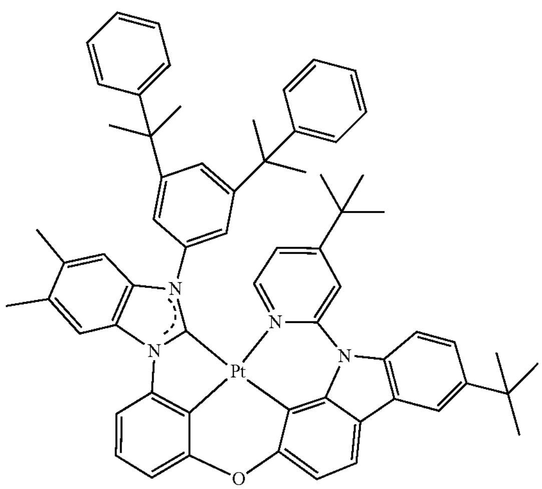
2771
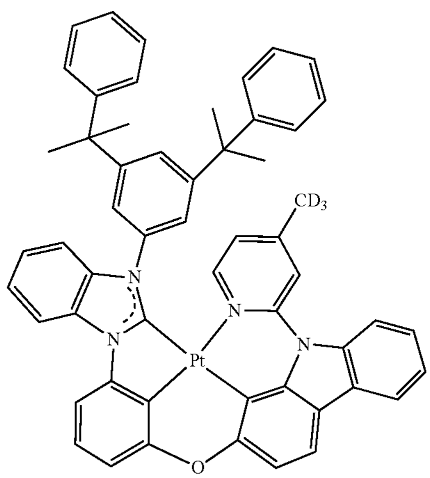
2772
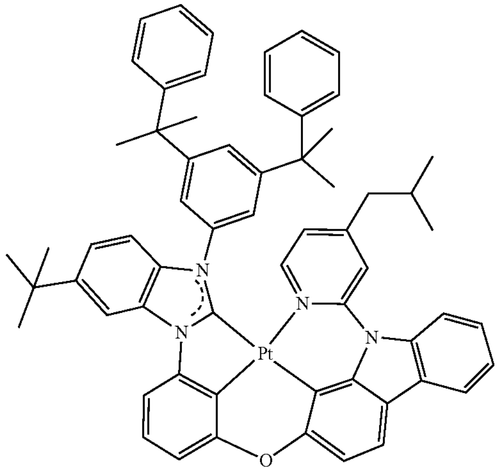
-continued
2773
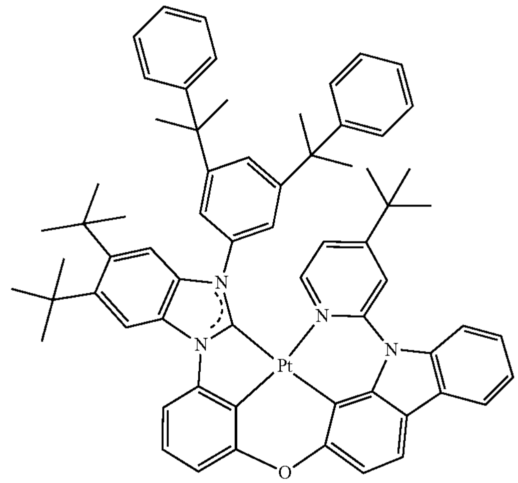
2774
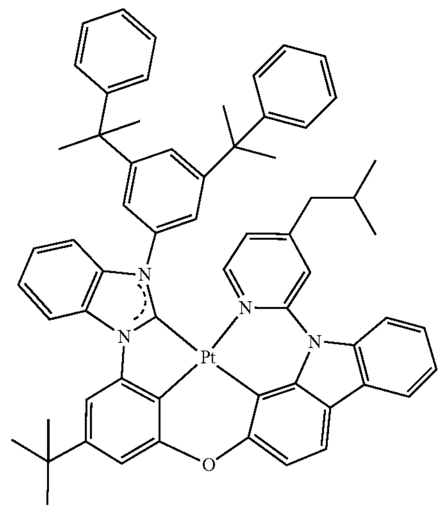
2775
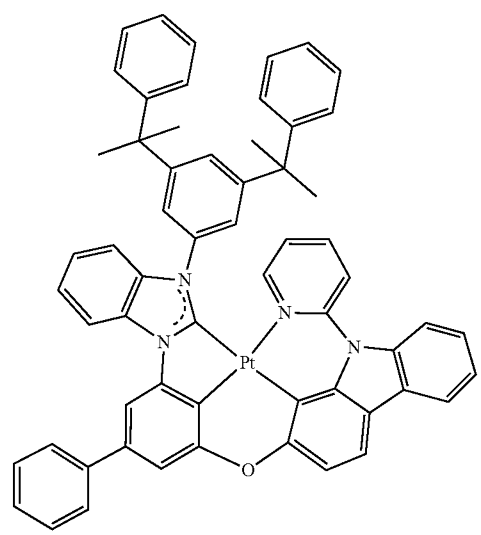

-continued
2776
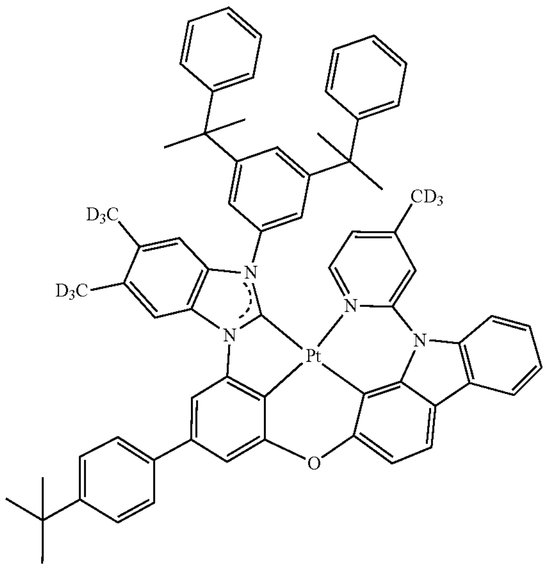
2777
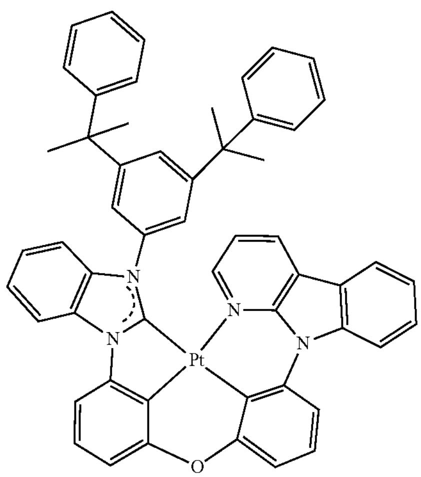
2778
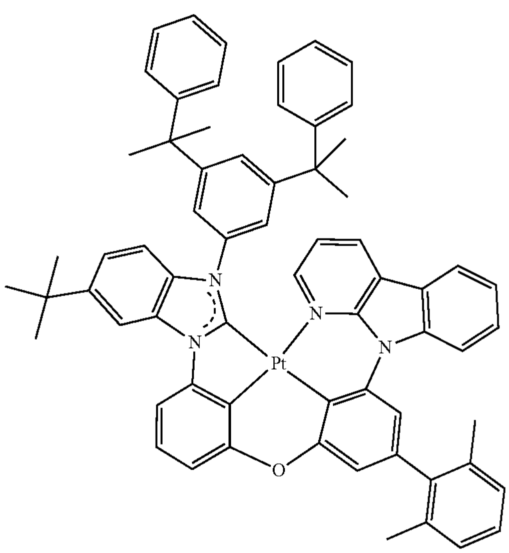
-continued
2779
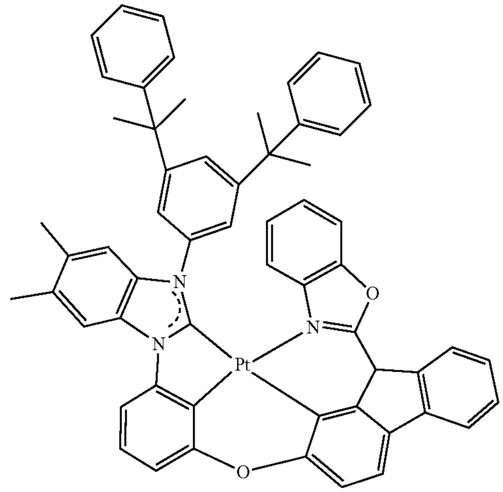
2780
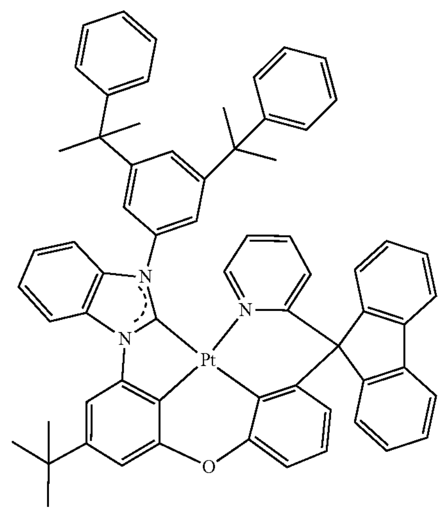
2781
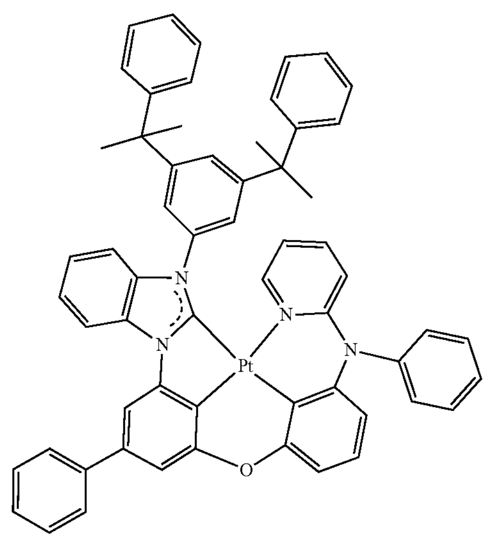

-continued
2782
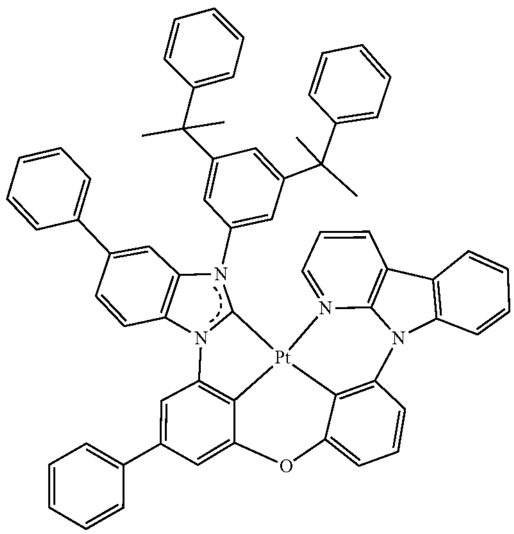
2783
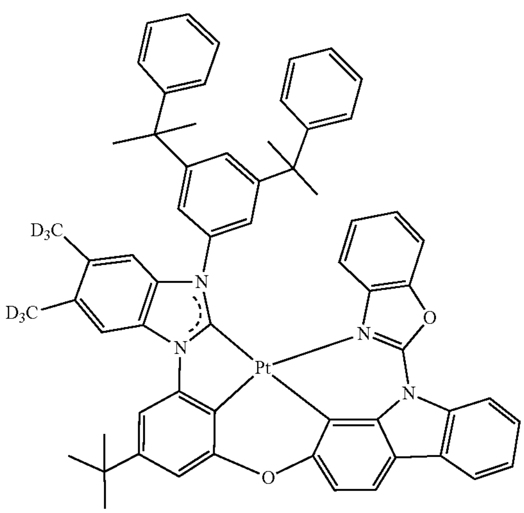
2784
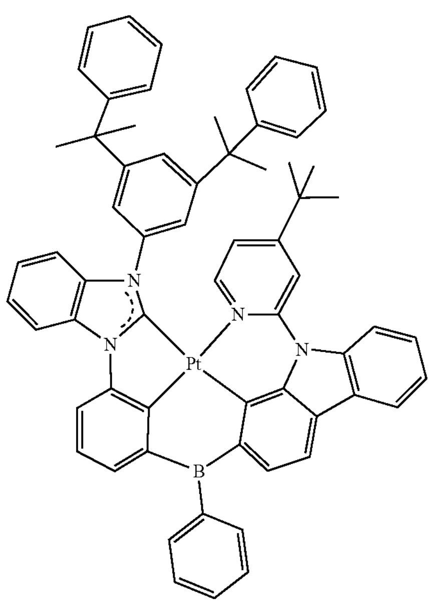
-continued
2785
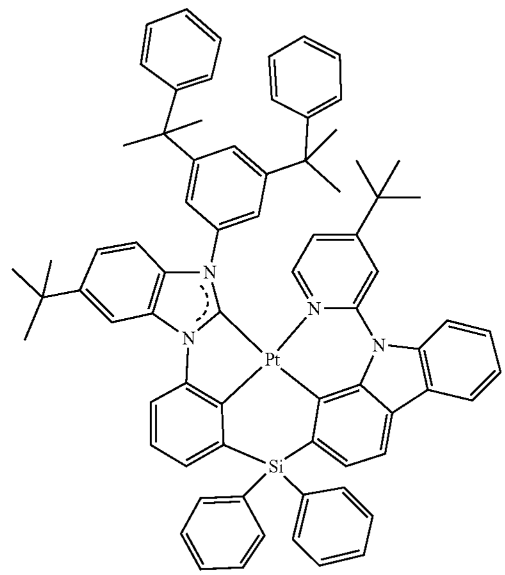
2786
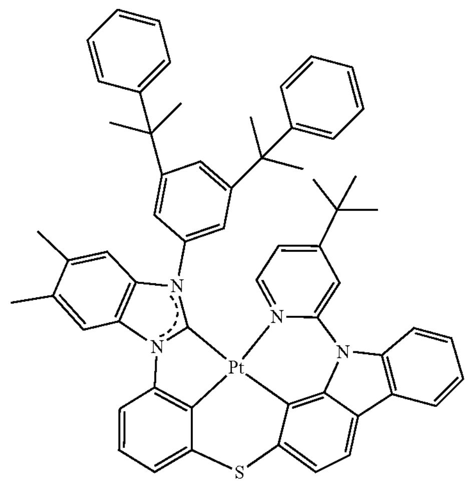
2787
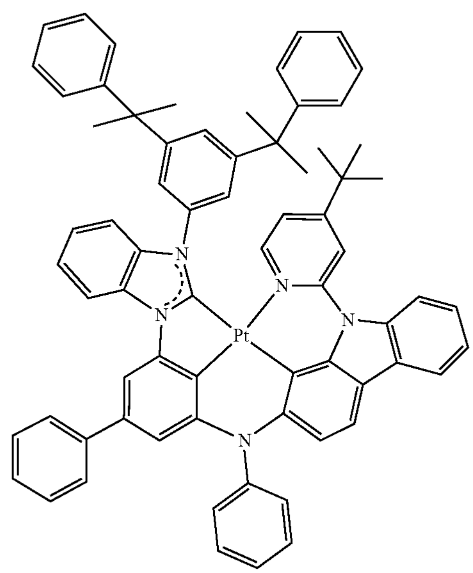

2788
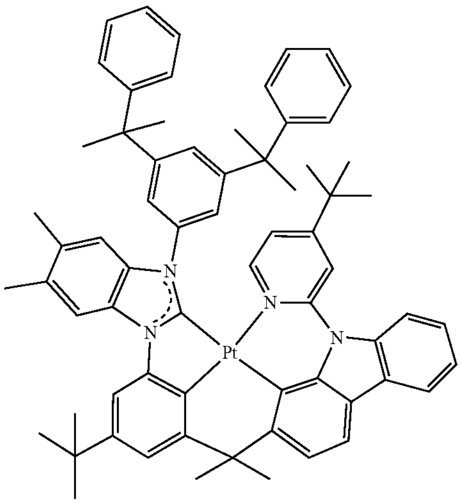
2789
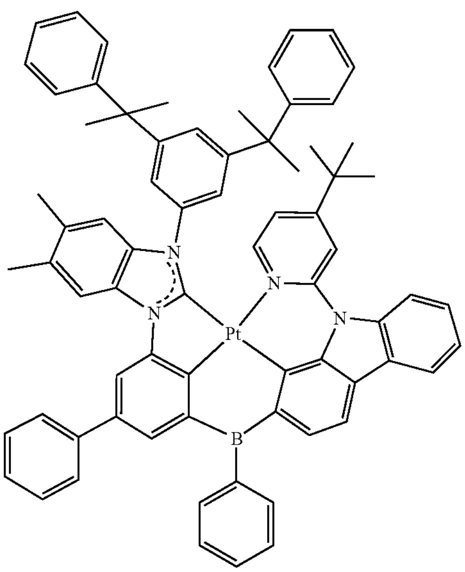
2790
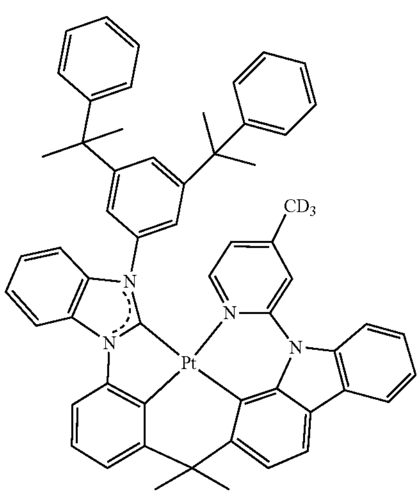
2791
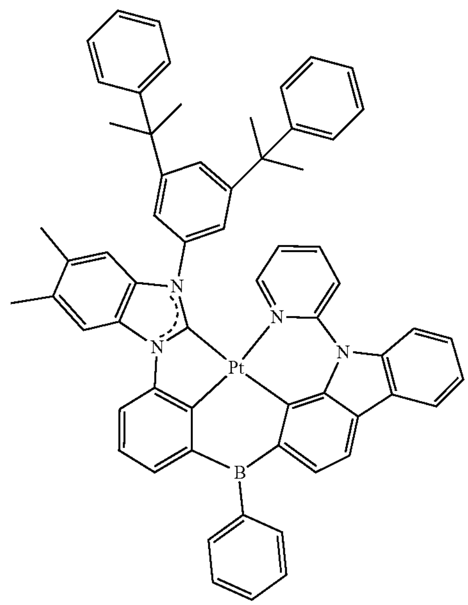
2792
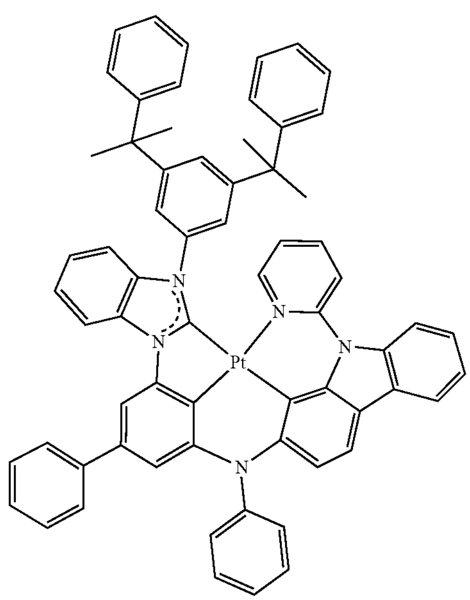

-continued
2793
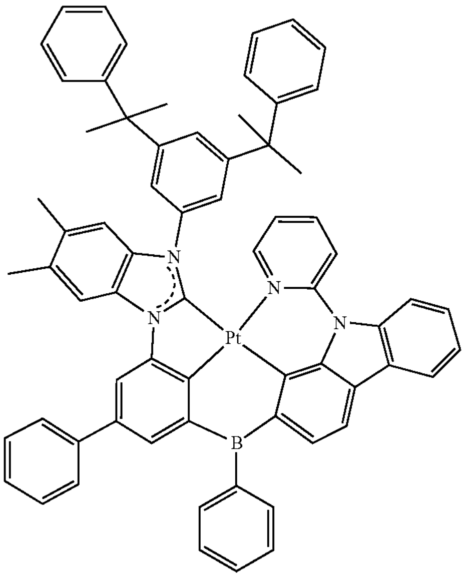
2794
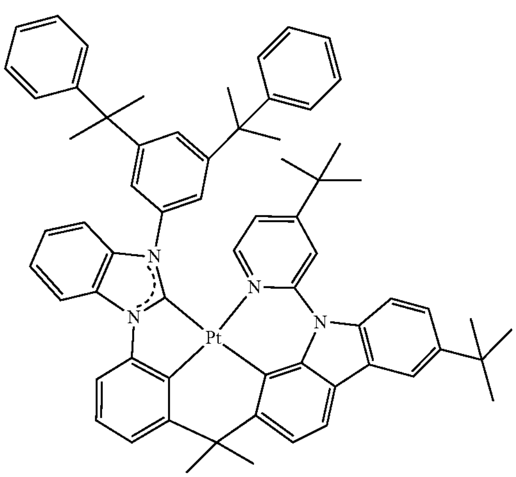
-continued
2795
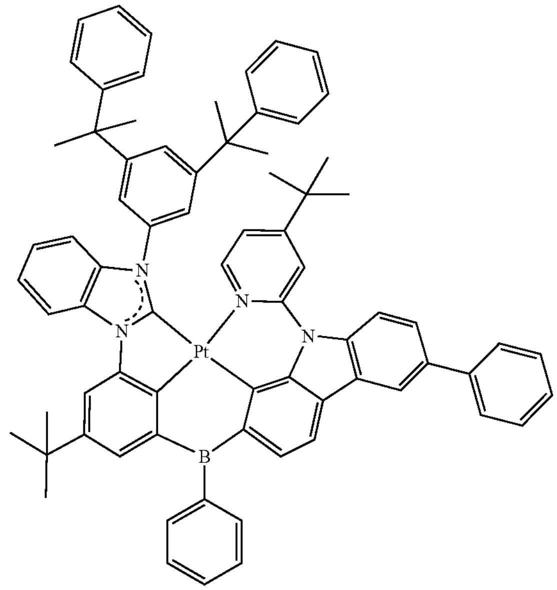
2796
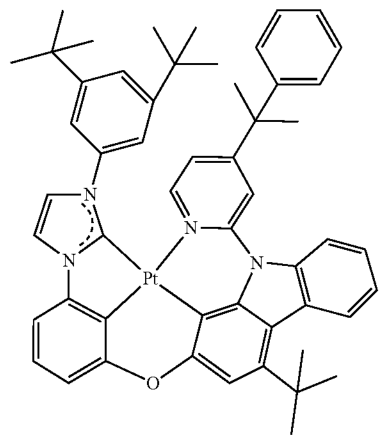
2797
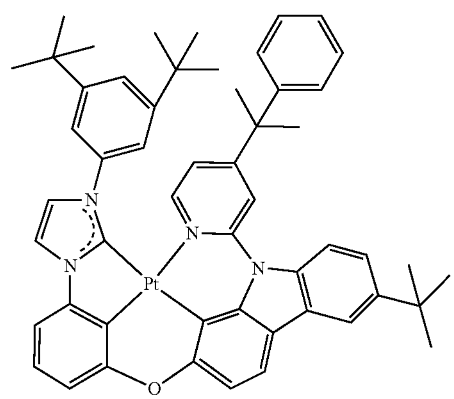

-continued
2798
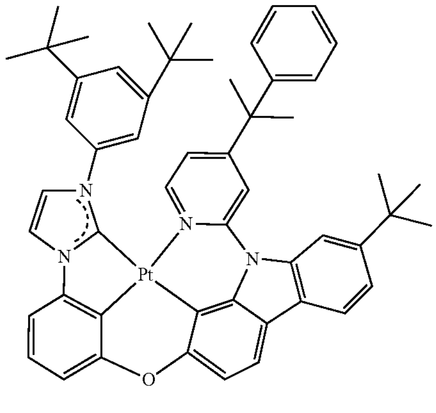
2799
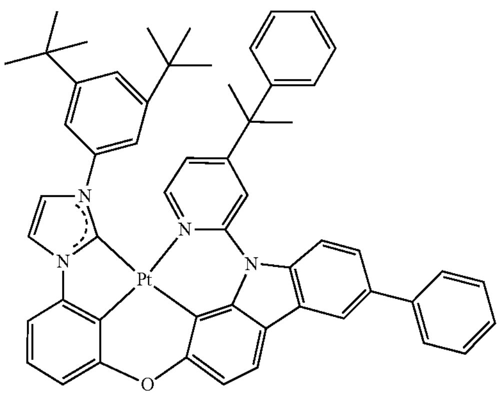
2800
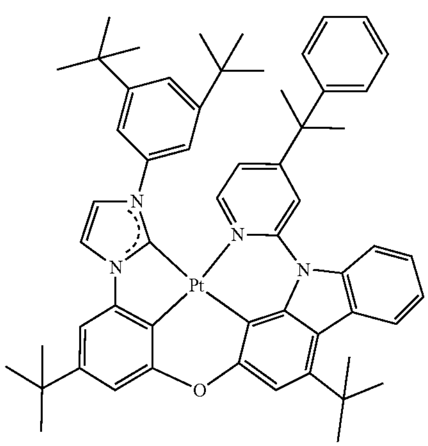
-continued
2801
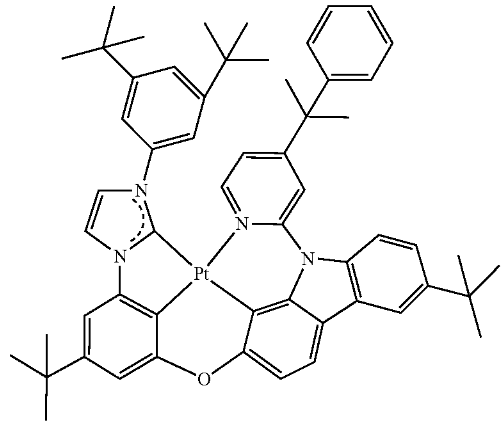
2802
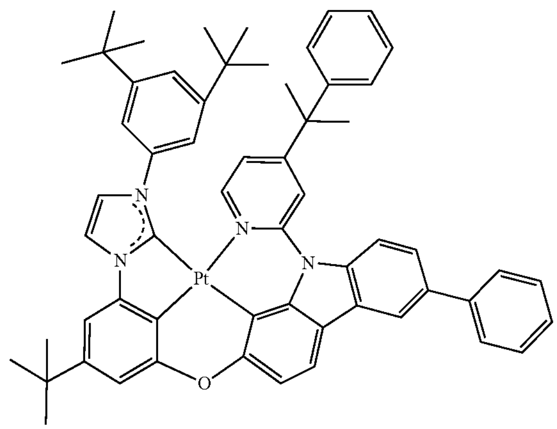
2803
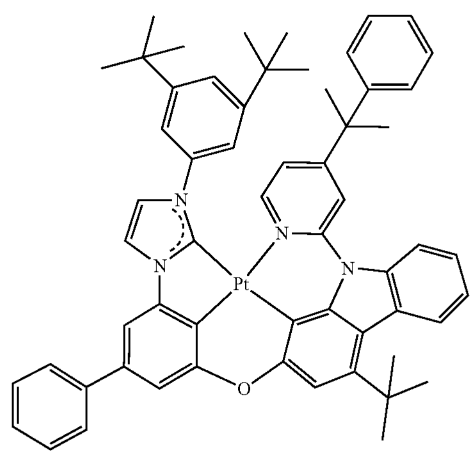

-continued
2804
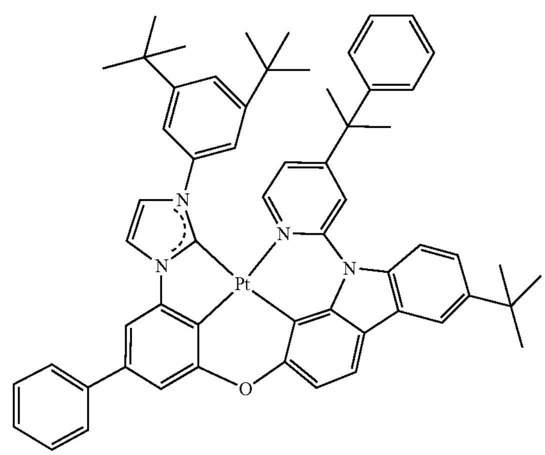
2805
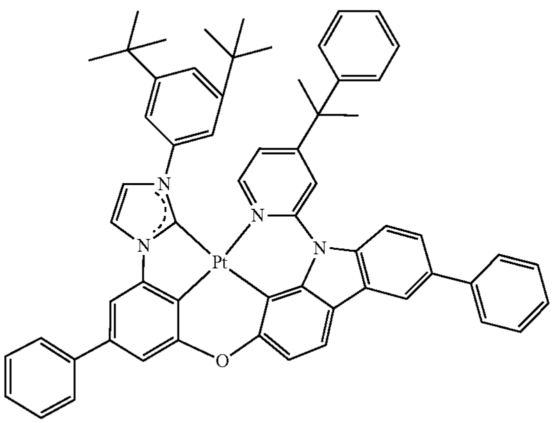
2806
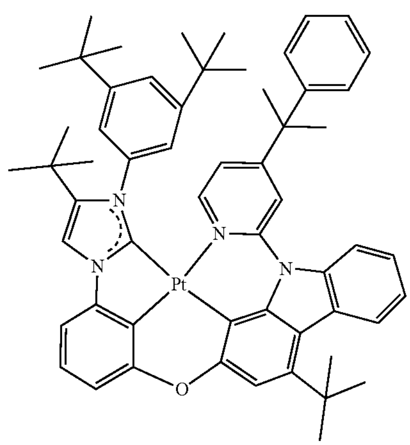
-continued
2807
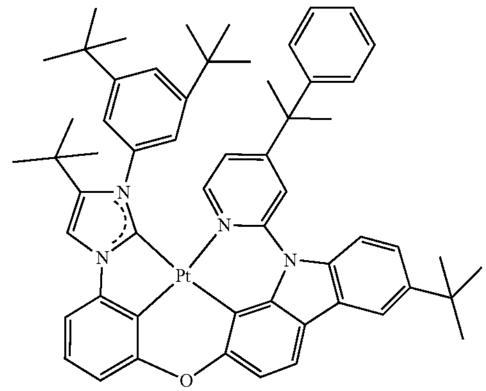
2808
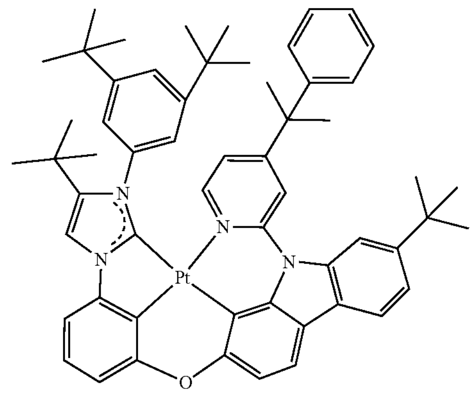
2809
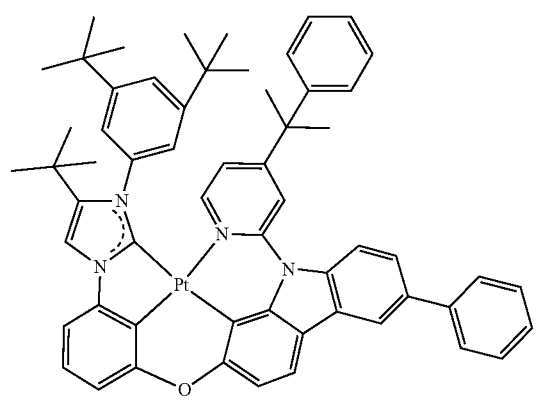
2810
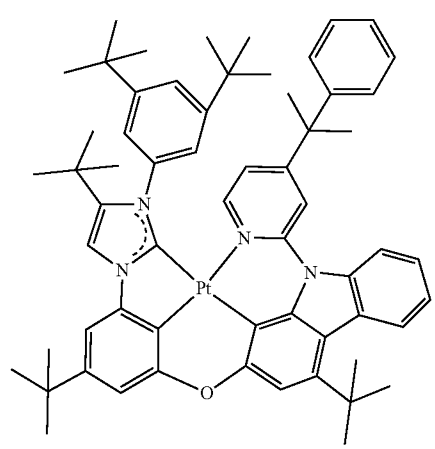

2811
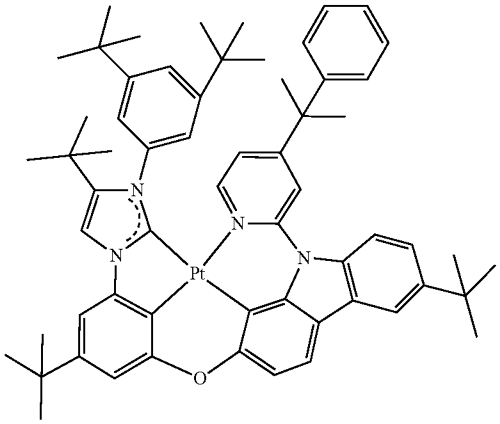
2812
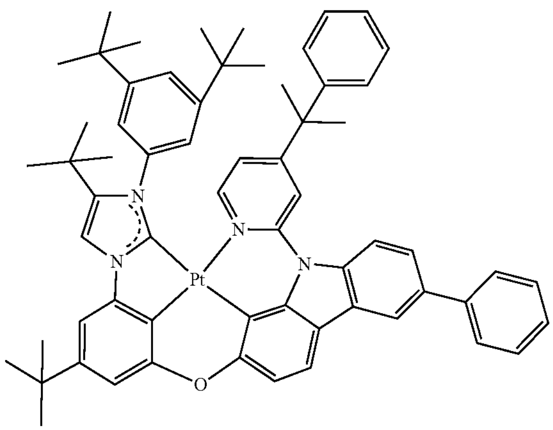
2813
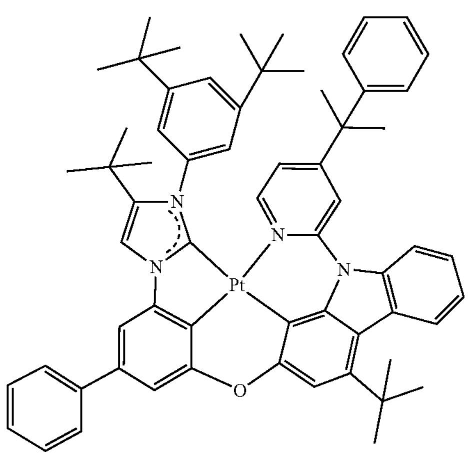
2814
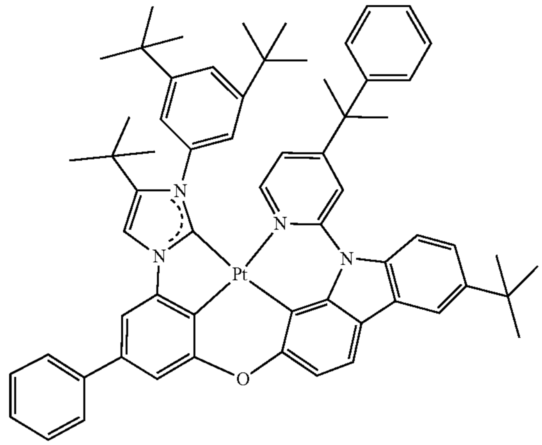
2815
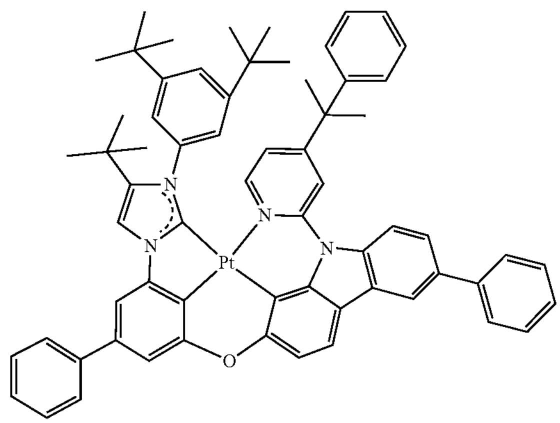
2816
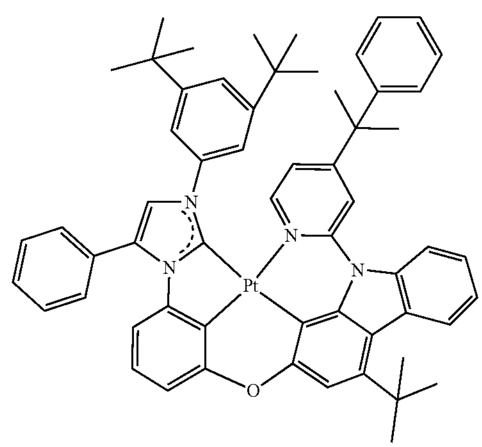

-continued
2817
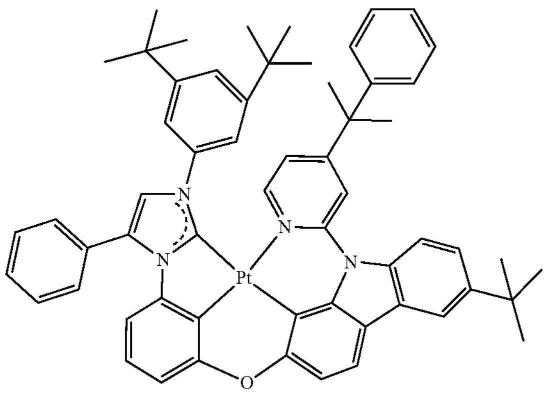
2818
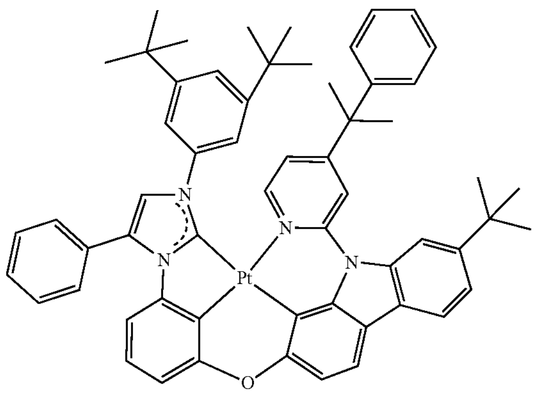
2819
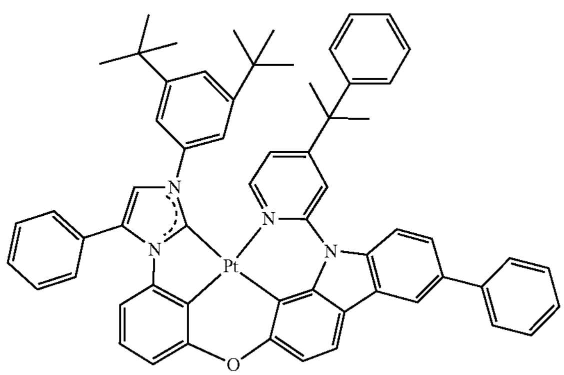
2820
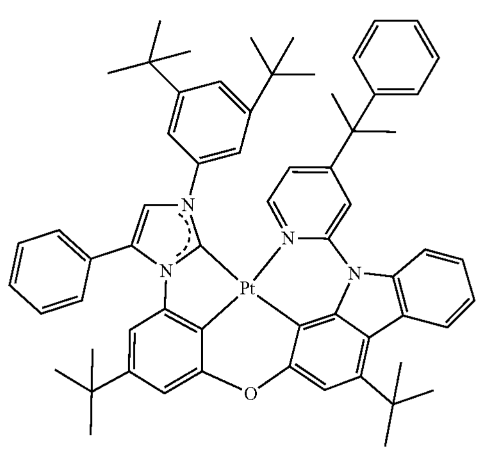
-continued
2821
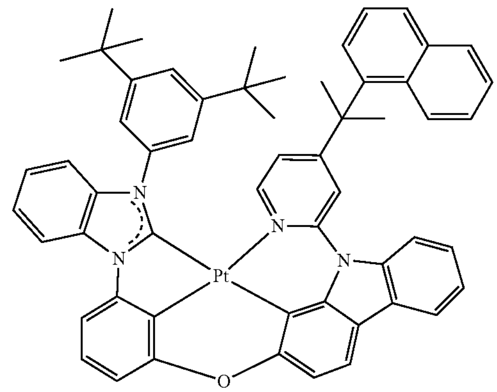
2822
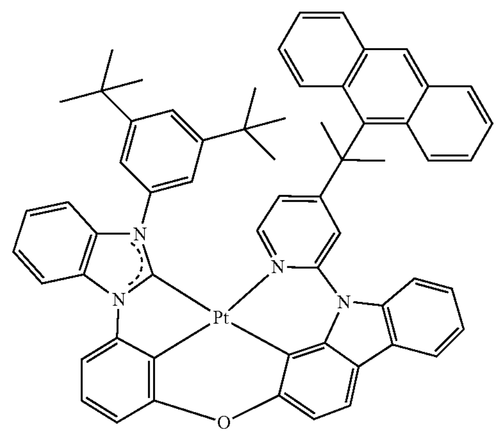
2823
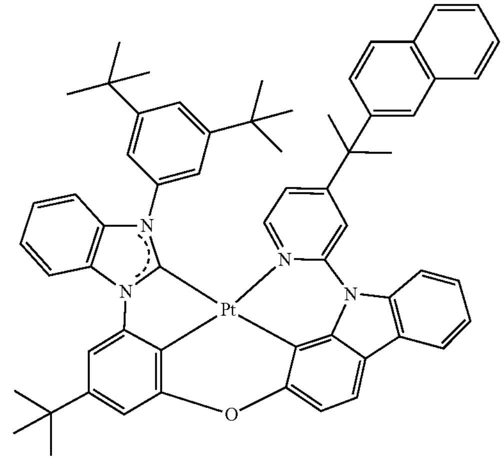

-continued
2824
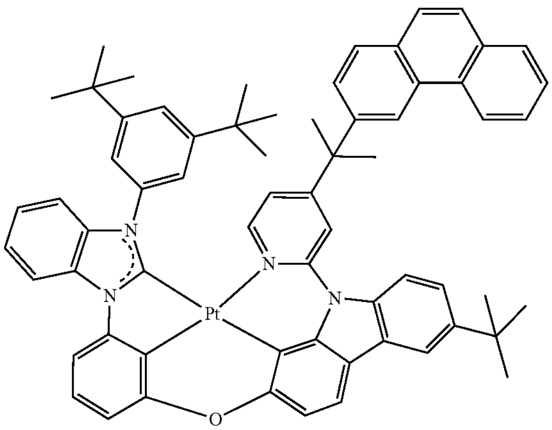
2825
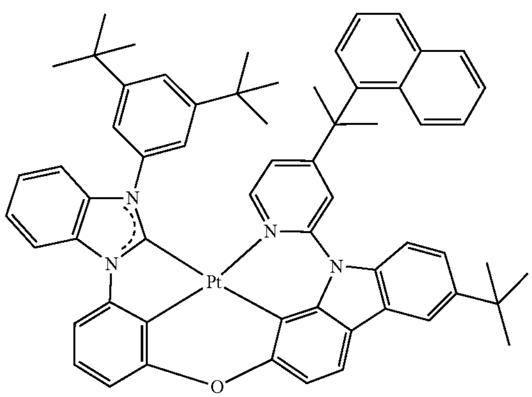
2826
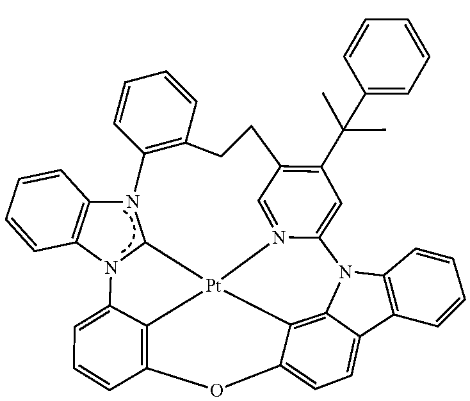
-continued
2827
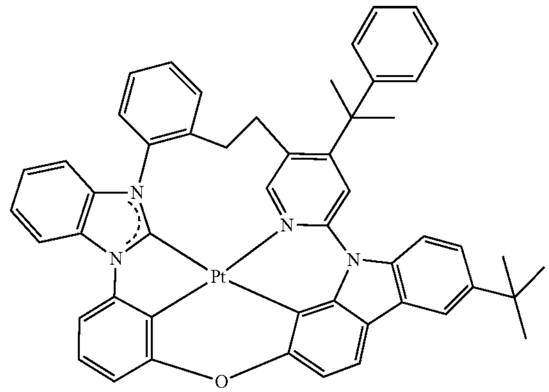
2828
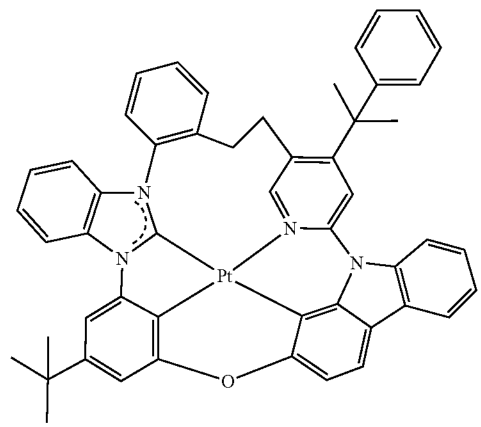
2829
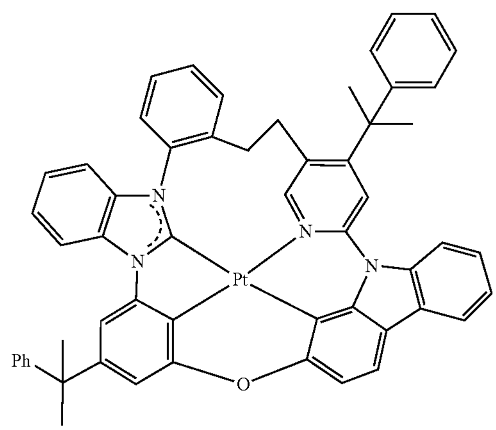
2830
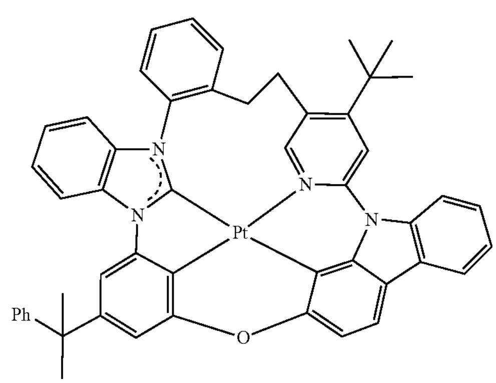

-continued
2831
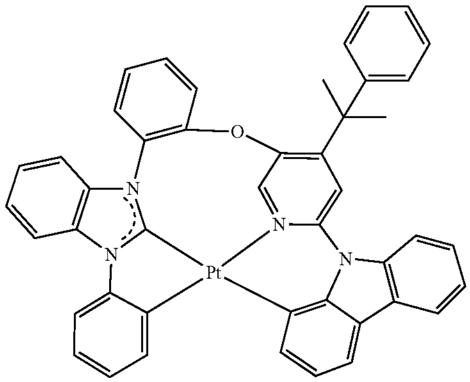
2832
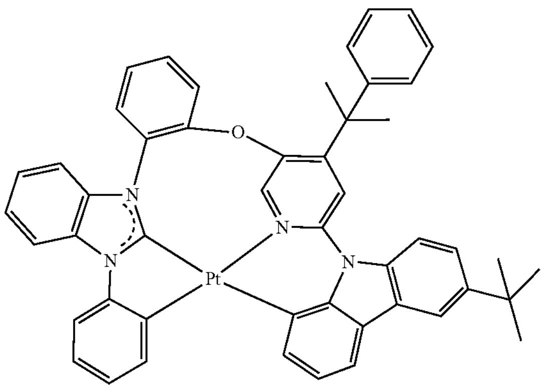
2833
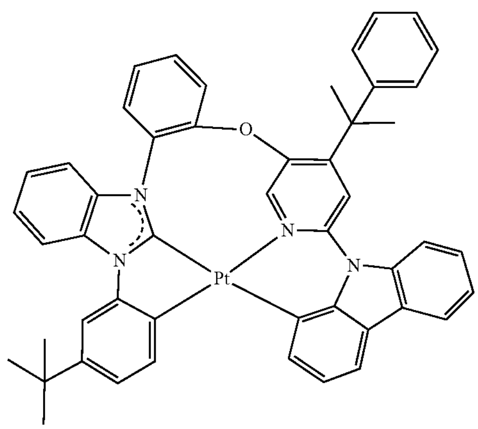
2834
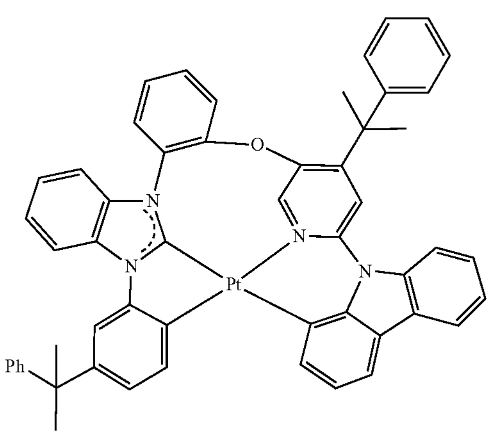
-continued
2835
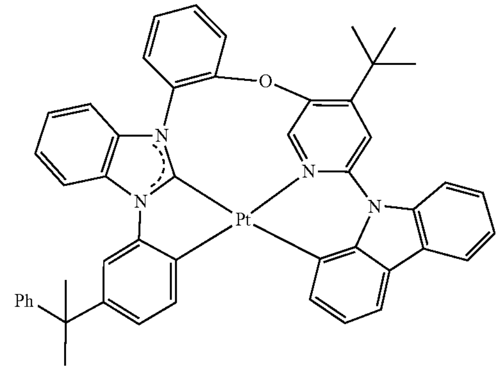
2836
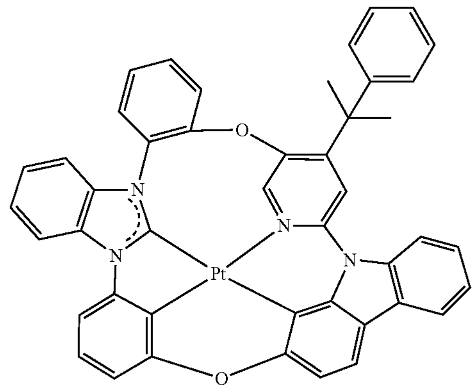
2837
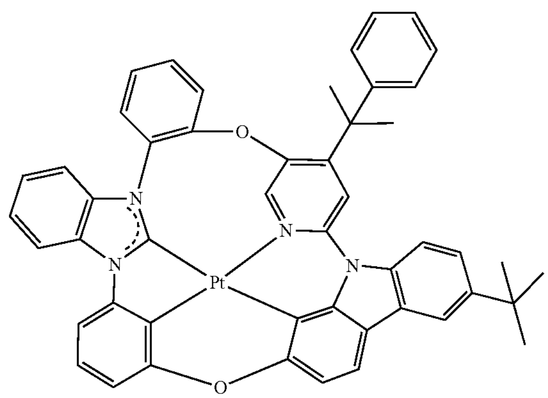
2838
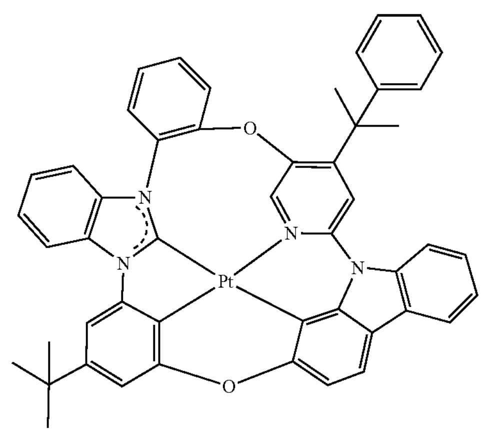

-continued
2839
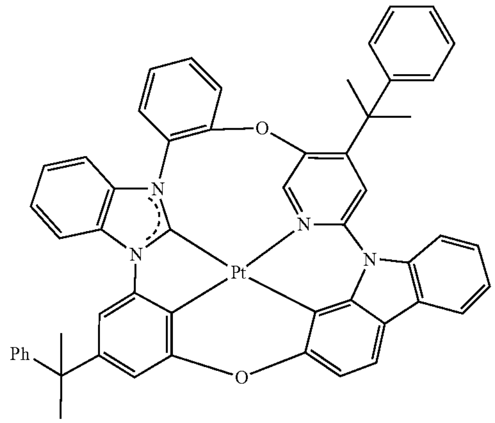
2840
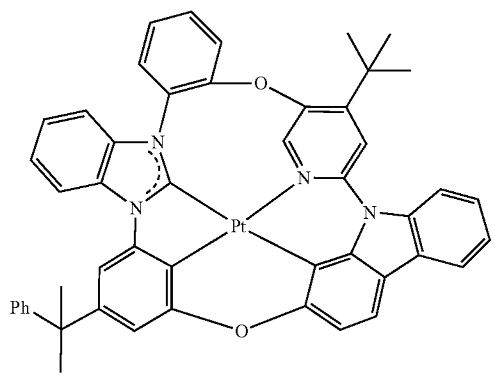
2841
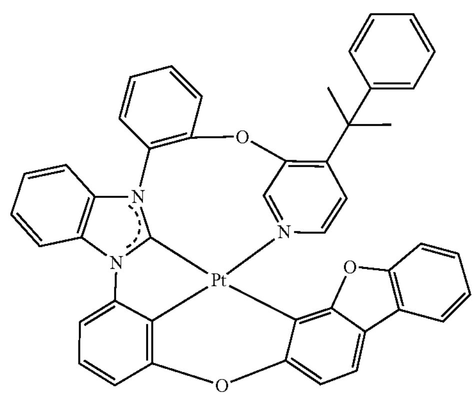
2842
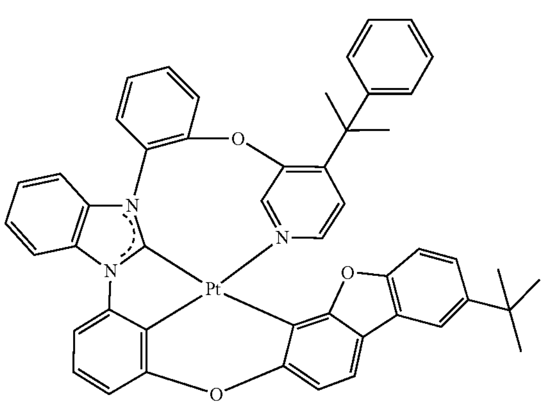
-continued
2843
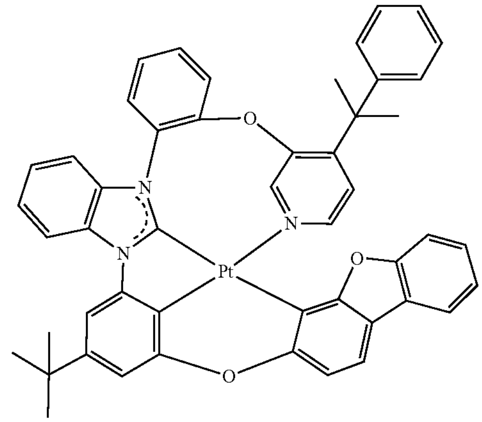
2844
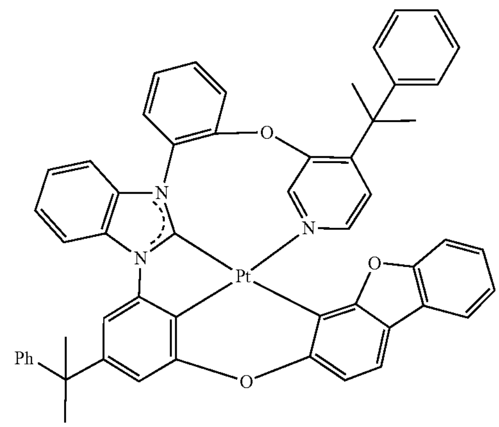
2845
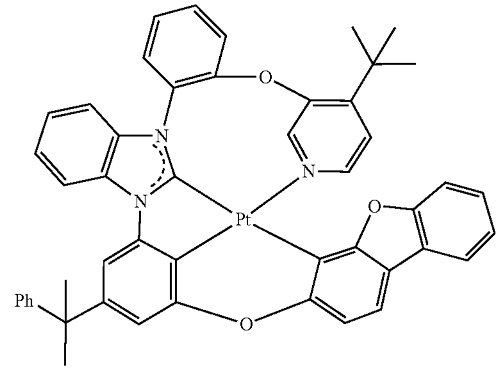
2846
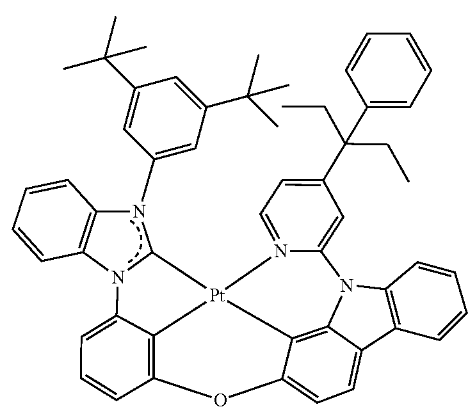

-continued
2847
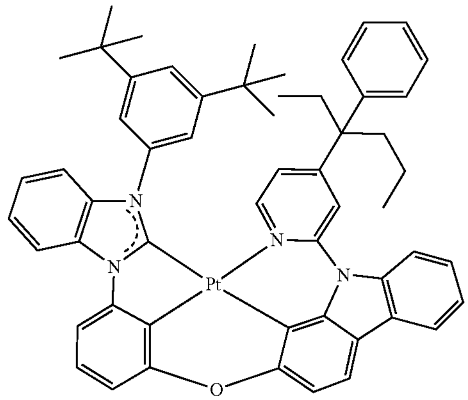
2848
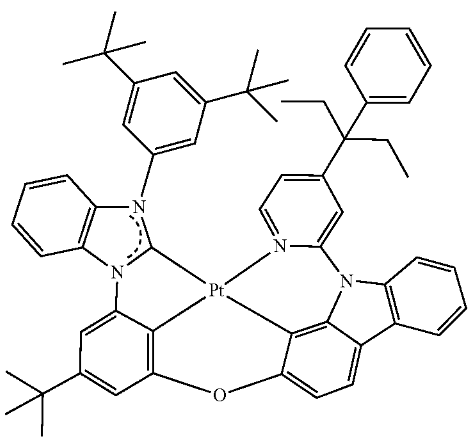
2849
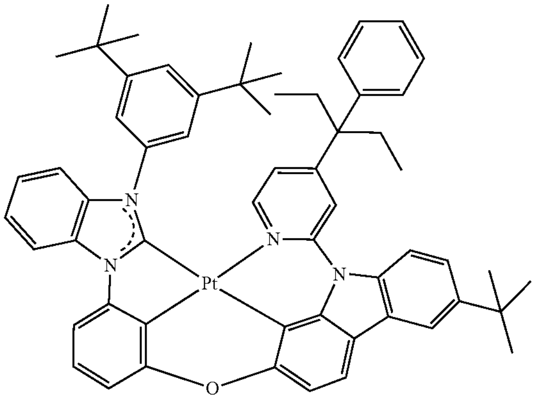
-continued
2850
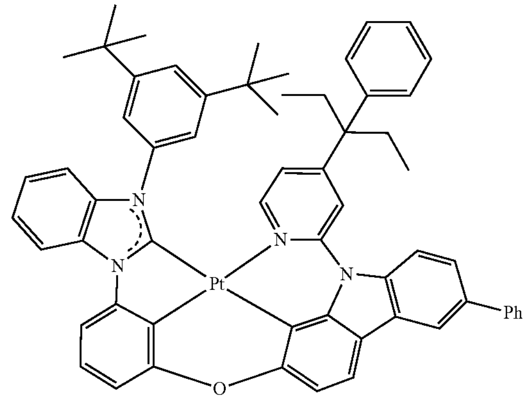
2851
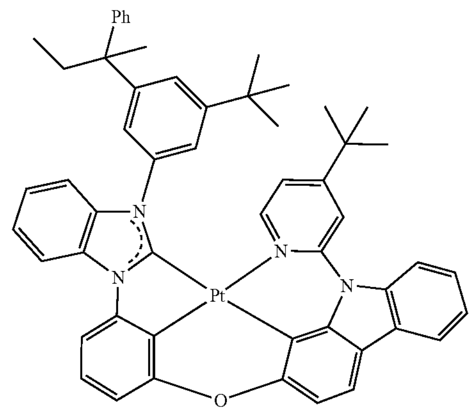
2852
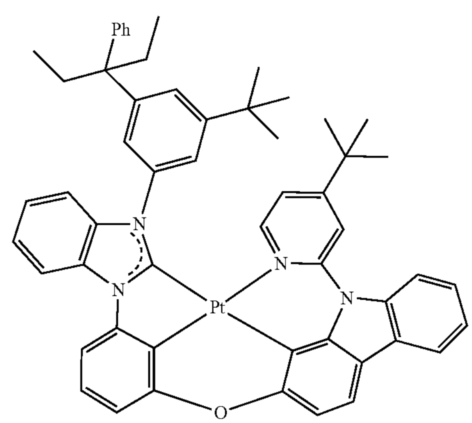

-continued
2853
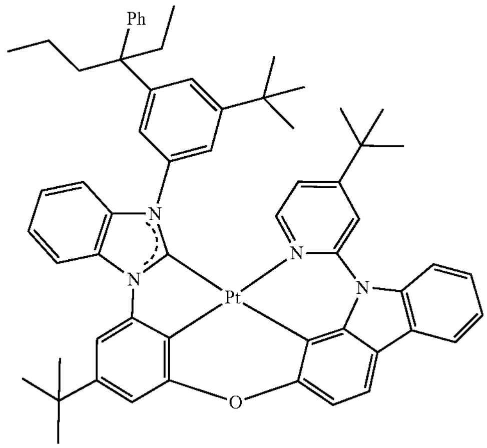
2854
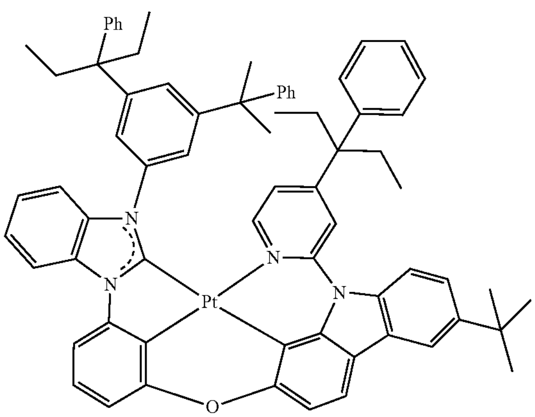
2855
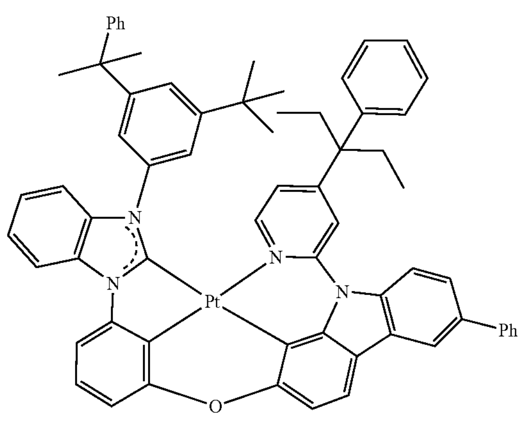
-continued
2856
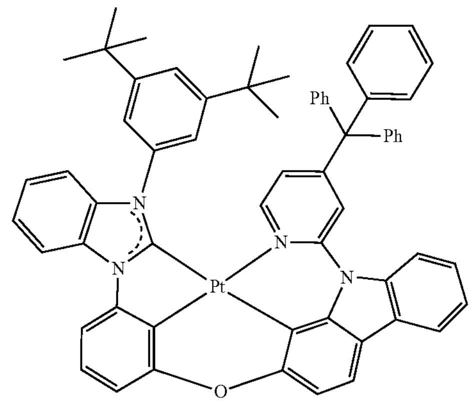
2857
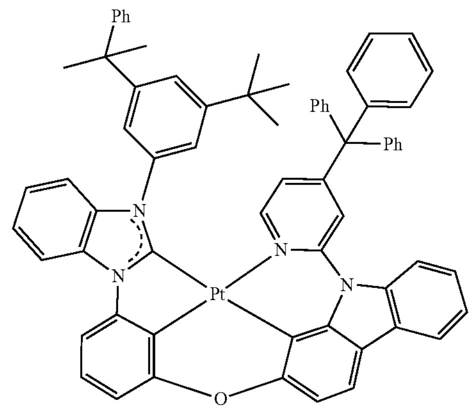
2858
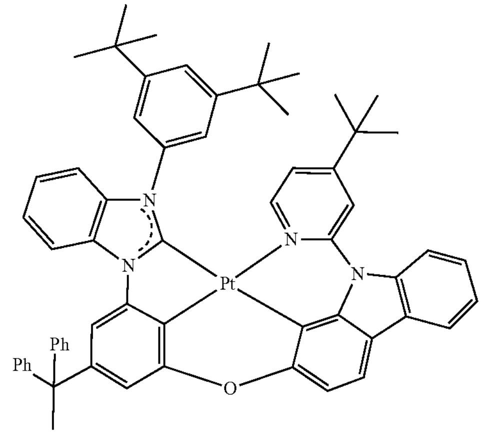

-continued
2859
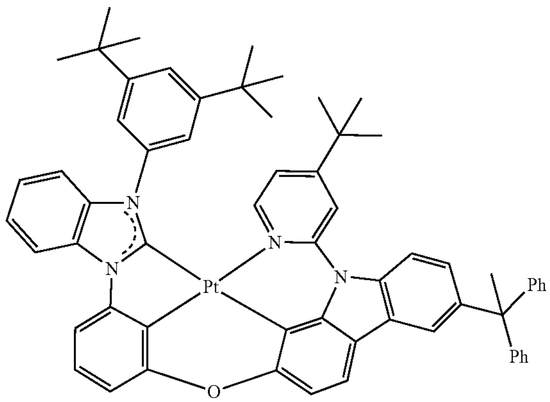
2860
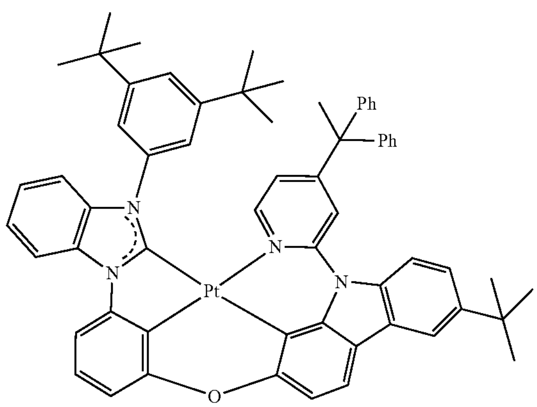
2861
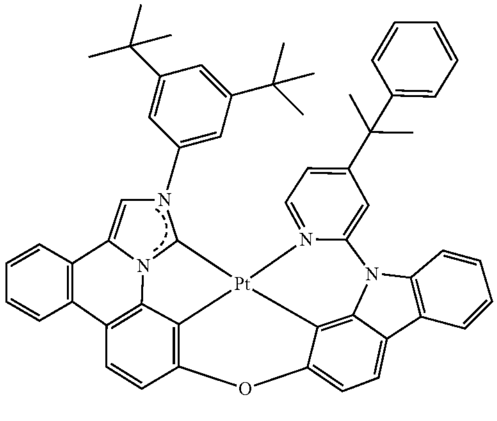
-continued
2862
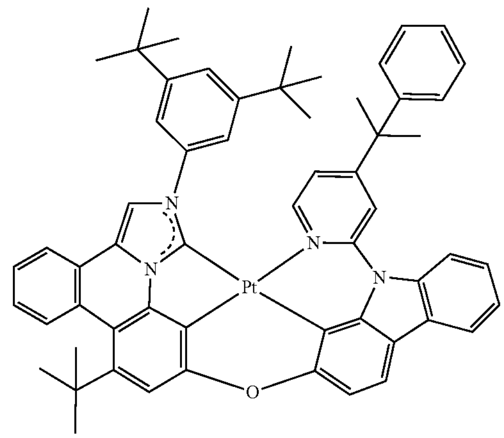
2863
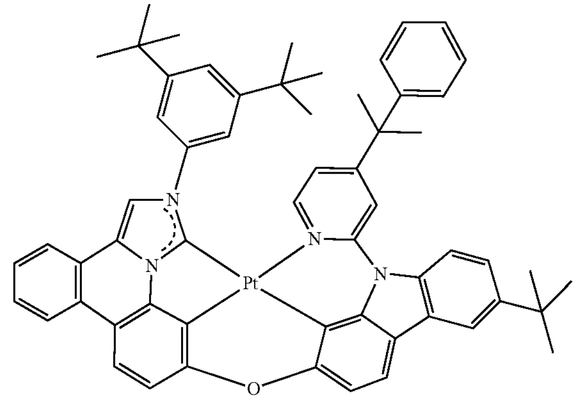
2864
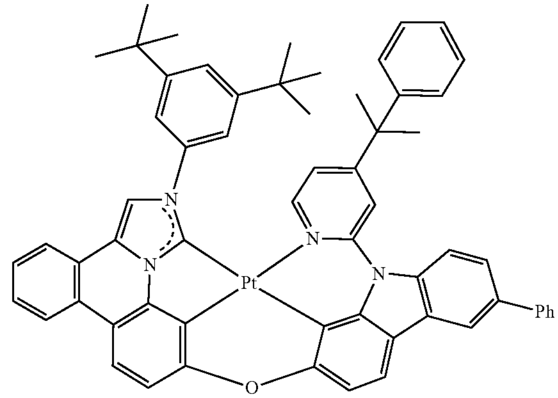

-continued
2865
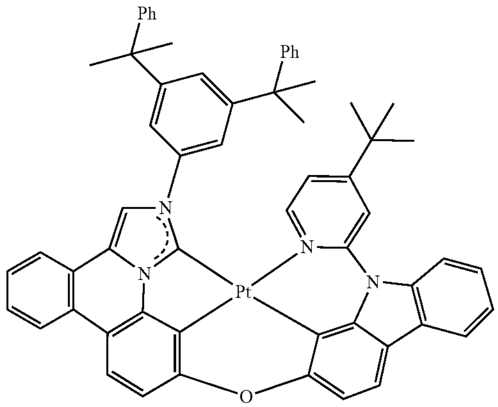
2866
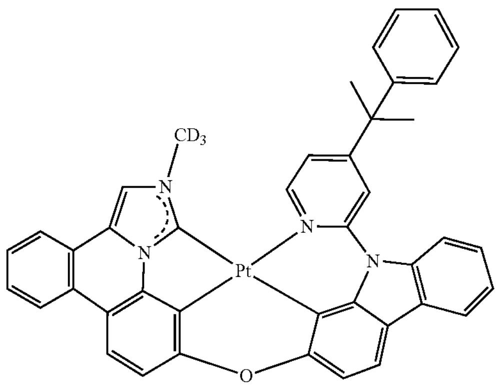
2867
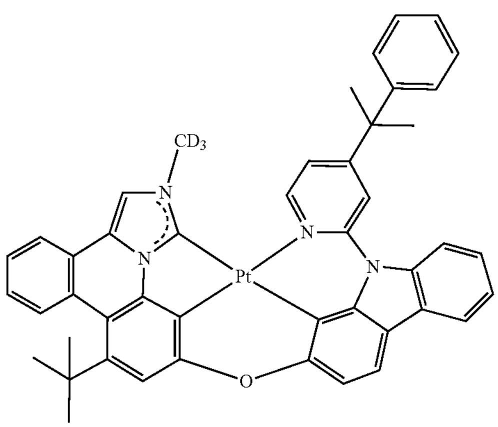
2868
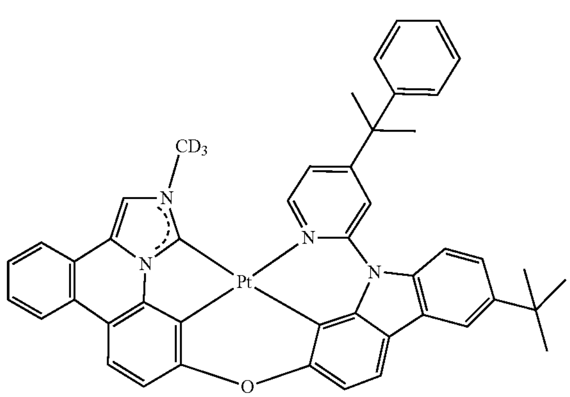
-continued
2869
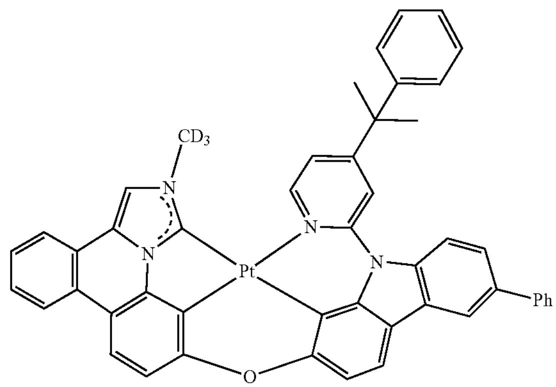
2870
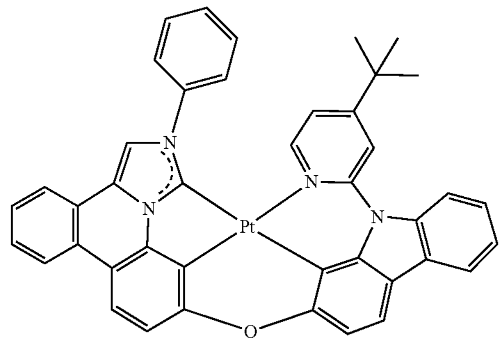
2871
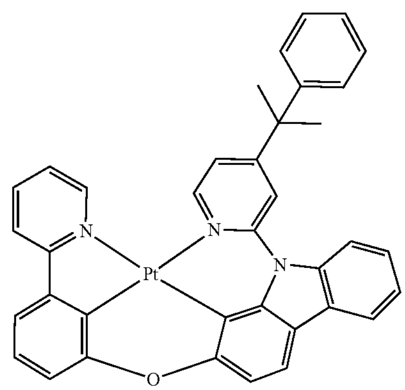
2872
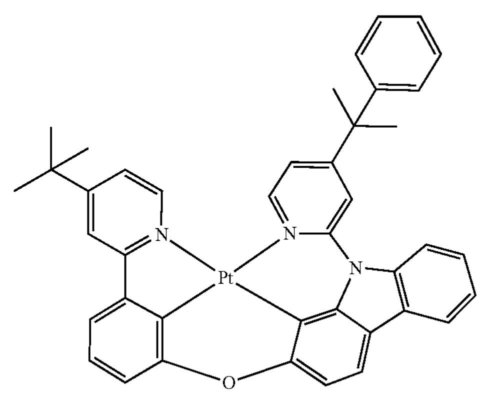

-continued
2873
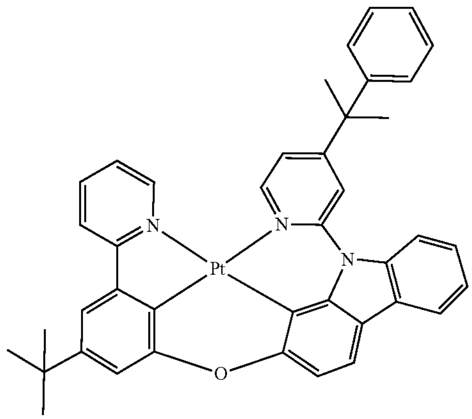
2874
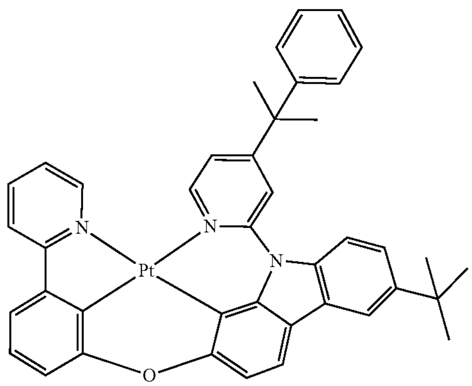
2875
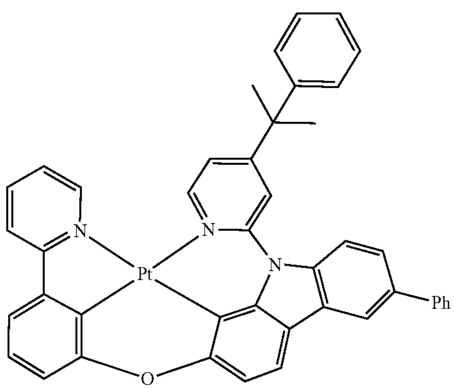
2876
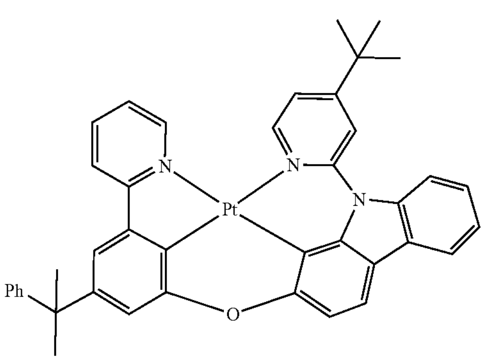
-continued
2877
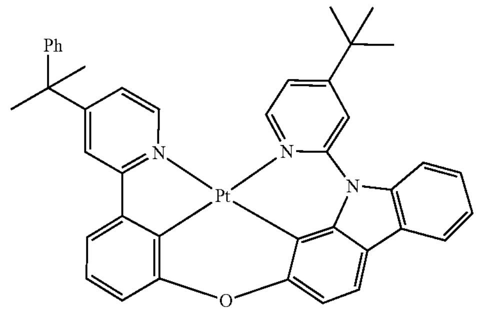
2878
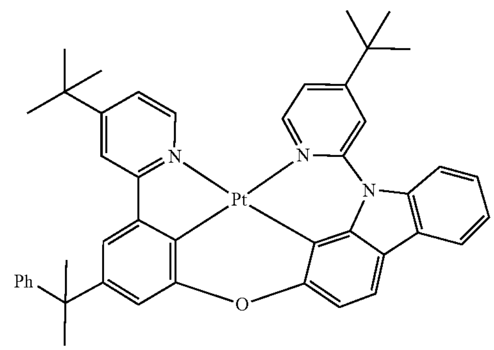
2879
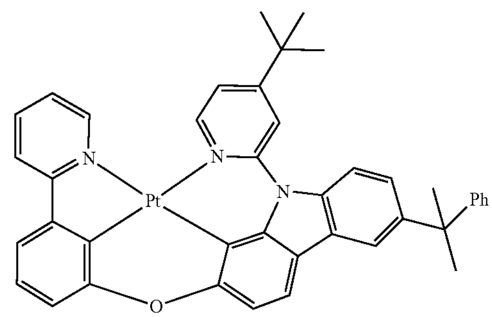
2880
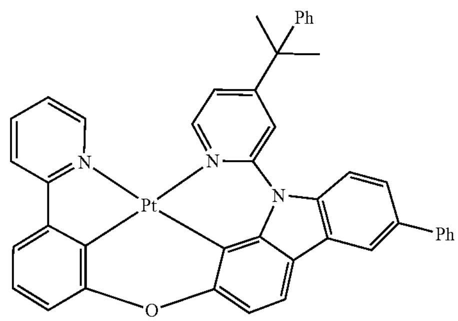
2881
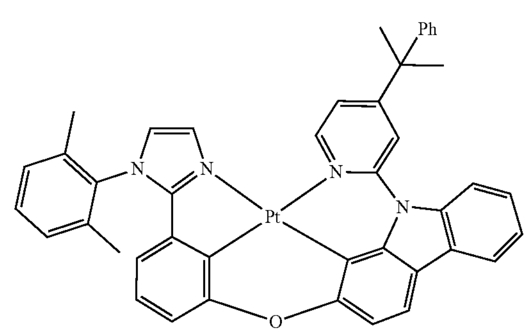

-continued
2882
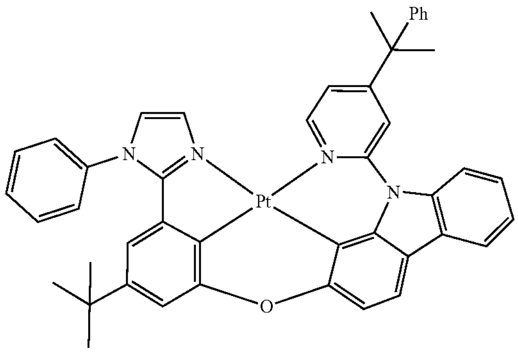
2883
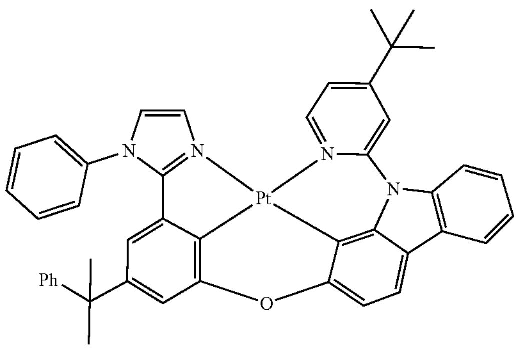
2884
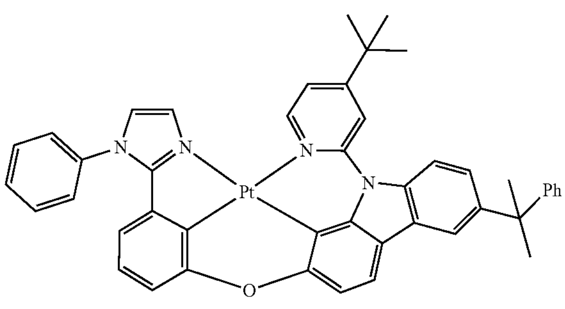
2885
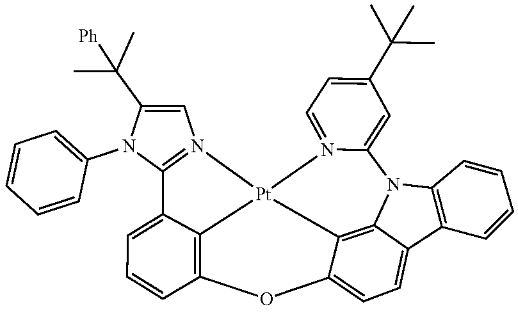
-continued
2886
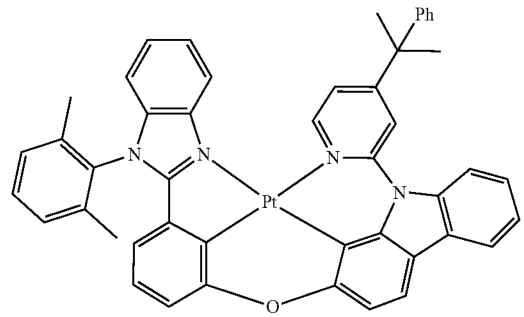
2887
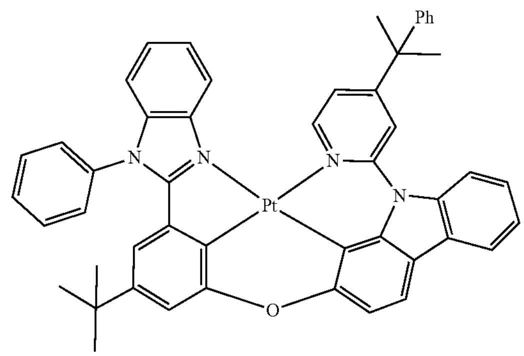
2888
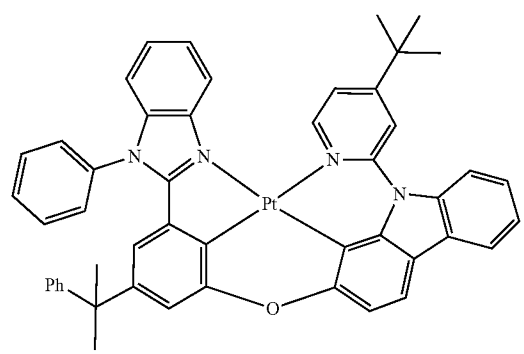
2889
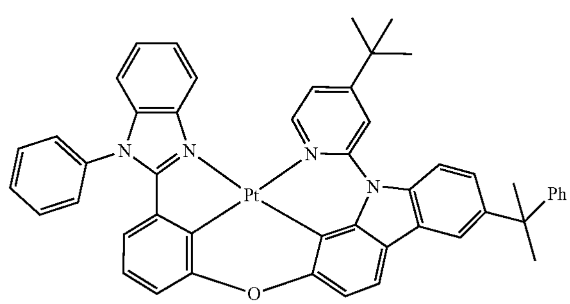

2890
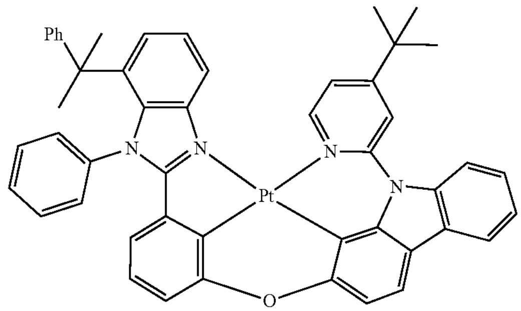
2891
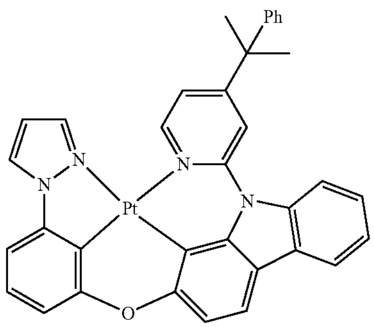
2892
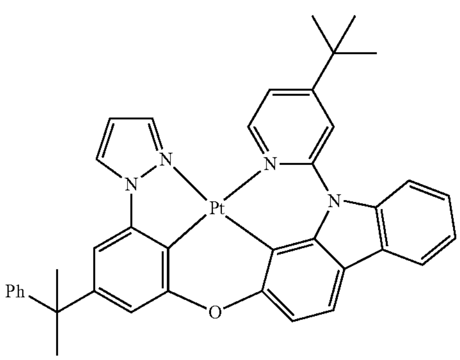
2893
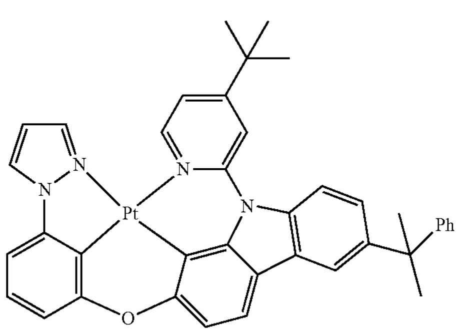
2894
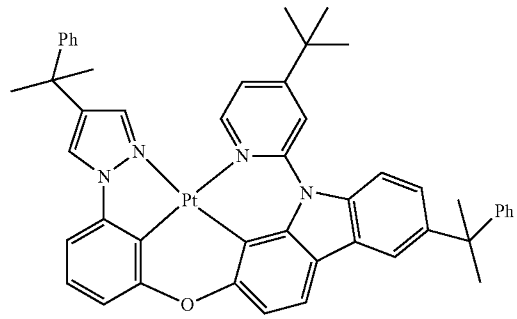
2895
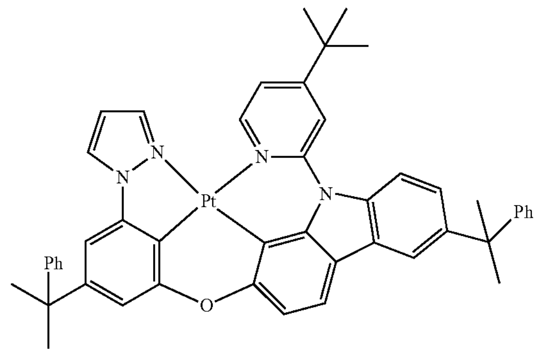
2896
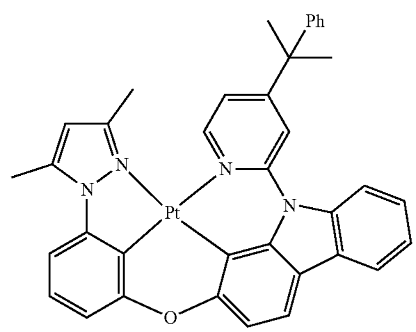
2897
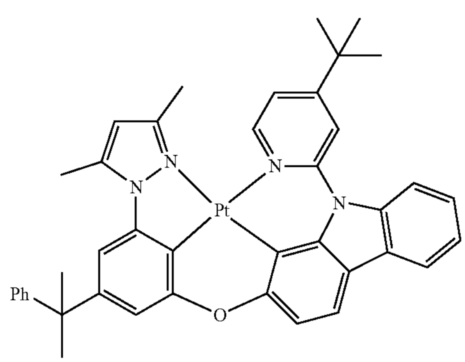

2898
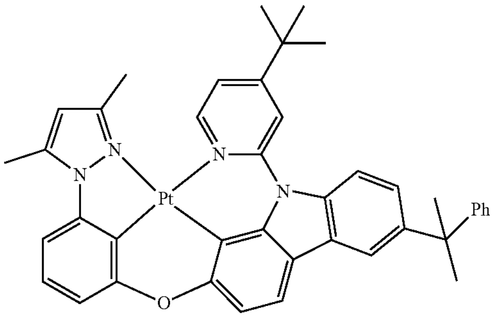
2899
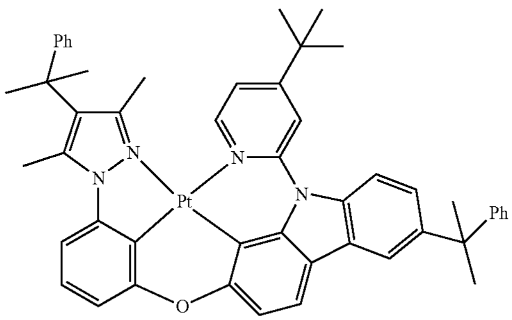
2900
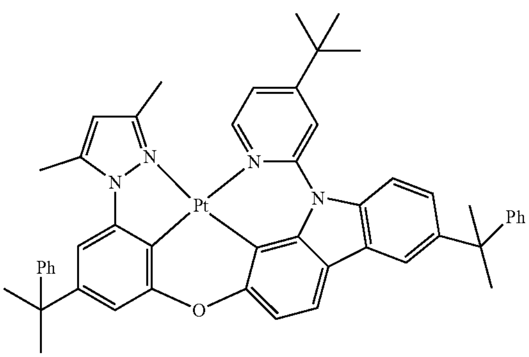
2901
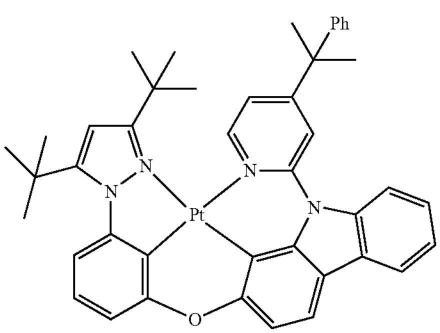
2902
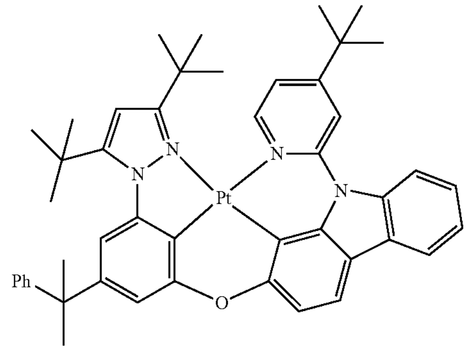
2903
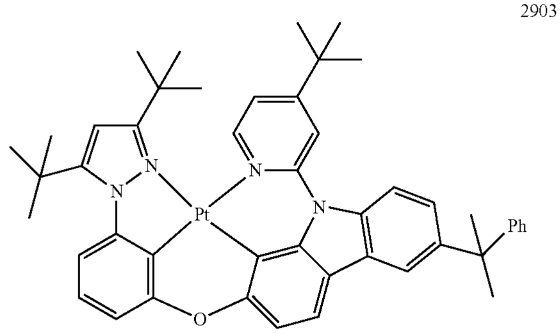
2904
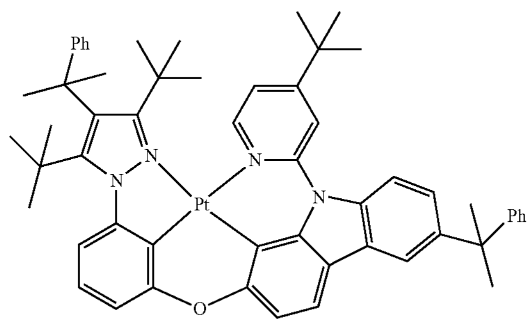
2905
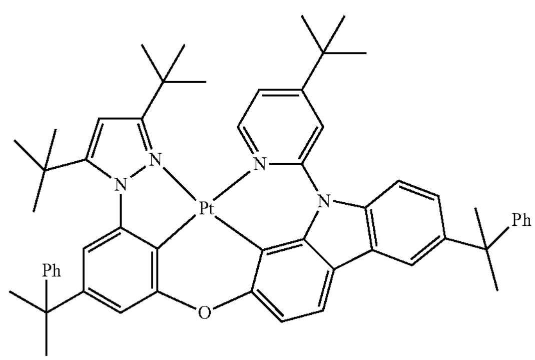

-continued
2906
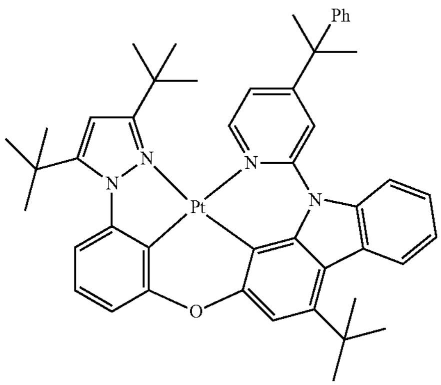
2907
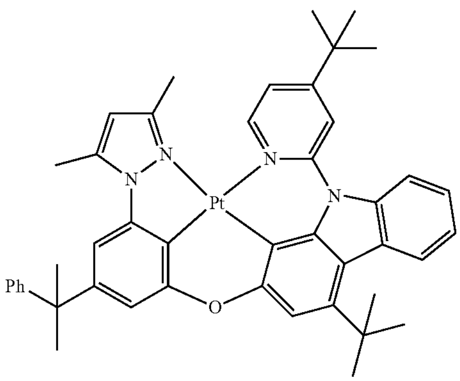
2908
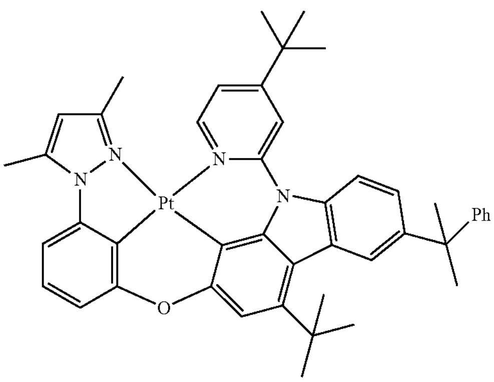
2909
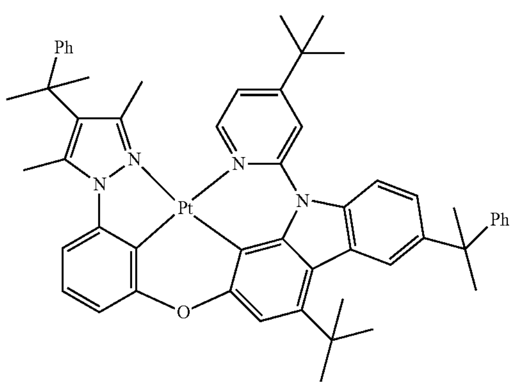
-continued
2910
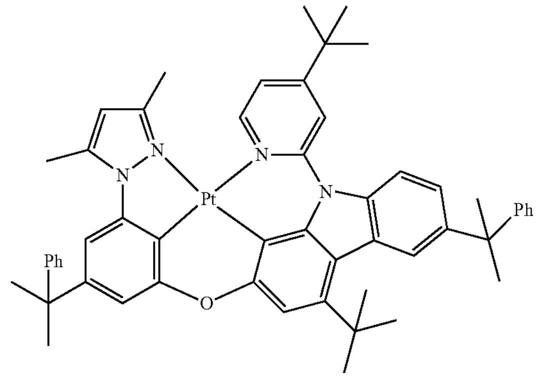
2911
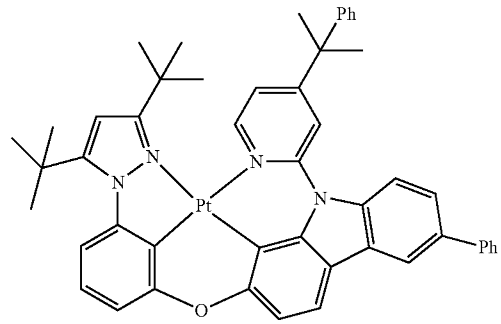
2912
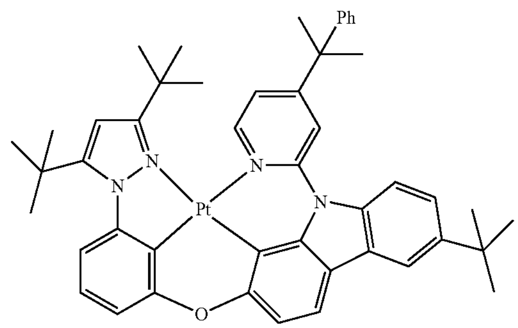
2913
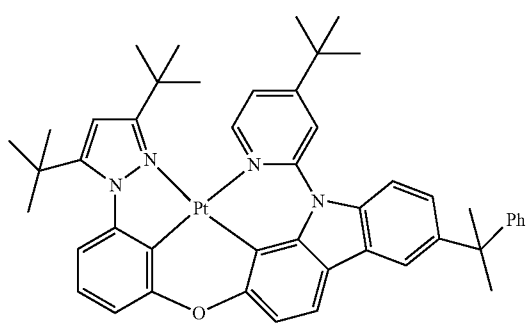

2914
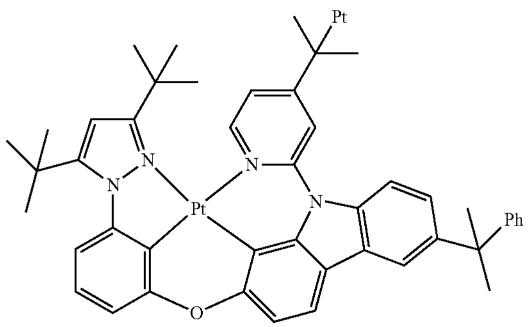
2915
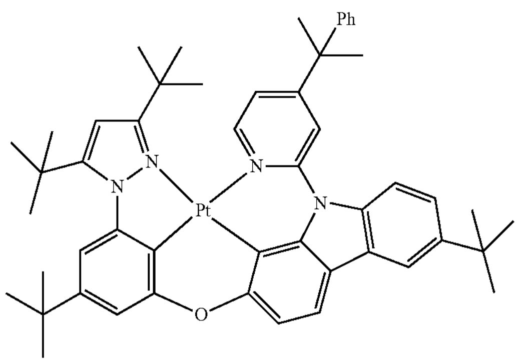
2916
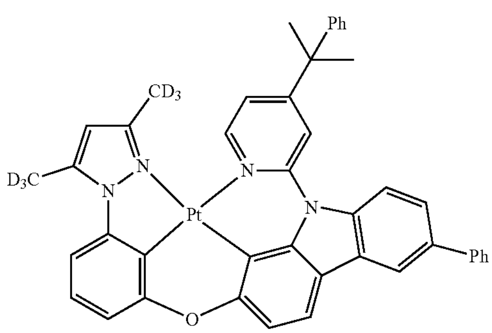
2917
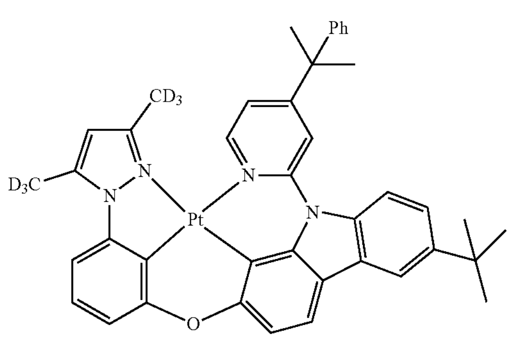
2918
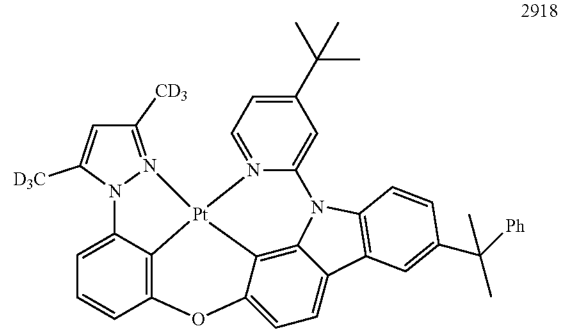
2919
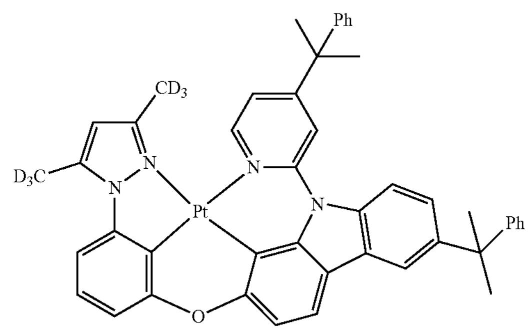
2920
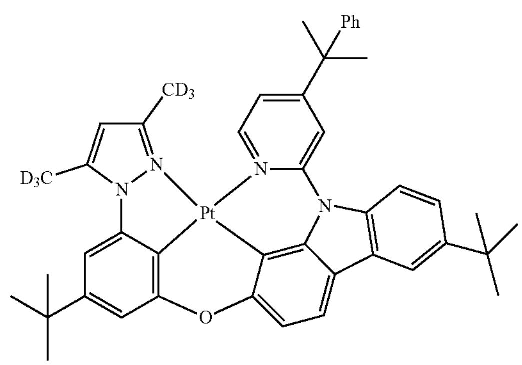
2921
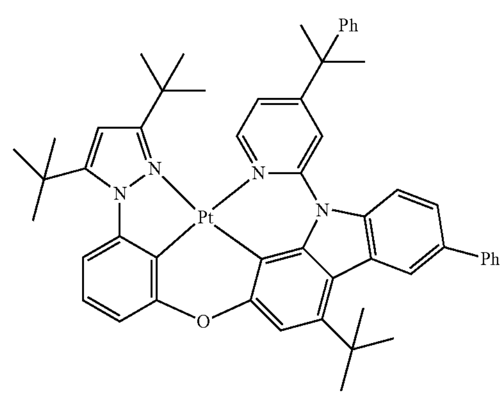

2922
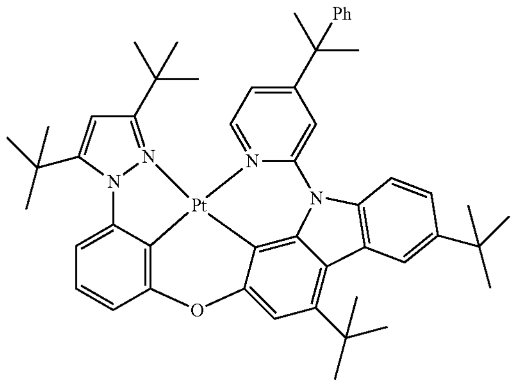
2923
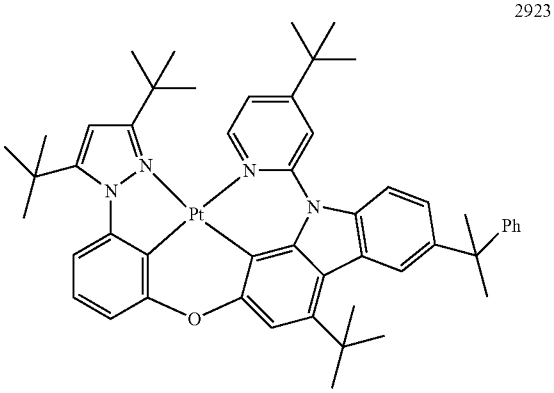
2924
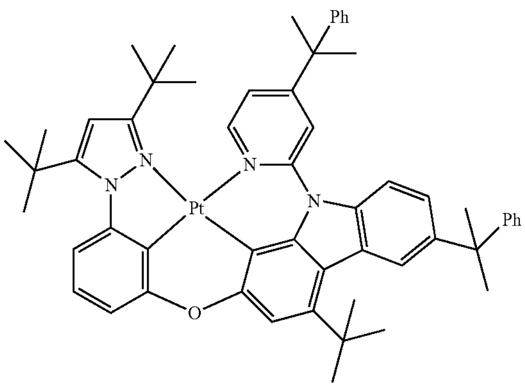
2925
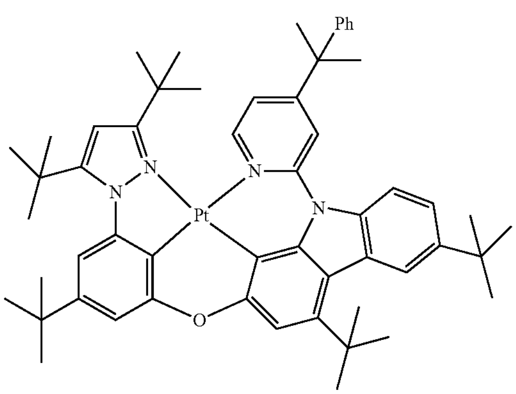
2926
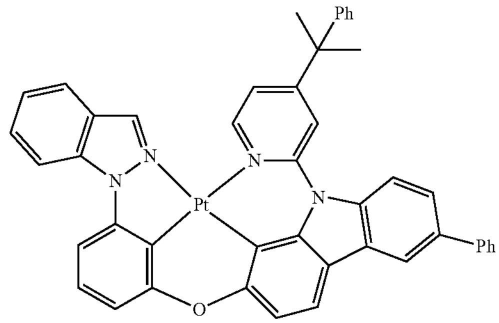
2927
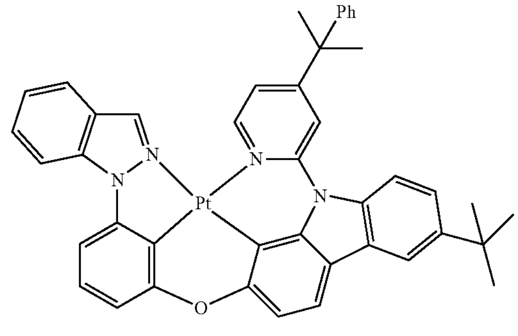
2928
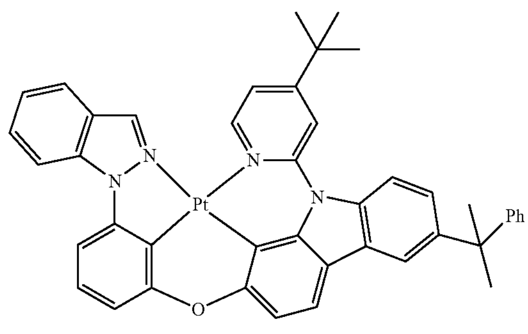
2929
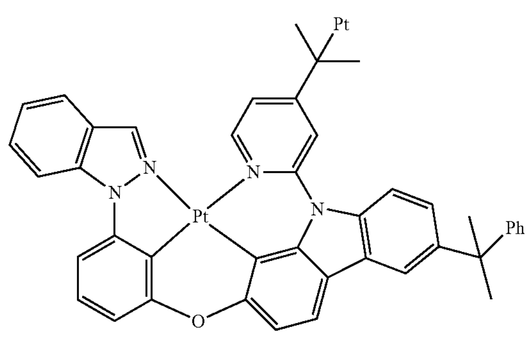

-continued
2930
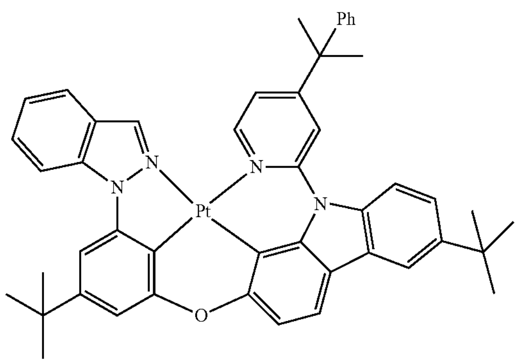
2931
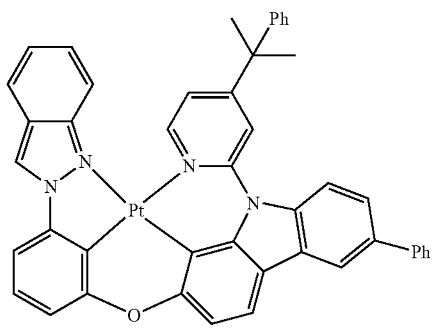
2932
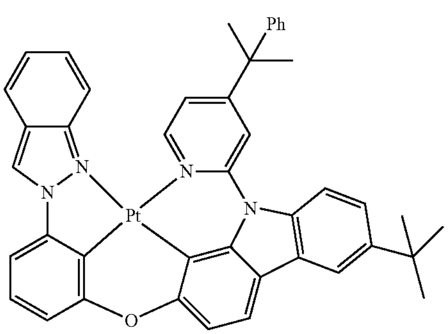
2933
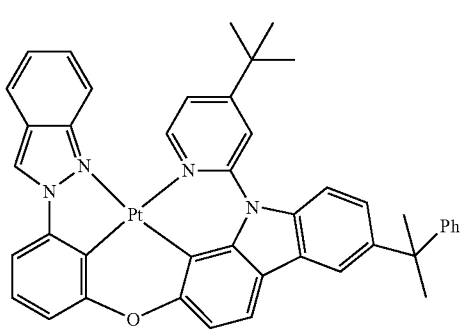
-continued
2934
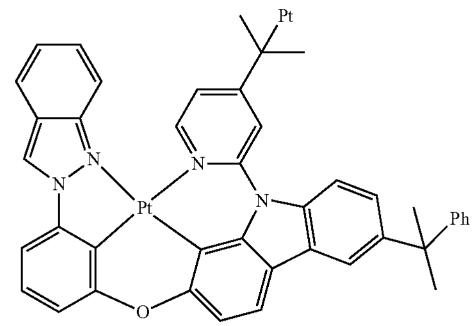
2935
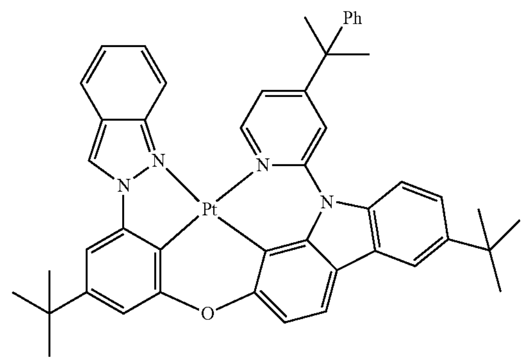
2936
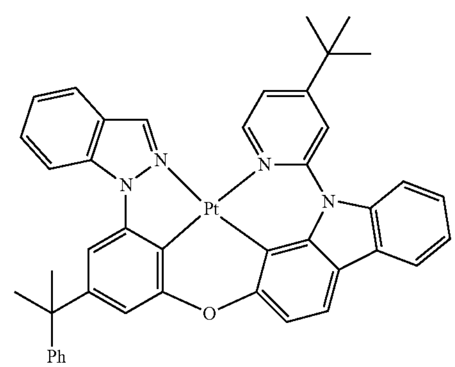
2937
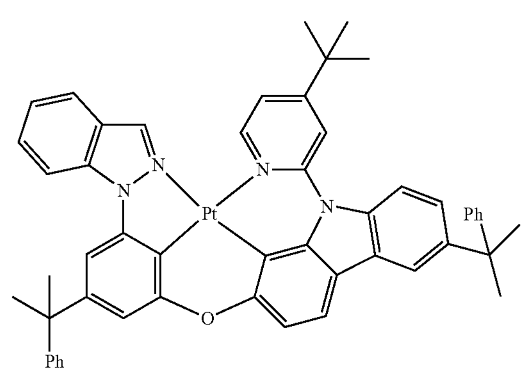

2938
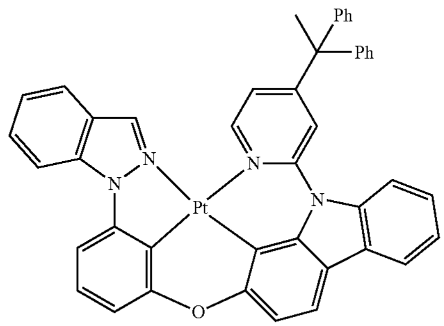
2939
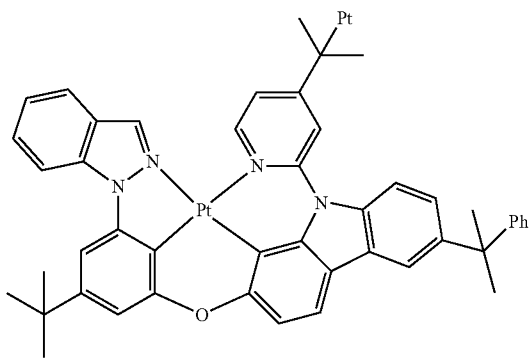
2940
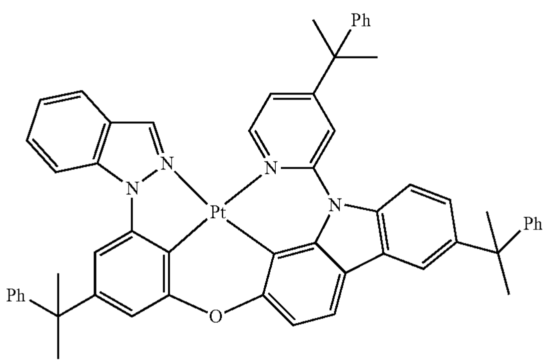
2941
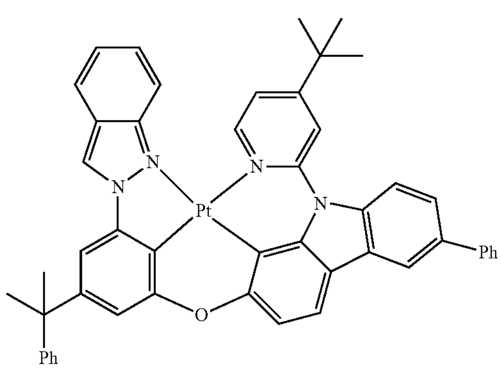
2942
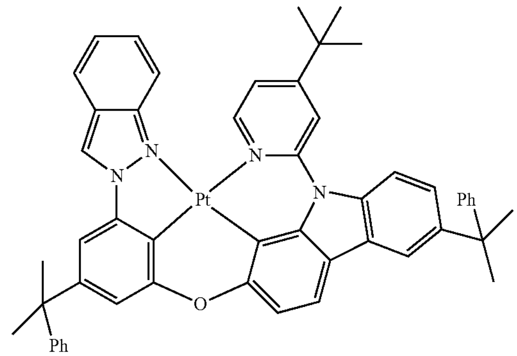
2943
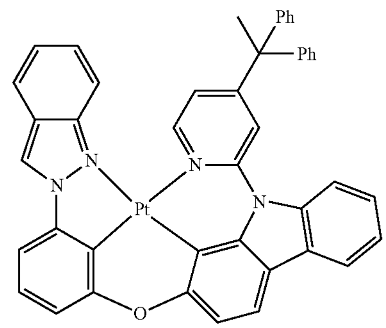
2944
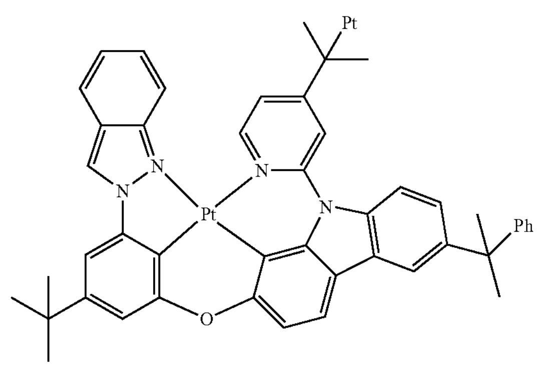
2945
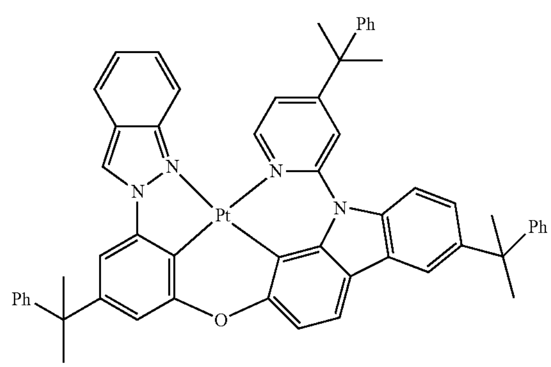

2946
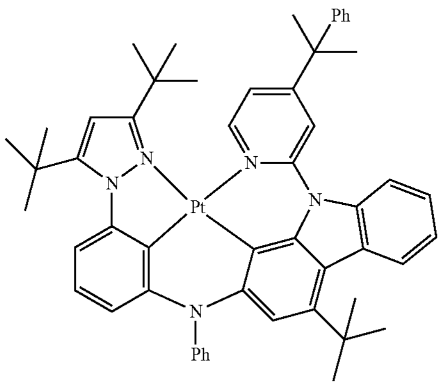
2947
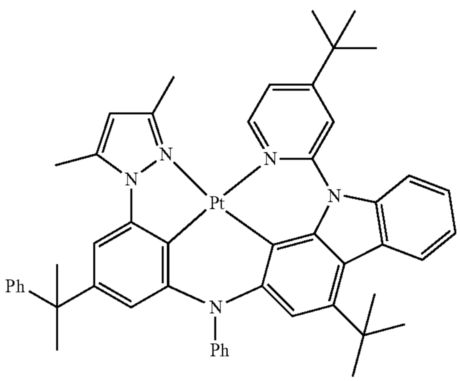
2948
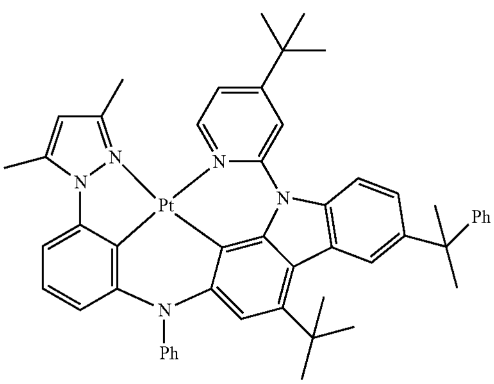
2949
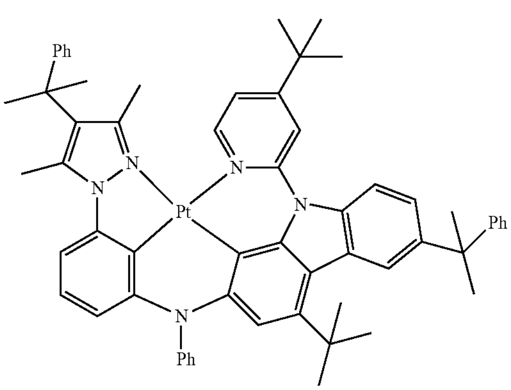
2950
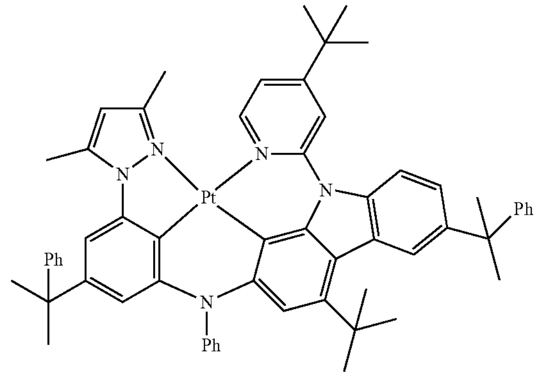
2951
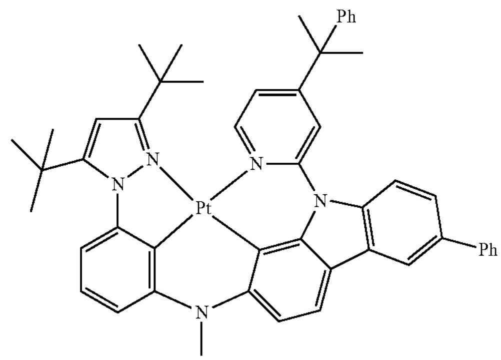
2952
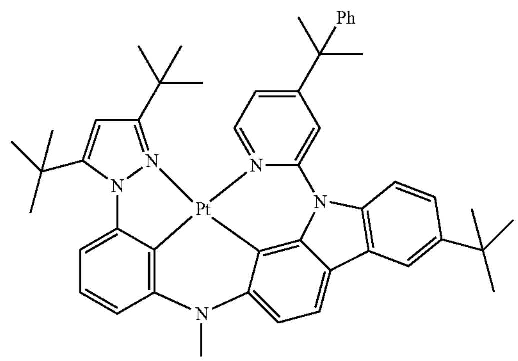
2953
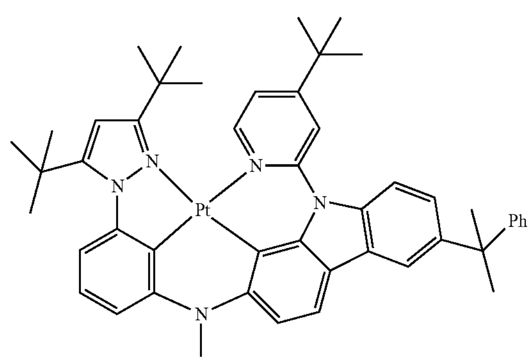

-continued
2954
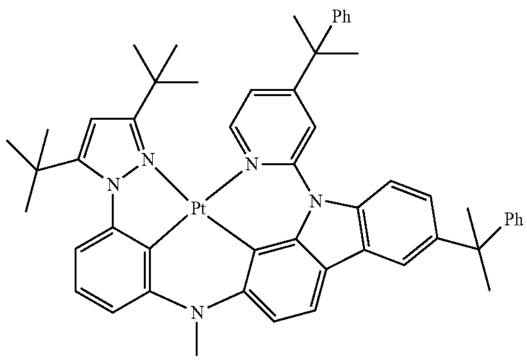
2955
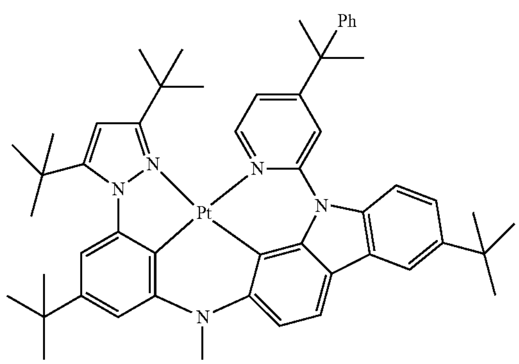
2956
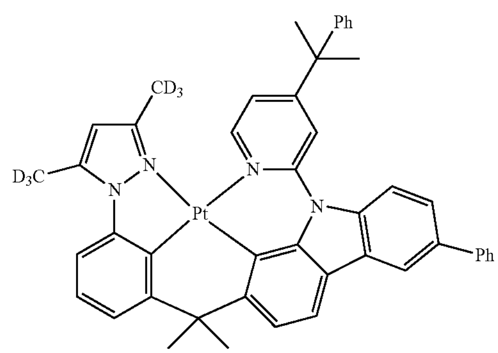
2957
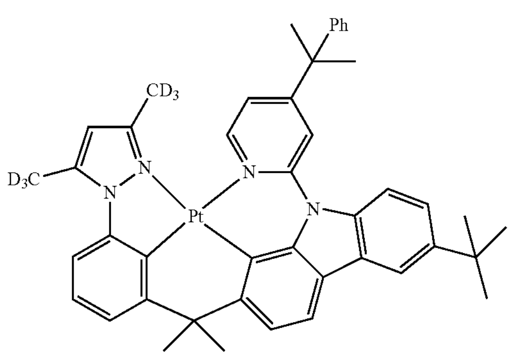
-continued
2958
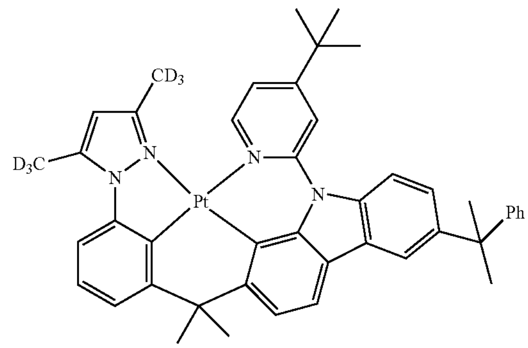
2959
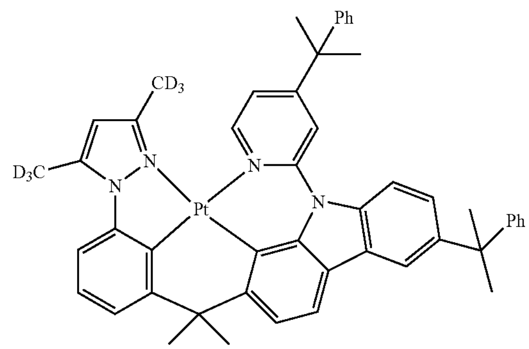
2960
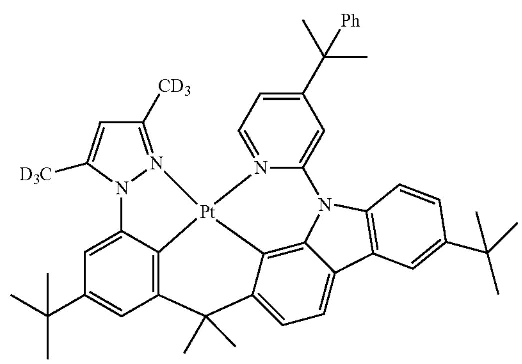
2961
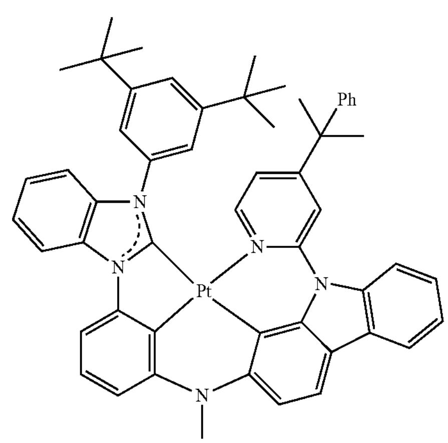

2962
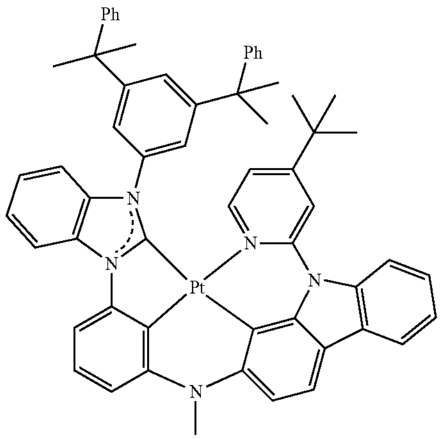
2963
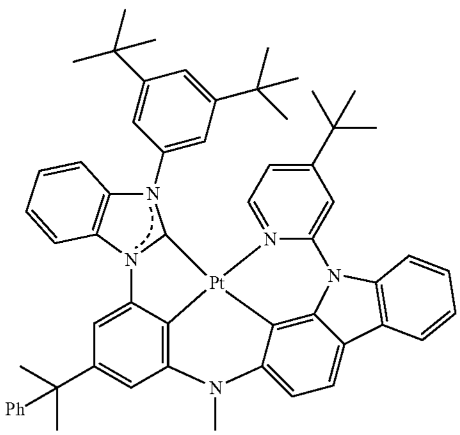
2964
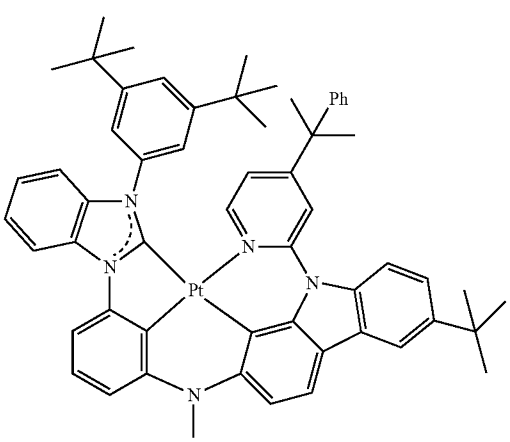
2965
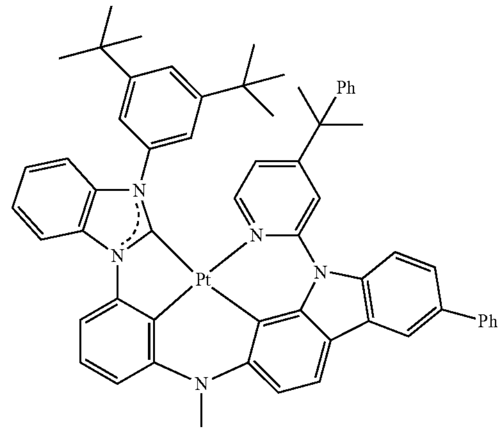
2966
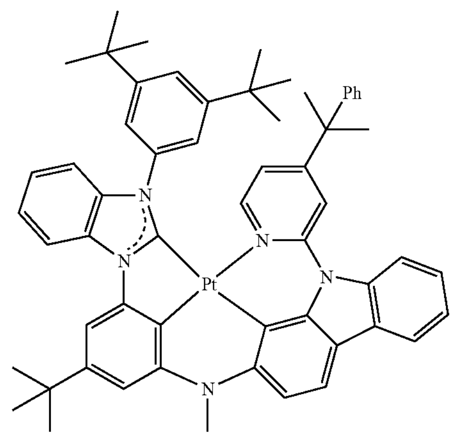
2967
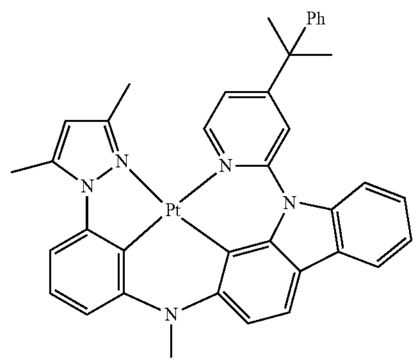
2968
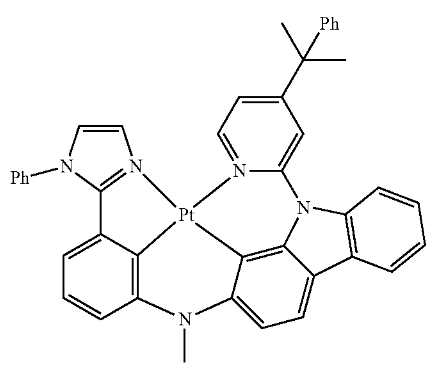

-continued
2969
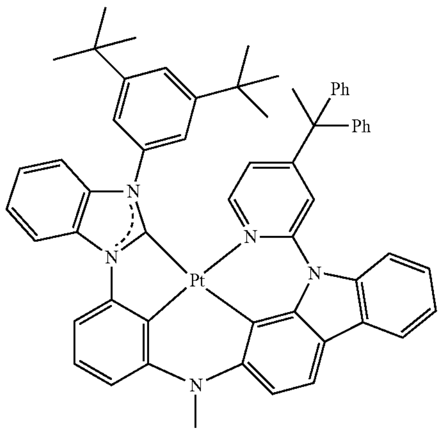
2970
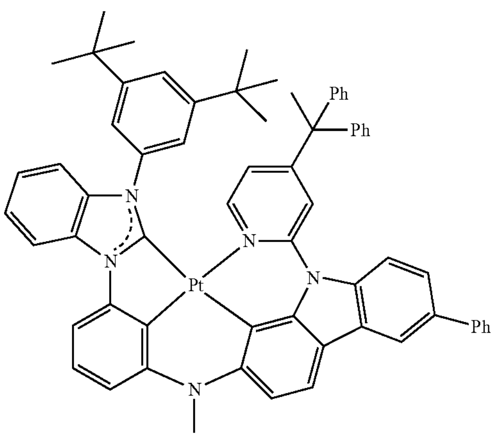
2971
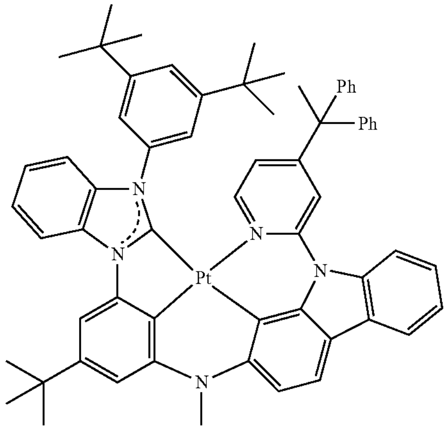
-continued
2972
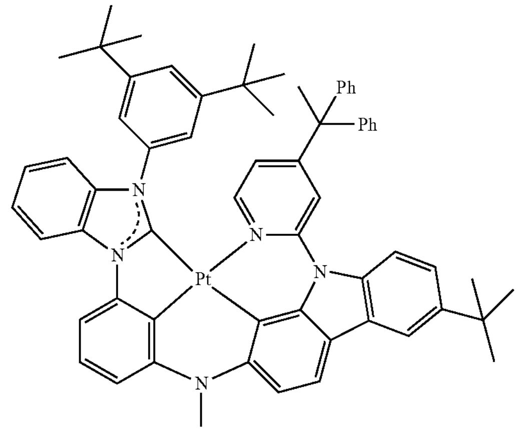
2973
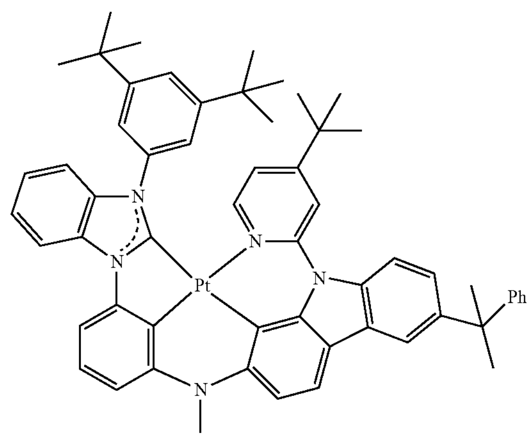
2974
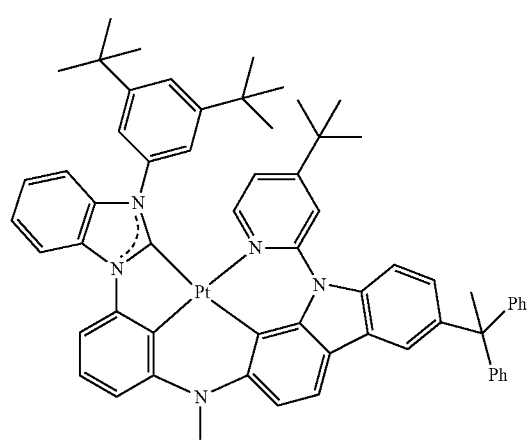

-continued
2975
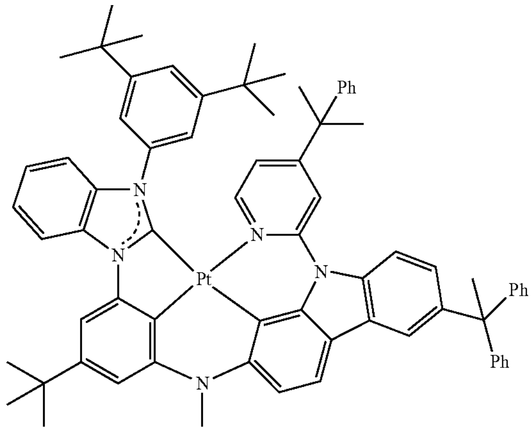
2976
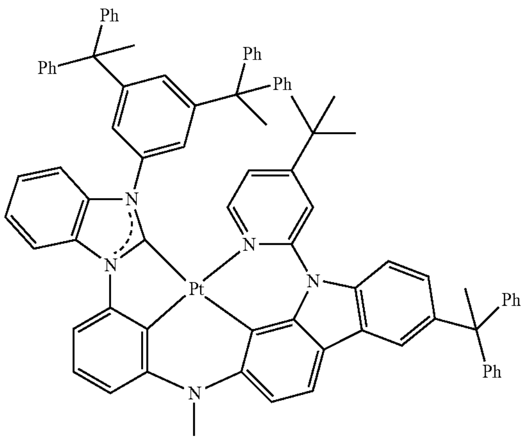
2977
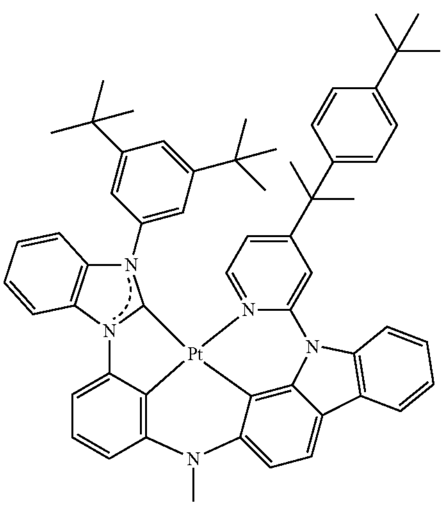
-continued
2978
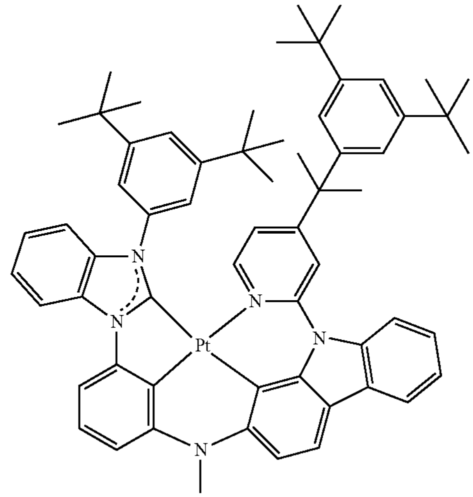
2979
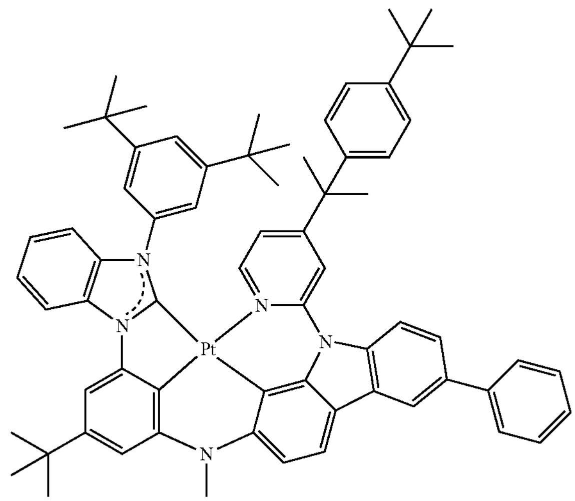
2980
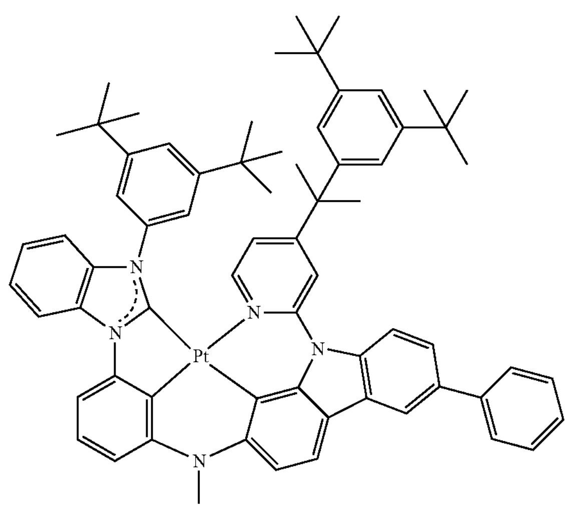

2981
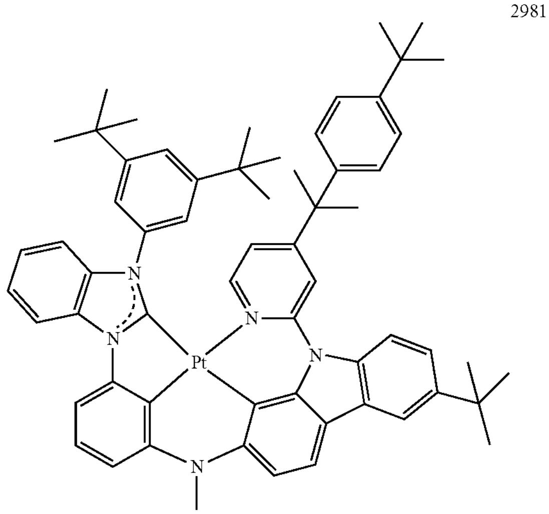
2982
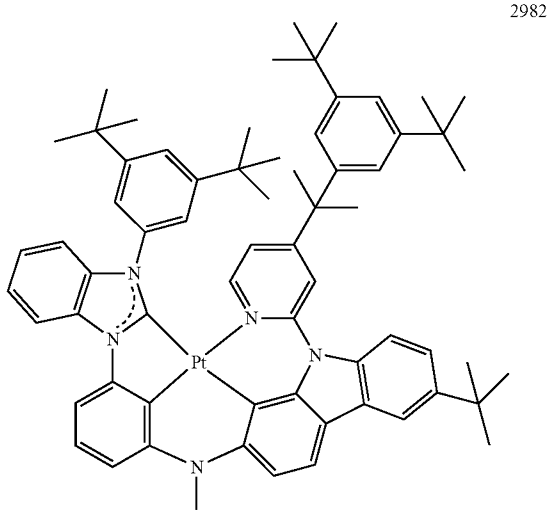
2983
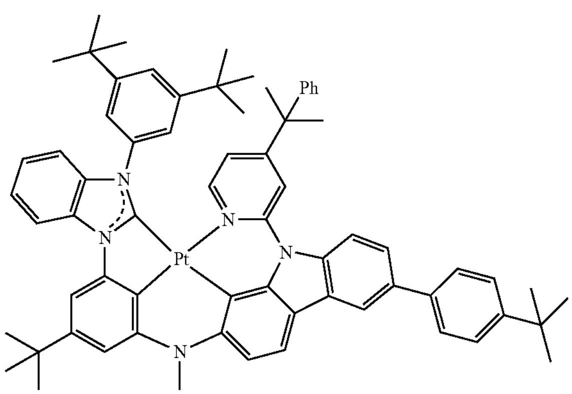
2984
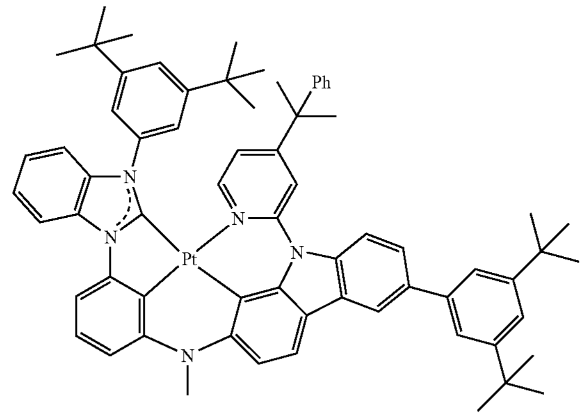
2985
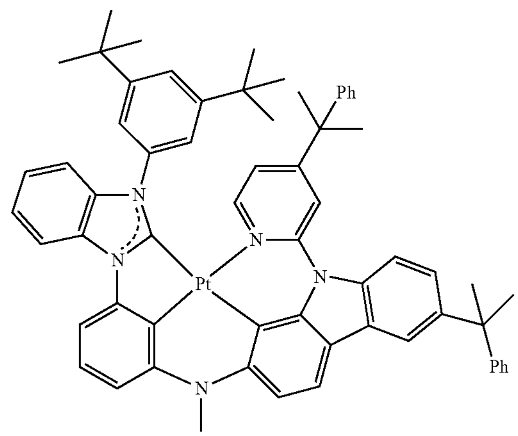
2986
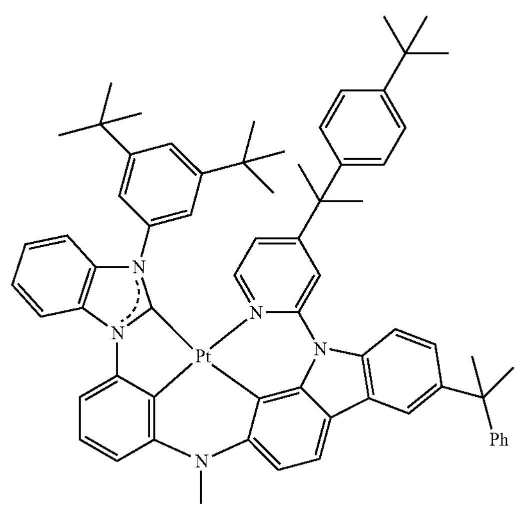

-continued
2987
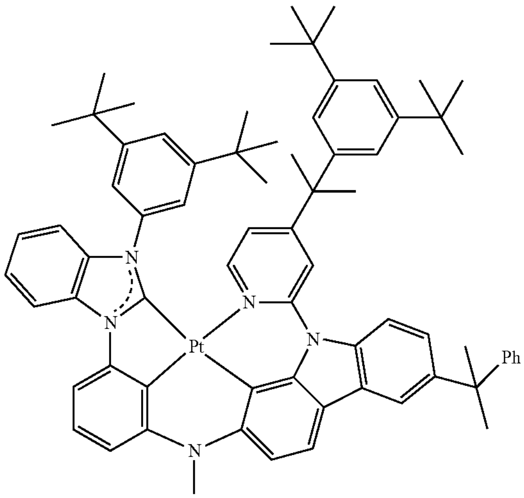
2988
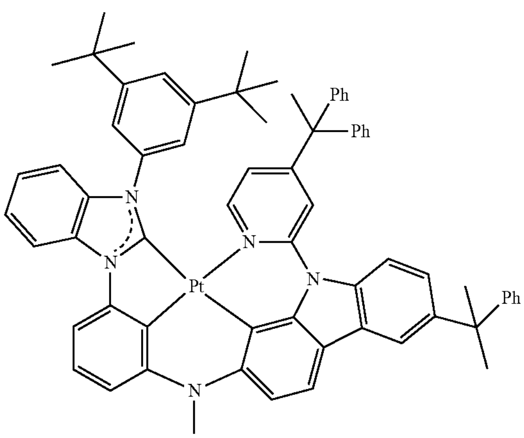
2989
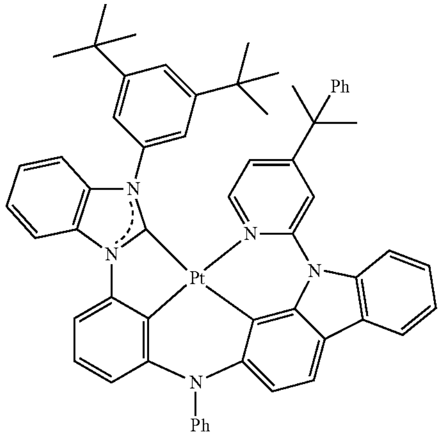
-continued
2990
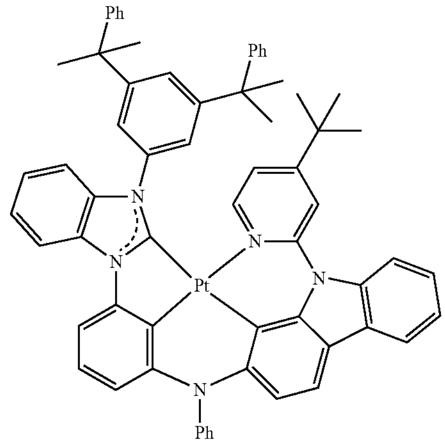
2991
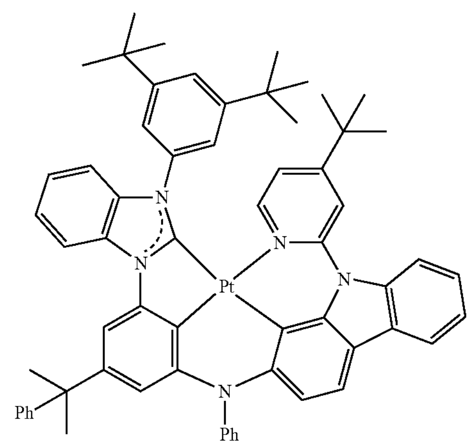
2992
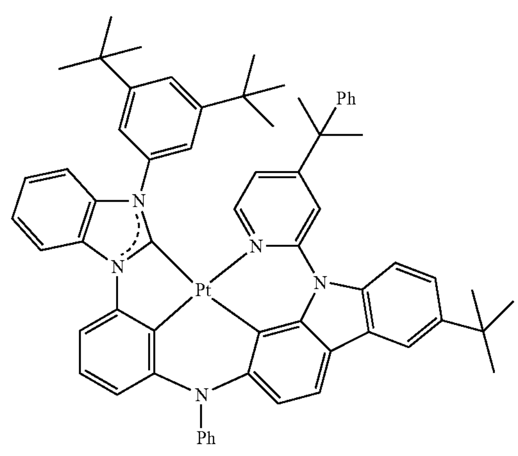

-continued
2993
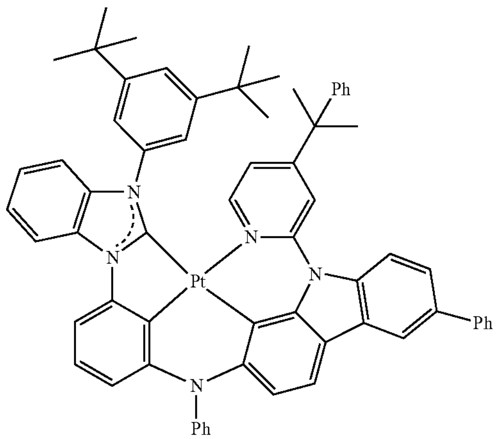
2994
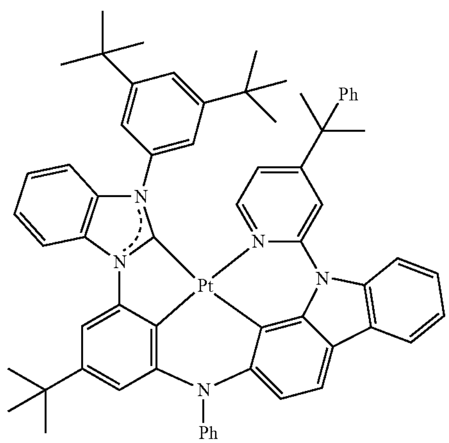
2995
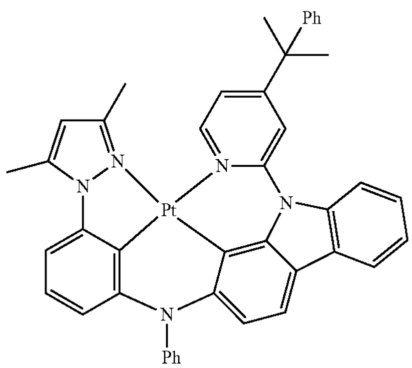
2996
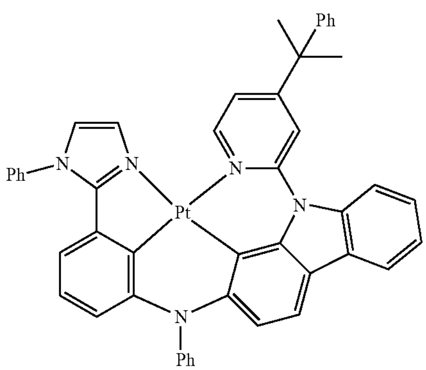
-continued
2997
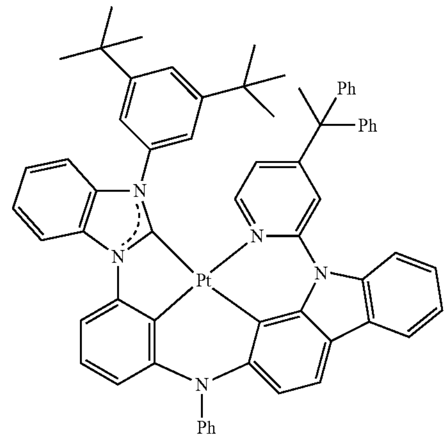
2998
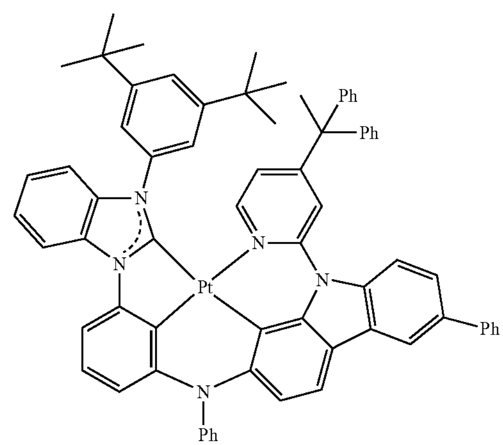
2988
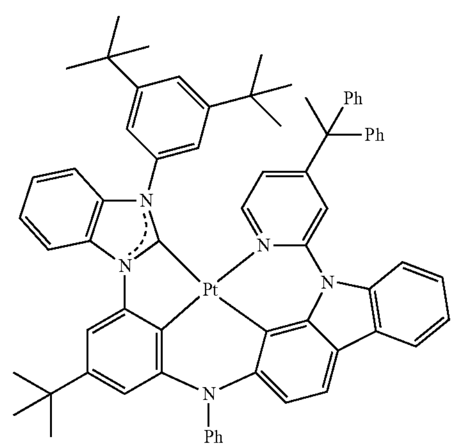

3000
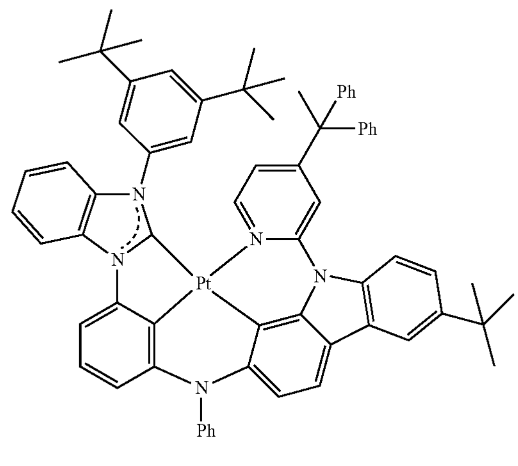
3001
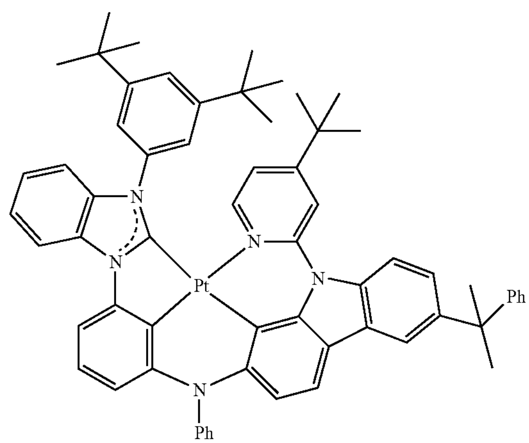
3002
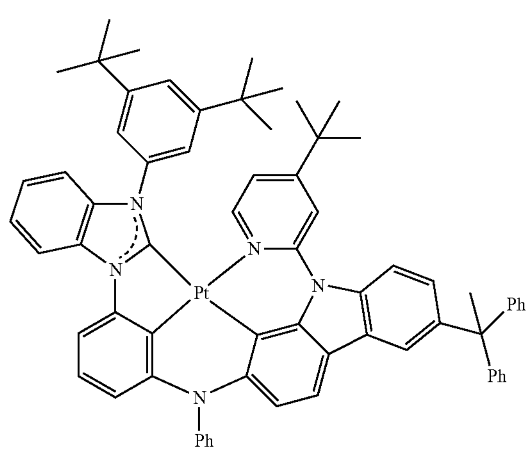
3003
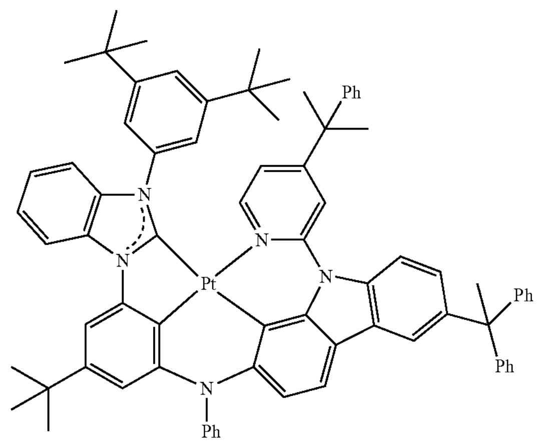
3004
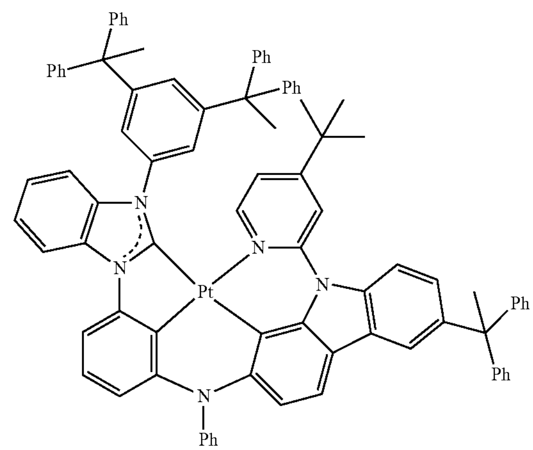
3005
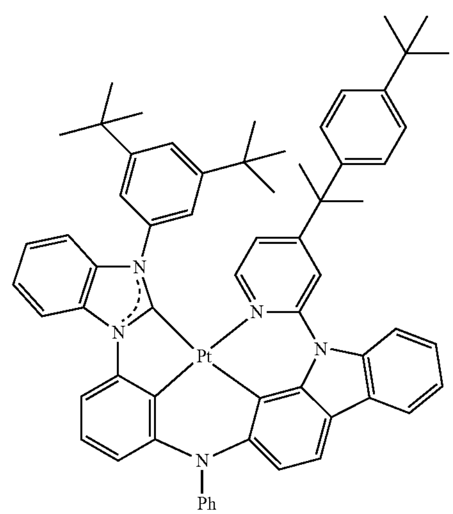

-continued
3006
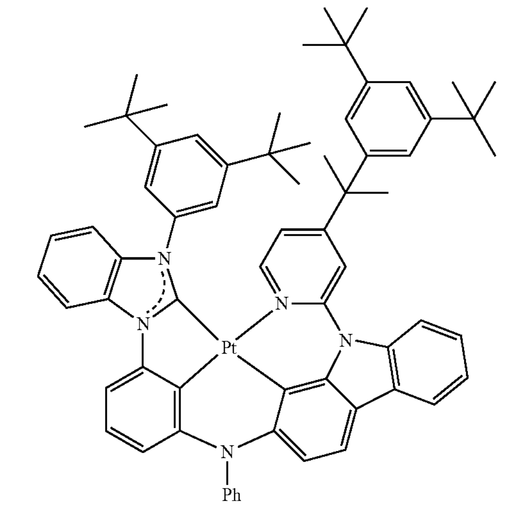
3007
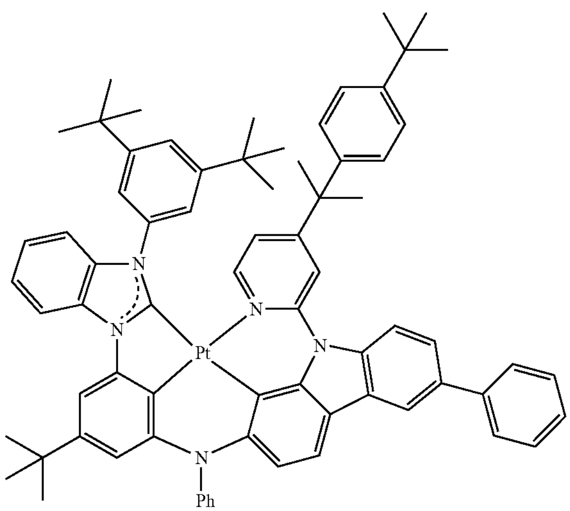
3008
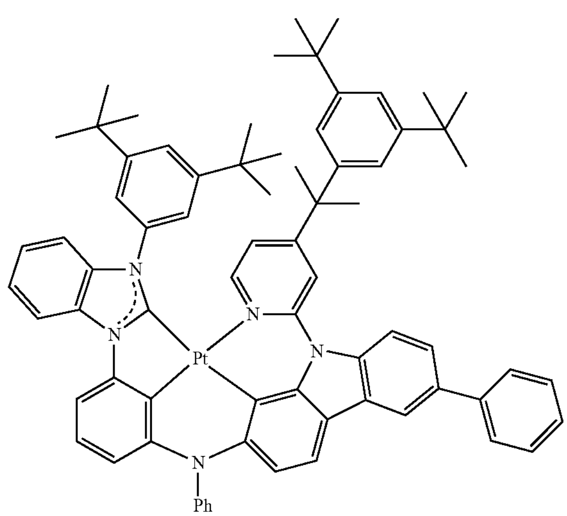
-continued
3009
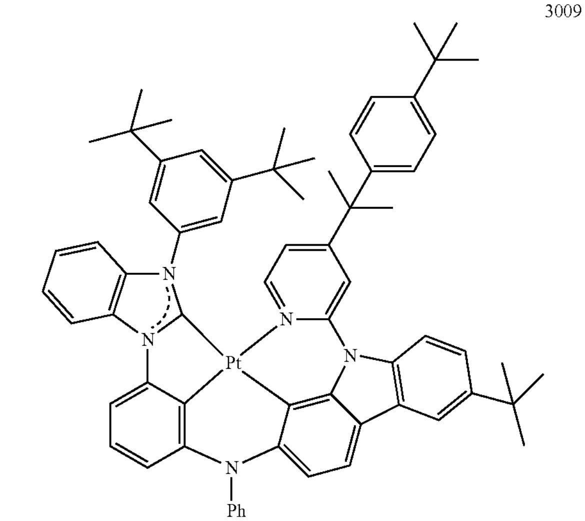
3010
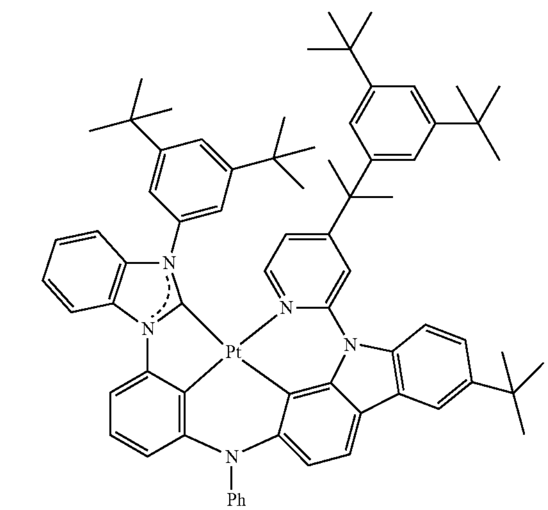
3011
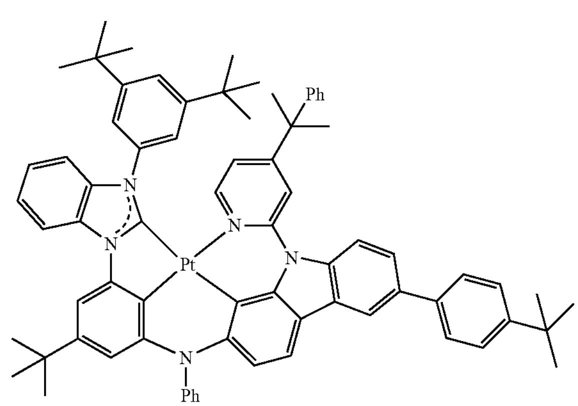

-continued
3012
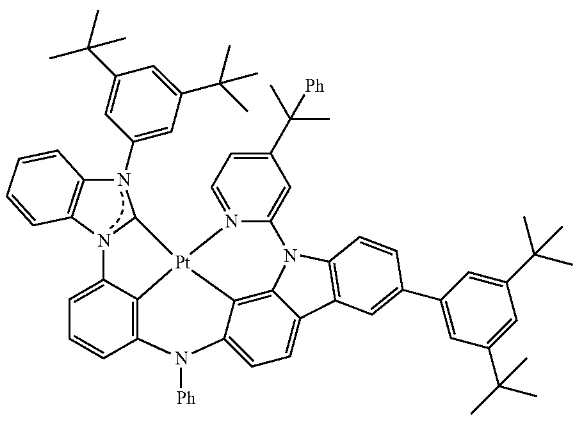
3013
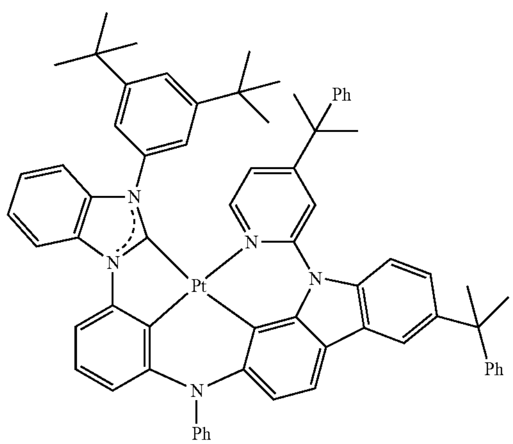
3014
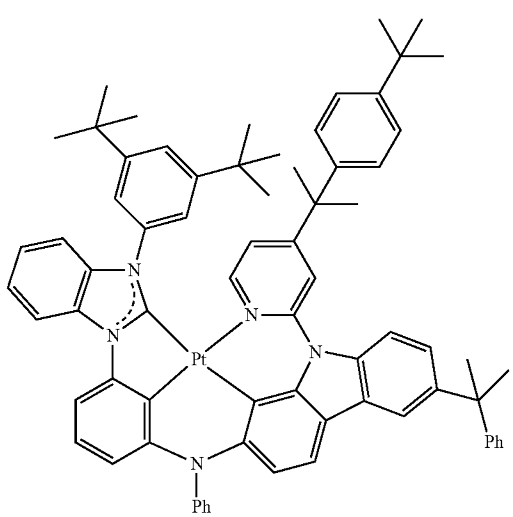
-continued
3015
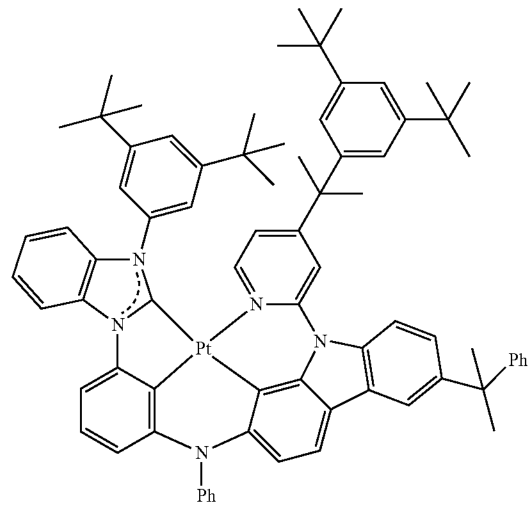
3016
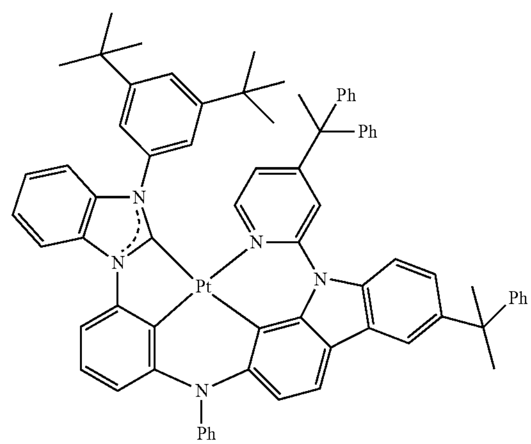
3017
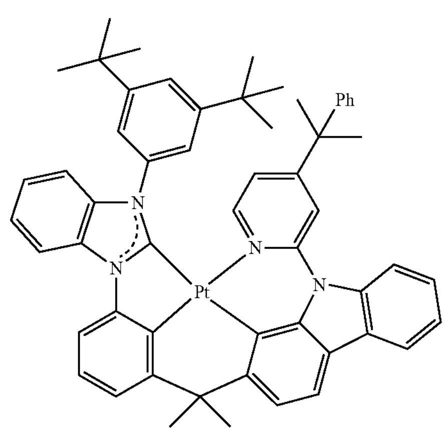

-continued
3018
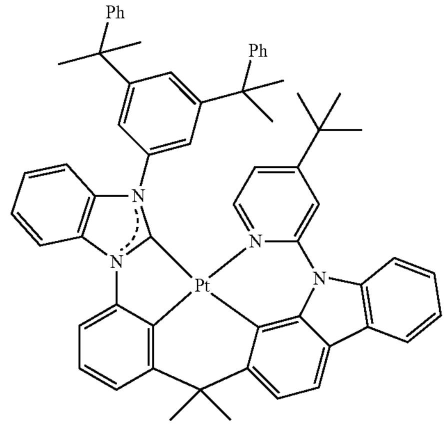
3019
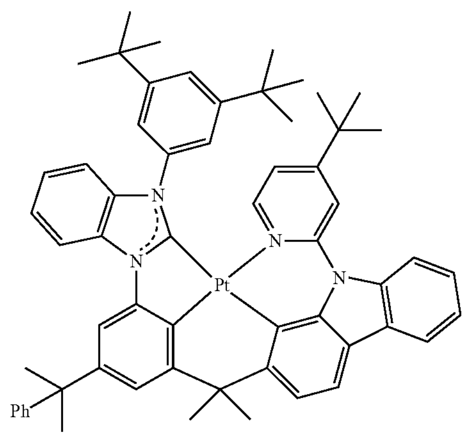
3020
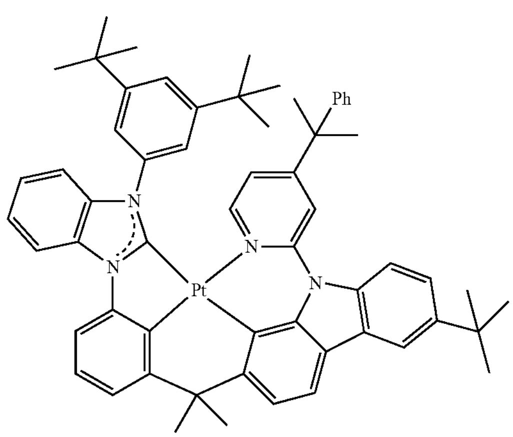
-continued
3021
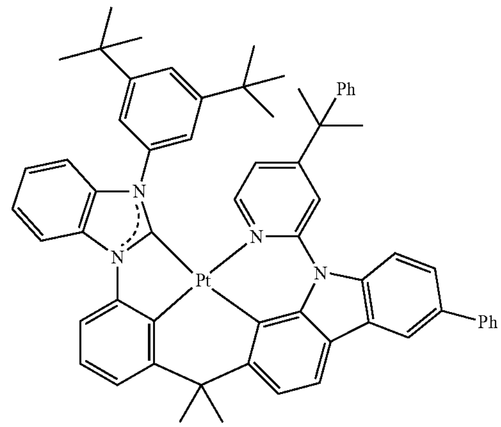
3022
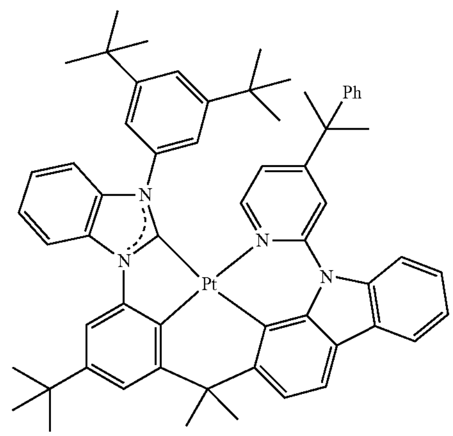
3023
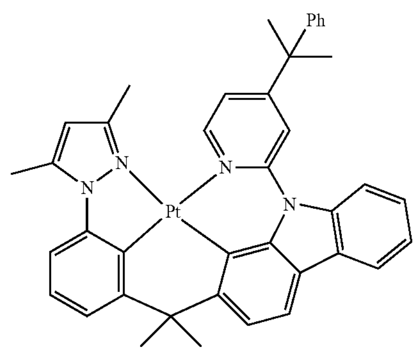
3024
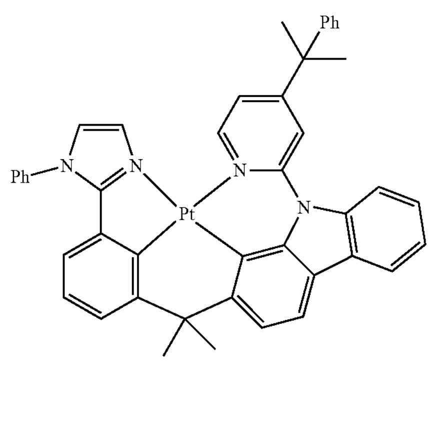

-continued
3025
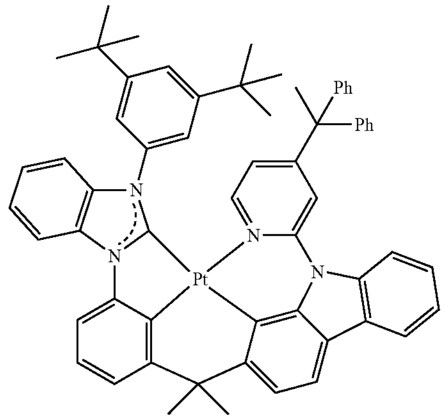
3026
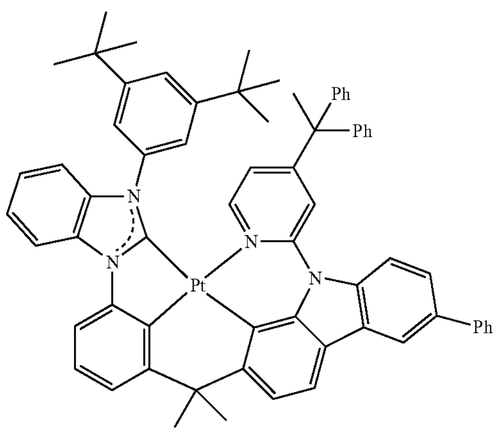
3027
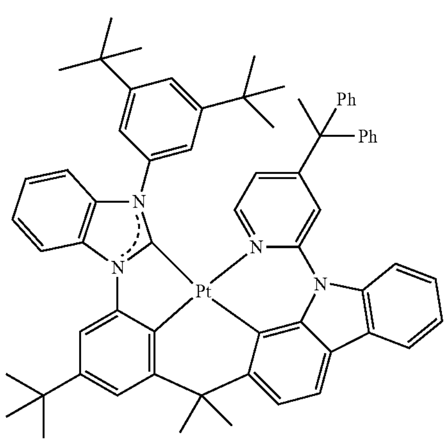
-continued
3028
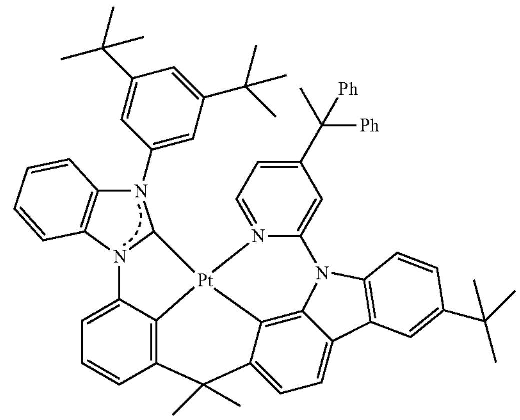
3029
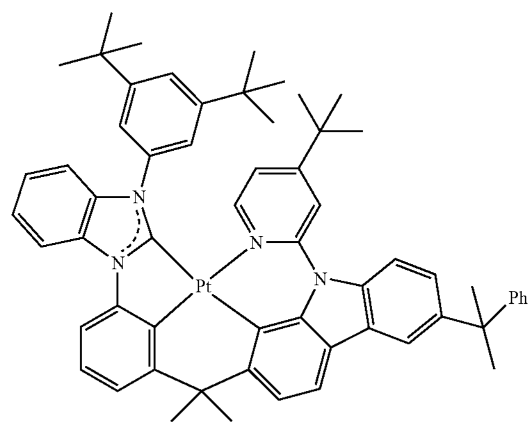
3030
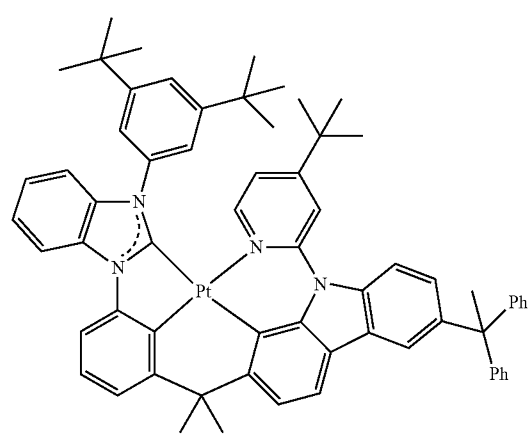

-continued
3031
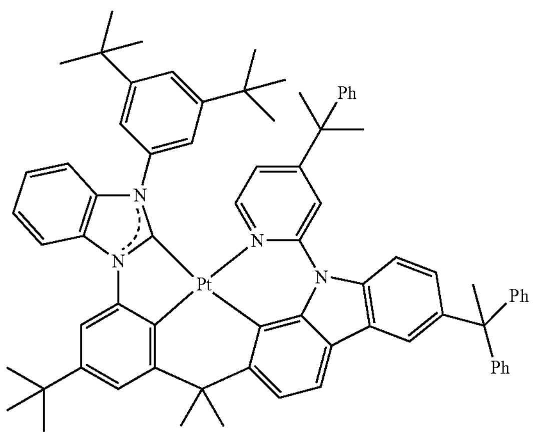
3032
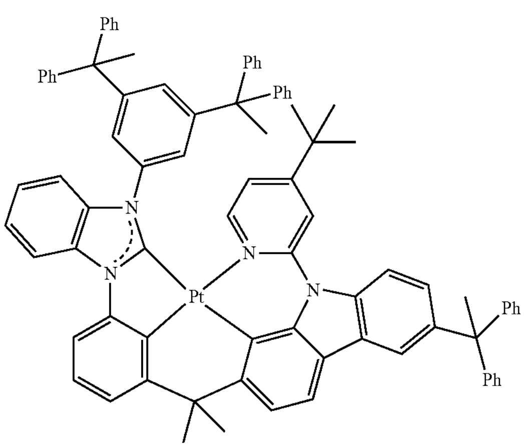
3033
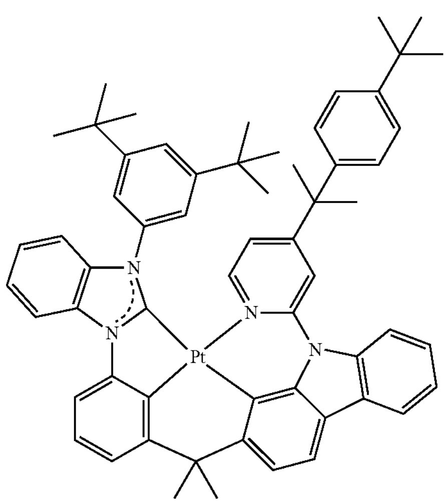
-continued
3034
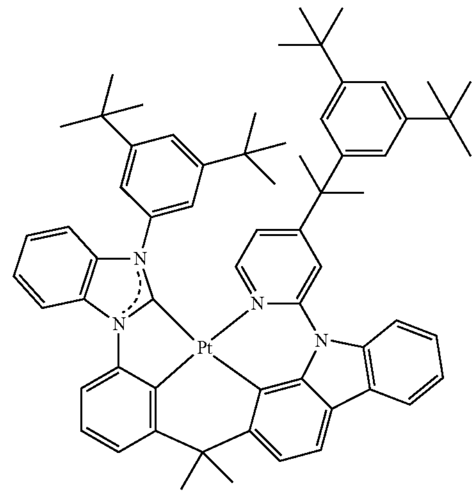
3035
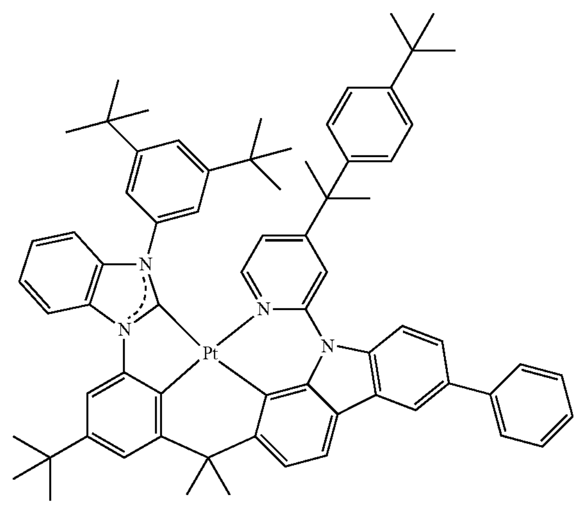
3036
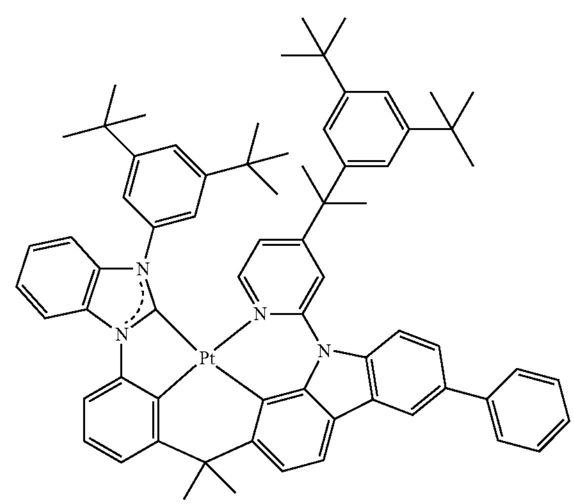

-continued
3037
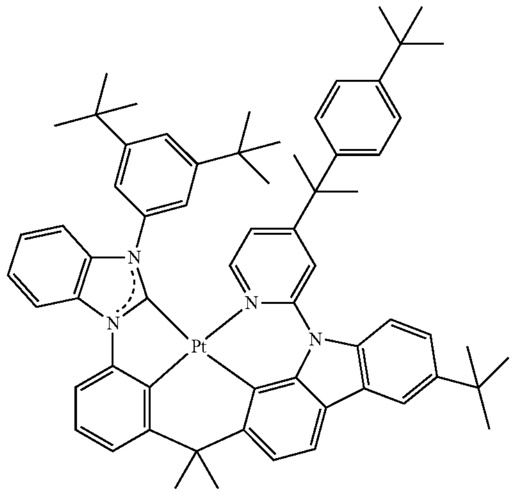
3038
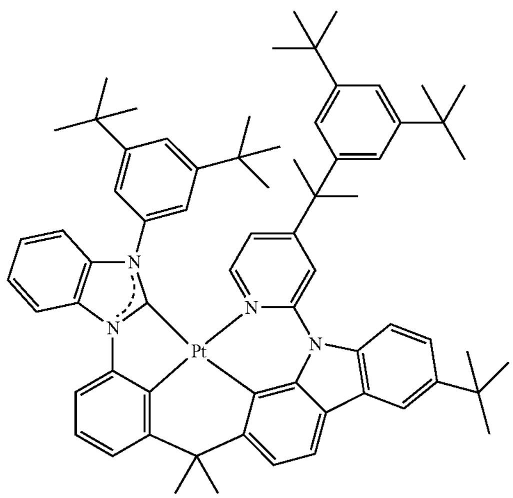
3039
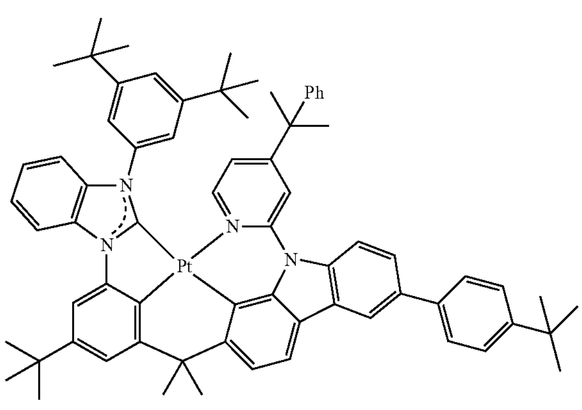
-continued
3040
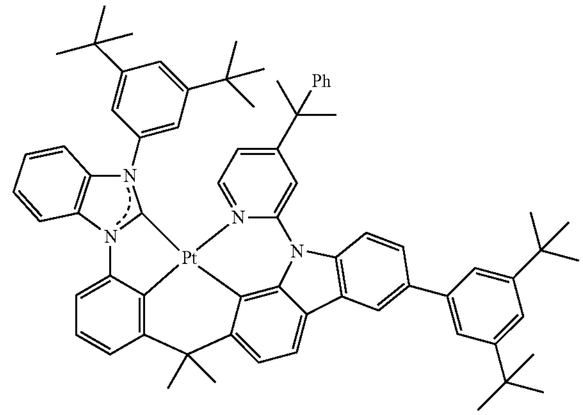
3041
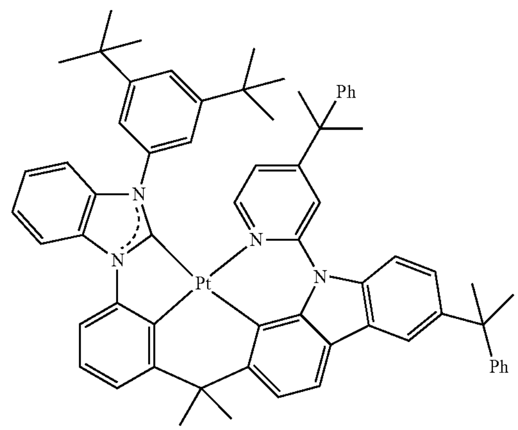
3042
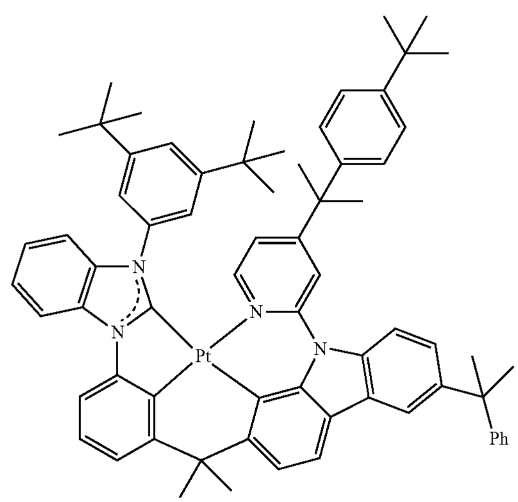

-continued
3043
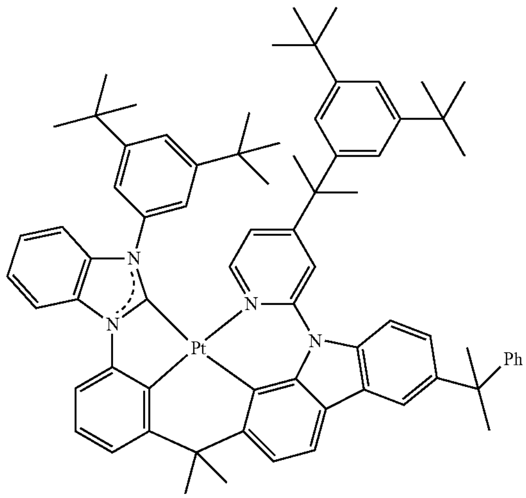
3044
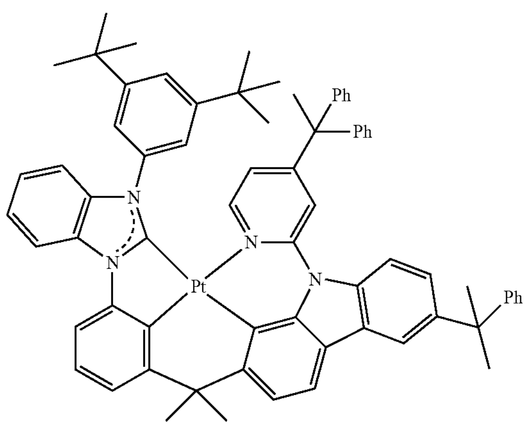
3045
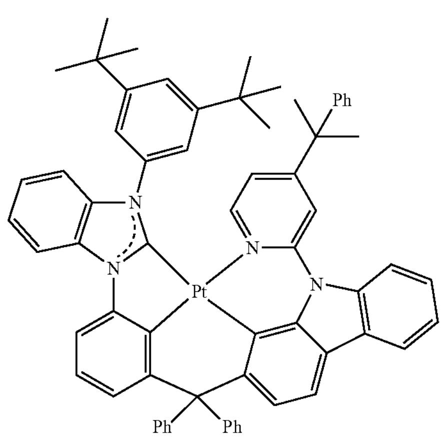
-continued
3046
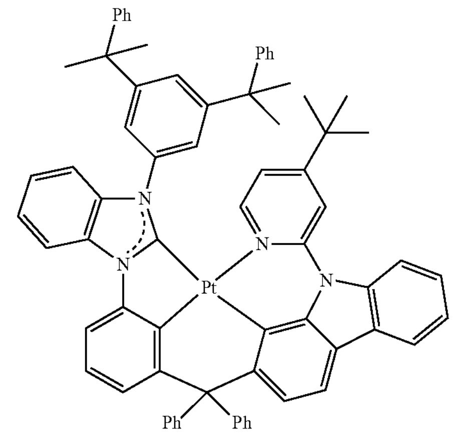
3047
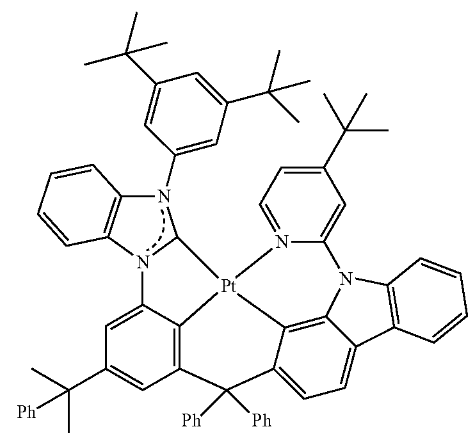
3048
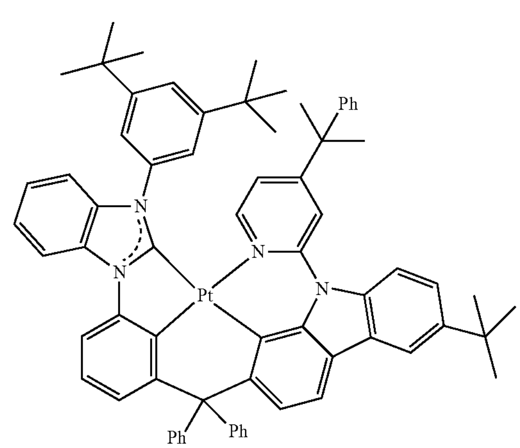

-continued
3049
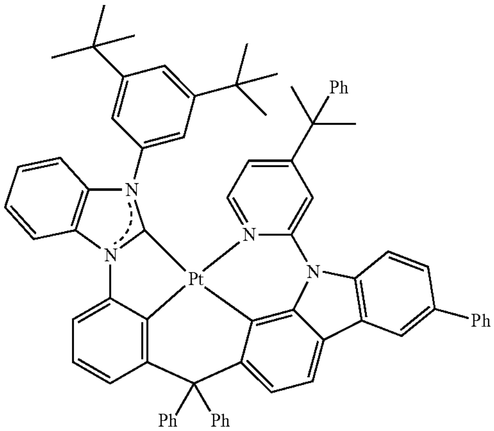
3050
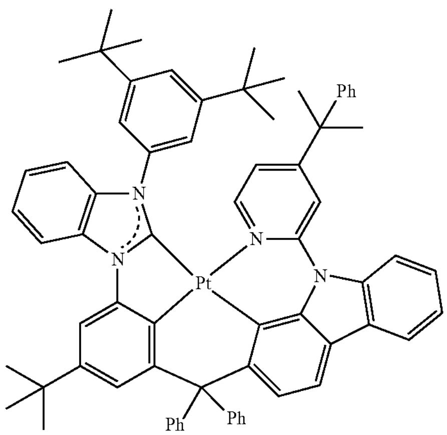
3051
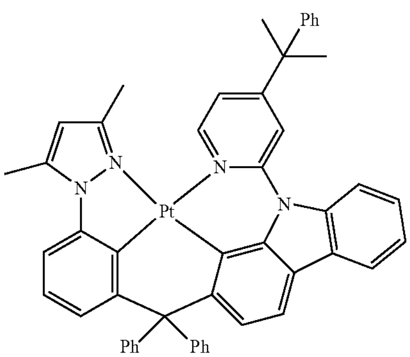
3052
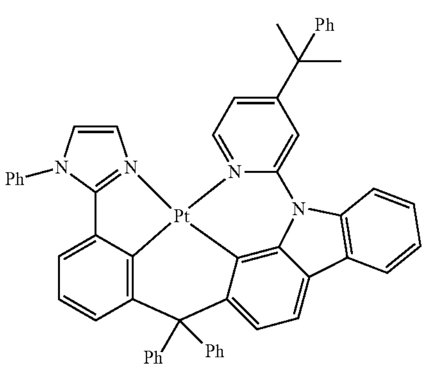
-continued
3053
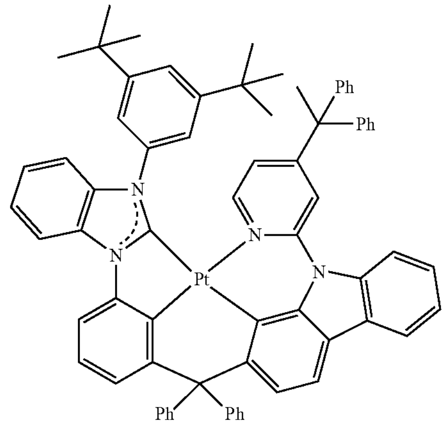
3054
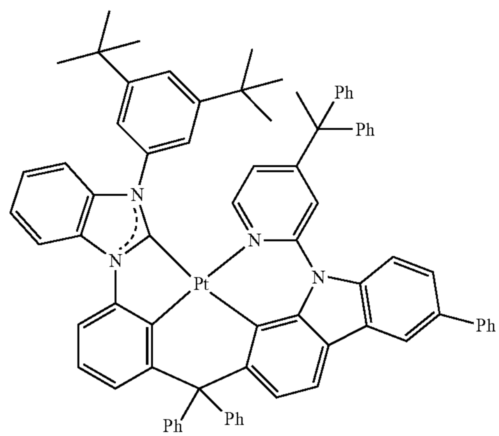
3055
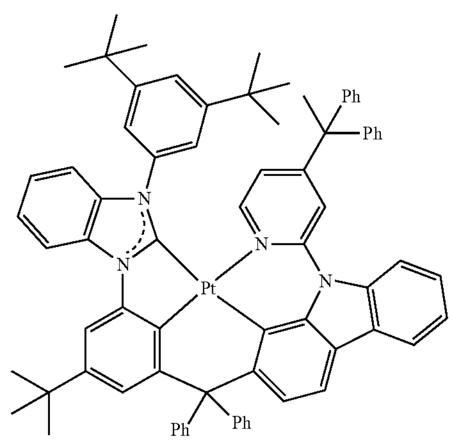

-continued
3056
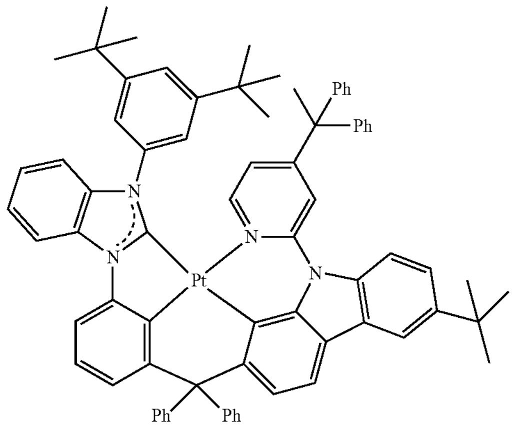
3057
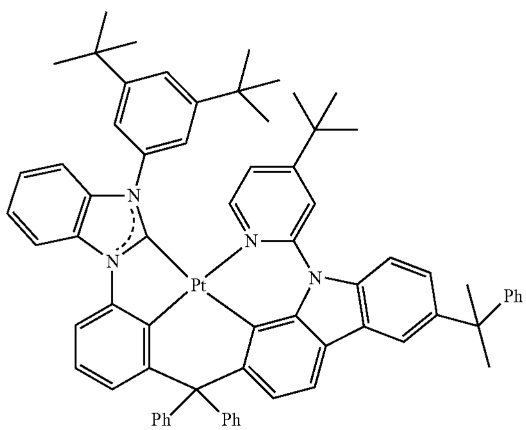
3058
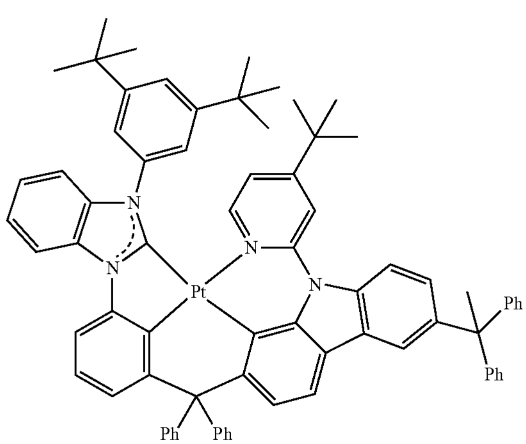
-continued
3059
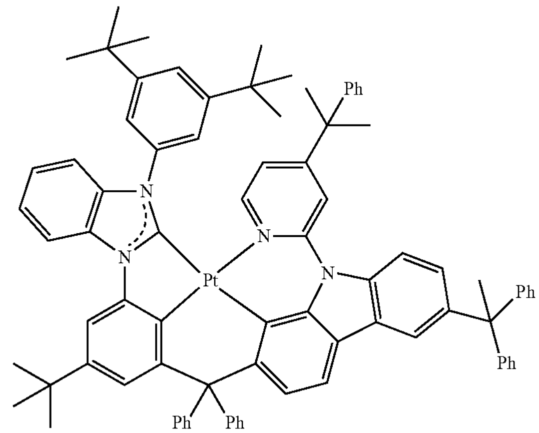
3060
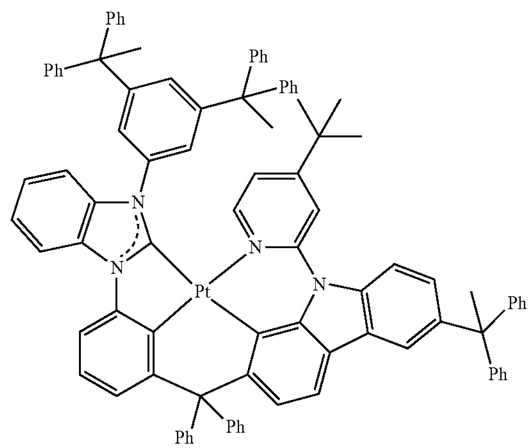
3061
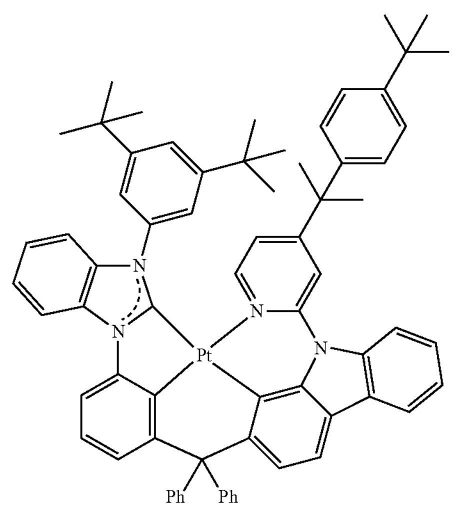

-continued
3062
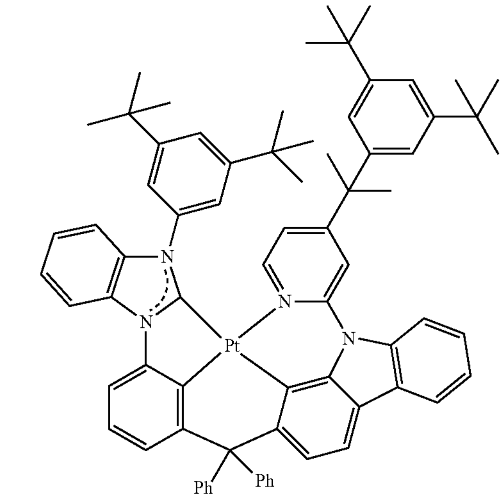
3063
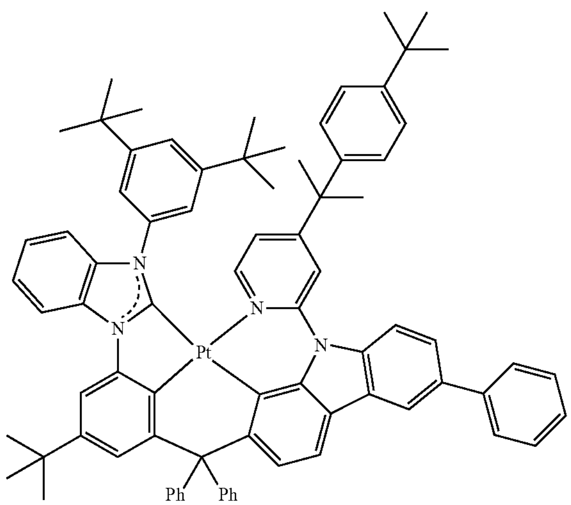
3064
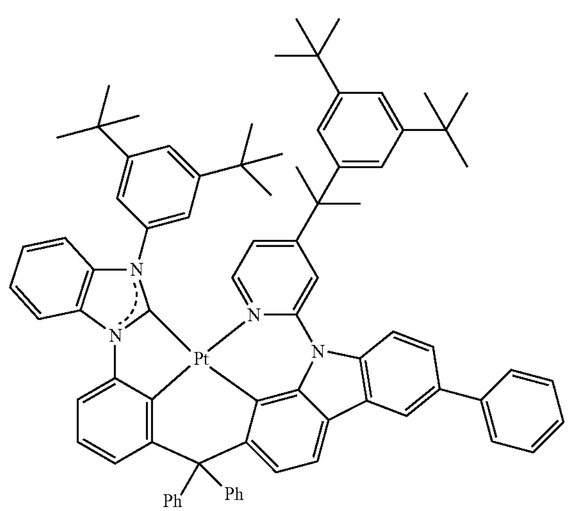
-continued
3065
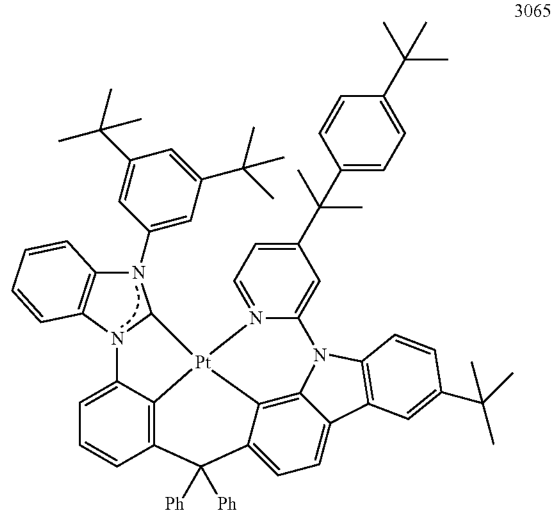
3066
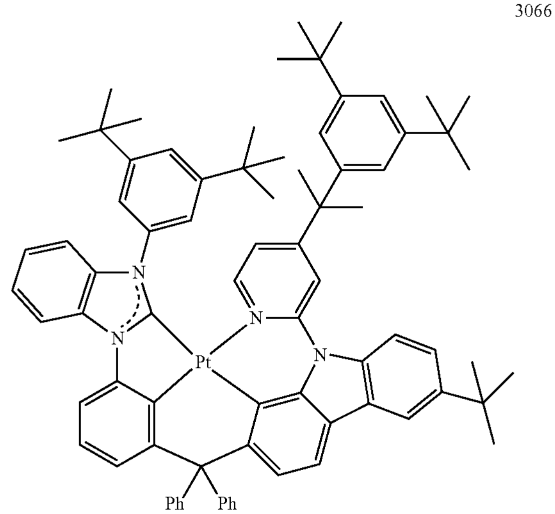
3067
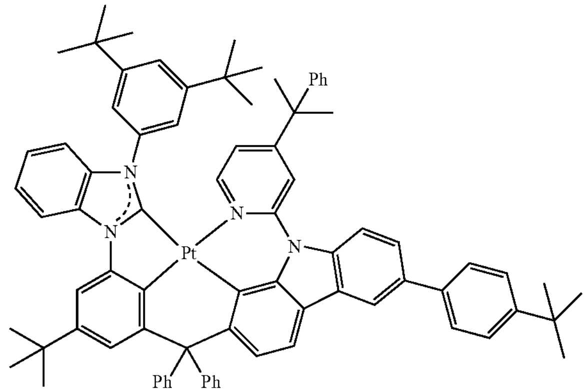

3068
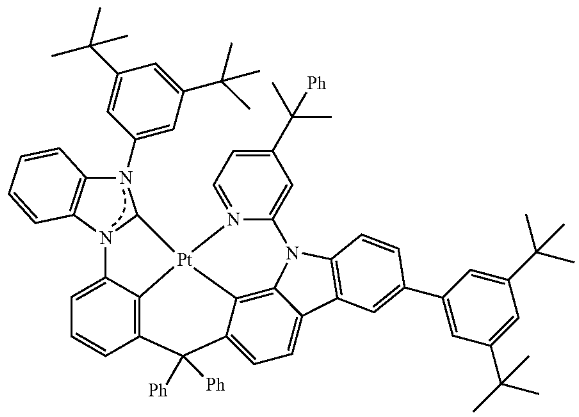
3069
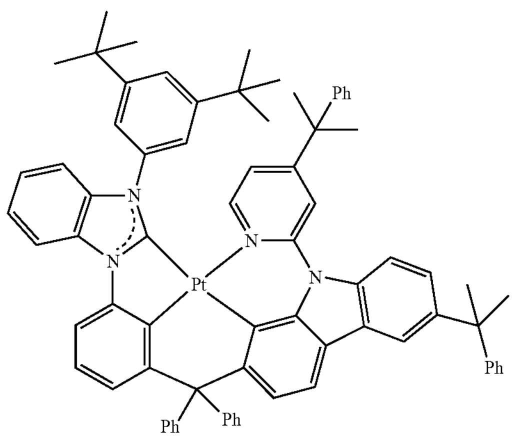
3070
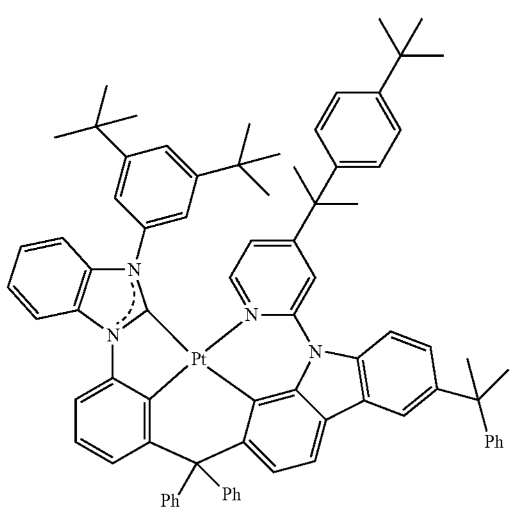
3071
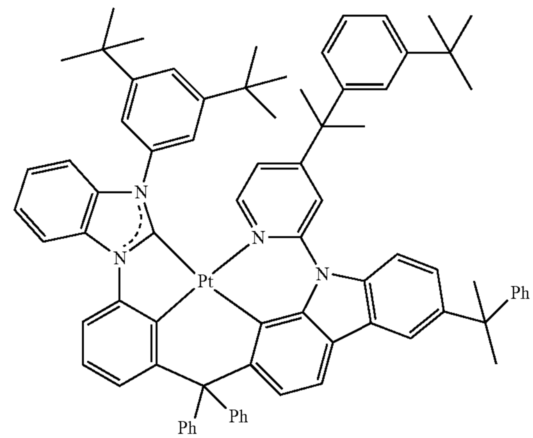
3072
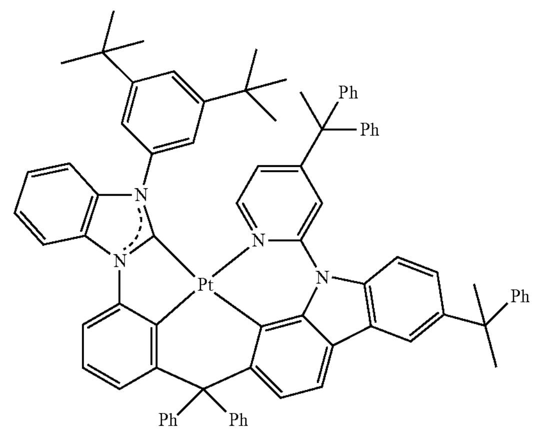
3073
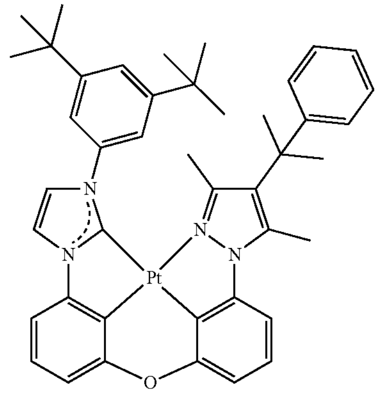

3074
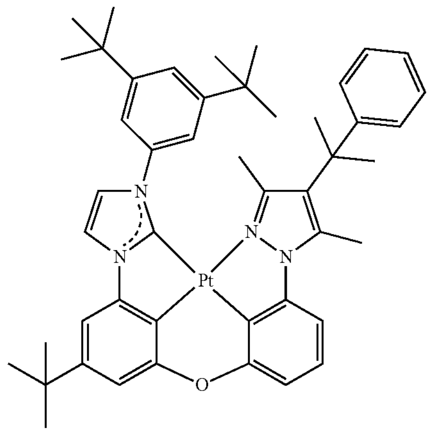
3075
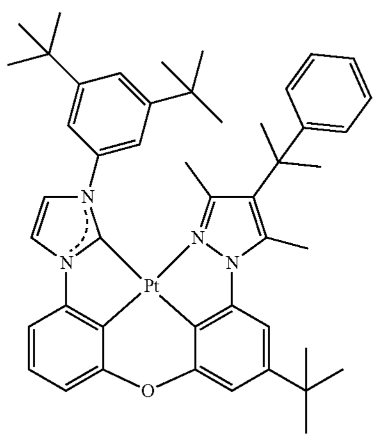
3076
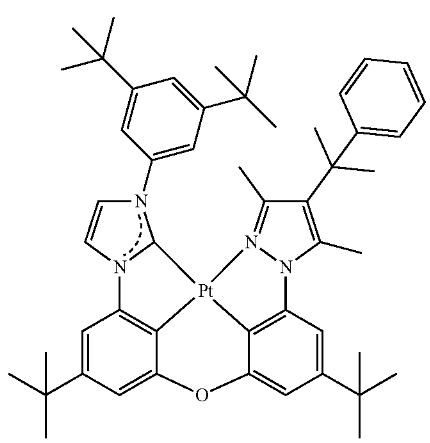
3077
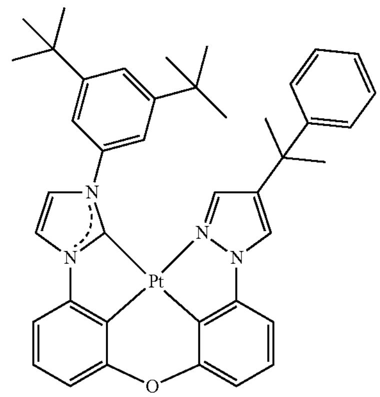
3078
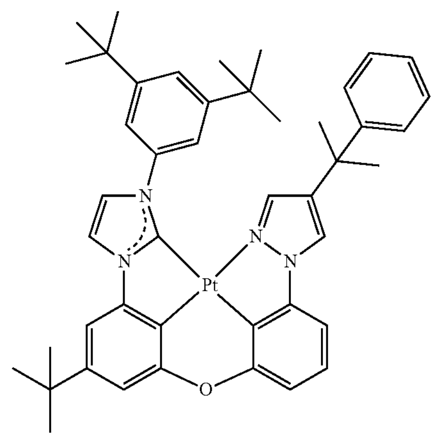
3079
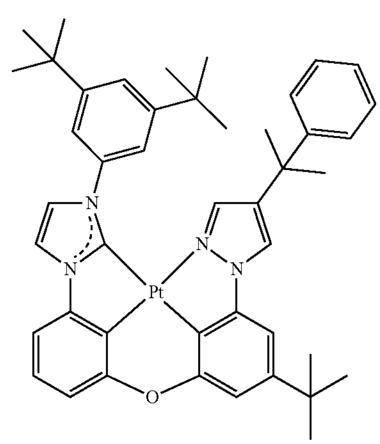

-continued
3080
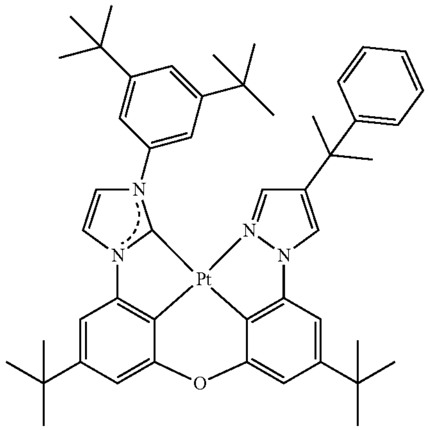
3081
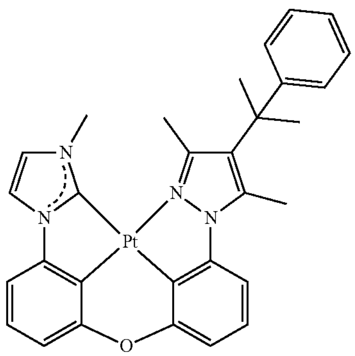
3082
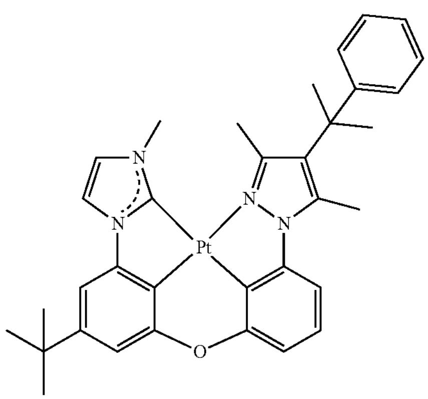
3083
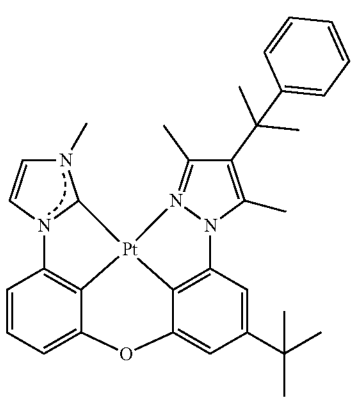
-continued
3084
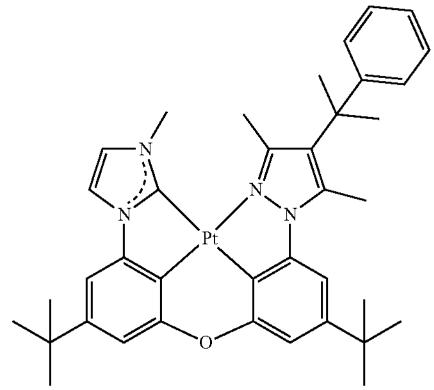
3085
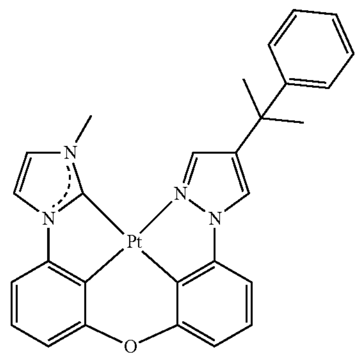
3086
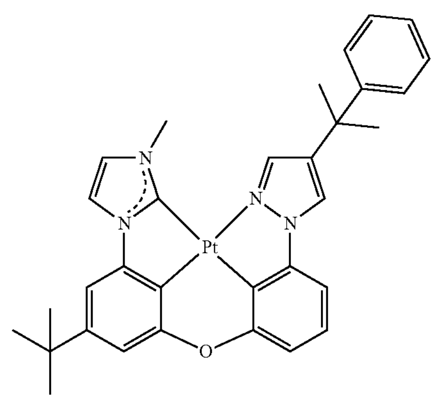
3087
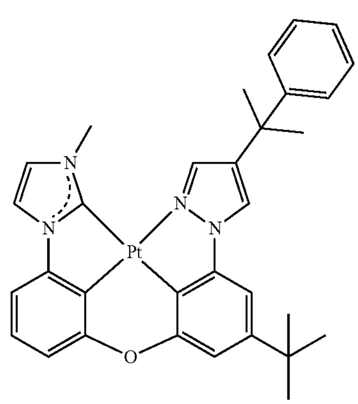

-continued
3088
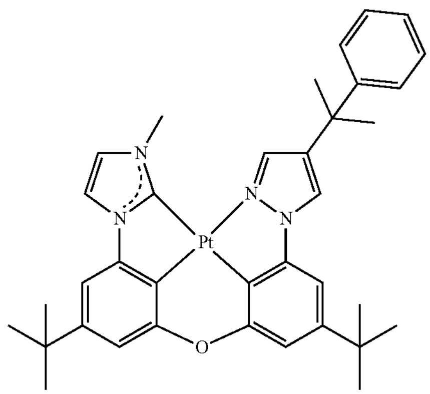
3089
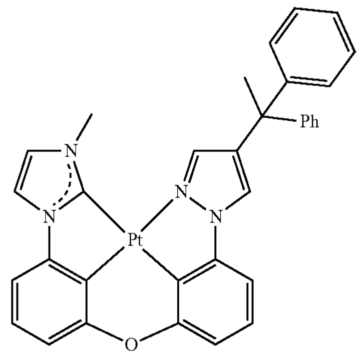
3090
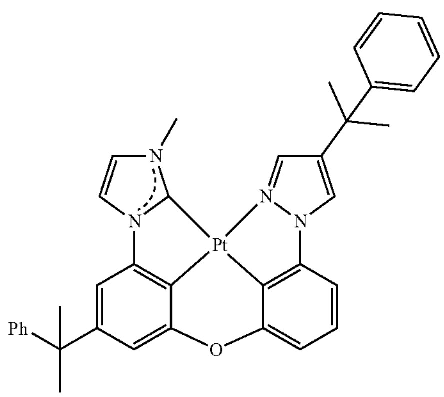
3091
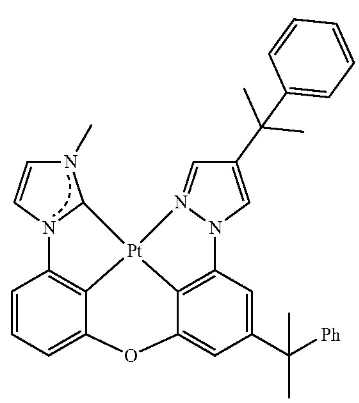
-continued
3092
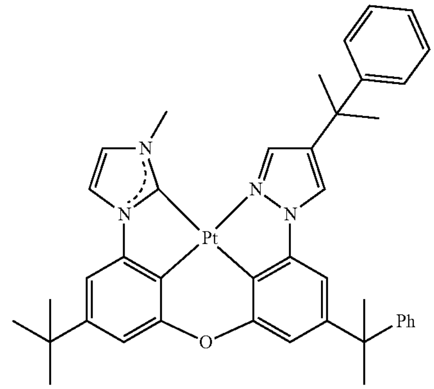
3093
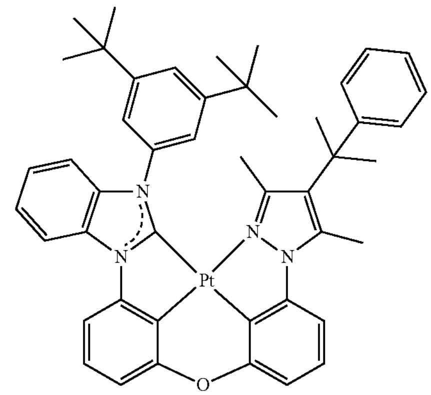
3094
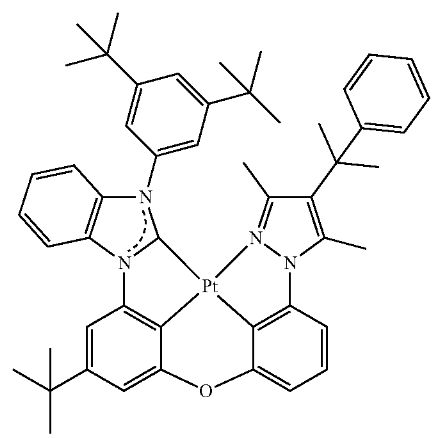
3095
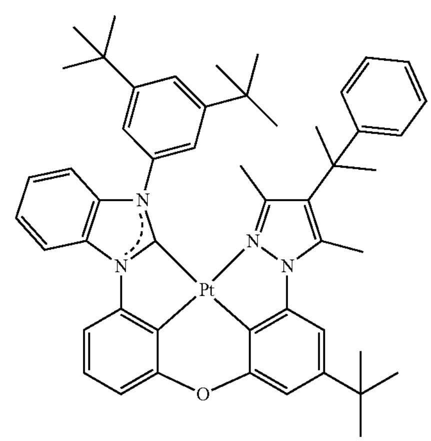

-continued
3096
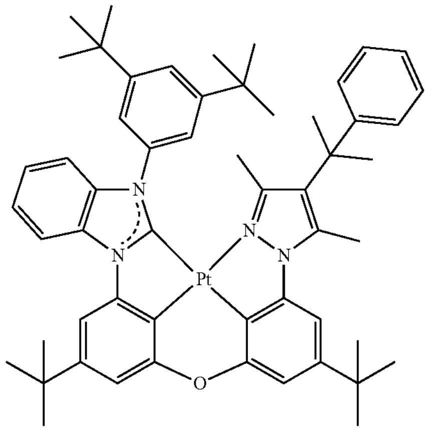
3097
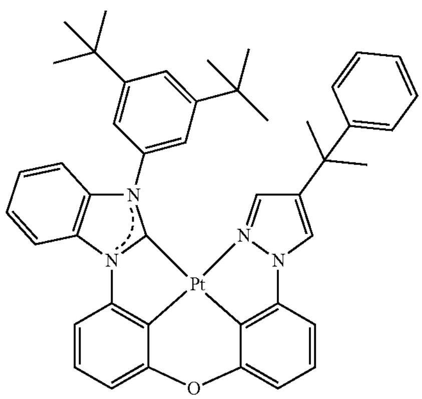
3098
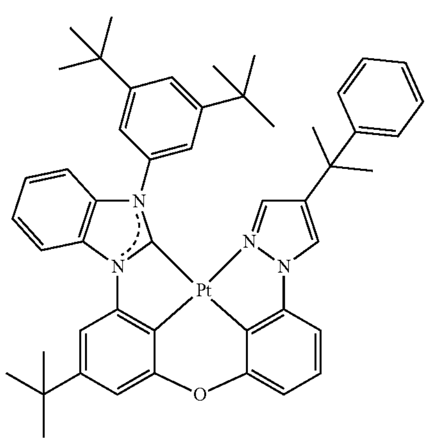
-continued
3099
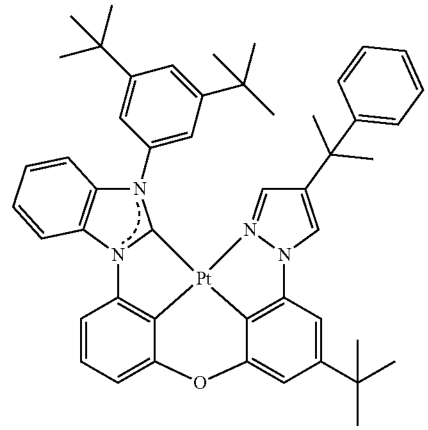
3100
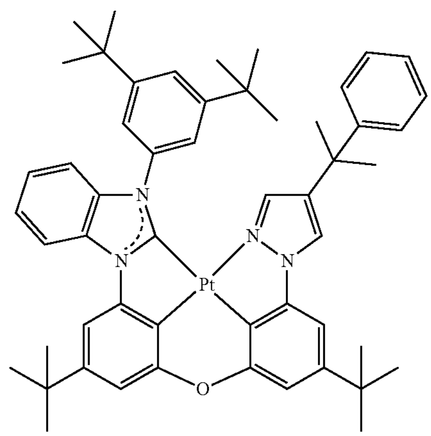
3101
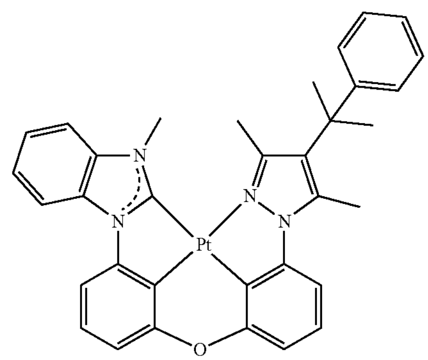
3102
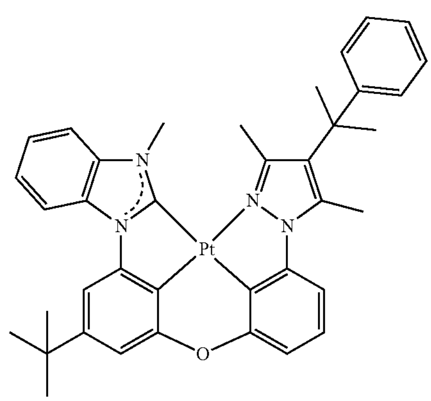

3103
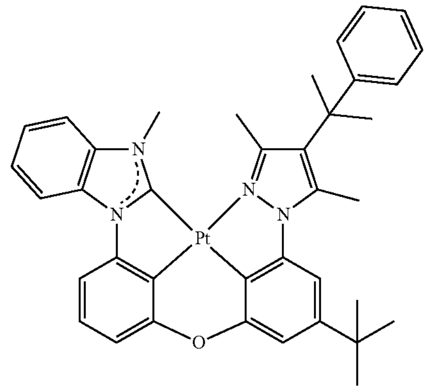
3104
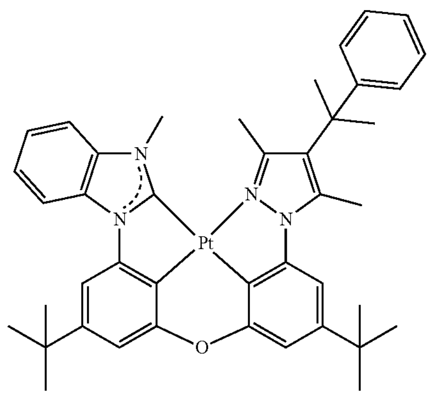
3105
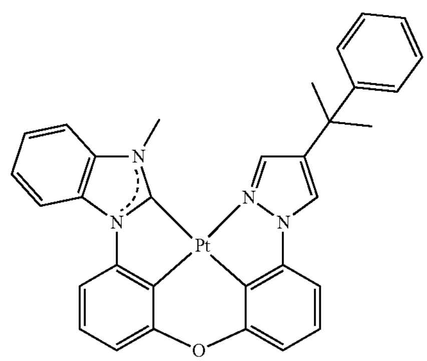
3106
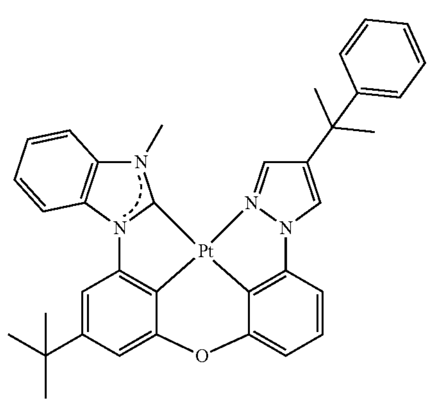
3107
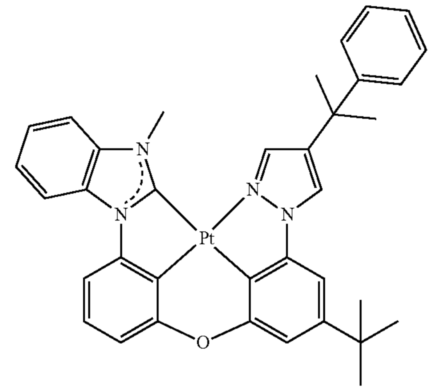
3108
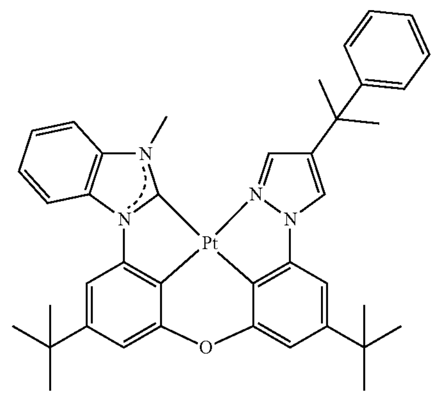
3109
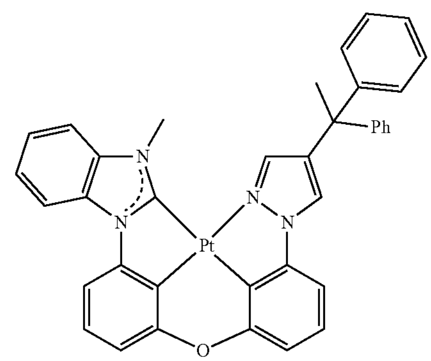
3110
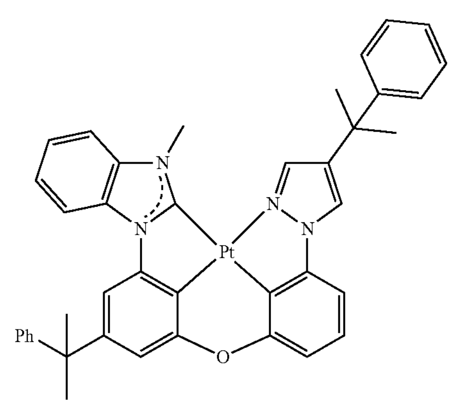

3111
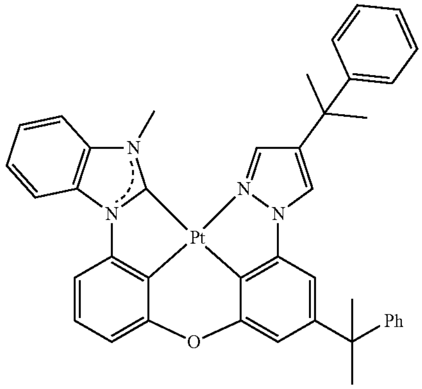
3112
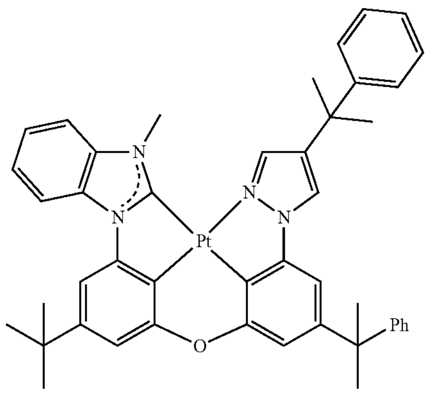
3113
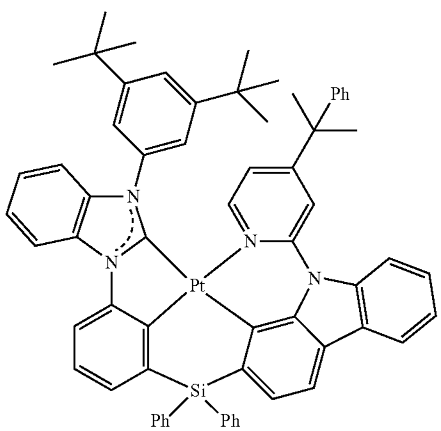
3114
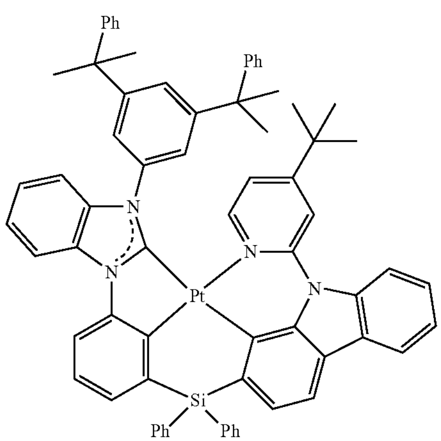
3115
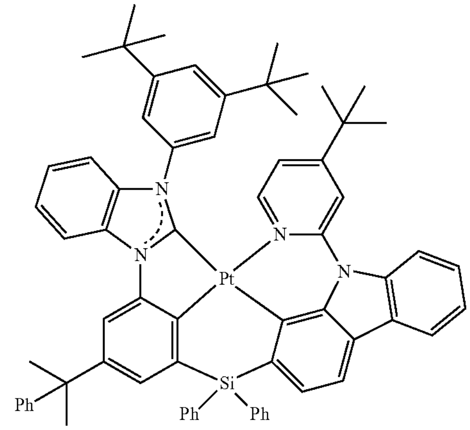
3116
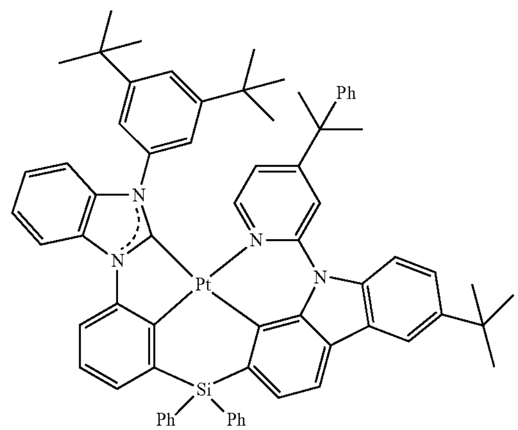
3117
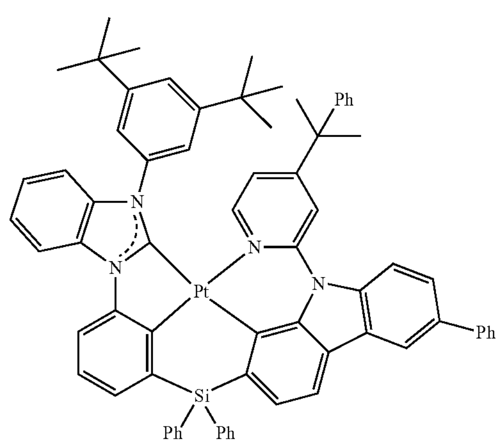

-continued
3118
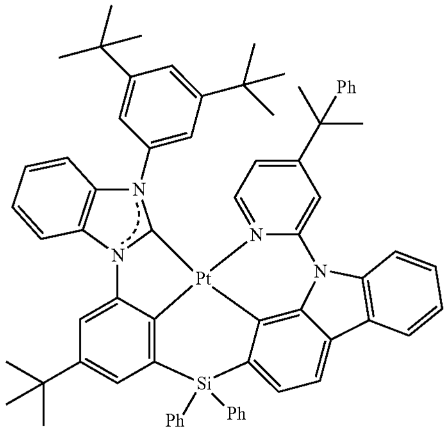
3119
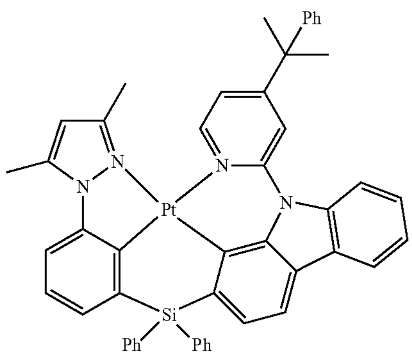
3120
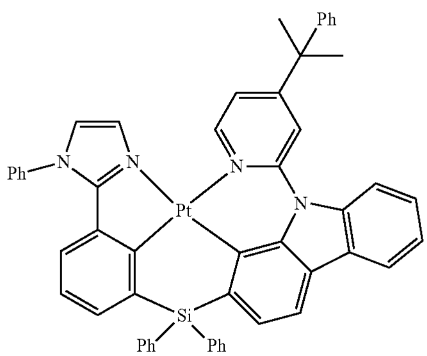
3121
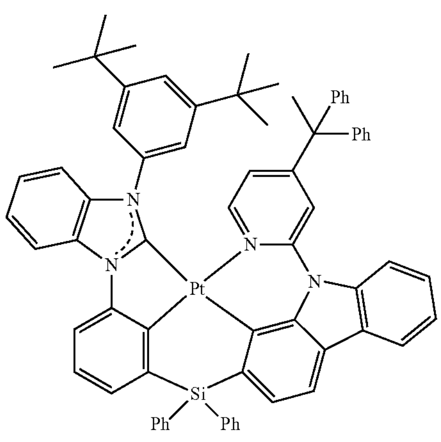
-continued
3122
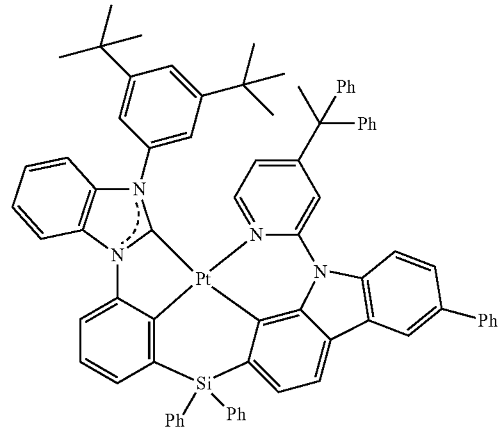
3123
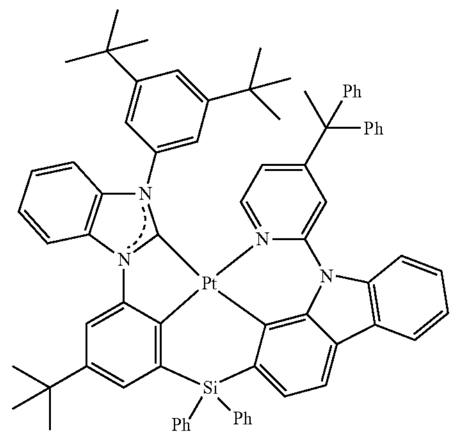
3124
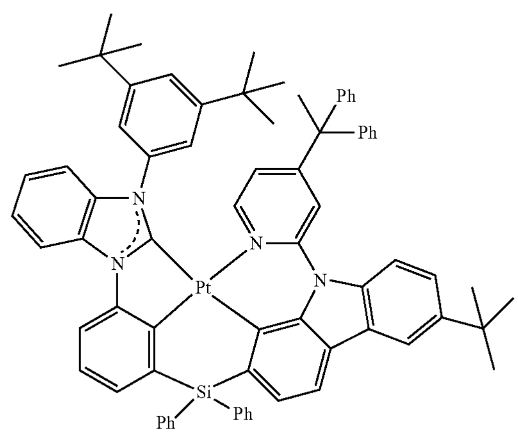

-continued
3125
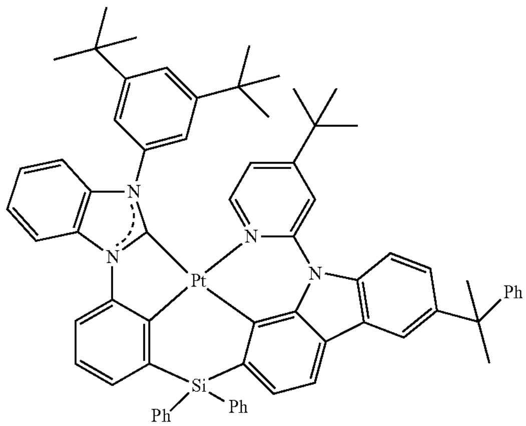
3126
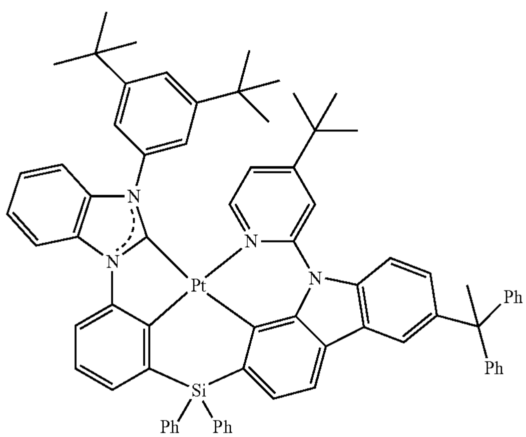
3127
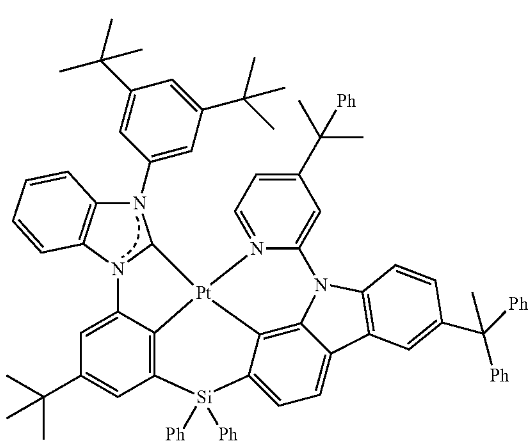
-continued
3128
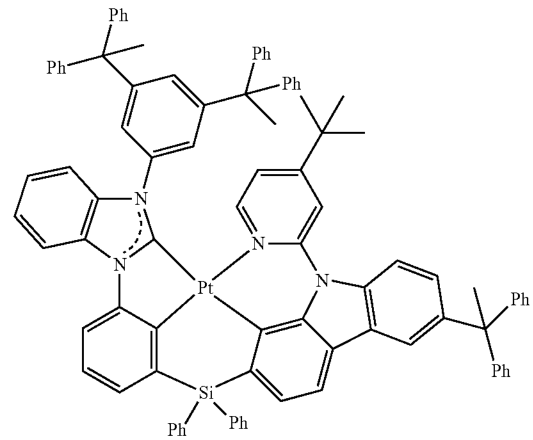
3129
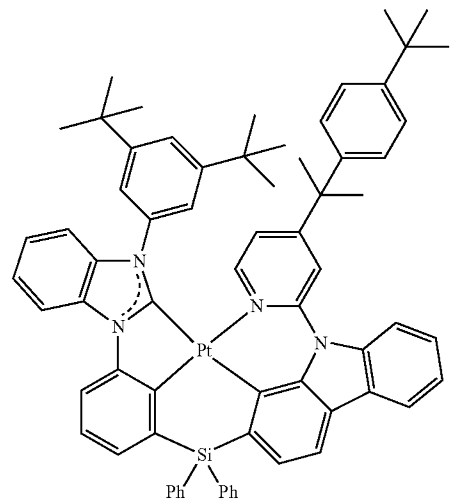
3130
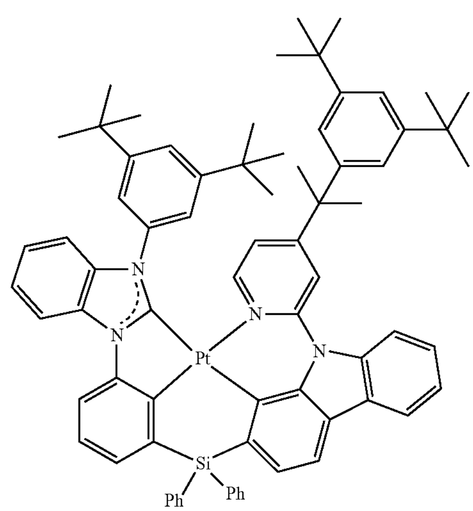

-continued
3131
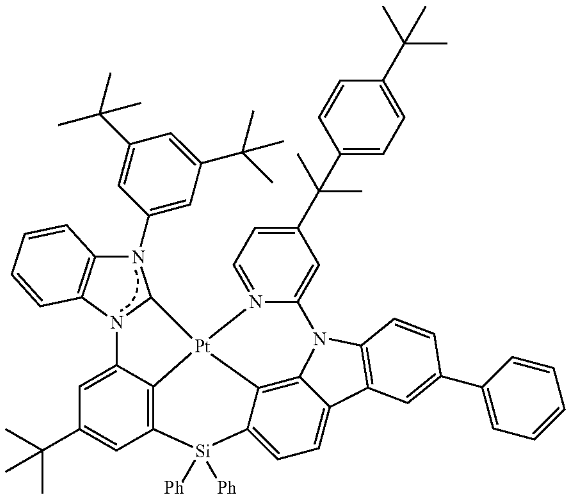
3132
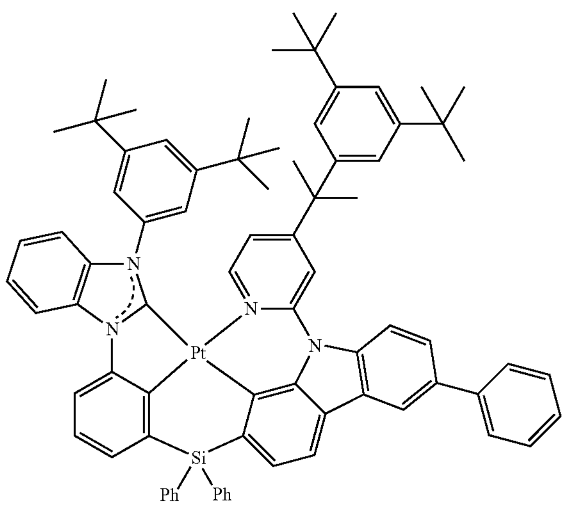
3133
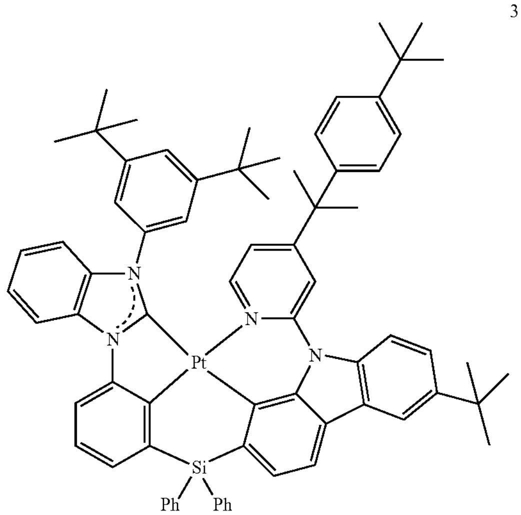
-continued
3134
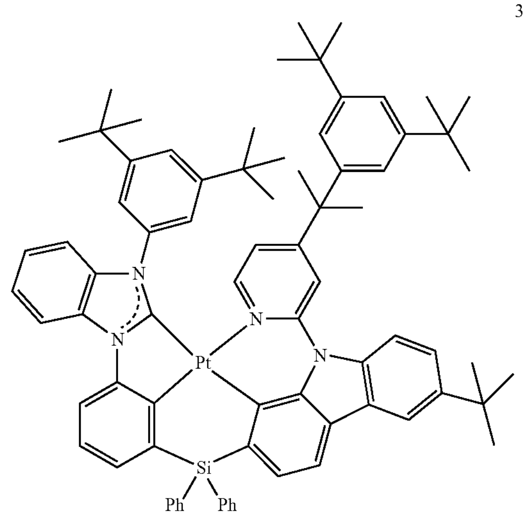
3135
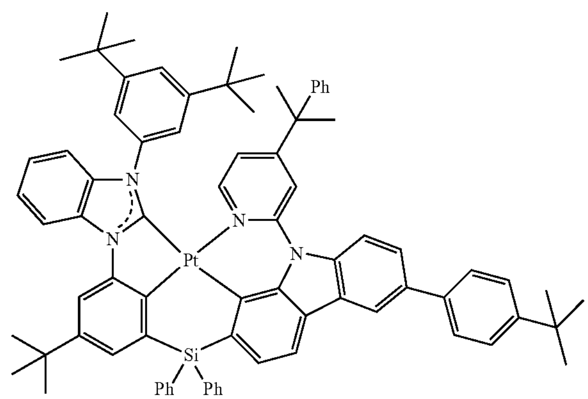
3136
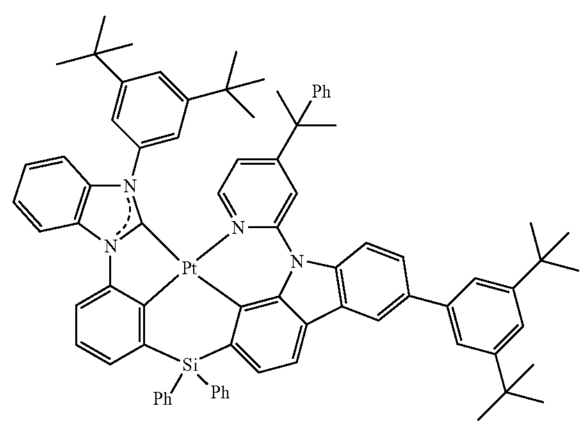

-continued
3137
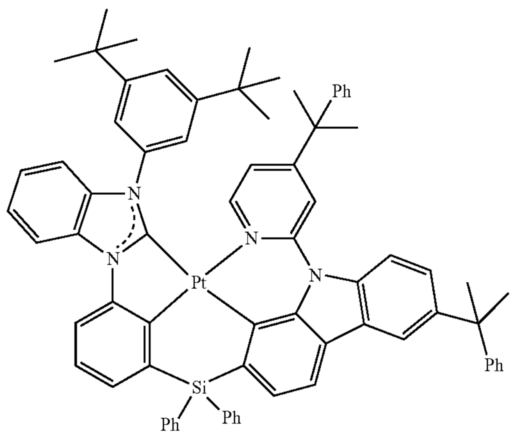
3138
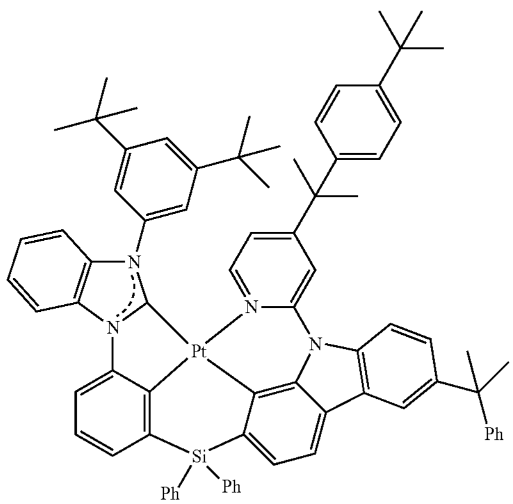
3139
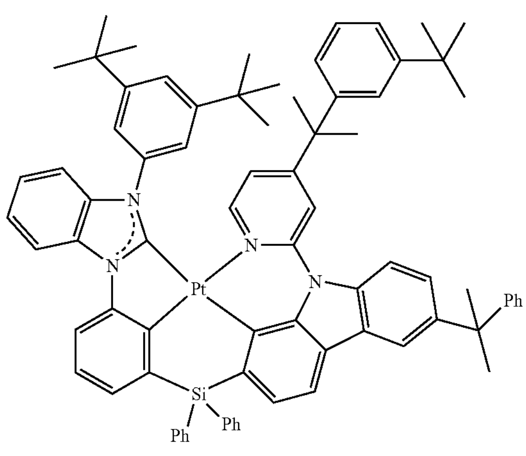
-continued
3140
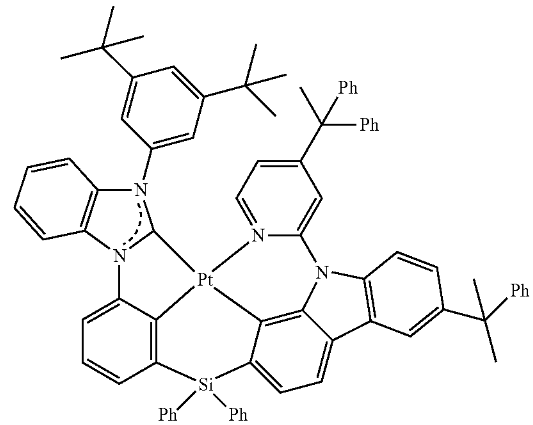
3141
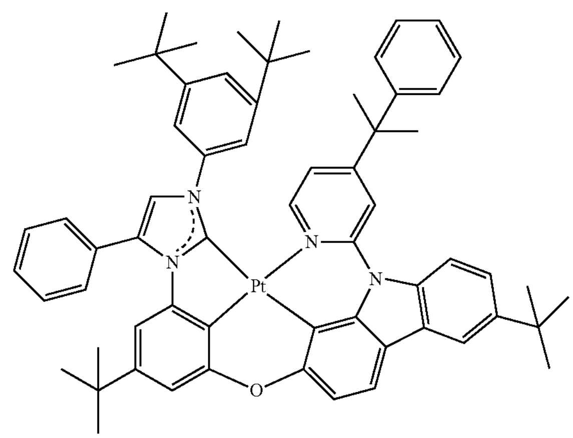
3142
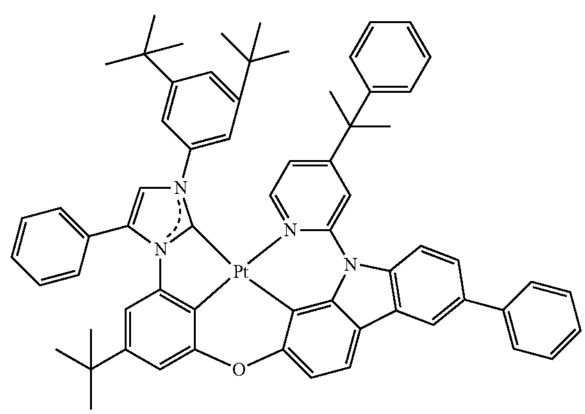

-continued

3143

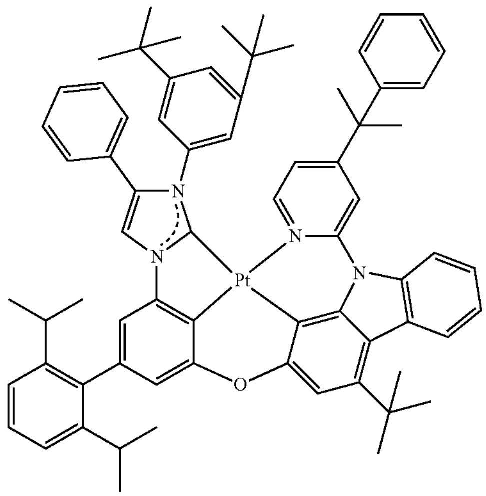

3144

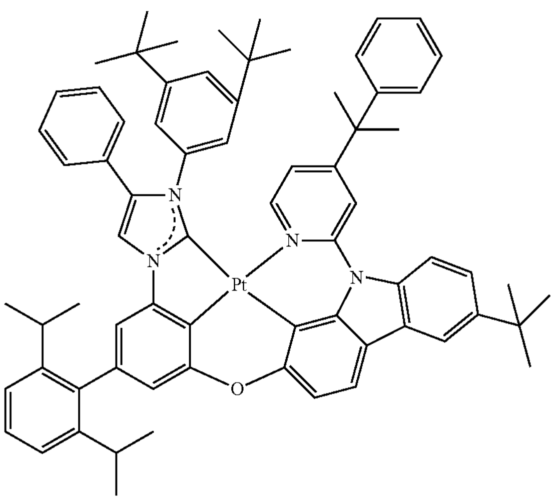

3145

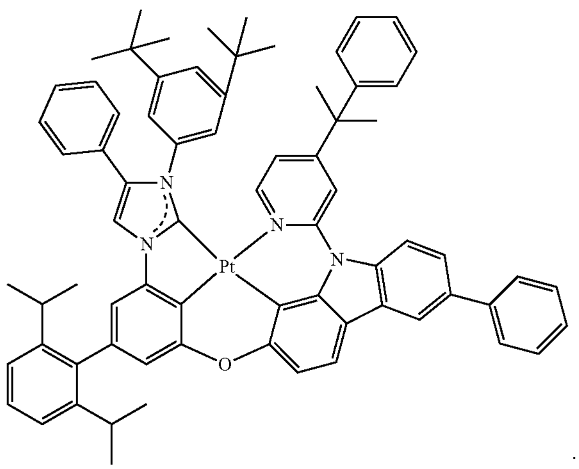

In the organometallic compound represented by Formula 1, $Z_1$ to $Z_4$ may each independently be the group represented by Formula 2, and the sum of b1 to b4, which respectively indicate the number of $Z_1$(s) to $Z_4$(s), may be 1 or greater. That is, the organometallic compound represented by Formula 1 may include at least one group represented by Formula 2. Accordingly, the organometallic compound represented by Formula 1 may have an improved orientation without a change in conjugation length. In addition, the group represented by *—C($Q_{51}$)($Q_{52}$)($Q_{53}$) in the group represented by Formula 2 may not include hydrogen at a benzyl site including a weak chemical bond (that is, none of $Q_{51}$ to $Q_{53}$ in Formula 2 may be hydrogen). Thus, the organometallic compound including at least one group represented by Formula 2 may have excellent chemical and/or electrical stability. Accordingly, an electronic device, e.g., an organic light-emitting device, including the organometallic compound represented by Formula 1 may have improved luminescence efficiency and lifespan.

The highest occupied molecular orbital (HOMO) energy level, lowest unoccupied molecular orbital (LUMO) energy level, $S_1$ energy level, and $T_1$ energy level of some of the organometallic compounds represented by Formula 1 were evaluated by using Gaussian 09 that performs molecular structure optimizations according to density functional theory (DFT) at a degree of B3LYP. The results thereof are shown in Table 1.

TABLE 1

| Compound No. | HOMO (eV) | LUMO (eV) | $T_1$ (eV) |
|---|---|---|---|
| Pt-1 | −4.63 | −1.23 | 2.64 |
| Pt-2 | −4.65 | −1.23 | 2.64 |
| Pt-3 | −4.62 | −1.20 | 2.63 |
| Pt-4 | −4.62 | −1.21 | 2.64 |
| Pt-5 | −4.66 | −1.26 | 2.64 |
| Pt-6 | −4.61 | −1.22 | 2.61 |
| Pt-7 | −4.70 | −1.25 | 2.74 |
| Pt-8 | −4.56 | −1.13 | 2.60 |
| Pt-9 | −4.65 | −1.27 | 2.64 |
| Pt-10 | −4.66 | −1.28 | 2.64 |
| Pt-11 | −4.62 | −1.23 | 2.61 |
| Pt-12 | −4.64 | −1.22 | 2.64 |
| Pt-13 | −4.63 | −1.21 | 2.64 |
| Pt-14 | −4.65 | −1.25 | 2.64 |
| Pt-15 | −4.63 | −1.23 | 2.61 |
| Pt-16 | −4.67 | −1.25 | 2.64 |
| Pt-17 | −4.62 | −1.21 | 2.64 |
| Pt-18 | −4.62 | −1.20 | 2.65 |
| Pt-19 | −4.63 | −1.23 | 2.64 |
| Pt-20 | −4.64 | −1.22 | 2.65 |
| Pt-21 | −4.61 | −1.20 | 2.64 |
| Pt-22 | −4.60 | −1.19 | 2.65 |
| Pt-23 | −4.64 | −1.24 | 2.61 |
| Pt-24 | −4.64 | −1.24 | 2.62 |

Referring to the results shown in Table 1, the organometallic compound represented by Formula 1 was found to have suitable electrical characteristics for use as an emission layer material in an electronic device, e.g., an organic light-emitting device.

A method of synthesizing the organometallic compound represented by Formula 1 may be apparent to one of ordinary skill in the art by referring to Synthesis Examples provided herein.

The organometallic compound represented by Formula 1 may be suitable for use in an organic layer of an organic light-emitting device, e.g., as an emission layer material in the organic layer. Thus, according to another aspect, there is provided an organic light-emitting device that may include a first electrode; a second electrode; and an organic layer disposed between the first electrode and the second electrode and including an emission layer; wherein the organic layer may include at least one organometallic compound represented by Formula 1.

The organic light-emitting device may include an organic layer including the organometallic compound represented by Formula 1. Thus, the organic light-emitting device may have excellent driving voltage, excellent external quantum efficiency, a relatively small full width at half maximum (FWHM) of an emission peak in an electroluminescence (EL) spectrum, and excellent lifespan characteristics.

The organometallic compound represented by Formula 1 may be used in a pair of electrodes of an organic light-emitting device. For example, the organometallic compound represented by Formula 1 may be included in the emission layer. In some embodiments, the emission layer may further include a host. In some embodiments, a content of the host may be greater than a content of the organometallic compound. The emission layer may emit red light, green light, or blue light. In some embodiments, the organometallic compound may emit blue light.

In some embodiments, the emission layer may be a First Embodiment or a Second Embodiment.

First Embodiment

The emission layer may include the organometallic compound represented by Formula 1, and the organometallic compound may serve as a phosphorescence emitter. For example, a ratio of emission components emitted from the organometallic compound may be 80 percent (%) or more, 85% or more, 90% or more, or 95% or more of the total emission components emitted from the emission layer. Blue light may be emitted from the organometallic compound.

Second Embodiment

The emission layer may further include, in addition to the organometallic compound represented by Formula 1, a phosphorescent dopant, a fluorescent dopant, or any combination thereof, which is different from the organometallic compound. Here, the organometallic compound may serve, not as a phosphorescence emitter, but as a sensitizer or an auxiliary dopant. In some embodiments, the emission layer may further include a fluorescent dopant, the fluorescent dopant may be different from the organometallic compound, and a ratio of emission components emitted from the fluorescent dopant may be 80% or more, 85% or more, 90% or more, or 95% or more of the total emission components emitted from the emission layer.

In the Second Embodiment, a content of the fluorescent dopant may be in a range of about 1 part to about 100 parts by weight, about 5 parts to about 50 parts by weight, or about 10 parts to about 20 parts by weight, based on 100 parts by weight of the organometallic compound represented by Formula 1.

In the Second Embodiment, a total content of the organometallic compound represented by Formula 1 and the fluorescent dopant may be in a range of about 1 part to about 30 parts by weight, about 3 parts to about 20 parts by weight, or about 5 parts to about 15 parts by weight, based on 100 parts by weight of the emission layer.

A fluorescent dopant that may be used in the Second Embodiment may not include a transition metal.

In some embodiments, a fluorescent dopant that may be used in the Second Embodiment may be a fluorescence-emitting material not including a cyano group (—CN) and a fluoro group (—F).

In some embodiments, a fluorescent dopant that may be used in the Second Embodiment may be a condensed ring-containing compound, an amino group-containing compound, a styryl group-containing compound, or a boron group-containing compound.

In some embodiments, a fluorescent dopant that may be used in the Second Embodiment may include an amino group-containing compound.

In some embodiments, the fluorescent dopant that may be used in the Second Embodiment may include a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group(a tetracene group), a picene group, a perylene group, a pentaphene group, an indenoanthracene group, a group represented by one of Formulae 501-1 to 501-21, or any combination thereof:

501-1

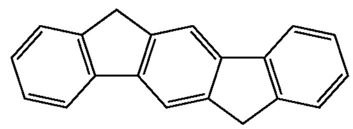

501-2

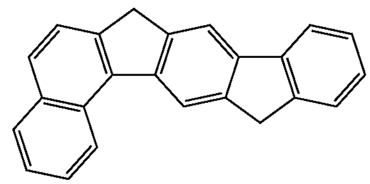

501-3

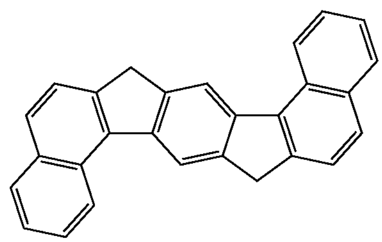

501-4

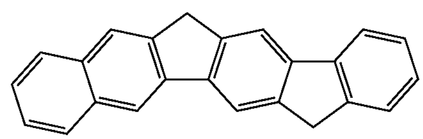

501-5

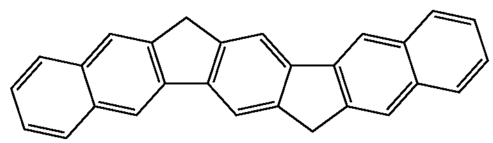

501-6

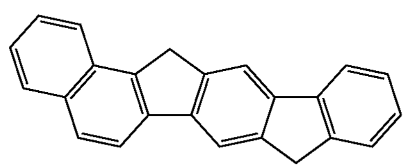

501-7

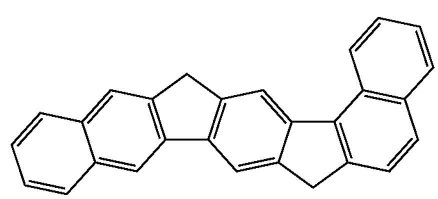

-continued
501-8
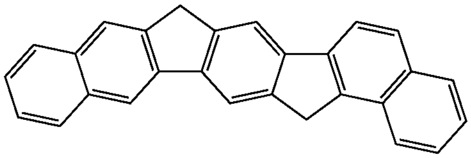
501-9
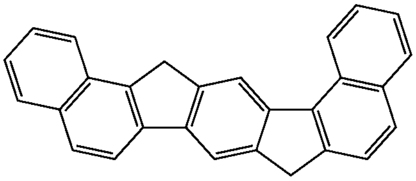
501-10
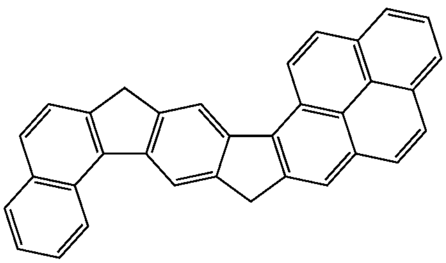
501-11
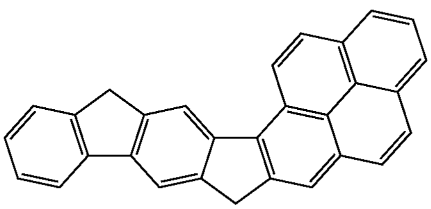
501-12
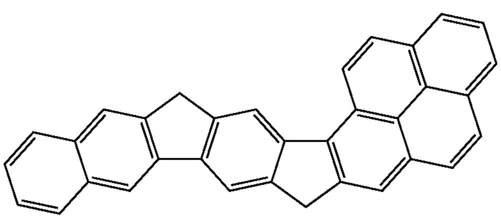
501-13
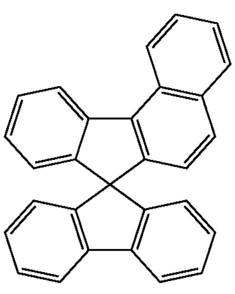
501-14
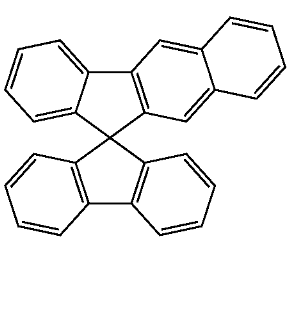
-continued
501-15
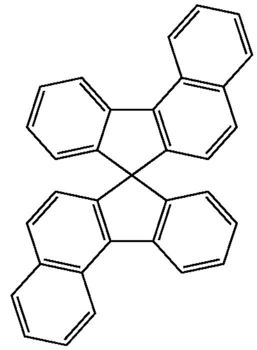
501-16
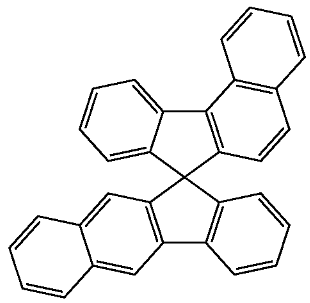
501-17
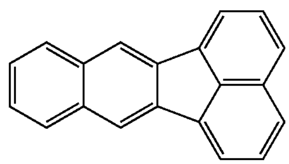
501-18
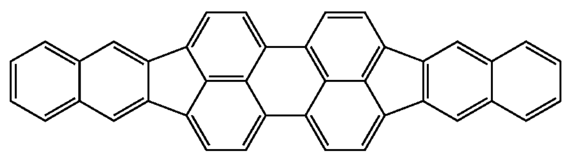
501-19
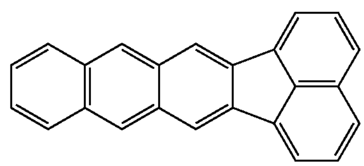
501-20
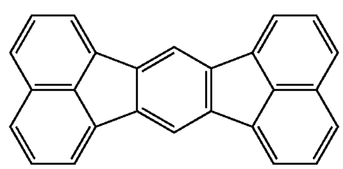
501-21
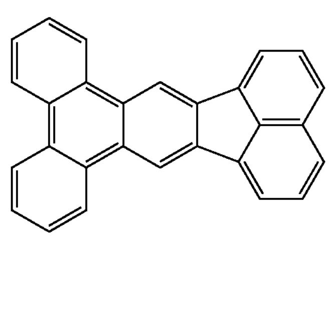
.

In one or more embodiments, the fluorescent dopant that may be used in the Second Embodiment may include a compound represented by Formula 501A or 501B:

501A

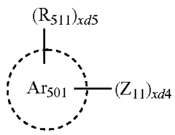

501B

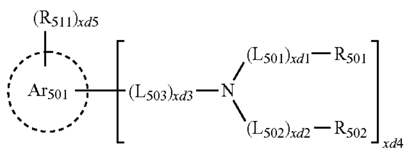

wherein, in Formulae 501A and 501B, $Ar_{501}$ may be a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a bisanthracene group, or a group represented by one of Formulae 501-1 to 501-21, $R_{511}$ may be hydrogen, deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or —Si($Q_{501}$)($Q_{502}$)($Q_{503}$), xd5 may be an integer from 0 to 10, $L_{501}$ to $L_{503}$ may each independently be:

a single bond; and a $C_3$-$C_{10}$ cycloalkylene group, a $C_1$-$C_{10}$ heterocycloalkylene group, a $C_3$-$C_{10}$ cycloalkenylene group, a $C_2$-$C_{10}$ heterocycloalkenylene group, an unsaturated $C_1$-$C_{10}$ heterocyclic group, a $C_6$-$C_{60}$ arylene group, a $C_1$-$C_{60}$ heteroarylene group, a divalent non-aromatic condensed polycyclic group, or a divalent non-aromatic condensed heteropolycyclic group, each unsubstituted or substituted with deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$), or any combination thereof, xd1 to xd3 may each independently be 1, 2, or 3, $R_{501}$ and $R_{502}$ may each independently be a phenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, a dibenzothiophenyl group, or a dibenzosilolyl group, each unsubstituted or substituted with deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$), or any combination thereof, $Z_{11}$ may be a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$) ($Q_{503}$), or any combination thereof, xd4 may be 1, 2, 3, 4, 5, or 6, and wherein $Q_{501}$ to $Q_{503}$ may each independently be hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

In one or more embodiments, the fluorescent dopant may include a compound represented by Formula 501A or 501B, xd4 in Formula 501A may be 1, 2, 3, 4, 5, or 6, and xd4 in Formula 501B may be 2, 3, or 4.

In one or more embodiments, the fluorescent dopant may include one of Compounds FD(1) to FD(16), one of Compounds FD1 to FD16, or any combination thereof:

FD(1)
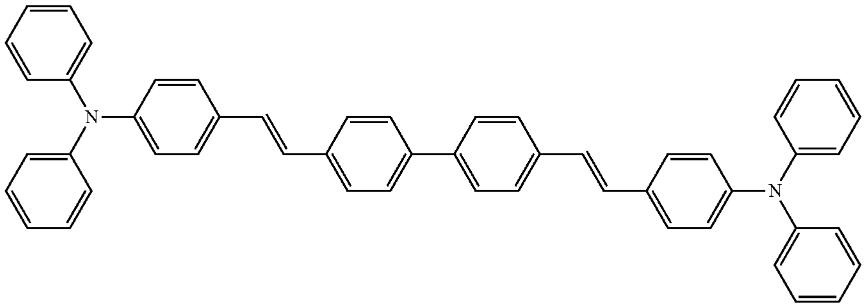
FD(2)
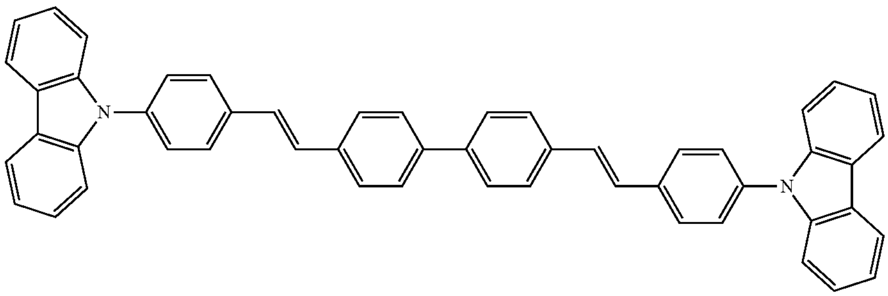
FD(3)
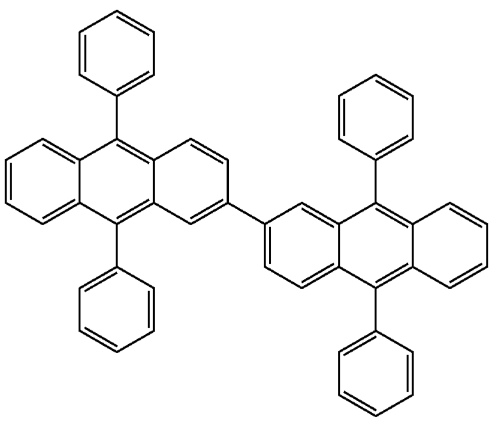
FD(4)
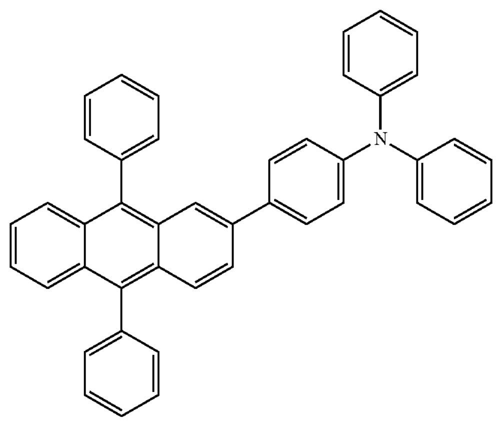
FD(5)
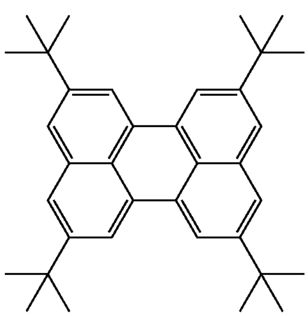
FD(6)
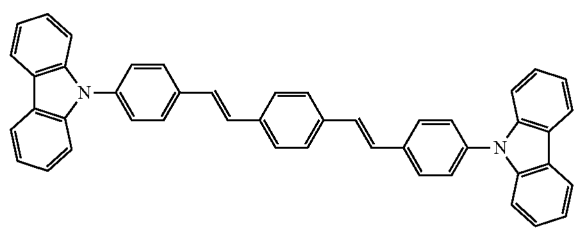
FD(7)
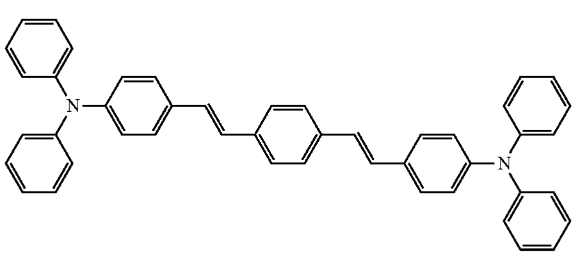
FD(8)
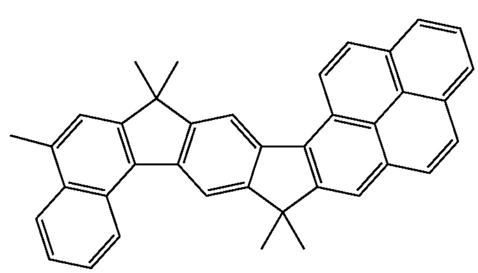

-continued
FD(9)
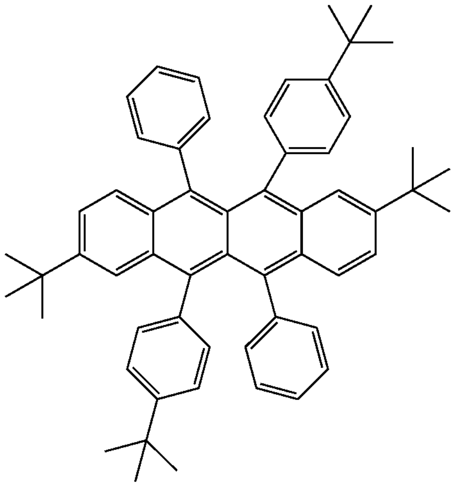
FD(10)
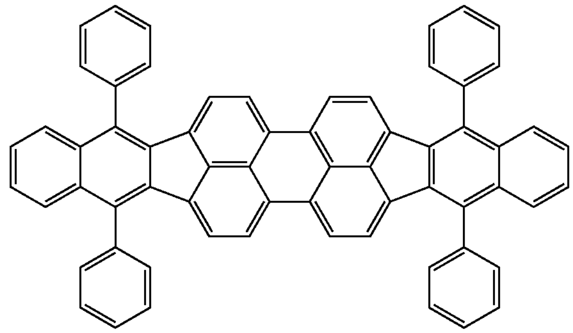
FD(11)
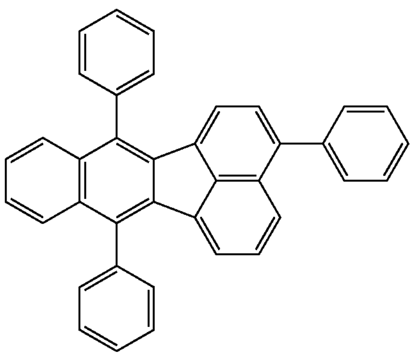
FD(12)
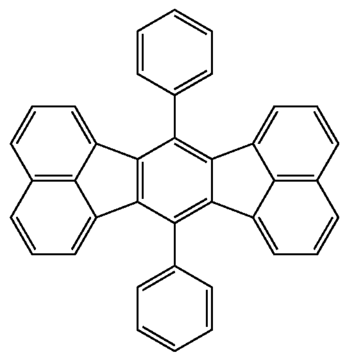
FD(13)
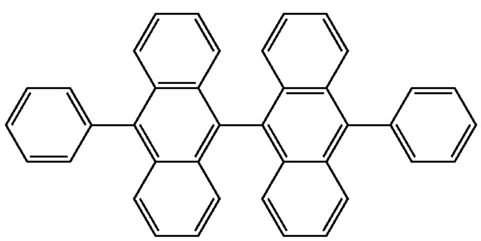
FD(14)
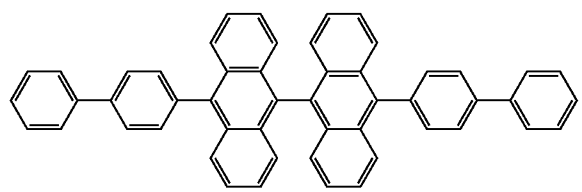
FD(15)
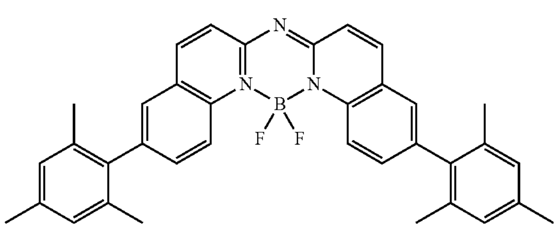
FD(16)
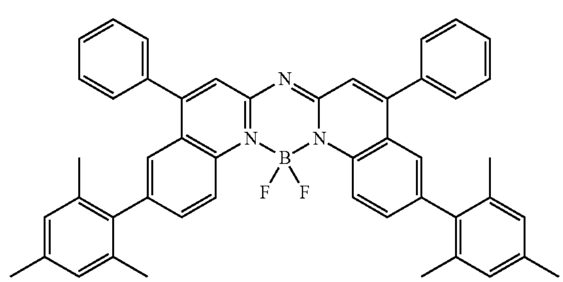

-continued
FD1
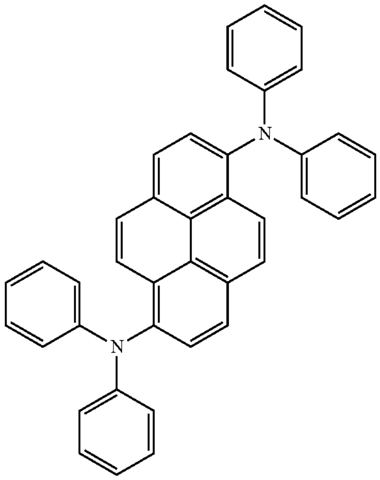
FD2
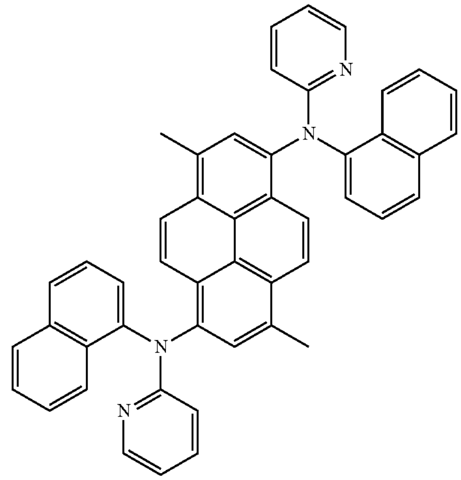
FD3
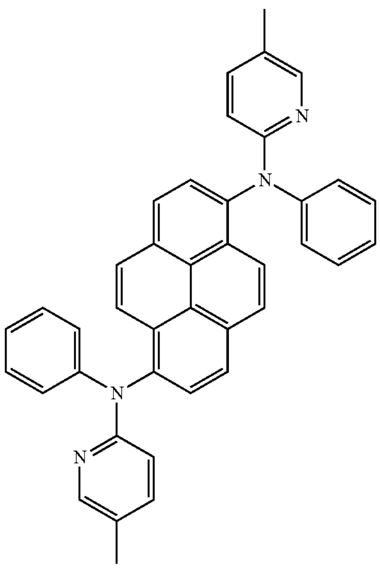
FD4
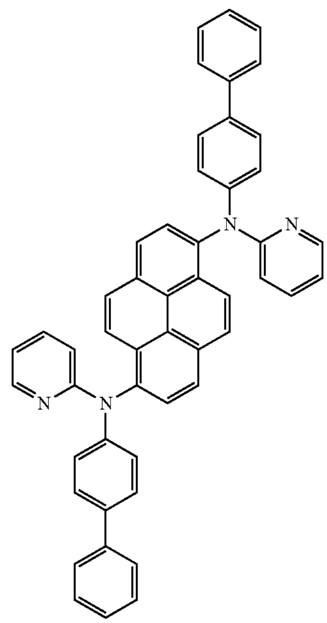
FD5
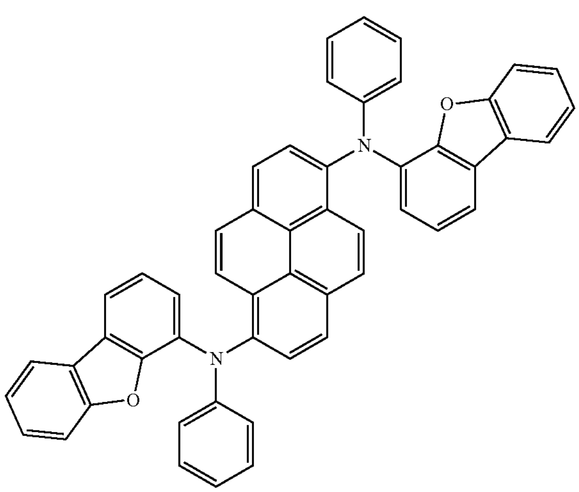
FD6
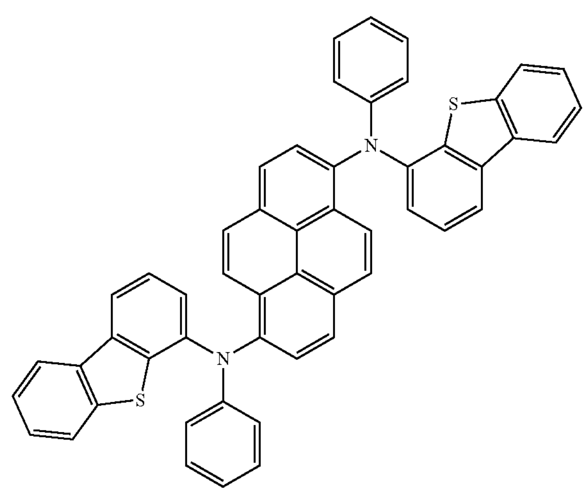

-continued
FD7
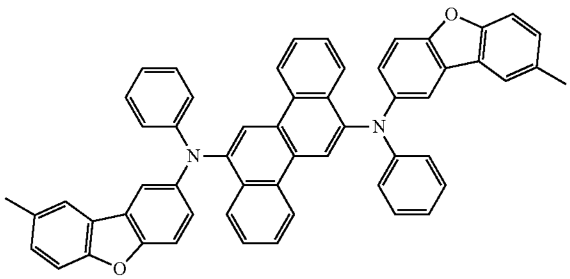
FD8
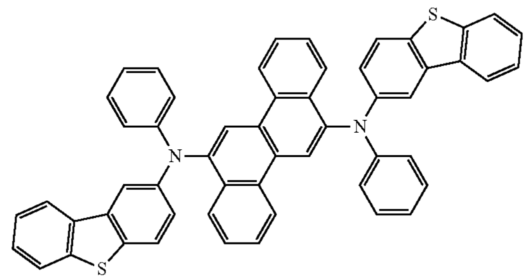
FD9
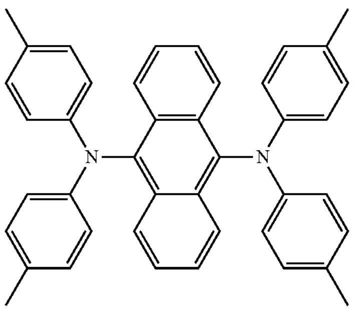
FD10
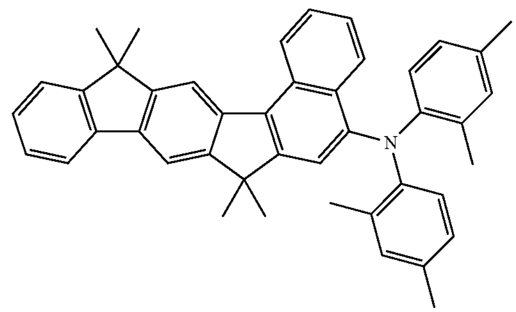
FD11
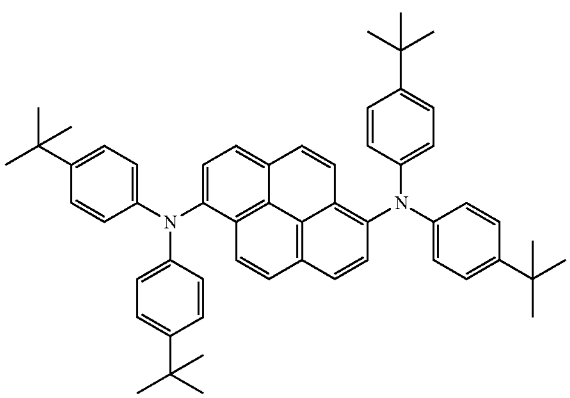
FD12
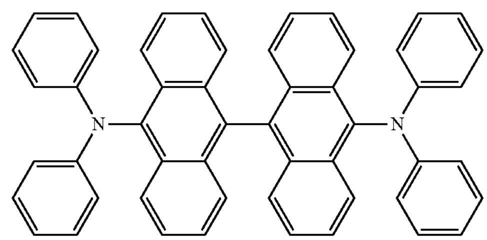
FD13
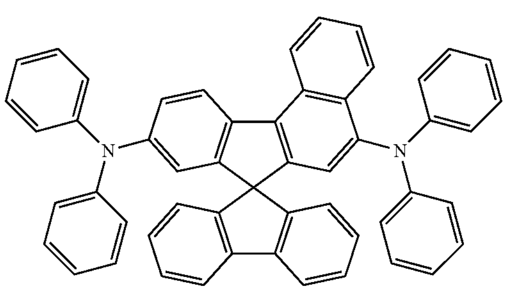
FD14
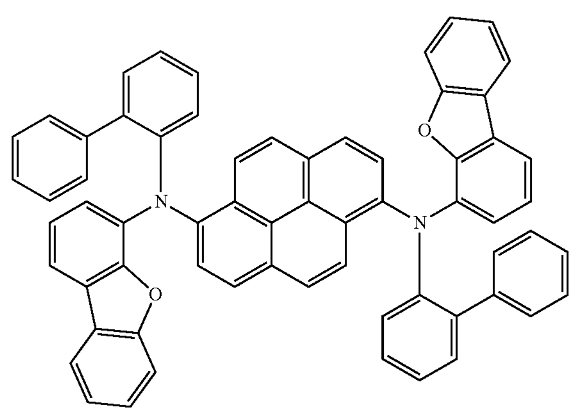

-continued

FD15

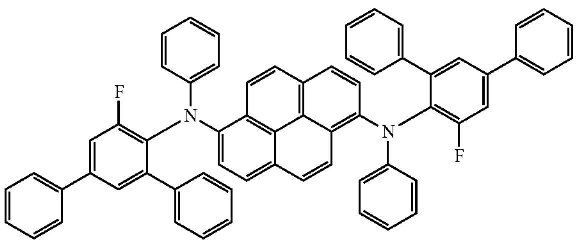

FD16

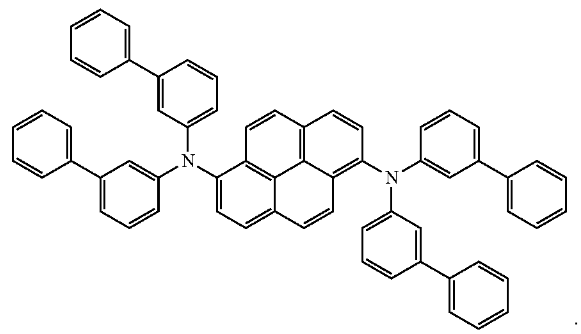

As used herein, the expression the "(organic layer) includes at least one organometallic compound" may be construed as meaning the "(organic layer) may include one organometallic compound of Formula 1 or two different organometallic compounds of Formula 1".

For example, Compound 1 may only be included in the organic layer as an organometallic compound. In this embodiment, Compound 1 may be included in the emission layer of the organic light-emitting device. In some embodiments, Compounds 1 and 2 may be included in the organic layer as organometallic compounds. In this embodiment, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region disposed between the first electrode and the emission layer and an electron transport region disposed between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single and/or a plurality of layers between the first electrode and the second electrode in an organic light-emitting device. The "organic layer" may include not only organic compounds but also organometallic complexes including metals.

The FIGURE illustrates a schematic cross-sectional view of an organic light-emitting device 10 according to an exemplary embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

The first electrode 11 may be formed by depositing or sputtering, onto the substrate, a material for forming the first electrode 11. The first electrode 11 may be an anode. The material for forming the first electrode 11 may include a material with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), and zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO.

The organic layer 15 may be on the first electrode 11.

The organic layer 15 may include a hole transport region, an emission layer, and an electron transport region.

The hole transport region may be between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum deposition, for example, the vacuum deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, though the conditions may vary depending on a compound that is used as a hole injection material and a structure and thermal properties of a desired hole injection layer, but conditions for the vacuum deposition are not limited thereto.

When a hole injection layer is formed by spin coating, the spin coating may be performed at a coating rate in a range of about 2,000 revolutions per minute (rpm) to about 5,000 rpm, and at a temperature in a range of about 80° C. to 200° C., to facilitate removal of a solvent after the spin coating, though the conditions may vary depending on a compound that is used as a hole injection material and a structure and thermal properties of a desired hole injection layer, but conditions for the spin coating are not limited thereto.

The conditions for forming a hole transport layer and an electron blocking layer may be inferred from the conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or any combination thereof:

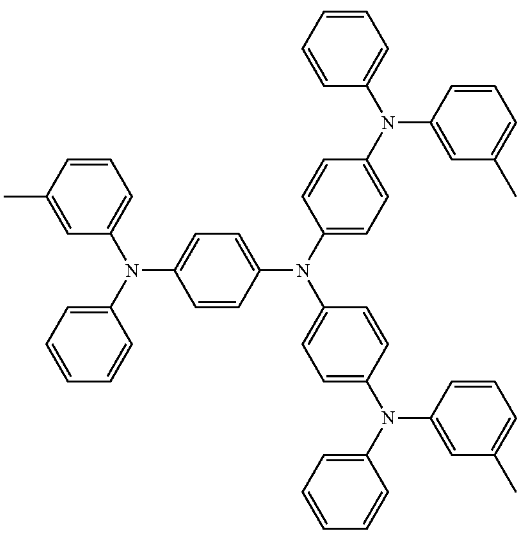

m-MTDATA

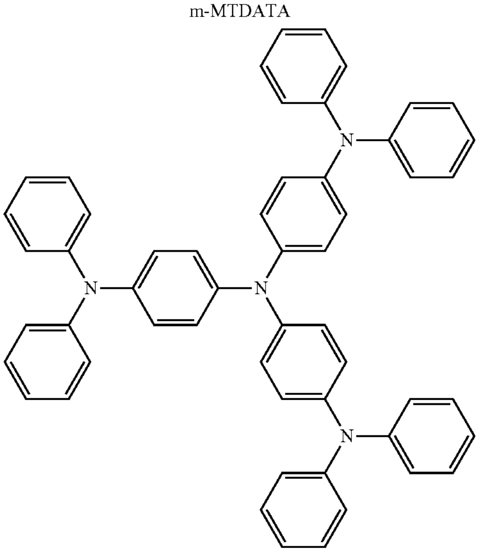

TDATA

-continued

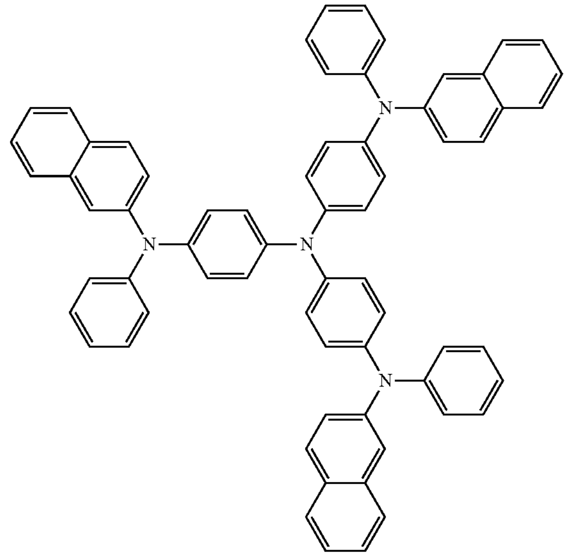

2-TNATA

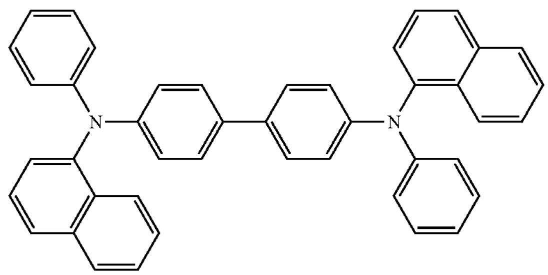

NPB

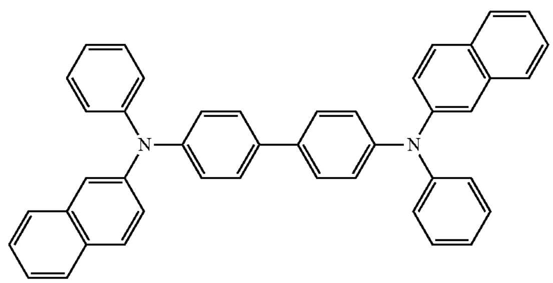

β-NPB

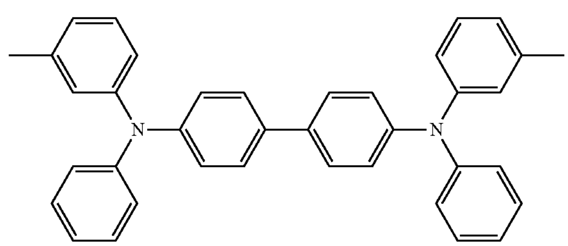

TPD

-continued

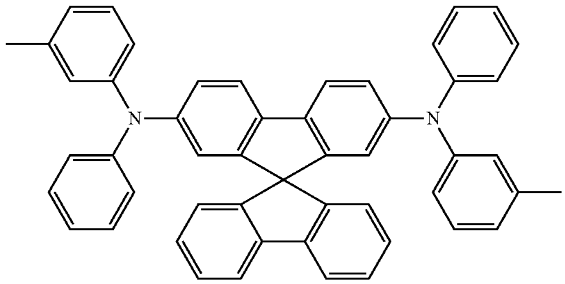

Spiro-TPD

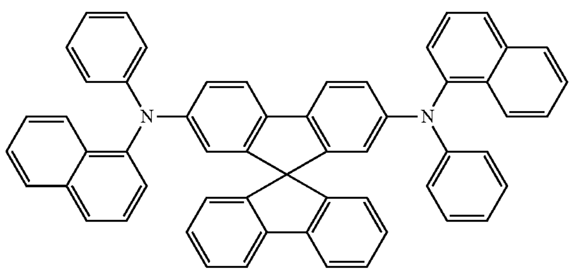

Spiro-NPB

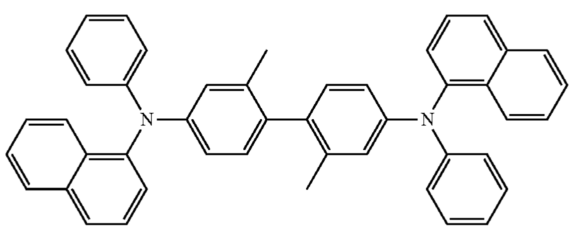

methylated NPB

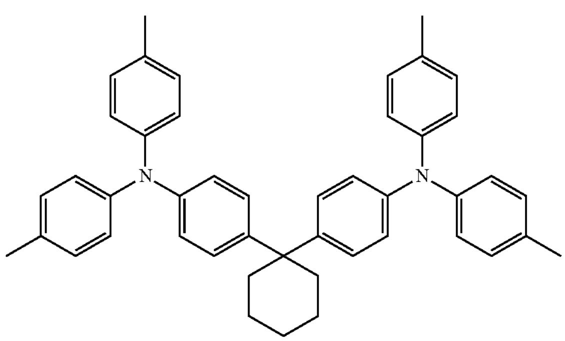

TAPC

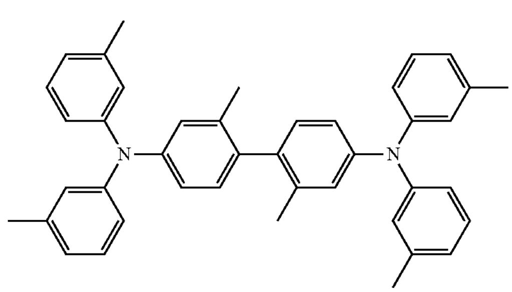

HMTPD

-continued

Formula 201

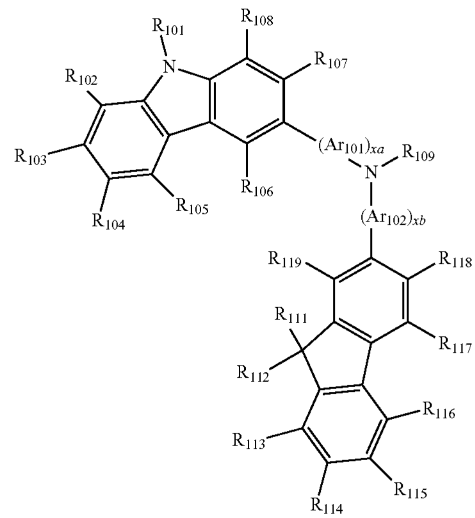

Formula 202

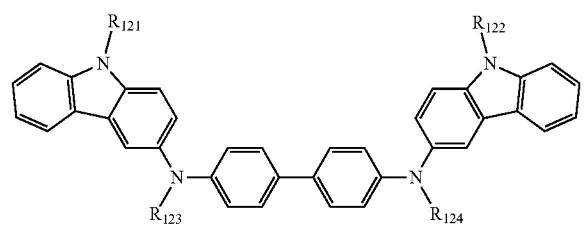

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_2$-$C_{10}$ heterocycloalkenyl group, an unsaturated $C_1$-$C_{10}$ heterocyclic group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5. In some embodiments, xa and xb may each independently be an integer from 0 to 2. In some embodiments, xa may be 1, and xb may be 0, but embodiments are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In some embodiments, the compound represented by Formula 201 may be represented by Formula 201A:

Formula 201A

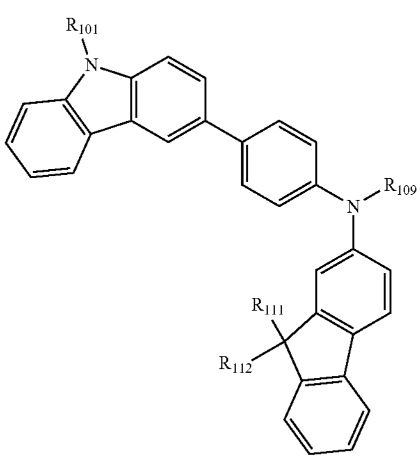

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In some embodiments, the hole transport region may include one of Compounds HT1 to HT20 or any combination thereof:

HT1

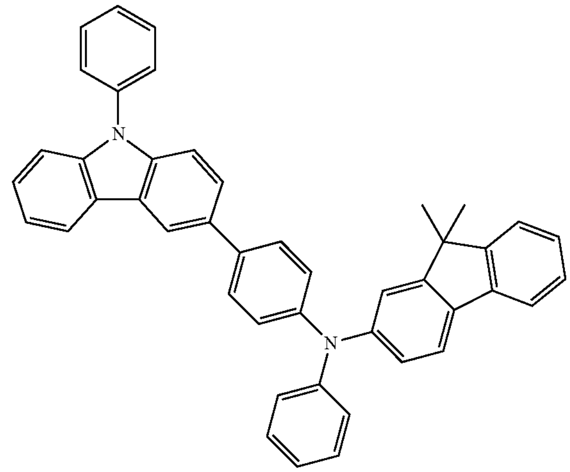

HT2

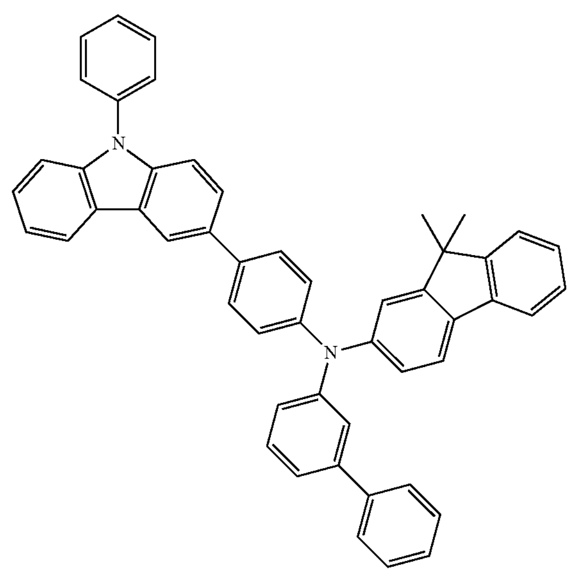

-continued
HT3
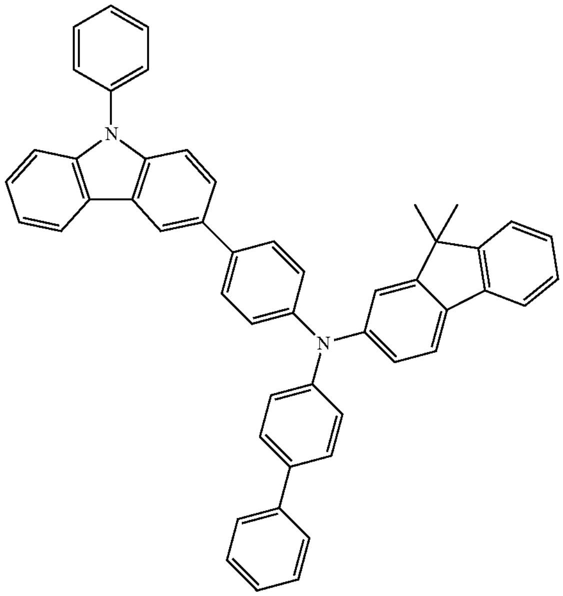
HT4
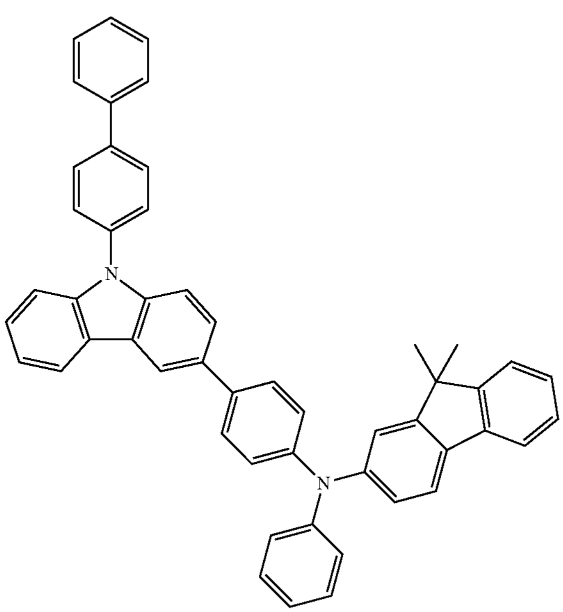
-continued
HT5
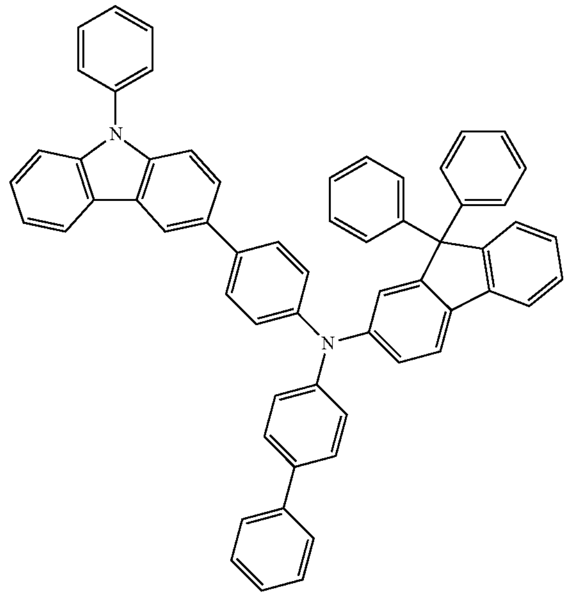
HT6
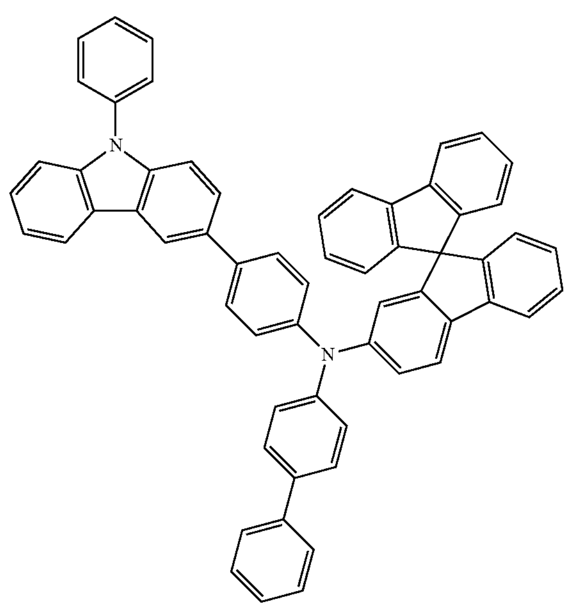

-continued
HT7
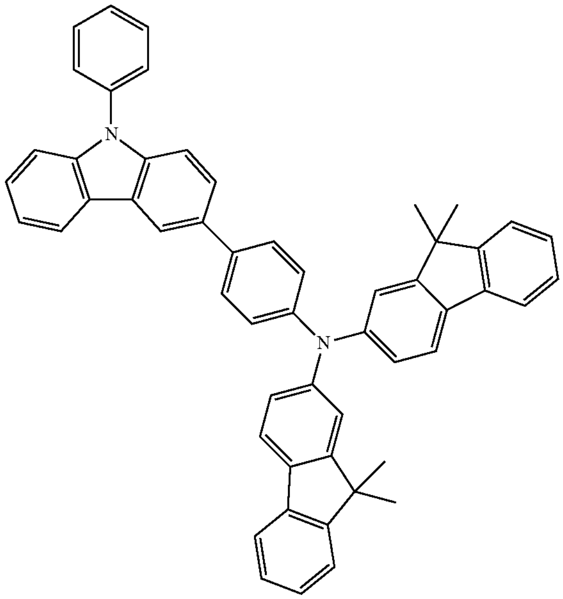
HT8
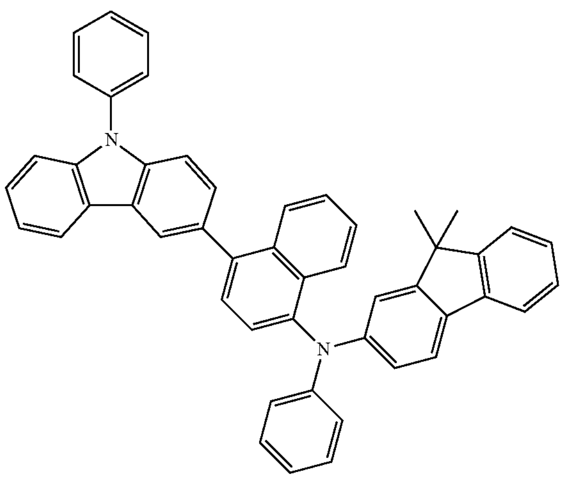
HT9
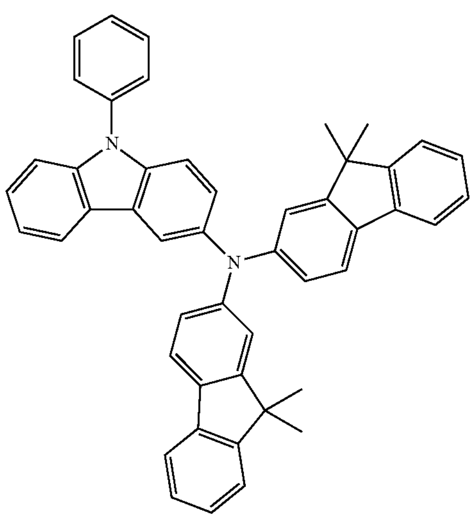
-continued
HT10
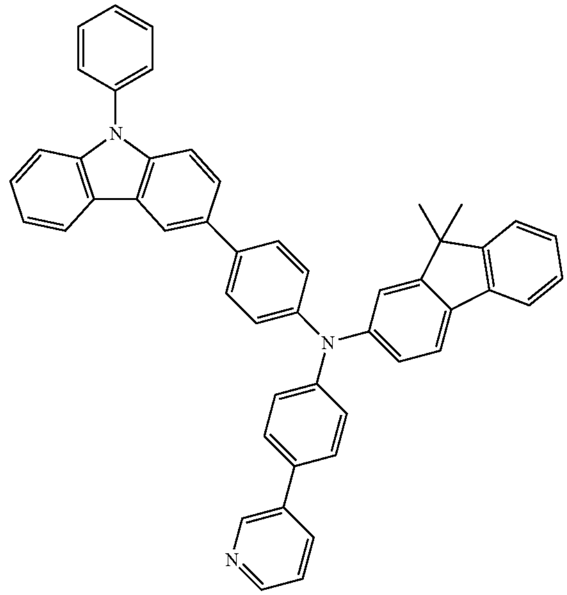
HT11
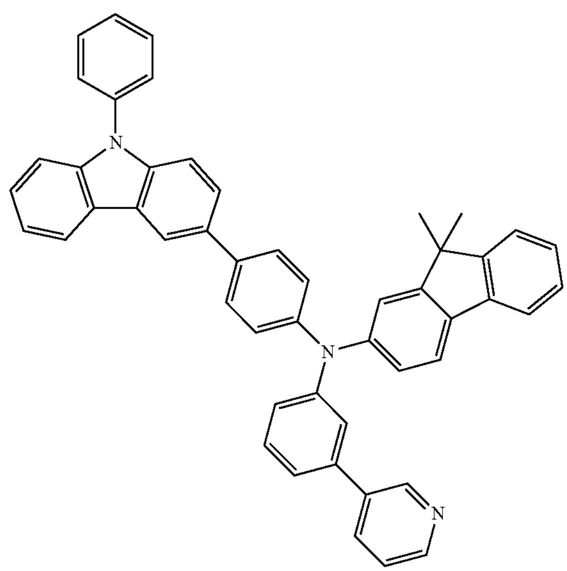

-continued
HT12
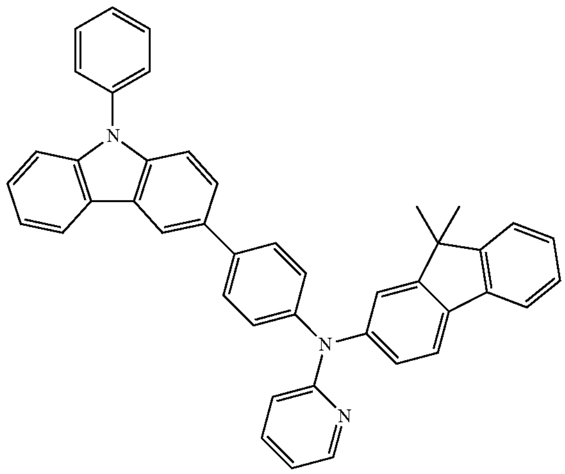
HT13
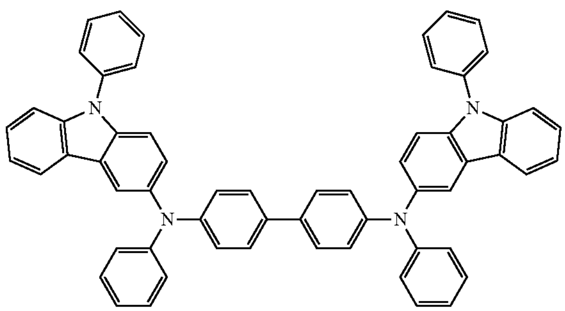
HT14
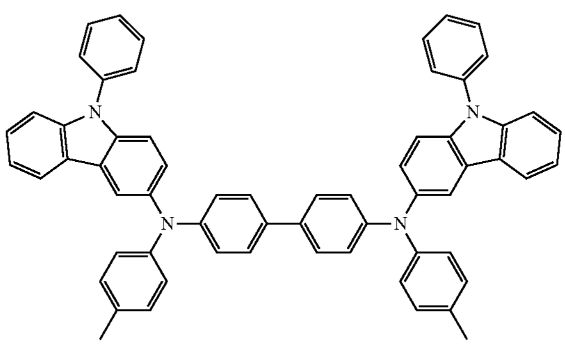
HT15
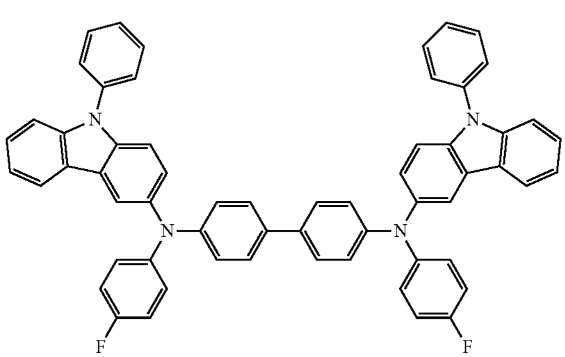
-continued
HT16
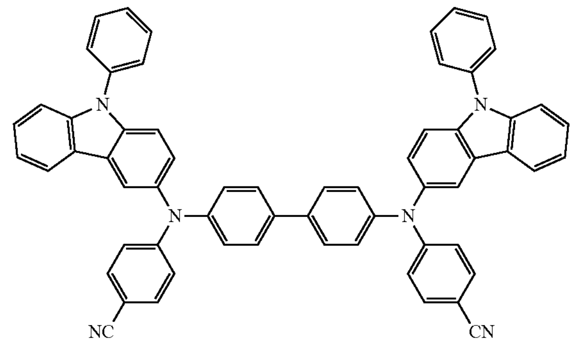
HT17
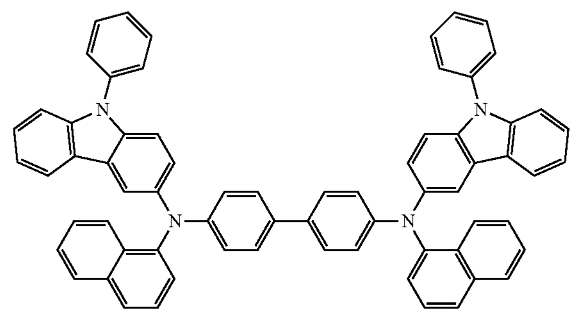
HT18
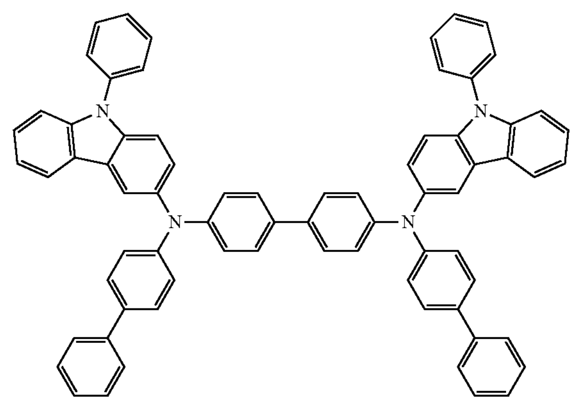
HT19
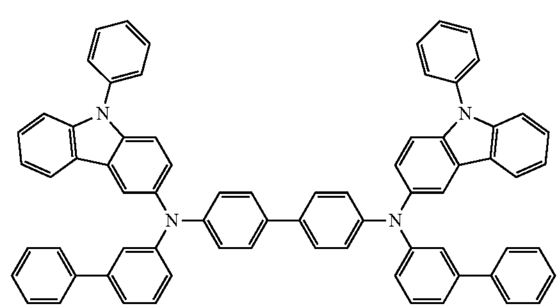

-continued

HT20

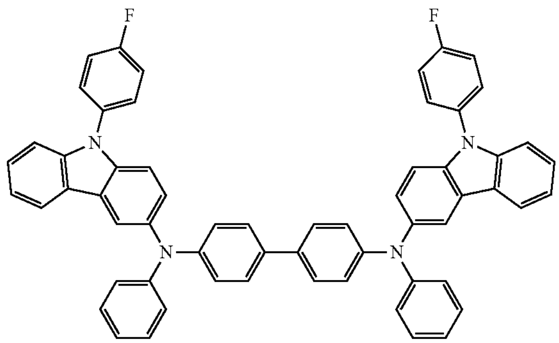

The thickness of the hole transport region may be in a range of about 100 (Angstroms) Å to about 10,000 Å, and in some embodiments, about 100 Å to about 1,000 Å. When the hole transport region includes a hole injection layer, a hole transport layer an electron blocking layer, or any combination thereof, the thickness of the hole injection layer may be in a range of about 100 Å to about 10,000 Å, and in some embodiments, about 100 Å to about 1,000 Å, and the thickness of the hole transport layer may be in a range of about 50 Å to about 2,000 Å, and in some embodiments, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be a quinone derivative, a metal oxide, a compound containing a cyano group, or any combination thereof, but embodiments are not limited thereto. In some embodiments, the p-dopant may be a quinone derivative, such as tetracyanoquinodimethane (TCNQ), a 2,3,5,6-tetrafluoro-tetracyano-1,4-benzoquinonedimethane (F4-TCNQ), or F6-TCNNQ; a metal oxide, such as a tungsten oxide or a molybdenum oxide; a compound containing a cyano group, such as Compound HT-D1; or any combination thereof:

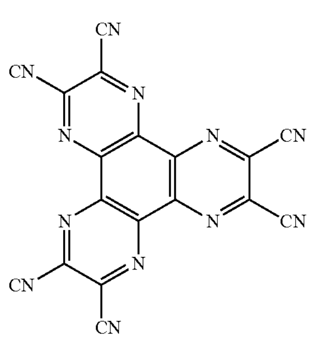

HT-D1

-continued

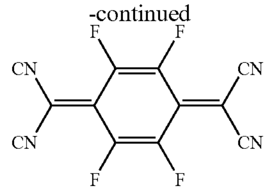

F4-TCNQ

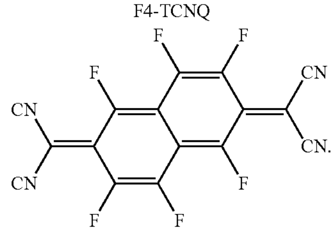

F6-TCNNQ

The hole transport region may further include a buffer layer.

The buffer layer may compensate for an optical resonance distance depending on a wavelength of light emitted from the emission layer to improve the efficiency of an organic light-emitting device.

When the hole transport region includes an electron blocking layer, a material for forming the electron blocking layer may include the material for forming a hole transport region, the host material described herein or any combination thereof. In some embodiments, when the hole transport region includes an electron blocking layer, mCP described herein or the like may be used for forming the electron blocking layer.

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The emission layer may include a host and a dopant, and the dopant may include the organometallic compound represented by Formula 1 described herein.

The host may include TPBi, TBADN, ADN (also known as “DNA”), CBP, CDBP, TCP, mCP, Compound H50, Compound H51, Compound H52, or any combination thereof:

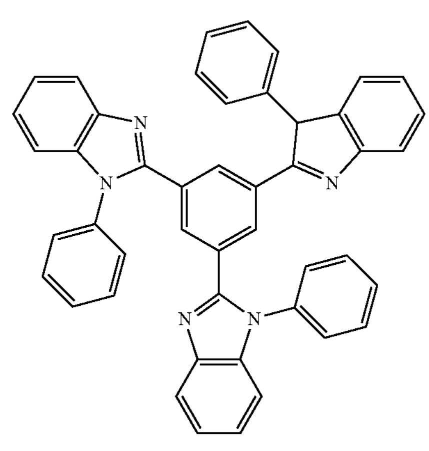

TPBi

-continued

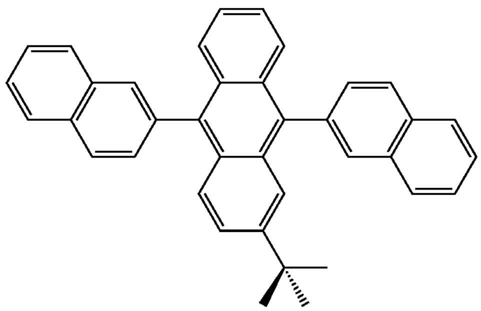

TBADN

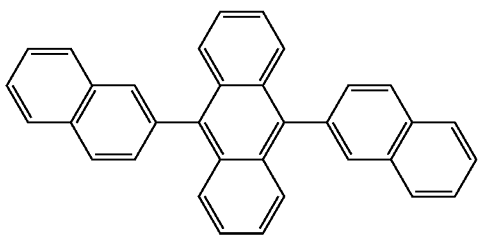

ADN

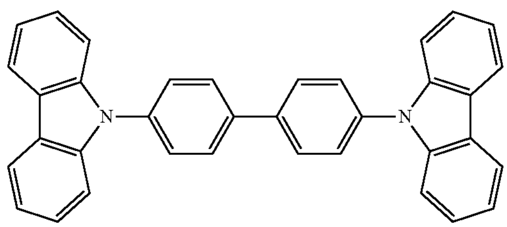

CBP

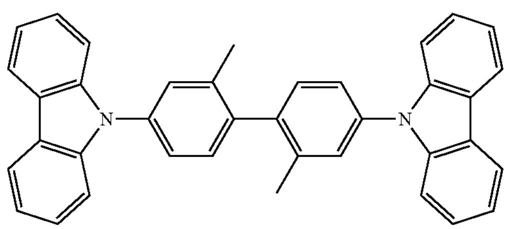

CDBP

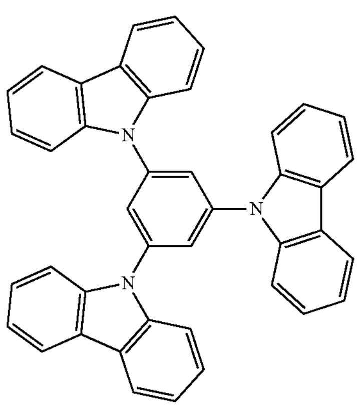

TCP

-continued

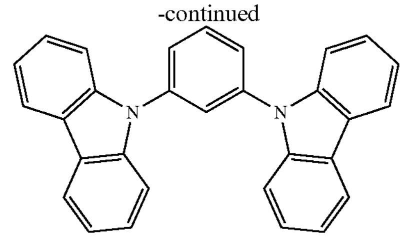

mCP

H50

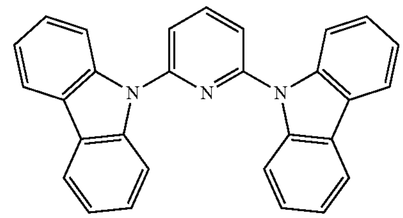

H51

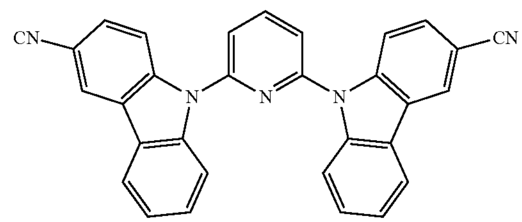

H52

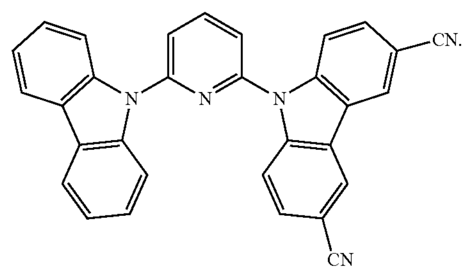

When the organic light-emitting device 10 is a full-color organic light-emitting device, the emission layer may be patterned into a red emission layer, a green emission layer, and/or a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount of the dopant may be a range of about 0.01 parts to about 15 parts by weight based on about 100 parts by weight of the host, but embodiments are not limited thereto.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Next, an electron transport region may be formed on the emission layer.

The electron transport region may include a hole blocking layer, an electron transport layer, an electron injection layer, or a combination thereof.

In some embodiments, the electron transport region may have a hole blocking layer/an electron transport layer/an electron injection layer structure or an electron transport layer/an electron injection layer structure, but embodiments are not limited thereto. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, at least one BCP, Bphen, and BAlq:

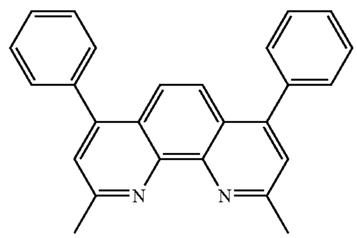

BCP

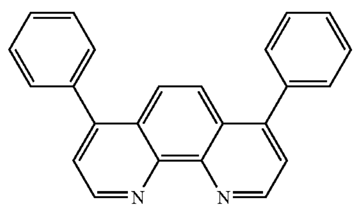

Bphen

-continued

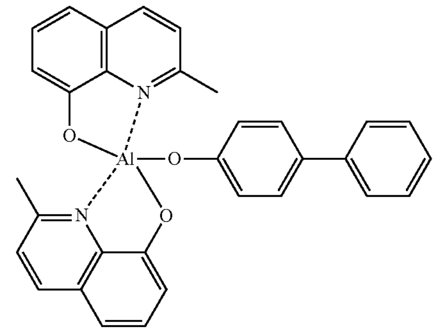

BAlq

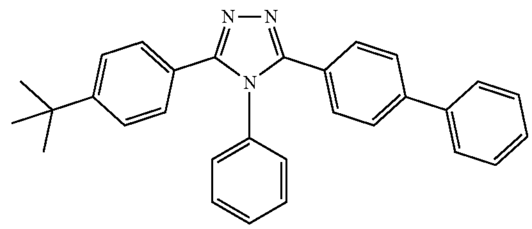

TAZ

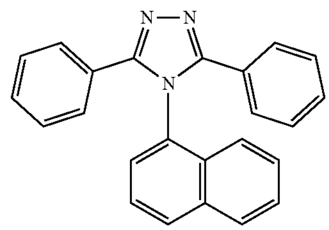

NTAZ

In some embodiments, the hole blocking layer may include the host, the material for forming an electron transport layer described herein, the material for forming an electron injection layer described herein, or any combination thereof.

The thickness of the hole blocking layer may be in a range of about 20 Å to about 1,000 Å, and in some embodiments, about 30 Å to about 600 Å. When the thickness of the hole blocking layer is within any of these ranges, excellent hole blocking characteristics may be obtained without a substantial increase in driving voltage.

The electron transport layer may include BCP, Bphen, TPBi, $Alq_3$, BAlq, TAZ, NTAZ, or any combination thereof:

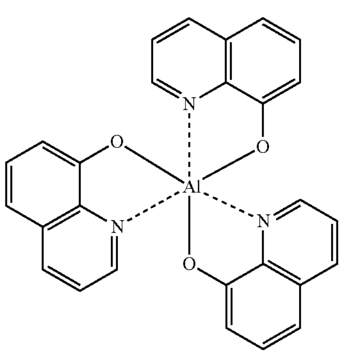

$Alq_3$

In some embodiments, the electron transport layer may include one of Compounds ET1 to ET25 or any combination thereof:

ET1

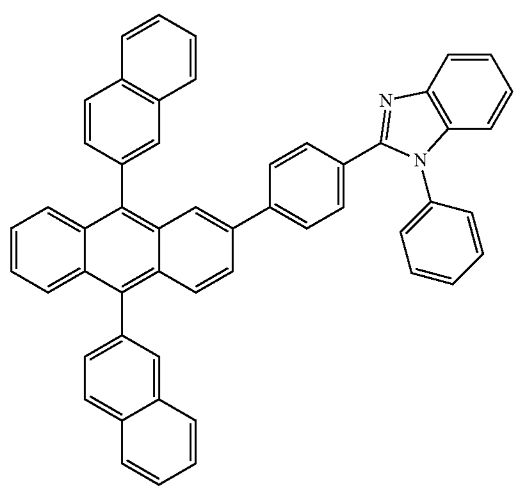

-continued
ET2
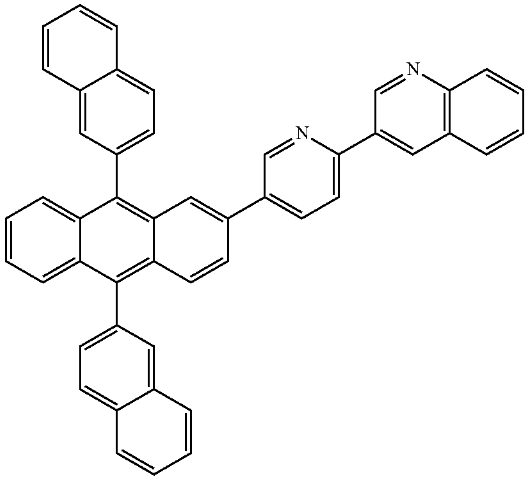
ET3
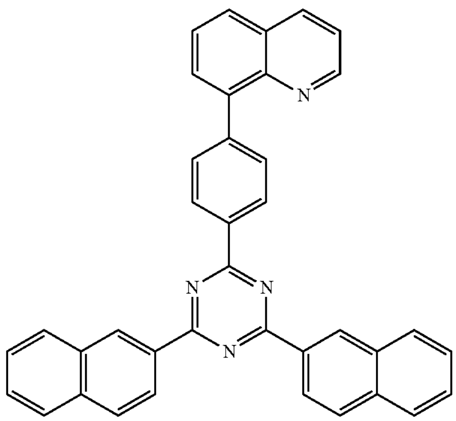
ET4
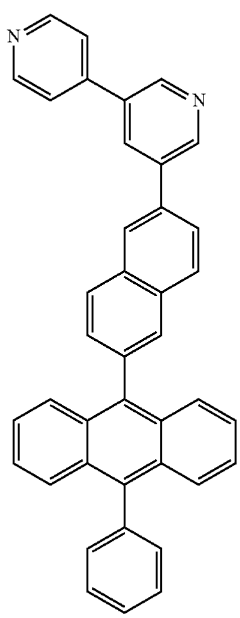
-continued
ET5
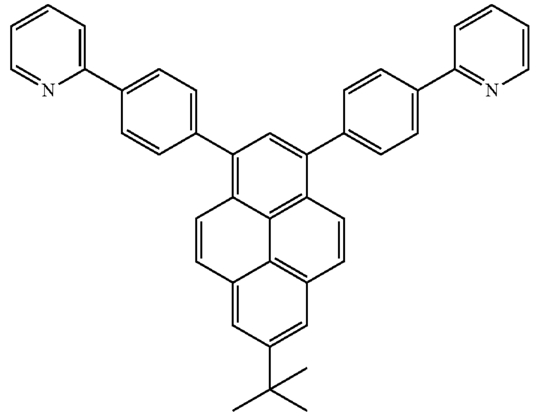
ET6
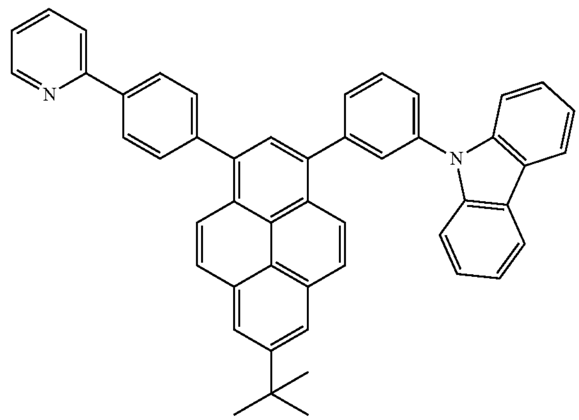
ET7
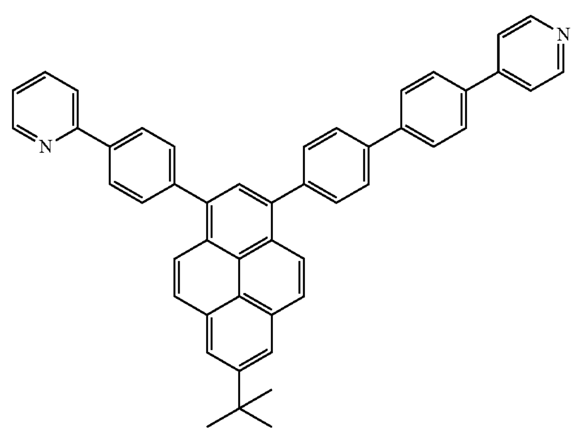

-continued
ET8
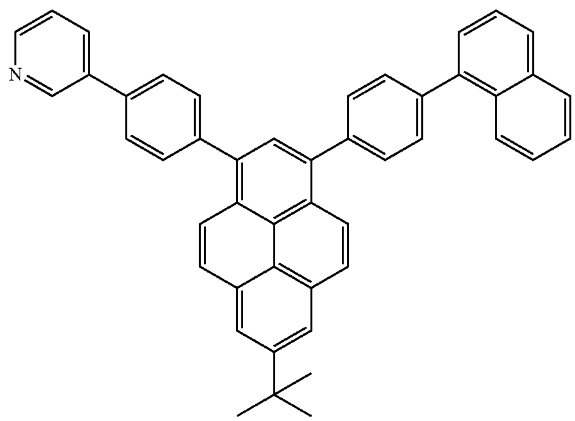
ET9
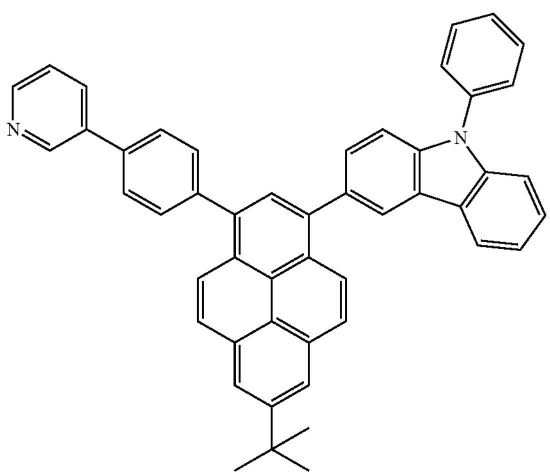
ET10
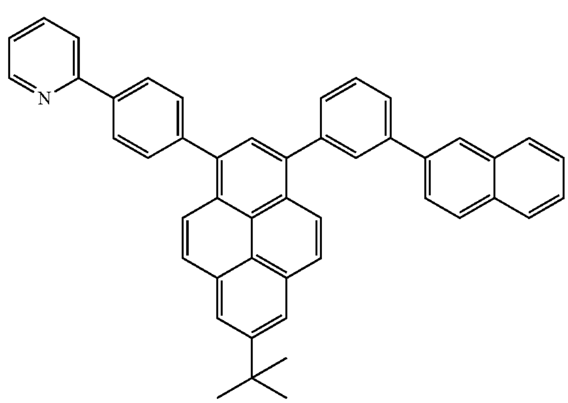
ET11
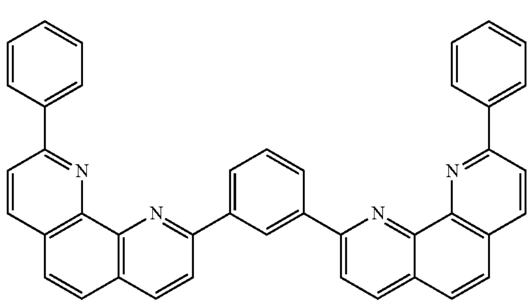
-continued
ET12
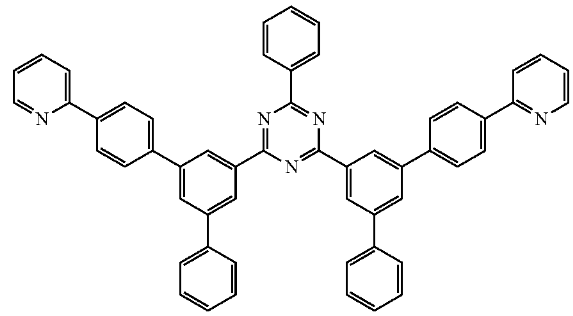
ET13
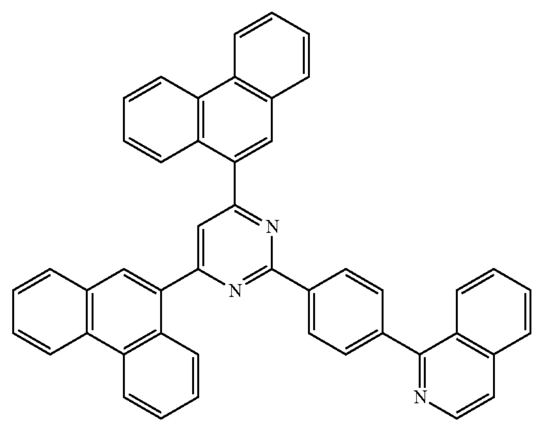
ET14
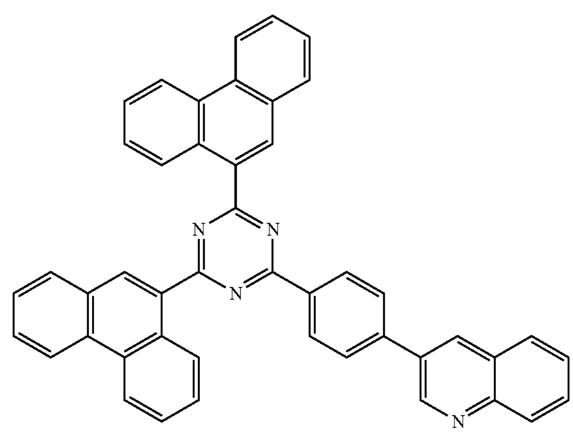
ET15
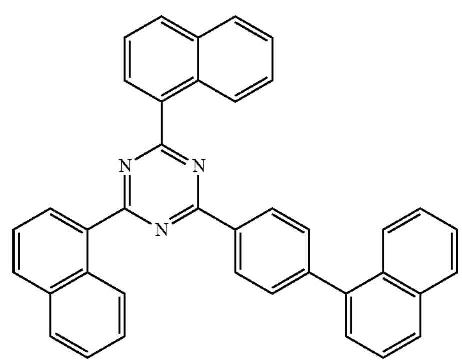

-continued
ET16
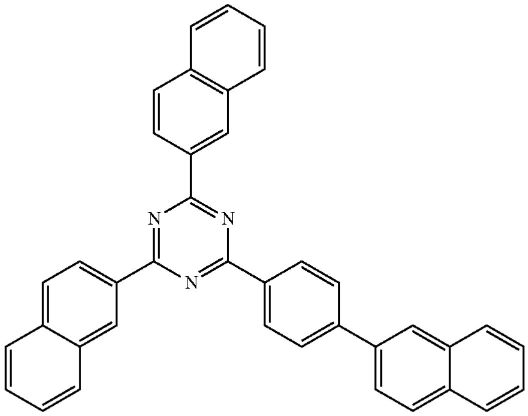
ET17
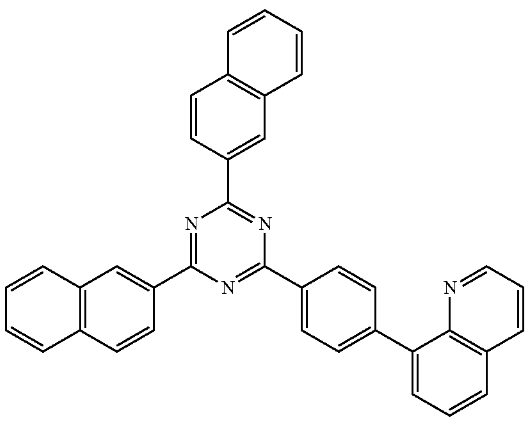
ET18
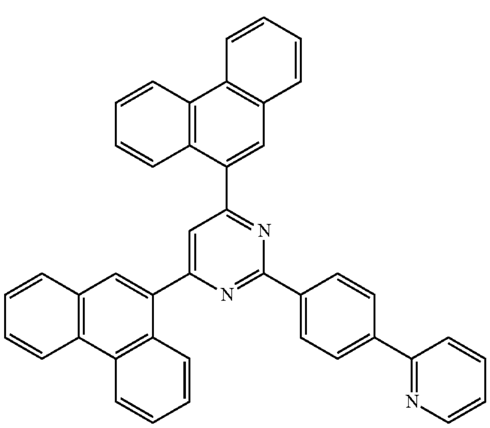
-continued
ET19
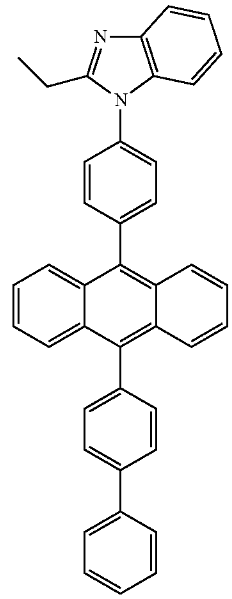
ET20
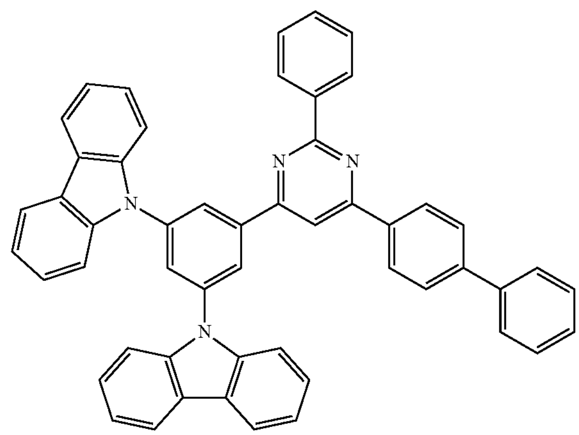
ET21
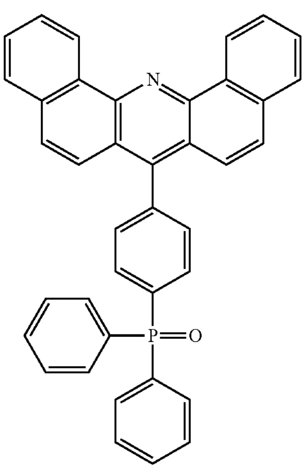

-continued

ET22

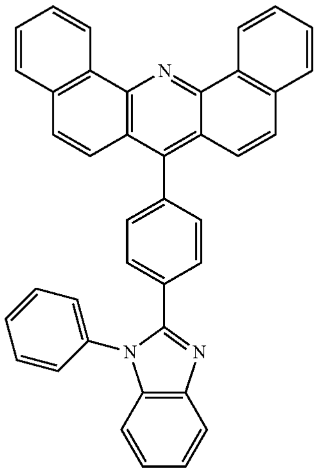

ET23

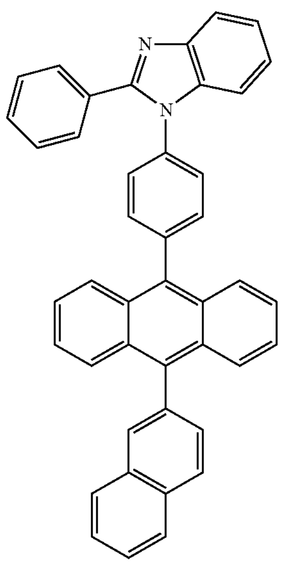

ET24

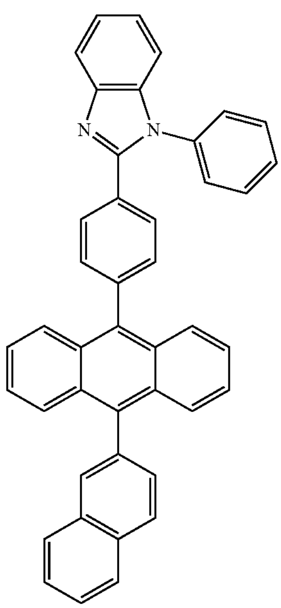

-continued

ET25

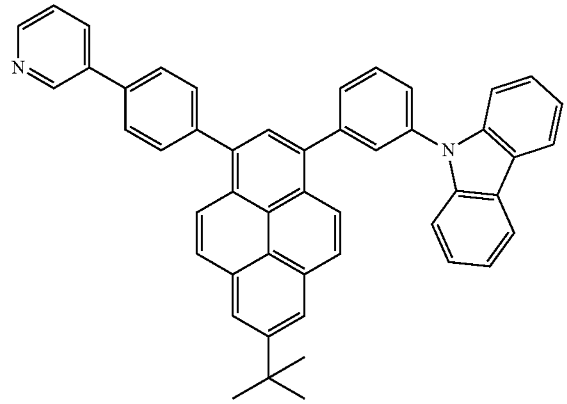

The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 or Compound ET-D2:

ET-D1

ET-D2

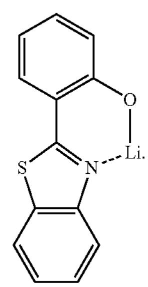

The electron transport region may include an electron injection layer that facilitates electron injection from the second electrode 19.

The electron injection layer may include LiF, NaCl, CsF, $Li_2O$, BaO, or any combination thereof.

The thickness of the electron injection layer may be in a range of about 1 Å to about 100 Å, for example, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, or any combination thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

According to another aspect, the organic light-emitting device may be included in an electronic apparatus. Thus, another aspect of the present disclosure provides an electronic apparatus including the organic light-emitting device. The electronic apparatus may include, for example, a display, an illumination, a sensor, and the like.

According to an aspect of still another embodiment, a diagnostic composition may include at least one organometallic compound represented by Formula 1.

Since the organometallic compound represented by Formula 1 provides high luminescence efficiency, the diagnostic efficiency of the diagnostic composition that includes the organometallic compound represented by Formula 1 may be excellent.

The diagnostic composition may be applied in various ways, such as in a diagnostic kit, a diagnostic reagent, a biosensor, or a biomarker.

All groups and compounds are understood to include all possible isomers, including structural isomers, occurring in the groups or compounds. Structural isomers differ from each other in the connectivity of the constituent atoms. By way of general example, and without limitation, the structural isomers of oxadiazole include 1,2,3-oxadiazole, 1,2,4-oxadiazole, 1,2,5-oxadiazole, and 1,3,4-oxadiaozole.

The term "$C_1$-$C_{60}$ alkyl group" as used herein refers to a linear or branched saturated aliphatic hydrocarbon monovalent group having 1 to 60 carbon atoms. The term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. In some embodiments, Formula 9-33 may be a branched $C_6$ alkyl group. Formula 9-33 may be a tert-butyl group substituted with two methyl groups.

The term "$C_1$-$C_{60}$ alkoxy group" as used herein refers to a monovalent group represented by —$OA_{101}$ (wherein $A_{101}$ is a $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, or a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent cyclic saturated hydrocarbon group including 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a bicyclo[1.1.1]pentyl group, a bicyclo[2.1.1]hexyl group, a bicyclo[2.2.1]heptyl group (a norbornanyl group), or a bicyclo[2.2.2]octyl group.

The term "$C_1$-$C_{10}$ heterocycloalkyl group" as used herein refers to a monovalent monocyclic group including at least one N, O, P, Si, B, Se, Ge, S, or any combination thereof as a ring-forming atom and 1 to 10 carbon atoms. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent monocyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group including at least one N, O, P, Si, B, Se, Ge, S, or any combination thereof as a ring-forming atom, 2 to 10 carbon atoms, and at least one carbon-carbon double bond in its ring. Examples of the $C_2$-$C_{10}$ heterocycloalkenyl group include a 2,3-dihydrofuranyl group and a 2,3-dihydrothiophenyl group. The term "$C_2$-$C_{10}$ heterocycloalkylene group" as used herein refers to a divalent group having the same structure as the $C_2$-$C_{10}$ heterocycloalkenyl group.

The term "unsaturated $C_1$-$C_{10}$ heterocyclic group" as used herein refers to a monovalent monocyclic group including at least one N, O, P, Si, B, Se, Ge, S, or any combination thereof as a ring-forming atom, 1 to 10 carbon atoms, and at least one heteroatom-carbon double bond, heteroatom-heteroatom double bond, or a combination thereof in its ring. Examples of the unsaturated $C_1$-$C_{10}$ heterocyclic group include an oxazine group and an imidazoline group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkyl aryl group" as used herein refers to a $C_6$-$C_{59}$ aryl group substituted with at least one $C_1$-$C_{54}$ alkyl group.

The term "$C_1$-$C_{60}$ heteroaryl group" as used herein refers to a monovalent group having a heterocyclic aromatic system having at least one N, O, P, Si, B, Se, Ge, S, or any combination thereof as a ring-forming atom and 1 to 60 carbon atoms. The term "$C_1$-$C_{60}$ heteroarylene group" as used herein refers to a divalent group having a heterocyclic aromatic system having at least one N, O, P, Si, B, Se, Ge, S, or any combination thereof as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{59}$ heteroaryl group substituted with at least one $C_1$-$C_{59}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_{60}$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a N, O, P, Si, B, Se, Ge, S, or any combination thereof and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$0_5$-$0_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, each (unsubstituted or substituted with at least one $R_{10a}$).

The term "$C_1$-$C_{30}$ heterocyclic group" as used herein refers to saturated or unsaturated cyclic group including 1 to 30 carbon atoms and at least one N, O, P, Si, B, Se, Ge, S, or any combination thereof as ring-forming atoms. The $C_1$-$C_{30}$ heterocyclic group may be a monocyclic group or a polycyclic group. Examples of the "01-030 heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a 1,3,5-triazine group, a 1,2,3-triazine group, a 1,2,4-triazine group, a quinoline group, an isoquinoline group, a quinoxaline group, a quinazoline group, a phenanthroline group, a pyrazole group, an imidazole group, a 1,2,3-triazole group, a 1,2,4-triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$).

The "deuterated $C_1$-$C_{60}$ alkyl group (or deuterated $C_1$-$C_{20}$ alkyl group or the like)", "deuterated $C_3$-$C_{10}$ cycloalkyl group", "deuterated heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. Examples of the "deuterated $C_3$-$C_{10}$ cycloalkyl group" may include Formula 10-501. The "deuterated $C_1$-$C_{60}$ alkyl group (or deuterated $C_1$-$C_{20}$ alkyl group or the like)", "deuterated $C_3$-$C_{10}$ cycloalkyl group", "deuterated heterocycloalkyl group", or "deuterated phenyl group" may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, fully deuterated heterocycloalkyl group, or fully deuterated phenyl group, in which all hydrogen atoms are substituted with deuterium atoms; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, partially deuterated heterocycloalkyl group, or partially deuterated phenyl group, in which some of hydrogen atoms are substituted with deuterium atoms.

The "($C_1$-$C_{20}$ alkyl)'X' group" refers to a 'X' group substituted with at least one $C_{20}$ alkyl group. For example, the "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

A substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted heterocycloalkyl group, the substituted $C_3$-$C_{10}$ cycloalkenyl group, the substituted $C_2$-$C_{10}$ heterocycloalkenyl group, the substituted unsaturated $C_1$-$C_{10}$ heterocyclic group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_2$-$C_{10}$ heterocycloalkenyl group, an unsaturated $C_1$-$C_{10}$ heterocyclic group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$B(Q_{36})(Q_{37})$, -$P(=O)(Q_{38})(Q_{39})$, or —$P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_1$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_2$-$C_{10}$ heterocycloalkenyl group; an unsaturated $C_1$-$C_{10}$ heterocyclic group, a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES

Synthesis Example 1 (Compound Pt-1)

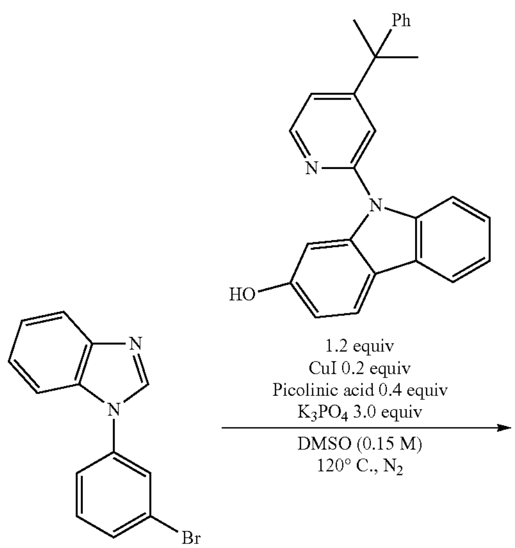

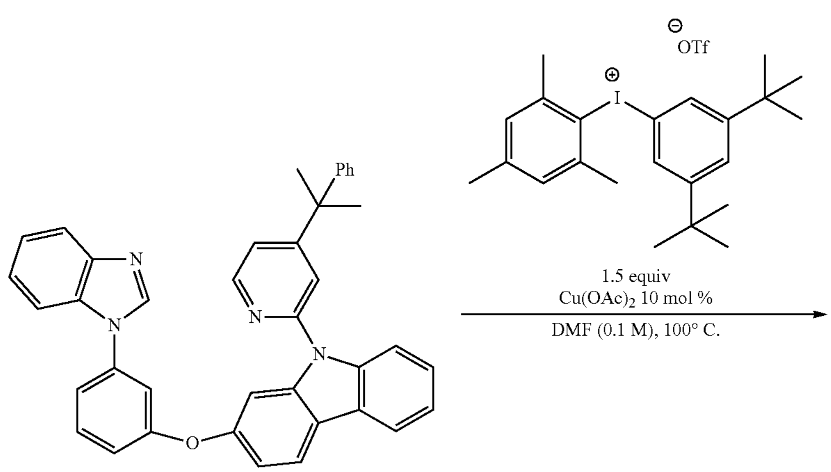

Pt-1-IM2

-continued

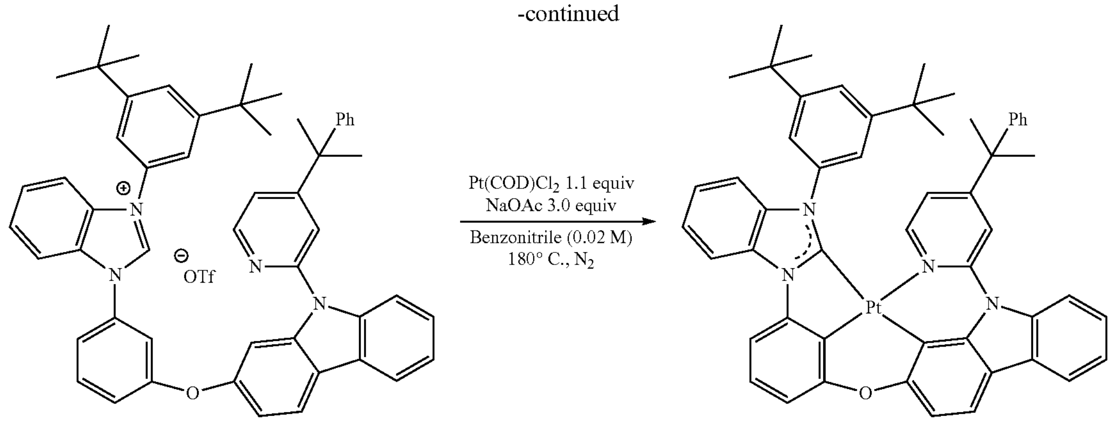

(1) Synthesis of Intermediate Pt-1-IM2

5.46 grams (g) (20 mmol) of 1-(3-bromophenyl)-1H-benzo[d]imidazole, 9.08 g (24 mmol) of 9-(4-(2-phenylpropan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of dimethyl sulfoxide (DMSO), followed by stirring at a temperature of 120° C. for 12 hours. Once the reaction was complete, the mixture was cooled to room temperature, and then, an organic layer extracted using saturated ammonium chloride ($NH_4Cl$) and ethyl acetate (EA) was dried with anhydrous magnesium sulfate ($MgSO_4$) and subjected to filtration, followed by concentration under reduced pressure. The resulting product was subjected to silica gel column chromatography to thereby obtain 7.42 g (13 mmol) of Intermediate Pt-1-1M2 (yield: 65%).

LC-MS (calculated value: 570.24 g/mol, measured value: M+1=571 g/mol)

(2) Synthesis of Intermediate Pt-1-IM1

7.42 g (13 mmol) of Intermediate Pt-1-IM2, 11.40 g (19.5 mmol) of (3,5-di-tert-butylphenyl)(mesityl)iodonium triflate, and 0.24 g (1.3 mmol) of copper (II) acetate were mixed with 130 mL of N,N-dimethylformamide (DMF), followed by stirring at a temperature of 100° C. for 4 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 10.05 g (11.05 mmol) of Intermediate Pt-1-IM1 (yield: 85%).

LC-MS (calculated value: 759.41 g/mol, measured value: M+1=759 g/mol)

(3) Synthesis of Compound Pt-1

5.00 g (5.50 mmol) of Intermediate Pt-1-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.88 g (3.03 mmol) of Compound Pt-1 (yield: 55%).

LC-MS (calculated value: 951.35 g/mol, measured value: M+1=952 g/mol)

Synthesis Example 2 (Compound Pt-2)

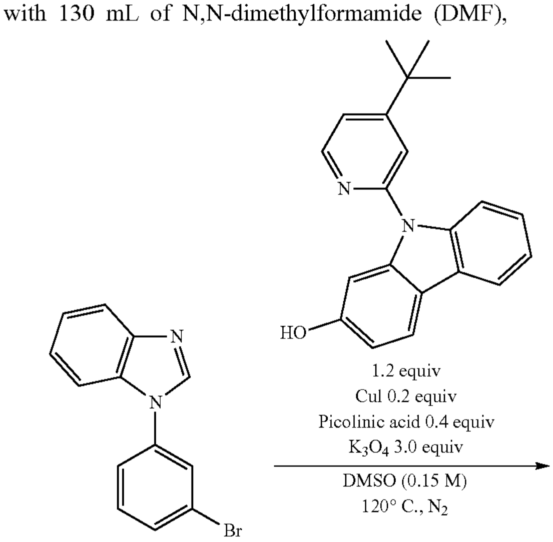

-continued

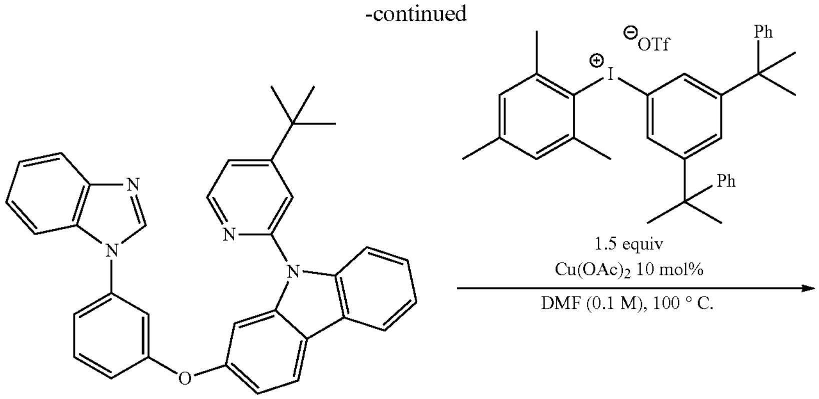

Pt-2-IM2

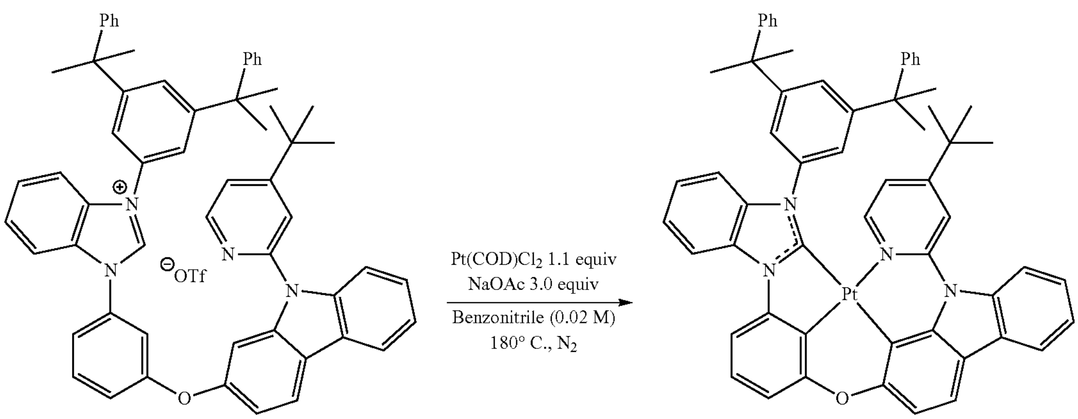

Pt-2-IM1

Pt-2

(1) Synthesis of Intermediate Pt-2-IM2

5.46 g (20 mmol) of 1-(3-bromophenyl)-1H-benzo[d]imidazole, 7.59 g (24 mmol) of 9-(4-(tert-butyl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours.

Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 6.92 g (13.60 mmol) of Intermediate Pt-2-IM2 (yield: 68%).

LC-MS (calculated value: 508.23 g/mol, measured value: M+1=509 g/mol)

(2) Synthesis of Intermediate Pt-2-IM1

6.92 g (13.60 mmol) of Intermediate Pt-2-IM2, 14.45 g (20.40 mmol) of (3,5-bis(2-phenylpropan-2-yl)phenyl)(mesityl)iodonium triflate, and 0.25 g (1.36 mmol) of copper (II) acetate were mixed with 136 mL of DMF, followed by stirring at a temperature of 100° C. for 4 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 11.09 g (11.42 mmol) of Intermediate Pt-2-IM1 (yield: 84%).

LC-MS (calculated value: 821.42 g/mol, measured value: M+1=821 g/mol)

(3) Synthesis of Compound Pt-2

5.34 g (5.50 mmol) of Intermediate Pt-2-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.96 g (2.92 mmol) of Compound Pt-2 (yield: 53%).

LC-MS (calculated value: 1013.36 g/mol, measured value: M+1=1014 g/mol)

Synthesis Example 3 (Compound Pt-3)

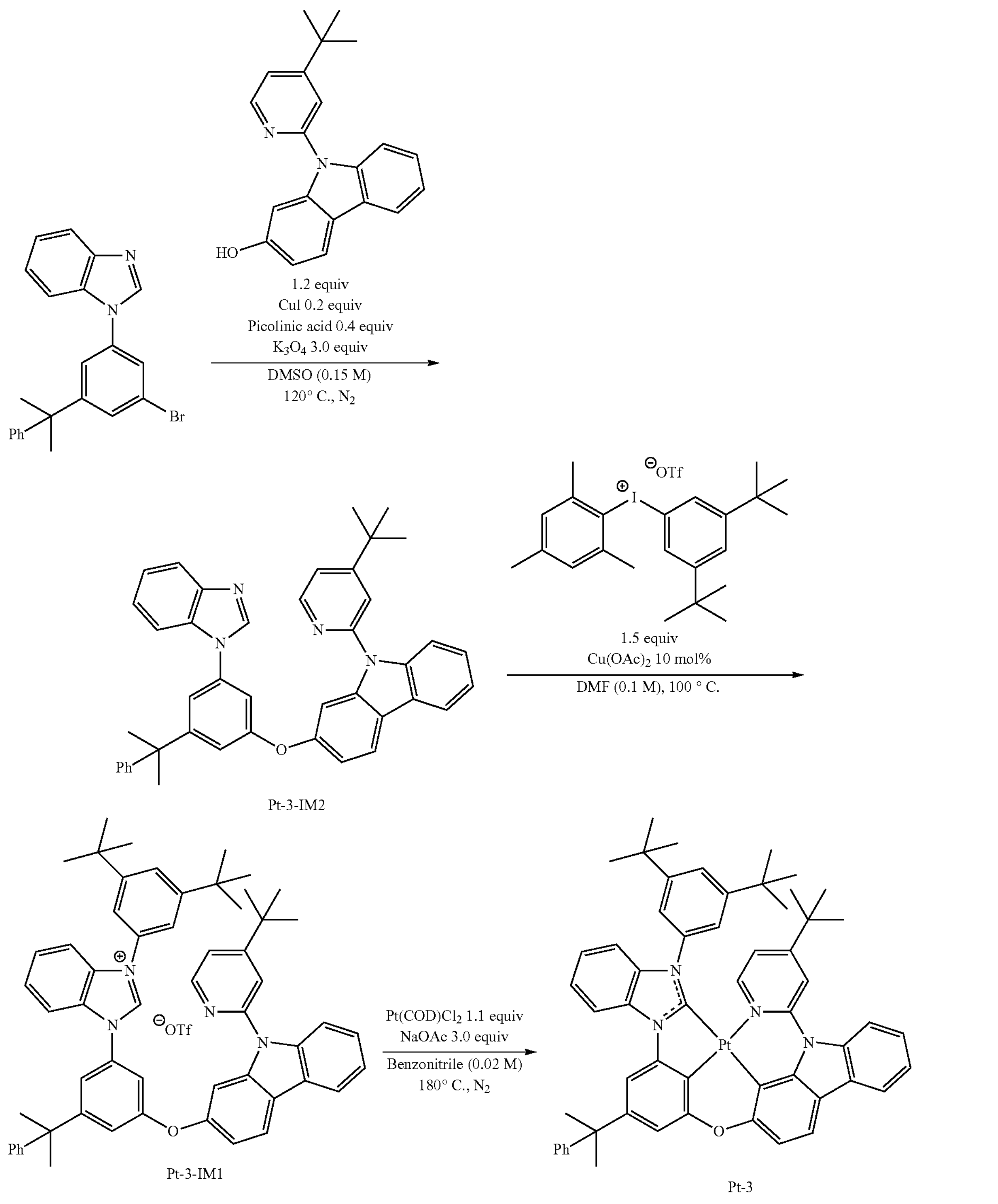

(1) Synthesis of Intermediate Pt-3-IM2

7.83 g (20 mmol) of 1-(3-bromo-5-(2-phenylpropan-2-yl)phenyl)-1H-benzo[d]imidazole, 7.59 g (24 mmol) of 9-(4-(tert-butyl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 7.77 g (12.40 mmol) of Intermediate Pt-3-IM2 (yield: 62%).

LC-MS (calculated value: 626.31 g/mol, measured value: M+1=627 g/mol)

(2) Synthesis of Intermediate Pt-3-IM1

7.77 g (12.40 mmol) of Intermediate Pt-3-IM2, 10.87 g (18.60 mmol) of (3,5-di-tert-butylphenyl)(mesityl)iodonium triflate, and 0.23 g (1.24 mmol) of copper (II) acetate were mixed with 124 mL of DMF, followed by stirring at a temperature of 100° C. for 4 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 11.09 g (11.42 mmol) of Intermediate Pt-3-IM1 (yield: 84%).

LC-MS (calculated value: 815.47 g/mol, measured value: M+1=816 g/mol)

(3) Synthesis of Compound Pt-3

5.31 g (5.50 mmol) of Intermediate Pt-3-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.94 g (2.92 mmol) of Compound Pt-3 (yield: 53%).

LC-MS (calculated value: 1007.41 g/mol, measured value: M+1=1008 g/mol)

Synthesis Example 4 (Compound Pt-4)

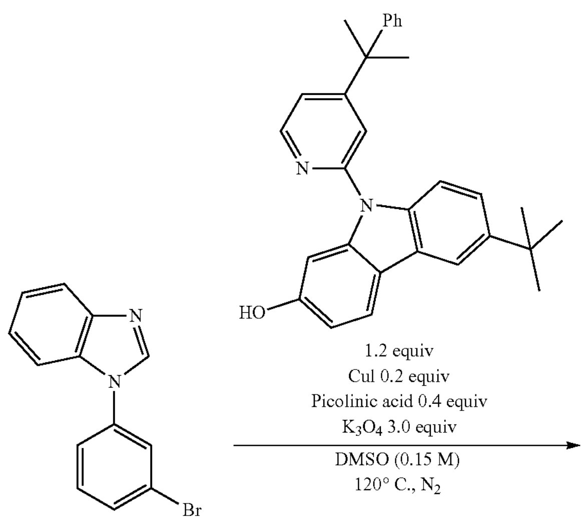

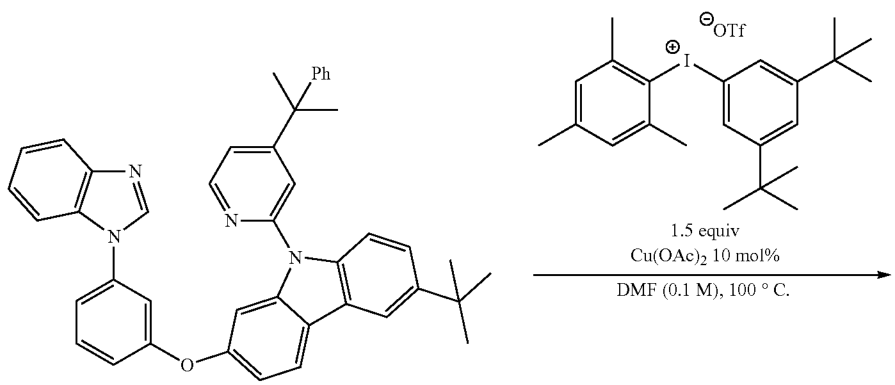

Pt-4-IM2

-continued

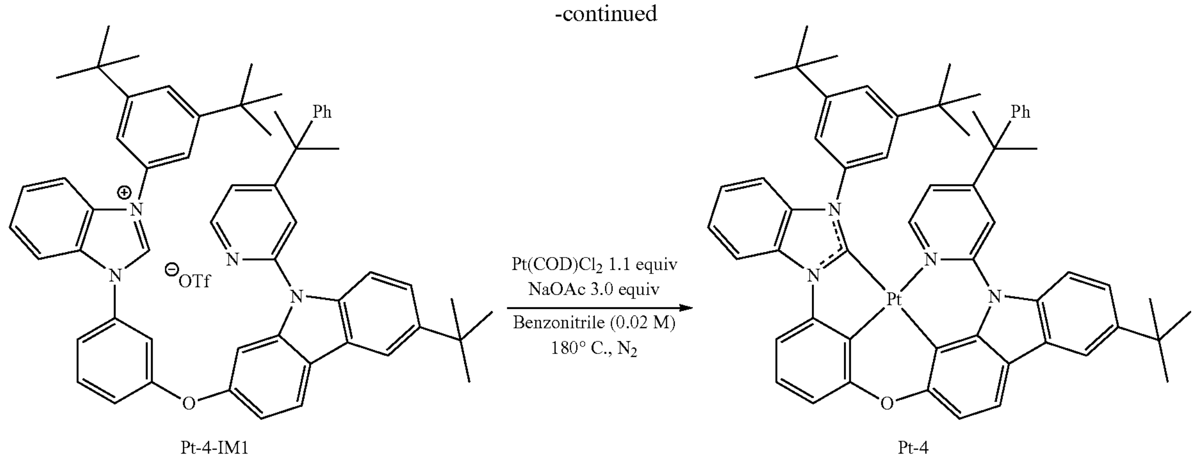

(1) Synthesis of Intermediate Pt-4-IM2

5.46 g (20 mmol) of 1-(3-bromophenyl)-1H-benzo[d]imidazole, 10.43 g (24 mmol) of 6-(tert-butyl)-9-(4-(2-phenylpropan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 8.40 g (13.40 mmol) of Intermediate Pt-4-IM2 (yield: 67%).

LC-MS (calculated value: 626.31 g/mol, measured value: M+1=627 g/mol)

(2) Synthesis of Intermediate Pt-4-IM1

8.40 g (13.40 mmol) of Intermediate Pt-4-IM2, 11.75 g (20.10 mmol) of (3,5-di-tert-butylphenyl)(mesityl)iodonium triflate, and 0.24 g (1.34 mmol) of copper (II) acetate were mixed with 124 mL of DMF, followed by stirring at a temperature of 100° C. for 4 hours.

Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 11.09 g (11.42 mmol) of Intermediate Pt-4-IM1 (yield: 84%).

LC-MS (calculated value: 815.47 g/mol, measured value: M+1=816 g/mol)

(3) Synthesis of Compound Pt-4

5.31 g (5.50 mmol) of Intermediate Pt-4-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.94 g (2.92 mmol) of Compound Pt-4 (yield: 53%).

LC-MS (calculated value: 1007.41 g/mol, measured value: M+1=1008 g/mol) Synthesis Example 5 (Compound Pt-5)

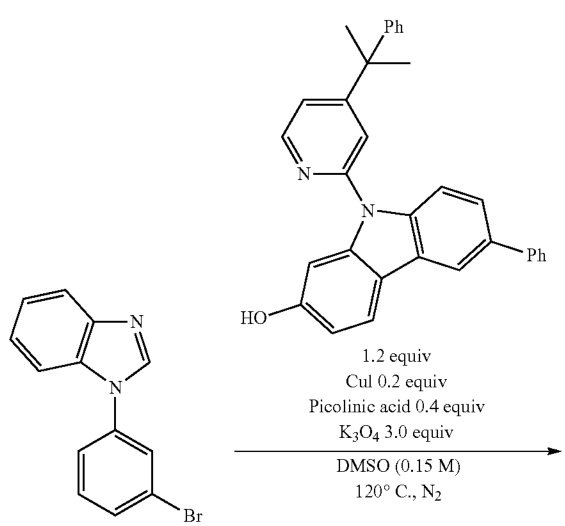

-continued

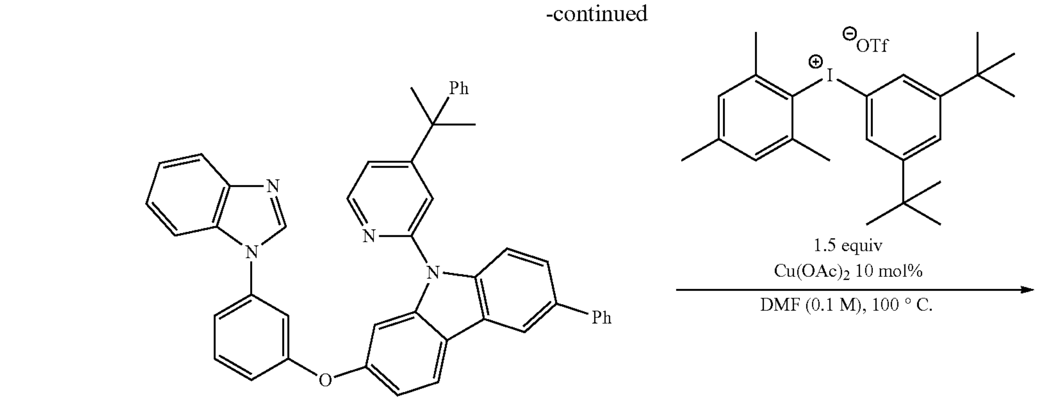

Pt-5-IM2

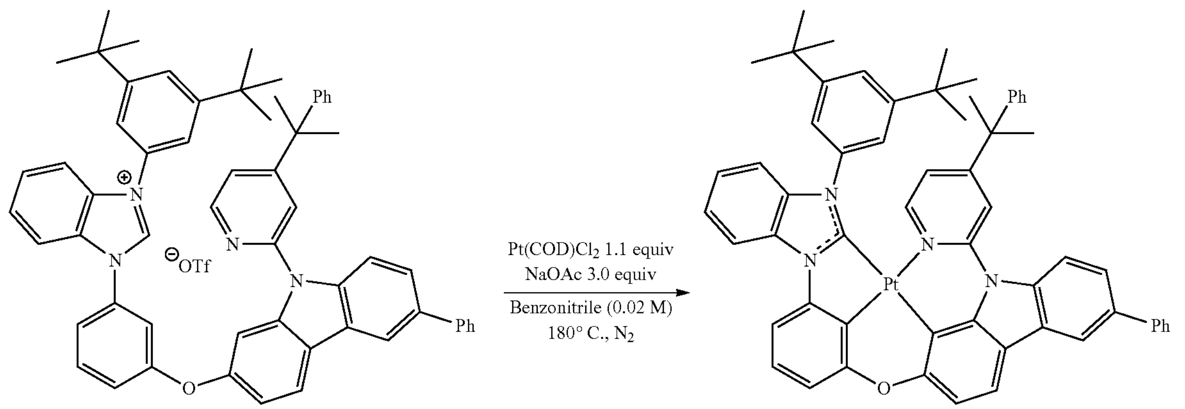

Pt-5-IM1

Pt-5

(1) Synthesis of Intermediate Pt-5-IM2

5.46 g (20 mmol) of 1-(3-bromophenyl)-1H-benzo[d]imidazole, 10.91 g (24 mmol) of 6-phenyl-9-(4-(2-phenylpropan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 6.86 g (10.60 mmol) of Intermediate Pt-5-IM2 (yield: 53%).

LC-MS (calculated value: 646.27 g/mol, measured value: M+1=647 g/mol)

(2) Synthesis of Intermediate Pt-5-IM1

6.86 g (10.60 mmol) of Intermediate Pt-5-IM2, 9.29 g (15.90 mmol) of (3,5-di-tert-butylphenyl)(mesityl)iodonium triflate, and 0.19 g (1.06 mmol) of copper (II) acetate were mixed with 106 mL of DMF, followed by stirring at a temperature of 100° C. for 4 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 8.56 g (8.69 mmol) of Intermediate Pt-5-IM1 (yield: 82%).

LC-MS (calculated value: 835.44 g/mol, measured value: M+1=836 g/mol)

(3) Synthesis of Compound Pt-5

5.42 g (5.50 mmol) of Intermediate Pt-5-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 3.11 g (3.03 mmol) of Compound Pt-5 (yield: 55%).

LC-MS (calculated value: 1027.38 g/mol, measured value: M+1=1028 g/mol)

Synthesis Example 6 (Compound Pt-6)

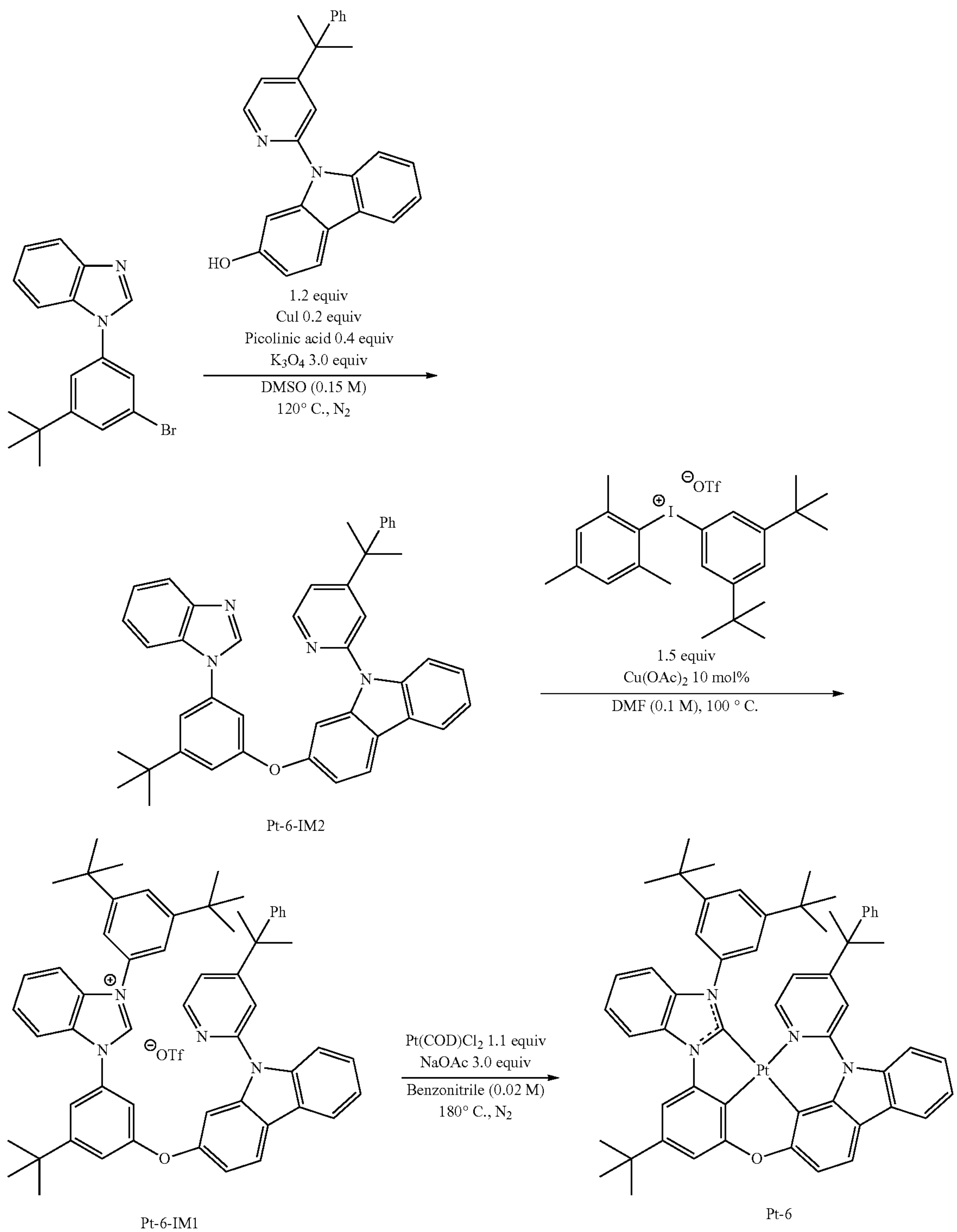

(1) Synthesis of Intermediate Pt-6-IM2

6.58 g (20 mmol) of 1-(3-bromo-5-(tert-butyl)phenyl)-1H-benzo[d]imidazole, 9.08 g (24 mmol) of 9-(4-(2-phenyl-propan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 6.64 g (10.60 mmol) of Intermediate Pt-6-IM2 (yield: 53%).

LC-MS (calculated value: 626.31 g/mol, measured value: M+1=627 g/mol)

(2) Synthesis of Intermediate Pt-6-IM1

6.64 g (10.60 mmol) of Intermediate Pt-6-IM2, 9.29 g (15.90 mmol) of (3,5-di-tert-butylphenyl)(mesityl)iodonium triflate, and 0.19 g (1.06 mmol) of copper (II) acetate were mixed with 106 mL of DMF, followed by stirring at a temperature of 100° C. for 4 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 8.29 g (8.59 mmol) of Intermediate Pt-6-IM1 (yield: 81%).

LC-MS (calculated value: 815.47 g/mol, measured value: M+1=816 g/mol)

(3) Synthesis of Compound Pt-6

5.31 g (5.50 mmol) of Intermediate Pt-6-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 3.33 g (3.30 mmol) of Compound Pt-6 (yield: 60%).

LC-MS (calculated value: 1007.41 g/mol, measured value: M+1=1008 g/mol)

Synthesis Example 7 (Compound Pt-7)

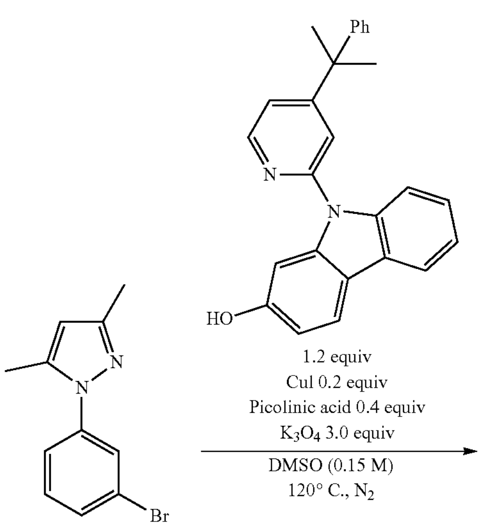

-continued

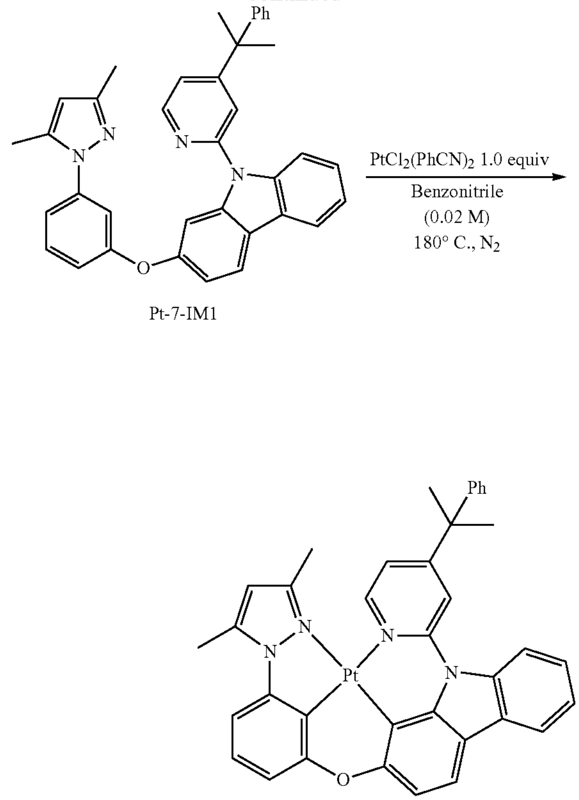

Pt-7

(1) Synthesis of Intermediate Pt-7-IM1

5.02 g (20 mmol) of 1-(3-bromophenyl)-3,5-dimethyl-1H-pyrazole, 9.08 g (24 mmol) of 9-phenyl-9-(4-(2-phenylpropan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 6.04 g (11.00 mmol) of Intermediate Pt-7-IM1 (yield: 55%).

LC-MS (calculated value: 548.26 g/mol, measured value: M+1=549 g/mol)

(2) Synthesis of Compound Pt-7

3.02 g (5.50 mmol) of Intermediate Pt-7-IM1 and 2.11 g (6.05 mmol) of $PtCl_2(PhCN)_2$ were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.24 g (3.03 mmol) of Compound Pt-7 (yield: 55%).

LC-MS (calculated value: 741.21 g/mol, measured value: M+1=742 g/mol)

Synthesis Example 8 (Compound Pt-8)

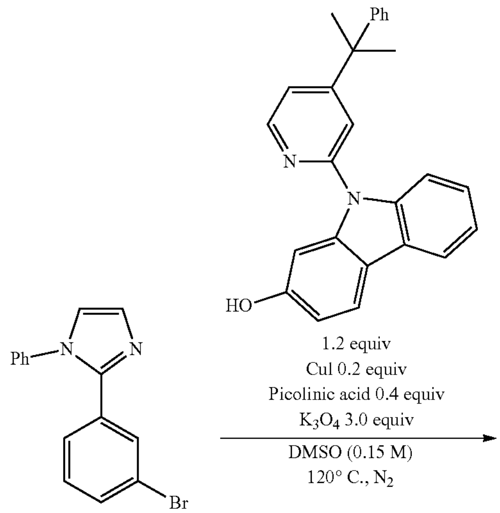

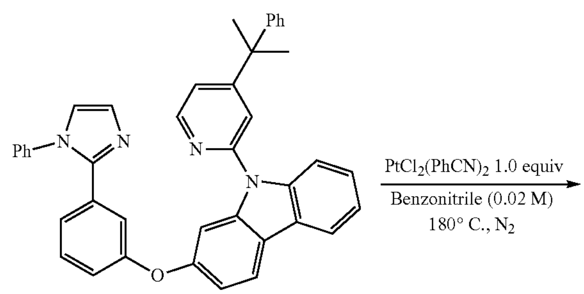

Pt-8-IM1

-continued

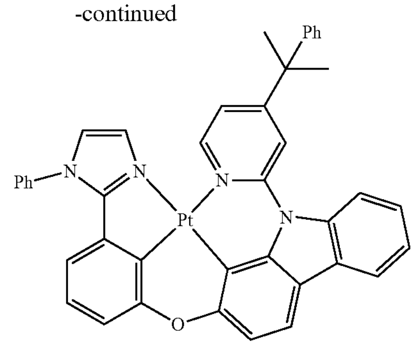

Pt-8

(1) Synthesis of Intermediate Pt-8-IM1

5.98 g (20 mmol) of 2-(3-bromophenyl)-1-phenyl-1H-imidazole, 9.08 g (24 mmol) of 9-phenyl-9-(4-(2-phenylpropan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 5.85 g (9.80 mmol) of Intermediate Pt-8-IM1 (yield: 49%).

LC-MS (calculated value: 596.26 g/mol, measured value: M+1=597 g/mol)

(2) Synthesis of Compound Pt-8

3.28 g (5.50 mmol) of Intermediate Pt-8-IM1 and 2.11 g (6.05 mmol) of $PtCl_2(PhCN)_2$ were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.43 g (3.08 mmol) of Compound Pt-8 (yield: 56%).

LC-MS (calculated value: 789.21 g/mol, measured value: M+1=790 g/mol)

Synthesis Example 9 (Compound Pt-9)

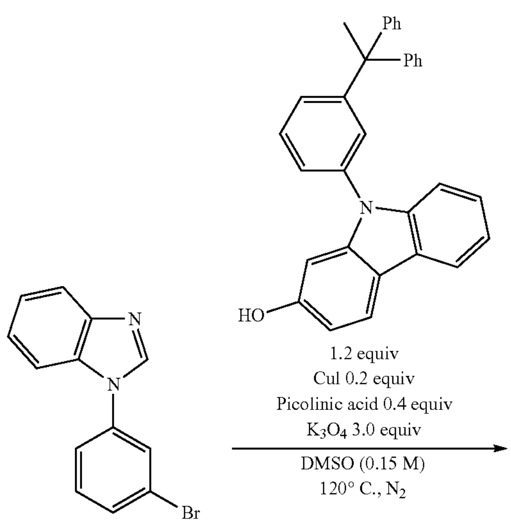

-continued

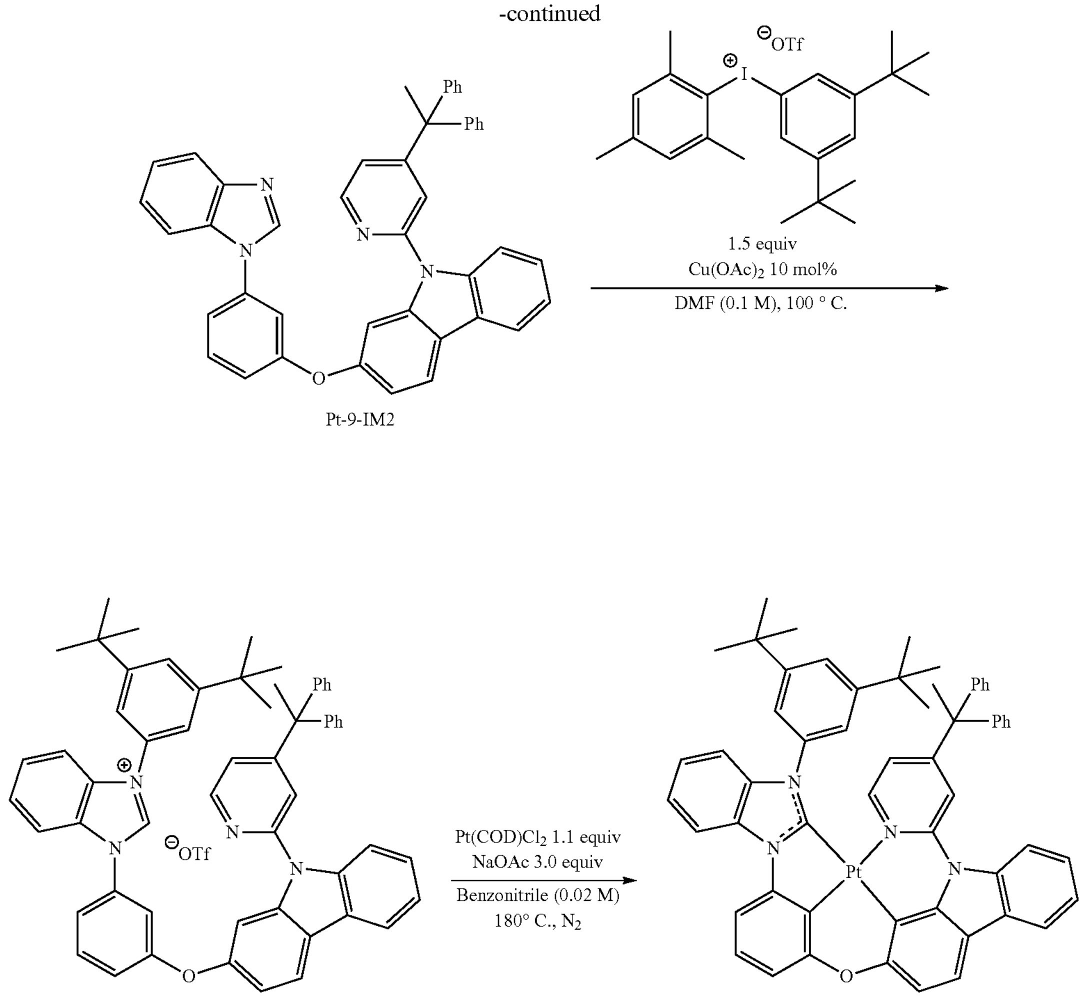

Pt-9-IM2

Pt-9-IM1

Pt-9

(1) Synthesis of Intermediate Pt-9-IM2

5.46 g (20 mmol) of 1-(3-bromophenyl)-1H-benzo[d]imidazole, 10.56 g (24 mmol) of 9-(4-(1,1-diphenylethyl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 6.70 g (10.60 mmol) of Intermediate Pt-9-IM2 (yield: 53%).

LC-MS (calculated value: 632.26 g/mol, measured value: M+1=633 g/mol)

(2) Synthesis of Intermediate Pt-9-IM1

6.86 g (10.60 mmol) of Intermediate Pt-9-IM2, 9.29 g (15.90 mmol) of (3,5-di-tert-butylphenyl)(mesityl)iodonium triflate, and 0.19 g (1.06 mmol) of copper (II) acetate were mixed with 106 mL of DMF, followed by stirring at a temperature of 100° C. for 4 hours.

Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 8.43 g (8.69 mmol) of Intermediate Pt-9-IM1 (yield: 82%).

LC-MS (calculated value: 821.44 g/mol, measured value: M+1=821 g/mol)

(3) Synthesis of Compound Pt-9

5.34 g (5.50 mmol) of Intermediate Pt-9-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 3.07 g (3.03 mmol) of Compound Pt-9 (yield: 55%).

LC-MS (calculated value: 1013.36 g/mol, measured value: M+1=1014 g/mol)

Synthesis Example 10 (Compound Pt-10)

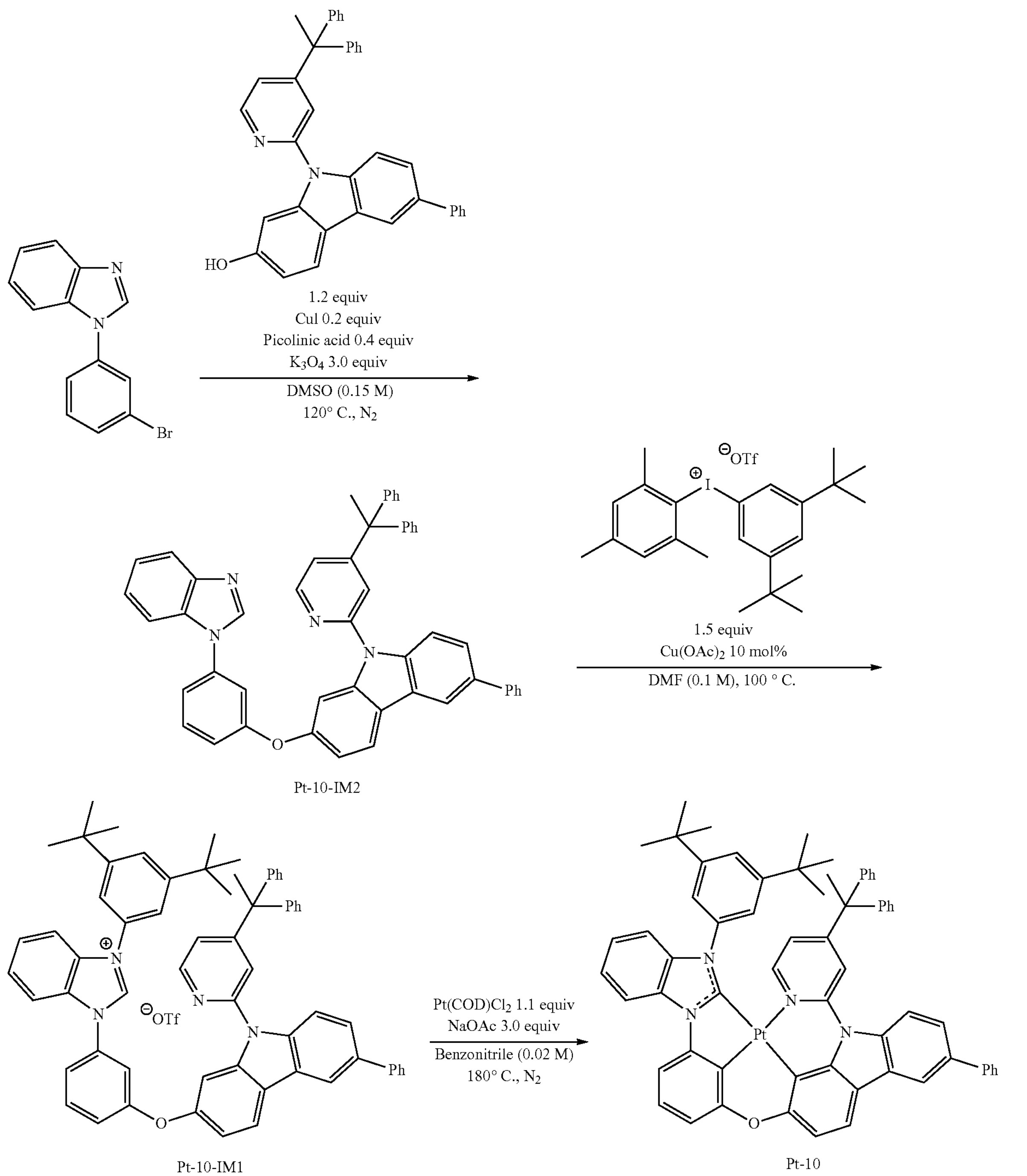

(1) Synthesis of Intermediate Pt-10-IM2

5.46 g (20 mmol) of 1-(3-bromophenyl)-1H-benzo[d]imidazole, 12.39 g (24 mmol) of 9-(4-(1,1-diphenylethyl)pyridin-2-yl)-6-phenyl-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 7.08 g (10.00 mmol) of Intermediate Pt-10-IM2 (yield: 50%).

LC-MS (calculated value: 708.29 g/mol, measured value: M+1=709 g/mol)

(2) Synthesis of Intermediate Pt-10-IM1

7.08 g (10.00 mmol) of Intermediate Pt-10-IM2, 8.76 g (15.00 mmol) of (3,5-di-tert-butylphenyl)(mesityl)iodonium triflate, and 0.19 g (1.00 mmol) of copper (II) acetate were mixed with 100 mL of DMF, followed by stirring at a temperature of 100° C. for 4 hours.

Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 8.37 g (8.00 mmol) of Intermediate Pt-10-IM1 (yield: 80%).

LC-MS (calculated value: 897.45 g/mol, measured value: M+1=898 g/mol)

(3) Synthesis of Compound Pt-10

5.76 g (5.50 mmol) of Intermediate Pt-10-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 3.06 g (2.81 mmol) of Compound Pt-10 (yield: 51%).

LC-MS (calculated value: 1089.40 g/mol, measured value: M+1=1090 g/mol)

Synthesis Example 11 (Compound Pt-13)

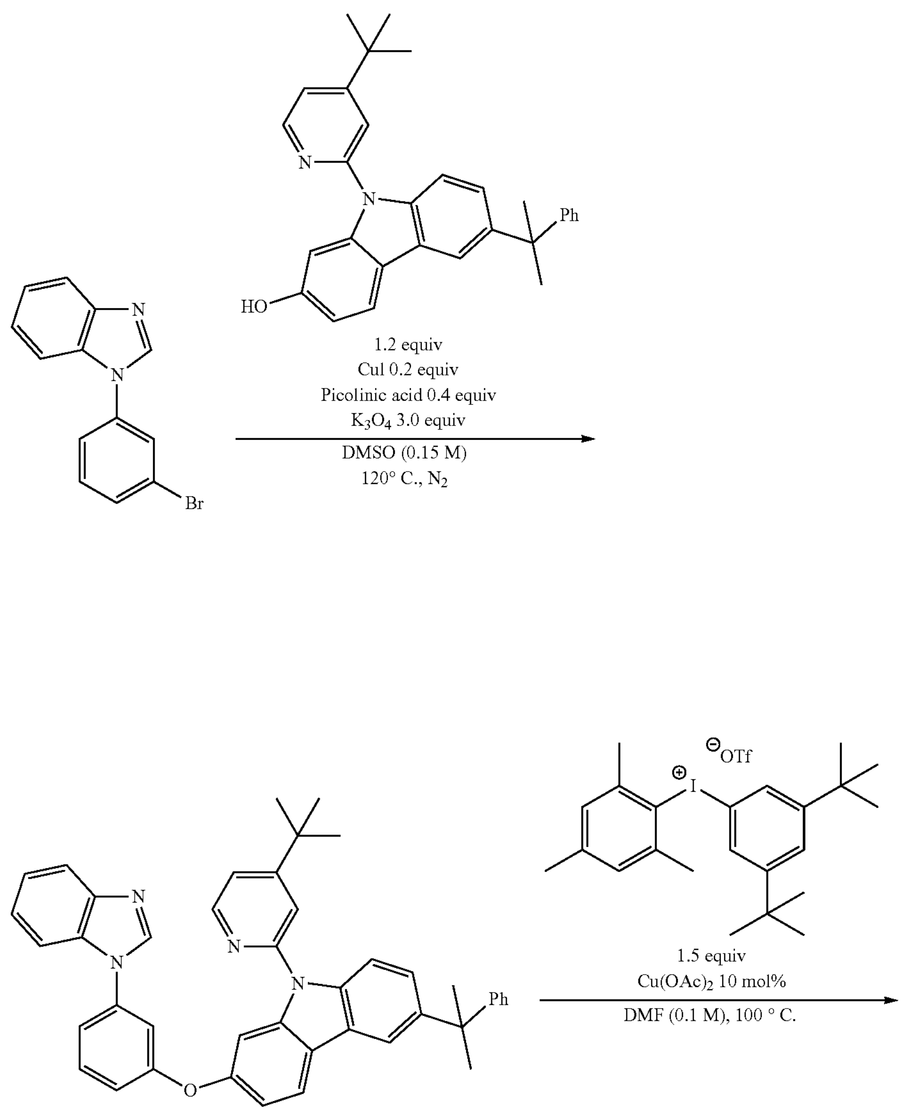

Pt-13-IM2

-continued

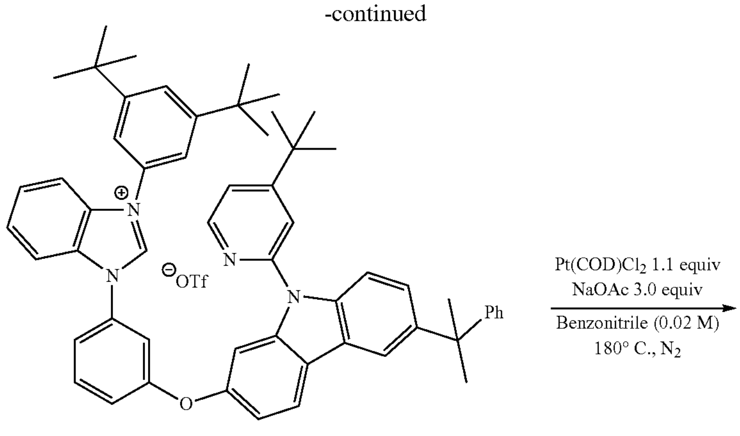

Pt-13-IM1

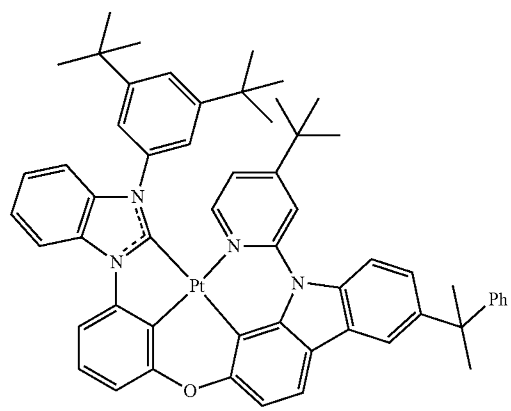

Pt-13

(1) Synthesis of Intermediate Pt-13-IM2

5.46 g (20 mmol) of 1-(3-bromophenyl)-1H-benzo[d] imidazole, 10.42 g (24 mmol) of 9-(4-(tert-butyppyridin-2-yl)-6-(2-phenylpropan-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 6.89 g (11.00 mmol) of Intermediate Pt-13-IM2 (yield: 55%).

LC-MS (calculated value: 626.31 g/mol, measured value: M+1=627 g/mol)

(2) Synthesis of Intermediate Pt-13-IM1

6.89 g (11.00 mmol) of Intermediate Pt-13-IM2, 9.64 g (16.50 mmol) of (3,5-di-tert-butylphenyl)(mesityl)iodonium triflate, and 0.20 g (1.10 mmol) of copper (II) acetate were mixed with 110 mL of DMF, followed by stirring at a temperature of 100° C. for 4 hours.

Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 8.49 g (8.80 mmol) of Intermediate Pt-13-IM1 (yield: 80%).

LC-MS (calculated value: 815.47 g/mol, measured value: M+1=816 g/mol)

(3) Synthesis of Compound Pt-13

5.30 g (5.50 mmol) of Intermediate Pt-13-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.83 g (2.81 mmol) of Compound Pt-13 (yield: 51%).

LC-MS (calculated value: 1007.41 g/mol, measured value: M+1=1008 g/mol)

Synthesis Example 12 (Compound Pt-17)
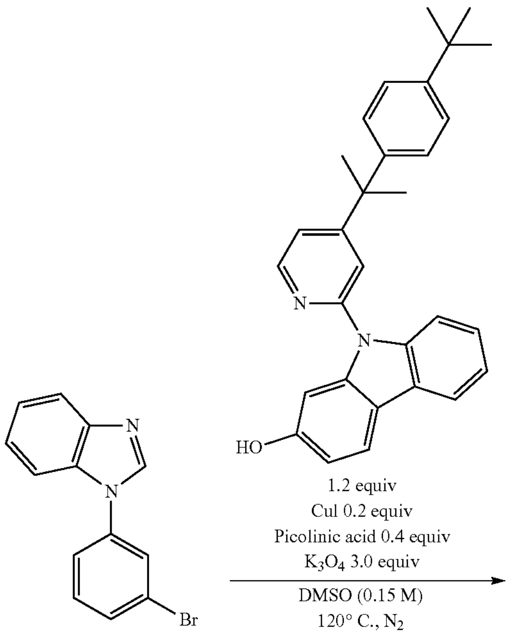
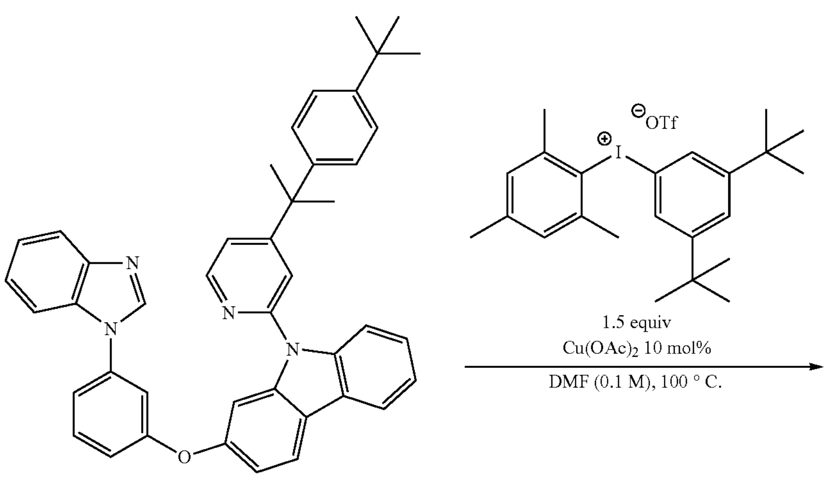
Pt-17-IM2

-continued

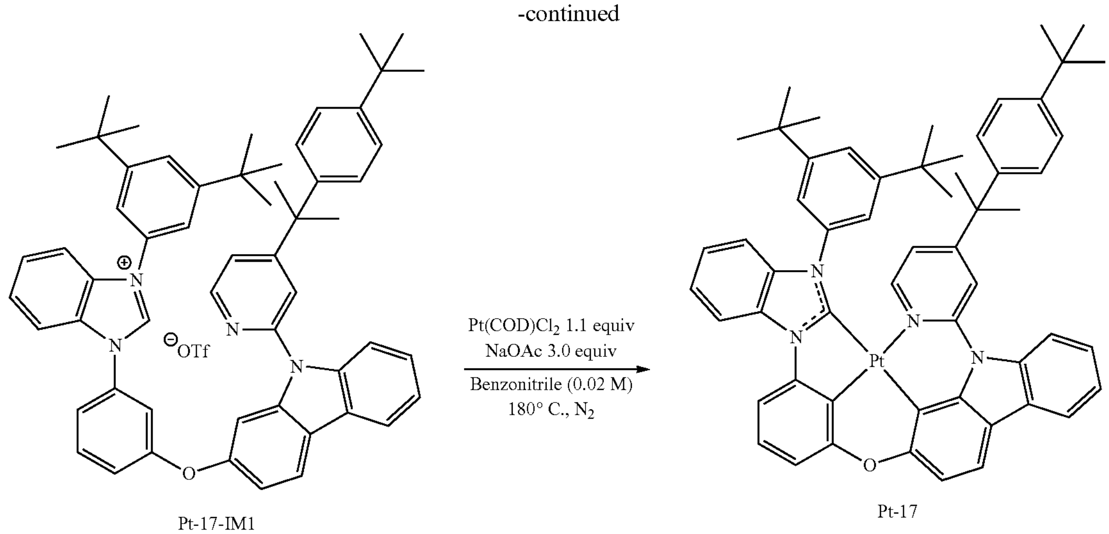

(1) Synthesis of Intermediate Pt-17-IM2

5.46 g (20 mmol) of 1-(3-bromophenyl)-1H-benzo[d]imidazole, 10.42 g (24 mmol) of 9-(4-(2-(4-(tert-butyl)phenyl)propan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 6.89 g (11.00 mmol) of Intermediate Pt-17-IM2 (yield: 55%).

LC-MS (calculated value: 626.31 g/mol, measured value: M+1=627 g/mol)

(2) Synthesis of Intermediate Pt-17-IM1

6.89 g (11.00 mmol) of Intermediate Pt-17-IM2, 9.64 g (16.50 mmol) of (3,5-di-tert-butylphenyl)(mesityl)iodonium triflate, and 0.20 g (1.10 mmol) of copper (II) acetate were mixed with 110 mL of DMF, followed by stirring at a temperature of 100° C. for 4 hours.

Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 8.49 g (8.80 mmol) of Intermediate Pt-17-IM1 (yield: 80%).

LC-MS (calculated value: 815.47 g/mol, measured value: M+1=816 g/mol)

(3) Synthesis of Compound Pt-17

5.30 g (5.50 mmol) of Intermediate Pt-17-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 2.94 g (2.92 mmol) of Compound Pt-17 (yield: 53%).

LC-MS (calculated value: 1007.41 g/mol, measured value: M+1=1008 g/mol)

Synthesis Example 13 (Compound Pt-18)
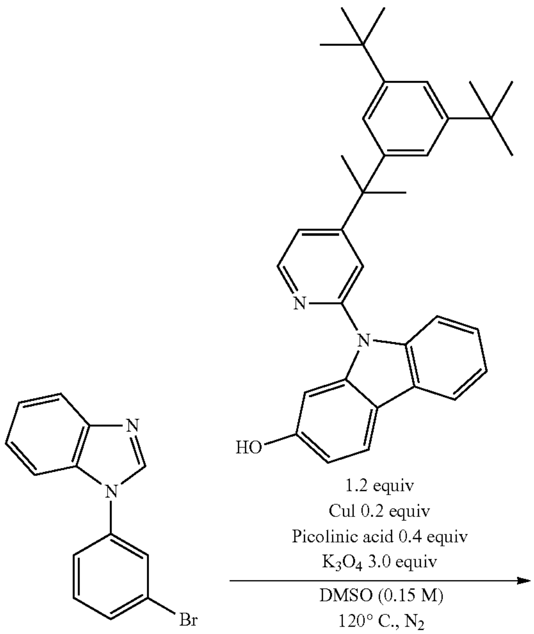
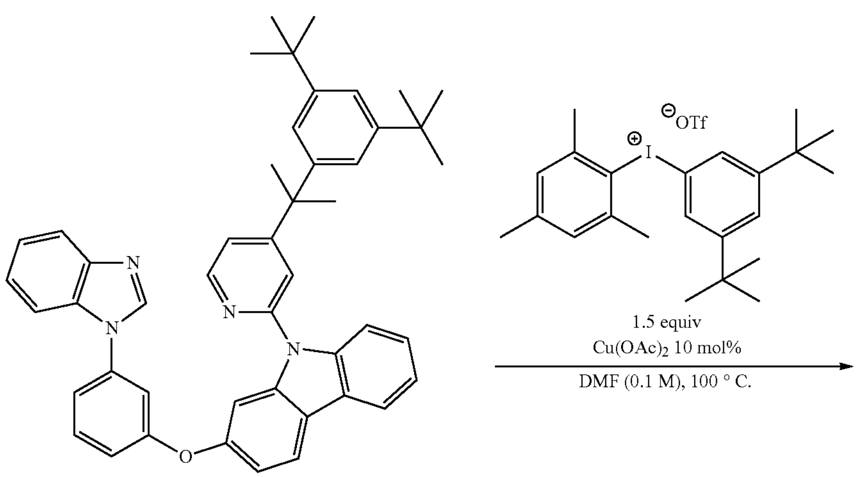
Pt-18-IM2

-continued

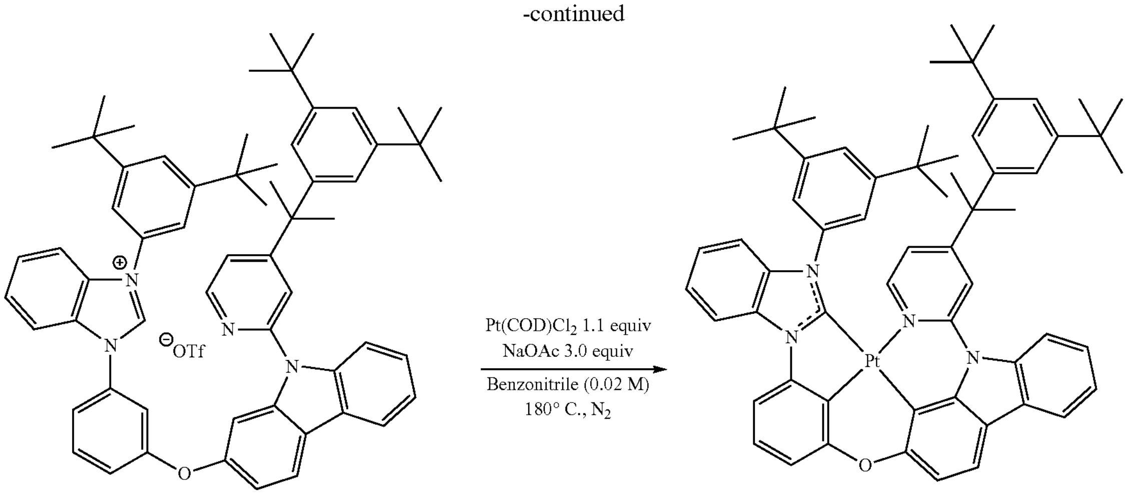

Pt-18-IM1 Pt-18

(1) Synthesis of Intermediate Pt-18-IM2

5.46 g (20 mmol) of 1-(3-bromophenyl)-1H-benzo[d]imidazole, 11.78 g (24 mmol) of 9-(4-(2-(3,5-di-tert-butylphenyl)propan-2-yl)pyridin-2-yl)-9H-carbazol-2-ol, 0.76 g (4 mmol) of copper (I) iodide, 0.98 g (8 mmol) of picolinic acid, and 12.7 g (60 mmol) of potassium phosphate tribasic were mixed with 133 mL of DMSO, followed by stirring at a temperature of 120° C. for 12 hours. Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 7.78 g (11.40 mmol) of Intermediate Pt-18-IM2 (yield: 57%).

LC-MS (calculated value: 682.37 g/mol, measured value: M+1=683 g/mol)

(2) Synthesis of Intermediate Pt-18-IM1

7.78 g (11.40 mmol) of Intermediate Pt-18-IM2, 9.99 g (17.10 mmol) of (3,5-di-tert-butylphenyl)(mesityl)iodonium triflate, and 0.21 g (1.14 mmol) of copper (II) acetate were mixed with 114 mL of DMF, followed by stirring at a temperature of 100° C. for 4 hours.

Once the reaction was complete, the mixture was cooled to room temperature, and then, an organic layer extracted using saturated $NH_4Cl$ and EA was dried with anhydrous $MgSO_4$ and subjected to filtration, followed by concentration under reduced pressure. The resulting product was subjected to silica gel column chromatography to thereby obtain 9.66 g (9.46 mmol) of Intermediate Pt-18-IM1 (yield: 83%).

LC-MS (calculated value: 871.53 g/mol, measured value: M+1=872 g/mol)

(3) Synthesis of Compound Pt-18

5.62 g (5.50 mmol) of Intermediate Pt-18-IM1, 2.26 g (6.05 mmol) of $Pt(COD)Cl_2$, and 1.35 g (16.50 mmol) of sodium acetate were mixed with 275 mL of benzonitrile, followed by stirring at a temperature of 180° C. for 18 hours. Once the reaction was complete, the mixture was cooled to room temperature and concentrated under reduced pressure. The resulting product was subjected to silica gel column chromatography to thereby obtain 3.22 g (3.03 mmol) of Compound Pt-18 (yield: 55%).

LC-MS (calculated value: 1063.47 g/mol, measured value: M+1=1064 g/mol)

Evaluation Example 1: Evaluation of Photoluminescence (PL) Spectrum

Compound Pt-1 was diluted in toluene at a concentration of 10 millimole (mM), and a PL spectrum of Compound Pt-1 was measured by using an ISC PC1 spectrofluorometer, in which a xenon lamp is mounted. The same process was performed on Compound Pt-2 to Pt-6, Pt-9, Pt-10, Pt-13, Pt-17, and Pt-18. The maximum emission wavelength and FWHM of the compounds are shown in Table 2.

TABLE 2

| Compound No. | Maximum emission wavelength (nm) | FWHM (nm) |
|---|---|---|
| Pt-1 | 460 | 21 |
| Pt-2 | 460 | 22 |
| Pt-3 | 465 | 27 |
| Pt-4 | 461 | 21 |
| Pt-5 | 460 | 19 |
| Pt-6 | 465 | 26 |
| Pt-9 | 462 | 22 |
| Pt-10 | 462 | 21 |
| Pt-13 | 461 | 21 |
| Pt-17 | 460 | 21 |
| Pt-18 | 460 | 21 |

TABLE 2-continued
| Compound No. | Maximum emission wavelength (nm) | FWHM (nm) |
|---|---|---|
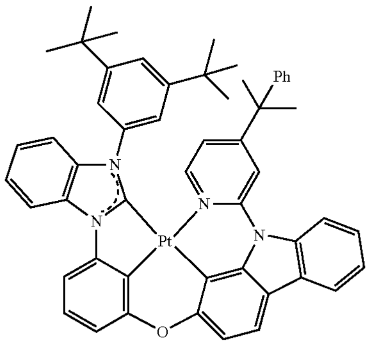
Pt-1
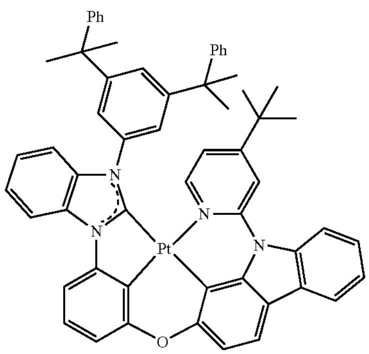
Pt-2
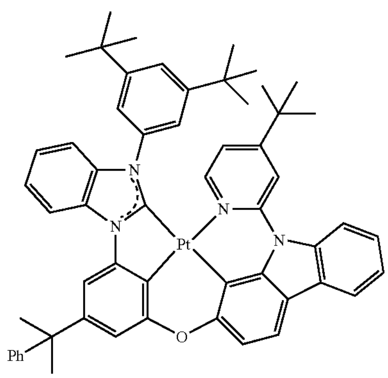
Pt-3
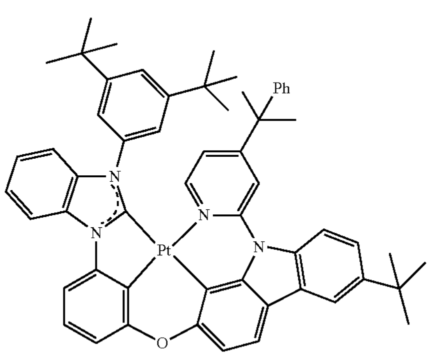
Pt-4
TABLE 2-continued
| Compound No. | Maximum emission wavelength (nm) | FWHM (nm) |
|---|---|---|
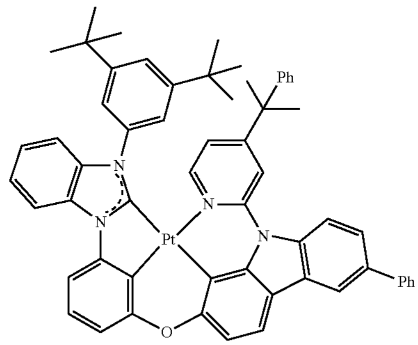
Pt-5
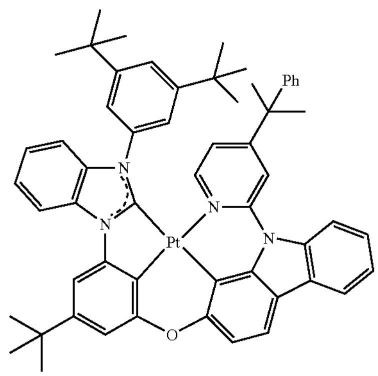
Pt-6
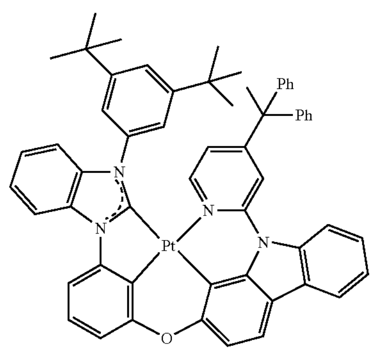
Pt-9
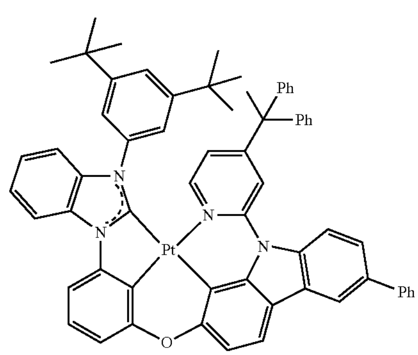
Pt-10

TABLE 2-continued

| Compound No. | Maximum emission wavelength (nm) | FWHM (nm) |
|---|---|---|
| 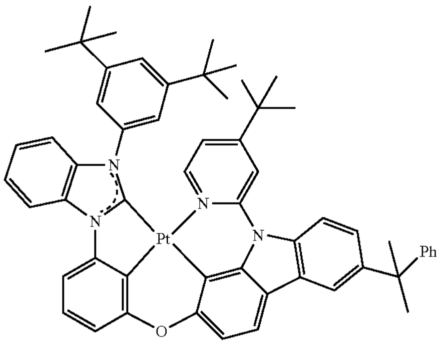 Pt-13 | | |
| 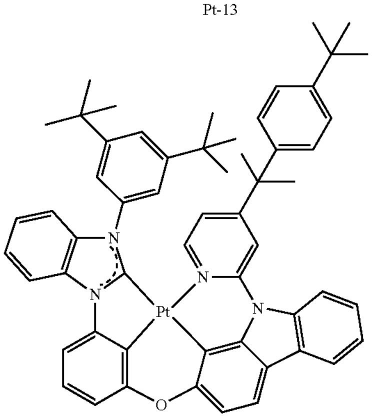 Pt-17 | | |
| 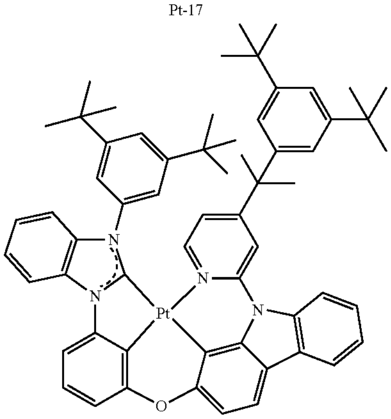 Pt-18 | | |

Referring to the results of Table 2, Compounds Pt-1 to Pt-6, Pt-9, Pt-10, Pt-13, Pt-17, and Pt-18 were found to emit blue light having a narrow FWHM.

Example 1

As a first electrode (an anode), a glass substrate having an indium tin oxide (ITO) electrode deposited thereon at a thickness of 1,500 Å was washed with distilled water in the presence of ultrasound waves. Once the washing with distilled water was complete, ultrasound wave washing was performed on the substrate by using isopropyl alcohol, acetone, and methanol in this stated order. Subsequently, the substrate was dried, transferred to a plasma washer, washed for 5 minutes using oxygen plasma, and mounted in a vacuum deposition device.

Compound HT3 was vacuum-deposited on the ITO electrode of the glass substrate to form a first hole injection layer having a thickness of about 3500 Å, Compound HT-D1 was vacuum-deposited on the first hole injection layer to form a second hole injection layer having a thickness of about 300 Å, and TAPC was vacuum-deposited on the second hole injection layer to form an electron blocking layer having a thickness of about 100 Å, thereby forming a hole transport region.

Compound H52 and Compound Pt-1 (10 wt %) were co-deposited on the hole transport region to form an emission layer having a thickness of 300 Å.

Compound ET3 was vacuum-deposited on the emission layer to form an electron transport layer having a thickness of about 250 Å, ET-D1 (Liq) was deposited on the electron transport layer to form an electron injection layer having a thickness of about 5 Å, and an Al second electrode (a cathode) was formed on the electron injection layer to have a thickness of about 1,000 Å, thereby completing the manufacture of an organic light-emitting device.

HT3

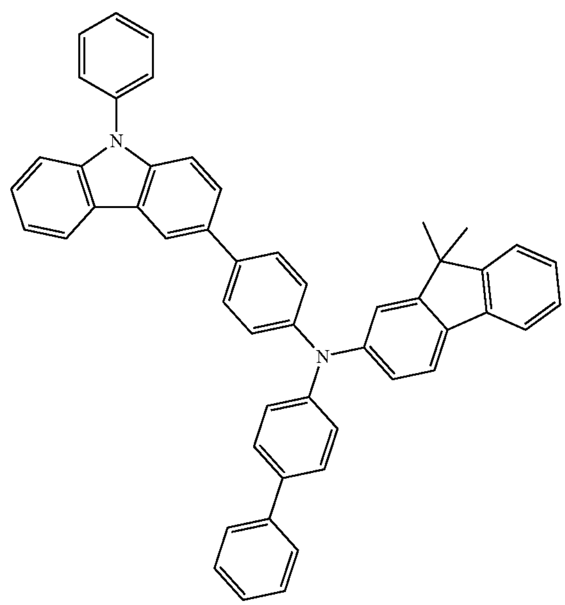

HT-D1

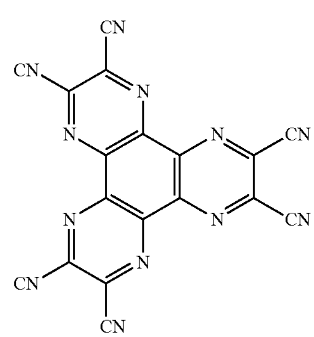

-continued

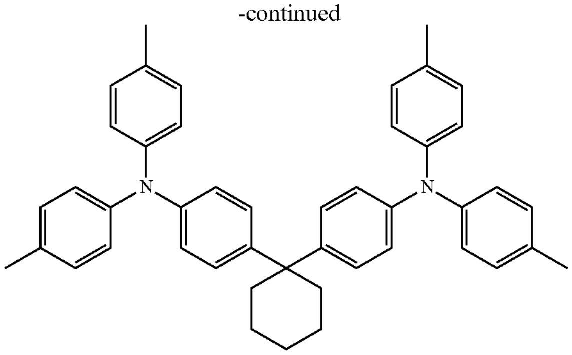

TAPC

H52

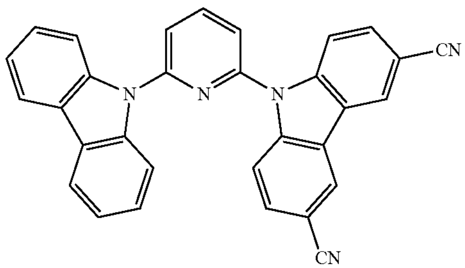

ET3

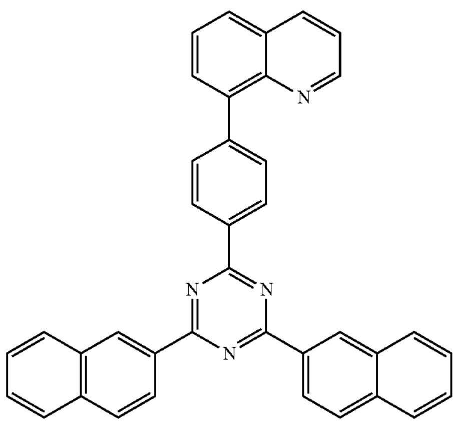

-continued

ET-D1

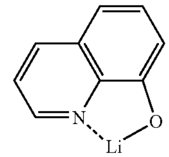

Examples 1 and 6 and Comparative Examples A and B

Organic light-emitting devices were manufactured in substantially the same manner as in Example 1, except that the compounds shown in Table 3 were used instead of Compound Pt-1 as a dopant in the formation of an emission layer.

Evaluation Example 2: Evaluation of Characteristics of Organic Light-Emitting Device The maximum emission wavelength of the EL spectrum, the driving voltage, the external quantum luminescence efficiency, and lifespan ($LT_{95}$) of each of the organic light-emitting devices manufactured in Examples 1 to 6 and Comparative Examples A and B were evaluated. The results thereof are shown in Table 3. The lifespan ($LT_{95}$) indicates time (hour) for the luminance of each light-emitting device to decline to 95% of its initial luminance of 100%. EL spectra of the manufactured organic light-emitting devices at a luminance of 1,000 candelas per square meter (cd/$m^2$) were measured by using a luminance meter (Minolta Cs-1000A). Then, the maximum emission wavelength was evaluated. A Keithley 2400 current voltmeter and a luminance meter (Minolta Cs-1000A) were used in evaluation of driving voltage and external quantum luminescence efficiency. In Table 3, the driving voltage, external quantum luminescence efficiency, and lifespan of the organic light-emitting devices manufactured in Examples 1 to 6 and Comparative Example B are shown in a relative value (%).

TABLE 3

| | Dopant Compound No. | Maximum emission wavelength (nm) | Driving voltage (V) (relative value, %) | External quantum Luminescence efficiency (External quantum efficiency (EQE) (at 1,000 cd/$m^2$) (relative value, %) | Lifespan ($LT_{95}$) (at 1,000 cd/$m^2$) (relative value, %) |
|---|---|---|---|---|---|
| Example 1 | Pt-1 | 460 | 93 | 120 | 159 |
| Example 2 | Pt-2 | 461 | 94 | 105 | 116 |
| Example 3 | Pt-3 | 466 | 95 | 124 | 236 |
| Example 4 | Pt-4 | 461 | 96 | 123 | 175 |
| Example 5 | Pt-5 | 460 | 94 | 122 | 188 |
| Example 6 | Pt-13 | 461 | 95 | 110 | 145 |
| Comparative Example A | A | 461 | 100 | 100 | 100 |
| Comparative Example B | B | 452 | 121 | 62 | 17 |

TABLE 3-continued
| Dopant Compound No. | Maximum emission wavelength (nm) | Driving voltage (V) (relative value, %) | External quantum Luminescence efficiency (External quantum efficiency (EQE) (at 1,000 cd/m$^2$) (relative value, %) | Lifespan ($LT_{95}$) (at 1,000 cd/m$^2$) (relative value, %) |
|---|---|---|---|---|
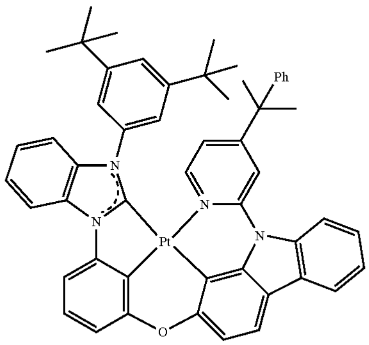
Pt-1
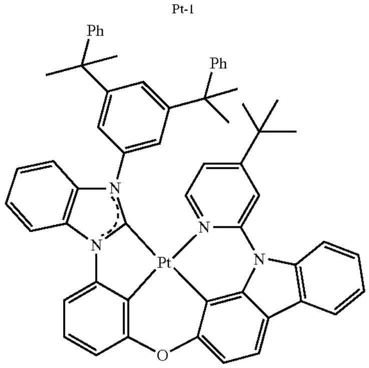
Pt-2
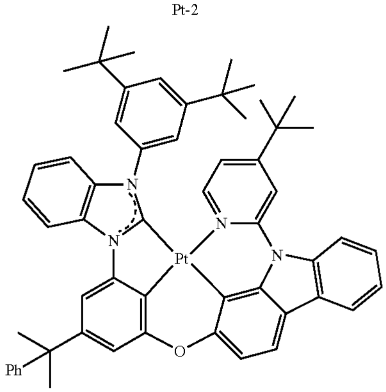
Pt-3
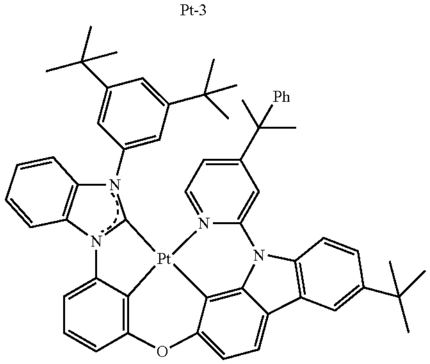
Pt-4

TABLE 3-continued
| Dopant Compound No. | Maximum emission wavelength (nm) | Driving voltage (V) (relative value, %) | External quantum Luminescence efficiency (External quantum efficiency (EQE) (at 1,000 cd/m$^2$) (relative value, %) | Lifespan (LT$_{95}$) (at 1,000 cd/m$^2$) (relative value, %) |
|---|---|---|---|---|
| 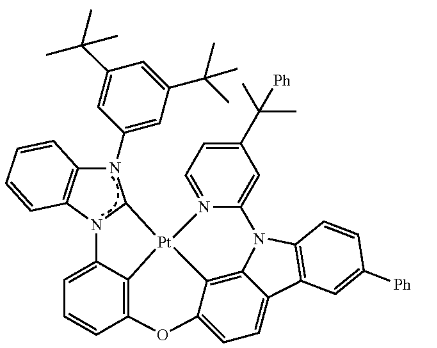 Pt-5 | | | | |
| 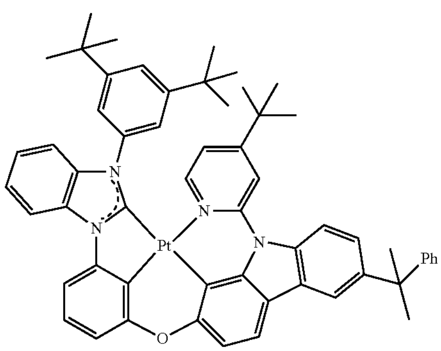 Pt-13 | | | | |
| 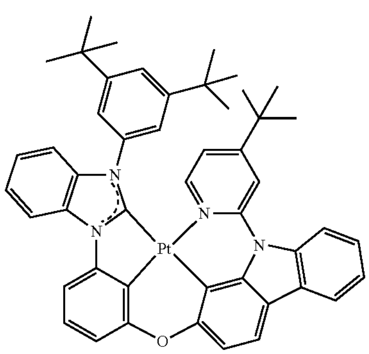 A | | | | |

TABLE 3-continued

| Dopant Compound No. | Maximum emission wavelength (nm) | Driving voltage (V) (relative value, %) | External quantum Luminescence efficiency (External quantum efficiency (EQE) (at 1,000 cd/m$^2$) (relative value, %) | Lifespan ($LT_{95}$) (at 1,000 cd/m$^2$) (relative value, %) |
|---|---|---|---|---|

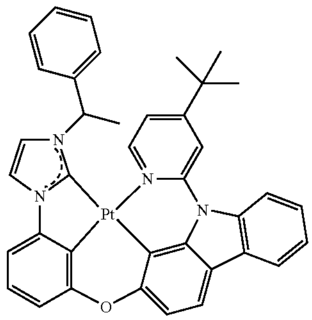

B

Referring to Table 3, the organic light-emitting device of Examples 1 to 6 were found to have improved driving voltage, improved external quantum luminescence efficiency, and improved lifespan, as compared with the organic light-emitting devices of Comparative Examples A and B.

Example 7

An organic light-emitting device was manufactured in substantially the same manner as in Example 1, except that CBP, Compound Pt-1, and Compound FD16 were co-deposited at a weight ratio of 88.5:10:1.5 to form an emission layer instead of Compound H52 and Compound Pt-1.

Comparative Example C

An organic light-emitting device was manufactured in the same manner as in Example 1, except that CBP and Compound FD16 were co-deposited at a weight ratio of 90:10 to form an emission layer instead of Compound H52 and Compound Pt-1.

Evaluation Example 3: Evaluation of Characteristics of Organic Light-Emitting Device The maximum emission wavelength of the EL spectrum, driving voltage, external quantum luminescence efficiency, and lifespan ($LT_{95}$) of the organic light-emitting devices manufactured in Example 7 and Comparative Example C were evaluated in substantially the same manner as in Evaluation Example 2. The results are shown in Table 4. In Table 4, the driving voltage, external quantum luminescence efficiency, and lifespan of the organic light-emitting devices manufactured in Example 7 and Comparative Example C are shown in a relative value (%).

TABLE 4

| No. | Emission layer | Maximum emission wavelength (nm) | Driving voltage (relative value, %) | External quantum luminescence efficiency (EQE) (at 1,000 cd/m$^2$) (relative value, %) | Lifespan ($LT_{95}$) (at 1,000 cd/m$^2$) (relative value, %) |
|---|---|---|---|---|---|
| Example 7 | CBP:Pt-1:FD16 (88.5:10:1.5) | 461 | 96 | 603 | 536 |
| Comparative Example C | CBP:FD16 (90:10) | 462 | 100 | 100 | 100 |

TABLE 4-continued

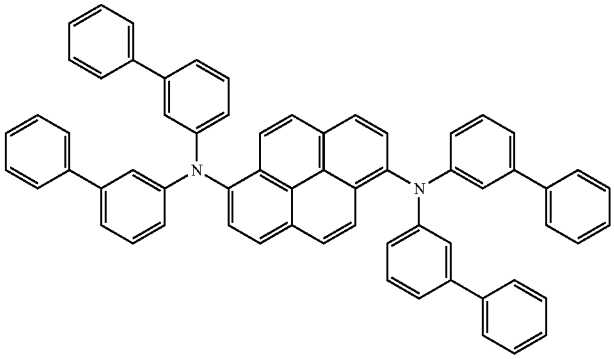

FD16

Referring to Table 4, the organic light-emitting device of Example 7 was found to have improved driving voltage, improved external quantum luminescence efficiency, and improved lifespan, as compared with the organic light-emitting device of Comparative Example C.

As the organometallic compound has excellent thermal stability and electrical characteristics, an electronic device, e.g., an organic light-emitting device including the organometallic compound may have improved driving voltage, improved external quantum efficiency, and improved lifespan characteristics and emit light having a relatively narrow FWHM.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

Formula 1

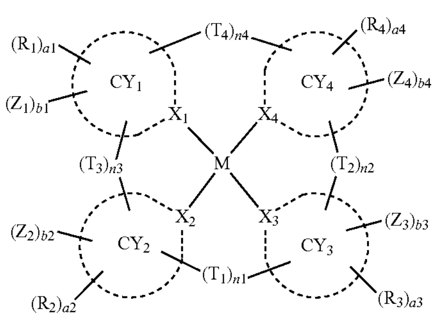

wherein,

M in Formula 1 is Pt, a bond between $X_1$ and M and a bond between $X_4$ and M in Formula 1 are each a coordinate bond and a bond between $X_2$ and M and a bond between $X_3$ and M in Formula 1 are each a covalent bond, the group represented by

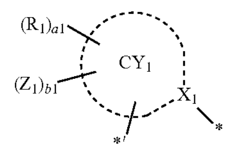

in Formula 1 is represented by one of Formulae CY1-26 to CY1-41 or one of Formulae CY1-Z46 to CY1-Z61,

CY1-26

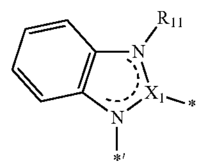

CY1-27

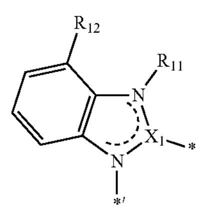

CY1-28

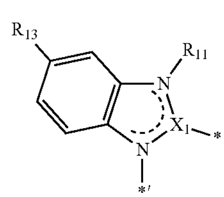

CY1-29

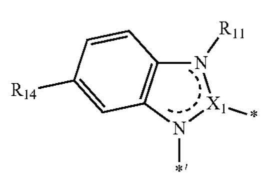

CY1-30
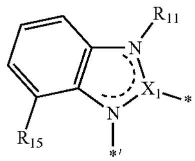
CY1-31
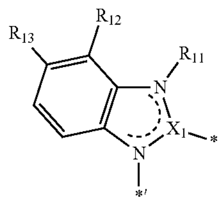
CY1-32
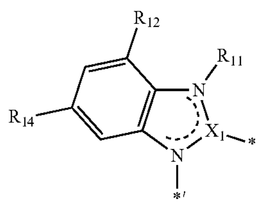
CY1-33
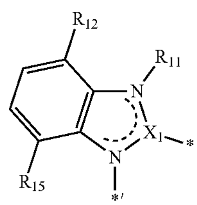
CY1-34
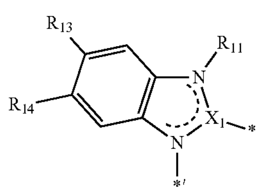
CY1-35
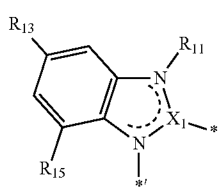
CY1-36
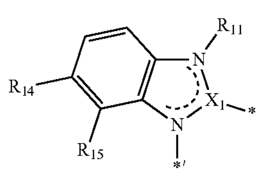
CY1-37
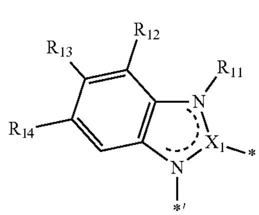
CY1-38
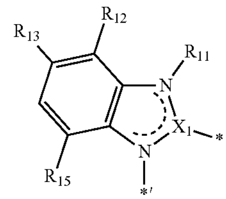
CY1-39
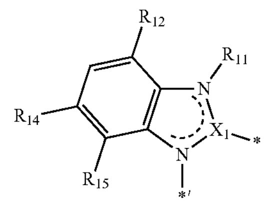
CY1-40
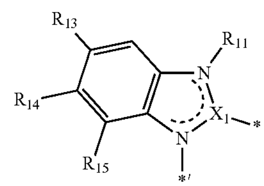
CY1-41
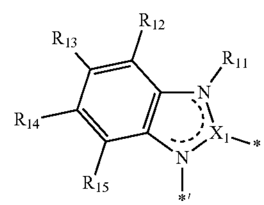
CY1-Z46
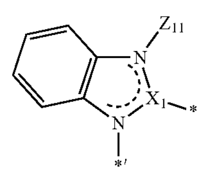
CY1-Z47
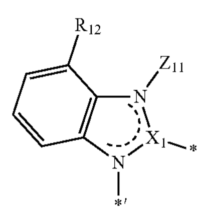
CY1-Z48
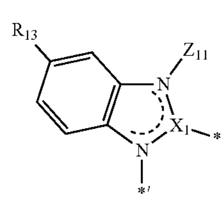
CY1-Z49
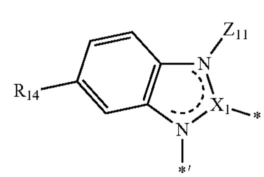

-continued

CY1-Z50

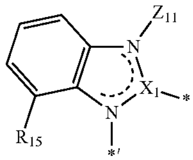

CY1-Z51

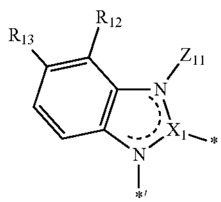

CY1-Z52

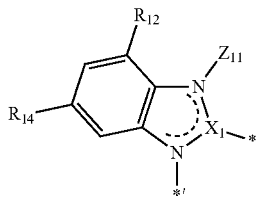

CY1-Z53

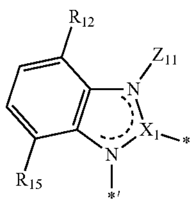

CY1-Z54

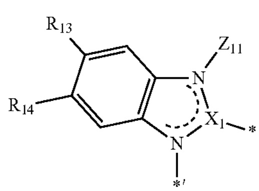

CY1-Z55

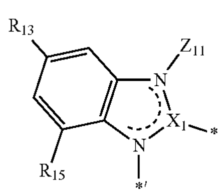

CY1-Z56

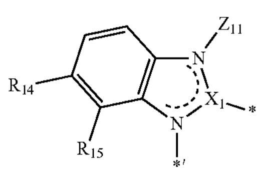

CY1-Z57

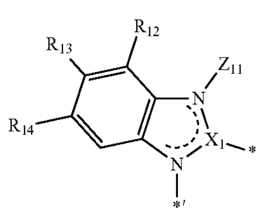

-continued

CY1-Z58

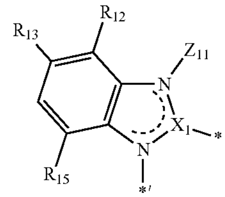

CY1-Z59

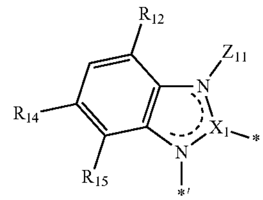

CY1-Z60

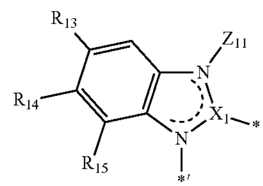

CY1-Z61

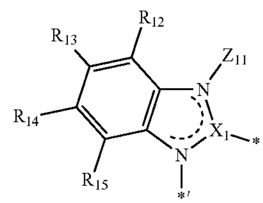

wherein, in Formulae CY1-26 to CY1-1-41 and Formulae CY1-Z46 to CY1-Z61, $X_1$ is C,

* indicates a binding site to M in Formula 1, and

*' indicates a binding site to $T_3$ in Formula 1, ring $CY_2$ is a benzene group represented by Formula CY2(1),

CY2(1)

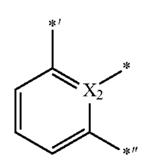

wherein, in Formula CY2(1), $X_2$ is C,

*' indicates a binding site to $T_3$ in Formula 1,

* indicates a binding site to M in Formula 1, and

* " indicates a binding site to $T_1$ in Formula 1, ring $CY_3$ is a carbazole group represented by Formula CY3(1),

CY3(1)

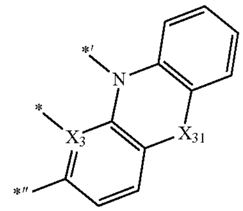

wherein, in Formula CY3(1), $X_3$ is C, $X_{31}$ is a single bond,

*" indicates a binding site to $T_1$ in Formula 1,

* indicates a binding site to M in Formula 1, and

*' indicates a binding site to $T_2$ in Formula 1, ring $CY_4$ is a pyridine group represented by Formula CY4(1),

CY4(1)

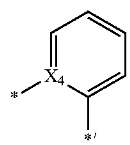

wherein, in Formula CY4(1), $X_4$ is N,

* indicates a binding site to M in Formula 1, and

*' indicates a binding site to $T_2$ in Formula 1, n1 to n3 in Formula 1 are each 1, $T_1$ in Formula 1 is *—S—*' or *—O—*', $T_2$ in Formula 1 is a single bond, $T_3$ in Formula 1 is a single bond, n4 in Formula 1 is 0 and $T_4$ is not present, $R_{11}$ in Formulae CY1-26 to CY1-41 is a phenyl group substituted with a $C_1$-$C_{60}$ alkyl group, a deuterated $C_1$-$C_{60}$ alkyl group, or any combination thereof, $R_{12}$ to $R_{15}$ in Formulae CY1-26 to CY1-41 and CY1-Z46 to CY1-Z61, $R_2$ in Formula 1 and $R_4$ in Formula 1 are each independently hydrogen, deuterium, a $C_1$-$C_{60}$ alkyl group, or a deuterated $C_1$-$C_{60}$ alkyl group, $R_3$ in Formula 1 is:

hydrogen, deuterium, a $C_1$-$C_{60}$ alkyl group, or a deuterated $C_1$-$C_{60}$ alkyl group, or a phenyl group unsubstituted or substituted with deuterium, a $C_1$-$C_{60}$ alkyl group, a deuterated $C_1$-$C_{60}$ alkyl group, or any combination thereof, a2 to a4 in Formula 1 are each independently an integer from 0 to 3, $Z_{11}$ in Formulae CY1-Z46 to CY1-Z61 and $Z_2$ to $Z_4$ in Formula 1 are each independently a group represented by Formula 2:

Formula 2

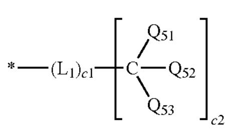

one of $Q_{51}$ to $Q_{53}$ in Formula 2 is a benzene group unsubstituted or substituted with deuterium, a $C_1$-$C_{60}$ alkyl group, a deuterated $C_1$-$C_{60}$ alkyl group, or any combination thereof, two of $Q_{51}$ to $Q_{53}$ in Formula 2 are each independently $—CH_3$, $—CD_3$, $—CD_2H$, or $—CDH_2$, $L_1$ in Formula 2 is a single bond or a benzene group, c1 in Formula 2 is 1, c2 in Formula 2 is 1 or 2,

* in Formula 2 indicates a binding site to an adjacent atom, b2 to b4 in Formula 1 are each 0 or 1, (a) or (b) is true:

(a) when the group represented by

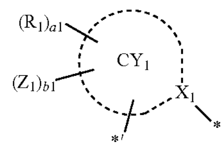

in Formula 1 is represented by one of Formulae CY1-26 to CY1-41, then the sum of b2 to b4 in Formula 1 is 1, $L_1$ in Formula 2 is a single bond, and c2 in Formula 2 is 1, (b) when the group represented by

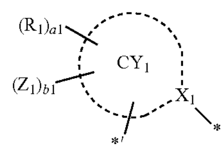

in Formula 1 is represented by one of Formulae CY1-Z46 to CY1-Z61, then b2 to b4 in Formula 1 are each 0, $L_1$ in Formula 2 is a benzene group, and c2 in Formula 2 is 1 or 2.

2. The organometallic compound of claim 1, wherein a group represented by *—$C(Q_{51})(Q_{52})(Q_{53})$ in Formula 2 is represented by one of Formulae 2-1 to 2-20:

2-1

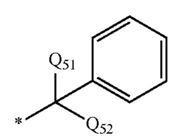

2-2

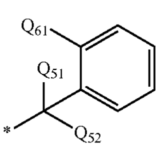

2-3

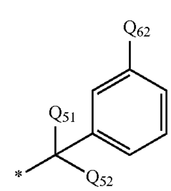

2-4

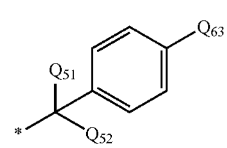

-continued 2-5

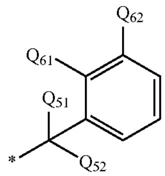

2-6

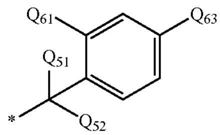

2-7

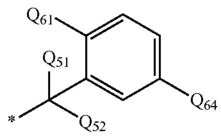

2-8

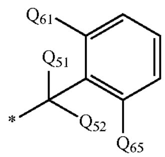

2-9

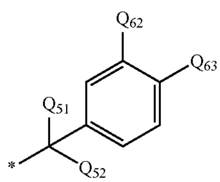

2-10

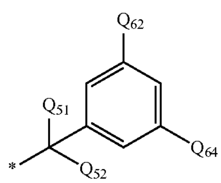

2-11

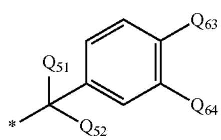

2-12

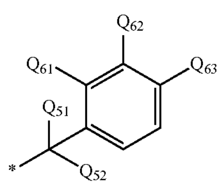

2-13

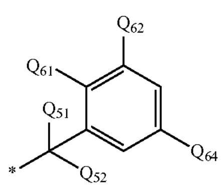

-continued 2-14

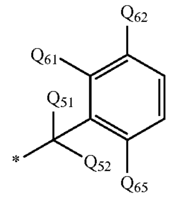

2-15

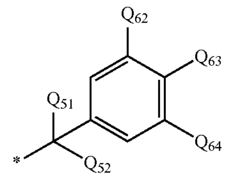

2-16

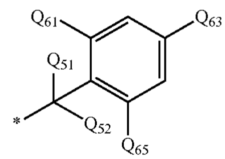

2-17

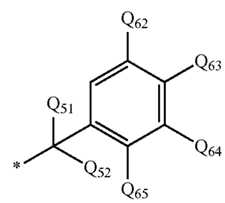

2-18

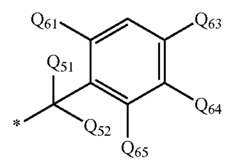

2-19

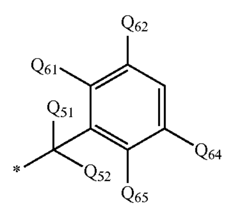

2-20

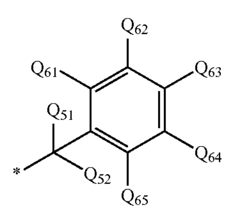

wherein, in Formulae 2-1 to 2-20, $Q_{51}$ and $Q_{52}$ are each independently —$CH_3$, —$CD_3$, —$CD_2H$, or —$CDH_2$, $Q_{61}$ to $Q_{65}$ are each independently deuterium, a $C_1$-$C_{60}$ alkyl group, or a deuterated $C_1$-$C_{60}$ alkyl group, and

* indicates a binding site to $L_1$ in Formula 2.

3. The organometallic compound of claim 1, wherein the (b) is true, and $Z_{11}$ in Formulae CY1-Z46 to CY1-Z61 is represented by one of Formulae 2(1) to 2(10):

2(1)
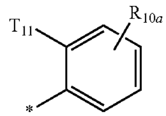
2(2)
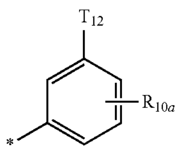
2(3)
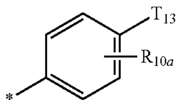
2(4)
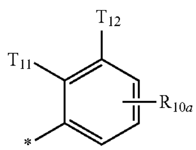
2(5)
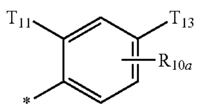
2(6)
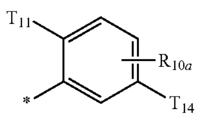
2(7)
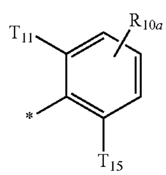
2(8)
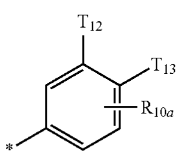
2(9)
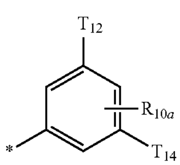
2(10)
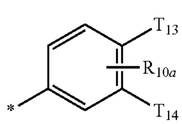
2(1)
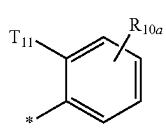
-continued
2(2)
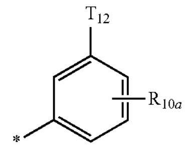
2(3)
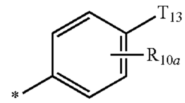
2(4)
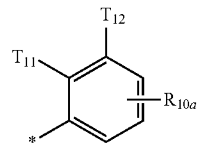
2(5)
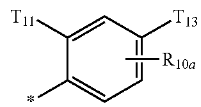
2(6)
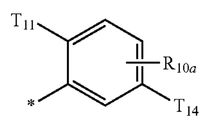
2(7)
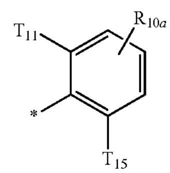
2(14)
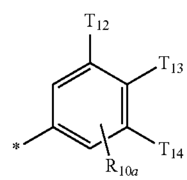
2(15)
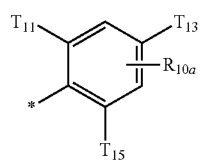
2(16)
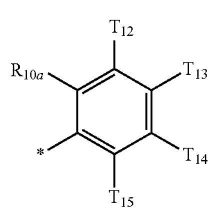
2(17)
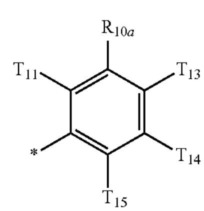

-continued

2(18)

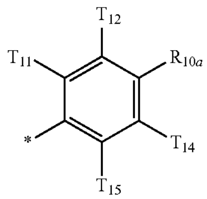

2(19)

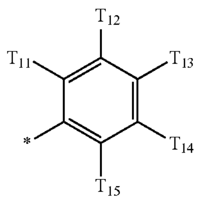

wherein, in Formulae 2(1) to 2(10), $T_{11}$ to $T_{15}$ are each a group represented by *—$C(Q_{51})(Q_{52})(Q_{53})$ in Formula 2, $T_{11}$ to $T_{15}$ are identical to or different from each other, $R_{10a}$ is a hydrogen, and

* indicates a binding site to a nitrogen in Formulae CY1-Z46 to CY1-Z61.

4. An organic light-emitting device comprising:

a first electrode;

a second electrode; and an organic layer disposed between the first electrode and the second electrode and comprising an emission layer;

wherein the organic layer comprises at least one organometallic compound of claim 1.

5. The organic light-emitting device of claim 4, wherein the first electrode is an anode, the second electrode is a cathode, and the organic layer further comprises a hole transport region disposed between the first electrode and the emission layer and an electron transport region disposed between the emission layer and the second electrode, wherein the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

6. An electronic apparatus comprising the organic light-emitting device of claim 4.

7. The organic light-emitting device of claim 4, wherein the emission layer comprises the organometallic compound.

8. The organic light-emitting device of claim 7, wherein the emission layer further comprises a host.

9. The organic light-emitting device of claim 7, wherein a ratio of emission components emitted from the organometallic compound is 80 percent (%) or more of the total emission components emitted from the emission layer.

10. The organic light-emitting device of claim 9, wherein blue light is emitted from the organometallic compound.

11. The organic light-emitting device of claim 7, wherein the emission layer further comprises a fluorescent dopant different from the organometallic compound.

12. The organic light-emitting device of claim 11, wherein the fluorescent dopant comprises an amino group-containing compound.

* * * * *